US012696682B2

(12) United States Patent
Sakuma

(10) Patent No.: US 12,696,682 B2
(45) Date of Patent: Jul. 28, 2026

(54) ORGANIC ELECTROLUMINESCENCE DEVICE AND AMINE COMPOUND FOR ORGANIC ELECTROLUMINESCENCE DEVICE

(71) Applicant: Samsung Display Co., LTD., Yongin-si (KR)

(72) Inventor: Takao Sakuma, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 404 days.

(21) Appl. No.: 17/159,944

(22) Filed: Jan. 27, 2021

(65) Prior Publication Data

US 2023/0010262 A1 Jan. 12, 2023

(30) Foreign Application Priority Data

May 27, 2020 (KR) ........................ 10-2020-0063590

(51) Int. Cl.
*H10K 85/60* (2023.01)
*H10K 50/15* (2023.01)

(52) U.S. Cl.
CPC ......... *H10K 85/633* (2023.02); *H10K 85/636* (2023.02); *H10K 85/6576* (2023.02); *H10K 50/15* (2023.02)

(58) Field of Classification Search
CPC ............. H01L 51/0054; H01L 51/0059; H01L 51/006; H01L 51/0061; H01L 51/073;
(Continued)

(56) References Cited

U.S. PATENT DOCUMENTS 8,329,316 B2 12/2012 Kim et al.
10,205,102 B2 2/2019 Takada
(Continued)

FOREIGN PATENT DOCUMENTS

CN 106831313 6/2017
KR 10-2014-0086815 7/2014
(Continued)

OTHER PUBLICATIONS

Gao et al. Appl. Phys. Lett. 102, 153301 (2013) (Year: 2013).*
WO-2022075746-A1 machine translation (Year: 2022).*
WO-2019088517-A1 machine translation (Year: 2019).*

*Primary Examiner* — Elizabeth M. Dahlburg
(74) *Attorney, Agent, or Firm* — Lerner David LLP

(57) ABSTRACT

An organic electroluminescence device includes a first electrode, a hole transport region disposed on the first electrode, an emission layer disposed on the hole transport region, an electron transport region disposed on the emission layer, and a second electrode disposed on the electron transport region. The hole transport region includes an amine compound represented by Formula 1, thereby exhibiting high light emission efficiency, and wherein Formula 1 is explained in the specification.

[Formula 1]

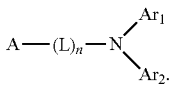

6 Claims, 2 Drawing Sheets

(58) Field of Classification Search
CPC ............. H01L 51/0074; H01L 51/5056; H01L 51/506; H01L 51/5064; H01L 51/5088; H01L 51/5096; C07C 211/54; C07C 211/57; C09K 11/06; H10K 50/15; H10K 85/615; H10K 85/626; H10K 85/631; H10K 85/633; H10K 85/636; H10K 85/6572; H10K 85/6574
See application file for complete search history.

(56) References Cited

U.S. PATENT DOCUMENTS

| | | | | |
|---|---|---|---|---|
| 11,196,008 | B2 | 12/2021 | Park et al. | |
| 2017/0125731 | A1* | 5/2017 | Yun | H01L 51/56 |
| 2018/0037546 | A1* | 2/2018 | Sugino | C07D 409/14 |
| 2019/0039996 | A1 | 2/2019 | Takada et al. | |
| 2019/0140177 | A1 | 5/2019 | Lee et al. | |

FOREIGN PATENT DOCUMENTS

| | | | | |
|---|---|---|---|---|
| KR | 20170001830 | A | | 1/2017 |
| KR | 10-2017-0052735 | | | 5/2017 |
| KR | 10-2018-0124728 | | | 11/2018 |
| KR | 10-2019-0014299 | | | 2/2019 |
| KR | 10-2019-0052505 | | | 5/2019 |
| KR | 10-2081739 | | | 2/2020 |
| WO | 2007/105884 | | | 9/2007 |
| WO | 2019/088517 | | | 5/2019 |
| WO | WO-2022075746 | A1 | * | 4/2022 |

* cited by examiner

ORGANIC ELECTROLUMINESCENCE DEVICE AND AMINE COMPOUND FOR ORGANIC ELECTROLUMINESCENCE DEVICE

CROSS-REFERENCE TO RELATED APPLICATION(S)

This application claims priority to and benefits of Korean Patent Application No. 10-2020-0063590 under 35 U.S.C. § 119, filed on May 27, 2020 in the Korean Intellectual Property Office, the entire contents of which are incorporated herein by reference.

BACKGROUND

1. Technical Field

The disclosure relates to an organic electroluminescence device and an amine compound for the organic electroluminescence device.

2. Description of the Related Art

Recently, active development is being conducted for an organic electroluminescence display as an image display device. In contrast to liquid crystal display devices and the like, the organic electroluminescence display is a so-called self-luminescent display device in which holes and electrons injected from a first electrode and a second electrode recombine in an emission layer, and thus a luminescent material including an organic compound in the emission layer emits light to implement display.

In the application of an organic electroluminescence device to a display device, there is a continuous demand for an organic electroluminescence device having a low driving voltage, high light emission efficiency, and a long service life, and for the development of materials for an organic electroluminescence device that are capable of stably attaining such characteristics.

SUMMARY

The disclosure provides an organic electroluminescence device having high efficiency and an amine compound included in a hole transport region of the organic electroluminescence device.

An embodiment of the inventive concept provides an amine compound represented by Formula 1:

[Formula 1]

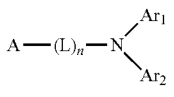

In Formula 1, L may be a substituted or unsubstituted arylene group having 6 to 30 ring-forming carbon atoms, or a substituted or unsubstituted heteroarylene group having 2 to 30 ring-forming carbon atoms, n may be an integer from 0 to 2, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, and A may be represented by one of Formula 2-1 to Formula 2-5:

[Formula 2-1]

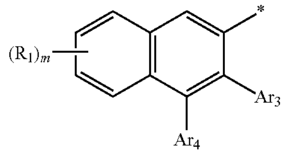

[Formula 2-2]

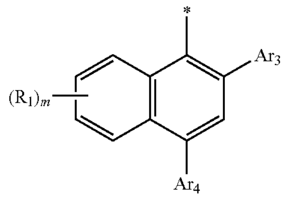

[Formula 2-3]

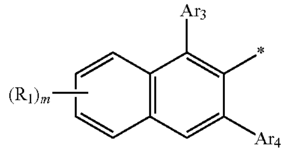

[Formula 2-4]

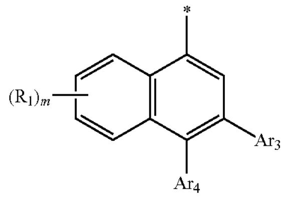

[Formula 2-5]

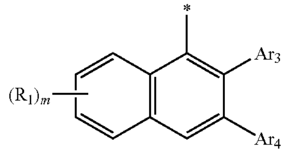

In Formula 2-1 to Formula 2-5, $R_1$ may be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, m may be an integer from 0 to 4, $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms, and * indicates a binding site to a neighboring atom, provided that when A in Formula 1 is represented by Formula 2-4 or Formula 2-5, n in Formula 1 may be 1 and $Ar_2$ may be a substituted or unsubstituted heteroaryl group having 2 to 30 ring-forming carbon atoms.

In an embodiment, Formula 1 may be represented by one of Formula 3-1 to Formula 3-3:

[Formula 3-1]

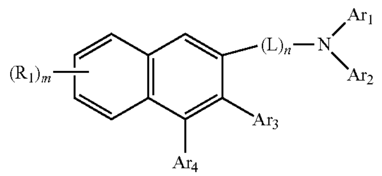

-continued

[Formula 3-2]

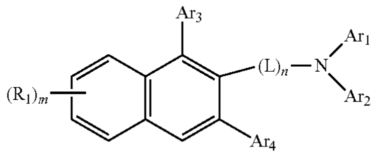

[Formula 3-3]

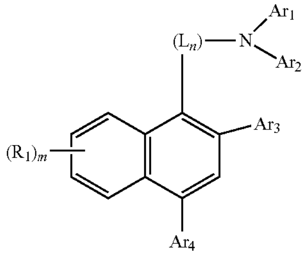

In Formula 3-1 to Formula 3-3, $R_1$ may be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, m may be an integer from 0 to 4, and $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms, and $Ar_1$, $Ar_2$, L, and n may be the same as defined in Formula 1.

In an embodiment, Formula 1 may be represented by Formula 4-1 or Formula 4-2:

[Formula 4-1]

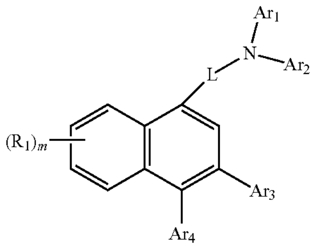

[Formula 4-2]

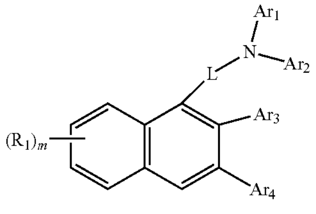

In Formula 4-1 and Formula 4-2, $Ar_2$ may be a substituted or unsubstituted heteroaryl group having 2 to 30 ring-forming carbon atoms, $R_1$ may be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, m may be an integer from 0 to 4, and $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms, and $Ar_1$ and L may be the same as defined in Formula 1.

In an embodiment, $Ar_2$ may be represented by Formula 5:

[Formula 5]

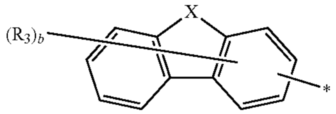

In Formula 5, X may be O or S, $R_3$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, b may be an integer from 0 to 7, and * indicates a binding site to a neighboring atom.

In an embodiment, Formula 3-1 may be represented by one of Formula 3-1-1 to Formula 3-1-3:

[Formula 3-1-1]

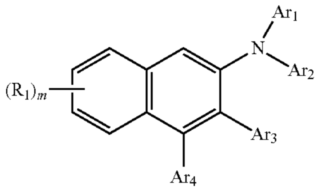

[Formula 3-1-2]

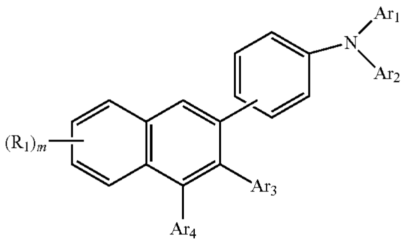

[Formula 3-1-3]

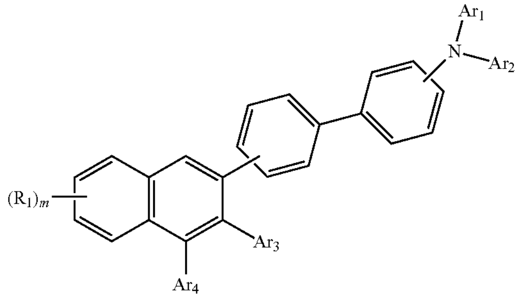

In Formula 3-1-1 to Formula 3-1-3, $Ar_1$ to $Ar_4$, $R_1$, and m may be the same as defined in Formula 3-1.

In an embodiment, Formula 3-2 may be represented by one of Formula 3-2-1 to Formula 3-2-3:

[Formula 3-2-1]

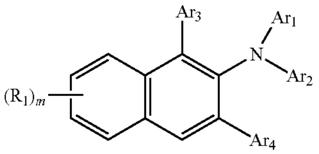

[Formula 3-2-2]

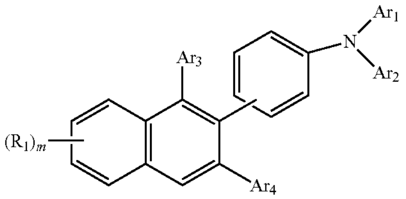

[Formula 3-2-3]

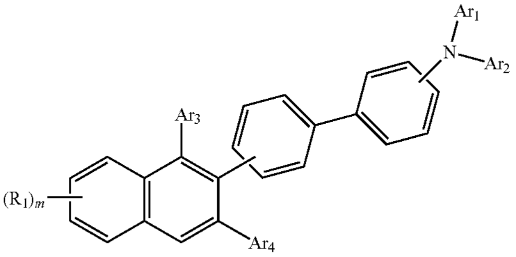

In Formula 3-2-1 to Formula 3-2-3, $Ar_1$ to $Ar_4$, $R_1$, and m may be the same as defined in Formula 3-2.

In an embodiment, Formula 3-3 may be represented by one of Formula 3-3-1 to Formula 3-3-3:

[Formula 3-3-1]

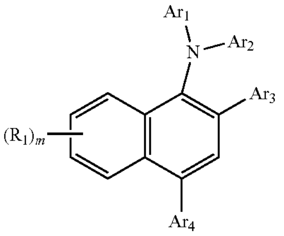

[Formula 3-3-2]

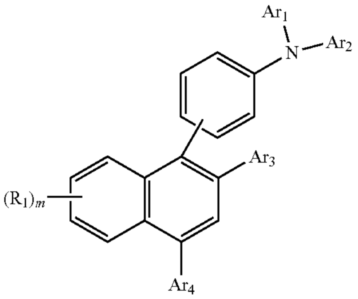

-continued

[Formula 3-3-3]

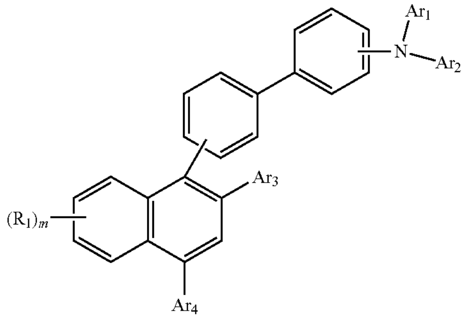

In Formula 3-3-1 to Formula 3-3-3, $Ar_1$ to $Ar_4$, $R_1$, and m may be the same as defined in Formula 3-3.

In an embodiment, Formula 4-1 may be represented by Formula 4-1-1 or Formula

[Formula 4-1-1]

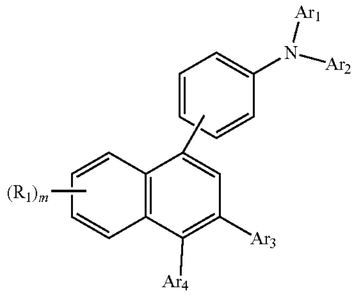

[Formula 4-1-2]

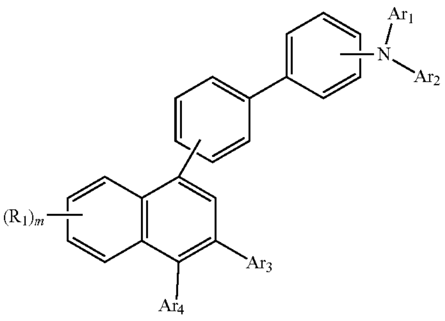

In Formula 4-1-1 and Formula 4-1-2, $Ar_1$ to $Ar_4$, $R_1$, and m may be the same as defined in Formula 4-1.

In an embodiment, Formula 4-2 may be represented by Formula 4-2-1 or Formula 4-2-2:

[Formula 4-2-1]

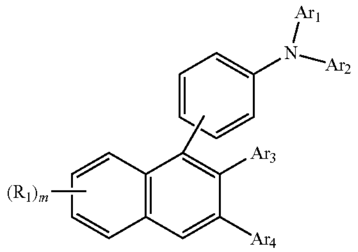

-continued

[Formula 4-2-2]

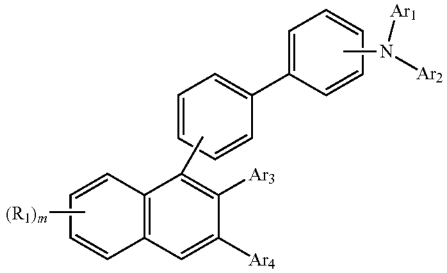

In Formula 4-2-1 and Formula 4-2-2, $Ar_1$ to $Ar_4$, $R_1$, and m may be the same as defined in Formula 4-2.

In an embodiment, L in Formula 1 may be a direct linkage, a substituted or unsubstituted phenylene group, or a substituted or unsubstituted biphenylene group.

In an embodiment, Formula 1 may be represented by one of Formula 6-1 to Formula 6-4:

[Formula 6-1]

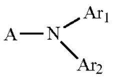

[Formula 6-2]

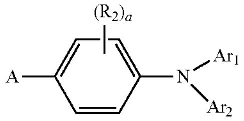

[Formula 6-3]

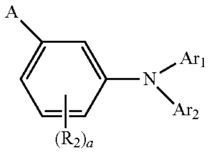

[Formula 6-4]

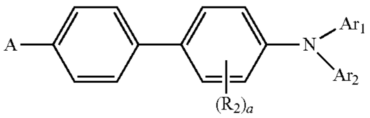

In Formulae 6-1 to 6-4, $R_2$ may be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a may be an integer from 0 to 4, and A, $Ar_1$, and $Ar_2$ may be the same as defined in Formula 1.

An embodiment of the inventive concept provides an organic electroluminescence device including a first electrode, a hole transport region disposed on the first electrode, an emission layer disposed on the hole transport region, an electron transport region disposed on the emission layer, and the second electrode disposed on the electron transport region. The hole transport region may include the amine compound represented by Formula 1.

In an embodiment, the hole transport region may include a hole injection layer disposed on the first electrode; and a hole transport layer disposed on the hole injection layer. The hole transport layer may include the amine compound represented by Formula 1.

In an embodiment, the hole transport layer may further include a p-dopant, and the p-dopant may be at least one selected from quinone derivatives, metal oxides, or cyano group-containing compounds.

In an embodiment, the organic electroluminescence device may further include a capping layer disposed on the second electrode and having a refractive index equal to or greater than about 1.6.

In an embodiment, the capping layer may include at least one organic layer or at least one inorganic layer.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
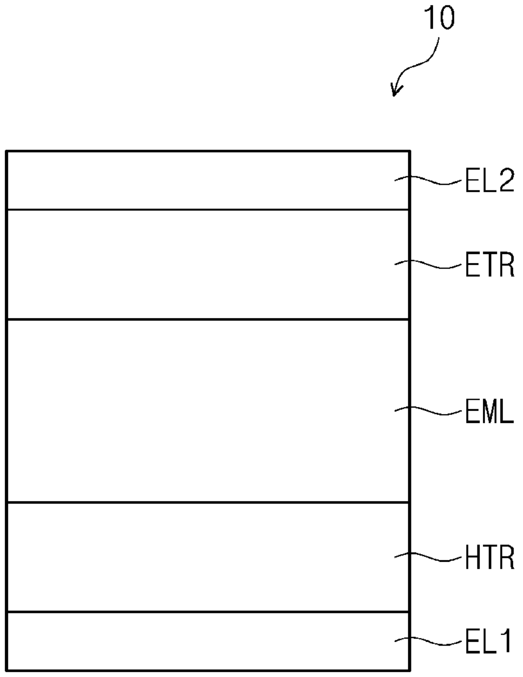
FIG. 1 is a schematic cross-sectional view illustrating an organic electroluminescence device according to an embodiment of the inventive concept.

The inventive concept may have various modifications and may be embodied in different forms, and embodiments will be explained in detail with reference to the accompanying drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

In the description, it will be understood that when an element (a region, a layer, a section, or the like) is referred to as being "on", "connected to" or "coupled to" another element, it can be directly on, connected or coupled to the other element, or one or more intervening elements may be disposed therebetween.

Like reference numerals refer to like elements throughout the specification. In the drawings, the thickness, the ratio, and the dimensions of elements may be exaggerated for an effective description of technical contents.

The term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms “first”, “second”, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

The terms “below,” “lower,” “above,” “upper,” and the like are used to describe the relationship of the configurations shown in the drawings. The terms are used as a relative concept and are described with reference to the direction indicated in the drawings.

The terms “about” or “approximately” as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, “about” may mean within one or more standard deviations, or within ±20%, 10%, or 5% of the stated value.

It should be understood that terms such as “comprises,” “comprising,” “includes,” “including,” “have,” “having,” “contains,” and/or “containing” are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, an organic electroluminescence device according to an embodiment of the inventive concept and a compound of an embodiment included therein will be described with reference to the accompanying drawings.

FIGS. 1 to 4 are schematic cross-sectional views illustrating organic electroluminescence devices according to embodiments of the inventive concept. Referring to FIGS. 1 to 4, in each of organic electroluminescence devices 10 according to embodiments, a first electrode EL1 and a second electrode EL2 are disposed to face each other and an emission layer EML may be disposed between the first electrode EL1 and the second electrode EL2.

Each of the organic electroluminescence devices 10 of the embodiments may further include functional layers between the first electrode EL1 and the second electrode EL2 in addition to the emission layer EML. The functional layers may include a hole transport region HTR and an electron transport region ETR. For example, each of the organic electroluminescence devices 10 according to embodiments may include the first electrode EL1, the hole transport region HTR, the emission layer EML, the electron transport region ETR, and the second electrode EL2 that may be sequentially stacked. The organic electroluminescence device 10 of an embodiment may include a capping layer CPL disposed on the second electrode EL2.

The organic electroluminescence device 10 of an embodiment may include an amine compound of an embodiment, which will be described later, in the hole transfer region HTR disposed between the first electrode EL1 and the second electrode EL2. However, embodiments of the inventive concept are not limited thereto, and the organic electroluminescence device 10 of an embodiment may include an amine compound according to an embodiment, which will be described later, not only in the hole transport region HTR but also in the emission layer EML or electron transport region ETR, which is disposed between the first electrode EL1 and the second electrode EL2, or in the capping layer CPL disposed on the second electrode EL2.

Figure 2:
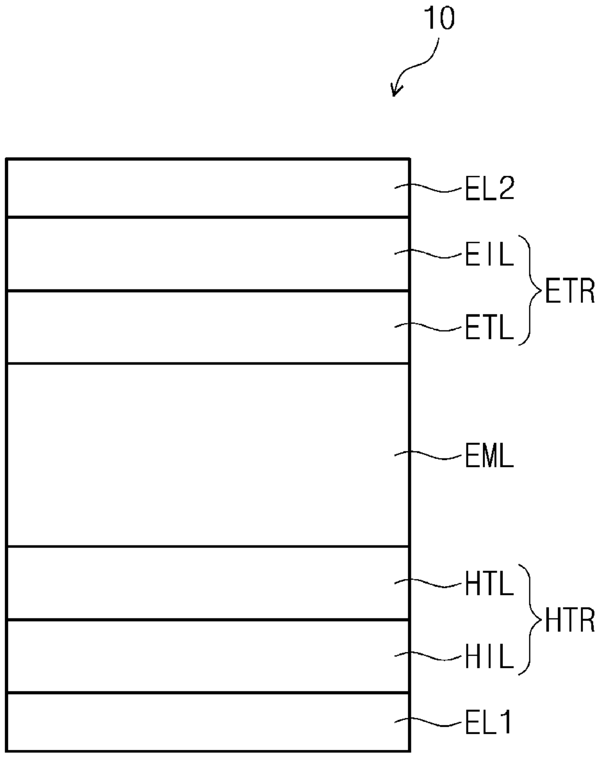
FIG. 2 is a schematic cross-sectional view illustrating an organic electroluminescence device according to an embodiment of the inventive concept.
Figure 3:
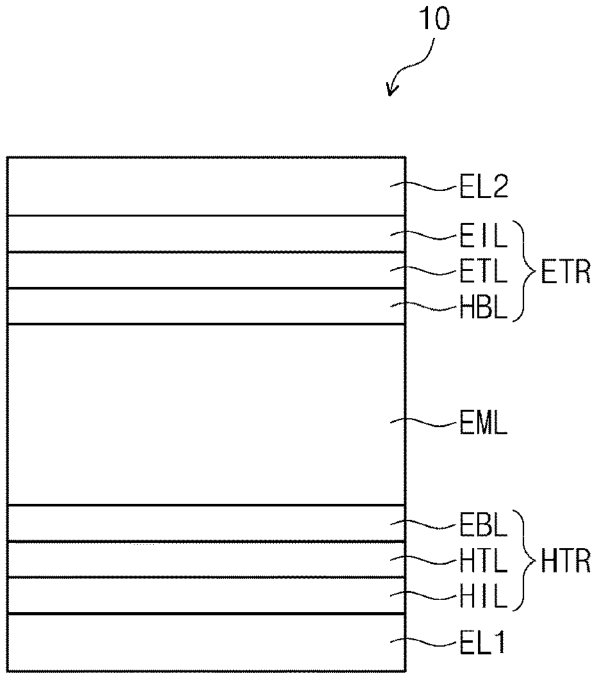
FIG. 3 is a schematic cross-sectional view illustrating an organic electroluminescence device according to an embodiment of the inventive concept.
Figure 4:
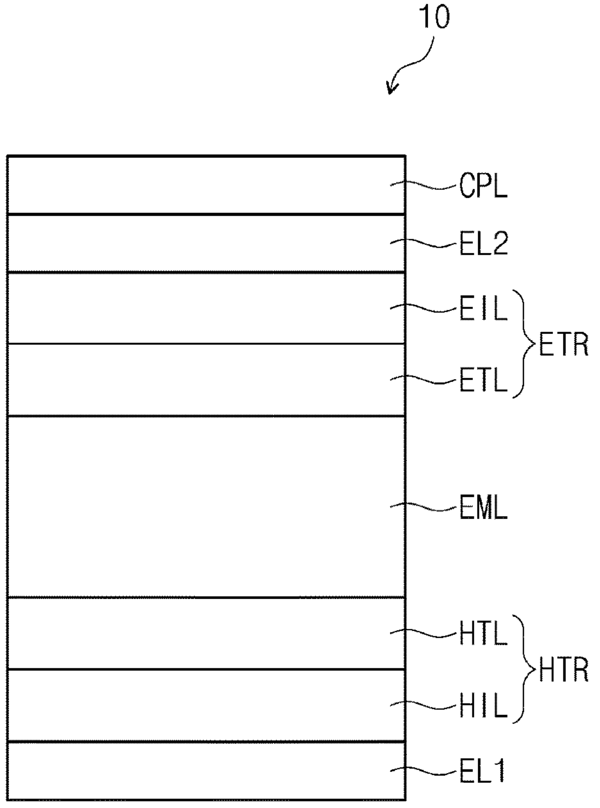
FIG. 4 is a schematic cross-sectional view illustrating an organic electroluminescence device according to an embodiment of the inventive concept.

In comparison to FIG. 1, FIG. 2 illustrates a schematic cross-sectional view of an organic electroluminescence device 10 of an embodiment, in which a hole transport region HTR includes a hole injection layer HIL and a hole transport layer HTL, and in which an electron transport region ETR includes an electron injection layer EIL and an electron transport layer ETL. In comparison to FIG. 1, FIG. 3 illustrates a schematic cross-sectional view of an organic electroluminescence device 10 of an embodiment, in which a hole transport region HTR includes a hole injection layer HIL, a hole transport layer HTL, and an electron blocking layer EBL, and in which an electron transport region ETR includes an electron injection layer EIL, an electron transport layer ETL, and a hole blocking layer HBL. In comparison to FIG. 2, FIG. 4 illustrates a schematic cross-sectional view of an organic electroluminescence device 10 of an embodiment including a capping layer CPL disposed on the second electrode EL2.

The first electrode EL1 has a conductivity. The first electrode EL1 may be formed of a metal alloy or a conductive compound. The first electrode EL1 may be a pixel electrode or positive electrode. The first electrode EL1 may be a transmissive electrode, a transflective electrode, or a reflective electrode. When the first electrode EL1 is a transmissive electrode, the first electrode EL1 may include a transparent metal oxide, such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). For example, the first electrode EL1 may have a multilayer structure including a reflective layer or a transflective layer formed of the above-described materials, and a transparent conductive layer formed of ITO, IZO, ZnO, ITZO, etc. For example, the first electrode EL1 may have a three-layer structure of ITO/Ag/ITO, but embodiments of the inventive concept are not limited thereto. The thickness of the first electrode EL1 may be in a range of about 1,000 Å to about 10,000 Å. For example, the thickness of the first electrode EL1 may be in a range of about 1,000 Å to about 3,000 Å.

The hole transport region HTR may be disposed on the first electrode EL1. The hole transport region HTR may include at least one of a hole injection layer HIL, a hole transport layer HTL, a hole buffer layer (not shown), or an electron blocking layer.

The hole transport region HTR may have a single layer formed of a single material, a single layer formed of different materials, or a multilayer structure including layers formed of different materials.

For example, the hole transport region HTR may have a single layer structure of a hole injection layer HIL or a hole transport layer HTL, or a single layer structure formed of a hole injection material and a hole transport material. The hole transport region HTR may have a single layer structure formed of different materials, or it may have a structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL which are sequentially laminated from the first electrode EL1, but embodiments of the inventive concept are not limited thereto.

The hole transport region HTR in the organic electroluminescence device 10 may include an amine compound according to an embodiment of the inventive concept.

In the description, the term "substituted or unsubstituted" may indicate that one is substituted or unsubstituted with at least one substituent selected from the group consisting of a deuterium atom, a halogen atom, a cyano group, a nitro group, an amino group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. Each of the substituents listed above may be substituted or unsubstituted. For example, a biphenyl group may be interpreted as an aryl group or a phenyl group substituted with a phenyl group.

In the description, examples of the halogen atom may include a fluorine atom, a chlorine atom, a bromine atom, and an iodine atom.

In the description, the alkyl group may be a linear, branched, or cyclic type. The number of carbons in the alkyl group may be 1 to 50, 1 to 30, 1 to 20, 1 to 10, or 1 to 6. Examples of the alkyl group may include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, an alkenyl group means a hydrocarbon group including at least one carbon double bond in the middle or terminal of an alkyl group having 2 or more carbon atoms. The alkenyl group may be linear or branched. Although the number of carbon atoms is not specifically limited, it may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but are not limited thereto.

In the description, an alkynyl group means a hydrocarbon group including at least one carbon triple bond in the middle or terminal of an alkyl group having 2 or more carbon atoms. The alkynyl group may be linear or branched. Although the number of carbon atoms is not specifically limited, it may be 2 to 30, 2 to 20, or 2 to 10. Examples of the alkynyl group may include an ethynyl group, a propynyl group, etc., but are not limited thereto.

In the description, a hydrocarbon ring group may be an any functional group or substituent derived from an aliphatic hydrocarbon ring, or an any functional group or substituent derived from an aromatic hydrocarbon ring. The number of ring-forming carbon atoms in the hydrocarbon ring group may be 5 to 60, 5 to 30, or 5 to 20.

In the description, an aryl group means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., but are not limited thereto.

In the description, the fluorenyl group may be substituted, and two substituents may be combined with each other to form a spiro structure. Examples of the substituted fluorenyl group are as follows. However, embodiments of the inventive concept are not limited thereto.

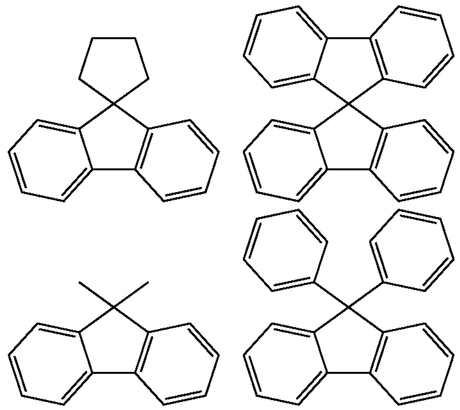

In the description, a heterocyclic group means any functional group or substituent derived from a ring containing at least one of B, O, N, P, Si, or S as a hetero atom. The heterocyclic group includes an aliphatic heterocyclic group and an aromatic heterocyclic group. The aromatic heterocyclic group may be a heteroaryl group. The aliphatic heterocycle and aromatic heterocycle may be monocyclic or polycyclic.

In the description, the heterocyclic group may include at least one of B, O, N, P, Si or S as a hetero atom. When the heterocyclic group contains two or more hetero atoms, the two or more hetero atoms may be the same as or different from each other. The heterocyclic group may be a monocyclic heterocyclic group or a polycyclic heterocyclic group, and includes a heteroaryl group. The number of ring-forming carbon atoms in the heterocyclic group may be 2 to 30, 2 to 20, or 2 to 10.

In the description, the aliphatic heterocyclic group may include at least one of B, O, N, P, Si, or S as a hetero atom. The number of ring-forming carbon atoms in the aliphatic heterocyclic group may be 2 to 30, 2 to 20, or 2 to 10. Examples of the aliphatic heterocyclic group include an oxirane group, a tyran group, a pyrrolidine group, a piperidine group, a tetrahydrofuran group, a tetrahydrothiophene group, a thian group, a tetrahydropyran group, a 1,4-dioxane group, etc., but are not limited to thereto.

In the description, the heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophenyl, thienothiophene, benzofuranyl, phenanthroline, thiazolyl, isooxazolyl, oxadiazolyl, thiadiazolyl, phenothiazolyl, phenothiazinyl, dibenzosilole, dibenzofuranyl, etc., but are not limited thereto.

In the description, the number of carbon atoms in an amine group is not specifically limited, but may be 1 to 30. The amine group may include an alkyl amine group, an aryl amine group, or a heteroaryl amine group. Examples of the amine group include a methylamine group, a dimethylamine group, a phenylamine group, a diphenylamine group, a naphthylamine group, a 9-methyl-anthracenylamine group, a triphenylamine group, etc., but are not limited thereto.

In the description, the above description with respect to the aryl group is applied to an arylene group except that the arylene group is a divalent group.

In the description, the above description with respect to the heteroaryl group is applied to a heteroarylene group except that the heteroarylene group is a divalent group.

In the description, "—*" indicates a binding site to a neighboring atom.

The amine compound according to an embodiment of the inventive concept is represented by Formula 1:

[Formula 1]

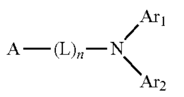

In Formula 1, L may be a substituted or unsubstituted arylene group having 6 to 30 ring-forming carbon atoms, or a substituted or unsubstituted heteroarylene group having 2 to 30 ring-forming carbon atoms.

In Formula 1, n may be an integer from 0 to 2, and when n is 2, groups represented by L may be the same as or different from each other.

In Formula 1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms.

In Formula 1, A may be represented by one of Formula 2-1 to Formula 2-5:

[Formula 2-1]

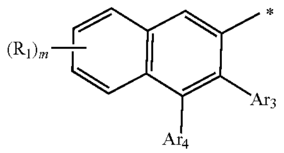

[Formula 2-2]

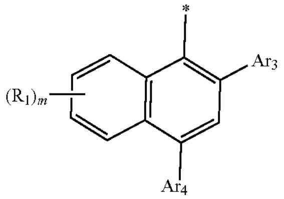

[Formula 2-3]

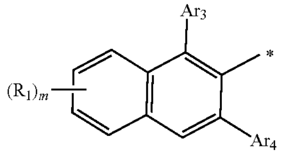

[Formula 2-4]

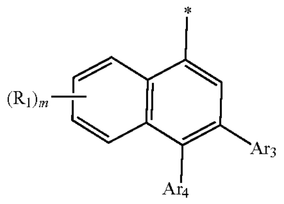

[Formula 2-5]

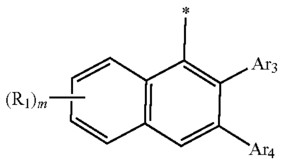

In Formula 2-1 to Formula 2-5, $R_1$ may be a hydrogen atom, a deuterium atom, a halogen atom, a cyano group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 2-1 to Formula 2-5, m may be an integer from 0 to 4, and when m is 2 or more, groups represented by $R_1$ may be the same as or different from each other.

In Formula 2-1 to Formula 2-5, $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula 2-1 to Formula 2-5, * indicates a binding site to a neighboring atom.

When A in Formula 1 is represented by Formula 2-4 or Formula 2-5, in Formula 1, n may be 1 and $Ar_2$ may be a substituted or unsubstituted heteroaryl group having 2 to 30 ring-forming carbon atoms.

In an embodiment, the amine compound may be a monoamine compound. In an embodiment, the amine compound may not include a heteroaryl group containing N.

In an embodiment, a monoamine compound represented by Formula 1 may not include a substituent containing N.

In an embodiment, $Ar_3$ and/or $Ar_4$ in Formula 2-1 to Formula 2-5 may be a substituted or unsubstituted aryl group having 6 to 30 ring-forming carbon atoms.

In an embodiment, $Ar_3$ and/or $Ar_4$ in Formula 2-1 to Formula 2-5 may be a substituted or unsubstituted phenyl group.

In an embodiment, when $Ar_1$ and/or $Ar_2$ in Formula 1 are a substituted or unsubstituted heteroaryl group having 2 to 30 ring-forming carbon atoms, $Ar_1$ and/or $Ar_2$ may be represented by Formula 5:

[Formula 5]

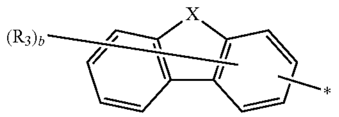

In Formula 5, X may be O or S.

In Formula 5, $R_3$ may be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 5, b may be an integer from 0 to 7, and when b is 2 or more, groups represented by $R_3$ may be the same as or different from each other.

In Formula 5, * indicates a binding site to a neighboring atom.

In an embodiment, n in Formula 1 may be 0 or 1.

In an embodiment, L in Formula 1 may be a substituted or unsubstituted arylene group having 6 to 15 ring-forming carbon atoms. L in Formula 1 may be an unsubstituted arylene group having 6 to 15 ring-forming carbon atoms.

In an embodiment, L in Formula 1 may be a direct linkage, a substituted or unsubstituted phenylene group, or a substituted or unsubstituted biphenylene group.

In an embodiment, Formula 1 may be represented by one of Formula 6-1 to Formula 6-4:

[Formula 6-1]

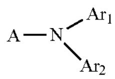

[Formula 6-2]

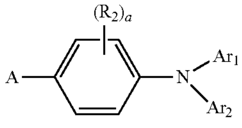

[Formula 6-3]

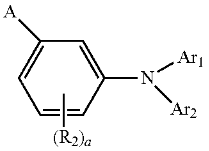

[Formula 6-4]

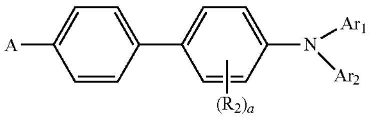

In Formula 6-1 to Formula 6-4, $R_2$ may be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 6-1 to Formula 6-4, a may be an integer from 0 to 4, and when a is 2 or more, groups represented by $R_2$ may be the same as or different from each other.

In Formula 6-1 to Formula 6-4, A, $Ar_1$, and $Ar_2$ may be the same as defined in Formula 1.

In an embodiment, $R_1$ in Formula 1 may be a hydrogen atom or a deuterium atom.

In an embodiment, Formula 1 may be represented by one of Formula 3-1 to Formula 3-3:

[Formula 3-1]

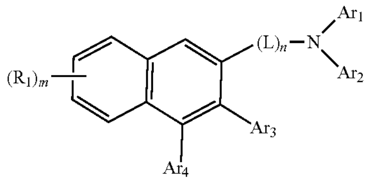

[Formula 3-2]

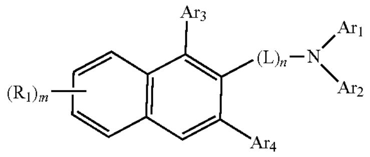

[Formula 3-3]

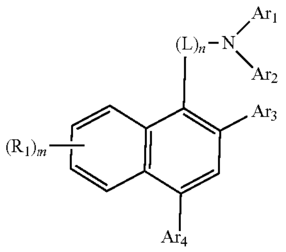

In Formula 3-1 to Formula 3-3, $R_1$ may be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 3-1 to Formula 3-3, m may be an integer from 0 to 4, and when m is 2 or more, groups represented by $R_1$ may be the same as or different from each other.

In Formula 3-1 to Formula 3-3, $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula 3-1 to Formula 3-3, $Ar_1$, $Ar_2$, L and n may be the same as defined in Formula 1.

In an embodiment, Formula 1 may be represented by Formula 4-1 or Formula 4-2:

[Formula 4-1]

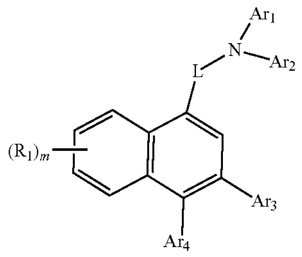

[Formula 4-2]

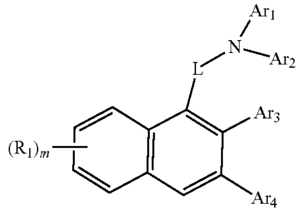

In Formula 4-1 and Formula 4-2, $Ar_2$ may be a substituted or unsubstituted heteroaryl group having 2 to 30 ring-forming carbon atoms.

In Formula 4-1 and Formula 4-2, $R_1$ may be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 4-1 and Formula 4-2, m may be an integer from 0 to 4, and when m is 2 or more, groups represented by $R_1$ may be the same as or different from each other.

In Formula 4-1 and Formula 4-2, $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula 4-1 and Formula 4-2, $Ar_1$ and L may be the same as defined in Formula 1.

In an embodiment, $Ar_2$ in Formula 4-1 and Formula 4-2 may be a substituted or unsubstituted heteroaryl group having 2 to 15 ring-forming carbon atoms, or a substituted or unsubstituted heteroaryl group having 2 to 12 ring-forming carbon atoms.

In an embodiment, $Ar_2$ in Formula 4-1 and Formula 4-2 may be represented by Formula 5:

[Formula 5]

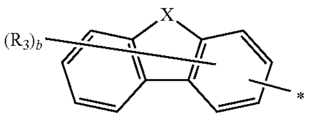

In Formula 5, X may be O or S.

In Formula 5, $R_3$ may be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 5, b may be an integer from 0 to 7, and when b is 2 or more, groups represented by $R_3$ may be the same as or different from each other.

In Formula 5, * indicates a binding site to a neighboring atom.

In an embodiment, Formula 3-1 may be represented by one of Formula 3-1-1 to Formula 3-1-3:

[Formula 3-1-1]

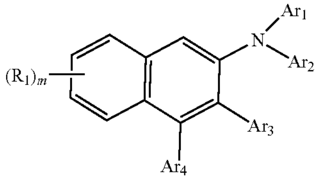

[Formula 3-1-2]

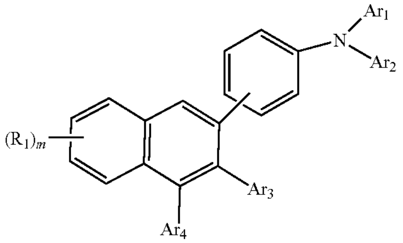

[Formula 3-1-3]

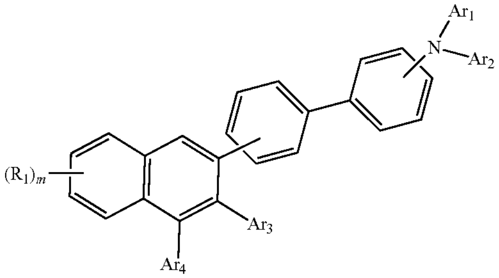

In Formula 3-1-1 to Formula 3-1-3, $Ar_1$ to $Ar_4$, $R_1$, and m may be the same as defined in Formula 3-1.

In an embodiment, Formula 3-2 may be represented by one of Formula 3-2-1 to Formula 3-2-3:

[Formula 3-2-1]

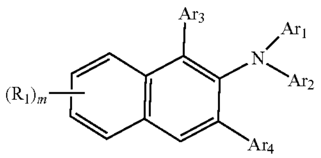

[Formula 3-2-2]

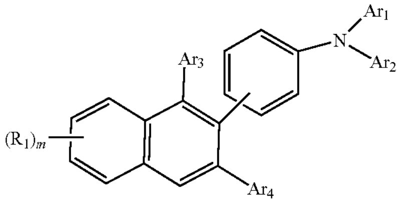

-continued

[Formula 3-2-3]

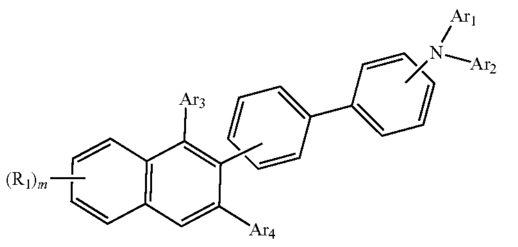

In Formula 3-2-1 to Formula 3-2-3, $Ar_1$ to $Ar_4$, $R_1$, and m may be the same as defined in Formula 3-2.

In an embodiment, Formula 3-3 may be represented by one of Formula 3-3-1 to Formula 3-3-3:

[Formula 3-3-1]

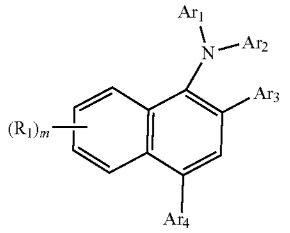

[Formula 3-3-2]

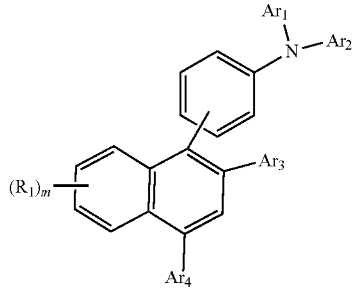

[Formula 3-3-3]

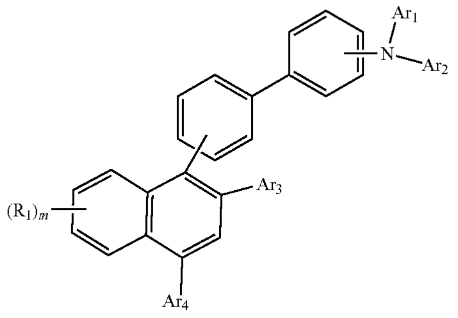

In Formula 3-3-1 to Formula 3-3-3, $Ar_1$ to $Ar_4$, $R_1$, and m may be the same as defined in Formula 3-3.

In an embodiment, Formula 4-1 may be represented by Formula 4-1-1 or Formula

[Formula 4-1-1]

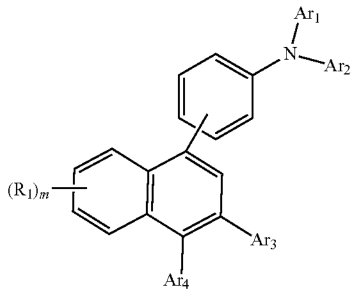

[Formula 4-1-2]

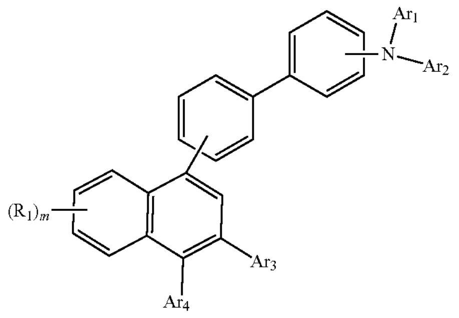

In Formula 4-1-1 and Formula 4-1-2, $Ar_1$ to $Ar_4$, $R_1$, and m may be the same as defined in Formula 4-1.

In an embodiment, Formula 4-2 may be represented by Formula 4-2-1 or Formula 4-2-2:

[Formula 4-2-1]

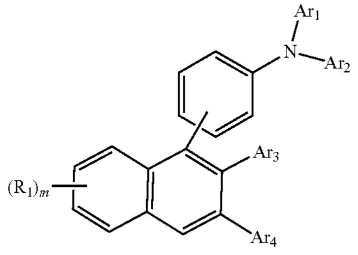

[Formula 4-2-2]

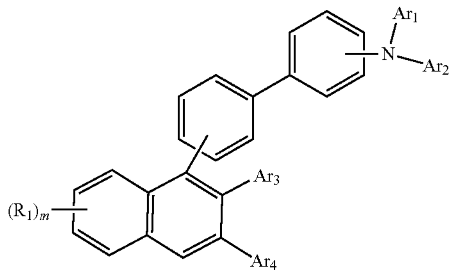

In Formula 4-2-1 and Formula 4-2-2, $Ar_1$ to $Ar_4$, $R_1$, and m may be the same as defined in Formula 4-2.

The amine compound represented by Formula 1 according to an embodiment of the inventive concept may be one selected from among the compounds represented by Compound Groups 1 to 4. However, embodiments of the inventive concept are not limited thereto.

[Compound Group 1]
| | n | A—L—* | $Ar_1$ | $Ar_2$ |
|---|---|---|---|---|
| 1-A1-1 | 1 | 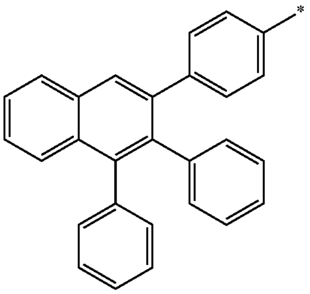 [SMILES: *c1ccc(-c2cc3ccccc3c(-c3ccccc3)c2-c2ccccc2)cc1] | 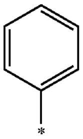 | 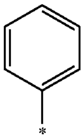 [SMILES: *c1ccccc1] |
| 1-A1-2 | 1 | 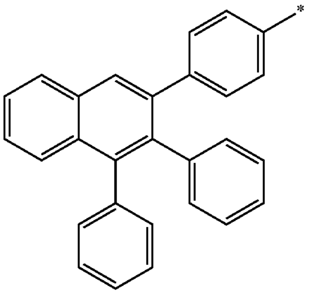 [SMILES: *c1ccc(-c2cc3ccccc3c(-c3ccccc3)c2-c2ccccc2)cc1] | 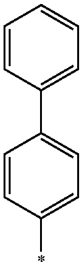 [SMILES: *c1ccc(-c2ccccc2)cc1] | 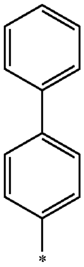 [SMILES: *c1ccc(-c2ccccc2)cc1] |
| 1-A1-3 | 1 | 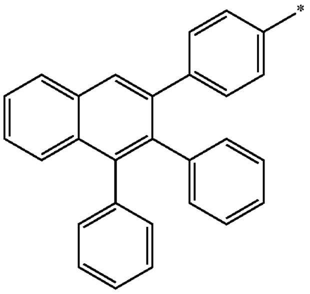 [SMILES: *c1ccc(-c2cc3ccccc3c(-c3ccccc3)c2-c2ccccc2)cc1] | 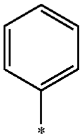 [SMILES: *c1ccccc1] | 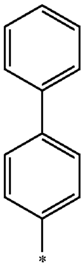 [SMILES: *c1ccc(-c2ccccc2)cc1] |
| 1-A1-4 | 1 | 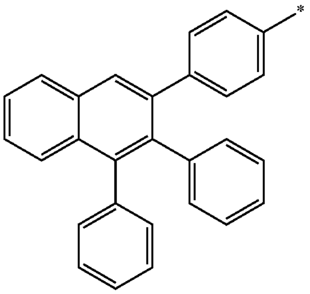 [SMILES: *c1ccc(-c2cc3ccccc3c(-c3ccccc3)c2-c2ccccc2)cc1] | 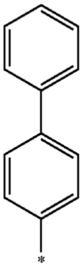 [SMILES: *c1ccc(-c2ccccc2)cc1] | 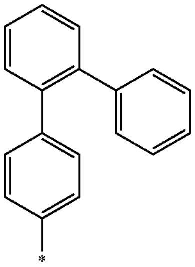 [SMILES: *c1ccc(-c2ccccc2-c2ccccc2)cc1] |
| 1-A1-5 | 1 | 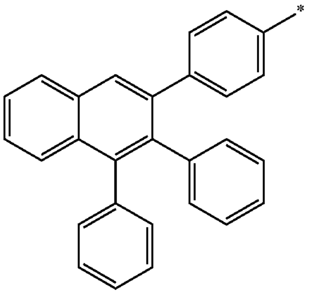 [SMILES: *c1ccc(-c2cc3ccccc3c(-c3ccccc3)c2-c2ccccc2)cc1] | 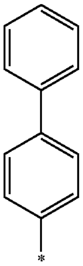 [SMILES: *c1ccc(-c2ccccc2)cc1] | 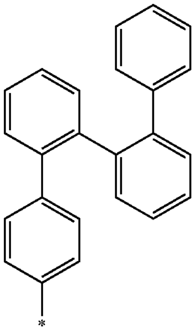 [SMILES: *c1ccc(-c2ccccc2-c2ccccc2-c2ccccc2)cc1] |

-continued
| [Compound Group 1] | | | | |
|---|---|---|---|---|
| | n | A—L—* | $Ar_1$ | $Ar_2$ |
| 1-A1-6 | 1 | 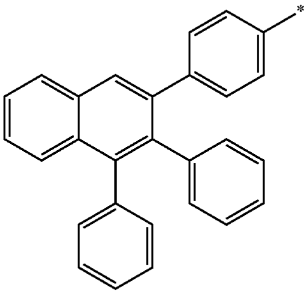 [SMILES: *c1ccc(-c2cc3ccccc3c(-c3ccccc3)c2-c2ccccc2)cc1] | 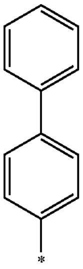 [SMILES: *c1ccc(-c2ccccc2)cc1] | 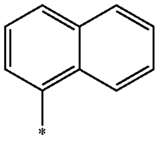 |
| 1-A1-7 | 1 | 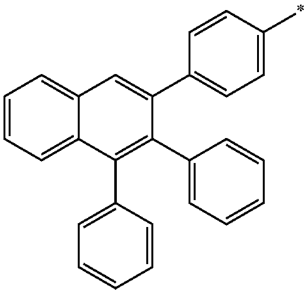 [SMILES: *c1ccc(-c2cc3ccccc3c(-c3ccccc3)c2-c2ccccc2)cc1] | 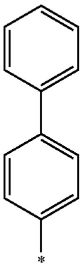 | 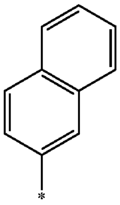 |
| 1-A1-8 | 1 | 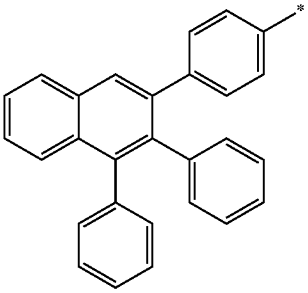 [SMILES: *c1ccc(-c2cc3ccccc3c(-c3ccccc3)c2-c2ccccc2)cc1] | 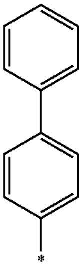 [SMILES: *c1ccc(-c2ccccc2)cc1] | 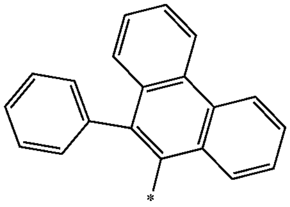 [SMILES: *c1c(-c2ccccc2)c2ccccc2c2ccccc12] |
| 1-A1-9 | 1 | 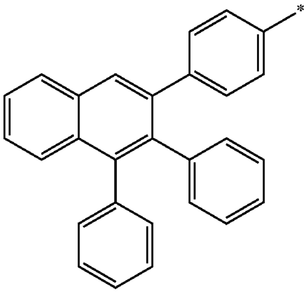 [SMILES: *c1ccc(-c2cc3ccccc3c(-c3ccccc3)c2-c2ccccc2)cc1] | 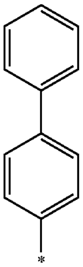 [SMILES: *c1ccc(-c2ccccc2)cc1] | 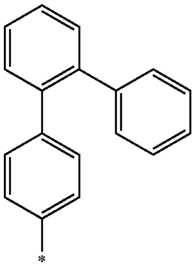 [SMILES: *c1ccc(-c2ccccc2-c2ccccc2)cc1] |
| 1-A1-10 | 1 | 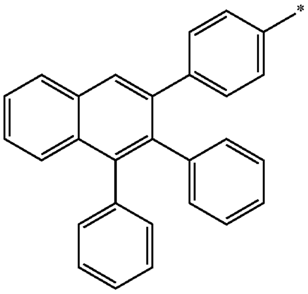 [SMILES: *c1ccc(-c2cc3ccccc3c(-c3ccccc3)c2-c2ccccc2)cc1] | 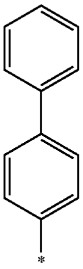 [SMILES: *c1ccc(-c2ccccc2)cc1] | 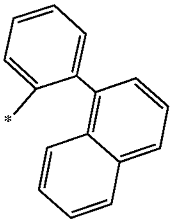 [SMILES: *c1ccccc1-c1cccc2ccccc12] |

-continued
[Compound Group 1]
| | n | A—L—* | $Ar_1$ | $Ar_2$ |
|---|---|---|---|---|
| 1-A1-11 | 1 | 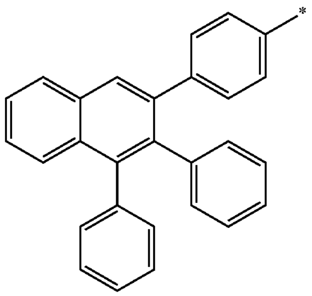 [SMILES: *c1ccc(-c2cc3ccccc3c(-c3ccccc3)c2-c2ccccc2)cc1] | 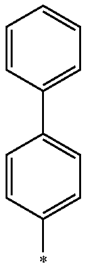 [SMILES: *c1ccc(-c2ccccc2)cc1] | 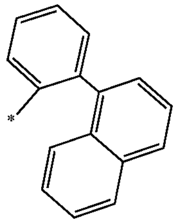 [SMILES: *c1ccccc1-c1cccc2ccccc12] |
| 1-A1-12 | 1 | 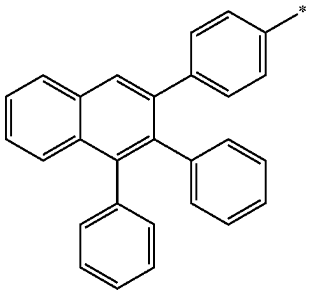 [SMILES: *c1ccc(-c2cc3ccccc3c(-c3ccccc3)c2-c2ccccc2)cc1] | 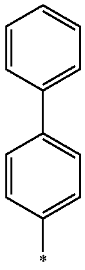 [SMILES: *c1ccc(-c2ccccc2)cc1] | 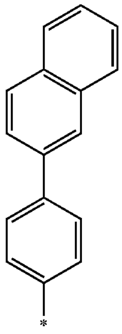 |
| 1-A1-13 | 1 | 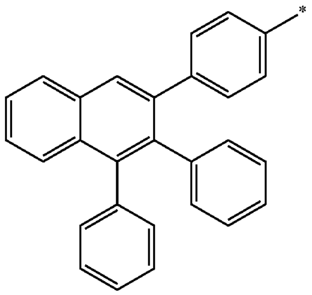 [SMILES: *c1ccc(-c2cc3ccccc3c(-c3ccccc3)c2-c2ccccc2)cc1] | 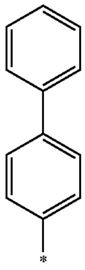 [SMILES: *c1ccc(-c2ccccc2)cc1] | 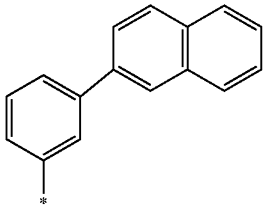 [SMILES: *c1cccc(-c2ccc3ccccc3c2)c1] |
| 1-A1-14 | 1 | 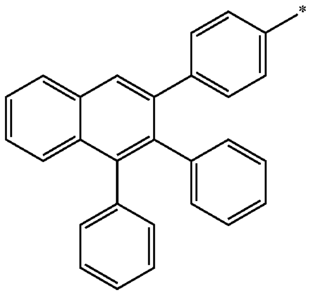 [SMILES: *c1ccc(-c2cc3ccccc3c(-c3ccccc3)c2-c2ccccc2)cc1] | 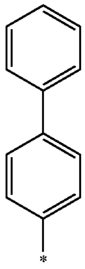 [SMILES: *c1ccc(-c2ccccc2)cc1] | 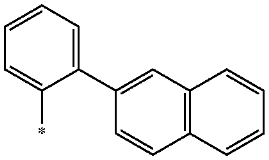 [SMILES: *c1ccccc1-c1ccc2ccccc2c1] |
| 1-A1-15 | 1 | 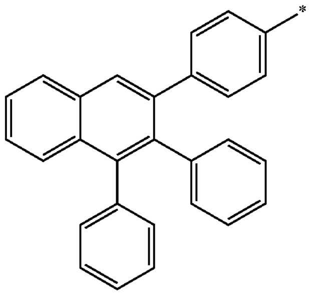 [SMILES: *c1ccc(-c2cc3ccccc3c(-c3ccccc3)c2-c2ccccc2)cc1] | 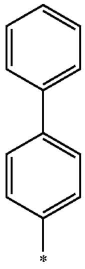 [SMILES: *c1ccc(-c2ccccc2)cc1] | 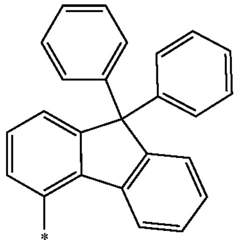 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 1-A1-16 | 1 | 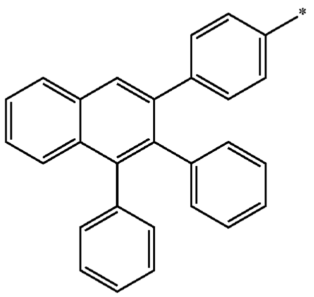 [SMILES: *c1ccc(-c2cc3ccccc3c(-c3ccccc3)c2-c2ccccc2)cc1] | 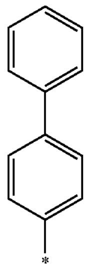 [SMILES: *c1ccc(-c2ccccc2)cc1] | 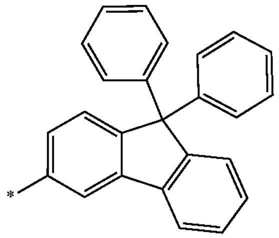 [SMILES: *c1ccc2c(c1)-c1ccccc1C2(c1ccccc1)c1ccccc1] |
| 1-A1-17 | 1 | 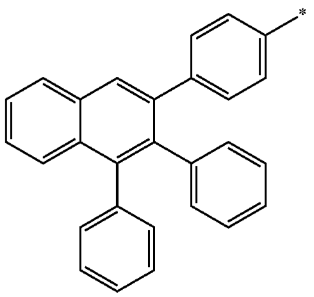 [SMILES: *c1ccc(-c2cc3ccccc3c(-c3ccccc3)c2-c2ccccc2)cc1] | 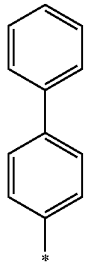 [SMILES: *c1ccc(-c2ccccc2)cc1] | 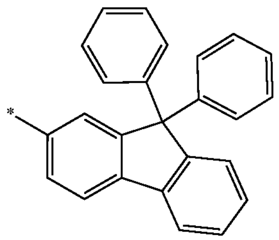 [SMILES: *c1ccc2c(c1)C(c1ccccc1)(c1ccccc1)c1ccccc1-2] |
| 1-A1-18 | 1 | 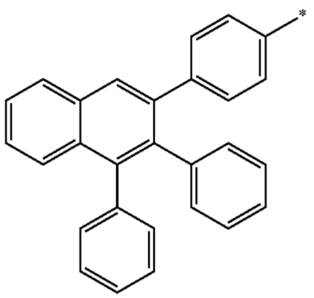 [SMILES: *c1ccc(-c2cc3ccccc3c(-c3ccccc3)c2-c2ccccc2)cc1] | 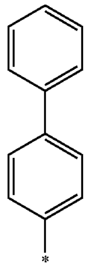 [SMILES: *c1ccc(-c2ccccc2)cc1] | 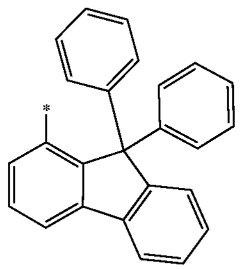 [SMILES: *c1cccc2c1C(c1ccccc1)(c1ccccc1)c1ccccc1-2] |
| 1-A1-19 | 1 | 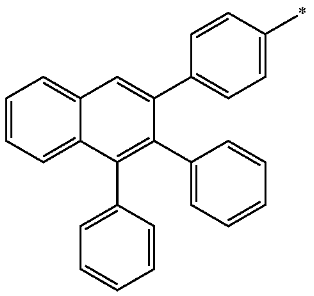 [SMILES: *c1ccc(-c2cc3ccccc3c(-c3ccccc3)c2-c2ccccc2)cc1] | 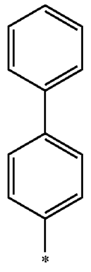 [SMILES: *c1ccc(-c2ccccc2)cc1] | 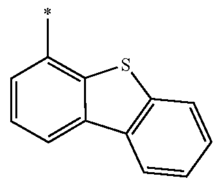 |
| 1-A1-20 | 1 | 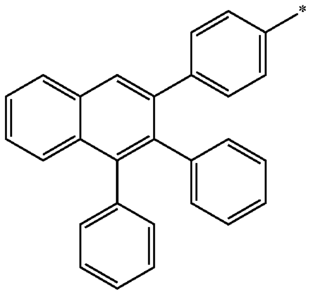 [SMILES: *c1ccc(-c2cc3ccccc3c(-c3ccccc3)c2-c2ccccc2)cc1] | 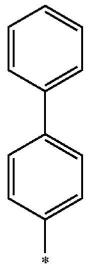 [SMILES: *c1ccc(-c2ccccc2)cc1] | 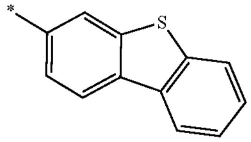 |

-continued
[Compound Group 1]
| | n | A—L—* | $Ar_1$ | $Ar_2$ |
|---|---|---|---|---|
| 1-A1-21 | 1 | 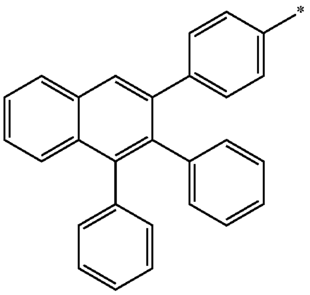 [SMILES: *c1ccc(-c2cc3ccccc3c(-c3ccccc3)c2-c2ccccc2)cc1] | 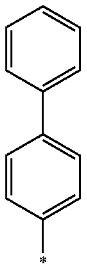 [SMILES: *c1ccc(-c2ccccc2)cc1] | 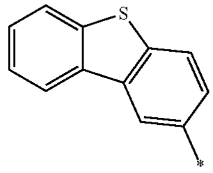 |
| 1-A1-22 | 1 | 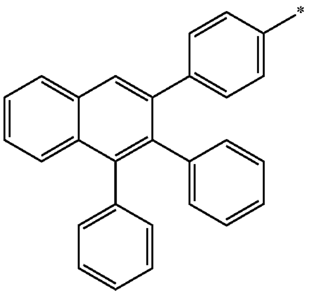 [SMILES: *c1ccc(-c2cc3ccccc3c(-c3ccccc3)c2-c2ccccc2)cc1] | 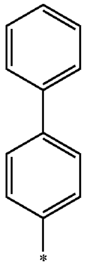 [SMILES: *c1ccc(-c2ccccc2)cc1] | 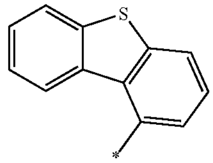 |
| 1-A1-23 | 1 | 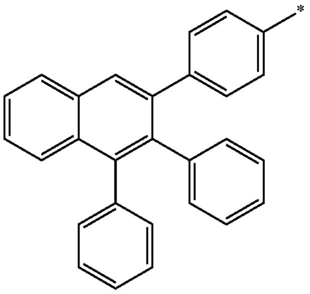 [SMILES: *c1ccc(-c2cc3ccccc3c(-c3ccccc3)c2-c2ccccc2)cc1] | 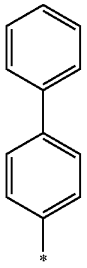 [SMILES: *c1ccc(-c2ccccc2)cc1] | 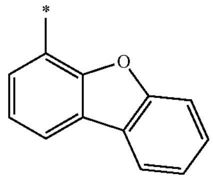 |
| 1-A1-24 | 1 | 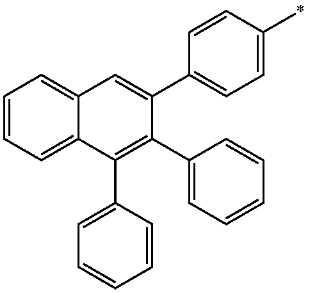 [SMILES: *c1ccc(-c2cc3ccccc3c(-c3ccccc3)c2-c2ccccc2)cc1] | 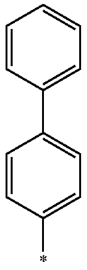 [SMILES: *c1ccc(-c2ccccc2)cc1] | 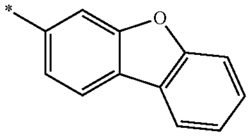 |
| 1-A1-25 | 1 | 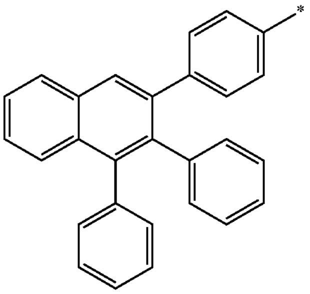 [SMILES: *c1ccc(-c2cc3ccccc3c(-c3ccccc3)c2-c2ccccc2)cc1] | 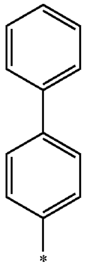 [SMILES: *c1ccc(-c2ccccc2)cc1] | 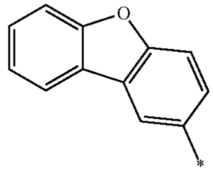 |

-continued
[Compound Group 1]
| | n | A—L—* | $Ar_1$ | $Ar_2$ |
|---|---|---|---|---|
| 1-A1-26 | 1 | 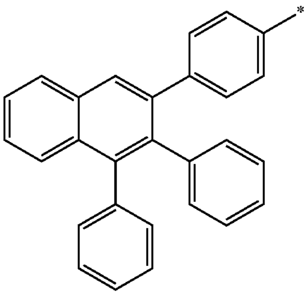 [SMILES: *c1ccc(-c2cc3ccccc3c(-c3ccccc3)c2-c2ccccc2)cc1] | 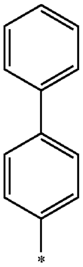 [SMILES: *c1ccc(-c2ccccc2)cc1] | 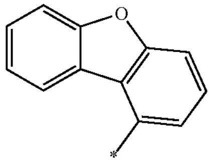 |
| 1-A1-27 | 1 | 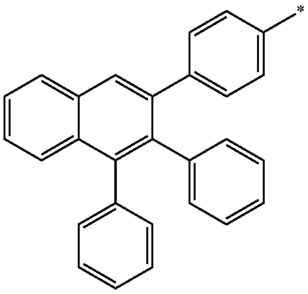 [SMILES: *c1ccc(-c2cc3ccccc3c(-c3ccccc3)c2-c2ccccc2)cc1] | 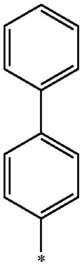 [SMILES: *c1ccc(-c2ccccc2)cc1] | 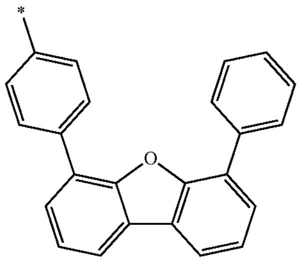 |
| 1-A1-28 | 1 | 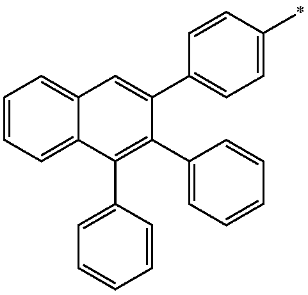 [SMILES: *c1ccc(-c2cc3ccccc3c(-c3ccccc3)c2-c2ccccc2)cc1] | 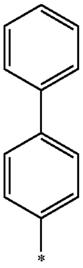 [SMILES: *c1ccc(-c2ccccc2)cc1] | 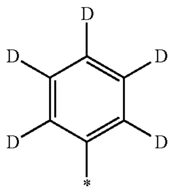 |
| 1-A1-29 | 1 | 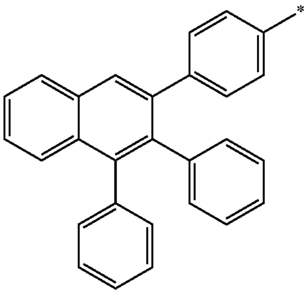 [SMILES: *c1ccc(-c2cc3ccccc3c(-c3ccccc3)c2-c2ccccc2)cc1] | 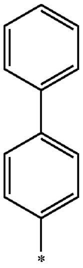 [SMILES: *c1ccc(-c2ccccc2)cc1] | 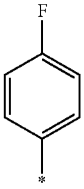 |
| 1-A1-30 | 1 | 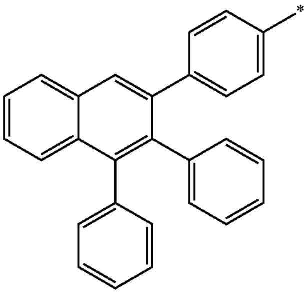 [SMILES: *c1ccc(-c2cc3ccccc3c(-c3ccccc3)c2-c2ccccc2)cc1] | 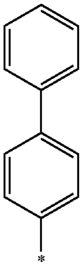 [SMILES: *c1ccc(-c2ccccc2)cc1] | 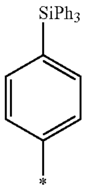 |

-continued
[Compound Group 1]
| | n | A—L—* | $Ar_1$ | $Ar_2$ |
|---|---|---|---|---|
| 1-A1-31 | 1 | 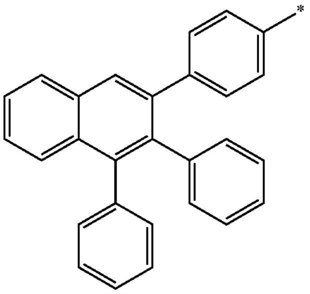 [SMILES: *c1ccc(-c2cc3ccccc3c(-c3ccccc3)c2-c2ccccc2)cc1] | 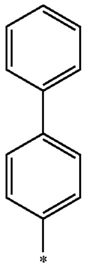 [SMILES: *c1ccc(-c2ccccc2)cc1] | 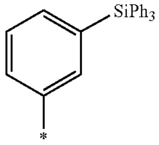 |
| 1-A1-32 | 1 | 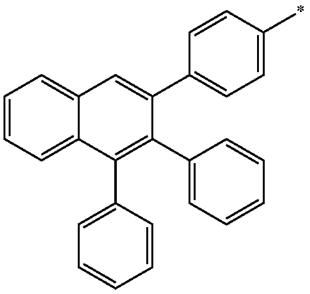 [SMILES: *c1ccc(-c2cc3ccccc3c(-c3ccccc3)c2-c2ccccc2)cc1] | 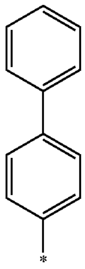 [SMILES: *c1ccc(-c2ccccc2)cc1] | 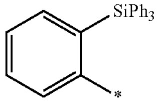 |
| 1-A1-33 | 1 | 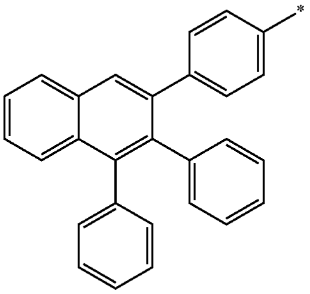 [SMILES: *c1ccc(-c2cc3ccccc3c(-c3ccccc3)c2-c2ccccc2)cc1] | 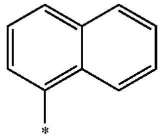 [SMILES: *c1cccc2ccccc12] | 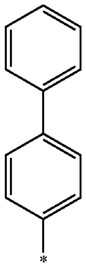 [SMILES: *c1ccc(-c2ccccc2)cc1] |
| 1-A1-34 | 1 | 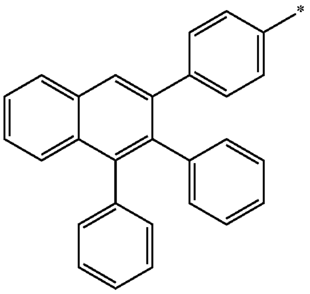 [SMILES: *c1ccc(-c2cc3ccccc3c(-c3ccccc3)c2-c2ccccc2)cc1] | 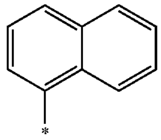 [SMILES: *c1cccc2ccccc12] | 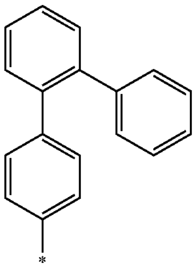 [SMILES: *c1ccc(-c2ccccc2-c2ccccc2)cc1] |
| 1-A1-35 | 1 | 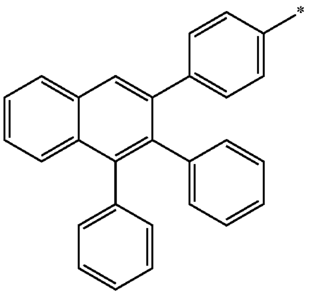 [SMILES: *c1ccc(-c2cc3ccccc3c(-c3ccccc3)c2-c2ccccc2)cc1] | 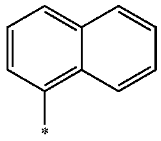 | 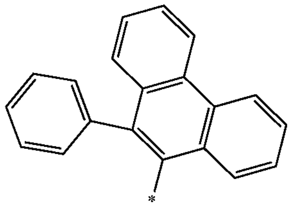 [SMILES: *c1c(-c2ccccc2)c2ccccc2c2ccccc12] |

-continued
| [Compound Group 1] | | | | |
|---|---|---|---|---|
| | n | A—L—* | $Ar_1$ | $Ar_2$ |
| 1-A1-36 | 1 | 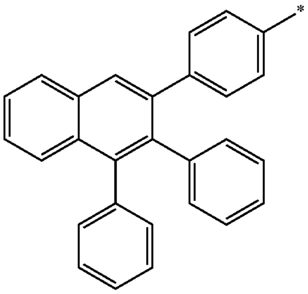 [SMILES: *c1ccc(-c2cc3ccccc3c(-c3ccccc3)c2-c2ccccc2)cc1] | 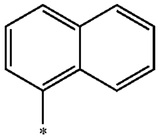 [SMILES: *c1cccc2ccccc12] | 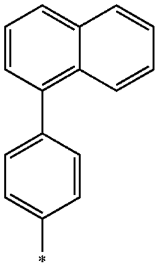 [SMILES: *c1ccc(-c2cccc3ccccc23)cc1] |
| 1-A1-37 | 1 | 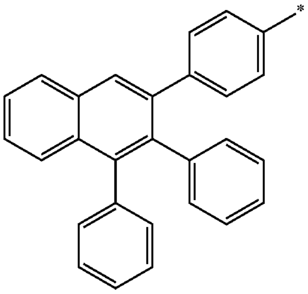 [SMILES: *c1ccc(-c2cc3ccccc3c(-c3ccccc3)c2-c2ccccc2)cc1] | 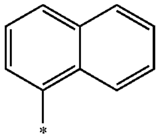 | 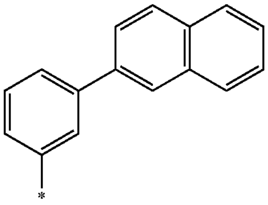 [SMILES: *c1cccc(-c2ccc3ccccc3c2)c1] |
| 1-A1-38 | 1 | 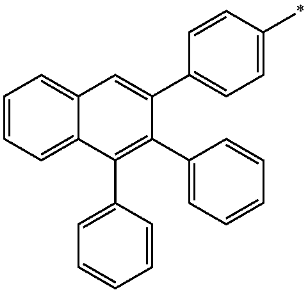 [SMILES: *c1ccc(-c2cc3ccccc3c(-c3ccccc3)c2-c2ccccc2)cc1] | 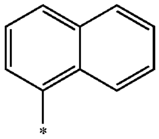 | 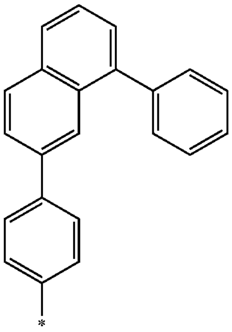 [SMILES: *c1ccc(-c2ccc3cccc(-c4ccccc4)c3c2)cc1] |
| 1-A1-39 | 1 | 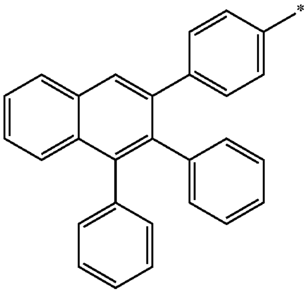 [SMILES: *c1ccc(-c2cc3ccccc3c(-c3ccccc3)c2-c2ccccc2)cc1] | 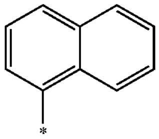 | 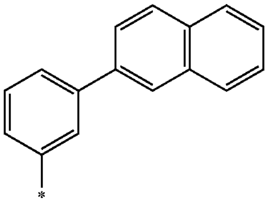 [SMILES: *c1cccc(-c2ccc3ccccc3c2)c1] |
| 1-A1-40 | 1 | 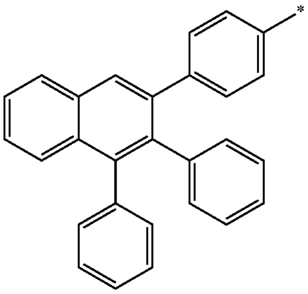 [SMILES: *c1ccc(-c2cc3ccccc3c(-c3ccccc3)c2-c2ccccc2)cc1] | 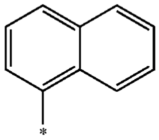 [SMILES: *c1cccc2ccccc12] | 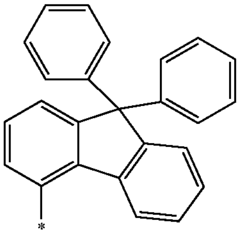 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 1-A1-41 | 1 | 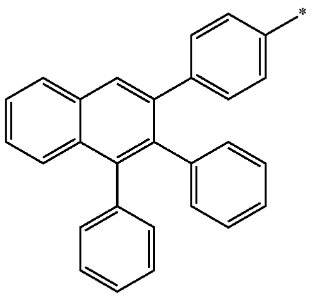 [SMILES: *c1ccc(-c2cc3ccccc3c(-c3ccccc3)c2-c2ccccc2)cc1] | 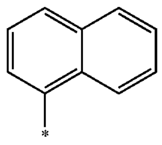 [SMILES: *c1cccc2ccccc12] | 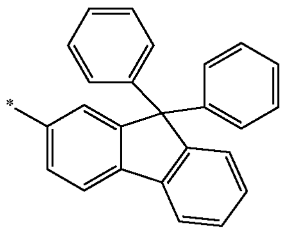 [SMILES: *c1ccc2c(c1)C(c1ccccc1)(c1ccccc1)c1ccccc1-2] |
| 1-A1-42 | 1 | 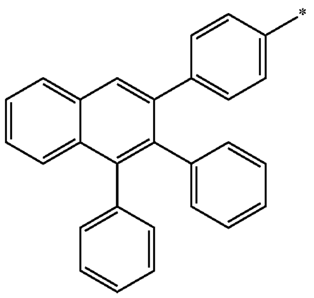 [SMILES: *c1ccc(-c2cc3ccccc3c(-c3ccccc3)c2-c2ccccc2)cc1] | 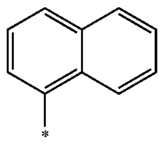 [SMILES: *c1cccc2ccccc12] | 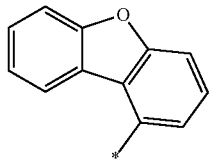 |
| 1-A1-43 | 1 | 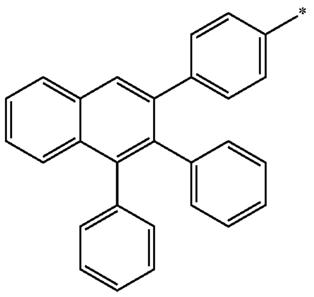 [SMILES: *c1ccc(-c2cc3ccccc3c(-c3ccccc3)c2-c2ccccc2)cc1] | 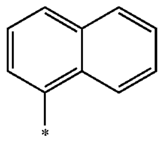 [SMILES: *c1cccc2ccccc12] | 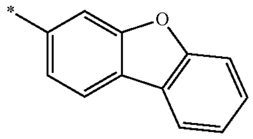 |
| 1-A1-44 | 1 | 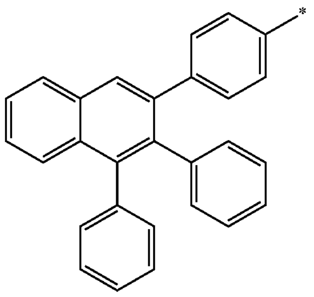 [SMILES: *c1ccc(-c2cc3ccccc3c(-c3ccccc3)c2-c2ccccc2)cc1] | 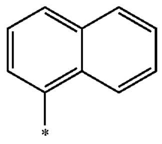 [SMILES: *c1cccc2ccccc12] | 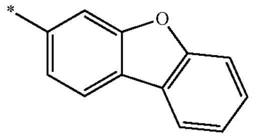 |
| 1-A1-45 | 1 | 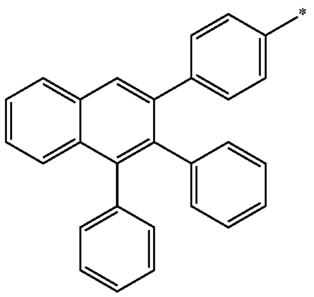 [SMILES: *c1ccc(-c2cc3ccccc3c(-c3ccccc3)c2-c2ccccc2)cc1] | 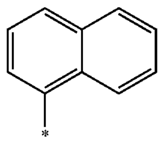 | 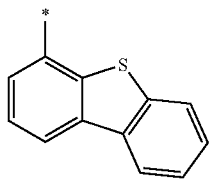 |

-continued
[Compound Group 1]
| | n | A—L—* | $Ar_1$ | $Ar_2$ |
|---|---|---|---|---|
| 1-A1-46 | 1 | 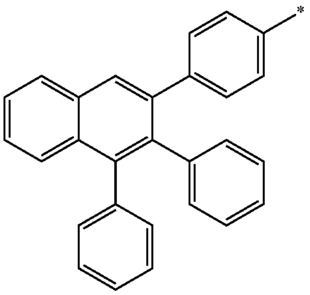 [SMILES: *c1ccc(-c2cc3ccccc3c(-c3ccccc3)c2-c2ccccc2)cc1] | 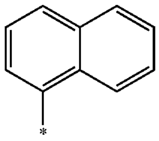 [SMILES: *c1cccc2ccccc12] | 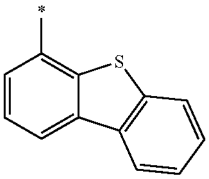 |
| 1-A1-47 | 1 | 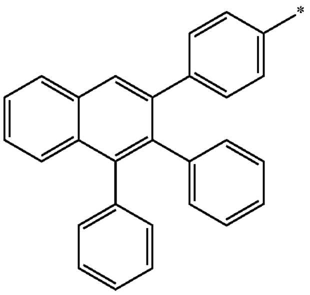 [SMILES: *c1ccc(-c2cc3ccccc3c(-c3ccccc3)c2-c2ccccc2)cc1] | 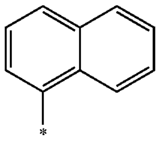 [SMILES: *c1cccc2ccccc12] | 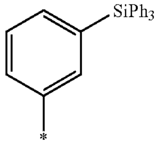 |
| 1-A1-48 | 1 | 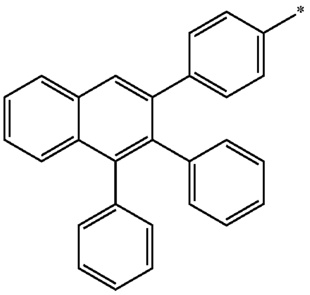 [SMILES: *c1ccc(-c2cc3ccccc3c(-c3ccccc3)c2-c2ccccc2)cc1] | 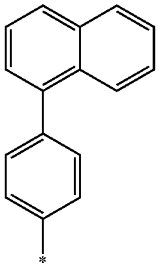 | 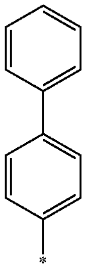 |
| 1-A1-49 | 1 | 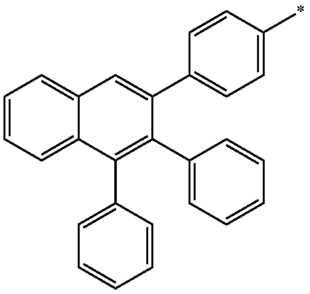 [SMILES: *c1ccc(-c2cc3ccccc3c(-c3ccccc3)c2-c2ccccc2)cc1] | 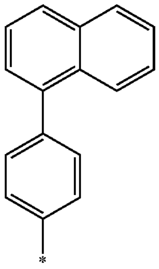 | 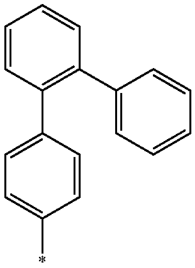 |
| 1-A1-50 | 1 | 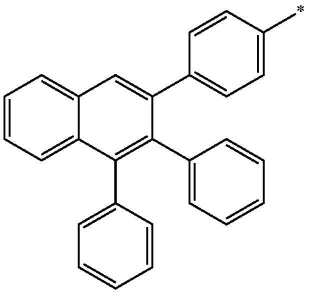 [SMILES: *c1ccc(-c2cc3ccccc3c(-c3ccccc3)c2-c2ccccc2)cc1] | 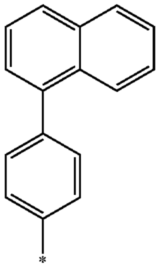 | 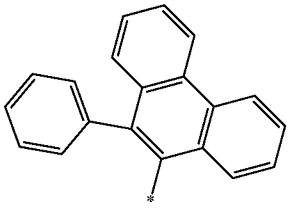 |

-continued
[Compound Group 1]
| | n | A—L—* | $Ar_1$ | $Ar_2$ |
|---|---|---|---|---|
| 1-A1-51 | 1 | 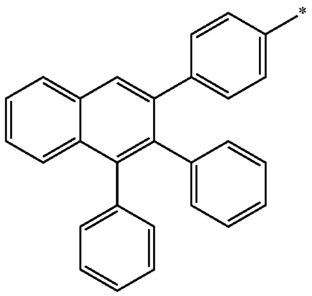 [SMILES: *c1ccc(-c2cc3ccccc3c(-c3ccccc3)c2-c2ccccc2)cc1] | 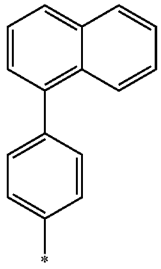 | 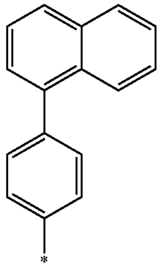 |
| 1-A1-52 | 1 | 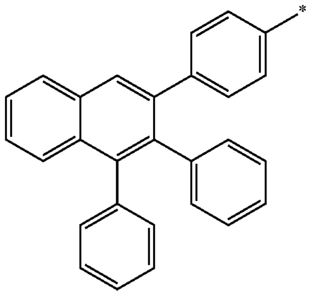 [SMILES: *c1ccc(-c2cc3ccccc3c(-c3ccccc3)c2-c2ccccc2)cc1] | 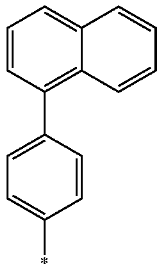 | 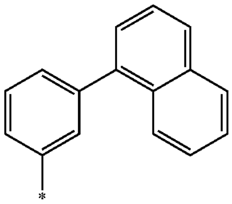 |
| 1-A1-53 | 1 | 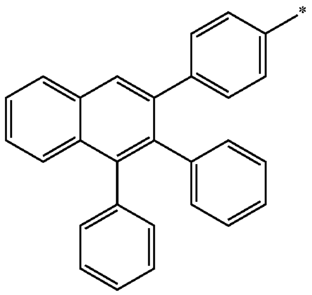 [SMILES: *c1ccc(-c2cc3ccccc3c(-c3ccccc3)c2-c2ccccc2)cc1] | 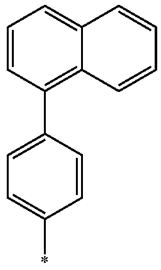 | 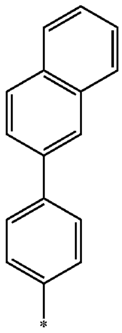 |
| 1-A1-54 | 1 | 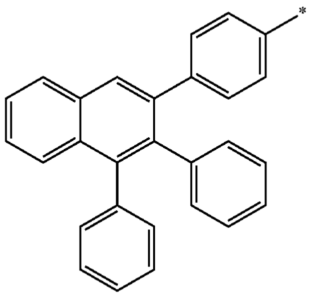 [SMILES: *c1ccc(-c2cc3ccccc3c(-c3ccccc3)c2-c2ccccc2)cc1] | 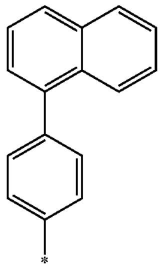 | 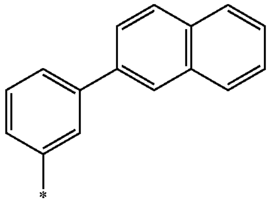 |
| 1-A1-55 | 1 | 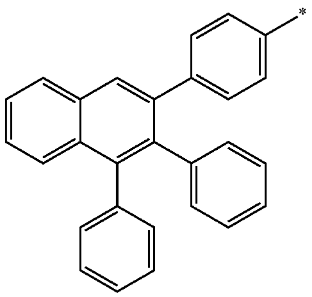 [SMILES: *c1ccc(-c2cc3ccccc3c(-c3ccccc3)c2-c2ccccc2)cc1] | 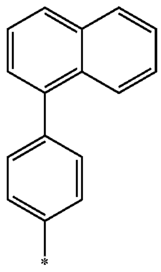 | 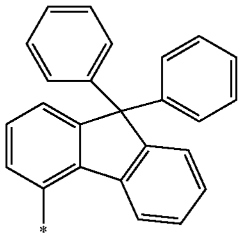 |

-continued
[Compound Group 1]
| | n | A—L—* | $Ar_1$ | $Ar_2$ |
| --- | --- | --- | --- | --- |
| 1-A1-56 | 1 | 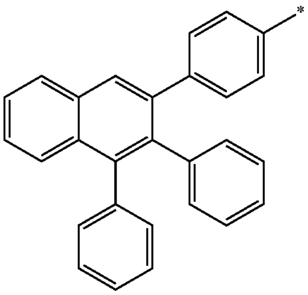 [SMILES: *c1ccc(-c2cc3ccccc3c(-c3ccccc3)c2-c2ccccc2)cc1] | 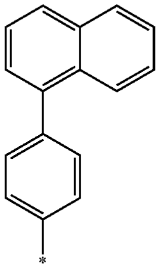 | 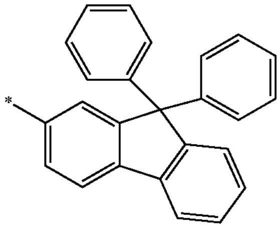 |
| 1-A1-57 | 1 | 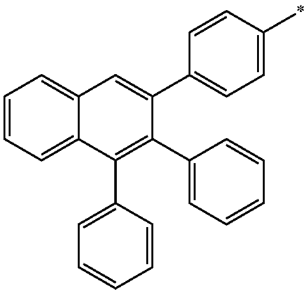 [SMILES: *c1ccc(-c2cc3ccccc3c(-c3ccccc3)c2-c2ccccc2)cc1] | 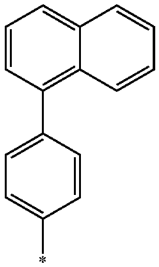 | 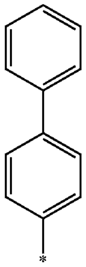 |
| 1-A1-58 | 1 | 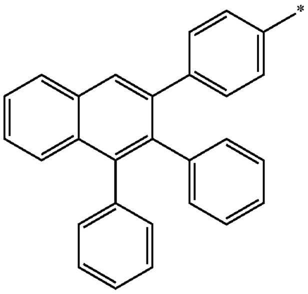 [SMILES: *c1ccc(-c2cc3ccccc3c(-c3ccccc3)c2-c2ccccc2)cc1] | 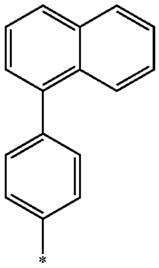 | 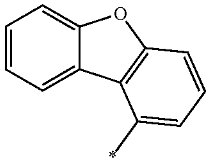 |
| 1-A1-59 | 1 | 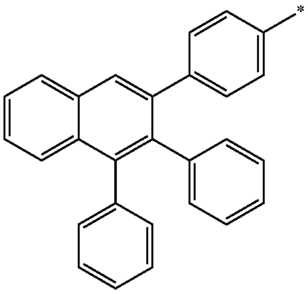 [SMILES: *c1ccc(-c2cc3ccccc3c(-c3ccccc3)c2-c2ccccc2)cc1] | 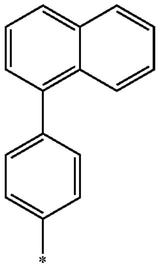 | 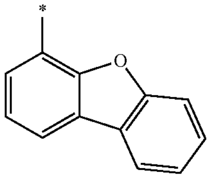 |
| 1-A1-60 | 1 | 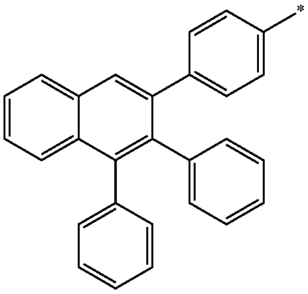 [SMILES: *c1ccc(-c2cc3ccccc3c(-c3ccccc3)c2-c2ccccc2)cc1] | 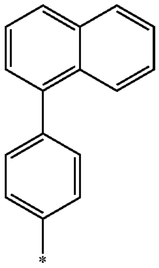 | 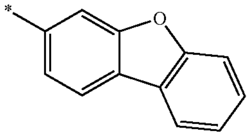 |

-continued
| [Compound Group 1] | | | | |
|---|---|---|---|---|
| | n | A—L—* | $Ar_1$ | $Ar_2$ |
| 1-A1-61 | 1 | 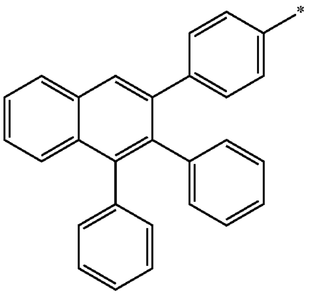 [SMILES: *c1ccc(-c2cc3ccccc3c(-c3ccccc3)c2-c2ccccc2)cc1] | 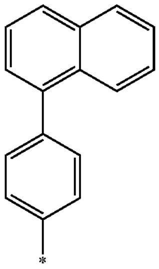 | 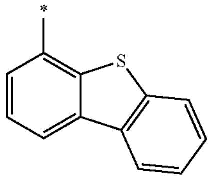 |
| 1-A1-62 | 1 | 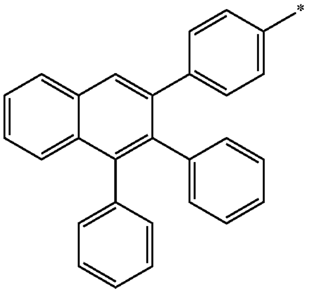 [SMILES: *c1ccc(-c2cc3ccccc3c(-c3ccccc3)c2-c2ccccc2)cc1] | 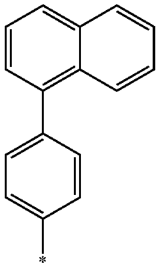 | 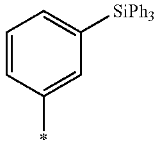 |
| 1-A1-63 | 1 | 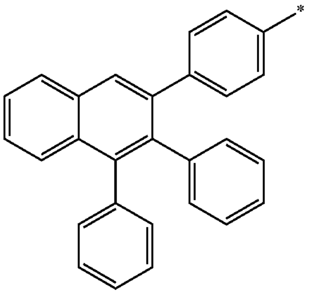 [SMILES: *c1ccc(-c2cc3ccccc3c(-c3ccccc3)c2-c2ccccc2)cc1] | 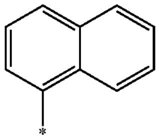 | 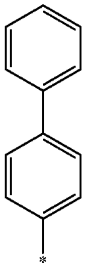 |
| 1-A1-64 | 1 | 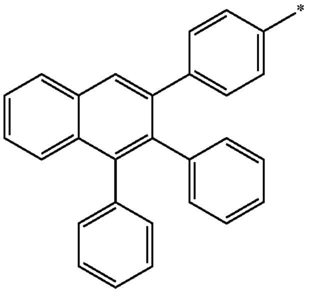 [SMILES: *c1ccc(-c2cc3ccccc3c(-c3ccccc3)c2-c2ccccc2)cc1] | 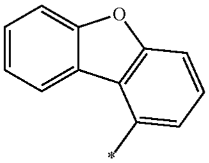 | 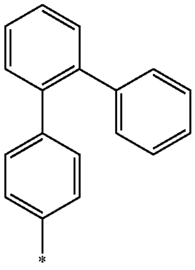 |
| 1-A1-65 | 1 | 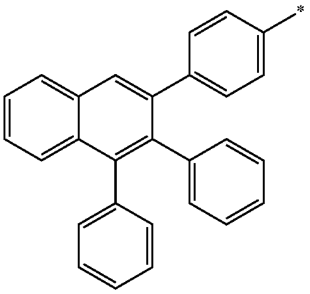 [SMILES: *c1ccc(-c2cc3ccccc3c(-c3ccccc3)c2-c2ccccc2)cc1] | 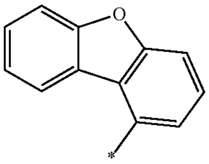 | 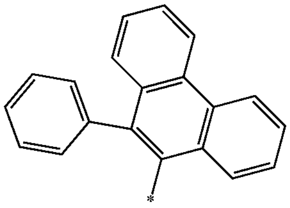 |

-continued
| [Compound Group 1] | | | | |
|---|---|---|---|---|
| | n | A—L—* | $Ar_1$ | $Ar_2$ |
| 1-A1-66 | 1 | 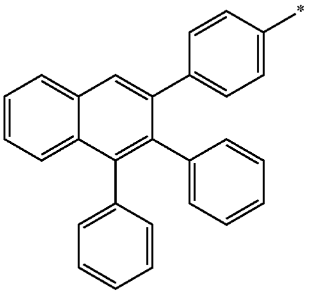 [SMILES: *c1ccc(-c2cc3ccccc3c(-c3ccccc3)c2-c2ccccc2)cc1] | 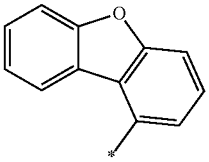 | 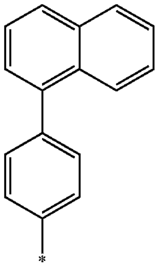 |
| 1-A1-67 | 1 | 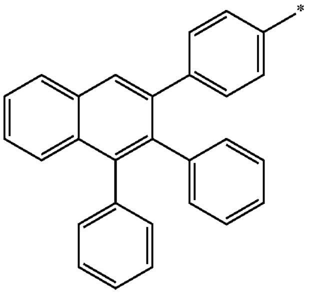 [SMILES: *c1ccc(-c2cc3ccccc3c(-c3ccccc3)c2-c2ccccc2)cc1] | 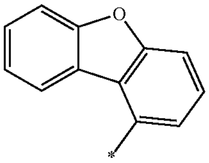 | 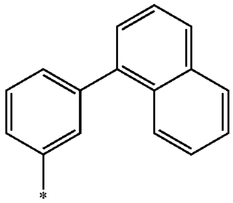 |
| 1-A1-68 | 1 | 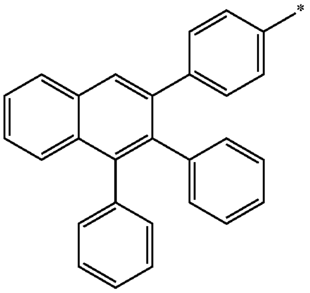 [SMILES: *c1ccc(-c2cc3ccccc3c(-c3ccccc3)c2-c2ccccc2)cc1] | 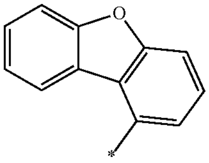 | 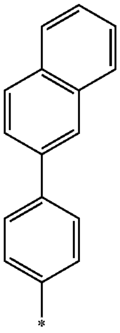 |
| 1-A1-69 | 1 | 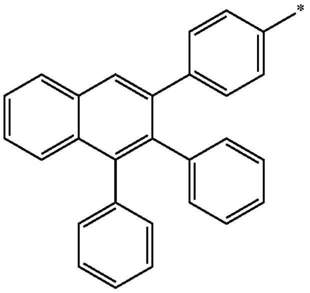 [SMILES: *c1ccc(-c2cc3ccccc3c(-c3ccccc3)c2-c2ccccc2)cc1] | 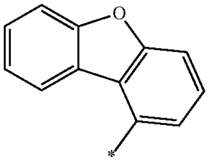 | 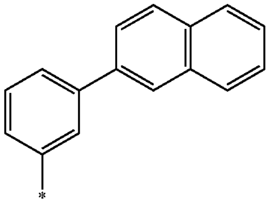 |
| 1-A1-70 | 1 | 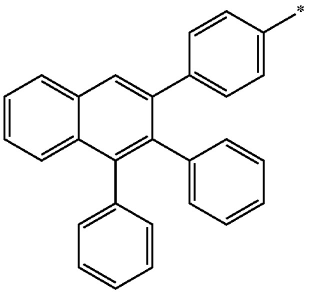 [SMILES: *c1ccc(-c2cc3ccccc3c(-c3ccccc3)c2-c2ccccc2)cc1] | 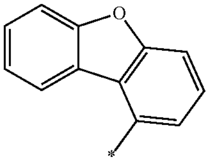 | 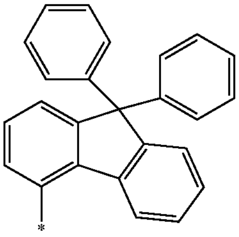 |

-continued
[Compound Group 1]
| | n | A—L—* | $Ar_1$ | $Ar_2$ |
|---|---|---|---|---|
| 1-A1-71 | 1 | 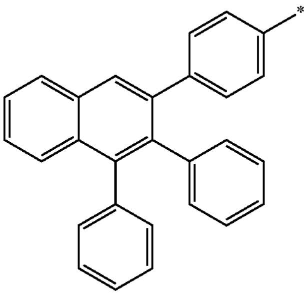 [SMILES: *c1ccc(-c2cc3ccccc3c(-c3ccccc3)c2-c2ccccc2)cc1] | 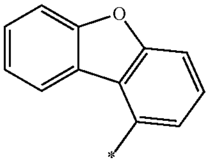 | 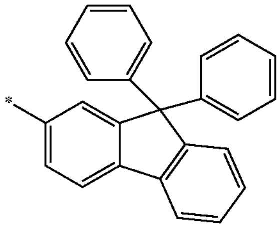 |
| 1-A1-72 | 1 | 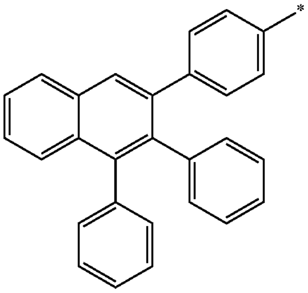 [SMILES: *c1ccc(-c2cc3ccccc3c(-c3ccccc3)c2-c2ccccc2)cc1] | 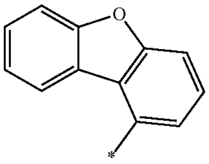 | 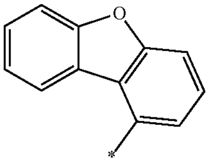 |
| 1-A1-73 | 1 | 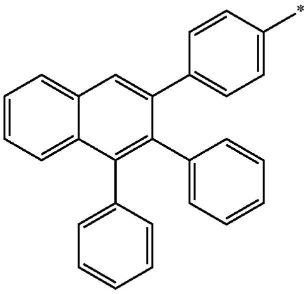 [SMILES: *c1ccc(-c2cc3ccccc3c(-c3ccccc3)c2-c2ccccc2)cc1] | 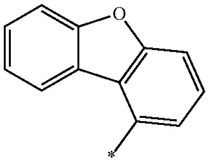 | 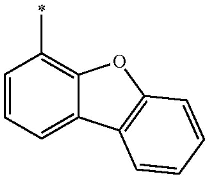 |
| 1-A1-74 | 1 | 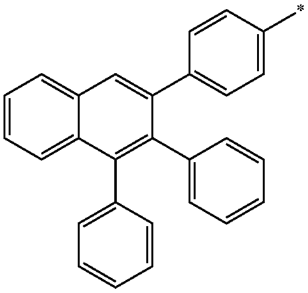 [SMILES: *c1ccc(-c2cc3ccccc3c(-c3ccccc3)c2-c2ccccc2)cc1] | 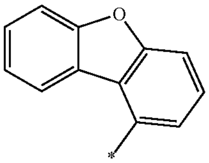 | 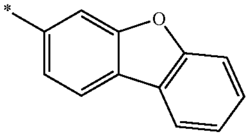 [SMILES: *c1ccc2c(c1)oc1ccccc12] |
| 1-A1-75 | 1 | 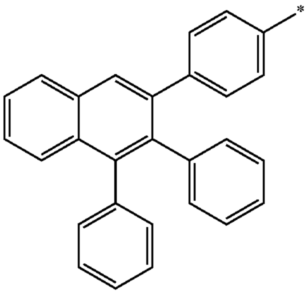 [SMILES: *c1ccc(-c2cc3ccccc3c(-c3ccccc3)c2-c2ccccc2)cc1] | 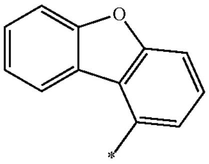 | 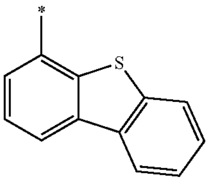 |

-continued
[Compound Group 1]
| | n | A—L—* | $Ar_1$ | $Ar_2$ |
|---|---|---|---|---|
| 1-A1-76 | 1 | 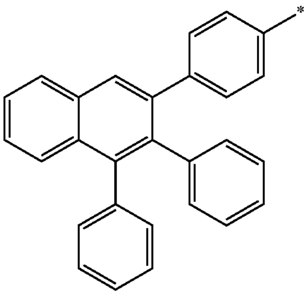 [SMILES: *c1ccc(-c2cc3ccccc3c(-c3ccccc3)c2-c2ccccc2)cc1] | 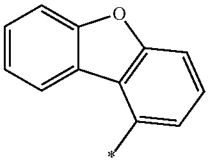 | 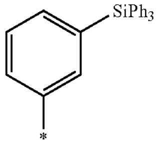 |
| 1-A1-77 | 1 | 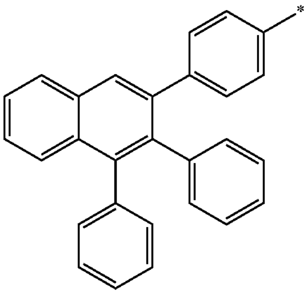 [SMILES: *c1ccc(-c2cc3ccccc3c(-c3ccccc3)c2-c2ccccc2)cc1] | 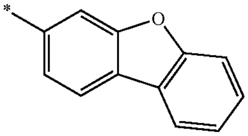 [SMILES: *c1ccc2c(c1)oc1ccccc12] | 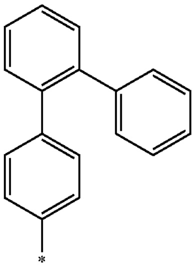 [SMILES: *c1ccc(-c2ccccc2-c2ccccc2)cc1] |
| 1-A1-78 | 1 | 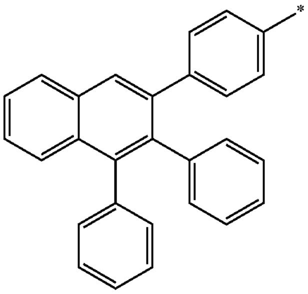 [SMILES: *c1ccc(-c2cc3ccccc3c(-c3ccccc3)c2-c2ccccc2)cc1] | 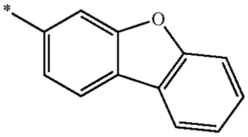 [SMILES: *c1ccc2c(c1)oc1ccccc12] | 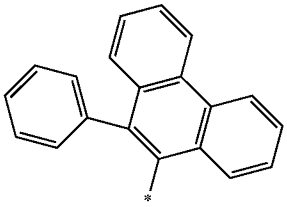 [SMILES: *c1c(-c2ccccc2)c2ccccc2c2ccccc12] |
| 1-A1-79 | 1 | 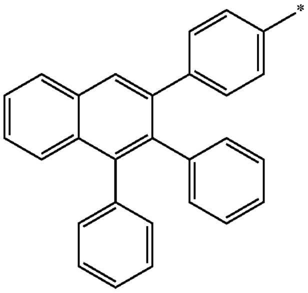 [SMILES: *c1ccc(-c2cc3ccccc3c(-c3ccccc3)c2-c2ccccc2)cc1] | 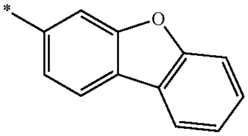 [SMILES: *c1ccc2c(c1)oc1ccccc12] | 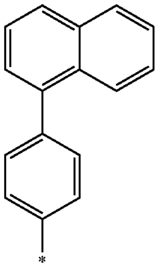 [SMILES: *c1ccc(-c2cccc3ccccc23)cc1] |
| 1-A1-80 | 1 | 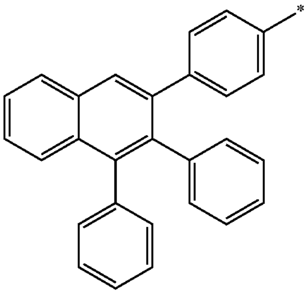 [SMILES: *c1ccc(-c2cc3ccccc3c(-c3ccccc3)c2-c2ccccc2)cc1] | 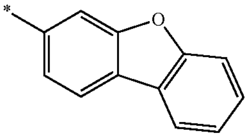 [SMILES: *c1ccc2c(c1)oc1ccccc12] | 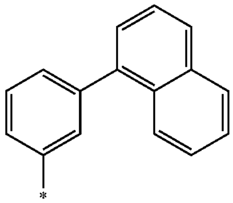 |

-continued
[Compound Group 1]
| | n | A—L—* | $Ar_1$ | $Ar_2$ |
|---|---|---|---|---|
| 1-A1-81 | 1 | 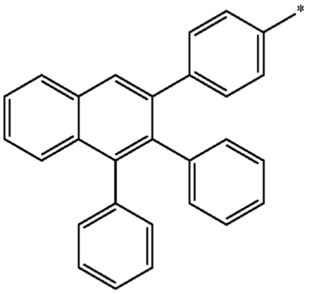 [SMILES: *c1ccc(-c2cc3ccccc3c(-c3ccccc3)c2-c2ccccc2)cc1] | 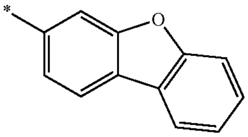 [SMILES: *c1ccc2c(c1)oc1ccccc12] | 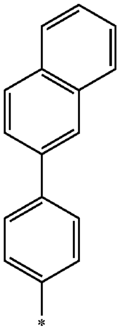 [SMILES: *c1ccc(-c2ccc3ccccc3c2)cc1] |
| 1-A1-82 | 1 | 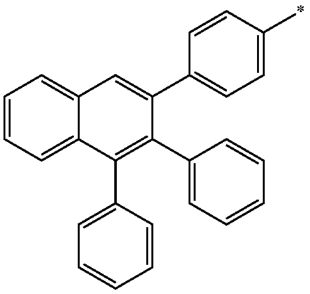 [SMILES: *c1ccc(-c2cc3ccccc3c(-c3ccccc3)c2-c2ccccc2)cc1] | 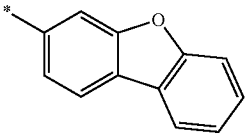 [SMILES: *c1ccc2c(c1)oc1ccccc12] | 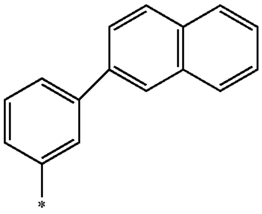 [SMILES: *c1cccc(-c2ccc3ccccc3c2)c1] |
| 1-A1-83 | 1 | 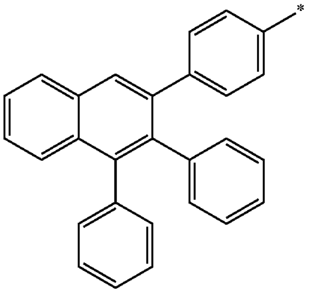 [SMILES: *c1ccc(-c2cc3ccccc3c(-c3ccccc3)c2-c2ccccc2)cc1] | 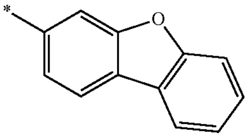 [SMILES: *c1ccc2c(c1)oc1ccccc12] | 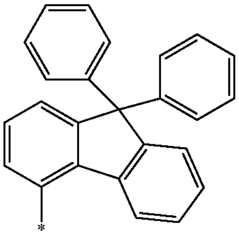 |
| 1-A1-84 | 1 | 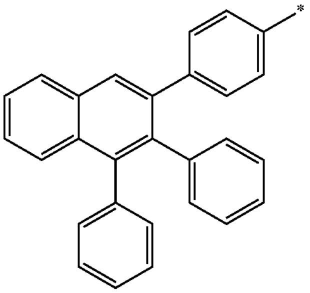 [SMILES: *c1ccc(-c2cc3ccccc3c(-c3ccccc3)c2-c2ccccc2)cc1] | 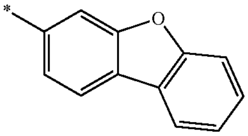 [SMILES: *c1ccc2c(c1)oc1ccccc12] | 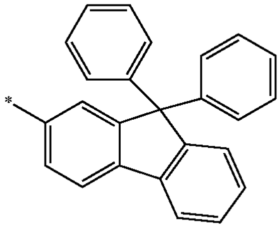 |
| 1-A1-85 | 1 | 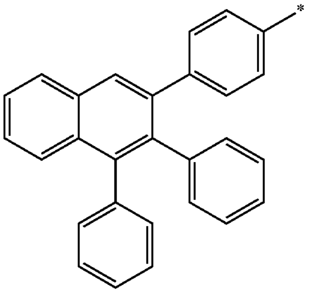 [SMILES: *c1ccc(-c2cc3ccccc3c(-c3ccccc3)c2-c2ccccc2)cc1] | 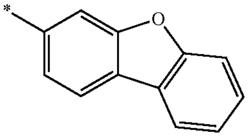 [SMILES: *c1ccc2c(c1)oc1ccccc12] | 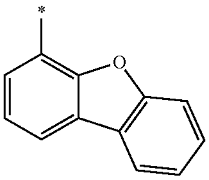 |

-continued
| [Compound Group 1] | | | | |
|---|---|---|---|---|
| | n | A—L—* | $Ar_1$ | $Ar_2$ |
| 1-A1-86 | 1 | 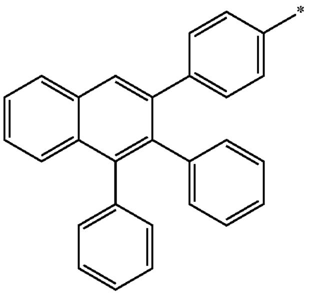 [SMILES: *c1ccc(-c2cc3ccccc3c(-c3ccccc3)c2-c2ccccc2)cc1] | 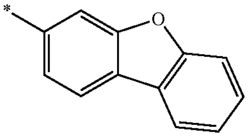 [SMILES: *c1ccc2c(c1)oc1ccccc12] | 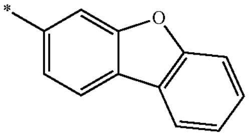 |
| 1-A1-87 | 1 | 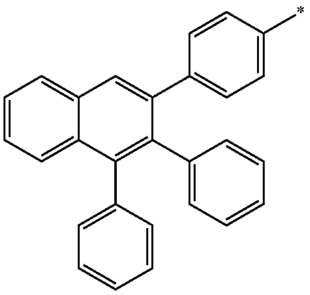 [SMILES: *c1ccc(-c2cc3ccccc3c(-c3ccccc3)c2-c2ccccc2)cc1] | 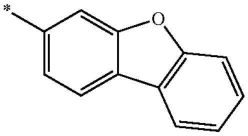 [SMILES: *c1ccc2c(c1)oc1ccccc12] | 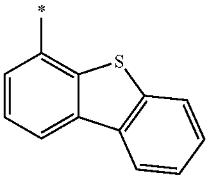 |
| 1-A1-88 | 1 | 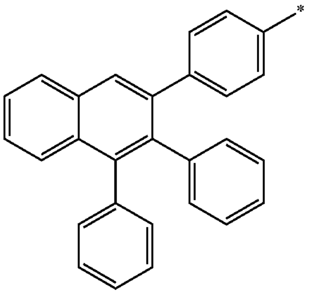 [SMILES: *c1ccc(-c2cc3ccccc3c(-c3ccccc3)c2-c2ccccc2)cc1] | 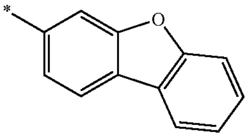 [SMILES: *c1ccc2c(c1)oc1ccccc12] | 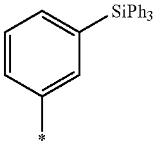 |
| 1-A1-89 | 1 | 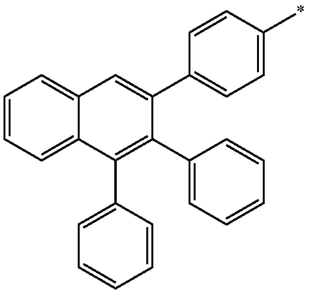 [SMILES: *c1ccc(-c2cc3ccccc3c(-c3ccccc3)c2-c2ccccc2)cc1] | 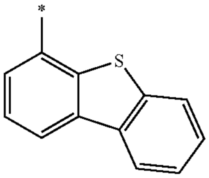 | 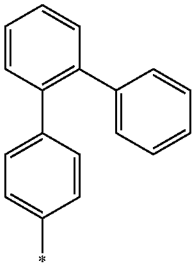 |
| 1-A1-90 | 1 | 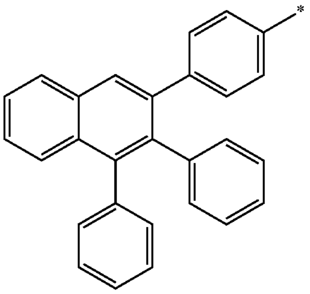 [SMILES: *c1ccc(-c2cc3ccccc3c(-c3ccccc3)c2-c2ccccc2)cc1] | 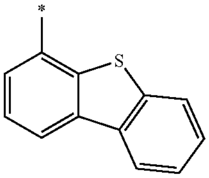 | 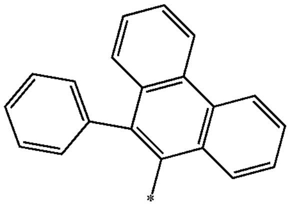 |

-continued
| [Compound Group 1] | | | | |
|---|---|---|---|---|
| | n | A—L—* | $Ar_1$ | $Ar_2$ |
| 1-A1-91 | 1 | 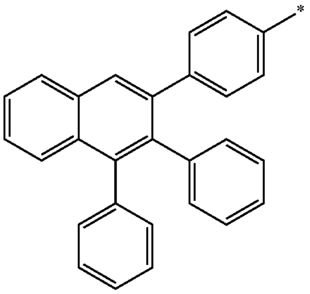 [SMILES: *c1ccc(-c2cc3ccccc3c(-c3ccccc3)c2-c2ccccc2)cc1] | 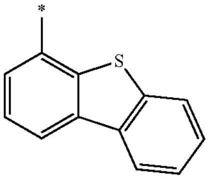 | 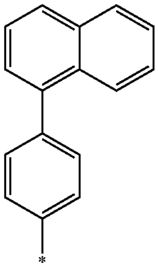 |
| 1-A1-92 | 1 | 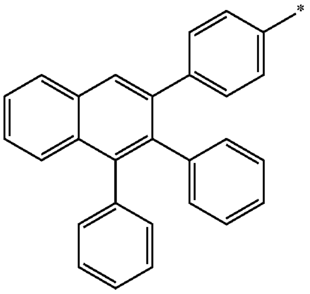 [SMILES: *c1ccc(-c2cc3ccccc3c(-c3ccccc3)c2-c2ccccc2)cc1] | 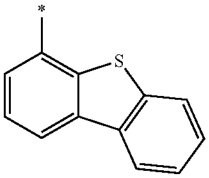 | 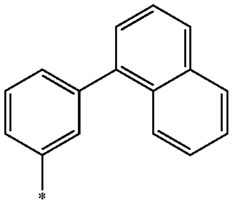 |
| 1-A1-93 | 1 | 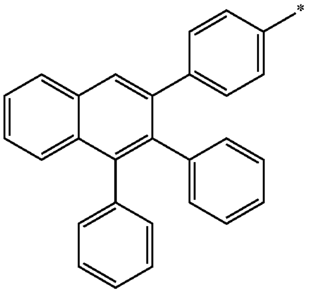 [SMILES: *c1ccc(-c2cc3ccccc3c(-c3ccccc3)c2-c2ccccc2)cc1] | 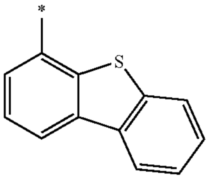 | 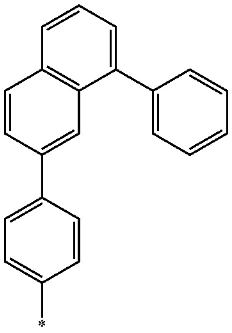 |
| 1-A1-94 | 1 | 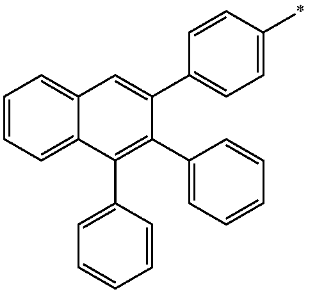 [SMILES: *c1ccc(-c2cc3ccccc3c(-c3ccccc3)c2-c2ccccc2)cc1] | 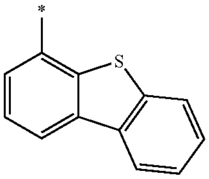 | 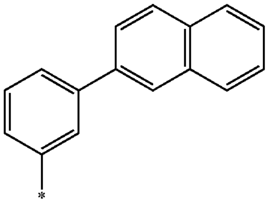 |
| 1-A1-95 | 1 | 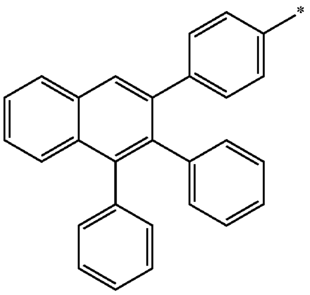 [SMILES: *c1ccc(-c2cc3ccccc3c(-c3ccccc3)c2-c2ccccc2)cc1] | 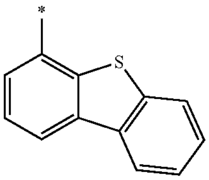 | 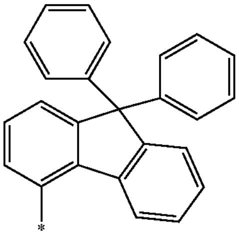 |

-continued
[Compound Group 1]
| | n | A—L—* | $Ar_1$ | $Ar_2$ |
|---|---|---|---|---|
| 1-A1-96 | 1 | 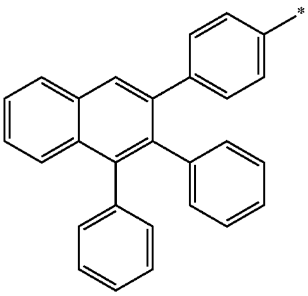 [SMILES: *c1ccc(-c2cc3ccccc3c(-c3ccccc3)c2-c2ccccc2)cc1] | 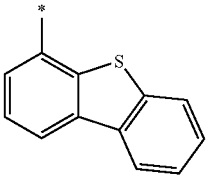 | 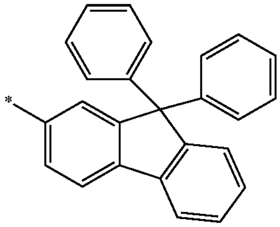 |
| 1-A1-97 | 1 | 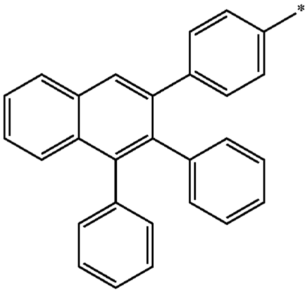 [SMILES: *c1ccc(-c2cc3ccccc3c(-c3ccccc3)c2-c2ccccc2)cc1] | 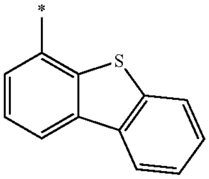 | 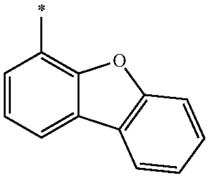 |
| 1-A1-98 | 1 | 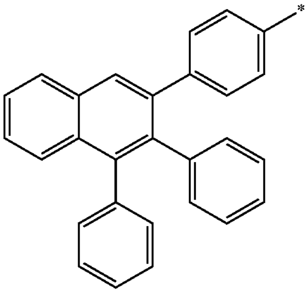 [SMILES: *c1ccc(-c2cc3ccccc3c(-c3ccccc3)c2-c2ccccc2)cc1] | 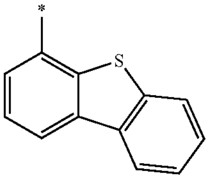 | 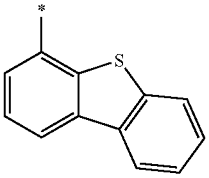 |
| 1-A1-99 | 1 | 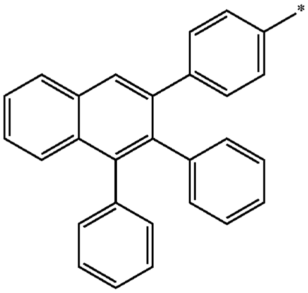 [SMILES: *c1ccc(-c2cc3ccccc3c(-c3ccccc3)c2-c2ccccc2)cc1] | 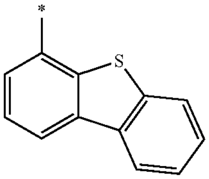 | 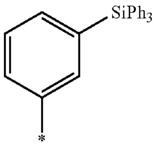 |

-continued
[Compound Group 1]
| | n | A—L—* | $Ar_1$ | $Ar_2$ |
|---|---|---|---|---|
| 2-A1-1 | 1 | 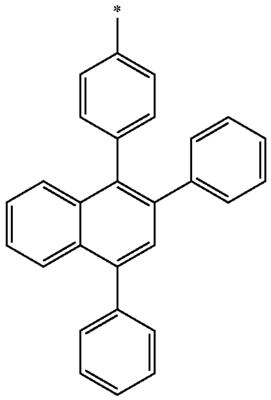 | 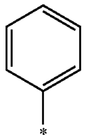 [SMILES: *c1ccccc1] | 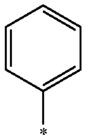 [SMILES: *c1ccccc1] |
| 2-A1-2 | 1 | 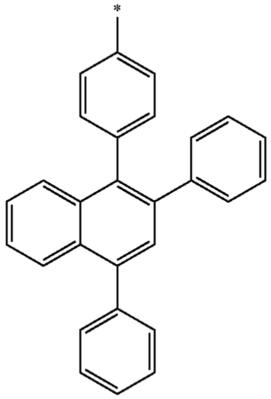 | 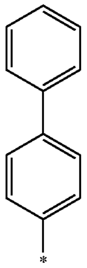 [SMILES: *c1ccc(-c2ccccc2)cc1] | 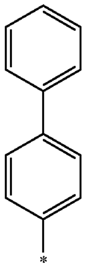 [SMILES: *c1ccc(-c2ccccc2)cc1] |
| 2-A1-3 | 1 | 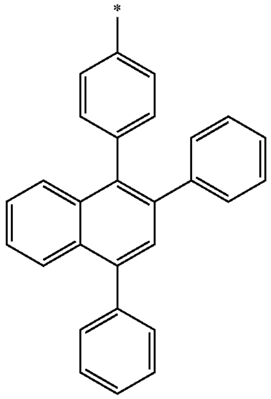 | 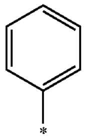 | 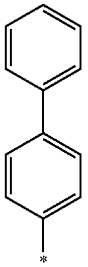 [SMILES: *c1ccc(-c2ccccc2)cc1] |

-continued
| [Compound Group 1] | | | | |
|---|---|---|---|---|
| | n | A—L—* | $Ar_1$ | $Ar_2$ |
| 2-A1-4 | 1 | 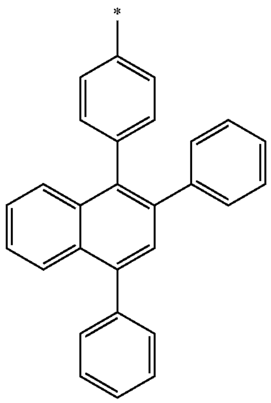 | 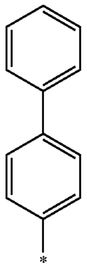 [SMILES: *c1ccc(-c2ccccc2)cc1] | 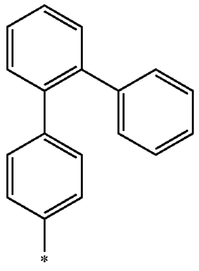 [SMILES: *c1ccc(-c2ccccc2-c2ccccc2)cc1] |
| 2-A1-5 | 1 | 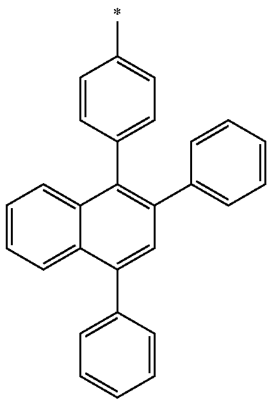 | 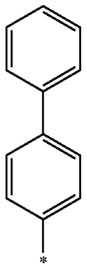 [SMILES: *c1ccc(-c2ccccc2)cc1] | 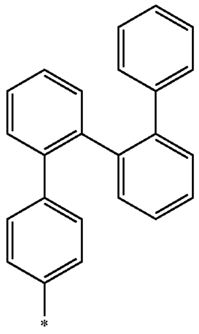 [SMILES: *c1ccc(-c2ccccc2-c2ccccc2-c2ccccc2)cc1] |
| 2-A1-6 | 1 | 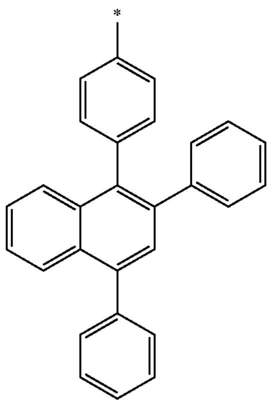 | 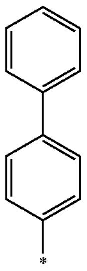 [SMILES: *c1ccc(-c2ccccc2)cc1] | 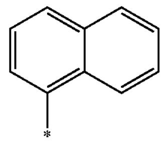 |

-continued
[Compound Group 1]
| | n | A—L—* | $Ar_1$ | $Ar_2$ |
|---|---|---|---|---|
| 2-A1-7 | 1 | 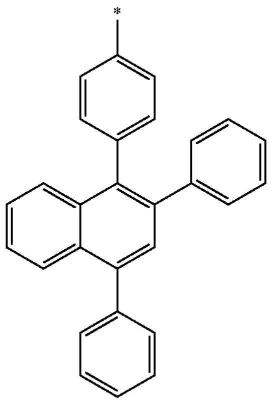 | 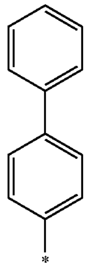 [SMILES: *c1ccc(-c2ccccc2)cc1] | 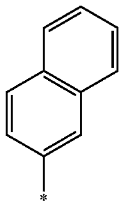 |
| 2-A1-8 | 1 | 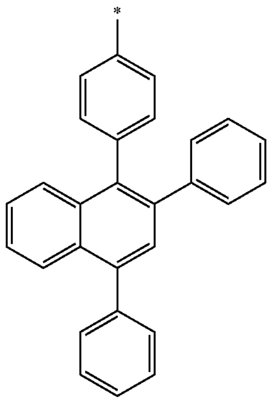 | 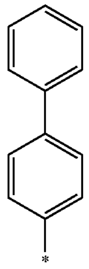 [SMILES: *c1ccc(-c2ccccc2)cc1] | 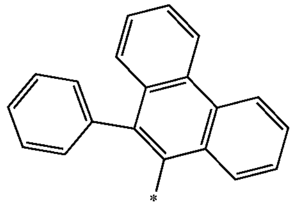 [SMILES: *c1c(-c2ccccc2)c2ccccc2c2ccccc12] |
| 2-A1-9 | 1 | 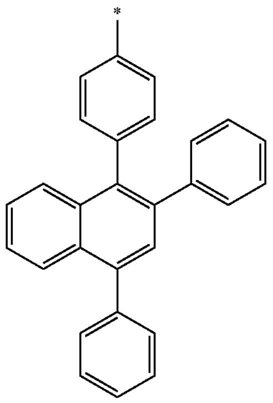 | 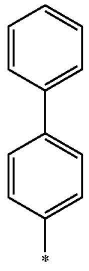 [SMILES: *c1ccc(-c2ccccc2)cc1] | 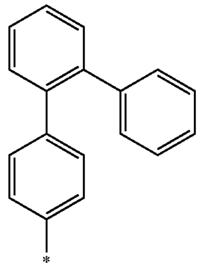 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 2-A1-10 | 1 | 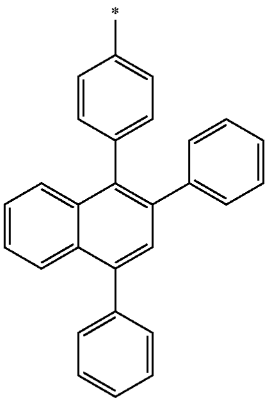 | 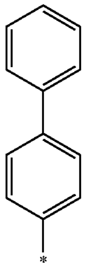 [SMILES: *c1ccc(-c2ccccc2)cc1] | 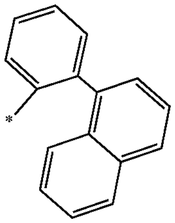 [SMILES: *c1ccccc1-c1cccc2ccccc12] |
| 2-A1-11 | 1 | 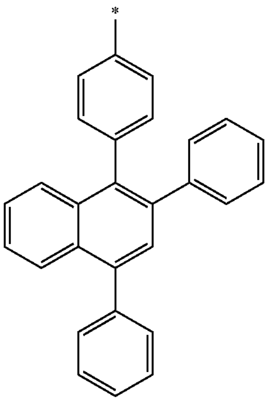 | 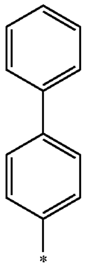 [SMILES: *c1ccc(-c2ccccc2)cc1] | 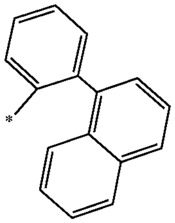 [SMILES: *c1ccccc1-c1cccc2ccccc12] |
| 2-A1-12 | 1 | 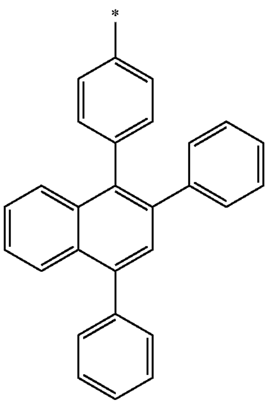 | 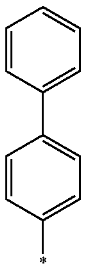 [SMILES: *c1ccc(-c2ccccc2)cc1] | 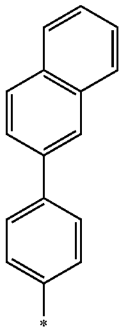 |

-continued
[Compound Group 1]
| | n | A—L—* | $Ar_1$ | $Ar_2$ |
|---|---|---|---|---|
| 2-A1-13 | 1 | 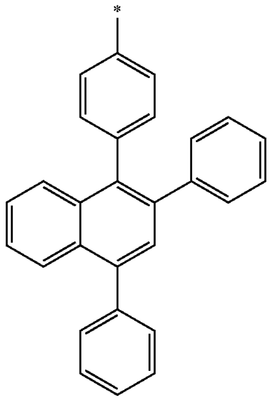 | 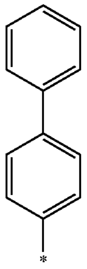 [SMILES: *c1ccc(-c2ccccc2)cc1] | 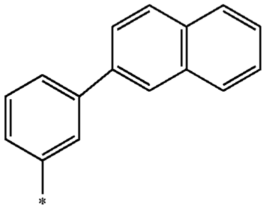 [SMILES: *c1cccc(-c2ccc3ccccc3c2)c1] |
| 2-A1-14 | 1 | 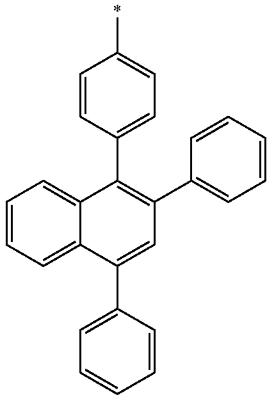 | 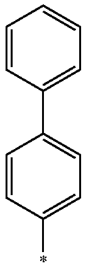 [SMILES: *c1ccc(-c2ccccc2)cc1] | 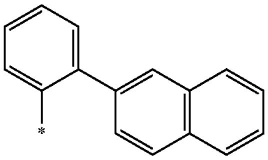 [SMILES: *c1ccccc1-c1ccc2ccccc2c1] |
| 2-A1-15 | 1 | 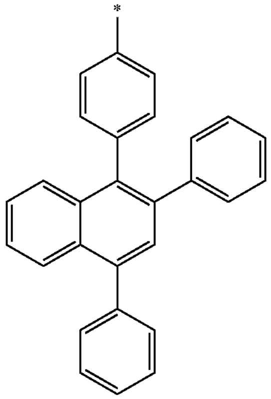 | 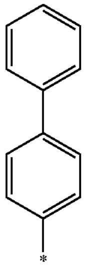 [SMILES: *c1ccc(-c2ccccc2)cc1] | 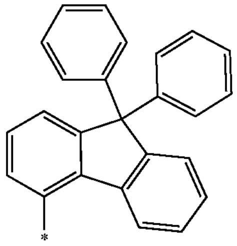 [SMILES: *c1cccc2c1-c1ccccc1C2(c1ccccc1)c1ccccc1] |

-continued
| [Compound Group 1] | | | | |
|---|---|---|---|---|
| | n | A—L—* | $Ar_1$ | $Ar_2$ |
| 2-A1-16 | 1 | 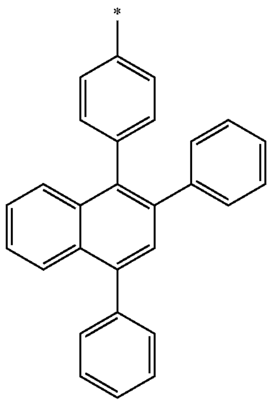 | 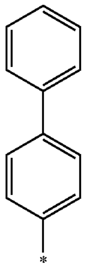 [SMILES: *c1ccc(-c2ccccc2)cc1] | 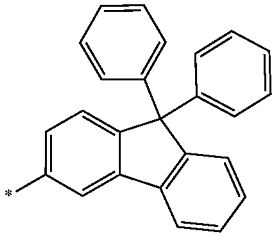 [SMILES: *c1ccc2c(c1)-c1ccccc1C2(c1ccccc1)c1ccccc1] |
| 2-A1-17 | 1 | 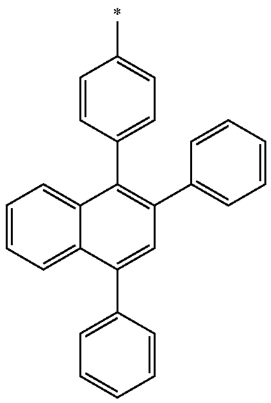 | 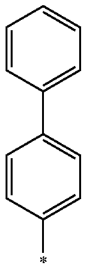 [SMILES: *c1ccc(-c2ccccc2)cc1] | 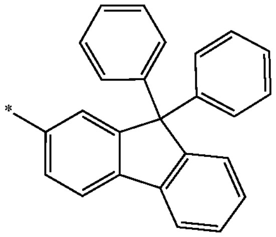 [SMILES: *c1ccc2c(c1)C(c1ccccc1)(c1ccccc1)c1ccccc1-2] |
| 2-A1-18 | 1 | 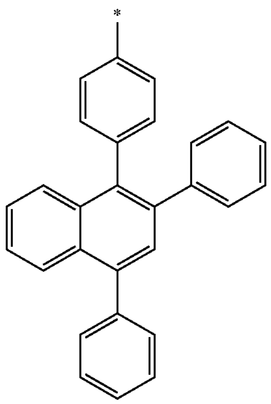 | 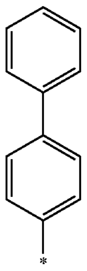 [SMILES: *c1ccc(-c2ccccc2)cc1] | 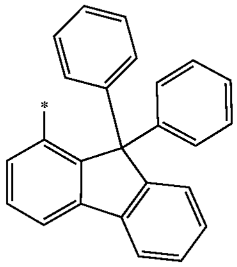 [SMILES: *c1cccc2c1C(c1ccccc1)(c1ccccc1)c1ccccc1-2] |

-continued
[Compound Group 1]
| | n | A—L—* | $Ar_1$ | $Ar_2$ |
|---|---|---|---|---|
| 2-A1-19 | 1 | 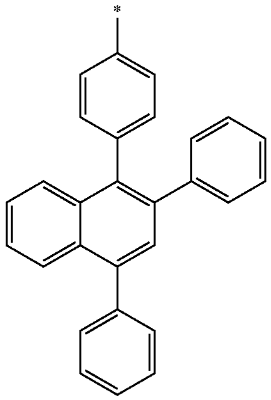 | 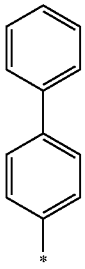 [SMILES: *c1ccc(-c2ccccc2)cc1] | 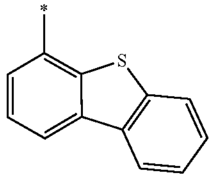 [SMILES: *c1cccc2c1sc1ccccc12] |
| 2-A1-20 | 1 | 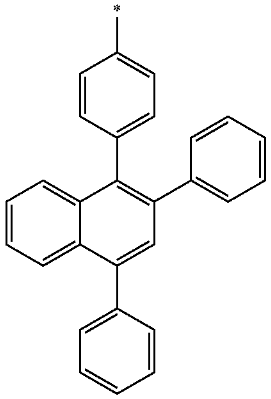 | 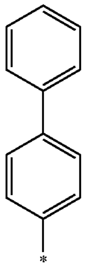 [SMILES: *c1ccc(-c2ccccc2)cc1] | 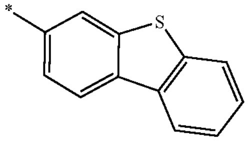 [SMILES: *c1ccc2c(c1)sc1ccccc12] |
| 2-A1-21 | 1 | 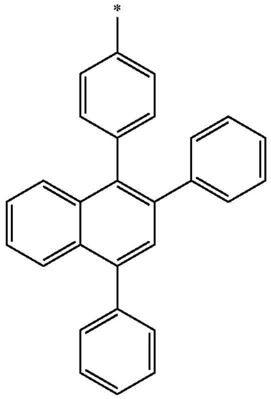 | 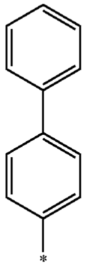 [SMILES: *c1ccc(-c2ccccc2)cc1] | 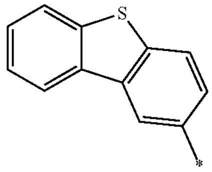 |

-continued
[Compound Group 1]
| | n | A—L—* | $Ar_1$ | $Ar_2$ |
|---|---|---|---|---|
| 2-A1-22 | 1 | 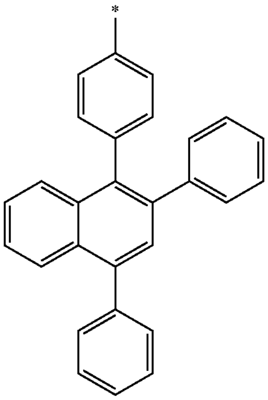 | 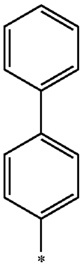 [SMILES: *c1ccc(-c2ccccc2)cc1] | 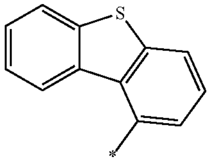 |
| 2-A1-23 | 1 | 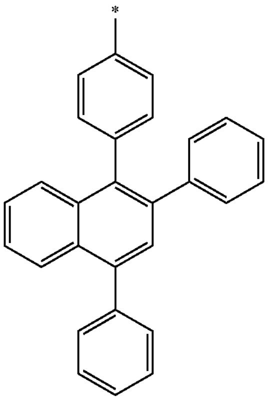 | 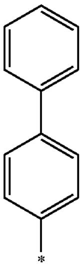 [SMILES: *c1ccc(-c2ccccc2)cc1] | 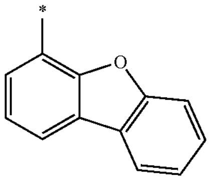 |
| 2-A1-24 | 1 | 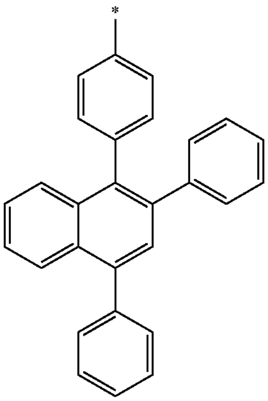 | 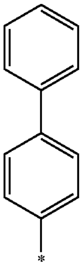 [SMILES: *c1ccc(-c2ccccc2)cc1] | 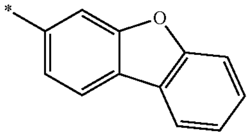 |

-continued
| [Compound Group 1] | n | A—L—* | $Ar_1$ | $Ar_2$ |
|---|---|---|---|---|
| 2-A1-25 | 1 | 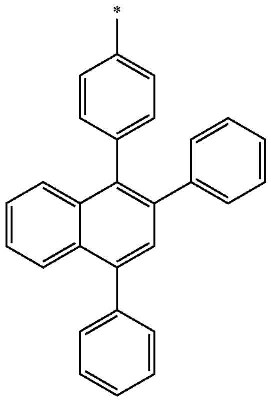 | 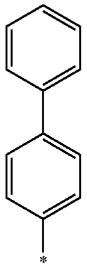 [SMILES: *c1ccc(-c2ccccc2)cc1] | 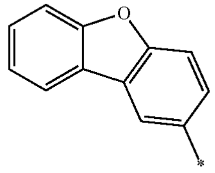 |
| 2-A1-26 | 1 | 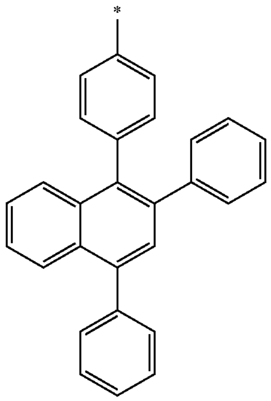 | 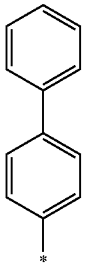 [SMILES: *c1ccc(-c2ccccc2)cc1] | 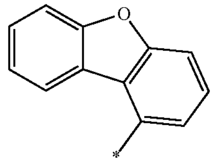 |
| 2-A1-27 | 1 | 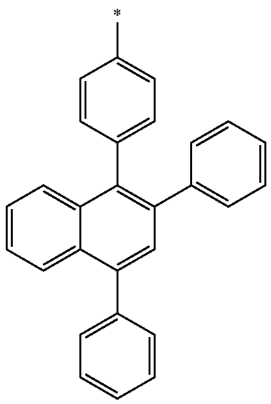 | 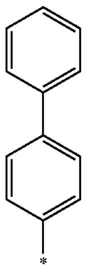 [SMILES: *c1ccc(-c2ccccc2)cc1] | 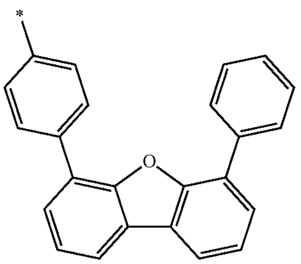 |

-continued
| [Compound Group 1] | | | | |
|---|---|---|---|---|
| | n | A—L—* | $Ar_1$ | $Ar_2$ |
| 2-A1-28 | 1 | 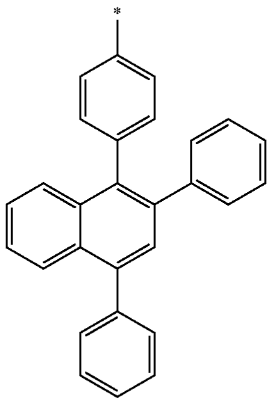 | 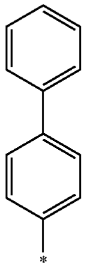 [SMILES: *c1ccc(-c2ccccc2)cc1] | 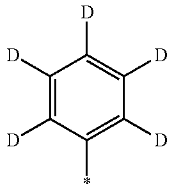 |
| 2-A1-29 | 1 | 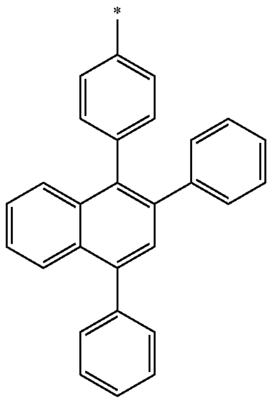 | 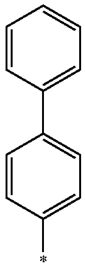 [SMILES: *c1ccc(-c2ccccc2)cc1] | 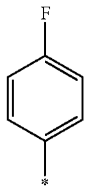 |
| 2-A1-30 | 1 | 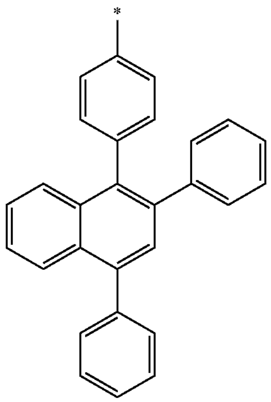 | 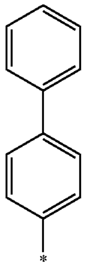 [SMILES: *c1ccc(-c2ccccc2)cc1] | 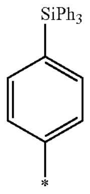 |

-continued
[Compound Group 1]
| | n | A—L—* | $Ar_1$ | $Ar_2$ |
|---|---|---|---|---|
| 2-A1-31 | 1 | 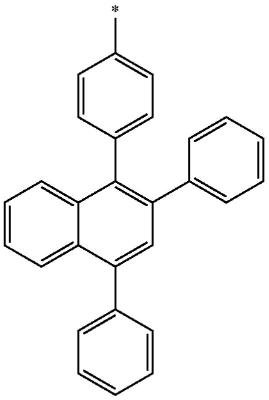 | 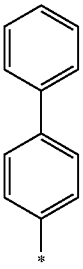 [SMILES: *c1ccc(-c2ccccc2)cc1] | 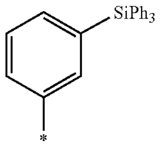 |
| 2-A1-32 | 1 | 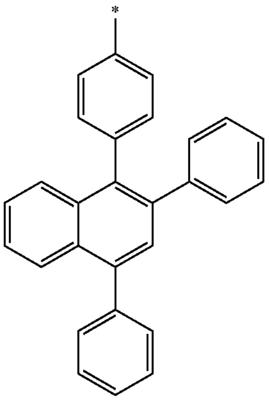 | 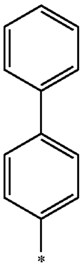 [SMILES: *c1ccc(-c2ccccc2)cc1] | 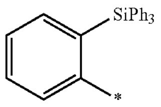 |
| 2-A1-33 | 1 | 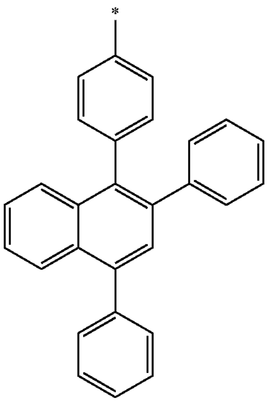 | 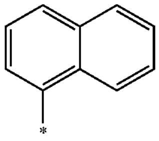 [SMILES: *c1cccc2ccccc12] | 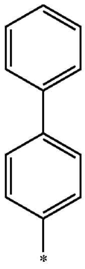 [SMILES: *c1ccc(-c2ccccc2)cc1] |

-continued
[Compound Group 1]
| | n | A—L—* | $Ar_1$ | $Ar_2$ |
|---|---|---|---|---|
| 2-A1-34 | 1 | 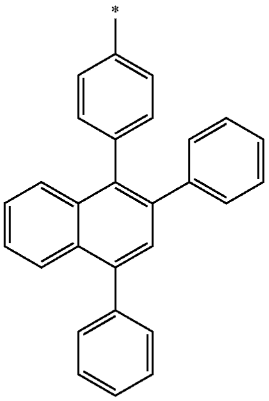 | 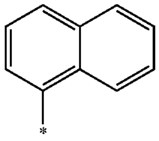 | 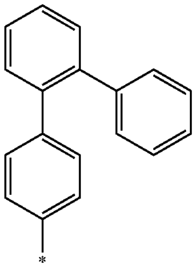 [SMILES: *c1ccc(-c2ccccc2-c2ccccc2)cc1] |
| 2-A1-35 | 1 | 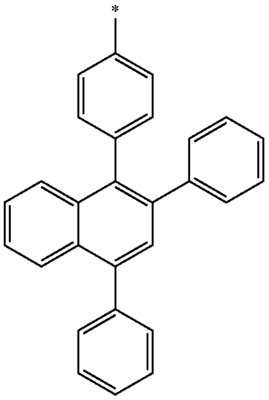 | 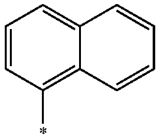 [SMILES: *c1cccc2ccccc12] | 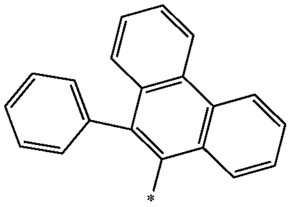 [SMILES: *c1c(-c2ccccc2)c2ccccc2c2ccccc12] |
| 2-A1-36 | 1 | 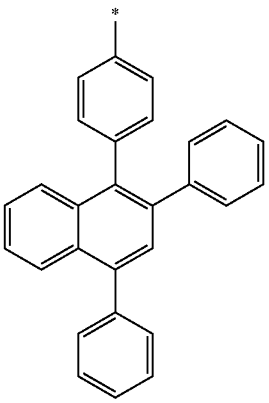 | 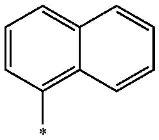 [SMILES: *c1cccc2ccccc12] | 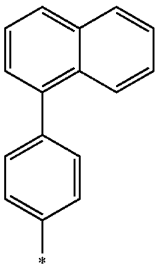 [SMILES: *c1ccc(-c2cccc3ccccc23)cc1] |

-continued
| [Compound Group 1] | n | A—L—* | $Ar_1$ | $Ar_2$ |
|---|---|---|---|---|
| 2-A1-37 | 1 | 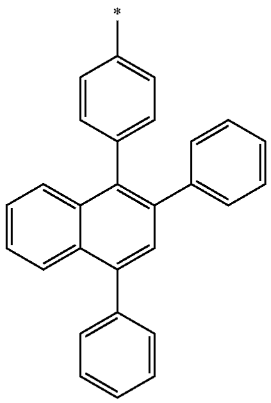 | 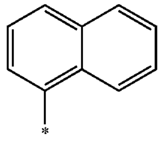 | 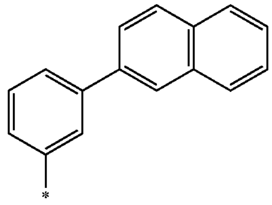 [SMILES: *c1cccc(-c2ccc3ccccc3c2)c1] |
| 2-A1-38 | 1 | 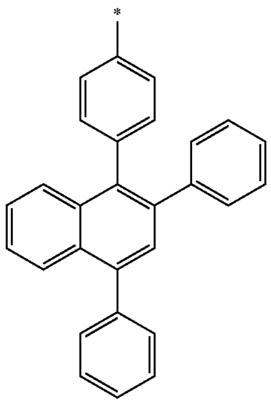 | 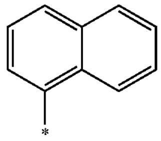 [SMILES: *c1cccc2ccccc12] | 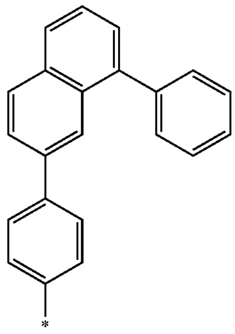 [SMILES: *c1ccc(-c2ccc3cccc(-c4ccccc4)c3c2)cc1] |
| 2-A1-39 | 1 | 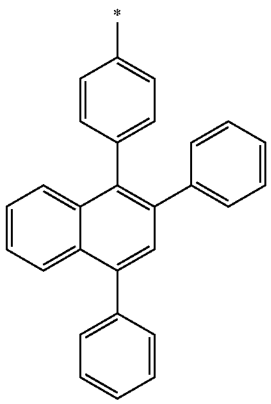 | 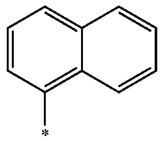 [SMILES: *c1cccc2ccccc12] | 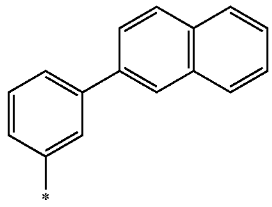 [SMILES: *c1cccc(-c2ccc3ccccc3c2)c1] |

-continued
| [Compound Group 1] | | | | |
|---|---|---|---|---|
| | n | A—L—* | $Ar_1$ | $Ar_2$ |
| 2-A1-40 | 1 | 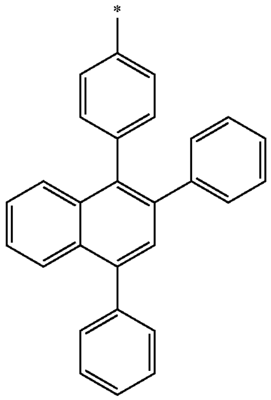 | 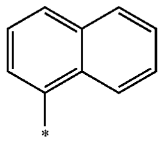 | 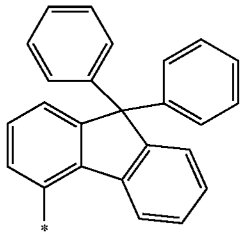 [SMILES: *c1cccc2c1-c1ccccc1C2(c1ccccc1)c1ccccc1] |
| 2-A1-41 | 1 | 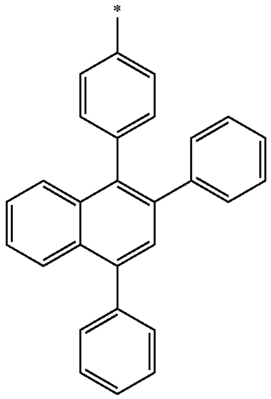 | 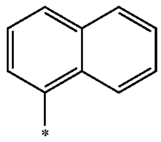 | 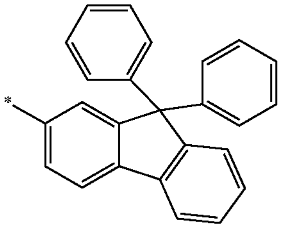 [SMILES: *c1ccc2c(c1)C(c1ccccc1)(c1ccccc1)c1ccccc1-2] |
| 2-A1-42 | 1 | 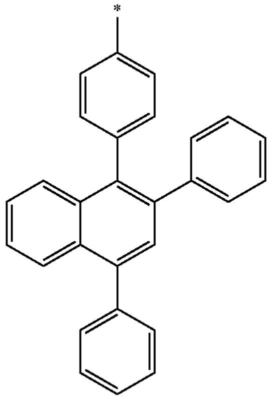 | 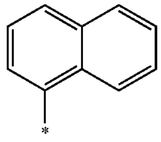 [SMILES: *c1cccc2ccccc12] | 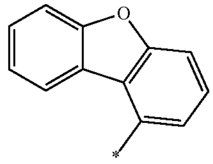 |

-continued
[Compound Group 1]
| | n | A—L—* | $Ar_1$ | $Ar_2$ |
|---|---|---|---|---|
| 2-A1-43 | 1 | 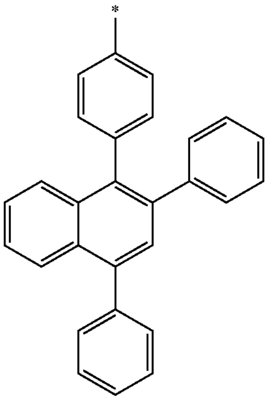 | 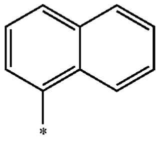 | 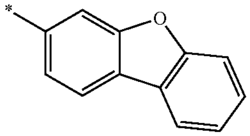 |
| 2-A1-44 | 1 | 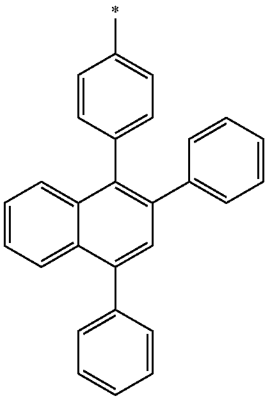 | 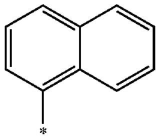 | 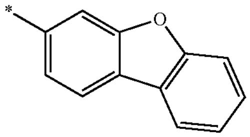 |
| 2-A1-45 | 1 | 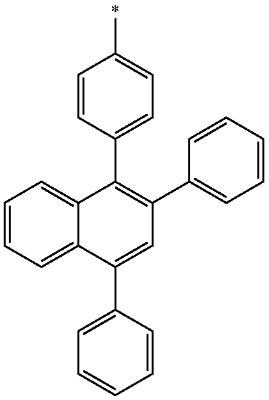 | 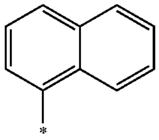 [SMILES: *c1cccc2ccccc12] | 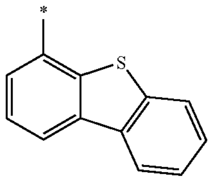 |

-continued
[Compound Group 1]
| | n | A—L—* | $Ar_1$ | $Ar_2$ |
|---|---|---|---|---|
| 2-A1-46 | 1 | 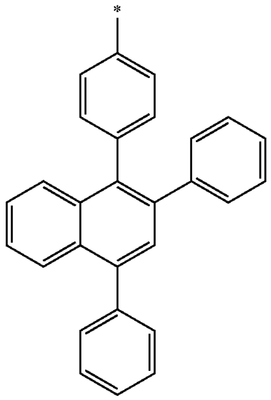 | 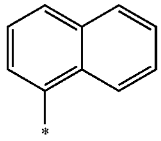 | 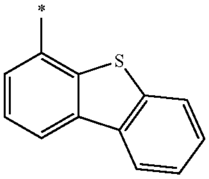 |
| 2-A1-47 | 1 | 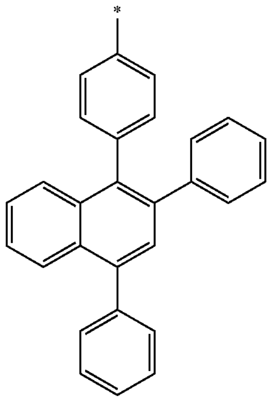 | 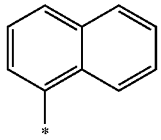 | 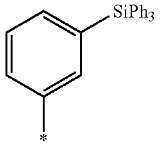 |
| 2-A1-48 | 1 | 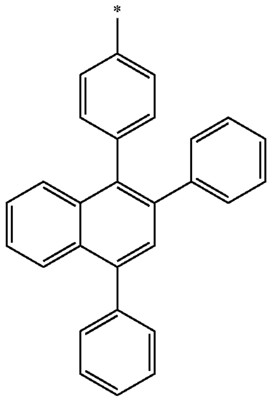 | 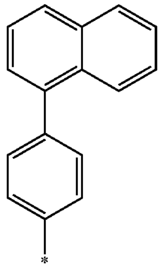 | 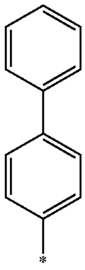 |

-continued
| [Compound Group 1] | | | | |
|---|---|---|---|---|
| | n | A—L—* | $Ar_1$ | $Ar_2$ |
| 2-A1-49 | 1 | 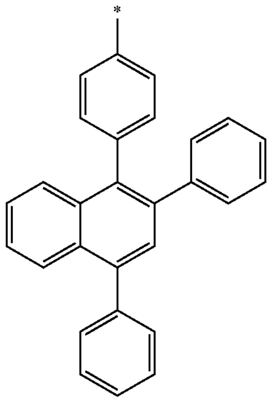 | 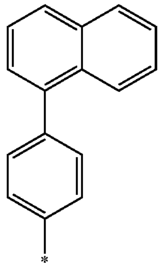 | 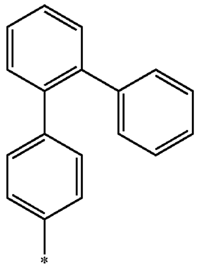 |
| 2-A1-50 | 1 | 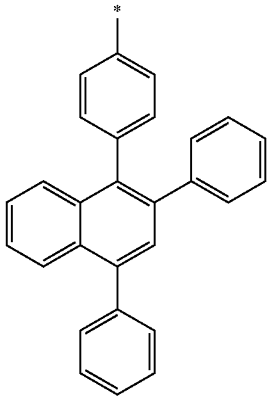 | 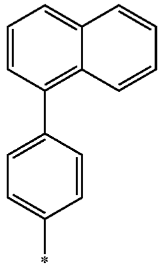 | 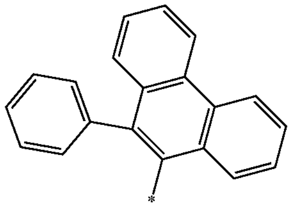 |
| 2-A1-51 | 1 | 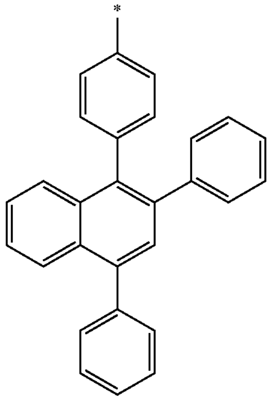 | 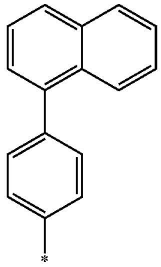 | 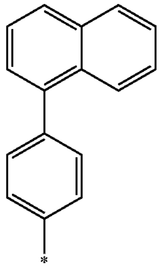 |

-continued
[Compound Group 1]
| | n | A—L—* | $Ar_1$ | $Ar_2$ |
|---|---|---|---|---|
| 2-A1-52 | 1 | 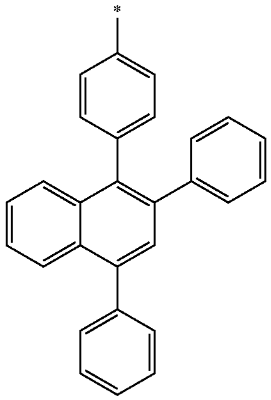 | 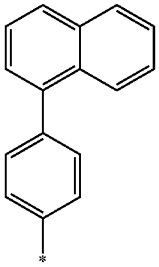 | 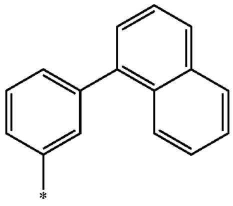 |
| 2-A1-53 | 1 | 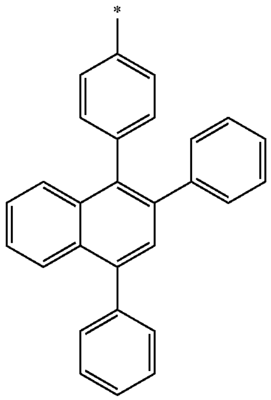 | 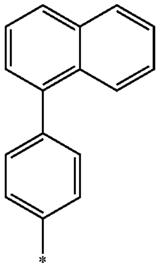 | 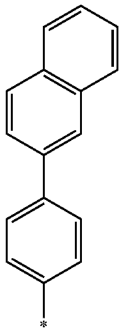 |
| 2-A1-54 | 1 | 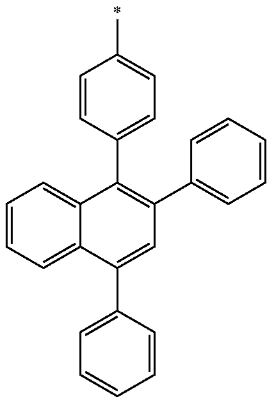 | 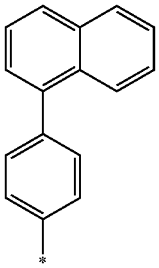 | 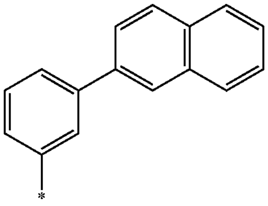 |

-continued
[Compound Group 1]
| | n | A—L—* | $Ar_1$ | $Ar_2$ |
|---|---|---|---|---|
| 2-A1-55 | 1 | 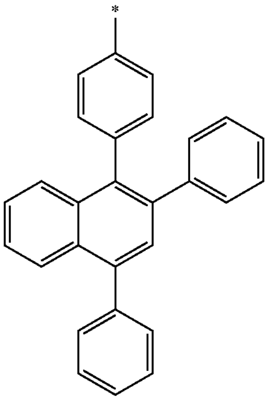 | 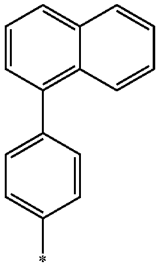 | 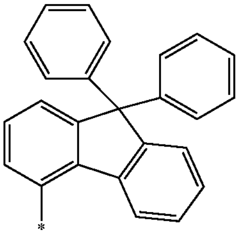 |
| 2-A1-56 | 1 | 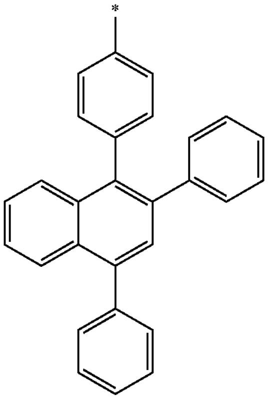 | 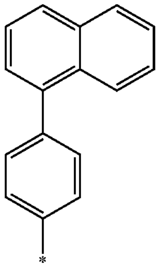 | 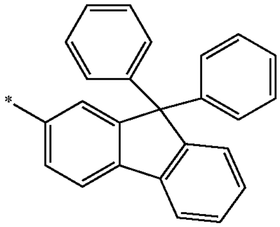 |
| 2-A1-57 | 1 | 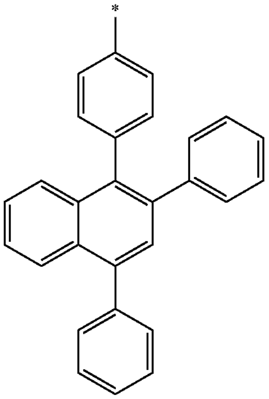 | 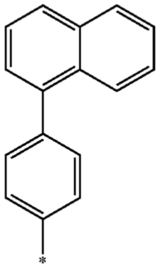 | 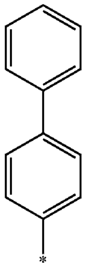 |

-continued
| [Compound Group 1] | | | | |
|---|---|---|---|---|
| | n | A—L—* | $Ar_1$ | $Ar_2$ |
| 2-A1-58 | 1 | 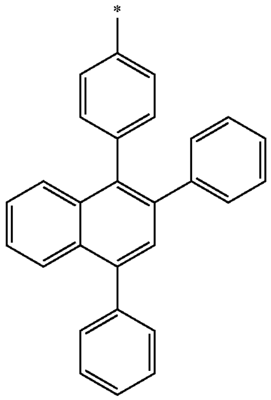 | 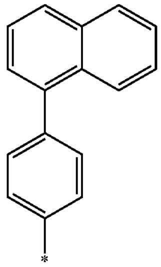 | 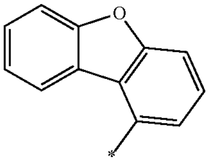 |
| 2-A1-59 | 1 | 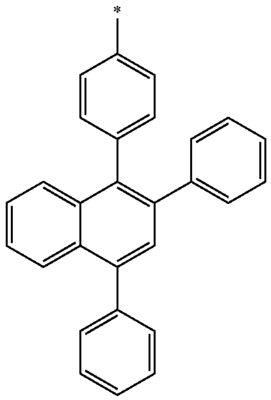 | 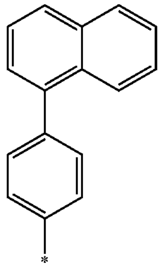 | 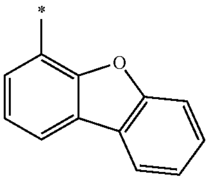 |
| 2-A1-60 | 1 | 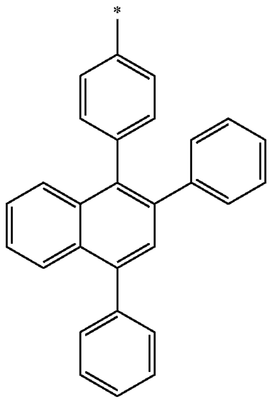 | 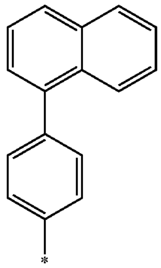 | 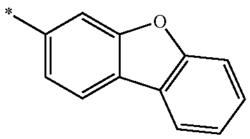 |

-continued
| [Compound Group 1] | | | | |
|---|---|---|---|---|
| | n | A—L—* | $Ar_1$ | $Ar_2$ |
| 2-A1-61 | 1 | 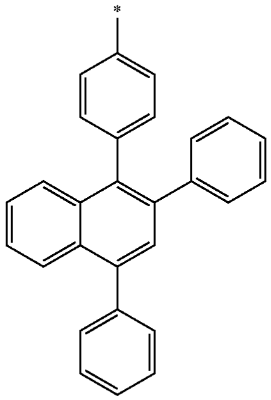 | 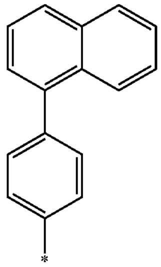 | 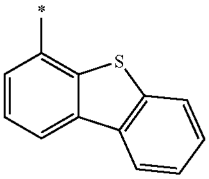 |
| 2-A1-62 | 1 | 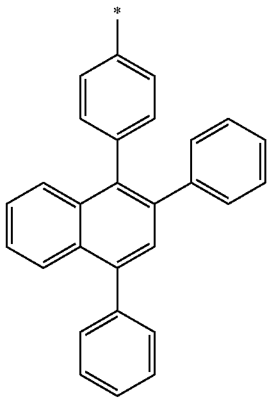 | 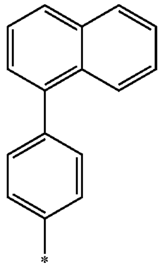 | 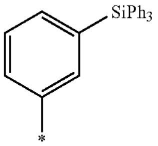 |
| 2-A1-63 | 1 | 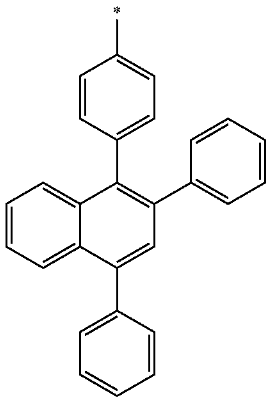 | 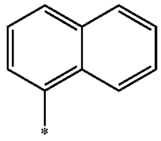 | 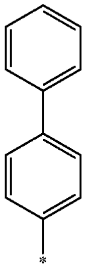 |

-continued
| | | [Compound Group 1] | | |
|---|---|---|---|---|
| | n | A—L—* | $Ar_1$ | $Ar_2$ |
| 2-A1-64 | 1 | 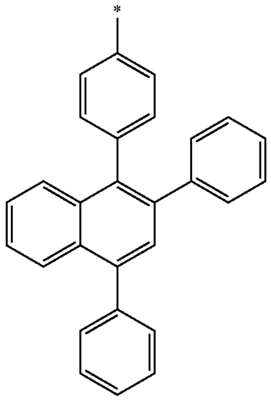 | 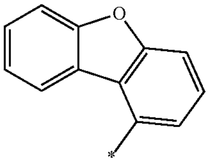 | 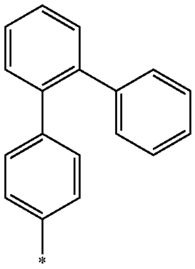 |
| 2-A1-65 | 1 | 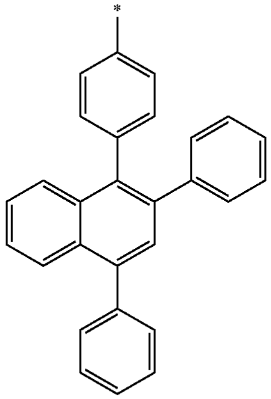 | 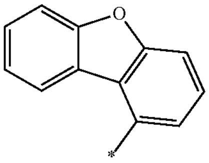 | 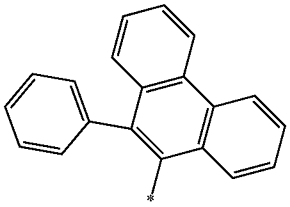 |
| 2-A1-66 | 1 | 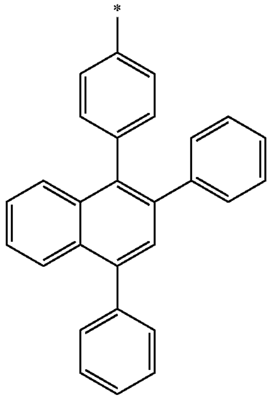 | 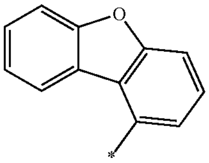 | 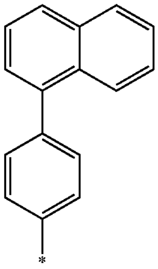 |

-continued
[Compound Group 1]
| | n | A—L—* | $Ar_1$ | $Ar_2$ |
|---|---|---|---|---|
| 2-A1-67 | 1 | 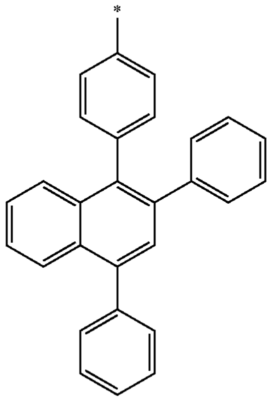 | 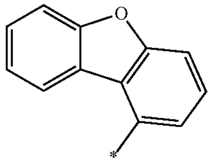 | 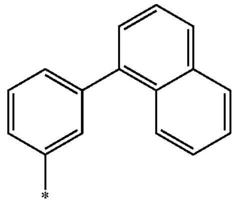 |
| 2-A1-68 | 1 | 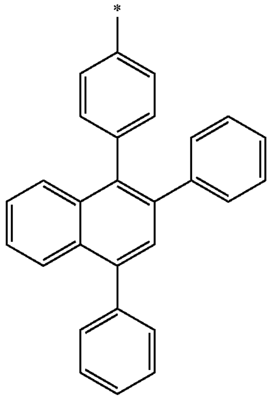 | 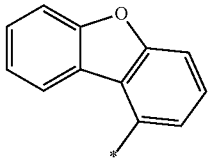 | 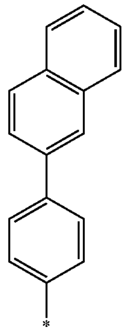 |
| 2-A1-69 | 1 | 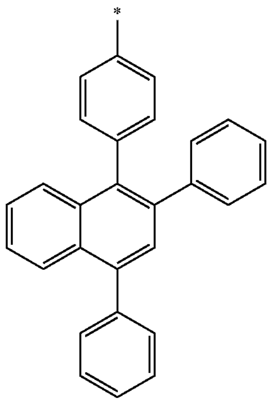 | 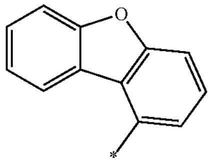 | 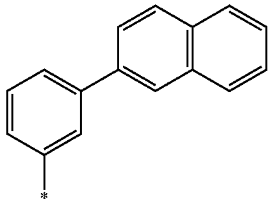 |

-continued
| [Compound Group 1] | | | | |
|---|---|---|---|---|
| | n | A—L—* | $Ar_1$ | $Ar_2$ |
| 2-A1-70 | 1 | 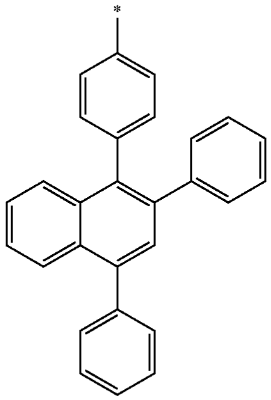 | 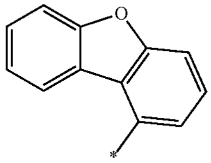 | 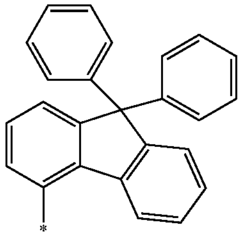 |
| 2-A1-71 | 1 | 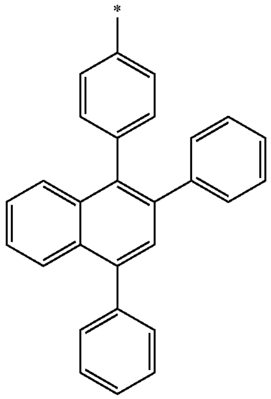 | 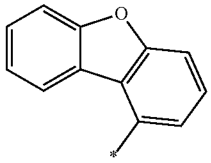 | 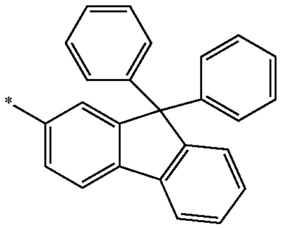 |
| 2-A1-72 | 1 | 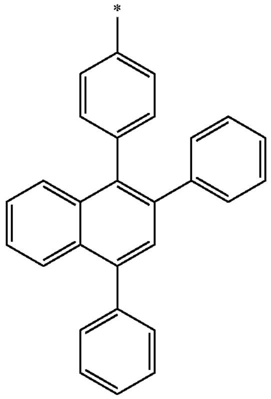 | 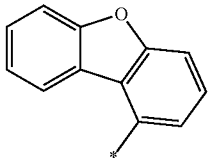 | 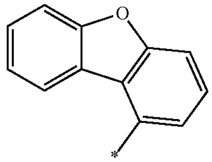 |

-continued
| [Compound Group 1] | | | | |
|---|---|---|---|---|
| | n | A—L—* | $Ar_1$ | $Ar_2$ |
| 2-A1-73 | 1 | 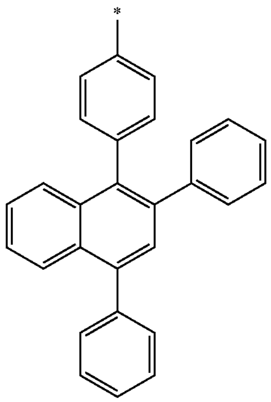 | 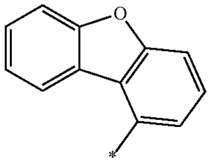 | 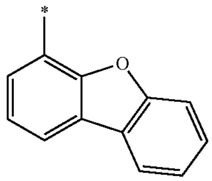 [SMILES: *c1cccc2c1oc1ccccc12] |
| 2-A1-74 | 1 | 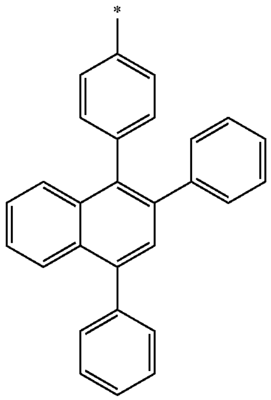 | 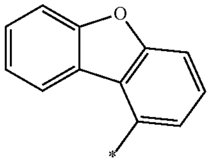 | 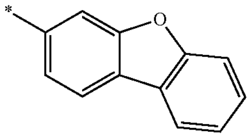 [SMILES: *c1ccc2c(c1)oc1ccccc12] |
| 2-A1-75 | 1 | 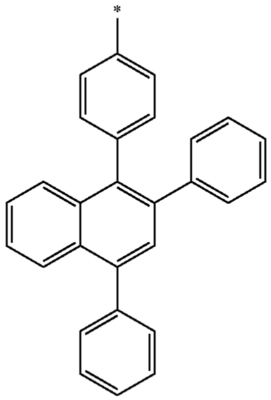 | 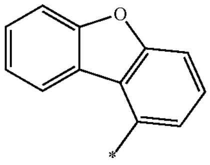 | 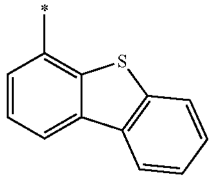 |

-continued
| | n | A—L—* | $Ar_1$ | $Ar_2$ |
|---|---|---|---|---|
| [Compound Group 1] | | | | |
| 2-A1-76 | 1 | 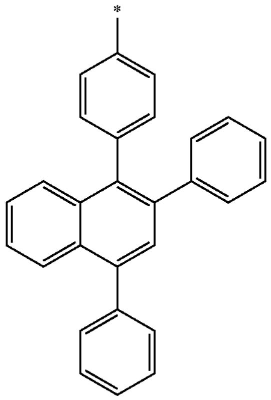 | 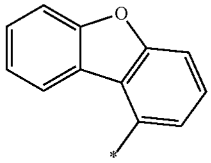 | 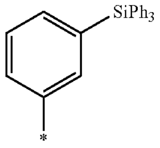 |
| 2-A1-77 | 1 | 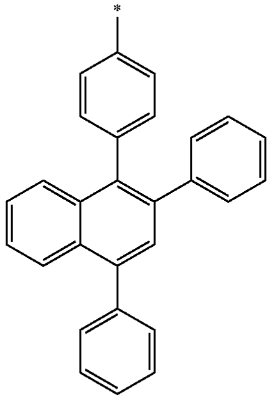 | 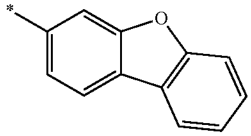 [SMILES: *c1ccc2c(c1)oc1ccccc12] | 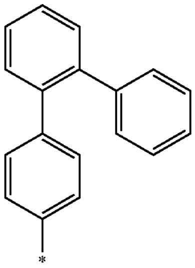 [SMILES: *c1ccc(-c2ccccc2-c2ccccc2)cc1] |
| 2-A1-78 | 1 | 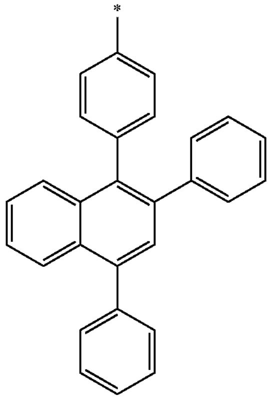 | 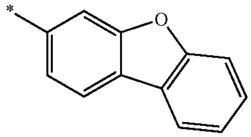 [SMILES: *c1ccc2c(c1)oc1ccccc12] | 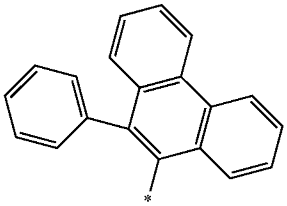 [SMILES: *c1c(-c2ccccc2)c2ccccc2c2ccccc12] |

-continued
| [Compound Group 1] | | | | |
|---|---|---|---|---|
| | n | A—L—* | $Ar_1$ | $Ar_2$ |
| 2-A1-79 | 1 | 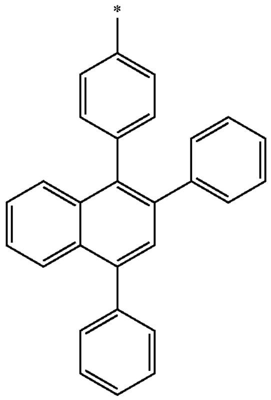 | 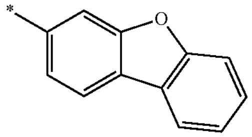 [SMILES: *c1ccc2c(c1)oc1ccccc12] | 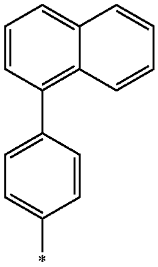 [SMILES: *c1ccc(-c2cccc3ccccc23)cc1] |
| 2-A1-80 | 1 | 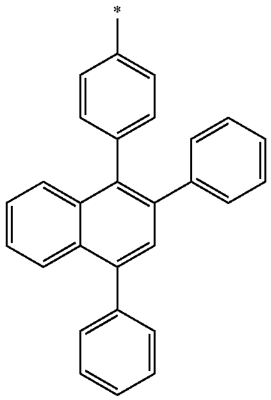 | 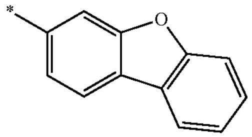 [SMILES: *c1ccc2c(c1)oc1ccccc12] | 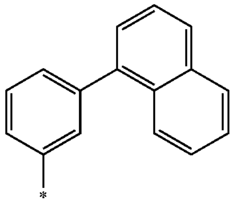 |
| 2-A1-81 | 1 | 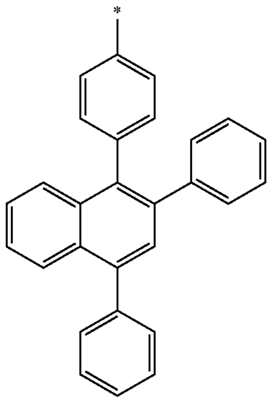 | 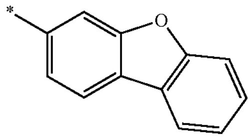 [SMILES: *c1ccc2c(c1)oc1ccccc12] | 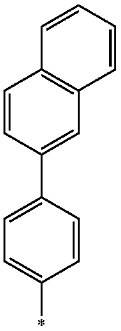 [SMILES: *c1ccc(-c2ccc3ccccc3c2)cc1] |

-continued
[Compound Group 1]
| | n | A—L—* | $Ar_1$ | $Ar_2$ |
|---|---|---|---|---|
| 2-A1-82 | 1 | 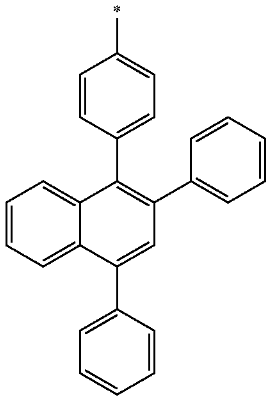 | 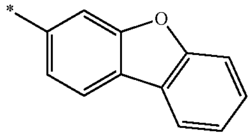 [SMILES: *c1ccc2c(c1)oc1ccccc12] | 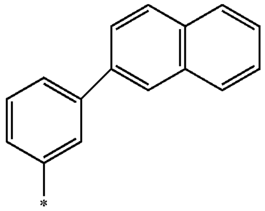 [SMILES: *c1cccc(-c2ccc3ccccc3c2)c1] |
| 2-A1-83 | 1 | 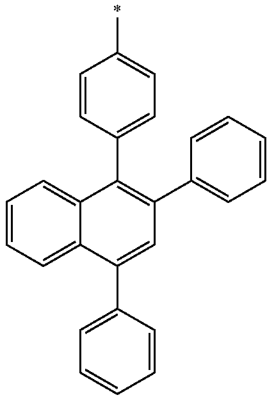 | 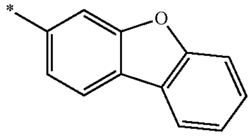 [SMILES: *c1ccc2c(c1)oc1ccccc12] | 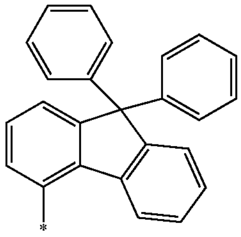 |
| 2-A1-84 | 1 | 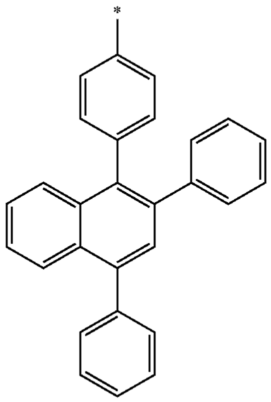 | 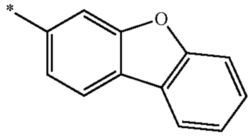 [SMILES: *c1ccc2c(c1)oc1ccccc12] | 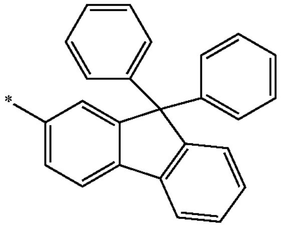 |

-continued
| [Compound Group 1] | | | | |
|---|---|---|---|---|
| | n | A—L—* | $Ar_1$ | $Ar_2$ |
| 2-A1-85 | 1 | 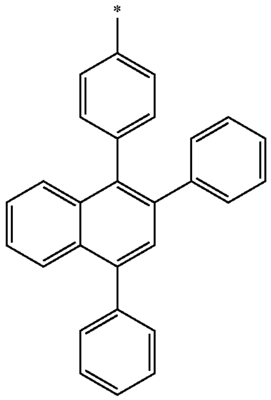 | 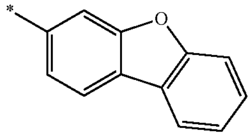 [SMILES: *c1ccc2c(c1)oc1ccccc12] | 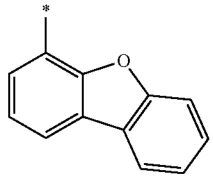 |
| 2-A1-86 | 1 | 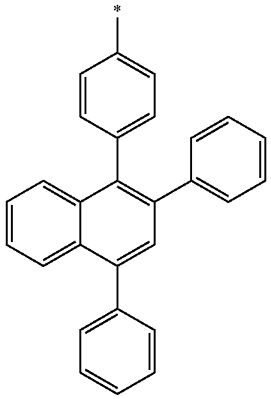 | 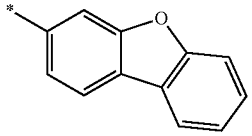 [SMILES: *c1ccc2c(c1)oc1ccccc12] | 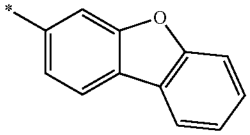 |
| 2-A1-87 | 1 | 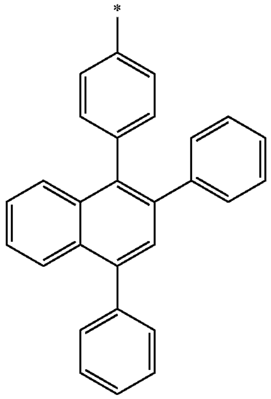 | 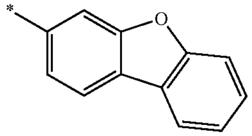 [SMILES: *c1ccc2c(c1)oc1ccccc12] | 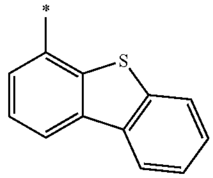 |

-continued
[Compound Group 1]
| | n | A—L—* | $Ar_1$ | $Ar_2$ |
|---|---|---|---|---|
| 2-A1-88 | 1 | 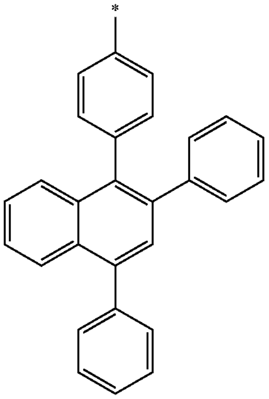 | 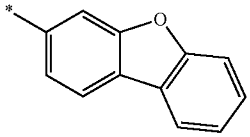 [SMILES: *c1ccc2c(c1)oc1ccccc12] | 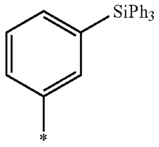 |
| 2-A1-89 | 1 | 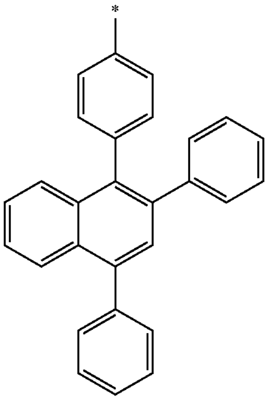 | 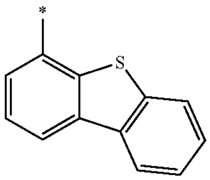 | 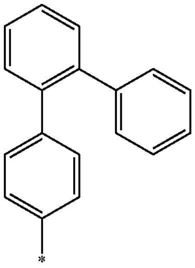 |
| 2-A1-90 | 1 | 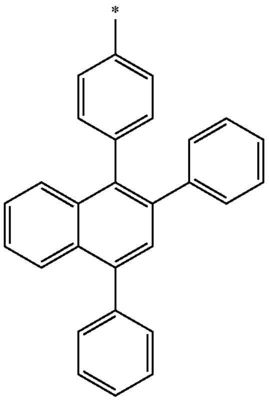 | 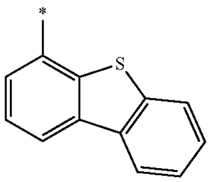 | 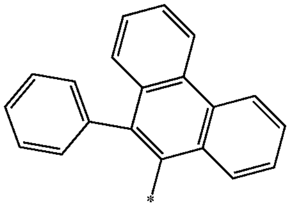 |

-continued
[Compound Group 1]
| | n | A—L—* | $Ar_1$ | $Ar_2$ |
|---|---|---|---|---|
| 2-A1-91 | 1 | 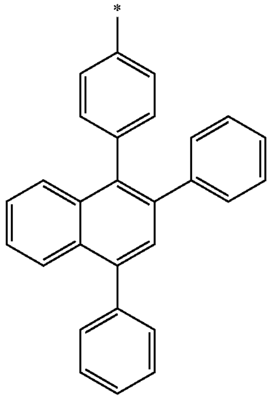 | 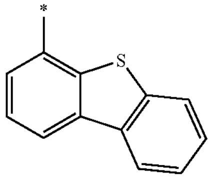 | 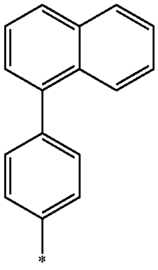 |
| 2-A1-92 | 1 | 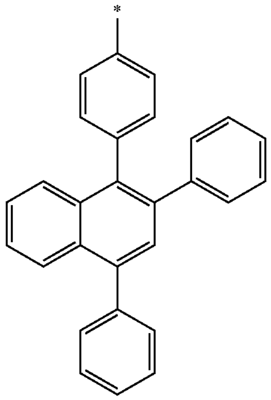 | 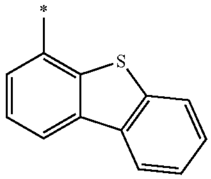 | 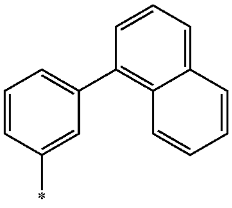 |
| 2-A1-93 | 1 | 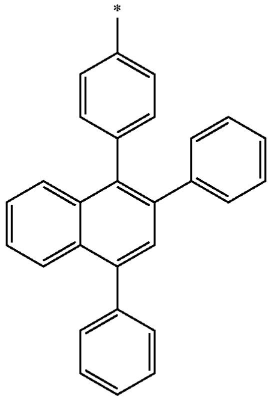 | 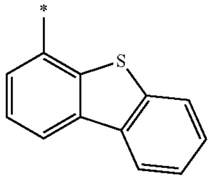 | 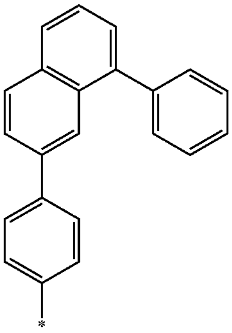 |

-continued
[Compound Group 1]
| | n | A—L—* | $Ar_1$ | $Ar_2$ |
|---|---|---|---|---|
| 2-A1-94 | 1 | 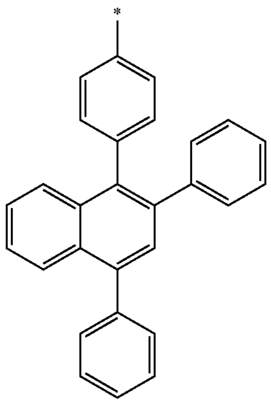 | 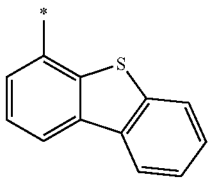 | 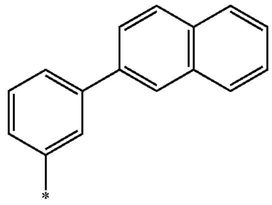 |
| 2-A1-95 | 1 | 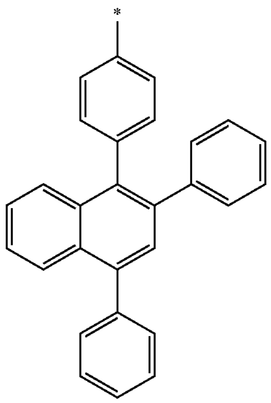 | 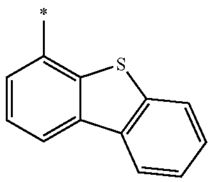 | 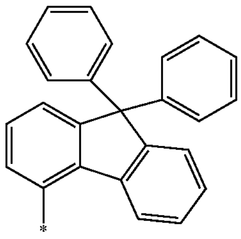 |
| 2-A1-96 | 1 | 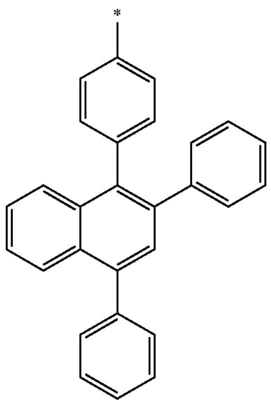 | 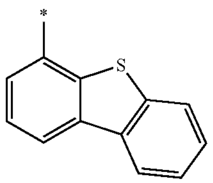 | 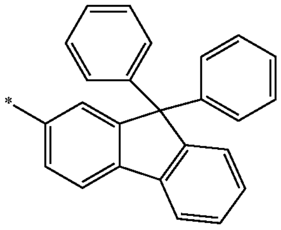 |

-continued
[Compound Group 1]
| | n | A—L—* | $Ar_1$ | $Ar_2$ |
|---|---|---|---|---|
| 2-A1-97 | 1 | 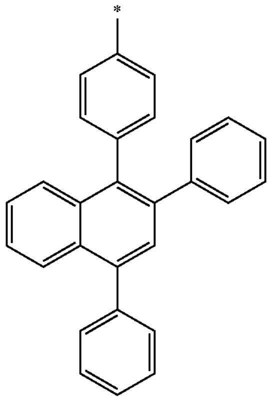 | 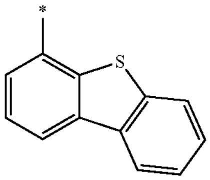 | 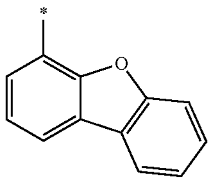 |
| 2-A1-98 | 1 | 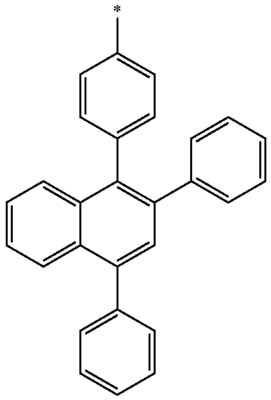 | 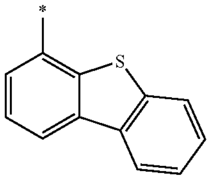 | 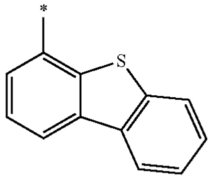 |
| 2-A1-99 | 1 | 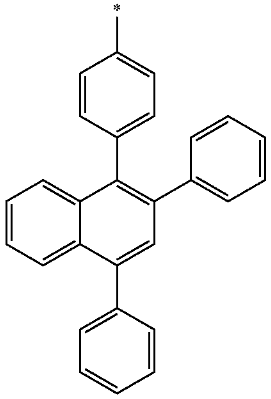 | 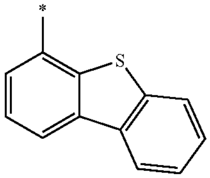 | 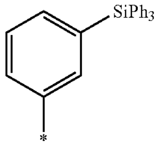 |
| 3-A1-1 | 1 | 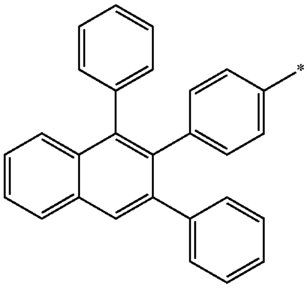 | 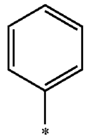 | 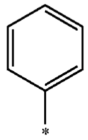 |

-continued
[Compound Group 1]
| | n | A—L—* | $Ar_1$ | $Ar_2$ |
| --- | --- | --- | --- | --- |
| 3-A1-2 | 1 | 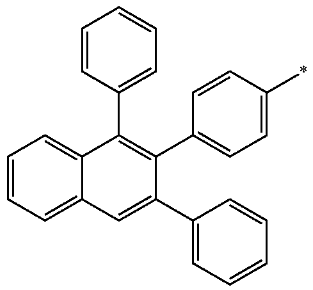 | 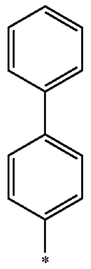 [SMILES: *c1ccc(-c2ccccc2)cc1] | 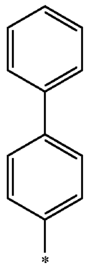 [SMILES: *c1ccc(-c2ccccc2)cc1] |
| 3-A1-3 | 1 | 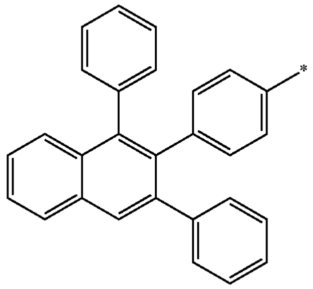 | 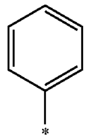 [SMILES: *c1ccccc1] | 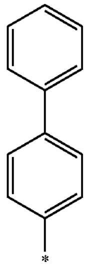 [SMILES: *c1ccc(-c2ccccc2)cc1] |
| 3-A1-4 | 1 | 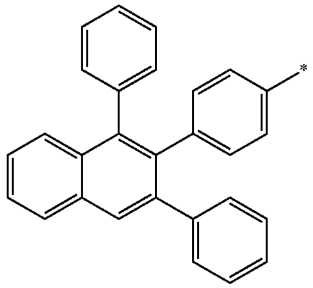 | 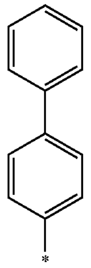 | 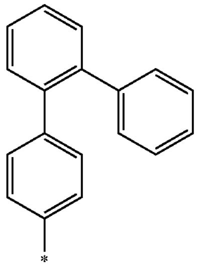 [SMILES: *c1ccc(-c2ccccc2-c2ccccc2)cc1] |
| 3-A1-5 | 1 | 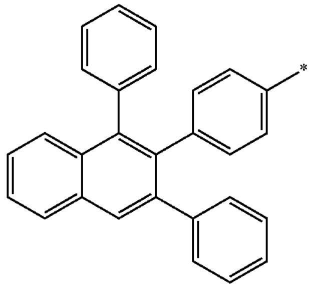 | 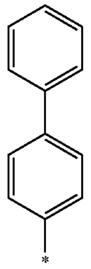 [SMILES: *c1ccc(-c2ccccc2)cc1] | 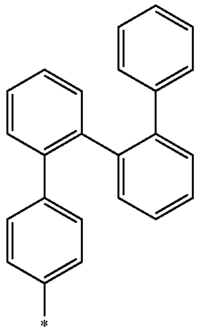 [SMILES: *c1ccc(-c2ccccc2-c2ccccc2-c2ccccc2)cc1] |
| 3-A1-6 | 1 | 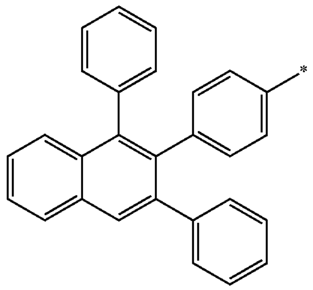 | 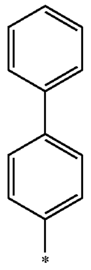 [SMILES: *c1ccc(-c2ccccc2)cc1] | 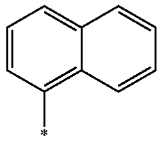 |

-continued
| [Compound Group 1] | | | | |
|---|---|---|---|---|
| | n | A—L—* | $Ar_1$ | $Ar_2$ |
| 3-A1-7 | 1 | 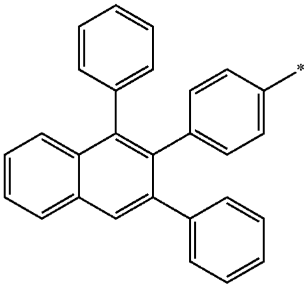 | 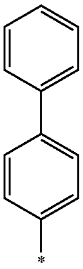 [SMILES: *c1ccc(-c2ccccc2)cc1] | 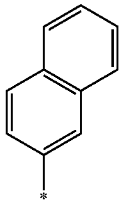 |
| 3-A1-8 | 1 | 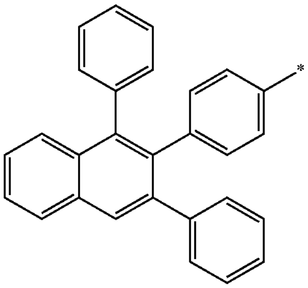 | 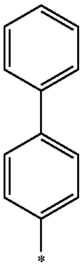 | 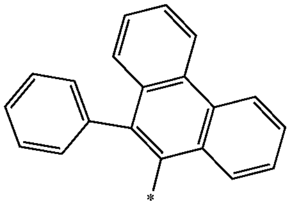 [SMILES: *c1c(-c2ccccc2)c2ccccc2c2ccccc12] |
| 3-A1-9 | 1 | 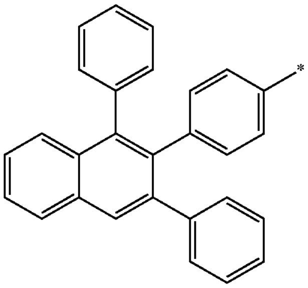 | 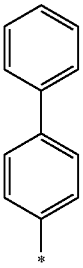 [SMILES: *c1ccc(-c2ccccc2)cc1] | 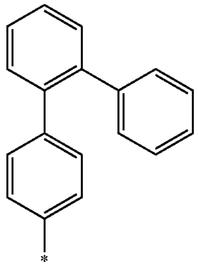 [SMILES: *c1ccc(-c2ccccc2-c2ccccc2)cc1] |
| 3-A1-10 | 1 | 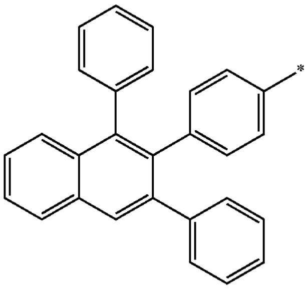 | 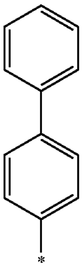 [SMILES: *c1ccc(-c2ccccc2)cc1] | 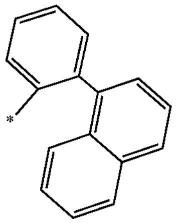 [SMILES: *c1ccccc1-c1cccc2ccccc12] |
| 3-A1-11 | 1 | 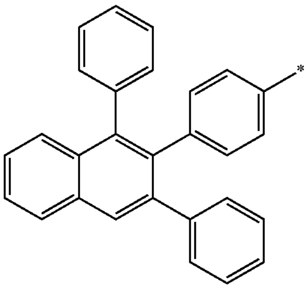 | 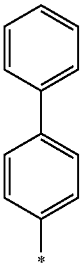 [SMILES: *c1ccc(-c2ccccc2)cc1] | 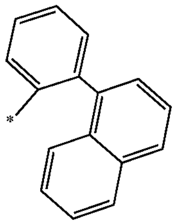 [SMILES: *c1ccccc1-c1cccc2ccccc12] |

-continued
[Compound Group 1]
| | n | A—L—* | $Ar_1$ | $Ar_2$ |
|---|---|---|---|---|
| 3-A1-12 | 1 | 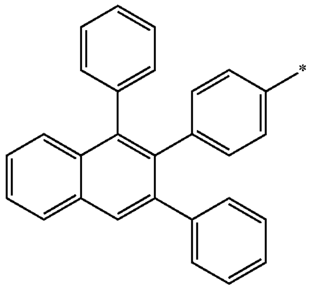 | 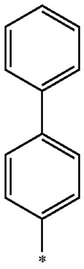 [SMILES: *c1ccc(-c2ccccc2)cc1] | 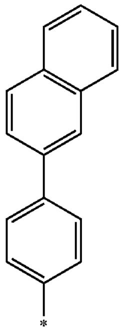 |
| 3-A1-13 | 1 | 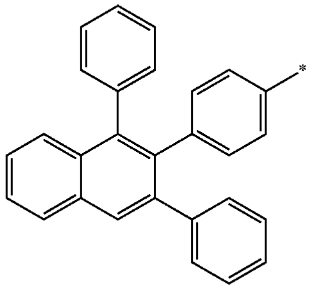 | 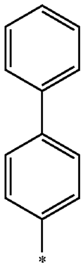 | 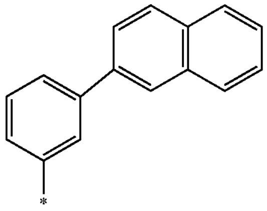 [SMILES: *c1cccc(-c2ccc3ccccc3c2)c1] |
| 3-A1-14 | 1 | 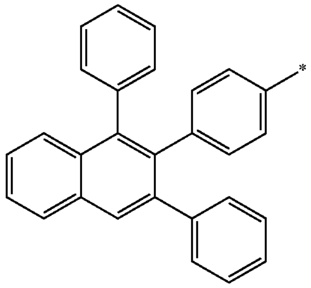 | 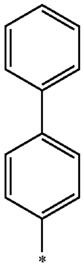 [SMILES: *c1ccc(-c2ccccc2)cc1] | 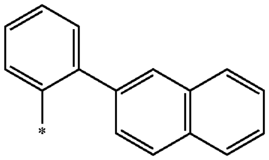 [SMILES: *c1ccccc1-c1ccc2ccccc2c1] |
| 3-A1-15 | 1 | 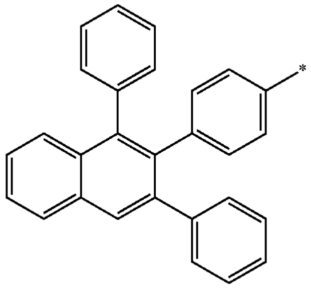 | 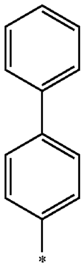 | 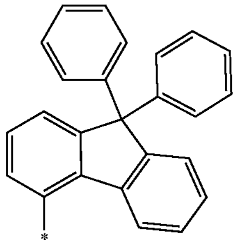 [SMILES: *c1cccc2c1-c1ccccc1C2(c1ccccc1)c1ccccc1] |
| 3-A1-16 | 1 | 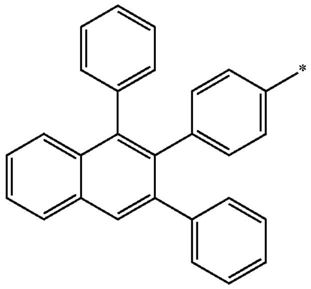 | 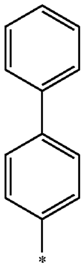 [SMILES: *c1ccc(-c2ccccc2)cc1] | 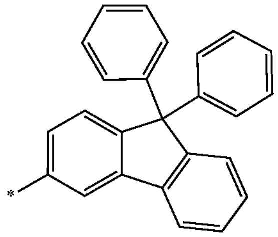 [SMILES: *c1ccc2c(c1)-c1ccccc1C2(c1ccccc1)c1ccccc1] |

-continued
[Compound Group 1]
| | n | A—L—* | $Ar_1$ | $Ar_2$ |
|---|---|---|---|---|
| 3-A1-17 | 1 | 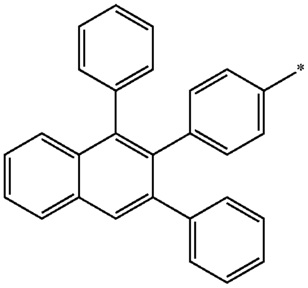 | 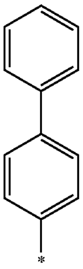 [SMILES: *c1ccc(-c2ccccc2)cc1] | 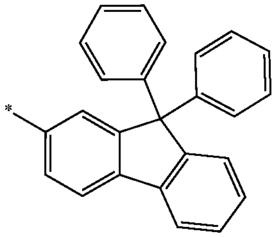 [SMILES: *c1ccc2c(c1)C(c1ccccc1)(c1ccccc1)c1ccccc1-2] |
| 3-A1-18 | 1 | 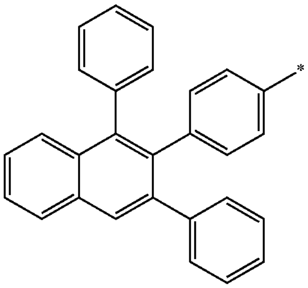 | 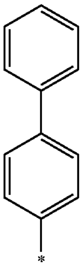 | 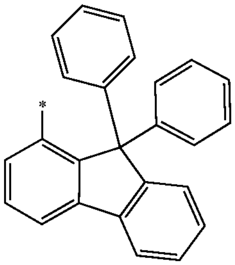 [SMILES: *c1cccc2c1C(c1ccccc1)(c1ccccc1)c1ccccc1-2] |
| 3-A1-19 | 1 | 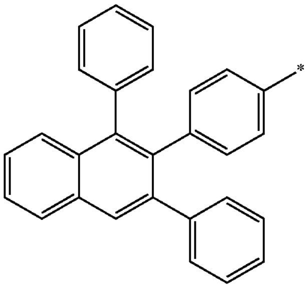 | 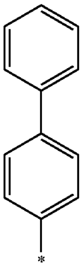 [SMILES: *c1ccc(-c2ccccc2)cc1] | 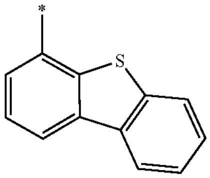 |
| 3-A1-20 | 1 | 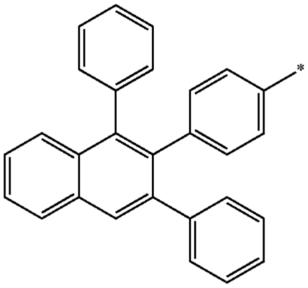 | 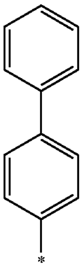 [SMILES: *c1ccc(-c2ccccc2)cc1] | 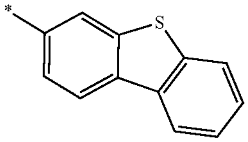 [SMILES: *c1ccc2c(c1)sc1ccccc12] |
| 3-A1-21 | 1 | 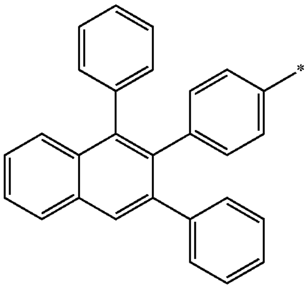 | 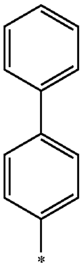 [SMILES: *c1ccc(-c2ccccc2)cc1] | 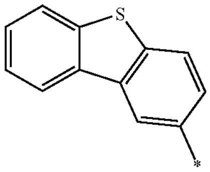 |

-continued
[Compound Group 1]
| | n | A—L—* | $Ar_1$ | $Ar_2$ |
|---|---|---|---|---|
| 3-A1-22 | 1 | 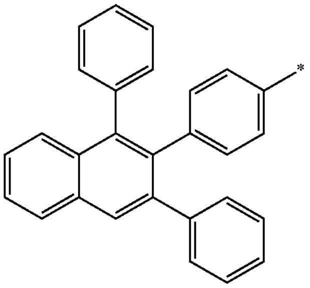 | 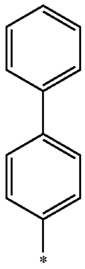 [SMILES: *c1ccc(-c2ccccc2)cc1] | 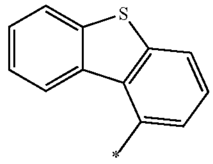 |
| 3-A1-23 | 1 | 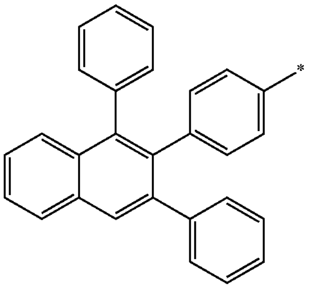 | 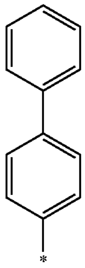 | 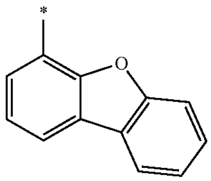 |
| 3-A1-24 | 1 | 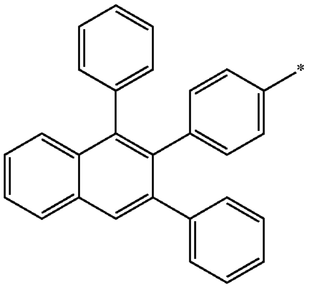 | 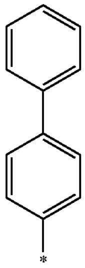 [SMILES: *c1ccc(-c2ccccc2)cc1] | 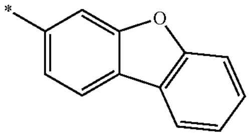 |
| 3-A1-25 | 1 | 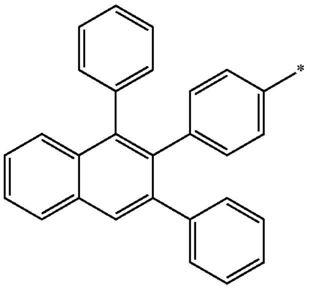 | 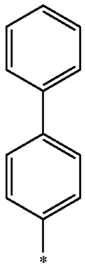 [SMILES: *c1ccc(-c2ccccc2)cc1] | 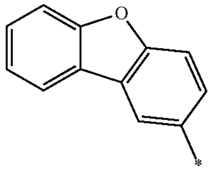 |
| 3-A1-26 | 1 | 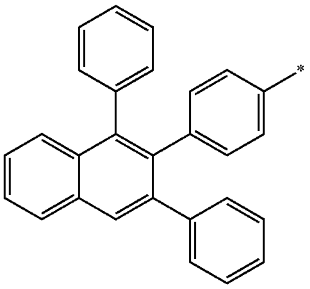 | 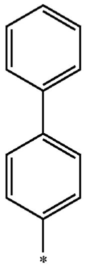 [SMILES: *c1ccc(-c2ccccc2)cc1] | 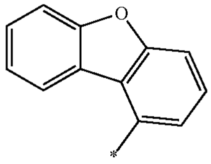 |

-continued
[Compound Group 1]
| | n | A—L—* | $Ar_1$ | $Ar_2$ |
|---|---|---|---|---|
| 3-A1-27 | 1 | 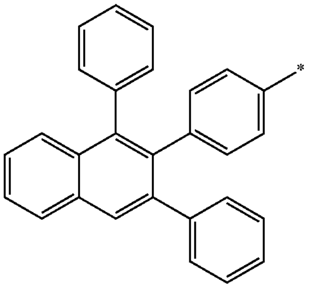 | 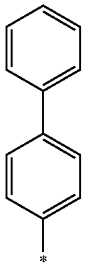 [SMILES: *c1ccc(-c2ccccc2)cc1] | 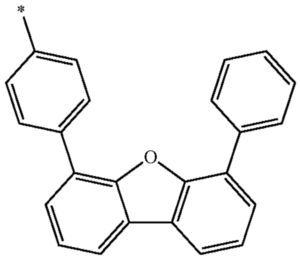 |
| 3-A1-28 | 1 | 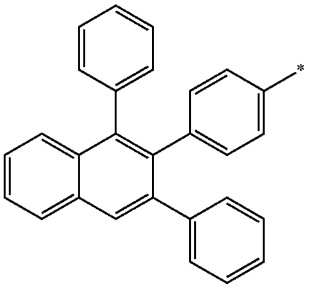 | 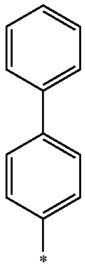 | 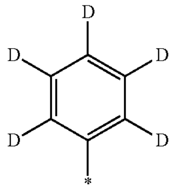 |
| 3-A1-29 | 1 | 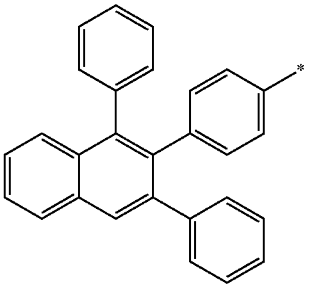 | 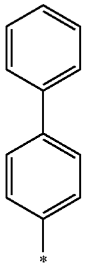 [SMILES: *c1ccc(-c2ccccc2)cc1] | 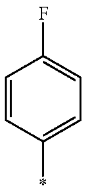 |
| 3-A1-30 | 1 | 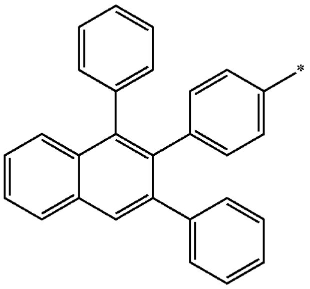 | 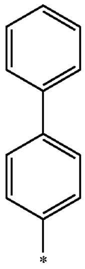 [SMILES: *c1ccc(-c2ccccc2)cc1] | 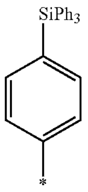 |
| 3-A1-31 | 1 | 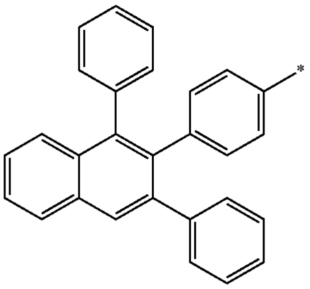 | 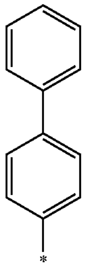 [SMILES: *c1ccc(-c2ccccc2)cc1] | 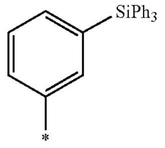 |

-continued
[Compound Group 1]
| | n | A—L—* | $Ar_1$ | $Ar_2$ |
|---|---|---|---|---|
| 3-A1-32 | 1 | 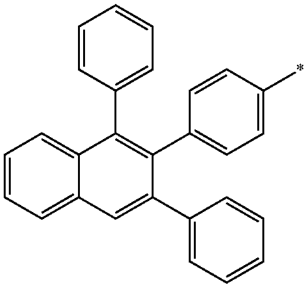 | 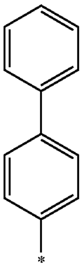 [SMILES: *c1ccc(-c2ccccc2)cc1] | 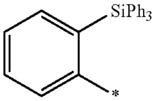 |
| 3-A1-33 | 1 | 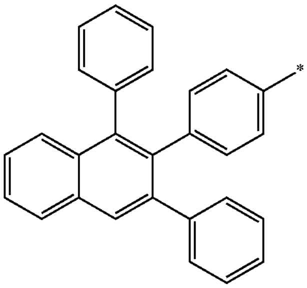 | 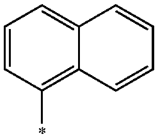 | 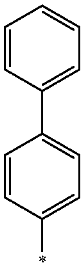 [SMILES: *c1ccc(-c2ccccc2)cc1] |
| 3-A1-34 | 1 | 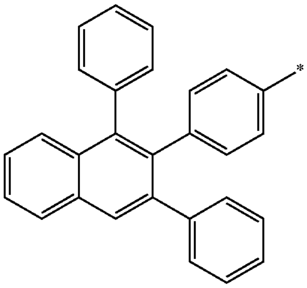 | 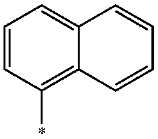 [SMILES: *c1cccc2ccccc12] | 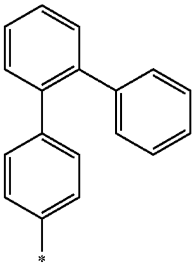 [SMILES: *c1ccc(-c2ccccc2-c2ccccc2)cc1] |
| 3-A1-35 | 1 | 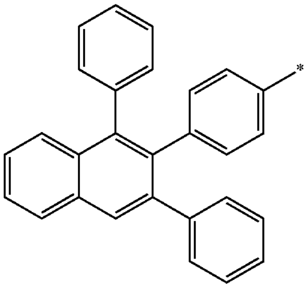 | 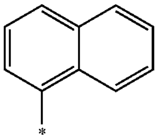 | 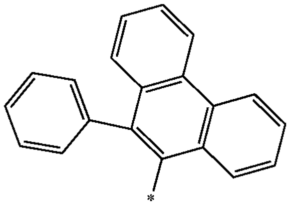 [SMILES: *c1c(-c2ccccc2)c2ccccc2c2ccccc12] |
| 3-A1-36 | 1 | 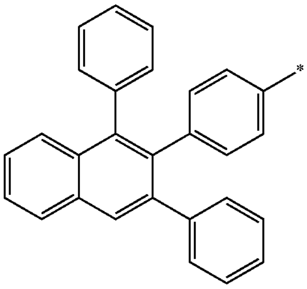 | 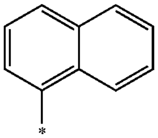 | 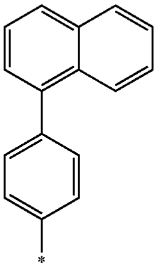 [SMILES: *c1ccc(-c2cccc3ccccc23)cc1] |

-continued
| [Compound Group 1] | | | | |
|---|---|---|---|---|
| | n | A—L—* | $Ar_1$ | $Ar_2$ |
| 3-A1-37 | 1 | 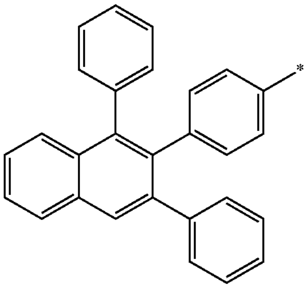 | 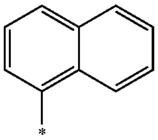 | 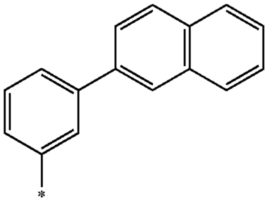 [SMILES: *c1cccc(-c2ccc3ccccc3c2)c1] |
| 3-A1-38 | 1 | 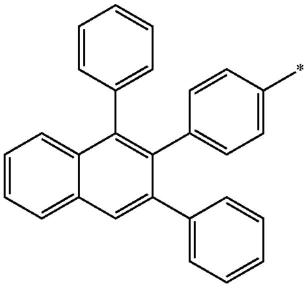 | 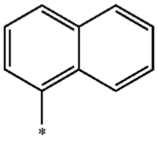 [SMILES: *c1cccc2ccccc12] | 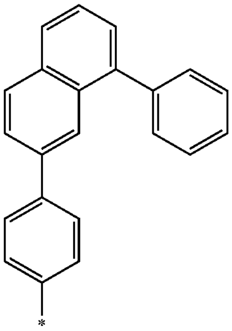 [SMILES: *c1ccc(-c2ccc3cccc(-c4ccccc4)c3c2)cc1] |
| 3-A1-39 | 1 | 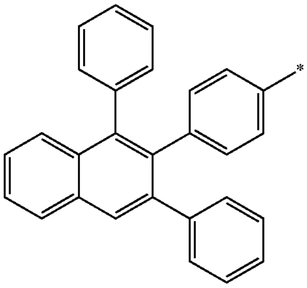 | 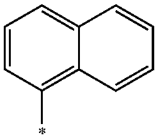 [SMILES: *c1cccc2ccccc12] | 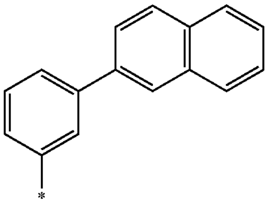 [SMILES: *c1cccc(-c2ccc3ccccc3c2)c1] |
| 3-A1-40 | 1 | 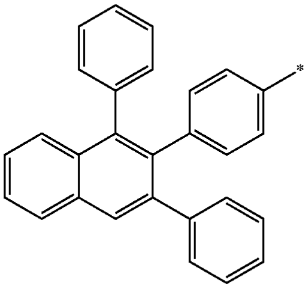 | 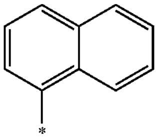 [SMILES: *c1cccc2ccccc12] | 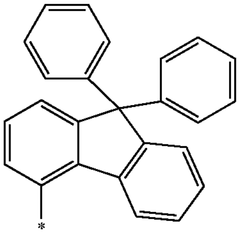 [SMILES: *c1cccc2c1-c1ccccc1C2(c1ccccc1)c1ccccc1] |
| 3-A1-41 | 1 | 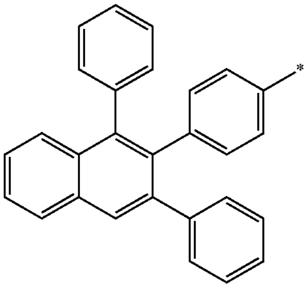 | 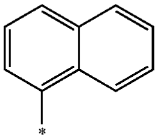 | 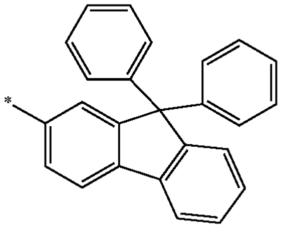 [SMILES: *c1ccc2c(c1)C(c1ccccc1)(c1ccccc1)c1ccccc1-2] |

-continued
| [Compound Group 1] | | | | |
|---|---|---|---|---|
| | n | A—L—* | $Ar_1$ | $Ar_2$ |
| 3-A1-42 | 1 | 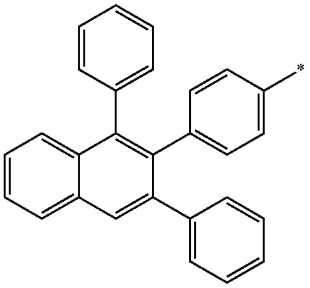 | 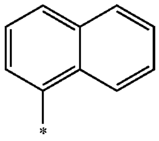 | 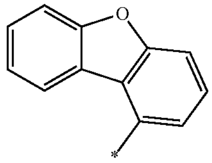 |
| 3-A1-43 | 1 | 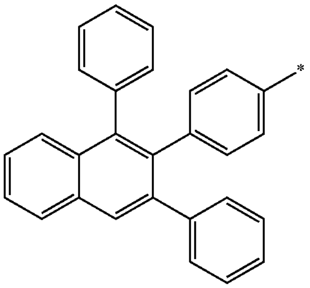 | 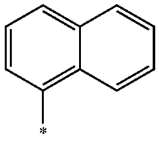 | 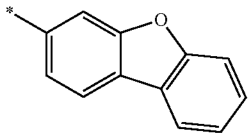 |
| 3-A1-44 | 1 | 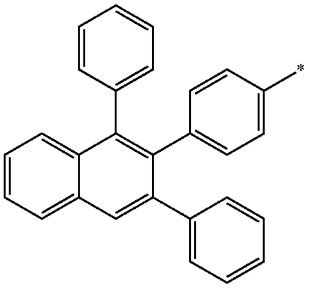 | 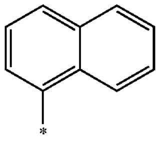 [SMILES: *c1cccc2ccccc12] | 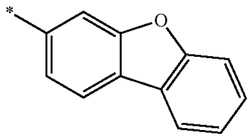 |
| 3-A1-45 | 1 | 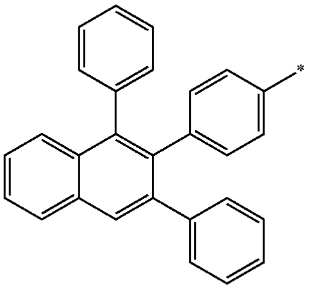 | 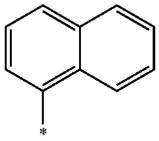 | 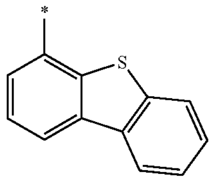 |
| 3-A1-46 | 1 | 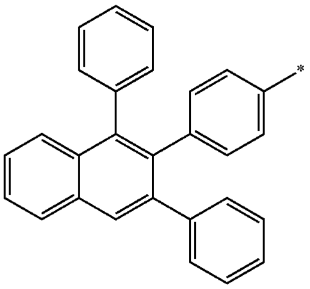 | 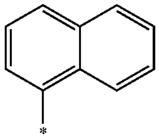 | 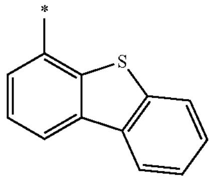 |

-continued
[Compound Group 1]
| | n | A—L—* | $Ar_1$ | $Ar_2$ |
|---|---|---|---|---|
| 3-A1-47 | 1 | 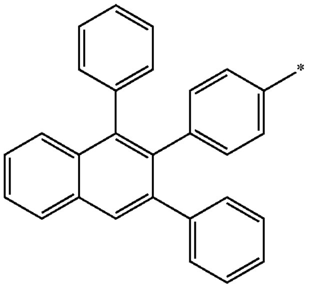 | 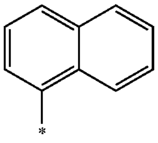 | 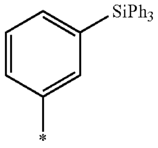 |
| 3-A1-48 | 1 | 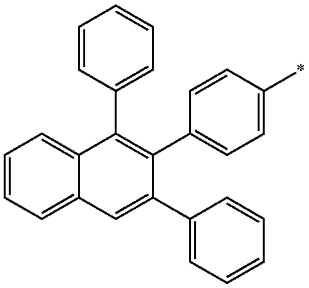 | 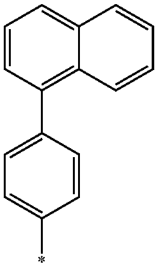 | 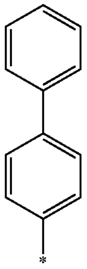 |
| 3-A1-49 | 1 | 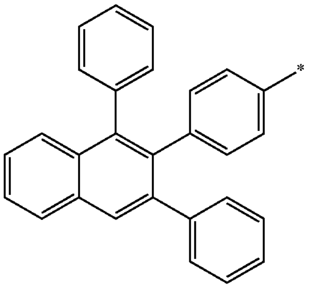 | 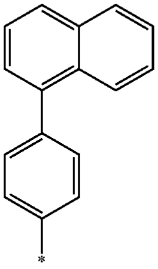 | 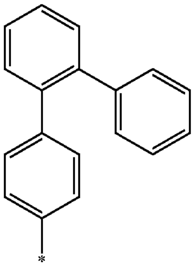 |
| 3-A1-50 | 1 | 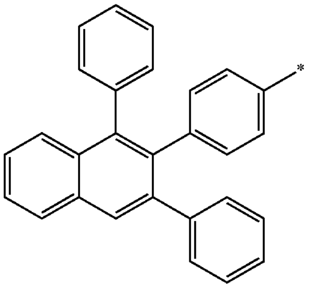 | 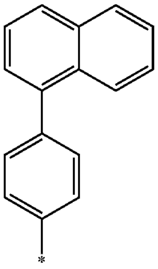 | 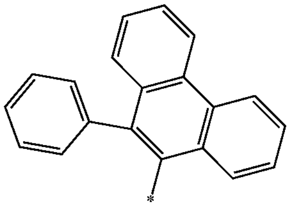 |
| 3-A1-51 | 1 | 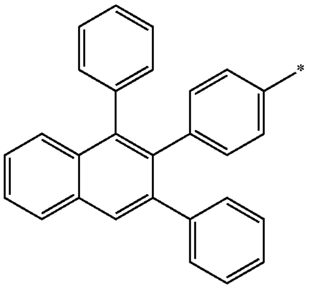 | 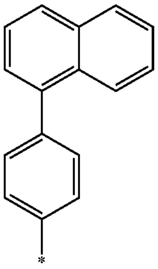 | 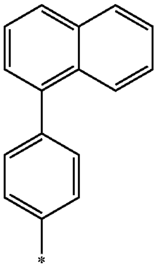 |

-continued
[Compound Group 1]
| | n | A—L—* | $Ar_1$ | $Ar_2$ |
|---|---|---|---|---|
| 3-A1-52 | 1 | 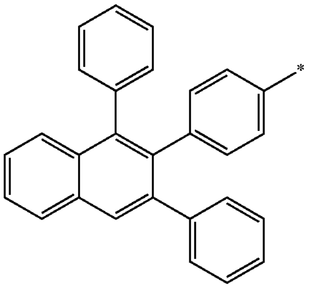 | 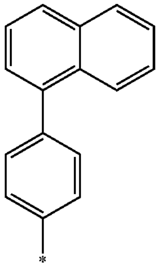 | 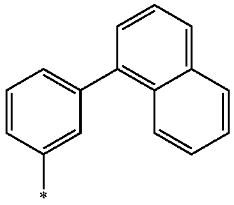 |
| 3-A1-53 | 1 | 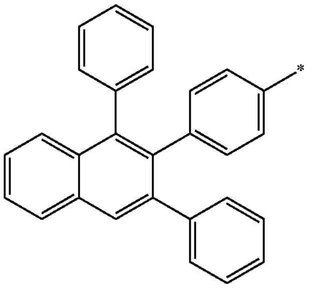 | 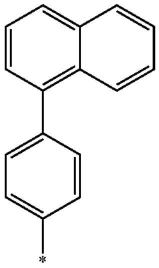 | 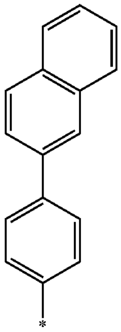 |
| 3-A1-54 | 1 | 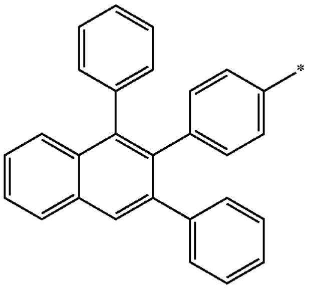 | 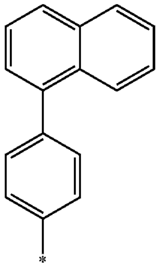 | 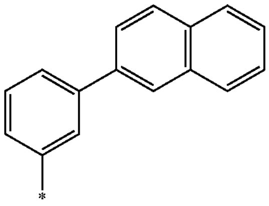 |
| 3-A1-55 | 1 | 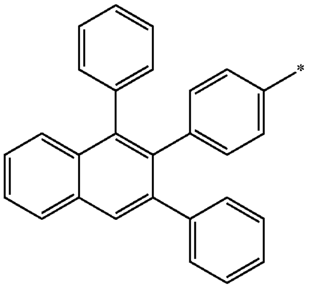 | 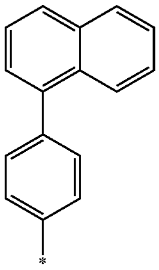 | 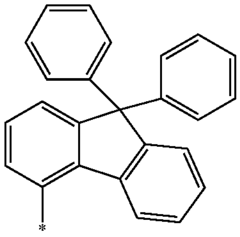 |
| 3-A1-56 | 1 | 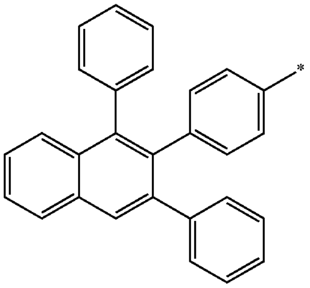 | 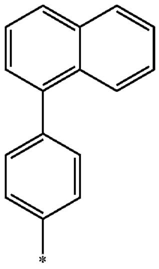 | 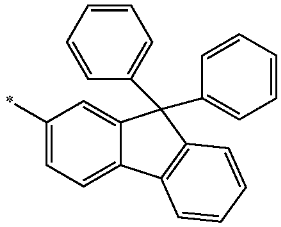 |

-continued
[Compound Group 1]
| | n | A—L—* | $Ar_1$ | $Ar_2$ |
|---|---|---|---|---|
| 3-A1-57 | 1 | 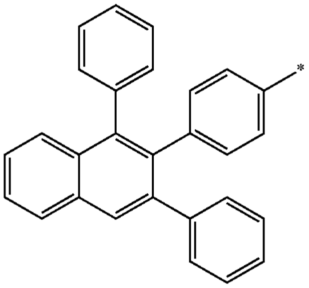 | 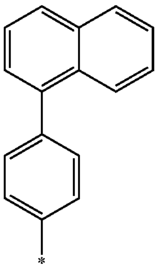 | 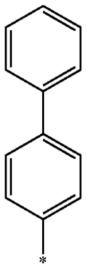 |
| 3-A1-58 | 1 | 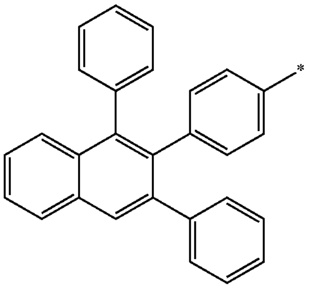 | 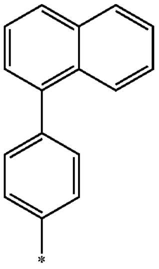 | 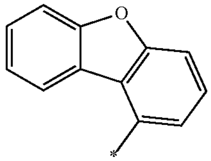 |
| 3-A1-59 | 1 | 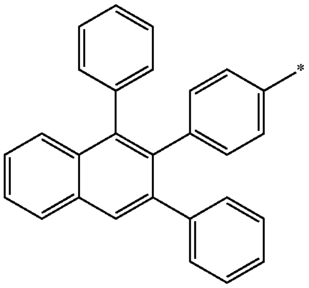 | 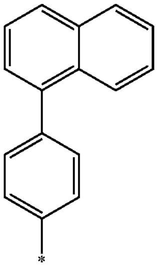 | 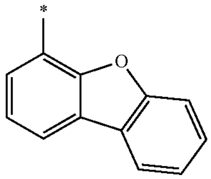 |
| 3-A1-60 | 1 | 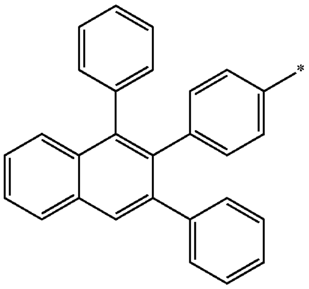 | 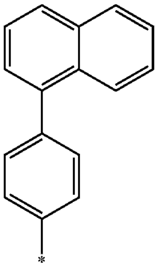 | 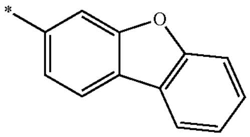 |
| 3-A1-61 | 1 | 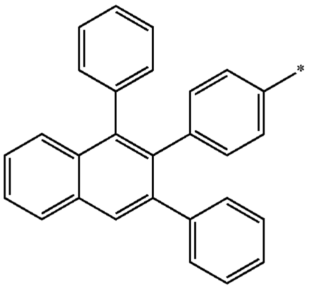 | 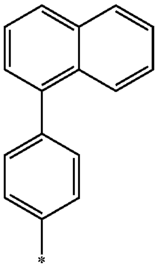 | 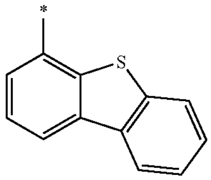 |

-continued
[Compound Group 1]
| | n | A—L—* | $Ar_1$ | $Ar_2$ |
|---|---|---|---|---|
| 3-A1-62 | 1 | 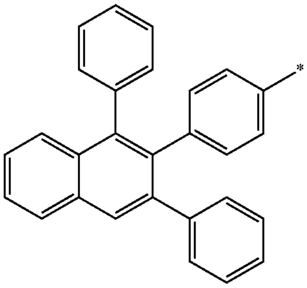 | 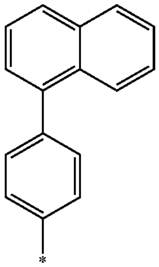 | 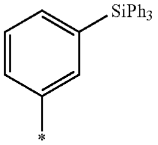 |
| 3-A1-63 | 1 | 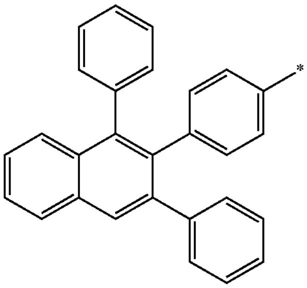 | 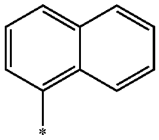 [SMILES: *c1cccc2ccccc12] | 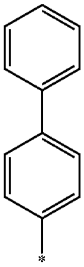 |
| 3-A1-64 | 1 | 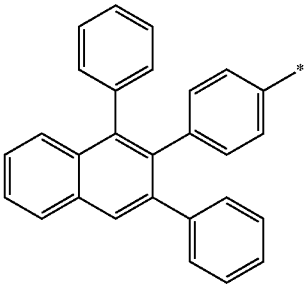 | 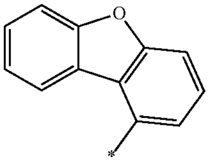 | 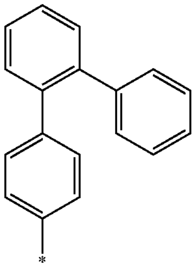 |
| 3-A1-65 | 1 | 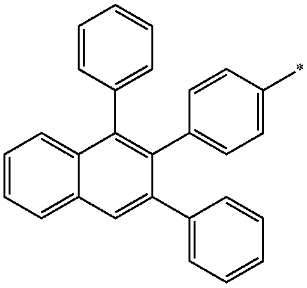 | 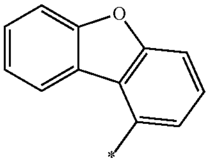 | 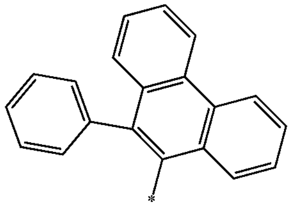 |
| 3-A1-66 | 1 | 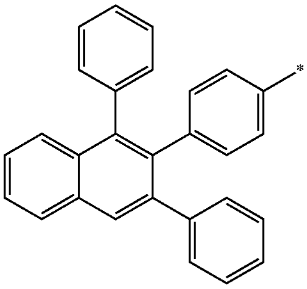 | 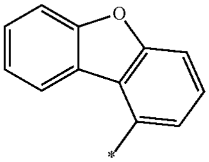 | 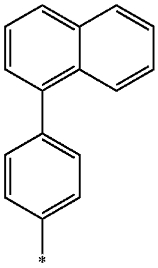 |

-continued
[Compound Group 1]
| | n | A—L—* | $Ar_1$ | $Ar_2$ |
|---|---|---|---|---|
| 3-A1-67 | 1 | 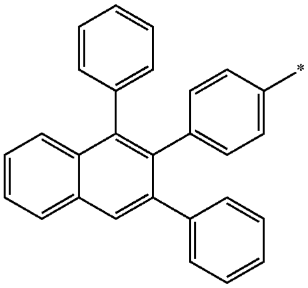 | 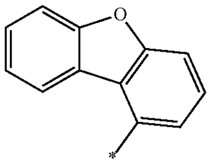 | 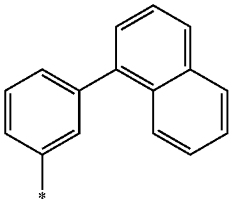 |
| 3-A1-68 | 1 | 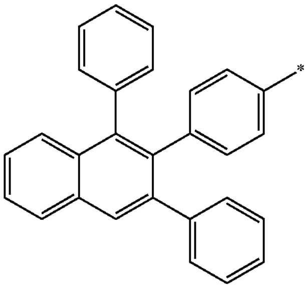 | 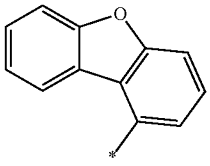 | 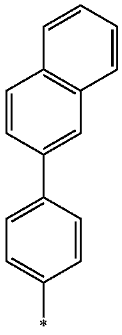 |
| 3-A1-69 | 1 | 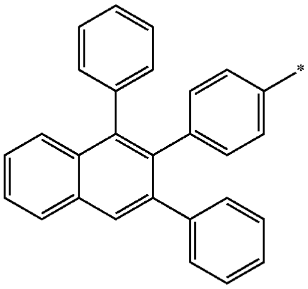 | 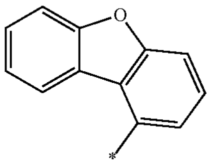 | 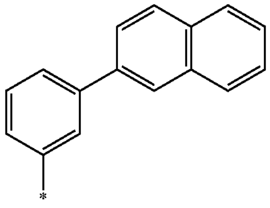 |
| 3-A1-70 | 1 | 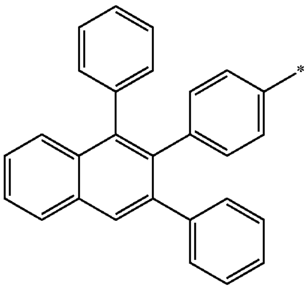 | 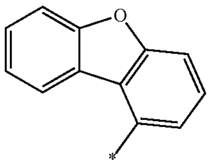 | 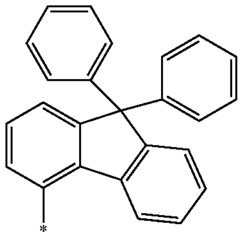 |
| 3-A1-71 | 1 | 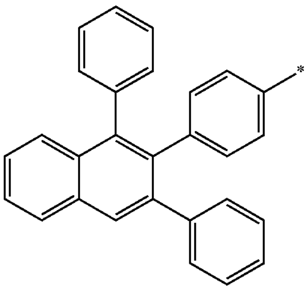 | 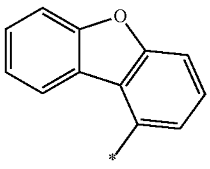 | 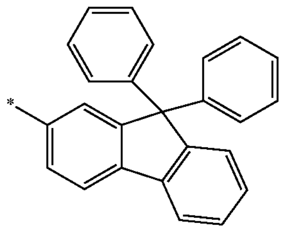 |

-continued
| [Compound Group 1] | | | | |
|---|---|---|---|---|
| | n | A—L—* | $Ar_1$ | $Ar_2$ |
| 3-A1-72 | 1 | 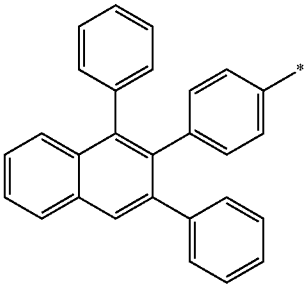 | 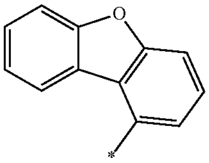 | 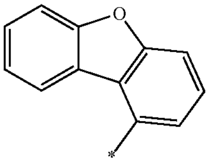 |
| 3-A1-73 | 1 | 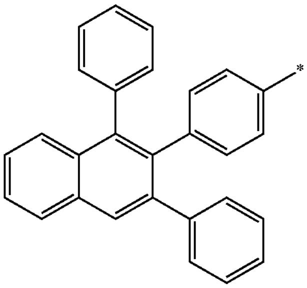 | 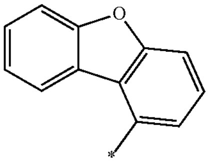 | 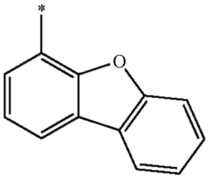 |
| 3-A1-74 | 1 | 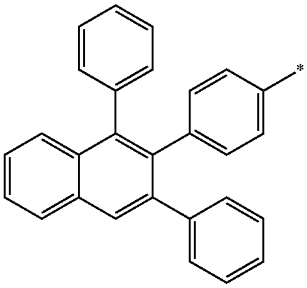 | 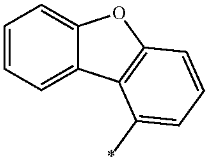 | 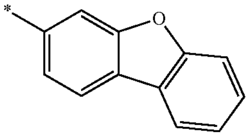 [SMILES: *c1ccc2c(c1)oc1ccccc12] |
| 3-A1-75 | 1 | 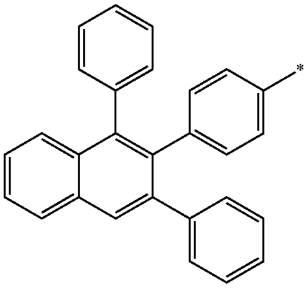 | 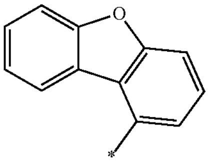 | 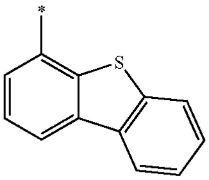 |
| 3-A1-76 | 1 | 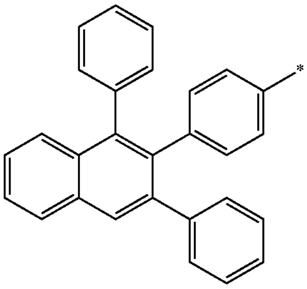 | 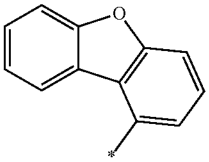 | 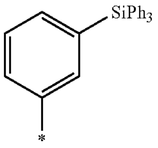 |

-continued
| [Compound Group 1] | | | | |
|---|---|---|---|---|
| | n | A—L—* | $Ar_1$ | $Ar_2$ |
| 3-A1-77 | 1 | 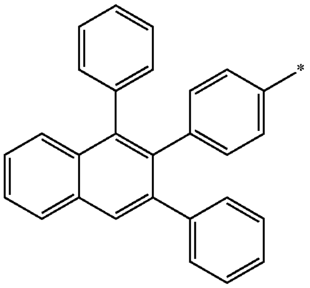 | 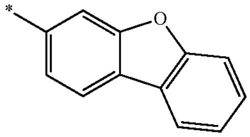 [SMILES: *c1ccc2c(c1)oc1ccccc12] | 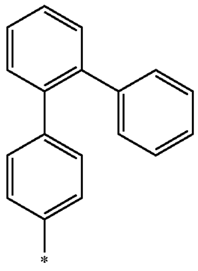 [SMILES: *c1ccc(-c2ccccc2-c2ccccc2)cc1] |
| 3-A1-78 | 1 | 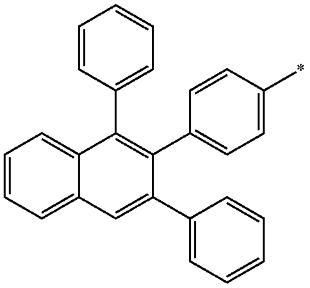 | 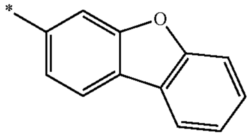 [SMILES: *c1ccc2c(c1)oc1ccccc12] | 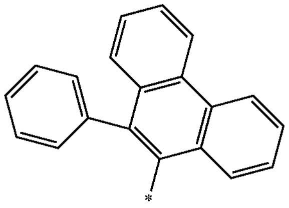 [SMILES: *c1c(-c2ccccc2)c2ccccc2c2ccccc12] |
| 3-A1-79 | 1 | 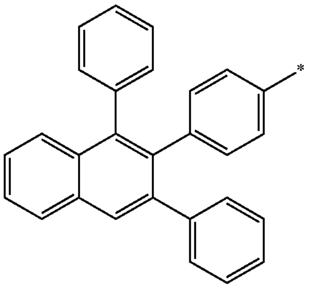 | 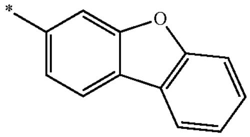 [SMILES: *c1ccc2c(c1)oc1ccccc12] | 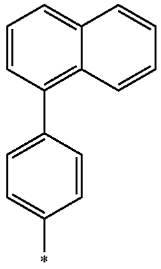 [SMILES: *c1ccc(-c2cccc3ccccc23)cc1] |
| 3-A1-80 | 1 | 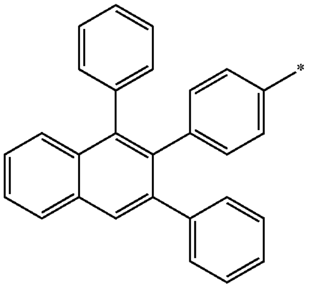 | 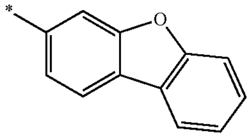 [SMILES: *c1ccc2c(c1)oc1ccccc12] | 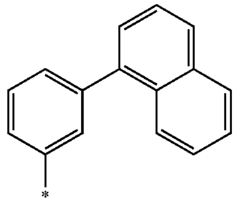 |
| 3-A1-81 | 1 | 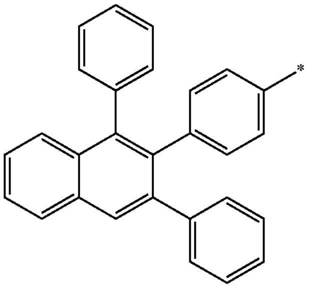 | 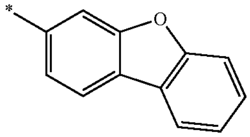 [SMILES: *c1ccc2c(c1)oc1ccccc12] | 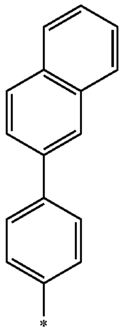 [SMILES: *c1ccc(-c2ccc3ccccc3c2)cc1] |

-continued
[Compound Group 1]
| | n | A—L—* | $Ar_1$ | $Ar_2$ |
|---|---|---|---|---|
| 3-A1-82 | 1 | 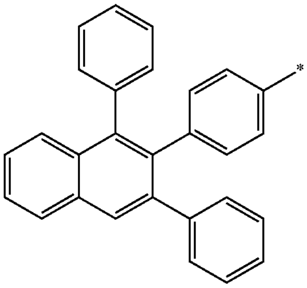 | 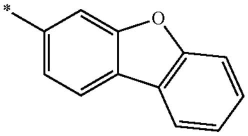 [SMILES: *c1ccc2c(c1)oc1ccccc12] | 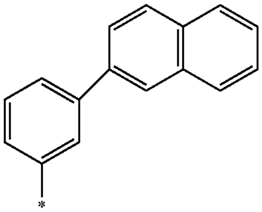 [SMILES: *c1cccc(-c2ccc3ccccc3c2)c1] |
| 3-A1-83 | 1 | 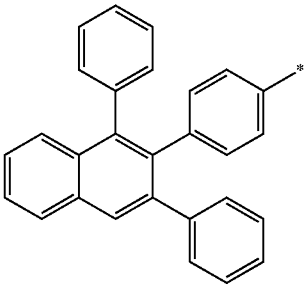 | 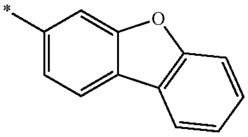 | 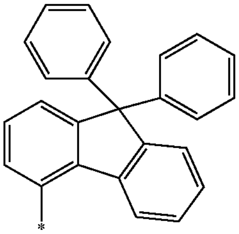 |
| 3-A1-84 | 1 | 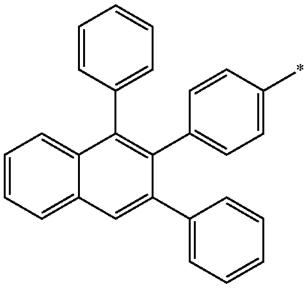 | 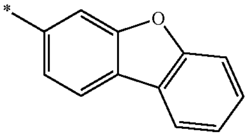 [SMILES: *c1ccc2c(c1)oc1ccccc12] | 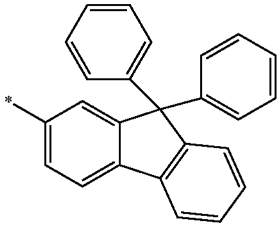 |
| 3-A1-85 | 1 | 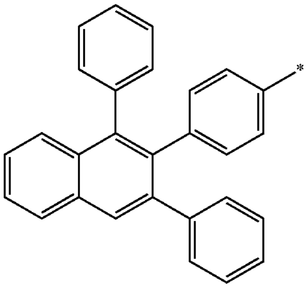 | 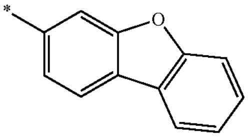 [SMILES: *c1ccc2c(c1)oc1ccccc12] | 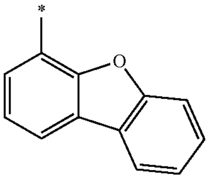 |
| 3-A1-86 | 1 | 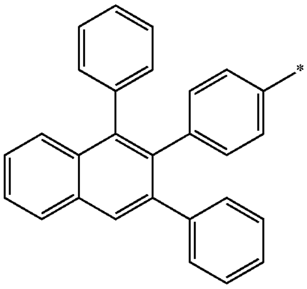 | 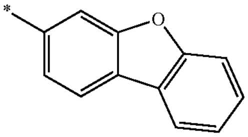 [SMILES: *c1ccc2c(c1)oc1ccccc12] | 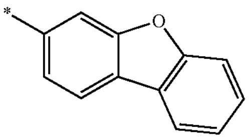 |

-continued
[Compound Group 1]
| | n | A—L—* | $Ar_1$ | $Ar_2$ |
|---|---|---|---|---|
| 3-A1-87 | 1 | 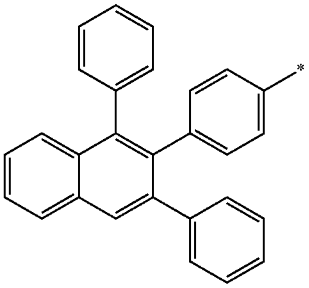 | 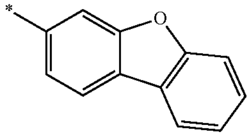 [SMILES: *c1ccc2c(c1)oc1ccccc12] | 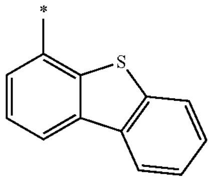 |
| 3-A1-88 | 1 | 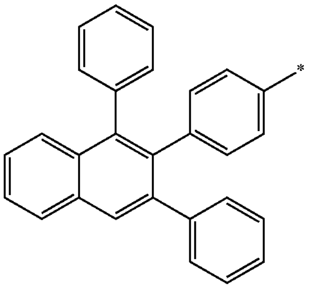 | 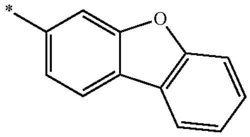 | 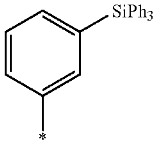 |
| 3-A1-89 | 1 | 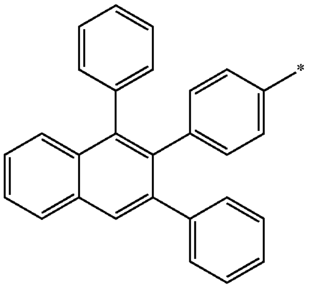 | 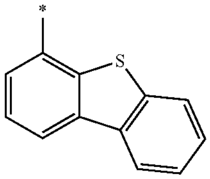 | 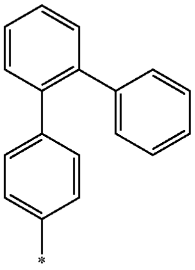 |
| 3-A1-90 | 1 | 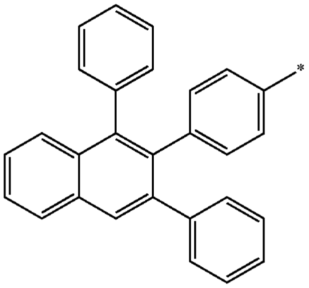 | 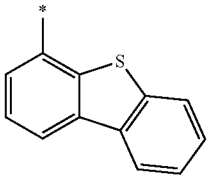 | 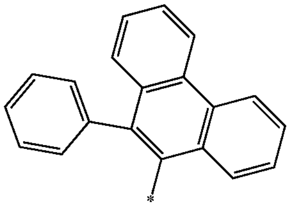 |
| 3-A1-91 | 1 | 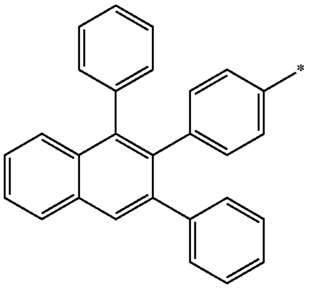 | 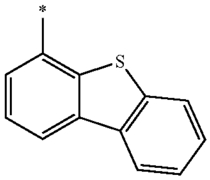 | 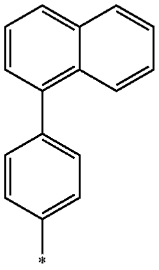 |

-continued
[Compound Group 1]
| | n | A—L—* | $Ar_1$ | $Ar_2$ |
| --- | --- | --- | --- | --- |
| 3-A1-92 | 1 | 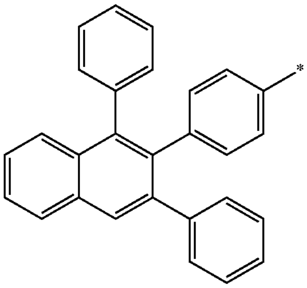 | 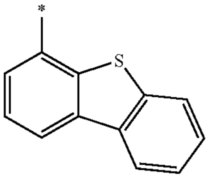 | 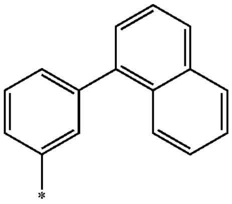 |
| 3-A1-93 | 1 | 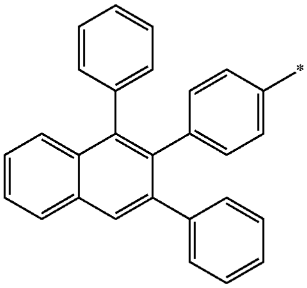 | 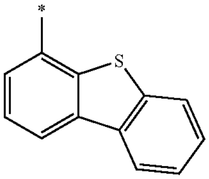 | 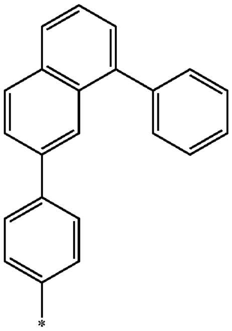 |
| 3-A1-94 | 1 | 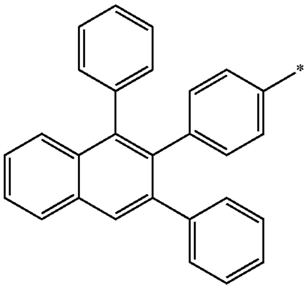 | 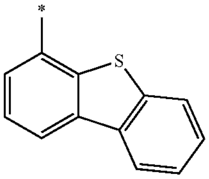 | 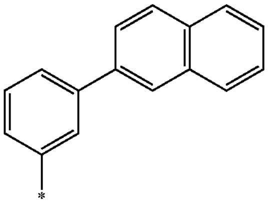 |
| 3-A1-95 | 1 | 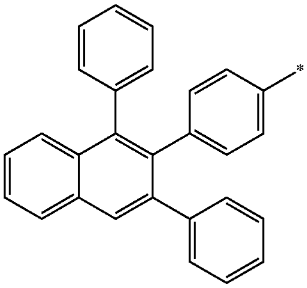 | 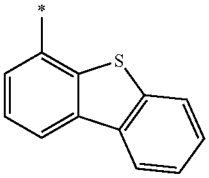 | 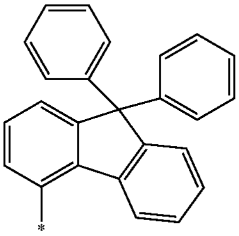 |
| 3-A1-96 | 1 | 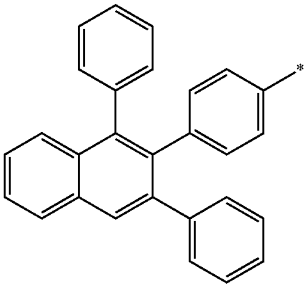 | 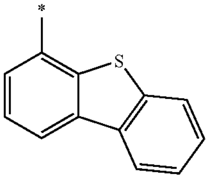 | 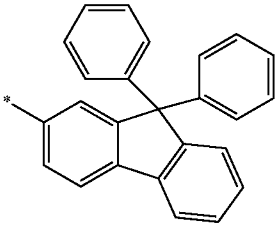 |

-continued
[Compound Group 1]
| | n | A—L—* | $Ar_1$ | $Ar_2$ |
|---|---|---|---|---|
| 3-A1-97 | 1 | 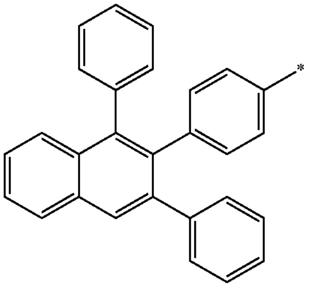 | 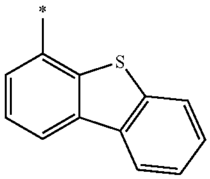 | 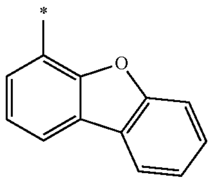 |
| 3-A1-98 | 1 | 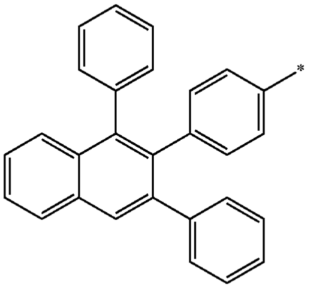 | 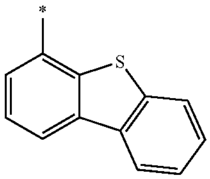 | 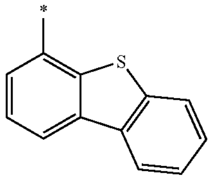 |
| 3-A1-99 | 1 | 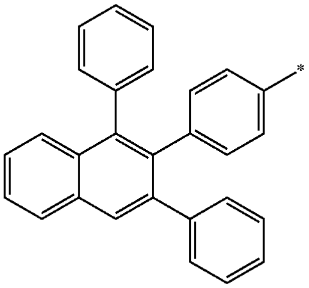 | 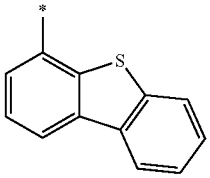 | 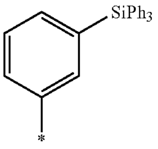 |
| 4-A1-1 | 1 | 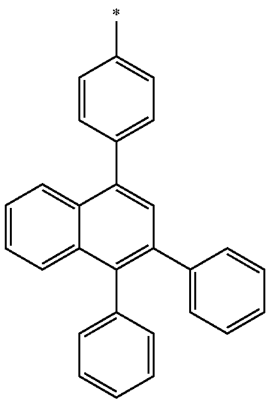 | 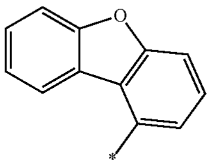 | 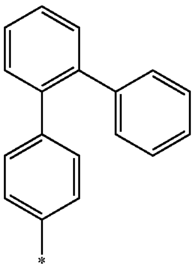 |

-continued
[Compound Group 1]
| | n | A—L—* | $Ar_1$ | $Ar_2$ |
|---|---|---|---|---|
| 4-A1-2 | 1 | 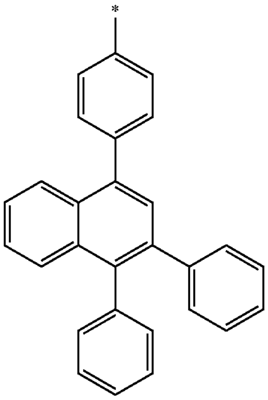 | 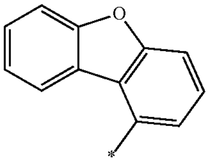 | 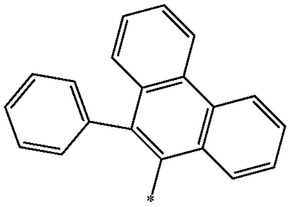 |
| 4-A1-3 | 1 | 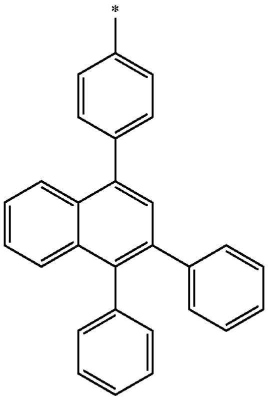 | 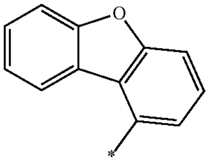 | 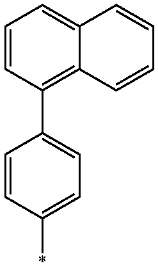 |
| 4-A1-4 | 1 | 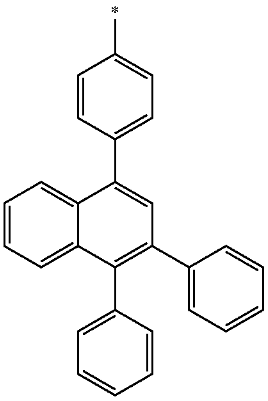 | 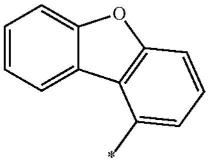 | 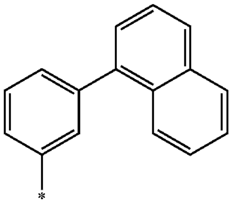 |

-continued
| [Compound Group 1] | | | | |
|---|---|---|---|---|
| | n | A—L—* | $Ar_1$ | $Ar_2$ |
| 4-A1-5 | 1 | 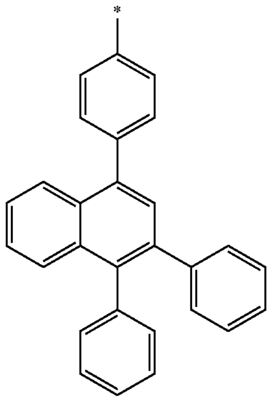 | 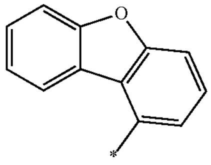 | 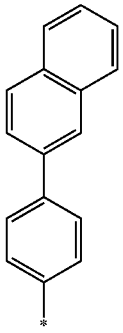 |
| 4-A1-6 | 1 | 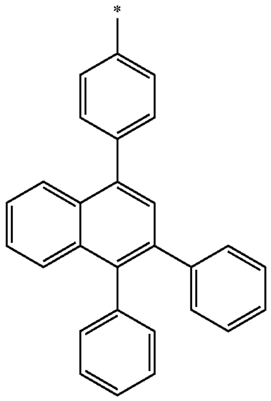 | 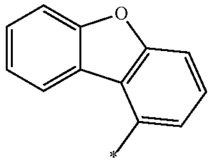 | 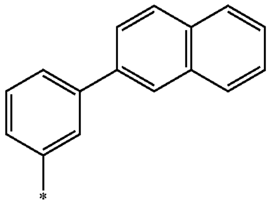 |
| 4-A1-7 | 1 | 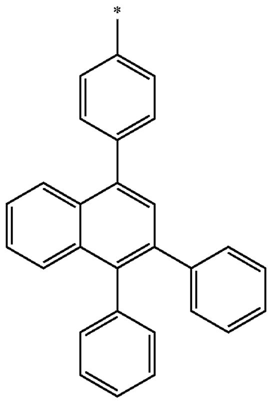 | 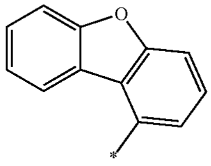 | 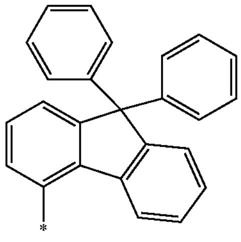 |

-continued
| [Compound Group 1] | | | | |
|---|---|---|---|---|
| | n | A—L—* | $Ar_1$ | $Ar_2$ |
| 4-A1-8 | 1 | 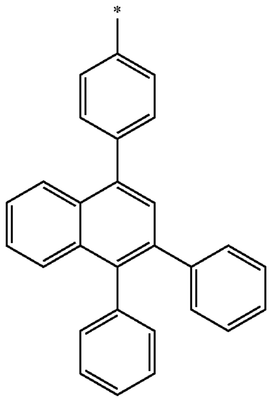 | 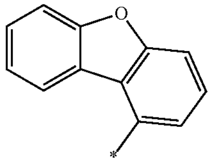 | 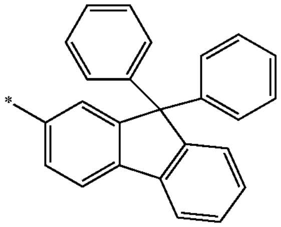 |
| 4-A1-9 | 1 | 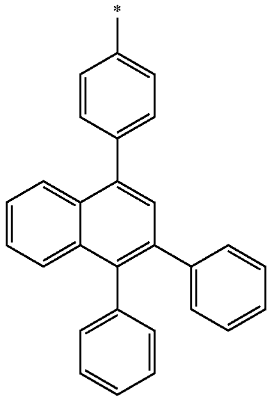 | 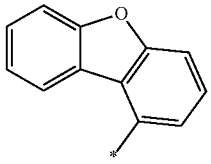 | 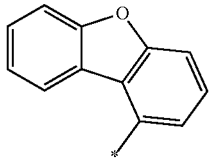 |
| 4-A1-10 | 1 | 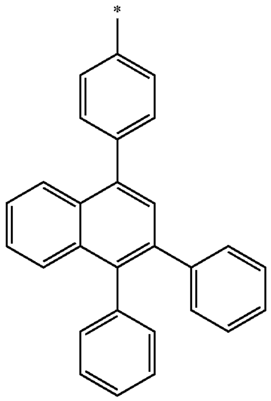 | 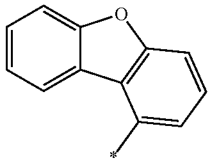 | 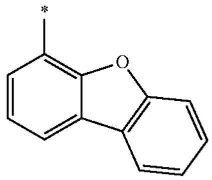 |

-continued
| [Compound Group 1] | | | | |
|---|---|---|---|---|
| | n | A—L—* | $Ar_1$ | $Ar_2$ |
| 4-A1-11 | 1 | 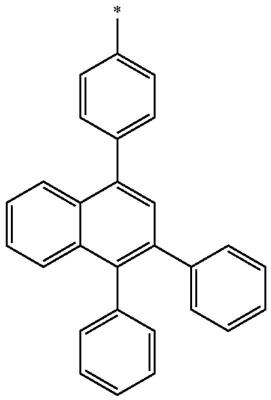 | 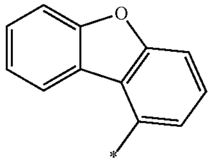 | 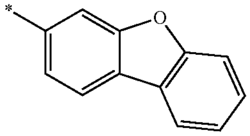 |
| 4-A1-12 | 1 | 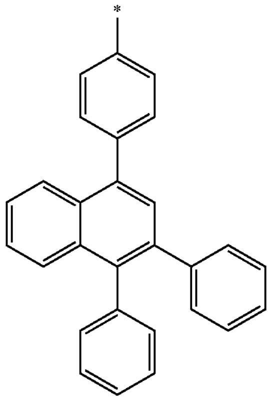 | 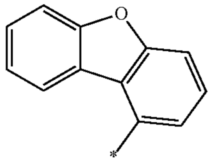 | 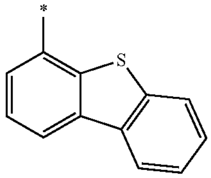 |
| 4-A1-13 | 1 | 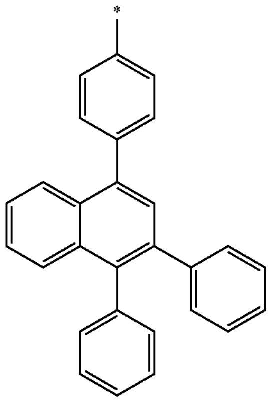 | 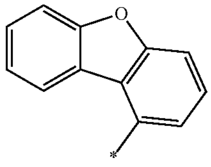 | 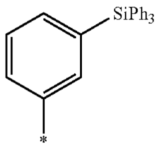 |

-continued
| [Compound Group 1] | | | | |
|---|---|---|---|---|
| | n | A—L—* | $Ar_1$ | $Ar_2$ |
| 4-A1-14 | 1 | 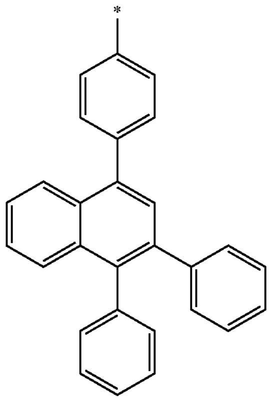 | 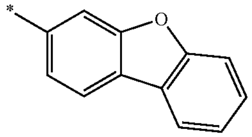 [SMILES: *c1ccc2c(c1)oc1ccccc12] | 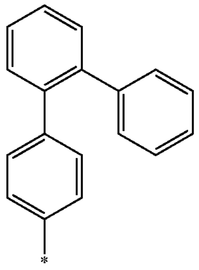 |
| 4-A1-15 | 1 | 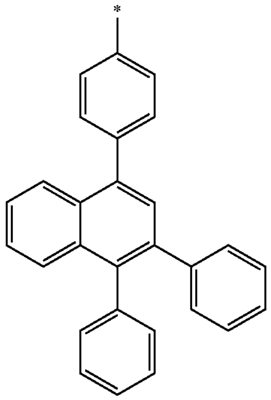 | 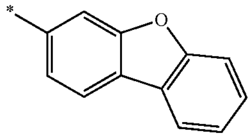 [SMILES: *c1ccc2c(c1)oc1ccccc12] | 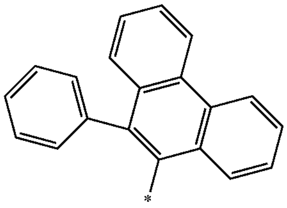 [SMILES: *c1c(-c2ccccc2)c2ccccc2c2ccccc12] |
| 4-A1-16 | 1 | 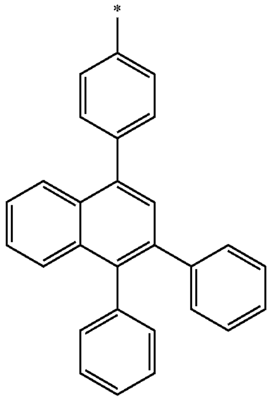 | 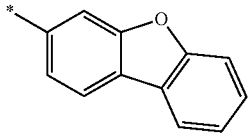 [SMILES: *c1ccc2c(c1)oc1ccccc12] | 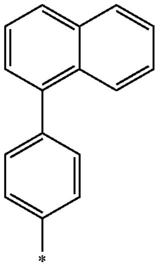 [SMILES: *c1ccc(-c2cccc3ccccc23)cc1] |

-continued
[Compound Group 1]
| | n | A—L—* | $Ar_1$ | $Ar_2$ |
|---|---|---|---|---|
| 4-A1-17 | 1 | 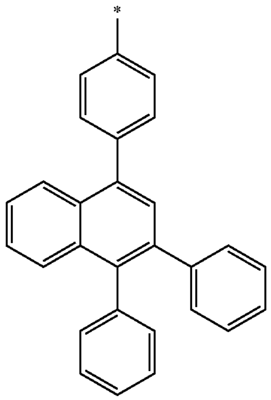 | 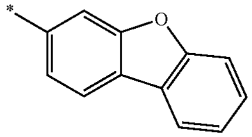 [SMILES: *c1ccc2c(c1)oc1ccccc12] | 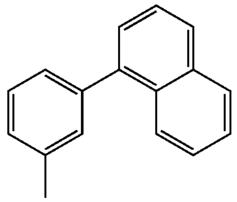 |
| 4-A1-18 | 1 | 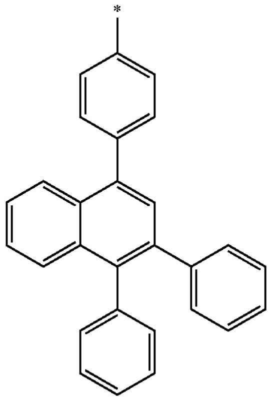 | 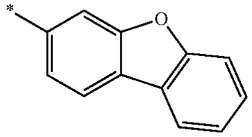 [SMILES: *c1ccc2c(c1)oc1ccccc12] | 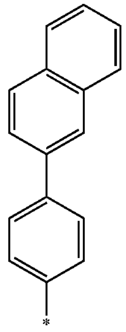 [SMILES: *c1ccc(-c2ccc3ccccc3c2)cc1] |
| 4-A1-19 | 1 | 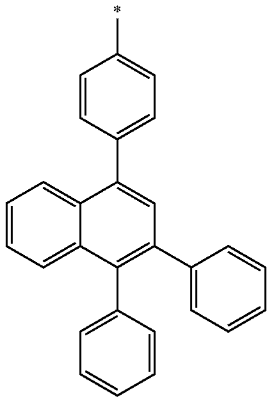 | 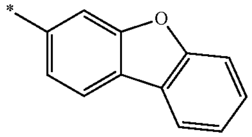 [SMILES: *c1ccc2c(c1)oc1ccccc12] | 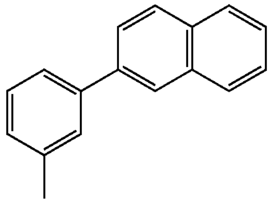 |

-continued
| [Compound Group 1] | | | | |
|---|---|---|---|---|
| | n | A—L—* | $Ar_1$ | $Ar_2$ |
| 4-A1-20 | 1 | 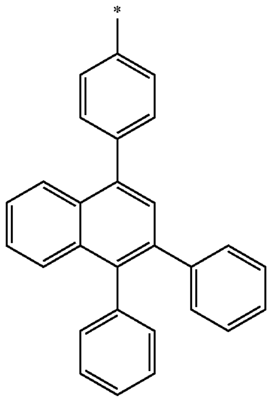 | 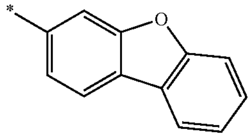 [SMILES: *c1ccc2c(c1)oc1ccccc12] | 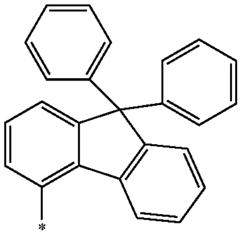 [SMILES: *c1cccc2c1-c1ccccc1C2(c1ccccc1)c1ccccc1] |
| 4-A1-21 | 1 | 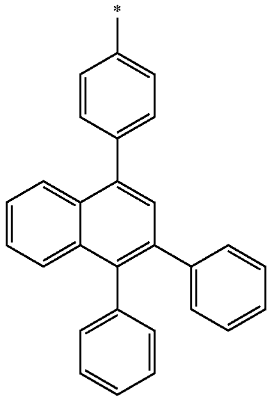 | 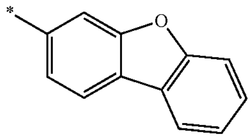 [SMILES: *c1ccc2c(c1)oc1ccccc12] | 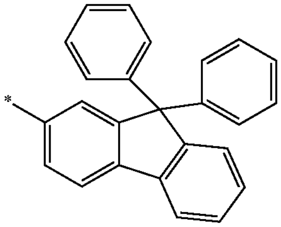 [SMILES: *c1ccc2c(c1)C(c1ccccc1)(c1ccccc1)c1ccccc1-2] |
| 4-A1-22 | 1 | 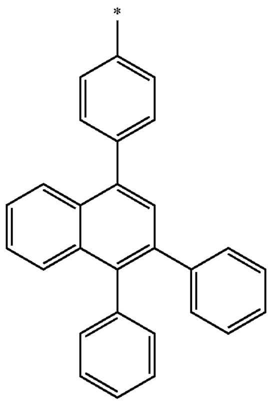 | 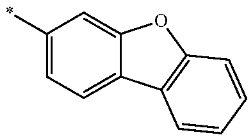 [SMILES: *c1ccc2c(c1)oc1ccccc12] | 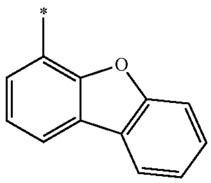 |

-continued
[Compound Group 1]
| | n | A—L—* | $Ar_1$ | $Ar_2$ |
|---|---|---|---|---|
| 4-A1-23 | 1 | 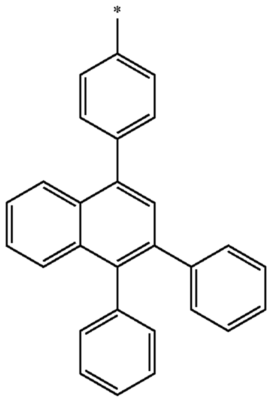 | 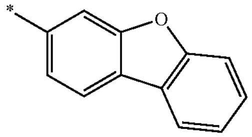 [SMILES: *c1ccc2c(c1)oc1ccccc12] | 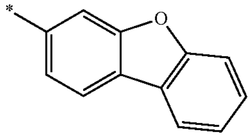 [SMILES: *c1ccc2c(c1)oc1ccccc12] |
| 4-A1-24 | 1 | 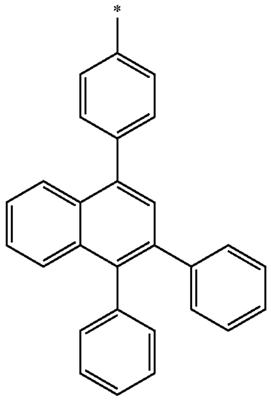 | 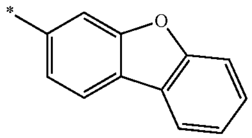 [SMILES: *c1ccc2c(c1)oc1ccccc12] | 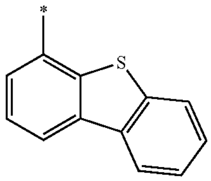 |
| 4-A1-25 | 1 | 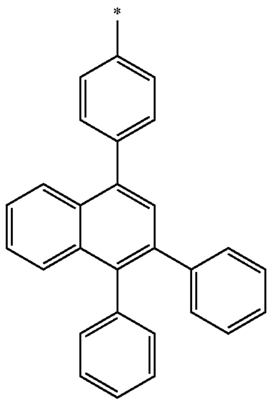 | 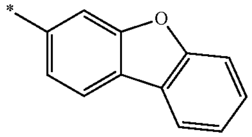 [SMILES: *c1ccc2c(c1)oc1ccccc12] | 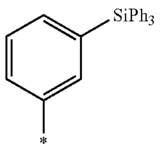 |

-continued
[Compound Group 1]
| | n | A—L—* | $Ar_1$ | $Ar_2$ |
|---|---|---|---|---|
| 4-A1-26 | 1 | 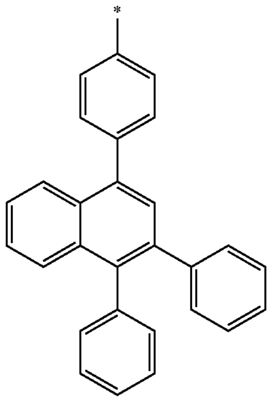 | 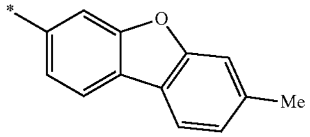 | 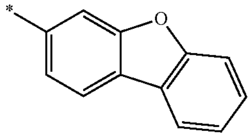 |
| 4-A1-27 | 1 | 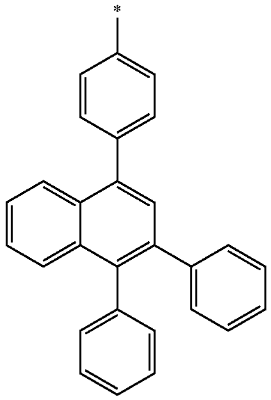 | 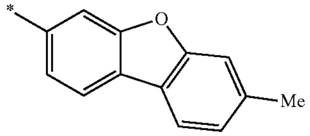 | 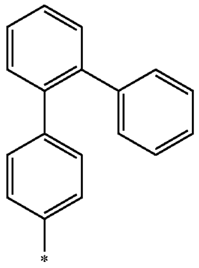 [SMILES: *c1ccc(-c2ccccc2-c2ccccc2)cc1] |
| 4-A1-28 | 1 | 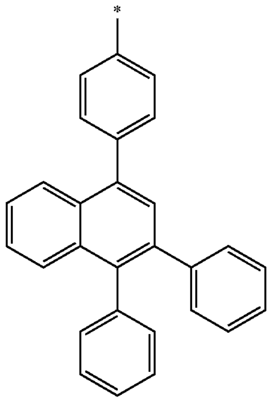 | 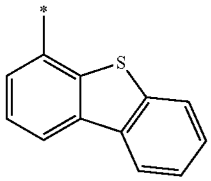 | 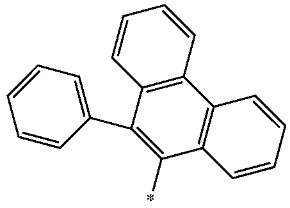 [SMILES: *c1c(-c2ccccc2)c2ccccc2c2ccccc12] |

-continued
[Compound Group 1]
| | n | A—L—* | $Ar_1$ | $Ar_2$ |
|---|---|---|---|---|
| 4-A1-29 | 1 | 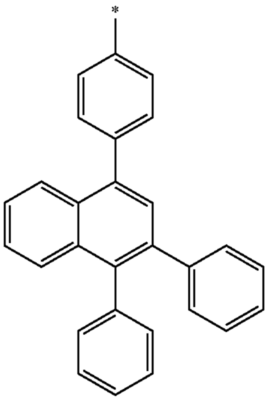 | 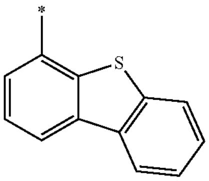 | 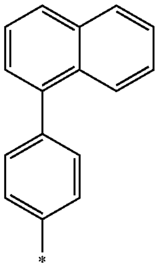 [SMILES: *c1ccc(-c2cccc3ccccc23)cc1] |
| 4-A1-30 | 1 | 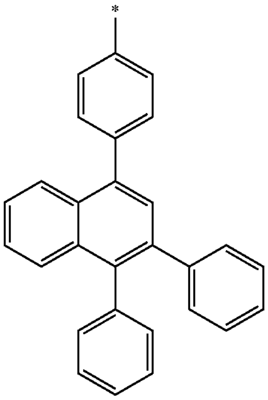 | 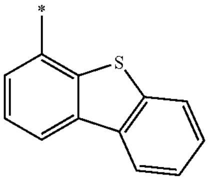 | 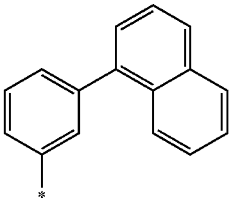 |
| 4-A1-31 | 1 | 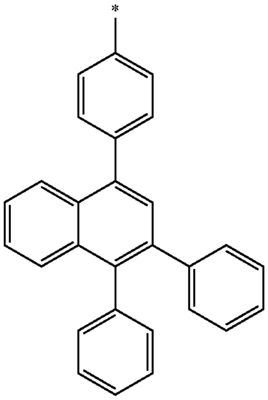 | 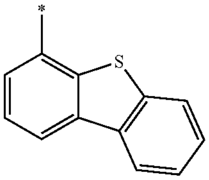 | 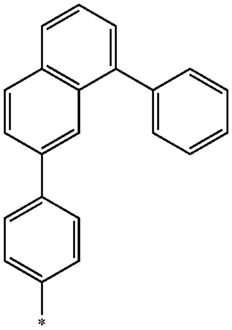 [SMILES: *c1ccc(-c2ccc3cccc(-c4ccccc4)c3c2)cc1] |

-continued
[Compound Group 1]
| | n | A—L—* | $Ar_1$ | $Ar_2$ |
| --- | --- | --- | --- | --- |
| 4-A1-32 | 1 | 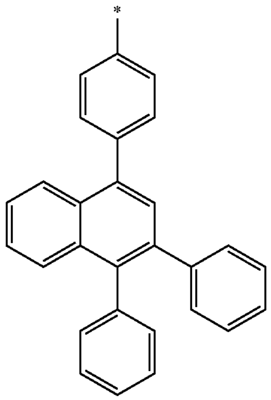 | 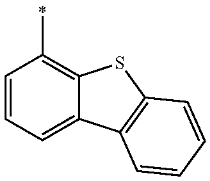 | 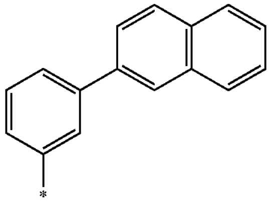 [SMILES: *c1cccc(-c2ccc3ccccc3c2)c1] |
| 4-A1-33 | 1 | 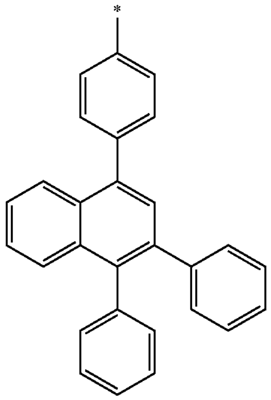 | 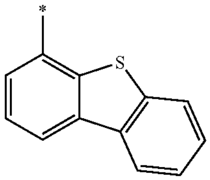 | 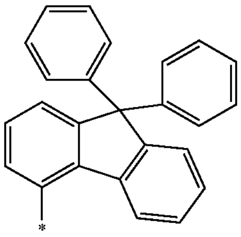 [SMILES: *c1cccc2c1-c1ccccc1C2(c1ccccc1)c1ccccc1] |
| 4-A1-34 | 1 | 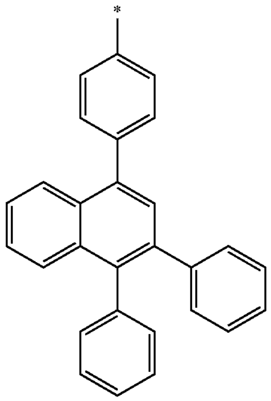 | 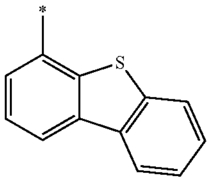 | 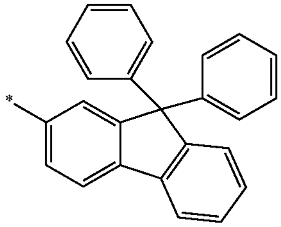 |

-continued
| [Compound Group 1] | | | | |
|---|---|---|---|---|
| | n | A—L—* | $Ar_1$ | $Ar_2$ |
| 4-A1-35 | 1 | 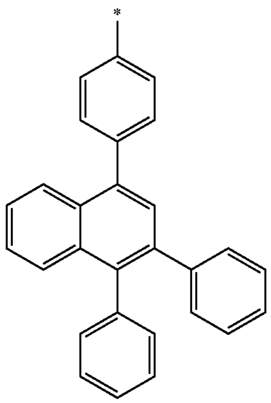 | 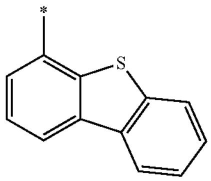 | 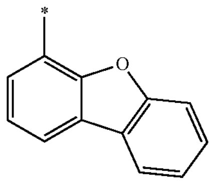 |
| 4-A1-36 | 1 | 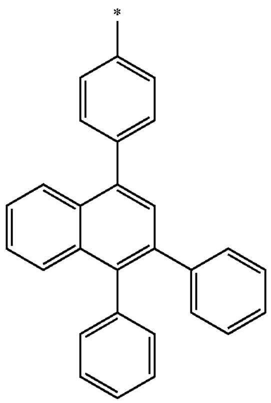 | 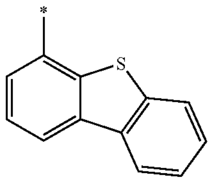 | 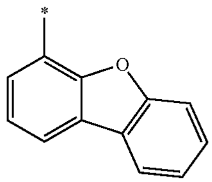 [SMILES: *c1cccc2c1oc1ccccc12] |
| 4-A1-37 | 1 | 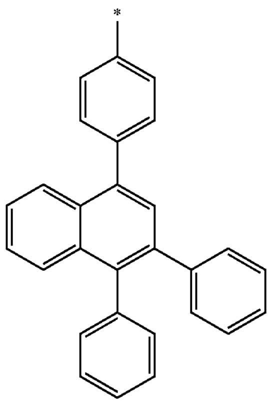 | 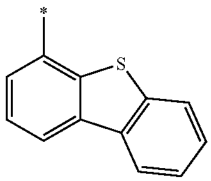 | 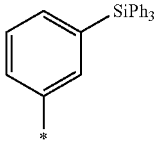 |
| 5-A1-1 | 1 | 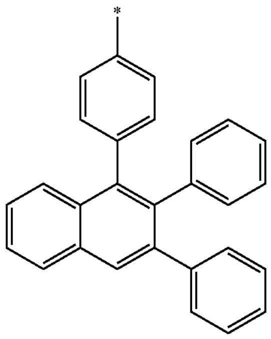 [SMILES: *c1ccc(-c2c(-c3ccccc3)c(-c3ccccc3)cc3ccccc23)cc1] | 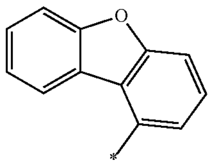 | 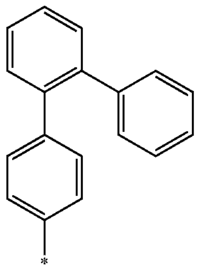 |

-continued
[Compound Group 1]
| | n | A—L—* | $Ar_1$ | $Ar_2$ |
|---|---|---|---|---|
| 5-A1-2 | 1 | 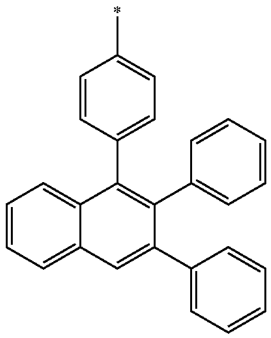 [SMILES: *c1ccc(-c2c(-c3ccccc3)c(-c3ccccc3)cc3ccccc23)cc1] | 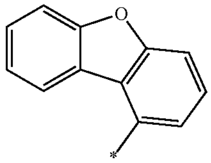 | 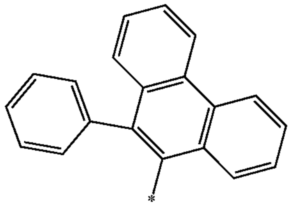 |
| 5-A1-3 | 1 | 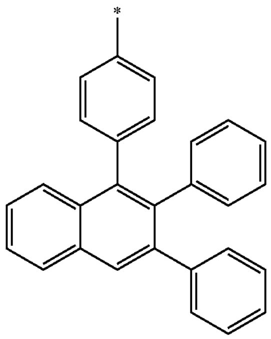 [SMILES: *c1ccc(-c2c(-c3ccccc3)c(-c3ccccc3)cc3ccccc23)cc1] | 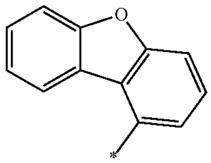 | 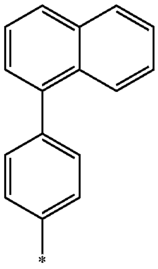 |
| 5-A1-4 | 1 | 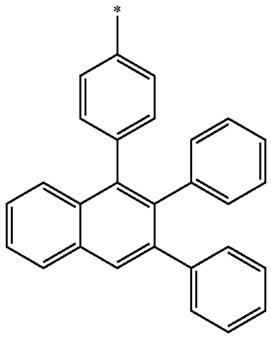 [SMILES: *c1ccc(-c2c(-c3ccccc3)c(-c3ccccc3)cc3ccccc23)cc1] | 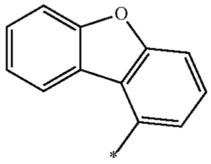 | 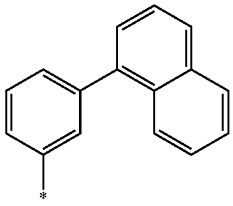 |
| 5-A1-5 | 1 | 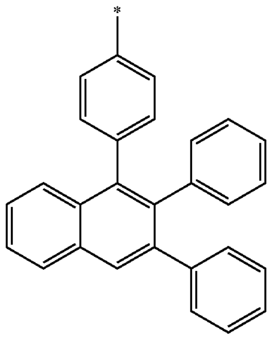 [SMILES: *c1ccc(-c2c(-c3ccccc3)c(-c3ccccc3)cc3ccccc23)cc1] | 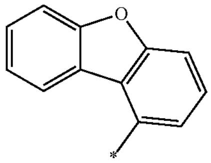 | 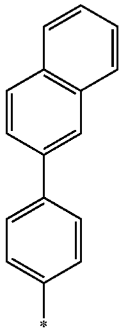 |

-continued
[Compound Group 1]
| | n | A—L—* | $Ar_1$ | $Ar_2$ |
|---|---|---|---|---|
| 5-A1-6 | 1 | 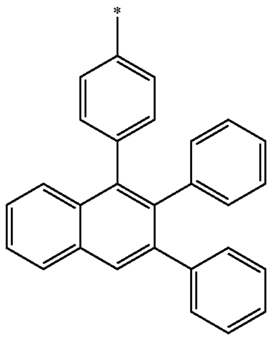 [SMILES: *c1ccc(-c2c(-c3ccccc3)c(-c3ccccc3)cc3ccccc23)cc1] | 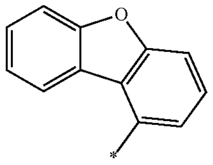 | 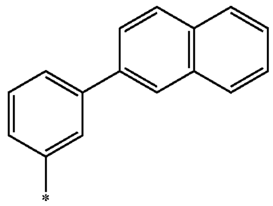 |
| 5-A1-7 | 1 | 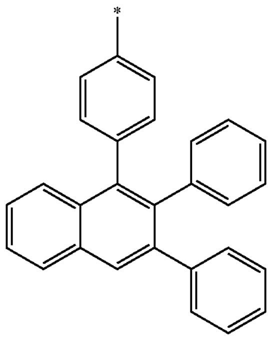 [SMILES: *c1ccc(-c2c(-c3ccccc3)c(-c3ccccc3)cc3ccccc23)cc1] | 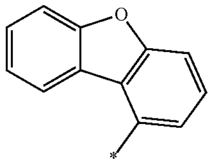 | 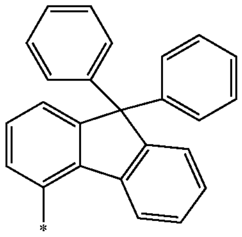 |
| 5-A1-8 | 1 | 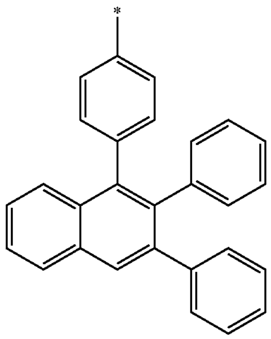 [SMILES: *c1ccc(-c2c(-c3ccccc3)c(-c3ccccc3)cc3ccccc23)cc1] | 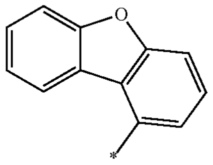 | 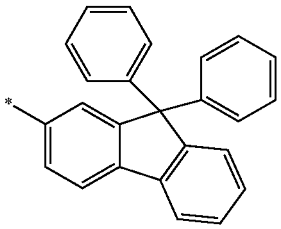 |
| 5-A1-9 | 1 | 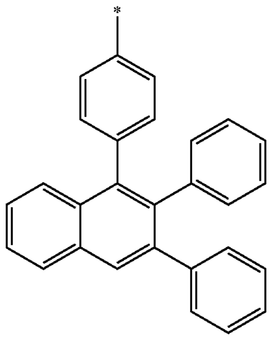 [SMILES: *c1ccc(-c2c(-c3ccccc3)c(-c3ccccc3)cc3ccccc23)cc1] | 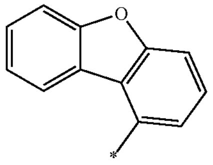 | 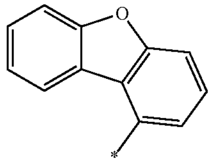 |

-continued
[Compound Group 1]
| | n | A—L—* | $Ar_1$ | $Ar_2$ |
|---|---|---|---|---|
| 5-A1-10 | 1 | 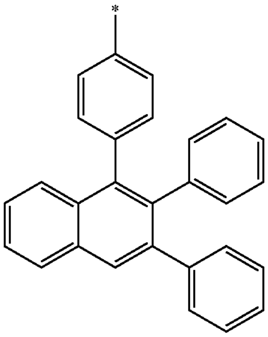 [SMILES: *c1ccc(-c2c(-c3ccccc3)c(-c3ccccc3)cc3ccccc23)cc1] | 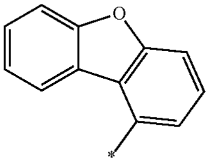 | 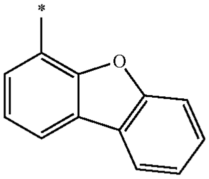 |
| 5-A1-11 | 1 | 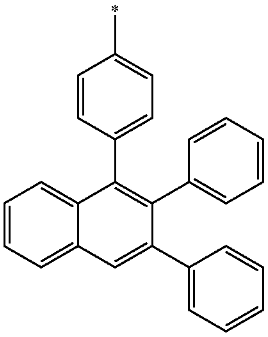 [SMILES: *c1ccc(-c2c(-c3ccccc3)c(-c3ccccc3)cc3ccccc23)cc1] | 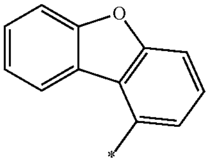 | 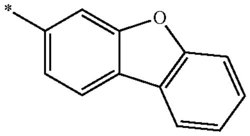 |
| 5-A1-12 | 1 | 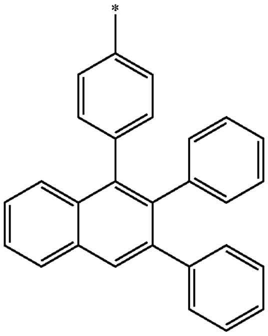 [SMILES: *c1ccc(-c2c(-c3ccccc3)c(-c3ccccc3)cc3ccccc23)cc1] | 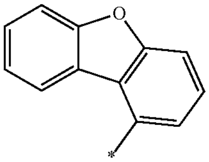 | 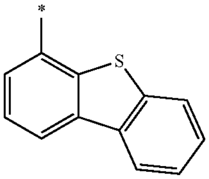 |
| 5-A1-13 | 1 | 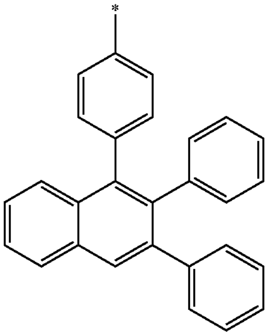 [SMILES: *c1ccc(-c2c(-c3ccccc3)c(-c3ccccc3)cc3ccccc23)cc1] | 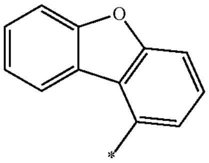 | 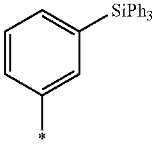 |

-continued
[Compound Group 1]
| | n | A—L—* | $Ar_1$ | $Ar_2$ |
|---|---|---|---|---|
| 5-A1-14 | 1 | 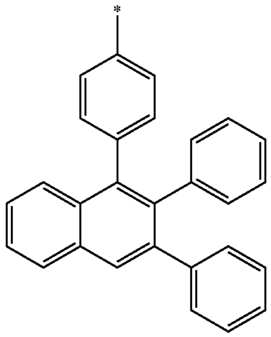 [SMILES: *c1ccc(-c2c(-c3ccccc3)c(-c3ccccc3)cc3ccccc23)cc1] | 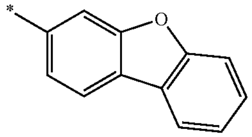 [SMILES: *c1ccc2c(c1)oc1ccccc12] | 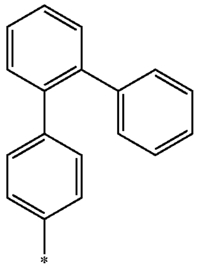 |
| 5-A1-15 | 1 | 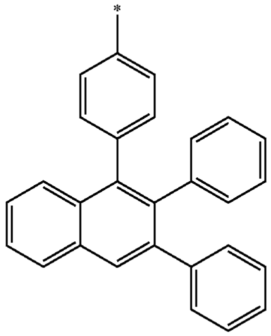 [SMILES: *c1ccc(-c2c(-c3ccccc3)c(-c3ccccc3)cc3ccccc23)cc1] | 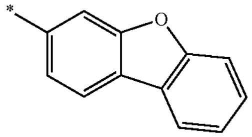 [SMILES: *c1ccc2c(c1)oc1ccccc12] | 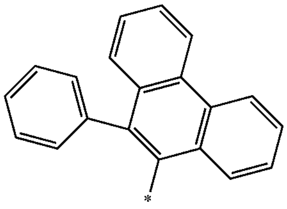 [SMILES: *c1c(-c2ccccc2)c2ccccc2c2ccccc12] |
| 5-A1-16 | 1 | 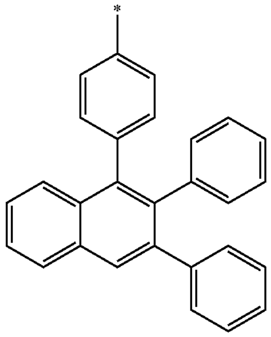 [SMILES: *c1ccc(-c2c(-c3ccccc3)c(-c3ccccc3)cc3ccccc23)cc1] | 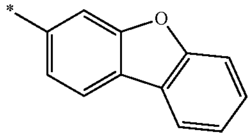 [SMILES: *c1ccc2c(c1)oc1ccccc12] | 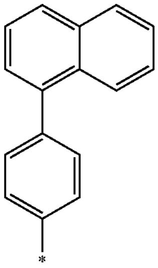 [SMILES: *c1ccc(-c2cccc3ccccc23)cc1] |
| 5-A1-17 | 1 | 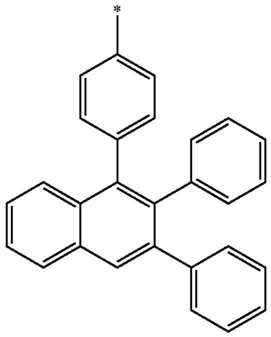 [SMILES: *c1ccc(-c2c(-c3ccccc3)c(-c3ccccc3)cc3ccccc23)cc1] | 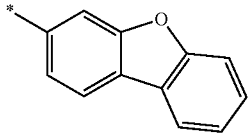 [SMILES: *c1ccc2c(c1)oc1ccccc12] | 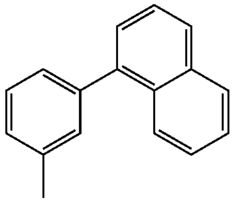 |

-continued
[Compound Group 1]
| | n | A—L—* | $Ar_1$ | $Ar_2$ |
|---|---|---|---|---|
| 5-A1-18 | 1 | 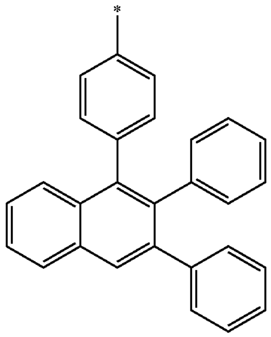 [SMILES: *c1ccc(-c2c(-c3ccccc3)c(-c3ccccc3)cc3ccccc23)cc1] | 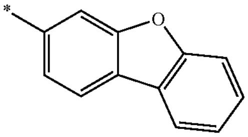 [SMILES: *c1ccc2c(c1)oc1ccccc12] | 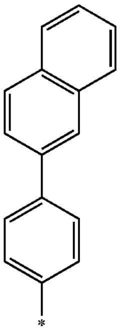 [SMILES: *c1ccc(-c2ccc3ccccc3c2)cc1] |
| 5-A1-19 | 1 | 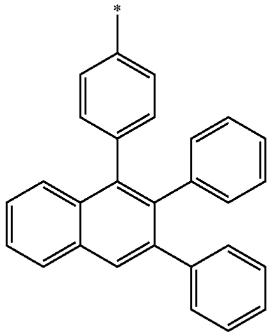 [SMILES: *c1ccc(-c2c(-c3ccccc3)c(-c3ccccc3)cc3ccccc23)cc1] | 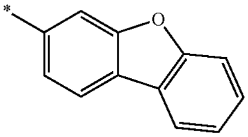 [SMILES: *c1ccc2c(c1)oc1ccccc12] | 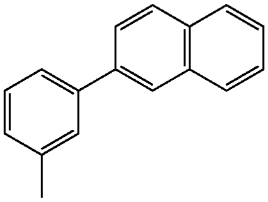 |
| 5-A1-20 | 1 | 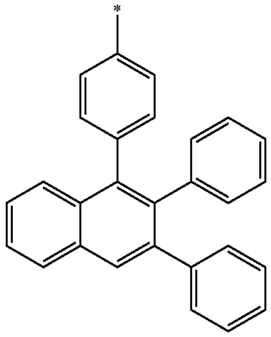 [SMILES: *c1ccc(-c2c(-c3ccccc3)c(-c3ccccc3)cc3ccccc23)cc1] | 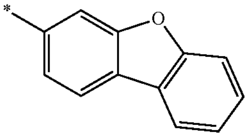 [SMILES: *c1ccc2c(c1)oc1ccccc12] | 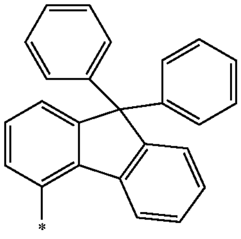 [SMILES: *c1cccc2c1-c1ccccc1C2(c1ccccc1)c1ccccc1] |
| 5-A1-21 | 1 | 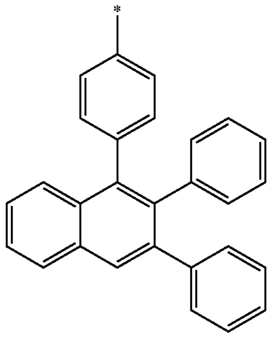 [SMILES: *c1ccc(-c2c(-c3ccccc3)c(-c3ccccc3)cc3ccccc23)cc1] | 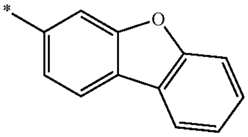 [SMILES: *c1ccc2c(c1)oc1ccccc12] | 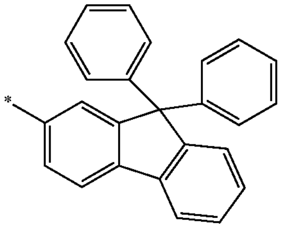 [SMILES: *c1ccc2c(c1)C(c1ccccc1)(c1ccccc1)c1ccccc1-2] |

-continued
[Compound Group 1]
| | n | A—L—* | $Ar_1$ | $Ar_2$ |
|---|---|---|---|---|
| 5-A1-22 | 1 | 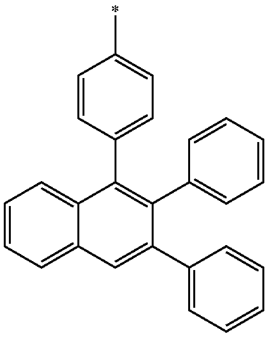 [SMILES: *c1ccc(-c2c(-c3ccccc3)c(-c3ccccc3)cc3ccccc23)cc1] | 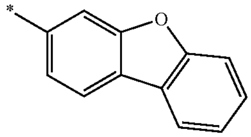 [SMILES: *c1ccc2c(c1)oc1ccccc12] | 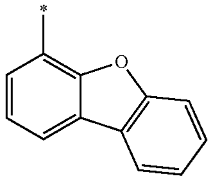 |
| 5-A1-23 | 1 | 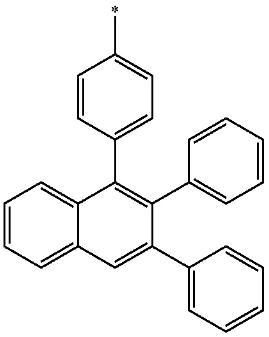 [SMILES: *c1ccc(-c2c(-c3ccccc3)c(-c3ccccc3)cc3ccccc23)cc1] | 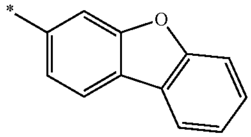 [SMILES: *c1ccc2c(c1)oc1ccccc12] | 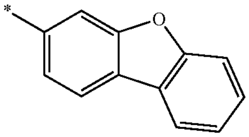 [SMILES: *c1ccc2c(c1)oc1ccccc12] |
| 5-A1-24 | 1 | 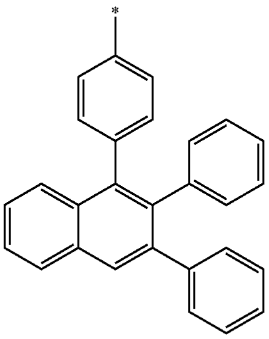 [SMILES: *c1ccc(-c2c(-c3ccccc3)c(-c3ccccc3)cc3ccccc23)cc1] | 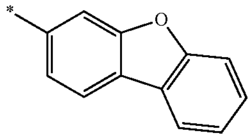 [SMILES: *c1ccc2c(c1)oc1ccccc12] | 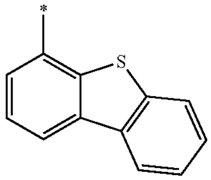 |
| 5-A1-25 | 1 | 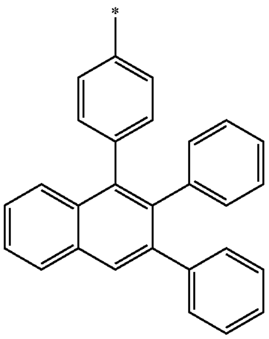 [SMILES: *c1ccc(-c2c(-c3ccccc3)c(-c3ccccc3)cc3ccccc23)cc1] | 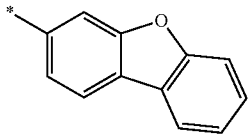 [SMILES: *c1ccc2c(c1)oc1ccccc12] | 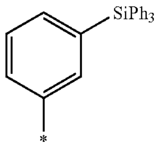 |

-continued
[Compound Group 1]
| | n | A—L—* | $Ar_1$ | $Ar_2$ |
|---|---|---|---|---|
| 5-A1-26 | 1 | 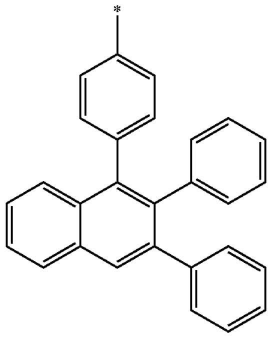 [SMILES: *c1ccc(-c2c(-c3ccccc3)c(-c3ccccc3)cc3ccccc23)cc1] | 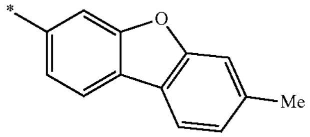 | 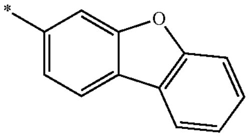 |
| 5-A1-27 | 1 | 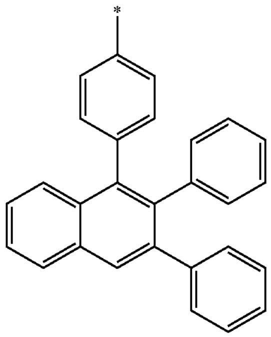 [SMILES: *c1ccc(-c2c(-c3ccccc3)c(-c3ccccc3)cc3ccccc23)cc1] | 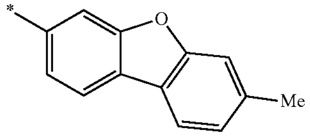 | 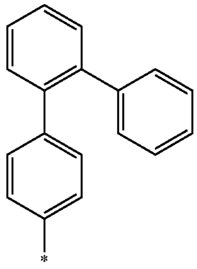 [SMILES: *c1ccc(-c2ccccc2-c2ccccc2)cc1] |
| 5-A1-28 | 1 | 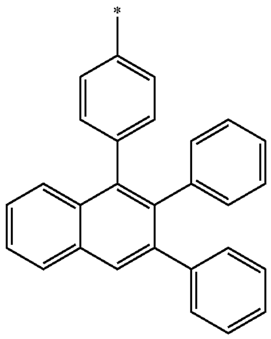 [SMILES: *c1ccc(-c2c(-c3ccccc3)c(-c3ccccc3)cc3ccccc23)cc1] | 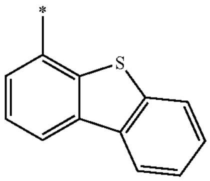 | 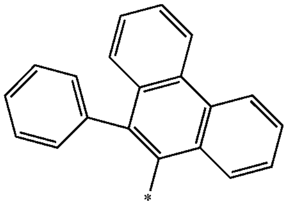 [SMILES: *c1c(-c2ccccc2)c2ccccc2c2ccccc12] |
| 5-A1-29 | 1 | 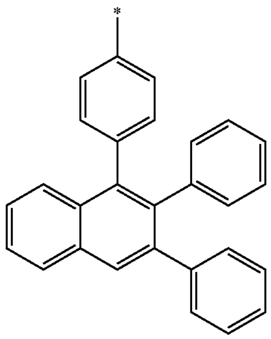 [SMILES: *c1ccc(-c2c(-c3ccccc3)c(-c3ccccc3)cc3ccccc23)cc1] | 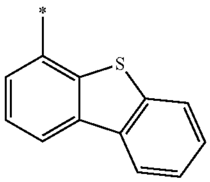 | 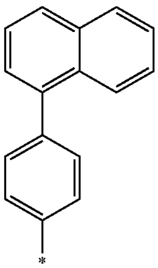 [SMILES: *c1ccc(-c2cccc3ccccc23)cc1] |

-continued
| [Compound Group 1] | | | | |
|---|---|---|---|---|
| | n | A—L—* | $Ar_1$ | $Ar_2$ |
| 5-A1-30 | 1 | 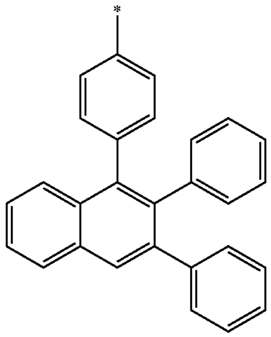 [SMILES: *c1ccc(-c2c(-c3ccccc3)c(-c3ccccc3)cc3ccccc23)cc1] | 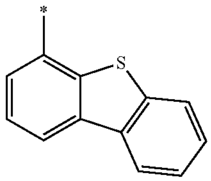 | 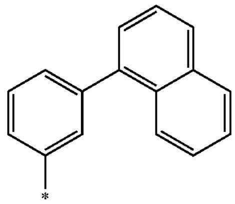 [SMILES: *c1cccc(-c2cccc3ccccc23)c1] |
| 5-A1-31 | 1 | 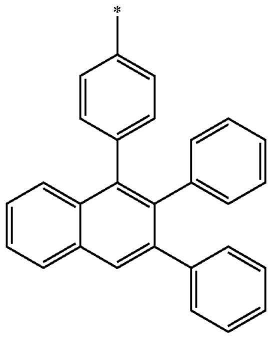 [SMILES: *c1ccc(-c2c(-c3ccccc3)c(-c3ccccc3)cc3ccccc23)cc1] | 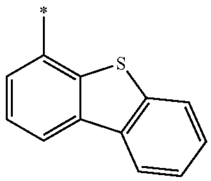 | 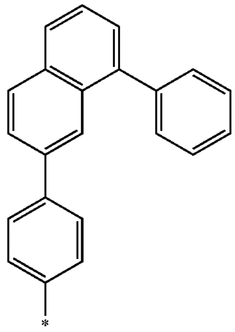 [SMILES: *c1ccc(-c2ccc3cccc(-c4ccccc4)c3c2)cc1] |
| 5-A1-32 | 1 | 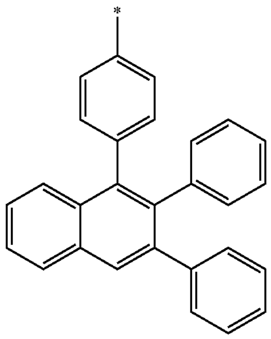 [SMILES: *c1ccc(-c2c(-c3ccccc3)c(-c3ccccc3)cc3ccccc23)cc1] | 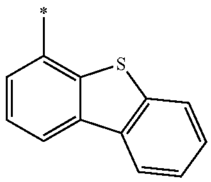 | 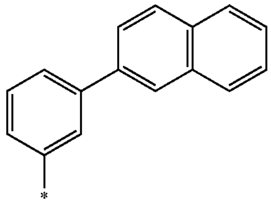 [SMILES: *c1cccc(-c2ccc3ccccc3c2)c1] |
| 5-A1-33 | 1 | 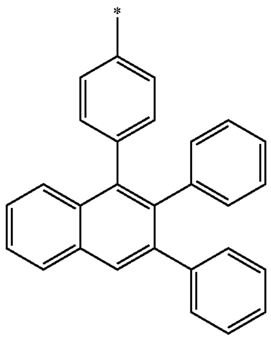 [SMILES: *c1ccc(-c2c(-c3ccccc3)c(-c3ccccc3)cc3ccccc23)cc1] | 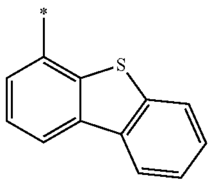 | 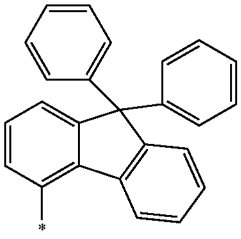 [SMILES: *c1cccc2c1-c1ccccc1C2(c1ccccc1)c1ccccc1] |

-continued
| [Compound Group 1] | | | | |
|---|---|---|---|---|
| | n | A—L—* | $Ar_1$ | $Ar_2$ |
| 5-A1-34 | 1 | 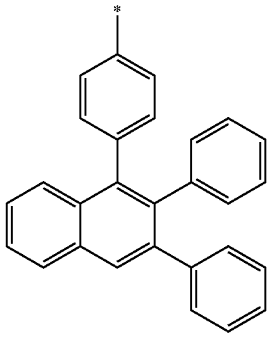 [SMILES: *c1ccc(-c2c(-c3ccccc3)c(-c3ccccc3)cc3ccccc23)cc1] | 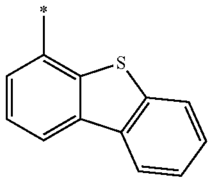 | 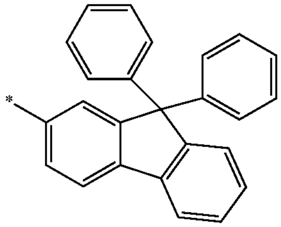 |
| 5-A1-35 | 1 | 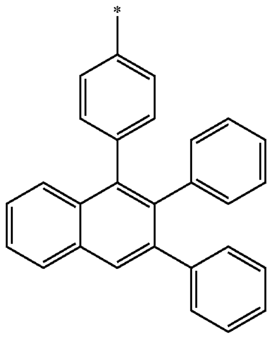 [SMILES: *c1ccc(-c2c(-c3ccccc3)c(-c3ccccc3)cc3ccccc23)cc1] | 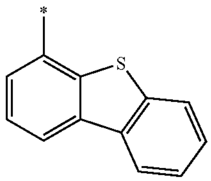 | 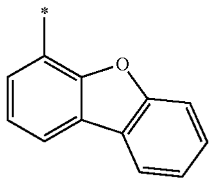 |
| 5-A1-36 | 1 | 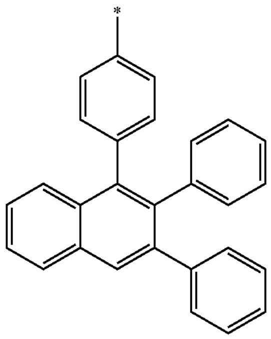 [SMILES: *c1ccc(-c2c(-c3ccccc3)c(-c3ccccc3)cc3ccccc23)cc1] | 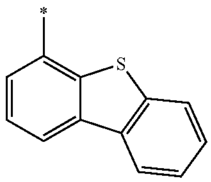 | 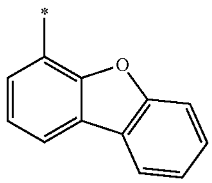 |
| 5-A1-37 | 1 | 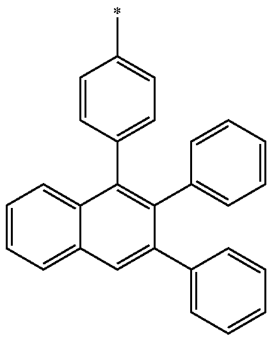 [SMILES: *c1ccc(-c2c(-c3ccccc3)c(-c3ccccc3)cc3ccccc23)cc1] | 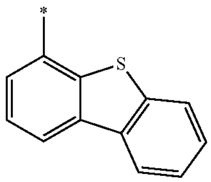 | 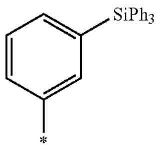 |

-continued
| [Compound Group 1] | | | | |
|---|---|---|---|---|
| | n | A—L—* | $Ar_1$ | $Ar_2$ |
| 1-B1-1 | 1 | 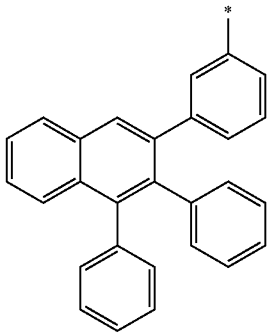 | 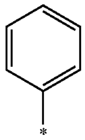 [SMILES: *c1ccccc1] | 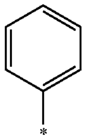 [SMILES: *c1ccccc1] |
| 1-B1-2 | 1 | 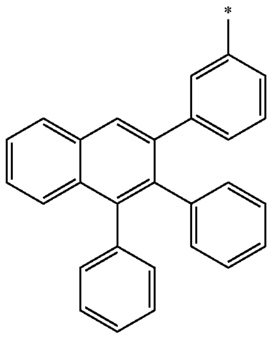 | 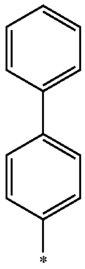 [SMILES: *c1ccc(-c2ccccc2)cc1] | 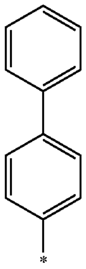 [SMILES: *c1ccc(-c2ccccc2)cc1] |
| 1-B1-3 | 1 | 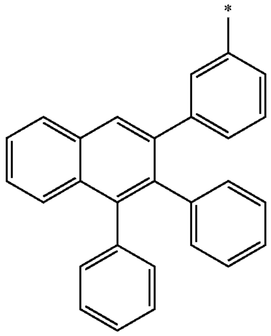 | 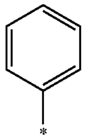 | 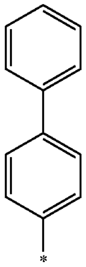 [SMILES: *c1ccc(-c2ccccc2)cc1] |
| 1-B1-4 | 1 | 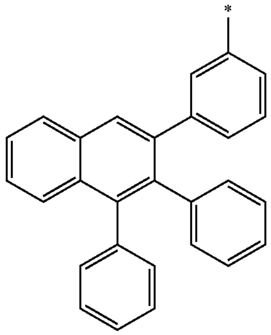 | 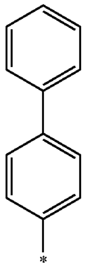 | 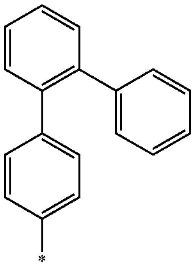 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 1-B1-5 | 1 | 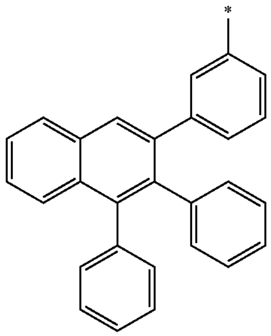 | 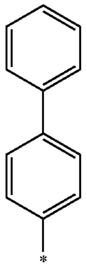 [SMILES: *c1ccc(-c2ccccc2)cc1] | 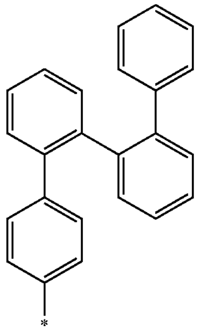 [SMILES: *c1ccc(-c2ccccc2-c2ccccc2-c2ccccc2)cc1] |
| 1-B1-6 | 1 | 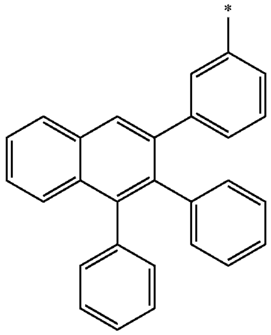 | 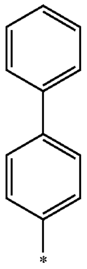 [SMILES: *c1ccc(-c2ccccc2)cc1] | 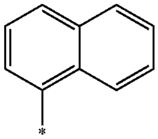 |
| 1-B1-7 | 1 | 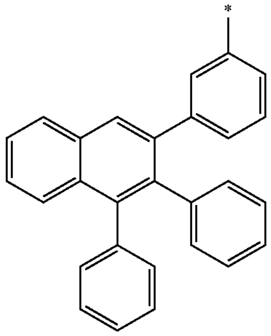 | 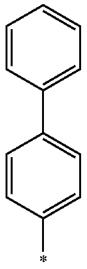 [SMILES: *c1ccc(-c2ccccc2)cc1] | 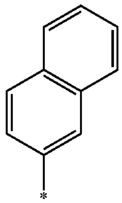 |
| 1-B1-8 | 1 | 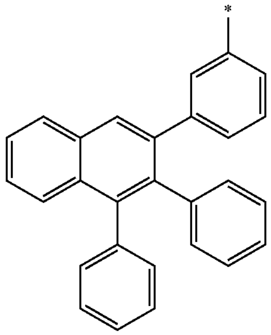 | 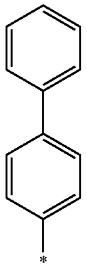 | 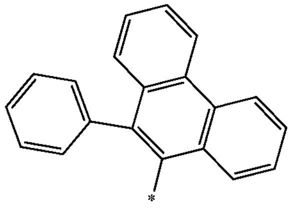 [SMILES: *c1c(-c2ccccc2)c2ccccc2c2ccccc12] |

-continued
[Compound Group 1]
| | n | A—L—* | $Ar_1$ | $Ar_2$ |
|---|---|---|---|---|
| 1-B1-9 | 1 | 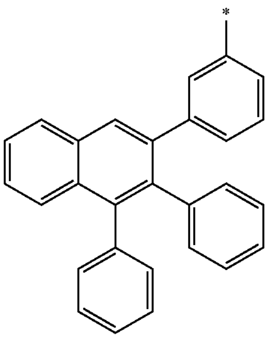 | 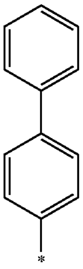 [SMILES: *c1ccc(-c2ccccc2)cc1] | 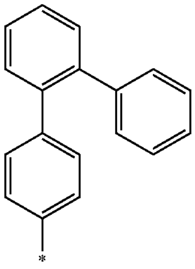 [SMILES: *c1ccc(-c2ccccc2-c2ccccc2)cc1] |
| 1-B1-10 | 1 | 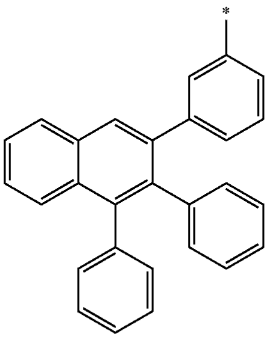 | 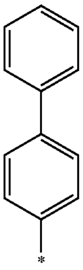 [SMILES: *c1ccc(-c2ccccc2)cc1] | 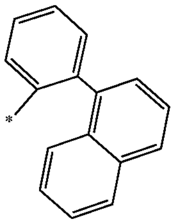 [SMILES: *c1ccccc1-c1cccc2ccccc12] |
| 1-B1-11 | 1 | 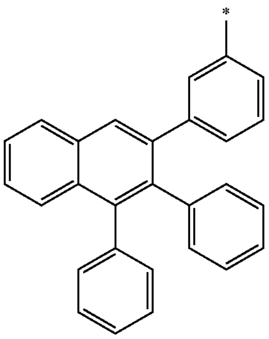 | 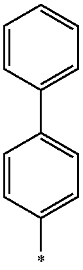 [SMILES: *c1ccc(-c2ccccc2)cc1] | 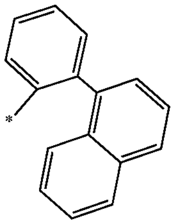 [SMILES: *c1ccccc1-c1cccc2ccccc12] |
| 1-B1-12 | 1 | 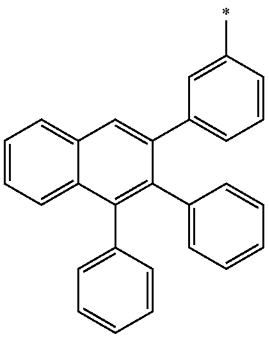 | 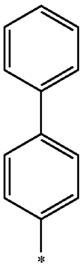 | 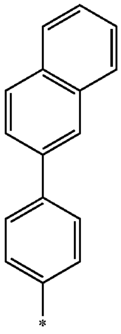 |

-continued
| [Compound Group 1] | | | | |
|---|---|---|---|---|
| | n | A—L—* | $Ar_1$ | $Ar_2$ |
| 1-B1-13 | 1 | 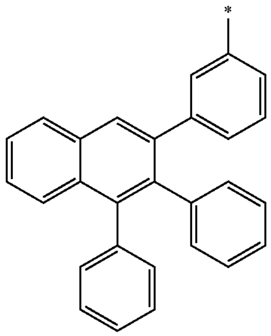 | 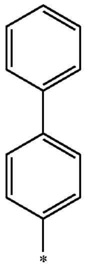 [SMILES: *c1ccc(-c2ccccc2)cc1] | 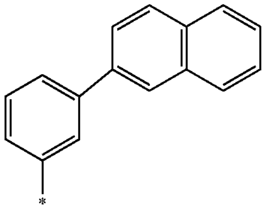 [SMILES: *c1cccc(-c2ccc3ccccc3c2)c1] |
| 1-B1-14 | 1 | 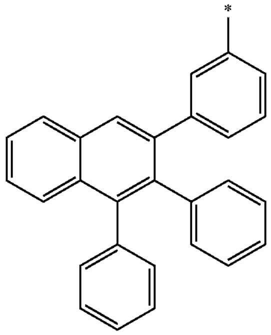 | 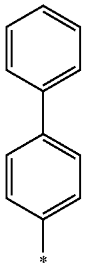 [SMILES: *c1ccc(-c2ccccc2)cc1] | 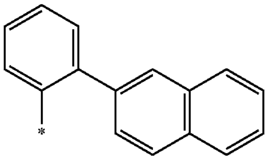 [SMILES: *c1ccccc1-c1ccc2ccccc2c1] |
| 1-B1-15 | 1 | 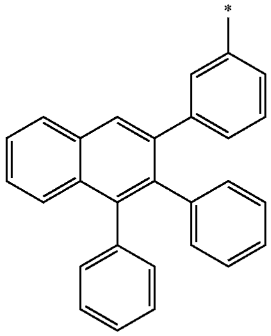 | 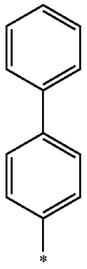 [SMILES: *c1ccc(-c2ccccc2)cc1] | 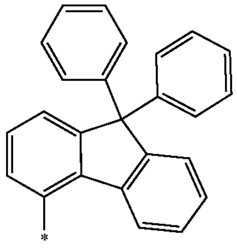 [SMILES: *c1cccc2c1-c1ccccc1C2(c1ccccc1)c1ccccc1] |
| 1-B1-16 | 1 | 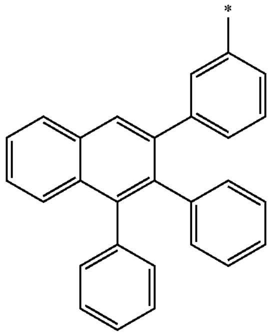 | 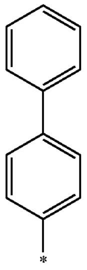 | 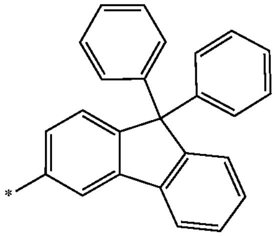 [SMILES: *c1ccc2c(c1)-c1ccccc1C2(c1ccccc1)c1ccccc1] |

-continued
| [Compound Group 1] | | | | |
|---|---|---|---|---|
| | n | A—L—* | $Ar_1$ | $Ar_2$ |
| 1-B1-17 | 1 | 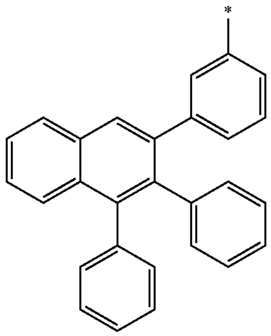 | 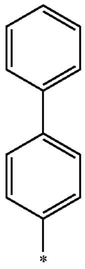 [SMILES: *c1ccc(-c2ccccc2)cc1] | 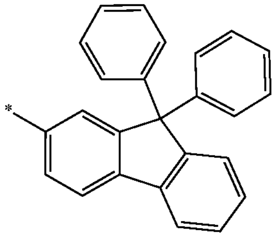 [SMILES: *c1ccc2c(c1)C(c1ccccc1)(c1ccccc1)c1ccccc1-2] |
| 1-B1-18 | 1 | 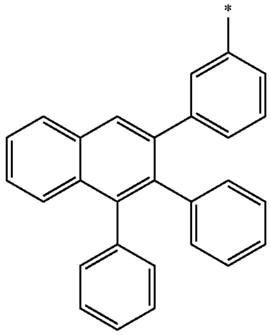 | 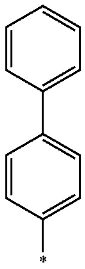 [SMILES: *c1ccc(-c2ccccc2)cc1] | 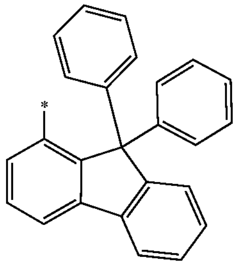 [SMILES: *c1cccc2c1C(c1ccccc1)(c1ccccc1)c1ccccc1-2] |
| 1-B1-19 | 1 | 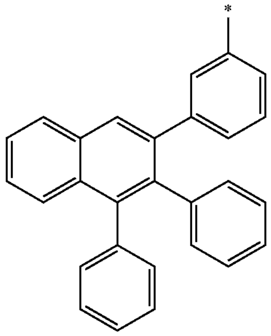 | 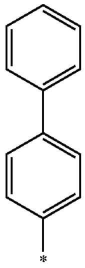 [SMILES: *c1ccc(-c2ccccc2)cc1] | 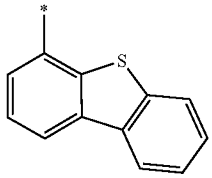 |
| 1-B1-20 | 1 | 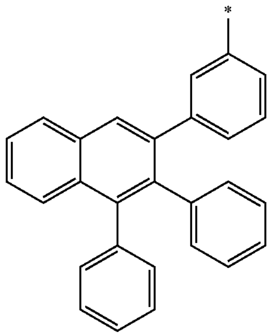 | 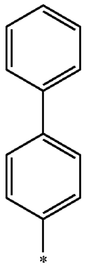 | 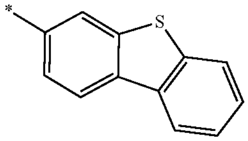 |

-continued
[Compound Group 1]
| | n | A—L—* | $Ar_1$ | $Ar_2$ |
|---|---|---|---|---|
| 1-B1-21 | 1 | 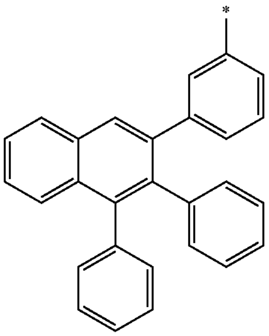 | 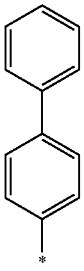 [SMILES: *c1ccc(-c2ccccc2)cc1] | 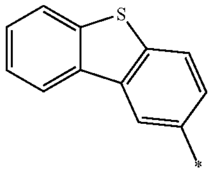 |
| 1-B1-22 | 1 | 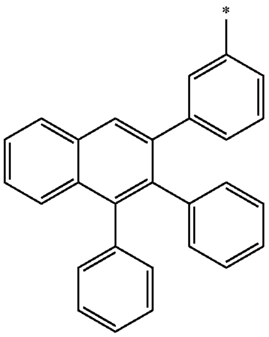 | 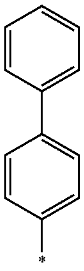 [SMILES: *c1ccc(-c2ccccc2)cc1] | 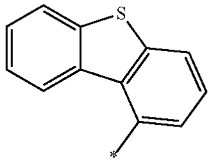 |
| 1-B1-23 | 1 | 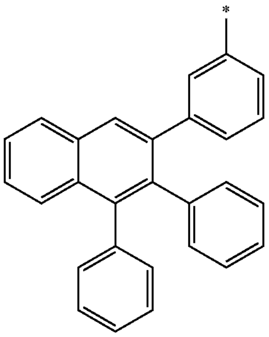 | 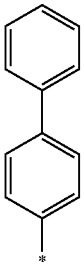 [SMILES: *c1ccc(-c2ccccc2)cc1] | 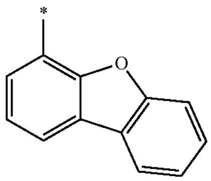 |
| 1-B1-24 | 1 | 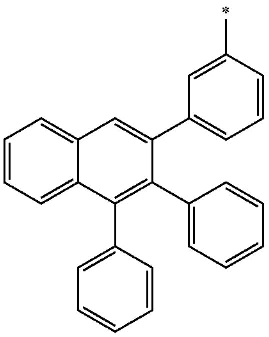 | 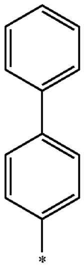 | 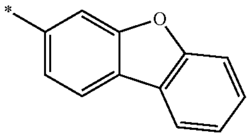 |

-continued
[Compound Group 1]
| | n | A—L—* | $Ar_1$ | $Ar_2$ |
|---|---|---|---|---|
| 1-B1-25 | 1 | 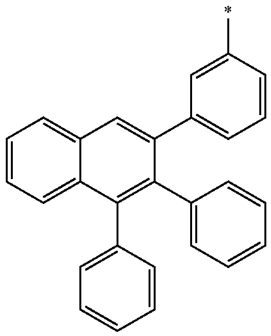 | 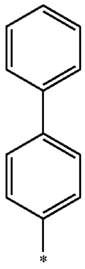 [SMILES: *c1ccc(-c2ccccc2)cc1] | 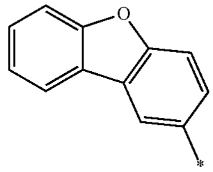 |
| 1-B1-26 | 1 | 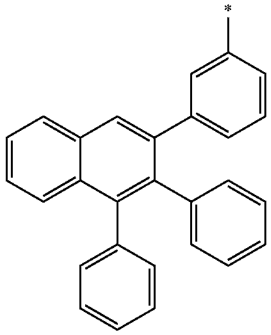 | 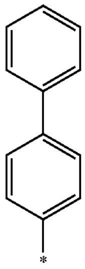 [SMILES: *c1ccc(-c2ccccc2)cc1] | 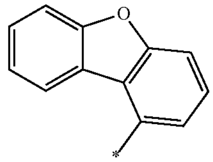 |
| 1-B1-27 | 1 | 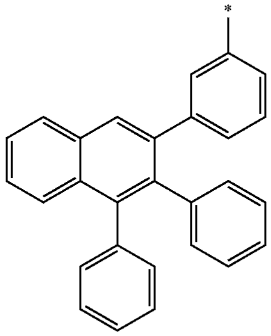 | 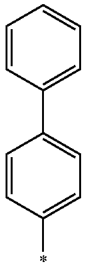 [SMILES: *c1ccc(-c2ccccc2)cc1] | 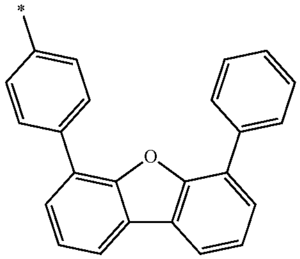 |
| 1-B1-28 | 1 | 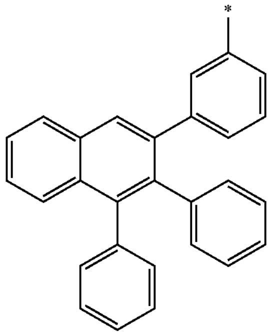 | 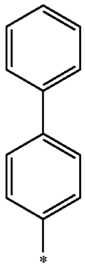 | 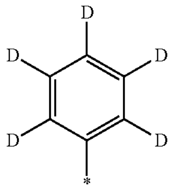 |

-continued
[Compound Group 1]
| | n | A—L—* | $Ar_1$ | $Ar_2$ |
|---|---|---|---|---|
| 1-B1-29 | 1 | 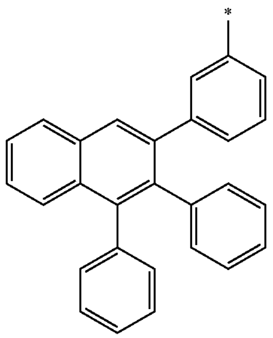 | 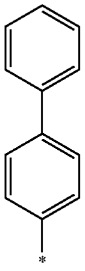 [SMILES: *c1ccc(-c2ccccc2)cc1] | 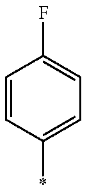 |
| 1-B1-30 | 1 | 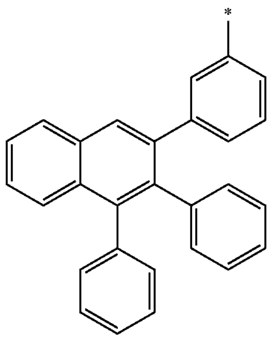 | 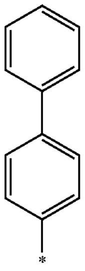 [SMILES: *c1ccc(-c2ccccc2)cc1] | 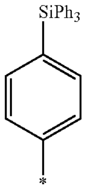 |
| 1-B1-31 | 1 | 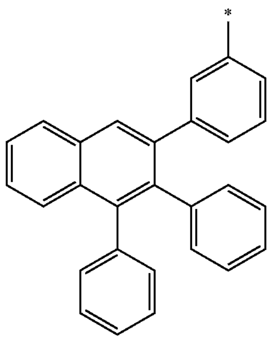 | 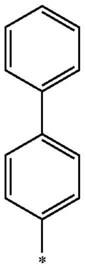 [SMILES: *c1ccc(-c2ccccc2)cc1] | 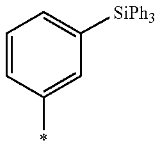 |
| 1-B1-32 | 1 | 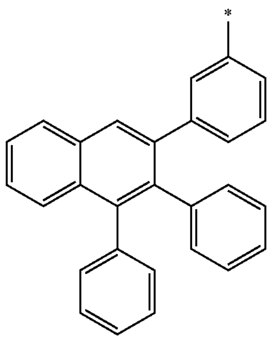 | 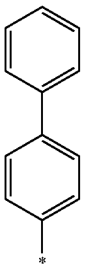 | 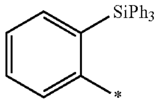 |

-continued
| [Compound Group 1] | | | | |
|---|---|---|---|---|
| | n | A—L—* | $Ar_1$ | $Ar_2$ |
| 1-B1-33 | 1 | 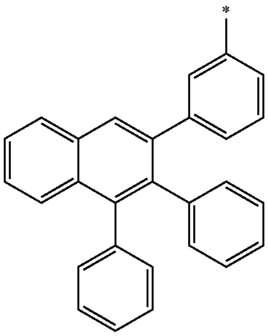 | 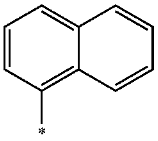 | 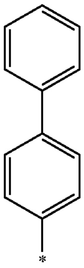 [SMILES: *c1ccc(-c2ccccc2)cc1] |
| 1-B1-34 | 1 | 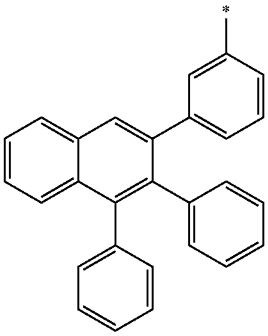 | 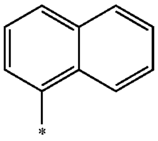 | 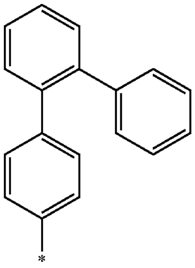 [SMILES: *c1ccc(-c2ccccc2-c2ccccc2)cc1] |
| 1-B1-35 | 1 | 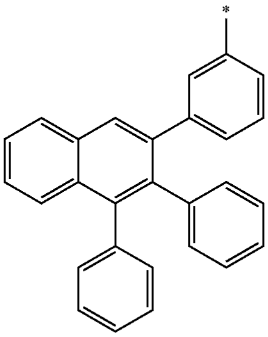 | 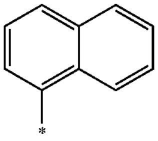 [SMILES: *c1cccc2ccccc12] | 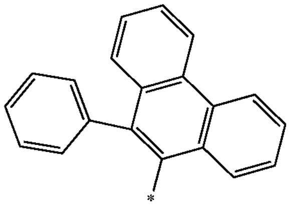 [SMILES: *c1c(-c2ccccc2)c2ccccc2c2ccccc12] |
| 1-B1-36 | 1 | 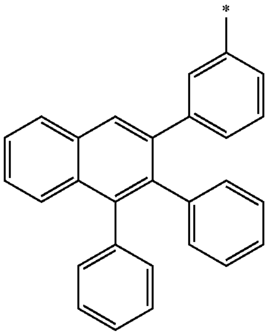 | 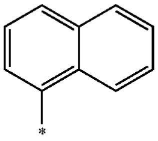 | 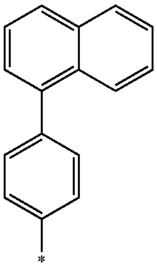 [SMILES: *c1ccc(-c2cccc3ccccc23)cc1] |

-continued
[Compound Group 1]
| | n | A—L—* | $Ar_1$ | $Ar_2$ |
|---|---|---|---|---|
| 1-B1-37 | 1 | 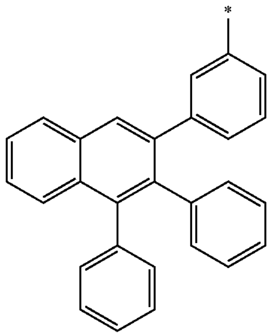 | 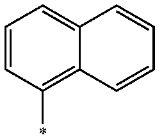 | 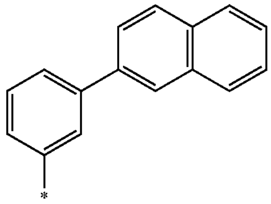 [SMILES: *c1cccc(-c2ccc3ccccc3c2)c1] |
| 1-B1-38 | 1 | 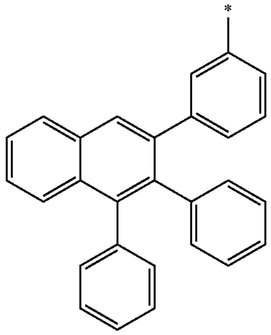 | 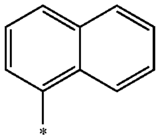 | 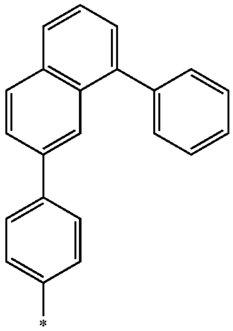 [SMILES: *c1ccc(-c2ccc3cccc(-c4ccccc4)c3c2)cc1] |
| 1-B1-39 | 1 | 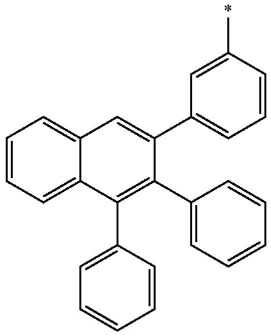 | 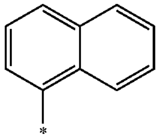 [SMILES: *c1cccc2ccccc12] | 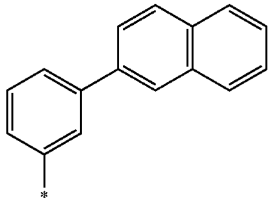 [SMILES: *c1cccc(-c2ccc3ccccc3c2)c1] |
| 1-B1-40 | 1 | 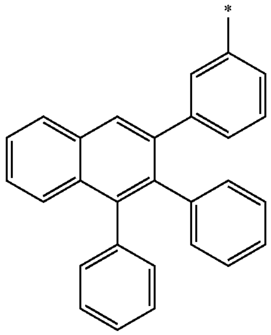 | 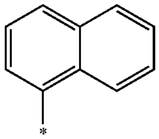 | 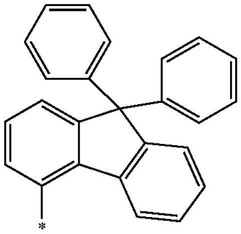 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 1-B1-41 | 1 | 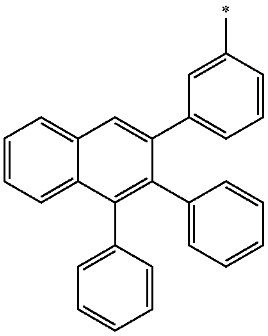 | 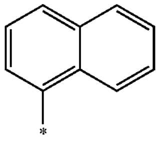 | 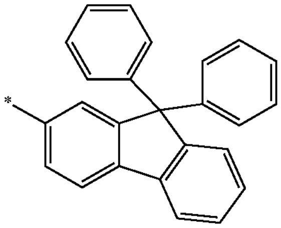 [SMILES: *c1ccc2c(c1)C(c1ccccc1)(c1ccccc1)c1ccccc1-2] |
| 1-B1-42 | 1 | 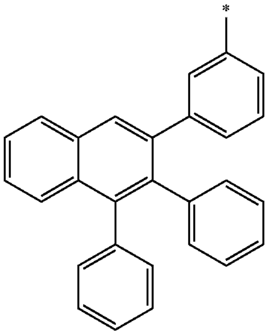 | 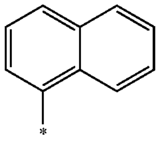 | 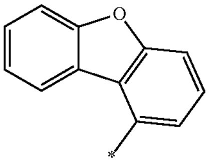 |
| 1-B1-43 | 1 | 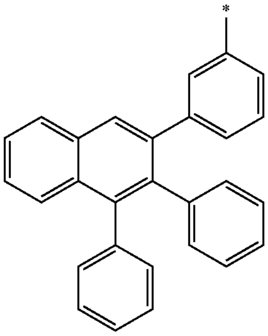 | 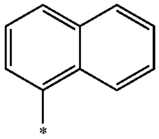 [SMILES: *c1cccc2ccccc12] | 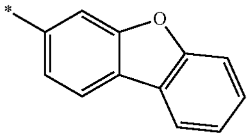 |
| 1-B1-44 | 1 | 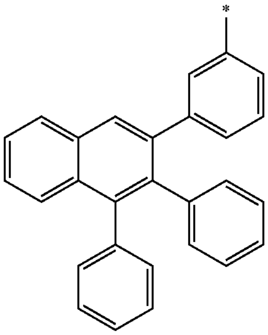 | 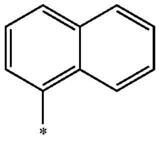 | 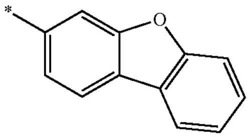 |

-continued
| [Compound Group 1] | | | | |
|---|---|---|---|---|
| | n | A—L—* | $Ar_1$ | $Ar_2$ |
| 1-B1-45 | 1 | 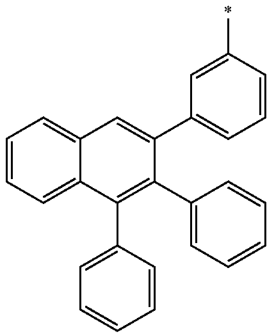 | 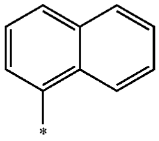 | 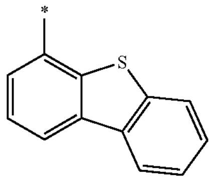 |
| 1-B1-46 | 1 | 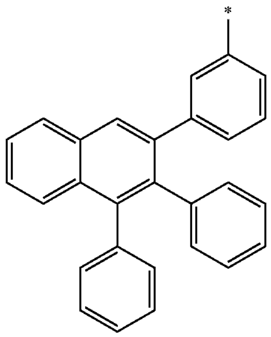 | 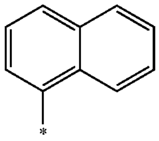 | 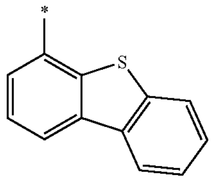 |
| 1-B1-47 | 1 | 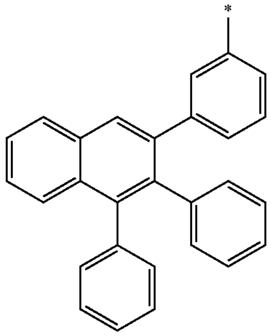 | 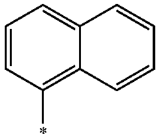 [SMILES: *c1cccc2ccccc12] | 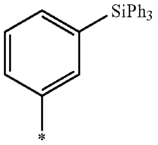 |
| 1-B1-48 | 1 | 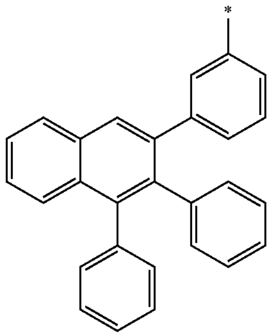 | 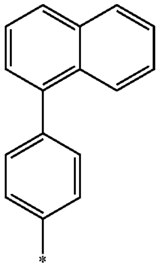 | 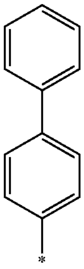 |

-continued
[Compound Group 1]
| | n | A—L—* | $Ar_1$ | $Ar_2$ |
|---|---|---|---|---|
| 1-B1-49 | 1 | 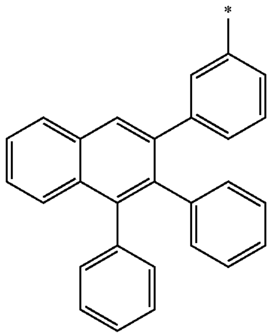 | 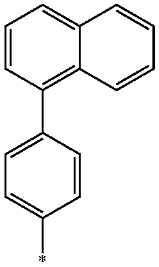 | 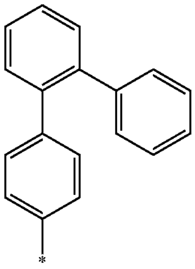 |
| 1-B1-50 | 1 | 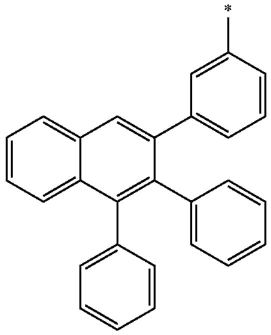 | 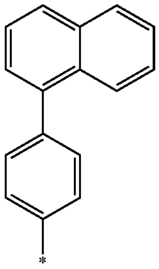 | 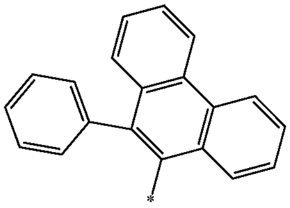 |
| 1-B1-51 | 1 | 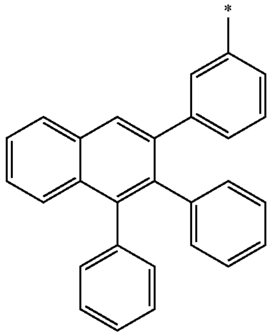 | 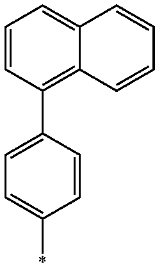 | 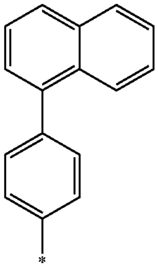 |
| 1-B1-52 | 1 | 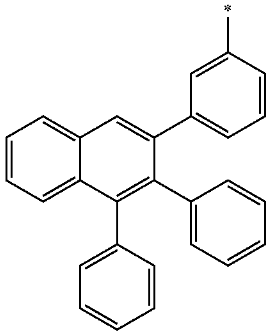 | 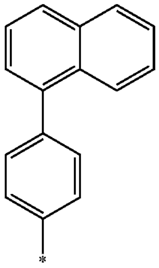 | 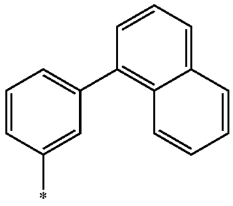 |

-continued
[Compound Group 1]
| | n | A—L—* | $Ar_1$ | $Ar_2$ |
|---|---|---|---|---|
| 1-B1-53 | 1 | 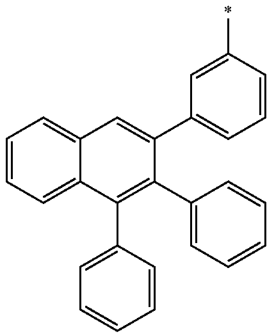 | 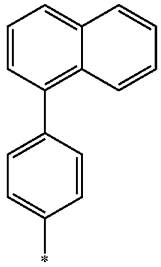 | 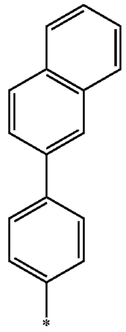 |
| 1-B1-54 | 1 | 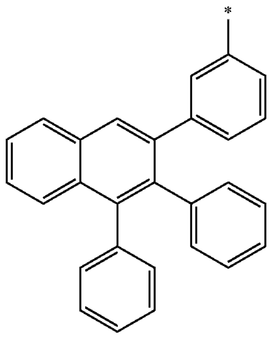 | 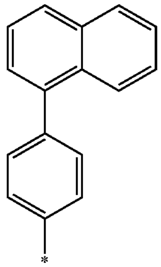 | 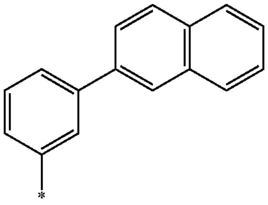 |
| 1-B1-55 | 1 | 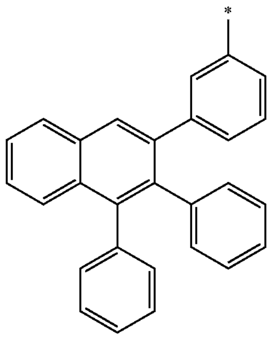 | 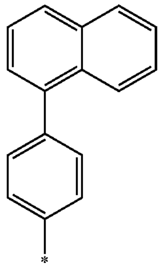 | 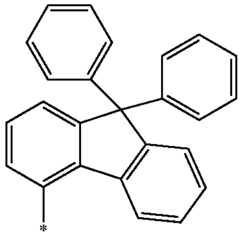 |
| 1-B1-56 | 1 | 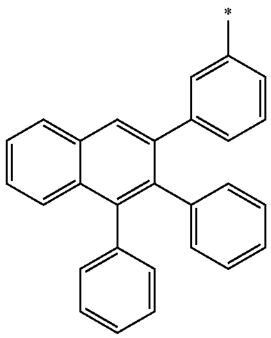 | 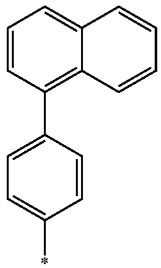 | 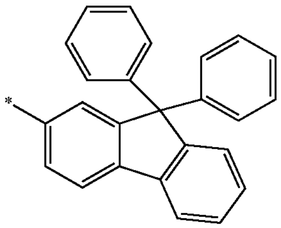 |

-continued
| [Compound Group 1] | n | A—L—* | $Ar_1$ | $Ar_2$ |
| --- | --- | --- | --- | --- |
| 1-B1-57 | 1 | 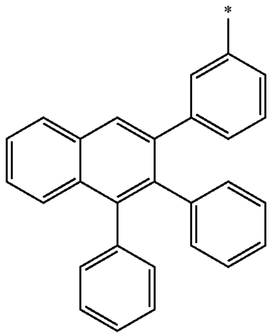 | 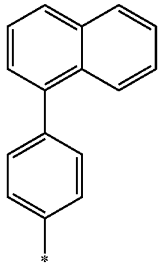 | 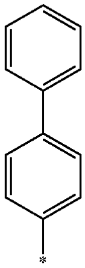 |
| 1-B1-58 | 1 | 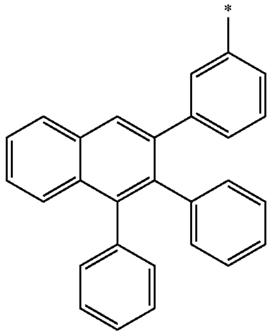 | 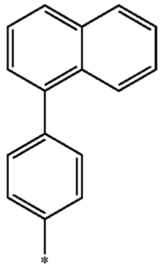 | 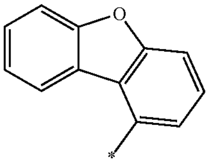 |
| 1-B1-59 | 1 | 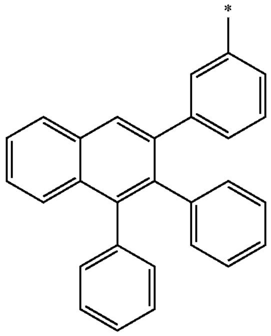 | 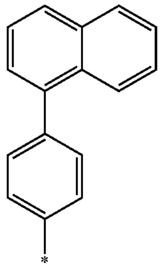 | 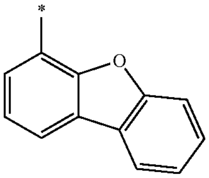 |
| 1-B1-60 | 1 | 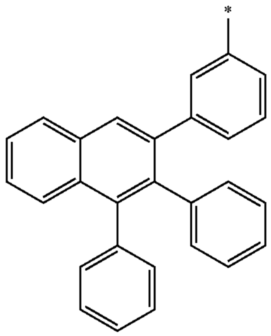 | 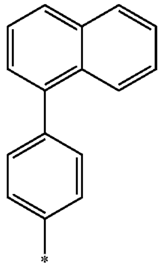 | 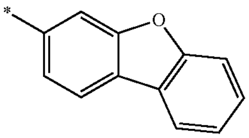 |

-continued
[Compound Group 1]
| | n | A—L—* | $Ar_1$ | $Ar_2$ |
|---|---|---|---|---|
| 1-B1-61 | 1 | 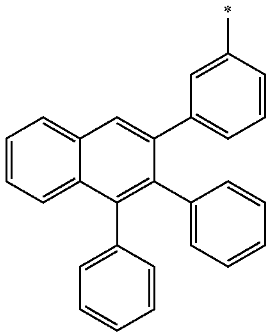 | 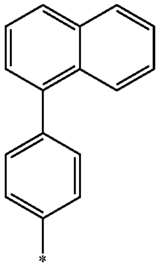 | 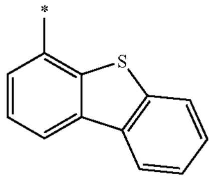 |
| 1-B1-62 | 1 | 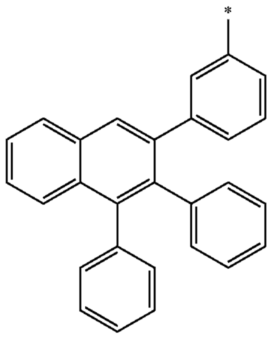 | 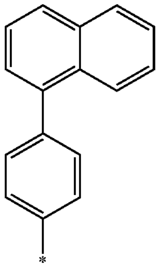 | 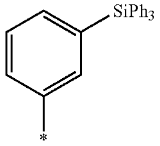 |
| 1-B1-63 | 1 | 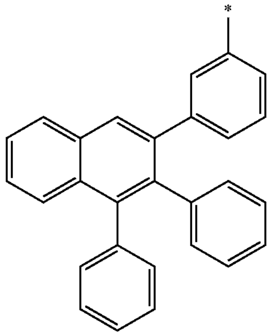 | 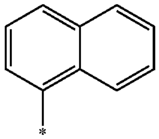 [SMILES: *c1cccc2ccccc12] | 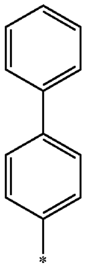 |
| 1-B1-64 | 1 | 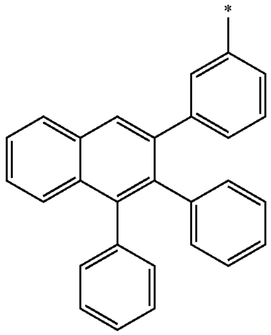 | 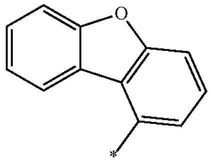 | 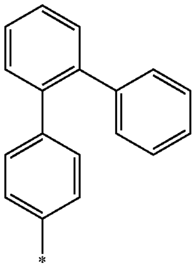 |

-continued
[Compound Group 1]
| | n | A—L—* | $Ar_1$ | $Ar_2$ |
|---|---|---|---|---|
| 1-B1-65 | 1 | 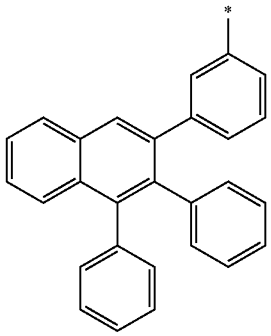 | 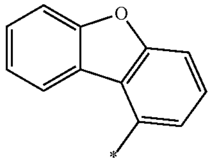 | 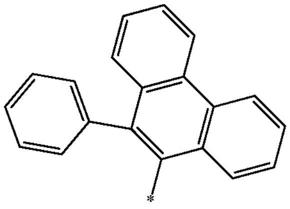 |
| 1-B1-66 | 1 | 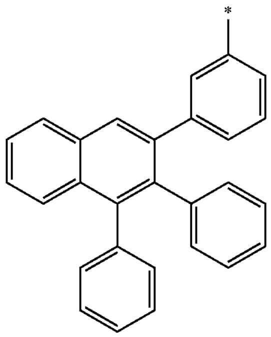 | 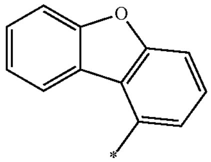 | 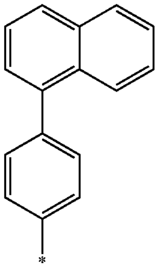 |
| 1-B1-67 | 1 | 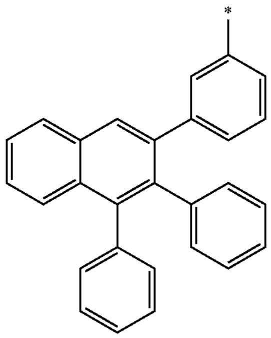 | 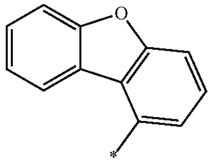 | 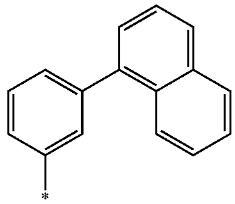 |
| 1-B1-68 | 1 | 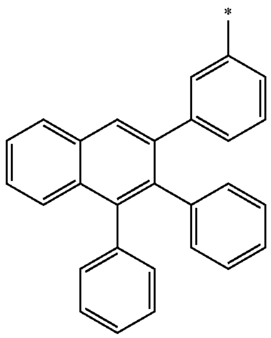 | 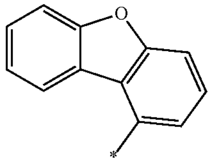 | 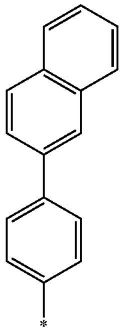 |

-continued
| [Compound Group 1] | | | | |
|---|---|---|---|---|
| | n | A—L—* | $Ar_1$ | $Ar_2$ |
| 1-B1-69 | 1 | 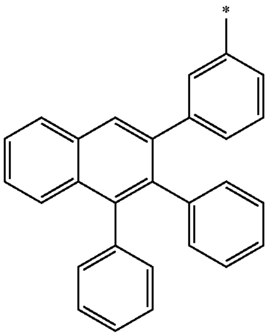 | 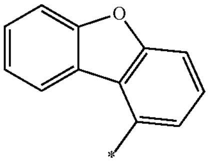 | 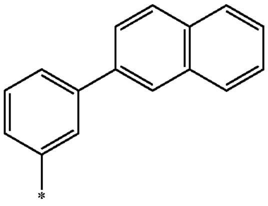 |
| 1-B1-70 | 1 | 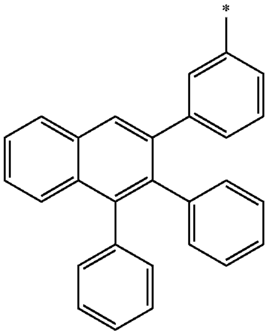 | 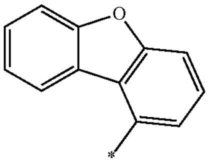 | 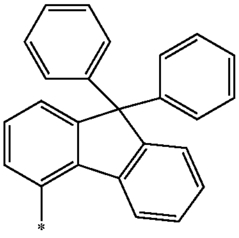 |
| 1-B1-71 | 1 | 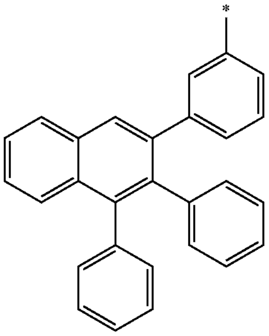 | 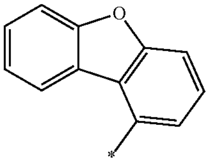 | 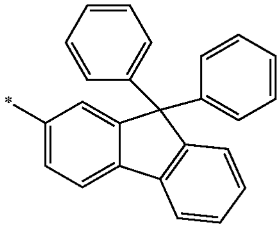 |
| 1-B1-72 | 1 | 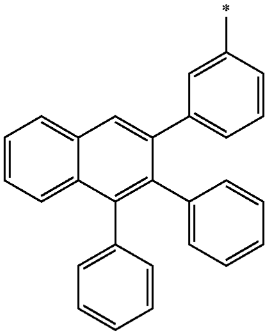 | 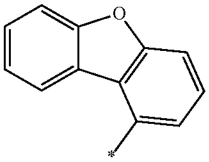 | 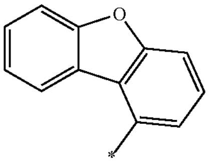 |

-continued
| [Compound Group 1] | | | | |
|---|---|---|---|---|
| | n | A—L—* | $Ar_1$ | $Ar_2$ |
| 1-B1-73 | 1 | 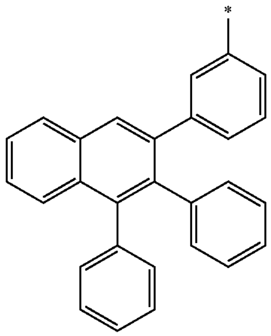 | 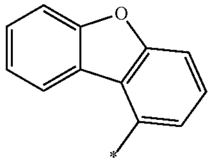 | 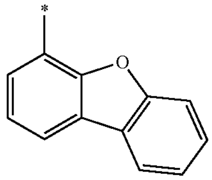 [SMILES: *c1cccc2c1oc1ccccc12] |
| 1-B1-74 | 1 | 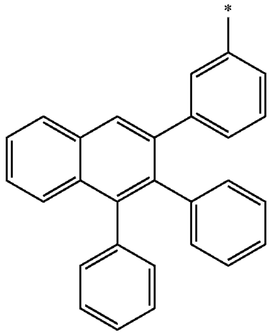 | 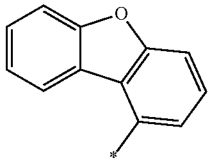 | 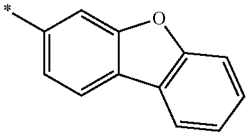 [SMILES: *c1ccc2c(c1)oc1ccccc12] |
| 1-B1-75 | 1 | 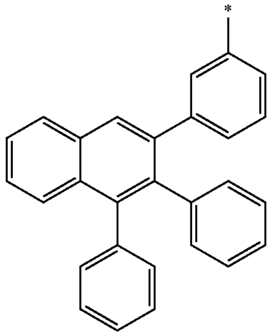 | 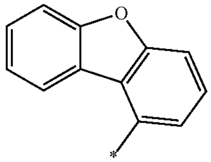 | 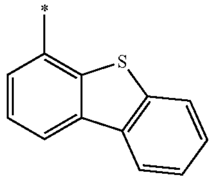 |
| 1-B1-76 | 1 | 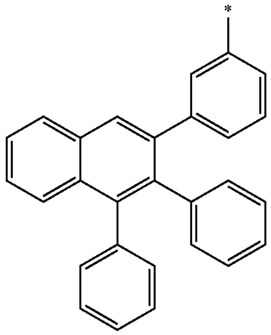 | 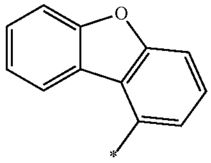 | 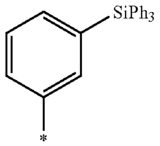 |

-continued
| [Compound Group 1] | | | | |
|---|---|---|---|---|
| | n | A—L—* | $Ar_1$ | $Ar_2$ |
| 1-B1-77 | 1 | 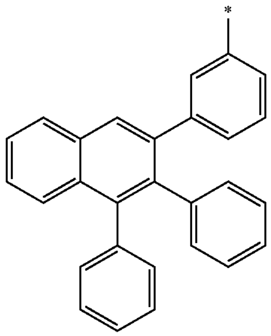 | 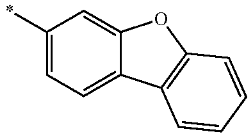 [SMILES: *c1ccc2c(c1)oc1ccccc12] | 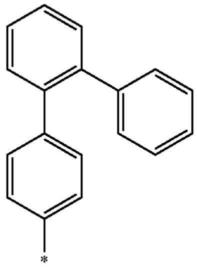 [SMILES: *c1ccc(-c2ccccc2-c2ccccc2)cc1] |
| 1-B1-78 | 1 | 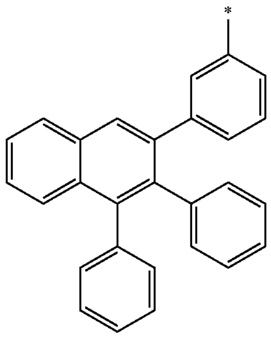 | 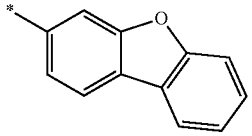 [SMILES: *c1ccc2c(c1)oc1ccccc12] | 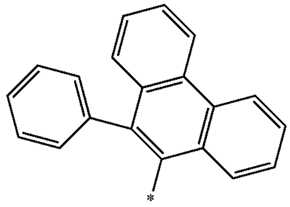 [SMILES: *c1c(-c2ccccc2)c2ccccc2c2ccccc12] |
| 1-B1-79 | 1 | 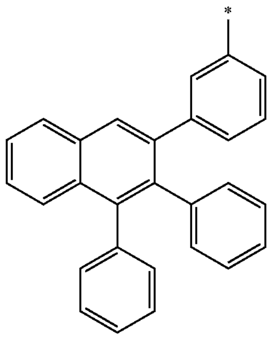 | 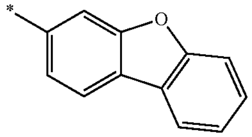 [SMILES: *c1ccc2c(c1)oc1ccccc12] | 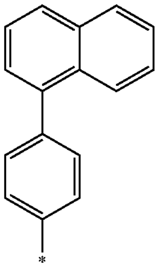 [SMILES: *c1ccc(-c2cccc3ccccc23)cc1] |
| 1-B1-80 | 1 | 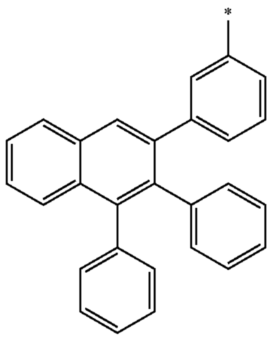 | 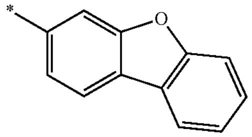 [SMILES: *c1ccc2c(c1)oc1ccccc12] | 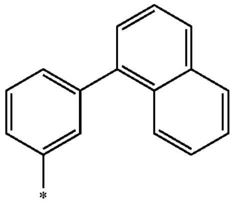 |

-continued
| [Compound Group 1] | | | | |
|---|---|---|---|---|
| | n | A—L—* | $Ar_1$ | $Ar_2$ |
| 1-B1-81 | 1 | 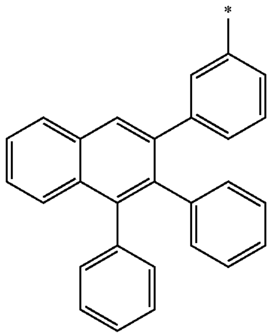 | 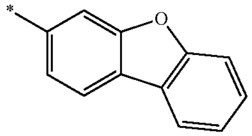 [SMILES: *c1ccc2c(c1)oc1ccccc12] | 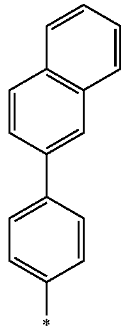 [SMILES: *c1ccc(-c2ccc3ccccc3c2)cc1] |
| 1-B1-82 | 1 | 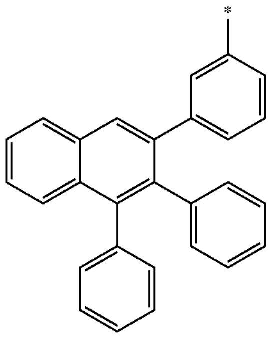 | 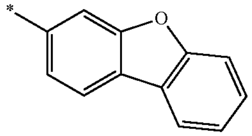 [SMILES: *c1ccc2c(c1)oc1ccccc12] | 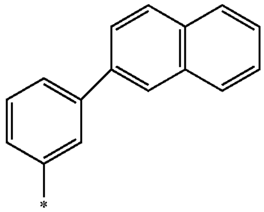 [SMILES: *c1cccc(-c2ccc3ccccc3c2)c1] |
| 1-B1-83 | 1 | 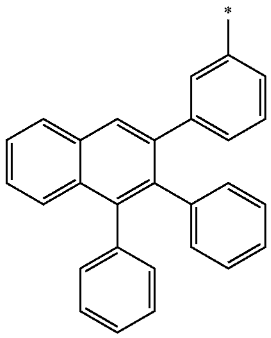 | 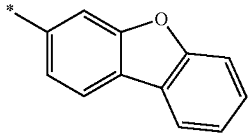 [SMILES: *c1ccc2c(c1)oc1ccccc12] | 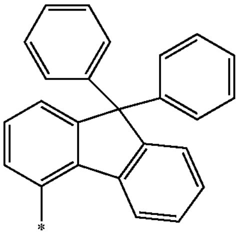 |
| 1-B1-84 | 1 | 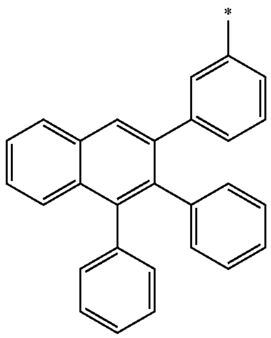 | 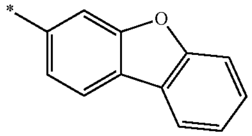 [SMILES: *c1ccc2c(c1)oc1ccccc12] | 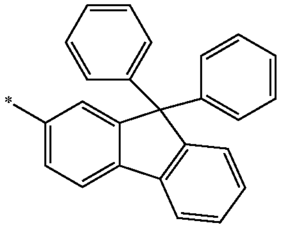 |

-continued
| [Compound Group 1] | n | A—L—* | $Ar_1$ | $Ar_2$ |
|---|---|---|---|---|
| 1-B1-85 | 1 | 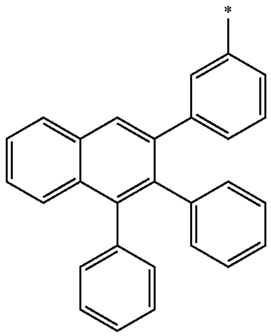 | 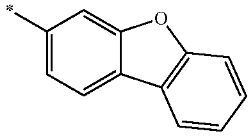 [SMILES: *c1ccc2c(c1)oc1ccccc12] | 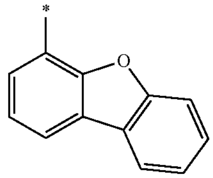 |
| 1-B1-86 | 1 | 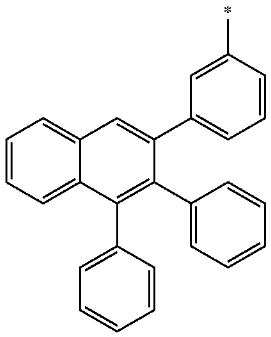 | 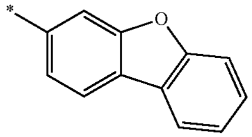 [SMILES: *c1ccc2c(c1)oc1ccccc12] | 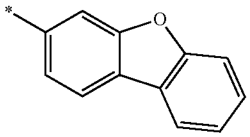 |
| 1-B1-87 | 1 | 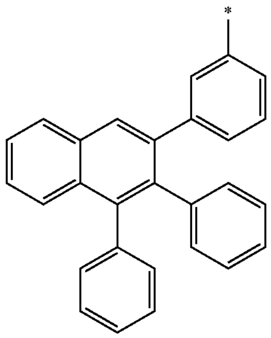 | 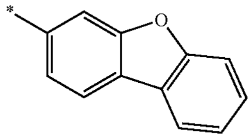 [SMILES: *c1ccc2c(c1)oc1ccccc12] | 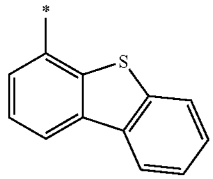 |
| 1-B1-88 | 1 | 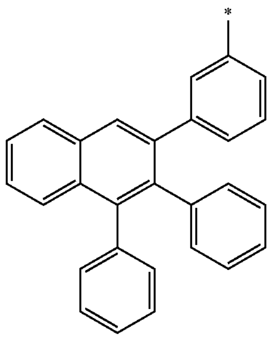 | 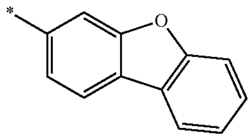 [SMILES: *c1ccc2c(c1)oc1ccccc12] | 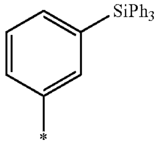 |

-continued
[Compound Group 1]
| | n | A—L—* | $Ar_1$ | $Ar_2$ |
|---|---|---|---|---|
| 1-B1-89 | 1 | 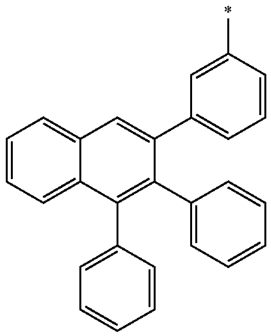 | 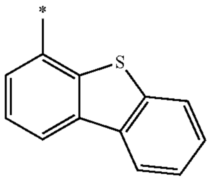 | 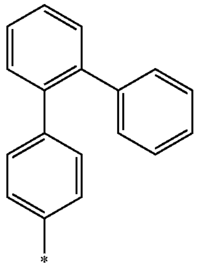 |
| 1-B1-90 | 1 | 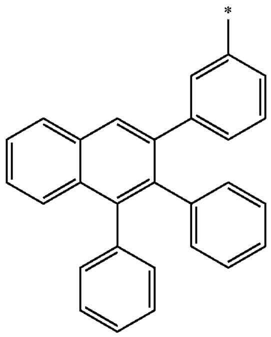 | 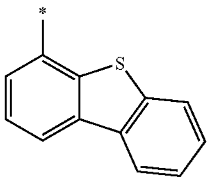 | 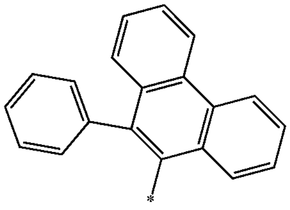 |
| 1-B1-91 | 1 | 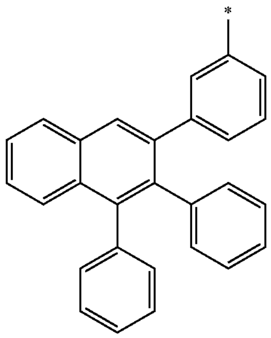 | 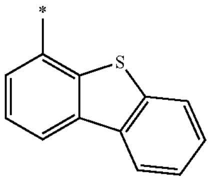 | 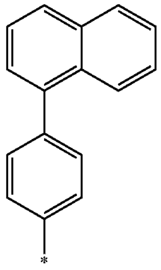 |
| 1-B1-92 | 1 | 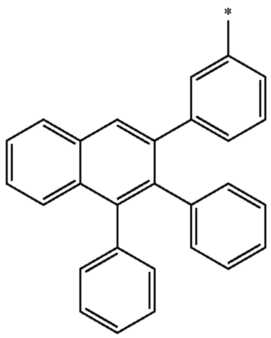 | 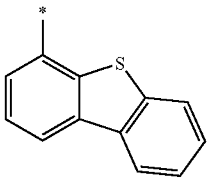 | 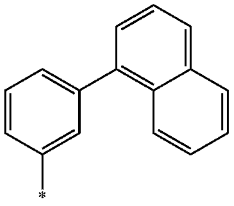 |

-continued
| [Compound Group 1] | | | | |
|---|---|---|---|---|
| | n | A—L—* | $Ar_1$ | $Ar_2$ |
| 1-B1-93 | 1 | 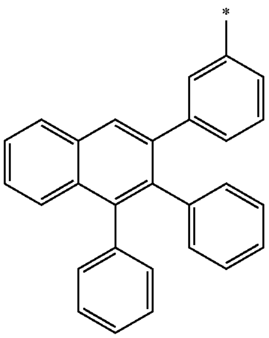 | 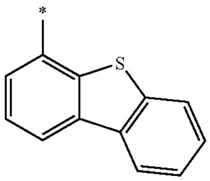 | 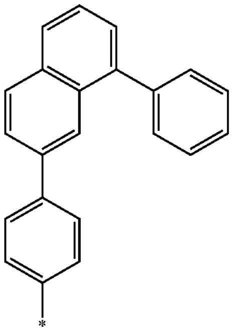 |
| 1-B1-94 | 1 | 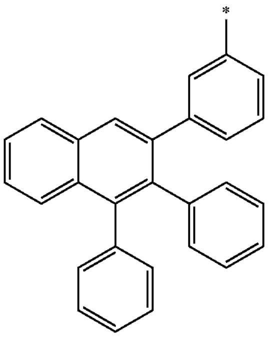 | 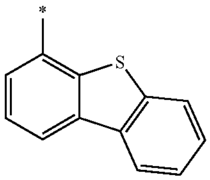 | 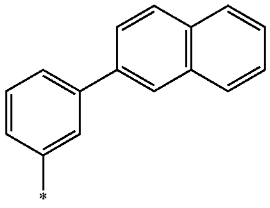 |
| 1-B1-95 | 1 | 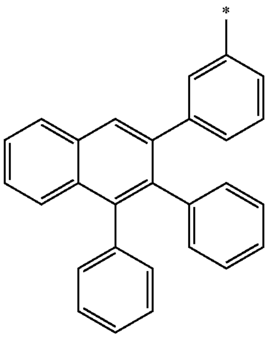 | 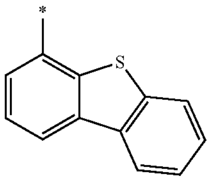 | 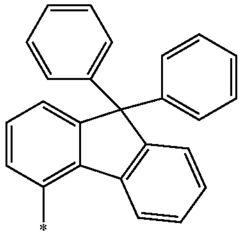 |
| 1-B1-96 | 1 | 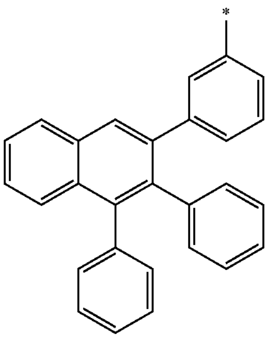 | 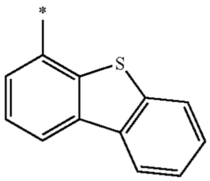 | 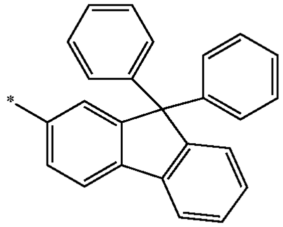 |

-continued
[Compound Group 1]
| | n | A—L—* | $Ar_1$ | $Ar_2$ |
|---|---|---|---|---|
| 1-B1-97 | 1 | 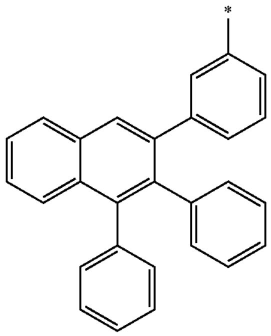 | 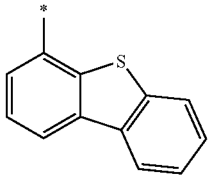 | 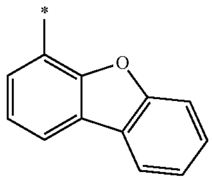 |
| 1-B1-98 | 1 | 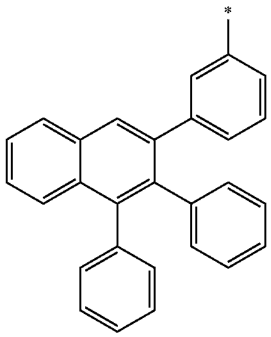 | 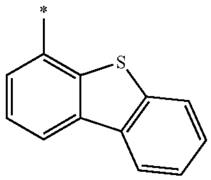 | 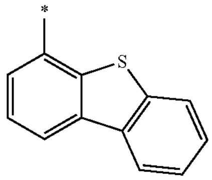 |
| 1-B1-99 | 1 | 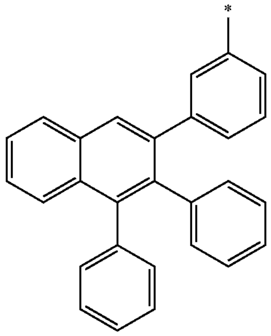 | 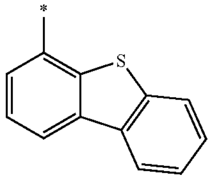 | 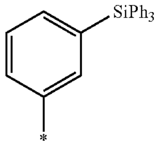 |
| 2-B1-1 | 1 | 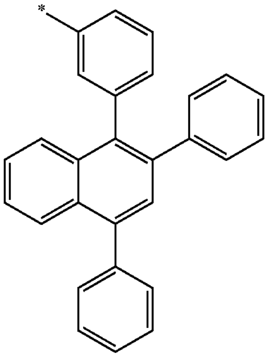 [SMILES: *c1cccc(-c2c(-c3ccccc3)cc(-c3ccccc3)c3ccccc23)c1] | 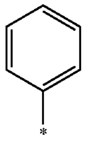 [SMILES: *c1ccccc1] | 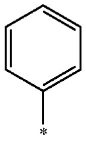 [SMILES: *c1ccccc1] |

-continued
| [Compound Group 1] | | | | |
| --- | --- | --- | --- | --- |
| | n | A—L—* | $Ar_1$ | $Ar_2$ |
| 2-B1-2 | 1 | 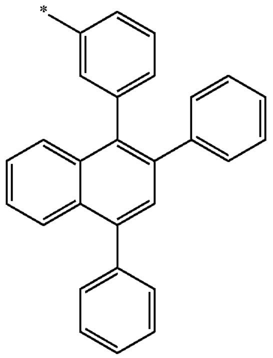 [SMILES: *c1cccc(-c2c(-c3ccccc3)cc(-c3ccccc3)c3ccccc23)c1] | 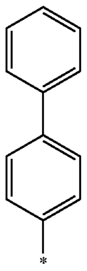 [SMILES: *c1ccc(-c2ccccc2)cc1] | 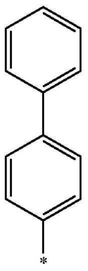 [SMILES: *c1ccc(-c2ccccc2)cc1] |
| 2-B1-3 | 1 | 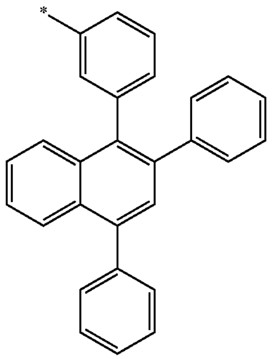 [SMILES: *c1cccc(-c2c(-c3ccccc3)cc(-c3ccccc3)c3ccccc23)c1] | 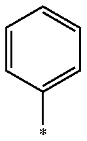 | 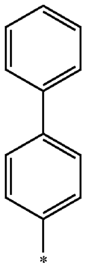 [SMILES: *c1ccc(-c2ccccc2)cc1] |
| 2-B1-4 | 1 | 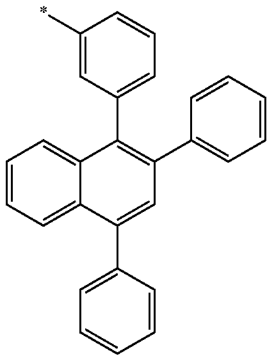 [SMILES: *c1cccc(-c2c(-c3ccccc3)cc(-c3ccccc3)c3ccccc23)c1] | 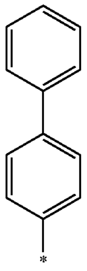 [SMILES: *c1ccc(-c2ccccc2)cc1] | 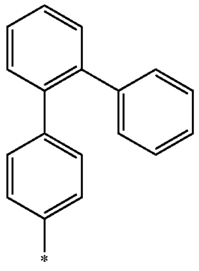 [SMILES: *c1ccc(-c2ccccc2-c2ccccc2)cc1] |
| 2-B1-5 | 1 | 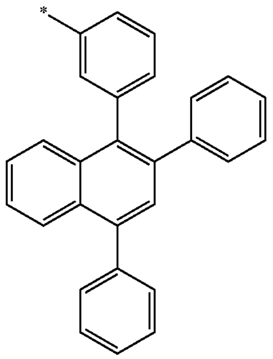 [SMILES: *c1cccc(-c2c(-c3ccccc3)cc(-c3ccccc3)c3ccccc23)c1] | 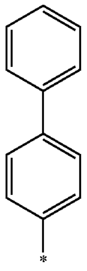 [SMILES: *c1ccc(-c2ccccc2)cc1] | 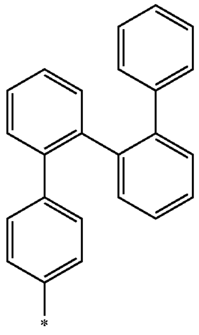 [SMILES: *c1ccc(-c2ccccc2-c2ccccc2-c2ccccc2)cc1] |

-continued
| [Compound Group 1] | | | | |
|---|---|---|---|---|
| | n | A—L—* | $Ar_1$ | $Ar_2$ |
| 2-B1-6 | 1 | 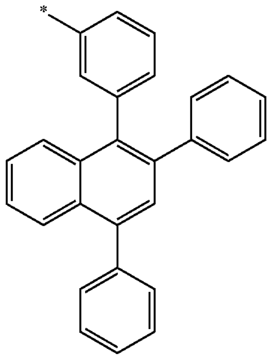 [SMILES: *c1cccc(-c2c(-c3ccccc3)cc(-c3ccccc3)c3ccccc23)c1] | 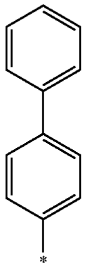 [SMILES: *c1ccc(-c2ccccc2)cc1] | 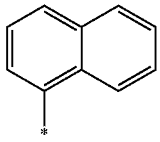 |
| 2-B1-7 | 1 | 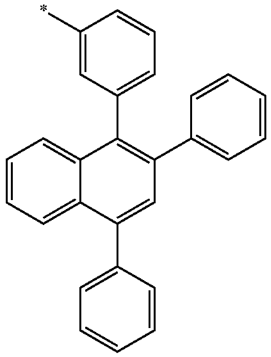 [SMILES: *c1cccc(-c2c(-c3ccccc3)cc(-c3ccccc3)c3ccccc23)c1] | 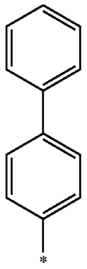 [SMILES: *c1ccc(-c2ccccc2)cc1] | 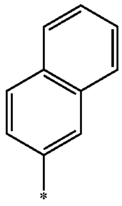 |
| 2-B1-8 | 1 | 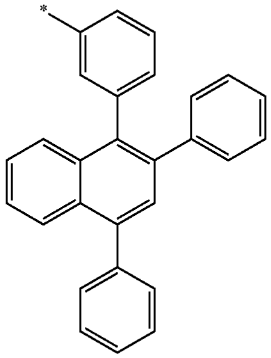 [SMILES: *c1cccc(-c2c(-c3ccccc3)cc(-c3ccccc3)c3ccccc23)c1] | 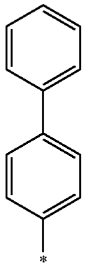 [SMILES: *c1ccc(-c2ccccc2)cc1] | 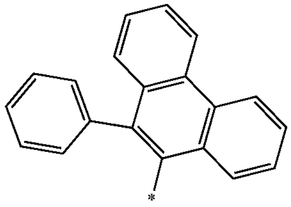 [SMILES: *c1c(-c2ccccc2)c2ccccc2c2ccccc12] |
| 2-B1-9 | 1 | 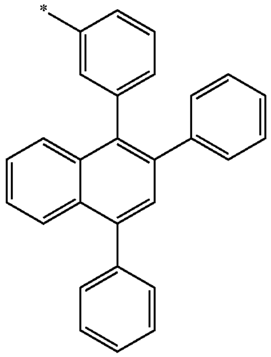 [SMILES: *c1cccc(-c2c(-c3ccccc3)cc(-c3ccccc3)c3ccccc23)c1] | 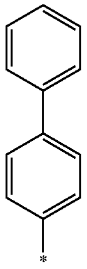 [SMILES: *c1ccc(-c2ccccc2)cc1] | 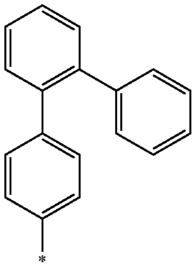 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 2-B1-10 | 1 | 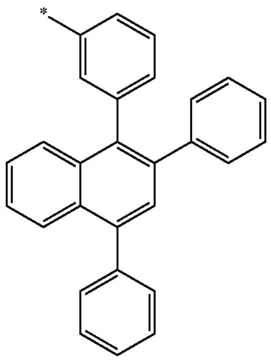 [SMILES: *c1cccc(-c2c(-c3ccccc3)cc(-c3ccccc3)c3ccccc23)c1] | 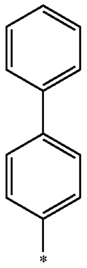 [SMILES: *c1ccc(-c2ccccc2)cc1] | 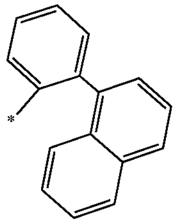 [SMILES: *c1ccccc1-c1cccc2ccccc12] |
| 2-B1-11 | 1 | 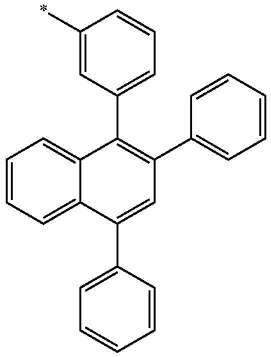 [SMILES: *c1cccc(-c2c(-c3ccccc3)cc(-c3ccccc3)c3ccccc23)c1] | 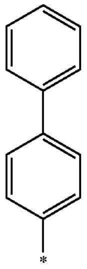 [SMILES: *c1ccc(-c2ccccc2)cc1] | 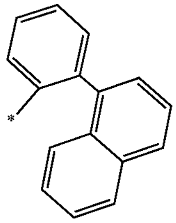 [SMILES: *c1ccccc1-c1cccc2ccccc12] |
| 2-B1-12 | 1 | 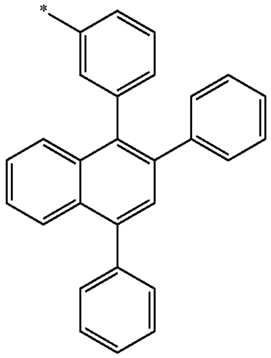 [SMILES: *c1cccc(-c2c(-c3ccccc3)cc(-c3ccccc3)c3ccccc23)c1] | 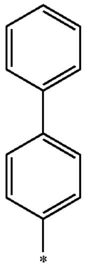 [SMILES: *c1ccc(-c2ccccc2)cc1] | 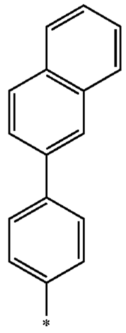 |
| 2-B1-13 | 1 | 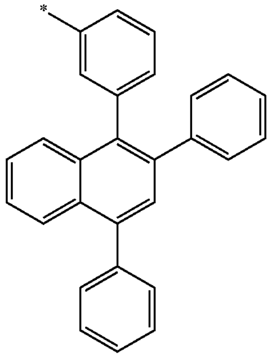 [SMILES: *c1cccc(-c2c(-c3ccccc3)cc(-c3ccccc3)c3ccccc23)c1] | 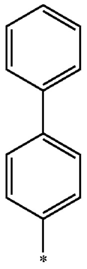 [SMILES: *c1ccc(-c2ccccc2)cc1] | 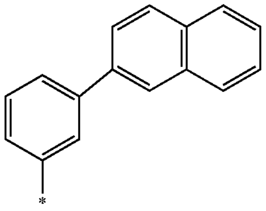 [SMILES: *c1cccc(-c2ccc3ccccc3c2)c1] |

-continued
[Compound Group 1]
| | n | A—L—* | $Ar_1$ | $Ar_2$ |
|---|---|---|---|---|
| 2-B1-14 | 1 | 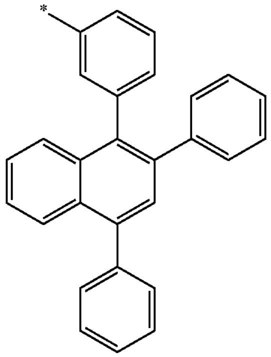 [SMILES: *c1cccc(-c2c(-c3ccccc3)cc(-c3ccccc3)c3ccccc23)c1] | 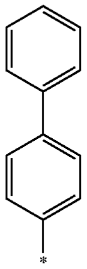 [SMILES: *c1ccc(-c2ccccc2)cc1] | 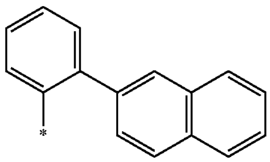 [SMILES: *c1ccccc1-c1ccc2ccccc2c1] |
| 2-B1-15 | 1 | 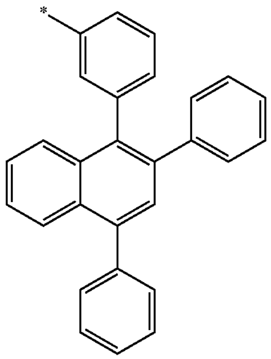 [SMILES: *c1cccc(-c2c(-c3ccccc3)cc(-c3ccccc3)c3ccccc23)c1] | 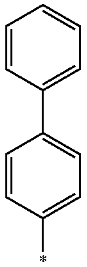 [SMILES: *c1ccc(-c2ccccc2)cc1] | 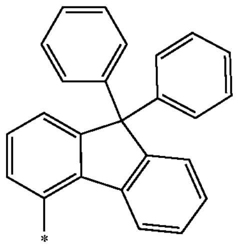 [SMILES: *c1cccc2c1-c1ccccc1C2(c1ccccc1)c1ccccc1] |
| 2-B1-16 | 1 | 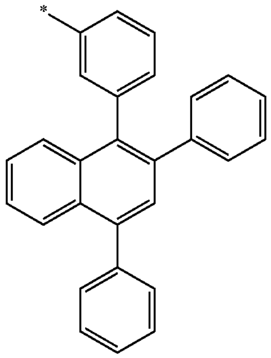 [SMILES: *c1cccc(-c2c(-c3ccccc3)cc(-c3ccccc3)c3ccccc23)c1] | 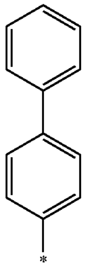 [SMILES: *c1ccc(-c2ccccc2)cc1] | 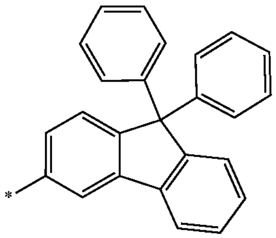 [SMILES: *c1ccc2c(c1)-c1ccccc1C2(c1ccccc1)c1ccccc1] |
| 2-B1-17 | 1 | 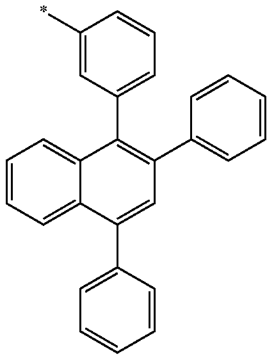 [SMILES: *c1cccc(-c2c(-c3ccccc3)cc(-c3ccccc3)c3ccccc23)c1] | 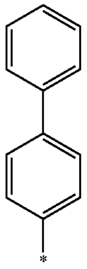 [SMILES: *c1ccc(-c2ccccc2)cc1] | 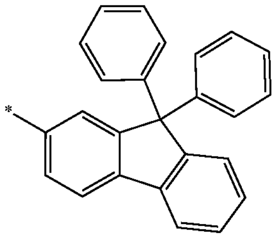 [SMILES: *c1ccc2c(c1)C(c1ccccc1)(c1ccccc1)c1ccccc1-2] |

-continued
[Compound Group 1]
| | n | A—L—* | $Ar_1$ | $Ar_2$ |
|---|---|---|---|---|
| 2-B1-18 | 1 | 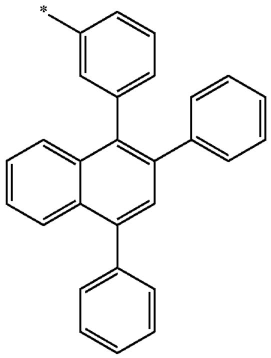 [SMILES: *c1cccc(-c2c(-c3ccccc3)cc(-c3ccccc3)c3ccccc23)c1] | 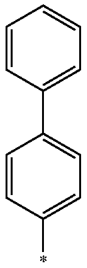 [SMILES: *c1ccc(-c2ccccc2)cc1] | 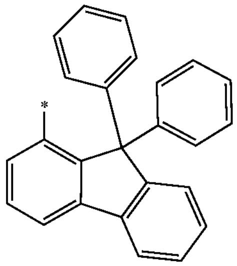 [SMILES: *c1cccc2c1C(c1ccccc1)(c1ccccc1)c1ccccc1-2] |
| 2-B1-19 | 1 | 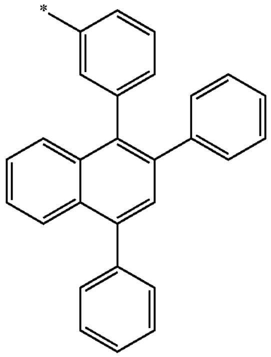 [SMILES: *c1cccc(-c2c(-c3ccccc3)cc(-c3ccccc3)c3ccccc23)c1] | 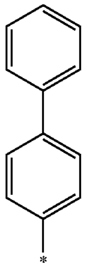 [SMILES: *c1ccc(-c2ccccc2)cc1] | 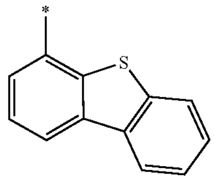 |
| 2-B1-20 | 1 | 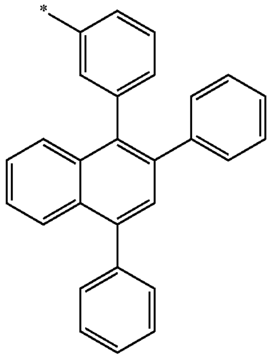 [SMILES: *c1cccc(-c2c(-c3ccccc3)cc(-c3ccccc3)c3ccccc23)c1] | 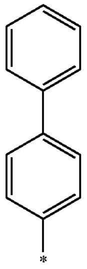 [SMILES: *c1ccc(-c2ccccc2)cc1] | 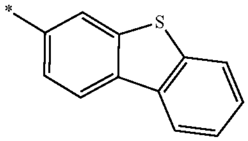 [SMILES: *c1ccc2c(c1)sc1ccccc12] |
| 2-B1-21 | 1 | 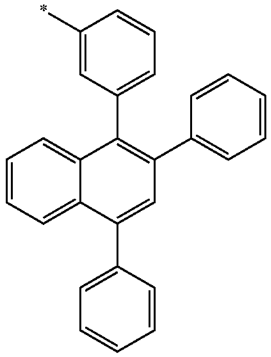 [SMILES: *c1cccc(-c2c(-c3ccccc3)cc(-c3ccccc3)c3ccccc23)c1] | 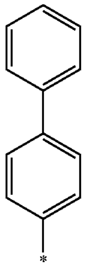 [SMILES: *c1ccc(-c2ccccc2)cc1] | 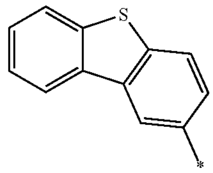 |

-continued
| [Compound Group 1] | | | | |
|---|---|---|---|---|
| | n | A—L—* | $Ar_1$ | $Ar_2$ |
| 2-B1-22 | 1 | 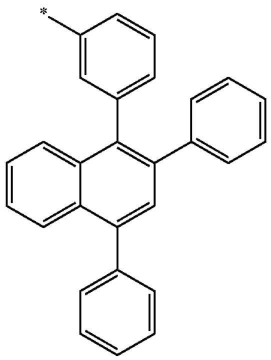 [SMILES: *c1cccc(-c2c(-c3ccccc3)cc(-c3ccccc3)c3ccccc23)c1] | 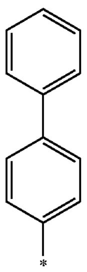 [SMILES: *c1ccc(-c2ccccc2)cc1] | 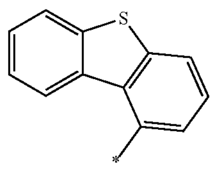 |
| 2-B1-23 | 1 | 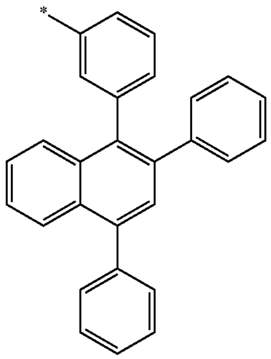 [SMILES: *c1cccc(-c2c(-c3ccccc3)cc(-c3ccccc3)c3ccccc23)c1] | 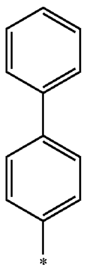 [SMILES: *c1ccc(-c2ccccc2)cc1] | 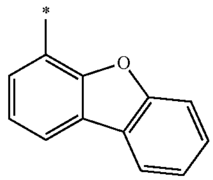 |
| 2-B1-24 | 1 | 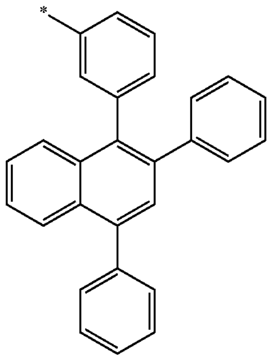 [SMILES: *c1cccc(-c2c(-c3ccccc3)cc(-c3ccccc3)c3ccccc23)c1] | 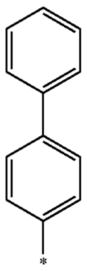 [SMILES: *c1ccc(-c2ccccc2)cc1] | 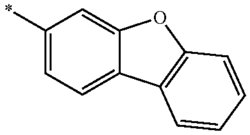 |
| 2-B1-25 | 1 | 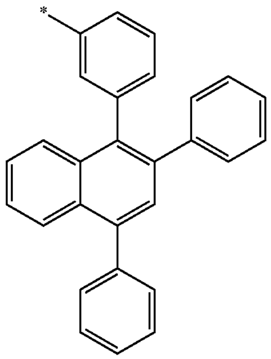 [SMILES: *c1cccc(-c2c(-c3ccccc3)cc(-c3ccccc3)c3ccccc23)c1] | 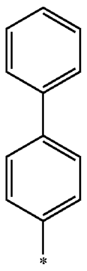 [SMILES: *c1ccc(-c2ccccc2)cc1] | 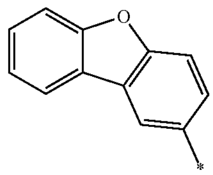 |

-continued
| [Compound Group 1] | | | | |
|---|---|---|---|---|
| | n | A—L—* | $Ar_1$ | $Ar_2$ |
| 2-B1-26 | 1 | 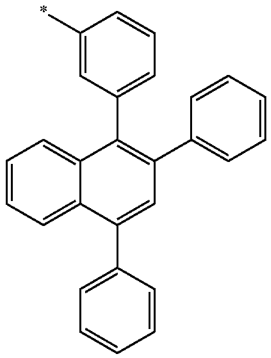 [SMILES: *c1cccc(-c2c(-c3ccccc3)cc(-c3ccccc3)c3ccccc23)c1] | 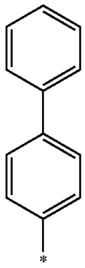 [SMILES: *c1ccc(-c2ccccc2)cc1] | 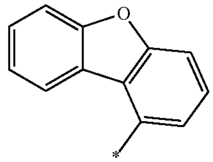 |
| 2-B1-27 | 1 | 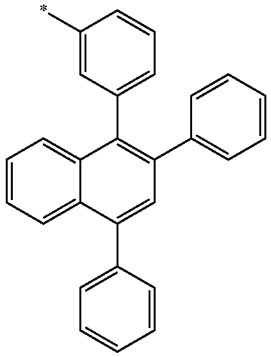 [SMILES: *c1cccc(-c2c(-c3ccccc3)cc(-c3ccccc3)c3ccccc23)c1] | 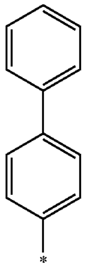 [SMILES: *c1ccc(-c2ccccc2)cc1] | 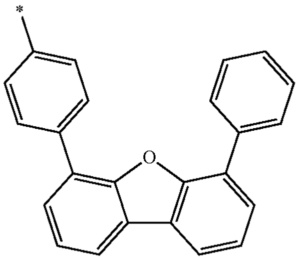 |
| 2-B1-28 | 1 | 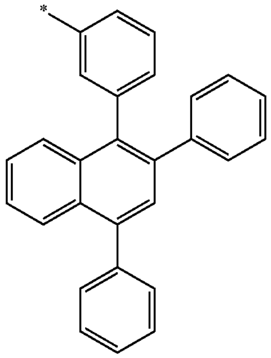 [SMILES: *c1cccc(-c2c(-c3ccccc3)cc(-c3ccccc3)c3ccccc23)c1] | 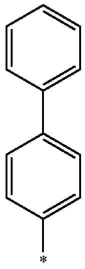 [SMILES: *c1ccc(-c2ccccc2)cc1] | 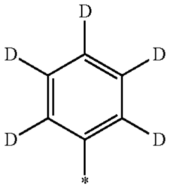 |
| 2-B1-29 | 1 | 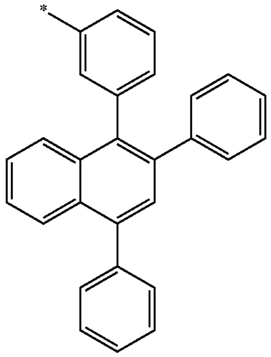 [SMILES: *c1cccc(-c2c(-c3ccccc3)cc(-c3ccccc3)c3ccccc23)c1] | 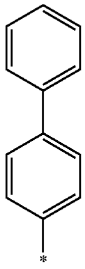 [SMILES: *c1ccc(-c2ccccc2)cc1] | 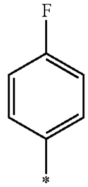 |

-continued
| [Compound Group 1] | | | | |
|---|---|---|---|---|
| | n | A—L—* | $Ar_1$ | $Ar_2$ |
| 2-B1-30 | 1 | 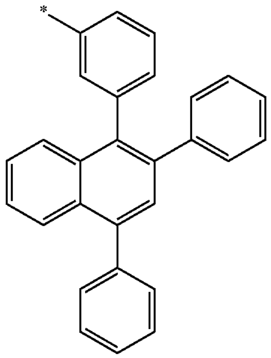 [SMILES: *c1cccc(-c2c(-c3ccccc3)cc(-c3ccccc3)c3ccccc23)c1] | 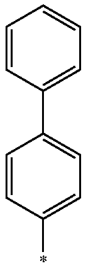 [SMILES: *c1ccc(-c2ccccc2)cc1] | 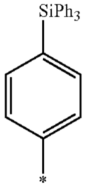 |
| 2-B1-31 | 1 | 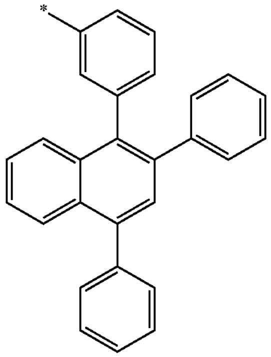 [SMILES: *c1cccc(-c2c(-c3ccccc3)cc(-c3ccccc3)c3ccccc23)c1] | 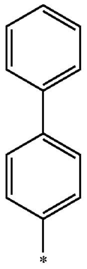 [SMILES: *c1ccc(-c2ccccc2)cc1] | 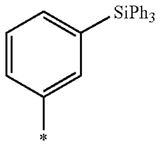 |
| 2-B1-32 | 1 | 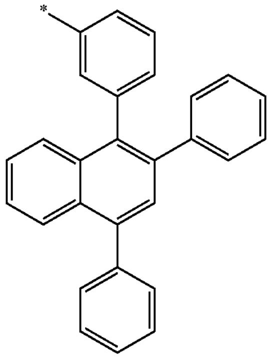 [SMILES: *c1cccc(-c2c(-c3ccccc3)cc(-c3ccccc3)c3ccccc23)c1] | 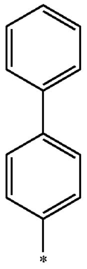 [SMILES: *c1ccc(-c2ccccc2)cc1] | 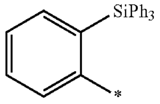 |
| 2-B1-33 | 1 | 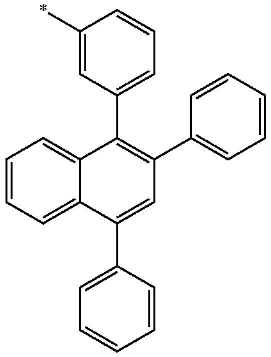 [SMILES: *c1cccc(-c2c(-c3ccccc3)cc(-c3ccccc3)c3ccccc23)c1] | 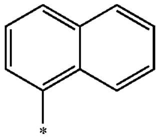 | 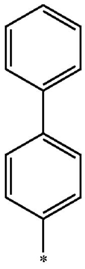 [SMILES: *c1ccc(-c2ccccc2)cc1] |

-continued
[Compound Group 1]
| | n | A—L—* | $Ar_1$ | $Ar_2$ |
|---|---|---|---|---|
| 2-B1-34 | 1 | 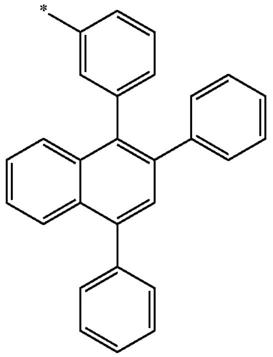 [SMILES: *c1cccc(-c2c(-c3ccccc3)cc(-c3ccccc3)c3ccccc23)c1] | 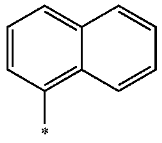 | 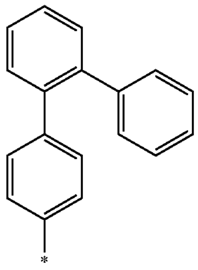 [SMILES: *c1ccc(-c2ccccc2-c2ccccc2)cc1] |
| 2-B1-35 | 1 | 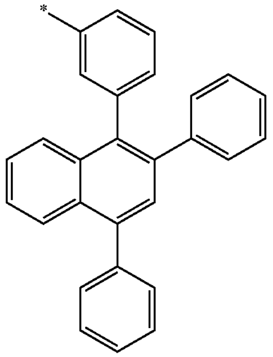 [SMILES: *c1cccc(-c2c(-c3ccccc3)cc(-c3ccccc3)c3ccccc23)c1] | 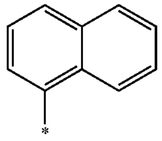 | 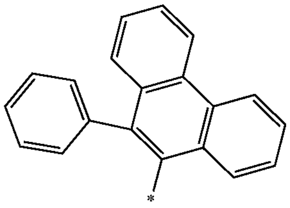 [SMILES: *c1c(-c2ccccc2)c2ccccc2c2ccccc12] |
| 2-B1-36 | 1 | 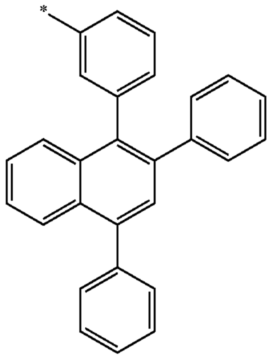 [SMILES: *c1cccc(-c2c(-c3ccccc3)cc(-c3ccccc3)c3ccccc23)c1] | 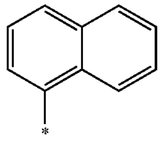 [SMILES: *c1cccc2ccccc12] | 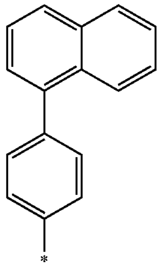 [SMILES: *c1ccc(-c2cccc3ccccc23)cc1] |
| 2-B1-37 | 1 | 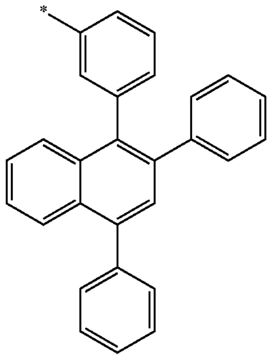 [SMILES: *c1cccc(-c2c(-c3ccccc3)cc(-c3ccccc3)c3ccccc23)c1] | 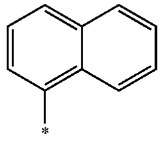 | 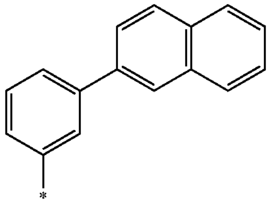 [SMILES: *c1cccc(-c2ccc3ccccc3c2)c1] |

-continued
[Compound Group 1]
| | n | A—L—* | $Ar_1$ | $Ar_2$ |
|---|---|---|---|---|
| 2-B1-38 | 1 | 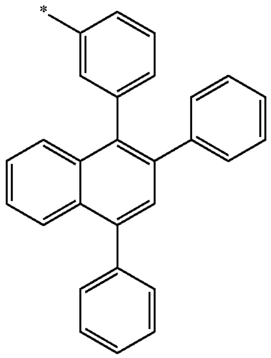 [SMILES: *c1cccc(-c2c(-c3ccccc3)cc(-c3ccccc3)c3ccccc23)c1] | 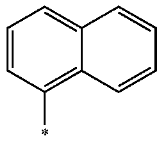 | 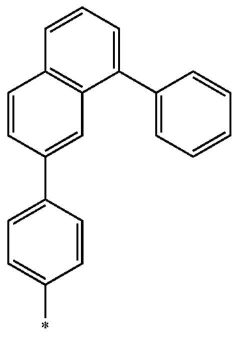 [SMILES: *c1ccc(-c2ccc3cccc(-c4ccccc4)c3c2)cc1] |
| 2-B1-39 | 1 | 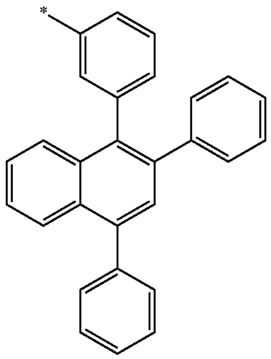 [SMILES: *c1cccc(-c2c(-c3ccccc3)cc(-c3ccccc3)c3ccccc23)c1] | 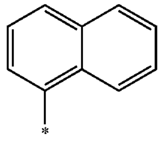 | 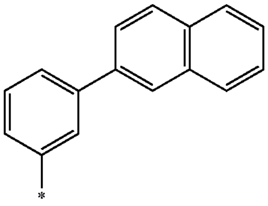 [SMILES: *c1cccc(-c2ccc3ccccc3c2)c1] |
| 2-B1-40 | 1 | 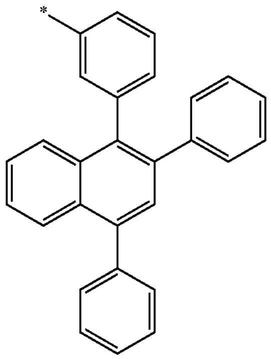 [SMILES: *c1cccc(-c2c(-c3ccccc3)cc(-c3ccccc3)c3ccccc23)c1] | 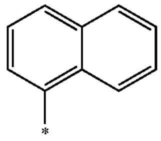 [SMILES: *c1cccc2ccccc12] | 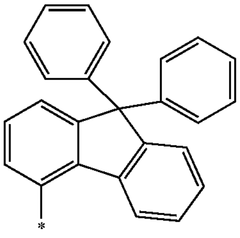 [SMILES: *c1cccc2c1-c1ccccc1C2(c1ccccc1)c1ccccc1] |
| 2-B1-41 | 1 | 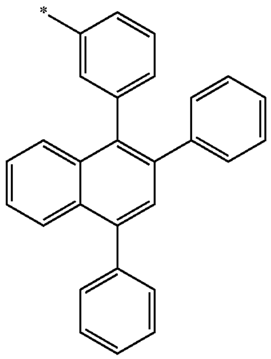 [SMILES: *c1cccc(-c2c(-c3ccccc3)cc(-c3ccccc3)c3ccccc23)c1] | 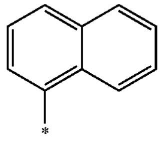 | 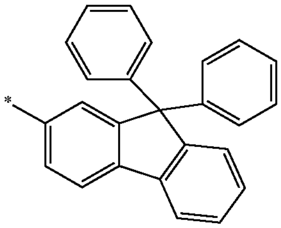 [SMILES: *c1ccc2c(c1)C(c1ccccc1)(c1ccccc1)c1ccccc1-2] |

-continued
| [Compound Group 1] | | | | |
|---|---|---|---|---|
| | n | A—L—* | $Ar_1$ | $Ar_2$ |
| 2-B1-42 | 1 | 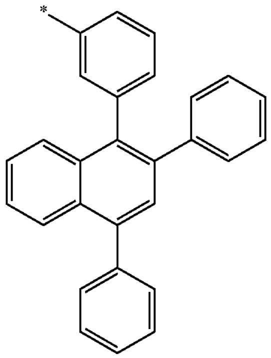 [SMILES: *c1cccc(-c2c(-c3ccccc3)cc(-c3ccccc3)c3ccccc23)c1] | 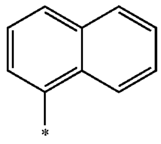 | 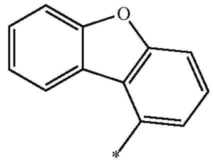 |
| 2-B1-43 | 1 | 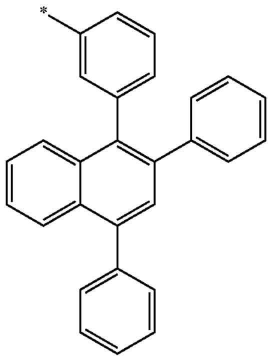 [SMILES: *c1cccc(-c2c(-c3ccccc3)cc(-c3ccccc3)c3ccccc23)c1] | 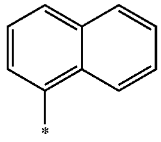 | 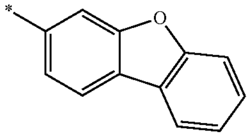 |
| 2-B1-44 | 1 | 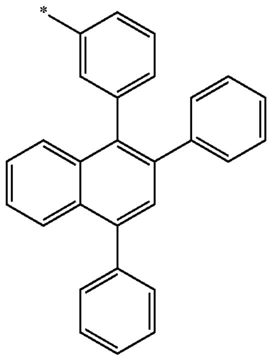 [SMILES: *c1cccc(-c2c(-c3ccccc3)cc(-c3ccccc3)c3ccccc23)c1] | 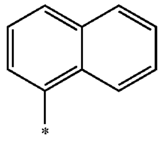 [SMILES: *c1cccc2ccccc12] | 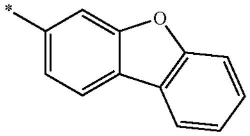 |
| 2-B1-45 | 1 | 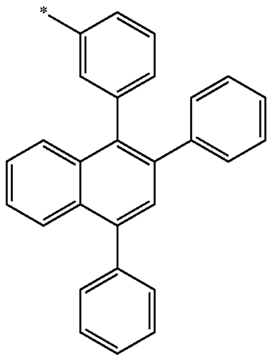 [SMILES: *c1cccc(-c2c(-c3ccccc3)cc(-c3ccccc3)c3ccccc23)c1] | 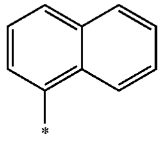 | 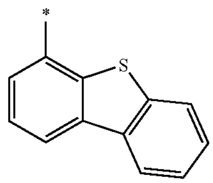 |

-continued
| [Compound Group 1] | | | | |
|---|---|---|---|---|
| | n | A—L—* | $Ar_1$ | $Ar_2$ |
| 2-B1-46 | 1 | 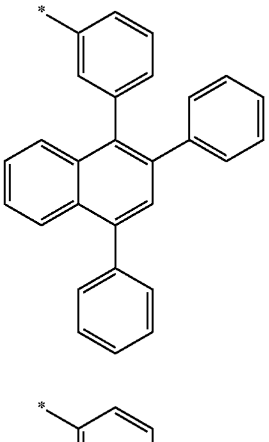 | 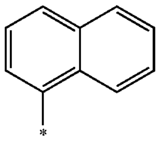 | 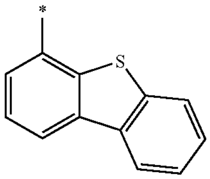 |
| 2-B1-47 | 1 | 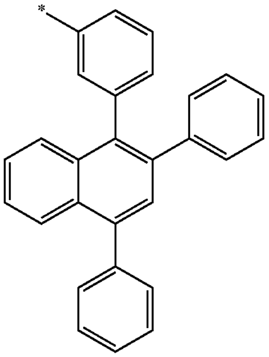 [SMILES: *c1cccc(-c2c(-c3ccccc3)cc(-c3ccccc3)c3ccccc23)c1] | 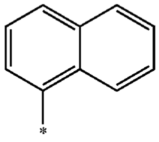 | 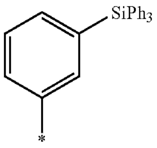 |
| 2-B1-48 | 1 | 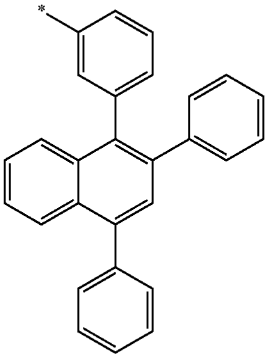 [SMILES: *c1cccc(-c2c(-c3ccccc3)cc(-c3ccccc3)c3ccccc23)c1] | 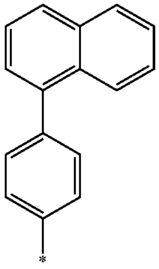 | 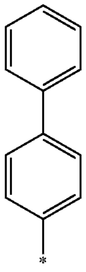 |
| 2-B1-49 | 1 | 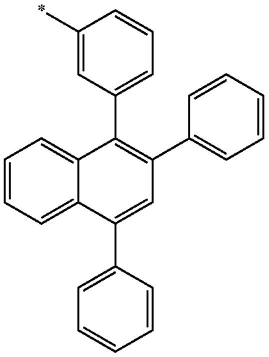 [SMILES: *c1cccc(-c2c(-c3ccccc3)cc(-c3ccccc3)c3ccccc23)c1] | 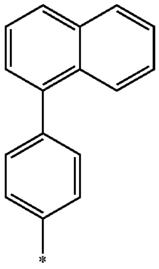 | 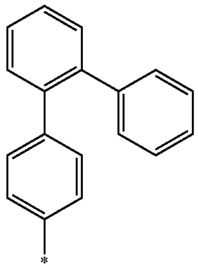 |

-continued
[Compound Group 1]
| | n | A—L—* | $Ar_1$ | $Ar_2$ |
|---|---|---|---|---|
| 2-B1-50 | 1 | 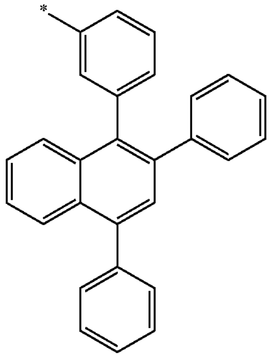 [SMILES: *c1cccc(-c2c(-c3ccccc3)cc(-c3ccccc3)c3ccccc23)c1] | 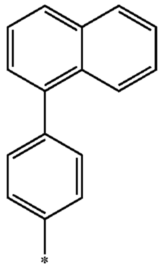 | 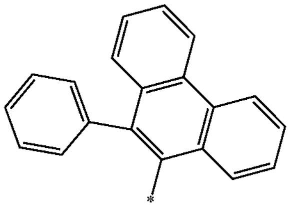 |
| 2-B1-51 | 1 | 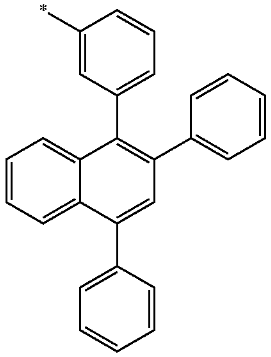 [SMILES: *c1cccc(-c2c(-c3ccccc3)cc(-c3ccccc3)c3ccccc23)c1] | 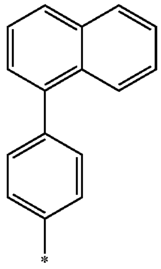 | 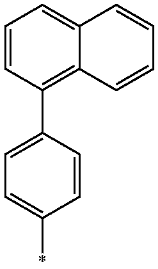 |
| 2-B1-52 | 1 | 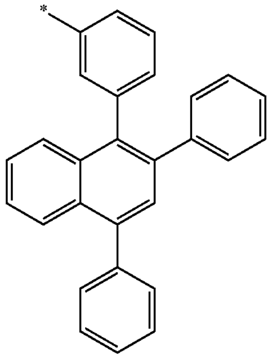 [SMILES: *c1cccc(-c2c(-c3ccccc3)cc(-c3ccccc3)c3ccccc23)c1] | 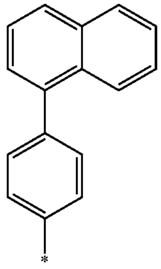 | 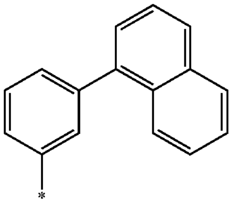 |
| 2-B1-53 | 1 | 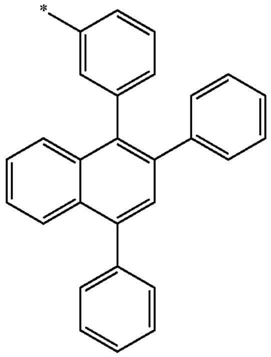 [SMILES: *c1cccc(-c2c(-c3ccccc3)cc(-c3ccccc3)c3ccccc23)c1] | 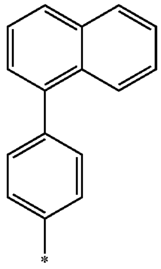 | 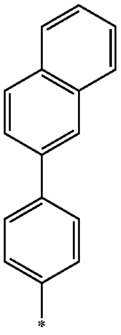 |

-continued
[Compound Group 1]
| | n | A—L—* | $Ar_1$ | $Ar_2$ |
|---|---|---|---|---|
| 2-B1-54 | 1 | 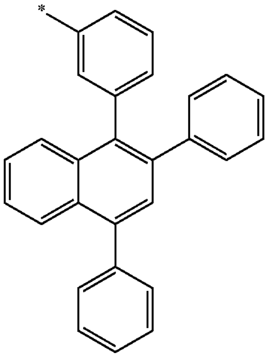 [SMILES: *c1cccc(-c2c(-c3ccccc3)cc(-c3ccccc3)c3ccccc23)c1] | 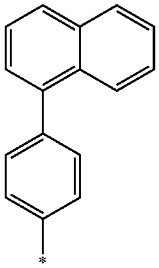 | 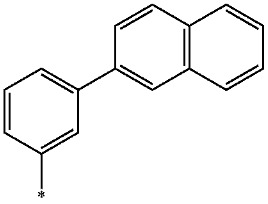 |
| 2-B1-55 | 1 | 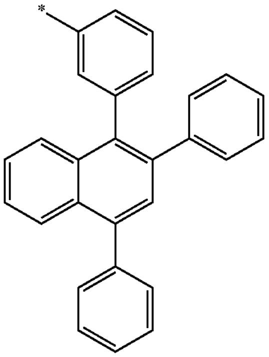 [SMILES: *c1cccc(-c2c(-c3ccccc3)cc(-c3ccccc3)c3ccccc23)c1] | 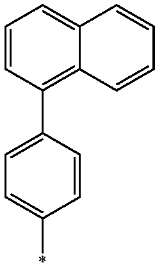 | 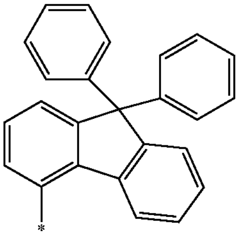 |
| 2-B1-56 | 1 | 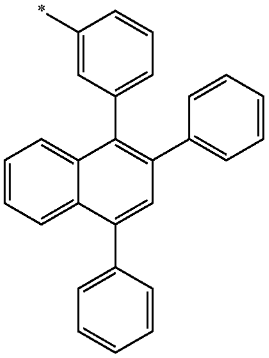 [SMILES: *c1cccc(-c2c(-c3ccccc3)cc(-c3ccccc3)c3ccccc23)c1] | 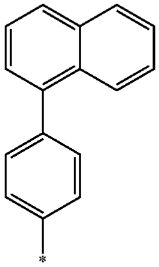 | 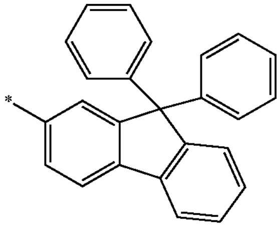 |
| 2-B1-57 | 1 | 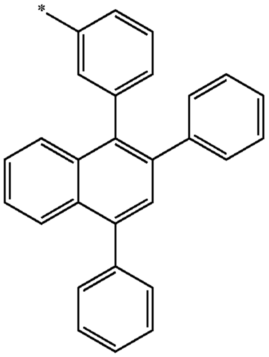 [SMILES: *c1cccc(-c2c(-c3ccccc3)cc(-c3ccccc3)c3ccccc23)c1] | 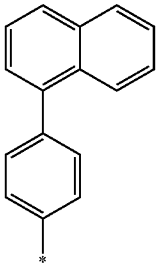 | 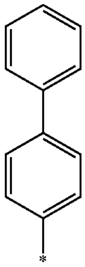 |

-continued
| [Compound Group 1] | | | | |
|---|---|---|---|---|
| | n | A—L—* | $Ar_1$ | $Ar_2$ |
| 2-B1-58 | 1 | 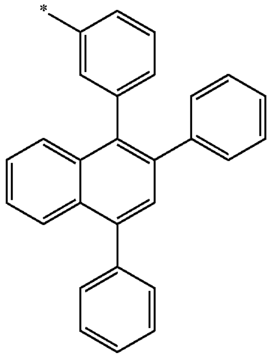 [SMILES: *c1cccc(-c2c(-c3ccccc3)cc(-c3ccccc3)c3ccccc23)c1] | 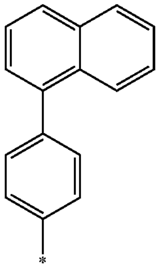 | 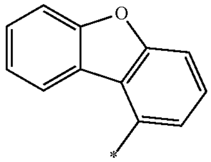 |
| 2-B1-59 | 1 | 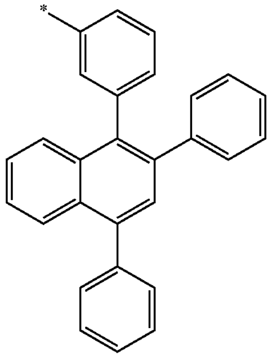 [SMILES: *c1cccc(-c2c(-c3ccccc3)cc(-c3ccccc3)c3ccccc23)c1] | 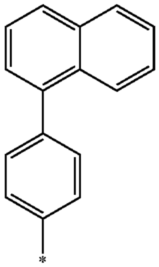 | 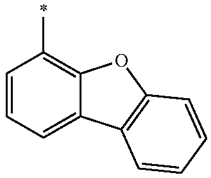 |
| 2-B1-60 | 1 | 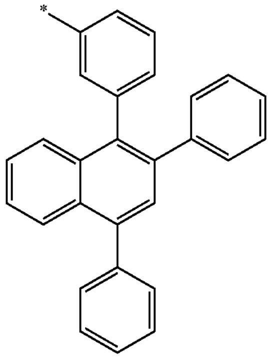 [SMILES: *c1cccc(-c2c(-c3ccccc3)cc(-c3ccccc3)c3ccccc23)c1] | 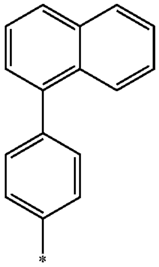 | 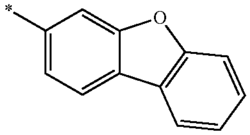 |
| 2-B1-61 | 1 | 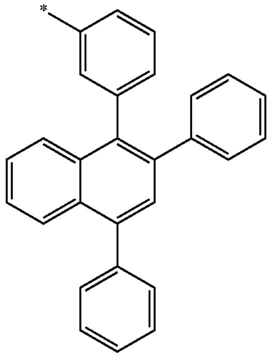 [SMILES: *c1cccc(-c2c(-c3ccccc3)cc(-c3ccccc3)c3ccccc23)c1] | 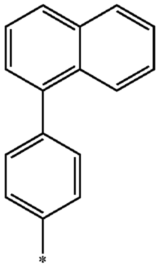 | 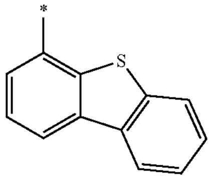 |

-continued
| [Compound Group 1] | | | | |
|---|---|---|---|---|
| | n | A—L—* | $Ar_1$ | $Ar_2$ |
| 2-B1-62 | 1 | 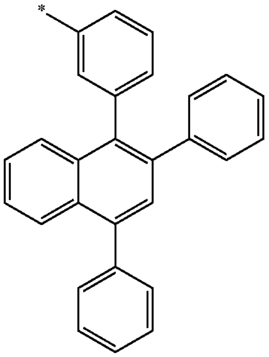 [SMILES: *c1cccc(-c2c(-c3ccccc3)cc(-c3ccccc3)c3ccccc23)c1] | 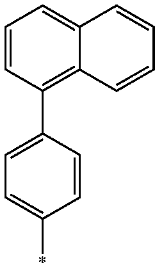 | 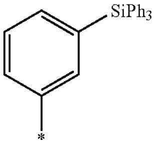 |
| 2-B1-63 | 1 | 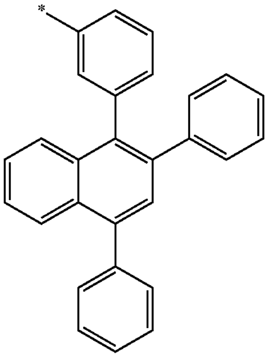 [SMILES: *c1cccc(-c2c(-c3ccccc3)cc(-c3ccccc3)c3ccccc23)c1] | 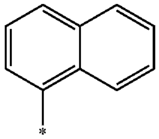 | 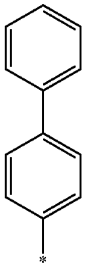 |
| 2-B1-64 | 1 | 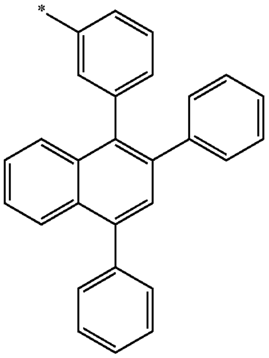 [SMILES: *c1cccc(-c2c(-c3ccccc3)cc(-c3ccccc3)c3ccccc23)c1] | 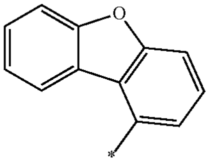 | 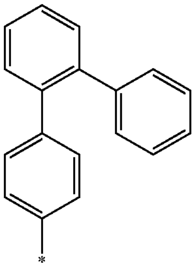 |
| 2-B1-65 | 1 | 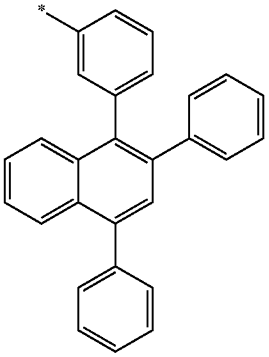 [SMILES: *c1cccc(-c2c(-c3ccccc3)cc(-c3ccccc3)c3ccccc23)c1] | 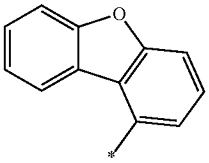 | 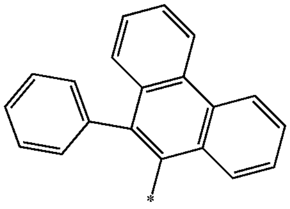 |

-continued
[Compound Group 1]
| | n | A—L—* | $Ar_1$ | $Ar_2$ |
|---|---|---|---|---|
| 2-B1-66 | 1 | 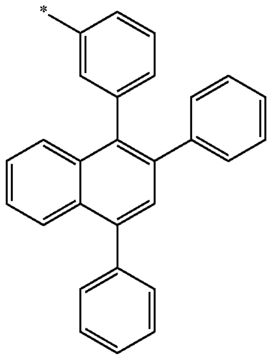 [SMILES: *c1cccc(-c2c(-c3ccccc3)cc(-c3ccccc3)c3ccccc23)c1] | 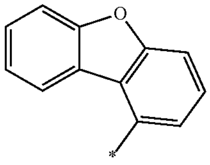 | 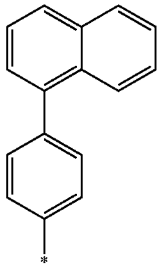 |
| 2-B1-67 | 1 | 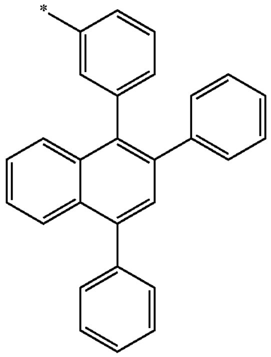 [SMILES: *c1cccc(-c2c(-c3ccccc3)cc(-c3ccccc3)c3ccccc23)c1] | 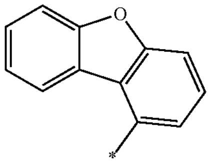 | 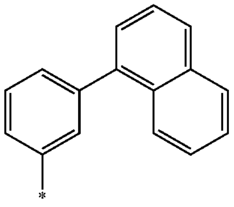 |
| 2-B1-68 | 1 | 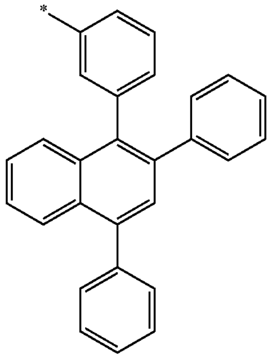 [SMILES: *c1cccc(-c2c(-c3ccccc3)cc(-c3ccccc3)c3ccccc23)c1] | 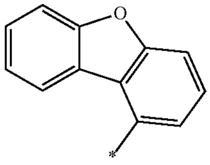 | 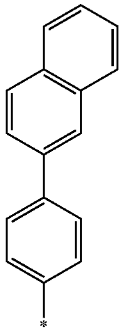 |
| 2-B1-69 | 1 | 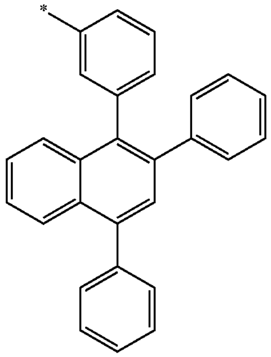 [SMILES: *c1cccc(-c2c(-c3ccccc3)cc(-c3ccccc3)c3ccccc23)c1] | 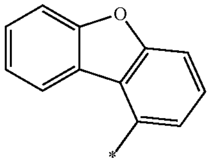 | 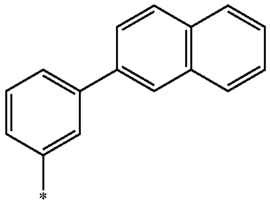 |

-continued
[Compound Group 1]
| | n | A—L—* | $Ar_1$ | $Ar_2$ |
|---|---|---|---|---|
| 2-B1-70 | 1 | 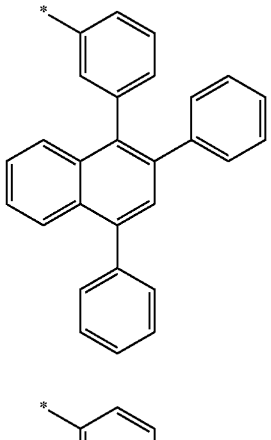 | 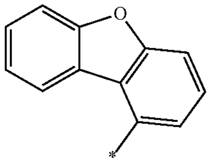 | 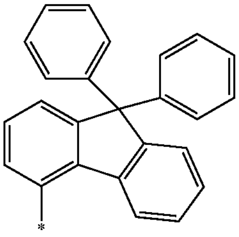 |
| 2-B1-71 | 1 | 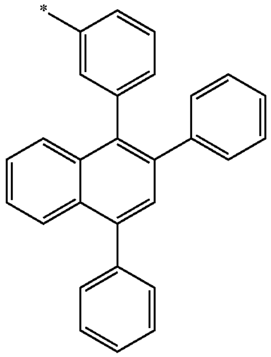 [SMILES: *c1cccc(-c2c(-c3ccccc3)cc(-c3ccccc3)c3ccccc23)c1] | 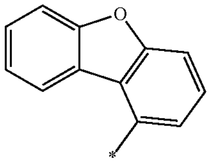 | 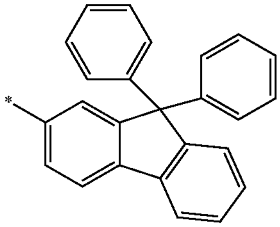 |
| 2-B1-72 | 1 | 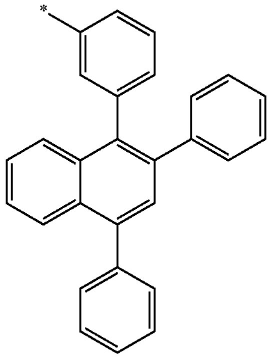 [SMILES: *c1cccc(-c2c(-c3ccccc3)cc(-c3ccccc3)c3ccccc23)c1] | 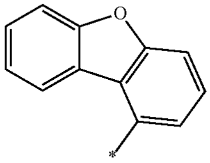 | 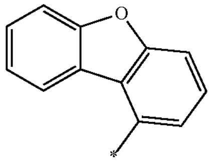 |
| 2-B1-73 | 1 | 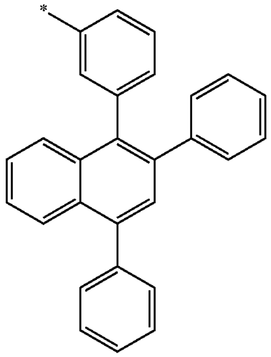 [SMILES: *c1cccc(-c2c(-c3ccccc3)cc(-c3ccccc3)c3ccccc23)c1] | 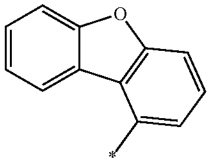 | 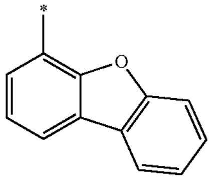 [SMILES: *c1cccc2c1oc1ccccc12] |

-continued
[Compound Group 1]
| | n | A—L—* | $Ar_1$ | $Ar_2$ |
|---|---|---|---|---|
| 2-B1-74 | 1 | 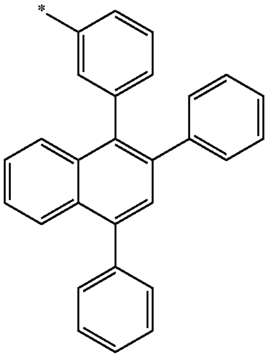 [SMILES: *c1cccc(-c2c(-c3ccccc3)cc(-c3ccccc3)c3ccccc23)c1] | 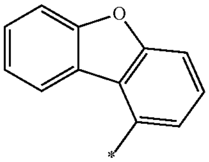 | 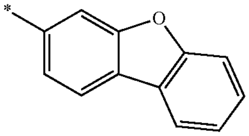 [SMILES: *c1ccc2c(c1)oc1ccccc12] |
| 2-B1-75 | 1 | 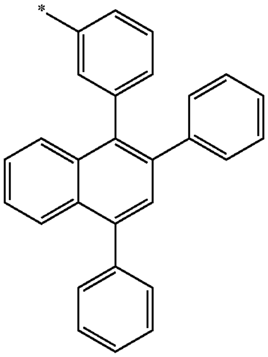 [SMILES: *c1cccc(-c2c(-c3ccccc3)cc(-c3ccccc3)c3ccccc23)c1] | 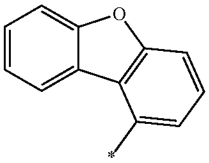 | 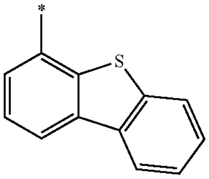 |
| 2-B1-76 | 1 | 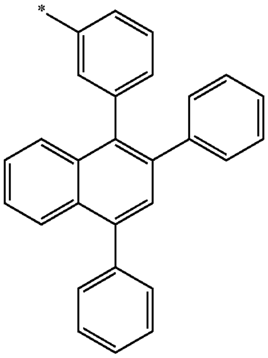 [SMILES: *c1cccc(-c2c(-c3ccccc3)cc(-c3ccccc3)c3ccccc23)c1] | 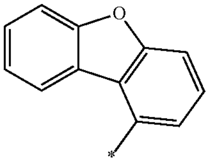 | 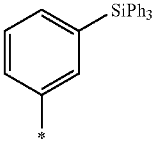 |
| 2-B1-77 | 1 | 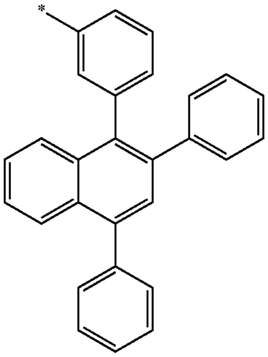 [SMILES: *c1cccc(-c2c(-c3ccccc3)cc(-c3ccccc3)c3ccccc23)c1] | 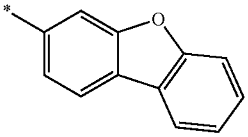 [SMILES: *c1ccc2c(c1)oc1ccccc12] | 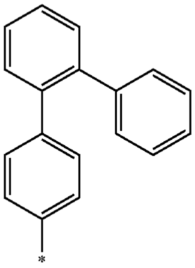 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 2-B1-78 | 1 | 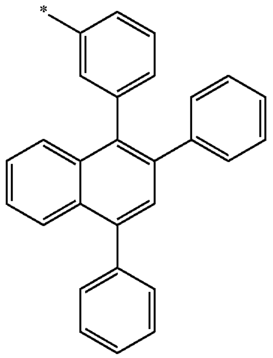 [SMILES: *c1cccc(-c2c(-c3ccccc3)cc(-c3ccccc3)c3ccccc23)c1] | 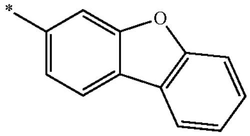 [SMILES: *c1ccc2c(c1)oc1ccccc12] | 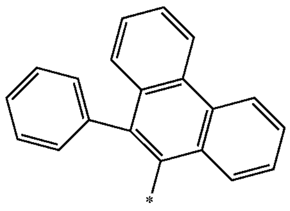 [SMILES: *c1c(-c2ccccc2)c2ccccc2c2ccccc12] |
| 2-B1-79 | 1 | 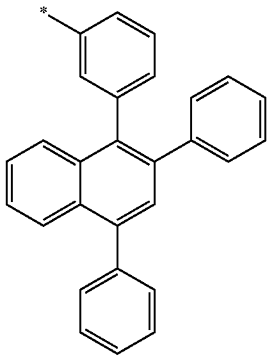 [SMILES: *c1cccc(-c2c(-c3ccccc3)cc(-c3ccccc3)c3ccccc23)c1] | 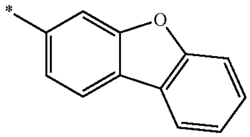 [SMILES: *c1ccc2c(c1)oc1ccccc12] | 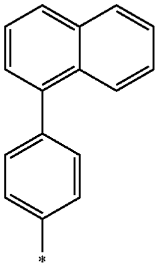 [SMILES: *c1ccc(-c2cccc3ccccc23)cc1] |
| 2-B1-80 | 1 | 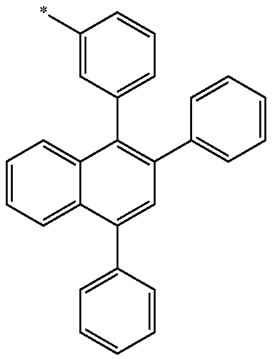 [SMILES: *c1cccc(-c2c(-c3ccccc3)cc(-c3ccccc3)c3ccccc23)c1] | 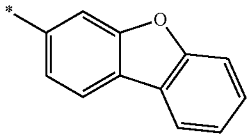 [SMILES: *c1ccc2c(c1)oc1ccccc12] | 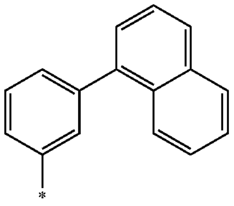 [SMILES: *c1cccc(-c2cccc3ccccc23)c1] |
| 2-B1-81 | 1 | 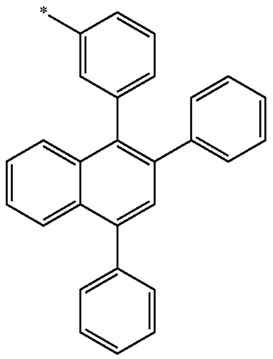 [SMILES: *c1cccc(-c2c(-c3ccccc3)cc(-c3ccccc3)c3ccccc23)c1] | 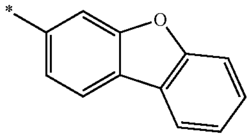 [SMILES: *c1ccc2c(c1)oc1ccccc12] | 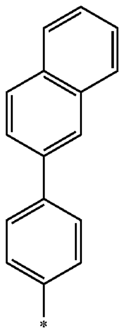 [SMILES: *c1ccc(-c2ccc3ccccc3c2)cc1] |

-continued
[Compound Group 1]
| | n | A—L—* | $Ar_1$ | $Ar_2$ |
|---|---|---|---|---|
| 2-B1-82 | 1 | 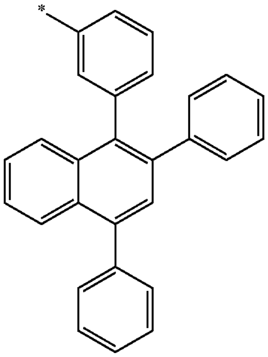 [SMILES: *c1cccc(-c2c(-c3ccccc3)cc(-c3ccccc3)c3ccccc23)c1] | 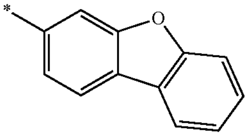 [SMILES: *c1ccc2c(c1)oc1ccccc12] | 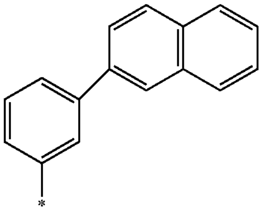 [SMILES: *c1cccc(-c2ccc3ccccc3c2)c1] |
| 2-B1-83 | 1 | 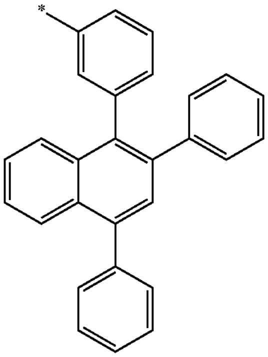 [SMILES: *c1cccc(-c2c(-c3ccccc3)cc(-c3ccccc3)c3ccccc23)c1] | 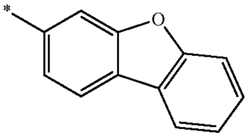 [SMILES: *c1ccc2c(c1)oc1ccccc12] | 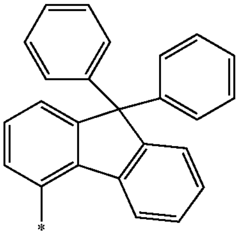 |
| 2-B1-84 | 1 | 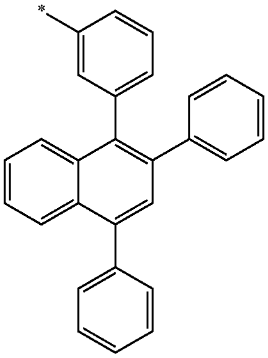 [SMILES: *c1cccc(-c2c(-c3ccccc3)cc(-c3ccccc3)c3ccccc23)c1] | 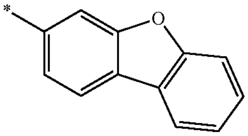 [SMILES: *c1ccc2c(c1)oc1ccccc12] | 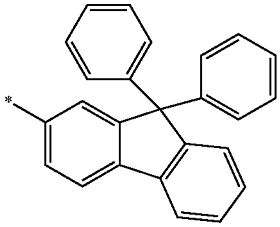 |
| 2-B1-85 | 1 | 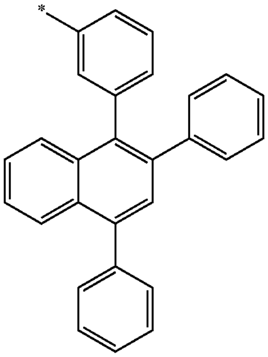 [SMILES: *c1cccc(-c2c(-c3ccccc3)cc(-c3ccccc3)c3ccccc23)c1] | 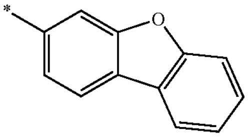 [SMILES: *c1ccc2c(c1)oc1ccccc12] | 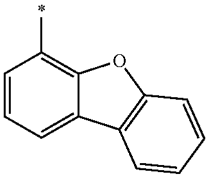 |

-continued
[Compound Group 1]
| | n | A—L—* | $Ar_1$ | $Ar_2$ |
|---|---|---|---|---|
| 2-B1-86 | 1 | 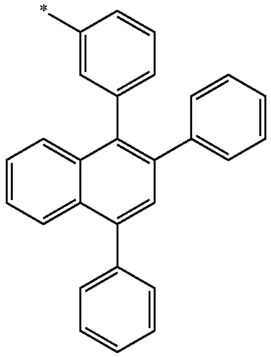 [SMILES: *c1cccc(-c2c(-c3ccccc3)cc(-c3ccccc3)c3ccccc23)c1] | 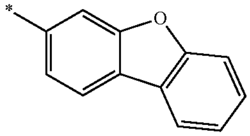 [SMILES: *c1ccc2c(c1)oc1ccccc12] | 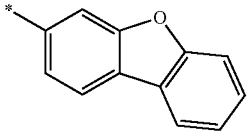 |
| 2-B1-87 | 1 | 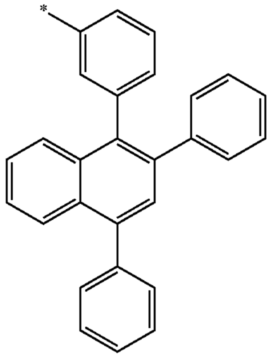 [SMILES: *c1cccc(-c2c(-c3ccccc3)cc(-c3ccccc3)c3ccccc23)c1] | 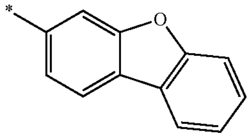 [SMILES: *c1ccc2c(c1)oc1ccccc12] | 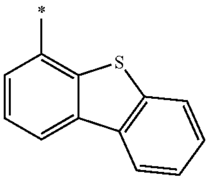 |
| 2-B1-88 | 1 | 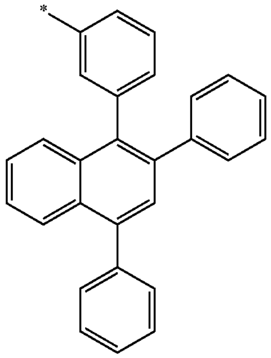 [SMILES: *c1cccc(-c2c(-c3ccccc3)cc(-c3ccccc3)c3ccccc23)c1] | 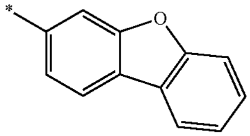 [SMILES: *c1ccc2c(c1)oc1ccccc12] | 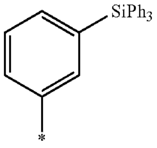 |
| 2-B1-89 | 1 | 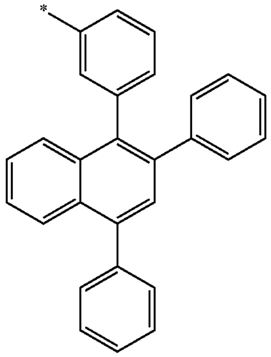 [SMILES: *c1cccc(-c2c(-c3ccccc3)cc(-c3ccccc3)c3ccccc23)c1] | 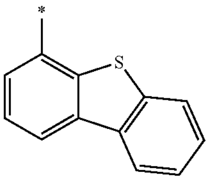 | 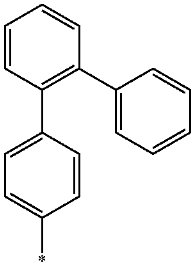 |

-continued
| [Compound Group 1] | | | | |
|---|---|---|---|---|
| | n | A—L—* | $Ar_1$ | $Ar_2$ |
| 2-B1-90 | 1 | 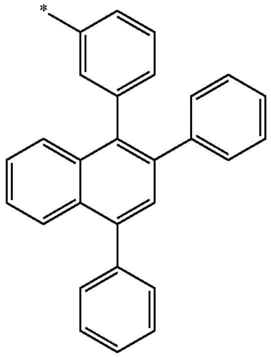 [SMILES: *c1cccc(-c2c(-c3ccccc3)cc(-c3ccccc3)c3ccccc23)c1] | 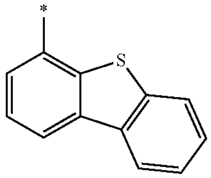 | 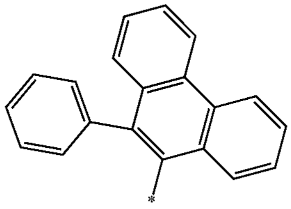 |
| 2-B1-91 | 1 | 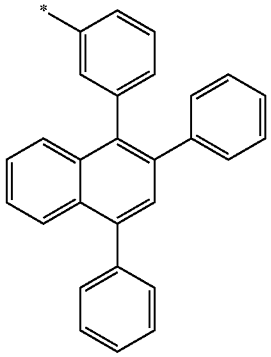 [SMILES: *c1cccc(-c2c(-c3ccccc3)cc(-c3ccccc3)c3ccccc23)c1] | 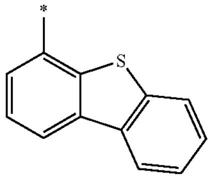 | 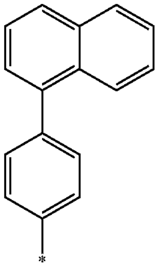 |
| 2-B1-92 | 1 | 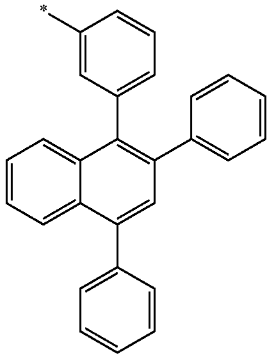 [SMILES: *c1cccc(-c2c(-c3ccccc3)cc(-c3ccccc3)c3ccccc23)c1] | 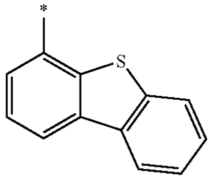 | 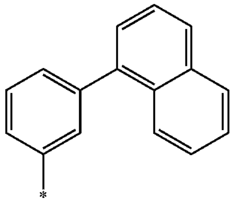 |
| 2-B1-93 | 1 | 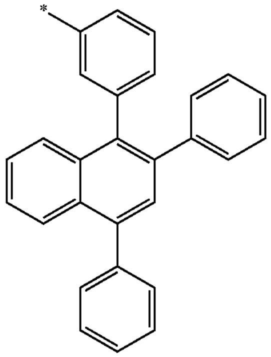 [SMILES: *c1cccc(-c2c(-c3ccccc3)cc(-c3ccccc3)c3ccccc23)c1] | 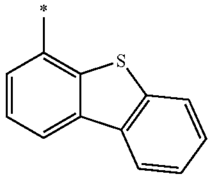 | 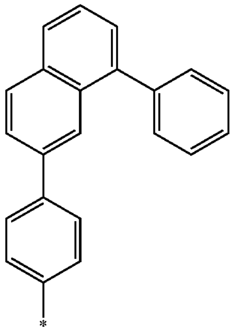 |

-continued
[Compound Group 1]
| | n | A—L—* | $Ar_1$ | $Ar_2$ |
|---|---|---|---|---|
| 2-B1-94 | 1 | 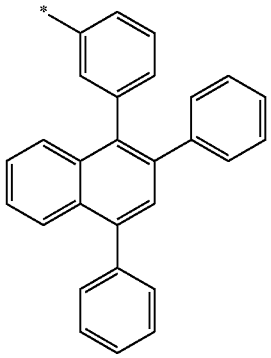 [SMILES: *c1cccc(-c2c(-c3ccccc3)cc(-c3ccccc3)c3ccccc23)c1] | 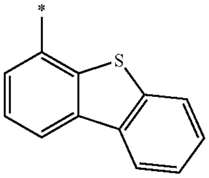 | 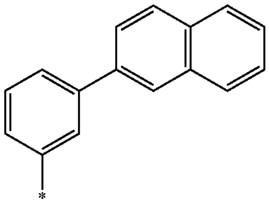 |
| 2-B1-95 | 1 | 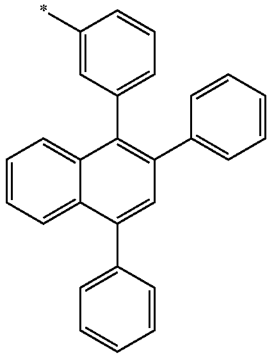 [SMILES: *c1cccc(-c2c(-c3ccccc3)cc(-c3ccccc3)c3ccccc23)c1] | 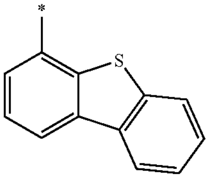 | 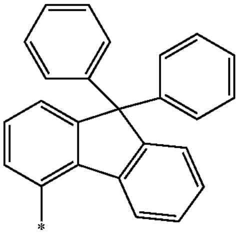 |
| 2-B1-96 | 1 | 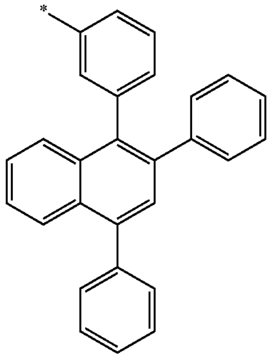 [SMILES: *c1cccc(-c2c(-c3ccccc3)cc(-c3ccccc3)c3ccccc23)c1] | 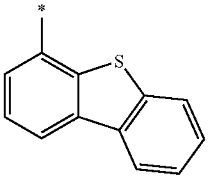 | 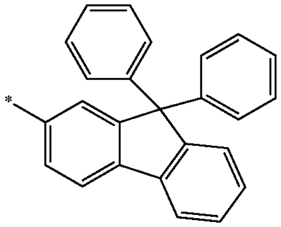 |
| 2-B1-97 | 1 | 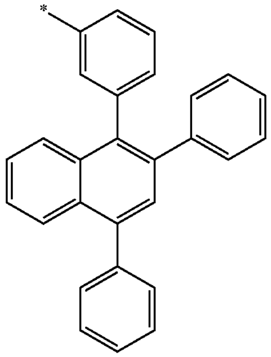 [SMILES: *c1cccc(-c2c(-c3ccccc3)cc(-c3ccccc3)c3ccccc23)c1] | 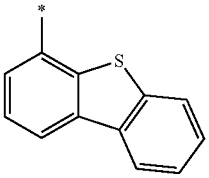 | 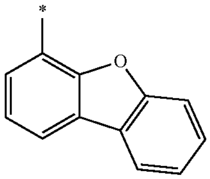 |

-continued
[Compound Group 1]
| | n | A—L—* | $Ar_1$ | $Ar_2$ |
|---|---|---|---|---|
| 2-B1-98 | 1 | 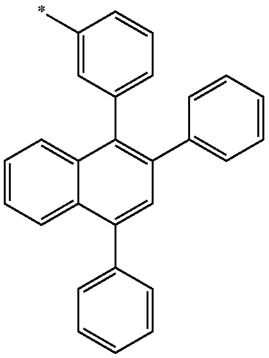 [SMILES: *c1cccc(-c2c(-c3ccccc3)cc(-c3ccccc3)c3ccccc23)c1] | 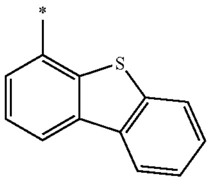 | 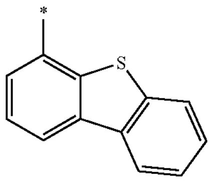 |
| 2-B1-99 | 1 | 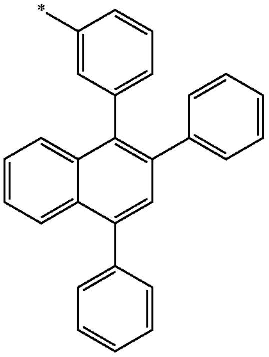 [SMILES: *c1cccc(-c2c(-c3ccccc3)cc(-c3ccccc3)c3ccccc23)c1] | 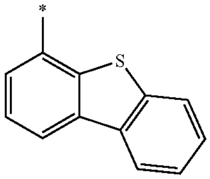 | 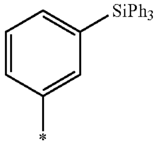 |
| 3-B1-1 | 1 | 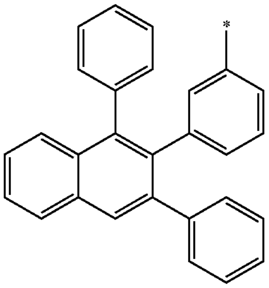 [SMILES: *c1cccc(-c2c(-c3ccccc3)cc3ccccc3c2-c2ccccc2)c1] | 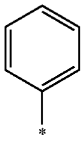 | 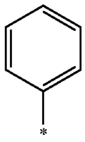 |
| 3-B1-2 | 1 | 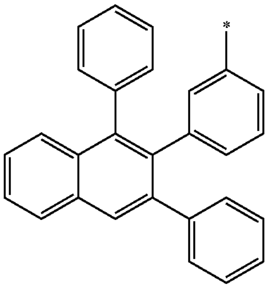 [SMILES: *c1cccc(-c2c(-c3ccccc3)cc3ccccc3c2-c2ccccc2)c1] | 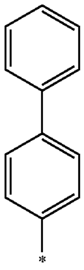 [SMILES: *c1ccc(-c2ccccc2)cc1] | 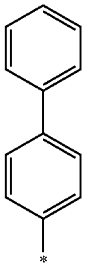 [SMILES: *c1ccc(-c2ccccc2)cc1] |

-continued
[Compound Group 1]
| | n | A—L—* | $Ar_1$ | $Ar_2$ |
|---|---|---|---|---|
| 3-B1-3 | 1 | 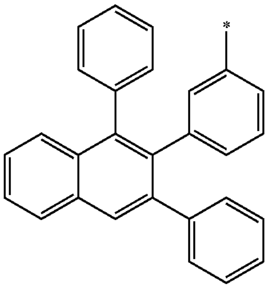 [SMILES: *c1cccc(-c2c(-c3ccccc3)cc3ccccc3c2-c2ccccc2)c1] | 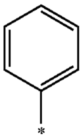 | 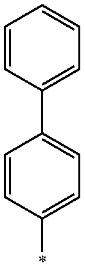 [SMILES: *c1ccc(-c2ccccc2)cc1] |
| 3-B1-4 | 1 | 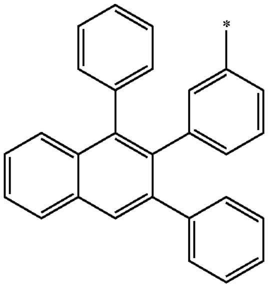 [SMILES: *c1cccc(-c2c(-c3ccccc3)cc3ccccc3c2-c2ccccc2)c1] | 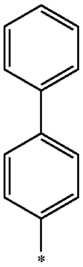 [SMILES: *c1ccc(-c2ccccc2)cc1] | 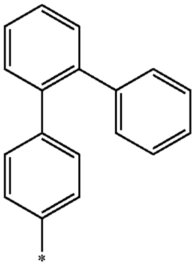 [SMILES: *c1ccc(-c2ccccc2-c2ccccc2)cc1] |
| 3-B1-5 | 1 | 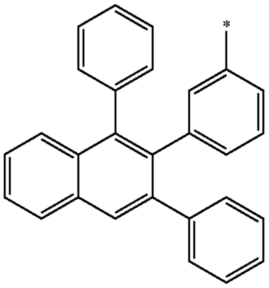 [SMILES: *c1cccc(-c2c(-c3ccccc3)cc3ccccc3c2-c2ccccc2)c1] | 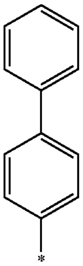 [SMILES: *c1ccc(-c2ccccc2)cc1] | 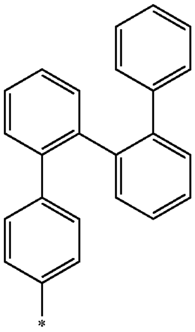 [SMILES: *c1ccc(-c2ccccc2-c2ccccc2-c2ccccc2)cc1] |
| 3-B1-6 | 1 | 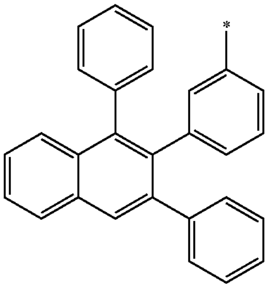 [SMILES: *c1cccc(-c2c(-c3ccccc3)cc3ccccc3c2-c2ccccc2)c1] | 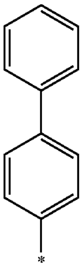 [SMILES: *c1ccc(-c2ccccc2)cc1] | 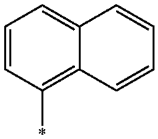 |
| 3-B1-7 | 1 | 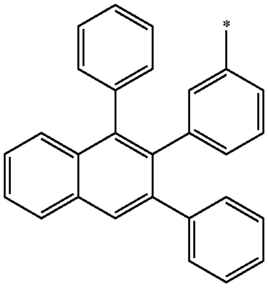 [SMILES: *c1cccc(-c2c(-c3ccccc3)cc3ccccc3c2-c2ccccc2)c1] | 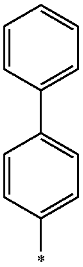 [SMILES: *c1ccc(-c2ccccc2)cc1] | 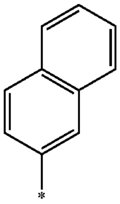 |

-continued
| [Compound Group 1] | | | | |
|---|---|---|---|---|
| | n | A—L—* | $Ar_1$ | $Ar_2$ |
| 3-B1-8 | 1 | 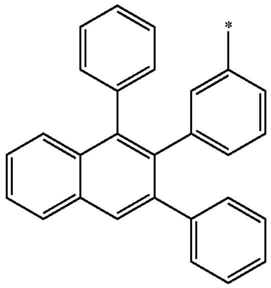 [SMILES: *c1cccc(-c2c(-c3ccccc3)cc3ccccc3c2-c2ccccc2)c1] | 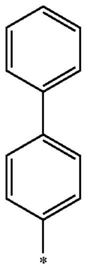 [SMILES: *c1ccc(-c2ccccc2)cc1] | 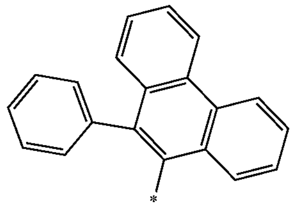 [SMILES: *c1c(-c2ccccc2)c2ccccc2c2ccccc12] |
| 3-B1-9 | 1 | 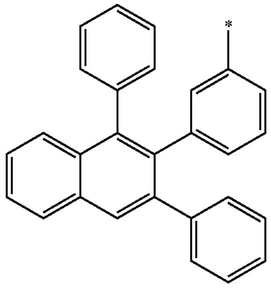 [SMILES: *c1cccc(-c2c(-c3ccccc3)cc3ccccc3c2-c2ccccc2)c1] | 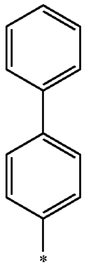 [SMILES: *c1ccc(-c2ccccc2)cc1] | 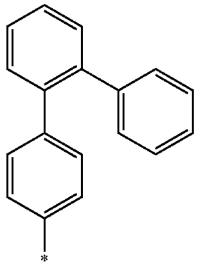 [SMILES: *c1ccc(-c2ccccc2-c2ccccc2)cc1] |
| 3-B1-10 | 1 | 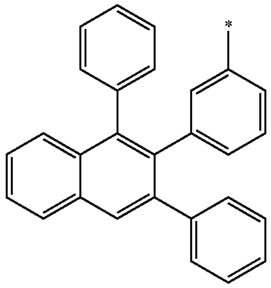 [SMILES: *c1cccc(-c2c(-c3ccccc3)cc3ccccc3c2-c2ccccc2)c1] | 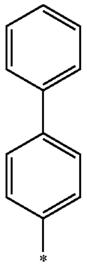 [SMILES: *c1ccc(-c2ccccc2)cc1] | 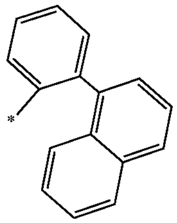 [SMILES: *c1ccccc1-c1cccc2ccccc12] |
| 3-B1-11 | 1 | 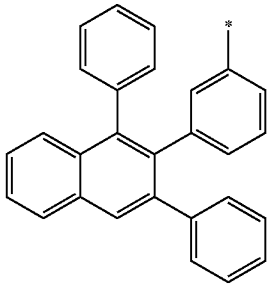 [SMILES: *c1cccc(-c2c(-c3ccccc3)cc3ccccc3c2-c2ccccc2)c1] | 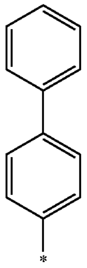 [SMILES: *c1ccc(-c2ccccc2)cc1] | 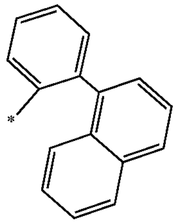 [SMILES: *c1ccccc1-c1cccc2ccccc12] |
| 3-B1-12 | 1 | 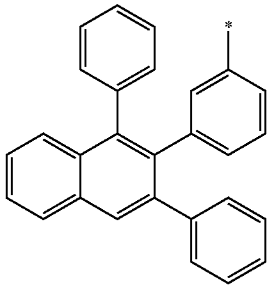 [SMILES: *c1cccc(-c2c(-c3ccccc3)cc3ccccc3c2-c2ccccc2)c1] | 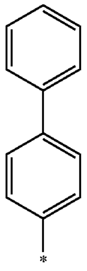 [SMILES: *c1ccc(-c2ccccc2)cc1] | 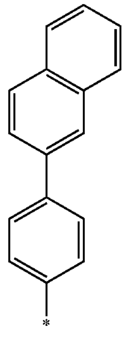 |

-continued
[Compound Group 1]
| | n | A—L—* | $Ar_1$ | $Ar_2$ |
|---|---|---|---|---|
| 3-B1-13 | 1 | 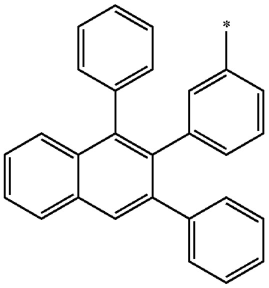 [SMILES: *c1cccc(-c2c(-c3ccccc3)cc3ccccc3c2-c2ccccc2)c1] | 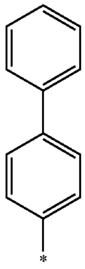 [SMILES: *c1ccc(-c2ccccc2)cc1] | 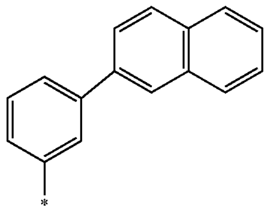 [SMILES: *c1cccc(-c2ccc3ccccc3c2)c1] |
| 3-B1-14 | 1 | 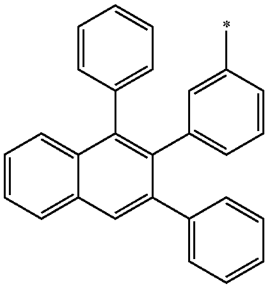 [SMILES: *c1cccc(-c2c(-c3ccccc3)cc3ccccc3c2-c2ccccc2)c1] | 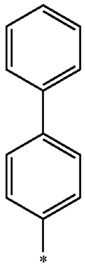 [SMILES: *c1ccc(-c2ccccc2)cc1] | 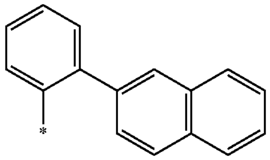 [SMILES: *c1ccccc1-c1ccc2ccccc2c1] |
| 3-B1-15 | 1 | 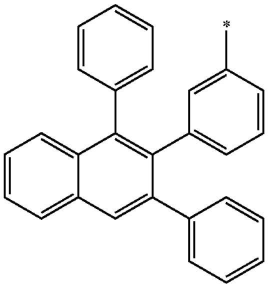 [SMILES: *c1cccc(-c2c(-c3ccccc3)cc3ccccc3c2-c2ccccc2)c1] | 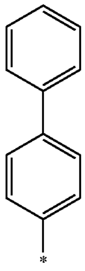 [SMILES: *c1ccc(-c2ccccc2)cc1] | 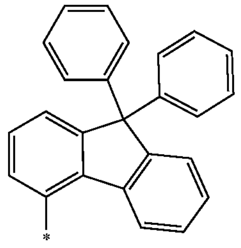 [SMILES: *c1cccc2c1-c1ccccc1C2(c1ccccc1)c1ccccc1] |
| 3-B1-16 | 1 | 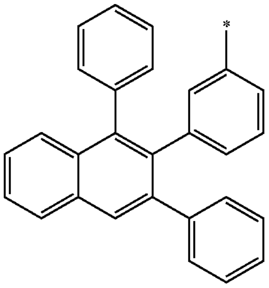 [SMILES: *c1cccc(-c2c(-c3ccccc3)cc3ccccc3c2-c2ccccc2)c1] | 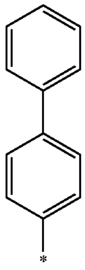 [SMILES: *c1ccc(-c2ccccc2)cc1] | 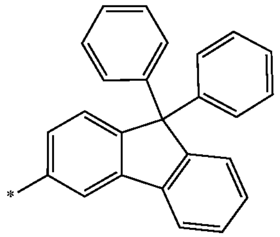 [SMILES: *c1ccc2c(c1)-c1ccccc1C2(c1ccccc1)c1ccccc1] |
| 3-B1-17 | 1 | 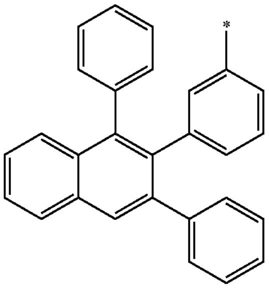 [SMILES: *c1cccc(-c2c(-c3ccccc3)cc3ccccc3c2-c2ccccc2)c1] | 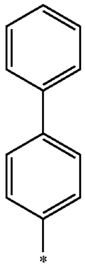 [SMILES: *c1ccc(-c2ccccc2)cc1] | 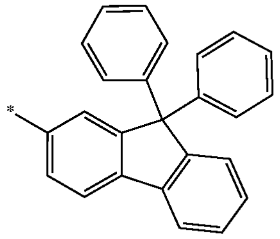 [SMILES: *c1ccc2c(c1)C(c1ccccc1)(c1ccccc1)c1ccccc1-2] |

-continued
| [Compound Group 1] | | | | |
|---|---|---|---|---|
| | n | A—L—* | $Ar_1$ | $Ar_2$ |
| 3-B1-18 | 1 | 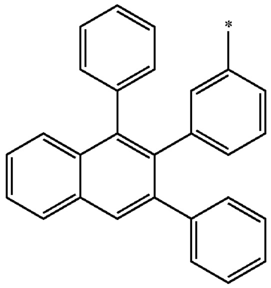 [SMILES: *c1cccc(-c2c(-c3ccccc3)cc3ccccc3c2-c2ccccc2)c1] | 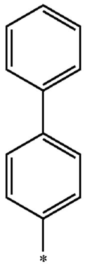 [SMILES: *c1ccc(-c2ccccc2)cc1] | 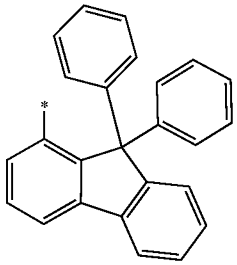 [SMILES: *c1cccc2c1C(c1ccccc1)(c1ccccc1)c1ccccc1-2] |
| 3-B1-19 | 1 | 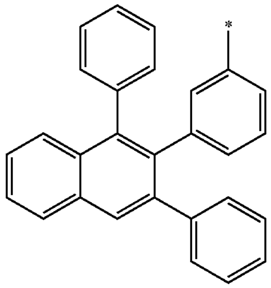 [SMILES: *c1cccc(-c2c(-c3ccccc3)cc3ccccc3c2-c2ccccc2)c1] | 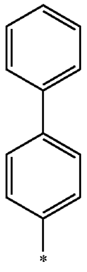 [SMILES: *c1ccc(-c2ccccc2)cc1] | 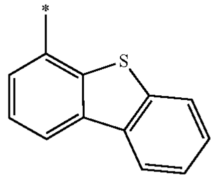 [SMILES: *c1cccc2c1sc1ccccc12] |
| 3-B1-20 | 1 | 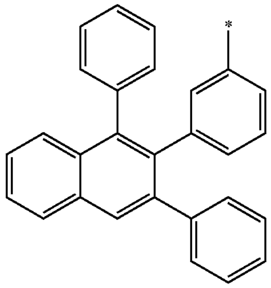 [SMILES: *c1cccc(-c2c(-c3ccccc3)cc3ccccc3c2-c2ccccc2)c1] | 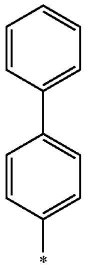 [SMILES: *c1ccc(-c2ccccc2)cc1] | 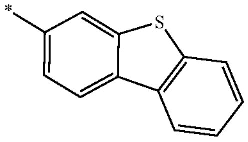 [SMILES: *c1ccc2c(c1)sc1ccccc12] |
| 3-B1-21 | 1 | 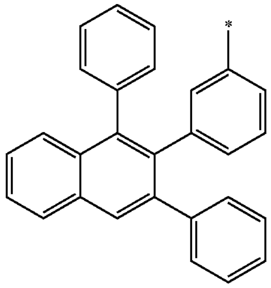 [SMILES: *c1cccc(-c2c(-c3ccccc3)cc3ccccc3c2-c2ccccc2)c1] | 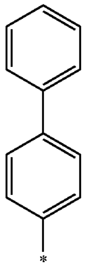 [SMILES: *c1ccc(-c2ccccc2)cc1] | 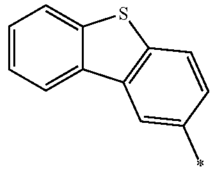 |
| 3-B1-22 | 1 | 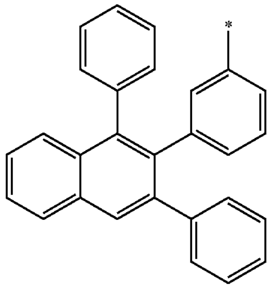 [SMILES: *c1cccc(-c2c(-c3ccccc3)cc3ccccc3c2-c2ccccc2)c1] | 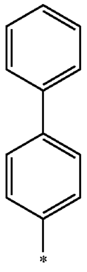 [SMILES: *c1ccc(-c2ccccc2)cc1] | 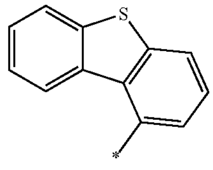 |

-continued
[Compound Group 1]
| | n | A—L—* | $Ar_1$ | $Ar_2$ |
|---|---|---|---|---|
| 3-B1-23 | 1 | 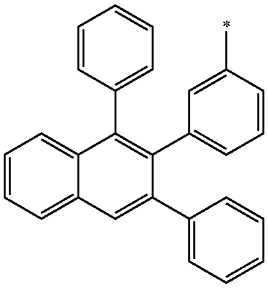 [SMILES: *c1cccc(-c2c(-c3ccccc3)cc3ccccc3c2-c2ccccc2)c1] | 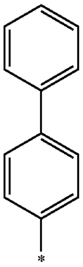 [SMILES: *c1ccc(-c2ccccc2)cc1] | 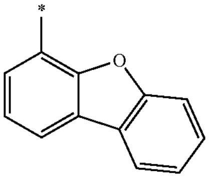 |
| 3-B1-24 | 1 | 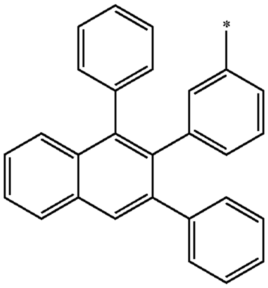 [SMILES: *c1cccc(-c2c(-c3ccccc3)cc3ccccc3c2-c2ccccc2)c1] | 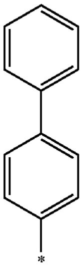 [SMILES: *c1ccc(-c2ccccc2)cc1] | 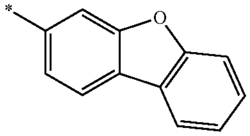 |
| 3-B1-25 | 1 | 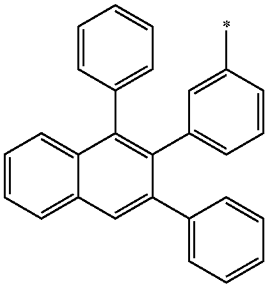 [SMILES: *c1cccc(-c2c(-c3ccccc3)cc3ccccc3c2-c2ccccc2)c1] | 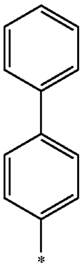 [SMILES: *c1ccc(-c2ccccc2)cc1] | 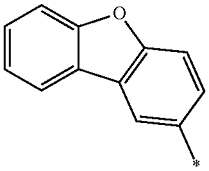 |
| 3-B1-26 | 1 | 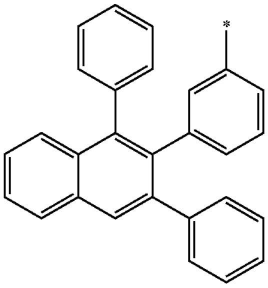 [SMILES: *c1cccc(-c2c(-c3ccccc3)cc3ccccc3c2-c2ccccc2)c1] | 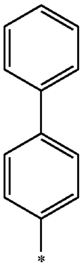 [SMILES: *c1ccc(-c2ccccc2)cc1] | 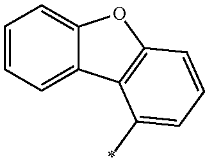 |
| 3-B1-27 | 1 | 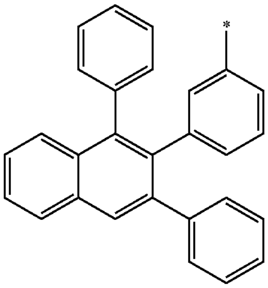 [SMILES: *c1cccc(-c2c(-c3ccccc3)cc3ccccc3c2-c2ccccc2)c1] | 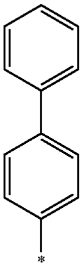 [SMILES: *c1ccc(-c2ccccc2)cc1] | 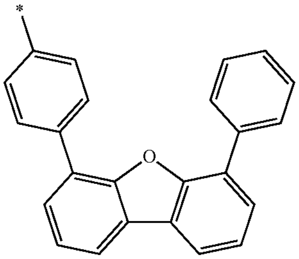 |

-continued
| [Compound Group 1] | | | | |
|---|---|---|---|---|
| | n | A—L—* | $Ar_1$ | $Ar_2$ |
| 3-B1-28 | 1 | 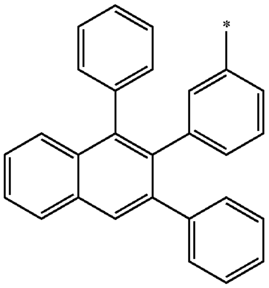 [SMILES: *c1cccc(-c2c(-c3ccccc3)cc3ccccc3c2-c2ccccc2)c1] | 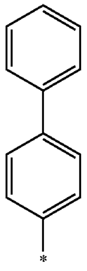 [SMILES: *c1ccc(-c2ccccc2)cc1] | 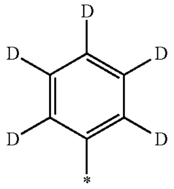 |
| 3-B1-29 | 1 | 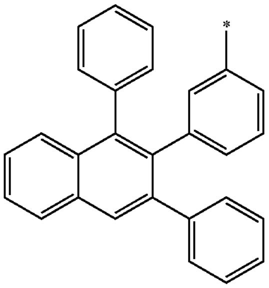 [SMILES: *c1cccc(-c2c(-c3ccccc3)cc3ccccc3c2-c2ccccc2)c1] | 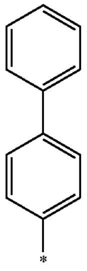 [SMILES: *c1ccc(-c2ccccc2)cc1] | 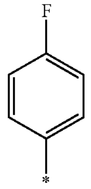 |
| 3-B1-30 | 1 | 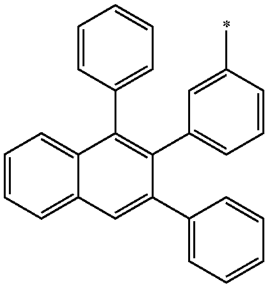 [SMILES: *c1cccc(-c2c(-c3ccccc3)cc3ccccc3c2-c2ccccc2)c1] | 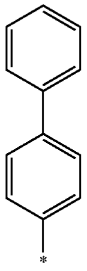 [SMILES: *c1ccc(-c2ccccc2)cc1] | 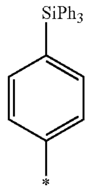 |
| 3-B1-31 | 1 | 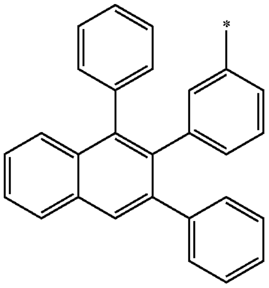 [SMILES: *c1cccc(-c2c(-c3ccccc3)cc3ccccc3c2-c2ccccc2)c1] | 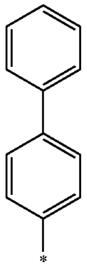 [SMILES: *c1ccc(-c2ccccc2)cc1] | 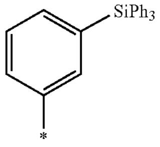 |
| 3-B1-32 | 1 | 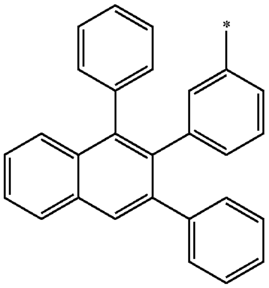 [SMILES: *c1cccc(-c2c(-c3ccccc3)cc3ccccc3c2-c2ccccc2)c1] | 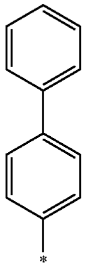 [SMILES: *c1ccc(-c2ccccc2)cc1] | 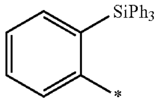 |

-continued
[Compound Group 1]
| | n | A—L—* | $Ar_1$ | $Ar_2$ |
|---|---|---|---|---|
| 3-B1-33 | 1 | 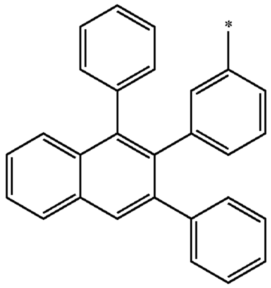 [SMILES: *c1cccc(-c2c(-c3ccccc3)cc3ccccc3c2-c2ccccc2)c1] | 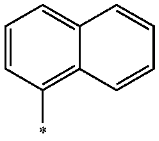 [SMILES: *c1cccc2ccccc12] | 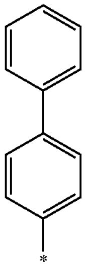 [SMILES: *c1ccc(-c2ccccc2)cc1] |
| 3-B1-34 | 1 | 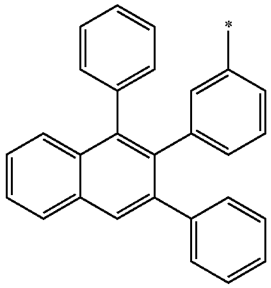 [SMILES: *c1cccc(-c2c(-c3ccccc3)cc3ccccc3c2-c2ccccc2)c1] | 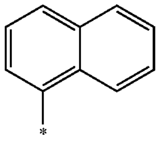 | 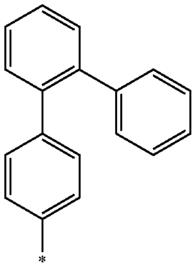 [SMILES: *c1ccc(-c2ccccc2-c2ccccc2)cc1] |
| 3-B1-35 | 1 | 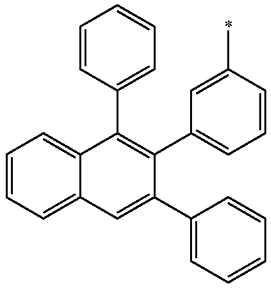 [SMILES: *c1cccc(-c2c(-c3ccccc3)cc3ccccc3c2-c2ccccc2)c1] | 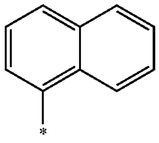 | 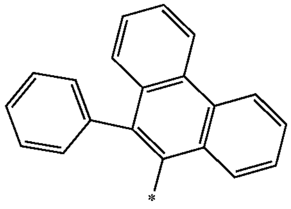 [SMILES: *c1c(-c2ccccc2)c2ccccc2c2ccccc12] |
| 3-B1-36 | 1 | 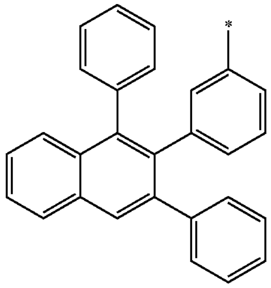 [SMILES: *c1cccc(-c2c(-c3ccccc3)cc3ccccc3c2-c2ccccc2)c1] | 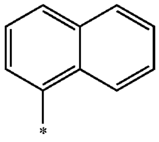 | 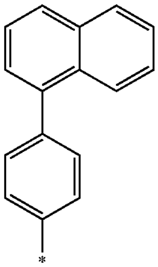 [SMILES: *c1ccc(-c2cccc3ccccc23)cc1] |
| 3-B1-37 | 1 | 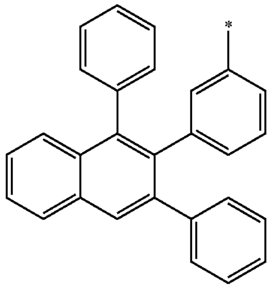 [SMILES: *c1cccc(-c2c(-c3ccccc3)cc3ccccc3c2-c2ccccc2)c1] | 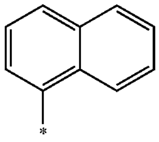 [SMILES: *c1cccc2ccccc12] | 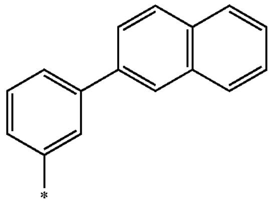 [SMILES: *c1cccc(-c2ccc3ccccc3c2)c1] |

-continued
| [Compound Group 1] | | | | |
|---|---|---|---|---|
| | n | A—L—* | $Ar_1$ | $Ar_2$ |
| 3-B1-38 | 1 | 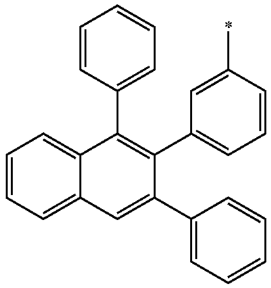 [SMILES: *c1cccc(-c2c(-c3ccccc3)cc3ccccc3c2-c2ccccc2)c1] | 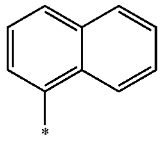 [SMILES: *c1cccc2ccccc12] | 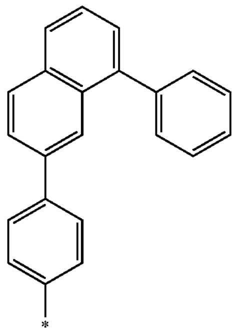 [SMILES: *c1ccc(-c2ccc3cccc(-c4ccccc4)c3c2)cc1] |
| 3-B1-39 | 1 | 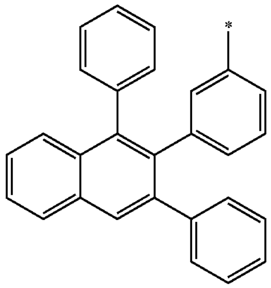 [SMILES: *c1cccc(-c2c(-c3ccccc3)cc3ccccc3c2-c2ccccc2)c1] | 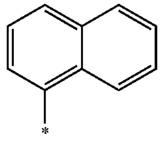 [SMILES: *c1cccc2ccccc12] | 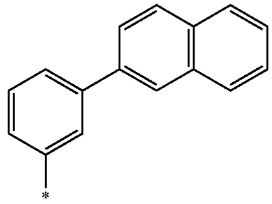 [SMILES: *c1cccc(-c2ccc3ccccc3c2)c1] |
| 3-B1-40 | 1 | 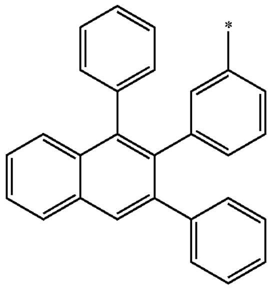 [SMILES: *c1cccc(-c2c(-c3ccccc3)cc3ccccc3c2-c2ccccc2)c1] | 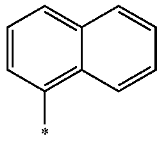 | 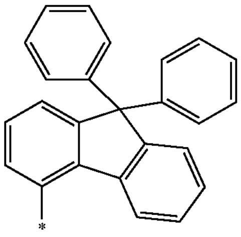 [SMILES: *c1cccc2c1-c1ccccc1C2(c1ccccc1)c1ccccc1] |
| 3-B1-41 | 1 | 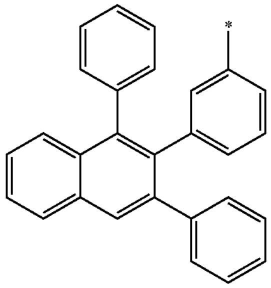 [SMILES: *c1cccc(-c2c(-c3ccccc3)cc3ccccc3c2-c2ccccc2)c1] | 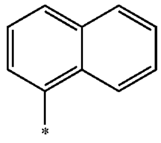 | 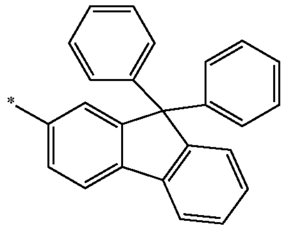 [SMILES: *c1ccc2c(c1)C(c1ccccc1)(c1ccccc1)c1ccccc1-2] |
| 3-B1-42 | 1 | 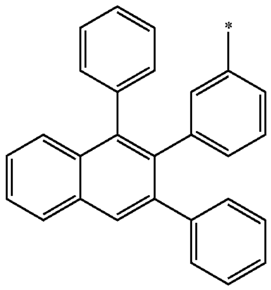 [SMILES: *c1cccc(-c2c(-c3ccccc3)cc3ccccc3c2-c2ccccc2)c1] | 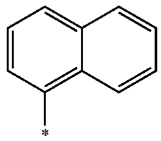 | 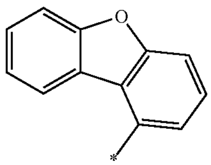 |

-continued
| [Compound Group 1] | | | | |
|---|---|---|---|---|
| | n | A—L—* | $Ar_1$ | $Ar_2$ |
| 3-B1-43 | 1 | 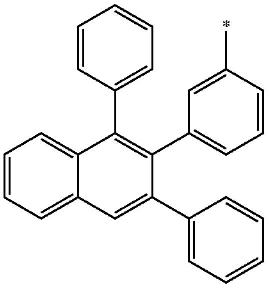 [SMILES: *c1cccc(-c2c(-c3ccccc3)cc3ccccc3c2-c2ccccc2)c1] | 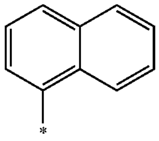 [SMILES: *c1cccc2ccccc12] | 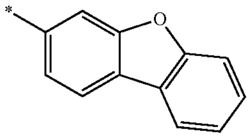 |
| 3-B1-44 | 1 | 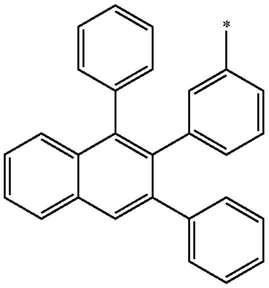 [SMILES: *c1cccc(-c2c(-c3ccccc3)cc3ccccc3c2-c2ccccc2)c1] | 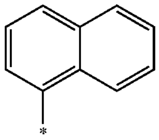 | 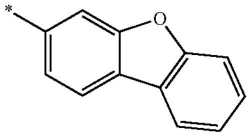 |
| 3-B1-45 | 1 | 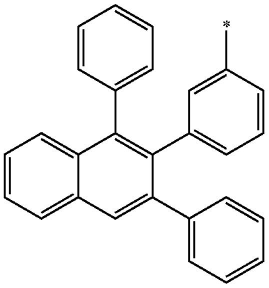 [SMILES: *c1cccc(-c2c(-c3ccccc3)cc3ccccc3c2-c2ccccc2)c1] | 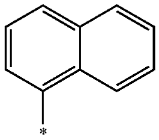 | 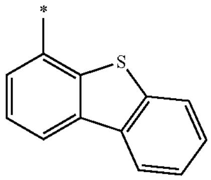 |
| 3-B1-46 | 1 | 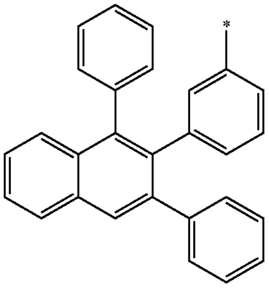 [SMILES: *c1cccc(-c2c(-c3ccccc3)cc3ccccc3c2-c2ccccc2)c1] | 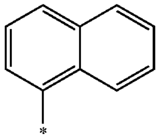 | 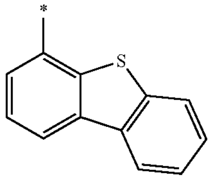 |
| 3-B1-47 | 1 | 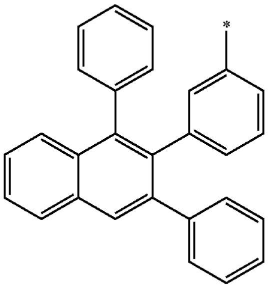 [SMILES: *c1cccc(-c2c(-c3ccccc3)cc3ccccc3c2-c2ccccc2)c1] | 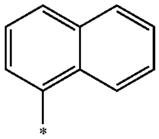 [SMILES: *c1cccc2ccccc12] | 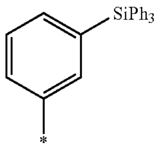 |

-continued
[Compound Group 1]
| | n | A—L—* | $Ar_1$ | $Ar_2$ |
|---|---|---|---|---|
| 3-B1-48 | 1 | 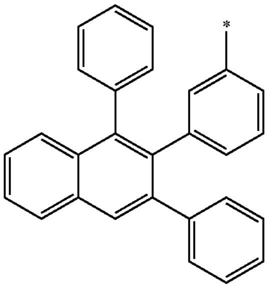 [SMILES: *c1cccc(-c2c(-c3ccccc3)cc3ccccc3c2-c2ccccc2)c1] | 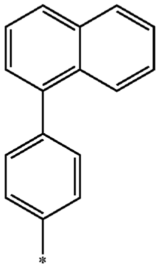 | 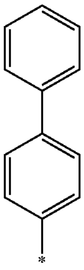 |
| 3-B1-49 | 1 | 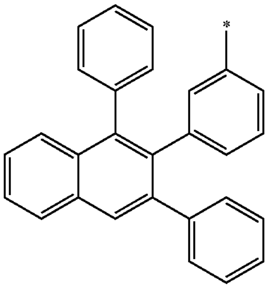 [SMILES: *c1cccc(-c2c(-c3ccccc3)cc3ccccc3c2-c2ccccc2)c1] | 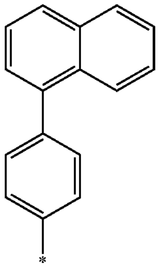 | 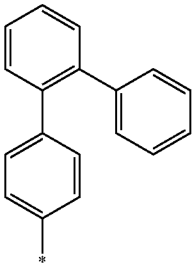 |
| 3-B1-50 | 1 | 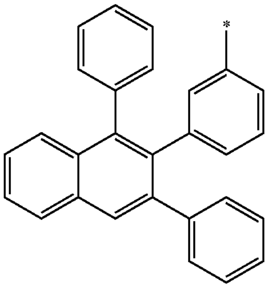 [SMILES: *c1cccc(-c2c(-c3ccccc3)cc3ccccc3c2-c2ccccc2)c1] | 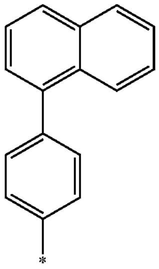 | 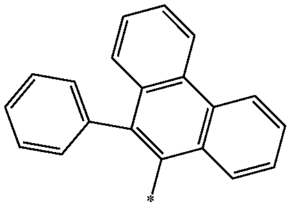 |
| 3-B1-51 | 1 | 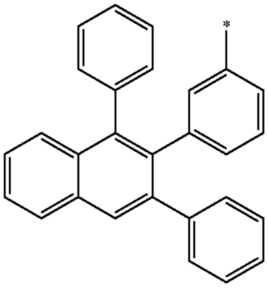 [SMILES: *c1cccc(-c2c(-c3ccccc3)cc3ccccc3c2-c2ccccc2)c1] | 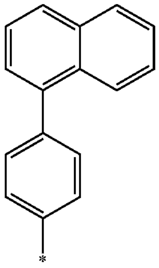 | 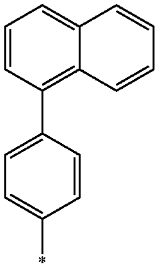 |
| 3-B1-52 | 1 | 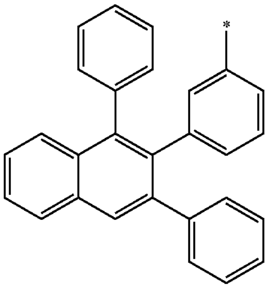 [SMILES: *c1cccc(-c2c(-c3ccccc3)cc3ccccc3c2-c2ccccc2)c1] | 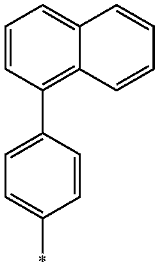 | 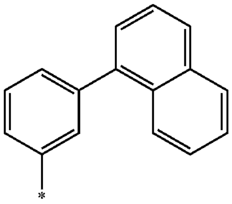 |

-continued
| [Compound Group 1] | | | | |
|---|---|---|---|---|
| | n | A—L—* | $Ar_1$ | $Ar_2$ |
| 3-B1-53 | 1 | 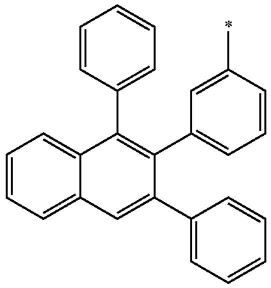 [SMILES: *c1cccc(-c2c(-c3ccccc3)cc3ccccc3c2-c2ccccc2)c1] | 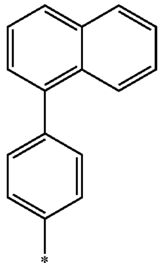 | 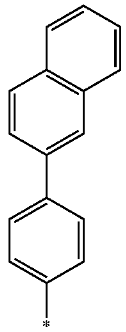 |
| 3-B1-54 | 1 | 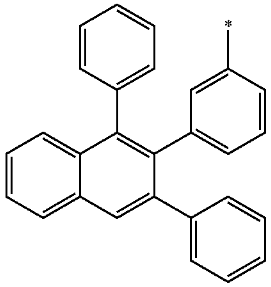 [SMILES: *c1cccc(-c2c(-c3ccccc3)cc3ccccc3c2-c2ccccc2)c1] | 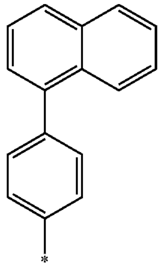 | 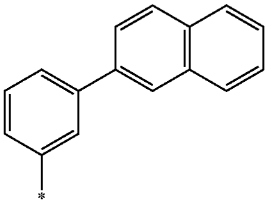 |
| 3-B1-55 | 1 | 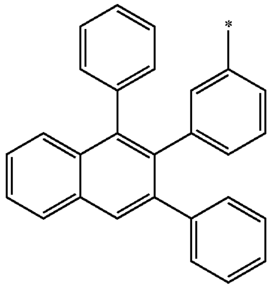 [SMILES: *c1cccc(-c2c(-c3ccccc3)cc3ccccc3c2-c2ccccc2)c1] | 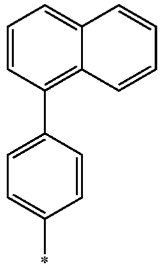 | 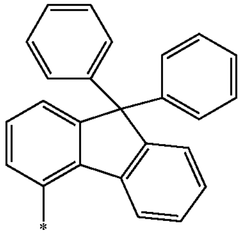 |
| 3-B1-56 | 1 | 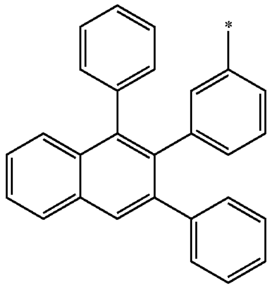 [SMILES: *c1cccc(-c2c(-c3ccccc3)cc3ccccc3c2-c2ccccc2)c1] | 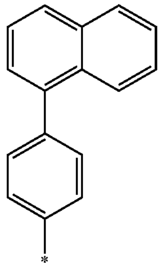 | 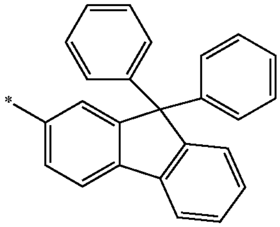 |
| 3-B1-57 | 1 | 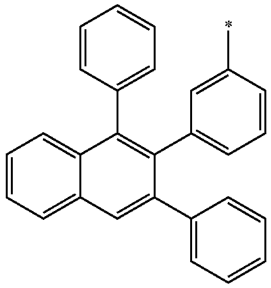 [SMILES: *c1cccc(-c2c(-c3ccccc3)cc3ccccc3c2-c2ccccc2)c1] | 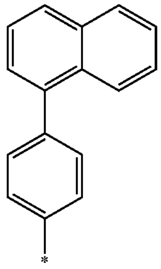 | 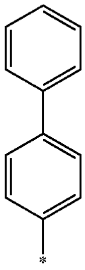 |

-continued
| [Compound Group 1] | | | | |
|---|---|---|---|---|
| | n | A—L—* | $Ar_1$ | $Ar_2$ |
| 3-B1-58 | 1 | 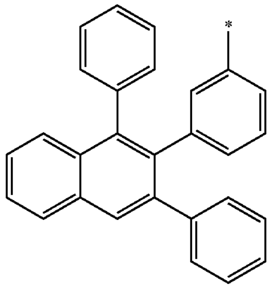 [SMILES: *c1cccc(-c2c(-c3ccccc3)cc3ccccc3c2-c2ccccc2)c1] | 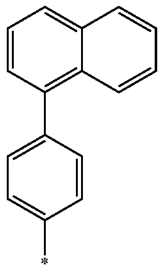 | 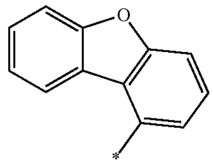 |
| 3-B1-59 | 1 | 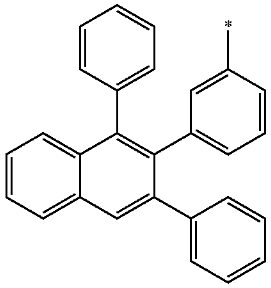 [SMILES: *c1cccc(-c2c(-c3ccccc3)cc3ccccc3c2-c2ccccc2)c1] | 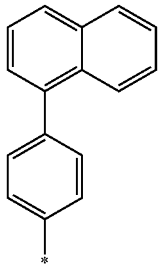 | 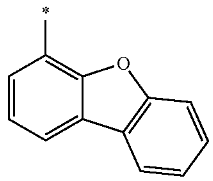 |
| 3-B1-60 | 1 | 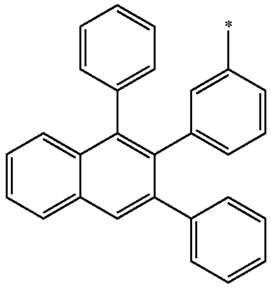 [SMILES: *c1cccc(-c2c(-c3ccccc3)cc3ccccc3c2-c2ccccc2)c1] | 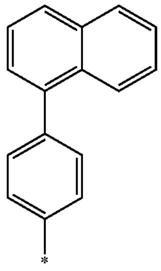 | 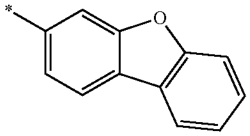 |
| 3-B1-61 | 1 | 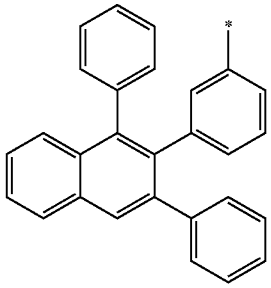 [SMILES: *c1cccc(-c2c(-c3ccccc3)cc3ccccc3c2-c2ccccc2)c1] | 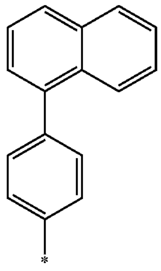 | 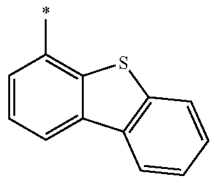 |
| 3-B1-62 | 1 | 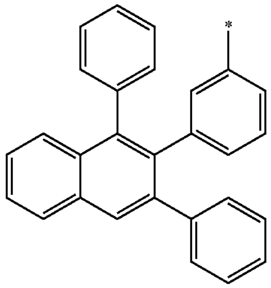 [SMILES: *c1cccc(-c2c(-c3ccccc3)cc3ccccc3c2-c2ccccc2)c1] | 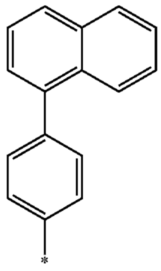 | 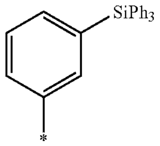 |

-continued
| [Compound Group 1] | | | | |
|---|---|---|---|---|
| | n | A—L—* | $Ar_1$ | $Ar_2$ |
| 3-B1-63 | 1 | 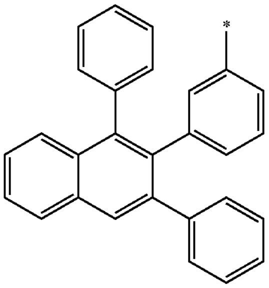 [SMILES: *c1cccc(-c2c(-c3ccccc3)cc3ccccc3c2-c2ccccc2)c1] | 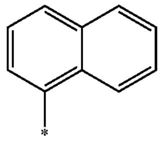 | 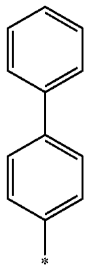 |
| 3-B1-64 | 1 | 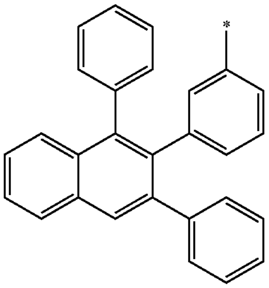 [SMILES: *c1cccc(-c2c(-c3ccccc3)cc3ccccc3c2-c2ccccc2)c1] | 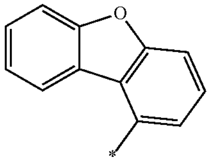 | 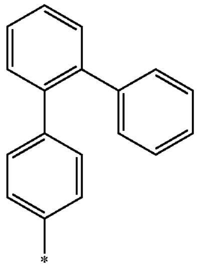 |
| 3-B1-65 | 1 | 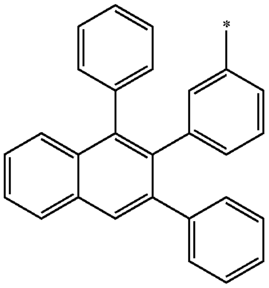 [SMILES: *c1cccc(-c2c(-c3ccccc3)cc3ccccc3c2-c2ccccc2)c1] | 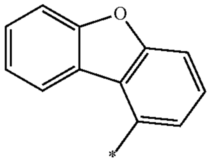 | 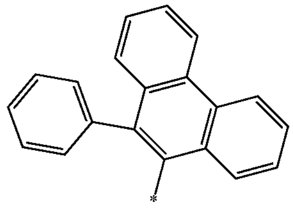 |
| 3-B1-66 | 1 | 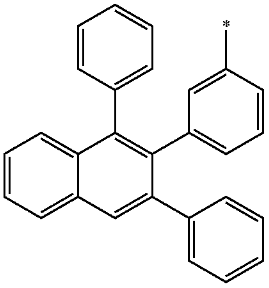 [SMILES: *c1cccc(-c2c(-c3ccccc3)cc3ccccc3c2-c2ccccc2)c1] | 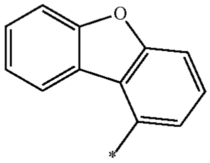 | 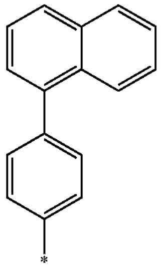 |
| 3-B1-67 | 1 | 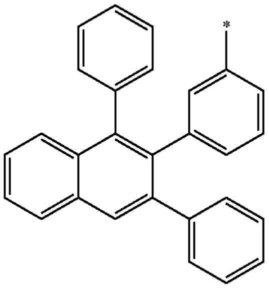 [SMILES: *c1cccc(-c2c(-c3ccccc3)cc3ccccc3c2-c2ccccc2)c1] | 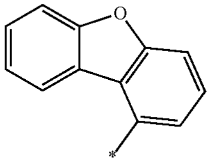 | 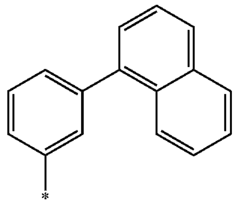 |

-continued
[Compound Group 1]
| | n | A—L—* | $Ar_1$ | $Ar_2$ |
|---|---|---|---|---|
| 3-B1-68 | 1 | 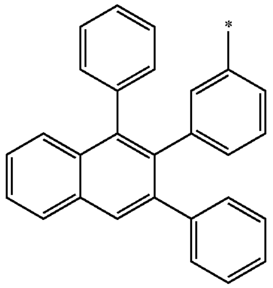 [SMILES: *c1cccc(-c2c(-c3ccccc3)cc3ccccc3c2-c2ccccc2)c1] | 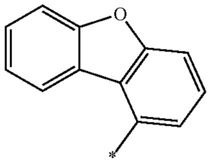 | 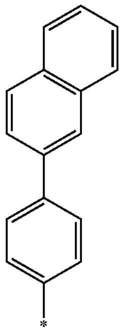 |
| 3-B1-69 | 1 | 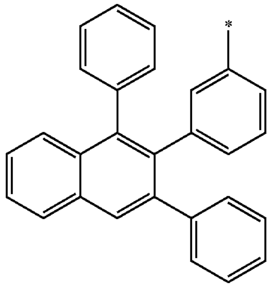 [SMILES: *c1cccc(-c2c(-c3ccccc3)cc3ccccc3c2-c2ccccc2)c1] | 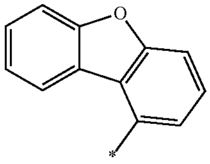 | 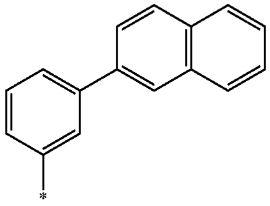 |
| 3-B1-70 | 1 | 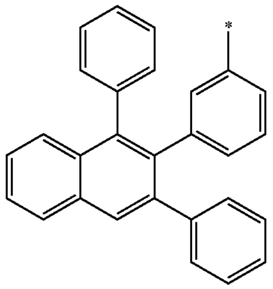 [SMILES: *c1cccc(-c2c(-c3ccccc3)cc3ccccc3c2-c2ccccc2)c1] | 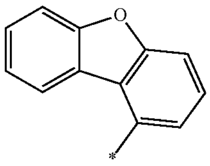 | 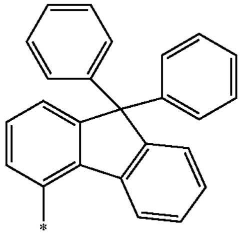 |
| 3-B1-71 | 1 | 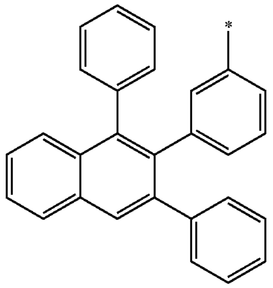 [SMILES: *c1cccc(-c2c(-c3ccccc3)cc3ccccc3c2-c2ccccc2)c1] | 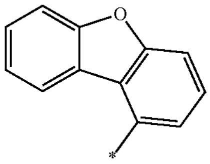 | 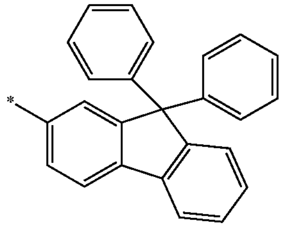 |
| 3-B1-72 | 1 | 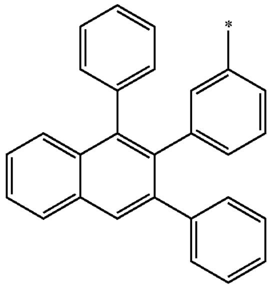 [SMILES: *c1cccc(-c2c(-c3ccccc3)cc3ccccc3c2-c2ccccc2)c1] | 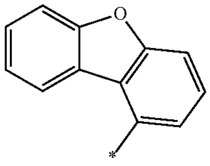 | 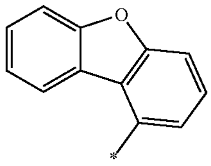 |

-continued
[Compound Group 1]
| | n | A—L—* | $Ar_1$ | $Ar_2$ |
|---|---|---|---|---|
| 3-B1-73 | 1 | 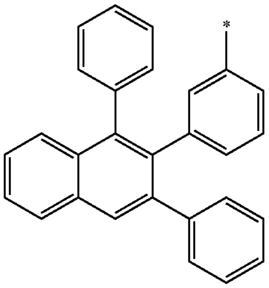 [SMILES: *c1cccc(-c2c(-c3ccccc3)cc3ccccc3c2-c2ccccc2)c1] | 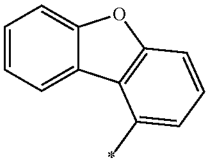 | 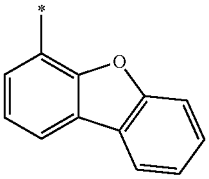 |
| 3-B1-74 | 1 | 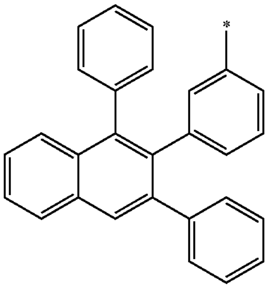 [SMILES: *c1cccc(-c2c(-c3ccccc3)cc3ccccc3c2-c2ccccc2)c1] | 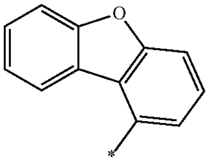 | 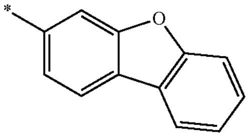 [SMILES: *c1ccc2c(c1)oc1ccccc12] |
| 3-B1-75 | 1 | 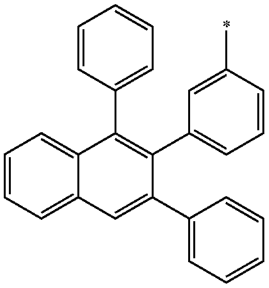 [SMILES: *c1cccc(-c2c(-c3ccccc3)cc3ccccc3c2-c2ccccc2)c1] | 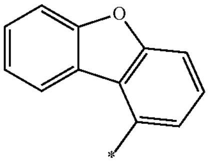 | 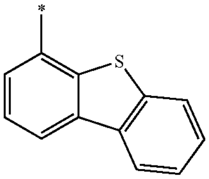 |
| 3-B1-76 | 1 | 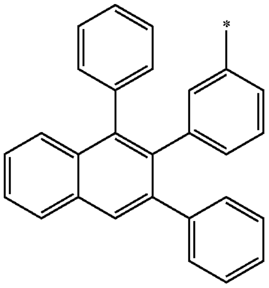 [SMILES: *c1cccc(-c2c(-c3ccccc3)cc3ccccc3c2-c2ccccc2)c1] | 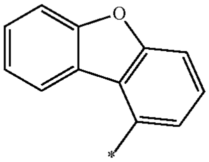 | 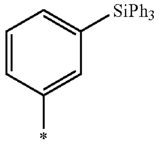 |
| 3-B1-77 | 1 | 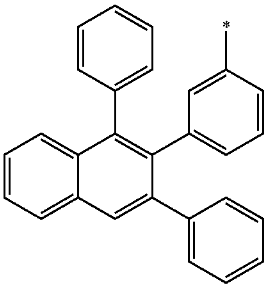 [SMILES: *c1cccc(-c2c(-c3ccccc3)cc3ccccc3c2-c2ccccc2)c1] | 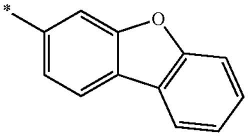 [SMILES: *c1ccc2c(c1)oc1ccccc12] | 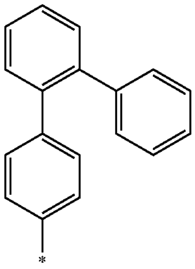 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 3-B1-78 | 1 | 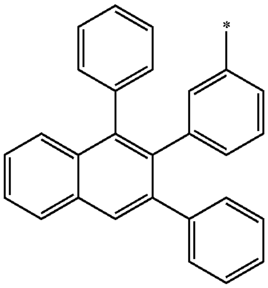 [SMILES: *c1cccc(-c2c(-c3ccccc3)cc3ccccc3c2-c2ccccc2)c1] | 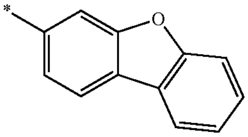 [SMILES: *c1ccc2c(c1)oc1ccccc12] | 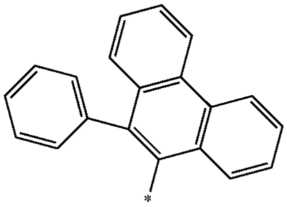 [SMILES: *c1c(-c2ccccc2)c2ccccc2c2ccccc12] |
| 3-B1-79 | 1 | 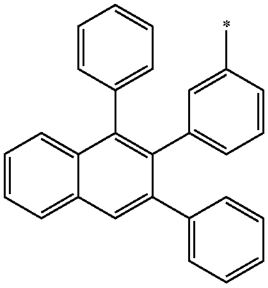 [SMILES: *c1cccc(-c2c(-c3ccccc3)cc3ccccc3c2-c2ccccc2)c1] | 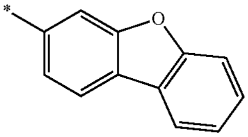 [SMILES: *c1ccc2c(c1)oc1ccccc12] | 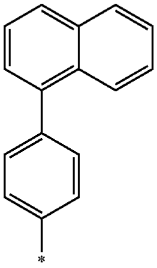 [SMILES: *c1ccc(-c2cccc3ccccc23)cc1] |
| 3-B1-80 | 1 | 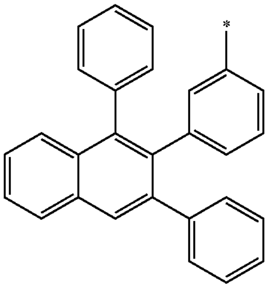 [SMILES: *c1cccc(-c2c(-c3ccccc3)cc3ccccc3c2-c2ccccc2)c1] | 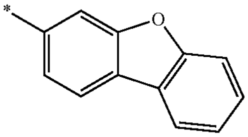 [SMILES: *c1ccc2c(c1)oc1ccccc12] | 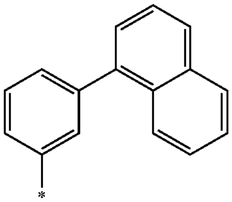 |
| 3-B1-81 | 1 | 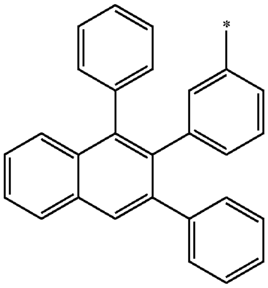 [SMILES: *c1cccc(-c2c(-c3ccccc3)cc3ccccc3c2-c2ccccc2)c1] | 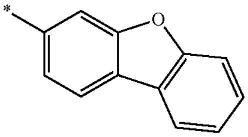 [SMILES: *c1ccc2c(c1)oc1ccccc12] | 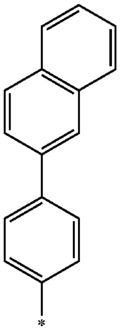 [SMILES: *c1ccc(-c2ccc3ccccc3c2)cc1] |
| 3-B1-82 | 1 | 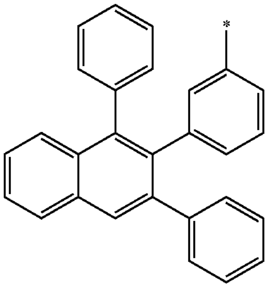 [SMILES: *c1cccc(-c2c(-c3ccccc3)cc3ccccc3c2-c2ccccc2)c1] | 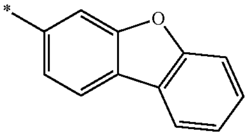 [SMILES: *c1ccc2c(c1)oc1ccccc12] | 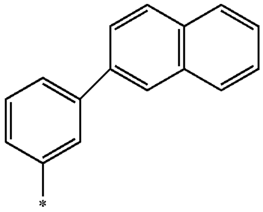 [SMILES: *c1cccc(-c2ccc3ccccc3c2)c1] |

-continued
| [Compound Group 1] | | | | |
|---|---|---|---|---|
| | n | A—L—* | $Ar_1$ | $Ar_2$ |
| 3-B1-83 | 1 | 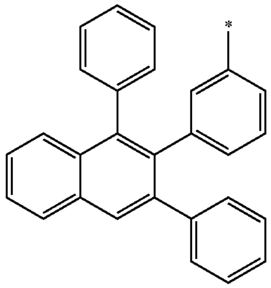 [SMILES: *c1cccc(-c2c(-c3ccccc3)cc3ccccc3c2-c2ccccc2)c1] | 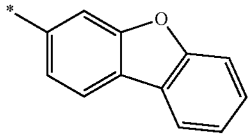 [SMILES: *c1ccc2c(c1)oc1ccccc12] | 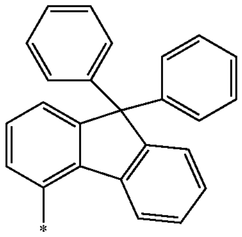 |
| 3-B1-84 | 1 | 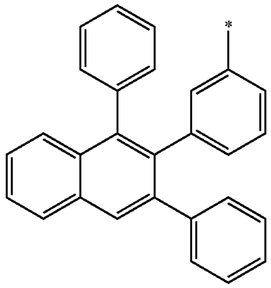 [SMILES: *c1cccc(-c2c(-c3ccccc3)cc3ccccc3c2-c2ccccc2)c1] | 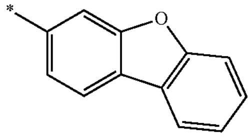 [SMILES: *c1ccc2c(c1)oc1ccccc12] | 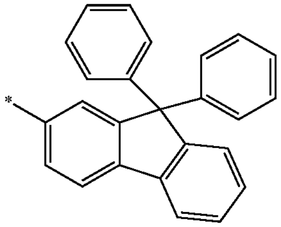 |
| 3-B1-85 | 1 | 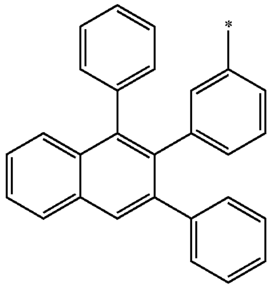 [SMILES: *c1cccc(-c2c(-c3ccccc3)cc3ccccc3c2-c2ccccc2)c1] | 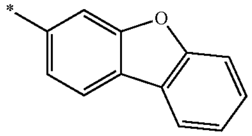 [SMILES: *c1ccc2c(c1)oc1ccccc12] | 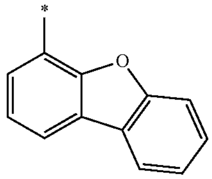 |
| 3-B1-86 | 1 | 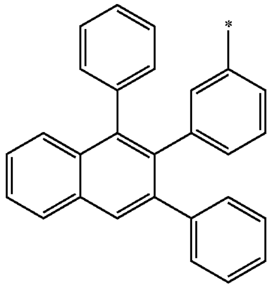 [SMILES: *c1cccc(-c2c(-c3ccccc3)cc3ccccc3c2-c2ccccc2)c1] | 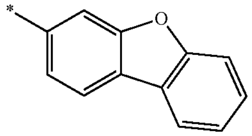 [SMILES: *c1ccc2c(c1)oc1ccccc12] | 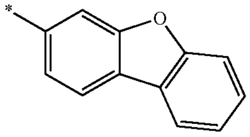 |
| 3-B1-87 | 1 | 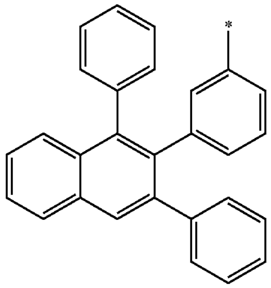 [SMILES: *c1cccc(-c2c(-c3ccccc3)cc3ccccc3c2-c2ccccc2)c1] | 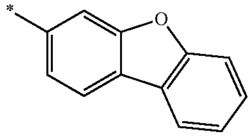 [SMILES: *c1ccc2c(c1)oc1ccccc12] | 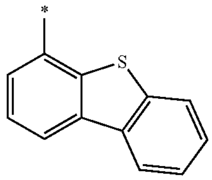 |

-continued
[Compound Group 1]
| | n | A—L—* | $Ar_1$ | $Ar_2$ |
|---|---|---|---|---|
| 3-B1-88 | 1 | 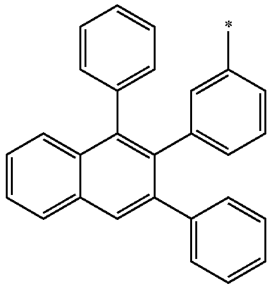 [SMILES: *c1cccc(-c2c(-c3ccccc3)cc3ccccc3c2-c2ccccc2)c1] | 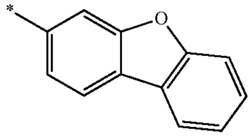 [SMILES: *c1ccc2c(c1)oc1ccccc12] | 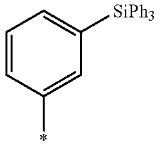 |
| 3-B1-89 | 1 | 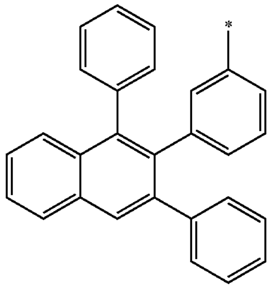 [SMILES: *c1cccc(-c2c(-c3ccccc3)cc3ccccc3c2-c2ccccc2)c1] | 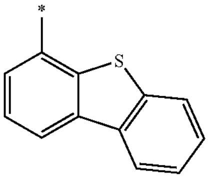 | 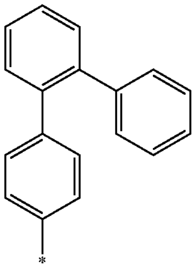 |
| 3-B1-90 | 1 | 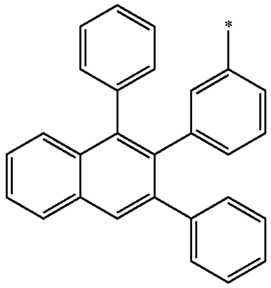 [SMILES: *c1cccc(-c2c(-c3ccccc3)cc3ccccc3c2-c2ccccc2)c1] | 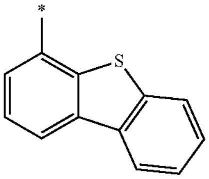 | 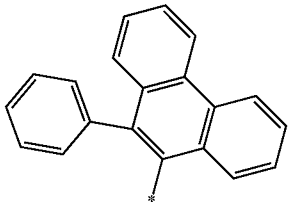 |
| 3-B1-91 | 1 | 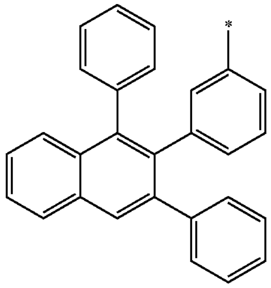 [SMILES: *c1cccc(-c2c(-c3ccccc3)cc3ccccc3c2-c2ccccc2)c1] | 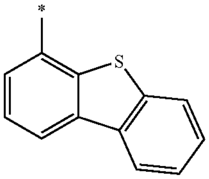 | 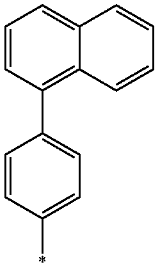 |
| 3-B1-92 | 1 | 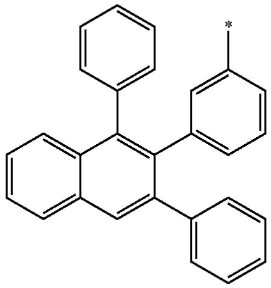 [SMILES: *c1cccc(-c2c(-c3ccccc3)cc3ccccc3c2-c2ccccc2)c1] | 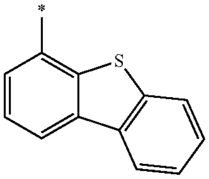 | 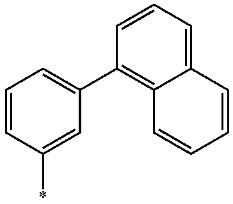 |

-continued
[Compound Group 1]
| | n | A—L—* | $Ar_1$ | $Ar_2$ |
|---|---|---|---|---|
| 3-B1-93 | 1 | 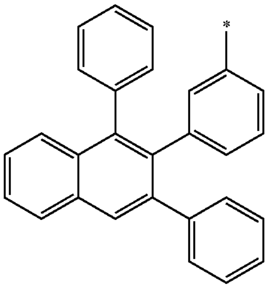 [SMILES: *c1cccc(-c2c(-c3ccccc3)cc3ccccc3c2-c2ccccc2)c1] | 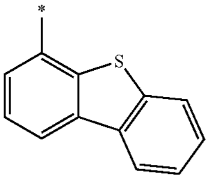 | 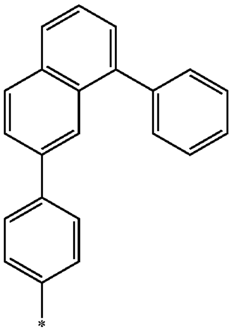 |
| 3-B1-94 | 1 | 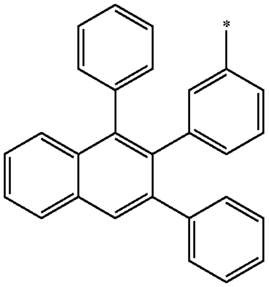 [SMILES: *c1cccc(-c2c(-c3ccccc3)cc3ccccc3c2-c2ccccc2)c1] | 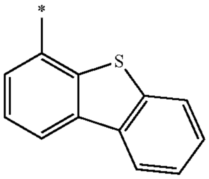 | 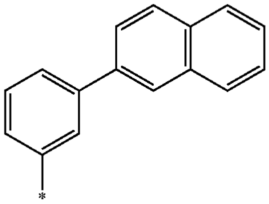 |
| 3-B1-95 | 1 | 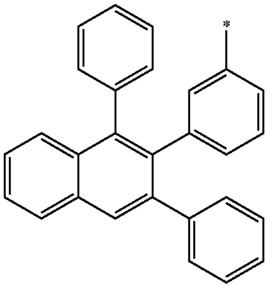 [SMILES: *c1cccc(-c2c(-c3ccccc3)cc3ccccc3c2-c2ccccc2)c1] | 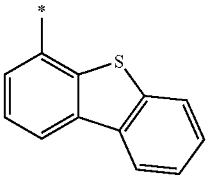 | 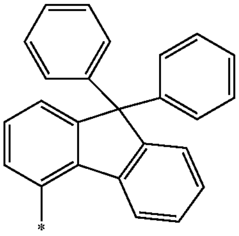 |
| 3-B1-96 | 1 | 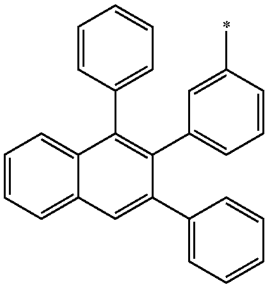 [SMILES: *c1cccc(-c2c(-c3ccccc3)cc3ccccc3c2-c2ccccc2)c1] | 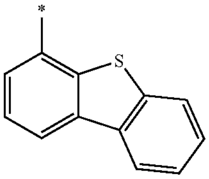 | 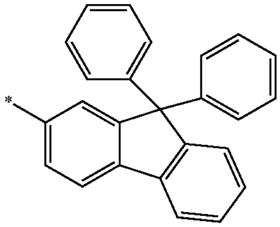 |
| 3-B1-97 | 1 | 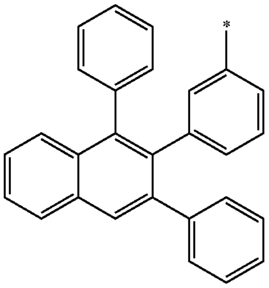 [SMILES: *c1cccc(-c2c(-c3ccccc3)cc3ccccc3c2-c2ccccc2)c1] | 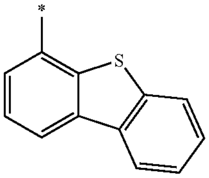 | 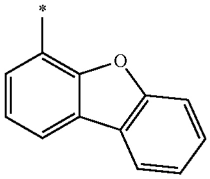 |

-continued
| [Compound Group 1] | | | | |
|---|---|---|---|---|
| | n | A—L—* | $Ar_1$ | $Ar_2$ |
| 3-B1-98 | 1 | 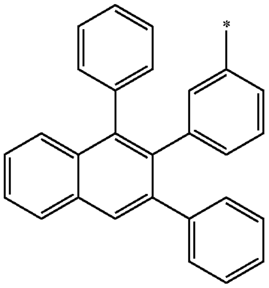 [SMILES: *c1cccc(-c2c(-c3ccccc3)cc3ccccc3c2-c2ccccc2)c1] | 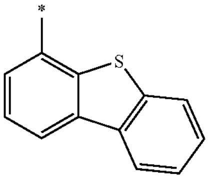 | 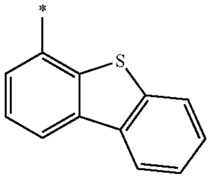 |
| 3-B1-99 | 1 | 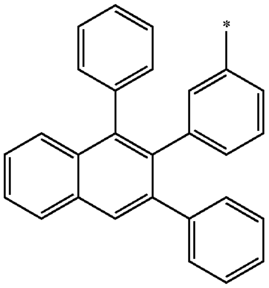 [SMILES: *c1cccc(-c2c(-c3ccccc3)cc3ccccc3c2-c2ccccc2)c1] | 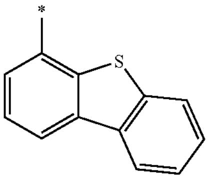 | 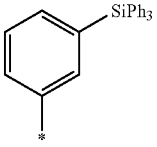 |
| 4-B1-1 | 1 | 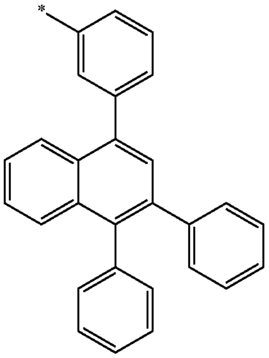 [SMILES: *c1cccc(-c2cc(-c3ccccc3)c(-c3ccccc3)c3ccccc23)c1] | 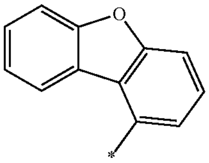 | 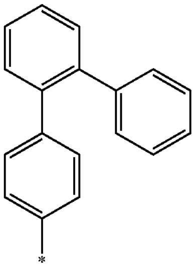 |
| 4-B1-2 | 1 | 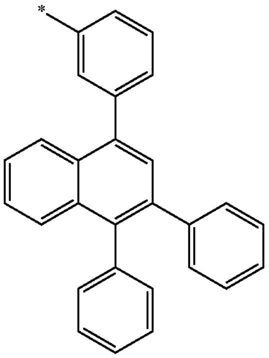 [SMILES: *c1cccc(-c2cc(-c3ccccc3)c(-c3ccccc3)c3ccccc23)c1] | 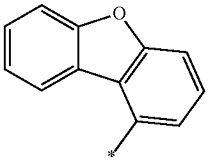 | 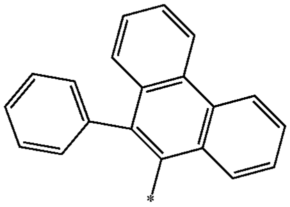 |

-continued
[Compound Group 1]
| | n | A—L—* | $Ar_1$ | $Ar_2$ |
|---|---|---|---|---|
| 4-B1-3 | 1 | 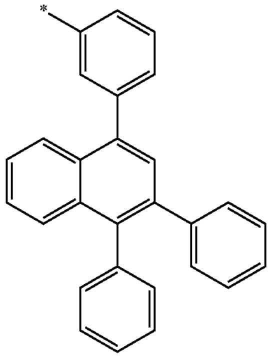 [SMILES: *c1cccc(-c2cc(-c3ccccc3)c(-c3ccccc3)c3ccccc23)c1] | 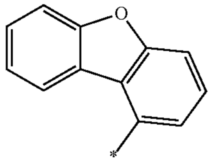 | 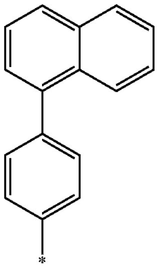 |
| 4-B1-4 | 1 | 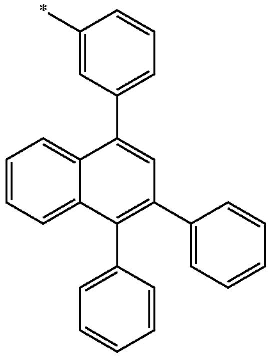 [SMILES: *c1cccc(-c2cc(-c3ccccc3)c(-c3ccccc3)c3ccccc23)c1] | 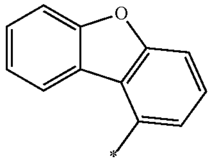 | 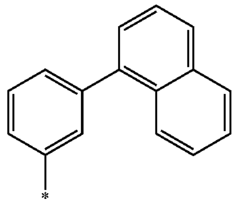 |
| 4-B1-5 | 1 | 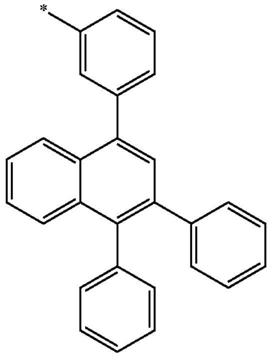 [SMILES: *c1cccc(-c2cc(-c3ccccc3)c(-c3ccccc3)c3ccccc23)c1] | 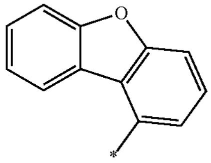 | 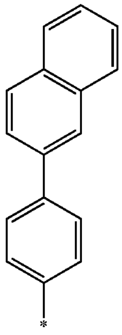 |
| 4-B1-6 | 1 | 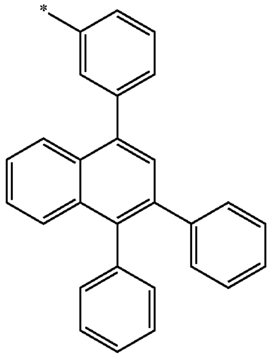 [SMILES: *c1cccc(-c2cc(-c3ccccc3)c(-c3ccccc3)c3ccccc23)c1] | 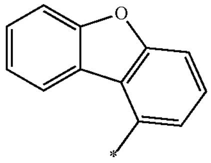 | 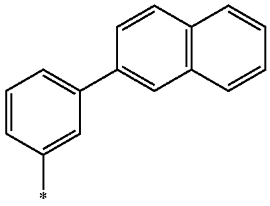 |

-continued
| [Compound Group 1] | | | | |
|---|---|---|---|---|
| | n | A—L—* | $Ar_1$ | $Ar_2$ |
| 4-B1-7 | 1 | 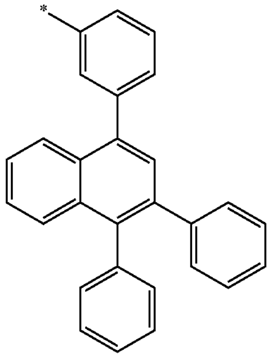 [SMILES: *c1cccc(-c2cc(-c3ccccc3)c(-c3ccccc3)c3ccccc23)c1] | 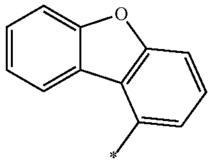 | 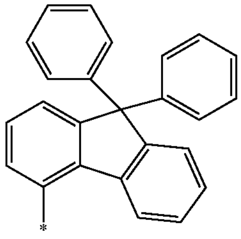 |
| 4-B1-8 | 1 | 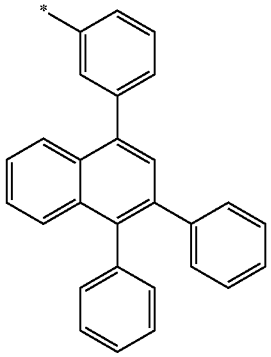 [SMILES: *c1cccc(-c2cc(-c3ccccc3)c(-c3ccccc3)c3ccccc23)c1] | 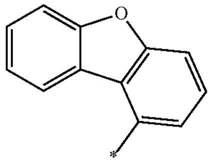 | 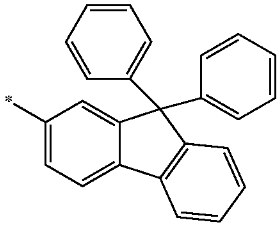 |
| 4-B1-9 | 1 | 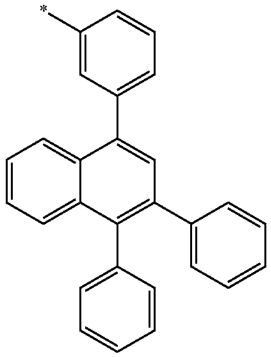 [SMILES: *c1cccc(-c2cc(-c3ccccc3)c(-c3ccccc3)c3ccccc23)c1] | 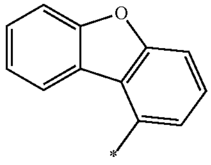 | 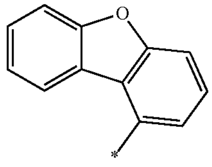 |
| 4-B1-10 | 1 | 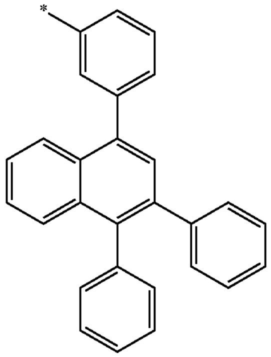 [SMILES: *c1cccc(-c2cc(-c3ccccc3)c(-c3ccccc3)c3ccccc23)c1] | 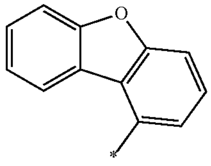 | 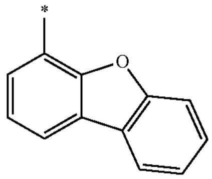 |

-continued
[Compound Group 1]
| | n | A—L—* | $Ar_1$ | $Ar_2$ |
|---|---|---|---|---|
| 4-B1-11 | 1 | 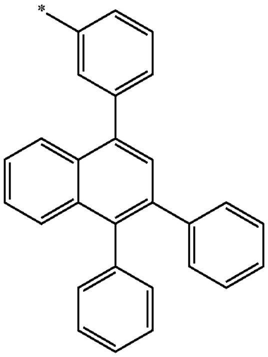 [SMILES: *c1cccc(-c2cc(-c3ccccc3)c(-c3ccccc3)c3ccccc23)c1] | 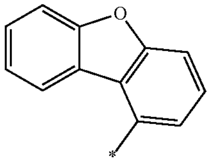 | 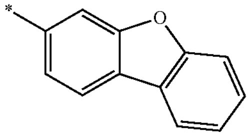 |
| 4-B1-12 | 1 | 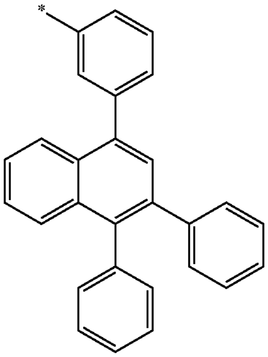 [SMILES: *c1cccc(-c2cc(-c3ccccc3)c(-c3ccccc3)c3ccccc23)c1] | 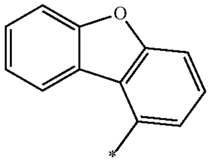 | 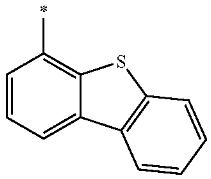 |
| 4-B1-13 | 1 | 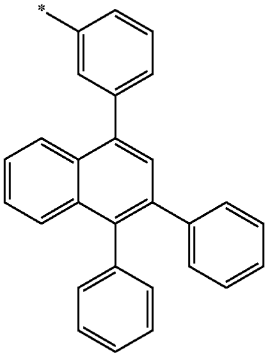 [SMILES: *c1cccc(-c2cc(-c3ccccc3)c(-c3ccccc3)c3ccccc23)c1] | 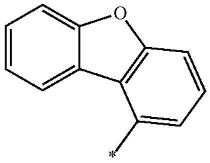 | 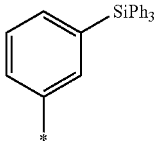 |
| 4-B1-14 | 1 | 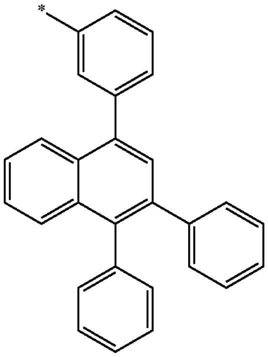 [SMILES: *c1cccc(-c2cc(-c3ccccc3)c(-c3ccccc3)c3ccccc23)c1] | 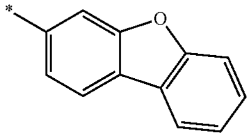 [SMILES: *c1ccc2c(c1)oc1ccccc12] | 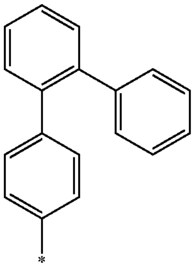 |

-continued
| [Compound Group 1] | | | | |
|---|---|---|---|---|
| | n | A—L—* | $Ar_1$ | $Ar_2$ |
| 4-B1-15 | 1 | 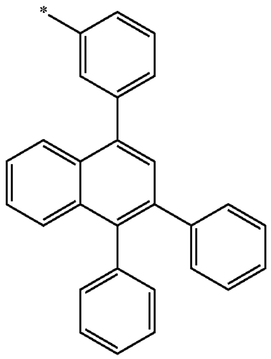 [SMILES: *c1cccc(-c2cc(-c3ccccc3)c(-c3ccccc3)c3ccccc23)c1] | 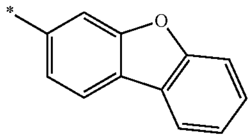 [SMILES: *c1ccc2c(c1)oc1ccccc12] | 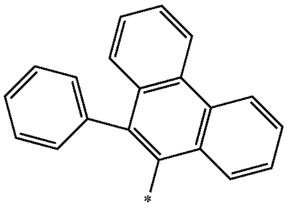 [SMILES: *c1c(-c2ccccc2)c2ccccc2c2ccccc12] |
| 4-B1-16 | 1 | 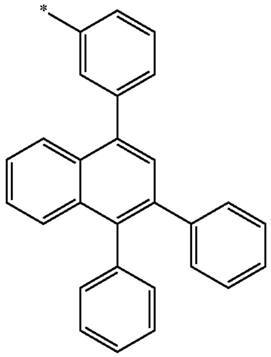 [SMILES: *c1cccc(-c2cc(-c3ccccc3)c(-c3ccccc3)c3ccccc23)c1] | 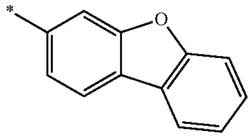 [SMILES: *c1ccc2c(c1)oc1ccccc12] | 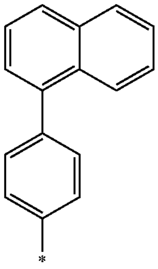 [SMILES: *c1ccc(-c2cccc3ccccc23)cc1] |
| 4-B1-17 | 1 | 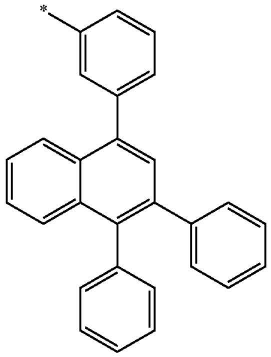 [SMILES: *c1cccc(-c2cc(-c3ccccc3)c(-c3ccccc3)c3ccccc23)c1] | 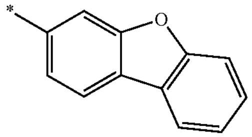 [SMILES: *c1ccc2c(c1)oc1ccccc12] | 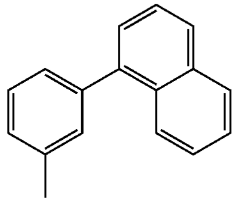 |
| 4-B1-18 | 1 | 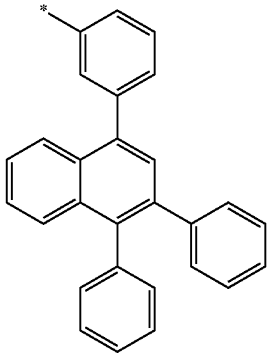 [SMILES: *c1cccc(-c2cc(-c3ccccc3)c(-c3ccccc3)c3ccccc23)c1] | 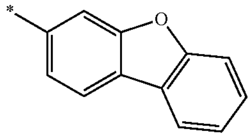 [SMILES: *c1ccc2c(c1)oc1ccccc12] | 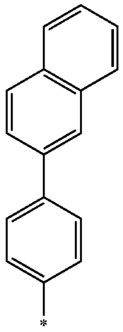 [SMILES: *c1ccc(-c2ccc3ccccc3c2)cc1] |

-continued
[Compound Group 1]
| | n | A—L—* | $Ar_1$ | $Ar_2$ |
|---|---|---|---|---|
| 4-B1-19 | 1 | 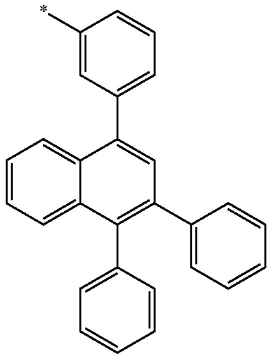 [SMILES: *c1cccc(-c2cc(-c3ccccc3)c(-c3ccccc3)c3ccccc23)c1] | 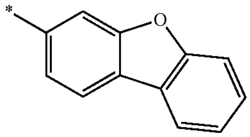 [SMILES: *c1ccc2c(c1)oc1ccccc12] | 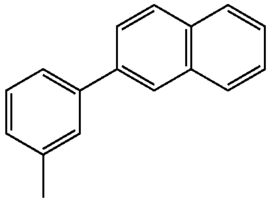 |
| 4-B1-20 | 1 | 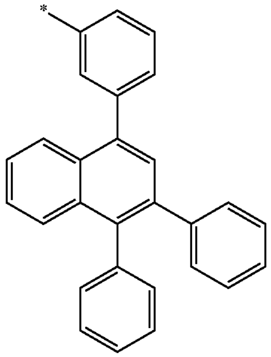 [SMILES: *c1cccc(-c2cc(-c3ccccc3)c(-c3ccccc3)c3ccccc23)c1] | 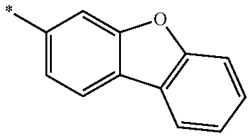 [SMILES: *c1ccc2c(c1)oc1ccccc12] | 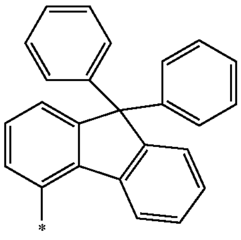 [SMILES: *c1cccc2c1-c1ccccc1C2(c1ccccc1)c1ccccc1] |
| 4-B1-21 | 1 | 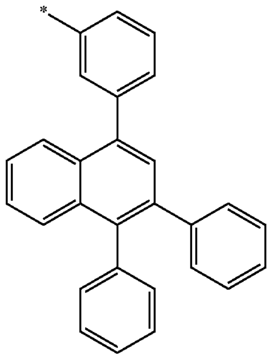 [SMILES: *c1cccc(-c2cc(-c3ccccc3)c(-c3ccccc3)c3ccccc23)c1] | 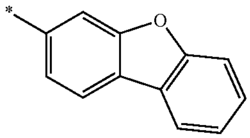 [SMILES: *c1ccc2c(c1)oc1ccccc12] | 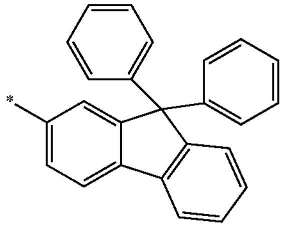 [SMILES: *c1ccc2c(c1)C(c1ccccc1)(c1ccccc1)c1ccccc1-2] |
| 4-B1-22 | 1 | 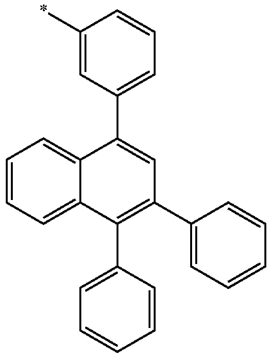 [SMILES: *c1cccc(-c2cc(-c3ccccc3)c(-c3ccccc3)c3ccccc23)c1] | 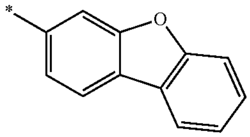 [SMILES: *c1ccc2c(c1)oc1ccccc12] | 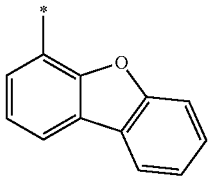 |

-continued
[Compound Group 1]
| | n | A—L—* | $Ar_1$ | $Ar_2$ |
|---|---|---|---|---|
| 4-B1-23 | 1 | 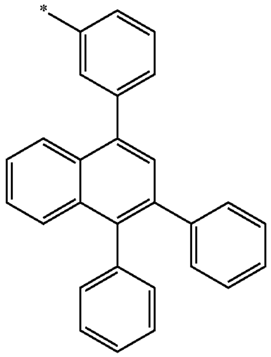 [SMILES: *c1cccc(-c2cc(-c3ccccc3)c(-c3ccccc3)c3ccccc23)c1] | 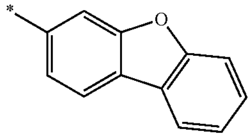 [SMILES: *c1ccc2c(c1)oc1ccccc12] | 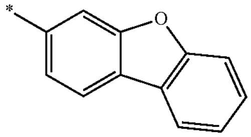 [SMILES: *c1ccc2c(c1)oc1ccccc12] |
| 4-B1-24 | 1 | 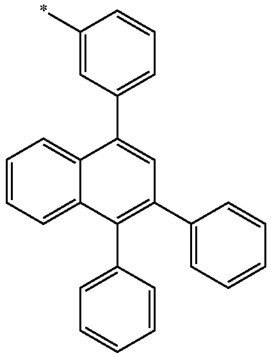 [SMILES: *c1cccc(-c2cc(-c3ccccc3)c(-c3ccccc3)c3ccccc23)c1] | 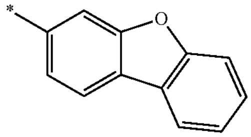 [SMILES: *c1ccc2c(c1)oc1ccccc12] | 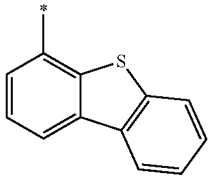 [SMILES: *c1cccc2c1sc1ccccc12] |
| 4-B1-25 | 1 | 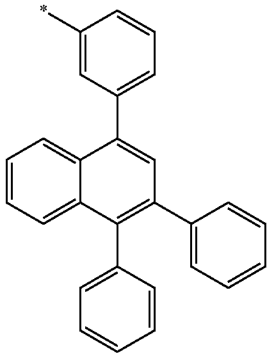 [SMILES: *c1cccc(-c2cc(-c3ccccc3)c(-c3ccccc3)c3ccccc23)c1] | 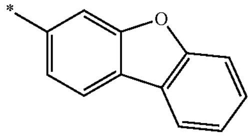 [SMILES: *c1ccc2c(c1)oc1ccccc12] | 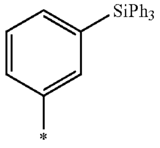 |
| 4-B1-26 | 1 | 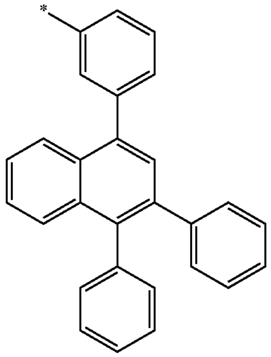 [SMILES: *c1cccc(-c2cc(-c3ccccc3)c(-c3ccccc3)c3ccccc23)c1] | 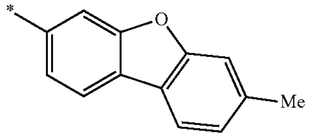 [SMILES: *c1ccc2c(c1)oc1cc(C)ccc12] | 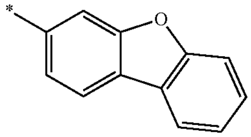 [SMILES: *c1ccc2c(c1)oc1ccccc12] |

-continued
[Compound Group 1]
| | n | A—L—* | $Ar_1$ | $Ar_2$ |
|---|---|---|---|---|
| 4-B1-27 | 1 | 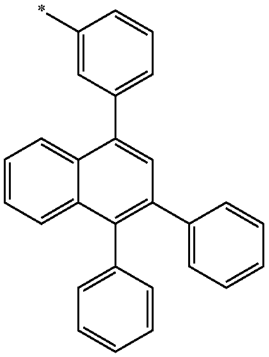 [SMILES: *c1cccc(-c2cc(-c3ccccc3)c(-c3ccccc3)c3ccccc23)c1] | 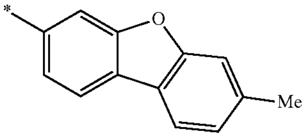 | 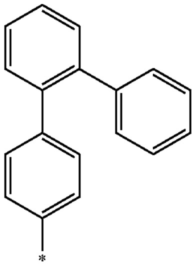 [SMILES: *c1ccc(-c2ccccc2-c2ccccc2)cc1] |
| 4-B1-28 | 1 | 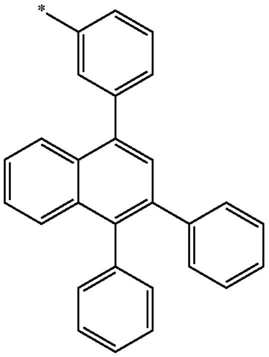 [SMILES: *c1cccc(-c2cc(-c3ccccc3)c(-c3ccccc3)c3ccccc23)c1] | 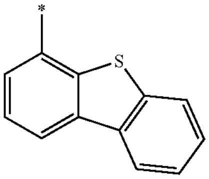 | 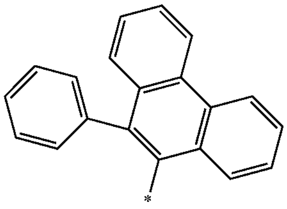 [SMILES: *c1c(-c2ccccc2)c2ccccc2c2ccccc12] |
| 4-B1-29 | 1 | 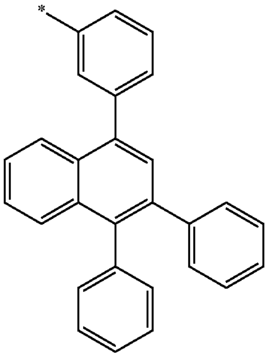 [SMILES: *c1cccc(-c2cc(-c3ccccc3)c(-c3ccccc3)c3ccccc23)c1] | 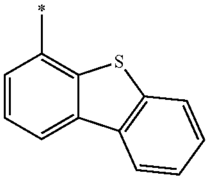 | 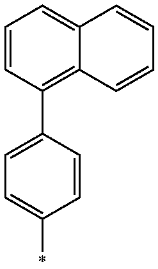 [SMILES: *c1ccc(-c2cccc3ccccc23)cc1] |
| 4-B1-30 | 1 | 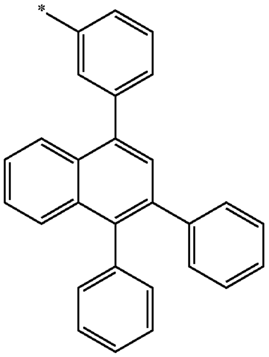 [SMILES: *c1cccc(-c2cc(-c3ccccc3)c(-c3ccccc3)c3ccccc23)c1] | 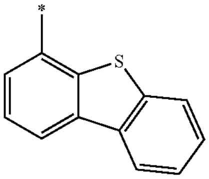 | 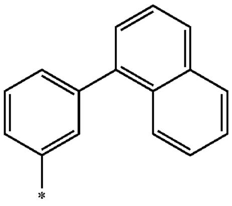 |

-continued
[Compound Group 1]
| | n | A—L—* | $Ar_1$ | $Ar_2$ |
|---|---|---|---|---|
| 4-B1-31 | 1 | 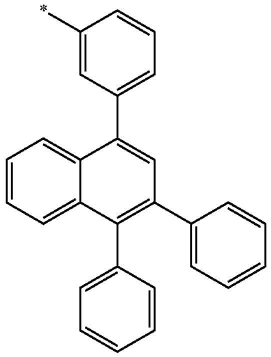 [SMILES: *c1cccc(-c2cc(-c3ccccc3)c(-c3ccccc3)c3ccccc23)c1] | 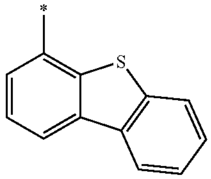 | 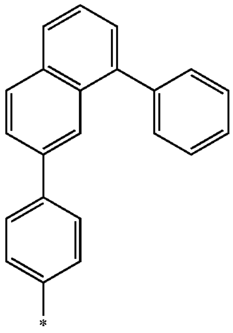 [SMILES: *c1ccc(-c2ccc3cccc(-c4ccccc4)c3c2)cc1] |
| 4-B1-32 | 1 | 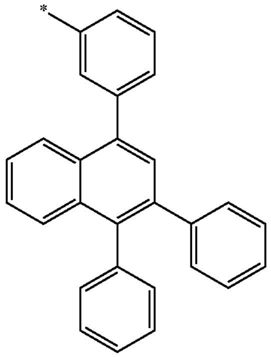 [SMILES: *c1cccc(-c2cc(-c3ccccc3)c(-c3ccccc3)c3ccccc23)c1] | 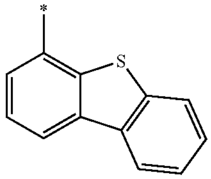 | 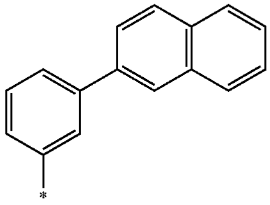 [SMILES: *c1cccc(-c2ccc3ccccc3c2)c1] |
| 4-B1-33 | 1 | 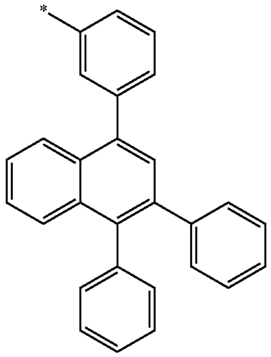 [SMILES: *c1cccc(-c2cc(-c3ccccc3)c(-c3ccccc3)c3ccccc23)c1] | 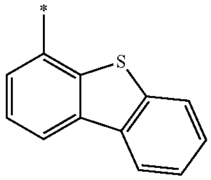 | 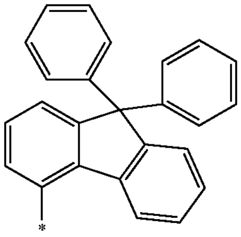 [SMILES: *c1cccc2c1-c1ccccc1C2(c1ccccc1)c1ccccc1] |
| 4-B1-34 | 1 | 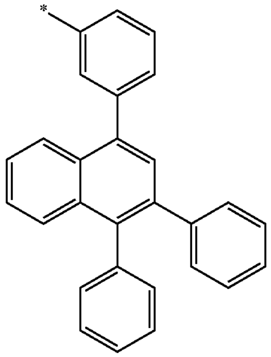 [SMILES: *c1cccc(-c2cc(-c3ccccc3)c(-c3ccccc3)c3ccccc23)c1] | 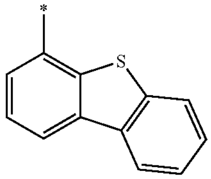 | 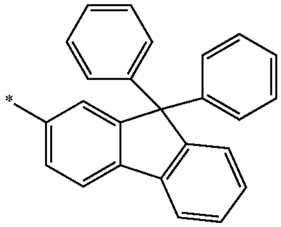 |

-continued
[Compound Group 1]
| | n | A—L—* | $Ar_1$ | $Ar_2$ |
|---|---|---|---|---|
| 4-B1-35 | 1 | 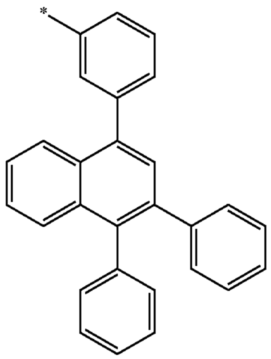 [SMILES: *c1cccc(-c2cc(-c3ccccc3)c(-c3ccccc3)c3ccccc23)c1] | 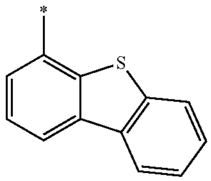 | 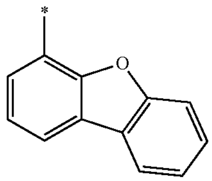 |
| 4-B1-36 | 1 | 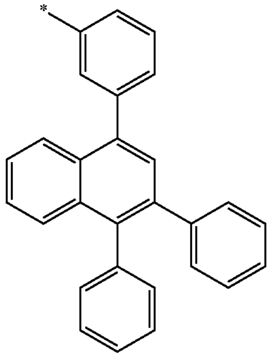 [SMILES: *c1cccc(-c2cc(-c3ccccc3)c(-c3ccccc3)c3ccccc23)c1] | 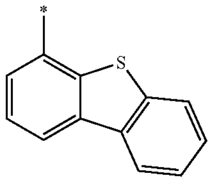 | 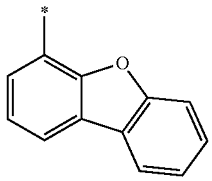 |
| 4-B1-37 | 1 | 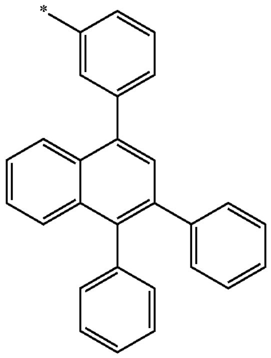 [SMILES: *c1cccc(-c2cc(-c3ccccc3)c(-c3ccccc3)c3ccccc23)c1] | 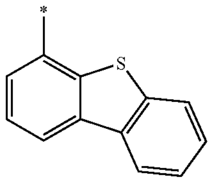 | 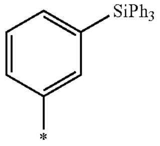 |
| 5-B1-1 | 1 | 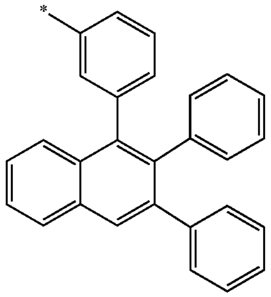 [SMILES: *c1cccc(-c2c(-c3ccccc3)c(-c3ccccc3)cc3ccccc23)c1] | 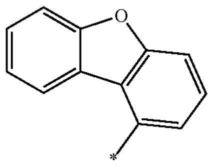 | 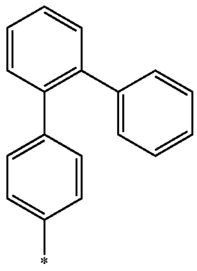 |

-continued
| [Compound Group 1] | | | | |
|---|---|---|---|---|
| | n | A—L—* | $Ar_1$ | $Ar_2$ |
| 5-B1-2 | 1 | 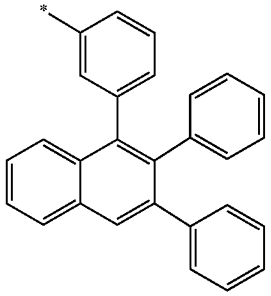 [SMILES: *c1cccc(-c2c(-c3ccccc3)c(-c3ccccc3)cc3ccccc23)c1] | 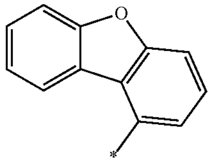 | 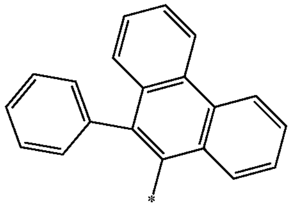 |
| 5-B1-3 | 1 | 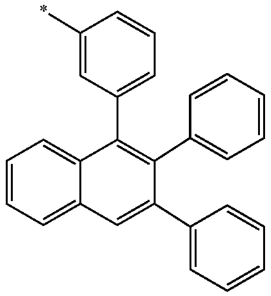 [SMILES: *c1cccc(-c2c(-c3ccccc3)c(-c3ccccc3)cc3ccccc23)c1] | 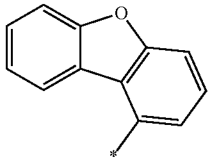 | 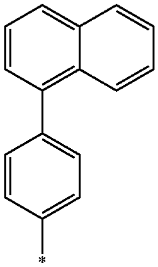 |
| 5-B1-4 | 1 | 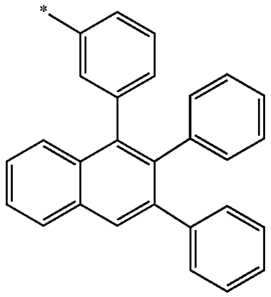 [SMILES: *c1cccc(-c2c(-c3ccccc3)c(-c3ccccc3)cc3ccccc23)c1] | 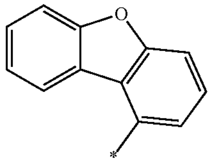 | 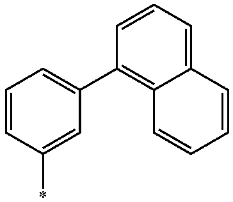 |
| 5-B1-5 | 1 | 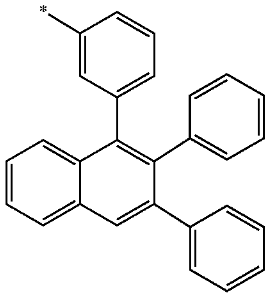 [SMILES: *c1cccc(-c2c(-c3ccccc3)c(-c3ccccc3)cc3ccccc23)c1] | 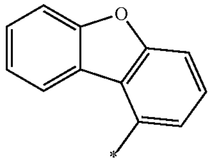 | 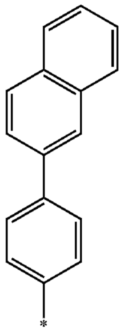 |
| 5-B1-6 | 1 | 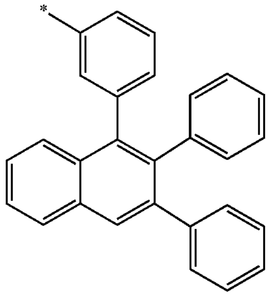 [SMILES: *c1cccc(-c2c(-c3ccccc3)c(-c3ccccc3)cc3ccccc23)c1] | 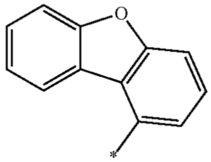 | 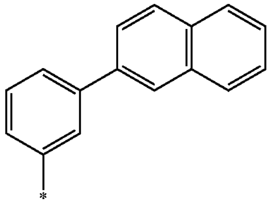 |

-continued
| [Compound Group 1] | | | | |
|---|---|---|---|---|
| | n | A—L—* | $Ar_1$ | $Ar_2$ |
| 5-B1-7 | 1 | 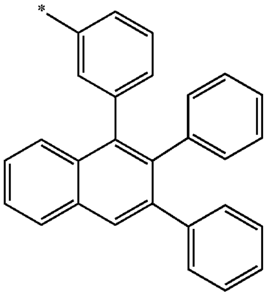 [SMILES: *c1cccc(-c2c(-c3ccccc3)c(-c3ccccc3)cc3ccccc23)c1] | 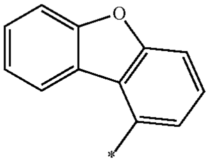 | 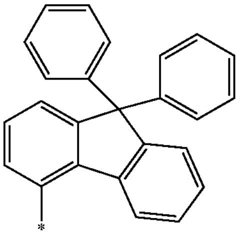 |
| 5-B1-8 | 1 | 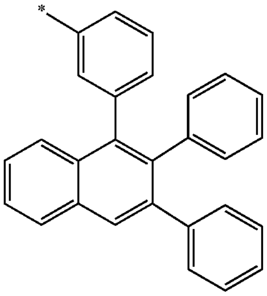 [SMILES: *c1cccc(-c2c(-c3ccccc3)c(-c3ccccc3)cc3ccccc23)c1] | 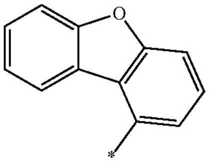 | 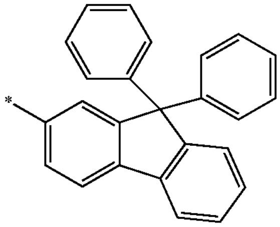 |
| 5-B1-9 | 1 | 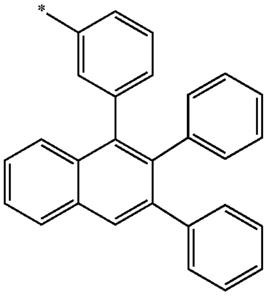 [SMILES: *c1cccc(-c2c(-c3ccccc3)c(-c3ccccc3)cc3ccccc23)c1] | 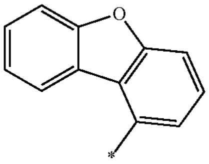 | 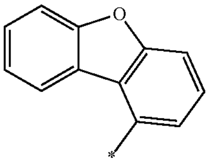 |
| 5-B1-10 | 1 | 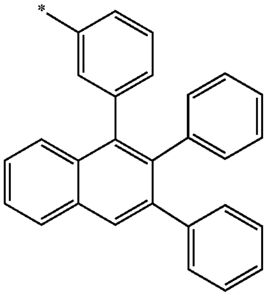 [SMILES: *c1cccc(-c2c(-c3ccccc3)c(-c3ccccc3)cc3ccccc23)c1] | 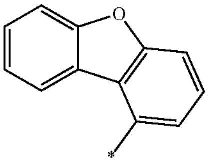 | 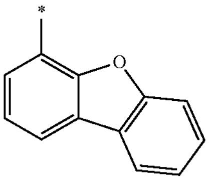 |
| 5-B1-11 | 1 | 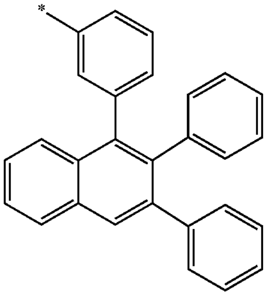 [SMILES: *c1cccc(-c2c(-c3ccccc3)c(-c3ccccc3)cc3ccccc23)c1] | 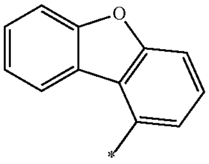 | 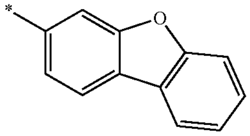 |

-continued
[Compound Group 1]
| | n | A—L—* | $Ar_1$ | $Ar_2$ |
|---|---|---|---|---|
| 5-B1-12 | 1 | 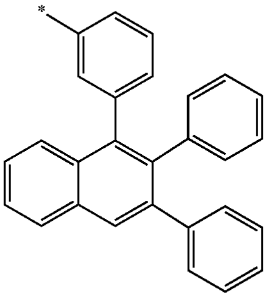 [SMILES: *c1cccc(-c2c(-c3ccccc3)c(-c3ccccc3)cc3ccccc23)c1] | 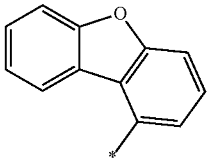 | 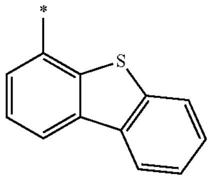 |
| 5-B1-13 | 1 | 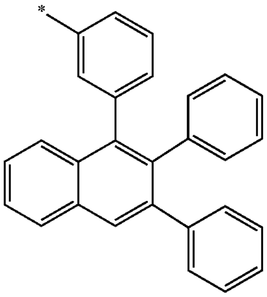 [SMILES: *c1cccc(-c2c(-c3ccccc3)c(-c3ccccc3)cc3ccccc23)c1] | 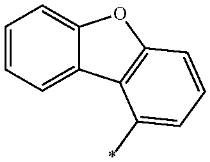 | 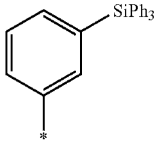 |
| 5-B1-14 | 1 | 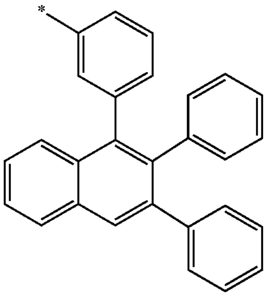 [SMILES: *c1cccc(-c2c(-c3ccccc3)c(-c3ccccc3)cc3ccccc23)c1] | 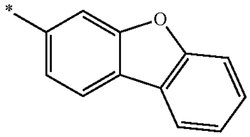 [SMILES: *c1ccc2c(c1)oc1ccccc12] | 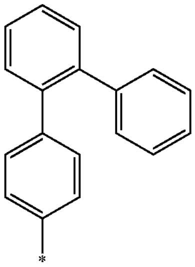 |
| 5-B1-15 | 1 | 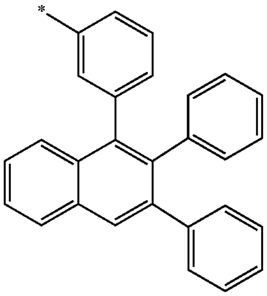 [SMILES: *c1cccc(-c2c(-c3ccccc3)c(-c3ccccc3)cc3ccccc23)c1] | 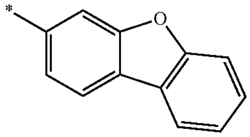 [SMILES: *c1ccc2c(c1)oc1ccccc12] | 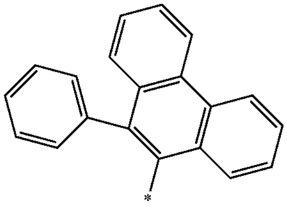 [SMILES: *c1c(-c2ccccc2)c2ccccc2c2ccccc12] |
| 5-B1-16 | 1 | 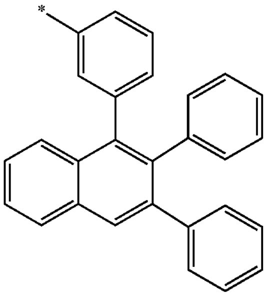 [SMILES: *c1cccc(-c2c(-c3ccccc3)c(-c3ccccc3)cc3ccccc23)c1] | 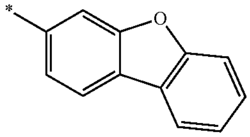 [SMILES: *c1ccc2c(c1)oc1ccccc12] | 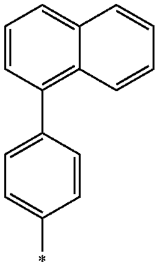 [SMILES: *c1ccc(-c2cccc3ccccc23)cc1] |

-continued
[Compound Group 1]
| | n | A—L—* | $Ar_1$ | $Ar_2$ |
|---|---|---|---|---|
| 5-B1-17 | 1 | 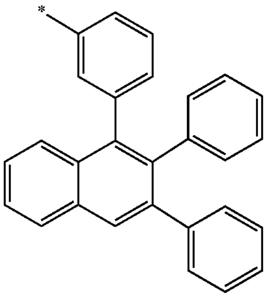 [SMILES: *c1cccc(-c2c(-c3ccccc3)c(-c3ccccc3)cc3ccccc23)c1] | 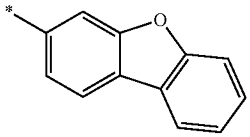 [SMILES: *c1ccc2c(c1)oc1ccccc12] | 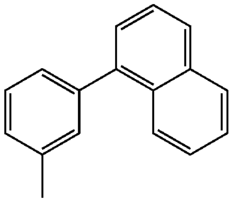 |
| 5-B1-18 | 1 | 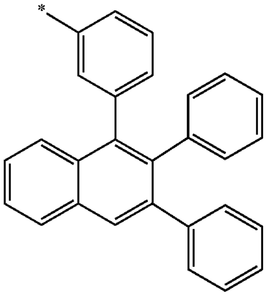 [SMILES: *c1cccc(-c2c(-c3ccccc3)c(-c3ccccc3)cc3ccccc23)c1] | 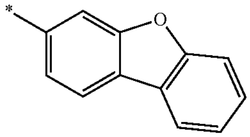 [SMILES: *c1ccc2c(c1)oc1ccccc12] | 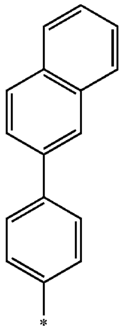 [SMILES: *c1ccc(-c2ccc3ccccc3c2)cc1] |
| 5-B1-19 | 1 | 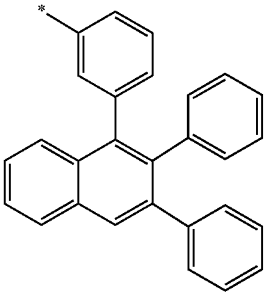 [SMILES: *c1cccc(-c2c(-c3ccccc3)c(-c3ccccc3)cc3ccccc23)c1] | 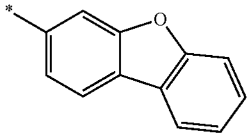 [SMILES: *c1ccc2c(c1)oc1ccccc12] | 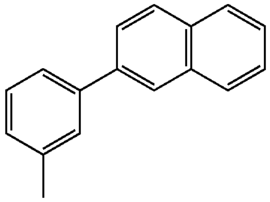 |
| 5-B1-20 | 1 | 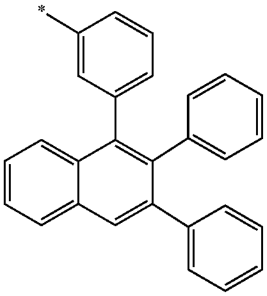 [SMILES: *c1cccc(-c2c(-c3ccccc3)c(-c3ccccc3)cc3ccccc23)c1] | 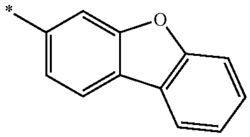 [SMILES: *c1ccc2c(c1)oc1ccccc12] | 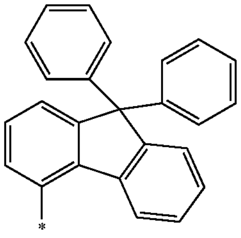 [SMILES: *c1cccc2c1-c1ccccc1C2(c1ccccc1)c1ccccc1] |
| 5-B1-21 | 1 | 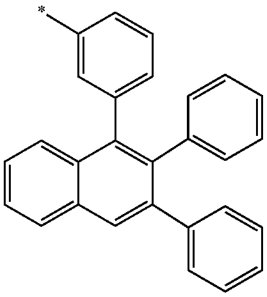 [SMILES: *c1cccc(-c2c(-c3ccccc3)c(-c3ccccc3)cc3ccccc23)c1] | 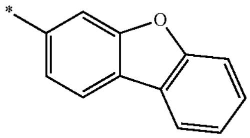 [SMILES: *c1ccc2c(c1)oc1ccccc12] | 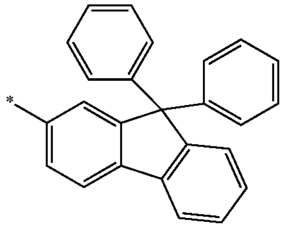 [SMILES: *c1ccc2c(c1)C(c1ccccc1)(c1ccccc1)c1ccccc1-2] |

-continued
| [Compound Group 1] | | | | |
|---|---|---|---|---|
| | n | A—L—* | $Ar_1$ | $Ar_2$ |
| 5-B1-22 | 1 | 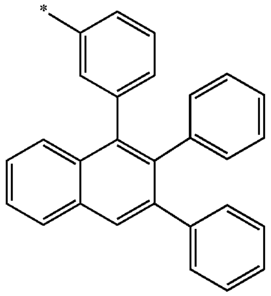 [SMILES: *c1cccc(-c2c(-c3ccccc3)c(-c3ccccc3)cc3ccccc23)c1] | 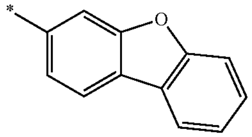 [SMILES: *c1ccc2c(c1)oc1ccccc12] | 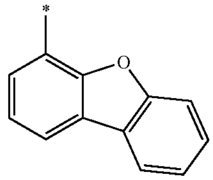 |
| 5-B1-23 | 1 | 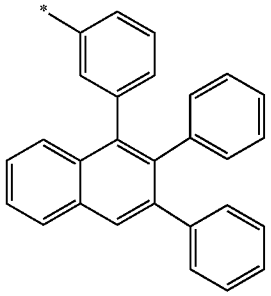 [SMILES: *c1cccc(-c2c(-c3ccccc3)c(-c3ccccc3)cc3ccccc23)c1] | 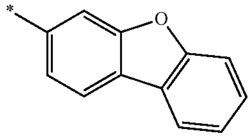 [SMILES: *c1ccc2c(c1)oc1ccccc12] | 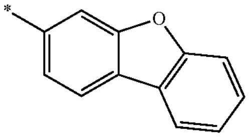 [SMILES: *c1ccc2c(c1)oc1ccccc12] |
| 5-B1-24 | 1 | 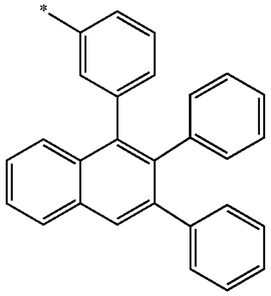 [SMILES: *c1cccc(-c2c(-c3ccccc3)c(-c3ccccc3)cc3ccccc23)c1] | 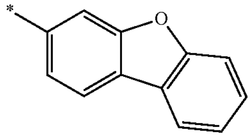 [SMILES: *c1ccc2c(c1)oc1ccccc12] | 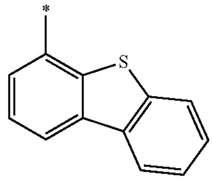 |
| 5-B1-25 | 1 | 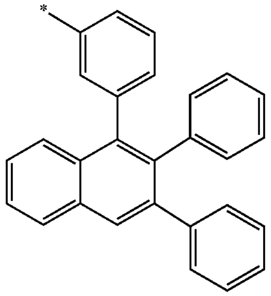 [SMILES: *c1cccc(-c2c(-c3ccccc3)c(-c3ccccc3)cc3ccccc23)c1] | 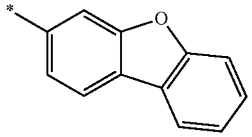 [SMILES: *c1ccc2c(c1)oc1ccccc12] | 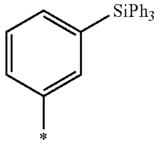 |
| 5-B1-26 | 1 | 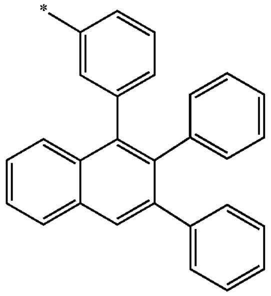 [SMILES: *c1cccc(-c2c(-c3ccccc3)c(-c3ccccc3)cc3ccccc23)c1] | 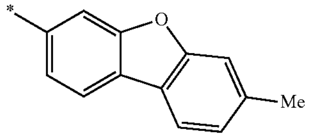 [SMILES: *c1ccc2c(c1)oc1cc(C)ccc12] | 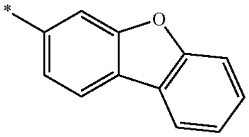 [SMILES: *c1ccc2c(c1)oc1ccccc12] |

-continued
| [Compound Group 1] | | | | |
|---|---|---|---|---|
| | n | A—L—* | $Ar_1$ | $Ar_2$ |
| 5-B1-27 | 1 | 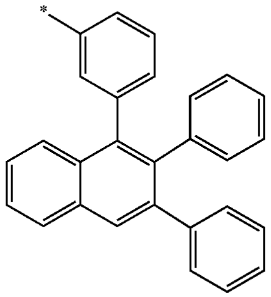 [SMILES: *c1cccc(-c2c(-c3ccccc3)c(-c3ccccc3)cc3ccccc23)c1] | 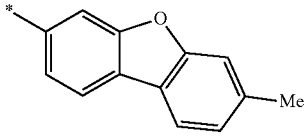 [SMILES: *c1ccc2c(c1)oc1cc(C)ccc12] | 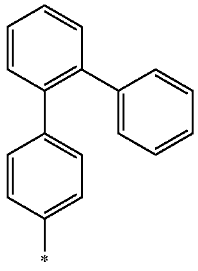 [SMILES: *c1ccc(-c2ccccc2-c2ccccc2)cc1] |
| 5-B1-28 | 1 | 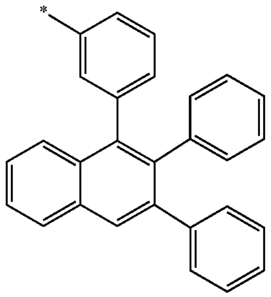 [SMILES: *c1cccc(-c2c(-c3ccccc3)c(-c3ccccc3)cc3ccccc23)c1] | 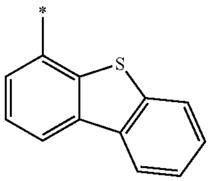 | 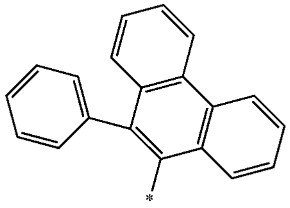 [SMILES: *c1c(-c2ccccc2)c2ccccc2c2ccccc12] |
| 5-B1-29 | 1 | 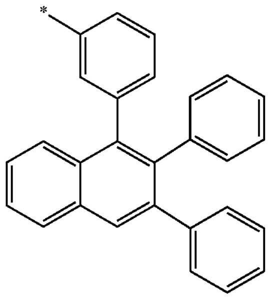 [SMILES: *c1cccc(-c2c(-c3ccccc3)c(-c3ccccc3)cc3ccccc23)c1] | 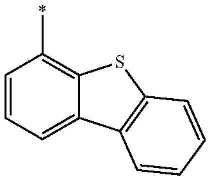 | 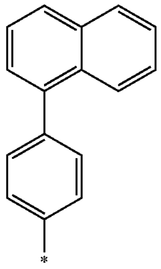 [SMILES: *c1ccc(-c2cccc3ccccc23)cc1] |
| 5-B1-30 | 1 | 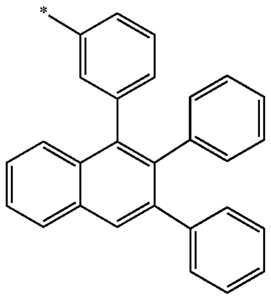 [SMILES: *c1cccc(-c2c(-c3ccccc3)c(-c3ccccc3)cc3ccccc23)c1] | 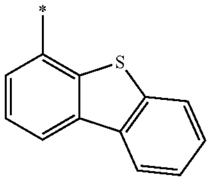 | 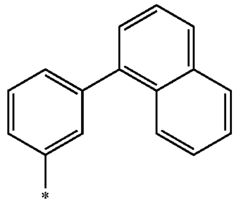 |
| 5-B1-31 | 1 | 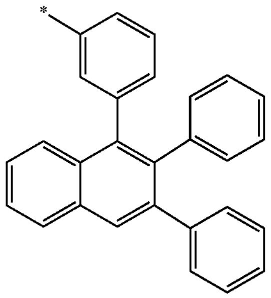 [SMILES: *c1cccc(-c2c(-c3ccccc3)c(-c3ccccc3)cc3ccccc23)c1] | 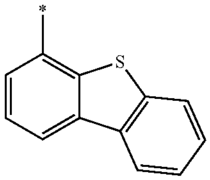 | 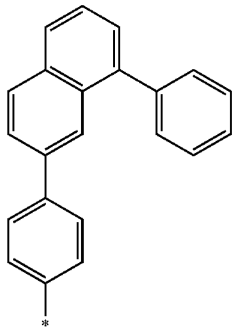 [SMILES: *c1ccc(-c2ccc3cccc(-c4ccccc4)c3c2)cc1] |

-continued
[Compound Group 1]
| | n | A—L—* | $Ar_1$ | $Ar_2$ |
|---|---|---|---|---|
| 5-B1-32 | 1 | 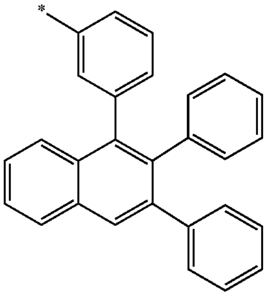 [SMILES: *c1cccc(-c2c(-c3ccccc3)c(-c3ccccc3)cc3ccccc23)c1] | 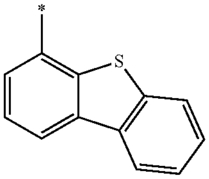 | 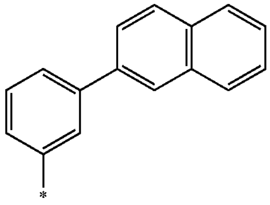 [SMILES: *c1cccc(-c2ccc3ccccc3c2)c1] |
| 5-B1-33 | 1 | 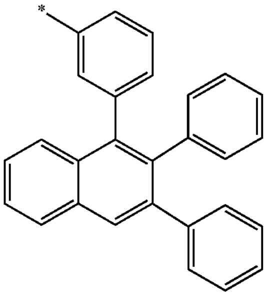 [SMILES: *c1cccc(-c2c(-c3ccccc3)c(-c3ccccc3)cc3ccccc23)c1] | 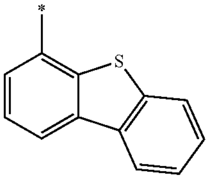 | 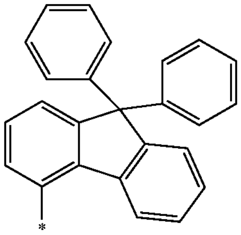 [SMILES: *c1cccc2c1-c1ccccc1C2(c1ccccc1)c1ccccc1] |
| 5-B1-34 | 1 | 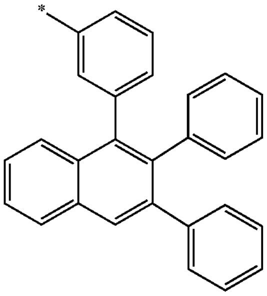 [SMILES: *c1cccc(-c2c(-c3ccccc3)c(-c3ccccc3)cc3ccccc23)c1] | 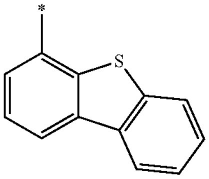 | 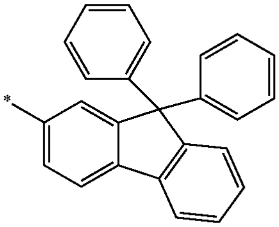 |
| 5-B1-35 | 1 | 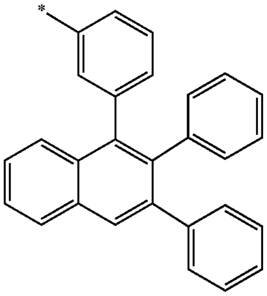 [SMILES: *c1cccc(-c2c(-c3ccccc3)c(-c3ccccc3)cc3ccccc23)c1] | 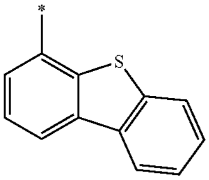 | 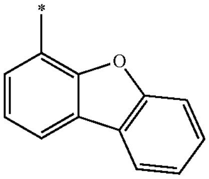 |
| 5-B1-36 | 1 | 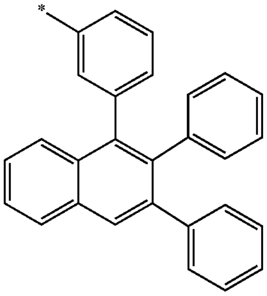 [SMILES: *c1cccc(-c2c(-c3ccccc3)c(-c3ccccc3)cc3ccccc23)c1] | 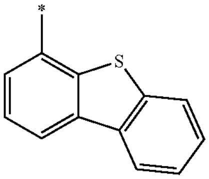 | 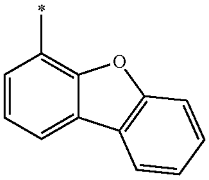 |

-continued
[Compound Group 1]
| | n | A—L—* | $Ar_1$ | $Ar_2$ |
|---|---|---|---|---|
| 5-B1-37 | 1 | 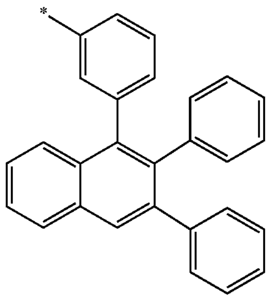 [SMILES: *c1cccc(-c2c(-c3ccccc3)c(-c3ccccc3)cc3ccccc23)c1] | 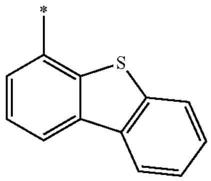 | 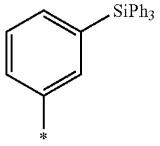 |
| 1-C1-1 | 0 | 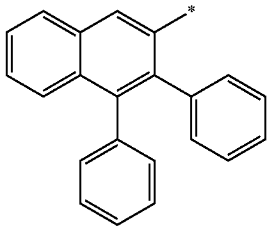 | 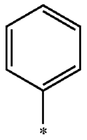 [SMILES: *c1ccccc1] | 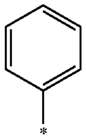 [SMILES: *c1ccccc1] |
| 1-C1-2 | 0 | 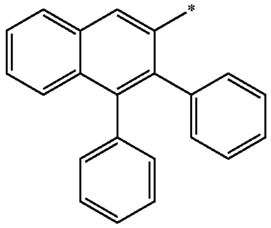 | 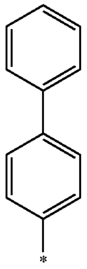 [SMILES: *c1ccc(-c2ccccc2)cc1] | 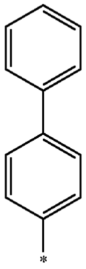 [SMILES: *c1ccc(-c2ccccc2)cc1] |
| 1-C1-3 | 0 | 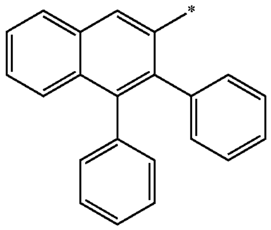 | 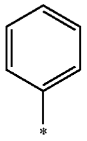 | 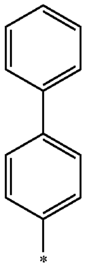 [SMILES: *c1ccc(-c2ccccc2)cc1] |
| 1-C1-4 | 0 | 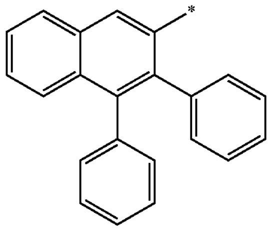 | 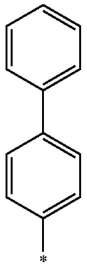 [SMILES: *c1ccc(-c2ccccc2)cc1] | 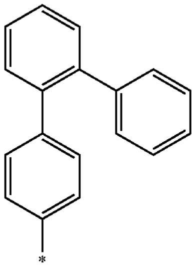 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 1-C1-5 | 0 | 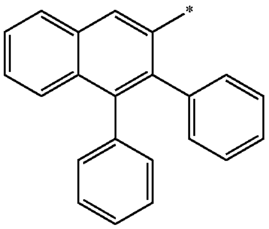 | 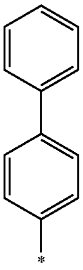 [SMILES: *c1ccc(-c2ccccc2)cc1] | 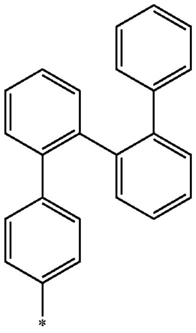 [SMILES: *c1ccc(-c2ccccc2-c2ccccc2-c2ccccc2)cc1] |
| 1-C1-6 | 0 | 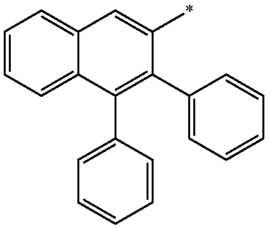 | 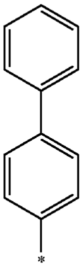 [SMILES: *c1ccc(-c2ccccc2)cc1] | 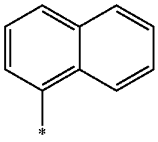 |
| 1-C1-7 | 0 | 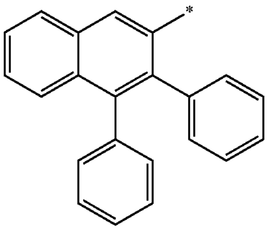 | 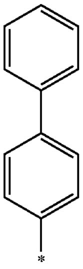 [SMILES: *c1ccc(-c2ccccc2)cc1] | 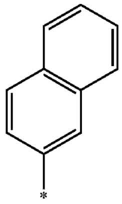 |
| 1-C1-8 | 0 | 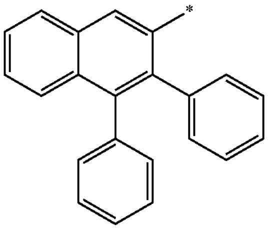 | 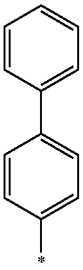 [SMILES: *c1ccc(-c2ccccc2)cc1] | 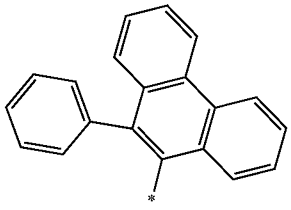 [SMILES: *c1c(-c2ccccc2)c2ccccc2c2ccccc12] |
| 1-C1-9 | 0 | 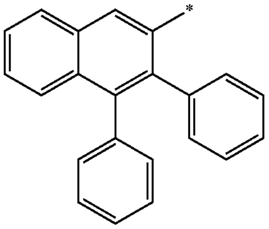 | 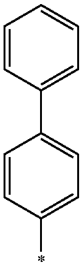 [SMILES: *c1ccc(-c2ccccc2)cc1] | 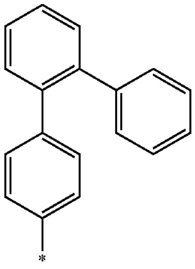 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 1-C1-10 | 0 | 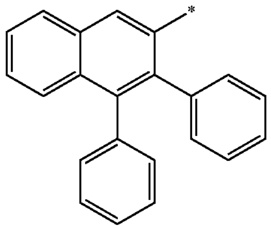 | 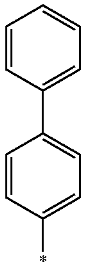 [SMILES: *c1ccc(-c2ccccc2)cc1] | 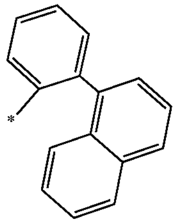 [SMILES: *c1ccccc1-c1cccc2ccccc12] |
| 1-C1-11 | 0 | 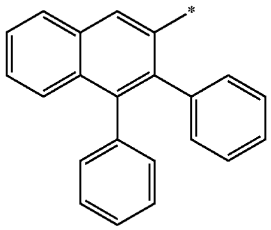 | 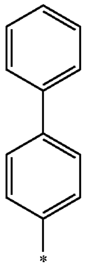 | 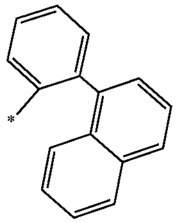 [SMILES: *c1ccccc1-c1cccc2ccccc12] |
| 1-C1-12 | 0 | 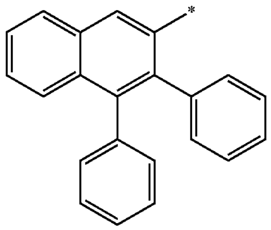 | 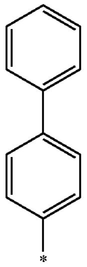 [SMILES: *c1ccc(-c2ccccc2)cc1] | 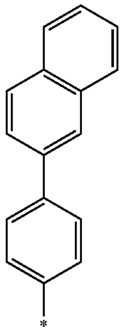 |
| 1-C1-13 | 0 | 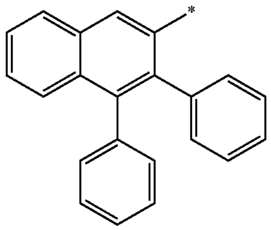 | 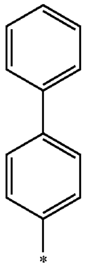 [SMILES: *c1ccc(-c2ccccc2)cc1] | 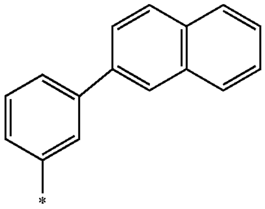 [SMILES: *c1cccc(-c2ccc3ccccc3c2)c1] |
| 1-C1-14 | 0 | 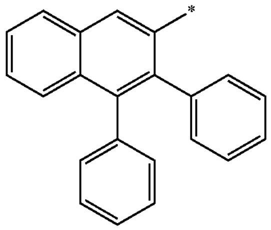 | 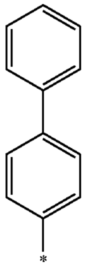 [SMILES: *c1ccc(-c2ccccc2)cc1] | 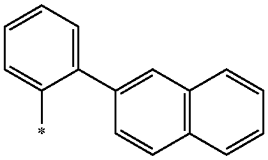 [SMILES: *c1ccccc1-c1ccc2ccccc2c1] |

-continued
[Compound Group 1]
| | n | A—L—* | $Ar_1$ | $Ar_2$ |
|---|---|---|---|---|
| 1-C1-15 | 0 | 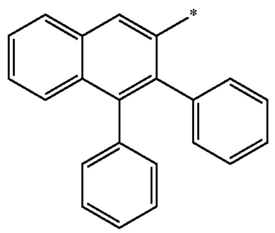 | 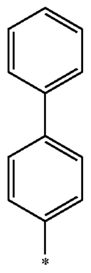 [SMILES: *c1ccc(-c2ccccc2)cc1] | 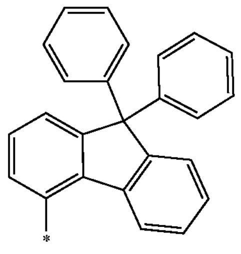 [SMILES: *c1cccc2c1-c1ccccc1C2(c1ccccc1)c1ccccc1] |
| 1-C1-16 | 0 | 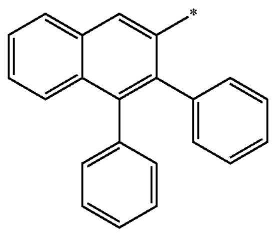 | 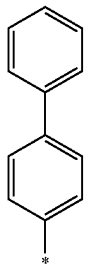 | 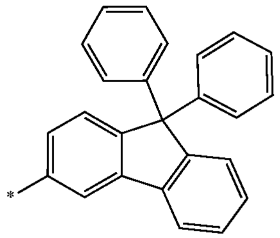 [SMILES: *c1ccc2c(c1)-c1ccccc1C2(c1ccccc1)c1ccccc1] |
| 1-C1-17 | 0 | 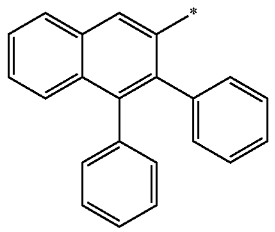 | 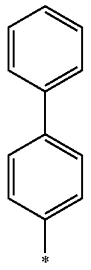 [SMILES: *c1ccc(-c2ccccc2)cc1] | 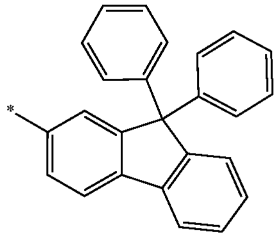 [SMILES: *c1ccc2c(c1)C(c1ccccc1)(c1ccccc1)c1ccccc1-2] |
| 1-C1-18 | 0 | 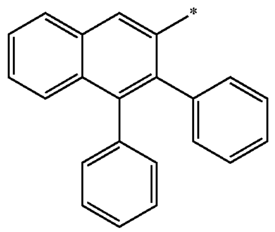 | 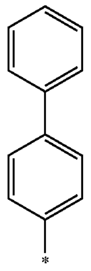 [SMILES: *c1ccc(-c2ccccc2)cc1] | 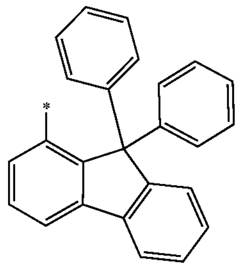 [SMILES: *c1cccc2c1C(c1ccccc1)(c1ccccc1)c1ccccc1-2] |
| 1-C1-19 | 0 | 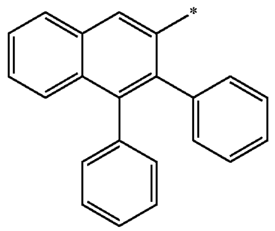 | 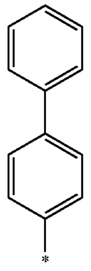 [SMILES: *c1ccc(-c2ccccc2)cc1] | 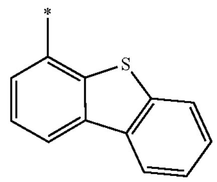 |

-continued
| [Compound Group 1] | | | | |
|---|---|---|---|---|
| | n | A—L—* | $Ar_1$ | $Ar_2$ |
| 1-C1-20 | 0 | 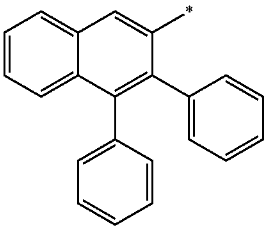 | 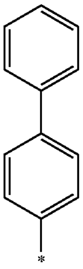 [SMILES: *c1ccc(-c2ccccc2)cc1] | 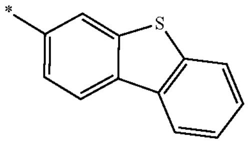 [SMILES: *c1ccc2c(c1)sc1ccccc12] |
| 1-C1-21 | 0 | 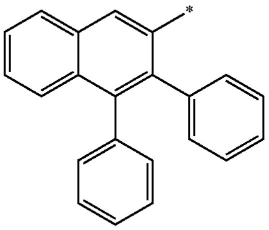 | 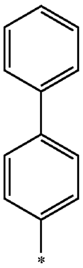 | 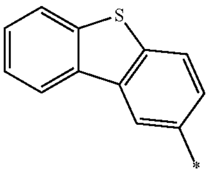 |
| 1-C1-22 | 0 | 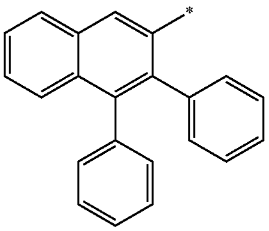 | 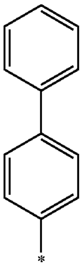 [SMILES: *c1ccc(-c2ccccc2)cc1] | 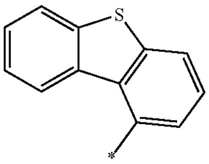 |
| 1-C1-23 | 0 | 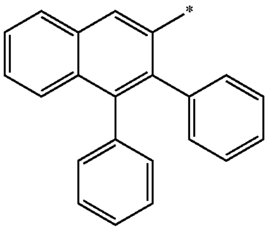 | 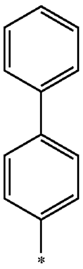 [SMILES: *c1ccc(-c2ccccc2)cc1] | 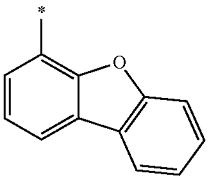 |
| 1-C1-24 | 0 | 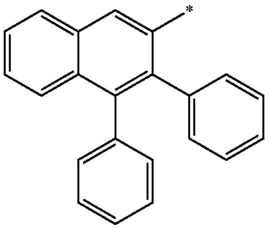 | 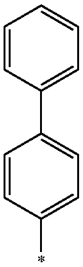 [SMILES: *c1ccc(-c2ccccc2)cc1] | 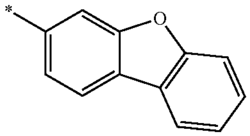 |

-continued
| [Compound Group 1] | | | | |
|---|---|---|---|---|
| | n | A—L—* | $Ar_1$ | $Ar_2$ |
| 1-C1-25 | 0 | 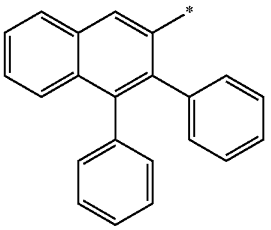 | 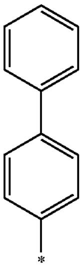 [SMILES: *c1ccc(-c2ccccc2)cc1] | 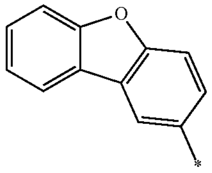 |
| 1-C1-26 | 0 | 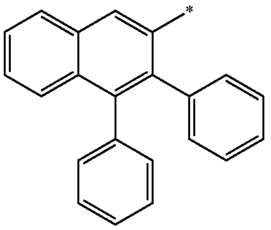 | 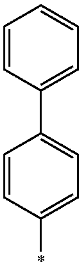 | 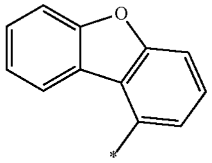 |
| 1-C1-27 | 0 | 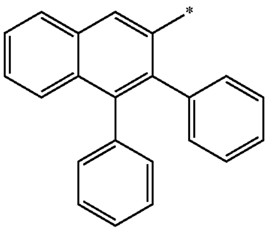 | 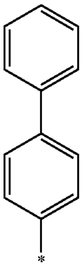 [SMILES: *c1ccc(-c2ccccc2)cc1] | 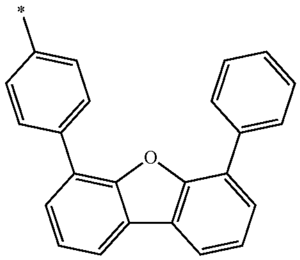 |
| 1-C1-28 | 0 | 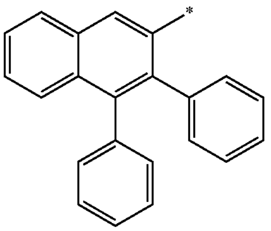 | 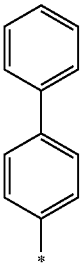 [SMILES: *c1ccc(-c2ccccc2)cc1] | 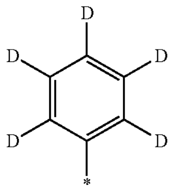 |
| 1-C1-29 | 0 | 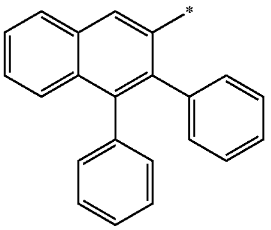 | 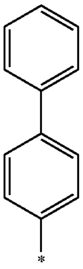 [SMILES: *c1ccc(-c2ccccc2)cc1] | 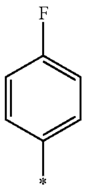 |

-continued
[Compound Group 1]
| | n | A—L—* | $Ar_1$ | $Ar_2$ |
|---|---|---|---|---|
| 1-C1-30 | 0 | 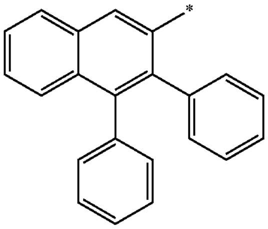 | 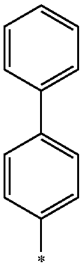 [SMILES: *c1ccc(-c2ccccc2)cc1] | 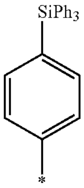 |
| 1-C1-31 | 0 | 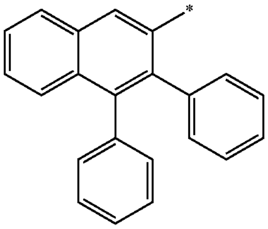 | 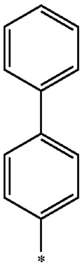 | 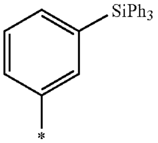 |
| 1-C1-32 | 0 | 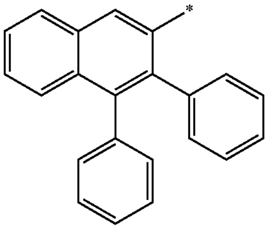 | 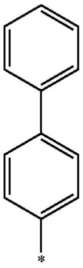 [SMILES: *c1ccc(-c2ccccc2)cc1] | 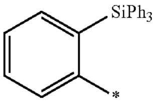 |
| 1-C1-33 | 0 | 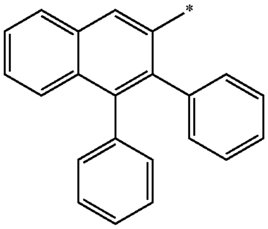 | 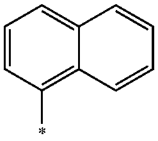 | 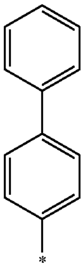 [SMILES: *c1ccc(-c2ccccc2)cc1] |
| 1-C1-34 | 0 | 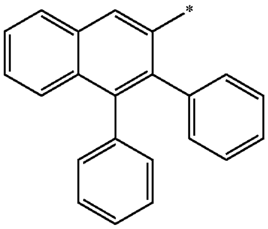 | 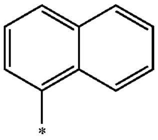 | 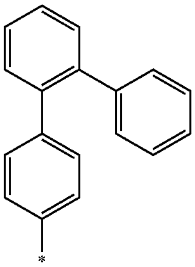 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 1-C1-35 | 0 | 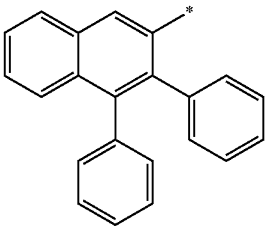 | 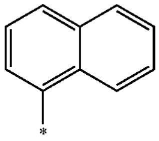 | 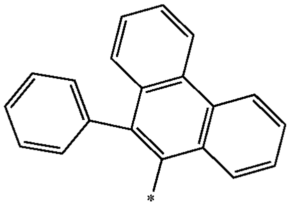 [SMILES: *c1c(-c2ccccc2)c2ccccc2c2ccccc12] |
| 1-C1-36 | 0 | 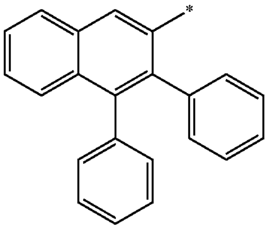 | 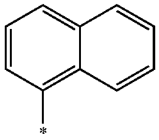 | 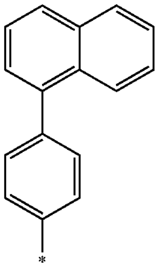 [SMILES: *c1ccc(-c2cccc3ccccc23)cc1] |
| 1-C1-37 | 0 | 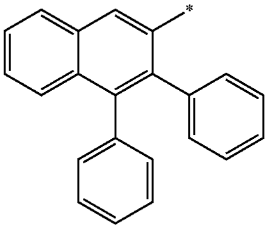 | 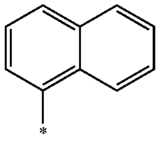 | 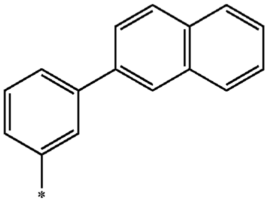 [SMILES: *c1cccc(-c2ccc3ccccc3c2)c1] |
| 1-C1-38 | 0 | 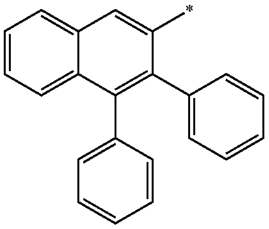 | 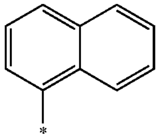 [SMILES: *c1cccc2ccccc12] | 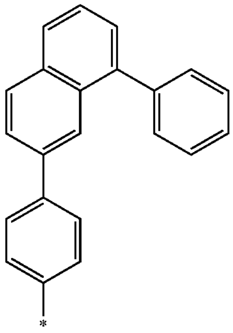 [SMILES: *c1ccc(-c2ccc3cccc(-c4ccccc4)c3c2)cc1] |
| 1-C1-39 | 0 | 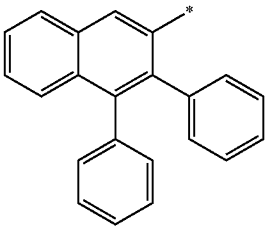 | 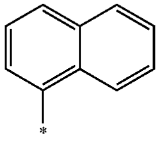 [SMILES: *c1cccc2ccccc12] | 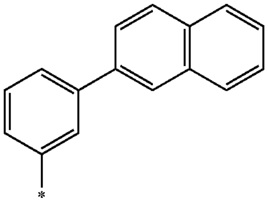 [SMILES: *c1cccc(-c2ccc3ccccc3c2)c1] |

-continued
[Compound Group 1]
| | n | A—L—* | $Ar_1$ | $Ar_2$ |
|---|---|---|---|---|
| 1-C1-40 | 0 | 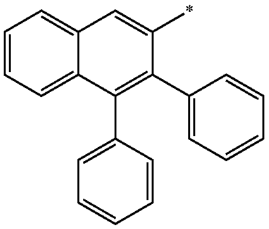 | 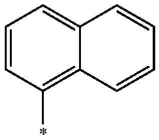 | 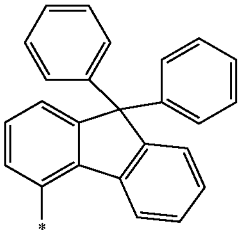 [SMILES: *c1cccc2c1-c1ccccc1C2(c1ccccc1)c1ccccc1] |
| 1-C1-41 | 0 | 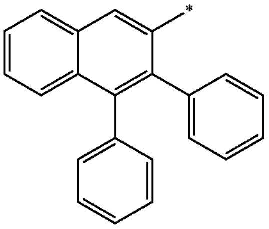 | 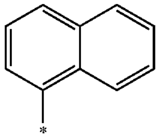 [SMILES: *c1cccc2ccccc12] | 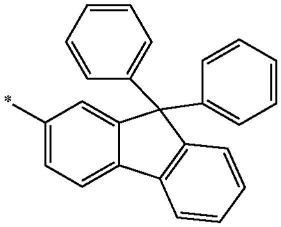 [SMILES: *c1ccc2c(c1)C(c1ccccc1)(c1ccccc1)c1ccccc1-2] |
| 1-C1-42 | 0 | 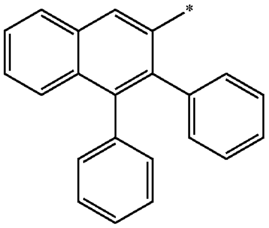 | 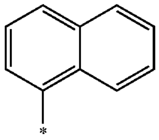 | 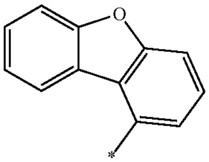 |
| 1-C1-43 | 0 | 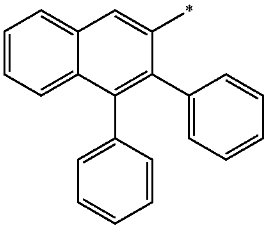 | 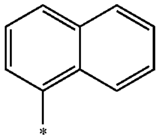 | 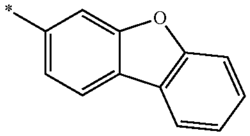 |
| 1-C1-44 | 0 | 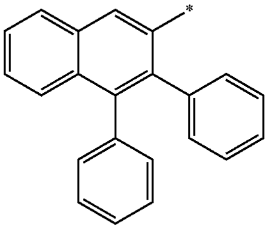 | 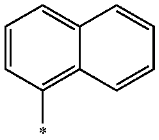 | 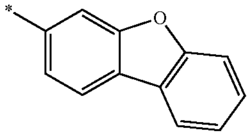 |
| 1-C1-45 | 0 | 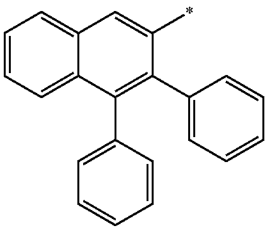 | 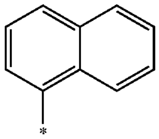 [SMILES: *c1cccc2ccccc12] | 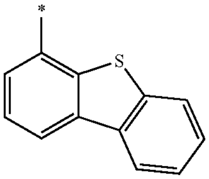 |

-continued
| [Compound Group 1] | | | | |
|---|---|---|---|---|
| | n | A—L—* | $Ar_1$ | $Ar_2$ |
| 1-C1-46 | 0 | 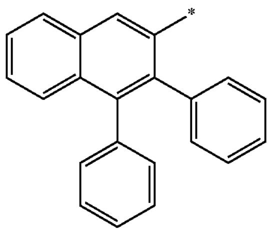 | 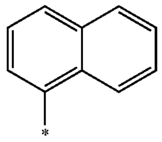 | 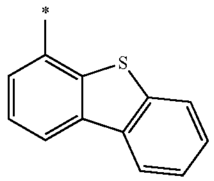 |
| 1-C1-47 | 0 | 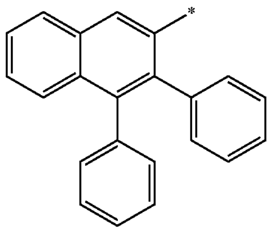 | 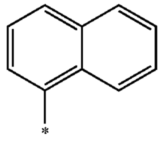 | 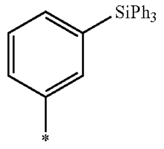 |
| 1-C1-48 | 0 | 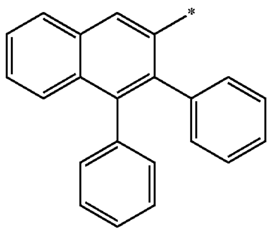 | 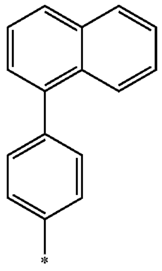 | 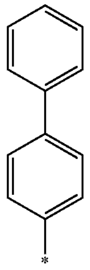 |
| 1-C1-49 | 0 | 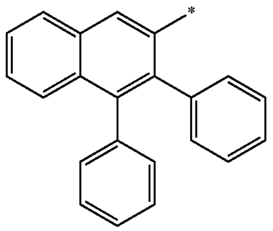 | 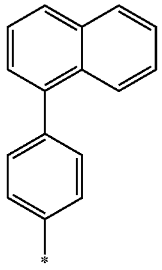 | 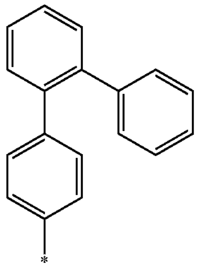 |
| 1-C1-50 | 0 | 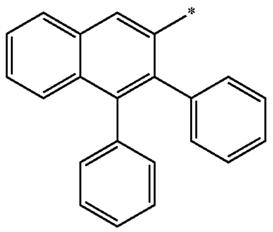 | 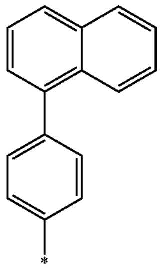 | 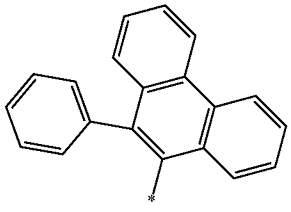 |

-continued
[Compound Group 1]
| | n | A—L—* | $Ar_1$ | $Ar_2$ |
|---|---|---|---|---|
| 1-C1-51 | 0 | 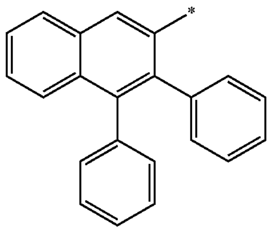 | 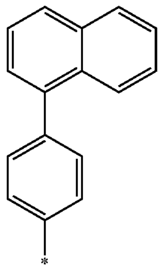 | 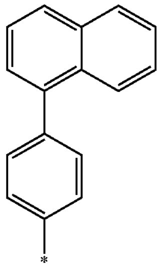 |
| 1-C1-52 | 0 | 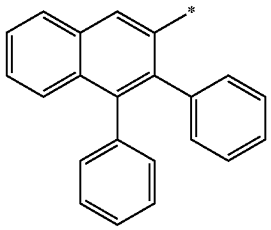 | 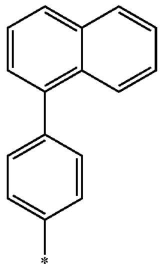 | 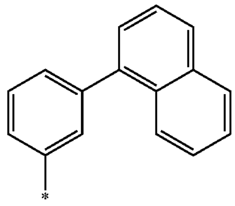 |
| 1-C1-53 | 0 | 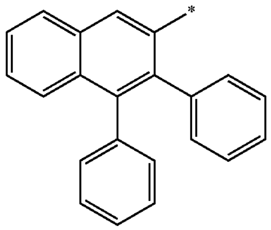 | 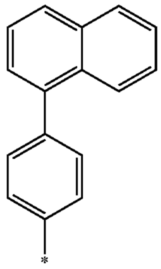 | 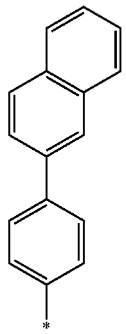 |
| 1-C1-54 | 0 | 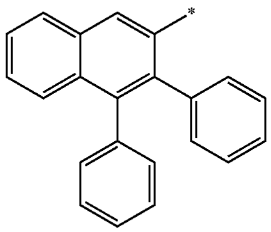 | 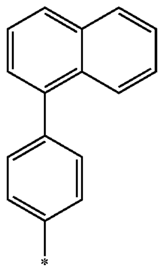 | 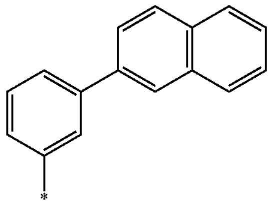 |
| 1-C1-55 | 0 | 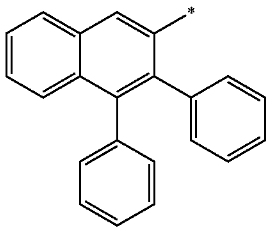 | 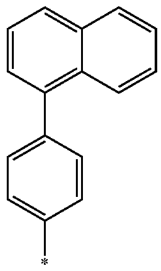 | 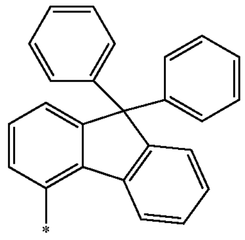 |

-continued
[Compound Group 1]
| | n | A—L—* | $Ar_1$ | $Ar_2$ |
|---|---|---|---|---|
| 1-C1-56 | 0 | 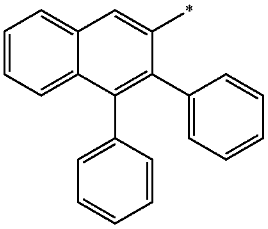 | 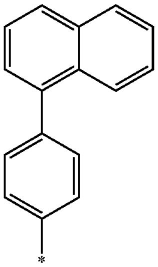 | 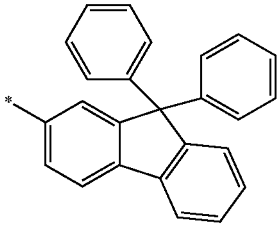 |
| 1-C1-57 | 0 | 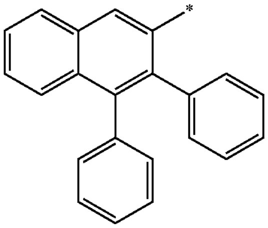 | 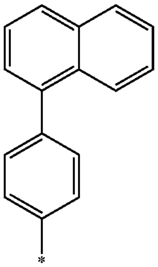 | 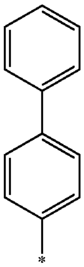 |
| 1-C1-58 | 0 | 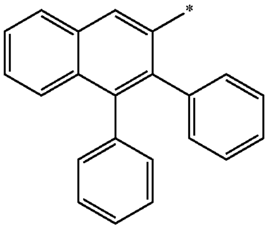 | 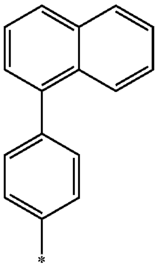 | 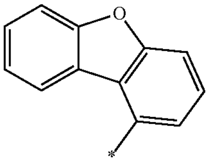 |
| 1-C1-59 | 0 | 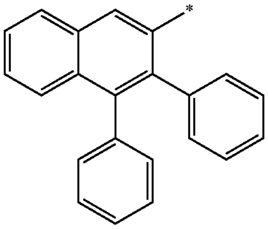 | 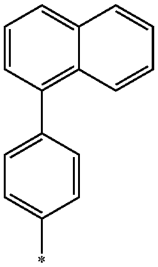 | 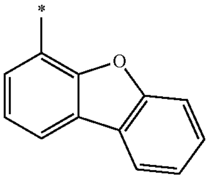 |
| 1-C1-60 | 0 | 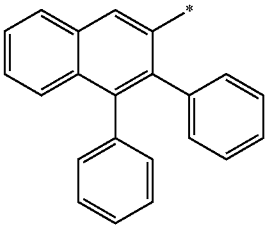 | 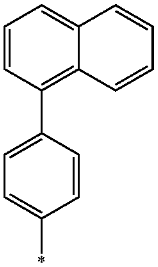 | 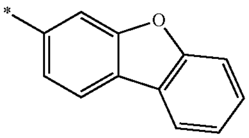 |

-continued
[Compound Group 1]
| | n | A—L—* | $Ar_1$ | $Ar_2$ |
|---|---|---|---|---|
| 1-C1-61 | 0 | 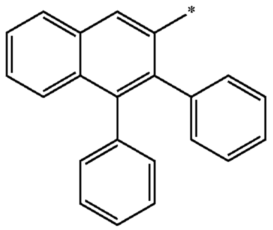 | 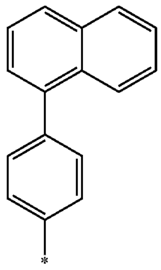 | 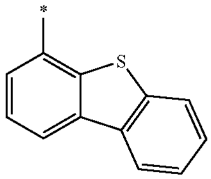 |
| 1-C1-62 | 0 | 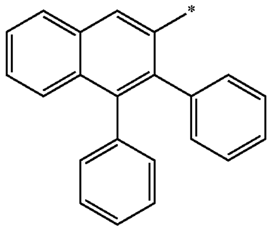 | 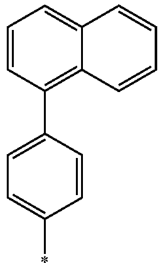 | 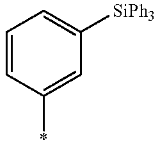 |
| 1-C1-63 | 0 | 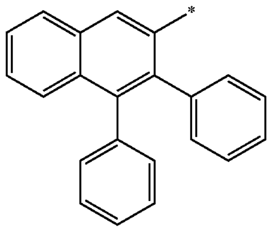 | 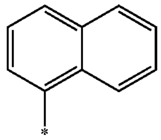 | 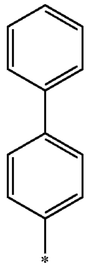 |
| 1-C1-64 | 0 | 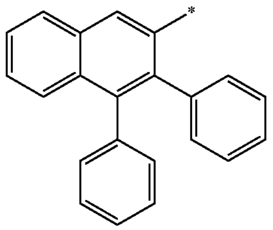 | 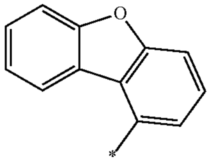 | 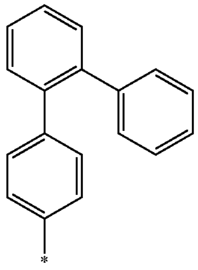 |
| 1-C1-65 | 0 | 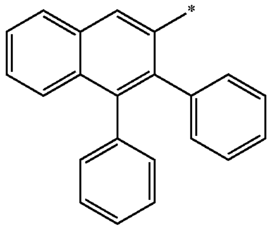 | 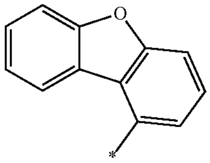 | 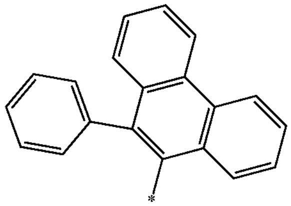 |

-continued
| [Compound Group 1] | | | | |
|---|---|---|---|---|
| | n | A—L—* | $Ar_1$ | $Ar_2$ |
| 1-C1-66 | 0 | 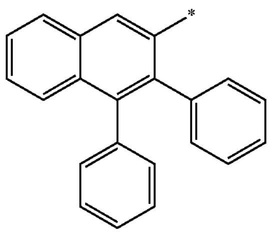 | 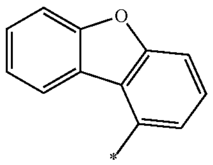 | 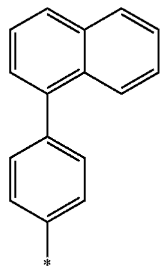 |
| 1-C1-67 | 0 | 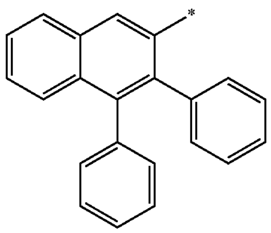 | 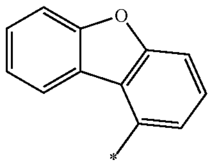 | 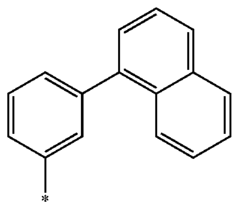 |
| 1-C1-68 | 0 | 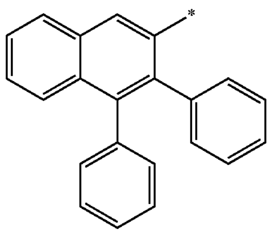 | 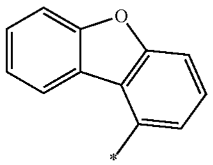 | 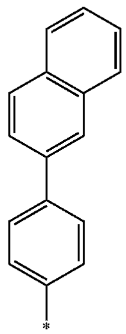 |
| 1-C1-69 | 0 | 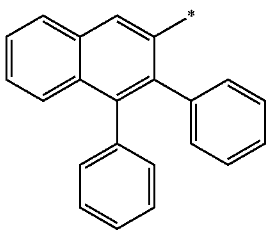 | 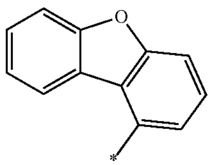 | 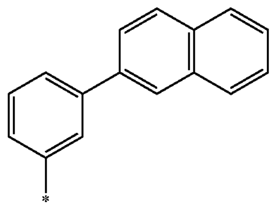 |
| 1-C1-70 | 0 | 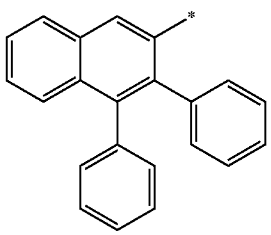 | 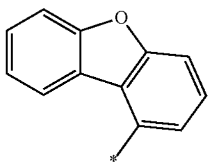 | 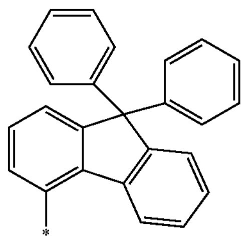 |

-continued
| [Compound Group 1] | | | | |
|---|---|---|---|---|
| | n | A—L—* | $Ar_1$ | $Ar_2$ |
| 1-C1-71 | 0 | 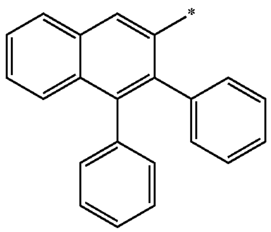 | 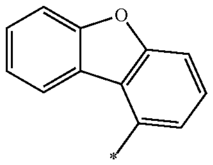 | 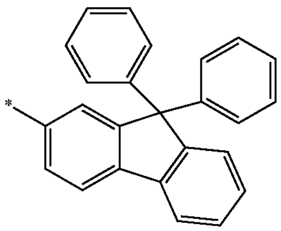 |
| 1-C1-72 | 0 | 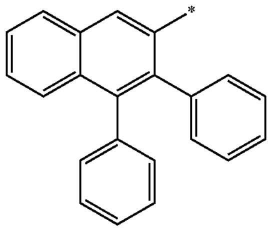 | 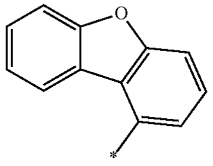 | 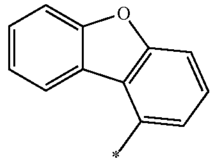 |
| 1-C1-73 | 0 | 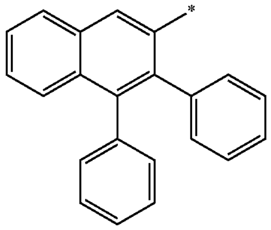 | 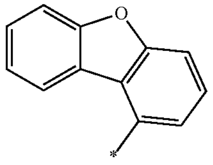 | 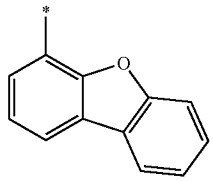 |
| 1-C1-74 | 0 | 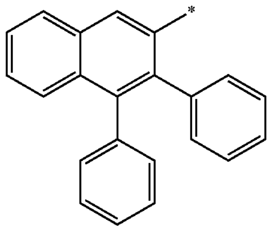 | 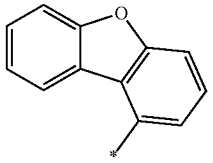 | 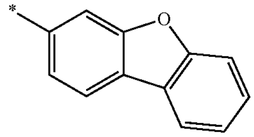 [SMILES: *c1ccc2c(c1)oc1ccccc12] |
| 1-C1-75 | 0 | 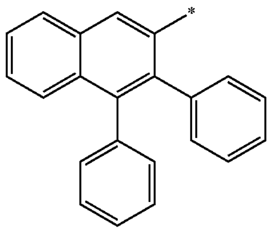 | 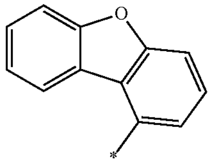 | 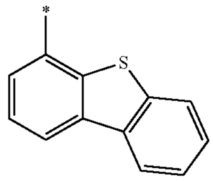 |
| 1-C1-76 | 0 | 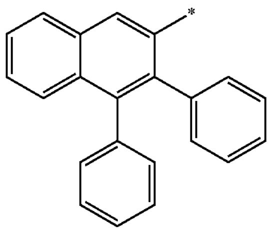 | 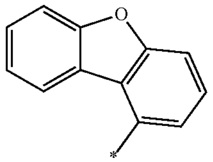 | 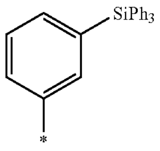 |

-continued
[Compound Group 1]
| | n | A—L—* | $Ar_1$ | $Ar_2$ |
|---|---|---|---|---|
| 1-C1-77 | 0 | 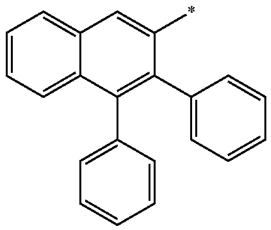 | 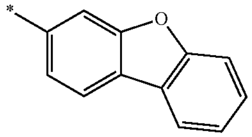 [SMILES: *c1ccc2c(c1)oc1ccccc12] | 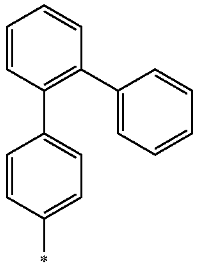 [SMILES: *c1ccc(-c2ccccc2-c2ccccc2)cc1] |
| 1-C1-78 | 0 | 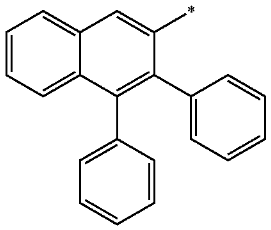 | 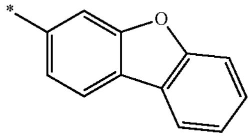 [SMILES: *c1ccc2c(c1)oc1ccccc12] | 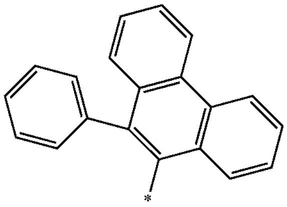 [SMILES: *c1c(-c2ccccc2)c2ccccc2c2ccccc12] |
| 1-C1-79 | 0 | 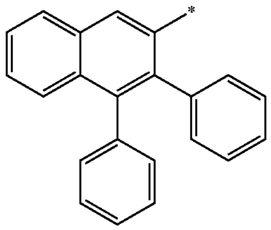 | 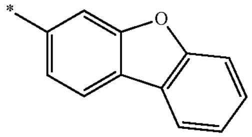 [SMILES: *c1ccc2c(c1)oc1ccccc12] | 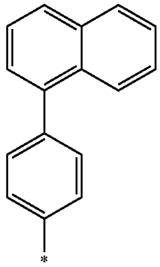 [SMILES: *c1ccc(-c2cccc3ccccc23)cc1] |
| 1-C1-80 | 0 | 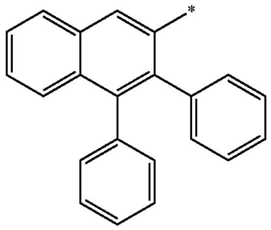 | 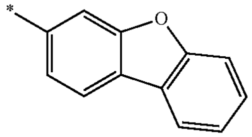 [SMILES: *c1ccc2c(c1)oc1ccccc12] | 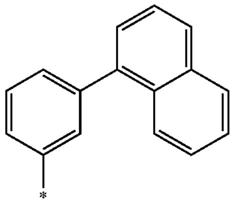 |
| 1-C1-81 | 0 | 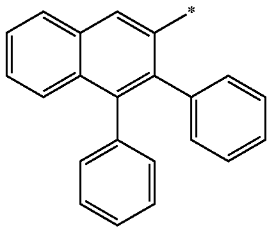 | 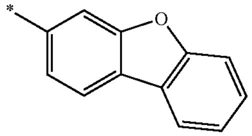 [SMILES: *c1ccc2c(c1)oc1ccccc12] | 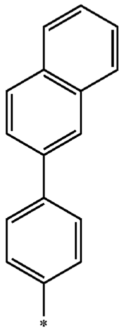 [SMILES: *c1ccc(-c2ccc3ccccc3c2)cc1] |

-continued
[Compound Group 1]
| | n | A—L—* | $Ar_1$ | $Ar_2$ |
|---|---|---|---|---|
| 1-C1-82 | 0 | 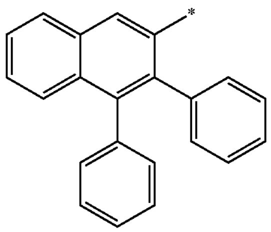 | 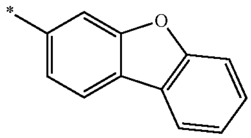 [SMILES: *c1ccc2c(c1)oc1ccccc12] | 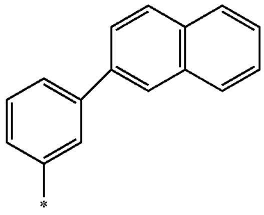 [SMILES: *c1cccc(-c2ccc3ccccc3c2)c1] |
| 1-C1-83 | 0 | 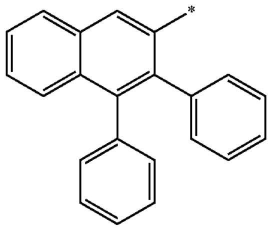 | 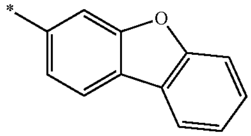 [SMILES: *c1ccc2c(c1)oc1ccccc12] | 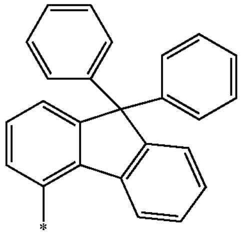 |
| 1-C1-84 | 0 | 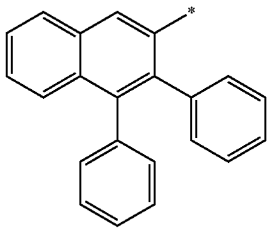 | 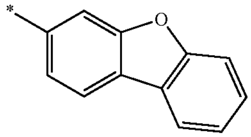 [SMILES: *c1ccc2c(c1)oc1ccccc12] | 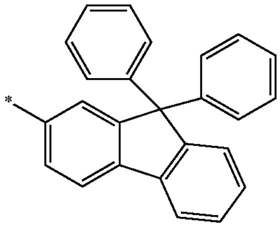 |
| 1-C1-85 | 0 | 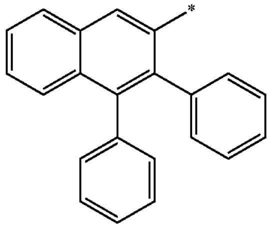 | 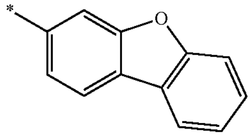 [SMILES: *c1ccc2c(c1)oc1ccccc12] | 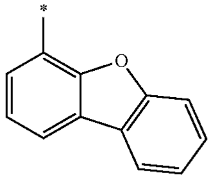 |
| 1-C1-86 | 0 | 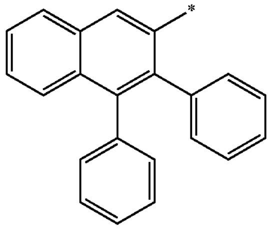 | 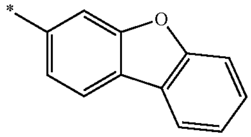 [SMILES: *c1ccc2c(c1)oc1ccccc12] | 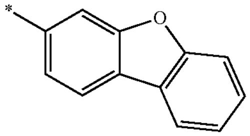 |
| 1-C1-87 | 0 | 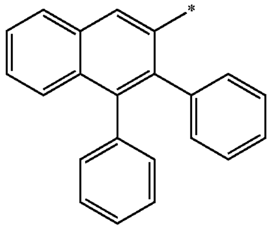 | 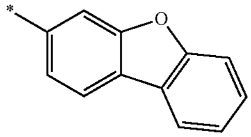 [SMILES: *c1ccc2c(c1)oc1ccccc12] | 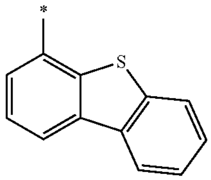 |

-continued
| [Compound Group 1] | | | | |
|---|---|---|---|---|
| | n | A—L—* | $Ar_1$ | $Ar_2$ |
| 1-C1-88 | 0 | 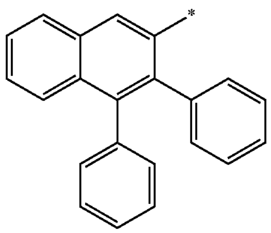 | 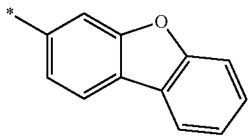 [SMILES: *c1ccc2c(c1)oc1ccccc12] | 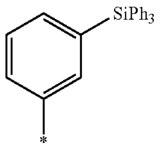 |
| 1-C1-89 | 0 | 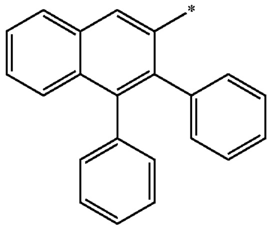 | 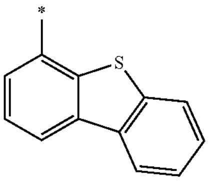 | 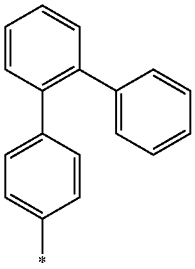 |
| 1-C1-90 | 0 | 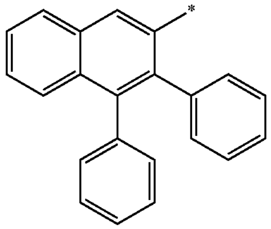 | 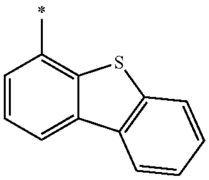 | 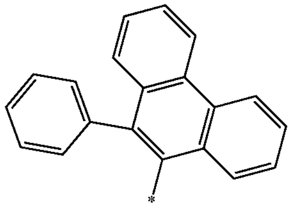 |
| 1-C1-91 | 0 | 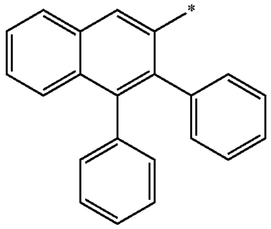 | 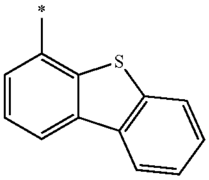 | 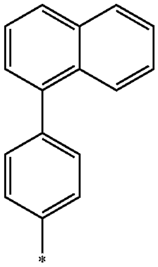 |
| 1-C1-92 | 0 | 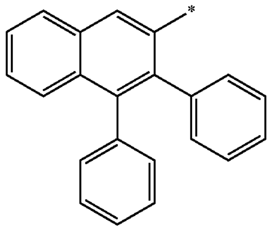 | 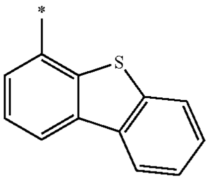 | 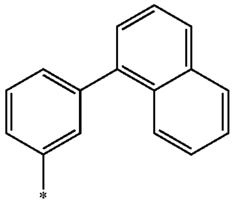 |

-continued
| [Compound Group 1] | | | | |
|---|---|---|---|---|
| | n | A—L—* | $Ar_1$ | $Ar_2$ |
| 1-C1-93 | 0 | 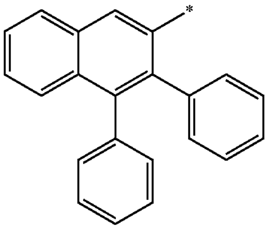 | 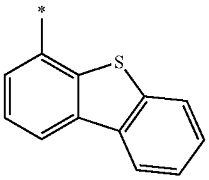 | 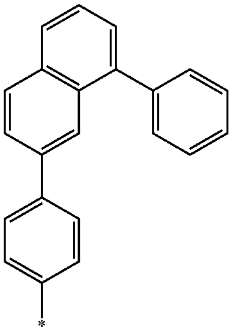 |
| 1-C1-94 | 0 | 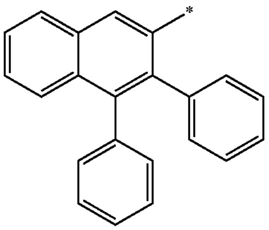 | 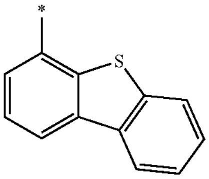 | 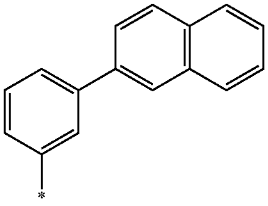 |
| 1-C1-95 | 0 | 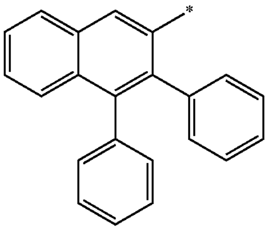 | 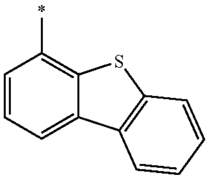 | 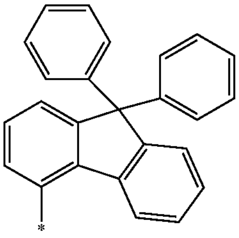 |
| 1-C1-96 | 0 | 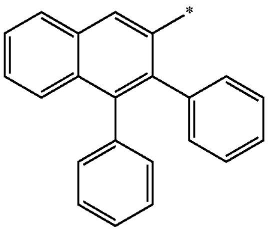 | 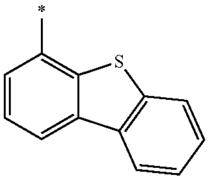 | 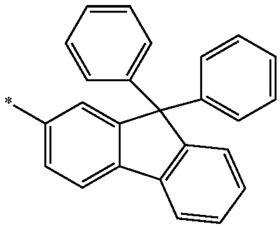 |
| 1-C1-97 | 0 | 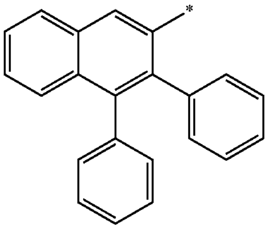 | 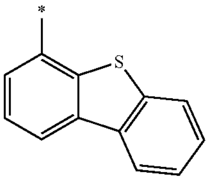 | 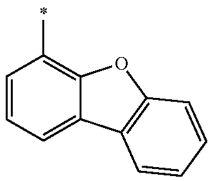 |
| 1-C1-98 | 0 | 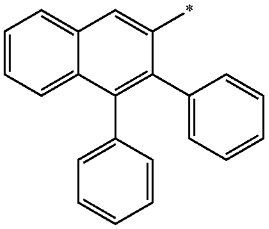 | 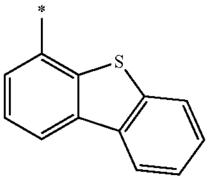 | 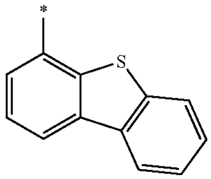 |

-continued
[Compound Group 1]
| | n | A—L—* | $Ar_1$ | $Ar_2$ |
|---|---|---|---|---|
| 1-C1-99 | 0 | 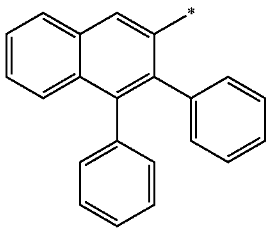 | 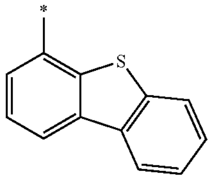 | 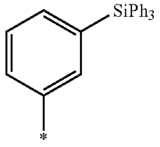 |
| 2-C1-1 | 0 | 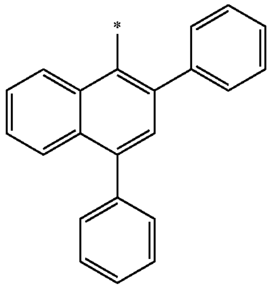 | 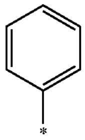 | 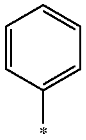 |
| 2-C1-2 | 0 | 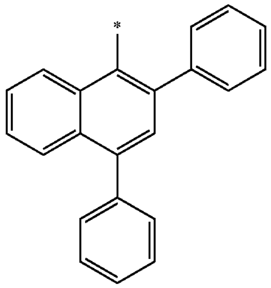 | 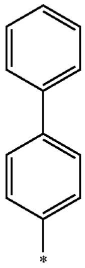 | 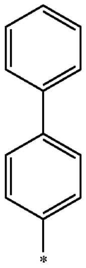 [SMILES: *c1ccc(-c2ccccc2)cc1] |
| 2-C1-3 | 0 | 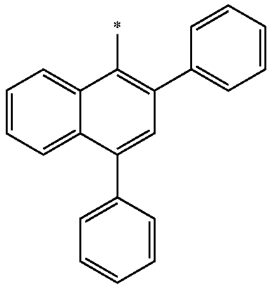 | 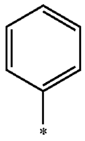 | 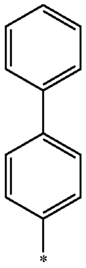 [SMILES: *c1ccc(-c2ccccc2)cc1] |
| 2-C1-4 | 0 | 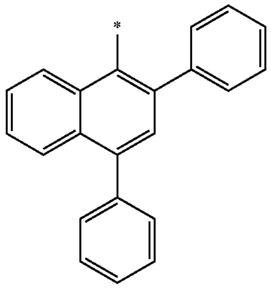 | 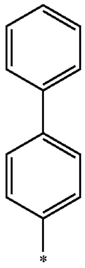 [SMILES: *c1ccc(-c2ccccc2)cc1] | 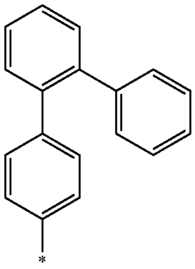 [SMILES: *c1ccc(-c2ccccc2-c2ccccc2)cc1] |

-continued
| [Compound Group 1] | | | | |
|---|---|---|---|---|
| | n | A—L—* | $Ar_1$ | $Ar_2$ |
| 2-C1-5 | 0 | 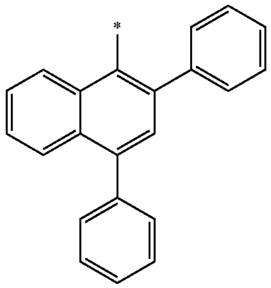 | 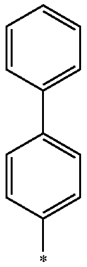 [SMILES: *c1ccc(-c2ccccc2)cc1] | 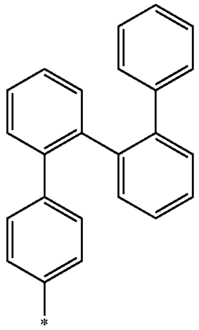 [SMILES: *c1ccc(-c2ccccc2-c2ccccc2-c2ccccc2)cc1] |
| 2-C1-6 | 0 | 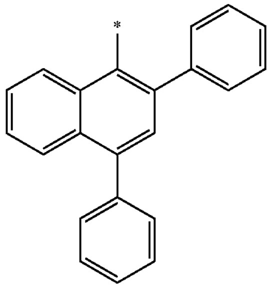 | 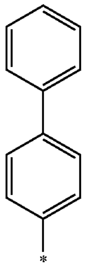 | 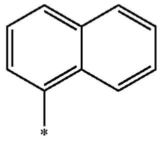 |
| 2-C1-7 | 0 | 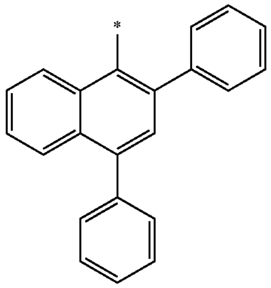 | 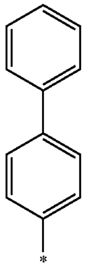 [SMILES: *c1ccc(-c2ccccc2)cc1] | 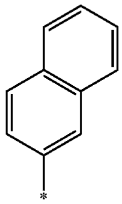 |
| 2-C1-8 | 0 | 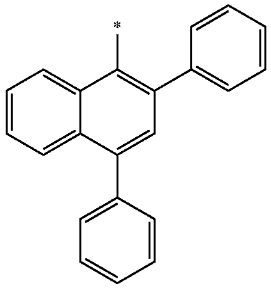 | 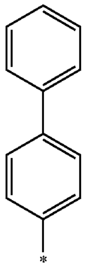 | 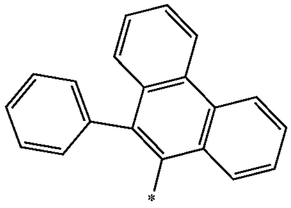 [SMILES: *c1c(-c2ccccc2)c2ccccc2c2ccccc12] |
| 2-C1-9 | 0 | 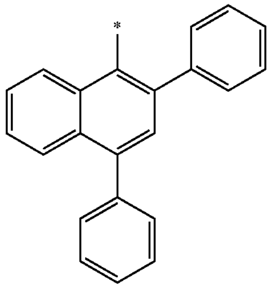 | 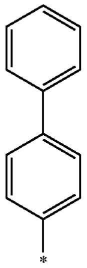 [SMILES: *c1ccc(-c2ccccc2)cc1] | 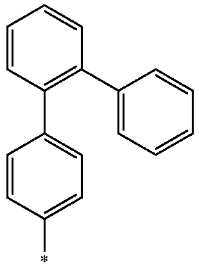 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 2-C1-10 | 0 | 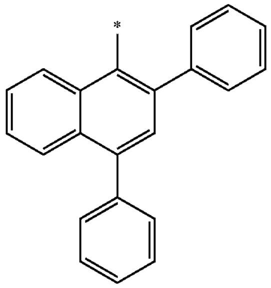 | 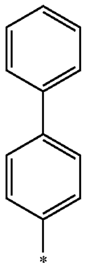 [SMILES: *c1ccc(-c2ccccc2)cc1] | 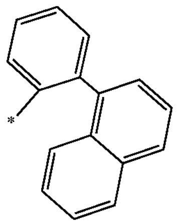 [SMILES: *c1ccccc1-c1cccc2ccccc12] |
| 2-C1-11 | 0 | 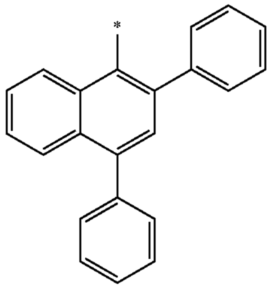 | 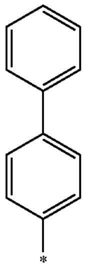 [SMILES: *c1ccc(-c2ccccc2)cc1] | 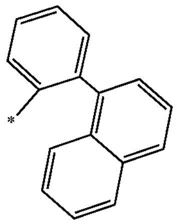 [SMILES: *c1ccccc1-c1cccc2ccccc12] |
| 2-C1-12 | 0 | 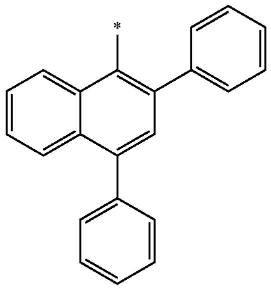 | 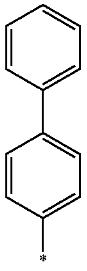 [SMILES: *c1ccc(-c2ccccc2)cc1] | 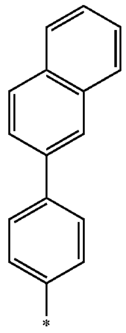 |
| 2-C1-13 | 0 | 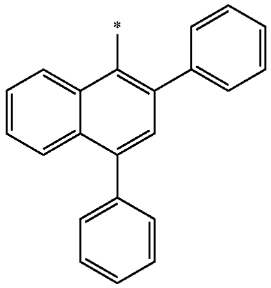 | 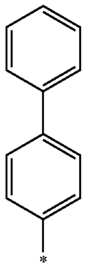 | 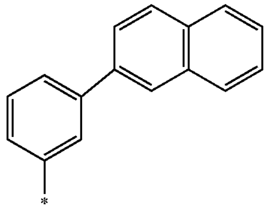 [SMILES: *c1cccc(-c2ccc3ccccc3c2)c1] |
| 2-C1-14 | 0 | 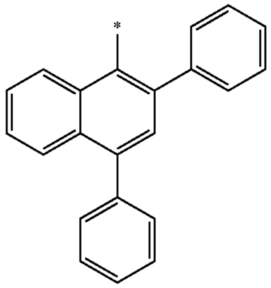 | 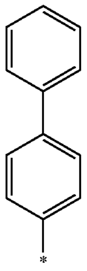 [SMILES: *c1ccc(-c2ccccc2)cc1] | 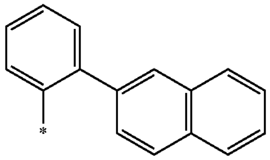 [SMILES: *c1ccccc1-c1ccc2ccccc2c1] |

-continued
[Compound Group 1]
| | n | A—L—* | $Ar_1$ | $Ar_2$ |
|---|---|---|---|---|
| 2-C1-15 | 0 | 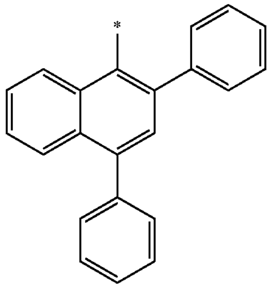 | 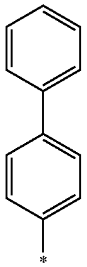 [SMILES: *c1ccc(-c2ccccc2)cc1] | 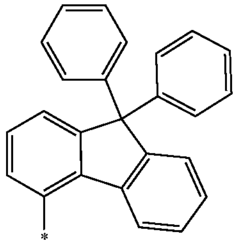 [SMILES: *c1cccc2c1-c1ccccc1C2(c1ccccc1)c1ccccc1] |
| 2-C1-16 | 0 | 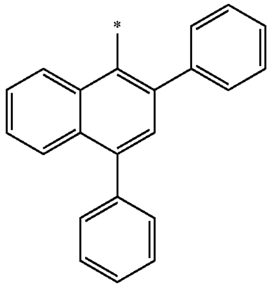 | 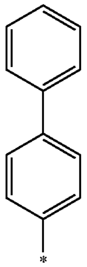 | 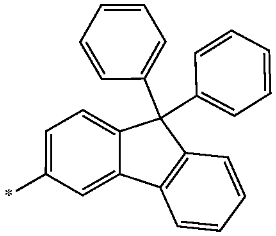 [SMILES: *c1ccc2c(c1)-c1ccccc1C2(c1ccccc1)c1ccccc1] |
| 2-C1-17 | 0 | 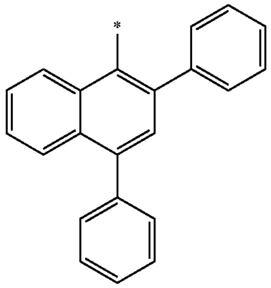 | 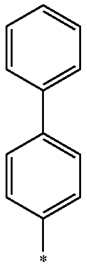 [SMILES: *c1ccc(-c2ccccc2)cc1] | 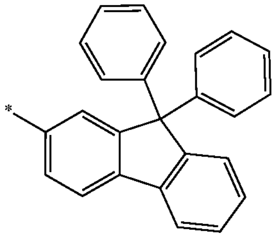 [SMILES: *c1ccc2c(c1)C(c1ccccc1)(c1ccccc1)c1ccccc1-2] |
| 2-C1-18 | 0 | 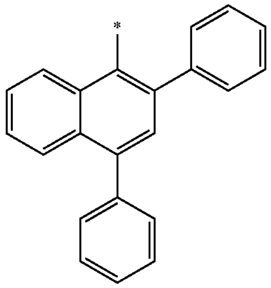 | 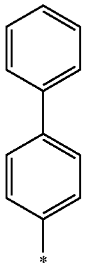 [SMILES: *c1ccc(-c2ccccc2)cc1] | 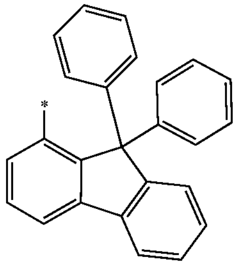 [SMILES: *c1cccc2c1C(c1ccccc1)(c1ccccc1)c1ccccc1-2] |
| 2-C1-19 | 0 | 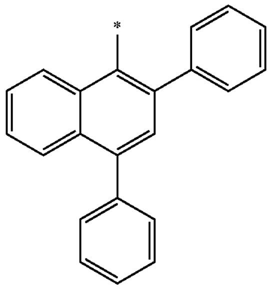 | 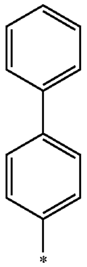 [SMILES: *c1ccc(-c2ccccc2)cc1] | 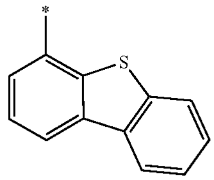 [SMILES: *c1cccc2c1sc1ccccc12] |

-continued
| [Compound Group 1] | | | | |
|---|---|---|---|---|
| | n | A—L—* | $Ar_1$ | $Ar_2$ |
| 2-C1-20 | 0 | 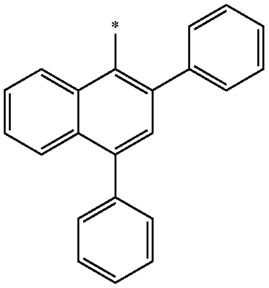 | 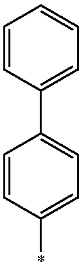 [SMILES: *c1ccc(-c2ccccc2)cc1] | 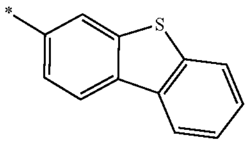 [SMILES: *c1ccc2c(c1)sc1ccccc12] |
| 2-C1-21 | 0 | 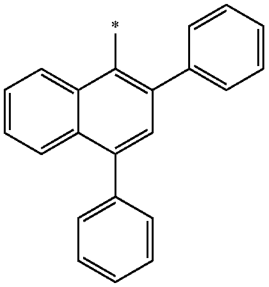 | 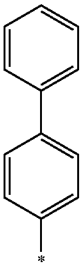 | 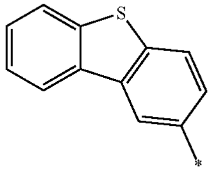 |
| 2-C1-22 | 0 | 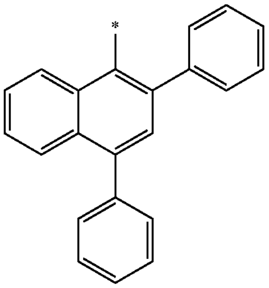 | 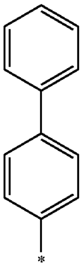 [SMILES: *c1ccc(-c2ccccc2)cc1] | 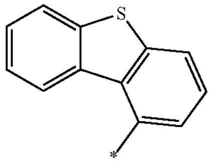 |
| 2-C1-23 | 0 | 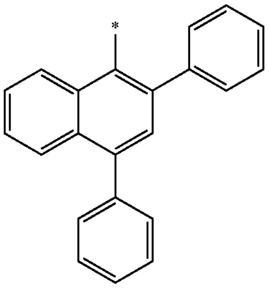 | 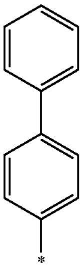 [SMILES: *c1ccc(-c2ccccc2)cc1] | 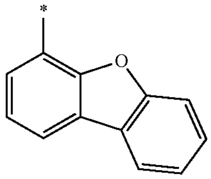 |
| 2-C1-24 | 0 | 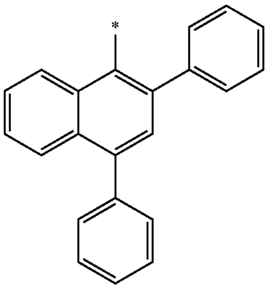 | 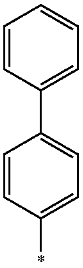 [SMILES: *c1ccc(-c2ccccc2)cc1] | 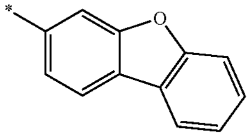 |

-continued
[Compound Group 1]
| | n | A—L—* | $Ar_1$ | $Ar_2$ |
|---|---|---|---|---|
| 2-C1-25 | 0 | 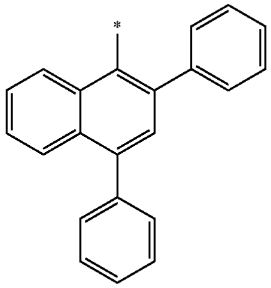 | 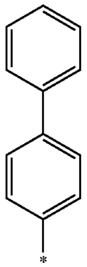 [SMILES: *c1ccc(-c2ccccc2)cc1] | 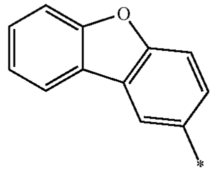 |
| 2-C1-26 | 0 | 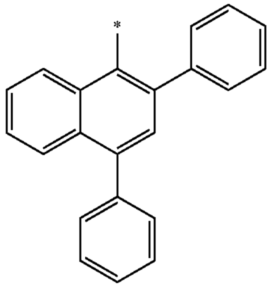 | 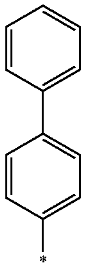 | 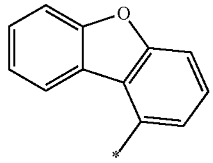 |
| 2-C1-27 | 0 | 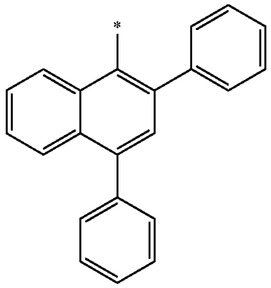 | 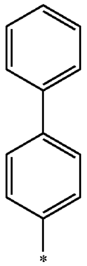 [SMILES: *c1ccc(-c2ccccc2)cc1] | 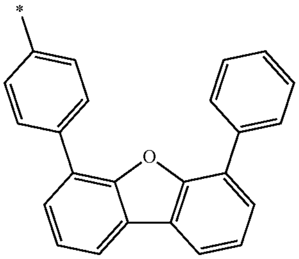 |
| 2-C1-28 | 0 | 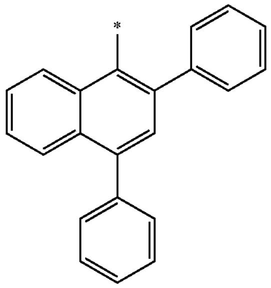 | 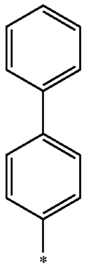 [SMILES: *c1ccc(-c2ccccc2)cc1] | 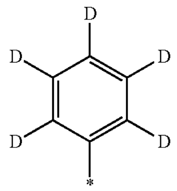 |
| 2-C1-29 | 0 | 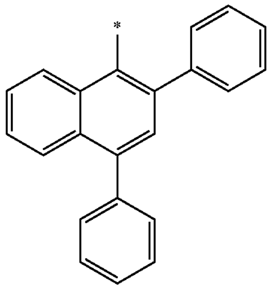 | 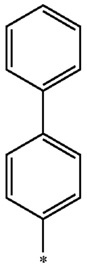 [SMILES: *c1ccc(-c2ccccc2)cc1] | 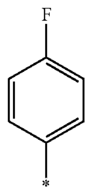 |

-continued
| [Compound Group 1] | | | | |
|---|---|---|---|---|
| | n | A—L—* | $Ar_1$ | $Ar_2$ |
| 2-C1-30 | 0 | 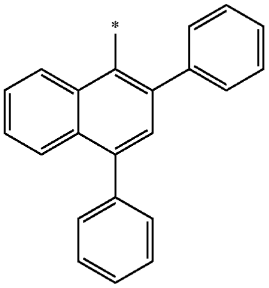 | 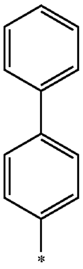 [SMILES: *c1ccc(-c2ccccc2)cc1] | 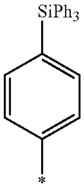 |
| 2-C1-31 | 0 | 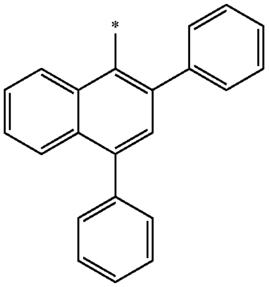 | 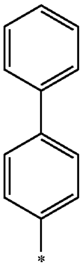 | 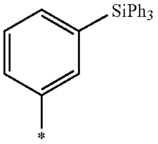 |
| 2-C1-32 | 0 | 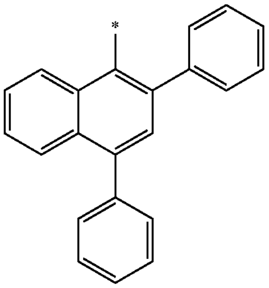 | 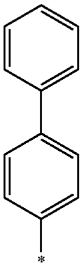 [SMILES: *c1ccc(-c2ccccc2)cc1] | 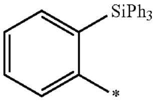 |
| 2-C1-33 | 0 | 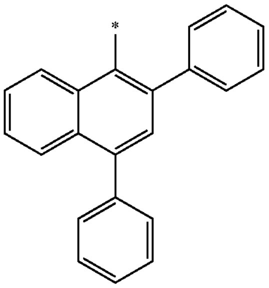 | 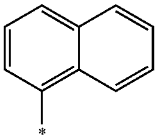 | 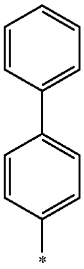 [SMILES: *c1ccc(-c2ccccc2)cc1] |
| 2-C1-34 | 0 | 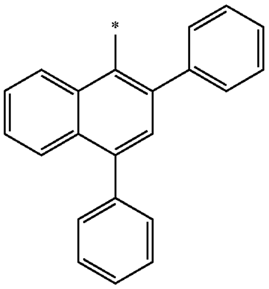 | 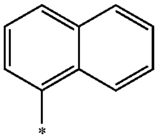 | 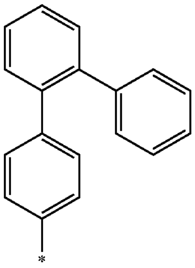 [SMILES: *c1ccc(-c2ccccc2-c2ccccc2)cc1] |

-continued
| [Compound Group 1] | | | | |
|---|---|---|---|---|
| | n | A—L—* | $Ar_1$ | $Ar_2$ |
| 2-C1-35 | 0 | 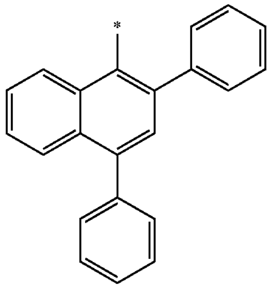 | 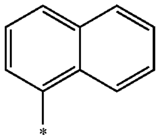 | 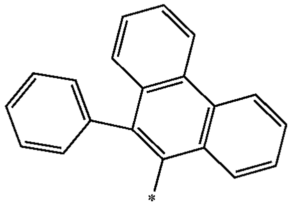 [SMILES: *c1c(-c2ccccc2)c2ccccc2c2ccccc12] |
| 2-C1-36 | 0 | 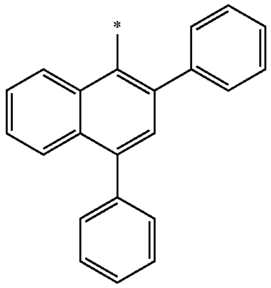 | 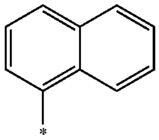 [SMILES: *c1cccc2ccccc12] | 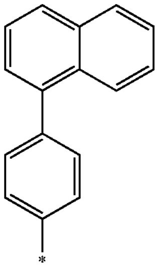 [SMILES: *c1ccc(-c2cccc3ccccc23)cc1] |
| 2-C1-37 | 0 | 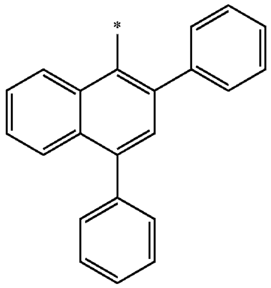 | 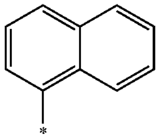 | 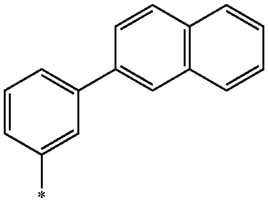 [SMILES: *c1cccc(-c2ccc3ccccc3c2)c1] |
| 2-C1-38 | 0 | 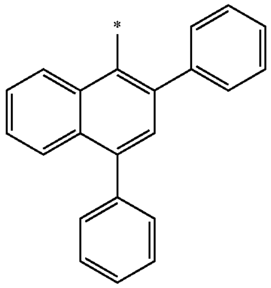 | 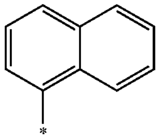 | 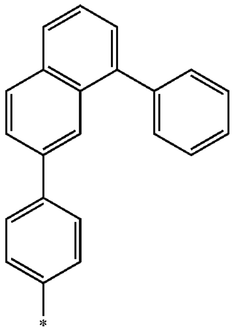 [SMILES: *c1ccc(-c2ccc3cccc(-c4ccccc4)c3c2)cc1] |
| 2-C1-39 | 0 | 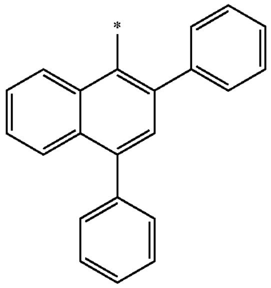 | 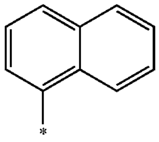 | 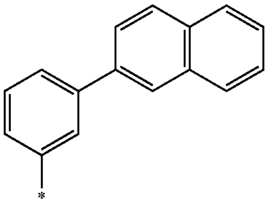 [SMILES: *c1cccc(-c2ccc3ccccc3c2)c1] |

-continued
[Compound Group 1]
| | n | A—L—* | $Ar_1$ | $Ar_2$ |
|---|---|---|---|---|
| 2-C1-40 | 0 | 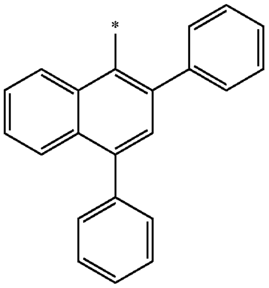 | 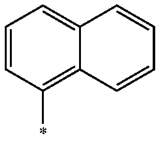 | 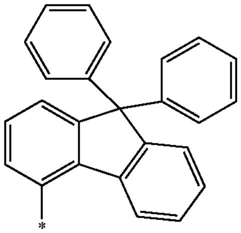 [SMILES: *c1cccc2c1-c1ccccc1C2(c1ccccc1)c1ccccc1] |
| 2-C1-41 | 0 | 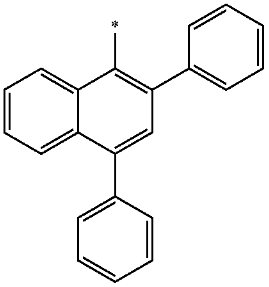 | 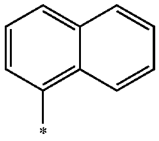 | 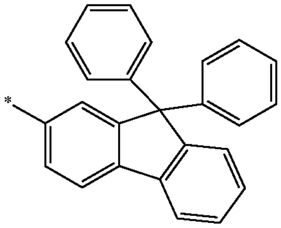 [SMILES: *c1ccc2c(c1)C(c1ccccc1)(c1ccccc1)c1ccccc1-2] |
| 2-C1-42 | 0 | 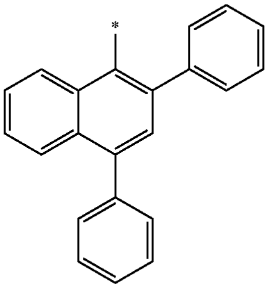 | 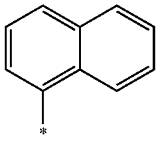 [SMILES: *c1cccc2ccccc12] | 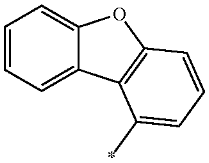 |
| 2-C1-43 | 0 | 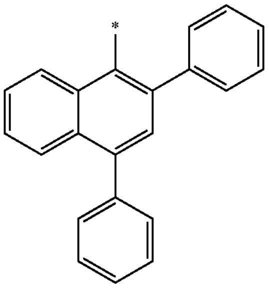 | 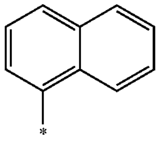 | 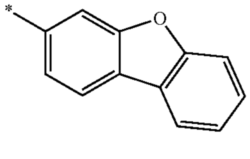 |
| 2-C1-44 | 0 | 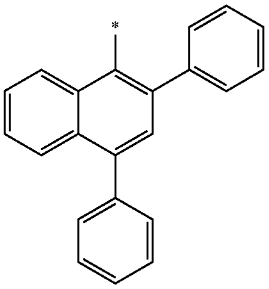 | 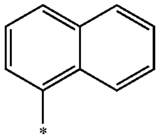 | 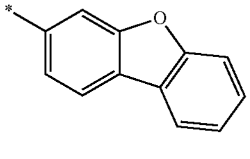 |

-continued
[Compound Group 1]
| | n | A—L—* | $Ar_1$ | $Ar_2$ |
|---|---|---|---|---|
| 2-C1-45 | 0 | 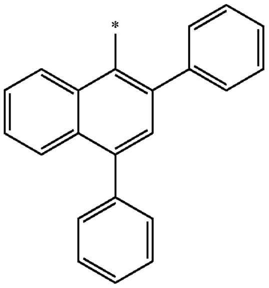 | 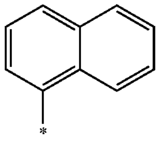 | 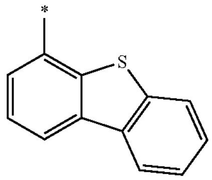 |
| 2-C1-46 | 0 | 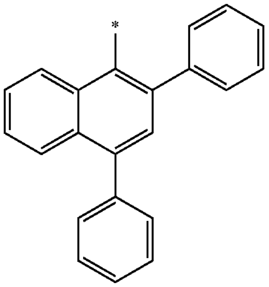 | 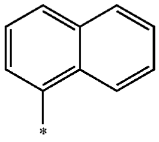 | 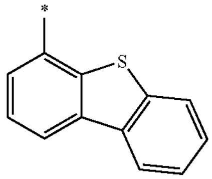 |
| 2-C1-47 | 0 | 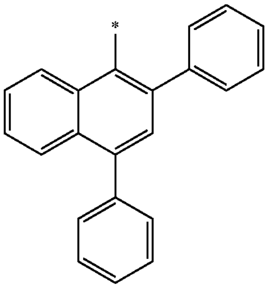 | 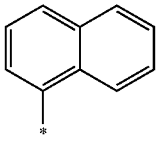 [SMILES: *c1cccc2ccccc12] | 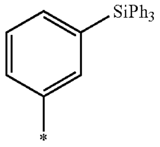 |
| 2-C1-48 | 0 | 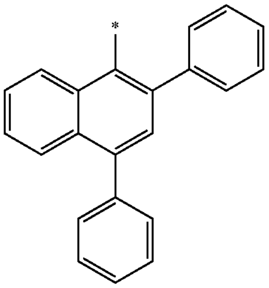 | 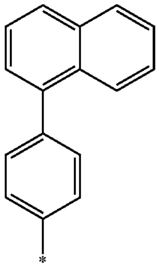 | 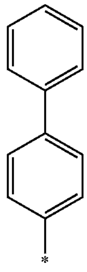 |
| 2-C1-49 | 0 | 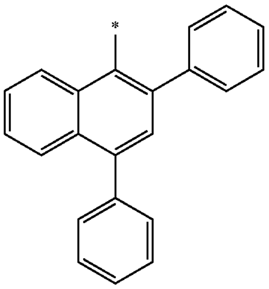 | 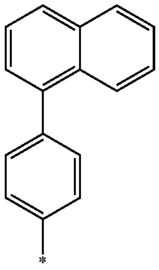 | 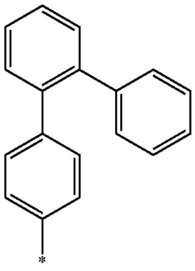 |

-continued
[Compound Group 1]
| | n | A—L—* | $Ar_1$ | $Ar_2$ |
|---|---|---|---|---|
| 2-C1-50 | 0 | 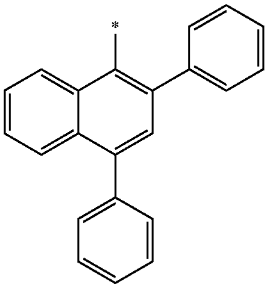 | 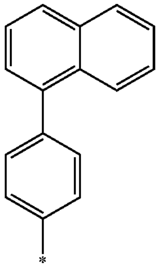 | 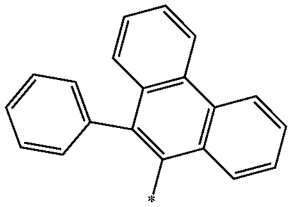 |
| 2-C1-51 | 0 | 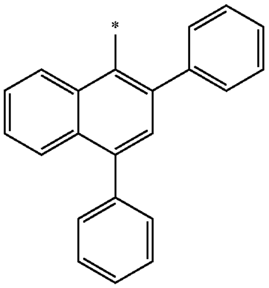 | 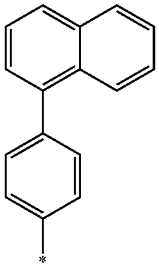 | 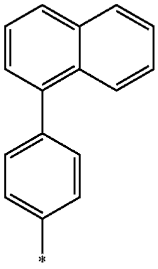 |
| 2-C1-52 | 0 | 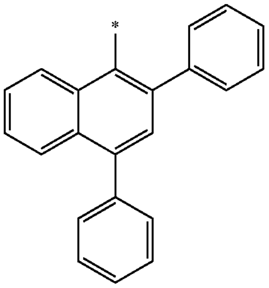 | 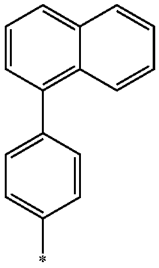 | 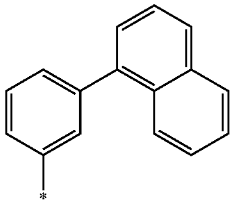 |
| 2-C1-53 | 0 | 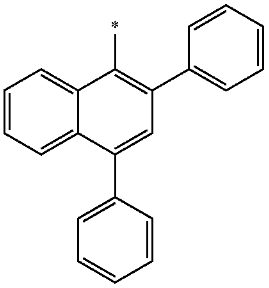 | 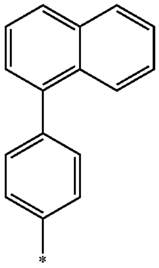 | 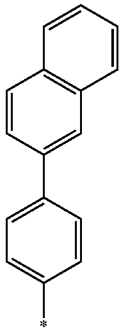 |
| 2-C1-54 | 0 | 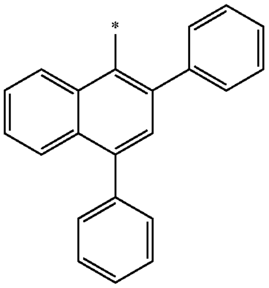 | 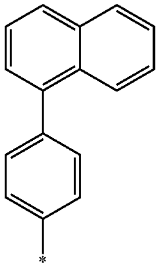 | 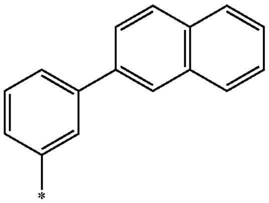 |

-continued
| [Compound Group 1] | | | | |
|---|---|---|---|---|
| | n | A—L—* | $Ar_1$ | $Ar_2$ |
| 2-C1-55 | 0 | 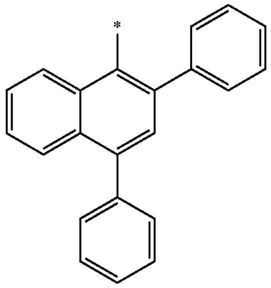 | 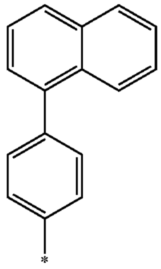 | 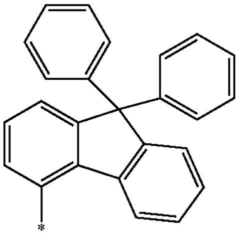 |
| 2-C1-56 | 0 | 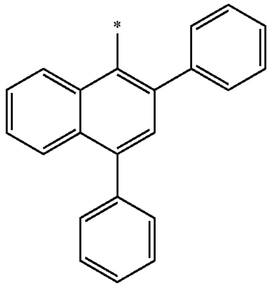 | 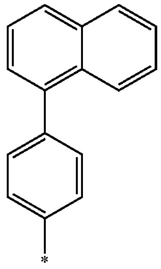 | 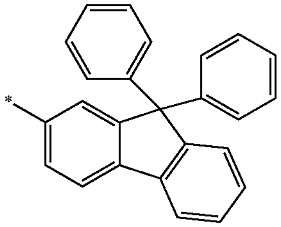 |
| 2-C1-57 | 0 | 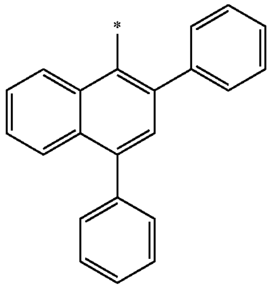 | 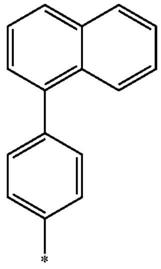 | 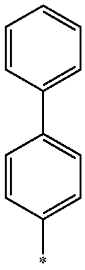 |
| 2-C1-58 | 0 | 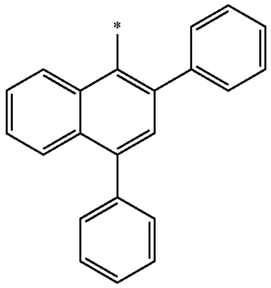 | 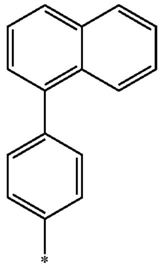 | 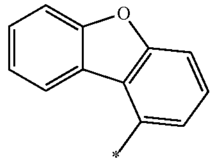 |
| 2-C1-59 | 0 | 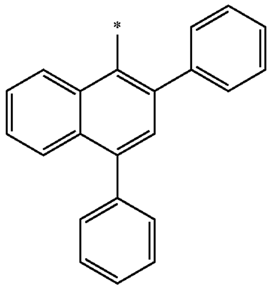 | 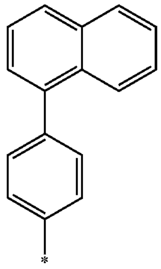 | 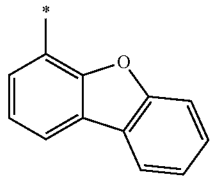 |

-continued
| [Compound Group 1] | | | | |
|---|---|---|---|---|
| | n | A—L—* | $Ar_1$ | $Ar_2$ |
| 2-C1-60 | 0 | 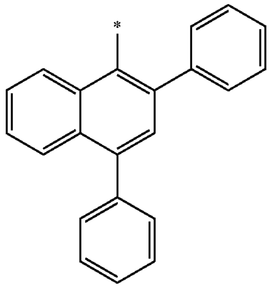 | 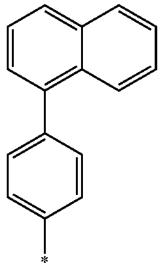 | 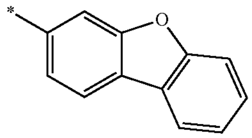 |
| 2-C1-61 | 0 | 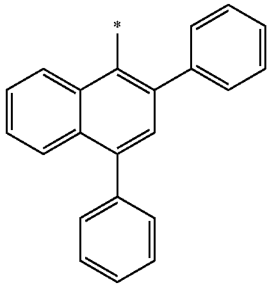 | 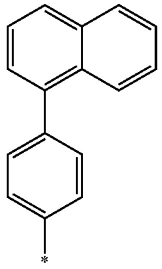 | 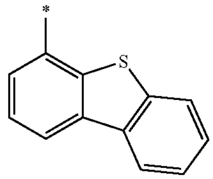 |
| 2-C1-62 | 0 | 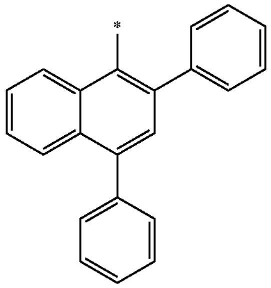 | 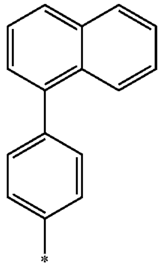 | 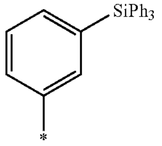 |
| 2-C1-63 | 0 | 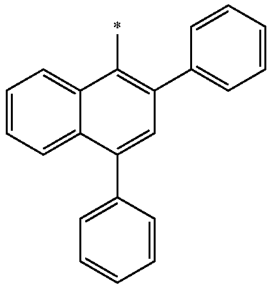 | 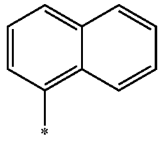 [SMILES: *c1cccc2ccccc12] | 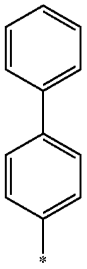 |
| 2-C1-64 | 0 | 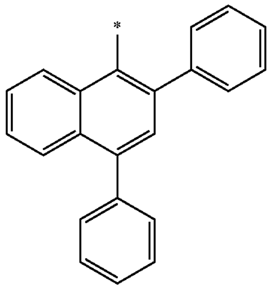 | 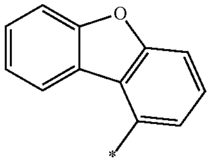 | 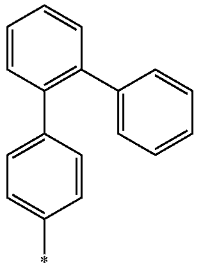 |

-continued
[Compound Group 1]
| | n | A—L—* | $Ar_1$ | $Ar_2$ |
|---|---|---|---|---|
| 2-C1-65 | 0 | 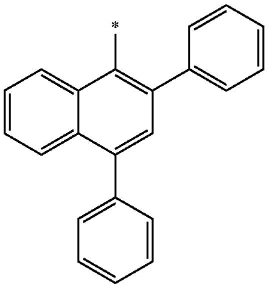 | 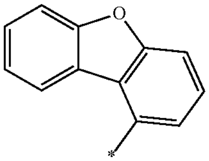 | 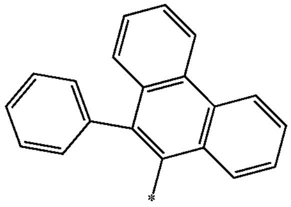 |
| 2-C1-66 | 0 | 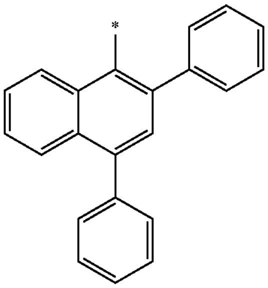 | 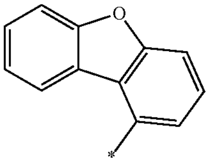 | 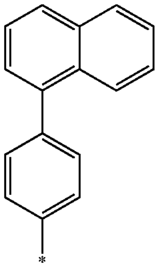 |
| 2-C1-67 | 0 | 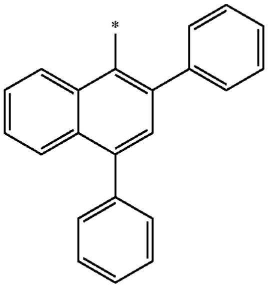 | 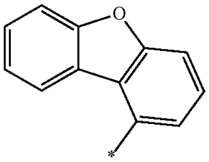 | 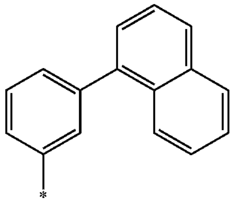 |
| 2-C1-68 | 0 | 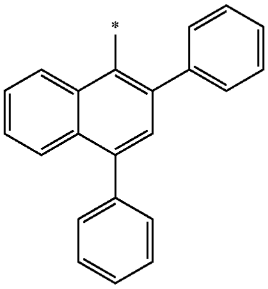 | 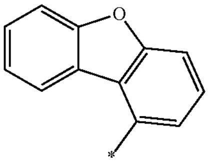 | 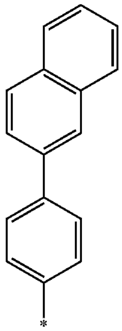 |
| 2-C1-69 | 0 | 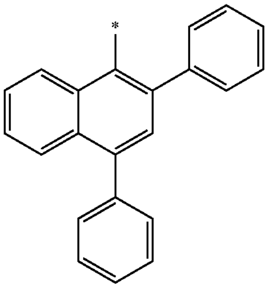 | 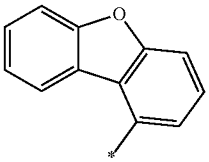 | 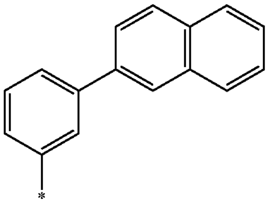 |

-continued
| [Compound Group 1] | | | | |
|---|---|---|---|---|
| | n | A—L—* | $Ar_1$ | $Ar_2$ |
| 2-C1-70 | 0 | 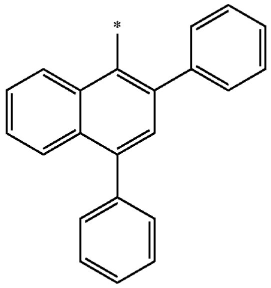 | 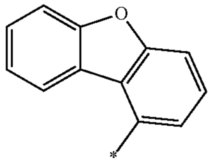 | 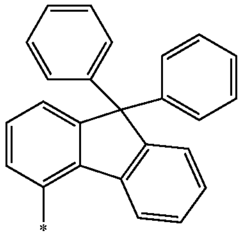 |
| 2-C1-71 | 0 | 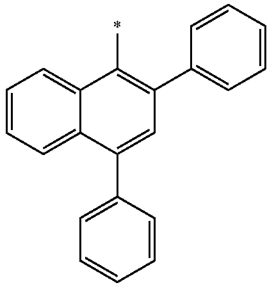 | 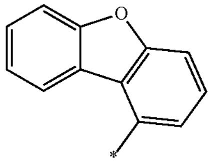 | 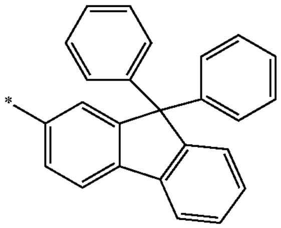 |
| 2-C1-72 | 0 | 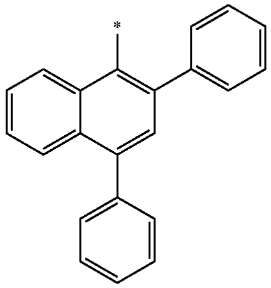 | 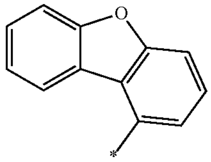 | 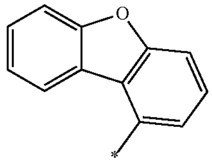 |
| 2-C1-73 | 0 | 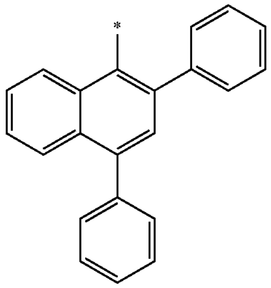 | 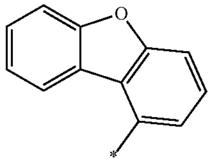 | 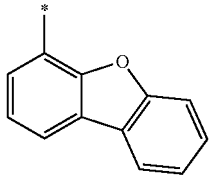 |
| 2-C1-74 | 0 | 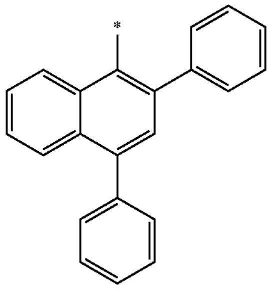 | 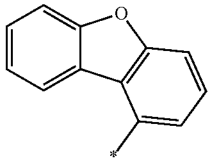 | 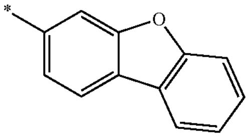 [SMILES: *c1ccc2c(c1)oc1ccccc12] |

-continued
[Compound Group 1]
| | n | A—L—* | $Ar_1$ | $Ar_2$ |
|---|---|---|---|---|
| 2-C1-75 | 0 | 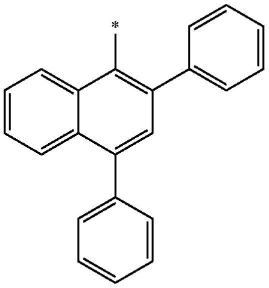 | 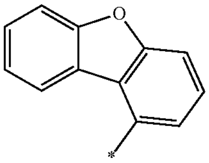 | 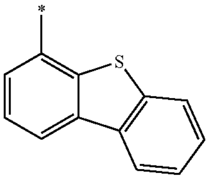 |
| 2-C1-76 | 0 | 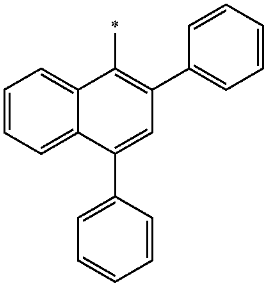 | 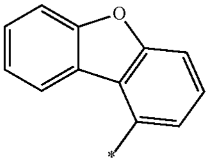 | 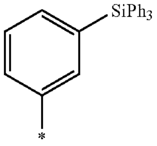 |
| 2-C1-77 | 0 | 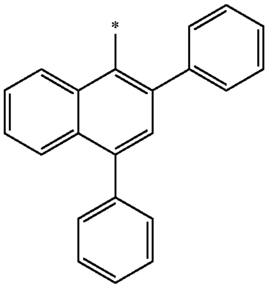 | 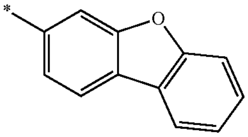 [SMILES: *c1ccc2c(c1)oc1ccccc12] | 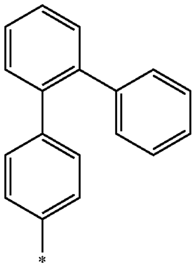 [SMILES: *c1ccc(-c2ccccc2-c2ccccc2)cc1] |
| 2-C1-78 | 0 | 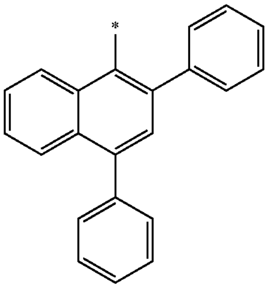 | 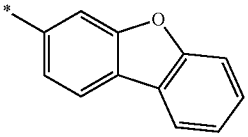 [SMILES: *c1ccc2c(c1)oc1ccccc12] | 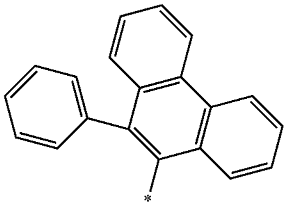 [SMILES: *c1c(-c2ccccc2)c2ccccc2c2ccccc12] |
| 2-C1-79 | 0 | 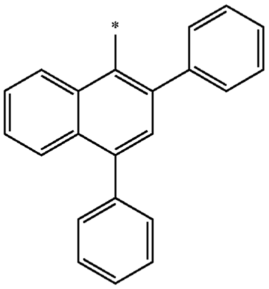 | 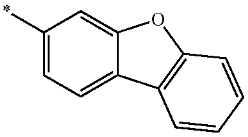 [SMILES: *c1ccc2c(c1)oc1ccccc12] | 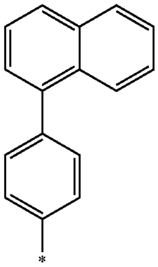 [SMILES: *c1ccc(-c2cccc3ccccc23)cc1] |

-continued
[Compound Group 1]
| | n | A—L—* | $Ar_1$ | $Ar_2$ |
|---|---|---|---|---|
| 2-C1-80 | 0 | 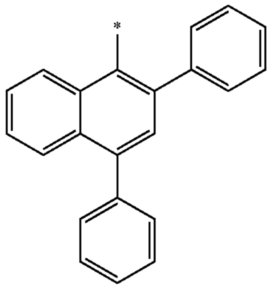 | 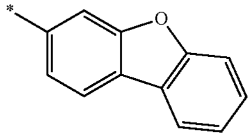 [SMILES: *c1ccc2c(c1)oc1ccccc12] | 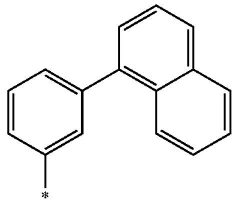 [SMILES: *c1cccc(-c2cccc3ccccc23)c1] |
| 2-C1-81 | 0 | 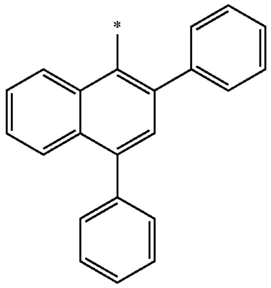 | 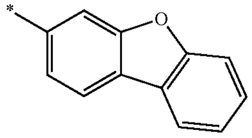 [SMILES: *c1ccc2c(c1)oc1ccccc12] | 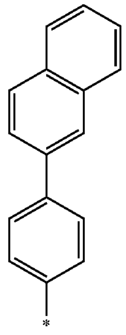 [SMILES: *c1ccc(-c2ccc3ccccc3c2)cc1] |
| 2-C1-82 | 0 | 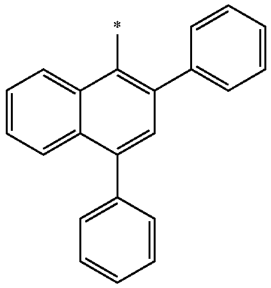 | 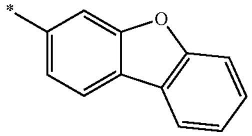 [SMILES: *c1ccc2c(c1)oc1ccccc12] | 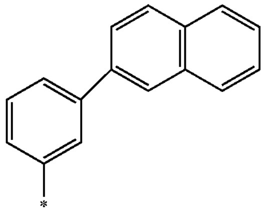 |
| 2-C1-83 | 0 | 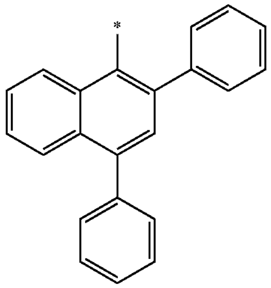 | 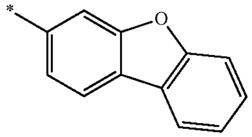 [SMILES: *c1ccc2c(c1)oc1ccccc12] | 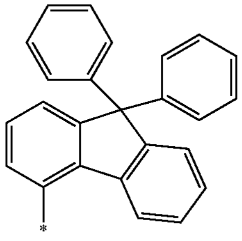 |
| 2-C1-84 | 0 | 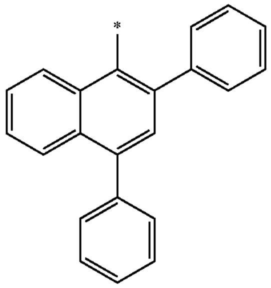 | 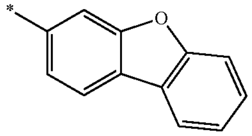 [SMILES: *c1ccc2c(c1)oc1ccccc12] | 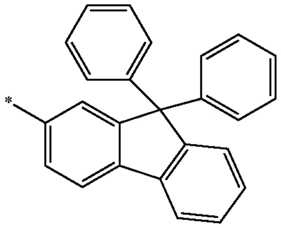 |

-continued
| [Compound Group 1] | | | | |
|---|---|---|---|---|
| | n | A—L—* | $Ar_1$ | $Ar_2$ |
| 2-C1-85 | 0 | 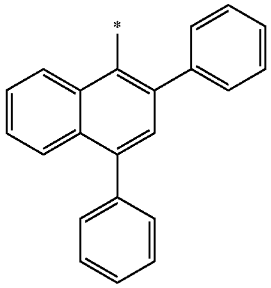 | 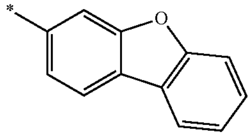 [SMILES: *c1ccc2c(c1)oc1ccccc12] | 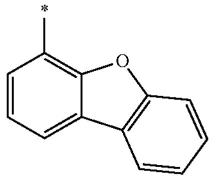 |
| 2-C1-86 | 0 | 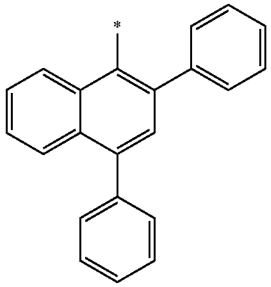 | 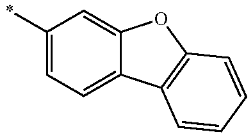 | 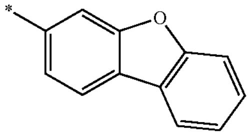 |
| 2-C1-87 | 0 | 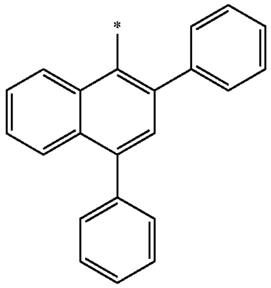 | 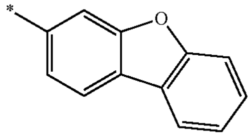 [SMILES: *c1ccc2c(c1)oc1ccccc12] | 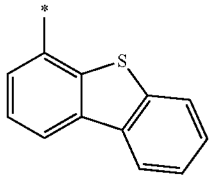 |
| 2-C1-88 | 0 | 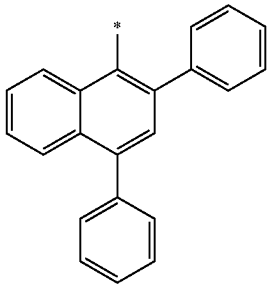 | 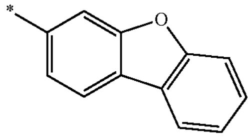 [SMILES: *c1ccc2c(c1)oc1ccccc12] | 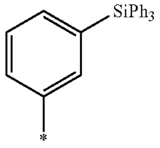 |
| 2-C1-89 | 0 | 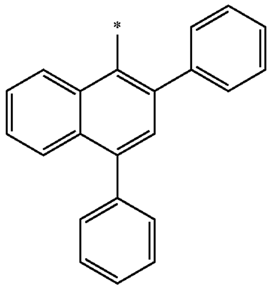 | 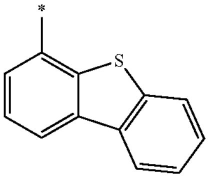 | 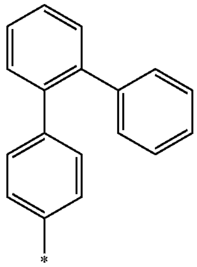 |

-continued
| [Compound Group 1] | | | | |
|---|---|---|---|---|
| | n | A—L—* | $Ar_1$ | $Ar_2$ |
| 2-C1-90 | 0 | 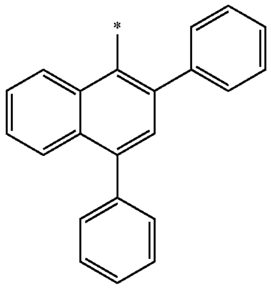 | 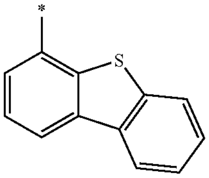 | 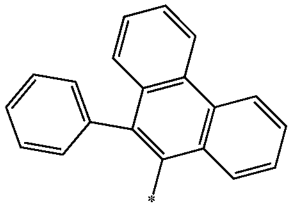 |
| 2-C1-91 | 0 | 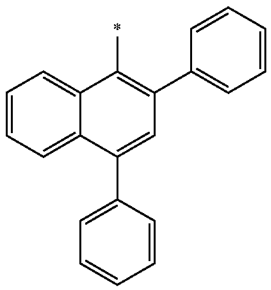 | 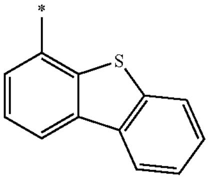 | 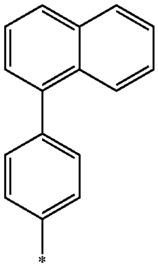 |
| 2-C1-92 | 0 | 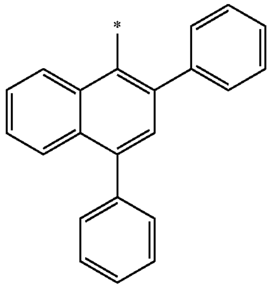 | 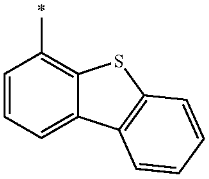 | 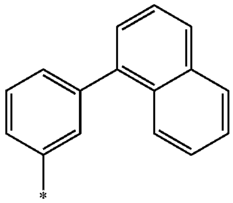 |
| 2-C1-93 | 0 | 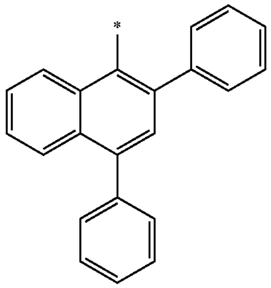 | 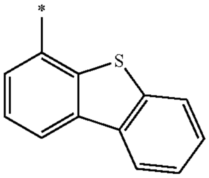 | 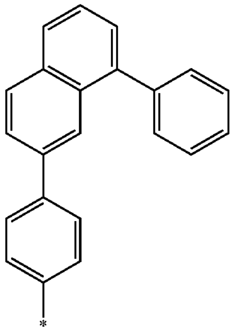 |
| 2-C1-94 | 0 | 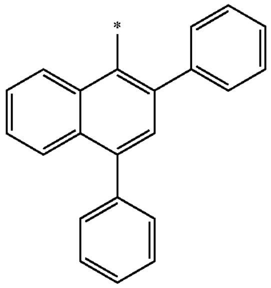 | 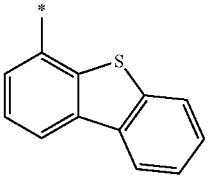 | 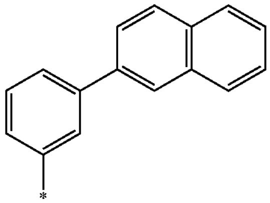 |

-continued
[Compound Group 1]
| | n | A—L—* | $Ar_1$ | $Ar_2$ |
|---|---|---|---|---|
| 2-C1-95 | 0 | 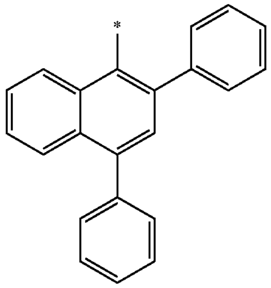 | 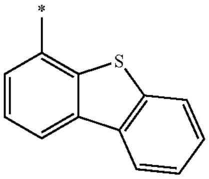 | 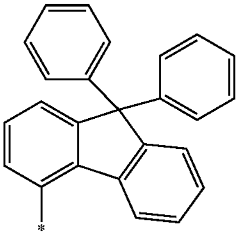 |
| 2-C1-96 | 0 | 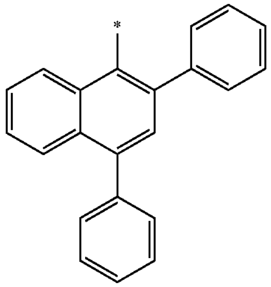 | 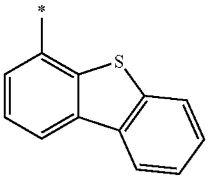 | 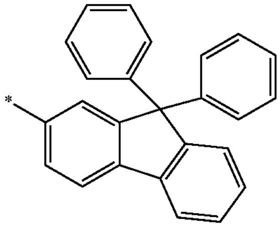 |
| 2-C1-97 | 0 | 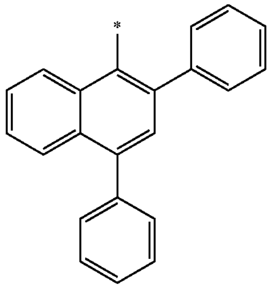 | 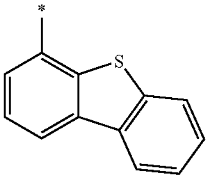 | 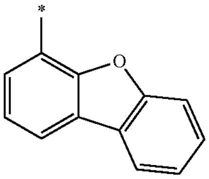 |
| 2-C1-98 | 0 | 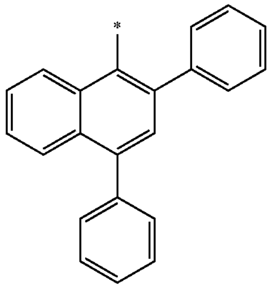 | 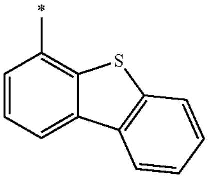 | 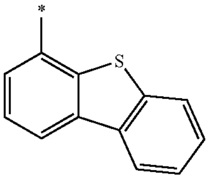 |
| 2-C1-99 | 0 | 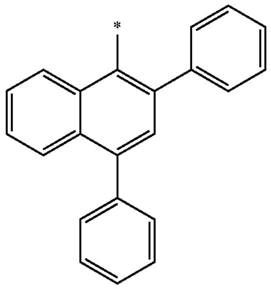 | 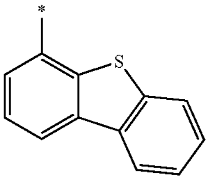 | 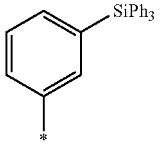 |

-continued
[Compound Group 1]
| | n | A—L—* | $Ar_1$ | $Ar_2$ |
|---|---|---|---|---|
| 3-C1-1 | 0 | 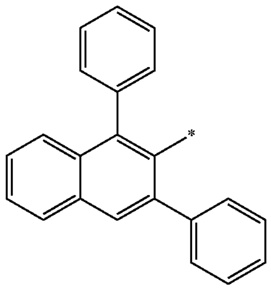 | 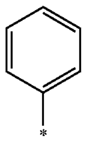 | 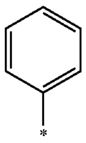 |
| 3-C1-2 | 0 | 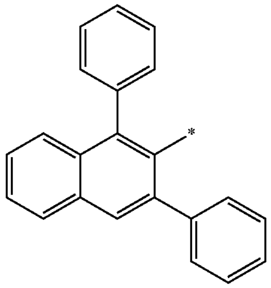 | 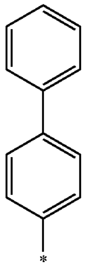 [SMILES: *c1ccc(-c2ccccc2)cc1] | 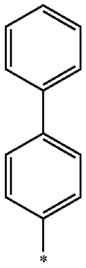 [SMILES: *c1ccc(-c2ccccc2)cc1] |
| 3-C1-3 | 0 | 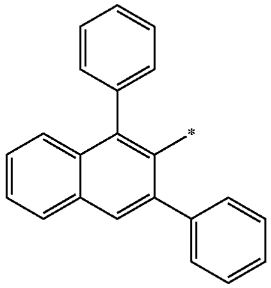 | 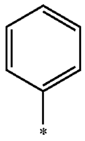 | 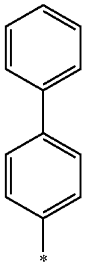 [SMILES: *c1ccc(-c2ccccc2)cc1] |
| 3-C1-4 | 0 | 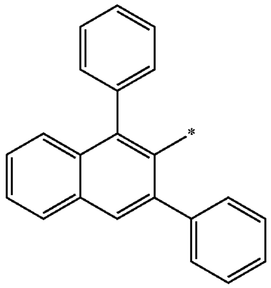 | 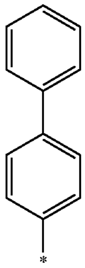 [SMILES: *c1ccc(-c2ccccc2)cc1] | 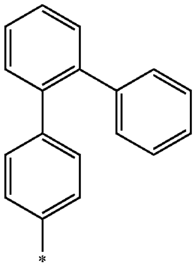 [SMILES: *c1ccc(-c2ccccc2-c2ccccc2)cc1] |
| 3-C1-5 | 0 | 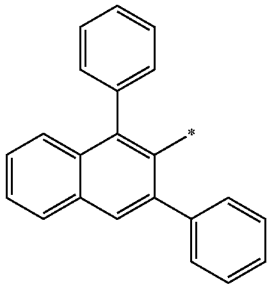 | 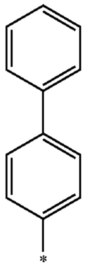 | 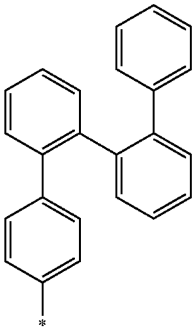 [SMILES: *c1ccc(-c2ccccc2-c2ccccc2-c2ccccc2)cc1] |

-continued
| [Compound Group 1] | | | | |
|---|---|---|---|---|
| | n | A—L—* | $Ar_1$ | $Ar_2$ |
| 3-C1-6 | 0 | 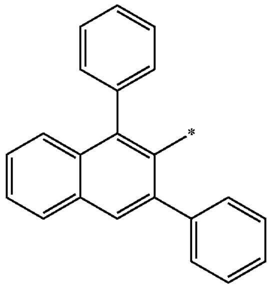 | 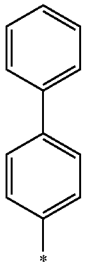 [SMILES: *c1ccc(-c2ccccc2)cc1] | 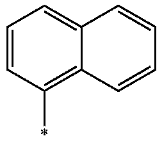 |
| 3-C1-7 | 0 | 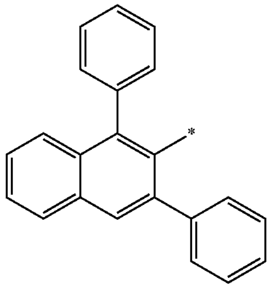 | 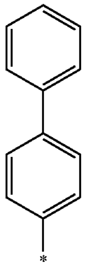 [SMILES: *c1ccc(-c2ccccc2)cc1] | 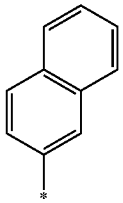 |
| 3-C1-8 | 0 | 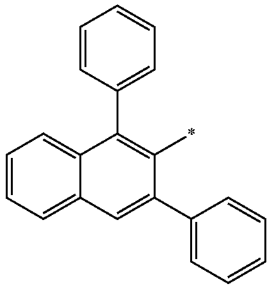 | 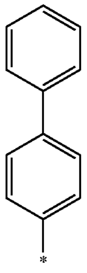 [SMILES: *c1ccc(-c2ccccc2)cc1] | 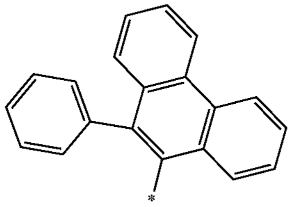 [SMILES: *c1c(-c2ccccc2)c2ccccc2c2ccccc12] |
| 3-C1-9 | 0 | 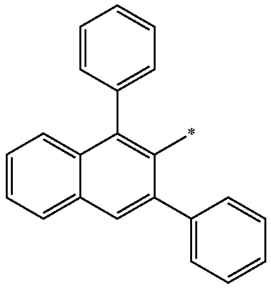 | 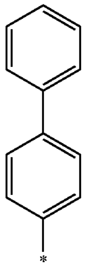 [SMILES: *c1ccc(-c2ccccc2)cc1] | 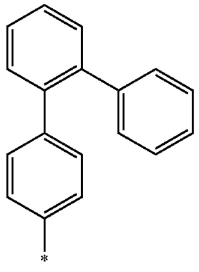 [SMILES: *c1ccc(-c2ccccc2-c2ccccc2)cc1] |
| 3-C1-10 | 0 | 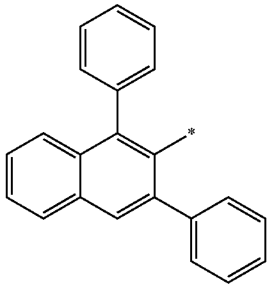 | 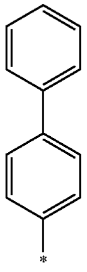 [SMILES: *c1ccc(-c2ccccc2)cc1] | 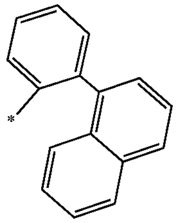 [SMILES: *c1ccccc1-c1cccc2ccccc12] |

-continued
| [Compound Group 1] | | | | |
|---|---|---|---|---|
| | n | A—L—* | $Ar_1$ | $Ar_2$ |
| 3-C1-11 | 0 | 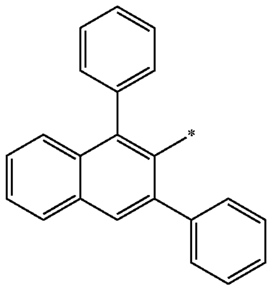 | 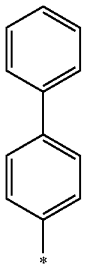 [SMILES: *c1ccc(-c2ccccc2)cc1] | 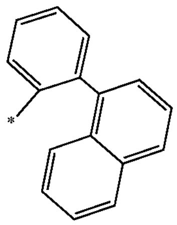 [SMILES: *c1ccccc1-c1cccc2ccccc12] |
| 3-C1-12 | 0 | 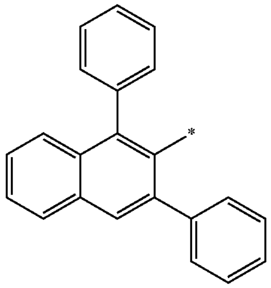 | 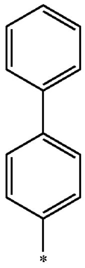 [SMILES: *c1ccc(-c2ccccc2)cc1] | 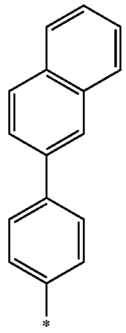 |
| 3-C1-13 | 0 | 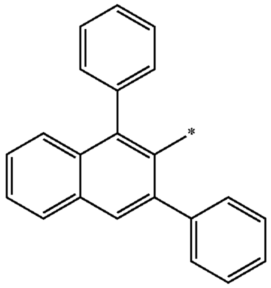 | 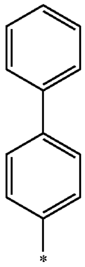 [SMILES: *c1ccc(-c2ccccc2)cc1] | 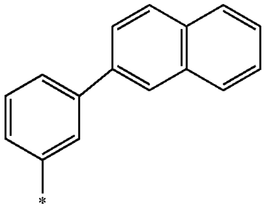 [SMILES: *c1cccc(-c2ccc3ccccc3c2)c1] |
| 3-C1-14 | 0 | 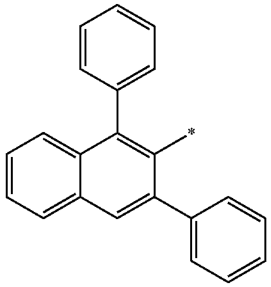 | 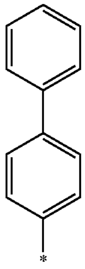 [SMILES: *c1ccc(-c2ccccc2)cc1] | 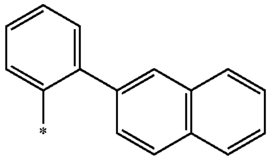 [SMILES: *c1ccccc1-c1ccc2ccccc2c1] |
| 3-C1-15 | 0 | 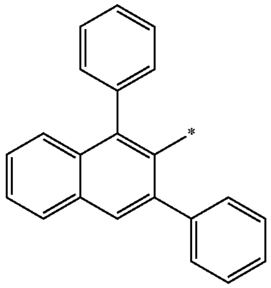 | 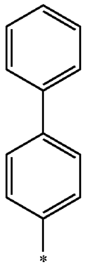 [SMILES: *c1ccc(-c2ccccc2)cc1] | 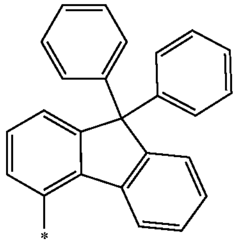 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 3-C1-16 | 0 | 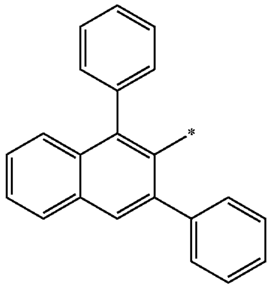 | 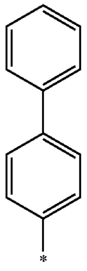 [SMILES: *c1ccc(-c2ccccc2)cc1] | 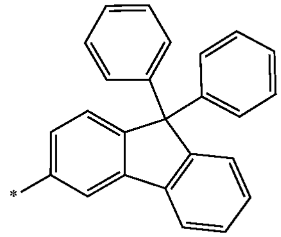 [SMILES: *c1ccc2c(c1)-c1ccccc1C2(c1ccccc1)c1ccccc1] |
| 3-C1-17 | 0 | 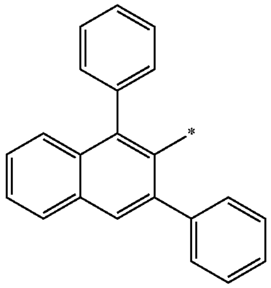 | 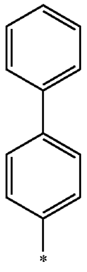 [SMILES: *c1ccc(-c2ccccc2)cc1] | 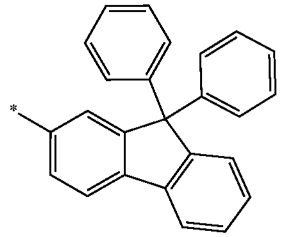 [SMILES: *c1ccc2c(c1)C(c1ccccc1)(c1ccccc1)c1ccccc1-2] |
| 3-C1-18 | 0 | 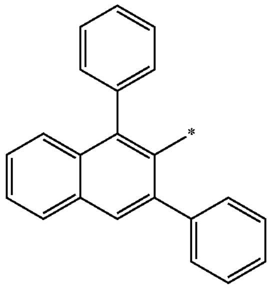 | 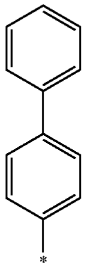 [SMILES: *c1ccc(-c2ccccc2)cc1] | 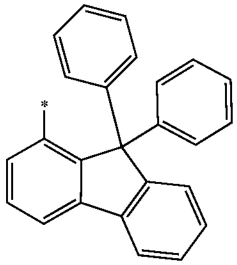 [SMILES: *c1cccc2c1C(c1ccccc1)(c1ccccc1)c1ccccc1-2] |
| 3-C1-19 | 0 | 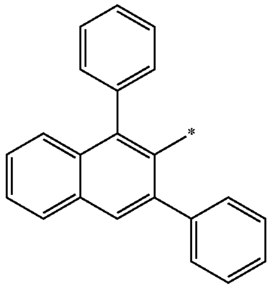 | 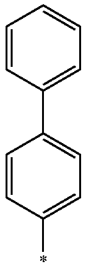 [SMILES: *c1ccc(-c2ccccc2)cc1] | 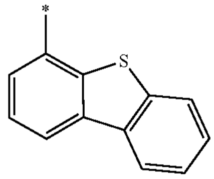 [SMILES: *c1cccc2c1sc1ccccc12] |
| 3-C1-20 | 0 | 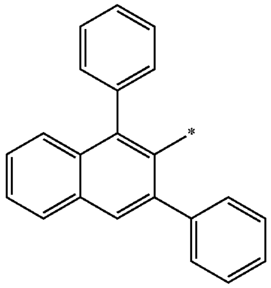 | 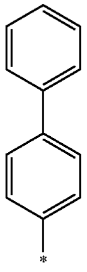 [SMILES: *c1ccc(-c2ccccc2)cc1] | 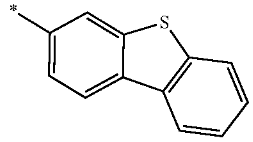 [SMILES: *c1ccc2c(c1)sc1ccccc12] |

-continued
[Compound Group 1]
| | n | A—L—* | $Ar_1$ | $Ar_2$ |
|---|---|---|---|---|
| 3-C1-21 | 0 | 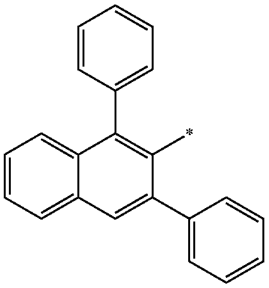 | 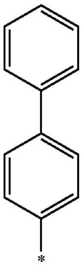 [SMILES: *c1ccc(-c2ccccc2)cc1] | 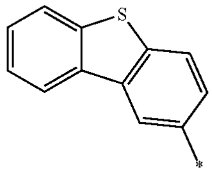 |
| 3-C1-22 | 0 | 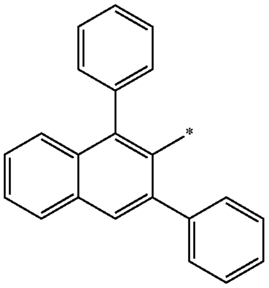 | 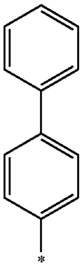 [SMILES: *c1ccc(-c2ccccc2)cc1] | 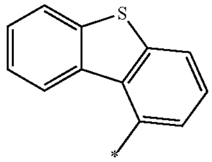 |
| 3-C1-23 | 0 | 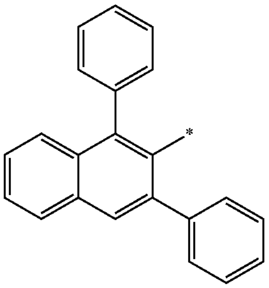 | 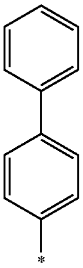 [SMILES: *c1ccc(-c2ccccc2)cc1] | 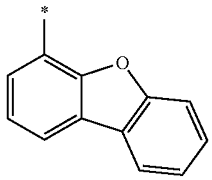 |
| 3-C1-24 | 0 | 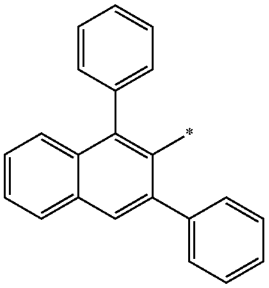 | 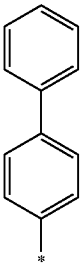 [SMILES: *c1ccc(-c2ccccc2)cc1] | 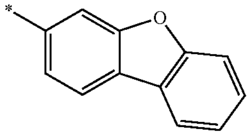 |
| 3-C1-25 | 0 | 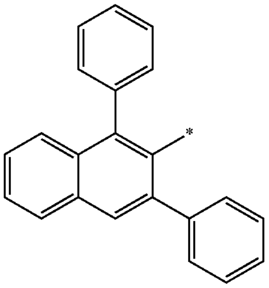 | 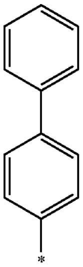 [SMILES: *c1ccc(-c2ccccc2)cc1] | 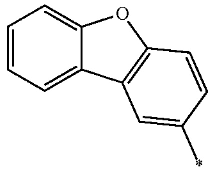 |

-continued
[Compound Group 1]
| | n | A—L—* | $Ar_1$ | $Ar_2$ |
|---|---|---|---|---|
| 3-C1-26 | 0 | 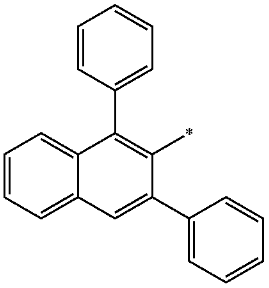 | 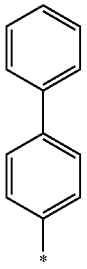 [SMILES: *c1ccc(-c2ccccc2)cc1] | 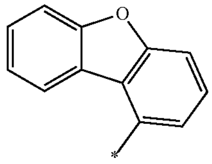 |
| 3-C1-27 | 0 | 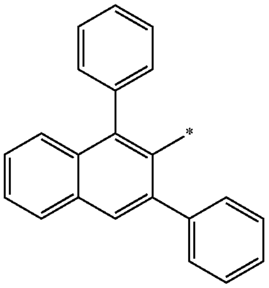 | 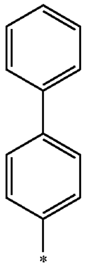 [SMILES: *c1ccc(-c2ccccc2)cc1] | 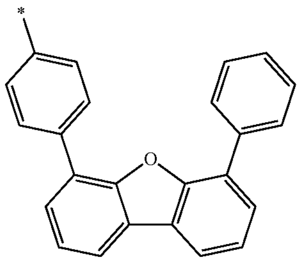 |
| 3-C1-28 | 0 | 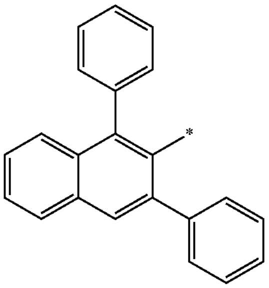 | 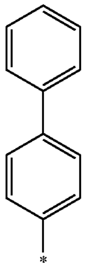 [SMILES: *c1ccc(-c2ccccc2)cc1] | 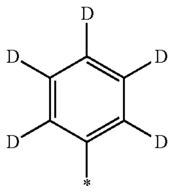 |
| 3-C1-29 | 0 | 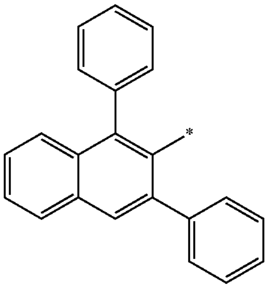 | 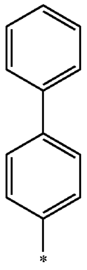 [SMILES: *c1ccc(-c2ccccc2)cc1] | 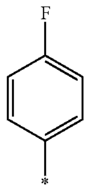 |
| 3-C1-30 | 0 | 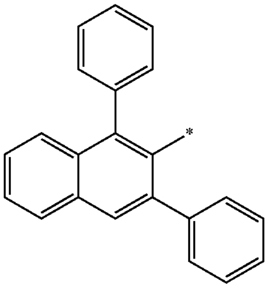 | 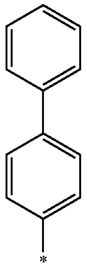 [SMILES: *c1ccc(-c2ccccc2)cc1] | 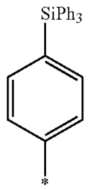 |

-continued
[Compound Group 1]
| | n | A—L—* | $Ar_1$ | $Ar_2$ |
|---|---|---|---|---|
| 3-C1-31 | 0 | 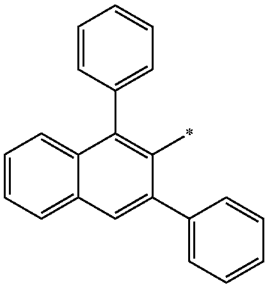 | 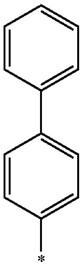 [SMILES: *c1ccc(-c2ccccc2)cc1] | 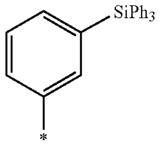 |
| 3-C1-32 | 0 | 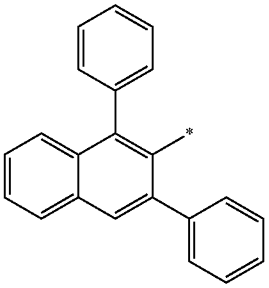 | 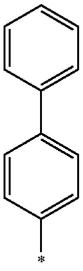 [SMILES: *c1ccc(-c2ccccc2)cc1] | 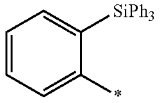 |
| 3-C1-33 | 0 | 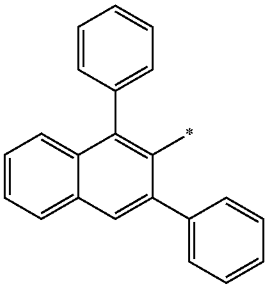 | 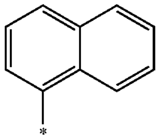 | 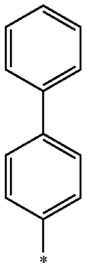 [SMILES: *c1ccc(-c2ccccc2)cc1] |
| 3-C1-34 | 0 | 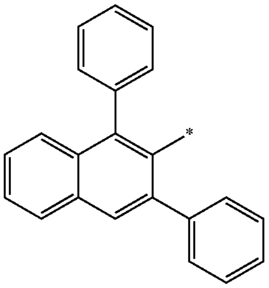 | 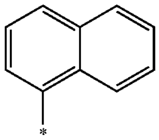 | 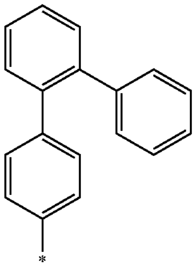 [SMILES: *c1ccc(-c2ccccc2-c2ccccc2)cc1] |
| 3-C1-35 | 0 | 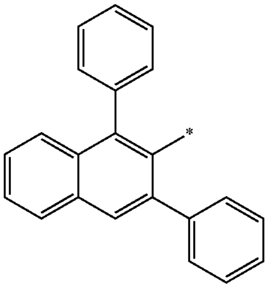 | 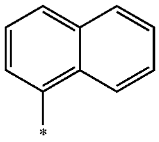 [SMILES: *c1cccc2ccccc12] | 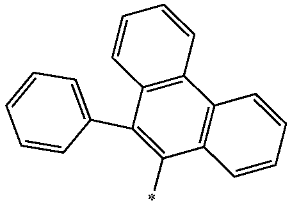 [SMILES: *c1c(-c2ccccc2)c2ccccc2c2ccccc12] |

-continued
| [Compound Group 1] | | | | |
|---|---|---|---|---|
| | n | A—L—* | $Ar_1$ | $Ar_2$ |
| 3-C1-36 | 0 | 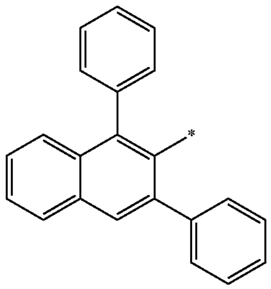 | 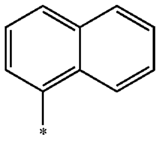 [SMILES: *c1cccc2ccccc12] | 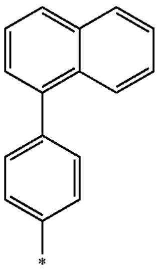 [SMILES: *c1ccc(-c2cccc3ccccc23)cc1] |
| 3-C1-37 | 0 | 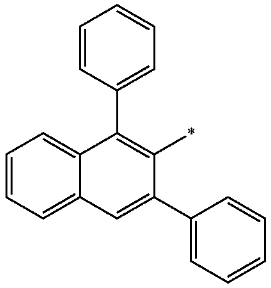 | 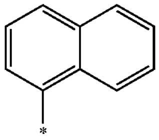 | 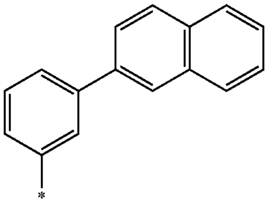 [SMILES: *c1cccc(-c2ccc3ccccc3c2)c1] |
| 3-C1-38 | 0 | 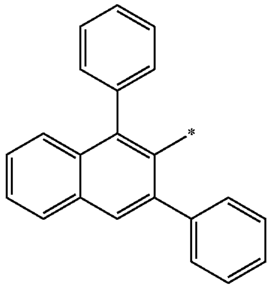 | 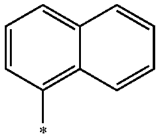 | 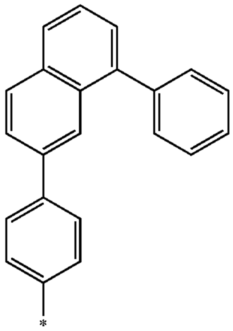 [SMILES: *c1ccc(-c2ccc3cccc(-c4ccccc4)c3c2)cc1] |
| 3-C1-39 | 0 | 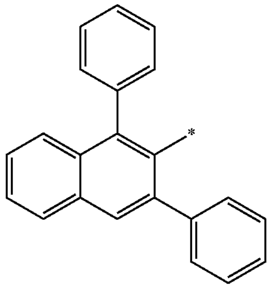 | 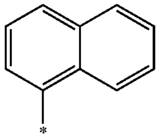 | 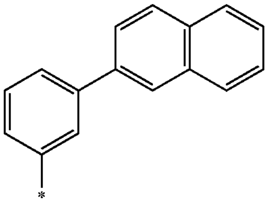 [SMILES: *c1cccc(-c2ccc3ccccc3c2)c1] |
| 3-C1-40 | 0 | 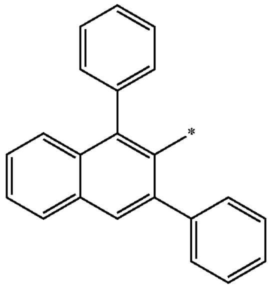 | 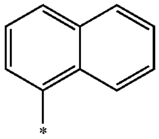 | 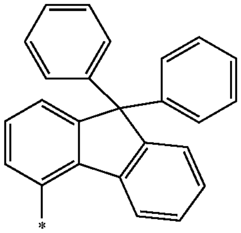 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 3-C1-41 | 0 | 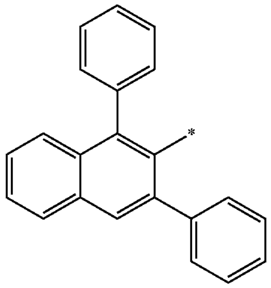 | 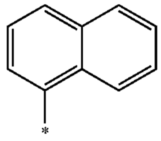 [SMILES: *c1cccc2ccccc12] | 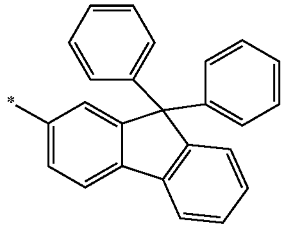 [SMILES: *c1ccc2c(c1)C(c1ccccc1)(c1ccccc1)c1ccccc1-2] |
| 3-C1-42 | 0 | 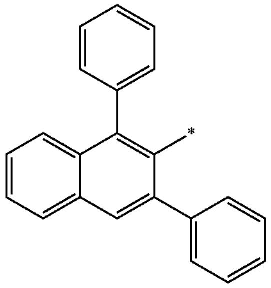 | 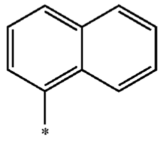 | 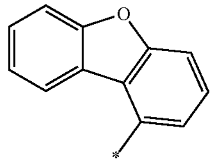 |
| 3-C1-43 | 0 | 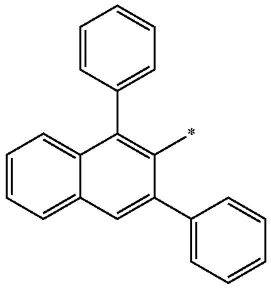 | 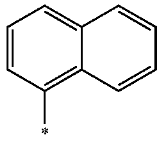 | 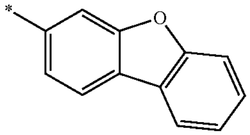 |
| 3-C1-44 | 0 | 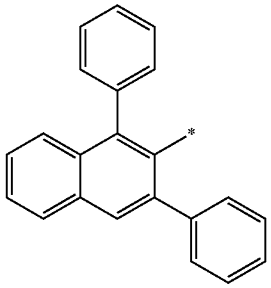 | 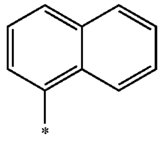 | 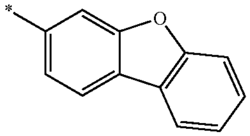 |
| 3-C1-45 | 0 | 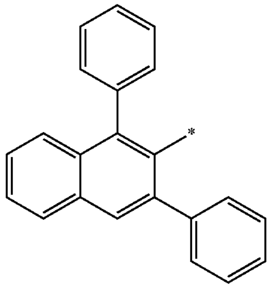 | 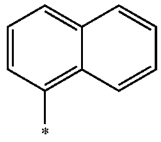 [SMILES: *c1cccc2ccccc12] | 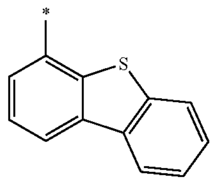 |

-continued
[Compound Group 1]
| | n | A—L—* | $Ar_1$ | $Ar_2$ |
|---|---|---|---|---|
| 3-C1-46 | 0 | 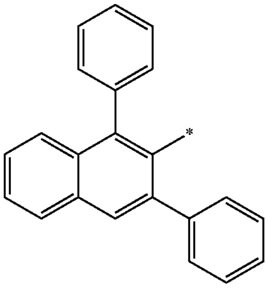 | 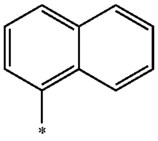 [SMILES: *c1cccc2ccccc12] | 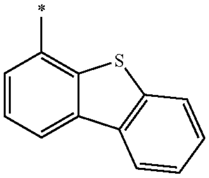 |
| 3-C1-47 | 0 | 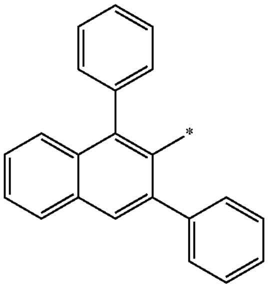 | 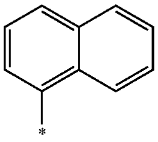 | 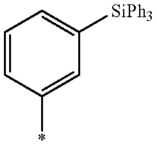 |
| 3-C1-48 | 0 | 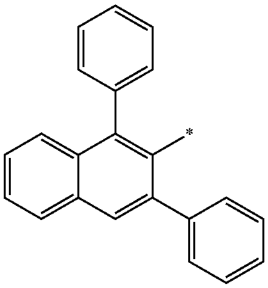 | 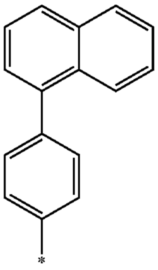 | 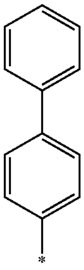 |
| 3-C1-49 | 0 | 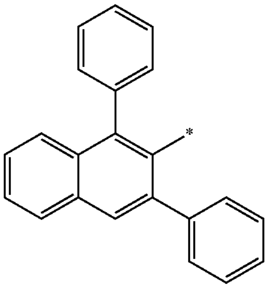 | 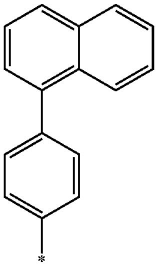 | 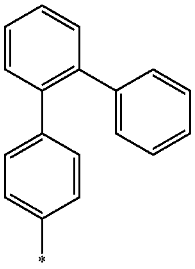 |
| 3-C1-50 | 0 | 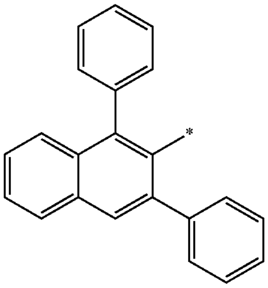 | 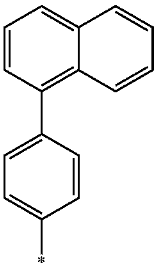 | 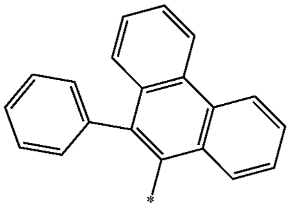 |

-continued
| [Compound Group 1] | | | | |
|---|---|---|---|---|
| | n | A—L—* | $Ar_1$ | $Ar_2$ |
| 3-C1-51 | 0 | 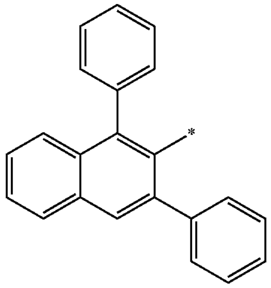 | 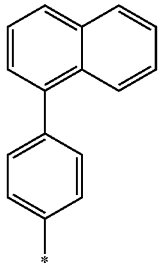 | 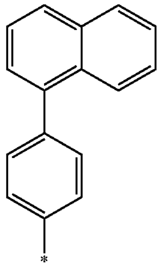 |
| 3-C1-52 | 0 | 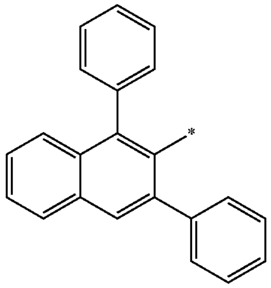 | 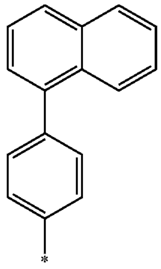 | 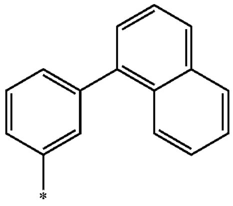 |
| 3-C1-53 | 0 | 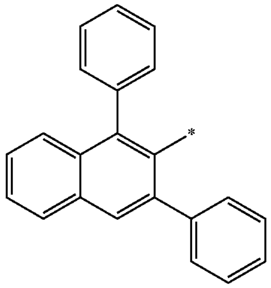 | 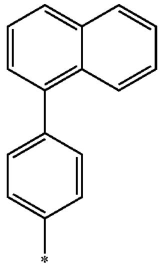 | 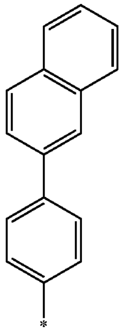 |
| 3-C1-54 | 0 | 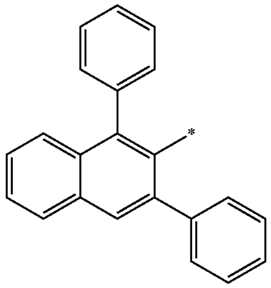 | 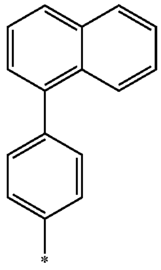 | 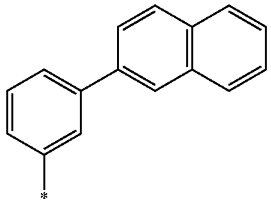 |
| 3-C1-55 | 0 | 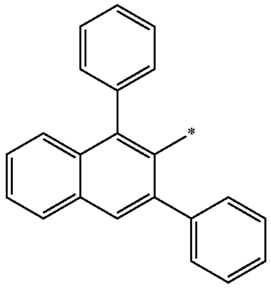 | 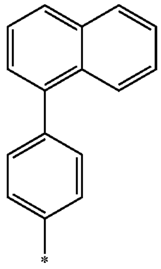 | 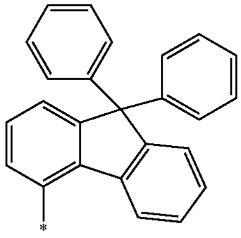 |

-continued
| [Compound Group 1] | | | | |
|---|---|---|---|---|
| | n | A—L—* | $Ar_1$ | $Ar_2$ |
| 3-C1-56 | 0 | 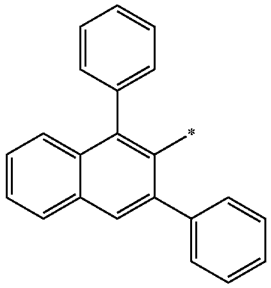 | 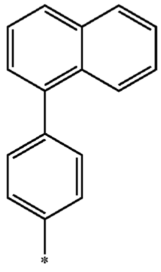 | 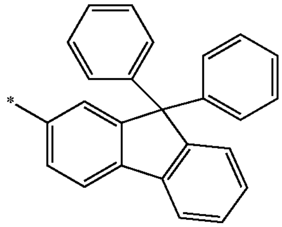 |
| 3-C1-57 | 0 | 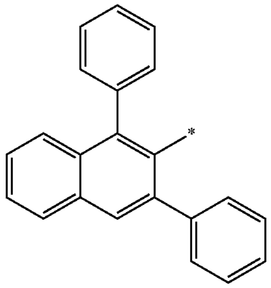 | 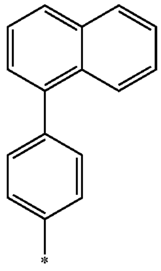 | 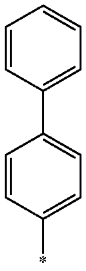 |
| 3-C1-58 | 0 | 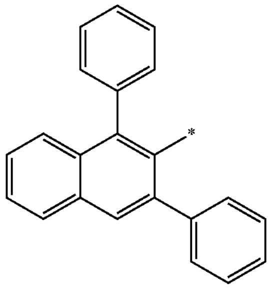 | 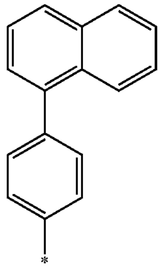 | 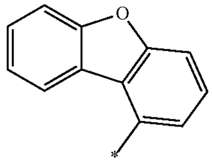 |
| 3-C1-59 | 0 | 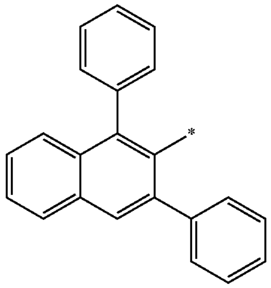 | 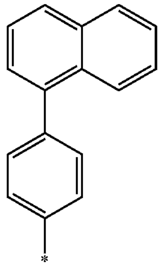 | 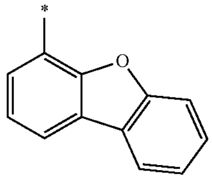 |
| 3-C1-60 | 0 | 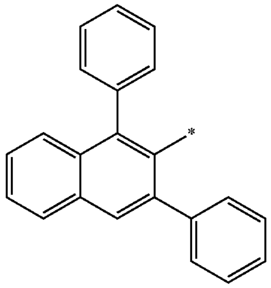 | 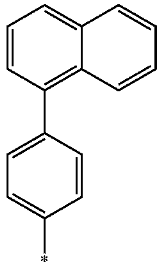 | 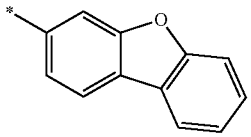 |

-continued
[Compound Group 1]
| | n | A—L—* | $Ar_1$ | $Ar_2$ |
|---|---|---|---|---|
| 3-C1-61 | 0 | 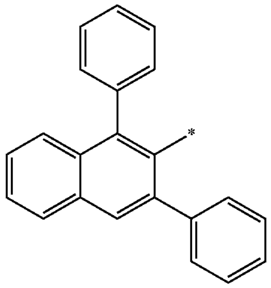 | 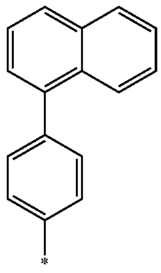 | 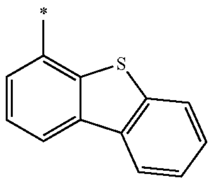 |
| 3-C1-62 | 0 | 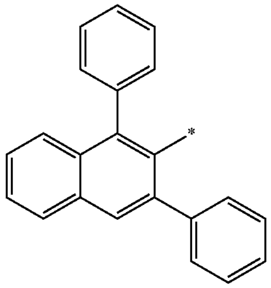 | 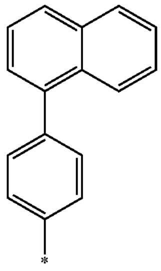 | 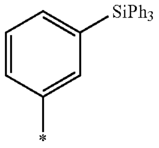 |
| 3-C1-63 | 0 | 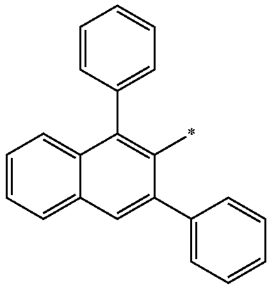 | 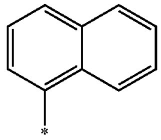 [SMILES: *c1cccc2ccccc12] | 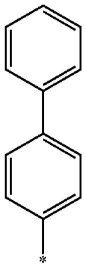 |
| 3-C1-64 | 0 | 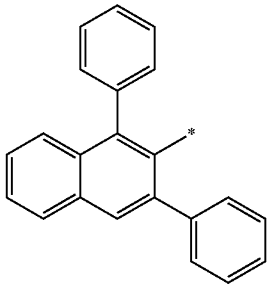 | 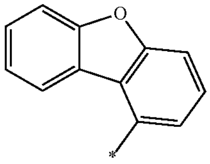 | 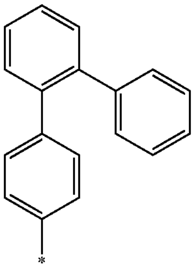 |
| 3-C1-65 | 0 | 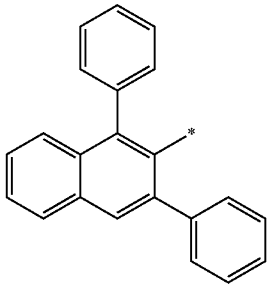 | 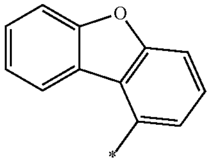 | 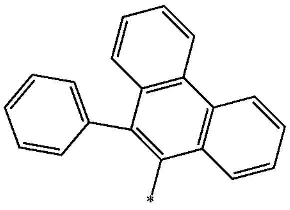 |

-continued
| [Compound Group 1] | | | | |
|---|---|---|---|---|
| | n | A—L—* | $Ar_1$ | $Ar_2$ |
| 3-C1-66 | 0 | 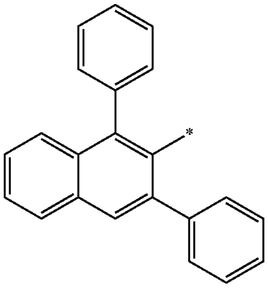 | 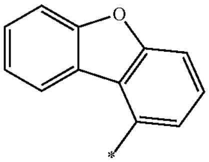 | 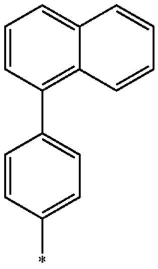 |
| 3-C1-67 | 0 | 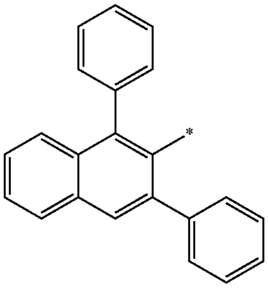 | 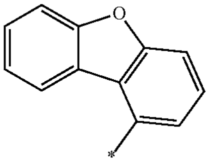 | 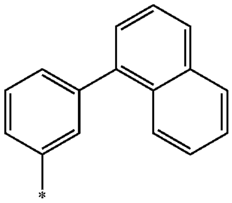 |
| 3-C1-68 | 0 | 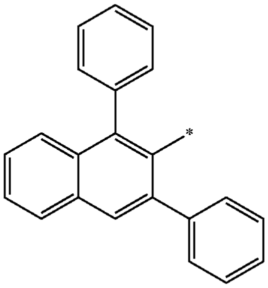 | 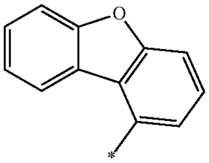 | 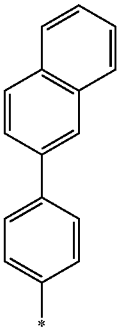 |
| 3-C1-69 | 0 | 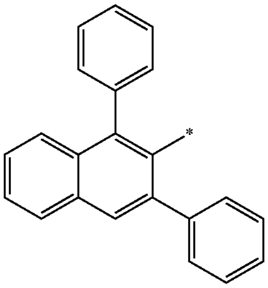 | 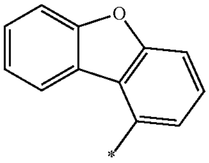 | 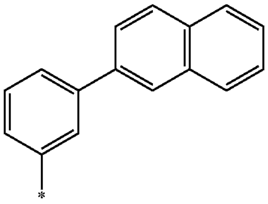 |
| 3-C1-70 | 0 | 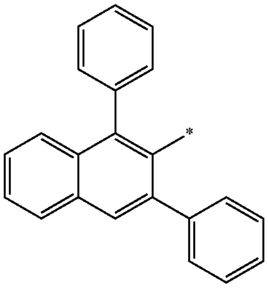 | 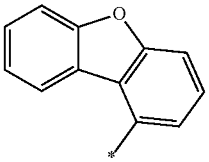 | 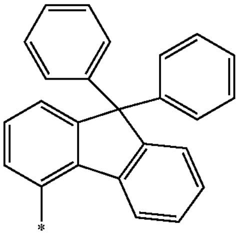 |

-continued
| [Compound Group 1] | | | | |
|---|---|---|---|---|
| | n | A—L—* | $Ar_1$ | $Ar_2$ |
| 3-C1-71 | 0 | 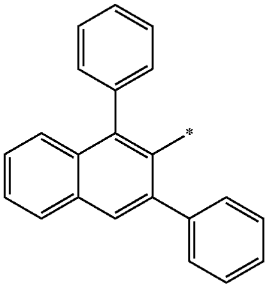 | 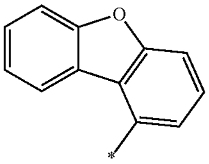 | 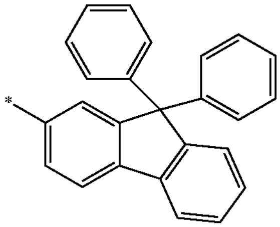 |
| 3-C1-72 | 0 | 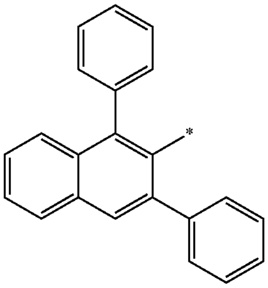 | 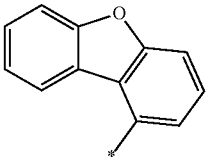 | 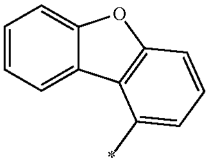 |
| 3-C1-73 | 0 | 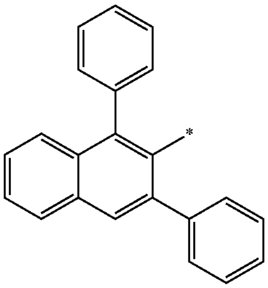 | 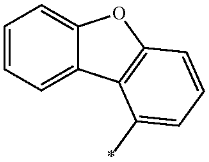 | 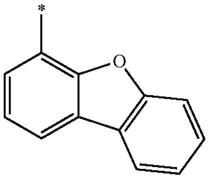 |
| 3-C1-74 | 0 | 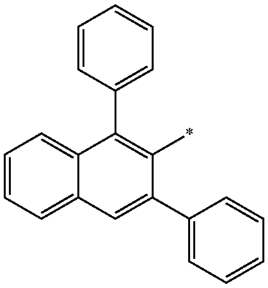 | 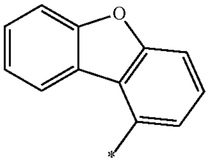 | 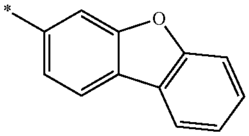 [SMILES: *c1ccc2c(c1)oc1ccccc12] |
| 3-C1-75 | 0 | 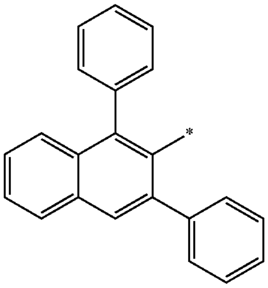 | 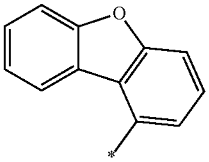 | 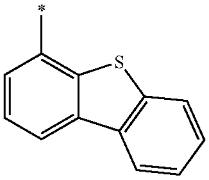 [SMILES: *c1cccc2c1sc1ccccc12] |

-continued
[Compound Group 1]
| | n | A—L—* | $Ar_1$ | $Ar_2$ |
|---|---|---|---|---|
| 3-C1-76 | 0 | 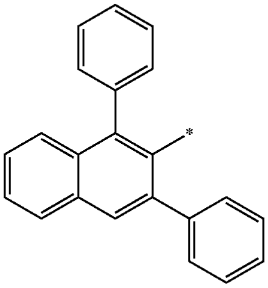 | 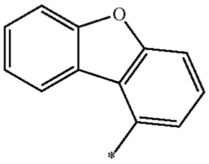 | 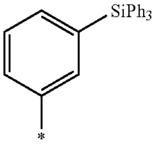 |
| 3-C1-77 | 0 | 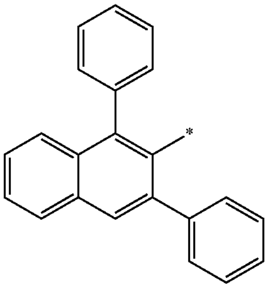 | 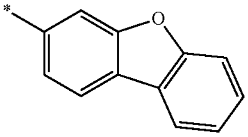 [SMILES: *c1ccc2c(c1)oc1ccccc12] | 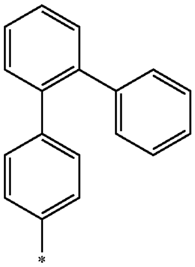 [SMILES: *c1ccc(-c2ccccc2-c2ccccc2)cc1] |
| 3-C1-78 | 0 | 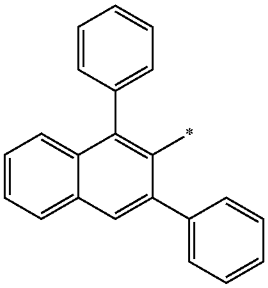 | 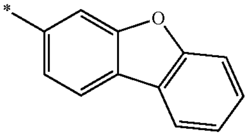 [SMILES: *c1ccc2c(c1)oc1ccccc12] | 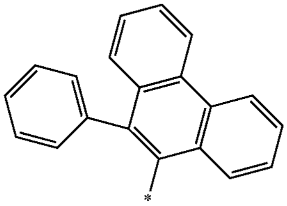 [SMILES: *c1c(-c2ccccc2)c2ccccc2c2ccccc12] |
| 3-C1-79 | 0 | 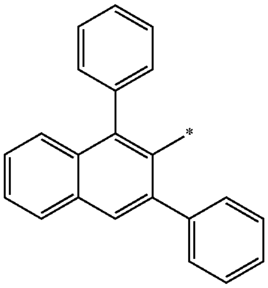 | 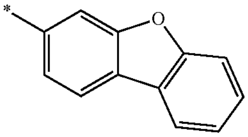 [SMILES: *c1ccc2c(c1)oc1ccccc12] | 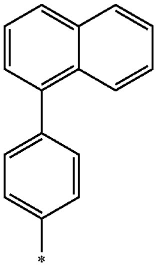 [SMILES: *c1ccc(-c2cccc3ccccc23)cc1] |
| 3-C1-80 | 0 | 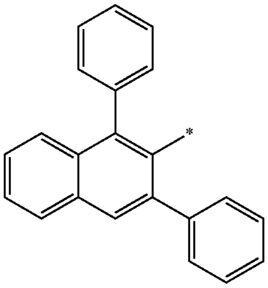 | 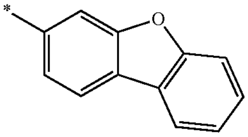 [SMILES: *c1ccc2c(c1)oc1ccccc12] | 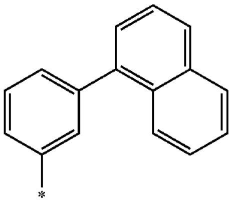 |

-continued
| [Compound Group 1] | | | | |
|---|---|---|---|---|
| | n | A—L—* | $Ar_1$ | $Ar_2$ |
| 3-C1-81 | 0 | 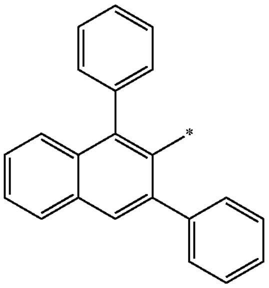 | 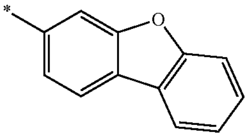 [SMILES: *c1ccc2c(c1)oc1ccccc12] | 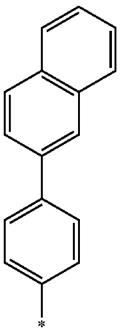 [SMILES: *c1ccc(-c2ccc3ccccc3c2)cc1] |
| 3-C1-82 | 0 | 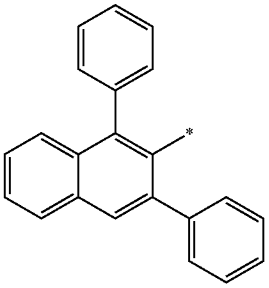 | 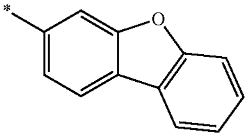 [SMILES: *c1ccc2c(c1)oc1ccccc12] | 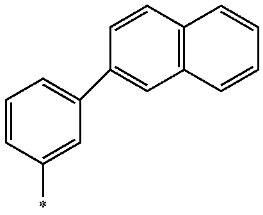 |
| 3-C1-83 | 0 | 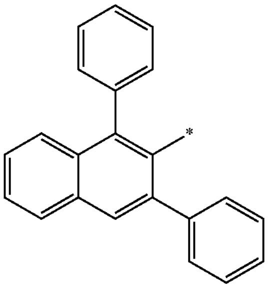 | 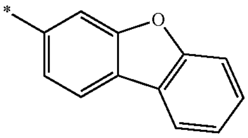 [SMILES: *c1ccc2c(c1)oc1ccccc12] | 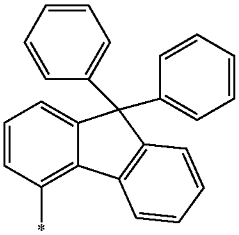 |
| 3-C1-84 | 0 | 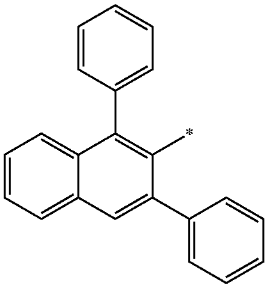 | 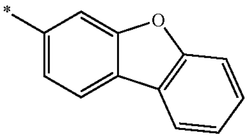 [SMILES: *c1ccc2c(c1)oc1ccccc12] | 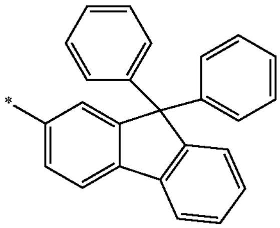 |
| 3-C1-85 | 0 | 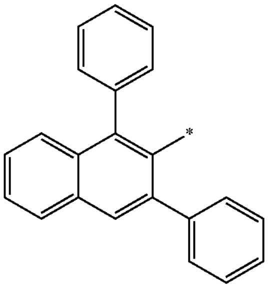 | 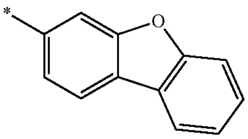 [SMILES: *c1ccc2c(c1)oc1ccccc12] | 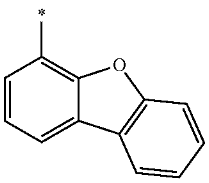 |

-continued
[Compound Group 1]
| | n | A—L—* | $Ar_1$ | $Ar_2$ |
|---|---|---|---|---|
| 3-C1-86 | 0 | 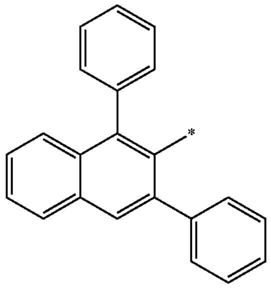 | 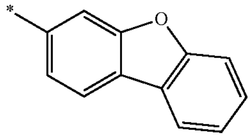 [SMILES: *c1ccc2c(c1)oc1ccccc12] | 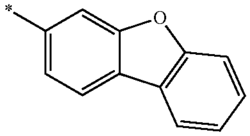 |
| 3-C1-87 | 0 | 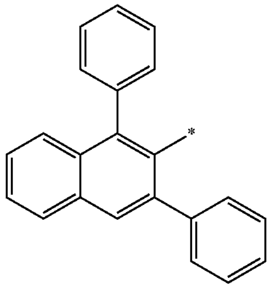 | 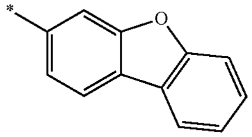 [SMILES: *c1ccc2c(c1)oc1ccccc12] | 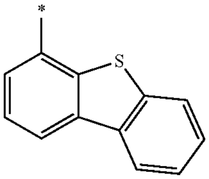 |
| 3-C1-88 | 0 | 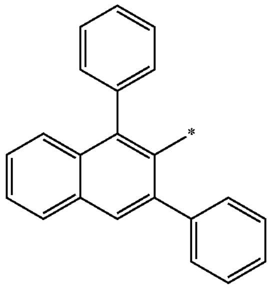 | 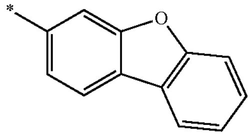 [SMILES: *c1ccc2c(c1)oc1ccccc12] | 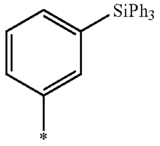 |
| 3-C1-89 | 0 | 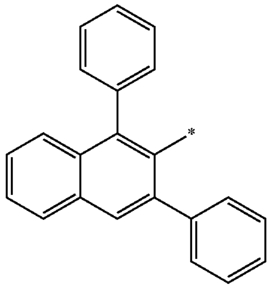 | 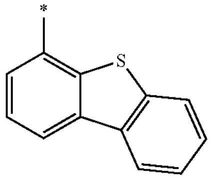 | 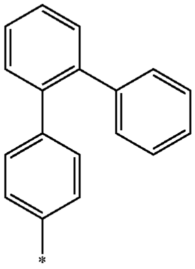 |
| 3-C1-90 | 0 | 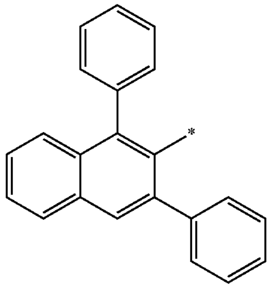 | 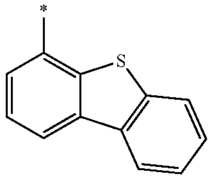 | 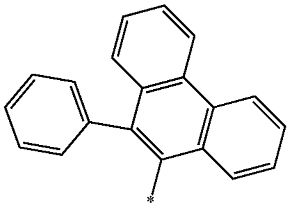 |

-continued
| [Compound Group 1] | | | | |
|---|---|---|---|---|
| | n | A—L—* | $Ar_1$ | $Ar_2$ |
| 3-C1-91 | 0 | 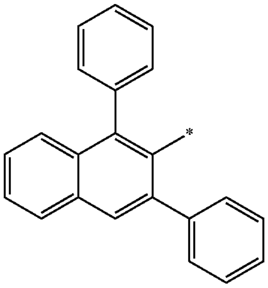 | 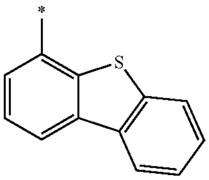 | 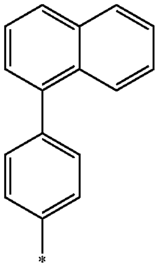 |
| 3-C1-92 | 0 | 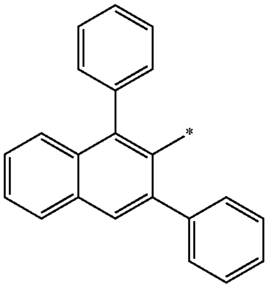 | 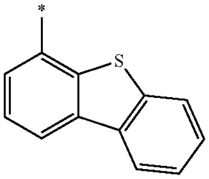 | 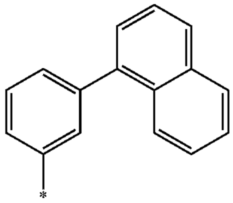 |
| 3-C1-93 | 0 | 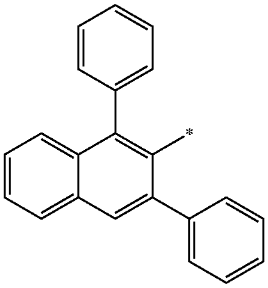 | 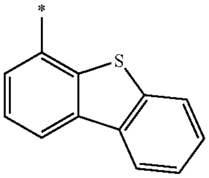 | 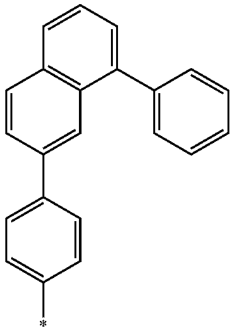 |
| 3-C1-94 | 0 | 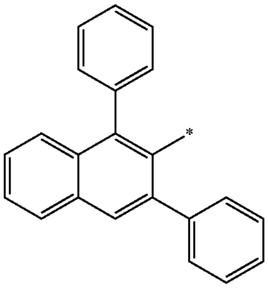 | 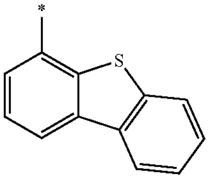 | 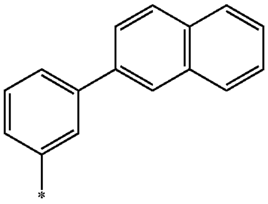 |
| 3-C1-95 | 0 | 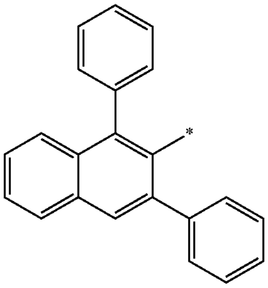 | 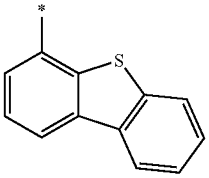 | 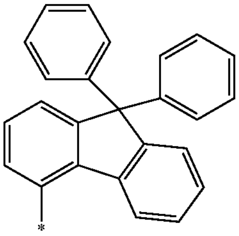 |

-continued
[Compound Group 1]
| | n | A—L—* | $Ar_1$ | $Ar_2$ |
|---|---|---|---|---|
| 3-C1-96 | 0 | 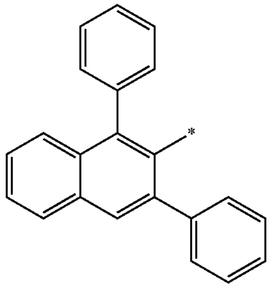 | 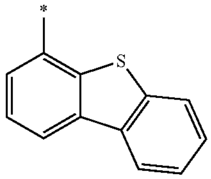 | 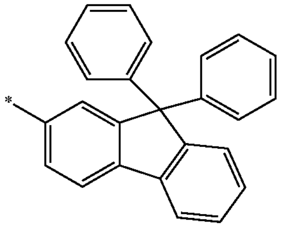 |
| 3-C1-97 | 0 | 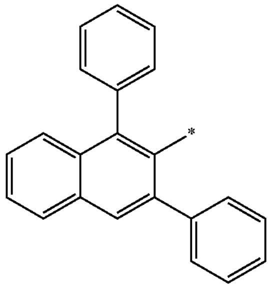 | 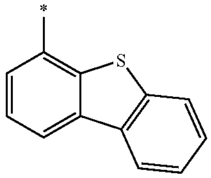 | 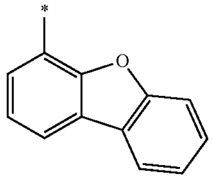 |
| 3-C1-98 | 0 | 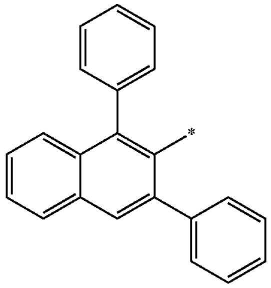 | 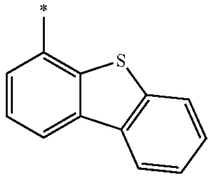 | 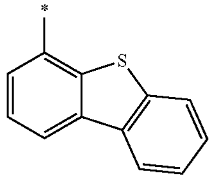 |
| 3-C1-99 | 0 | 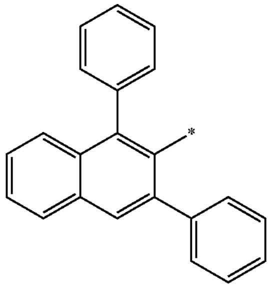 | 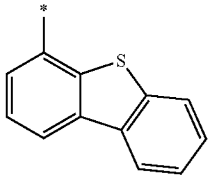 | 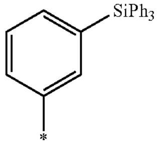 |
| 1-D1-1 | 1 | 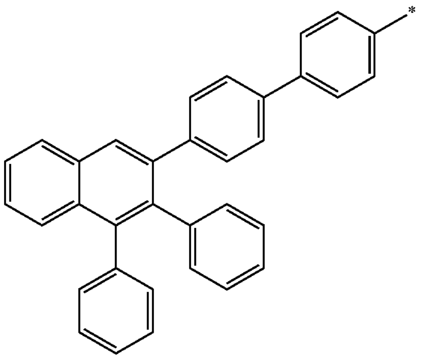 [SMILES: *c1ccc(-c2ccc(-c3cc4ccccc4c(-c4ccccc4)c3-c3ccccc3)cc2)cc1] | 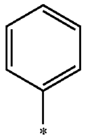 | 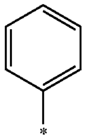 |

-continued
[Compound Group 1]
| | n | A—L—* | $Ar_1$ | $Ar_2$ |
|---|---|---|---|---|
| 1-D1-2 | 1 | 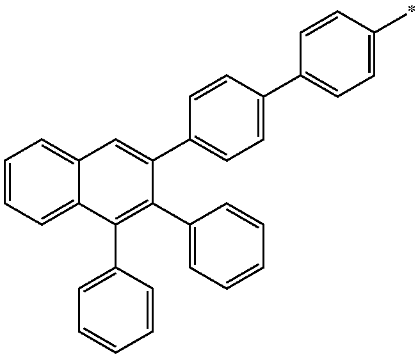 [SMILES: *c1ccc(-c2ccc(-c3cc4ccccc4c(-c4ccccc4)c3-c3ccccc3)cc2)cc1] | 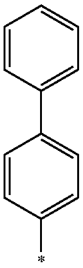 [SMILES: *c1ccc(-c2ccccc2)cc1] | 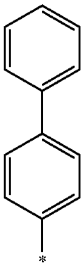 [SMILES: *c1ccc(-c2ccccc2)cc1] |
| 1-D1-3 | 1 | 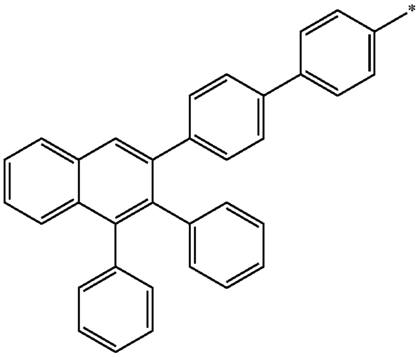 [SMILES: *c1ccc(-c2ccc(-c3cc4ccccc4c(-c4ccccc4)c3-c3ccccc3)cc2)cc1] | 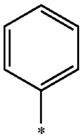 | 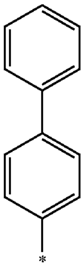 [SMILES: *c1ccc(-c2ccccc2)cc1] |
| 1-D1-4 | 1 | 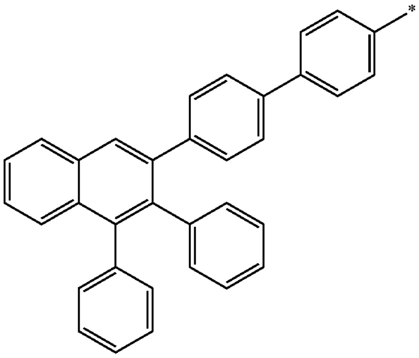 [SMILES: *c1ccc(-c2ccc(-c3cc4ccccc4c(-c4ccccc4)c3-c3ccccc3)cc2)cc1] | 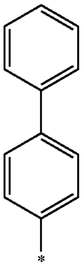 [SMILES: *c1ccc(-c2ccccc2)cc1] | 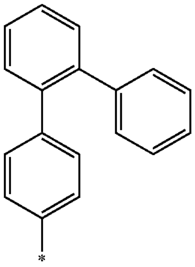 [SMILES: *c1ccc(-c2ccccc2-c2ccccc2)cc1] |
| 1-D1-5 | 1 | 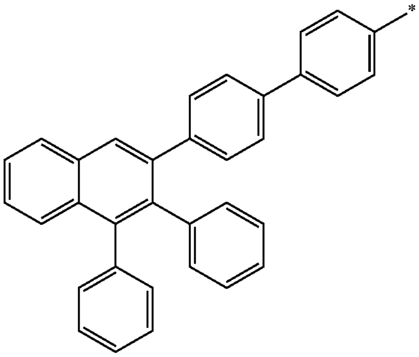 [SMILES: *c1ccc(-c2ccc(-c3cc4ccccc4c(-c4ccccc4)c3-c3ccccc3)cc2)cc1] | 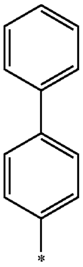 [SMILES: *c1ccc(-c2ccccc2)cc1] | 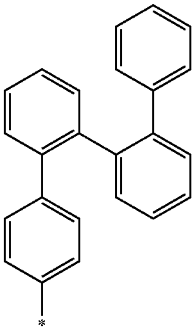 [SMILES: *c1ccc(-c2ccccc2-c2ccccc2-c2ccccc2)cc1] |

-continued
[Compound Group 1]
| | n | A—L—* | $Ar_1$ | $Ar_2$ |
|---|---|---|---|---|
| 1-D1-6 | 1 | 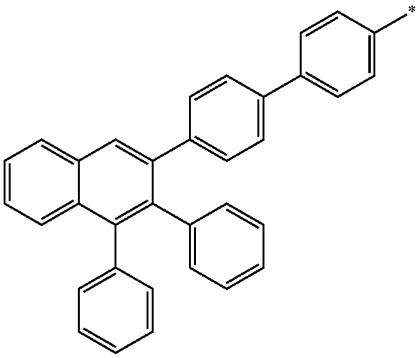 [SMILES: *c1ccc(-c2ccc(-c3cc4ccccc4c(-c4ccccc4)c3-c3ccccc3)cc2)cc1] | 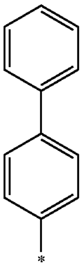 [SMILES: *c1ccc(-c2ccccc2)cc1] | 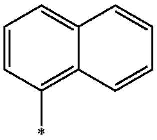 |
| 1-D1-7 | 1 | 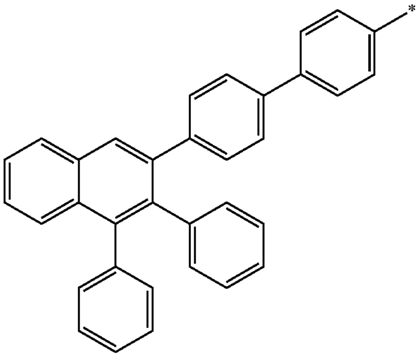 [SMILES: *c1ccc(-c2ccc(-c3cc4ccccc4c(-c4ccccc4)c3-c3ccccc3)cc2)cc1] | 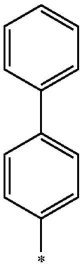 [SMILES: *c1ccc(-c2ccccc2)cc1] | 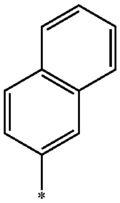 |
| 1-D1-8 | 1 | 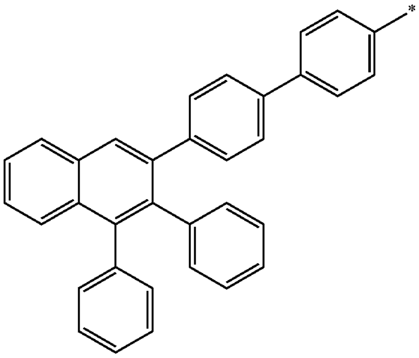 [SMILES: *c1ccc(-c2ccc(-c3cc4ccccc4c(-c4ccccc4)c3-c3ccccc3)cc2)cc1] | 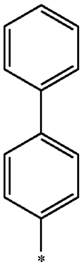 [SMILES: *c1ccc(-c2ccccc2)cc1] | 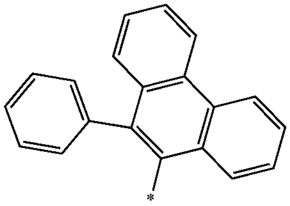 [SMILES: *c1c(-c2ccccc2)c2ccccc2c2ccccc12] |
| 1-D1-9 | 1 | 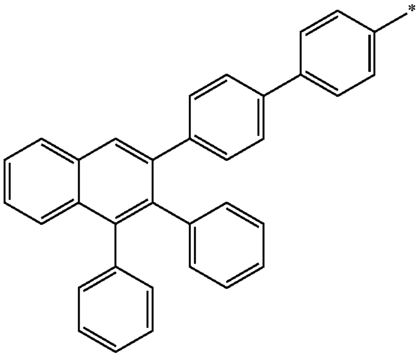 [SMILES: *c1ccc(-c2ccc(-c3cc4ccccc4c(-c4ccccc4)c3-c3ccccc3)cc2)cc1] | 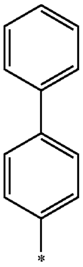 [SMILES: *c1ccc(-c2ccccc2)cc1] | 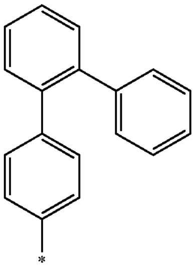 [SMILES: *c1ccc(-c2ccccc2-c2ccccc2)cc1] |

-continued
| [Compound Group 1] | | | | |
|---|---|---|---|---|
| | n | A—L—* | $Ar_1$ | $Ar_2$ |
| 1-D1-10 | 1 | 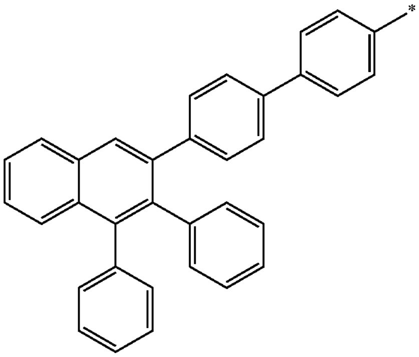 [SMILES: *c1ccc(-c2ccc(-c3cc4ccccc4c(-c4ccccc4)c3-c3ccccc3)cc2)cc1] | 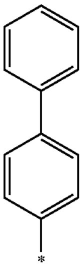 [SMILES: *c1ccc(-c2ccccc2)cc1] | 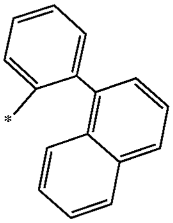 [SMILES: *c1ccccc1-c1cccc2ccccc12] |
| 1-D1-11 | 1 | 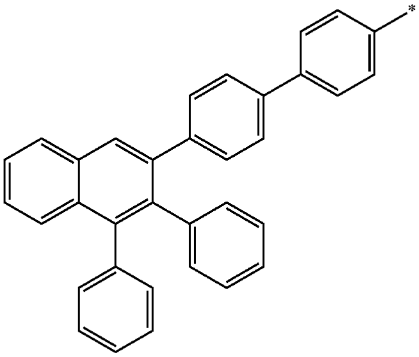 [SMILES: *c1ccc(-c2ccc(-c3cc4ccccc4c(-c4ccccc4)c3-c3ccccc3)cc2)cc1] | 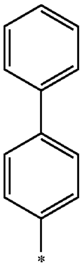 [SMILES: *c1ccc(-c2ccccc2)cc1] | 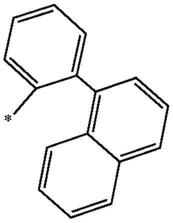 [SMILES: *c1ccccc1-c1cccc2ccccc12] |
| 1-D1-12 | 1 | 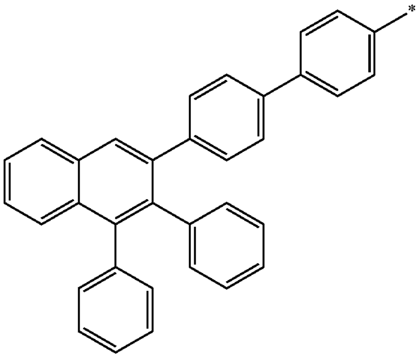 [SMILES: *c1ccc(-c2ccc(-c3cc4ccccc4c(-c4ccccc4)c3-c3ccccc3)cc2)cc1] | 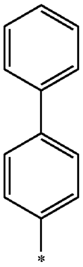 [SMILES: *c1ccc(-c2ccccc2)cc1] | 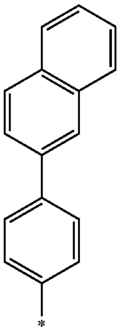 |
| 1-D1-13 | 1 | 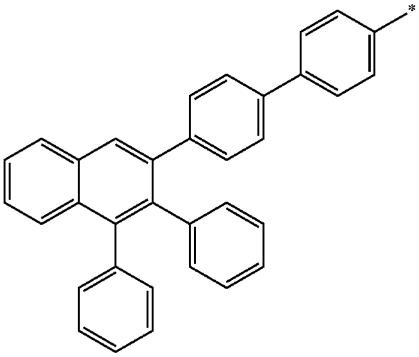 [SMILES: *c1ccc(-c2ccc(-c3cc4ccccc4c(-c4ccccc4)c3-c3ccccc3)cc2)cc1] | 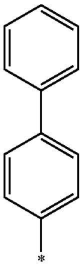 [SMILES: *c1ccc(-c2ccccc2)cc1] | 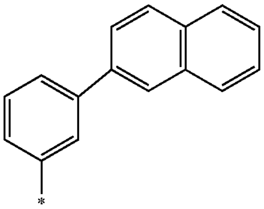 [SMILES: *c1cccc(-c2ccc3ccccc3c2)c1] |

-continued
| [Compound Group 1] | | | | |
|---|---|---|---|---|
| | n | A—L—* | $Ar_1$ | $Ar_2$ |
| 1-D1-14 | 1 | 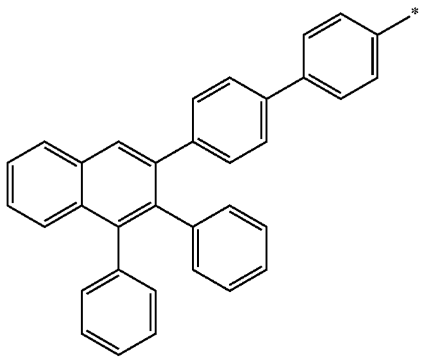 [SMILES: *c1ccc(-c2ccc(-c3cc4ccccc4c(-c4ccccc4)c3-c3ccccc3)cc2)cc1] | 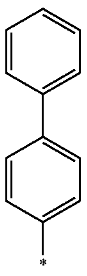 [SMILES: *c1ccc(-c2ccccc2)cc1] | 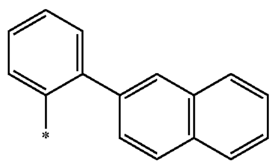 [SMILES: *c1ccccc1-c1ccc2ccccc2c1] |
| 1-D1-15 | 1 | 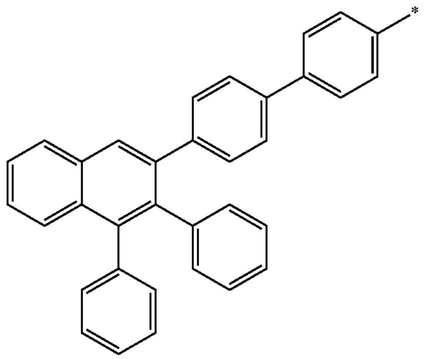 [SMILES: *c1ccc(-c2ccc(-c3cc4ccccc4c(-c4ccccc4)c3-c3ccccc3)cc2)cc1] | 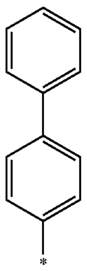 [SMILES: *c1ccc(-c2ccccc2)cc1] | 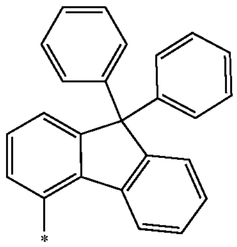 [SMILES: *c1cccc2c1-c1ccccc1C2(c1ccccc1)c1ccccc1] |
| 1-D1-16 | 1 | 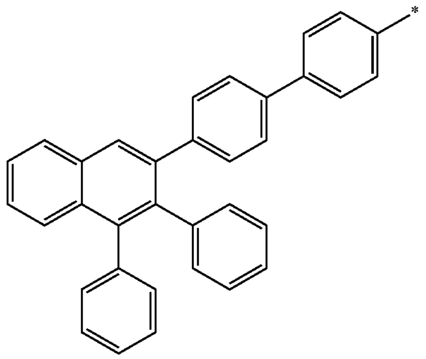 [SMILES: *c1ccc(-c2ccc(-c3cc4ccccc4c(-c4ccccc4)c3-c3ccccc3)cc2)cc1] | 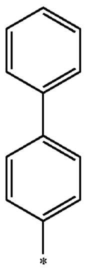 [SMILES: *c1ccc(-c2ccccc2)cc1] | 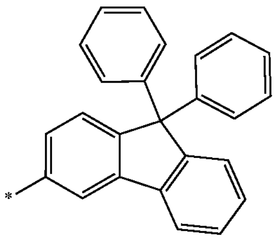 [SMILES: *c1ccc2c(c1)-c1ccccc1C2(c1ccccc1)c1ccccc1] |
| 1-D1-17 | 1 | 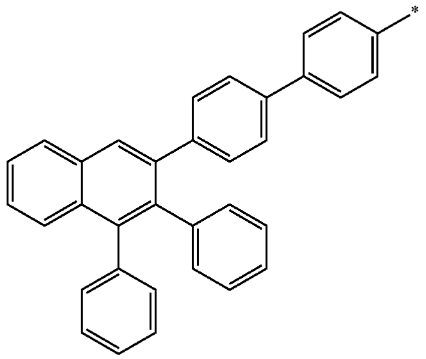 [SMILES: *c1ccc(-c2ccc(-c3cc4ccccc4c(-c4ccccc4)c3-c3ccccc3)cc2)cc1] | 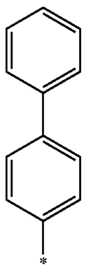 [SMILES: *c1ccc(-c2ccccc2)cc1] | 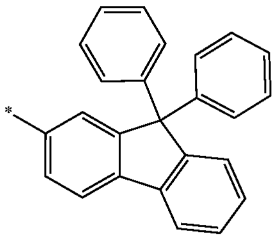 [SMILES: *c1ccc2c(c1)C(c1ccccc1)(c1ccccc1)c1ccccc1-2] |

-continued
| [Compound Group 1] | | | | |
|---|---|---|---|---|
| | n | A—L—* | $Ar_1$ | $Ar_2$ |
| 1-D1-18 | 1 | 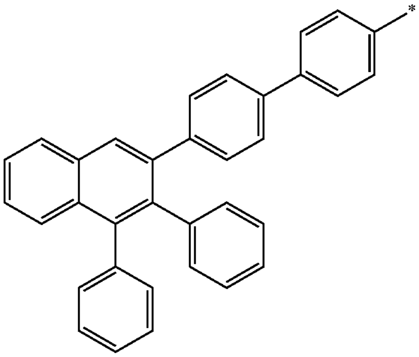 [SMILES: *c1ccc(-c2ccc(-c3cc4ccccc4c(-c4ccccc4)c3-c3ccccc3)cc2)cc1] | 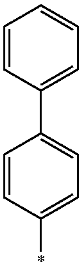 [SMILES: *c1ccc(-c2ccccc2)cc1] | 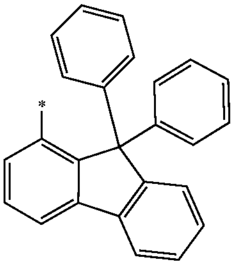 [SMILES: *c1cccc2c1C(c1ccccc1)(c1ccccc1)c1ccccc1-2] |
| 1-D1-19 | 1 | 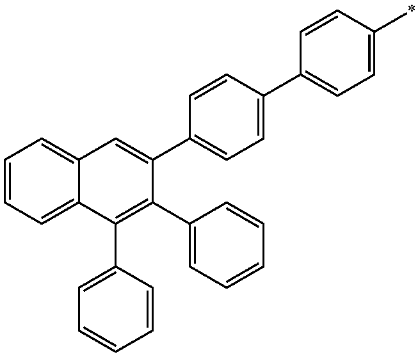 [SMILES: *c1ccc(-c2ccc(-c3cc4ccccc4c(-c4ccccc4)c3-c3ccccc3)cc2)cc1] | 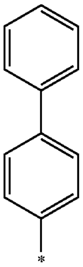 [SMILES: *c1ccc(-c2ccccc2)cc1] | 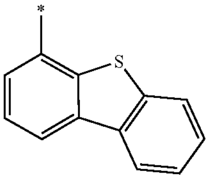 |
| 1-D1-20 | 1 | 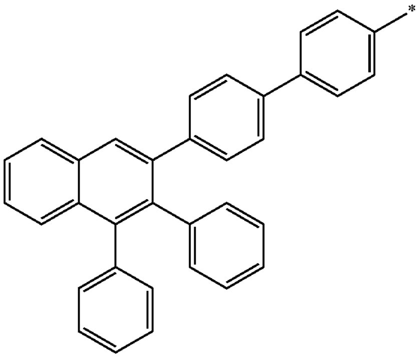 [SMILES: *c1ccc(-c2ccc(-c3cc4ccccc4c(-c4ccccc4)c3-c3ccccc3)cc2)cc1] | 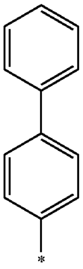 [SMILES: *c1ccc(-c2ccccc2)cc1] | 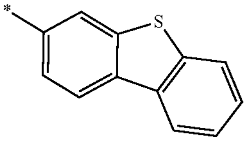 [SMILES: *c1ccc2c(c1)sc1ccccc12] |
| 1-D1-21 | 1 | 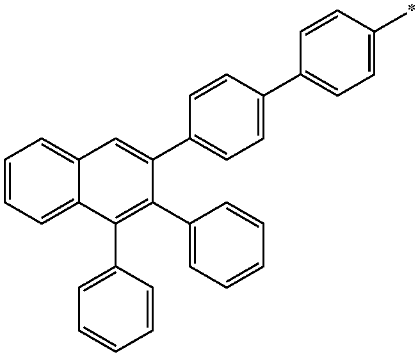 [SMILES: *c1ccc(-c2ccc(-c3cc4ccccc4c(-c4ccccc4)c3-c3ccccc3)cc2)cc1] | 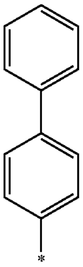 [SMILES: *c1ccc(-c2ccccc2)cc1] | 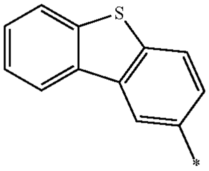 |

-continued
[Compound Group 1]
| | n | A—L—* | $Ar_1$ | $Ar_2$ |
|---|---|---|---|---|
| 1-D1-22 | 1 | 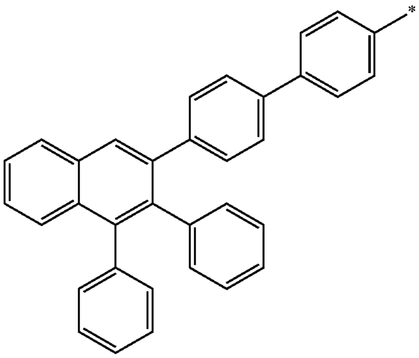 [SMILES: *c1ccc(-c2ccc(-c3cc4ccccc4c(-c4ccccc4)c3-c3ccccc3)cc2)cc1] | 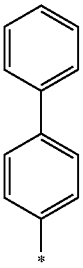 [SMILES: *c1ccc(-c2ccccc2)cc1] | 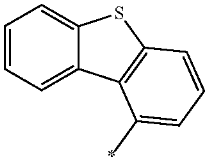 |
| 1-D1-23 | 1 | 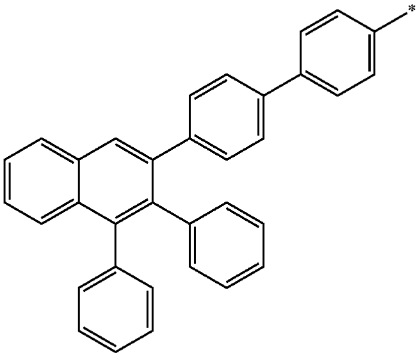 [SMILES: *c1ccc(-c2ccc(-c3cc4ccccc4c(-c4ccccc4)c3-c3ccccc3)cc2)cc1] | 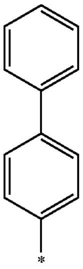 [SMILES: *c1ccc(-c2ccccc2)cc1] | 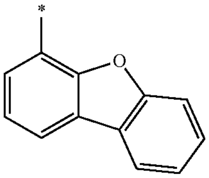 |
| 1-D1-24 | 1 | 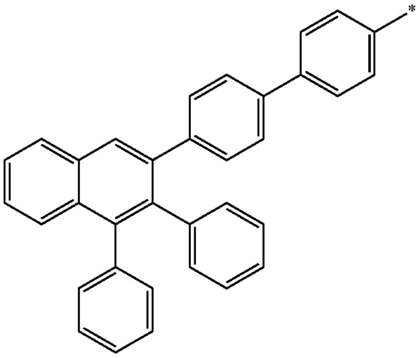 [SMILES: *c1ccc(-c2ccc(-c3cc4ccccc4c(-c4ccccc4)c3-c3ccccc3)cc2)cc1] | 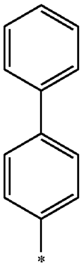 [SMILES: *c1ccc(-c2ccccc2)cc1] | 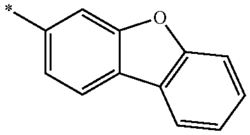 |
| 1-D1-25 | 1 | 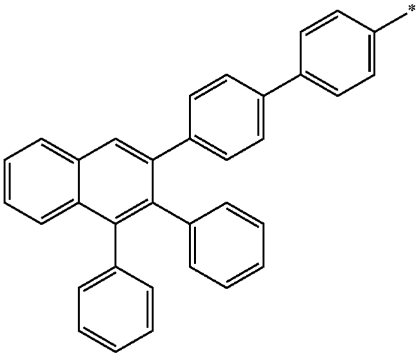 [SMILES: *c1ccc(-c2ccc(-c3cc4ccccc4c(-c4ccccc4)c3-c3ccccc3)cc2)cc1] | 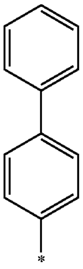 [SMILES: *c1ccc(-c2ccccc2)cc1] | 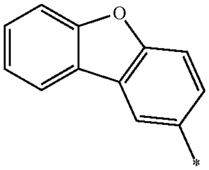 |

-continued
| [Compound Group 1] | | | | |
|---|---|---|---|---|
| | n | A—L—* | $Ar_1$ | $Ar_2$ |
| 1-D1-26 | 1 | 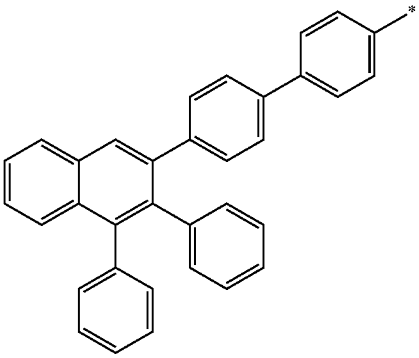 [SMILES: *c1ccc(-c2ccc(-c3cc4ccccc4c(-c4ccccc4)c3-c3ccccc3)cc2)cc1] | 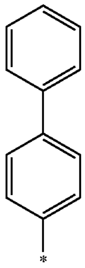 [SMILES: *c1ccc(-c2ccccc2)cc1] | 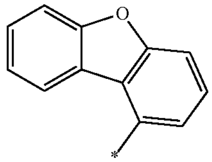 |
| 1-D1-27 | 1 | 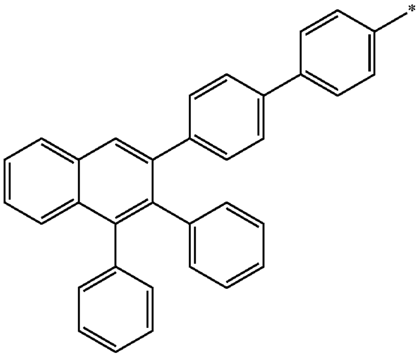 [SMILES: *c1ccc(-c2ccc(-c3cc4ccccc4c(-c4ccccc4)c3-c3ccccc3)cc2)cc1] | 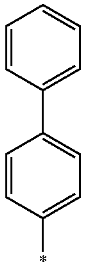 [SMILES: *c1ccc(-c2ccccc2)cc1] | 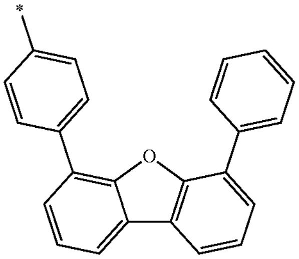 |
| 1-D1-28 | 1 | 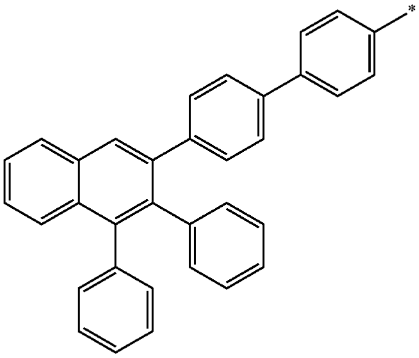 [SMILES: *c1ccc(-c2ccc(-c3cc4ccccc4c(-c4ccccc4)c3-c3ccccc3)cc2)cc1] | 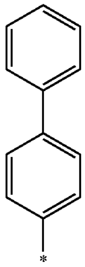 [SMILES: *c1ccc(-c2ccccc2)cc1] | 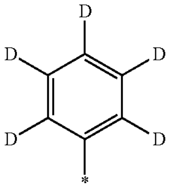 |
| 1-D1-29 | 1 | 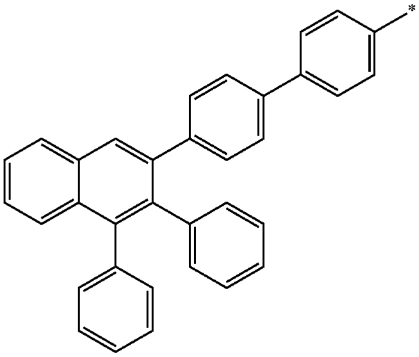 [SMILES: *c1ccc(-c2ccc(-c3cc4ccccc4c(-c4ccccc4)c3-c3ccccc3)cc2)cc1] | 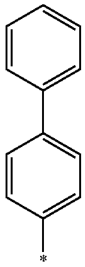 [SMILES: *c1ccc(-c2ccccc2)cc1] | 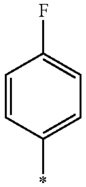 |

-continued
[Compound Group 1]
| | n | A—L—* | Ar$_1$ | Ar$_2$ |
|---|---|---|---|---|
| 1-D1-30 | 1 | 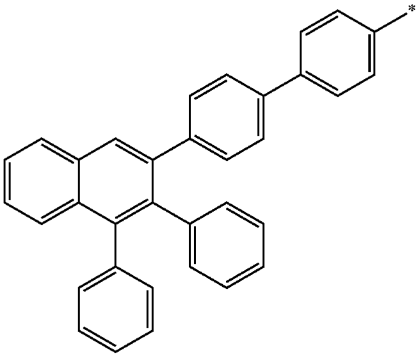 [SMILES: *c1ccc(-c2ccc(-c3cc4ccccc4c(-c4ccccc4)c3-c3ccccc3)cc2)cc1] | 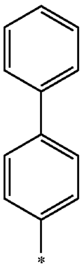 [SMILES: *c1ccc(-c2ccccc2)cc1] | 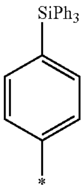 |
| 1-D1-31 | 1 | 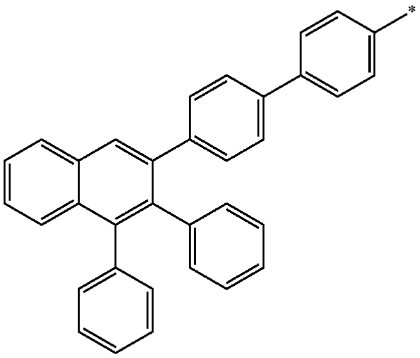 [SMILES: *c1ccc(-c2ccc(-c3cc4ccccc4c(-c4ccccc4)c3-c3ccccc3)cc2)cc1] | 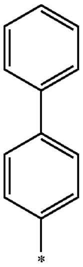 [SMILES: *c1ccc(-c2ccccc2)cc1] | 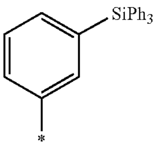 |
| 1-D1-32 | 1 | 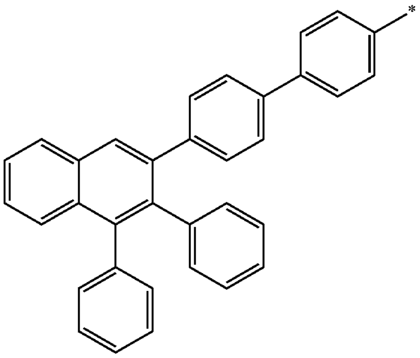 [SMILES: *c1ccc(-c2ccc(-c3cc4ccccc4c(-c4ccccc4)c3-c3ccccc3)cc2)cc1] | 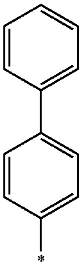 [SMILES: *c1ccc(-c2ccccc2)cc1] | 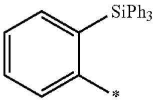 |
| 1-D1-33 | 1 | 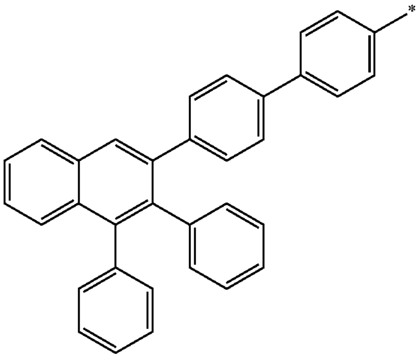 [SMILES: *c1ccc(-c2ccc(-c3cc4ccccc4c(-c4ccccc4)c3-c3ccccc3)cc2)cc1] | 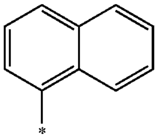 | 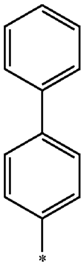 [SMILES: *c1ccc(-c2ccccc2)cc1] |

-continued
[Compound Group 1]
| | n | A—L—* | $Ar_1$ | $Ar_2$ |
|---|---|---|---|---|
| 1-D1-34 | 1 | 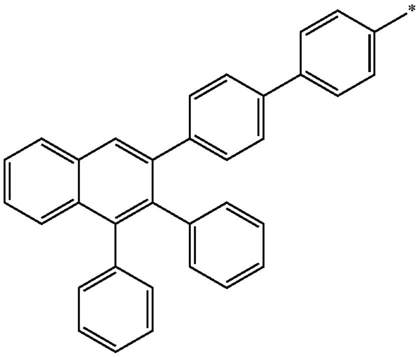 [SMILES: *c1ccc(-c2ccc(-c3cc4ccccc4c(-c4ccccc4)c3-c3ccccc3)cc2)cc1] | 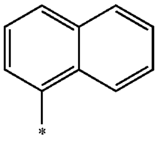 | 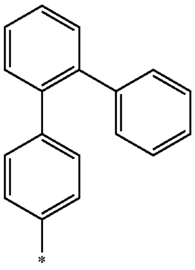 [SMILES: *c1ccc(-c2ccccc2-c2ccccc2)cc1] |
| 1-D1-35 | 1 | 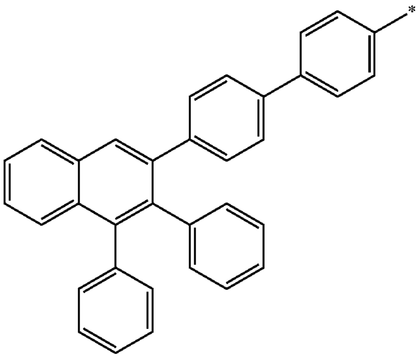 [SMILES: *c1ccc(-c2ccc(-c3cc4ccccc4c(-c4ccccc4)c3-c3ccccc3)cc2)cc1] | 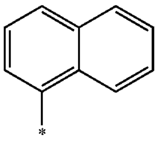 | 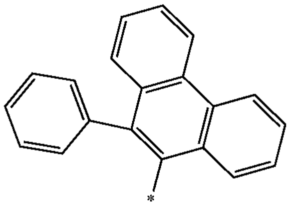 [SMILES: *c1c(-c2ccccc2)c2ccccc2c2ccccc12] |
| 1-D1-36 | 1 | 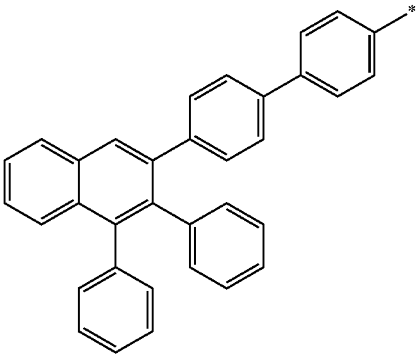 [SMILES: *c1ccc(-c2ccc(-c3cc4ccccc4c(-c4ccccc4)c3-c3ccccc3)cc2)cc1] | 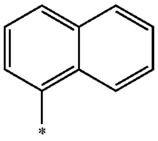 [SMILES: *c1cccc2ccccc12] | 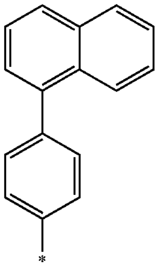 [SMILES: *c1ccc(-c2cccc3ccccc23)cc1] |
| 1-D1-37 | 1 | 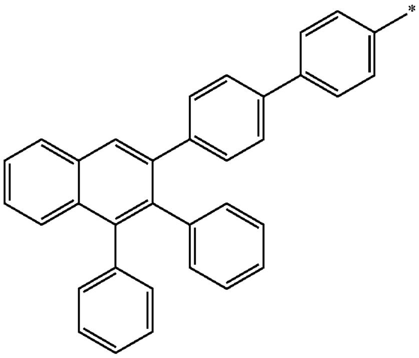 [SMILES: *c1ccc(-c2ccc(-c3cc4ccccc4c(-c4ccccc4)c3-c3ccccc3)cc2)cc1] | 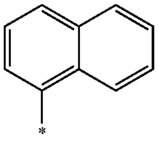 | 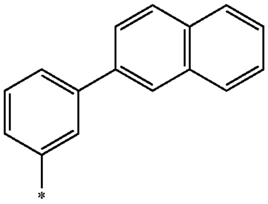 [SMILES: *c1cccc(-c2ccc3ccccc3c2)c1] |

-continued
[Compound Group 1]
| | n | A—L—* | $Ar_1$ | $Ar_2$ |
|---|---|---|---|---|
| 1-D1-38 | 1 | 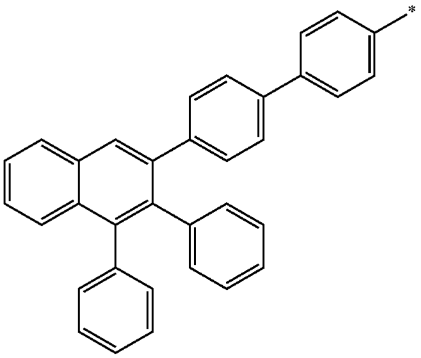 [SMILES: *c1ccc(-c2ccc(-c3cc4ccccc4c(-c4ccccc4)c3-c3ccccc3)cc2)cc1] | 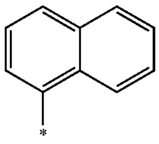 | 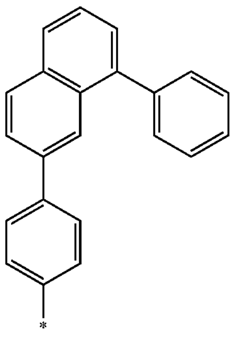 [SMILES: *c1ccc(-c2ccc3cccc(-c4ccccc4)c3c2)cc1] |
| 1-D1-39 | 1 | 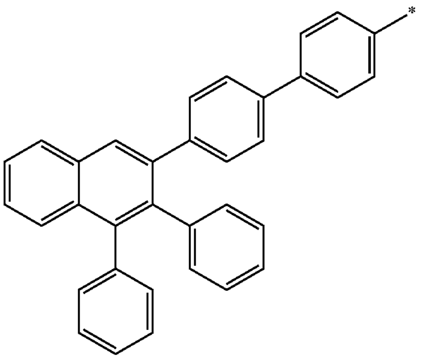 [SMILES: *c1ccc(-c2ccc(-c3cc4ccccc4c(-c4ccccc4)c3-c3ccccc3)cc2)cc1] | 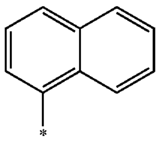 | 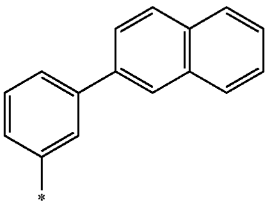 [SMILES: *c1cccc(-c2ccc3ccccc3c2)c1] |
| 1-D1-40 | 1 | 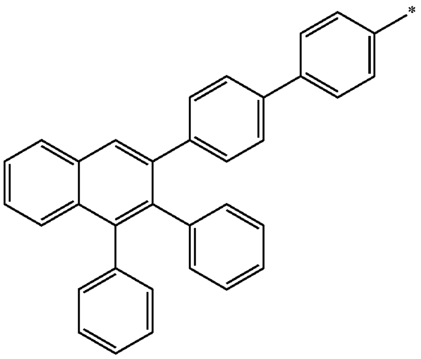 [SMILES: *c1ccc(-c2ccc(-c3cc4ccccc4c(-c4ccccc4)c3-c3ccccc3)cc2)cc1] | 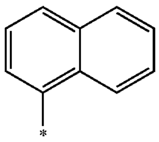 [SMILES: *c1cccc2ccccc12] | 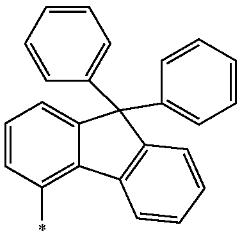 [SMILES: *c1cccc2c1-c1ccccc1C2(c1ccccc1)c1ccccc1] |
| 1-D1-41 | 1 | 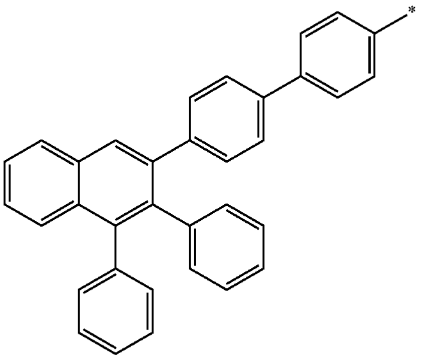 [SMILES: *c1ccc(-c2ccc(-c3cc4ccccc4c(-c4ccccc4)c3-c3ccccc3)cc2)cc1] | 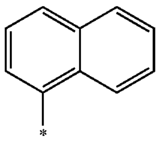 | 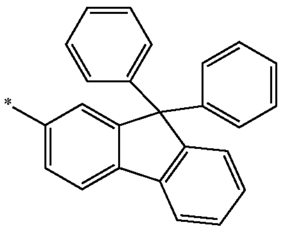 [SMILES: *c1ccc2c(c1)C(c1ccccc1)(c1ccccc1)c1ccccc1-2] |

-continued
[Compound Group 1]
| | n | A—L—* | $Ar_1$ | $Ar_2$ |
|---|---|---|---|---|
| 1-D1-42 | 1 | 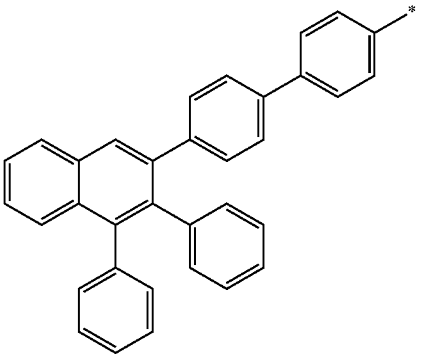 [SMILES: *c1ccc(-c2ccc(-c3cc4ccccc4c(-c4ccccc4)c3-c3ccccc3)cc2)cc1] | 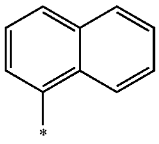 | 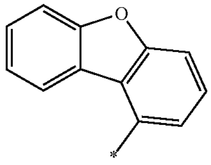 |
| 1-D1-43 | 1 | 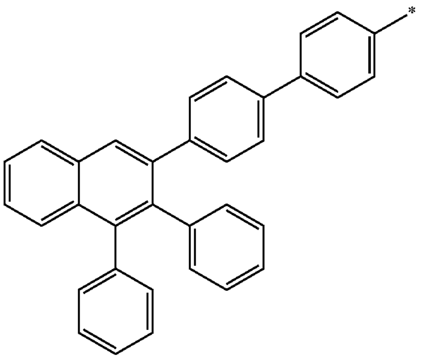 [SMILES: *c1ccc(-c2ccc(-c3cc4ccccc4c(-c4ccccc4)c3-c3ccccc3)cc2)cc1] | 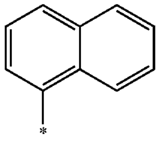 | 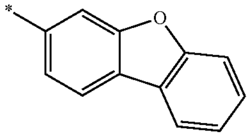 |
| 1-D1-44 | 1 | 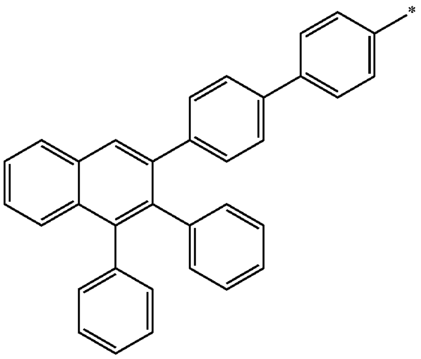 [SMILES: *c1ccc(-c2ccc(-c3cc4ccccc4c(-c4ccccc4)c3-c3ccccc3)cc2)cc1] | 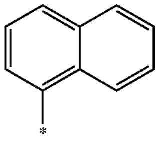 [SMILES: *c1cccc2ccccc12] | 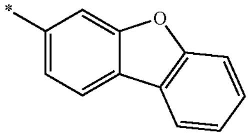 |
| 1-D1-45 | 1 | 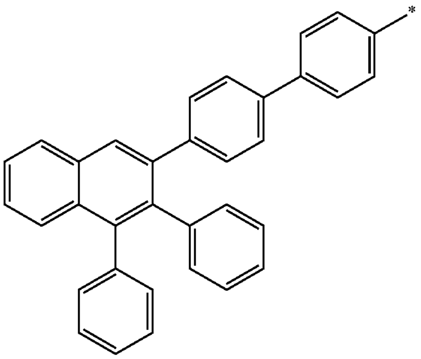 [SMILES: *c1ccc(-c2ccc(-c3cc4ccccc4c(-c4ccccc4)c3-c3ccccc3)cc2)cc1] | 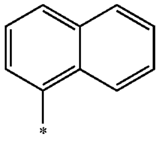 | 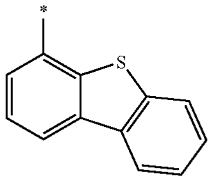 |

-continued
[Compound Group 1]
| | n | A—L—* | $Ar_1$ | $Ar_2$ |
|---|---|---|---|---|
| 1-D1-46 | 1 | 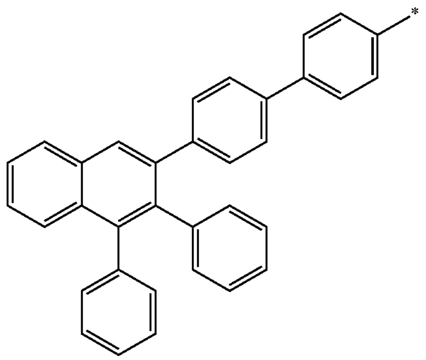 [SMILES: *c1ccc(-c2ccc(-c3cc4ccccc4c(-c4ccccc4)c3-c3ccccc3)cc2)cc1] | 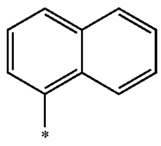 | 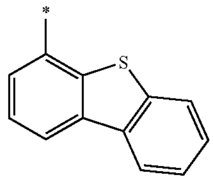 |
| 1-D1-47 | 1 | 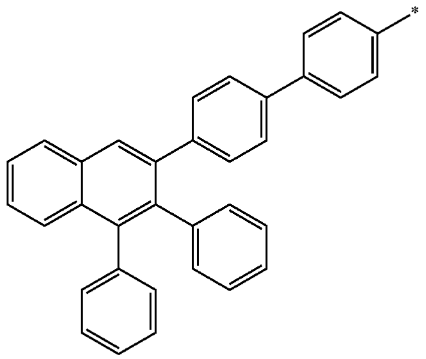 [SMILES: *c1ccc(-c2ccc(-c3cc4ccccc4c(-c4ccccc4)c3-c3ccccc3)cc2)cc1] | 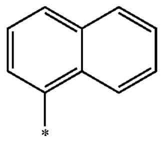 | 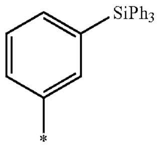 |
| 1-D1-48 | 1 | 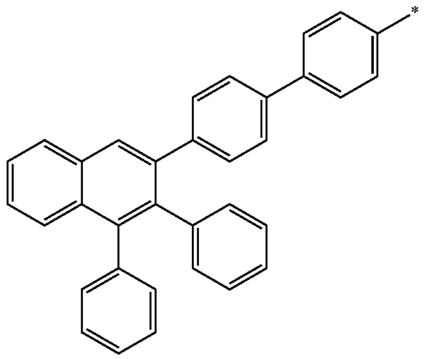 [SMILES: *c1ccc(-c2ccc(-c3cc4ccccc4c(-c4ccccc4)c3-c3ccccc3)cc2)cc1] | 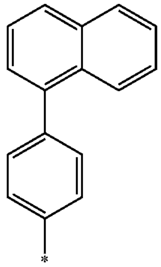 | 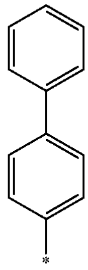 |
| 1-D1-49 | 1 | 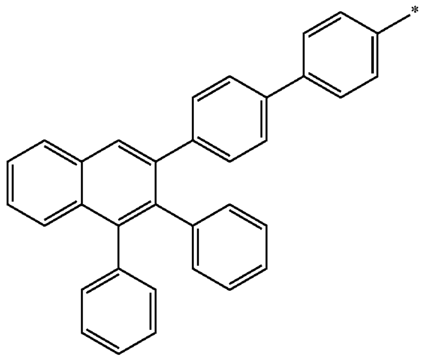 [SMILES: *c1ccc(-c2ccc(-c3cc4ccccc4c(-c4ccccc4)c3-c3ccccc3)cc2)cc1] | 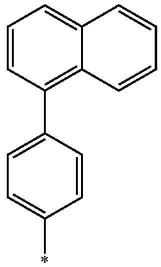 | 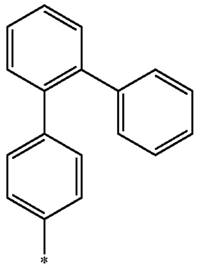 |

-continued
| [Compound Group 1] | | | | |
|---|---|---|---|---|
| | n | A—L—* | $Ar_1$ | $Ar_2$ |
| 1-D1-50 | 1 | 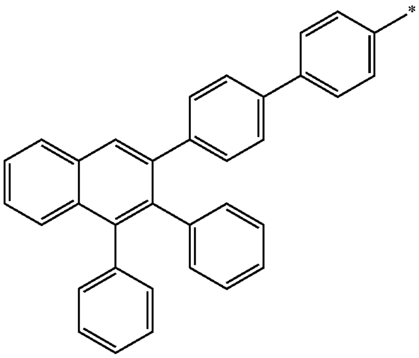 [SMILES: *c1ccc(-c2ccc(-c3cc4ccccc4c(-c4ccccc4)c3-c3ccccc3)cc2)cc1] | 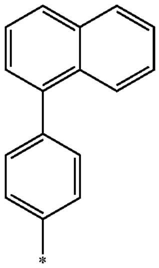 | 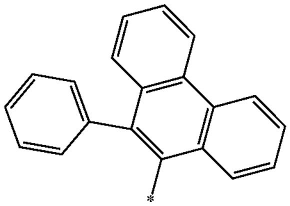 |
| 1-D1-51 | 1 | 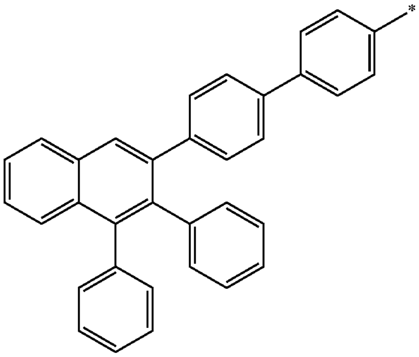 [SMILES: *c1ccc(-c2ccc(-c3cc4ccccc4c(-c4ccccc4)c3-c3ccccc3)cc2)cc1] | 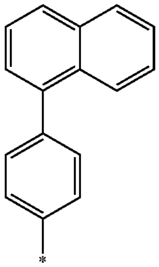 | 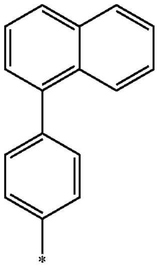 |
| 1-D1-52 | 1 | 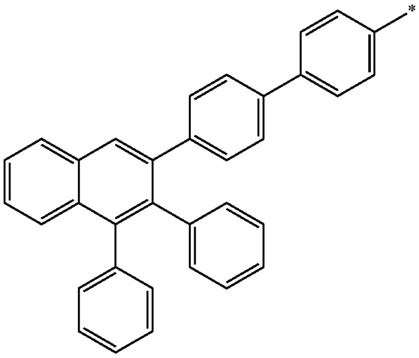 [SMILES: *c1ccc(-c2ccc(-c3cc4ccccc4c(-c4ccccc4)c3-c3ccccc3)cc2)cc1] | 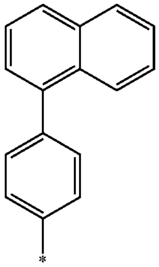 | 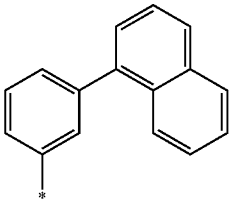 |
| 1-D1-53 | 1 | 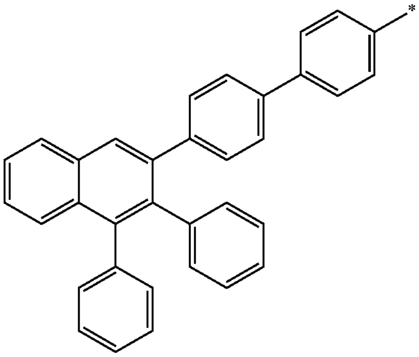 [SMILES: *c1ccc(-c2ccc(-c3cc4ccccc4c(-c4ccccc4)c3-c3ccccc3)cc2)cc1] | 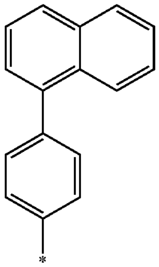 | 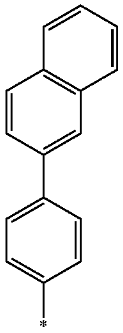 |

-continued
[Compound Group 1]
| | n | A—L—* | $Ar_1$ | $Ar_2$ |
|---|---|---|---|---|
| 1-D1-54 | 1 | 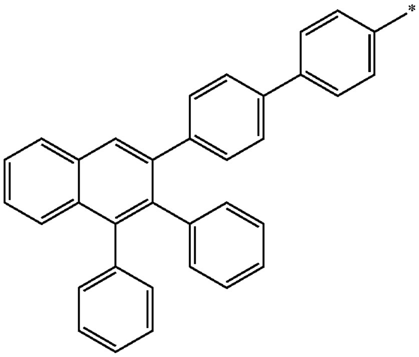 [SMILES: *c1ccc(-c2ccc(-c3cc4ccccc4c(-c4ccccc4)c3-c3ccccc3)cc2)cc1] | 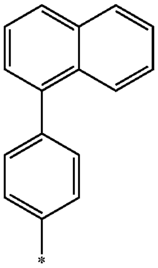 | 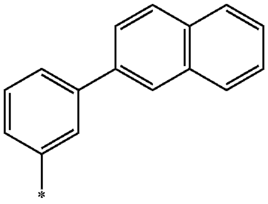 |
| 1-D1-55 | 1 | 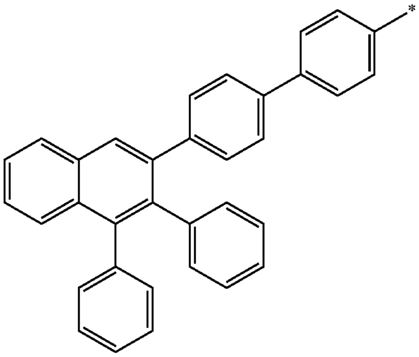 [SMILES: *c1ccc(-c2ccc(-c3cc4ccccc4c(-c4ccccc4)c3-c3ccccc3)cc2)cc1] | 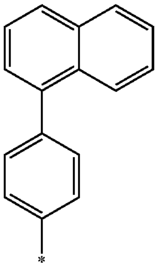 | 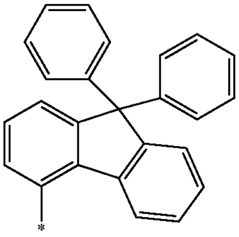 |
| 1-D1-56 | 1 | 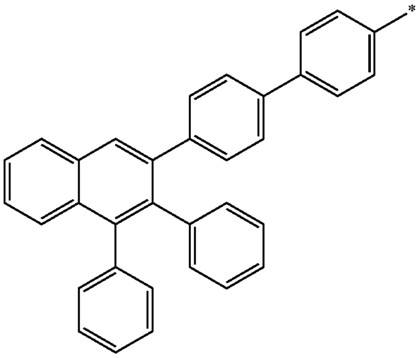 [SMILES: *c1ccc(-c2ccc(-c3cc4ccccc4c(-c4ccccc4)c3-c3ccccc3)cc2)cc1] | 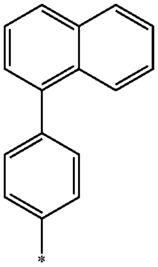 | 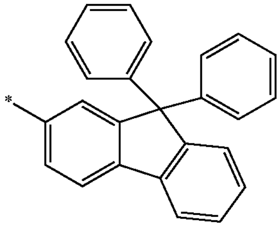 |
| 1-D1-57 | 1 | 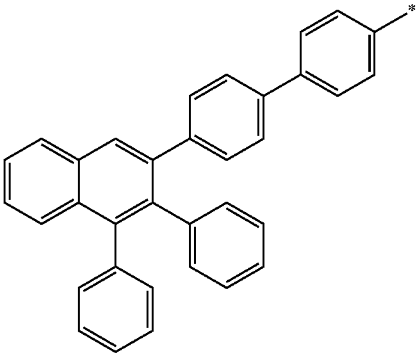 [SMILES: *c1ccc(-c2ccc(-c3cc4ccccc4c(-c4ccccc4)c3-c3ccccc3)cc2)cc1] | 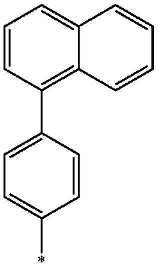 | 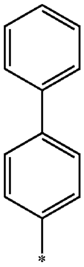 |

-continued
[Compound Group 1]
| | n | A—L—* | $Ar_1$ | $Ar_2$ |
|---|---|---|---|---|
| 1-D1-58 | 1 | 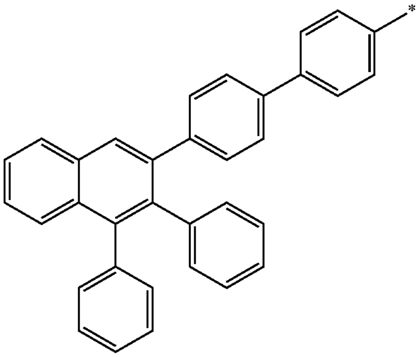 [SMILES: *c1ccc(-c2ccc(-c3cc4ccccc4c(-c4ccccc4)c3-c3ccccc3)cc2)cc1] | 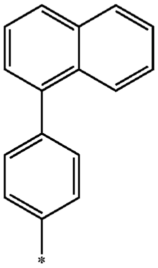 | 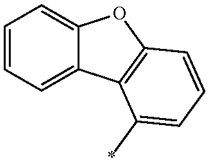 |
| 1-D1-59 | 1 | 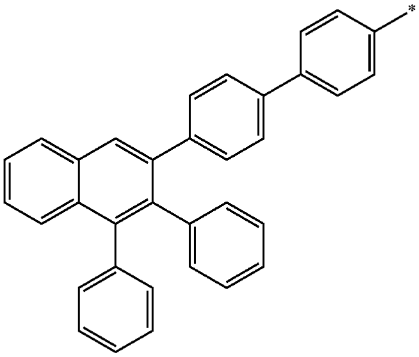 [SMILES: *c1ccc(-c2ccc(-c3cc4ccccc4c(-c4ccccc4)c3-c3ccccc3)cc2)cc1] | 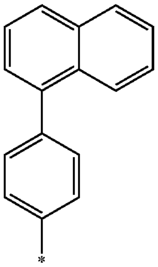 | 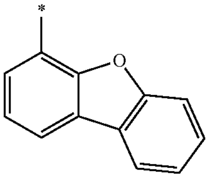 |
| 1-D1-60 | 1 | 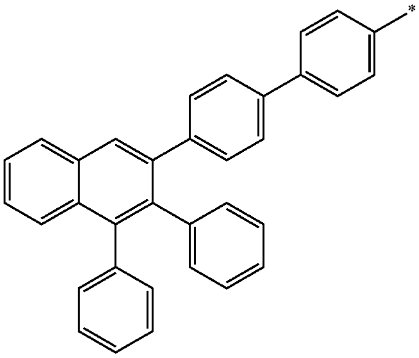 [SMILES: *c1ccc(-c2ccc(-c3cc4ccccc4c(-c4ccccc4)c3-c3ccccc3)cc2)cc1] | 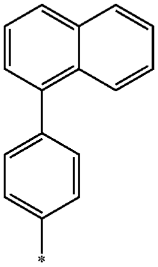 | 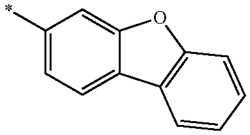 |
| 1-D1-61 | 1 | 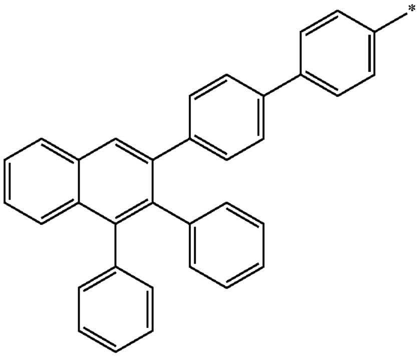 [SMILES: *c1ccc(-c2ccc(-c3cc4ccccc4c(-c4ccccc4)c3-c3ccccc3)cc2)cc1] | 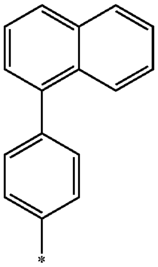 | 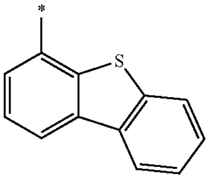 |

-continued
[Compound Group 1]
| | n | A—L—* | $Ar_1$ | $Ar_2$ |
|---|---|---|---|---|
| 1-D1-62 | 1 | 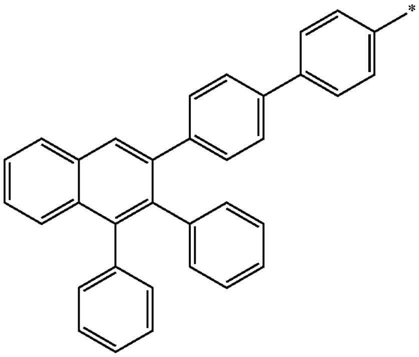 [SMILES: *c1ccc(-c2ccc(-c3cc4ccccc4c(-c4ccccc4)c3-c3ccccc3)cc2)cc1] | 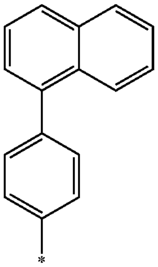 | 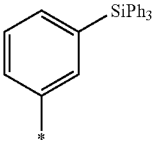 |
| 1-D1-63 | 1 | 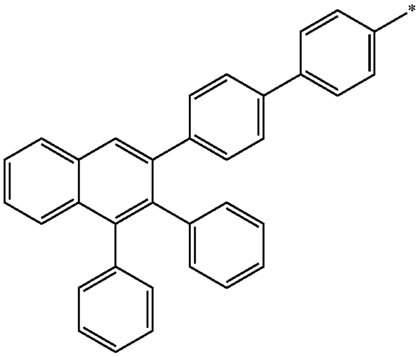 [SMILES: *c1ccc(-c2ccc(-c3cc4ccccc4c(-c4ccccc4)c3-c3ccccc3)cc2)cc1] | 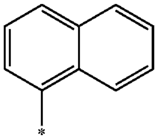 | 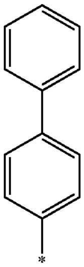 |
| 1-D1-64 | 1 | 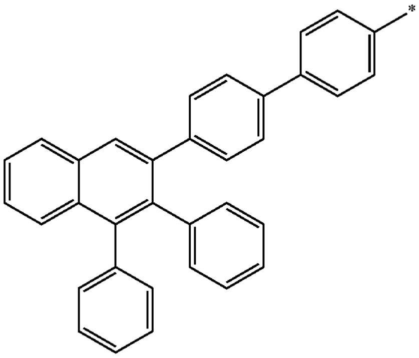 [SMILES: *c1ccc(-c2ccc(-c3cc4ccccc4c(-c4ccccc4)c3-c3ccccc3)cc2)cc1] | 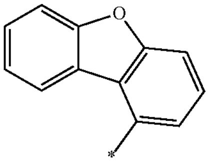 | 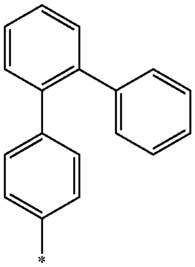 |
| 1-D1-65 | 1 | 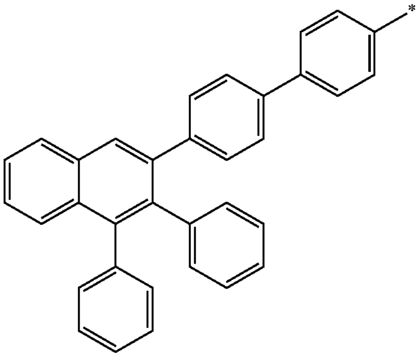 [SMILES: *c1ccc(-c2ccc(-c3cc4ccccc4c(-c4ccccc4)c3-c3ccccc3)cc2)cc1] | 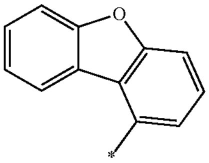 | 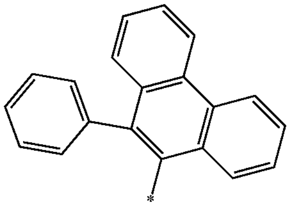 |

-continued
[Compound Group 1]
| | n | A—L—* | $Ar_1$ | $Ar_2$ |
|---|---|---|---|---|
| 1-D1-66 | 1 | 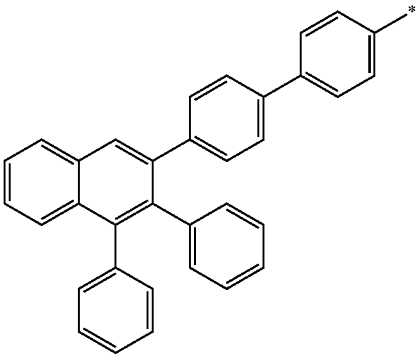 [SMILES: *c1ccc(-c2ccc(-c3cc4ccccc4c(-c4ccccc4)c3-c3ccccc3)cc2)cc1] | 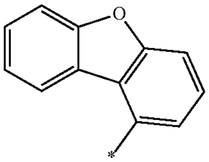 | 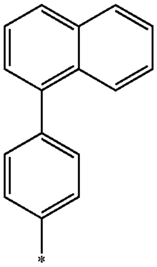 |
| 1-D1-67 | 1 | 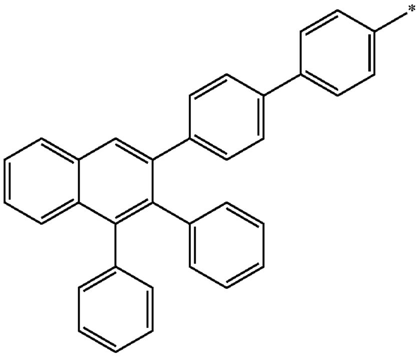 [SMILES: *c1ccc(-c2ccc(-c3cc4ccccc4c(-c4ccccc4)c3-c3ccccc3)cc2)cc1] | 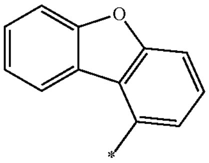 | 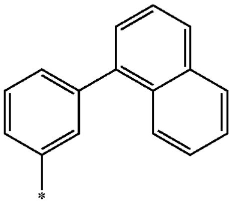 |
| 1-D1-68 | 1 | 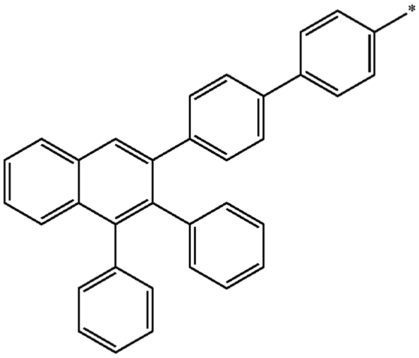 [SMILES: *c1ccc(-c2ccc(-c3cc4ccccc4c(-c4ccccc4)c3-c3ccccc3)cc2)cc1] | 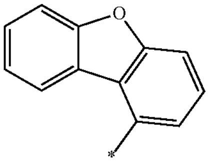 | 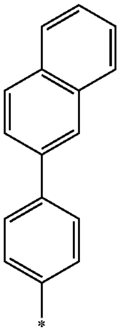 |
| 1-D1-69 | 1 | 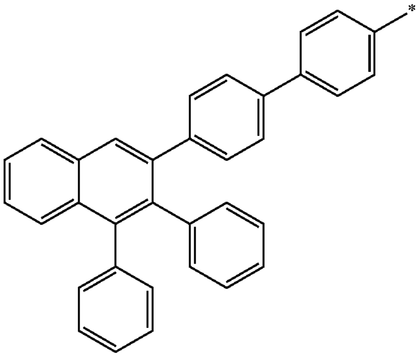 [SMILES: *c1ccc(-c2ccc(-c3cc4ccccc4c(-c4ccccc4)c3-c3ccccc3)cc2)cc1] | 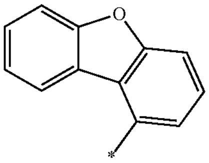 | 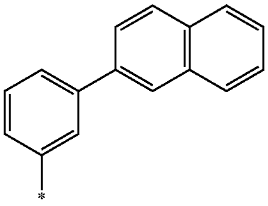 |

-continued
| [Compound Group 1] | | | | |
|---|---|---|---|---|
| | n | A—L—* | $Ar_1$ | $Ar_2$ |
| 1-D1-70 | 1 | 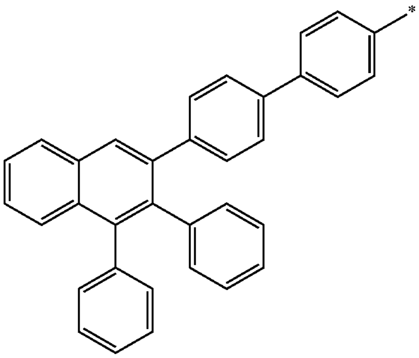 [SMILES: *c1ccc(-c2ccc(-c3cc4ccccc4c(-c4ccccc4)c3-c3ccccc3)cc2)cc1] | 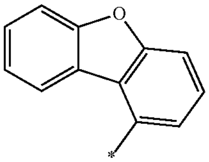 | 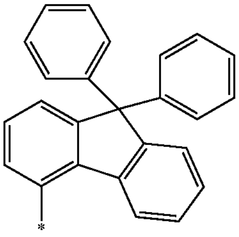 |
| 1-D1-71 | 1 | 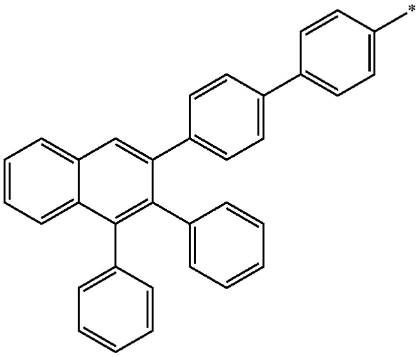 [SMILES: *c1ccc(-c2ccc(-c3cc4ccccc4c(-c4ccccc4)c3-c3ccccc3)cc2)cc1] | 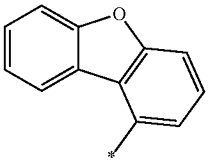 | 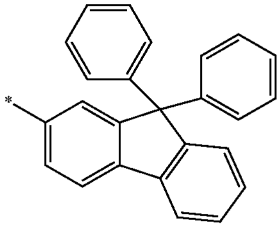 |
| 1-D1-72 | 1 | 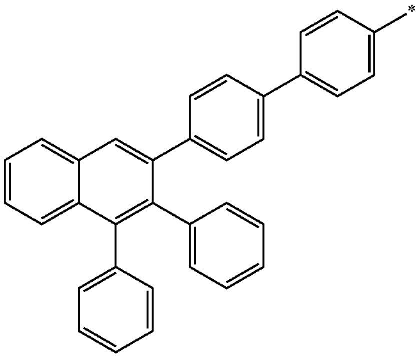 [SMILES: *c1ccc(-c2ccc(-c3cc4ccccc4c(-c4ccccc4)c3-c3ccccc3)cc2)cc1] | 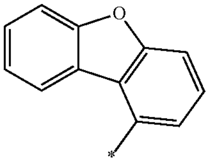 | 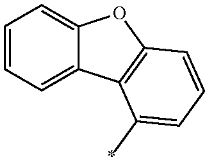 |
| 1-D1-73 | 1 | 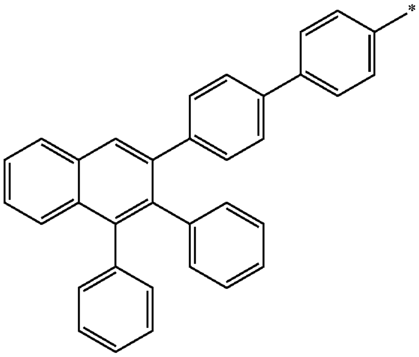 [SMILES: *c1ccc(-c2ccc(-c3cc4ccccc4c(-c4ccccc4)c3-c3ccccc3)cc2)cc1] | 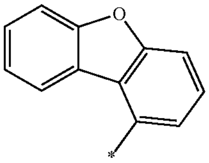 | 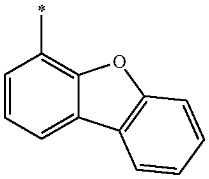 [SMILES: *c1cccc2c1oc1ccccc12] |

-continued
[Compound Group 1]
| | n | A—L—* | $Ar_1$ | $Ar_2$ |
|---|---|---|---|---|
| 1-D1-74 | 1 | 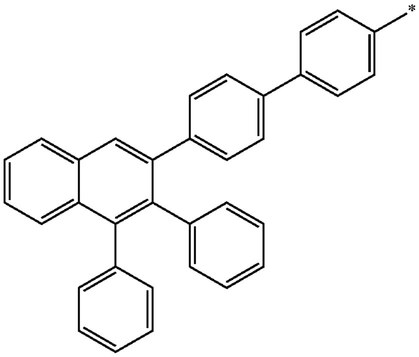 [SMILES: *c1ccc(-c2ccc(-c3cc4ccccc4c(-c4ccccc4)c3-c3ccccc3)cc2)cc1] | 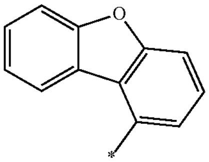 | 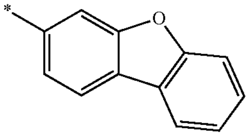 [SMILES: *c1ccc2c(c1)oc1ccccc12] |
| 1-D1-75 | 1 | 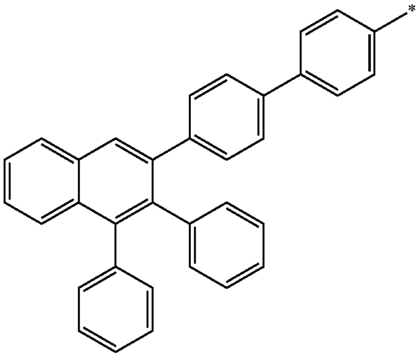 [SMILES: *c1ccc(-c2ccc(-c3cc4ccccc4c(-c4ccccc4)c3-c3ccccc3)cc2)cc1] | 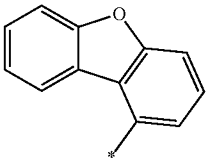 | 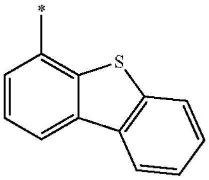 |
| 1-D1-76 | 1 | 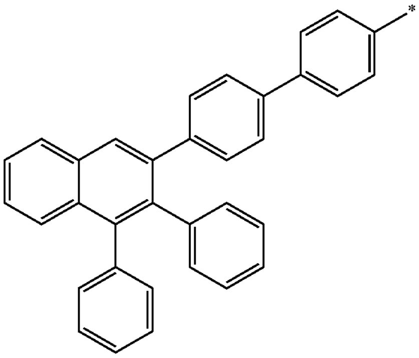 [SMILES: *c1ccc(-c2ccc(-c3cc4ccccc4c(-c4ccccc4)c3-c3ccccc3)cc2)cc1] | 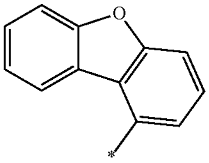 | 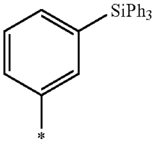 |
| 1-D1-77 | 1 | 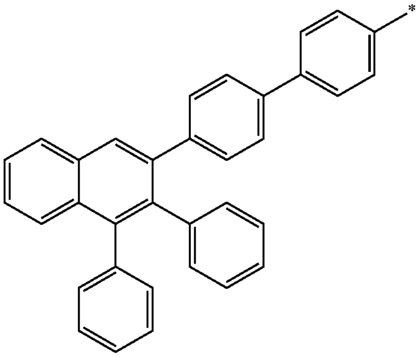 [SMILES: *c1ccc(-c2ccc(-c3cc4ccccc4c(-c4ccccc4)c3-c3ccccc3)cc2)cc1] | 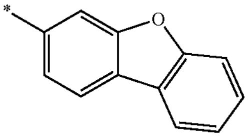 [SMILES: *c1ccc2c(c1)oc1ccccc12] | 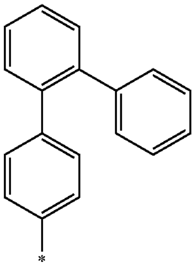 [SMILES: *c1ccc(-c2ccccc2-c2ccccc2)cc1] |

-continued
[Compound Group 1]
| | n | A—L—* | $Ar_1$ | $Ar_2$ |
|---|---|---|---|---|
| 1-D1-78 | 1 | 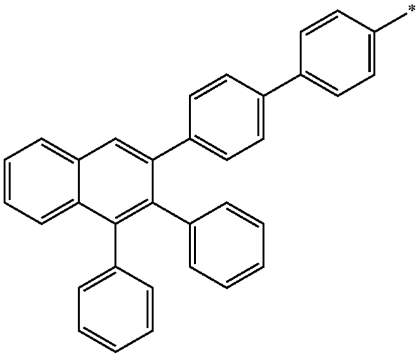 [SMILES: *c1ccc(-c2ccc(-c3cc4ccccc4c(-c4ccccc4)c3-c3ccccc3)cc2)cc1] | 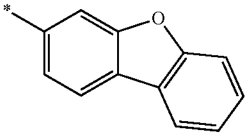 [SMILES: *c1ccc2c(c1)oc1ccccc12] | 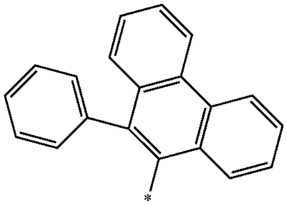 [SMILES: *c1c(-c2ccccc2)c2ccccc2c2ccccc12] |
| 1-D1-79 | 1 | 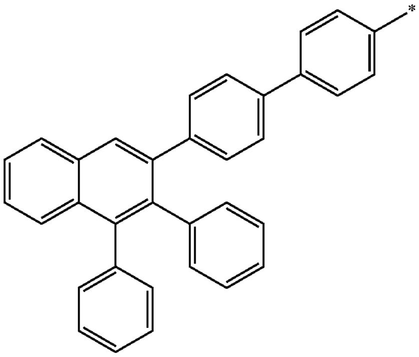 [SMILES: *c1ccc(-c2ccc(-c3cc4ccccc4c(-c4ccccc4)c3-c3ccccc3)cc2)cc1] | 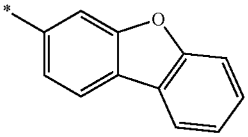 [SMILES: *c1ccc2c(c1)oc1ccccc12] | 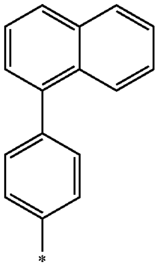 [SMILES: *c1ccc(-c2cccc3ccccc23)cc1] |
| 1-D1-80 | 1 | 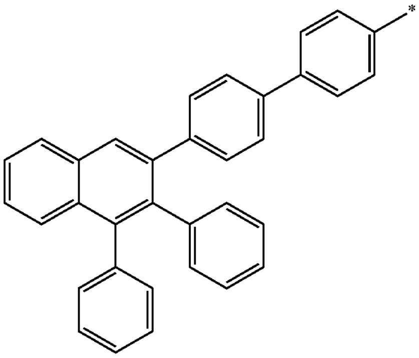 [SMILES: *c1ccc(-c2ccc(-c3cc4ccccc4c(-c4ccccc4)c3-c3ccccc3)cc2)cc1] | 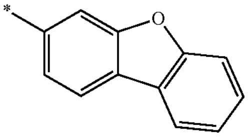 [SMILES: *c1ccc2c(c1)oc1ccccc12] | 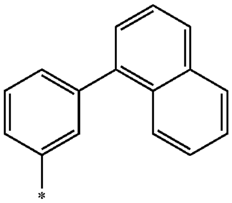 [SMILES: *c1cccc(-c2cccc3ccccc23)c1] |
| 1-D1-81 | 1 | 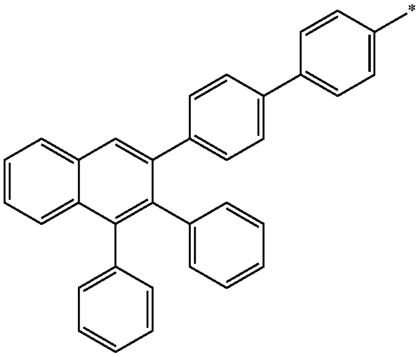 [SMILES: *c1ccc(-c2ccc(-c3cc4ccccc4c(-c4ccccc4)c3-c3ccccc3)cc2)cc1] | 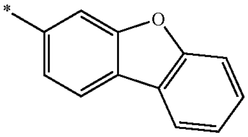 [SMILES: *c1ccc2c(c1)oc1ccccc12] | 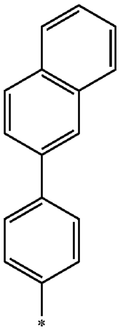 [SMILES: *c1ccc(-c2ccc3ccccc3c2)cc1] |

-continued
| [Compound Group 1] | | | | |
|---|---|---|---|---|
| | n | A—L—* | $Ar_1$ | $Ar_2$ |
| 1-D1-82 | 1 | 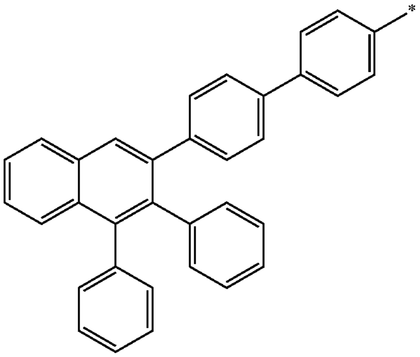 [SMILES: *c1ccc(-c2ccc(-c3cc4ccccc4c(-c4ccccc4)c3-c3ccccc3)cc2)cc1] | 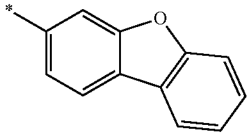 [SMILES: *c1ccc2c(c1)oc1ccccc12] | 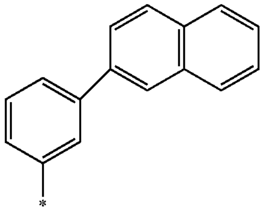 [SMILES: *c1cccc(-c2ccc3ccccc3c2)c1] |
| 1-D1-83 | 1 | 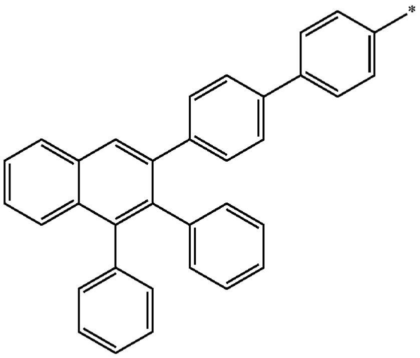 [SMILES: *c1ccc(-c2ccc(-c3cc4ccccc4c(-c4ccccc4)c3-c3ccccc3)cc2)cc1] | 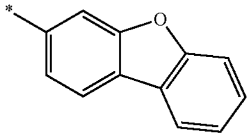 [SMILES: *c1ccc2c(c1)oc1ccccc12] | 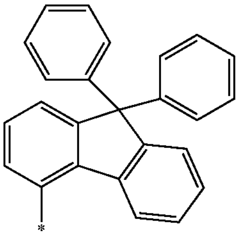 |
| 1-D1-84 | 1 | 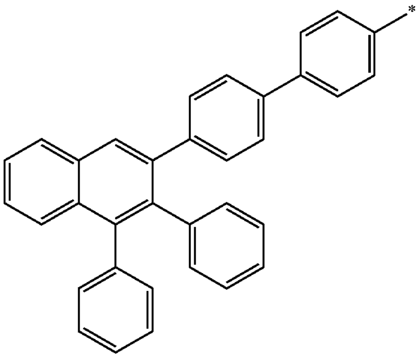 [SMILES: *c1ccc(-c2ccc(-c3cc4ccccc4c(-c4ccccc4)c3-c3ccccc3)cc2)cc1] | 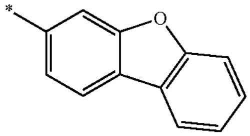 [SMILES: *c1ccc2c(c1)oc1ccccc12] | 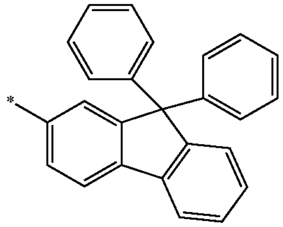 |
| 1-D1-85 | 1 | 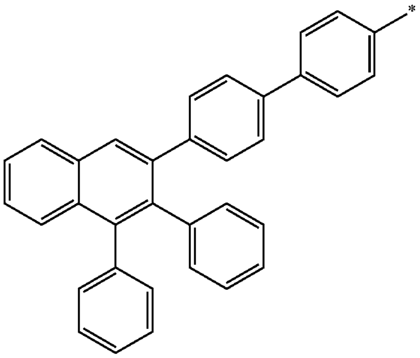 [SMILES: *c1ccc(-c2ccc(-c3cc4ccccc4c(-c4ccccc4)c3-c3ccccc3)cc2)cc1] | 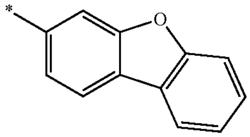 [SMILES: *c1ccc2c(c1)oc1ccccc12] | 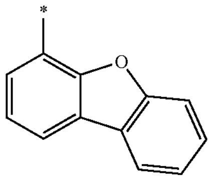 |

-continued
| [Compound Group 1] | | | | |
|---|---|---|---|---|
| | n | A—L—* | $Ar_1$ | $Ar_2$ |
| 1-D1-86 | 1 | 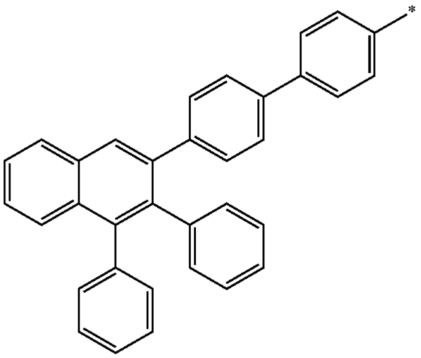 [SMILES: *c1ccc(-c2ccc(-c3cc4ccccc4c(-c4ccccc4)c3-c3ccccc3)cc2)cc1] | 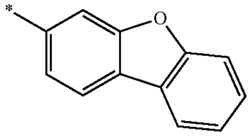 [SMILES: *c1ccc2c(c1)oc1ccccc12] | 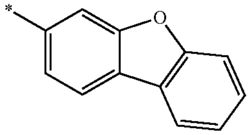 |
| 1-D1-87 | 1 | 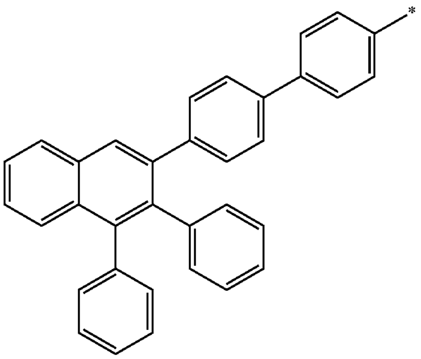 [SMILES: *c1ccc(-c2ccc(-c3cc4ccccc4c(-c4ccccc4)c3-c3ccccc3)cc2)cc1] | 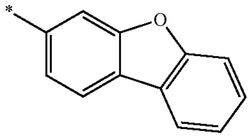 [SMILES: *c1ccc2c(c1)oc1ccccc12] | 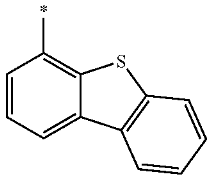 |
| 1-D1-88 | 1 | 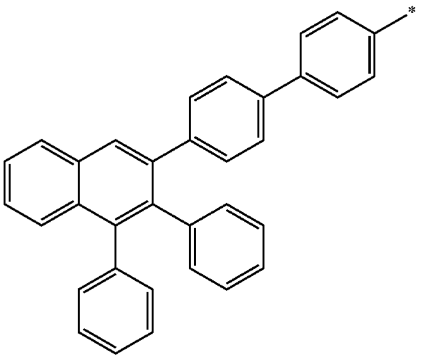 [SMILES: *c1ccc(-c2ccc(-c3cc4ccccc4c(-c4ccccc4)c3-c3ccccc3)cc2)cc1] | 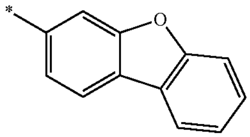 [SMILES: *c1ccc2c(c1)oc1ccccc12] | 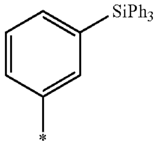 |
| 1-D1-89 | 1 | 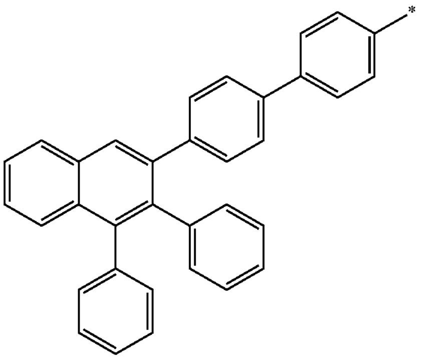 [SMILES: *c1ccc(-c2ccc(-c3cc4ccccc4c(-c4ccccc4)c3-c3ccccc3)cc2)cc1] | 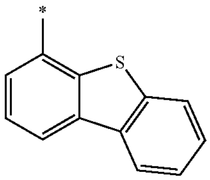 | 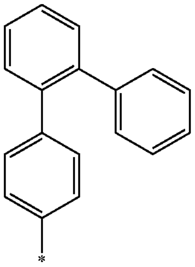 |

-continued
[Compound Group 1]
| | n | A—L—* | $Ar_1$ | $Ar_2$ |
|---|---|---|---|---|
| 1-D1-90 | 1 | 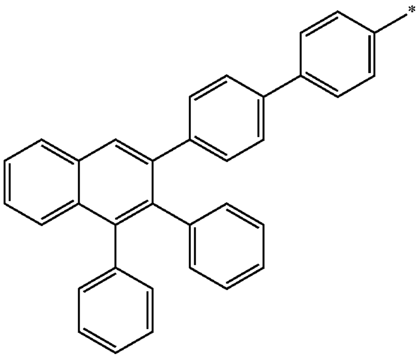 [SMILES: *c1ccc(-c2ccc(-c3cc4ccccc4c(-c4ccccc4)c3-c3ccccc3)cc2)cc1] | 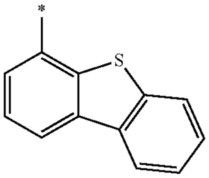 | 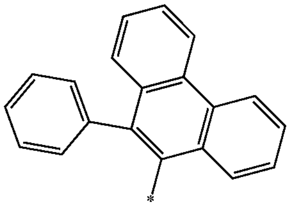 |
| 1-D1-91 | 1 | 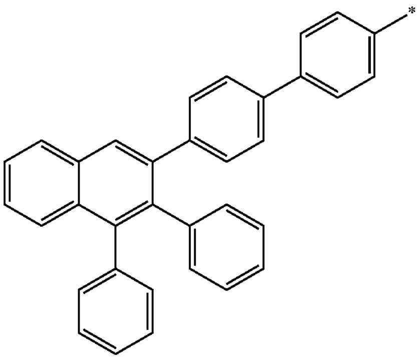 [SMILES: *c1ccc(-c2ccc(-c3cc4ccccc4c(-c4ccccc4)c3-c3ccccc3)cc2)cc1] | 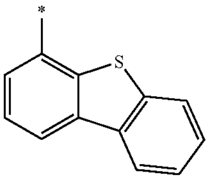 | 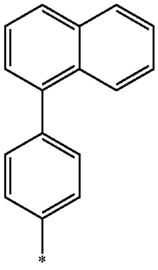 |
| 1-D1-92 | 1 | 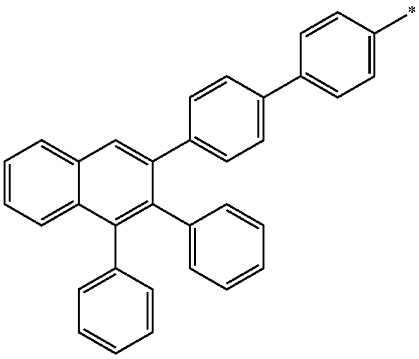 [SMILES: *c1ccc(-c2ccc(-c3cc4ccccc4c(-c4ccccc4)c3-c3ccccc3)cc2)cc1] | 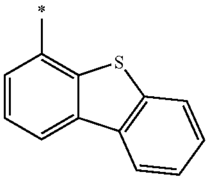 | 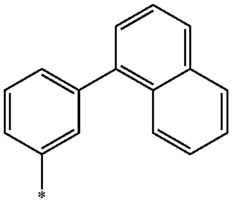 |
| 1-D1-93 | 1 | 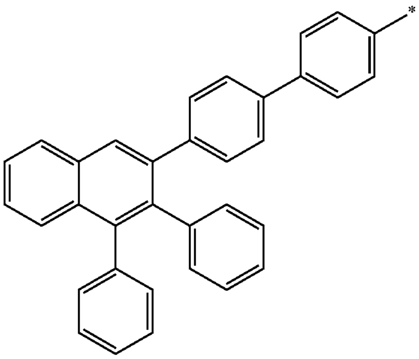 [SMILES: *c1ccc(-c2ccc(-c3cc4ccccc4c(-c4ccccc4)c3-c3ccccc3)cc2)cc1] | 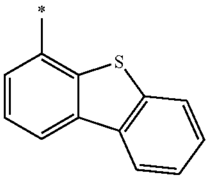 | 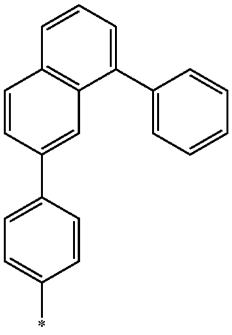 |

-continued
[Compound Group 1]
| | n | A—L—* | $Ar_1$ | $Ar_2$ |
|---|---|---|---|---|
| 1-D1-94 | 1 | 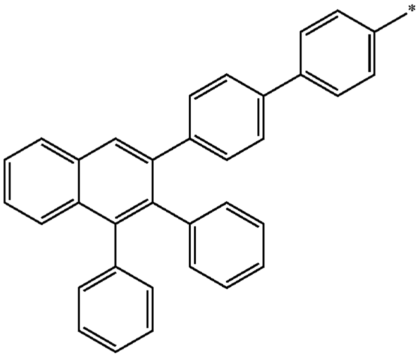 [SMILES: *c1ccc(-c2ccc(-c3cc4ccccc4c(-c4ccccc4)c3-c3ccccc3)cc2)cc1] | 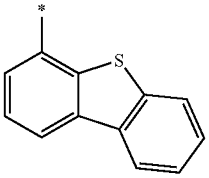 | 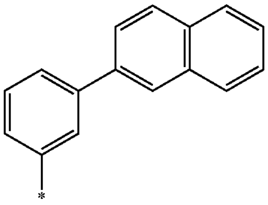 |
| 1-D1-95 | 1 | 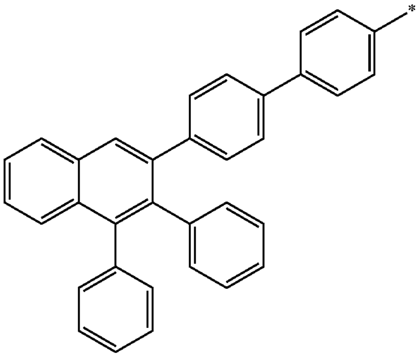 [SMILES: *c1ccc(-c2ccc(-c3cc4ccccc4c(-c4ccccc4)c3-c3ccccc3)cc2)cc1] | 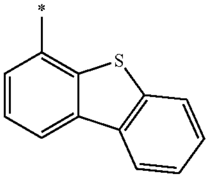 | 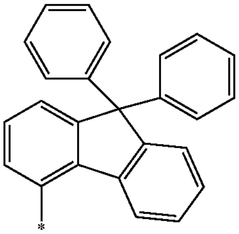 |
| 1-D1-96 | 1 | 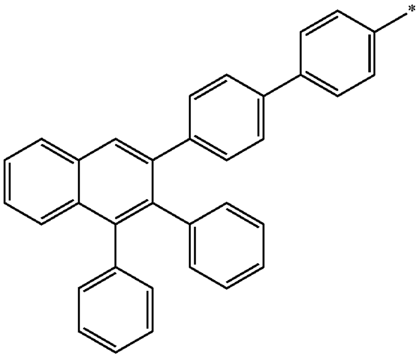 [SMILES: *c1ccc(-c2ccc(-c3cc4ccccc4c(-c4ccccc4)c3-c3ccccc3)cc2)cc1] | 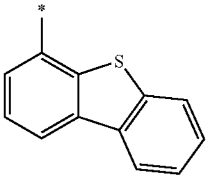 | 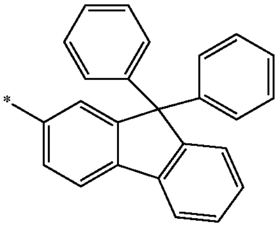 |
| 1-D1-97 | 1 | 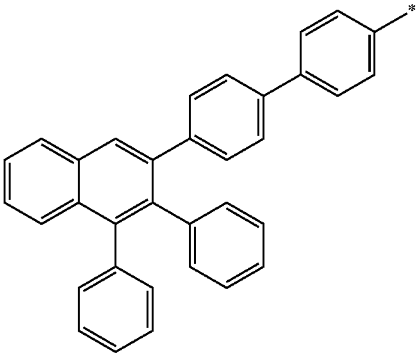 [SMILES: *c1ccc(-c2ccc(-c3cc4ccccc4c(-c4ccccc4)c3-c3ccccc3)cc2)cc1] | 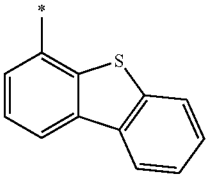 | 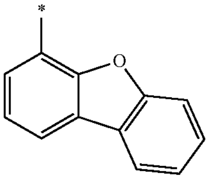 |

-continued
[Compound Group 1]
| | n | A—L—* | $Ar_1$ | $Ar_2$ |
|---|---|---|---|---|
| 1-D1-98 | 1 | 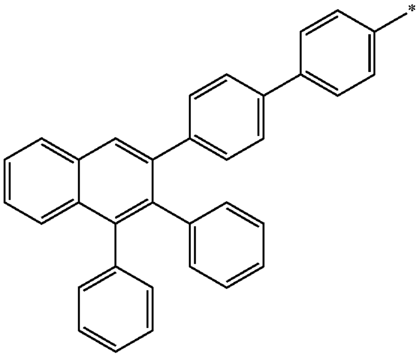 [SMILES: *c1ccc(-c2ccc(-c3cc4ccccc4c(-c4ccccc4)c3-c3ccccc3)cc2)cc1] | 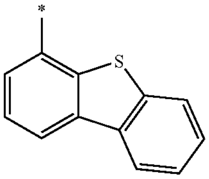 | 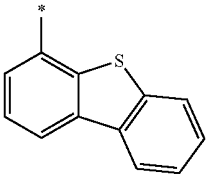 |
| 1-D1-99 | 1 | 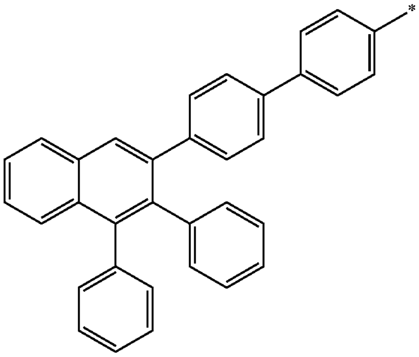 [SMILES: *c1ccc(-c2ccc(-c3cc4ccccc4c(-c4ccccc4)c3-c3ccccc3)cc2)cc1] | 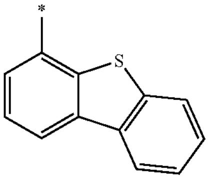 | 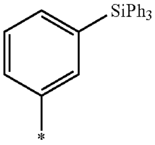 |
| 2-D1-1 | 1 | 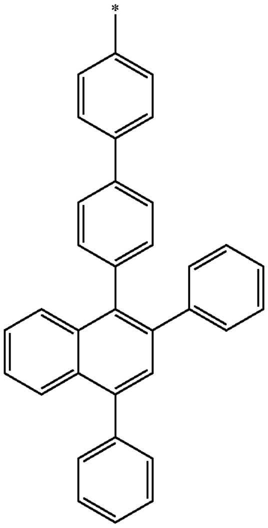 [SMILES: *c1ccc(-c2ccc(-c3c(-c4ccccc4)cc(-c4ccccc4)c4ccccc34)cc2)cc1] | 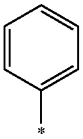 | 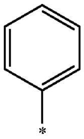 |

-continued
| [Compound Group 1] | | | | |
|---|---|---|---|---|
| | n | A—L—* | $Ar_1$ | $Ar_2$ |
| 2-D1-2 | 1 | 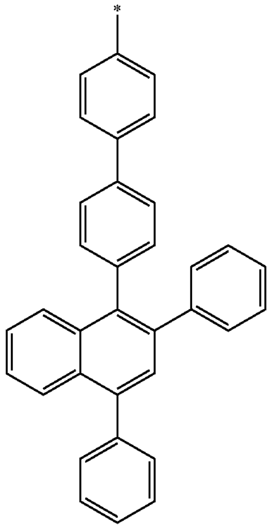 [SMILES: *c1ccc(-c2ccc(-c3c(-c4ccccc4)cc(-c4ccccc4)c4ccccc34)cc2)cc1] | 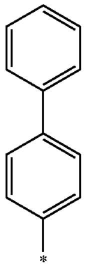 [SMILES: *c1ccc(-c2ccccc2)cc1] | 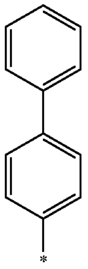 [SMILES: *c1ccc(-c2ccccc2)cc1] |
| 2-D1-3 | 1 | 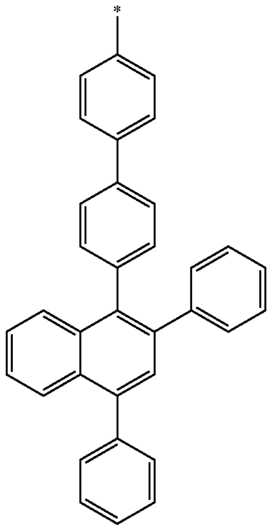 [SMILES: *c1ccc(-c2ccc(-c3c(-c4ccccc4)cc(-c4ccccc4)c4ccccc34)cc2)cc1] | 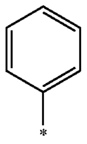 | 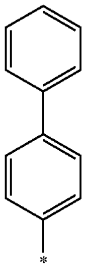 [SMILES: *c1ccc(-c2ccccc2)cc1] |

-continued
| | | | | |
|---|---|---|---|---|
| [Compound Group 1] | | | | |
| | n | A—L—* | $Ar_1$ | $Ar_2$ |
| 2-D1-4 | 1 | 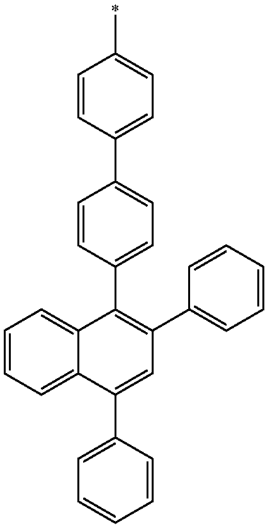 [SMILES: *c1ccc(-c2ccc(-c3c(-c4ccccc4)cc(-c4ccccc4)c4ccccc34)cc2)cc1] | 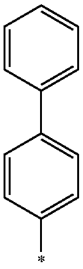 [SMILES: *c1ccc(-c2ccccc2)cc1] | 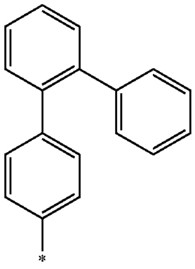 [SMILES: *c1ccc(-c2ccccc2-c2ccccc2)cc1] |
| 2-D1-5 | 1 | 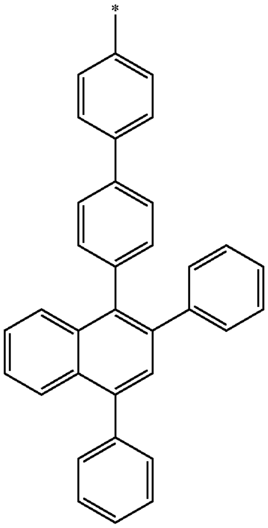 [SMILES: *c1ccc(-c2ccc(-c3c(-c4ccccc4)cc(-c4ccccc4)c4ccccc34)cc2)cc1] | 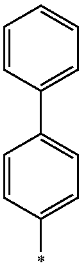 | 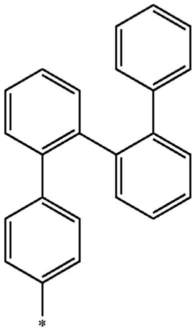 [SMILES: *c1ccc(-c2ccccc2-c2ccccc2-c2ccccc2)cc1] |

-continued
[Compound Group 1]
| | n | A—L—* | $Ar_1$ | $Ar_2$ |
|---|---|---|---|---|
| 2-D1-6 | 1 | 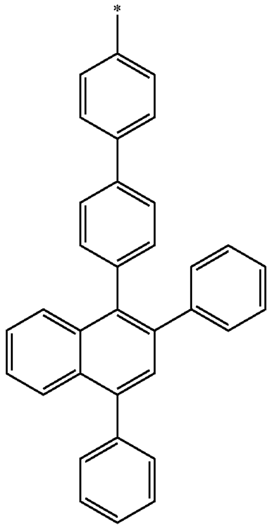 [SMILES: *c1ccc(-c2ccc(-c3c(-c4ccccc4)cc(-c4ccccc4)c4ccccc34)cc2)cc1] | 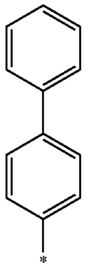 [SMILES: *c1ccc(-c2ccccc2)cc1] | 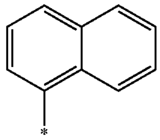 |
| 2-D1-7 | 1 | 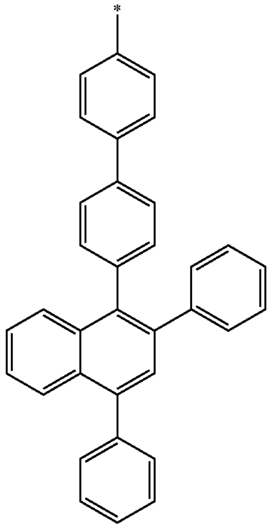 [SMILES: *c1ccc(-c2ccc(-c3c(-c4ccccc4)cc(-c4ccccc4)c4ccccc34)cc2)cc1] | 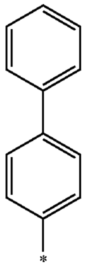 | 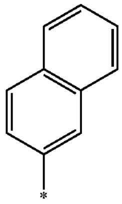 |

-continued
| [Compound Group 1] | | | | |
|---|---|---|---|---|
| | n | A—L—* | $Ar_1$ | $Ar_2$ |
| 2-D1-8 | 1 | 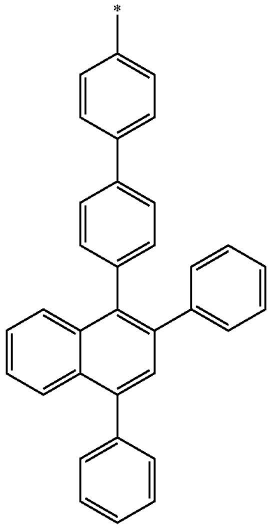 [SMILES: *c1ccc(-c2ccc(-c3c(-c4ccccc4)cc(-c4ccccc4)c4ccccc34)cc2)cc1] | 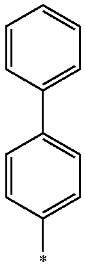 [SMILES: *c1ccc(-c2ccccc2)cc1] | 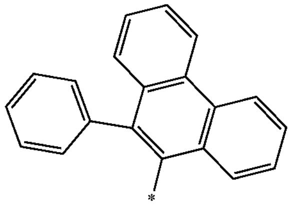 [SMILES: *c1c(-c2ccccc2)c2ccccc2c2ccccc12] |
| 2-D1-9 | 1 | 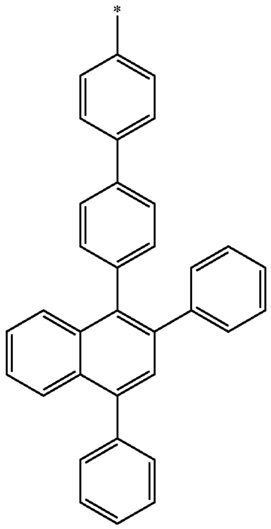 [SMILES: *c1ccc(-c2ccc(-c3c(-c4ccccc4)cc(-c4ccccc4)c4ccccc34)cc2)cc1] | 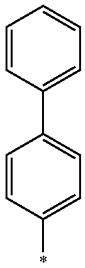 | 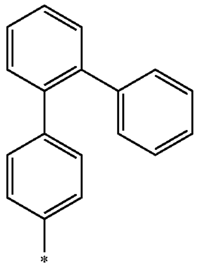 [SMILES: *c1ccc(-c2ccccc2-c2ccccc2)cc1] |

-continued
| [Compound Group 1] | | | | |
|---|---|---|---|---|
| | n | A—L—* | $Ar_1$ | $Ar_2$ |
| 2-D1-10 | 1 | 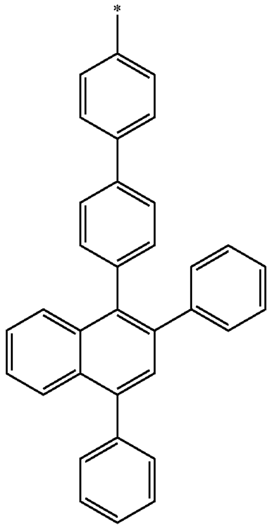 [SMILES: *c1ccc(-c2ccc(-c3c(-c4ccccc4)cc(-c4ccccc4)c4ccccc34)cc2)cc1] | 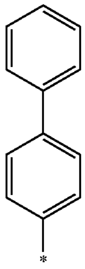 [SMILES: *c1ccc(-c2ccccc2)cc1] | 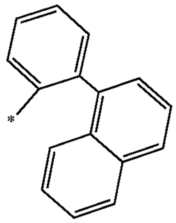 [SMILES: *c1ccccc1-c1cccc2ccccc12] |
| 2-D1-11 | 1 | 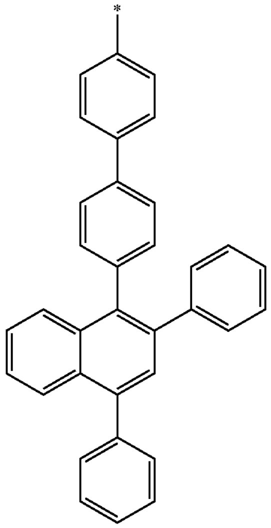 [SMILES: *c1ccc(-c2ccc(-c3c(-c4ccccc4)cc(-c4ccccc4)c4ccccc34)cc2)cc1] | 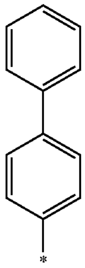 | 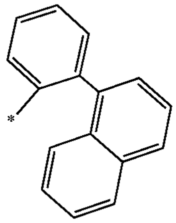 [SMILES: *c1ccccc1-c1cccc2ccccc12] |

-continued
[Compound Group 1]
| | n | A—L—* | $Ar_1$ | $Ar_2$ |
|---|---|---|---|---|
| 2-D1-12 | 1 | 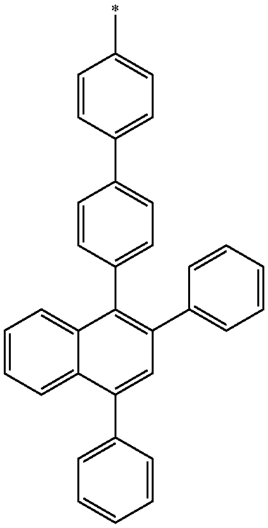 [SMILES: *c1ccc(-c2ccc(-c3c(-c4ccccc4)cc(-c4ccccc4)c4ccccc34)cc2)cc1] | 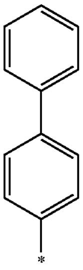 [SMILES: *c1ccc(-c2ccccc2)cc1] | 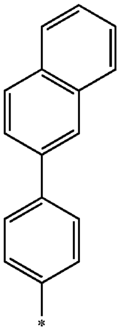 |
| 2-D1-13 | 1 | 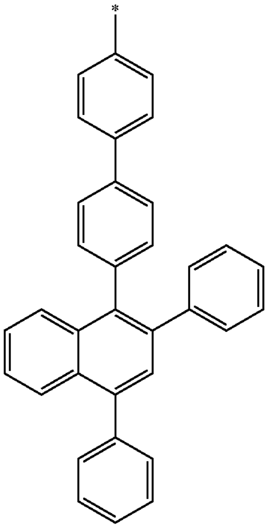 [SMILES: *c1ccc(-c2ccc(-c3c(-c4ccccc4)cc(-c4ccccc4)c4ccccc34)cc2)cc1] | 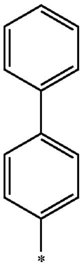 | 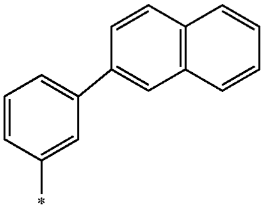 [SMILES: *c1cccc(-c2ccc3ccccc3c2)c1] |

-continued
| [Compound Group 1] | | | | |
|---|---|---|---|---|
| | n | A—L—* | $Ar_1$ | $Ar_2$ |
| 2-D1-14 | 1 | 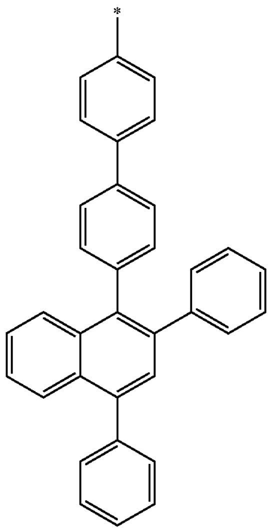 [SMILES: *c1ccc(-c2ccc(-c3c(-c4ccccc4)cc(-c4ccccc4)c4ccccc34)cc2)cc1] | 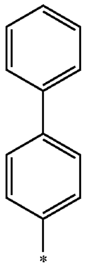 [SMILES: *c1ccc(-c2ccccc2)cc1] | 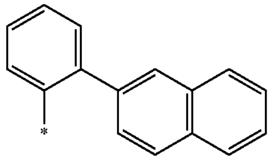 [SMILES: *c1ccccc1-c1ccc2ccccc2c1] |
| 2-D1-15 | 1 | 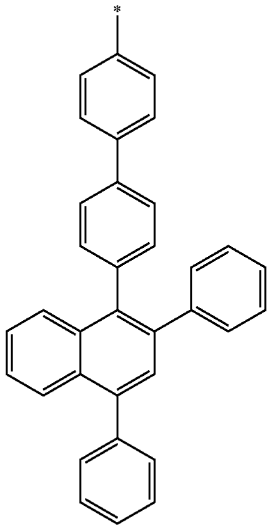 [SMILES: *c1ccc(-c2ccc(-c3c(-c4ccccc4)cc(-c4ccccc4)c4ccccc34)cc2)cc1] | 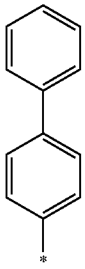 [SMILES: *c1ccc(-c2ccccc2)cc1] | 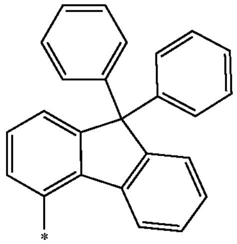 [SMILES: *c1cccc2c1-c1ccccc1C2(c1ccccc1)c1ccccc1] |

-continued
| | n | A—L—* | $Ar_1$ | $Ar_2$ |
|---|---|---|---|---|
| [Compound Group 1] | | | | |
| 2-D1-16 | 1 | 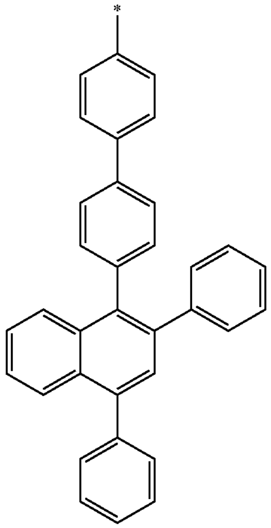 [SMILES: *c1ccc(-c2ccc(-c3c(-c4ccccc4)cc(-c4ccccc4)c4ccccc34)cc2)cc1] | 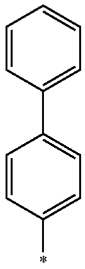 [SMILES: *c1ccc(-c2ccccc2)cc1] | 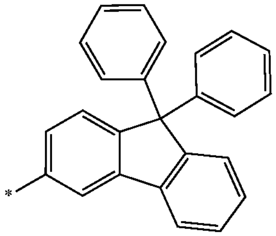 [SMILES: *c1ccc2c(c1)-c1ccccc1C2(c1ccccc1)c1ccccc1] |
| 2-D1-17 | 1 | 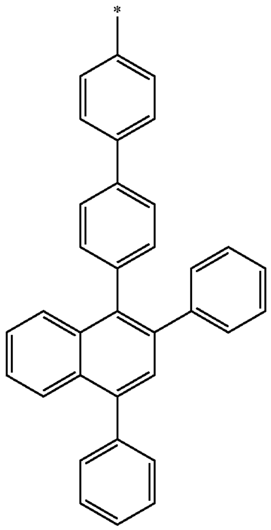 [SMILES: *c1ccc(-c2ccc(-c3c(-c4ccccc4)cc(-c4ccccc4)c4ccccc34)cc2)cc1] | 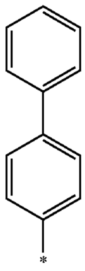 [SMILES: *c1ccc(-c2ccccc2)cc1] | 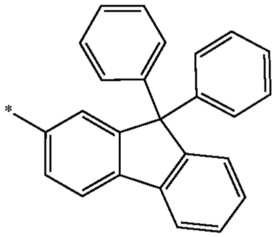 [SMILES: *c1ccc2c(c1)C(c1ccccc1)(c1ccccc1)c1ccccc1-2] |

-continued
| | n | A—L—* | $Ar_1$ | $Ar_2$ |
|---|---|---|---|---|
| | | [Compound Group 1] | | |
| 2-D1-18 | 1 | 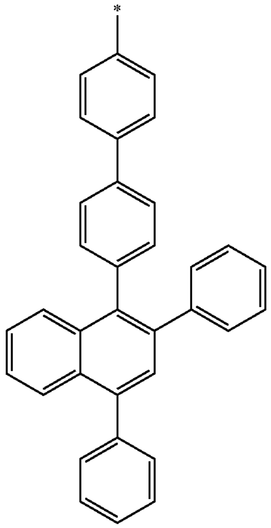 [SMILES: *c1ccc(-c2ccc(-c3c(-c4ccccc4)cc(-c4ccccc4)c4ccccc34)cc2)cc1] | 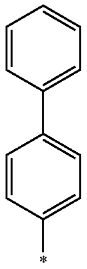 [SMILES: *c1ccc(-c2ccccc2)cc1] | 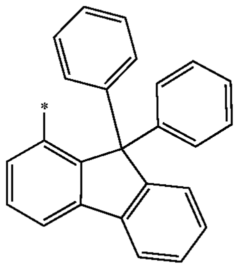 [SMILES: *c1cccc2c1C(c1ccccc1)(c1ccccc1)c1ccccc1-2] |
| 2-D1-19 | 1 | 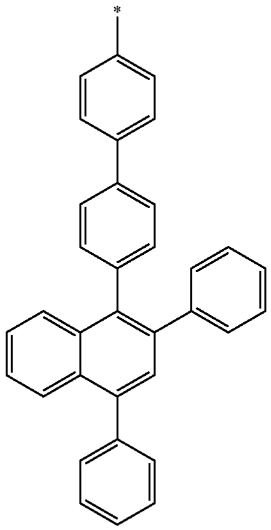 [SMILES: *c1ccc(-c2ccc(-c3c(-c4ccccc4)cc(-c4ccccc4)c4ccccc34)cc2)cc1] | 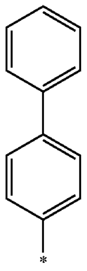 [SMILES: *c1ccc(-c2ccccc2)cc1] | 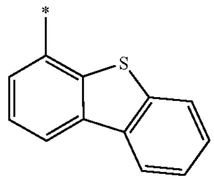 [SMILES: *c1cccc2c1sc1ccccc12] |

-continued
| [Compound Group 1] | | | | |
|---|---|---|---|---|
| | n | A—L—* | $Ar_1$ | $Ar_2$ |
| 2-D1-20 | 1 | 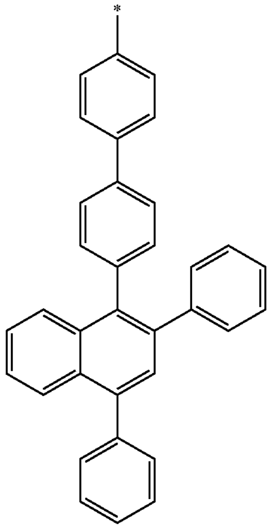 [SMILES: *c1ccc(-c2ccc(-c3c(-c4ccccc4)cc(-c4ccccc4)c4ccccc34)cc2)cc1] | 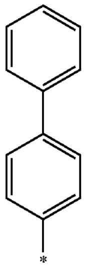 [SMILES: *c1ccc(-c2ccccc2)cc1] | 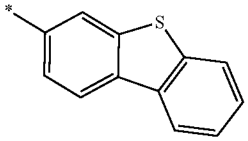 [SMILES: *c1ccc2c(c1)sc1ccccc12] |
| 2-D1-21 | 1 | 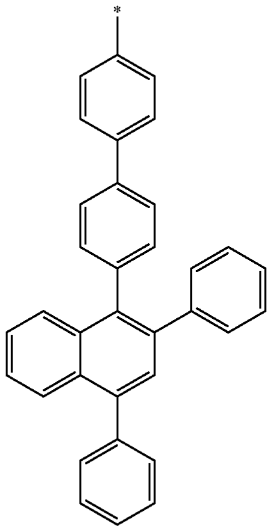 [SMILES: *c1ccc(-c2ccc(-c3c(-c4ccccc4)cc(-c4ccccc4)c4ccccc34)cc2)cc1] | 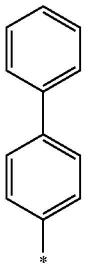 [SMILES: *c1ccc(-c2ccccc2)cc1] | 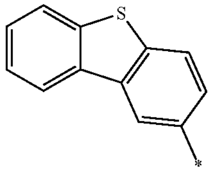 |

-continued
| [Compound Group 1] | | | | |
|---|---|---|---|---|
| | n | A—L—* | $Ar_1$ | $Ar_2$ |
| 2-D1-22 | 1 | 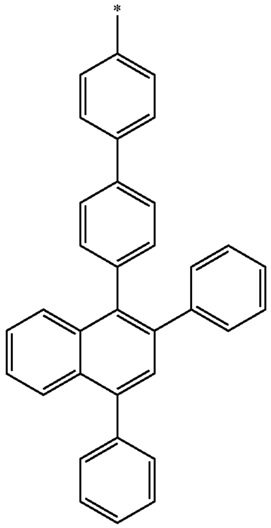 [SMILES: *c1ccc(-c2ccc(-c3c(-c4ccccc4)cc(-c4ccccc4)c4ccccc34)cc2)cc1] | 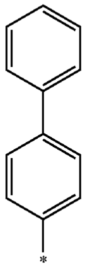 [SMILES: *c1ccc(-c2ccccc2)cc1] | 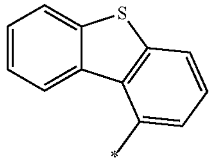 |
| 2-D1-23 | 1 | 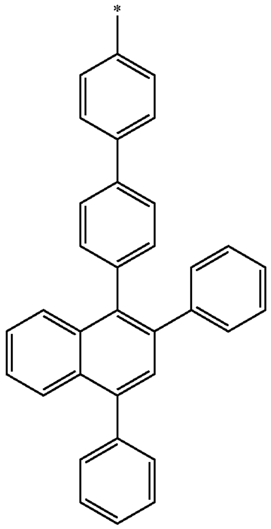 [SMILES: *c1ccc(-c2ccc(-c3c(-c4ccccc4)cc(-c4ccccc4)c4ccccc34)cc2)cc1] | 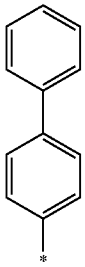 [SMILES: *c1ccc(-c2ccccc2)cc1] | 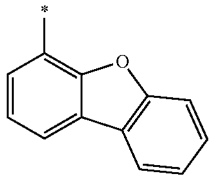 |

-continued
| | n | A—L—* | $Ar_1$ | $Ar_2$ |
|---|---|---|---|---|
| [Compound Group 1] | | | | |
| 2-D1-24 | 1 | 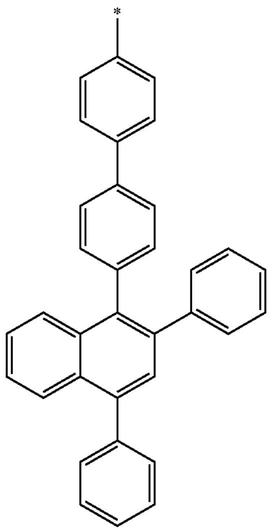 [SMILES: *c1ccc(-c2ccc(-c3c(-c4ccccc4)cc(-c4ccccc4)c4ccccc34)cc2)cc1] | 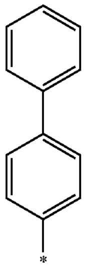 [SMILES: *c1ccc(-c2ccccc2)cc1] | 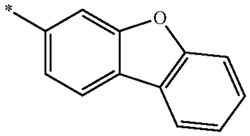 |
| 2-D1-25 | 1 | 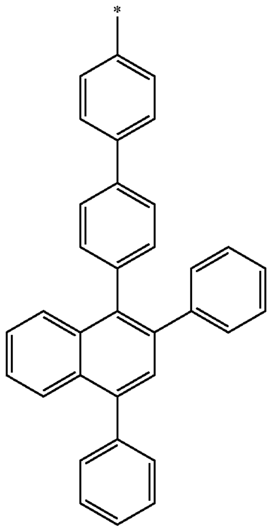 [SMILES: *c1ccc(-c2ccc(-c3c(-c4ccccc4)cc(-c4ccccc4)c4ccccc34)cc2)cc1] | 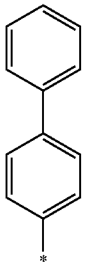 [SMILES: *c1ccc(-c2ccccc2)cc1] | 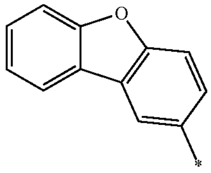 |

-continued
| [Compound Group 1] | | | | |
|---|---|---|---|---|
| | n | A—L—* | $Ar_1$ | $Ar_2$ |
| 2-D1-26 | 1 | 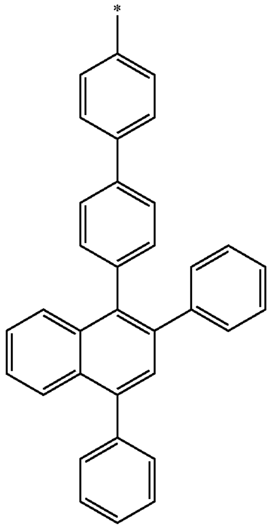 [SMILES: *c1ccc(-c2ccc(-c3c(-c4ccccc4)cc(-c4ccccc4)c4ccccc34)cc2)cc1] | 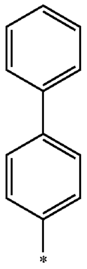 [SMILES: *c1ccc(-c2ccccc2)cc1] | 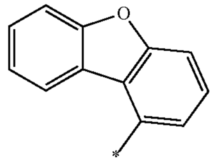 |
| 2-D1-27 | 1 | 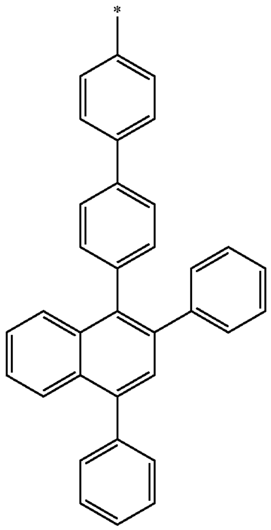 [SMILES: *c1ccc(-c2ccc(-c3c(-c4ccccc4)cc(-c4ccccc4)c4ccccc34)cc2)cc1] | 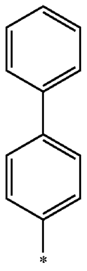 [SMILES: *c1ccc(-c2ccccc2)cc1] | 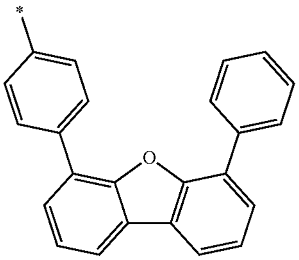 |

-continued
| [Compound Group 1] | | | | |
|---|---|---|---|---|
| | n | A—L—* | $Ar_1$ | $Ar_2$ |
| 2-D1-28 | 1 | 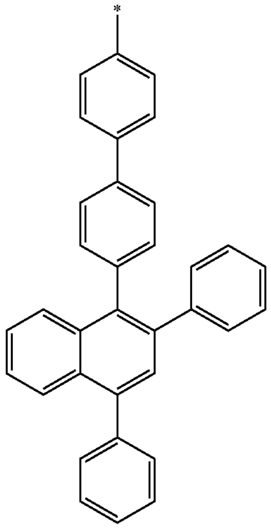 [SMILES: *c1ccc(-c2ccc(-c3c(-c4ccccc4)cc(-c4ccccc4)c4ccccc34)cc2)cc1] | 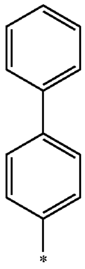 [SMILES: *c1ccc(-c2ccccc2)cc1] | 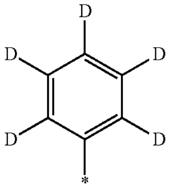 |
| 2-D1-29 | 1 | 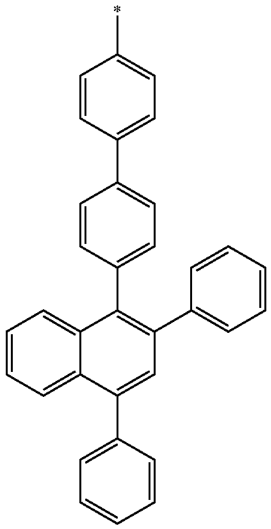 [SMILES: *c1ccc(-c2ccc(-c3c(-c4ccccc4)cc(-c4ccccc4)c4ccccc34)cc2)cc1] | 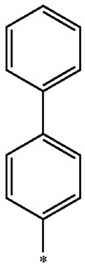 | 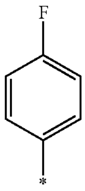 |

-continued
[Compound Group 1]
| | n | A—L—* | $Ar_1$ | $Ar_2$ |
|---|---|---|---|---|
| 2-D1-30 | 1 | 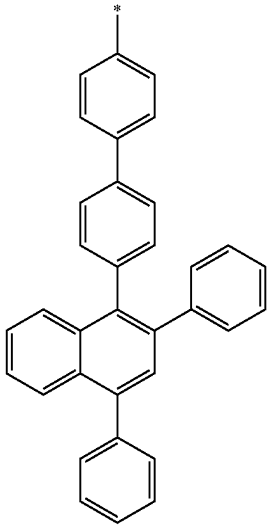 [SMILES: *c1ccc(-c2ccc(-c3c(-c4ccccc4)cc(-c4ccccc4)c4ccccc34)cc2)cc1] | 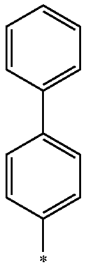 [SMILES: *c1ccc(-c2ccccc2)cc1] | 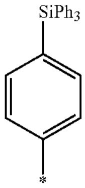 |
| 2-D1-31 | 1 | 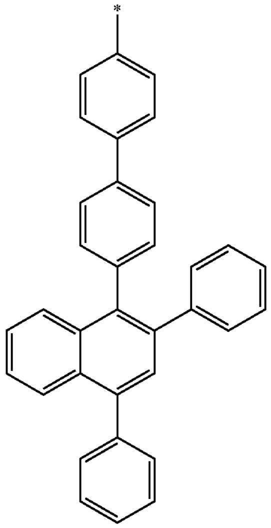 [SMILES: *c1ccc(-c2ccc(-c3c(-c4ccccc4)cc(-c4ccccc4)c4ccccc34)cc2)cc1] | 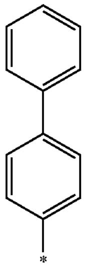 | 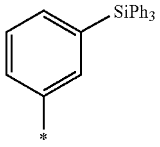 |

-continued
| [Compound Group 1] | | | | |
|---|---|---|---|---|
| | n | A—L—* | $Ar_1$ | $Ar_2$ |
| 2-D1-32 | 1 | 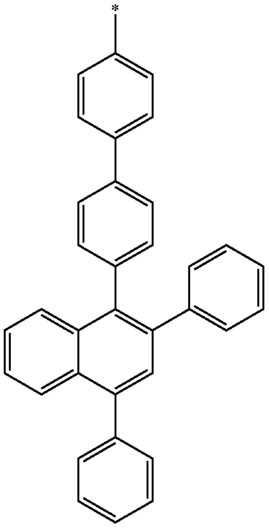 [SMILES: *c1ccc(-c2ccc(-c3c(-c4ccccc4)cc(-c4ccccc4)c4ccccc34)cc2)cc1] | 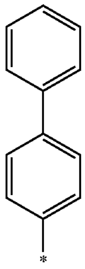 [SMILES: *c1ccc(-c2ccccc2)cc1] | 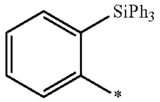 |
| 2-D1-33 | 1 | 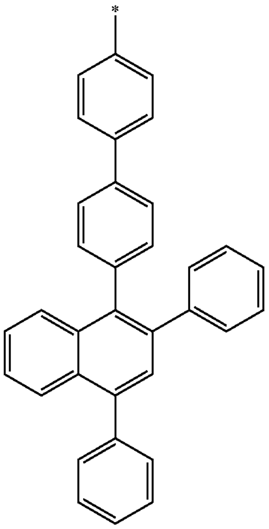 [SMILES: *c1ccc(-c2ccc(-c3c(-c4ccccc4)cc(-c4ccccc4)c4ccccc34)cc2)cc1] | 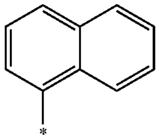 [SMILES: *c1cccc2ccccc12] | 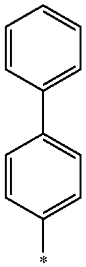 [SMILES: *c1ccc(-c2ccccc2)cc1] |

-continued
| [Compound Group 1] | | | | |
| --- | --- | --- | --- | --- |
| | n | A—L—* | $Ar_1$ | $Ar_2$ |
| 2-D1-34 | 1 | 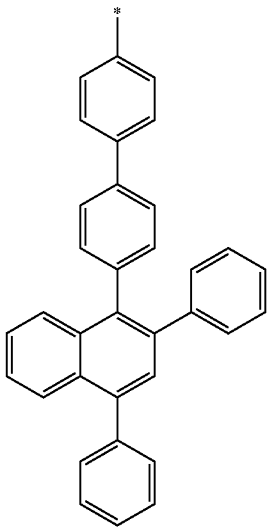 [SMILES: *c1ccc(-c2ccc(-c3c(-c4ccccc4)cc(-c4ccccc4)c4ccccc34)cc2)cc1] | 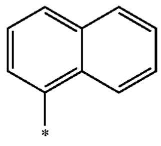 | 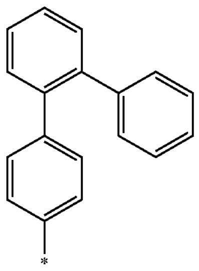 [SMILES: *c1ccc(-c2ccccc2-c2ccccc2)cc1] |
| 2-D1-35 | 1 | 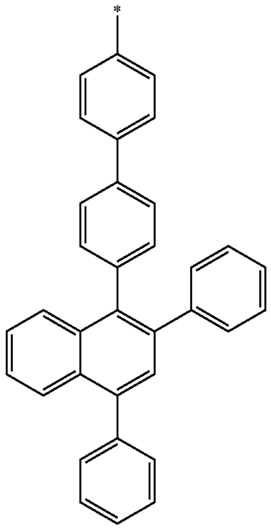 [SMILES: *c1ccc(-c2ccc(-c3c(-c4ccccc4)cc(-c4ccccc4)c4ccccc34)cc2)cc1] | 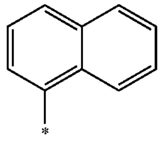 [SMILES: *c1cccc2ccccc12] | 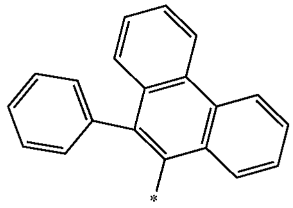 [SMILES: *c1c(-c2ccccc2)c2ccccc2c2ccccc12] |

-continued
[Compound Group 1]
| | n | A—L—* | $Ar_1$ | $Ar_2$ |
|---|---|---|---|---|
| 2-D1-36 | 1 | 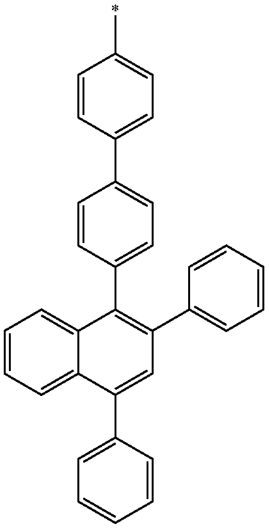 [SMILES: *c1ccc(-c2ccc(-c3c(-c4ccccc4)cc(-c4ccccc4)c4ccccc34)cc2)cc1] | 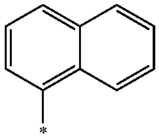 | 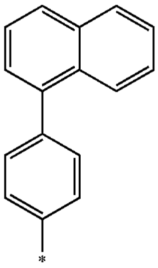 [SMILES: *c1ccc(-c2cccc3ccccc23)cc1] |
| 2-D1-37 | 1 | 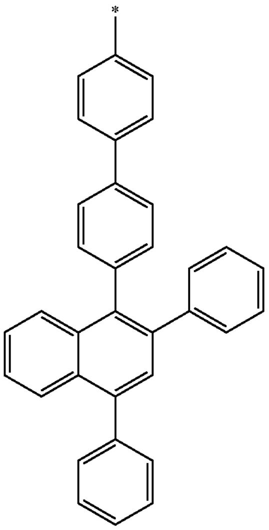 [SMILES: *c1ccc(-c2ccc(-c3c(-c4ccccc4)cc(-c4ccccc4)c4ccccc34)cc2)cc1] | 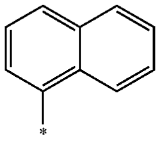 [SMILES: *c1cccc2ccccc12] | 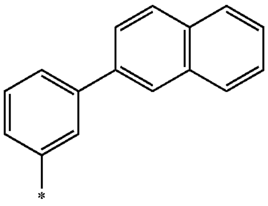 [SMILES: *c1cccc(-c2ccc3ccccc3c2)c1] |

-continued
| [Compound Group 1] | | | | |
|---|---|---|---|---|
| | n | A—L—* | $Ar_1$ | $Ar_2$ |
| 2-D1-38 | 1 | 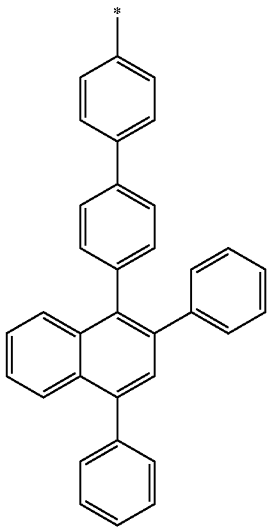 [SMILES: *c1ccc(-c2ccc(-c3c(-c4ccccc4)cc(-c4ccccc4)c4ccccc34)cc2)cc1] | 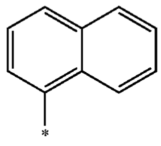 | 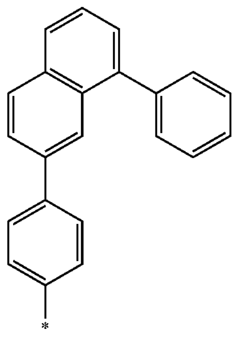 [SMILES: *c1ccc(-c2ccc3cccc(-c4ccccc4)c3c2)cc1] |
| 2-D1-39 | 1 | 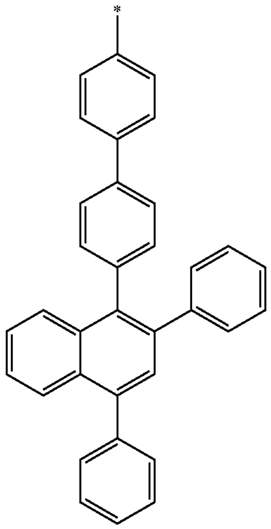 [SMILES: *c1ccc(-c2ccc(-c3c(-c4ccccc4)cc(-c4ccccc4)c4ccccc34)cc2)cc1] | 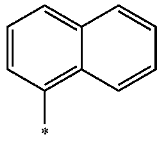 [SMILES: *c1cccc2ccccc12] | 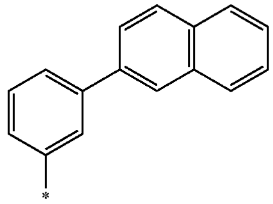 [SMILES: *c1cccc(-c2ccc3ccccc3c2)c1] |

-continued
| [Compound Group 1] | | | | |
|---|---|---|---|---|
| | n | A—L—* | $Ar_1$ | $Ar_2$ |
| 2-D1-40 | 1 | 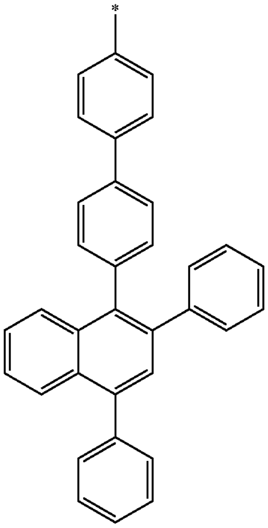 [SMILES: *c1ccc(-c2ccc(-c3c(-c4ccccc4)cc(-c4ccccc4)c4ccccc34)cc2)cc1] | 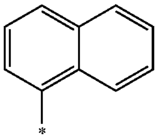 | 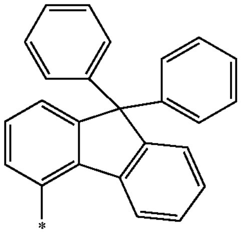 [SMILES: *c1cccc2c1-c1ccccc1C2(c1ccccc1)c1ccccc1] |
| 2-D1-41 | 1 | 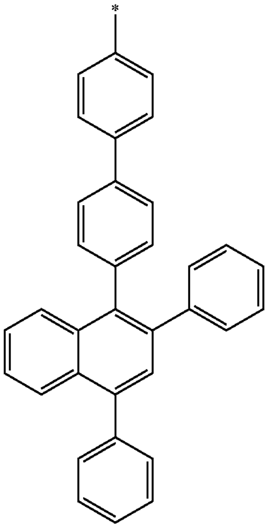 [SMILES: *c1ccc(-c2ccc(-c3c(-c4ccccc4)cc(-c4ccccc4)c4ccccc34)cc2)cc1] | 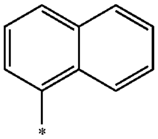 [SMILES: *c1cccc2ccccc12] | 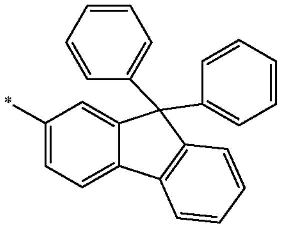 [SMILES: *c1ccc2c(c1)C(c1ccccc1)(c1ccccc1)c1ccccc1-2] |

-continued
[Compound Group 1]
| | n | A—L—* | $Ar_1$ | $Ar_2$ |
|---|---|---|---|---|
| 2-D1-42 | 1 | 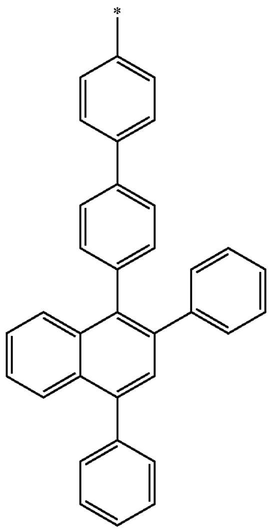 [SMILES: *c1ccc(-c2ccc(-c3c(-c4ccccc4)cc(-c4ccccc4)c4ccccc34)cc2)cc1] | 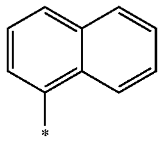 | 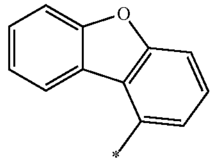 |
| 2-D1-43 | 1 | 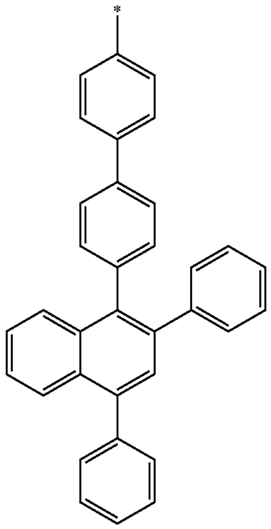 [SMILES: *c1ccc(-c2ccc(-c3c(-c4ccccc4)cc(-c4ccccc4)c4ccccc34)cc2)cc1] | 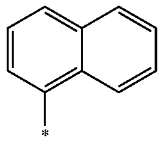 [SMILES: *c1cccc2ccccc12] | 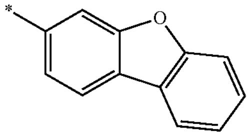 |

-continued
[Compound Group 1]
| | n | A—L—* | $Ar_1$ | $Ar_2$ |
|---|---|---|---|---|
| 2-D1-44 | 1 | 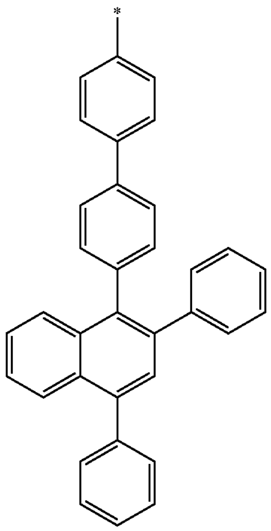 [SMILES: *c1ccc(-c2ccc(-c3c(-c4ccccc4)cc(-c4ccccc4)c4ccccc34)cc2)cc1] | 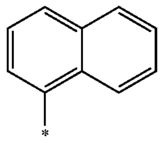 | 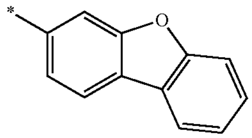 |
| 2-D1-45 | 1 | 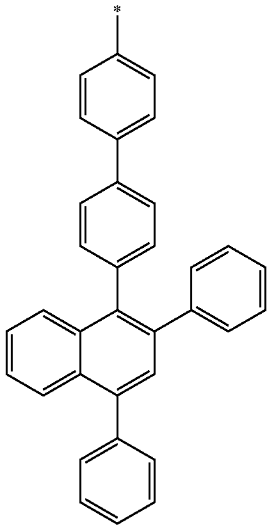 [SMILES: *c1ccc(-c2ccc(-c3c(-c4ccccc4)cc(-c4ccccc4)c4ccccc34)cc2)cc1] | 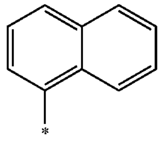 [SMILES: *c1cccc2ccccc12] | 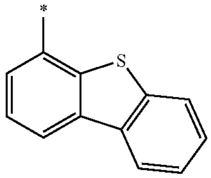 |

-continued
| [Compound Group 1] | | | | |
|---|---|---|---|---|
| | n | A—L—* | $Ar_1$ | $Ar_2$ |
| 2-D1-46 | 1 | 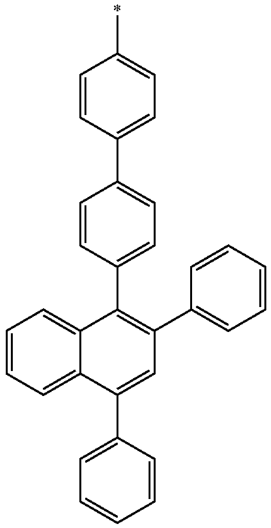 [SMILES: *c1ccc(-c2ccc(-c3c(-c4ccccc4)cc(-c4ccccc4)c4ccccc34)cc2)cc1] | 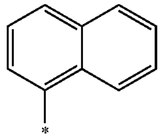 | 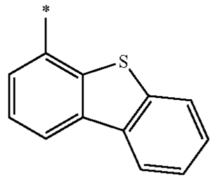 |
| 2-D1-47 | 1 | 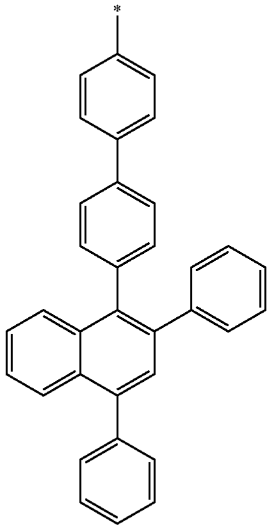 [SMILES: *c1ccc(-c2ccc(-c3c(-c4ccccc4)cc(-c4ccccc4)c4ccccc34)cc2)cc1] | 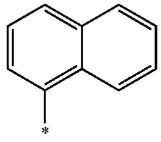 [SMILES: *c1cccc2ccccc12] | 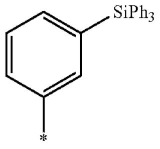 |

-continued
| [Compound Group 1] | | | | |
|---|---|---|---|---|
| | n | A—L—* | $Ar_1$ | $Ar_2$ |
| 2-D1-48 | 1 | 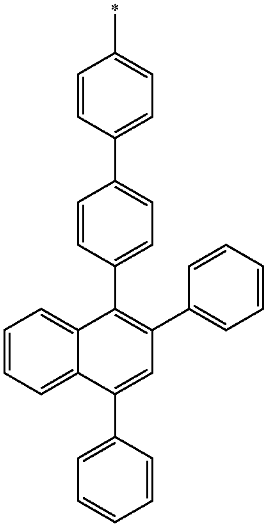 [SMILES: *c1ccc(-c2ccc(-c3c(-c4ccccc4)cc(-c4ccccc4)c4ccccc34)cc2)cc1] | 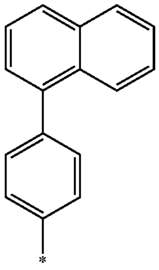 | 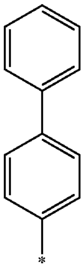 |
| 2-D1-49 | 1 | 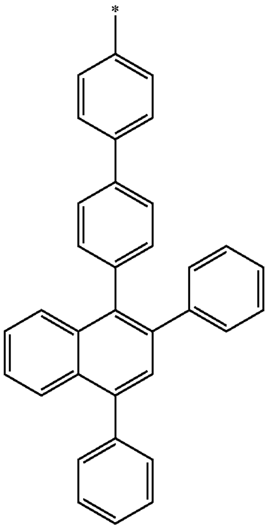 [SMILES: *c1ccc(-c2ccc(-c3c(-c4ccccc4)cc(-c4ccccc4)c4ccccc34)cc2)cc1] | 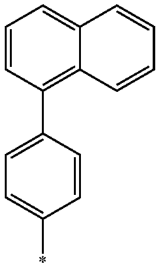 | 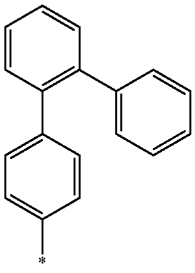 |

-continued
| [Compound Group 1] | | | | |
|---|---|---|---|---|
| | n | A—L—* | $Ar_1$ | $Ar_2$ |
| 2-D1-50 | 1 | 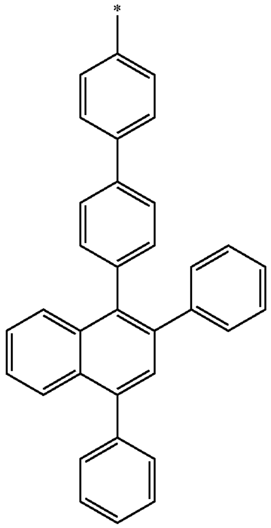 [SMILES: *c1ccc(-c2ccc(-c3c(-c4ccccc4)cc(-c4ccccc4)c4ccccc34)cc2)cc1] | 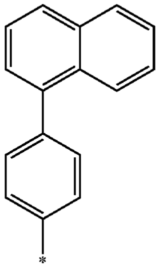 | 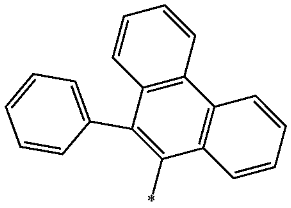 |
| 2-D1-51 | 1 | 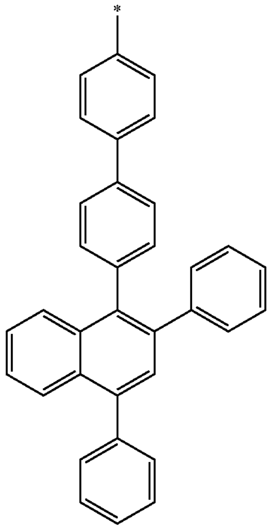 [SMILES: *c1ccc(-c2ccc(-c3c(-c4ccccc4)cc(-c4ccccc4)c4ccccc34)cc2)cc1] | 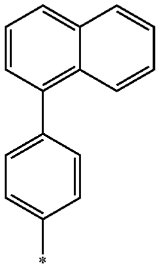 | 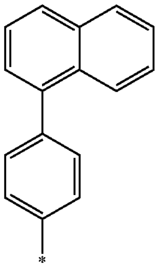 |

-continued
| [Compound Group 1] | | | | |
|---|---|---|---|---|
| | n | A—L—* | $Ar_1$ | $Ar_2$ |
| 2-D1-52 | 1 | 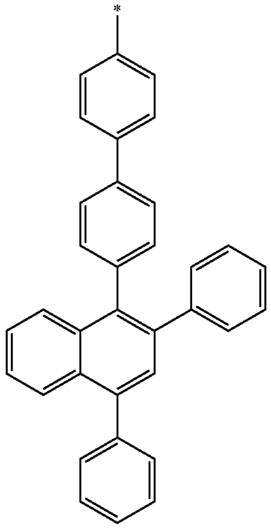 [SMILES: *c1ccc(-c2ccc(-c3c(-c4ccccc4)cc(-c4ccccc4)c4ccccc34)cc2)cc1] | 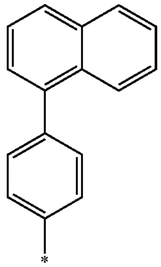 | 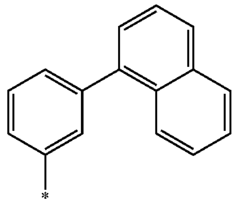 |
| 2-D1-53 | 1 | 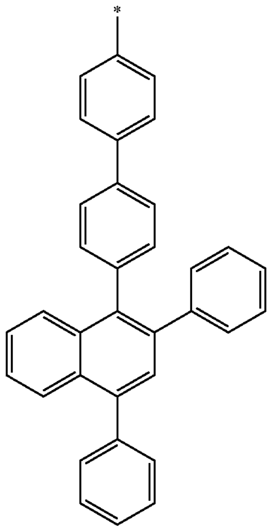 [SMILES: *c1ccc(-c2ccc(-c3c(-c4ccccc4)cc(-c4ccccc4)c4ccccc34)cc2)cc1] | 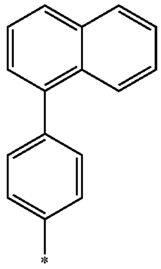 | 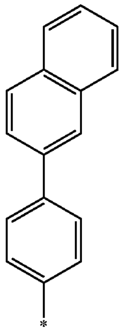 |

-continued
| [Compound Group 1] | | | | |
|---|---|---|---|---|
| | n | A—L—* | $Ar_1$ | $Ar_2$ |
| 2-D1-54 | 1 | 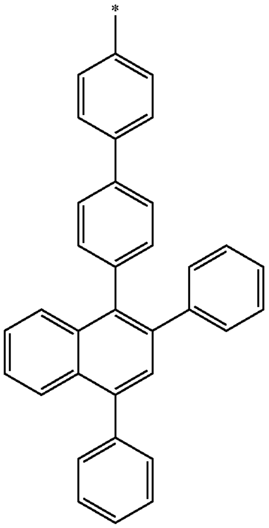 [SMILES: *c1ccc(-c2ccc(-c3c(-c4ccccc4)cc(-c4ccccc4)c4ccccc34)cc2)cc1] | 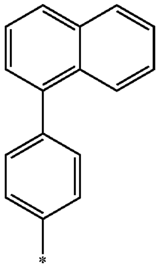 | 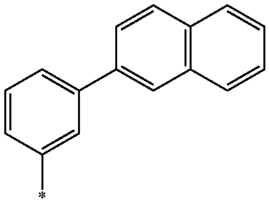 |
| 2-D1-55 | 1 | 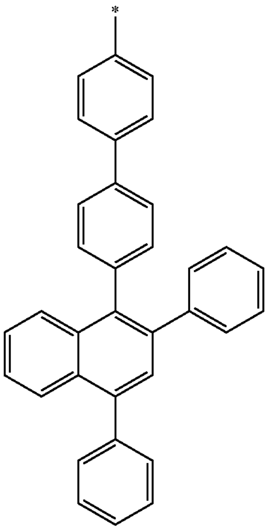 [SMILES: *c1ccc(-c2ccc(-c3c(-c4ccccc4)cc(-c4ccccc4)c4ccccc34)cc2)cc1] | 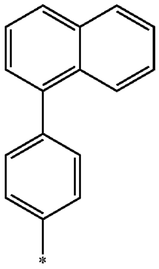 | 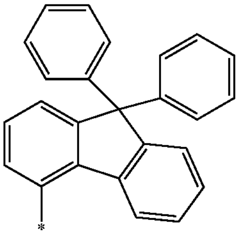 |

-continued
| [Compound Group 1] | | | | |
|---|---|---|---|---|
| | n | A—L—* | $Ar_1$ | $Ar_2$ |
| 2-D1-56 | 1 | 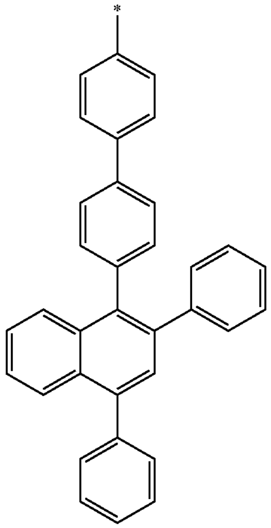 [SMILES: *c1ccc(-c2ccc(-c3c(-c4ccccc4)cc(-c4ccccc4)c4ccccc34)cc2)cc1] | 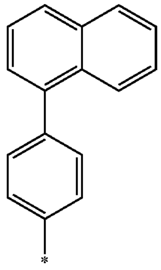 | 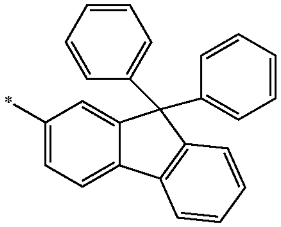 |
| 2-D1-57 | 1 | 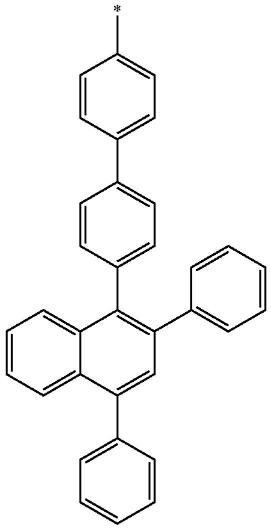 [SMILES: *c1ccc(-c2ccc(-c3c(-c4ccccc4)cc(-c4ccccc4)c4ccccc34)cc2)cc1] | 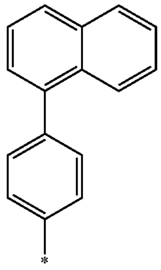 | 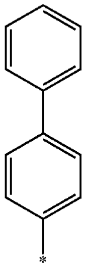 |

-continued
| [Compound Group 1] | | | | |
|---|---|---|---|---|
| | n | A—L—* | $Ar_1$ | $Ar_2$ |
| 2-D1-58 | 1 | 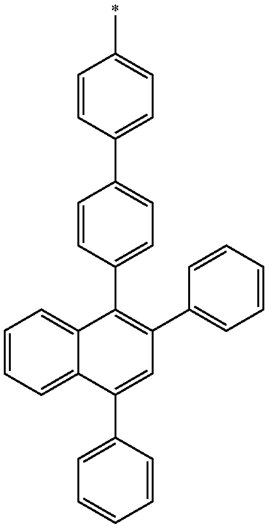 [SMILES: *c1ccc(-c2ccc(-c3c(-c4ccccc4)cc(-c4ccccc4)c4ccccc34)cc2)cc1] | 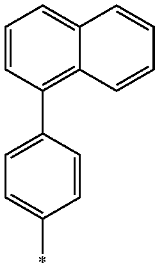 | 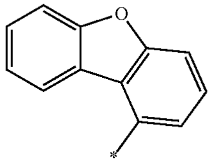 |
| 2-D1-59 | 1 | 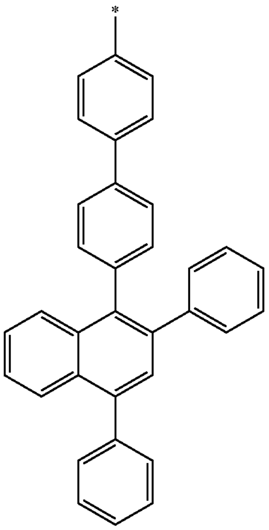 [SMILES: *c1ccc(-c2ccc(-c3c(-c4ccccc4)cc(-c4ccccc4)c4ccccc34)cc2)cc1] | 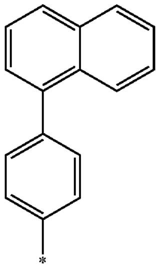 | 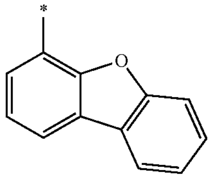 |

-continued
| | n | A—L—* | $Ar_1$ | $Ar_2$ |
|---|---|---|---|---|
| [Compound Group 1] | | | | |
| 2-D1-60 | 1 | 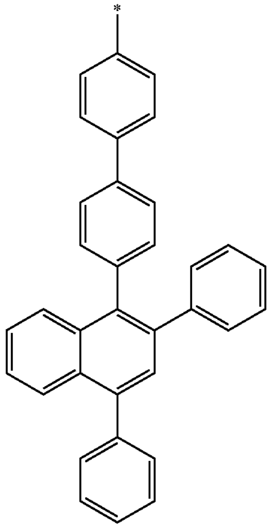 [SMILES: *c1ccc(-c2ccc(-c3c(-c4ccccc4)cc(-c4ccccc4)c4ccccc34)cc2)cc1] | 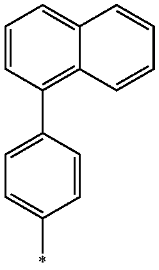 | 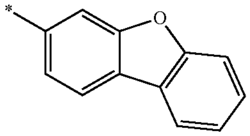 |
| 2-D1-61 | 1 | 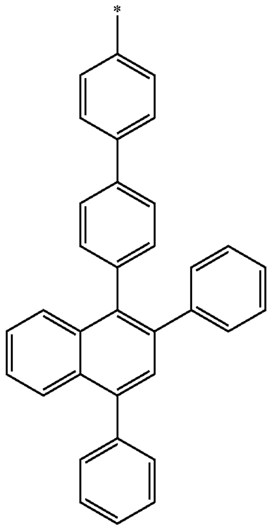 [SMILES: *c1ccc(-c2ccc(-c3c(-c4ccccc4)cc(-c4ccccc4)c4ccccc34)cc2)cc1] | 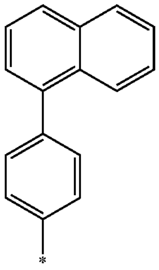 | 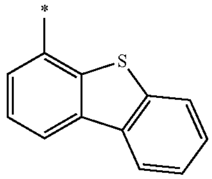 |

-continued
| [Compound Group 1] | n | A—L—* | $Ar_1$ | $Ar_2$ |
|---|---|---|---|---|
| 2-D1-62 | 1 | 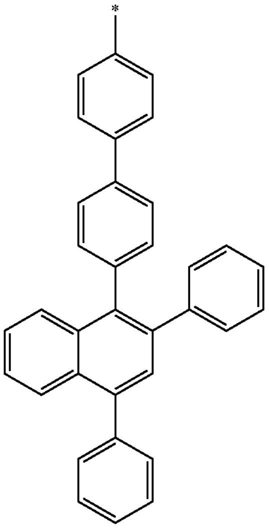 [SMILES: *c1ccc(-c2ccc(-c3c(-c4ccccc4)cc(-c4ccccc4)c4ccccc34)cc2)cc1] | 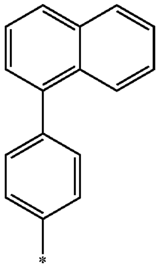 | 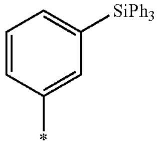 |
| 2-D1-63 | 1 | 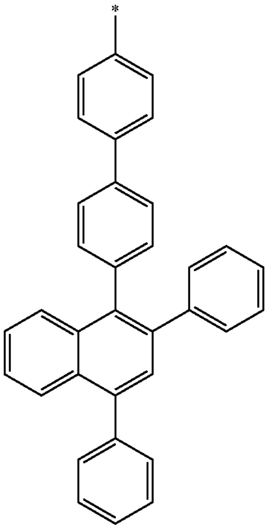 [SMILES: *c1ccc(-c2ccc(-c3c(-c4ccccc4)cc(-c4ccccc4)c4ccccc34)cc2)cc1] | 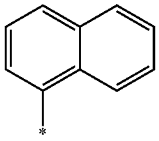 | 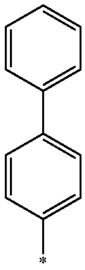 |

-continued
| [Compound Group 1] | | | | |
|---|---|---|---|---|
| | n | A—L—* | $Ar_1$ | $Ar_2$ |
| 2-D1-64 | 1 | 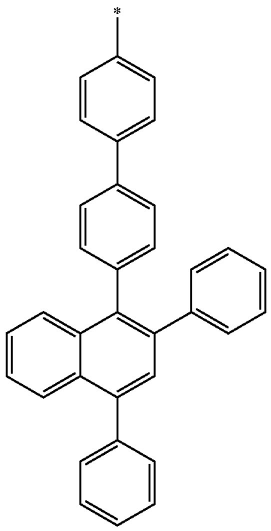 [SMILES: *c1ccc(-c2ccc(-c3c(-c4ccccc4)cc(-c4ccccc4)c4ccccc34)cc2)cc1] | 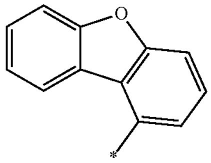 | 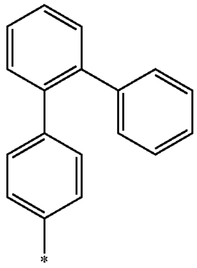 |
| 2-D1-65 | 1 | 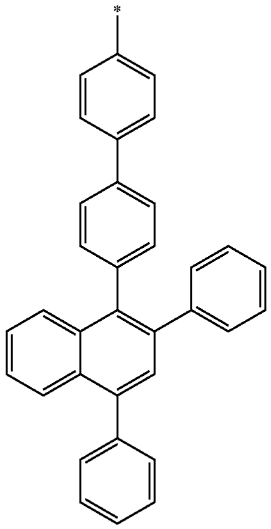 [SMILES: *c1ccc(-c2ccc(-c3c(-c4ccccc4)cc(-c4ccccc4)c4ccccc34)cc2)cc1] | 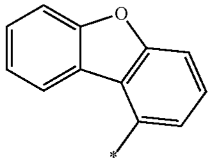 | 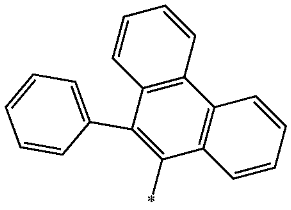 |

-continued
| [Compound Group 1] | | | | |
|---|---|---|---|---|
| | n | A—L—* | $Ar_1$ | $Ar_2$ |
| 2-D1-66 | 1 | 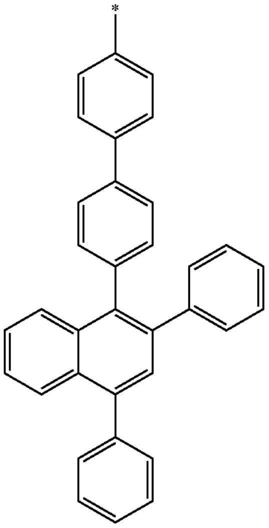 [SMILES: *c1ccc(-c2ccc(-c3c(-c4ccccc4)cc(-c4ccccc4)c4ccccc34)cc2)cc1] | 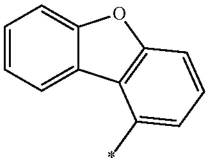 | 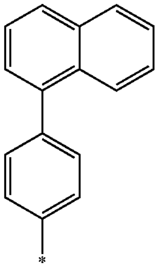 |
| 2-D1-67 | 1 | 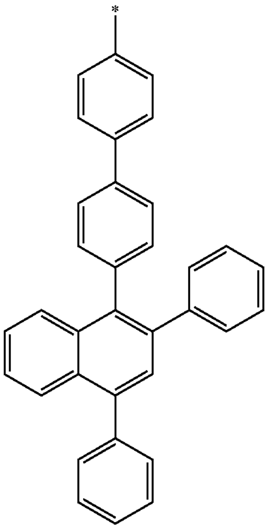 [SMILES: *c1ccc(-c2ccc(-c3c(-c4ccccc4)cc(-c4ccccc4)c4ccccc34)cc2)cc1] | 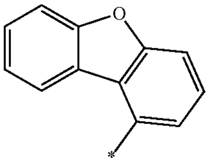 | 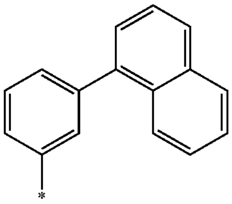 |

-continued
[Compound Group 1]
| | n | A—L—* | $Ar_1$ | $Ar_2$ |
|---|---|---|---|---|
| 2-D1-68 | 1 | 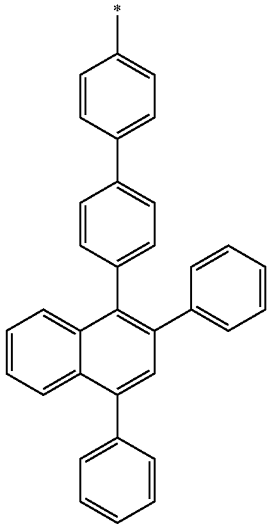 [SMILES: *c1ccc(-c2ccc(-c3c(-c4ccccc4)cc(-c4ccccc4)c4ccccc34)cc2)cc1] | 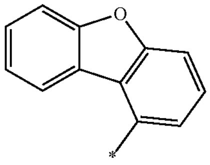 | 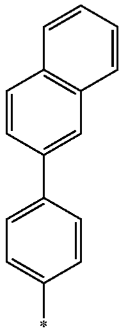 |
| 2-D1-69 | 1 | 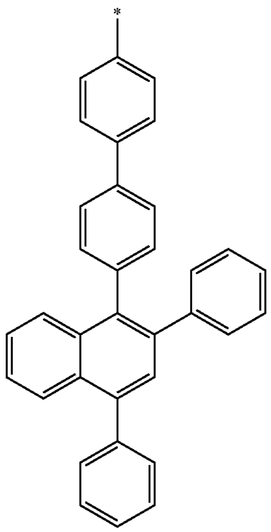 [SMILES: *c1ccc(-c2ccc(-c3c(-c4ccccc4)cc(-c4ccccc4)c4ccccc34)cc2)cc1] | 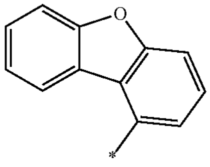 | 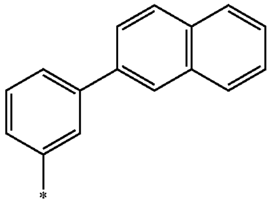 |

-continued
| [Compound Group 1] | | | | |
|---|---|---|---|---|
| | n | A—L—* | $Ar_1$ | $Ar_2$ |
| 2-D1-70 | 1 | 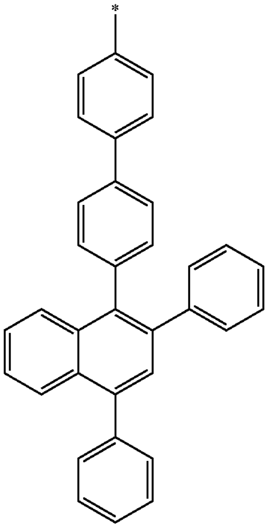 [SMILES: *c1ccc(-c2ccc(-c3c(-c4ccccc4)cc(-c4ccccc4)c4ccccc34)cc2)cc1] | 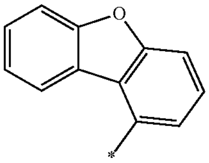 | 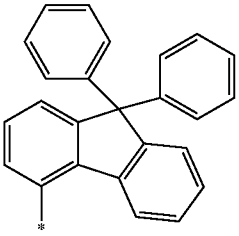 |
| 2-D1-71 | 1 | 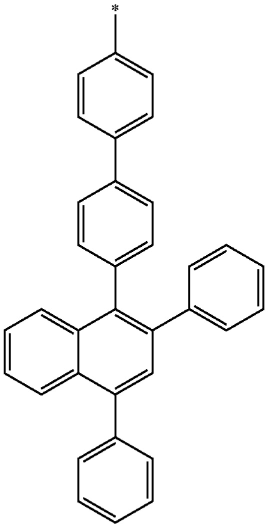 [SMILES: *c1ccc(-c2ccc(-c3c(-c4ccccc4)cc(-c4ccccc4)c4ccccc34)cc2)cc1] | 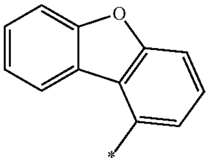 | 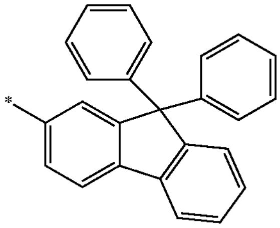 |

-continued
| [Compound Group 1] | | | | |
|---|---|---|---|---|
| | n | A—L—* | $Ar_1$ | $Ar_2$ |
| 2-D1-72 | 1 | 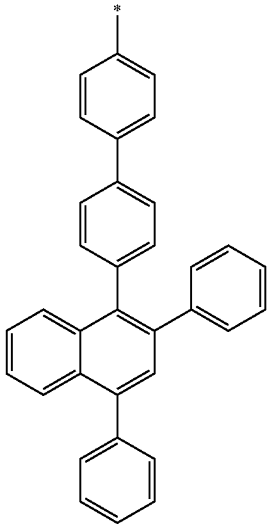 [SMILES: *c1ccc(-c2ccc(-c3c(-c4ccccc4)cc(-c4ccccc4)c4ccccc34)cc2)cc1] | 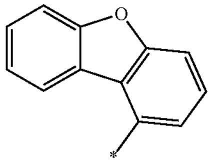 | 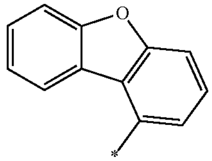 |
| 2-D1-73 | 1 | 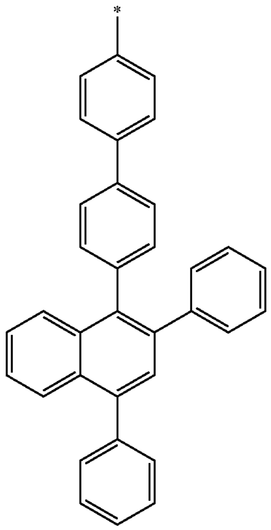 [SMILES: *c1ccc(-c2ccc(-c3c(-c4ccccc4)cc(-c4ccccc4)c4ccccc34)cc2)cc1] | 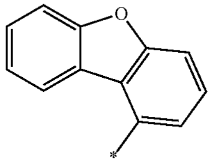 | 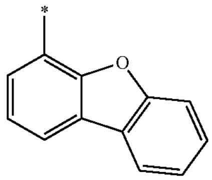 |

-continued
| [Compound Group 1] | | | | |
|---|---|---|---|---|
| | n | A—L—* | $Ar_1$ | $Ar_2$ |
| 2-D1-74 | 1 | 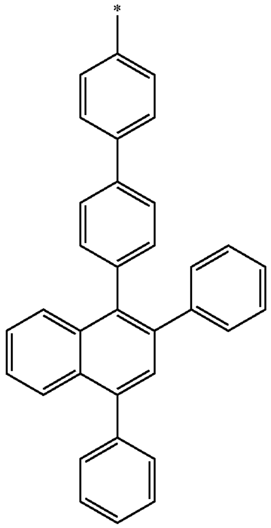 [SMILES: *c1ccc(-c2ccc(-c3c(-c4ccccc4)cc(-c4ccccc4)c4ccccc34)cc2)cc1] | 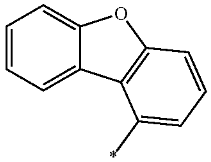 | 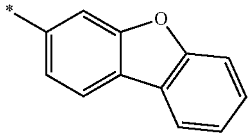 [SMILES: *c1ccc2c(c1)oc1ccccc12] |
| 2-D1-75 | 1 | 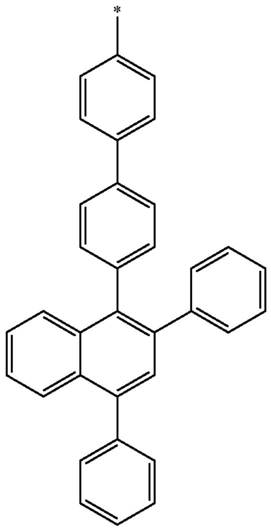 [SMILES: *c1ccc(-c2ccc(-c3c(-c4ccccc4)cc(-c4ccccc4)c4ccccc34)cc2)cc1] | 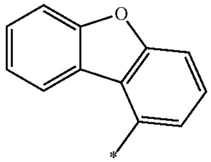 | 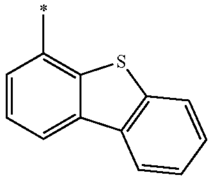 |

-continued
| [Compound Group 1] | | | | |
|---|---|---|---|---|
| | n | A—L—* | $Ar_1$ | $Ar_2$ |
| 2-D1-76 | 1 | 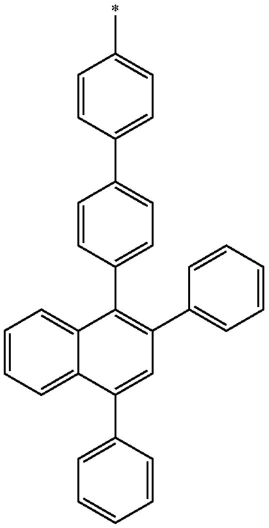 [SMILES: *c1ccc(-c2ccc(-c3c(-c4ccccc4)cc(-c4ccccc4)c4ccccc34)cc2)cc1] | 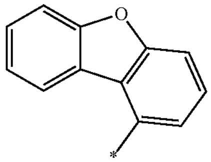 | 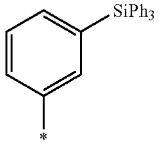 |
| 2-D1-77 | 1 | 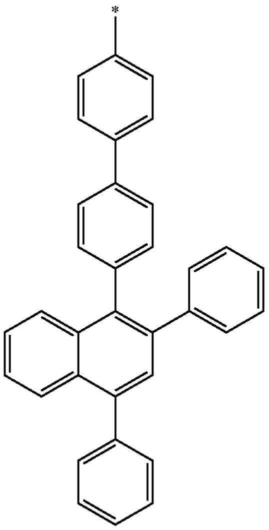 [SMILES: *c1ccc(-c2ccc(-c3c(-c4ccccc4)cc(-c4ccccc4)c4ccccc34)cc2)cc1] | 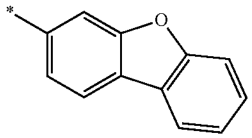 [SMILES: *c1ccc2c(c1)oc1ccccc12] | 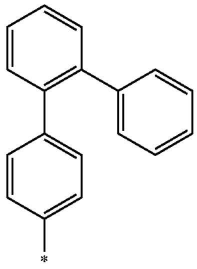 [SMILES: *c1ccc(-c2ccccc2-c2ccccc2)cc1] |

-continued
| [Compound Group 1] | | | | |
|---|---|---|---|---|
| | n | A—L—* | $Ar_1$ | $Ar_2$ |
| 2-D1-78 | 1 | 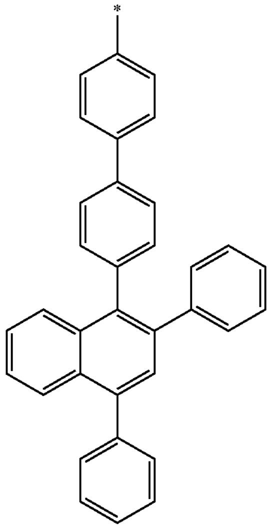 [SMILES: *c1ccc(-c2ccc(-c3c(-c4ccccc4)cc(-c4ccccc4)c4ccccc34)cc2)cc1] | 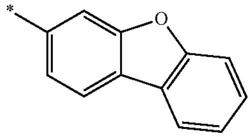 [SMILES: *c1ccc2c(c1)oc1ccccc12] | 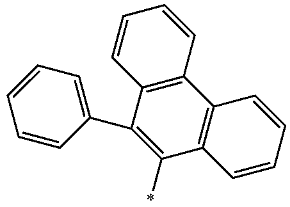 [SMILES: *c1c(-c2ccccc2)c2ccccc2c2ccccc12] |
| 2-D1-79 | 1 | 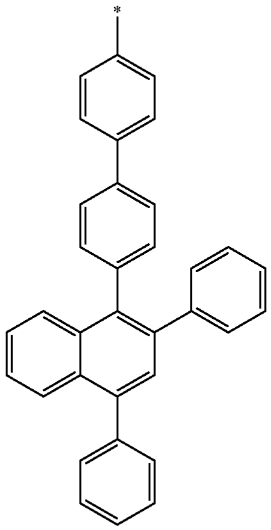 [SMILES: *c1ccc(-c2ccc(-c3c(-c4ccccc4)cc(-c4ccccc4)c4ccccc34)cc2)cc1] | 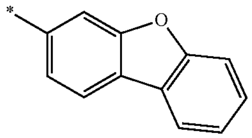 [SMILES: *c1ccc2c(c1)oc1ccccc12] | 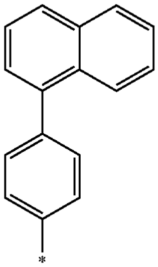 [SMILES: *c1ccc(-c2cccc3ccccc23)cc1] |

-continued
| [Compound Group 1] | | | | |
|---|---|---|---|---|
| | n | A—L—* | $Ar_1$ | $Ar_2$ |
| 2-D1-80 | 1 | 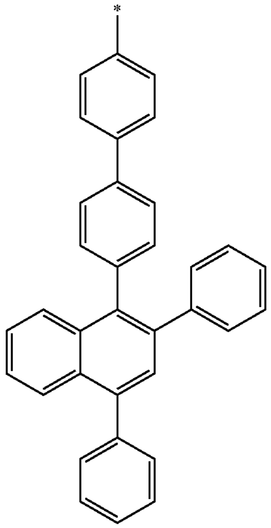 [SMILES: *c1ccc(-c2ccc(-c3c(-c4ccccc4)cc(-c4ccccc4)c4ccccc34)cc2)cc1] | 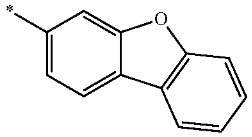 [SMILES: *c1ccc2c(c1)oc1ccccc12] | 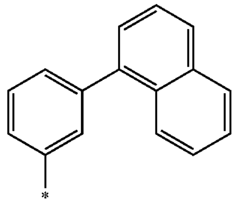 |
| 2-D1-81 | 1 | 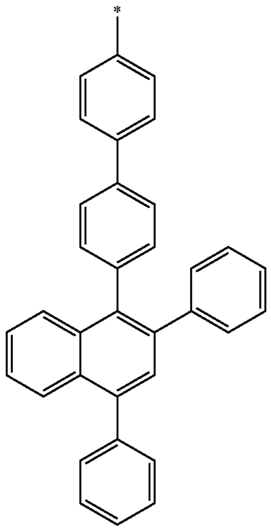 [SMILES: *c1ccc(-c2ccc(-c3c(-c4ccccc4)cc(-c4ccccc4)c4ccccc34)cc2)cc1] | 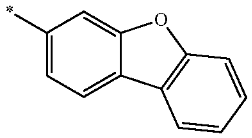 [SMILES: *c1ccc2c(c1)oc1ccccc12] | 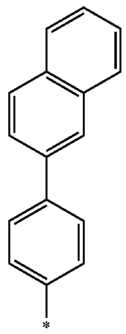 [SMILES: *c1ccc(-c2ccc3ccccc3c2)cc1] |

-continued
| [Compound Group 1] | | | | |
|---|---|---|---|---|
| | n | A—L—* | $Ar_1$ | $Ar_2$ |
| 2-D1-82 | 1 | 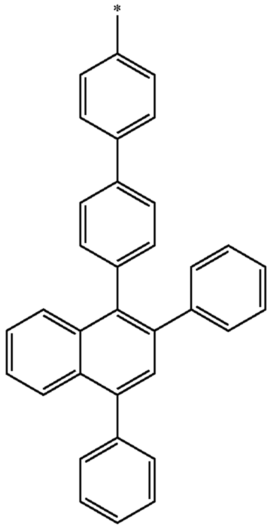 [SMILES: *c1ccc(-c2ccc(-c3c(-c4ccccc4)cc(-c4ccccc4)c4ccccc34)cc2)cc1] | 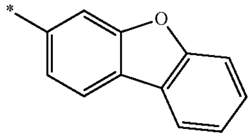 [SMILES: *c1ccc2c(c1)oc1ccccc12] | 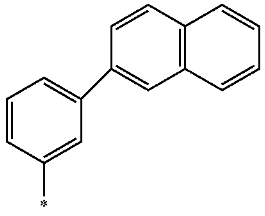 [SMILES: *c1cccc(-c2ccc3ccccc3c2)c1] |
| 2-D1-83 | 1 | 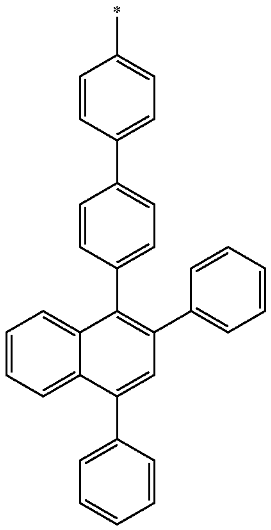 [SMILES: *c1ccc(-c2ccc(-c3c(-c4ccccc4)cc(-c4ccccc4)c4ccccc34)cc2)cc1] | 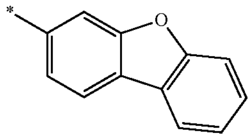 [SMILES: *c1ccc2c(c1)oc1ccccc12] | 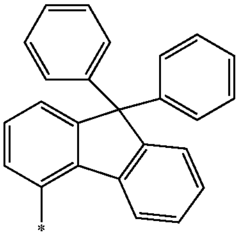 |

-continued
| [Compound Group 1] | | | | |
|---|---|---|---|---|
| | n | A—L—* | $Ar_1$ | $Ar_2$ |
| 2-D1-84 | 1 | 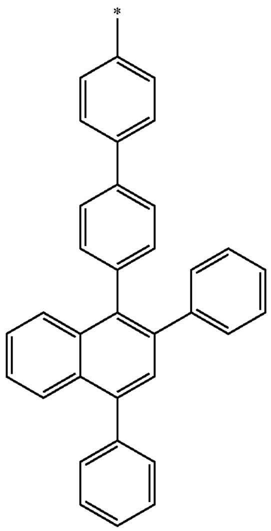 [SMILES: *c1ccc(-c2ccc(-c3c(-c4ccccc4)cc(-c4ccccc4)c4ccccc34)cc2)cc1] | 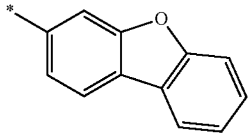 [SMILES: *c1ccc2c(c1)oc1ccccc12] | 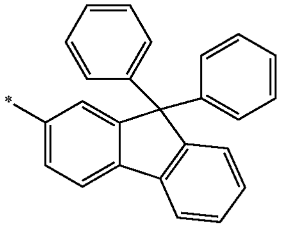 |
| 2-D1-85 | 1 | 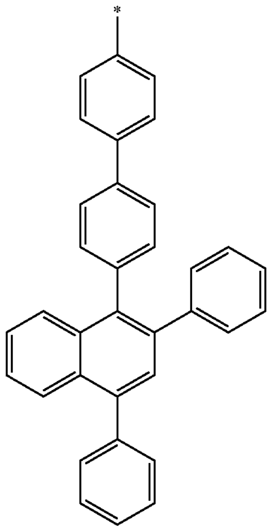 [SMILES: *c1ccc(-c2ccc(-c3c(-c4ccccc4)cc(-c4ccccc4)c4ccccc34)cc2)cc1] | 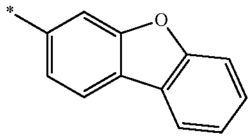 [SMILES: *c1ccc2c(c1)oc1ccccc12] | 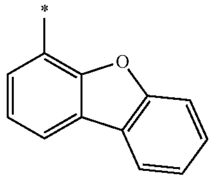 |

-continued
| [Compound Group 1] | | | | |
|---|---|---|---|---|
| | n | A—L—* | $Ar_1$ | $Ar_2$ |
| 2-D1-86 | 1 | 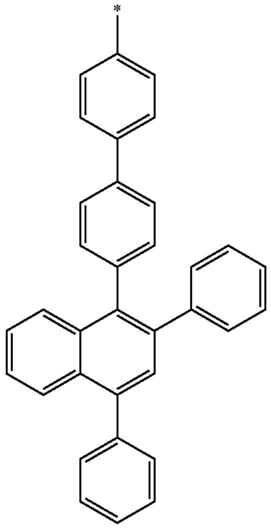 [SMILES: *c1ccc(-c2ccc(-c3c(-c4ccccc4)cc(-c4ccccc4)c4ccccc34)cc2)cc1] | 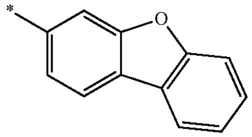 [SMILES: *c1ccc2c(c1)oc1ccccc12] | 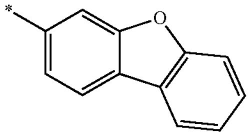 |
| 2-D1-87 | 1 | 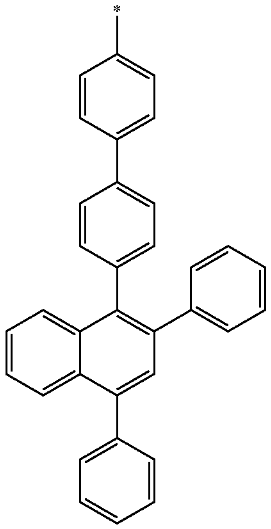 [SMILES: *c1ccc(-c2ccc(-c3c(-c4ccccc4)cc(-c4ccccc4)c4ccccc34)cc2)cc1] | 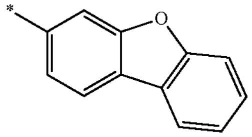 [SMILES: *c1ccc2c(c1)oc1ccccc12] | 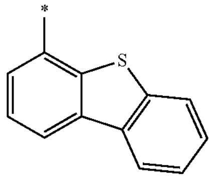 |

-continued
[Compound Group 1]
| | n | A—L—* | $Ar_1$ | $Ar_2$ |
|---|---|---|---|---|
| 2-D1-88 | 1 | 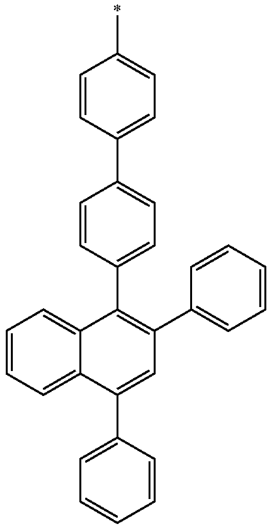 [SMILES: *c1ccc(-c2ccc(-c3c(-c4ccccc4)cc(-c4ccccc4)c4ccccc34)cc2)cc1] | 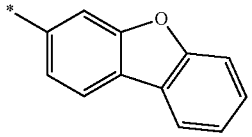 [SMILES: *c1ccc2c(c1)oc1ccccc12] | 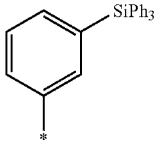 |
| 2-D1-89 | 1 | 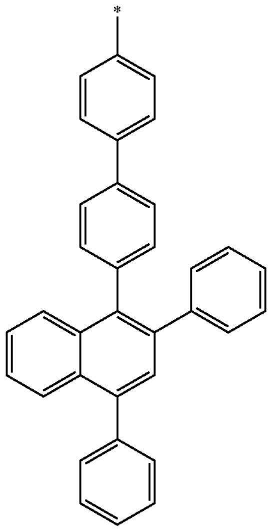 [SMILES: *c1ccc(-c2ccc(-c3c(-c4ccccc4)cc(-c4ccccc4)c4ccccc34)cc2)cc1] | 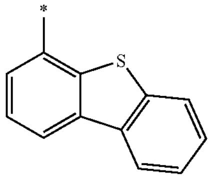 | 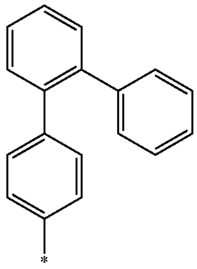 |

-continued
| [Compound Group 1] | | | | |
|---|---|---|---|---|
| | n | A—L—* | $Ar_1$ | $Ar_2$ |
| 2-D1-90 | 1 | 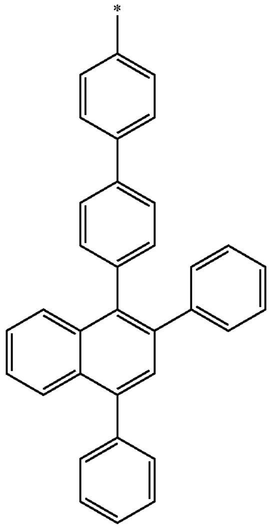 [SMILES: *c1ccc(-c2ccc(-c3c(-c4ccccc4)cc(-c4ccccc4)c4ccccc34)cc2)cc1] | 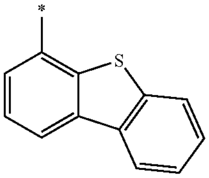 | 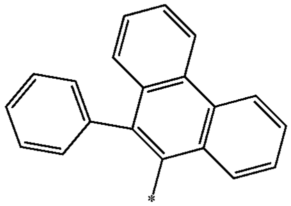 |
| 2-D1-91 | 1 | 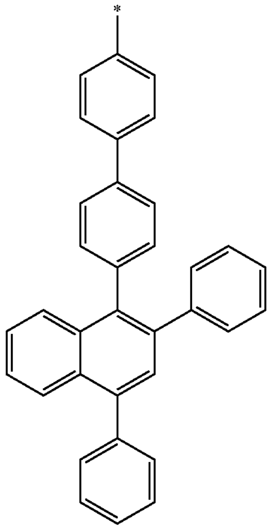 [SMILES: *c1ccc(-c2ccc(-c3c(-c4ccccc4)cc(-c4ccccc4)c4ccccc34)cc2)cc1] | 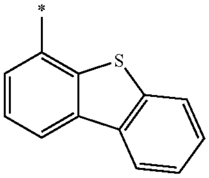 | 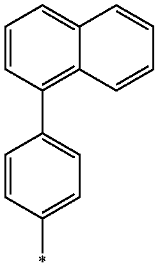 |

-continued
| [Compound Group 1] | | | | |
|---|---|---|---|---|
| | n | A—L—* | $Ar_1$ | $Ar_2$ |
| 2-D1-92 | 1 | 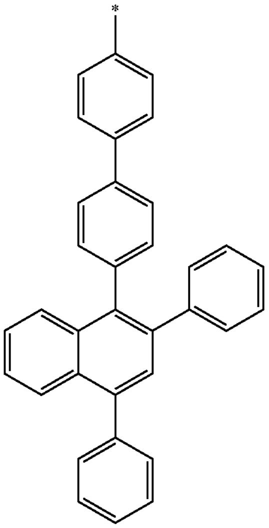 [SMILES: *c1ccc(-c2ccc(-c3c(-c4ccccc4)cc(-c4ccccc4)c4ccccc34)cc2)cc1] | 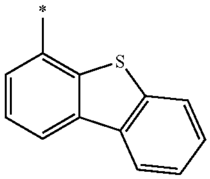 | 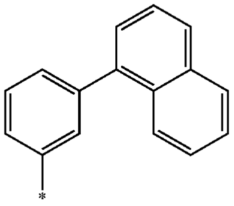 |
| 2-D1-93 | 1 | 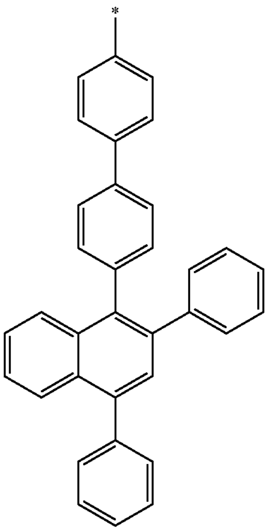 [SMILES: *c1ccc(-c2ccc(-c3c(-c4ccccc4)cc(-c4ccccc4)c4ccccc34)cc2)cc1] | 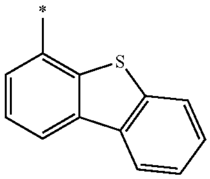 | 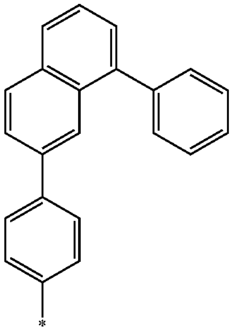 |

-continued
| [Compound Group 1] | n | A—L—* | $Ar_1$ | $Ar_2$ |
|---|---|---|---|---|
| 2-D1-94 | 1 | 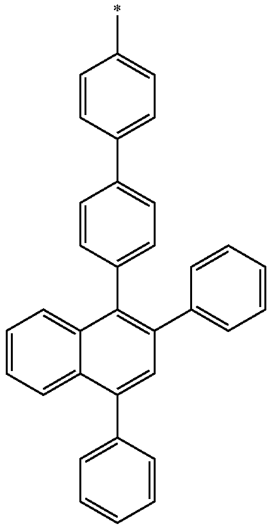 [SMILES: *c1ccc(-c2ccc(-c3c(-c4ccccc4)cc(-c4ccccc4)c4ccccc34)cc2)cc1] | 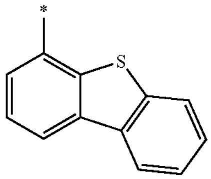 | 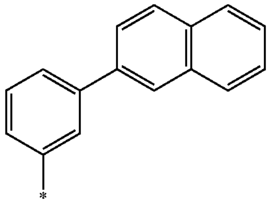 |
| 2-D1-95 | 1 | 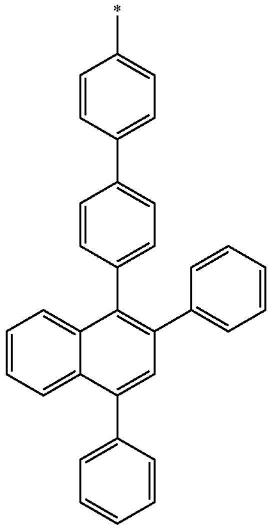 [SMILES: *c1ccc(-c2ccc(-c3c(-c4ccccc4)cc(-c4ccccc4)c4ccccc34)cc2)cc1] | 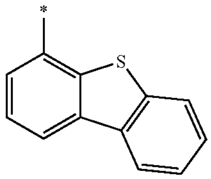 | 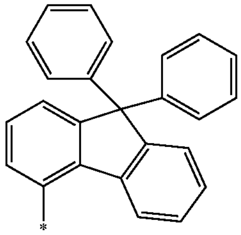 |

-continued
[Compound Group 1]
| | n | A—L—* | $Ar_1$ | $Ar_2$ |
|---|---|---|---|---|
| 2-D1-96 | 1 | 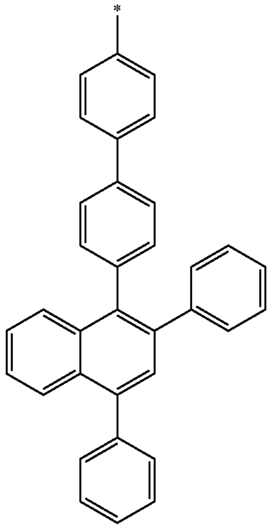 [SMILES: *c1ccc(-c2ccc(-c3c(-c4ccccc4)cc(-c4ccccc4)c4ccccc34)cc2)cc1] | 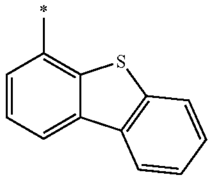 | 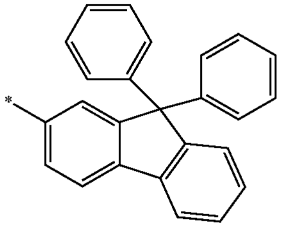 |
| 2-D1-97 | 1 | 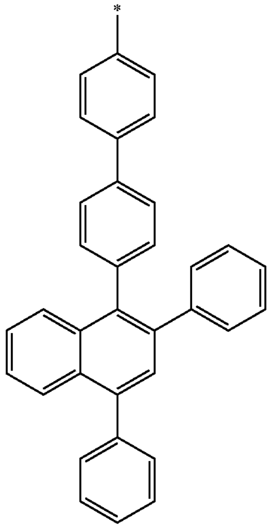 [SMILES: *c1ccc(-c2ccc(-c3c(-c4ccccc4)cc(-c4ccccc4)c4ccccc34)cc2)cc1] | 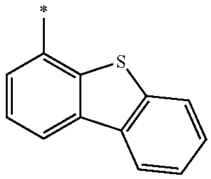 | 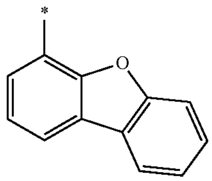 |

-continued
[Compound Group 1]
| | n | A—L—* | $Ar_1$ | $Ar_2$ |
|---|---|---|---|---|
| 2-D1-98 | 1 | 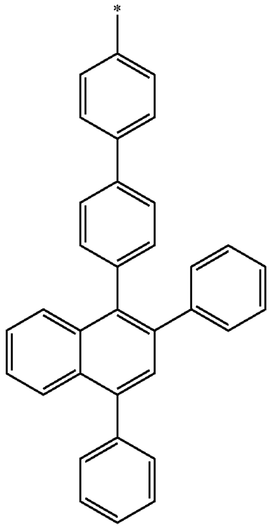 [SMILES: *c1ccc(-c2ccc(-c3c(-c4ccccc4)cc(-c4ccccc4)c4ccccc34)cc2)cc1] | 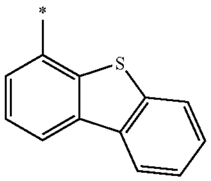 | 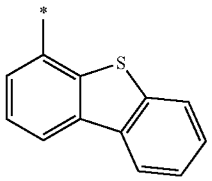 |
| 2-D1-99 | 1 | 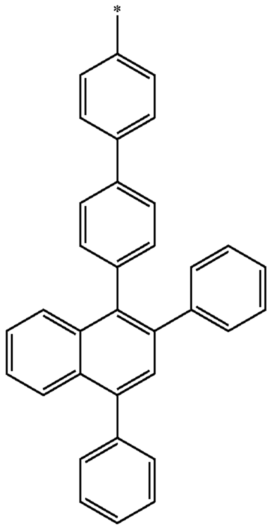 [SMILES: *c1ccc(-c2ccc(-c3c(-c4ccccc4)cc(-c4ccccc4)c4ccccc34)cc2)cc1] | 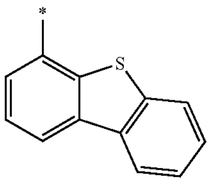 | 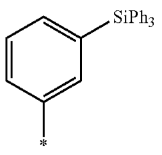 |
| 3-D1-1 | 1 | 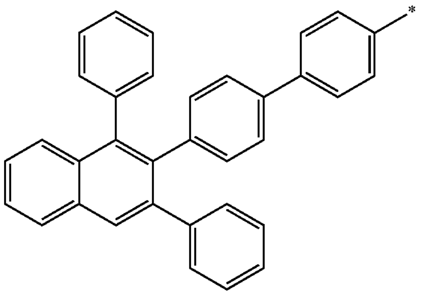 [SMILES: *c1ccc(-c2ccc(-c3c(-c4ccccc4)cc4ccccc4c3-c3ccccc3)cc2)cc1] | 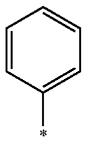 [SMILES: *c1ccccc1] | 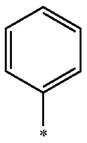 [SMILES: *c1ccccc1] |

-continued
| [Compound Group 1] | | | | |
|---|---|---|---|---|
| | n | A—L—* | $Ar_1$ | $Ar_2$ |
| 3-D1-2 | 1 | 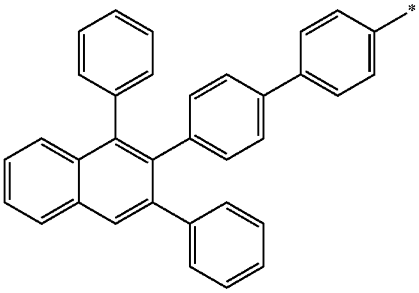 [SMILES: *c1ccc(-c2ccc(-c3c(-c4ccccc4)cc4ccccc4c3-c3ccccc3)cc2)cc1] | 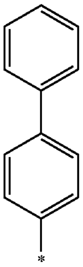 [SMILES: *c1ccc(-c2ccccc2)cc1] | 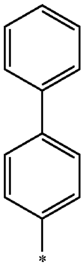 [SMILES: *c1ccc(-c2ccccc2)cc1] |
| 3-D1-3 | 1 | 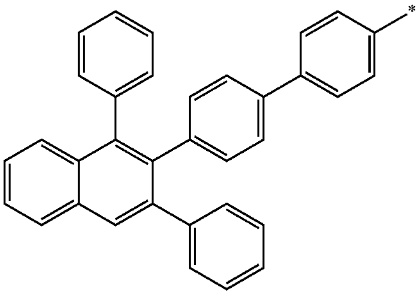 [SMILES: *c1ccc(-c2ccc(-c3c(-c4ccccc4)cc4ccccc4c3-c3ccccc3)cc2)cc1] | 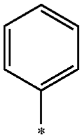 [SMILES: *c1ccccc1] | 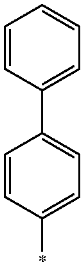 [SMILES: *c1ccc(-c2ccccc2)cc1] |
| 3-D1-4 | 1 | 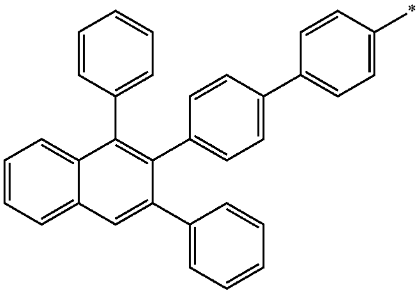 [SMILES: *c1ccc(-c2ccc(-c3c(-c4ccccc4)cc4ccccc4c3-c3ccccc3)cc2)cc1] | 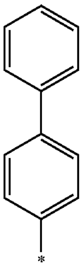 [SMILES: *c1ccc(-c2ccccc2)cc1] | 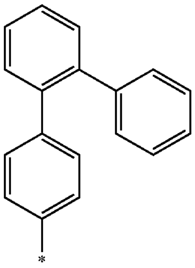 [SMILES: *c1ccc(-c2ccccc2-c2ccccc2)cc1] |
| 3-D1-5 | 1 | 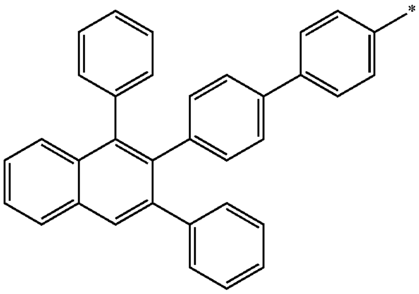 [SMILES: *c1ccc(-c2ccc(-c3c(-c4ccccc4)cc4ccccc4c3-c3ccccc3)cc2)cc1] | 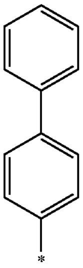 [SMILES: *c1ccc(-c2ccccc2)cc1] | 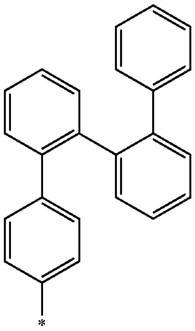 [SMILES: *c1ccc(-c2ccccc2-c2ccccc2-c2ccccc2)cc1] |
| 3-D1-6 | 1 | 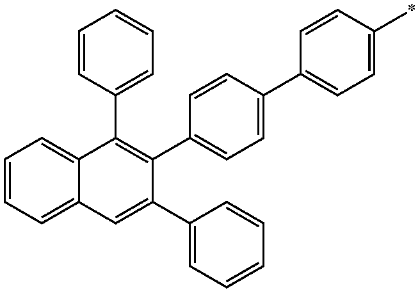 [SMILES: *c1ccc(-c2ccc(-c3c(-c4ccccc4)cc4ccccc4c3-c3ccccc3)cc2)cc1] | 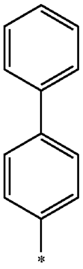 [SMILES: *c1ccc(-c2ccccc2)cc1] | 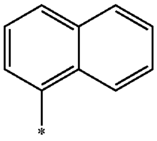 |

-continued
[Compound Group 1]
| | n | A—L—* | $Ar_1$ | $Ar_2$ |
|---|---|---|---|---|
| 3-D1-7 | 1 | 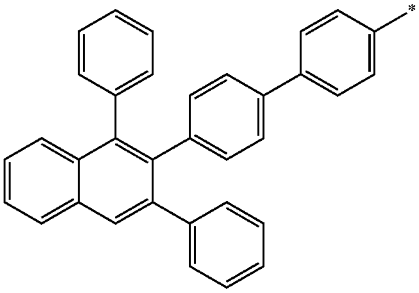 [SMILES: *c1ccc(-c2ccc(-c3c(-c4ccccc4)cc4ccccc4c3-c3ccccc3)cc2)cc1] | 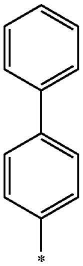 [SMILES: *c1ccc(-c2ccccc2)cc1] | 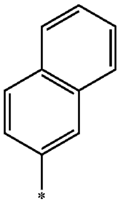 |
| 3-D1-8 | 1 | 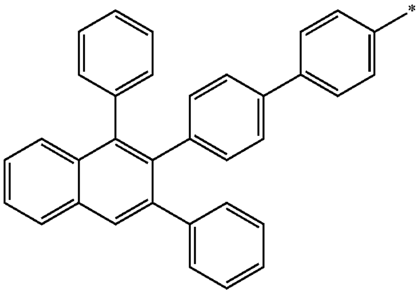 [SMILES: *c1ccc(-c2ccc(-c3c(-c4ccccc4)cc4ccccc4c3-c3ccccc3)cc2)cc1] | 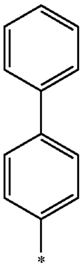 [SMILES: *c1ccc(-c2ccccc2)cc1] | 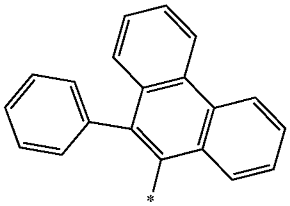 [SMILES: *c1c(-c2ccccc2)c2ccccc2c2ccccc12] |
| 3-D1-9 | 1 | 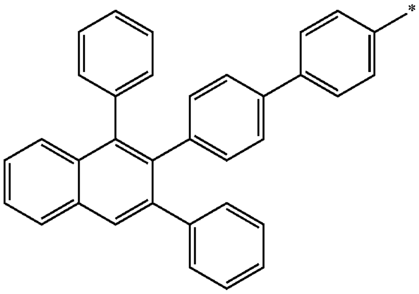 [SMILES: *c1ccc(-c2ccc(-c3c(-c4ccccc4)cc4ccccc4c3-c3ccccc3)cc2)cc1] | 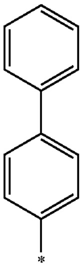 [SMILES: *c1ccc(-c2ccccc2)cc1] | 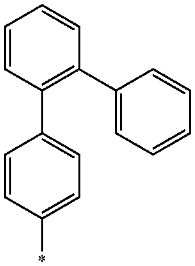 [SMILES: *c1ccc(-c2ccccc2-c2ccccc2)cc1] |
| 3-D1-10 | 1 | 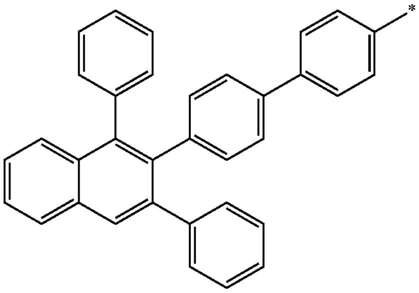 [SMILES: *c1ccc(-c2ccc(-c3c(-c4ccccc4)cc4ccccc4c3-c3ccccc3)cc2)cc1] | 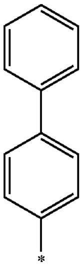 [SMILES: *c1ccc(-c2ccccc2)cc1] | 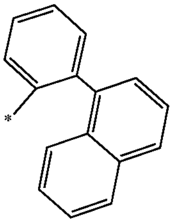 [SMILES: *c1ccccc1-c1cccc2ccccc12] |
| 3-D1-11 | 1 | 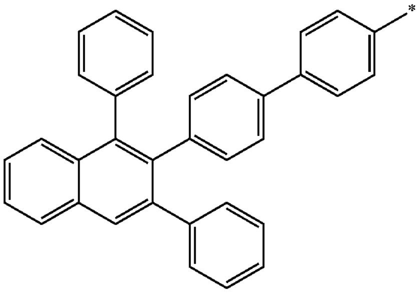 [SMILES: *c1ccc(-c2ccc(-c3c(-c4ccccc4)cc4ccccc4c3-c3ccccc3)cc2)cc1] | 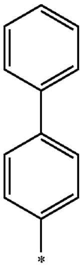 [SMILES: *c1ccc(-c2ccccc2)cc1] | 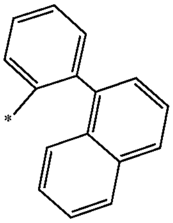 [SMILES: *c1ccccc1-c1cccc2ccccc12] |

-continued
[Compound Group 1]
| | n | A—L—* | $Ar_1$ | $Ar_2$ |
|---|---|---|---|---|
| 3-D1-12 | 1 | 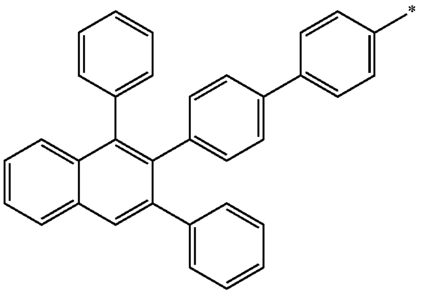 [SMILES: *c1ccc(-c2ccc(-c3c(-c4ccccc4)cc4ccccc4c3-c3ccccc3)cc2)cc1] | 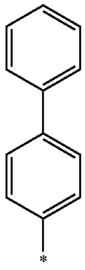 [SMILES: *c1ccc(-c2ccccc2)cc1] | 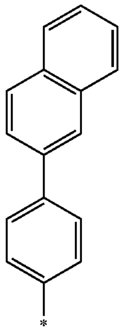 |
| 3-D1-13 | 1 | 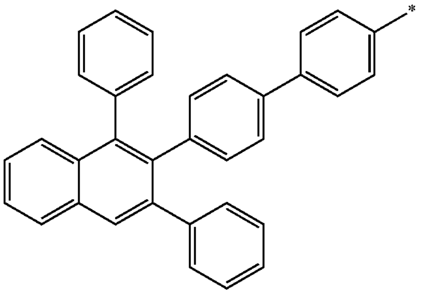 [SMILES: *c1ccc(-c2ccc(-c3c(-c4ccccc4)cc4ccccc4c3-c3ccccc3)cc2)cc1] | 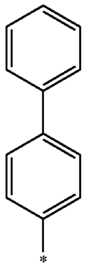 [SMILES: *c1ccc(-c2ccccc2)cc1] | 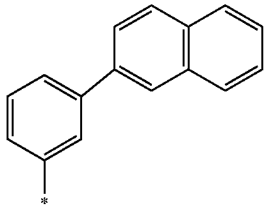 [SMILES: *c1cccc(-c2ccc3ccccc3c2)c1] |
| 3-D1-14 | 1 | 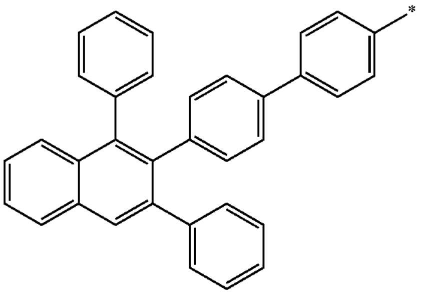 [SMILES: *c1ccc(-c2ccc(-c3c(-c4ccccc4)cc4ccccc4c3-c3ccccc3)cc2)cc1] | 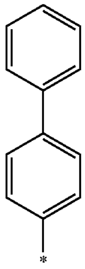 [SMILES: *c1ccc(-c2ccccc2)cc1] | 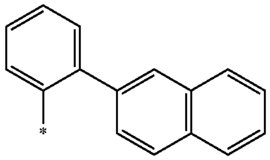 [SMILES: *c1ccccc1-c1ccc2ccccc2c1] |
| 3-D1-15 | 1 | 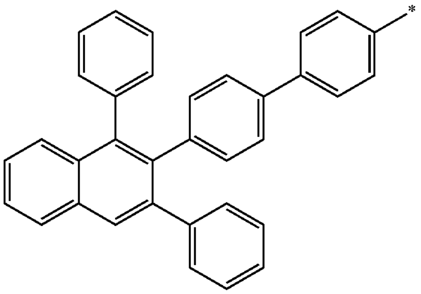 [SMILES: *c1ccc(-c2ccc(-c3c(-c4ccccc4)cc4ccccc4c3-c3ccccc3)cc2)cc1] | 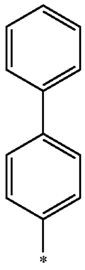 | 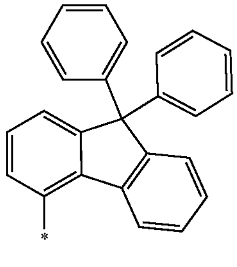 [SMILES: *c1cccc2c1-c1ccccc1C2(c1ccccc1)c1ccccc1] |
| 3-D1-16 | 1 | 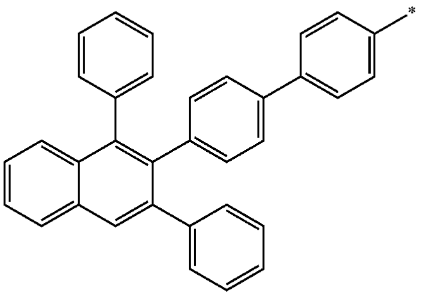 [SMILES: *c1ccc(-c2ccc(-c3c(-c4ccccc4)cc4ccccc4c3-c3ccccc3)cc2)cc1] | 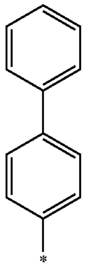 [SMILES: *c1ccc(-c2ccccc2)cc1] | 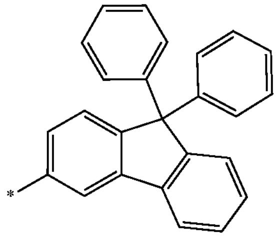 [SMILES: *c1ccc2c(c1)-c1ccccc1C2(c1ccccc1)c1ccccc1] |

-continued
[Compound Group 1]
| | n | A—L—* | $Ar_1$ | $Ar_2$ |
|---|---|---|---|---|
| 3-D1-17 | 1 | 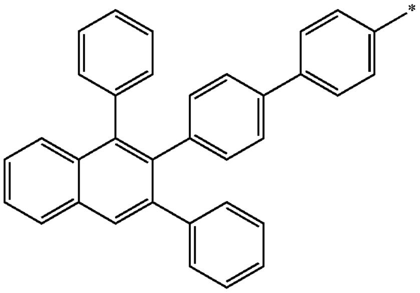 [SMILES: *c1ccc(-c2ccc(-c3c(-c4ccccc4)cc4ccccc4c3-c3ccccc3)cc2)cc1] | 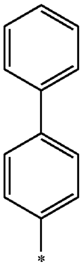 [SMILES: *c1ccc(-c2ccccc2)cc1] | 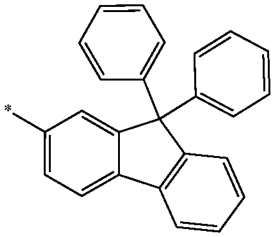 [SMILES: *c1ccc2c(c1)C(c1ccccc1)(c1ccccc1)c1ccccc1-2] |
| 3-D1-18 | 1 | 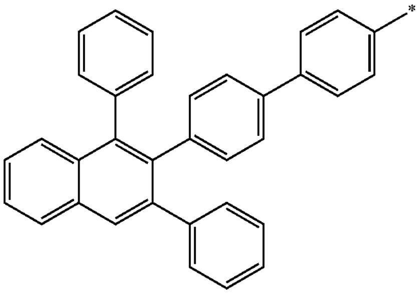 [SMILES: *c1ccc(-c2ccc(-c3c(-c4ccccc4)cc4ccccc4c3-c3ccccc3)cc2)cc1] | 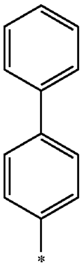 [SMILES: *c1ccc(-c2ccccc2)cc1] | 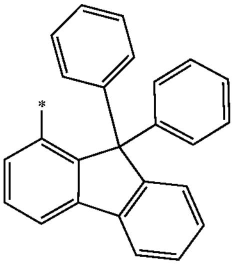 [SMILES: *c1cccc2c1C(c1ccccc1)(c1ccccc1)c1ccccc1-2] |
| 3-D1-19 | 1 | 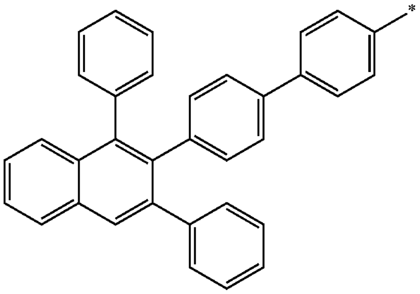 [SMILES: *c1ccc(-c2ccc(-c3c(-c4ccccc4)cc4ccccc4c3-c3ccccc3)cc2)cc1] | 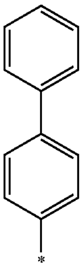 [SMILES: *c1ccc(-c2ccccc2)cc1] | 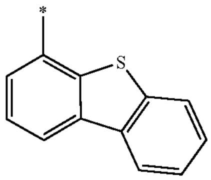 |
| 3-D1-20 | 1 | 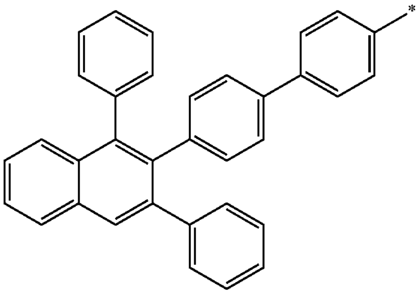 [SMILES: *c1ccc(-c2ccc(-c3c(-c4ccccc4)cc4ccccc4c3-c3ccccc3)cc2)cc1] | 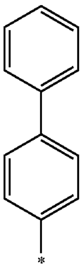 [SMILES: *c1ccc(-c2ccccc2)cc1] | 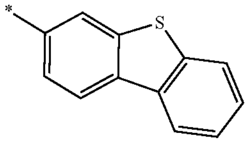 [SMILES: *c1ccc2c(c1)sc1ccccc12] |
| 3-D1-21 | 1 | 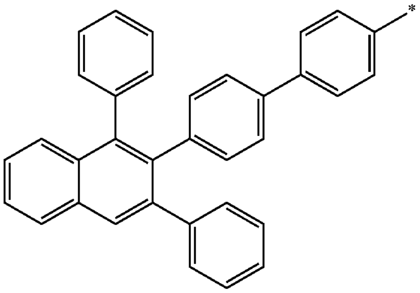 [SMILES: *c1ccc(-c2ccc(-c3c(-c4ccccc4)cc4ccccc4c3-c3ccccc3)cc2)cc1] | 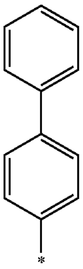 [SMILES: *c1ccc(-c2ccccc2)cc1] | 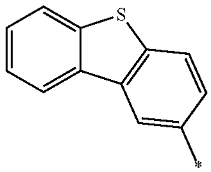 |

-continued
[Compound Group 1]
| | n | A—L—* | $Ar_1$ | $Ar_2$ |
|---|---|---|---|---|
| 3-D1-22 | 1 | 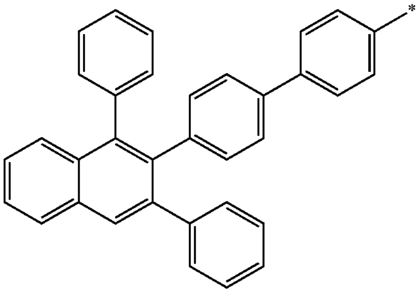 [SMILES: *c1ccc(-c2ccc(-c3c(-c4ccccc4)cc4ccccc4c3-c3ccccc3)cc2)cc1] | 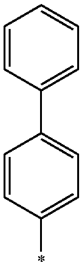 [SMILES: *c1ccc(-c2ccccc2)cc1] | 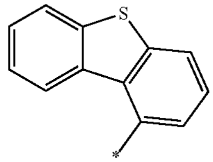 |
| 3-D1-23 | 1 | 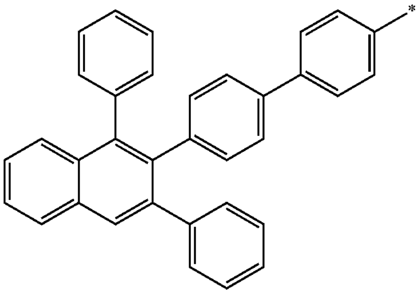 [SMILES: *c1ccc(-c2ccc(-c3c(-c4ccccc4)cc4ccccc4c3-c3ccccc3)cc2)cc1] | 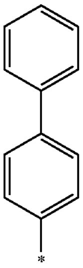 [SMILES: *c1ccc(-c2ccccc2)cc1] | 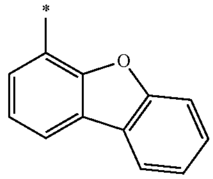 |
| 3-D1-24 | 1 | 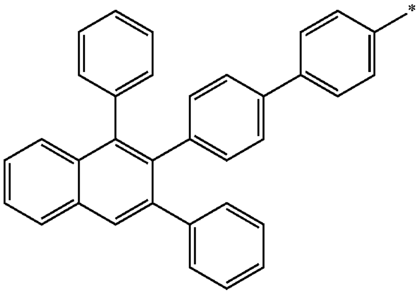 [SMILES: *c1ccc(-c2ccc(-c3c(-c4ccccc4)cc4ccccc4c3-c3ccccc3)cc2)cc1] | 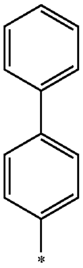 [SMILES: *c1ccc(-c2ccccc2)cc1] | 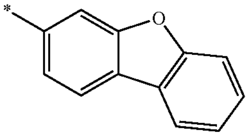 |
| 3-D1-25 | 1 | 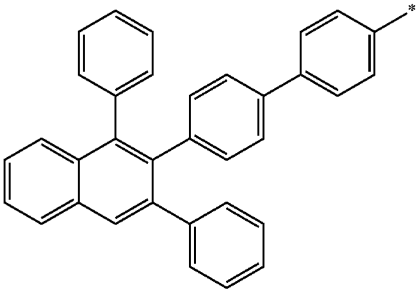 [SMILES: *c1ccc(-c2ccc(-c3c(-c4ccccc4)cc4ccccc4c3-c3ccccc3)cc2)cc1] | 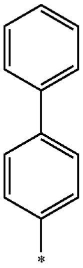 [SMILES: *c1ccc(-c2ccccc2)cc1] | 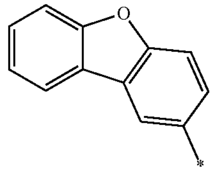 |
| 3-D1-26 | 1 | 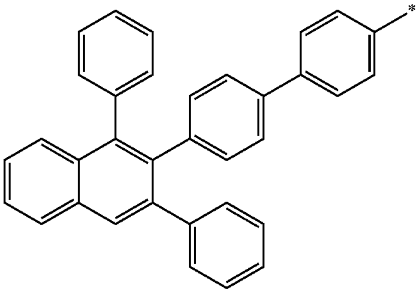 [SMILES: *c1ccc(-c2ccc(-c3c(-c4ccccc4)cc4ccccc4c3-c3ccccc3)cc2)cc1] | 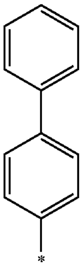 [SMILES: *c1ccc(-c2ccccc2)cc1] | 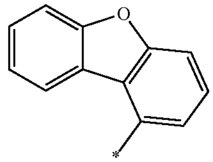 |

-continued
| [Compound Group 1] | | | | |
|---|---|---|---|---|
| | n | A—L—* | $Ar_1$ | $Ar_2$ |
| 3-D1-27 | 1 | 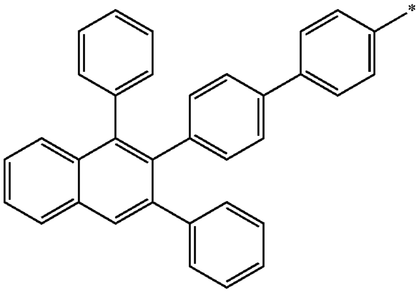 [SMILES: *c1ccc(-c2ccc(-c3c(-c4ccccc4)cc4ccccc4c3-c3ccccc3)cc2)cc1] | 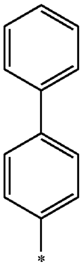 [SMILES: *c1ccc(-c2ccccc2)cc1] | 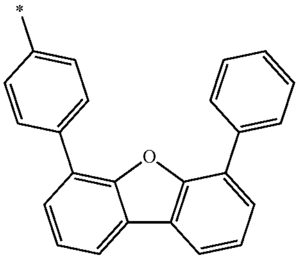 |
| 3-D1-28 | 1 | 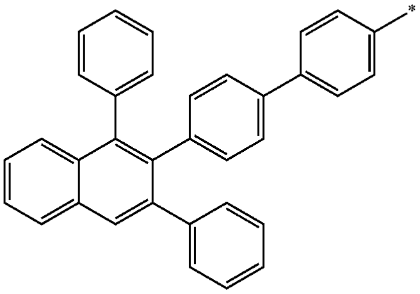 [SMILES: *c1ccc(-c2ccc(-c3c(-c4ccccc4)cc4ccccc4c3-c3ccccc3)cc2)cc1] | 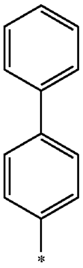 [SMILES: *c1ccc(-c2ccccc2)cc1] | 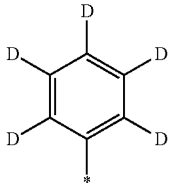 |
| 3-D1-29 | 1 | 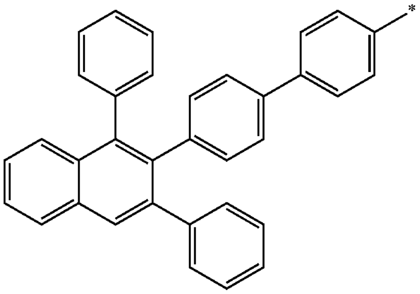 [SMILES: *c1ccc(-c2ccc(-c3c(-c4ccccc4)cc4ccccc4c3-c3ccccc3)cc2)cc1] | 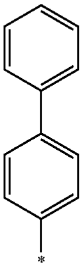 [SMILES: *c1ccc(-c2ccccc2)cc1] | 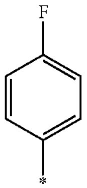 |
| 3-D1-30 | 1 | 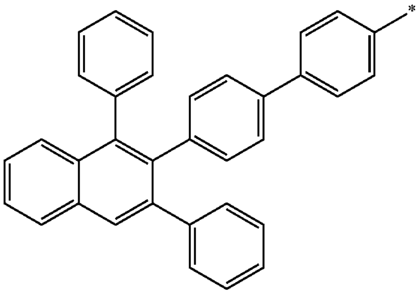 [SMILES: *c1ccc(-c2ccc(-c3c(-c4ccccc4)cc4ccccc4c3-c3ccccc3)cc2)cc1] | 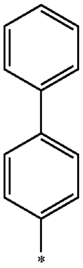 [SMILES: *c1ccc(-c2ccccc2)cc1] | 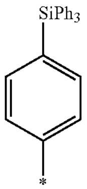 |
| 3-D1-31 | 1 | 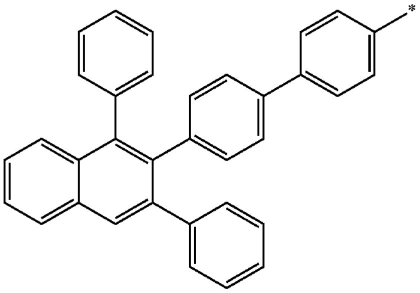 [SMILES: *c1ccc(-c2ccc(-c3c(-c4ccccc4)cc4ccccc4c3-c3ccccc3)cc2)cc1] | 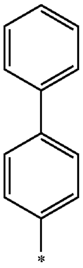 [SMILES: *c1ccc(-c2ccccc2)cc1] | 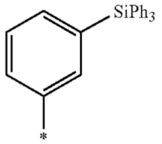 |

-continued
[Compound Group 1]
| | n | A—L—* | $Ar_1$ | $Ar_2$ |
|---|---|---|---|---|
| 3-D1-32 | 1 | 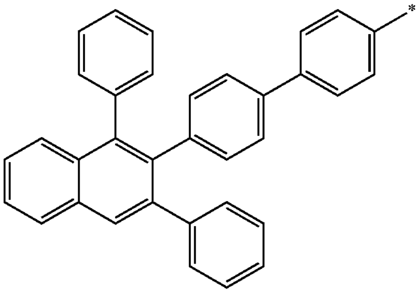 [SMILES: *c1ccc(-c2ccc(-c3c(-c4ccccc4)cc4ccccc4c3-c3ccccc3)cc2)cc1] | 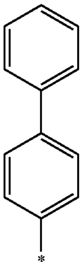 [SMILES: *c1ccc(-c2ccccc2)cc1] | 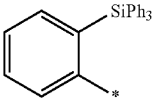 |
| 3-D1-33 | 1 | 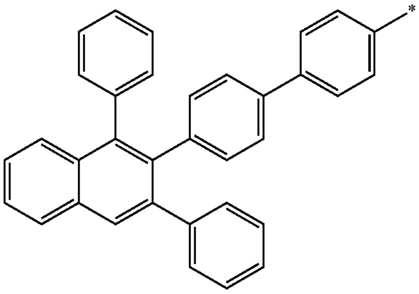 [SMILES: *c1ccc(-c2ccc(-c3c(-c4ccccc4)cc4ccccc4c3-c3ccccc3)cc2)cc1] | 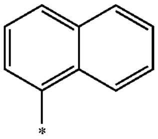 | 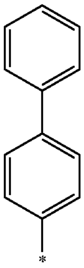 [SMILES: *c1ccc(-c2ccccc2)cc1] |
| 3-D1-34 | 1 | 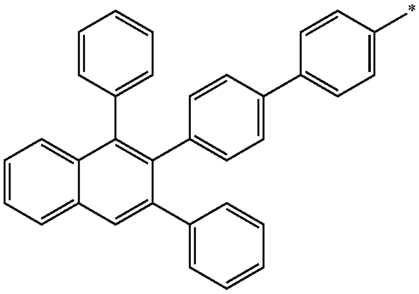 [SMILES: *c1ccc(-c2ccc(-c3c(-c4ccccc4)cc4ccccc4c3-c3ccccc3)cc2)cc1] | 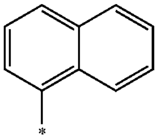 [SMILES: *c1cccc2ccccc12] | 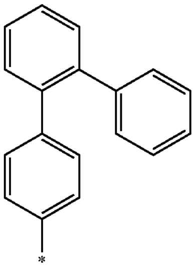 [SMILES: *c1ccc(-c2ccccc2-c2ccccc2)cc1] |
| 3-D1-35 | 1 | 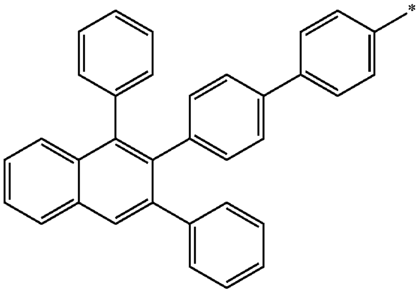 [SMILES: *c1ccc(-c2ccc(-c3c(-c4ccccc4)cc4ccccc4c3-c3ccccc3)cc2)cc1] | 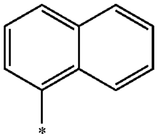 [SMILES: *c1cccc2ccccc12] | 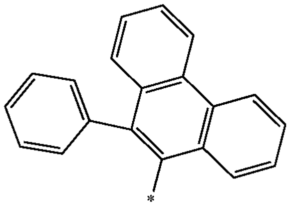 [SMILES: *c1c(-c2ccccc2)c2ccccc2c2ccccc12] |
| 3-D1-36 | 1 | 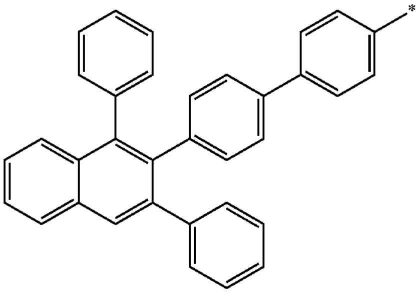 [SMILES: *c1ccc(-c2ccc(-c3c(-c4ccccc4)cc4ccccc4c3-c3ccccc3)cc2)cc1] | 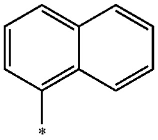 [SMILES: *c1cccc2ccccc12] | 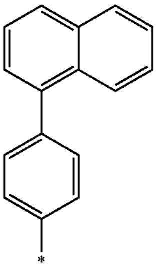 [SMILES: *c1ccc(-c2cccc3ccccc23)cc1] |

-continued
| [Compound Group 1] | | | | |
|---|---|---|---|---|
| | n | A—L—* | $Ar_1$ | $Ar_2$ |
| 3-D1-37 | 1 | 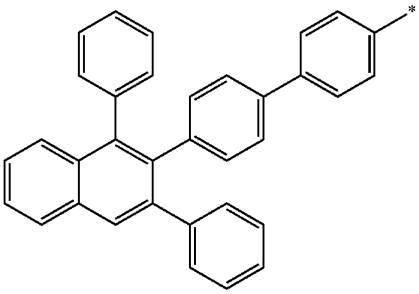 [SMILES: *c1ccc(-c2ccc(-c3c(-c4ccccc4)cc4ccccc4c3-c3ccccc3)cc2)cc1] | 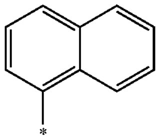 | 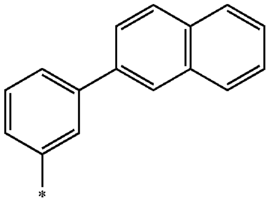 [SMILES: *c1cccc(-c2ccc3ccccc3c2)c1] |
| 3-D1-38 | 1 | 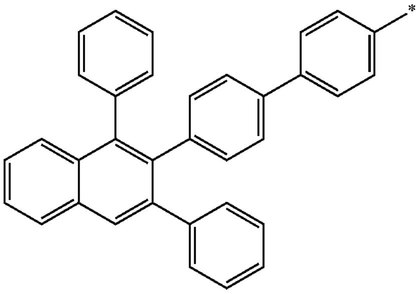 [SMILES: *c1ccc(-c2ccc(-c3c(-c4ccccc4)cc4ccccc4c3-c3ccccc3)cc2)cc1] | 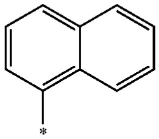 | 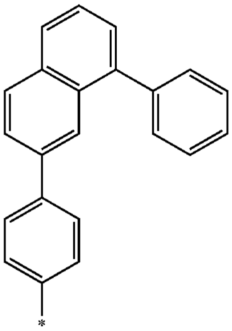 [SMILES: *c1ccc(-c2ccc3cccc(-c4ccccc4)c3c2)cc1] |
| 3-D1-39 | 1 | 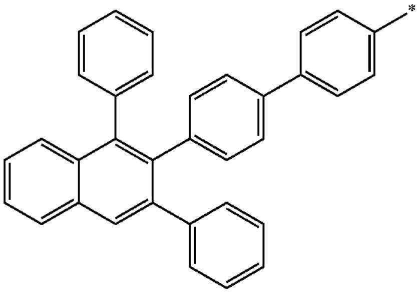 [SMILES: *c1ccc(-c2ccc(-c3c(-c4ccccc4)cc4ccccc4c3-c3ccccc3)cc2)cc1] | 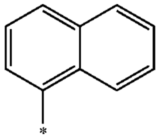 [SMILES: *c1cccc2ccccc12] | 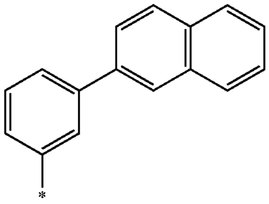 [SMILES: *c1cccc(-c2ccc3ccccc3c2)c1] |
| 3-D1-40 | 1 | 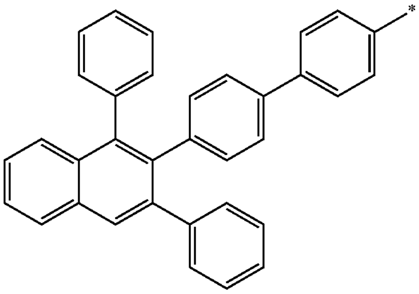 [SMILES: *c1ccc(-c2ccc(-c3c(-c4ccccc4)cc4ccccc4c3-c3ccccc3)cc2)cc1] | 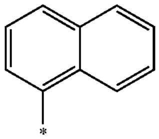 | 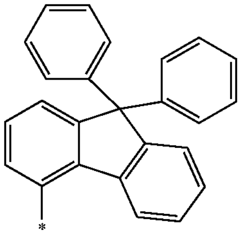 [SMILES: *c1cccc2c1-c1ccccc1C2(c1ccccc1)c1ccccc1] |
| 3-D1-41 | 1 | 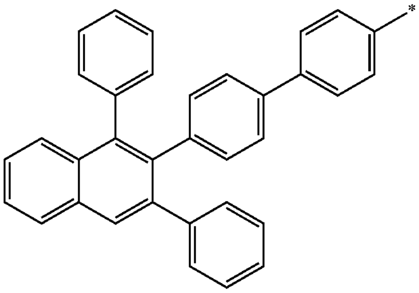 [SMILES: *c1ccc(-c2ccc(-c3c(-c4ccccc4)cc4ccccc4c3-c3ccccc3)cc2)cc1] | 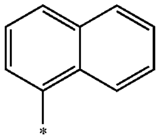 [SMILES: *c1cccc2ccccc12] | 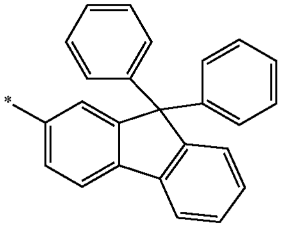 [SMILES: *c1ccc2c(c1)C(c1ccccc1)(c1ccccc1)c1ccccc1-2] |

-continued
[Compound Group 1]
| | n | A—L—* | $Ar_1$ | $Ar_2$ |
|---|---|---|---|---|
| 3-D1-42 | 1 | 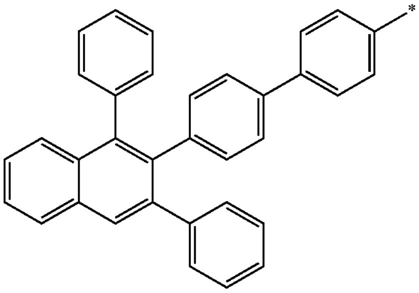 [SMILES: *c1ccc(-c2ccc(-c3c(-c4ccccc4)cc4ccccc4c3-c3ccccc3)cc2)cc1] | 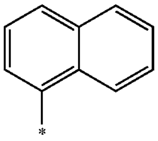 [SMILES: *c1cccc2ccccc12] | 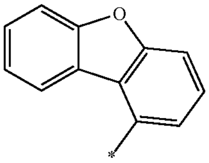 |
| 3-D1-43 | 1 | 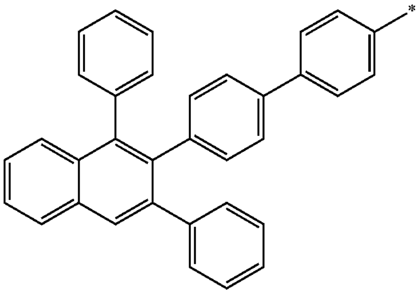 [SMILES: *c1ccc(-c2ccc(-c3c(-c4ccccc4)cc4ccccc4c3-c3ccccc3)cc2)cc1] | 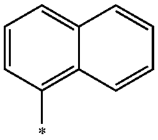 | 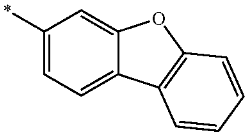 |
| 3-D1-44 | 1 | 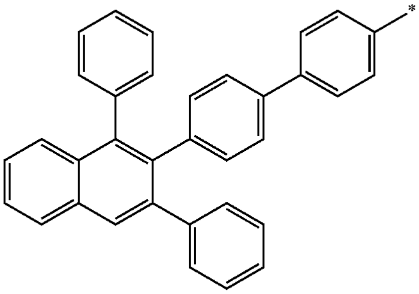 [SMILES: *c1ccc(-c2ccc(-c3c(-c4ccccc4)cc4ccccc4c3-c3ccccc3)cc2)cc1] | 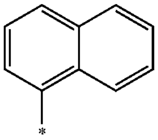 [SMILES: *c1cccc2ccccc12] | 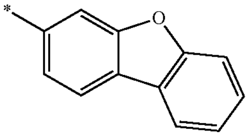 |
| 3-D1-45 | 1 | 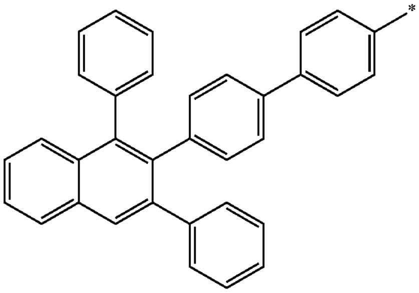 [SMILES: *c1ccc(-c2ccc(-c3c(-c4ccccc4)cc4ccccc4c3-c3ccccc3)cc2)cc1] | 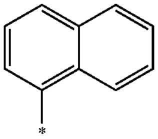 [SMILES: *c1cccc2ccccc12] | 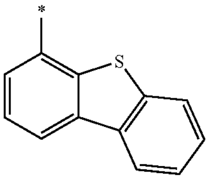 |
| 3-D1-46 | 1 | 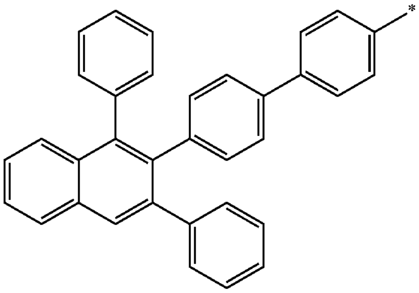 [SMILES: *c1ccc(-c2ccc(-c3c(-c4ccccc4)cc4ccccc4c3-c3ccccc3)cc2)cc1] | 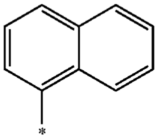 [SMILES: *c1cccc2ccccc12] | 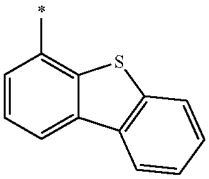 |

-continued
[Compound Group 1]
| | n | A—L—* | $Ar_1$ | $Ar_2$ |
|---|---|---|---|---|
| 3-D1-47 | 1 | 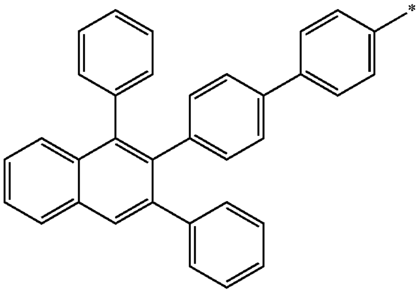 [SMILES: *c1ccc(-c2ccc(-c3c(-c4ccccc4)cc4ccccc4c3-c3ccccc3)cc2)cc1] | 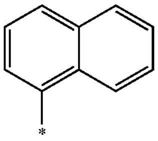 [SMILES: *c1cccc2ccccc12] | 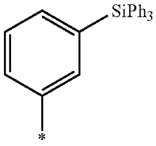 |
| 3-D1-48 | 1 | 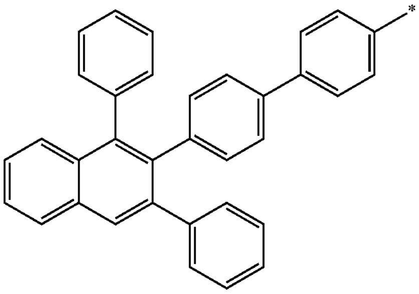 [SMILES: *c1ccc(-c2ccc(-c3c(-c4ccccc4)cc4ccccc4c3-c3ccccc3)cc2)cc1] | 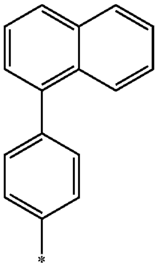 | 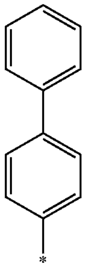 |
| 3-D1-49 | 1 | 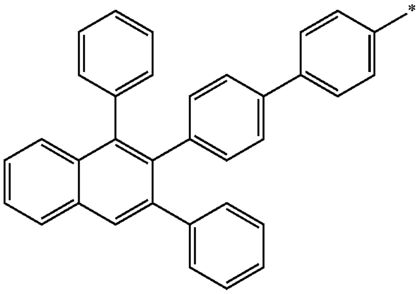 [SMILES: *c1ccc(-c2ccc(-c3c(-c4ccccc4)cc4ccccc4c3-c3ccccc3)cc2)cc1] | 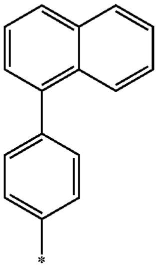 | 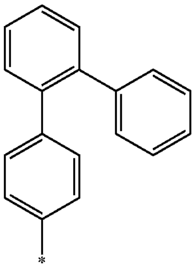 |
| 3-D1-50 | 1 | 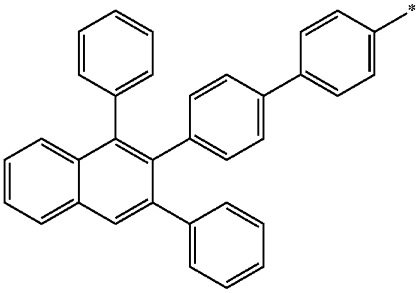 [SMILES: *c1ccc(-c2ccc(-c3c(-c4ccccc4)cc4ccccc4c3-c3ccccc3)cc2)cc1] | 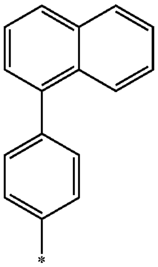 | 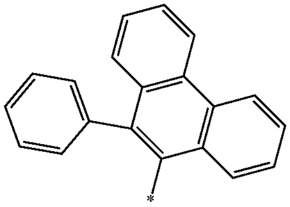 |
| 3-D1-51 | 1 | 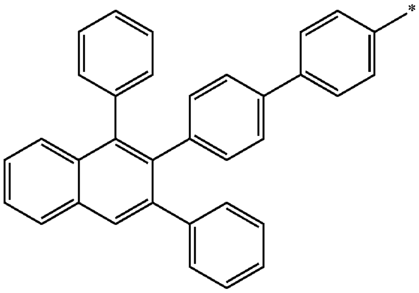 [SMILES: *c1ccc(-c2ccc(-c3c(-c4ccccc4)cc4ccccc4c3-c3ccccc3)cc2)cc1] | 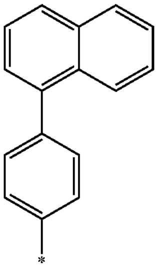 | 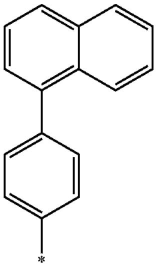 |

-continued
| [Compound Group 1] | | | | |
|---|---|---|---|---|
| | n | A—L—* | $Ar_1$ | $Ar_2$ |
| 3-D1-52 | 1 | 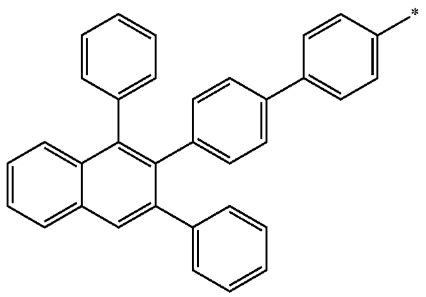 [SMILES: *c1ccc(-c2ccc(-c3c(-c4ccccc4)cc4ccccc4c3-c3ccccc3)cc2)cc1] | 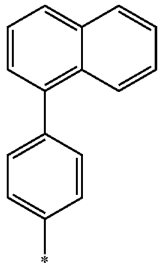 | 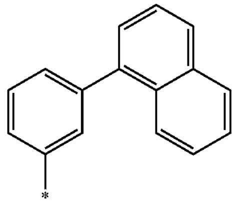 |
| 3-D1-53 | 1 | 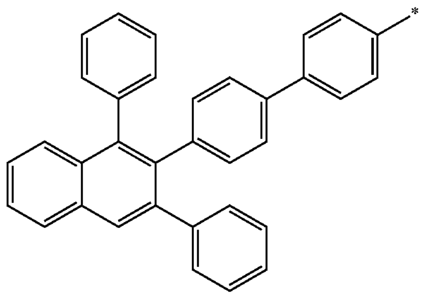 [SMILES: *c1ccc(-c2ccc(-c3c(-c4ccccc4)cc4ccccc4c3-c3ccccc3)cc2)cc1] | 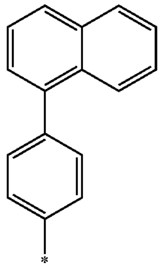 | 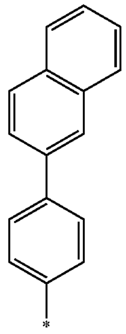 |
| 3-D1-54 | 1 | 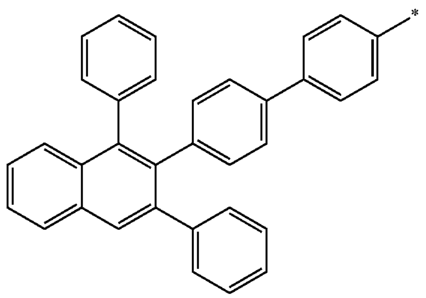 [SMILES: *c1ccc(-c2ccc(-c3c(-c4ccccc4)cc4ccccc4c3-c3ccccc3)cc2)cc1] | 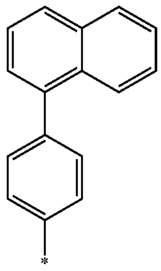 | 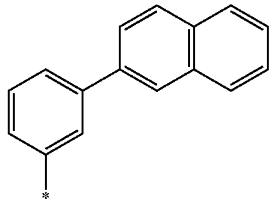 |
| 3-D1-55 | 1 | 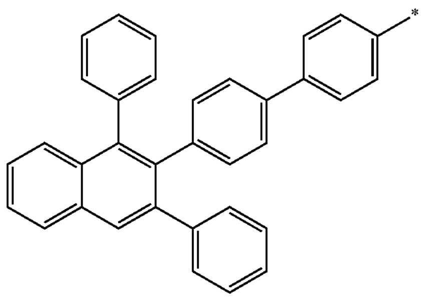 [SMILES: *c1ccc(-c2ccc(-c3c(-c4ccccc4)cc4ccccc4c3-c3ccccc3)cc2)cc1] | 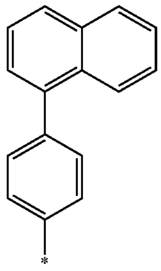 | 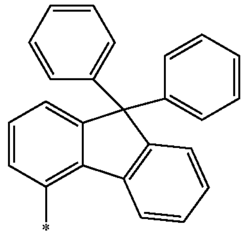 |
| 3-D1-56 | 1 | 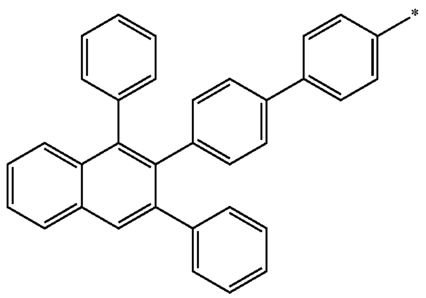 [SMILES: *c1ccc(-c2ccc(-c3c(-c4ccccc4)cc4ccccc4c3-c3ccccc3)cc2)cc1] | 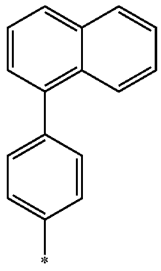 | 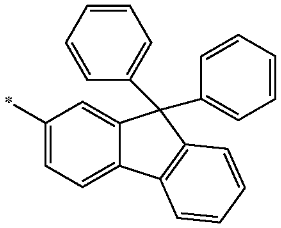 |

-continued
| [Compound Group 1] | | | | |
|---|---|---|---|---|
| | n | A—L—* | $Ar_1$ | $Ar_2$ |
| 3-D1-57 | 1 | 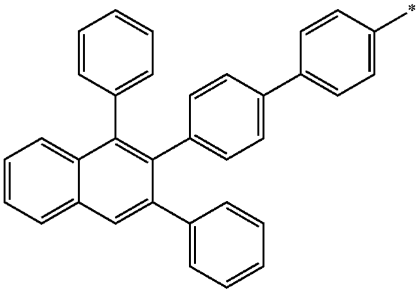 [SMILES: *c1ccc(-c2ccc(-c3c(-c4ccccc4)cc4ccccc4c3-c3ccccc3)cc2)cc1] | 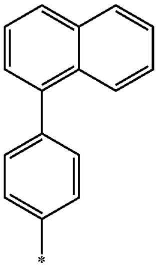 | 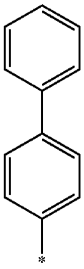 |
| 3-D1-58 | 1 | 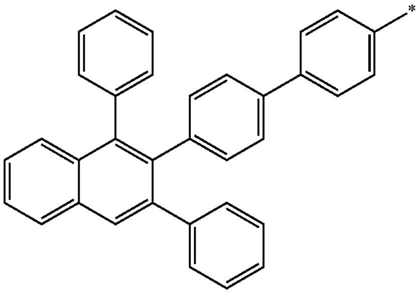 [SMILES: *c1ccc(-c2ccc(-c3c(-c4ccccc4)cc4ccccc4c3-c3ccccc3)cc2)cc1] | 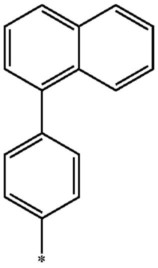 | 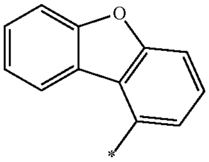 |
| 3-D1-59 | 1 | 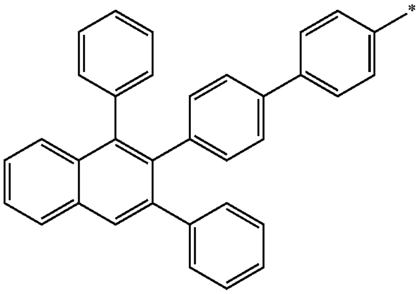 [SMILES: *c1ccc(-c2ccc(-c3c(-c4ccccc4)cc4ccccc4c3-c3ccccc3)cc2)cc1] | 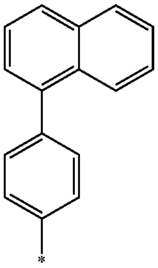 | 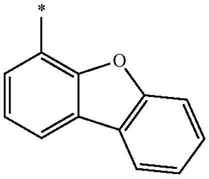 |
| 3-D1-60 | 1 | 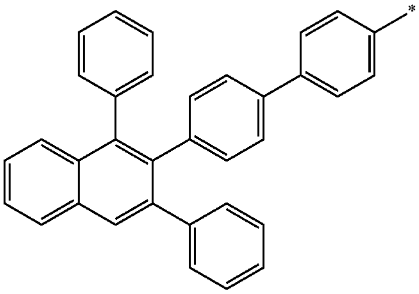 [SMILES: *c1ccc(-c2ccc(-c3c(-c4ccccc4)cc4ccccc4c3-c3ccccc3)cc2)cc1] | 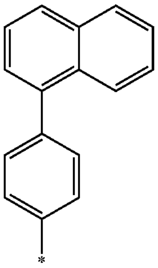 | 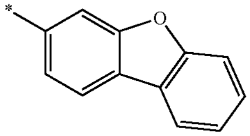 |
| 3-D1-61 | 1 | 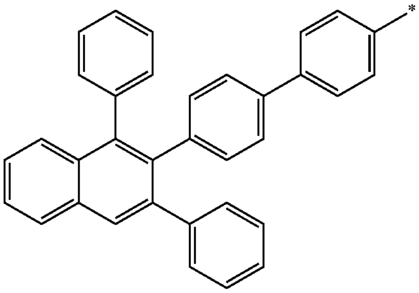 [SMILES: *c1ccc(-c2ccc(-c3c(-c4ccccc4)cc4ccccc4c3-c3ccccc3)cc2)cc1] | 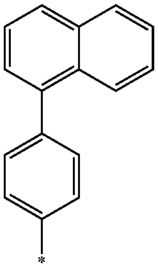 | 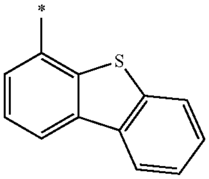 |

-continued
[Compound Group 1]
| | n | A—L—* | $Ar_1$ | $Ar_2$ |
|---|---|---|---|---|
| 3-D1-62 | 1 | 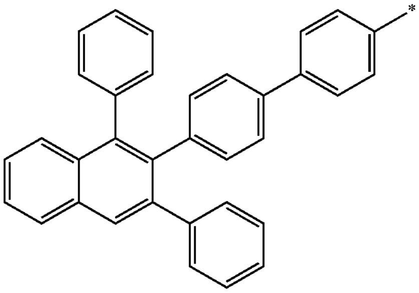 [SMILES: *c1ccc(-c2ccc(-c3c(-c4ccccc4)cc4ccccc4c3-c3ccccc3)cc2)cc1] | 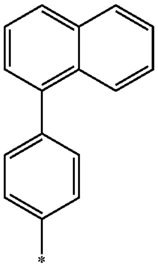 | 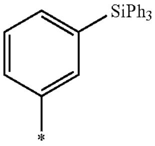 |
| 3-D1-63 | 1 | 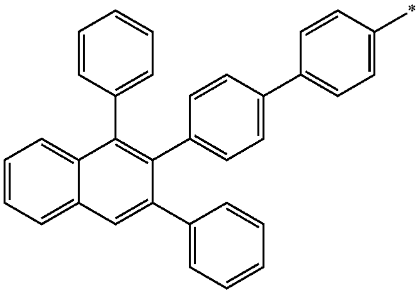 [SMILES: *c1ccc(-c2ccc(-c3c(-c4ccccc4)cc4ccccc4c3-c3ccccc3)cc2)cc1] | 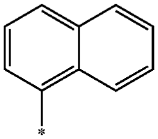 | 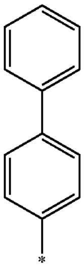 |
| 3-D1-64 | 1 | 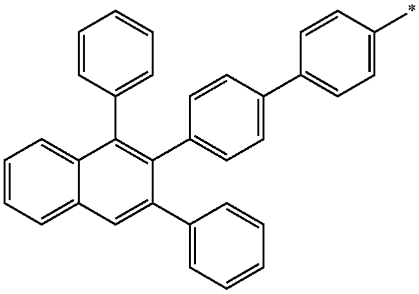 [SMILES: *c1ccc(-c2ccc(-c3c(-c4ccccc4)cc4ccccc4c3-c3ccccc3)cc2)cc1] | 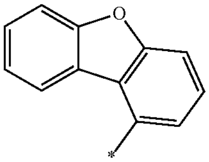 | 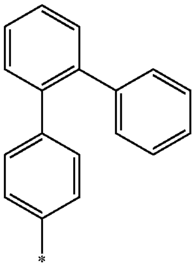 |
| 3-D1-65 | 1 | 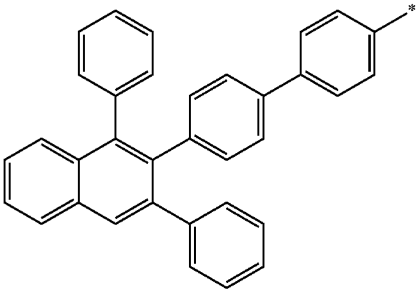 [SMILES: *c1ccc(-c2ccc(-c3c(-c4ccccc4)cc4ccccc4c3-c3ccccc3)cc2)cc1] | 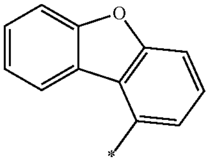 | 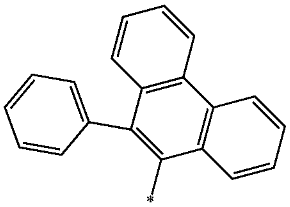 |
| 3-D1-66 | 1 | 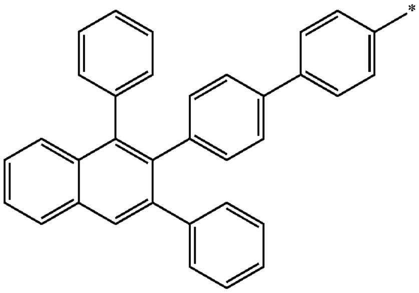 [SMILES: *c1ccc(-c2ccc(-c3c(-c4ccccc4)cc4ccccc4c3-c3ccccc3)cc2)cc1] | 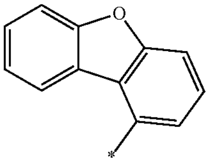 | 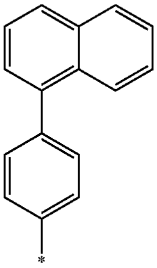 |

-continued
| [Compound Group 1] | | | | |
|---|---|---|---|---|
| | n | A—L—* | $Ar_1$ | $Ar_2$ |
| 3-D1-67 | 1 | 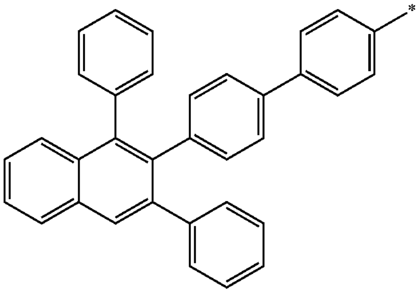 [SMILES: *c1ccc(-c2ccc(-c3c(-c4ccccc4)cc4ccccc4c3-c3ccccc3)cc2)cc1] | 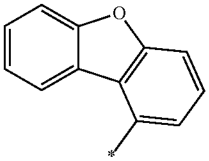 | 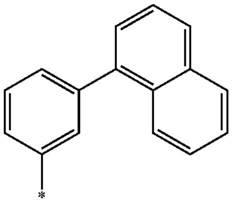 |
| 3-D1-68 | 1 | 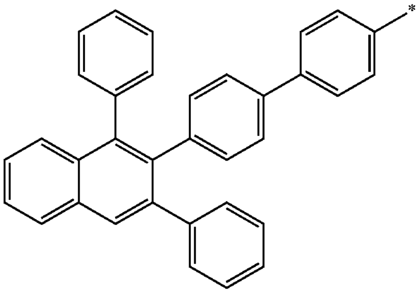 [SMILES: *c1ccc(-c2ccc(-c3c(-c4ccccc4)cc4ccccc4c3-c3ccccc3)cc2)cc1] | 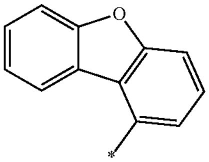 | 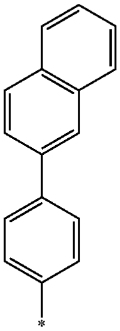 |
| 3-D1-69 | 1 | 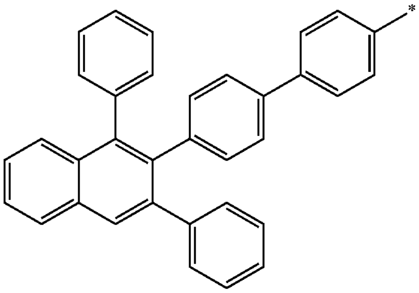 [SMILES: *c1ccc(-c2ccc(-c3c(-c4ccccc4)cc4ccccc4c3-c3ccccc3)cc2)cc1] | 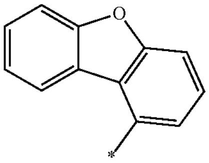 | 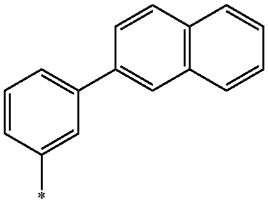 |
| 3-D1-70 | 1 | 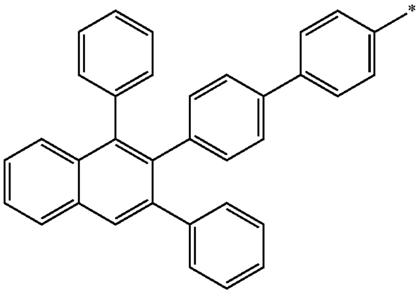 [SMILES: *c1ccc(-c2ccc(-c3c(-c4ccccc4)cc4ccccc4c3-c3ccccc3)cc2)cc1] | 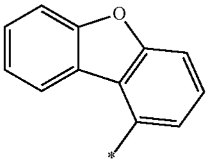 | 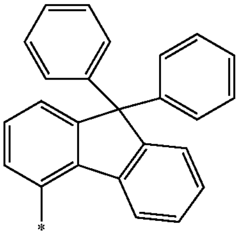 |
| 3-D1-71 | 1 | 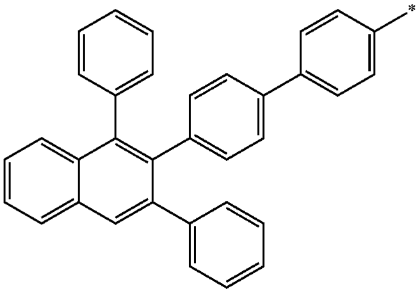 [SMILES: *c1ccc(-c2ccc(-c3c(-c4ccccc4)cc4ccccc4c3-c3ccccc3)cc2)cc1] | 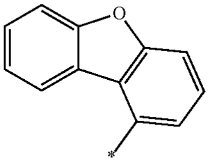 | 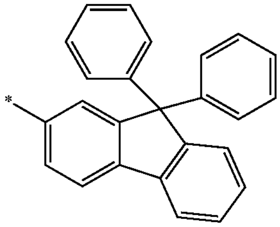 |

-continued
| [Compound Group 1] | | | | |
|---|---|---|---|---|
| | n | A—L—* | $Ar_1$ | $Ar_2$ |
| 3-D1-72 | 1 | 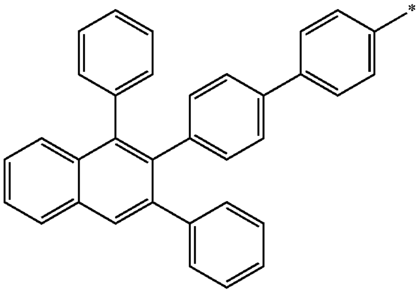 [SMILES: *c1ccc(-c2ccc(-c3c(-c4ccccc4)cc4ccccc4c3-c3ccccc3)cc2)cc1] | 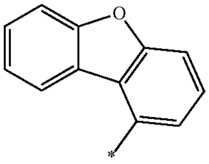 | 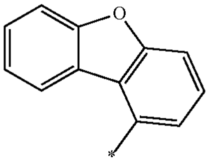 |
| 3-D1-73 | 1 | 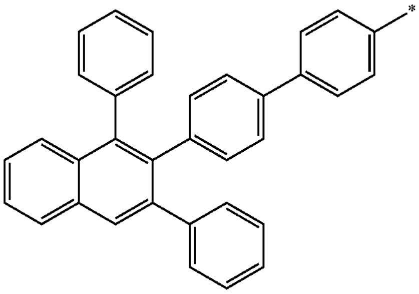 [SMILES: *c1ccc(-c2ccc(-c3c(-c4ccccc4)cc4ccccc4c3-c3ccccc3)cc2)cc1] | 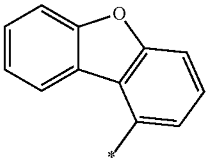 | 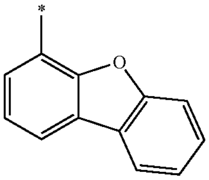 |
| 3-D1-74 | 1 | 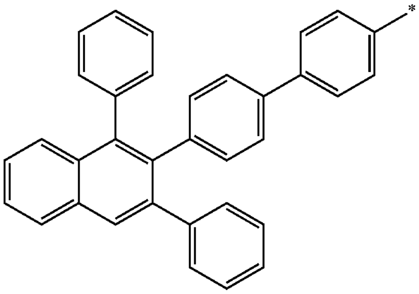 [SMILES: *c1ccc(-c2ccc(-c3c(-c4ccccc4)cc4ccccc4c3-c3ccccc3)cc2)cc1] | 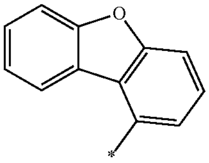 | 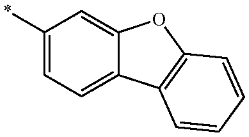 [SMILES: *c1ccc2c(c1)oc1ccccc12] |
| 3-D1-75 | 1 | 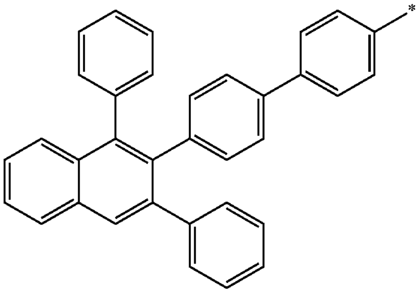 [SMILES: *c1ccc(-c2ccc(-c3c(-c4ccccc4)cc4ccccc4c3-c3ccccc3)cc2)cc1] | 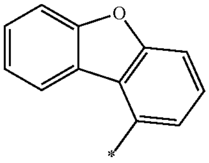 | 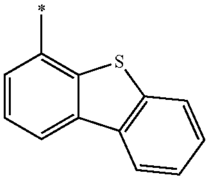 |
| 3-D1-76 | 1 | 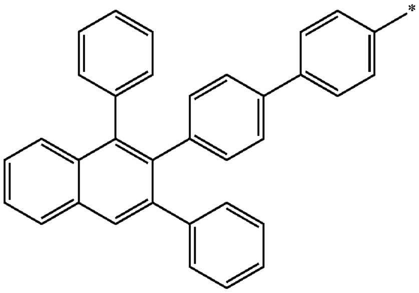 [SMILES: *c1ccc(-c2ccc(-c3c(-c4ccccc4)cc4ccccc4c3-c3ccccc3)cc2)cc1] | 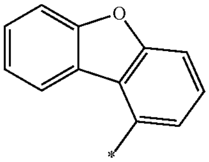 | 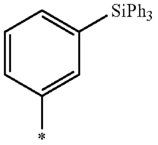 |

-continued
[Compound Group 1]
| | n | A—L—* | $Ar_1$ | $Ar_2$ |
|---|---|---|---|---|
| 3-D1-77 | 1 | 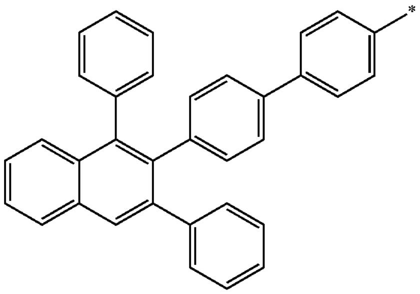 [SMILES: *c1ccc(-c2ccc(-c3c(-c4ccccc4)cc4ccccc4c3-c3ccccc3)cc2)cc1] | 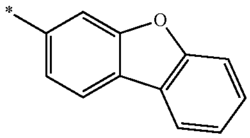 [SMILES: *c1ccc2c(c1)oc1ccccc12] | 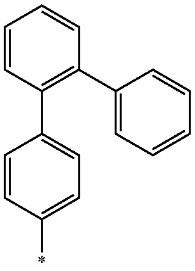 [SMILES: *c1ccc(-c2ccccc2-c2ccccc2)cc1] |
| 3-D1-78 | 1 | 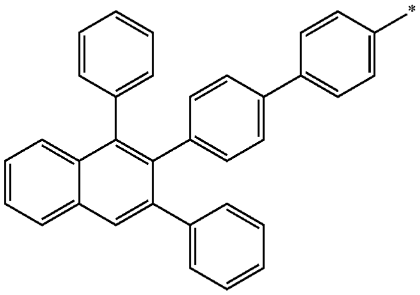 [SMILES: *c1ccc(-c2ccc(-c3c(-c4ccccc4)cc4ccccc4c3-c3ccccc3)cc2)cc1] | 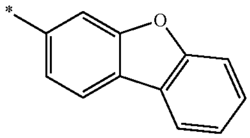 [SMILES: *c1ccc2c(c1)oc1ccccc12] | 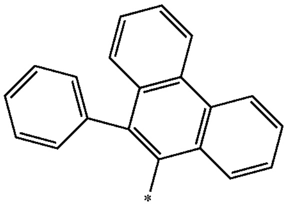 [SMILES: *c1c(-c2ccccc2)c2ccccc2c2ccccc12] |
| 3-D1-79 | 1 | 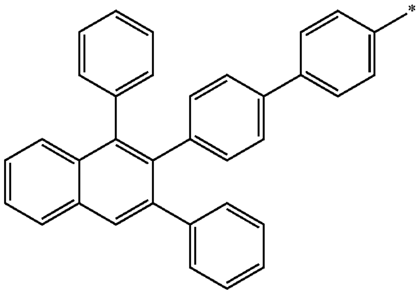 [SMILES: *c1ccc(-c2ccc(-c3c(-c4ccccc4)cc4ccccc4c3-c3ccccc3)cc2)cc1] | 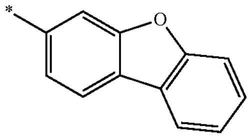 [SMILES: *c1ccc2c(c1)oc1ccccc12] | 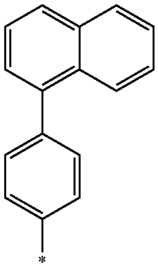 [SMILES: *c1ccc(-c2cccc3ccccc23)cc1] |
| 3-D1-80 | 1 | 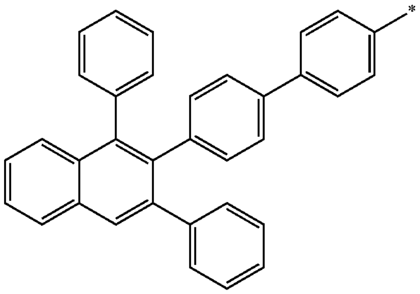 [SMILES: *c1ccc(-c2ccc(-c3c(-c4ccccc4)cc4ccccc4c3-c3ccccc3)cc2)cc1] | 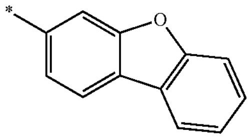 [SMILES: *c1ccc2c(c1)oc1ccccc12] | 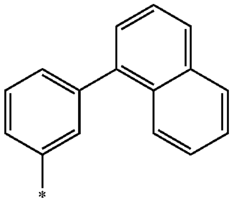 |
| 3-D1-81 | 1 | 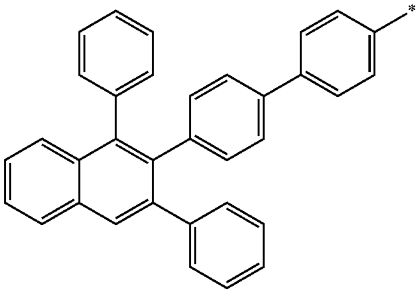 [SMILES: *c1ccc(-c2ccc(-c3c(-c4ccccc4)cc4ccccc4c3-c3ccccc3)cc2)cc1] | 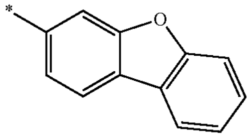 [SMILES: *c1ccc2c(c1)oc1ccccc12] | 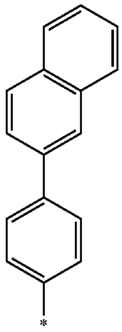 [SMILES: *c1ccc(-c2ccc3ccccc3c2)cc1] |

-continued
| [Compound Group 1] | | | | |
|---|---|---|---|---|
| | n | A—L—* | $Ar_1$ | $Ar_2$ |
| 3-D1-82 | 1 | 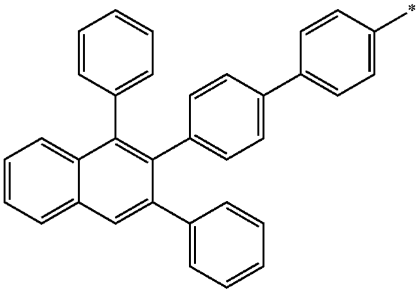 [SMILES: *c1ccc(-c2ccc(-c3c(-c4ccccc4)cc4ccccc4c3-c3ccccc3)cc2)cc1] | 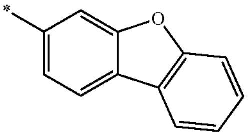 [SMILES: *c1ccc2c(c1)oc1ccccc12] | 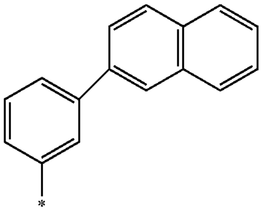 [SMILES: *c1cccc(-c2ccc3ccccc3c2)c1] |
| 3-D1-83 | 1 | 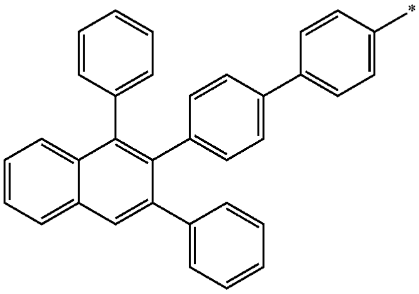 [SMILES: *c1ccc(-c2ccc(-c3c(-c4ccccc4)cc4ccccc4c3-c3ccccc3)cc2)cc1] | 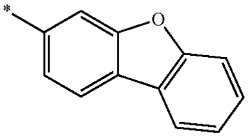 [SMILES: *c1ccc2c(c1)oc1ccccc12] | 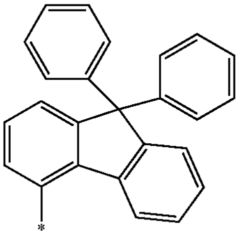 |
| 3-D1-84 | 1 | 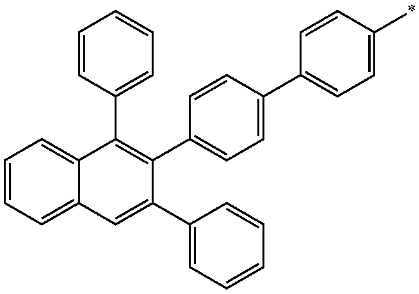 [SMILES: *c1ccc(-c2ccc(-c3c(-c4ccccc4)cc4ccccc4c3-c3ccccc3)cc2)cc1] | 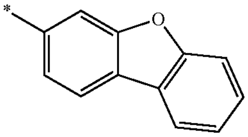 [SMILES: *c1ccc2c(c1)oc1ccccc12] | 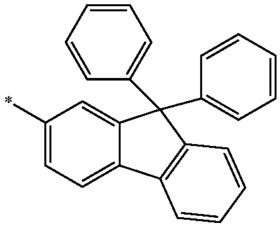 |
| 3-D1-85 | 1 | 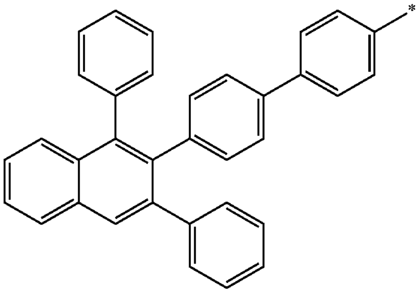 [SMILES: *c1ccc(-c2ccc(-c3c(-c4ccccc4)cc4ccccc4c3-c3ccccc3)cc2)cc1] | 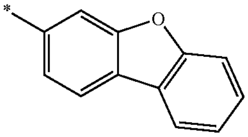 [SMILES: *c1ccc2c(c1)oc1ccccc12] | 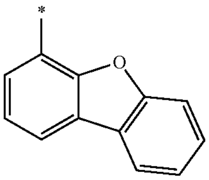 |
| 3-D1-86 | 1 | 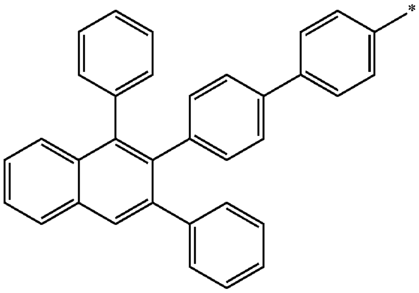 [SMILES: *c1ccc(-c2ccc(-c3c(-c4ccccc4)cc4ccccc4c3-c3ccccc3)cc2)cc1] | 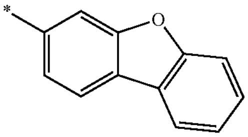 [SMILES: *c1ccc2c(c1)oc1ccccc12] | 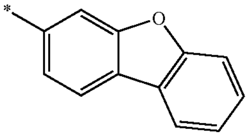 |

-continued
| [Compound Group 1] | | | | |
|---|---|---|---|---|
| | n | A—L—* | $Ar_1$ | $Ar_2$ |
| 3-D1-87 | 1 | 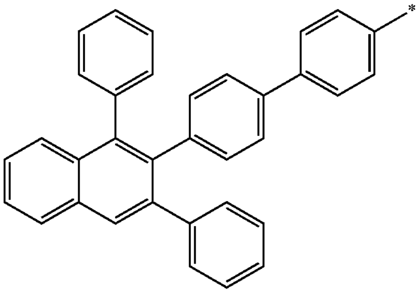 [SMILES: *c1ccc(-c2ccc(-c3c(-c4ccccc4)cc4ccccc4c3-c3ccccc3)cc2)cc1] | 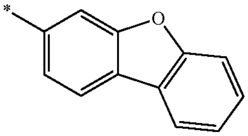 [SMILES: *c1ccc2c(c1)oc1ccccc12] | 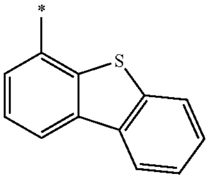 |
| 3-D1-88 | 1 | 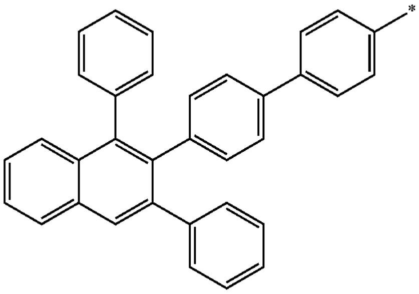 [SMILES: *c1ccc(-c2ccc(-c3c(-c4ccccc4)cc4ccccc4c3-c3ccccc3)cc2)cc1] | 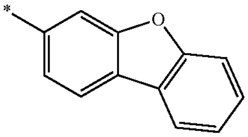 [SMILES: *c1ccc2c(c1)oc1ccccc12] | 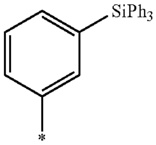 |
| 3-D1-89 | 1 | 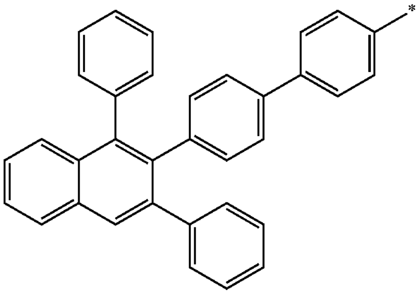 [SMILES: *c1ccc(-c2ccc(-c3c(-c4ccccc4)cc4ccccc4c3-c3ccccc3)cc2)cc1] | 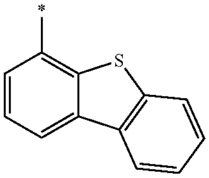 | 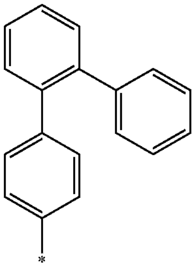 |
| 3-D1-90 | 1 | 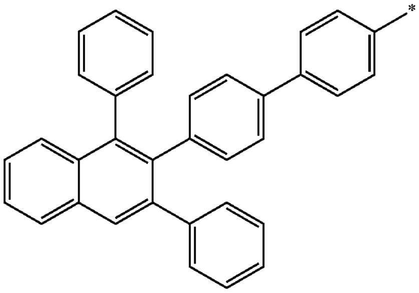 [SMILES: *c1ccc(-c2ccc(-c3c(-c4ccccc4)cc4ccccc4c3-c3ccccc3)cc2)cc1] | 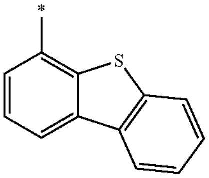 | 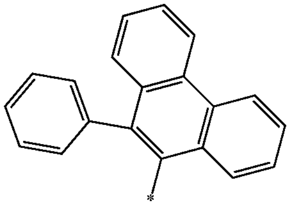 |
| 3-D1-91 | 1 | 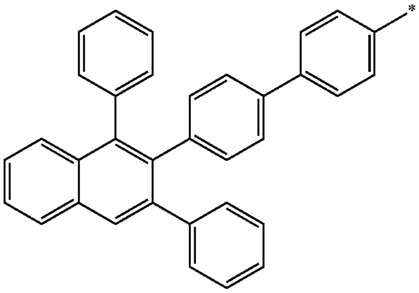 [SMILES: *c1ccc(-c2ccc(-c3c(-c4ccccc4)cc4ccccc4c3-c3ccccc3)cc2)cc1] | 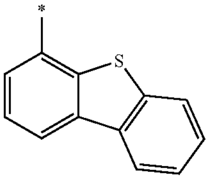 | 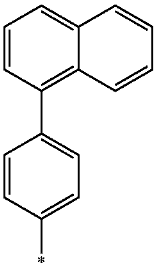 |

-continued
[Compound Group 1]
| | n | A—L—* | $Ar_1$ | $Ar_2$ |
|---|---|---|---|---|
| 3-D1-92 | 1 | 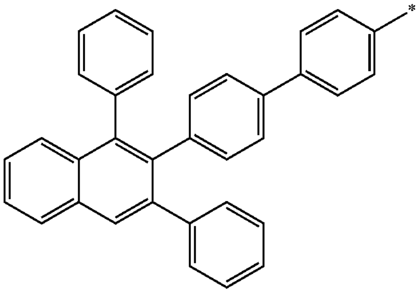 [SMILES: *c1ccc(-c2ccc(-c3c(-c4ccccc4)cc4ccccc4c3-c3ccccc3)cc2)cc1] | 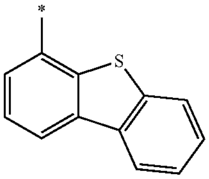 | 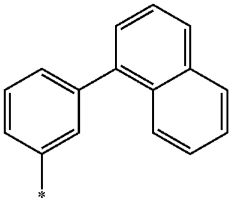 |
| 3-D1-93 | 1 | 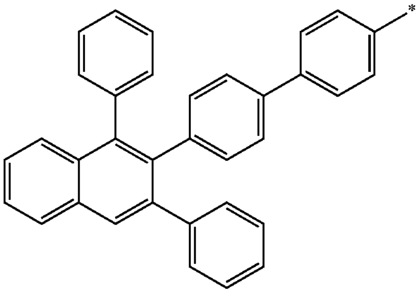 [SMILES: *c1ccc(-c2ccc(-c3c(-c4ccccc4)cc4ccccc4c3-c3ccccc3)cc2)cc1] | 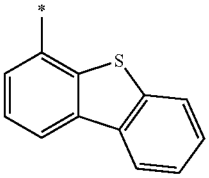 | 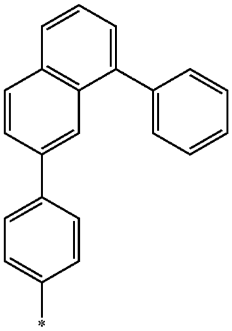 |
| 3-D1-94 | 1 | 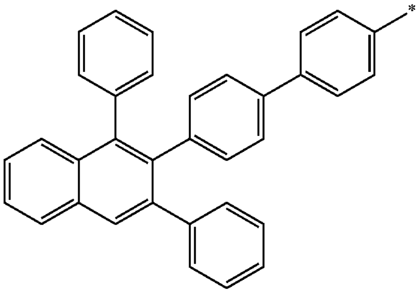 [SMILES: *c1ccc(-c2ccc(-c3c(-c4ccccc4)cc4ccccc4c3-c3ccccc3)cc2)cc1] | 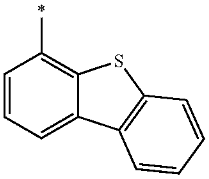 | 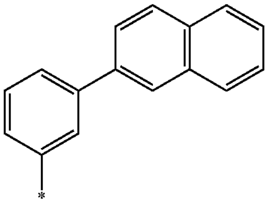 |
| 3-D1-95 | 1 | 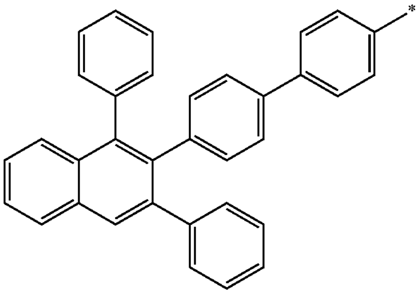 [SMILES: *c1ccc(-c2ccc(-c3c(-c4ccccc4)cc4ccccc4c3-c3ccccc3)cc2)cc1] | 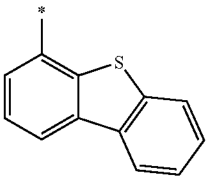 | 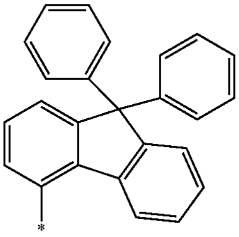 |
| 3-D1-96 | 1 | 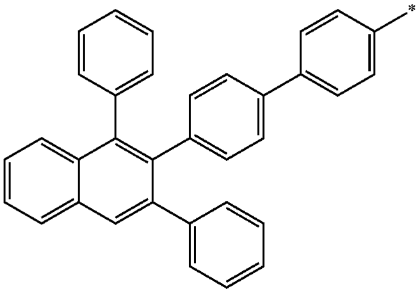 [SMILES: *c1ccc(-c2ccc(-c3c(-c4ccccc4)cc4ccccc4c3-c3ccccc3)cc2)cc1] | 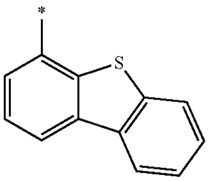 | 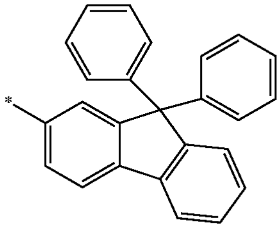 |

-continued
[Compound Group 1]
| | n | A—L—* | $Ar_1$ | $Ar_2$ |
|---|---|---|---|---|
| 3-D1-97 | 1 | 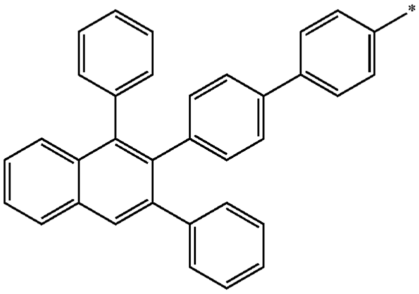 [SMILES: *c1ccc(-c2ccc(-c3c(-c4ccccc4)cc4ccccc4c3-c3ccccc3)cc2)cc1] | 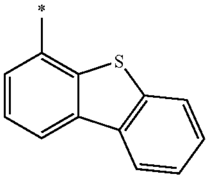 | 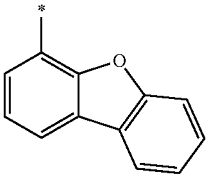 |
| 3-D1-98 | 1 | 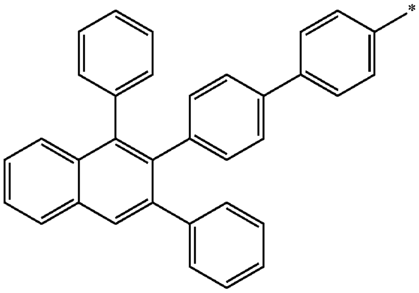 [SMILES: *c1ccc(-c2ccc(-c3c(-c4ccccc4)cc4ccccc4c3-c3ccccc3)cc2)cc1] | 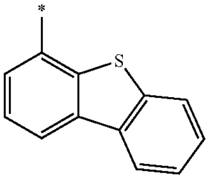 | 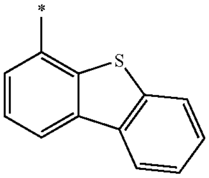 |
| 3-D1-99 | 1 | 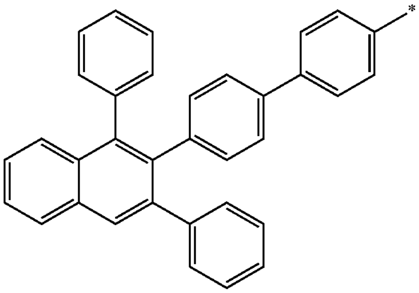 [SMILES: *c1ccc(-c2ccc(-c3c(-c4ccccc4)cc4ccccc4c3-c3ccccc3)cc2)cc1] | 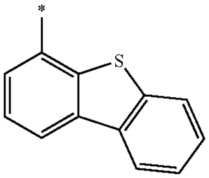 | 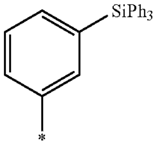 |
| 4-D1-1 | 1 | 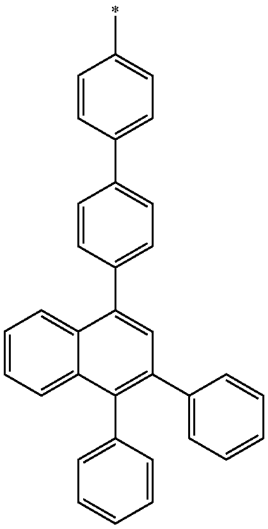 [SMILES: *c1ccc(-c2ccc(-c3cc(-c4ccccc4)c(-c4ccccc4)c4ccccc34)cc2)cc1] | 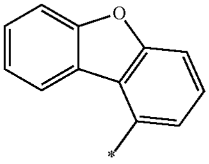 | 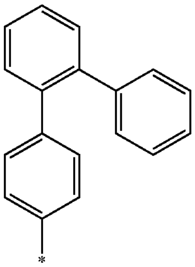 |

-continued
| [Compound Group 1] | | | | |
|---|---|---|---|---|
| | n | A—L—* | $Ar_1$ | $Ar_2$ |
| 4-D1-2 | 1 | 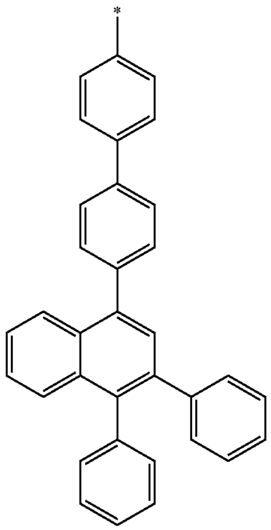 [SMILES: *c1ccc(-c2ccc(-c3cc(-c4ccccc4)c(-c4ccccc4)c4ccccc34)cc2)cc1] | 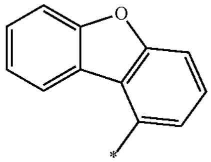 | 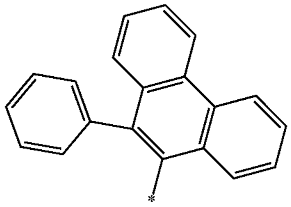 |
| 4-D1-3 | 1 | 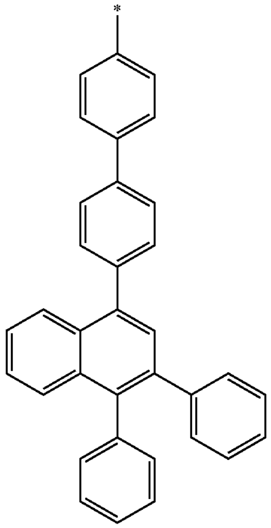 [SMILES: *c1ccc(-c2ccc(-c3cc(-c4ccccc4)c(-c4ccccc4)c4ccccc34)cc2)cc1] | 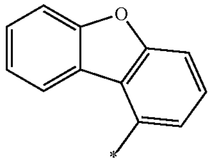 | 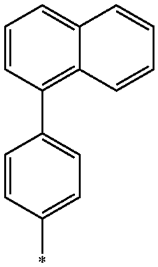 |

-continued
| [Compound Group 1] | | | | |
| --- | --- | --- | --- | --- |
| | n | A—L—* | $Ar_1$ | $Ar_2$ |
| 4-D1-4 | 1 | 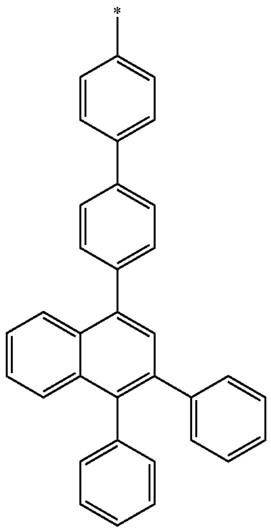 [SMILES: *c1ccc(-c2ccc(-c3cc(-c4ccccc4)c(-c4ccccc4)c4ccccc34)cc2)cc1] | 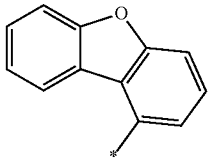 | 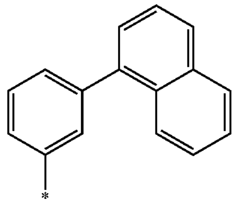 |
| 4-D1-5 | 1 | 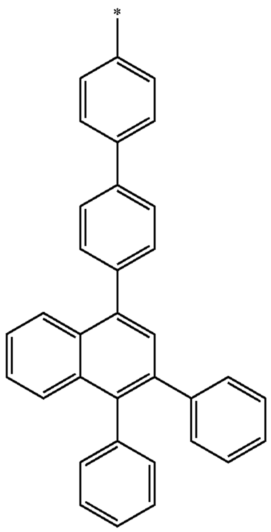 [SMILES: *c1ccc(-c2ccc(-c3cc(-c4ccccc4)c(-c4ccccc4)c4ccccc34)cc2)cc1] | 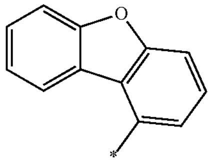 | 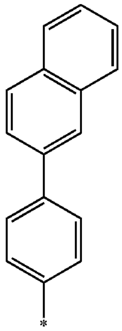 |

-continued
[Compound Group 1]
| | n | A—L—* | $Ar_1$ | $Ar_2$ |
|---|---|---|---|---|
| 4-D1-6 | 1 | 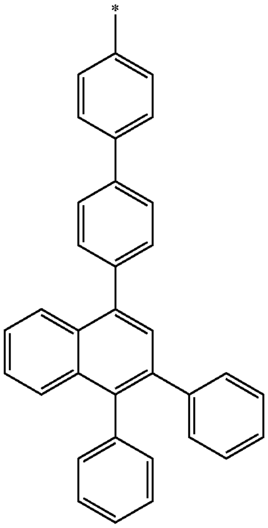 [SMILES: *c1ccc(-c2ccc(-c3cc(-c4ccccc4)c(-c4ccccc4)c4ccccc34)cc2)cc1] | 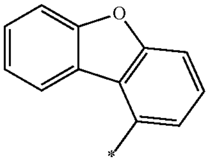 | 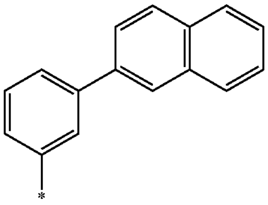 |
| 4-D1-7 | 1 | 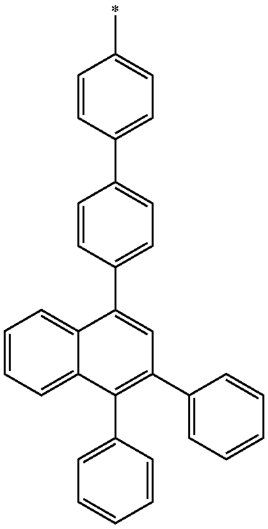 [SMILES: *c1ccc(-c2ccc(-c3cc(-c4ccccc4)c(-c4ccccc4)c4ccccc34)cc2)cc1] | 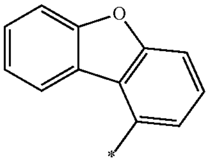 | 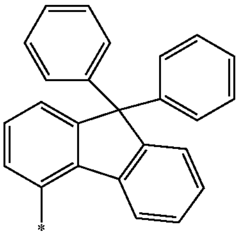 |

-continued
| | n | A—L—* | $Ar_1$ | $Ar_2$ |
|---|---|---|---|---|
| [Compound Group 1] | | | | |
| 4-D1-8 | 1 | 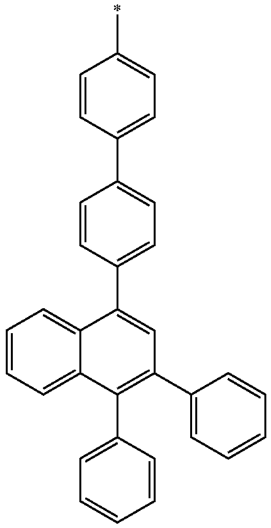 [SMILES: *c1ccc(-c2ccc(-c3cc(-c4ccccc4)c(-c4ccccc4)c4ccccc34)cc2)cc1] | 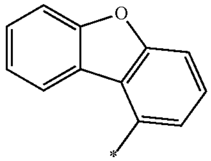 | 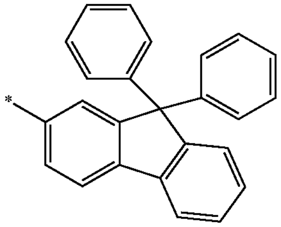 |
| 4-D1-9 | 1 | 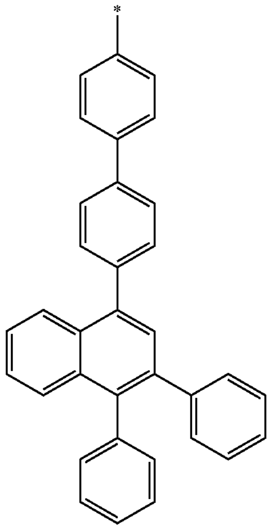 [SMILES: *c1ccc(-c2ccc(-c3cc(-c4ccccc4)c(-c4ccccc4)c4ccccc34)cc2)cc1] | 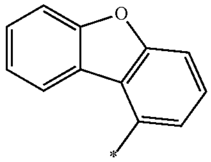 | 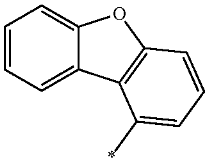 |

-continued
| [Compound Group 1] | n | A—L—* | $Ar_1$ | $Ar_2$ |
|---|---|---|---|---|
| 4-D1-10 | 1 | 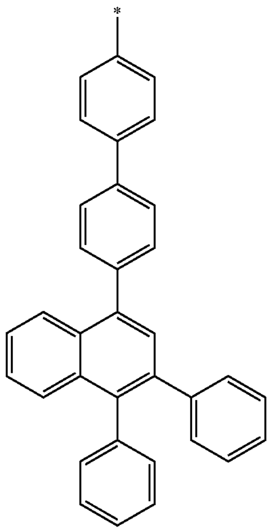 [SMILES: *c1ccc(-c2ccc(-c3cc(-c4ccccc4)c(-c4ccccc4)c4ccccc34)cc2)cc1] | 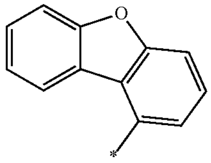 | 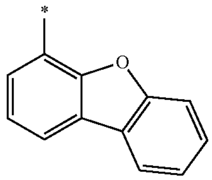 |
| 4-D1-11 | 1 | 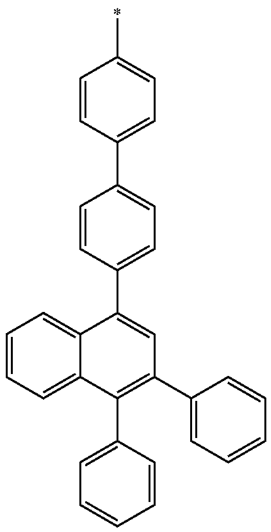 [SMILES: *c1ccc(-c2ccc(-c3cc(-c4ccccc4)c(-c4ccccc4)c4ccccc34)cc2)cc1] | 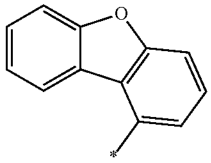 | 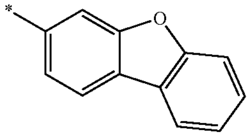 |

-continued
[Compound Group 1]
| | n | A—L—* | $Ar_1$ | $Ar_2$ |
|---|---|---|---|---|
| 4-D1-12 | 1 | 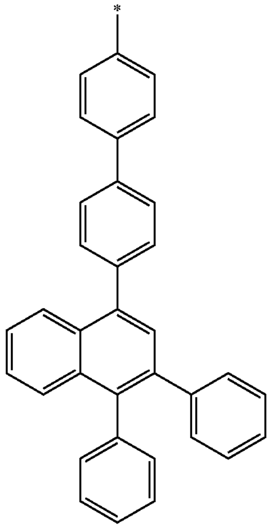 [SMILES: *c1ccc(-c2ccc(-c3cc(-c4ccccc4)c(-c4ccccc4)c4ccccc34)cc2)cc1] | 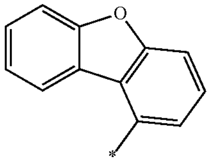 | 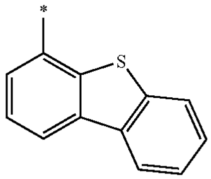 |
| 4-D1-13 | 1 | 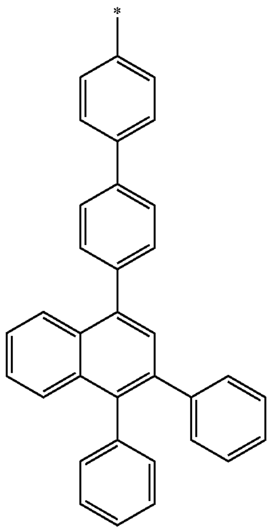 [SMILES: *c1ccc(-c2ccc(-c3cc(-c4ccccc4)c(-c4ccccc4)c4ccccc34)cc2)cc1] | 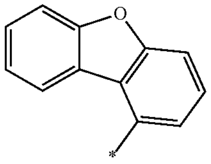 | 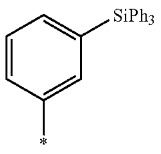 |

-continued
| [Compound Group 1] | | | | |
|---|---|---|---|---|
| | n | A—L—* | $Ar_1$ | $Ar_2$ |
| 4-D1-14 | 1 | 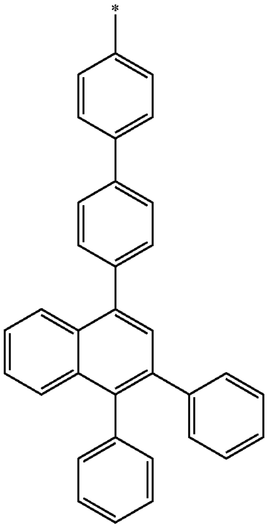 [SMILES: *c1ccc(-c2ccc(-c3cc(-c4ccccc4)c(-c4ccccc4)c4ccccc34)cc2)cc1] | 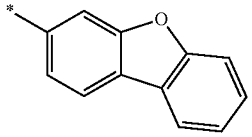 [SMILES: *c1ccc2c(c1)oc1ccccc12] | 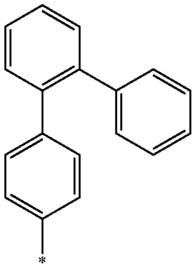 |
| 4-D1-15 | 1 | 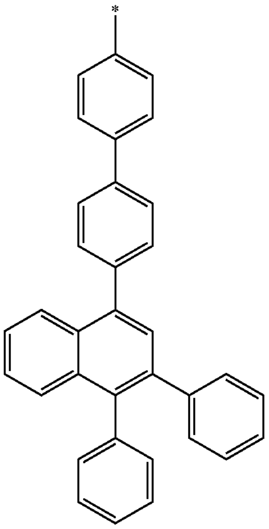 [SMILES: *c1ccc(-c2ccc(-c3cc(-c4ccccc4)c(-c4ccccc4)c4ccccc34)cc2)cc1] | 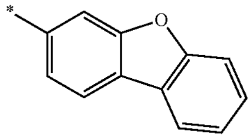 [SMILES: *c1ccc2c(c1)oc1ccccc12] | 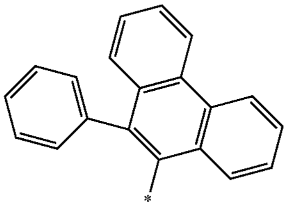 [SMILES: *c1c(-c2ccccc2)c2ccccc2c2ccccc12] |

-continued
| [Compound Group 1] | | | | |
|---|---|---|---|---|
| | n | A—L—* | $Ar_1$ | $Ar_2$ |
| 4-D1-16 | 1 | 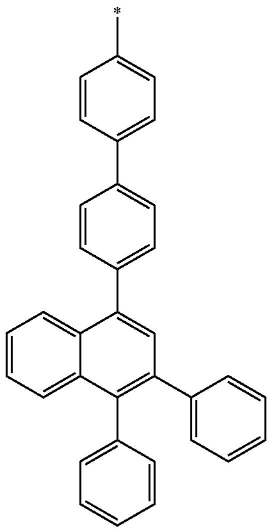 [SMILES: *c1ccc(-c2ccc(-c3cc(-c4ccccc4)c(-c4ccccc4)c4ccccc34)cc2)cc1] | 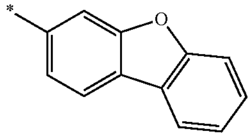 [SMILES: *c1ccc2c(c1)oc1ccccc12] | 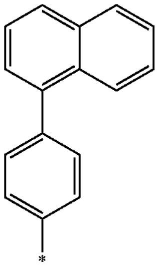 [SMILES: *c1ccc(-c2cccc3ccccc23)cc1] |
| 4-D1-17 | 1 | 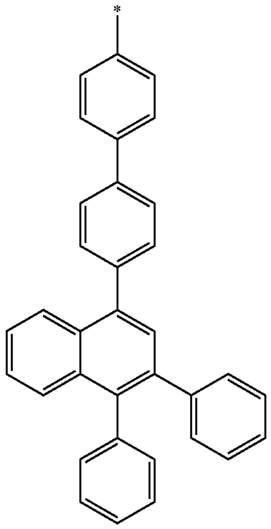 [SMILES: *c1ccc(-c2ccc(-c3cc(-c4ccccc4)c(-c4ccccc4)c4ccccc34)cc2)cc1] | 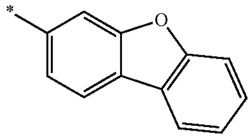 [SMILES: *c1ccc2c(c1)oc1ccccc12] | 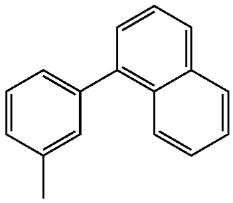 |

-continued
[Compound Group 1]
| | n | A—L—* | $Ar_1$ | $Ar_2$ |
|---|---|---|---|---|
| 4-D1-18 | 1 | 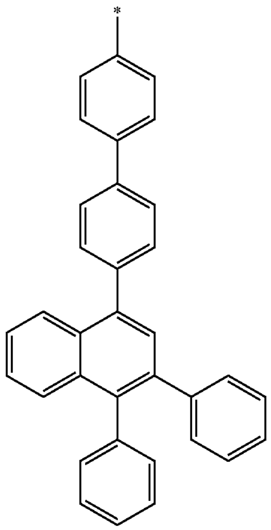 [SMILES: *c1ccc(-c2ccc(-c3cc(-c4ccccc4)c(-c4ccccc4)c4ccccc34)cc2)cc1] | 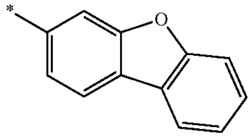 [SMILES: *c1ccc2c(c1)oc1ccccc12] | 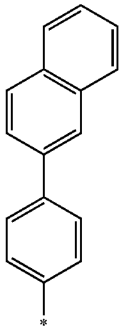 [SMILES: *c1ccc(-c2ccc3ccccc3c2)cc1] |
| 4-D1-19 | 1 | 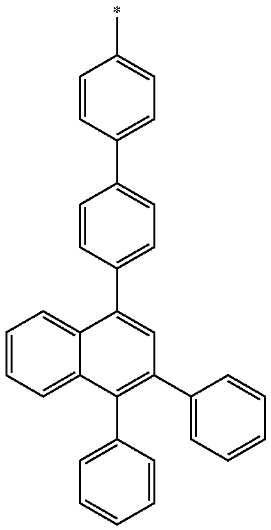 [SMILES: *c1ccc(-c2ccc(-c3cc(-c4ccccc4)c(-c4ccccc4)c4ccccc34)cc2)cc1] | 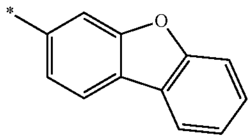 [SMILES: *c1ccc2c(c1)oc1ccccc12] | 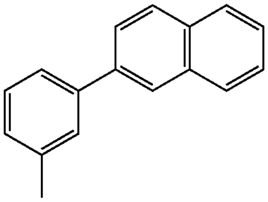 |

-continued
| [Compound Group 1] | | | | |
|---|---|---|---|---|
| | n | A—L—* | $Ar_1$ | $Ar_2$ |
| 4-D1-20 | 1 | 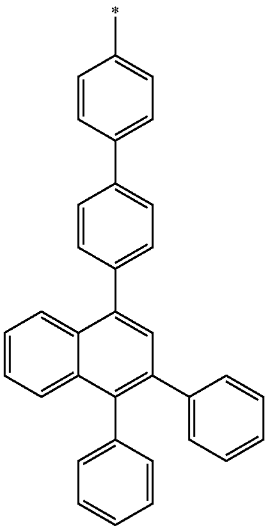 [SMILES: *c1ccc(-c2ccc(-c3cc(-c4ccccc4)c(-c4ccccc4)c4ccccc34)cc2)cc1] | 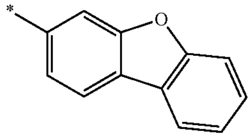 [SMILES: *c1ccc2c(c1)oc1ccccc12] | 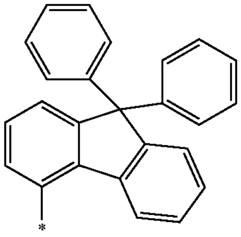 [SMILES: *c1cccc2c1-c1ccccc1C2(c1ccccc1)c1ccccc1] |
| 4-D1-21 | 1 | 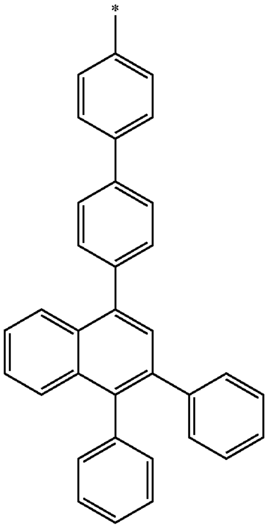 [SMILES: *c1ccc(-c2ccc(-c3cc(-c4ccccc4)c(-c4ccccc4)c4ccccc34)cc2)cc1] | 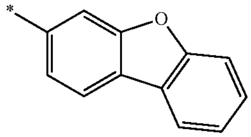 [SMILES: *c1ccc2c(c1)oc1ccccc12] | 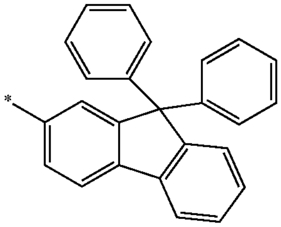 [SMILES: *c1ccc2c(c1)C(c1ccccc1)(c1ccccc1)c1ccccc1-2] |

-continued
| [Compound Group 1] | | | | |
|---|---|---|---|---|
| | n | A—L—* | $Ar_1$ | $Ar_2$ |
| 4-D1-22 | 1 | 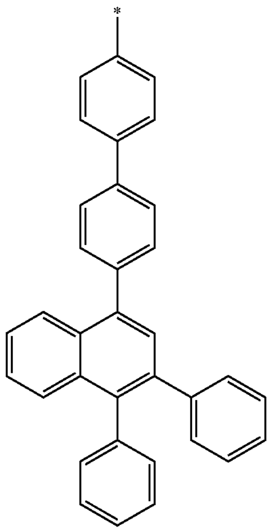 [SMILES: *c1ccc(-c2ccc(-c3cc(-c4ccccc4)c(-c4ccccc4)c4ccccc34)cc2)cc1] | 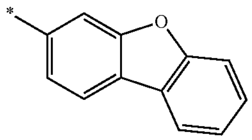 [SMILES: *c1ccc2c(c1)oc1ccccc12] | 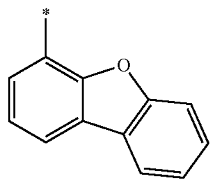 |
| 4-D1-23 | 1 | 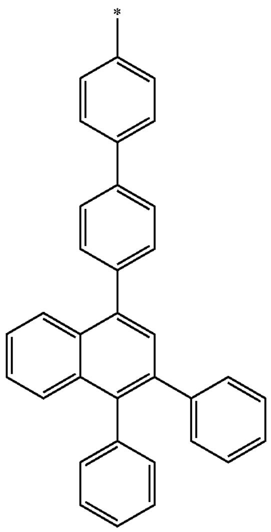 [SMILES: *c1ccc(-c2ccc(-c3cc(-c4ccccc4)c(-c4ccccc4)c4ccccc34)cc2)cc1] | 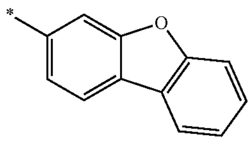 [SMILES: *c1ccc2c(c1)oc1ccccc12] | 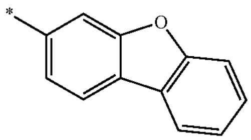 [SMILES: *c1ccc2c(c1)oc1ccccc12] |

-continued
| [Compound Group 1] | | | | |
|---|---|---|---|---|
| | n | A—L—* | $Ar_1$ | $Ar_2$ |
| 4-D1-24 | 1 | 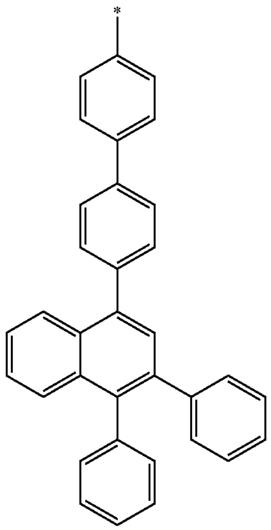 [SMILES: *c1ccc(-c2ccc(-c3cc(-c4ccccc4)c(-c4ccccc4)c4ccccc34)cc2)cc1] | 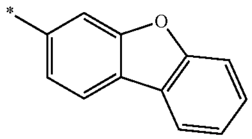 [SMILES: *c1ccc2c(c1)oc1ccccc12] | 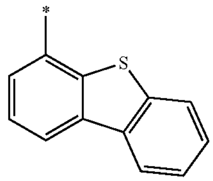 |
| 4-D1-25 | 1 | 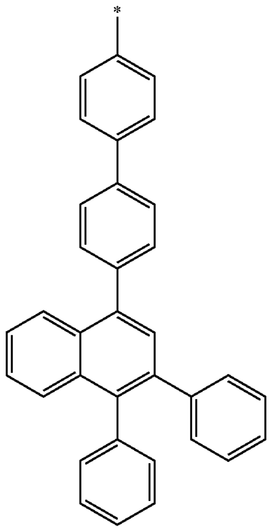 [SMILES: *c1ccc(-c2ccc(-c3cc(-c4ccccc4)c(-c4ccccc4)c4ccccc34)cc2)cc1] | 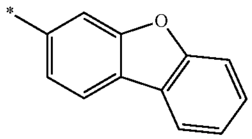 [SMILES: *c1ccc2c(c1)oc1ccccc12] | 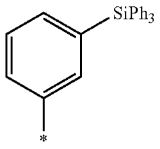 |

-continued
| [Compound Group 1] | | | | |
|---|---|---|---|---|
| | n | A—L—* | $Ar_1$ | $Ar_2$ |
| 4-D1-26 | 1 | 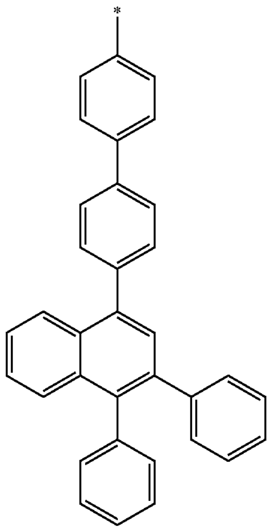 [SMILES: *c1ccc(-c2ccc(-c3cc(-c4ccccc4)c(-c4ccccc4)c4ccccc34)cc2)cc1] | 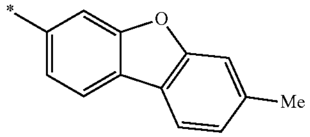 | 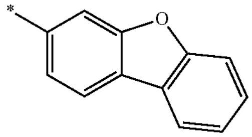 [SMILES: *c1ccc2c(c1)oc1ccccc12] |
| 4-D1-27 | 1 | 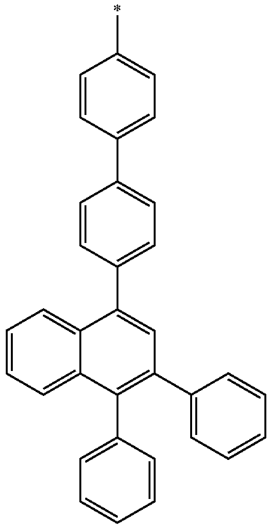 [SMILES: *c1ccc(-c2ccc(-c3cc(-c4ccccc4)c(-c4ccccc4)c4ccccc34)cc2)cc1] | 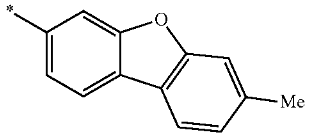 [SMILES: *c1ccc2c(c1)oc1cc(C)ccc12] | 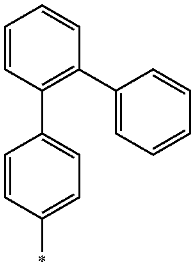 [SMILES: *c1ccc(-c2ccccc2-c2ccccc2)cc1] |

-continued
| [Compound Group 1] | | | | |
|---|---|---|---|---|
| | n | A—L—* | $Ar_1$ | $Ar_2$ |
| 4-D1-28 | 1 | 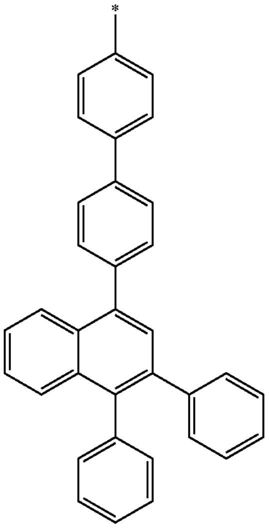 [SMILES: *c1ccc(-c2ccc(-c3cc(-c4ccccc4)c(-c4ccccc4)c4ccccc34)cc2)cc1] | 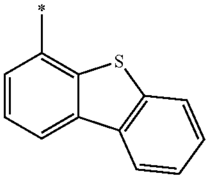 | 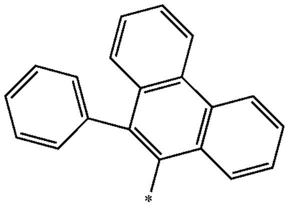 [SMILES: *c1c(-c2ccccc2)c2ccccc2c2ccccc12] |
| 4-D1-29 | 1 | 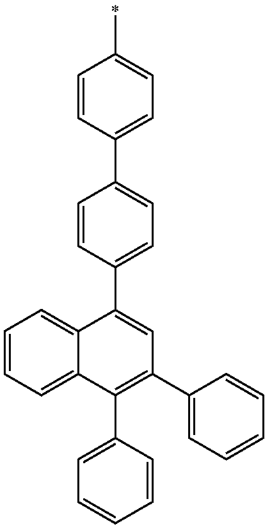 [SMILES: *c1ccc(-c2ccc(-c3cc(-c4ccccc4)c(-c4ccccc4)c4ccccc34)cc2)cc1] | 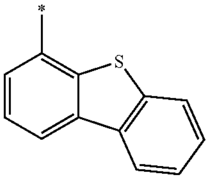 | 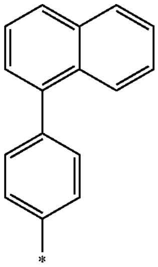 [SMILES: *c1ccc(-c2cccc3ccccc23)cc1] |

-continued
| [Compound Group 1] | | | | |
|---|---|---|---|---|
| | n | A—L—* | $Ar_1$ | $Ar_2$ |
| 4-D1-30 | 1 | 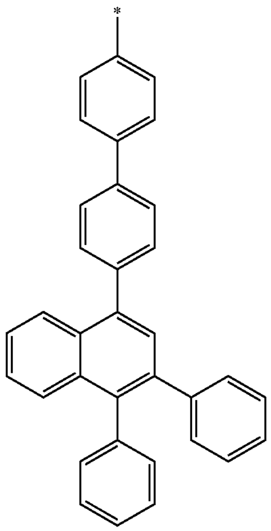 [SMILES: *c1ccc(-c2ccc(-c3cc(-c4ccccc4)c(-c4ccccc4)c4ccccc34)cc2)cc1] | 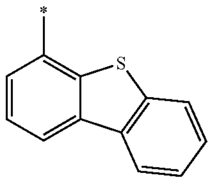 | 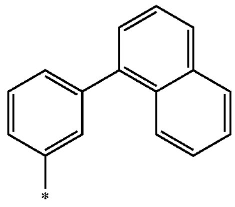 |
| 4-D1-31 | 1 | 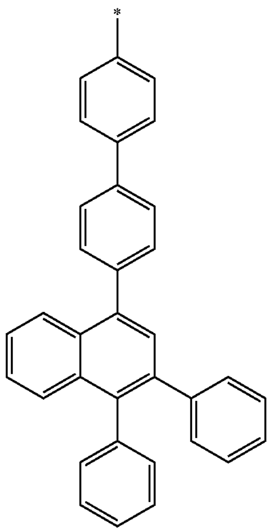 [SMILES: *c1ccc(-c2ccc(-c3cc(-c4ccccc4)c(-c4ccccc4)c4ccccc34)cc2)cc1] | 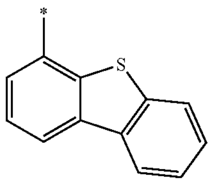 | 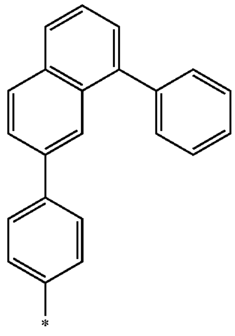 [SMILES: *c1ccc(-c2ccc3cccc(-c4ccccc4)c3c2)cc1] |

-continued
| [Compound Group 1] | | | | |
|---|---|---|---|---|
| | n | A—L—* | $Ar_1$ | $Ar_2$ |
| 4-D1-32 | 1 | 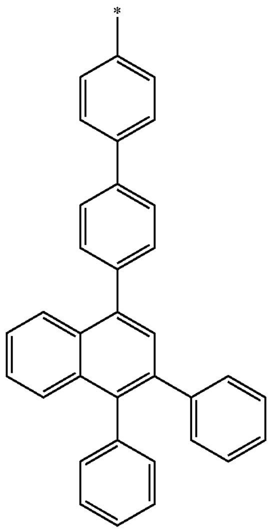 [SMILES: *c1ccc(-c2ccc(-c3cc(-c4ccccc4)c(-c4ccccc4)c4ccccc34)cc2)cc1] | 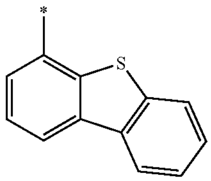 | 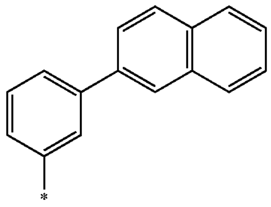 [SMILES: *c1cccc(-c2ccc3ccccc3c2)c1] |
| 4-D1-33 | 1 | 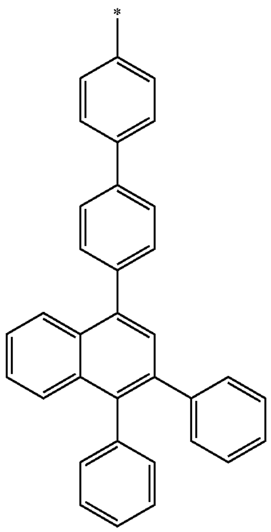 [SMILES: *c1ccc(-c2ccc(-c3cc(-c4ccccc4)c(-c4ccccc4)c4ccccc34)cc2)cc1] | 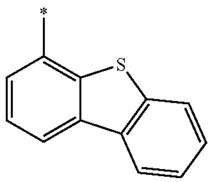 | 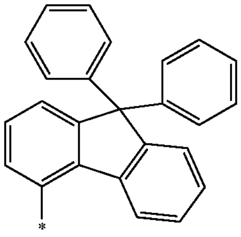 [SMILES: *c1cccc2c1-c1ccccc1C2(c1ccccc1)c1ccccc1] |

-continued
| [Compound Group 1] | | | | |
|---|---|---|---|---|
| | n | A—L—* | $Ar_1$ | $Ar_2$ |
| 4-D1-34 | 1 | 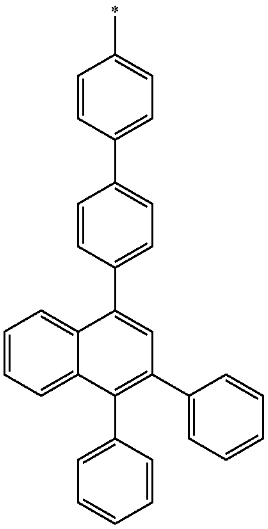 [SMILES: *c1ccc(-c2ccc(-c3cc(-c4ccccc4)c(-c4ccccc4)c4ccccc34)cc2)cc1] | 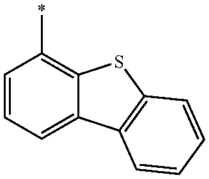 | 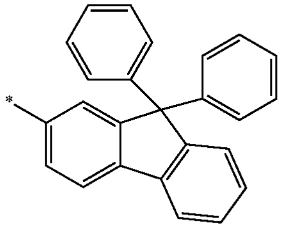 |
| 4-D1-35 | 1 | 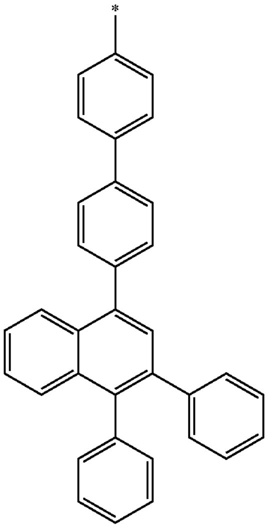 [SMILES: *c1ccc(-c2ccc(-c3cc(-c4ccccc4)c(-c4ccccc4)c4ccccc34)cc2)cc1] | 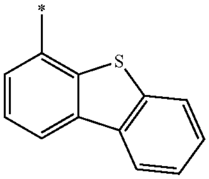 | 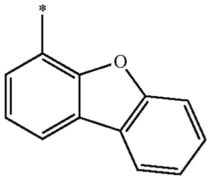 |

-continued
| [Compound Group 1] | | | | |
|---|---|---|---|---|
| | n | A—L—* | $Ar_1$ | $Ar_2$ |
| 4-D1-36 | 1 | 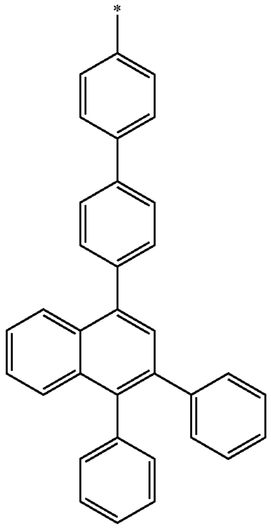 [SMILES: *c1ccc(-c2ccc(-c3cc(-c4ccccc4)c(-c4ccccc4)c4ccccc34)cc2)cc1] | 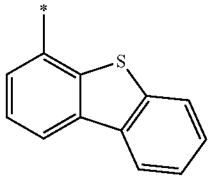 | 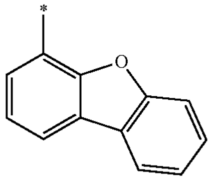 |
| 4-D1-37 | 1 | 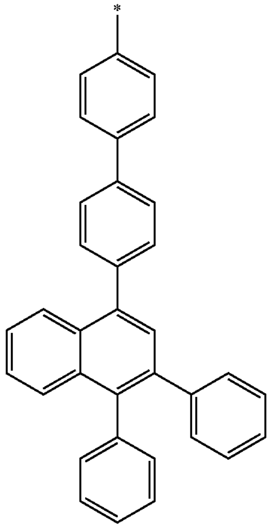 [SMILES: *c1ccc(-c2ccc(-c3cc(-c4ccccc4)c(-c4ccccc4)c4ccccc34)cc2)cc1] | 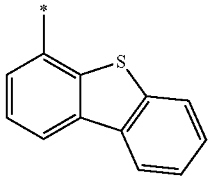 | 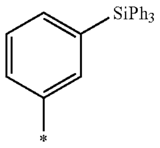 |
| 5-D1-1 | 1 | 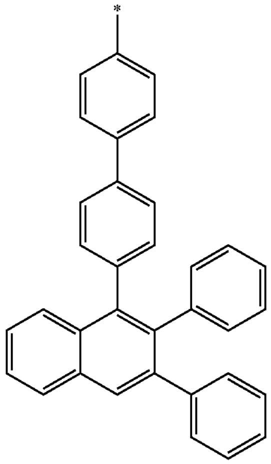 [SMILES: *c1ccc(-c2ccc(-c3c(-c4ccccc4)c(-c4ccccc4)cc4ccccc34)cc2)cc1] | 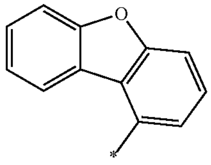 | 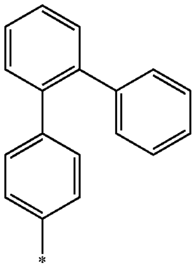 |

-continued
| [Compound Group 1] | | | | |
|---|---|---|---|---|
| | n | A—L—* | $Ar_1$ | $Ar_2$ |
| 5-D1-2 | 1 | 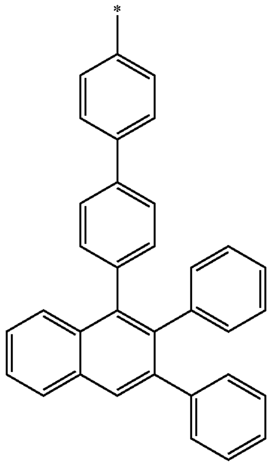 [SMILES: *c1ccc(-c2ccc(-c3c(-c4ccccc4)c(-c4ccccc4)cc4ccccc34)cc2)cc1] | 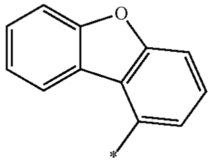 | 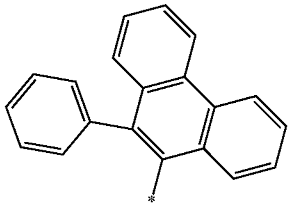 |
| 5-D1-3 | 1 | 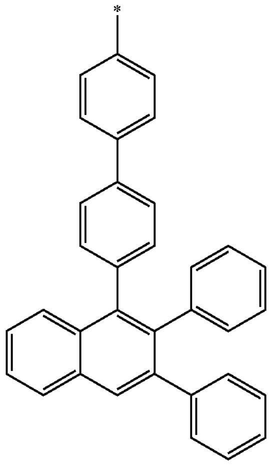 [SMILES: *c1ccc(-c2ccc(-c3c(-c4ccccc4)c(-c4ccccc4)cc4ccccc34)cc2)cc1] | 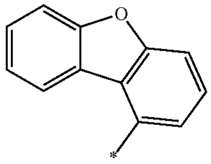 | 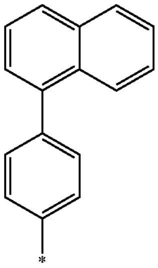 |
| 5-D1-4 | 1 | 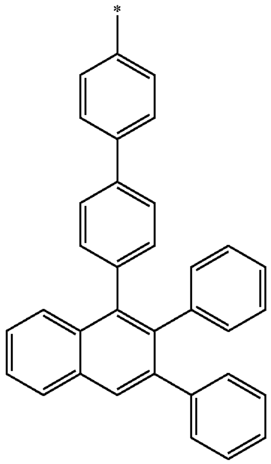 [SMILES: *c1ccc(-c2ccc(-c3c(-c4ccccc4)c(-c4ccccc4)cc4ccccc34)cc2)cc1] | 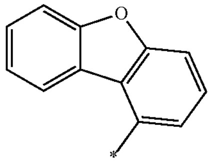 | 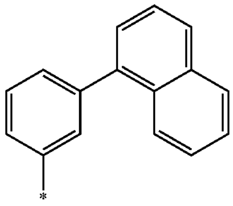 |

-continued
| [Compound Group 1] | | | | |
|---|---|---|---|---|
| | n | A—L—* | $Ar_1$ | $Ar_2$ |
| 5-D1-5 | 1 | 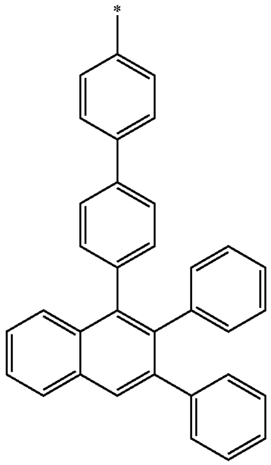 [SMILES: *c1ccc(-c2ccc(-c3c(-c4ccccc4)c(-c4ccccc4)cc4ccccc34)cc2)cc1] | 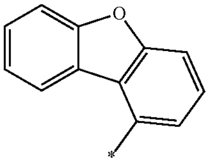 | 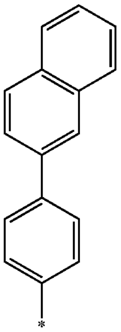 |
| 5-D1-6 | 1 | 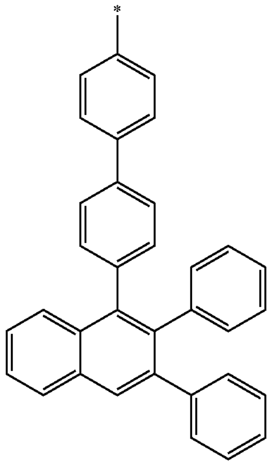 [SMILES: *c1ccc(-c2ccc(-c3c(-c4ccccc4)c(-c4ccccc4)cc4ccccc34)cc2)cc1] | 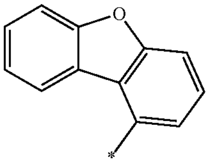 | 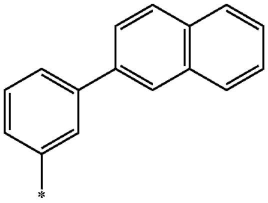 |
| 5-D1-7 | 1 | 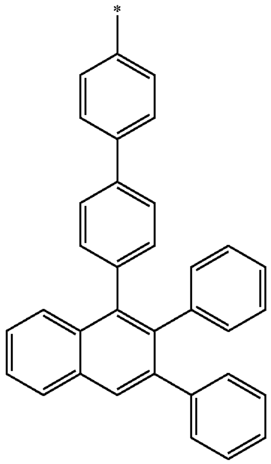 [SMILES: *c1ccc(-c2ccc(-c3c(-c4ccccc4)c(-c4ccccc4)cc4ccccc34)cc2)cc1] | 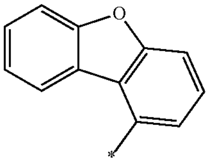 | 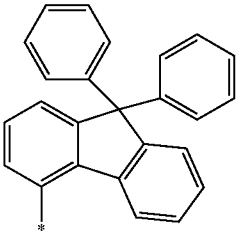 |

-continued
[Compound Group 1]
| | n | A—L—* | $Ar_1$ | $Ar_2$ |
|---|---|---|---|---|
| 5-D1-8 | 1 | 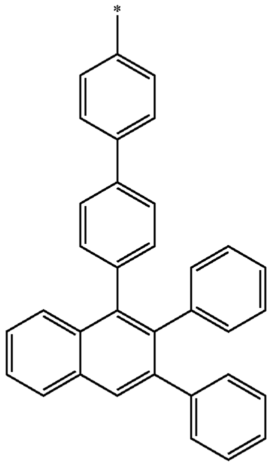 [SMILES: *c1ccc(-c2ccc(-c3c(-c4ccccc4)c(-c4ccccc4)cc4ccccc34)cc2)cc1] | 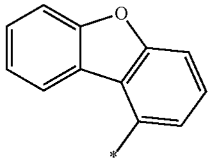 | 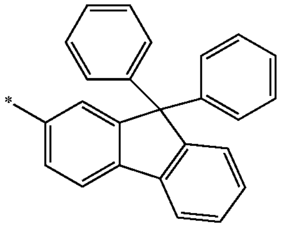 |
| 5-D1-9 | 1 | 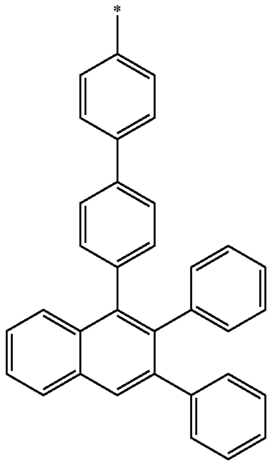 [SMILES: *c1ccc(-c2ccc(-c3c(-c4ccccc4)c(-c4ccccc4)cc4ccccc34)cc2)cc1] | 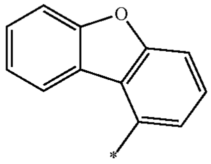 | 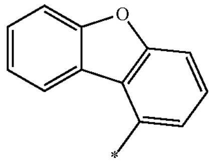 |
| 5-D1-10 | 1 | 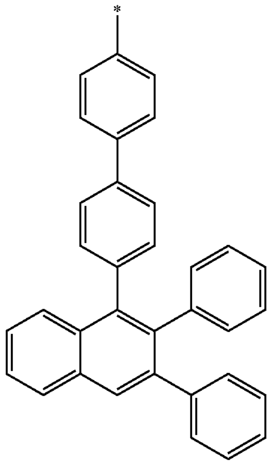 [SMILES: *c1ccc(-c2ccc(-c3c(-c4ccccc4)c(-c4ccccc4)cc4ccccc34)cc2)cc1] | 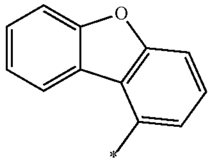 | 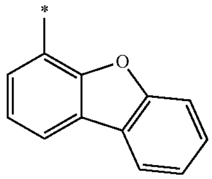 |

-continued
[Compound Group 1]
| | n | A—L—* | $Ar_1$ | $Ar_2$ |
| --- | --- | --- | --- | --- |
| 5-D1-11 | 1 | 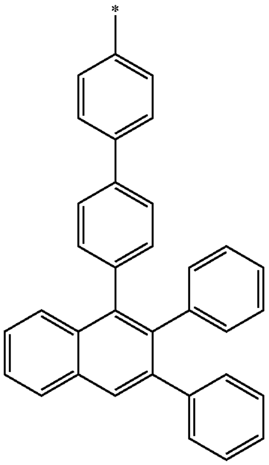 [SMILES: *c1ccc(-c2ccc(-c3c(-c4ccccc4)c(-c4ccccc4)cc4ccccc34)cc2)cc1] | 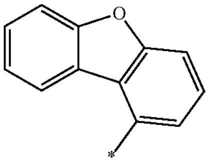 | 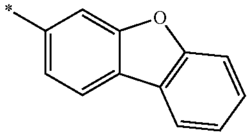 |
| 5-D1-12 | 1 | 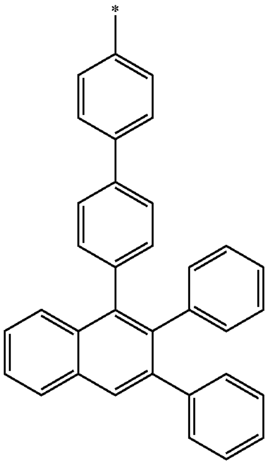 [SMILES: *c1ccc(-c2ccc(-c3c(-c4ccccc4)c(-c4ccccc4)cc4ccccc34)cc2)cc1] | 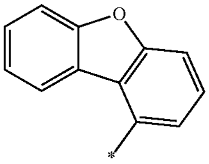 | 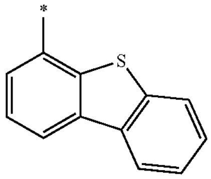 |
| 5-D1-13 | 1 | 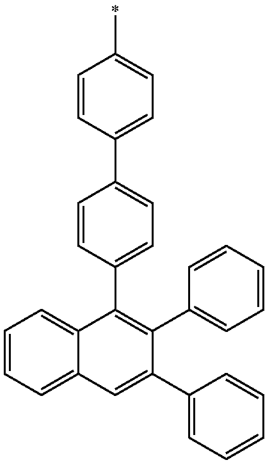 [SMILES: *c1ccc(-c2ccc(-c3c(-c4ccccc4)c(-c4ccccc4)cc4ccccc34)cc2)cc1] | 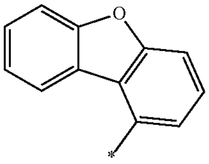 | 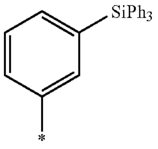 |

-continued
| [Compound Group 1] | | | | |
|---|---|---|---|---|
| | n | A—L—* | $Ar_1$ | $Ar_2$ |
| 5-D1-14 | 1 | 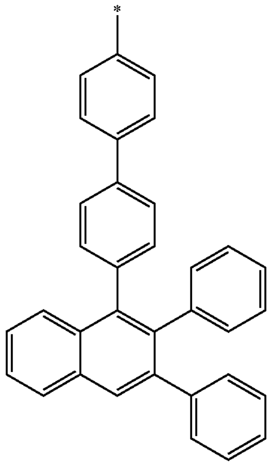 [SMILES: *c1ccc(-c2ccc(-c3c(-c4ccccc4)c(-c4ccccc4)cc4ccccc34)cc2)cc1] | 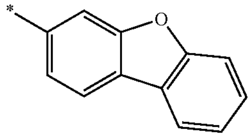 [SMILES: *c1ccc2c(c1)oc1ccccc12] | 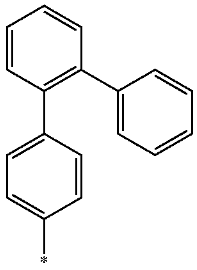 |
| 5-D1-15 | 1 | 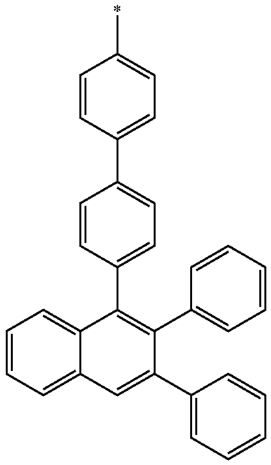 [SMILES: *c1ccc(-c2ccc(-c3c(-c4ccccc4)c(-c4ccccc4)cc4ccccc34)cc2)cc1] | 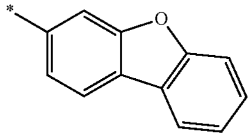 [SMILES: *c1ccc2c(c1)oc1ccccc12] | 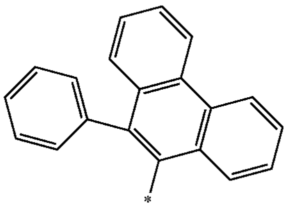 [SMILES: *c1c(-c2ccccc2)c2ccccc2c2ccccc12] |
| 5-D1-16 | 1 | 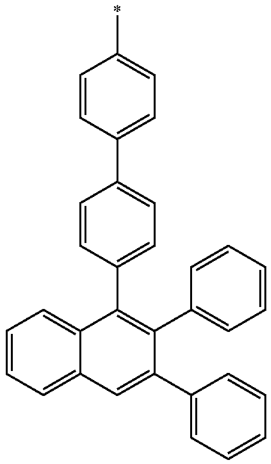 [SMILES: *c1ccc(-c2ccc(-c3c(-c4ccccc4)c(-c4ccccc4)cc4ccccc34)cc2)cc1] | 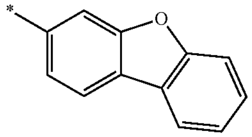 [SMILES: *c1ccc2c(c1)oc1ccccc12] | 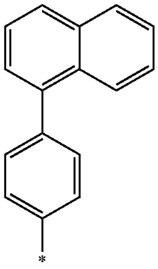 [SMILES: *c1ccc(-c2cccc3ccccc23)cc1] |

-continued
| [Compound Group 1] | | | | |
|---|---|---|---|---|
| | n | A—L—* | $Ar_1$ | $Ar_2$ |
| 5-D1-17 | 1 | 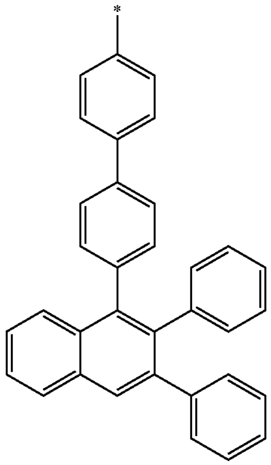 [SMILES: *c1ccc(-c2ccc(-c3c(-c4ccccc4)c(-c4ccccc4)cc4ccccc34)cc2)cc1] | 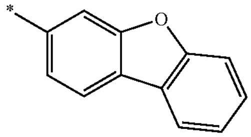 [SMILES: *c1ccc2c(c1)oc1ccccc12] | 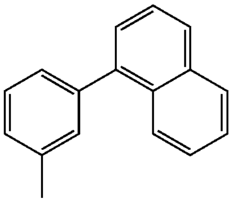 |
| 5-D1-18 | 1 | 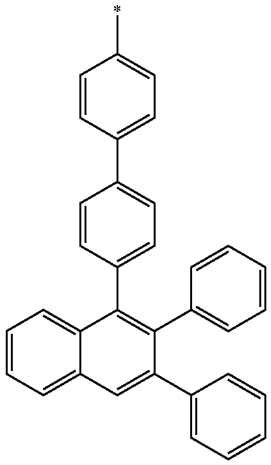 [SMILES: *c1ccc(-c2ccc(-c3c(-c4ccccc4)c(-c4ccccc4)cc4ccccc34)cc2)cc1] | 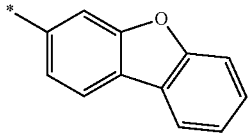 [SMILES: *c1ccc2c(c1)oc1ccccc12] | 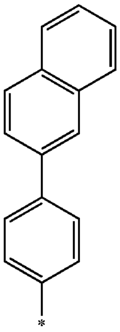 [SMILES: *c1ccc(-c2ccc3ccccc3c2)cc1] |
| 5-D1-19 | 1 | 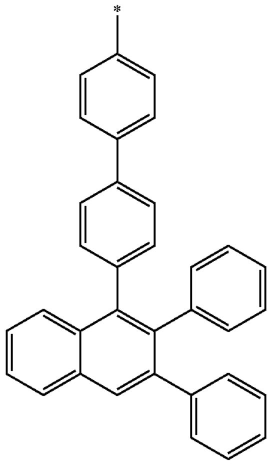 [SMILES: *c1ccc(-c2ccc(-c3c(-c4ccccc4)c(-c4ccccc4)cc4ccccc34)cc2)cc1] | 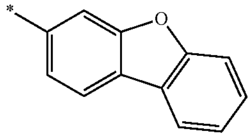 [SMILES: *c1ccc2c(c1)oc1ccccc12] | 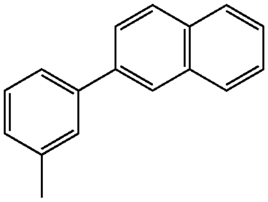 |

-continued
[Compound Group 1]
| | n | A—L—* | $Ar_1$ | $Ar_2$ |
|---|---|---|---|---|
| 5-D1-20 | 1 | 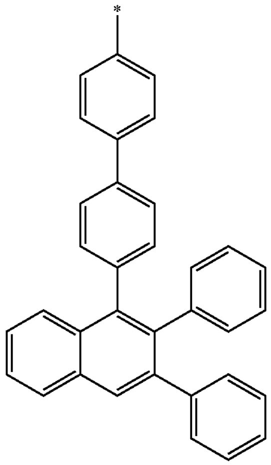 [SMILES: *c1ccc(-c2ccc(-c3c(-c4ccccc4)c(-c4ccccc4)cc4ccccc34)cc2)cc1] | 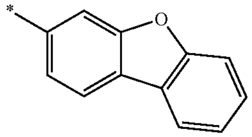 [SMILES: *c1ccc2c(c1)oc1ccccc12] | 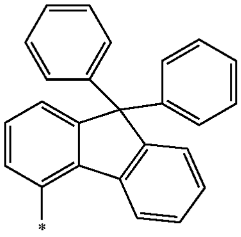 [SMILES: *c1cccc2c1-c1ccccc1C2(c1ccccc1)c1ccccc1] |
| 5-D1-21 | 1 | 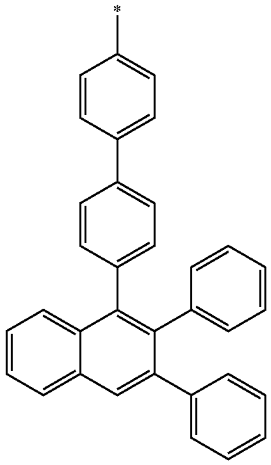 [SMILES: *c1ccc(-c2ccc(-c3c(-c4ccccc4)c(-c4ccccc4)cc4ccccc34)cc2)cc1] | 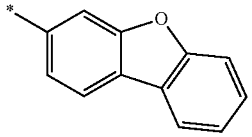 [SMILES: *c1ccc2c(c1)oc1ccccc12] | 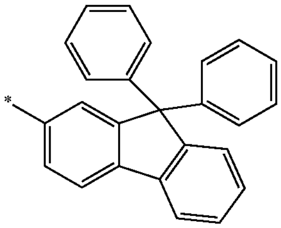 [SMILES: *c1ccc2c(c1)C(c1ccccc1)(c1ccccc1)c1ccccc1-2] |
| 5-D1-22 | 1 | 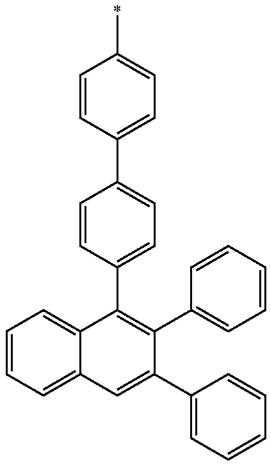 [SMILES: *c1ccc(-c2ccc(-c3c(-c4ccccc4)c(-c4ccccc4)cc4ccccc34)cc2)cc1] | 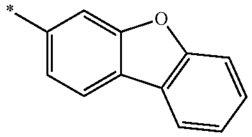 [SMILES: *c1ccc2c(c1)oc1ccccc12] | 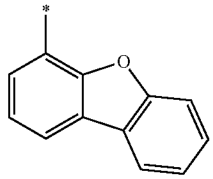 |

-continued
[Compound Group 1]
| | n | A—L—* | $Ar_1$ | $Ar_2$ |
|---|---|---|---|---|
| 5-D1-23 | 1 | 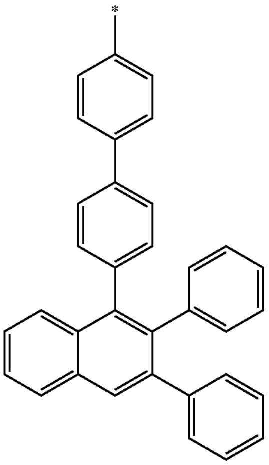 [SMILES: *c1ccc(-c2ccc(-c3c(-c4ccccc4)c(-c4ccccc4)cc4ccccc34)cc2)cc1] | 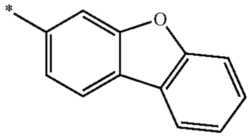 [SMILES: *c1ccc2c(c1)oc1ccccc12] | 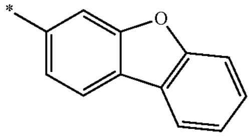 [SMILES: *c1ccc2c(c1)oc1ccccc12] |
| 5-D1-24 | 1 | 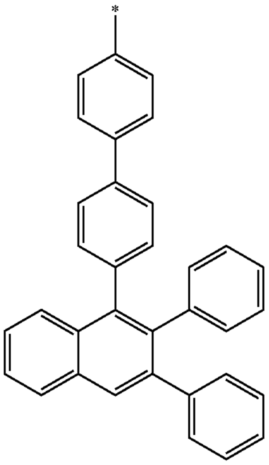 [SMILES: *c1ccc(-c2ccc(-c3c(-c4ccccc4)c(-c4ccccc4)cc4ccccc34)cc2)cc1] | 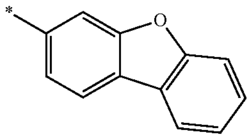 [SMILES: *c1ccc2c(c1)oc1ccccc12] | 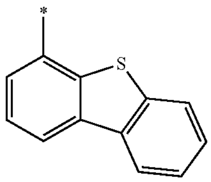 [SMILES: *c1cccc2c1sc1ccccc12] |
| 5-D1-25 | 1 | 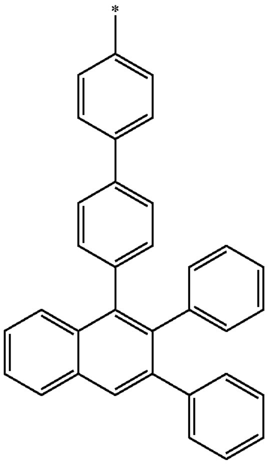 [SMILES: *c1ccc(-c2ccc(-c3c(-c4ccccc4)c(-c4ccccc4)cc4ccccc34)cc2)cc1] | 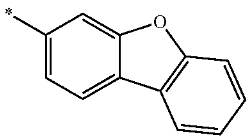 [SMILES: *c1ccc2c(c1)oc1ccccc12] | 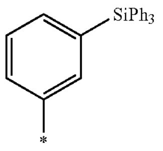 |

-continued
| [Compound Group 1] | | | | |
|---|---|---|---|---|
| | n | A—L—* | $Ar_1$ | $Ar_2$ |
| 5-D1-26 | 1 | 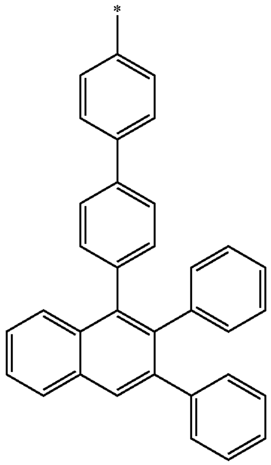 [SMILES: *c1ccc(-c2ccc(-c3c(-c4ccccc4)c(-c4ccccc4)cc4ccccc34)cc2)cc1] | 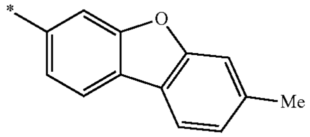 | 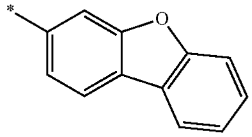 |
| 5-D1-27 | 1 | 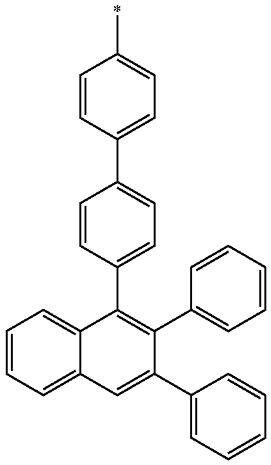 [SMILES: *c1ccc(-c2ccc(-c3c(-c4ccccc4)c(-c4ccccc4)cc4ccccc34)cc2)cc1] | 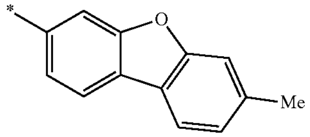 [SMILES: *c1ccc2c(c1)oc1cc(C)ccc12] | 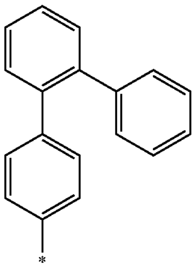 [SMILES: *c1ccc(-c2ccccc2-c2ccccc2)cc1] |
| 5-D1-28 | 1 | 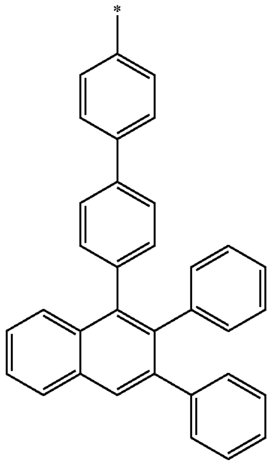 [SMILES: *c1ccc(-c2ccc(-c3c(-c4ccccc4)c(-c4ccccc4)cc4ccccc34)cc2)cc1] | 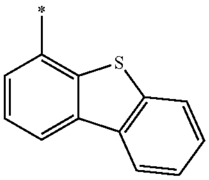 | 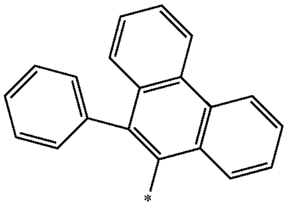 [SMILES: *c1c(-c2ccccc2)c2ccccc2c2ccccc12] |

-continued
| [Compound Group 1] | | | | |
|---|---|---|---|---|
| | n | A—L—* | $Ar_1$ | $Ar_2$ |
| 5-D1-29 | 1 | 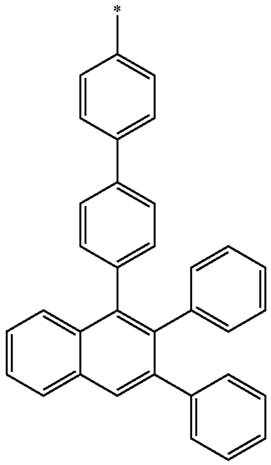 [SMILES: *c1ccc(-c2ccc(-c3c(-c4ccccc4)c(-c4ccccc4)cc4ccccc34)cc2)cc1] | 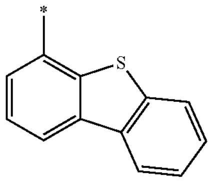 | 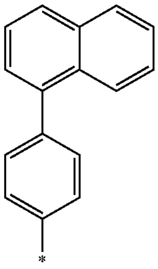 [SMILES: *c1ccc(-c2cccc3ccccc23)cc1] |
| 5-D1-30 | 1 | 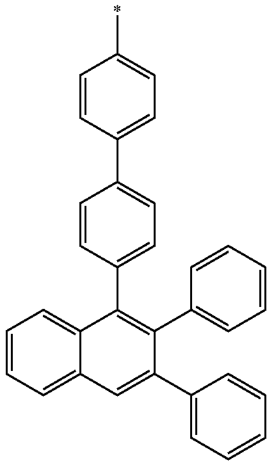 [SMILES: *c1ccc(-c2ccc(-c3c(-c4ccccc4)c(-c4ccccc4)cc4ccccc34)cc2)cc1] | 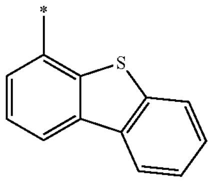 | 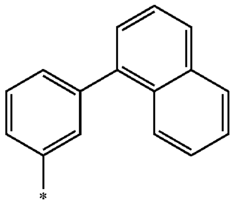 [SMILES: *c1cccc(-c2cccc3ccccc23)c1] |
| 5-D1-31 | 1 | 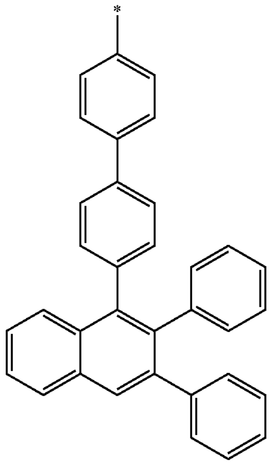 [SMILES: *c1ccc(-c2ccc(-c3c(-c4ccccc4)c(-c4ccccc4)cc4ccccc34)cc2)cc1] | 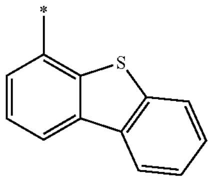 | 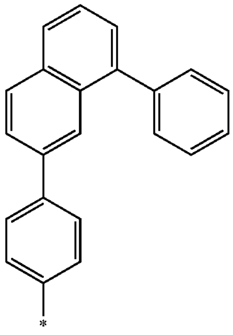 [SMILES: *c1ccc(-c2ccc3cccc(-c4ccccc4)c3c2)cc1] |

-continued
[Compound Group 1]
| | n | A—L—* | $Ar_1$ | $Ar_2$ |
|---|---|---|---|---|
| 5-D1-32 | 1 | 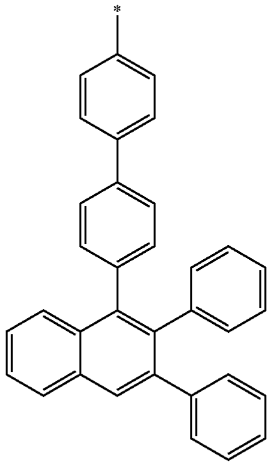 [SMILES: *c1ccc(-c2ccc(-c3c(-c4ccccc4)c(-c4ccccc4)cc4ccccc34)cc2)cc1] | 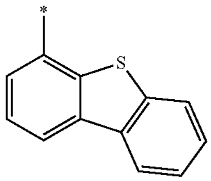 | 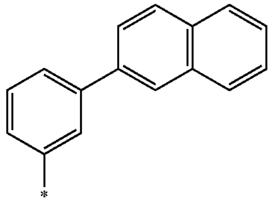 [SMILES: *c1cccc(-c2ccc3ccccc3c2)c1] |
| 5-D1-33 | 1 | 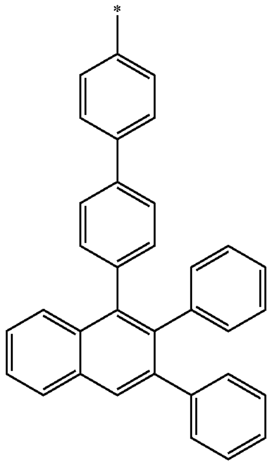 [SMILES: *c1ccc(-c2ccc(-c3c(-c4ccccc4)c(-c4ccccc4)cc4ccccc34)cc2)cc1] | 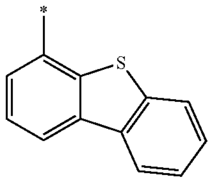 | 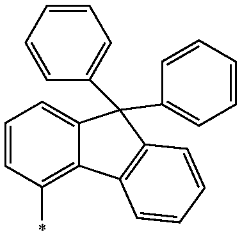 [SMILES: *c1cccc2c1-c1ccccc1C2(c1ccccc1)c1ccccc1] |
| 5-D1-34 | 1 | 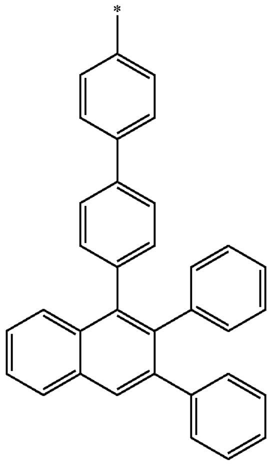 [SMILES: *c1ccc(-c2ccc(-c3c(-c4ccccc4)c(-c4ccccc4)cc4ccccc34)cc2)cc1] | 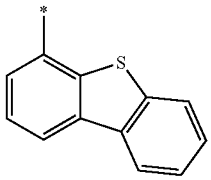 | 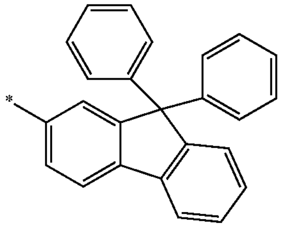 |

-continued
[Compound Group 1]
| | n | A—L—* | $Ar_1$ | $Ar_2$ |
|---|---|---|---|---|
| 5-D1-35 | 1 | 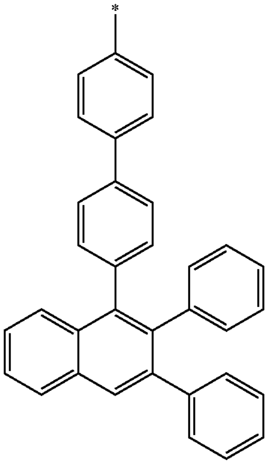 [SMILES: *c1ccc(-c2ccc(-c3c(-c4ccccc4)c(-c4ccccc4)cc4ccccc34)cc2)cc1] | 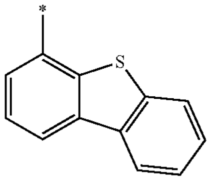 | 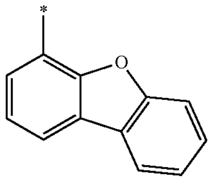 |
| 5-D1-36 | 1 | 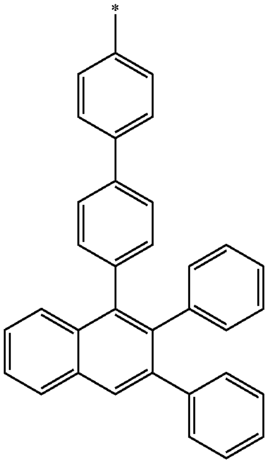 [SMILES: *c1ccc(-c2ccc(-c3c(-c4ccccc4)c(-c4ccccc4)cc4ccccc34)cc2)cc1] | 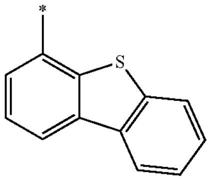 | 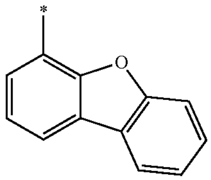 |
| 5-D1-37 | 1 | 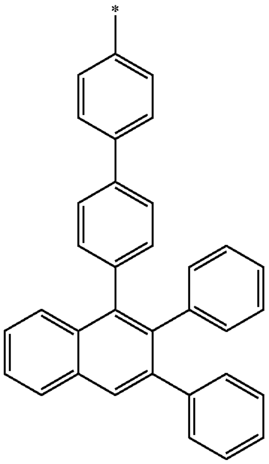 [SMILES: *c1ccc(-c2ccc(-c3c(-c4ccccc4)c(-c4ccccc4)cc4ccccc34)cc2)cc1] | 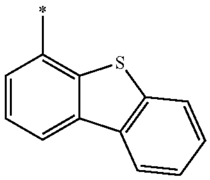 | 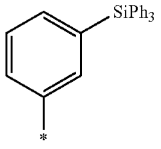 |

An organic electroluminescence device according to an embodiment of the inventive concept will be described with reference to FIGS. 1 to 3.

As described above, the hole transport region HTR includes an amine compound according to an embodiment of the inventive concept as described above. For example, the hole transport region HTR may include the amine compound represented by Formula 1.

When the hole transport region HTR is a multilayer structure, any of the layers may include the amine compound represented by Formula 1. For example, the hole transport region HTR may include the hole injection layer HIL disposed on the first electrode EL1 and the hole transport layer HTL disposed on the hole injection layer HIL, wherein the hole transport layer HTL may include the amine compound represented by Formula 1. However, the embodiments are not limited thereto. For example, the hole injection layer HIL may include the amine compound represented by Formula 1.

The hole transport region HTR may include one or more of the amine compounds represented by Formula 1. For example, the hole transport region HTR may include at least one selected from among compounds represented by Compound Groups 1 to 4 as described above.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

However, the hole transport region HTR may further include materials below in each layer.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris {N,N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPD), triphenylamine-containing polyetherketone (TPAPEK), 4-isopropyl-4'-methyldiphenyliodonium tetrakis(pentafluorophenyl) borate, dipyrazino[2,3-f: 2',3-h]quinoxaline-2,3,6,7,10,11-hexacarbonitrile (HAT-CN), etc.

The hole transport layer HTL may include general materials known in the art. The hole transport layer HTL may further include, for example, carbazole derivatives such as N-phenyl carbazole and polyvinyl carbazole, fluorene derivatives, N,N'-bis(3-methylphenyl)-N,N'-diphenyl-[1,1'-biphenyl]-4,4'-diamine (TPD), triphenylamine derivatives such as 4,4',4"-tris(N-carbazolyl)triphenylamine (TCTA), N,N'-di(naphthalen-1-yl)-N,N'-diphenyl-benzidine (NPD), 4,4'-cyclohexylidene (TAPC), bis[N,N-bis(4-methylphenyl)]benzenamine 4,4-bis[N,N'-(3-tolyl)amino]-3,3'-dimethylbiphenyl (HMTPD), 1,3-bis(N-carbazolyl)benzene (mCP), etc.

The electron blocking layer EBL may include, for example, carbazole derivatives such as N-phenyl carbazole and polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4"-tris(N-carbazolyl)triphenylamine (TCTA), N,N'-di(naphthalen-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mCDP), etc.

The thickness of the hole transport region HTR may be in a range of about 50 Å to about 15,000 Å. For example, the thickness of the hole transport region HTR may be in a range of about 100 Å to about 5,000 Å. The thickness of the hole injection layer HIL may be in a range of about 30 Å to about 1,000 Å, and the thickness of the hole transport layer HTL may be in a range of about 30 Å to about 1,000 Å. For example, the thickness of the electron blocking layer EBL may be in a range of about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed uniformly or non-uniformly in the hole transport region HTR. The charge generating material may be, for example, a p-dopant. The p-dopant may be at least one selected from quinone derivatives, metal oxides, and cyano group-containing compounds, but embodiments of the inventive concept are not limited thereto. For example, non-limiting examples of the p-dopant may include, but are not limited to, quinone derivatives such as tetracyanoquinodimethane (TCNQ) and 2,3,5,6-tetrafluoro-7,7,8,8-tetracyanoquinodimethane (F4-TCNQ), metal halides such as $MgF_2$, CuI, RbI, and metal oxides such as tungsten oxides and molybdenum oxides.

As described above, the hole transport region HTR may further include at least one selected from the hole buffer layer and the electron blocking layer EBL. The hole buffer layer may compensate a resonance distance according to the wavelength of light emitted from the emission layer EML to increase light emission efficiency. Materials which may be included in the hole transport region HTR may be used as materials which may be included in the hole buffer layer. The electron blocking layer EBL is a layer that serves to prevent electrons from being injected from the electron transport region ETR to the hole transport region HTR.

The emission layer EML is provided on the hole transport region HTR. The thickness of the emission layer EML may be in a range of about 100 Å to about 1,000 Å. For example, the thickness of the emission layer EML may be in a range of about 100 Å to about 600 Å. The emission layer EML may have a single layer formed of a single material, a single layer formed of different materials, or a multilayer structure having multiple layers formed of different materials.

As materials of the emission layer EML, known materials may be used and may be one selected among fluoranthene derivatives, pyrene derivatives, arylacetylene derivatives, anthracene derivatives, fluorene derivatives, perylene derivatives, chrysene derivatives, etc. may be used, without limitation. The host materials may include pyrene derivatives, perylene derivatives, and anthracene derivatives. For example, as the host materials of the emission layer EML, anthracene derivatives represented by Formula 10 may be used.

[Formula 10]

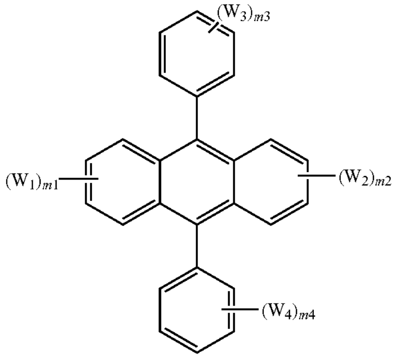

In Formula 10, $W_1$ to $W_4$ may be each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, m1 and m2 are each independently an integer from 0 to 4, and m3 and m4 are each independently an integer from 0 to 5.

If m1 is 1, $W_1$ may not be a hydrogen atom, if m2 is 1, $W_2$ may not be a hydrogen atom, if m3 is 1, $W_3$ may not be a hydrogen atom, and if m4 is 1, $W_4$ may not be a hydrogen atom.

If m1 is 2 or more, groups represented by $W_1$ may be the same or different. If m2 is 2 or more, groups represented by $W_2$ may be the same or different. If m3 is 2 or more, groups represented by $W_3$ may be the same or different. If m4 is 2 or more, groups represented by $W_4$ may be the same or different.

The compound represented by Formula 10 may include, for example, a compound represented by the following structures. However, the compound represented by Formula 10 is not limited thereto.

a-1

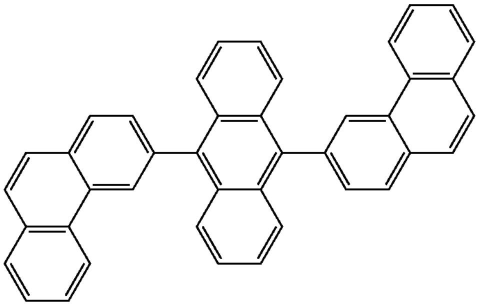

a-2

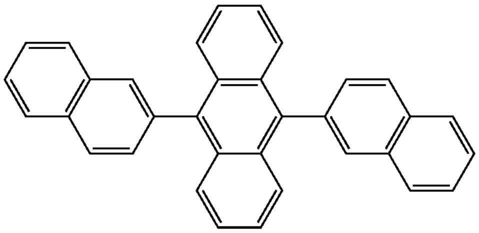

-continued a-3

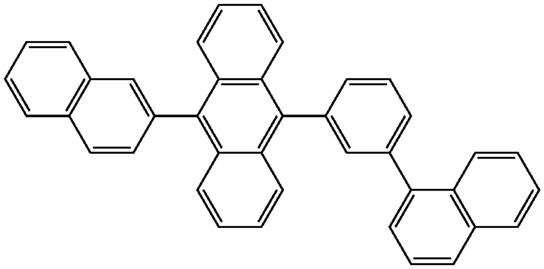

a-4

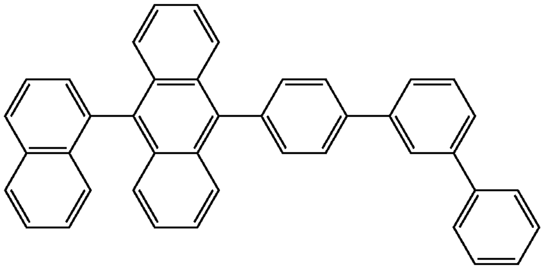

a-5

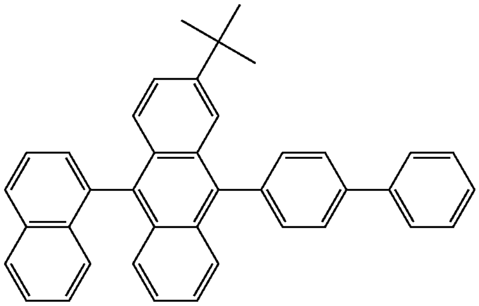

a-6

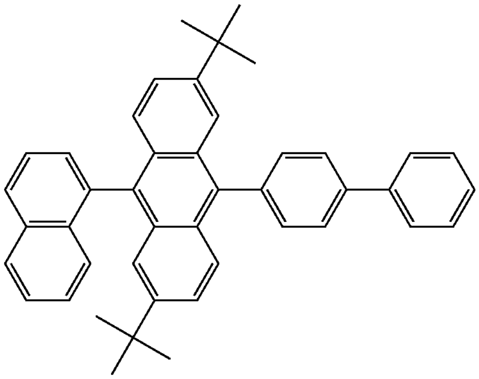

a-7

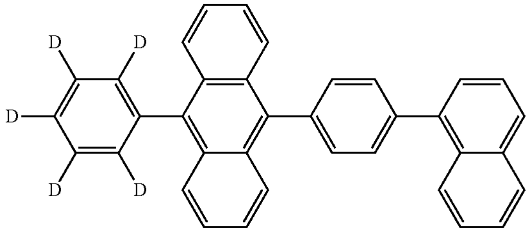

-continued a-8

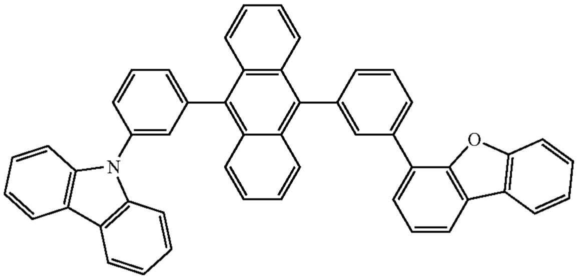

a-9

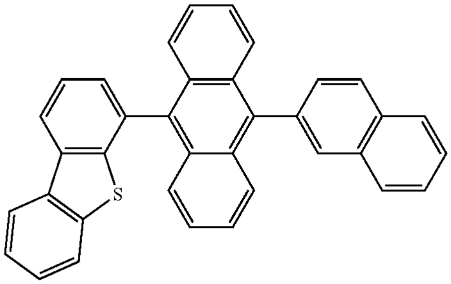

a-10

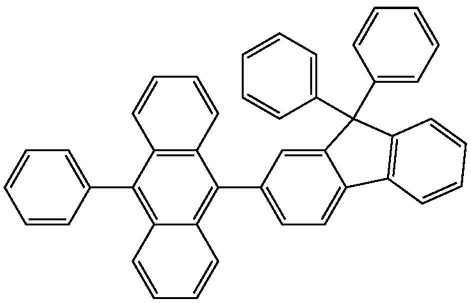

a-11

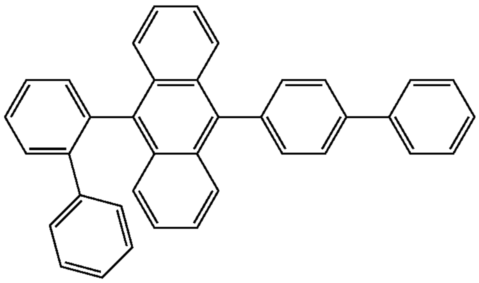

a-12

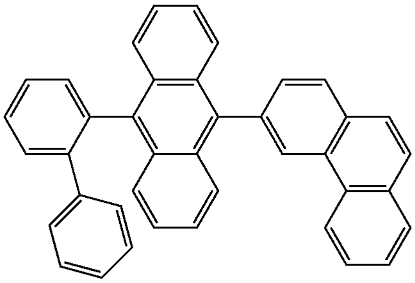

The emission layer EML may include a dopant, and known materials may be used as the dopant.

For example, at least any one of styryl derivatives (for example, 1,4-bis[2-(3-N-ethylcarbazolyl) vinyl]benzene (BCzVB), 4-(di-p-tolylamino)-4"-[(di-p-tolylamino) styryl]

stilbene (DPAVB), and N-(4-((E)-2-(6-((E)-4-(diphenylamino) styryl) naphthalen-2-yl) vinyl)phenyl)-N-phenylbenzena mine (N-BDAVBi), perylene and the derivatives thereof (for example, 2,5,8,11-tetra-t-butylperylene (TBPe)), pyrene and the derivatives thereof (for example, 1,1'-dipyrene, 1,4-dipyrenylbenzene, 1,4-bis(N,N-diphenylamino)pyrene, and 1,6-bis(N,N-diphenylamino)pyrene), or 1,3,5-tris(N-phenylbenzimidazole-2-yl)benzene (TPBi) may be used as a dopant, but is not limited thereto.

The emission layer EML may include a host material. For example, the emission layer EML may include, but is not limited to, as a host material, at least one of tris(8-hydroxyquinolinato)aluminum ($Alq_3$), bis[2-(diphenylphosphino) phenyl]ether oxide (DPEPO), 4,4'-bis(carbazol-9-yl) biphenyl (CBP), 1,3-bis(carbazol-9-yl)benzene (mCP), 2,8-bis (diphenylphosphoryl)dibenzo[b,d]furan (PPF), 4,4',4"-tris (carbazol-9-yl)-triphenylamine (TCTA), poly(N-vinylcabazole) (PVK), 9,10-di(naphthalen-2-yl) anthracene (ADN), 3-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl) anthracene (MADN), hexaphenyl cyclotriphosphazene (CP1), 1,4-bis(triphenylsilyl)benzene (UGH-2), hexaphenylcyclotrisiloxane (DPSiO3), octaphenylcyclotetra siloxane (DPSiO4), or 1,3,5-tris(1-phenyl-1H-benzo[d]imidazol-2-yl)benzene (TPBi).

When the emission layer EML emits red light, the emission layer EML may further include, for example, a fluorescent material including tris(dibenzoylmethanato) phenanthoroline europium (PBD:Eu$(DBM)_3$(Phen)) or perylene. When the emission layer EML emits red light, a dopant included in the emission layer EML may be, for example, a metal complex or an organometallic complex such as bis(1-phenylisoquinoline) acetylacetonate iridium (PIQIr(acac)), bis(1-phenylquinoline) acetylacetonate iridium (PQIr(acac)), tris(1-phenylquinoline) iridium (PQIr) and octaethylporphyrin platinum (PtOEP), rubrene and derivatives thereof, and 4-dicyanomethylene-2-(p-dimethylaminostyryl)-6-methyl-4H-pyran (DCM) and derivatives thereof.

When the emission layer EML emits green light, the emission layer EML may further include, for example, a fluorescent material including tris(8-hydroxyquinolinato) aluminum ($Alq_3$). When the emission layer EML emits green light, a dopant included in the emission layer EML may be, for example, selected from among a metal complex such as fac-tris(2-phenylpyridine) iridium ($Ir(ppy)_3$) or an organometallic complex, and coumarins and derivatives thereof.

When the emission layer EML emits blue light, the emission layer EML may further include, for example, a fluorescent material including any one selected from the group consisting of spiro-DPVBi, spiro-6P, distyryl-benzene (DSB), distyryl-arylene (DSA), polyfluorene (PFO)-based polymer and poly(p-phenylene vinylene (PPV)-based polymer. When the emission layer EML emits blue light, a dopant included in the emission layer EML may be, for example, selected from among a metal complex such as (4,6-F2ppy) 2Irpic or an organometallic complex, perylene and derivatives thereof.

The electron transport region ETR is disposed on the emission layer EML. The electron transport region ETR may include, but is not limited to, at least one of the hole blocking layer HBL, the electron transport layer ETL, or the electron injection layer EIL.

The electron transport region ETR may have a single layer formed of a single material, a single layer formed of different materials, or a multilayer structure including multiple layers formed of different materials.

For example, the electron transport region ETR may have a single layer structure of an electron injection layer EIL or an electron transport layer ETL, and may have a single layer structure formed of an electron injection material and an electron transport material. The electron transport region ETR may have a single layer structure formed of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be in a range of about 100 Å to about 1,500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, embodiments of the inventive concept are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl) biphenyl-3-yl)-1,3,5-triazine, bis[2-(diphenylphosphino)phenyl]ether oxide (DPEPO), 2-(4-(N-phenylbenzoimidazol-1-ylphenyl)-9,10-dinaphthylanthracene, 1,3,5-tri (1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq2), 9,10-di(naphthalen-2-yl) anthracene (ADN), or a mixture thereof. The thickness of the electron transport layers ETL may be in a range of about 100 Å to about 1,000 Å. For example, the thickness of the electron transport layers ETL may be in a range of about 150 Å to about 500 Å. If the thickness of the electron transport layers ETL satisfies the above-described range, satisfactory electron transport characteristics may be obtained without a substantial increase in driving voltage.

If the electron transport region ETR includes the electron injection layer EIL, the electron transport layer EIL may be formed using a metal halide such as LiF, NaCl, CsF, RbCl, and RbI, a lanthanide metal such as Yb, a metal oxide such as $Li_2O$ and BaO, or 8-hydroxyl-lithium quinolate (LiQ), etc., but embodiments of the inventive concept are not limited thereto. The electron injection layer EIL may also be formed of a mixture material of an electron transport material and an insulating organometallic salt. The organometallic salt may be a material having an energy band gap of about 4 eV or more. The organometallic salt may include, for example, metal acetates, metal benzoates, metal acetoacetates, metal acetylacetonates or metal stearates. The thickness of the electron injection layers EIL may be in a range of about 1 Å to about 100 Å. For example, the thickness of the electron injection layers EIL may be in a range of about 3 Å to about 90 Å. If the thickness of the electron injection layers EIL satisfies the above-described range, satisfactory electron injection properties may be obtained without a substantial increase in driving voltage.

The electron transport region ETR may include a hole blocking layer HBL as described above. The hole blocking layer HBL may include, but is not limited to, for example, at least one of 2,9-dimethyl-4,7-diphenyl-1,10-phenanthroline (BCP), bis[2-(diphenylphosphino)phenyl]ether oxide (DPEPO), or 4,7-diphenyl-1,10-phenanthroline (Bphen).

The second electrode EL2 is provided on the electron transport region ETR. The second electrode EL2 may be a common electrode or a negative electrode. The second electrode EL2 may be a transmissive electrode, a transflective electrode, or a reflective electrode. When the second electrode EL2 is the transmissive electrode, the second electrode EL2 may be formed of transparent metal oxides, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). For example, the first electrode EL1 may have a multilayer structure including a reflective layer or a transflective layer formed of the above-described materials, and a transparent conductive layer formed of ITO, IZO, ZnO, ITZO, etc.

Although not shown, the second electrode EL2 may be connected with an auxiliary electrode. If the second electrode EL2 is connected with the auxiliary electrode, the resistance of the second electrode EL2 may decrease.

Referring to FIG. 4, the organic electroluminescence device 10 according to an embodiment may further include a capping layer CPL disposed on the second electrode EL2. The capping layer CPL may include a multilayer or a single layer.

In an embodiment, the capping layer CPL may include at least one organic layer and/or at least one inorganic layer. For example, the capping layer CPL may have a structure in which an organic layer/an inorganic layer are alternately disposed at least one time, or a structure in which an inorganic layer/an organic layer are alternately disposed.

When the capping layer CPL includes an inorganic material, the inorganic material may include an alkaline metal compound such as LiF, an alkaline earth metal compound such as $MgF_2$, SiON, $SiN_x$, $SiO_y$, etc.

When the capping layer CPL includes an organic material, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol-9-yl)triphenylamine (TCTA), etc. may be included. For example, an epoxy resin or acrylate such as methacrylate may be included. However, embodiments of the inventive concept are not limited thereto, and the organic material may also include Compounds P1 to P5.

P1

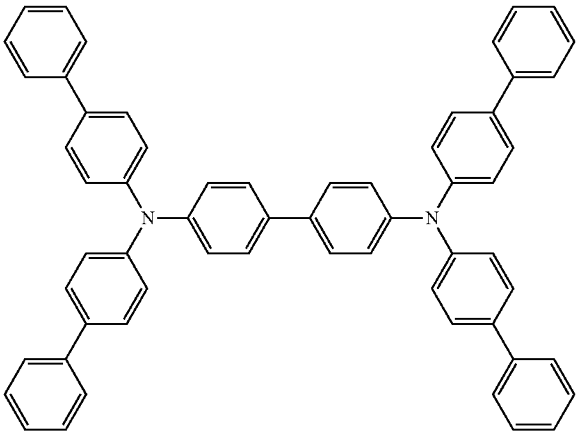

P2

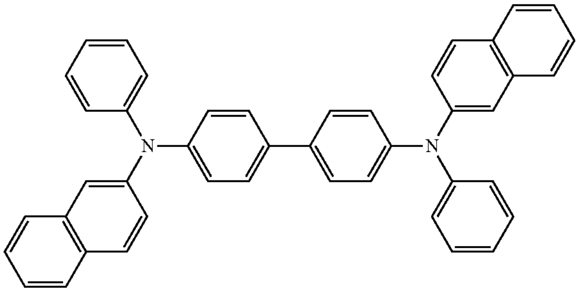

P3

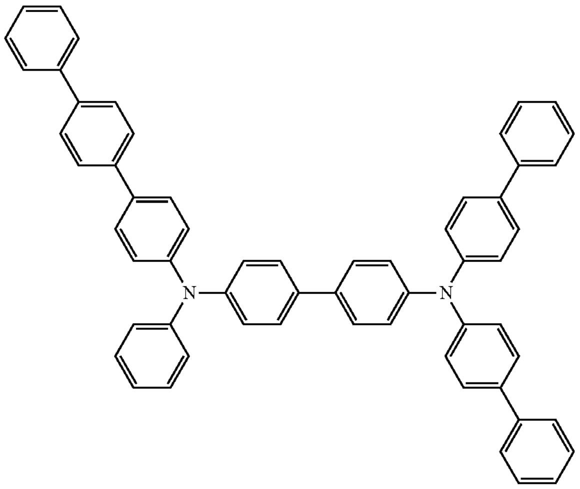

P4

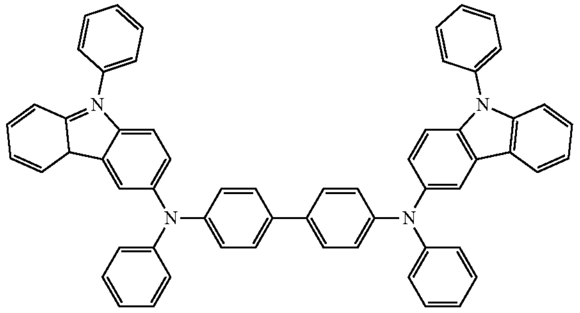

-continued

P5

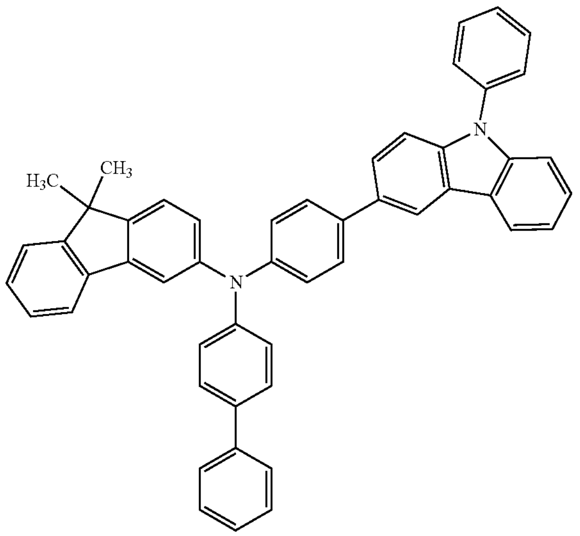

In an embodiment, the capping layer CPL may have a refractive index equal to greater than about 1.6 measured at about 589 nm. The capping layer CPL may have a refractive index equal to or less than about 2.0 measured at about 589 nm.

In the organic electroluminescence device 10, as a voltage is applied to the first electrode EL1 and the second electrode EL2, respectively, the holes injected from the first electrode EL1 are moved through the hole transport region HTR to the emission layer EML, and the electrons injected from the second electrode EL2 are moved through the electron transport region ETR to the emission layer EML. The electrons and holes are recombined in the emission layer EML to generate excitons and emit light when the excitons return to a ground state from an excited state.

When the organic electroluminescence device 10 is a front emission type, the first electrode EL1 may be the reflective electrode, and the second electrode EL2 may be the transmissive electrode or transflective electrode. When the organic electroluminescence device 10 is a rear emission type, the first electrode EL1 may be the transmissive electrode or transflective electrode, and the second electrode EL2 may be the reflective electrode.

The organic electroluminescence device 10 according to an embodiment of the inventive concept includes the amine compound represented by Formula 1, thereby achieving high efficiency and a long service life. A low driving voltage may be achieved.

Hereinafter, the disclosure will be described in more detail with reference to Examples and Comparative Examples. The embodiments are only illustrations for assisting the understanding of the inventive concept, and the scope of the inventive concept is not limited thereto.

SYNTHESIS EXAMPLES

An amine compound according to an embodiment of the inventive concept may be synthesized, for example, as follows. However, methods of synthesizing the amine compound according to an embodiment of the inventive concept are not limited thereto.

1. Synthesis of Compound 3-A1-38

(Synthesis of Compound B)

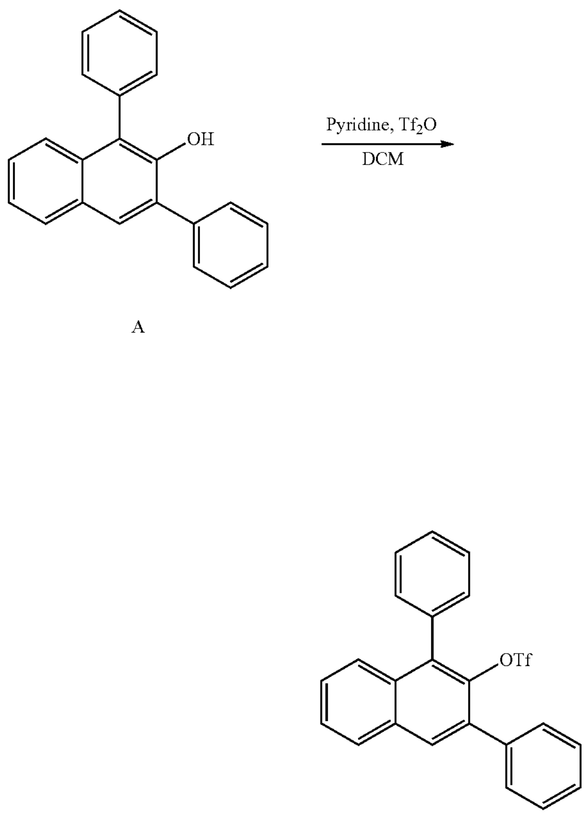

A

B $CH_2Cl_2$ solution (100 mL) was added to naphthylene A (12.2 g, 41.2 mmol) and pyridine (6.7 mL) and $Tf_2O$ (10 mL) was dropped to a reaction solution at 0° C. The reaction solution was stirred at room temperature for 12 hours and was neutralized with a saturated $NaHCO_3$ aqueous solution. The reaction solution was extracted with $CH_2Cl_2$, washed with $H_2O$ and brine, and dried with $Mg_2SO_4$. The obtained solution was concentrated and purified by silica gel column chromatography to obtain Compound B (14 g, 35 mmol, 85%, m/z 428.1).

(Synthesis of Compound C1)

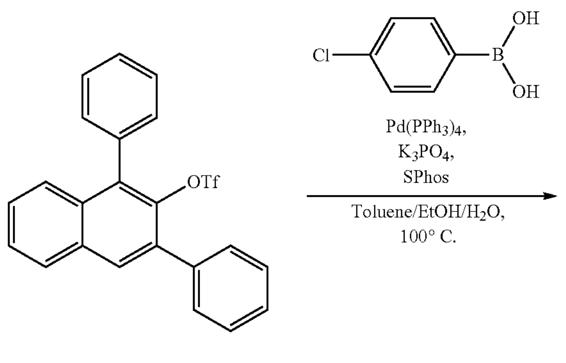

B

-continued

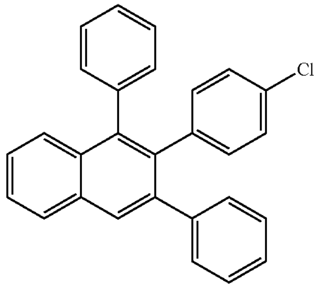

C1

Toluene/EtOH/$H_2O$ (v/v/v=4/2/1, 1000 mL) was added to the obtained Compound B (20.4 g, 48 mmol), boronic acid B2 (12 g, 72 mmol), and $K_3PO_4$ (20 g, 95 mmol), and degassed. In an argon atmosphere, 2-dicyclohexylphosphino-2',6'-dimethoxybiphenyl (2.0 g, 4.8 mmol) and tetrakis(triphenylphosphine) palladium (2.8 g, 2.4 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound C1 (11 g, 28 mmol, 59%, m/z 390.1).

(Synthesis of Compound 3-A1-38)

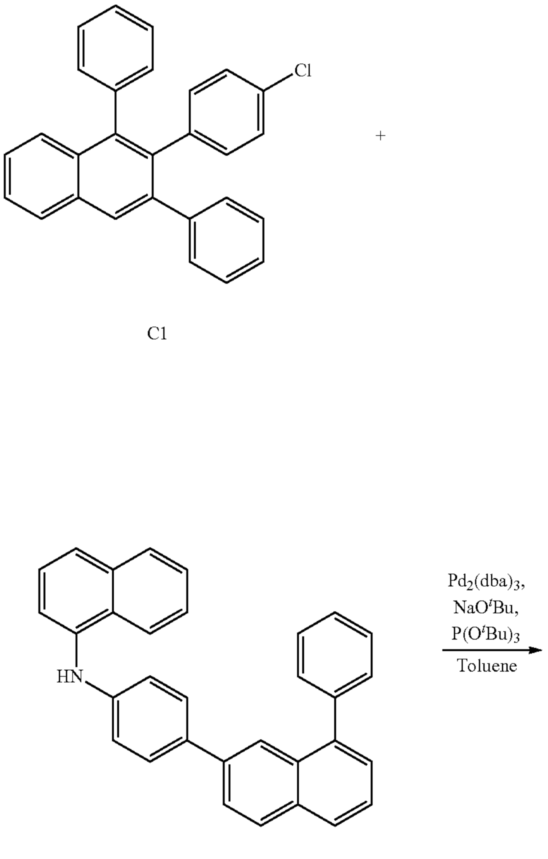

C1

D

-continued

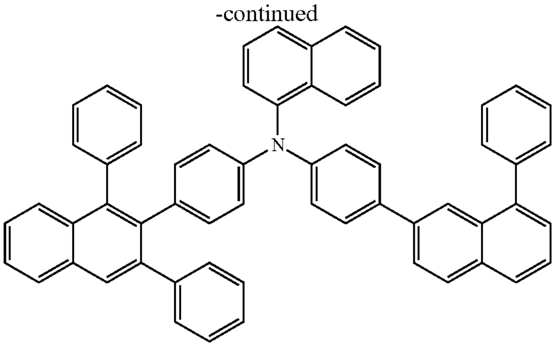

3-A1-38

Toluene (350 mL) was added to Compound C1 (7.8 g, 20 mmol), amine D (3.1 g, 20 mmol), and NaOtBu (4.2 g, 20 mmol) and degassed. In an argon atmosphere, 2.0 M of $P(tBu)_3$ toluene solution (1.0 mL) and $Pd(dba)_2$ (0.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound 3-A1-38 (6.2 g, 9 mmol, 44%, m/z 699.3).

2. Synthesis of Compound 3-A1-93

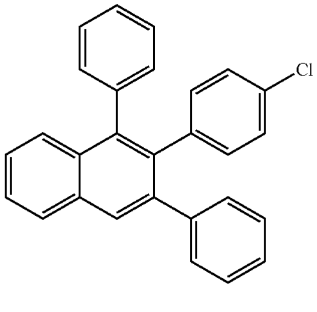

C1

+

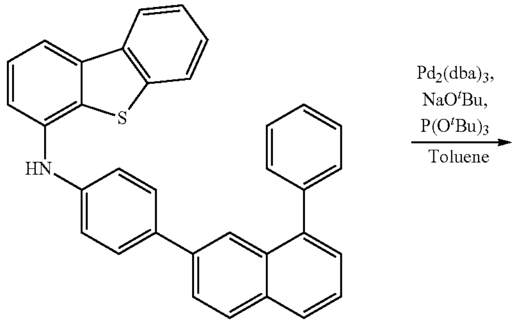

E

-continued

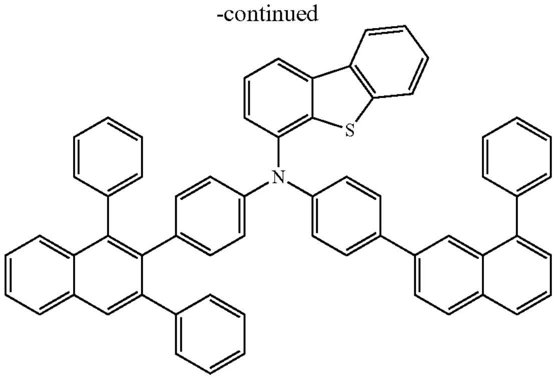

3-A1-93

Toluene (350 mL) was added to Compound C1 (7.8 g, 20 mmol), amine E (8.4 g, 20 mmol), and NaOtBu (4.2 g, 20 mmol) and degassed. In an argon atmosphere, 2.0 M of $P(O^tBu)_3$ toluene solution (1.0 mL) and $Pd_2(dba)_3$ (0.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$.

The obtained solution was concentrated and purified by column chromatography to obtain Compound 3-A1-93 (7.5 g, 9.0 mmol, 45%, m/z 831.3).

3. Synthesis of Compound 1-A1-93

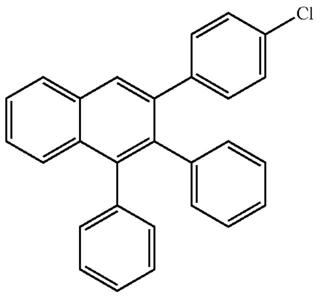

C2

+

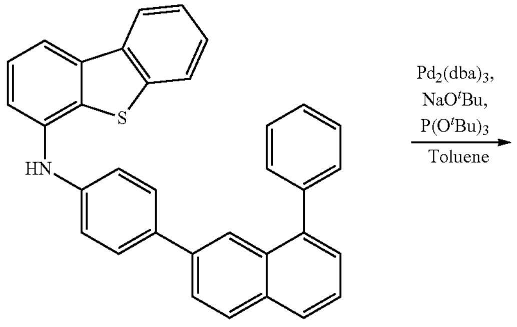

E

-continued

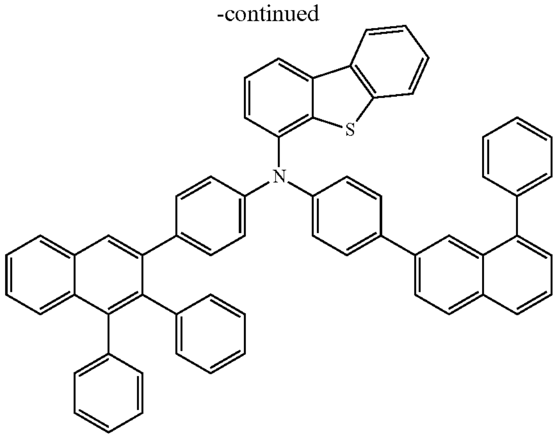

1-A1-93

Toluene (350 mL) was added to Compound C2 (7.8 g, 20 mmol, CAS No. 1383673-32-2), amine E (8.4 g, 20 mmol), and NaOtBu (4.2 g, 20 mmol) and degassed. In an argon atmosphere, 2.0 M of $P(O^tBu)_3$ toluene solution (1.0 mL) and $Pd_2(dba)_3$ (0.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound 1-A1-93 (6.0 g, 9.5 mmol, 48%, m/z 831.3).

4. Synthesis of Compound 2-A1-93

(Synthesis of Compound A3)

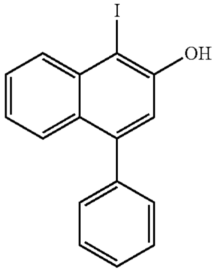

A2

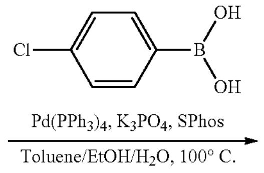

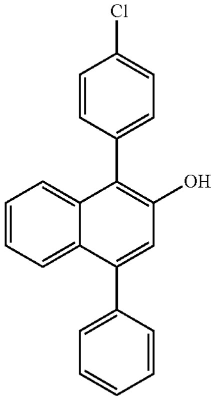

A3

Toluene/EtOH/$H_2O$ (v/v/v=4/2/1, 250 mL) was added to Compound A2 (6.9 g, 20 mmol), boronic acid B2 (4.1 g, 20 mmol), and $K_3PO_4$ (8.5 g, 40 mmol) and degassed. In an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound A3 (5.8 g, 18 mmol, 90%, m/z 330.1).

(Synthesis of Compound B3)

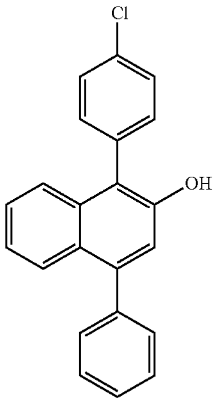

A3

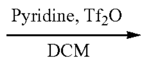

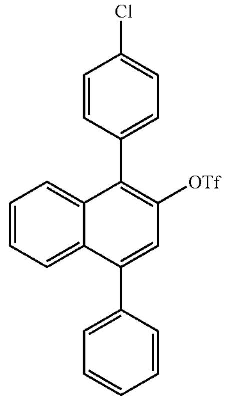

B3

Naphthylene A3 (13.6 g, 41.2 mmol) and pyridine (6.7 mL) were added to $CH_2Cl_2$ solution (100 mL) and $Tf_2O$ (10 mL) was dropped to a reaction solution at 0° C. The reaction solution was stirred at room temperature for 12 hours and was neutralized with a saturated $NaHCO_3$ aqueous solution. The reaction solution was extracted with $CH_2Cl_2$, washed with $H_2O$ and brine, and dried with $Mg_2SO_4$. The obtained solution was concentrated and purified by silica gel column chromatography to obtain Compound B3 (15.6 g, 34 mmol, 82%, m/z 462.0).

(Synthesis of Compound C3)

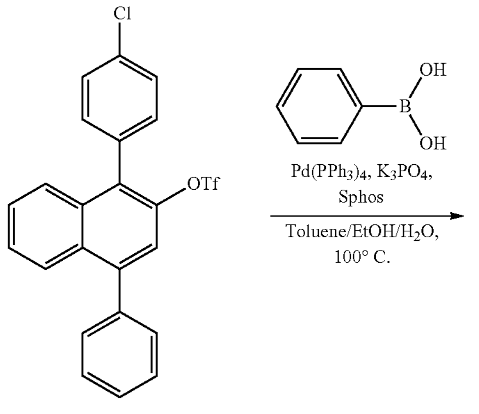

B3

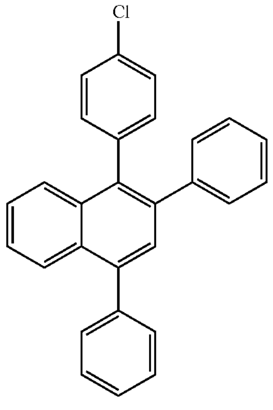

C3

Toluene/EtOH/$H_2O$ (v/v/v=4/2/1, 250 mL) was added to Compound B3 (9.3 g, 20 mmol), phenylboronic acid (2.4 g, 20 mmol), and $K_3PO_4$ (8.5 g, 40 mmol) and degassed. In an argon atmosphere, 2-dicyclohexylphosphino-2',6'-dimethoxybiphenyl (1.6 g, 4.0 mmol) and tetrakis(triphenylphosphine) palladium (1.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound C3 (5.6 g, 14 mmol, 72%, m/z 390.1).

(Synthesis of Compound 2-A1-93)

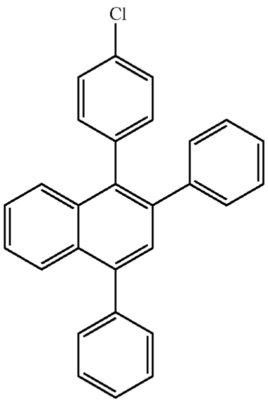 [SMILES: *c1ccc(-c2c(-c3ccccc3)cc(-c3ccccc3)c3ccccc23)cc1]

C3

+

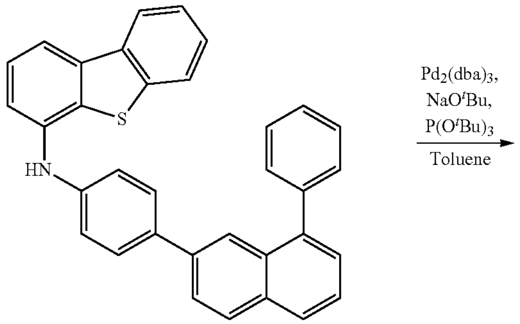

E

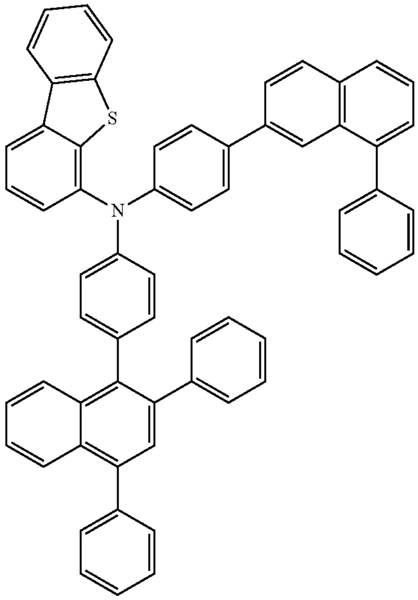

2-A1-93

Toluene (350 mL) was added to arylchloride C3 (7.8 g, 20 mmol), amine E (8.4 g, 20 mmol), and NaOtBu (4.2 g, 20 mmol) and degassed. In an argon atmosphere, 2.0 M of $P(O^tBu)_3$ toluene solution (1.0 mL) and $Pd_2(dba)_3$ (0.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound 2-A1-93 (10 g, 12 mmol, 60%, m/z 831.3).

5. Synthesis of Compound 4-A1-31

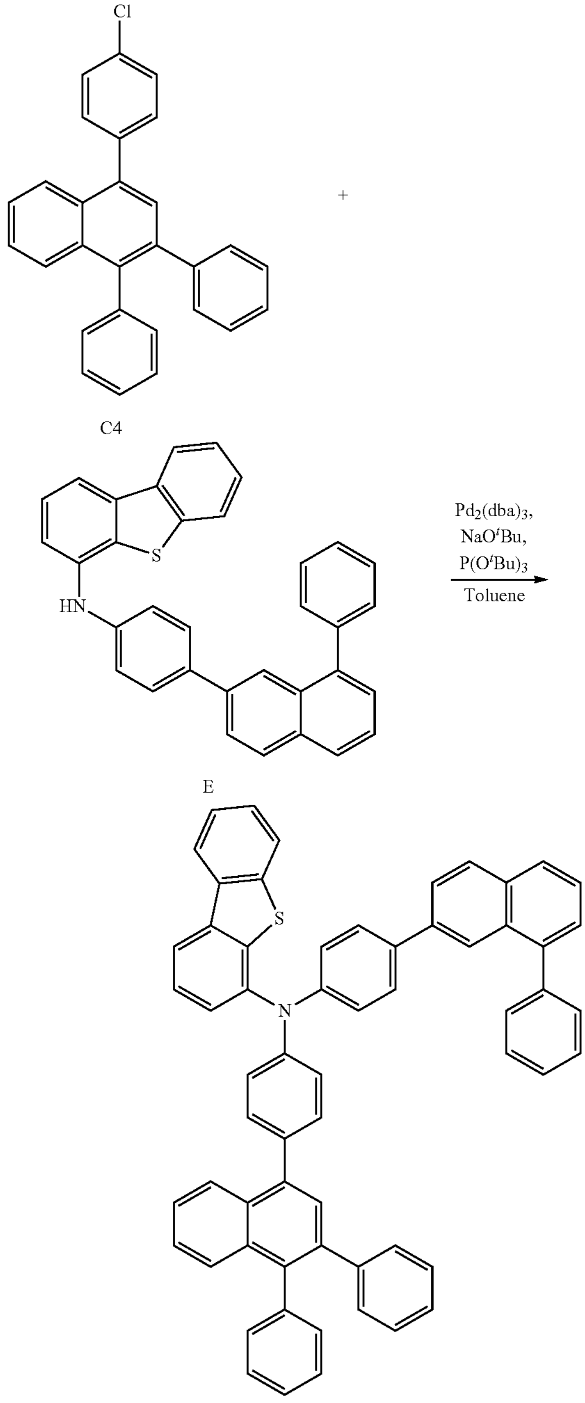

C4

E

4-A1-31

Toluene (350 mL) was added to arylchloride C4 (7.8 g, 20 mmol), amine E (8.4 g, 20 mmol), and NaOtBu (4.2 g, 20 mmol) and degassed. In an argon atmosphere, 2.0 M of $P(O^tBu)_3$ toluene solution (1.0 mL) and $Pd_2(dba)_3$ (0.6 g, 1.0 mmol) were added thereto and heated and stirred at 85° C.

for 6 hours. The reaction solution was standing to cool to room temperature, extracted with toluene, washed with $H_2O$ and brine, and dried with $Na_2SO_4$. The obtained solution was concentrated and purified by column chromatography to obtain Compound 4-A1-31 (13 g, 16 mmol, 78%, m/z 831.3).

6. Synthesis of Compound 5-A1-31

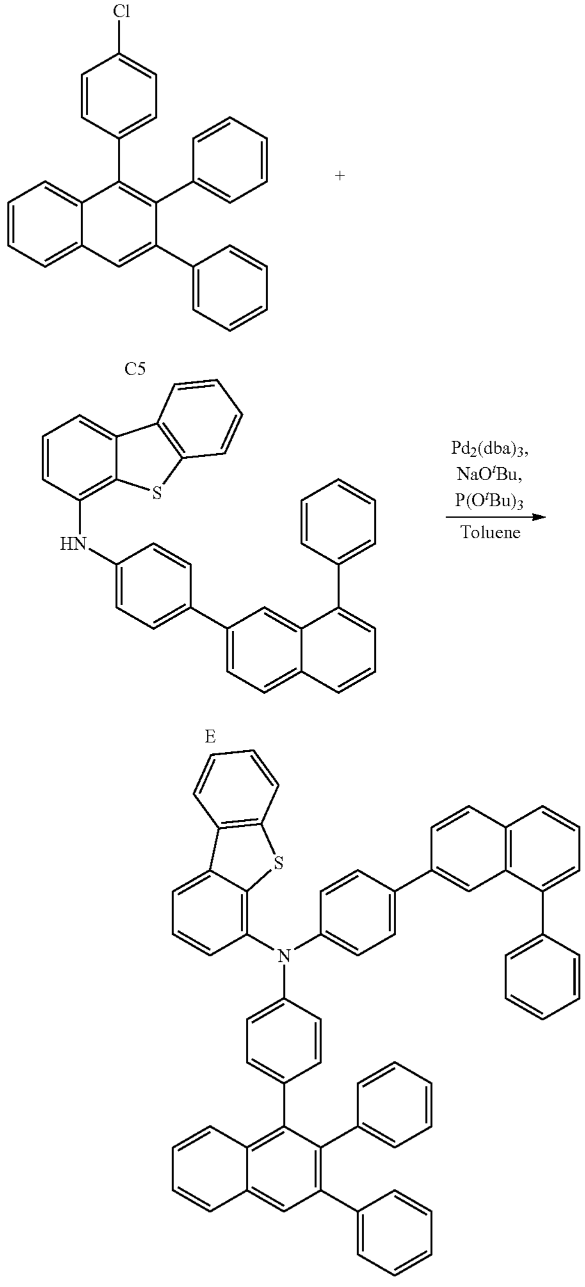

C5

E

5-A1-31

Toluene (350 mL) was added to arylchloride C5 (7.8 g, 20 mmol), amine E (8.4 g, 20 mmol), and NaOtBu (4.2 g, 20 mmol) and degassed. In an argon atmosphere, 2.0 M of $P(O^tBu)_3$ toluene solution (1.0 mL) and $Pd_2(dba)_3$ (0.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound 5-A1-31 (13 g, 15 mmol, 75%, m/z 831.3).

7. Synthesis of Compound 3-C1-93

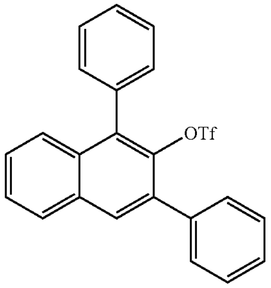

C1

+

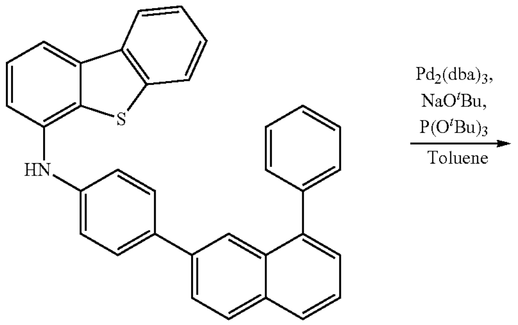

E

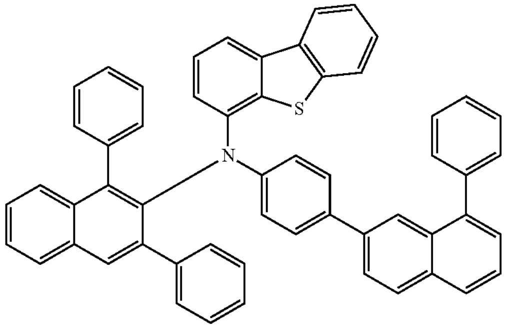

3-C1-93

Toluene (350 mL) was added to Compound B1 (8.6 g, 20 mmol), amine E (8.4 g, 20 mmol), and NaOtBu (4.2 g, 20 mmol) and degassed. In an argon atmosphere, 2.0 M of P(O$^t$Bu)$_3$ toluene solution (1.0 mL) and Pd$_2$(dba)$_3$ (0.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound 3-C1-93 (6.0 g, 8 mmol, 40%, m/z 755.3).

8. Synthesis of Compound 3-A1-98

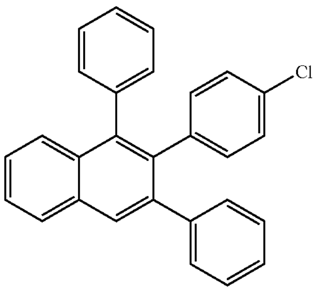

+

C1

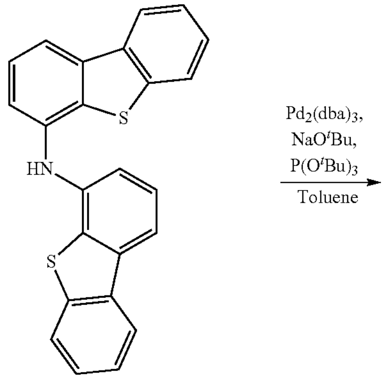

F

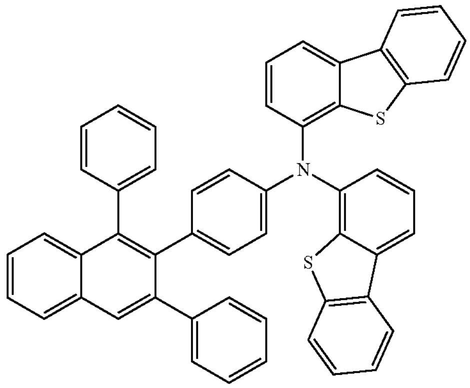

3-A1-98

Toluene (350 mL) was added to Compound C1 (7.8 g, 20 mmol), amine F (7.6 g, 20 mmol), and NaOtBu (4.2 g, 20 mmol) and degassed. In an argon atmosphere, 2.0 M of P(O$^t$Bu)$_3$ toluene solution (1.0 mL) and Pd$_2$(dba)$_3$ (0.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound 3-A1-98 (7.4 g, 9.0 mmol, 51%, m/z 735.2).

9. Synthesis of Compound 5-A1-36

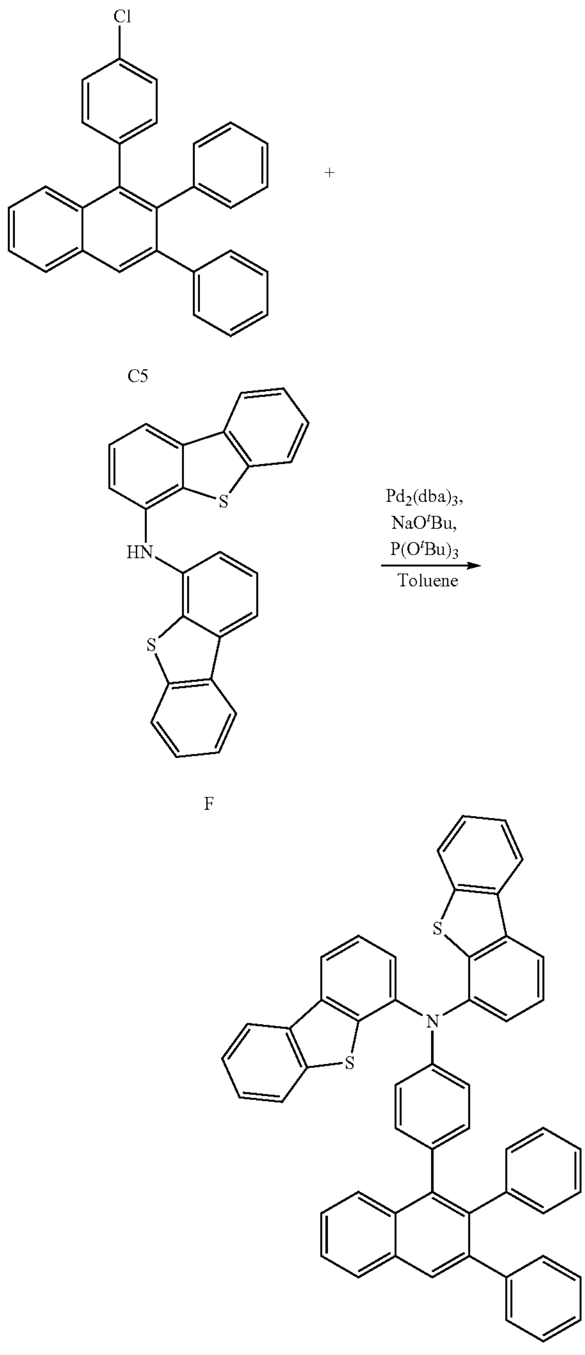

C5

F

5-A1-36

Toluene (350 mL) was added to Compound C5 (7.8 g, 20 mmol), amine F (7.6 g, 20 mmol), and NaOtBu (4.2 g, 20 mmol) and degassed. In an argon atmosphere, 2.0 M of P(O$^t$Bu)$_3$ toluene solution (1.0 mL) and Pd$_2$(dba)$_3$ (0.6 g, 1.0 mmol) were added thereto and heated and stirred at 85° C. for 6 hours. The reaction solution was standing to cool to room temperature, extracted with toluene, washed with $H_2O$ and brine, and dried with $Na_2SO_4$. The obtained solution was concentrated and purified by column chromatography to obtain Compound 5-A1-36 (8.5 g, 12 mmol, 58%, m/z 735.2).

(Device Manufactured Examples)

Organic electroluminescence devices were manufactured using Example Compounds and Comparative Example Compounds below as a hole transport region material:

[Example Compounds]

3-A1-38

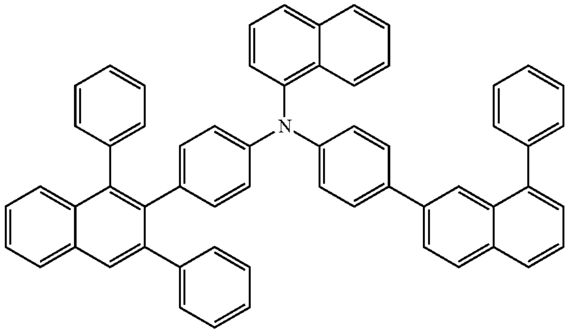

3-A1-93

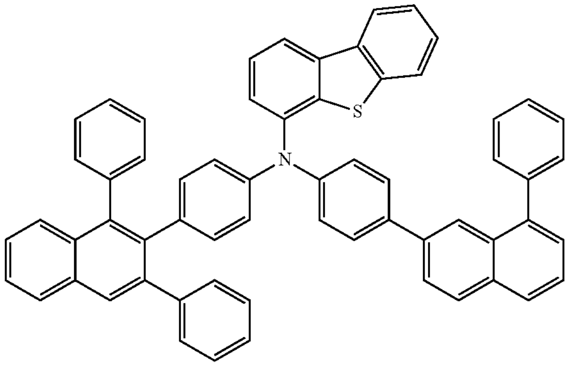

3-C1-93

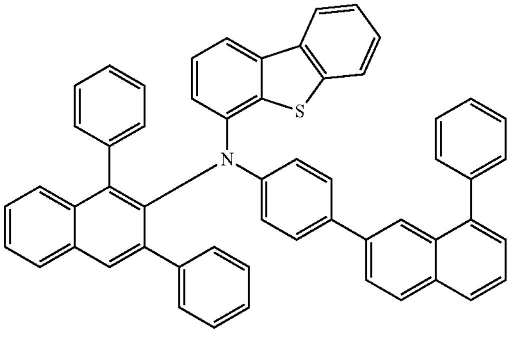

-continued
1-A1-93
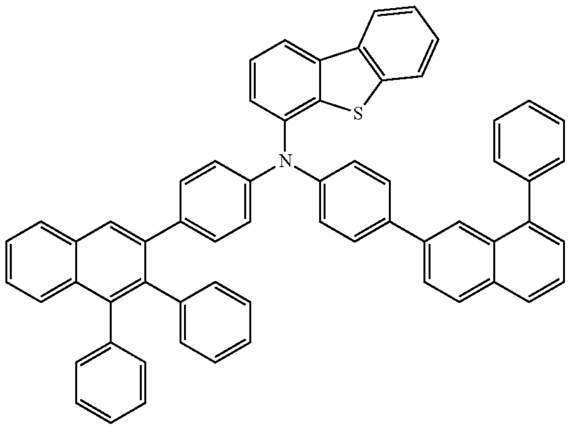
2-A1-93
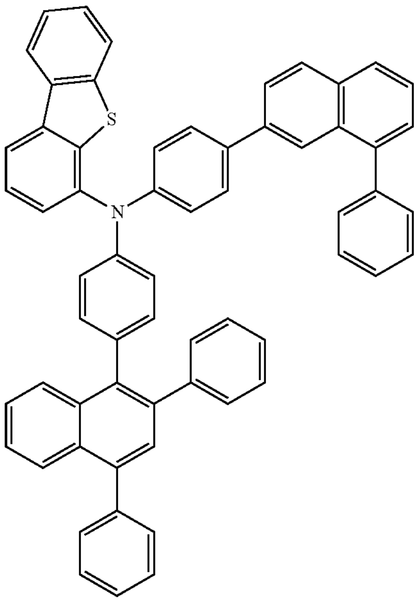
4-A1-31
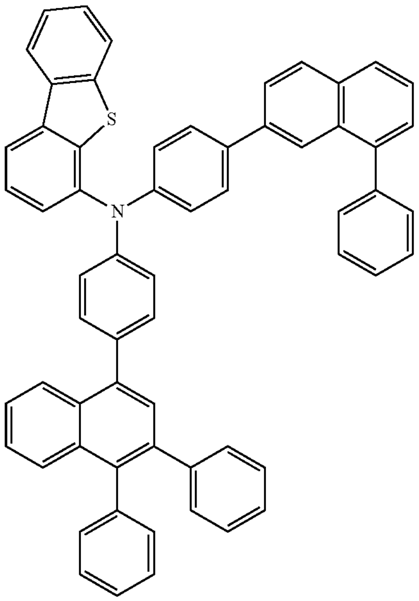
-continued
5-A1-31
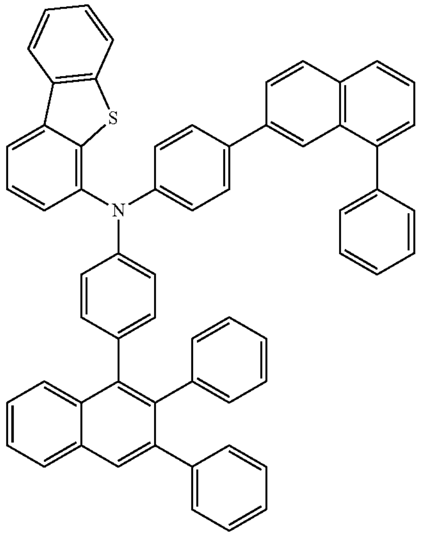
3-A1-98
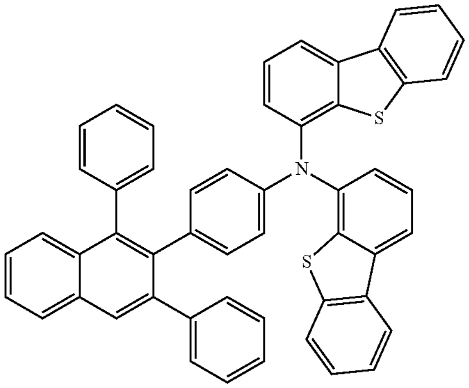
5-A1-36
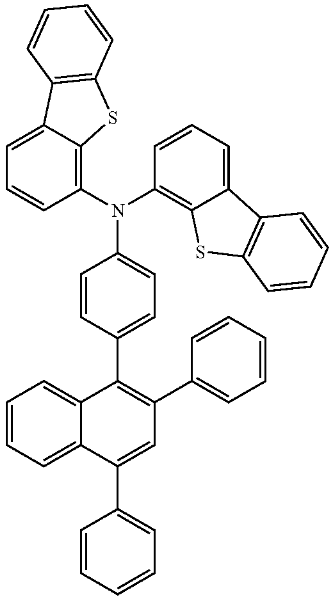

-continued

[Comparative Example Compounds]

R1

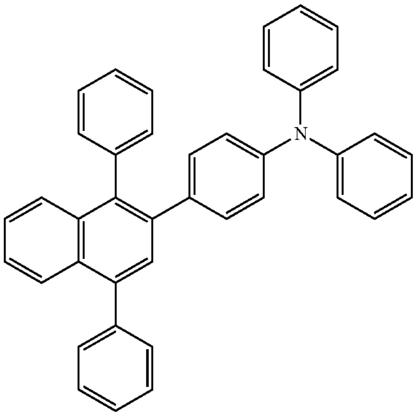

R2

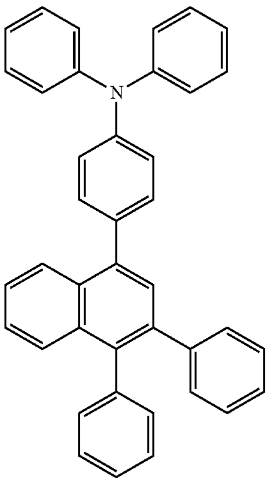

R3

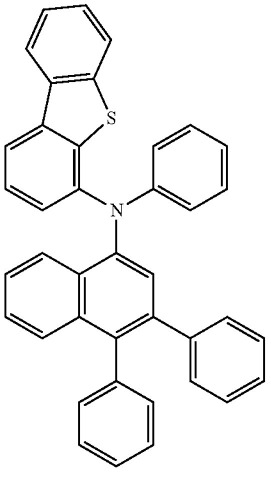

-continued

R4

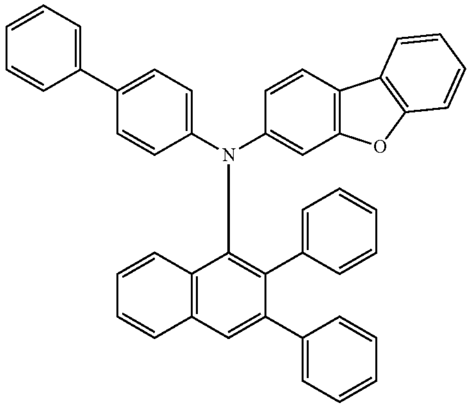

R5

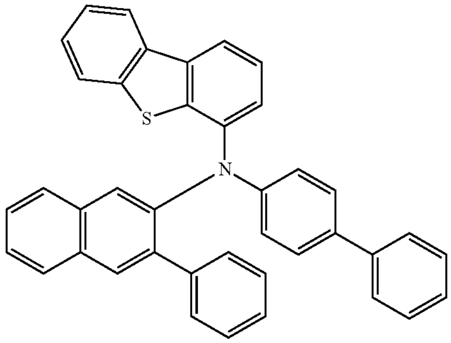

The organic electroluminescence devices of Examples and Comparative Examples were manufactured by the following method. A 150 nm-thick ITO was patterned on a glass substrate, and the glass substrate was washed with ultrapure water and treated with UV and ozone for about 10 minutes to form a first electrode. 2-TNATA was deposited thereon to a thickness of about 60 nm, and Example Compounds or Comparative Example Compounds were used to form a hole transport layer having a thickness of about 30 nm. TBP was doped to ADN by 3% to form an emission layer having a thickness of about 25 nm, a layer having a thickness of about 25 nm was formed with $Alq_3$ on the emission layer, and a layer having a thickness of about 1 nm was formed with LiF to form an electron transport region. A second electrode having a thickness of about 100 nm was formed with aluminum (A1). A 70 nm-thick capping layer was formed on the second electrode. Each layer was formed by a vacuum deposition method.

The light emission efficiencies of the organic electroluminescence devices according to Examples 1 to 9 and Comparative Examples 1 to 5 were measured. The results are shown in Table 1.

TABLE 1

| | Hole transport layer | Device efficiency |
|---|---|---|
| Example 1 | Example Compound 3-A1-38 | 109% |
| Example 2 | Example Compound 3-A1-93 | 110% |
| Example 3 | Example Compound 3-C1-93 | 108% |
| Example 4 | Example Compound 1-A1-93 | 109% |
| Example 5 | Example Compound 2-A1-93 | 108% |
| Example 6 | Example Compound 4-A1-31 | 108% |
| Example 7 | Example Compound 5-A1-31 | 108% |
| Example 8 | Example Compound 3-A1-98 | 111% |

TABLE 1-continued

| | Hole transport layer | Device efficiency |
|---|---|---|
| Example 9 | Example Compound 5-A1-36 | 110% |
| Comparative Example 1 | Comparative Example Compound R1 | 93% |
| Comparative Example 2 | Comparative Example Compound R2 | 94% |
| Comparative Example 3 | Comparative Example Compound R3 | 95% |
| Comparative Example 4 | Comparative Example Compound R4 | 100% |
| Comparative Example 5 | Comparative Example Compound R5 | 97% |

Referring to Table 1, it may be confirmed that Examples 1 to 9 have all achieved high efficiency compared to Comparative Examples 1 to 5.

It is found that Example Compounds have three aryl groups in one benzene ring of the naphthylene close to the nitrogen atom, and thus electrons at a specific position of the one benzene ring of the naphthylene become plentiful, thereby increasing device efficiency.

When comparing the compounds of Example 1 and Comparative Example 1, in a structure in which the arylamine group is substituted at position 2 of the naphthylene, the efficiency of the device of Example 1 including the compound of Example 1 in which the aryl groups are substituted at positions 1 and 3 of the naphthylene was increased more than the compound of Comparative Example 1 in which the aryl groups are substituted at positions 1 and 4 of the naphthylene. This is believed that electronic effects vary depending on the substitution positions of the aryl groups, and it is found that when the aryl groups are substituted at positions 1 and 3, electronic effects are more effectively exhibited.

The compounds of Examples 2 to 3 and 8 are embodiments where an arylamine group is substituted at position 2 of the naphthylene, wherein an aryl group is substituted at positions 1 and 3 so that electronic effects by a substituent like Example 1 may be expected and it may be confirmed that the efficiency of the devices is increased compared to Comparative Examples.

The compound of Example 5 is an embodiment where the arylamine group is substituted at position 1 of the naphthylene, wherein the aryl groups are substituted at positions 2 and 4 so that electronic effects by a substituent like Example 1 may be expected and it may be confirmed that the efficiency of the device is increased compared to Comparative Examples.

When comparing the compounds of Example 6 and Comparative Example 2, when the arylamine group is substituted at position 1 of the naphthylene, there are no aryl groups at the position adjacent to the arylamine group, and electronic effects may be less effective. Thus, it is found that the heteroaryl group is substituted at $Ar_1$ or $Ar_2$ which is bonded to the nitrogen atom and the aryl group which is a linker between the naphthylene and the nitrogen atom, thereby effectively exhibiting electron donating effects.

In comparing the compounds of Example 6 and Comparative Example 3, it is found that the aryl group is disclosed as a linker between the naphthylene and the nitrogen atom, thereby effectively exhibiting electron donating effects with the naphthylene.

When comparing the compounds of Examples 8 to 9 and Comparative Examples 1 to 5, these are embodiments where the substituents $Ar_1$ and $Ar_2$ of the nitrogen atom are heteroaryl groups, and it is found that electrons of the naphthylene become plentiful by electron donating effects of the heteroaryl group, thereby increasing efficiency of the devices.

The organic electroluminescence device according to an embodiment of the inventive concept uses the amine compound according to an embodiment, thereby achieving a low driving voltage, high efficiency, and a long service life.

The amine compound according to an embodiment of the inventive concept may have improved characteristics of the process of the hole injection and hole transport due to the improvement of orientation characteristics by stereoscopic factors and electronic characteristics by delocalization.

The organic electroluminescence device according to an embodiment of the inventive concept may have excellent efficiency.

The amine compound according to an embodiment of the inventive concept may be used as a material of the hole transport region of the organic electroluminescence device, and thereby the organic electroluminescence device may have improved efficiency.

Although the embodiments of the inventive concept are described, those with ordinary skill in the technical field to which the inventive concept pertains will understood that the disclosure may be carried out in other forms without changing the technical idea or essential features. Therefore, the disclosed embodiments are to be considered illustrative and not restrictive.

What is claimed is:

1. An organic electroluminescence device comprising:

a first electrode;

a hole transport region disposed on the first electrode;

an emission layer disposed on the hole transport region;

an electron transport region disposed on the emission layer; and a second electrode disposed on the electron transport region, wherein the hole transport region comprises an amine compound represented by Formula 1:

[Formula 1]

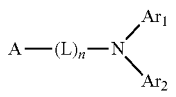

wherein the amine compound represented by Formula 1 is at least one selected from Compound Group 1, Compound Group 2, Compound Group 3, and Compound Group 4:

[Compound Group 1]
| | n | A—L—* | $Ar_1$ | $Ar_2$ |
|---|---|---|---|---|
| 2-A1-50 | 1 | 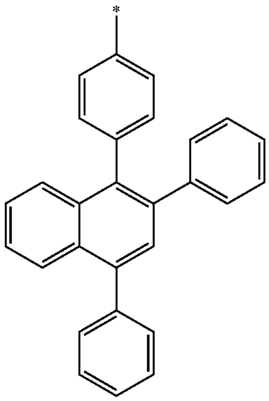 | 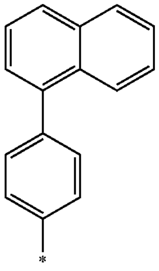 [SMILES: *c1ccc(-c2cccc3ccccc23)cc1] | 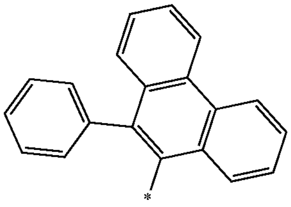 [SMILES: *c1c(-c2ccccc2)c2ccccc2c2ccccc12] |
| 2-A1-51 | 1 | 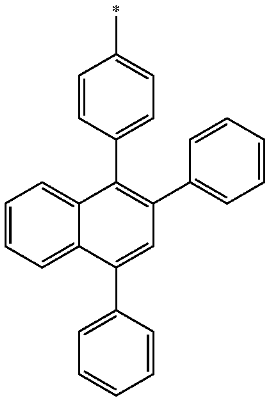 [SMILES: *c1ccc(-c2c(-c3ccccc3)cc(-c3ccccc3)c3ccccc23)cc1] | 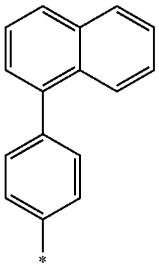 [SMILES: *c1ccc(-c2cccc3ccccc23)cc1] | 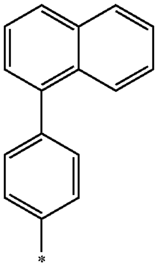 [SMILES: *c1ccc(-c2cccc3ccccc23)cc1] |
| 2-A1-52 | 1 | 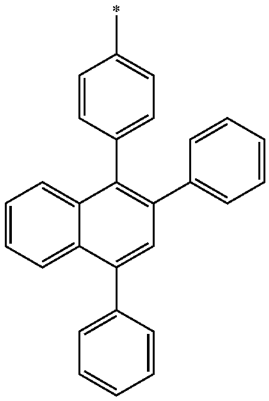 [SMILES: *c1ccc(-c2c(-c3ccccc3)cc(-c3ccccc3)c3ccccc23)cc1] | 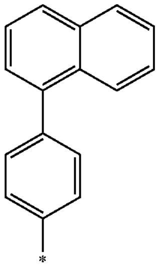 [SMILES: *c1ccc(-c2cccc3ccccc23)cc1] | 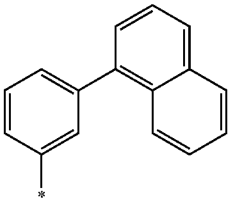 [SMILES: *c1cccc(-c2cccc3ccccc23)c1] |

-continued
| [Compound Group 1] | | | | |
|---|---|---|---|---|
| | n | A—L—* | $Ar_1$ | $Ar_2$ |
| 2-A1-53 | 1 | 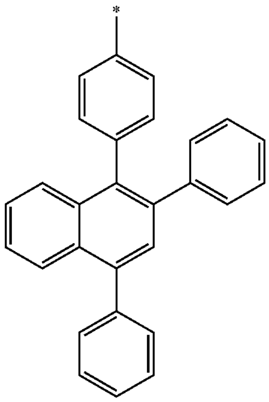 [SMILES: *c1ccc(-c2c(-c3ccccc3)cc(-c3ccccc3)c3ccccc23)cc1] | 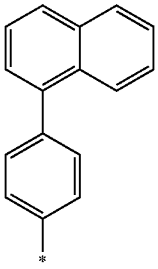 [SMILES: *c1ccc(-c2cccc3ccccc23)cc1] | 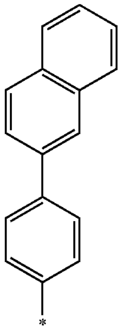 |
| 2-A1-54 | 1 | 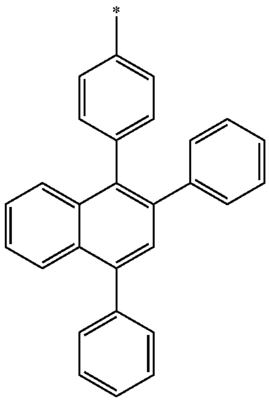 [SMILES: *c1ccc(-c2c(-c3ccccc3)cc(-c3ccccc3)c3ccccc23)cc1] | 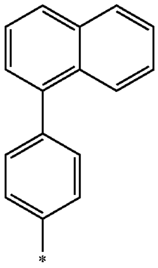 [SMILES: *c1ccc(-c2cccc3ccccc23)cc1] | 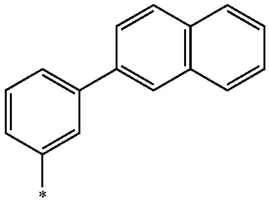 |
| 2-A1-55 | 1 | 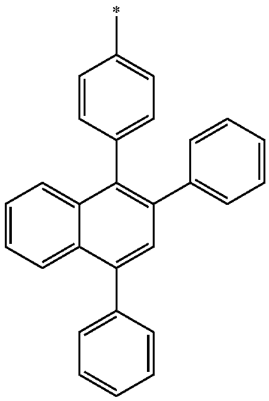 [SMILES: *c1ccc(-c2c(-c3ccccc3)cc(-c3ccccc3)c3ccccc23)cc1] | 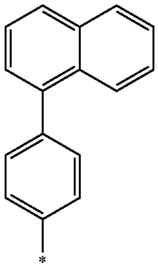 [SMILES: *c1ccc(-c2cccc3ccccc23)cc1] | 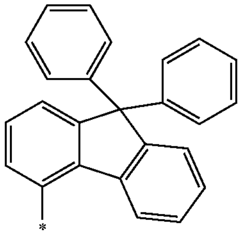 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 2-A1-56 | 1 | 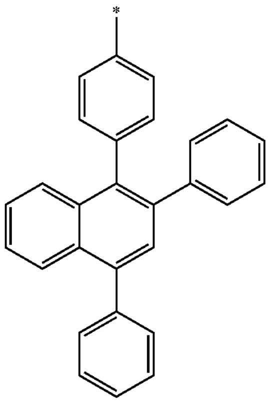 [SMILES: *c1ccc(-c2c(-c3ccccc3)cc(-c3ccccc3)c3ccccc23)cc1] | 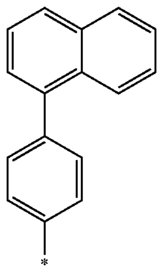 [SMILES: *c1ccc(-c2cccc3ccccc23)cc1] | 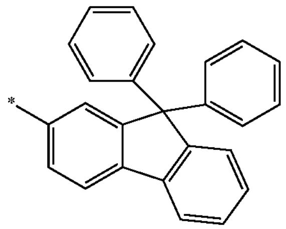 [SMILES: *c1ccc2c(c1)C(c1ccccc1)(c1ccccc1)c1ccccc1-2] |
| 2-A1-58 | 1 | 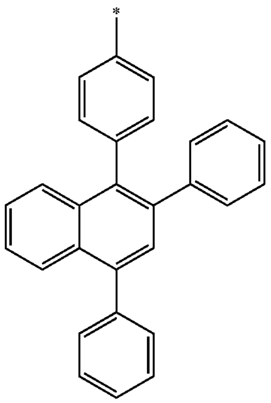 [SMILES: *c1ccc(-c2c(-c3ccccc3)cc(-c3ccccc3)c3ccccc23)cc1] | 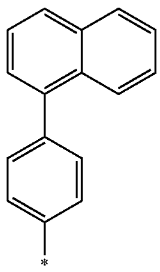 [SMILES: *c1ccc(-c2cccc3ccccc23)cc1] | 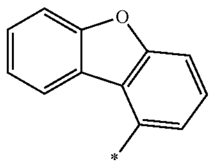 [SMILES: *c1cccc2oc3ccccc3c12] |
| 2-A1-59 | 1 | 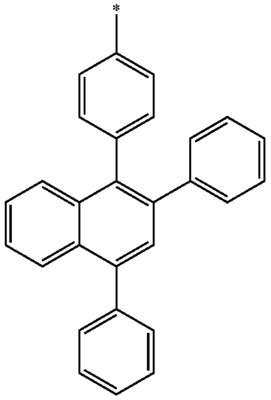 [SMILES: *c1ccc(-c2c(-c3ccccc3)cc(-c3ccccc3)c3ccccc23)cc1] | 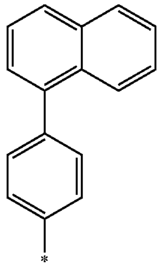 [SMILES: *c1ccc(-c2cccc3ccccc23)cc1] | 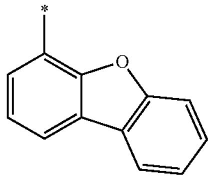 [SMILES: *c1cccc2c1oc1ccccc12] |

-continued
| [Compound Group 1] | | | | |
|---|---|---|---|---|
| | n | A—L—* | $Ar_1$ | $Ar_2$ |
| 2-A1-60 | 1 | 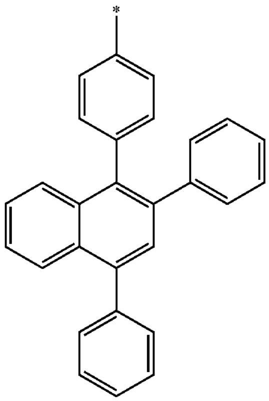 [SMILES: *c1ccc(-c2c(-c3ccccc3)cc(-c3ccccc3)c3ccccc23)cc1] | 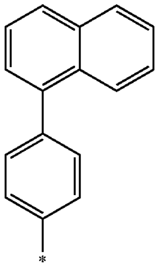 [SMILES: *c1ccc(-c2cccc3ccccc23)cc1] | 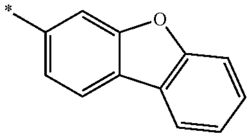 [SMILES: *c1ccc2c(c1)oc1ccccc12] |
| 2-A1-61 | 1 | 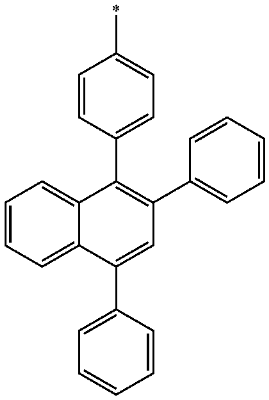 [SMILES: *c1ccc(-c2c(-c3ccccc3)cc(-c3ccccc3)c3ccccc23)cc1] | 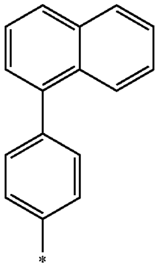 [SMILES: *c1ccc(-c2cccc3ccccc23)cc1] | 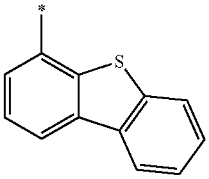 [SMILES: *c1cccc2c1sc1ccccc12] |
| 2-A1-62 | 1 | 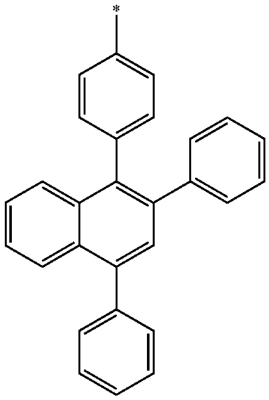 [SMILES: *c1ccc(-c2c(-c3ccccc3)cc(-c3ccccc3)c3ccccc23)cc1] | 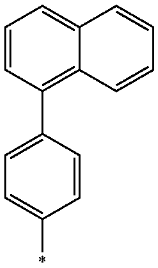 [SMILES: *c1ccc(-c2cccc3ccccc23)cc1] | 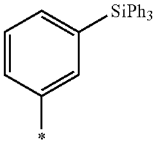 |

-continued
[Compound Group 1]
| | n | A—L—* | $Ar_1$ | $Ar_2$ |
|---|---|---|---|---|
| 2-A1-65 | 1 | 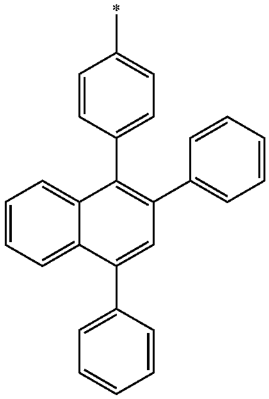 [SMILES: *c1ccc(-c2c(-c3ccccc3)cc(-c3ccccc3)c3ccccc23)cc1] | 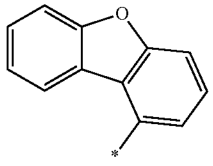 [SMILES: *c1cccc2oc3ccccc3c12] | 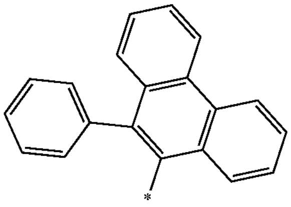 [SMILES: *c1c(-c2ccccc2)c2ccccc2c2ccccc12] |
| 2-A1-66 | 1 | 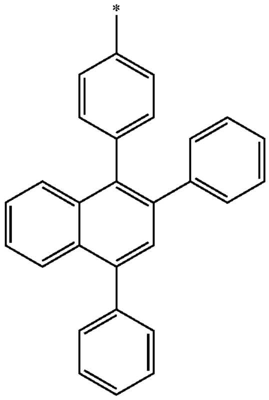 [SMILES: *c1ccc(-c2c(-c3ccccc3)cc(-c3ccccc3)c3ccccc23)cc1] | 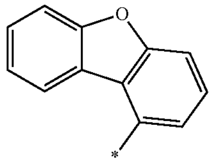 [SMILES: *c1cccc2oc3ccccc3c12] | 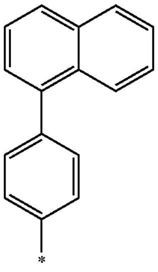 [SMILES: *c1ccc(-c2cccc3ccccc23)cc1] |
| 2-A1-67 | 1 | 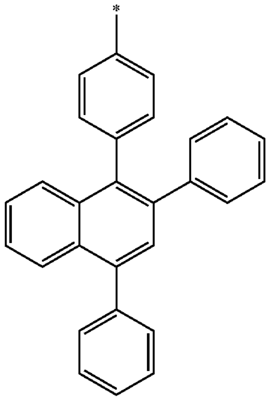 [SMILES: *c1ccc(-c2c(-c3ccccc3)cc(-c3ccccc3)c3ccccc23)cc1] | 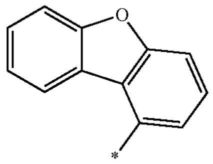 [SMILES: *c1cccc2oc3ccccc3c12] | 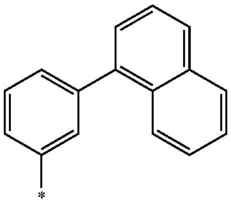 [SMILES: *c1cccc(-c2cccc3ccccc23)c1] |

-continued
| [Compound Group 1] | n | A—L—* | $Ar_1$ | $Ar_2$ |
|---|---|---|---|---|
| 2-A1-68 | 1 | 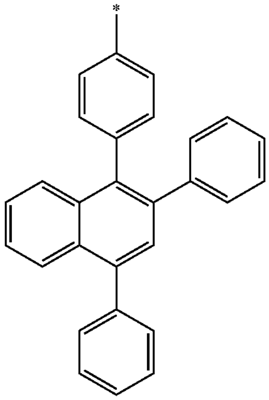 [SMILES: *c1ccc(-c2c(-c3ccccc3)cc(-c3ccccc3)c3ccccc23)cc1] | 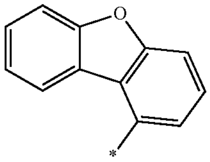 [SMILES: *c1cccc2oc3ccccc3c12] | 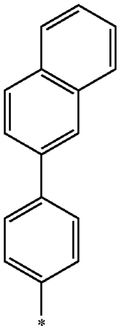 |
| 2-A1-69 | 1 | 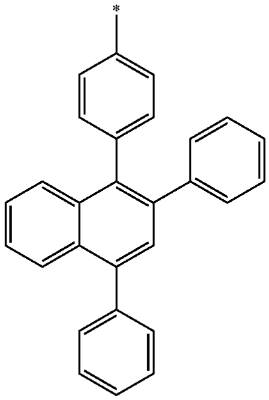 [SMILES: *c1ccc(-c2c(-c3ccccc3)cc(-c3ccccc3)c3ccccc23)cc1] | 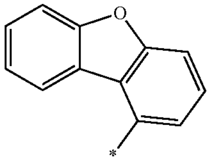 [SMILES: *c1cccc2oc3ccccc3c12] | 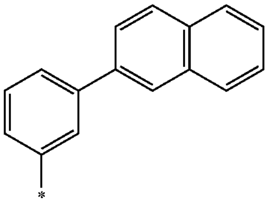 |
| 2-A1-70 | 1 | 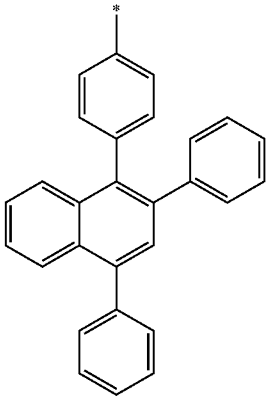 [SMILES: *c1ccc(-c2c(-c3ccccc3)cc(-c3ccccc3)c3ccccc23)cc1] | 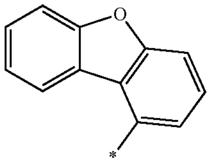 [SMILES: *c1cccc2oc3ccccc3c12] | 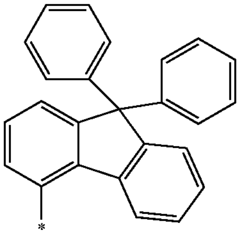 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 2-A1-71 | 1 | 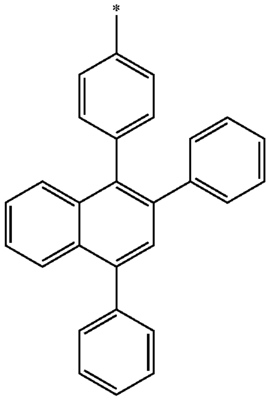 [SMILES: *c1ccc(-c2c(-c3ccccc3)cc(-c3ccccc3)c3ccccc23)cc1] | 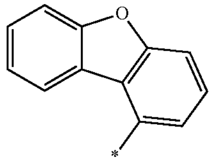 [SMILES: *c1cccc2oc3ccccc3c12] | 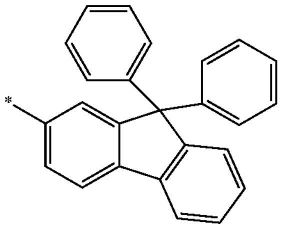 [SMILES: *c1ccc2c(c1)C(c1ccccc1)(c1ccccc1)c1ccccc1-2] |
| 2-A1-76 | 1 | 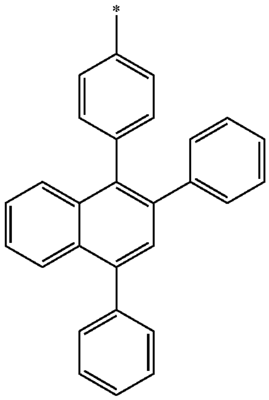 [SMILES: *c1ccc(-c2c(-c3ccccc3)cc(-c3ccccc3)c3ccccc23)cc1] | 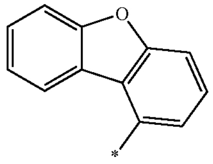 [SMILES: *c1cccc2oc3ccccc3c12] | 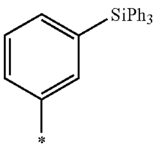 |
| 2-A1-78 | 1 | 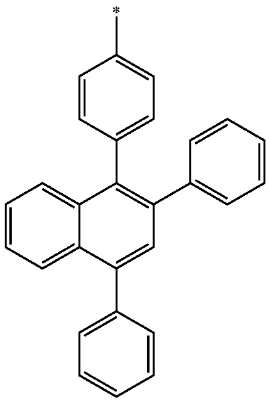 [SMILES: *c1ccc(-c2c(-c3ccccc3)cc(-c3ccccc3)c3ccccc23)cc1] | 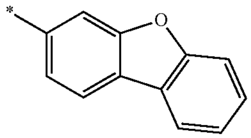 [SMILES: *c1ccc2c(c1)oc1ccccc12] | 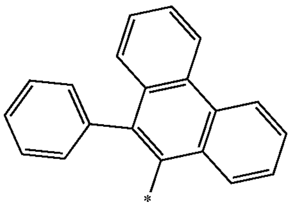 [SMILES: *c1c(-c2ccccc2)c2ccccc2c2ccccc12] |

-continued
[Compound Group 1]
| | n | A—L—* | $Ar_1$ | $Ar_2$ |
|---|---|---|---|---|
| 2-A1-79 | 1 | 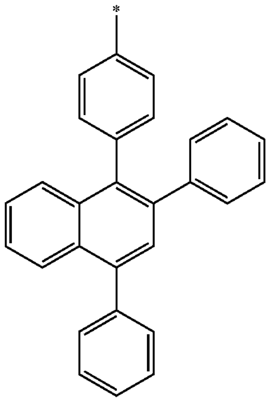 [SMILES: *c1ccc(-c2c(-c3ccccc3)cc(-c3ccccc3)c3ccccc23)cc1] | 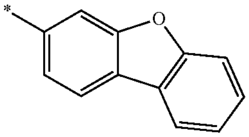 [SMILES: *c1ccc2c(c1)oc1ccccc12] | 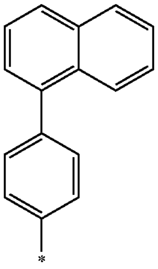 [SMILES: *c1ccc(-c2cccc3ccccc23)cc1] |
| 2-A1-80 | 1 | 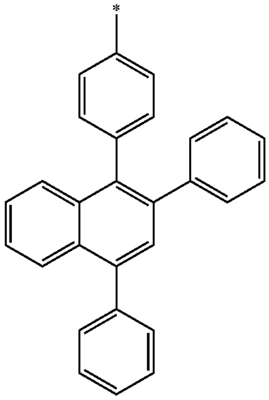 [SMILES: *c1ccc(-c2c(-c3ccccc3)cc(-c3ccccc3)c3ccccc23)cc1] | 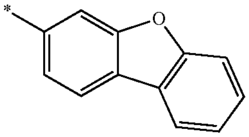 | 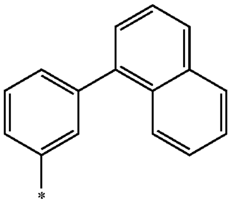 [SMILES: *c1cccc(-c2cccc3ccccc23)c1] |
| 2-A1-81 | 1 | 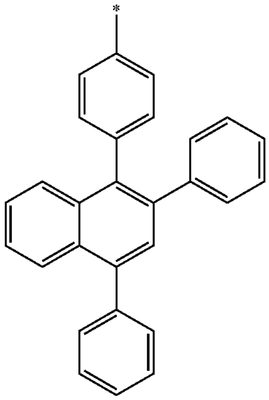 [SMILES: *c1ccc(-c2c(-c3ccccc3)cc(-c3ccccc3)c3ccccc23)cc1] | 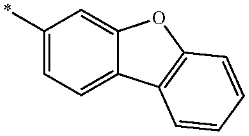 [SMILES: *c1ccc2c(c1)oc1ccccc12] | 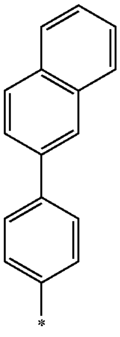 |

-continued
| [Compound Group 1] | | | | |
|---|---|---|---|---|
| | n | A—L—* | $Ar_1$ | $Ar_2$ |
| 2-A1-82 | 1 | 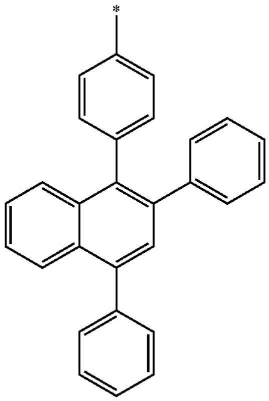 [SMILES: *c1ccc(-c2c(-c3ccccc3)cc(-c3ccccc3)c3ccccc23)cc1] | 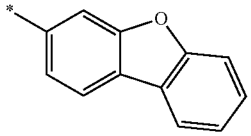 [SMILES: *c1ccc2c(c1)oc1ccccc12] | 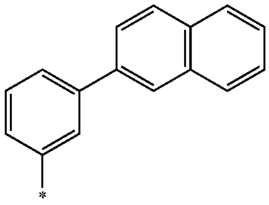 |
| 2-A1-83 | 1 | 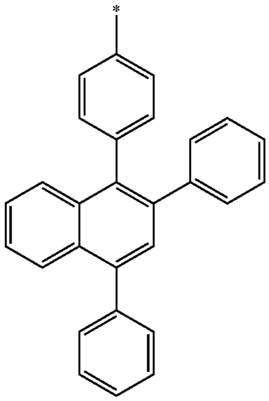 [SMILES: *c1ccc(-c2c(-c3ccccc3)cc(-c3ccccc3)c3ccccc23)cc1] | 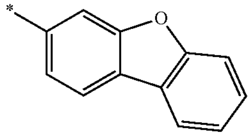 [SMILES: *c1ccc2c(c1)oc1ccccc12] | 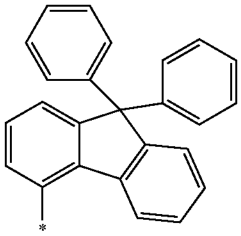 [SMILES: *c1cccc2c1-c1ccccc1C2(c1ccccc1)c1ccccc1] |
| 2-A1-84 | 1 | 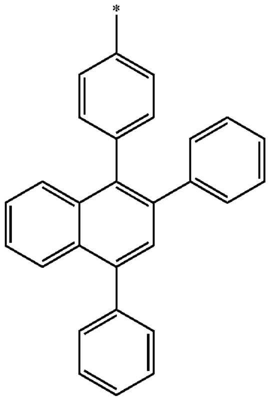 [SMILES: *c1ccc(-c2c(-c3ccccc3)cc(-c3ccccc3)c3ccccc23)cc1] | 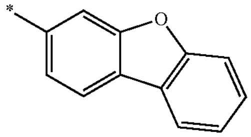 [SMILES: *c1ccc2c(c1)oc1ccccc12] | 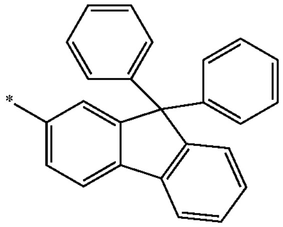 [SMILES: *c1ccc2c(c1)C(c1ccccc1)(c1ccccc1)c1ccccc1-2] |

-continued
| [Compound Group 1] | | | | |
|---|---|---|---|---|
| | n | A—L—* | $Ar_1$ | $Ar_2$ |
| 2-A1-88 | 1 | 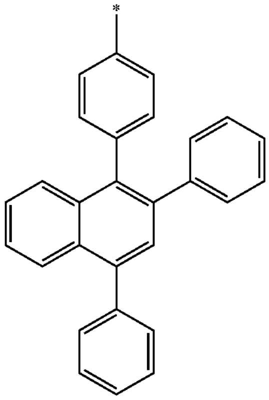 [SMILES: *c1ccc(-c2c(-c3ccccc3)cc(-c3ccccc3)c3ccccc23)cc1] | 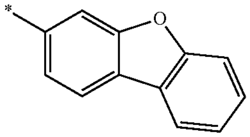 [SMILES: *c1ccc2c(c1)oc1ccccc12] | 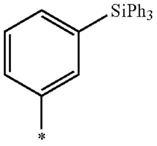 |
| 2-A1-90 | 1 | 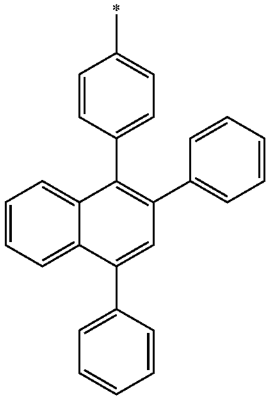 [SMILES: *c1ccc(-c2c(-c3ccccc3)cc(-c3ccccc3)c3ccccc23)cc1] | 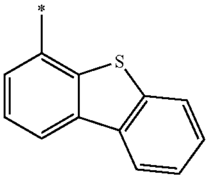 | 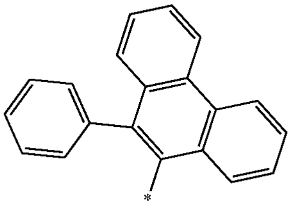 [SMILES: *c1c(-c2ccccc2)c2ccccc2c2ccccc12] |
| 2-A1-91 | 1 | 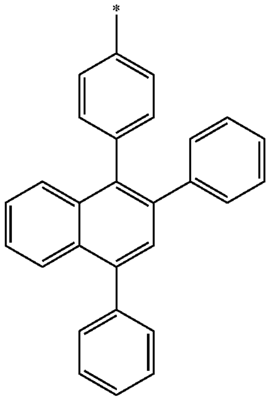 [SMILES: *c1ccc(-c2c(-c3ccccc3)cc(-c3ccccc3)c3ccccc23)cc1] | 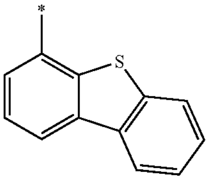 | 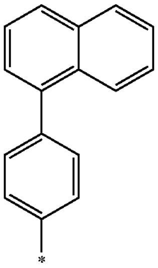 [SMILES: *c1ccc(-c2cccc3ccccc23)cc1] |

-continued
[Compound Group 1]
| | n | A—L—* | $Ar_1$ | $Ar_2$ |
| --- | --- | --- | --- | --- |
| 2-A1-92 | 1 | 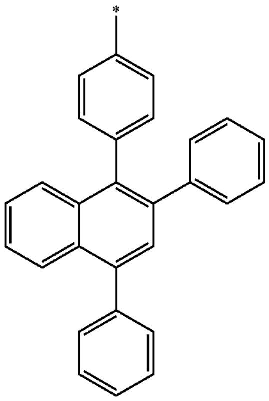 [SMILES: *c1ccc(-c2c(-c3ccccc3)cc(-c3ccccc3)c3ccccc23)cc1] | 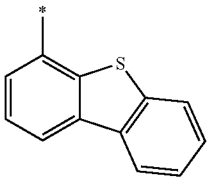 | 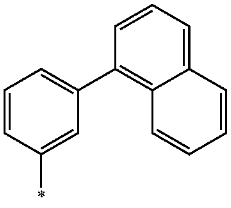 |
| 2-A1-93 | 1 | 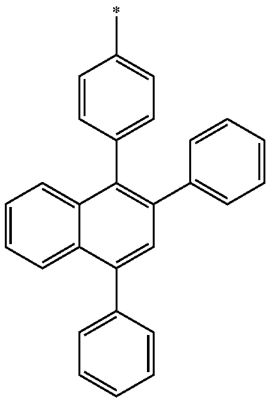 [SMILES: *c1ccc(-c2c(-c3ccccc3)cc(-c3ccccc3)c3ccccc23)cc1] | 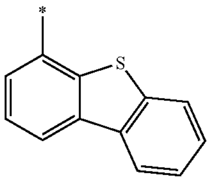 | 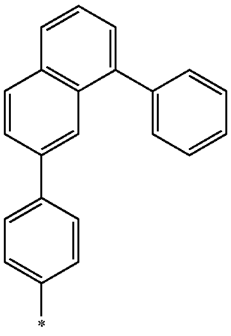 [SMILES: *c1ccc(-c2ccc3cccc(-c4ccccc4)c3c2)cc1] |
| 2-A1-94 | 1 | 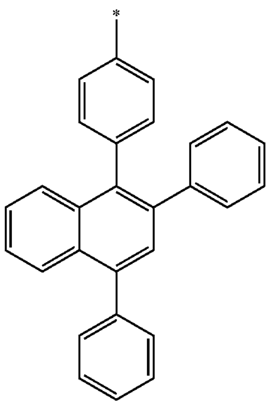 [SMILES: *c1ccc(-c2c(-c3ccccc3)cc(-c3ccccc3)c3ccccc23)cc1] | 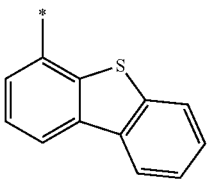 | 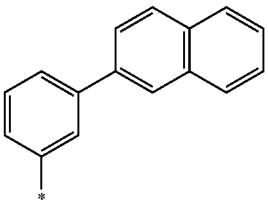 [SMILES: *c1cccc(-c2ccc3ccccc3c2)c1] |

-continued
[Compound Group 1]
| | n | A—L—* | $Ar_1$ | $Ar_2$ |
|---|---|---|---|---|
| 2-A1-95 | 1 | 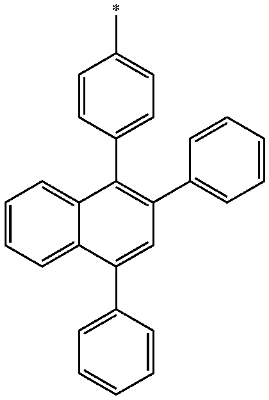 [SMILES: *c1ccc(-c2c(-c3ccccc3)cc(-c3ccccc3)c3ccccc23)cc1] | 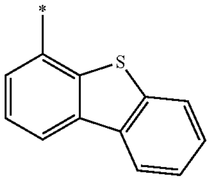 | 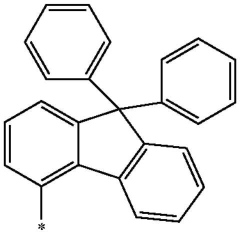 [SMILES: *c1cccc2c1-c1ccccc1C2(c1ccccc1)c1ccccc1] |
| 2-A1-96 | 1 | 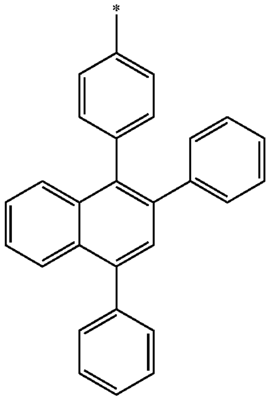 [SMILES: *c1ccc(-c2c(-c3ccccc3)cc(-c3ccccc3)c3ccccc23)cc1] | 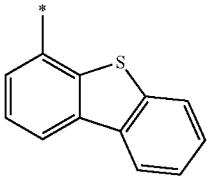 | 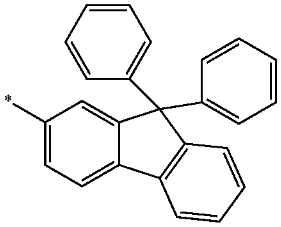 [SMILES: *c1ccc2c(c1)C(c1ccccc1)(c1ccccc1)c1ccccc1-2] |
| 2-A1-99 | 1 | 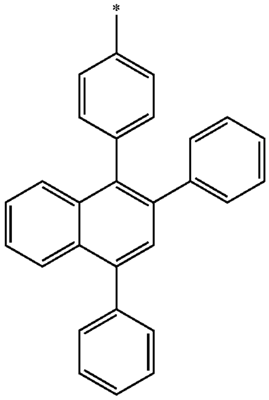 [SMILES: *c1ccc(-c2c(-c3ccccc3)cc(-c3ccccc3)c3ccccc23)cc1] | 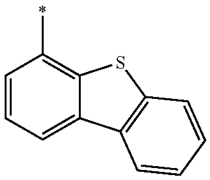 | 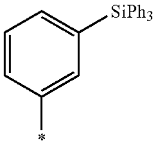 |
| 3-A1-50 | 1 | 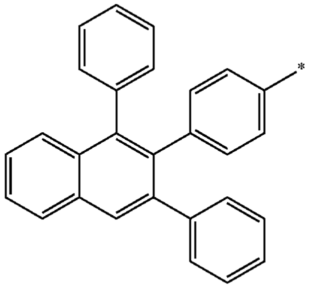 [SMILES: *c1ccc(-c2c(-c3ccccc3)cc3ccccc3c2-c2ccccc2)cc1] | 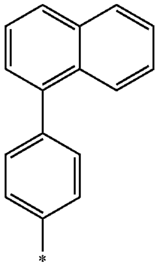 [SMILES: *c1ccc(-c2cccc3ccccc23)cc1] | 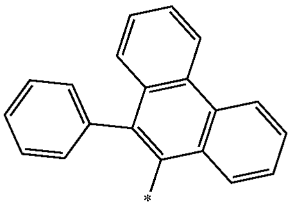 [SMILES: *c1c(-c2ccccc2)c2ccccc2c2ccccc12] |

-continued
[Compound Group 1]
| | n | A—L—* | $Ar_1$ | $Ar_2$ |
|---|---|---|---|---|
| 3-A1-51 | 1 | 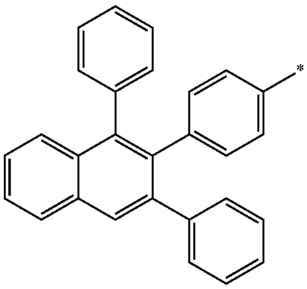 [SMILES: *c1ccc(-c2c(-c3ccccc3)cc3ccccc3c2-c2ccccc2)cc1] | 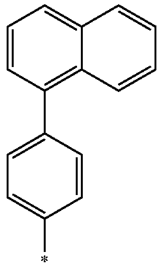 [SMILES: *c1ccc(-c2cccc3ccccc23)cc1] | 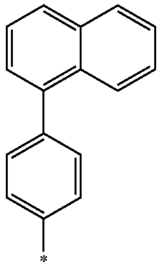 [SMILES: *c1ccc(-c2cccc3ccccc23)cc1] |
| 3-A1-52 | 1 | 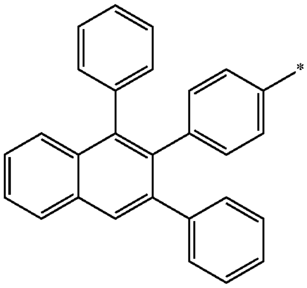 [SMILES: *c1ccc(-c2c(-c3ccccc3)cc3ccccc3c2-c2ccccc2)cc1] | 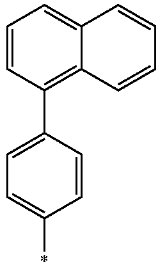 [SMILES: *c1ccc(-c2cccc3ccccc23)cc1] | 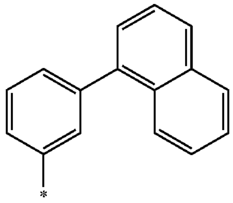 [SMILES: *c1cccc(-c2cccc3ccccc23)c1] |
| 3-A1-53 | 1 | 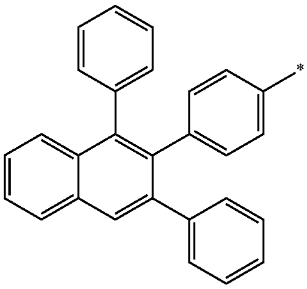 [SMILES: *c1ccc(-c2c(-c3ccccc3)cc3ccccc3c2-c2ccccc2)cc1] | 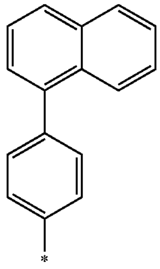 [SMILES: *c1ccc(-c2cccc3ccccc23)cc1] | 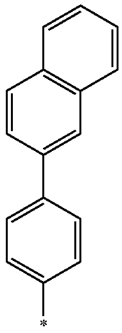 |
| 3-A1-54 | 1 | 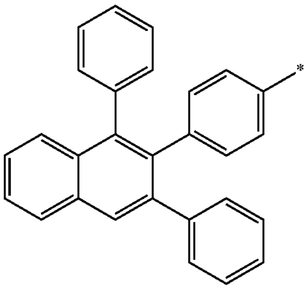 | 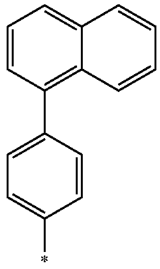 [SMILES: *c1ccc(-c2cccc3ccccc23)cc1] | 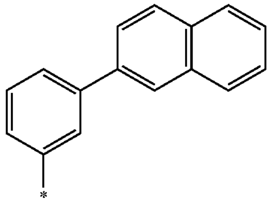 [SMILES: *c1cccc(-c2ccc3ccccc3c2)c1] |
| 3-A1-55 | 1 | 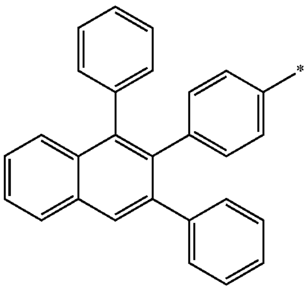 [SMILES: *c1ccc(-c2c(-c3ccccc3)cc3ccccc3c2-c2ccccc2)cc1] | 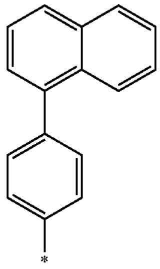 [SMILES: *c1ccc(-c2cccc3ccccc23)cc1] | 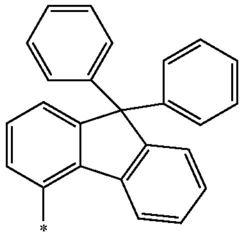 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 3-A1-56 | 1 | 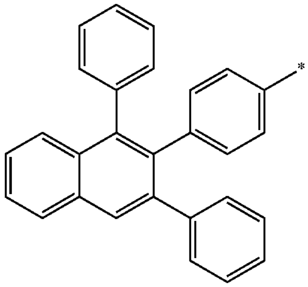 [SMILES: *c1ccc(-c2c(-c3ccccc3)cc3ccccc3c2-c2ccccc2)cc1] | 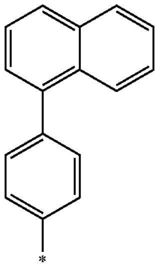 [SMILES: *c1ccc(-c2cccc3ccccc23)cc1] | 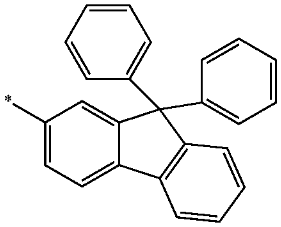 [SMILES: *c1ccc2c(c1)C(c1ccccc1)(c1ccccc1)c1ccccc1-2] |
| 3-A1-58 | 1 | 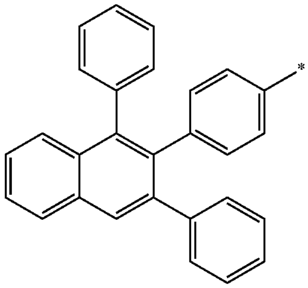 [SMILES: *c1ccc(-c2c(-c3ccccc3)cc3ccccc3c2-c2ccccc2)cc1] | 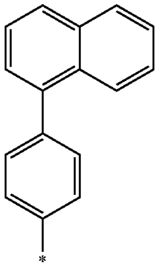 [SMILES: *c1ccc(-c2cccc3ccccc23)cc1] | 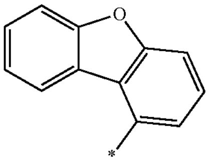 [SMILES: *c1cccc2oc3ccccc3c12] |
| 3-A1-59 | 1 | 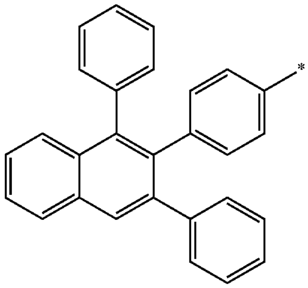 [SMILES: *c1ccc(-c2c(-c3ccccc3)cc3ccccc3c2-c2ccccc2)cc1] | 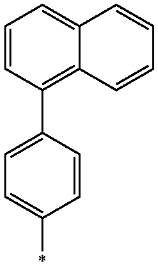 [SMILES: *c1ccc(-c2cccc3ccccc23)cc1] | 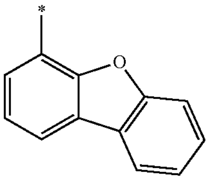 |
| 3-A1-60 | 1 | 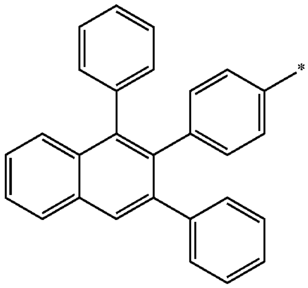 | 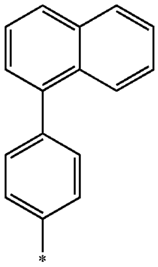 [SMILES: *c1ccc(-c2cccc3ccccc23)cc1] | 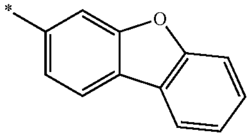 [SMILES: *c1ccc2c(c1)oc1ccccc12] |
| 3-A1-61 | 1 | 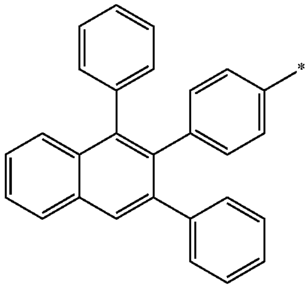 [SMILES: *c1ccc(-c2c(-c3ccccc3)cc3ccccc3c2-c2ccccc2)cc1] | 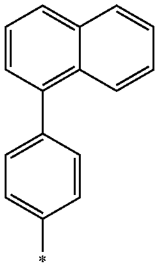 [SMILES: *c1ccc(-c2cccc3ccccc23)cc1] | 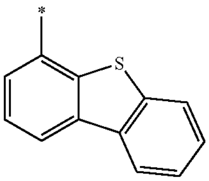 [SMILES: *c1cccc2c1sc1ccccc12] |

-continued
[Compound Group 1]
| | n | A—L—* | $Ar_1$ | $Ar_2$ |
|---|---|---|---|---|
| 3-A1-62 | 1 | 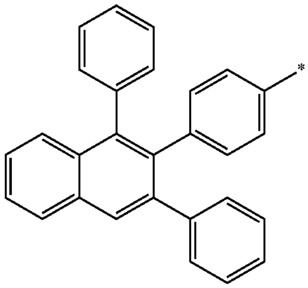 | 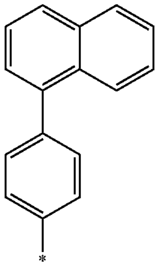 [SMILES: *c1ccc(-c2cccc3ccccc23)cc1] | 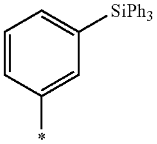 |
| 3-A1-65 | 1 | 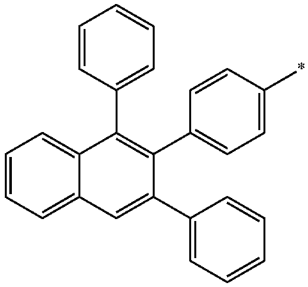 [SMILES: *c1ccc(-c2c(-c3ccccc3)cc3ccccc3c2-c2ccccc2)cc1] | 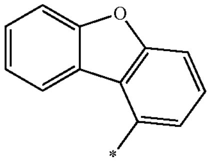 [SMILES: *c1cccc2oc3ccccc3c12] | 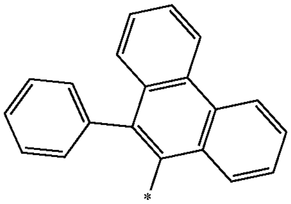 [SMILES: *c1c(-c2ccccc2)c2ccccc2c2ccccc12] |
| 3-A1-66 | 1 | 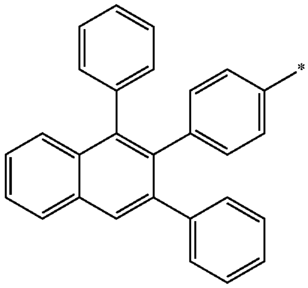 [SMILES: *c1ccc(-c2c(-c3ccccc3)cc3ccccc3c2-c2ccccc2)cc1] | 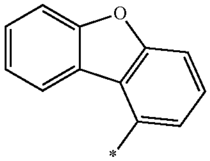 [SMILES: *c1cccc2oc3ccccc3c12] | 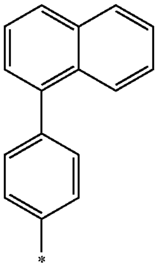 [SMILES: *c1ccc(-c2cccc3ccccc23)cc1] |
| 3-A1-67 | 1 | 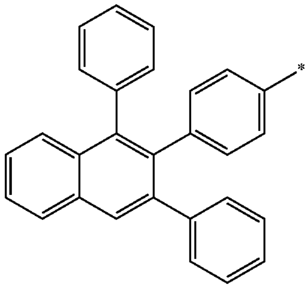 [SMILES: *c1ccc(-c2c(-c3ccccc3)cc3ccccc3c2-c2ccccc2)cc1] | 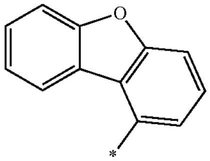 [SMILES: *c1cccc2oc3ccccc3c12] | 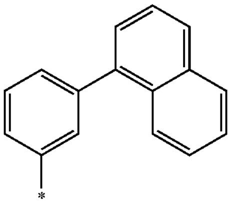 [SMILES: *c1cccc(-c2cccc3ccccc23)c1] |
| 3-A1-68 | 1 | 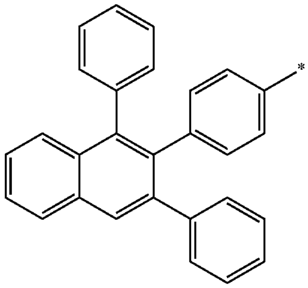 [SMILES: *c1ccc(-c2c(-c3ccccc3)cc3ccccc3c2-c2ccccc2)cc1] | 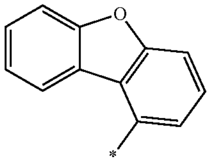 [SMILES: *c1cccc2oc3ccccc3c12] | 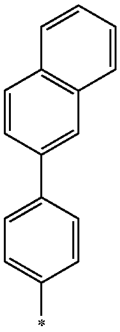 |

-continued
| [Compound Group 1] | | | | |
|---|---|---|---|---|
| | n | A—L—* | $Ar_1$ | $Ar_2$ |
| 3-A1-69 | 1 | 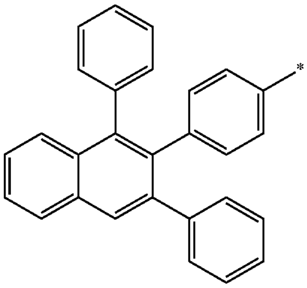 [SMILES: *c1ccc(-c2c(-c3ccccc3)cc3ccccc3c2-c2ccccc2)cc1] | 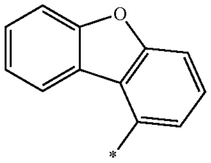 [SMILES: *c1cccc2oc3ccccc3c12] | 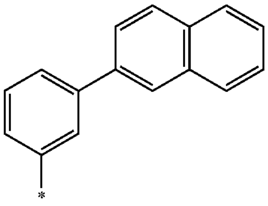 [SMILES: *c1cccc(-c2ccc3ccccc3c2)c1] |
| 3-A1-70 | 1 | 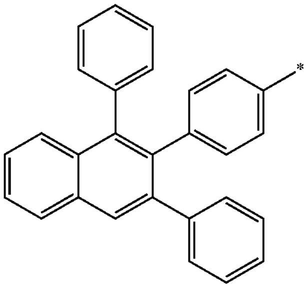 | 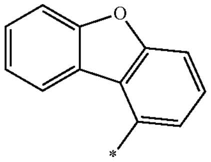 [SMILES: *c1cccc2oc3ccccc3c12] | 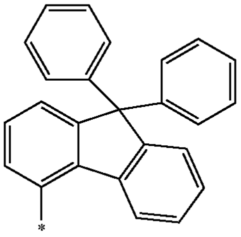 [SMILES: *c1cccc2c1-c1ccccc1C2(c1ccccc1)c1ccccc1] |
| 3-A1-71 | 1 | 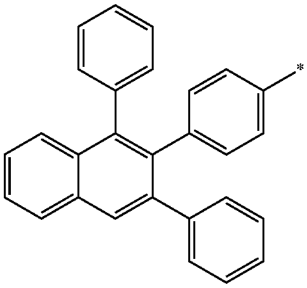 [SMILES: *c1ccc(-c2c(-c3ccccc3)cc3ccccc3c2-c2ccccc2)cc1] | 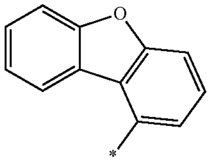 [SMILES: *c1cccc2oc3ccccc3c12] | 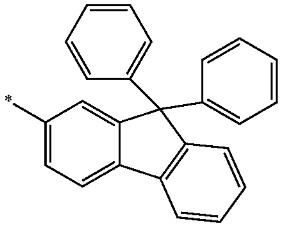 [SMILES: *c1ccc2c(c1)C(c1ccccc1)(c1ccccc1)c1ccccc1-2] |
| 3-A1-76 | 1 | 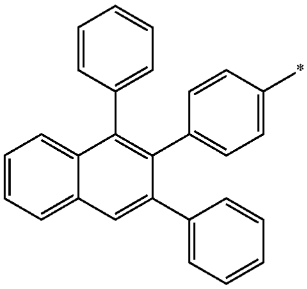 | 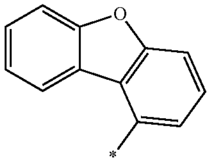 [SMILES: *c1cccc2oc3ccccc3c12] | 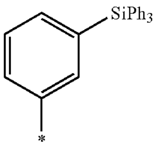 |
| 3-A1-78 | 1 | 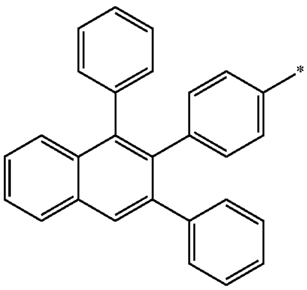 | 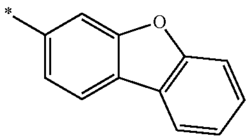 [SMILES: *c1ccc2c(c1)oc1ccccc12] | 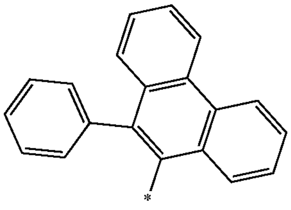 [SMILES: *c1c(-c2ccccc2)c2ccccc2c2ccccc12] |

-continued
[Compound Group 1]
| | n | A—L—* | $Ar_1$ | $Ar_2$ |
|---|---|---|---|---|
| 3-A1-79 | 1 | 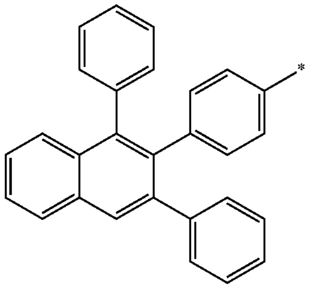 [SMILES: *c1ccc(-c2c(-c3ccccc3)cc3ccccc3c2-c2ccccc2)cc1] | 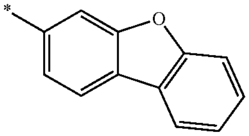 [SMILES: *c1ccc2c(c1)oc1ccccc12] | 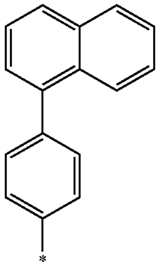 [SMILES: *c1ccc(-c2cccc3ccccc23)cc1] |
| 3-A1-80 | 1 | 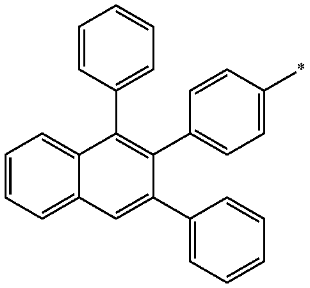 [SMILES: *c1ccc(-c2c(-c3ccccc3)cc3ccccc3c2-c2ccccc2)cc1] | 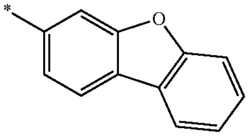 [SMILES: *c1ccc2c(c1)oc1ccccc12] | 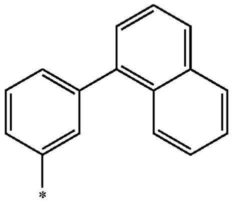 |
| 3-A1-81 | 1 | 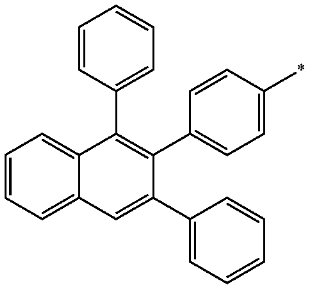 [SMILES: *c1ccc(-c2c(-c3ccccc3)cc3ccccc3c2-c2ccccc2)cc1] | 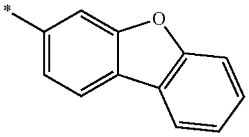 | 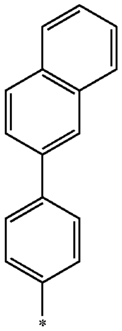 |
| 3-A1-82 | 1 | 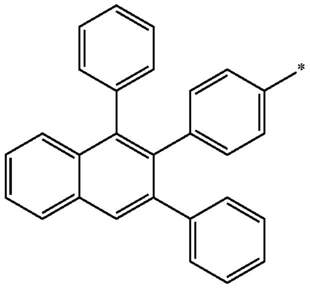 | 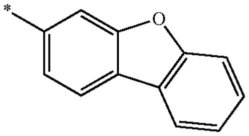 [SMILES: *c1ccc2c(c1)oc1ccccc12] | 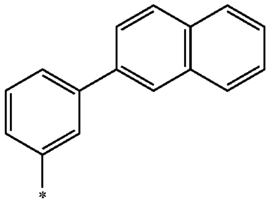 |
| 3-A1-83 | 1 | 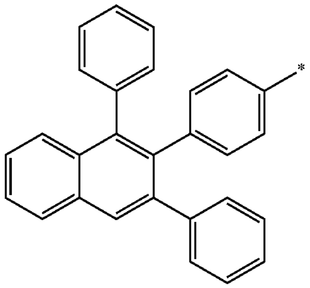 [SMILES: *c1ccc(-c2c(-c3ccccc3)cc3ccccc3c2-c2ccccc2)cc1] | 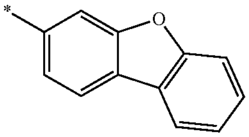 [SMILES: *c1ccc2c(c1)oc1ccccc12] | 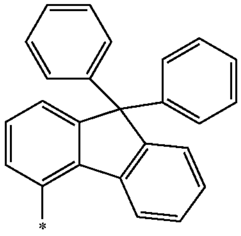 [SMILES: *c1cccc2c1-c1ccccc1C2(c1ccccc1)c1ccccc1] |

-continued
| | n | A—L—* | $Ar_1$ | $Ar_2$ |
|---|---|---|---|---|
| [Compound Group 1] | | | | |
| 3-A1-84 | 1 | 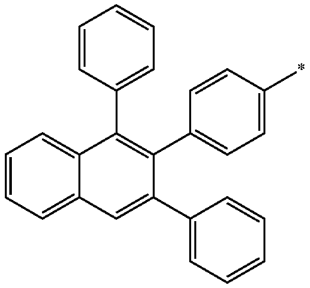 [SMILES: *c1ccc(-c2c(-c3ccccc3)cc3ccccc3c2-c2ccccc2)cc1] | 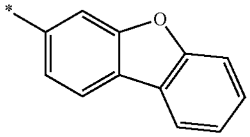 [SMILES: *c1ccc2c(c1)oc1ccccc12] | 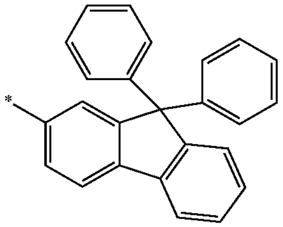 [SMILES: *c1ccc2c(c1)C(c1ccccc1)(c1ccccc1)c1ccccc1-2] |
| 3-A1-88 | 1 | 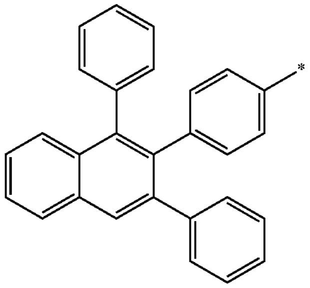 [SMILES: *c1ccc(-c2c(-c3ccccc3)cc3ccccc3c2-c2ccccc2)cc1] | 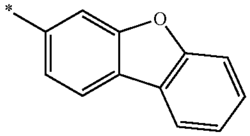 [SMILES: *c1ccc2c(c1)oc1ccccc12] | 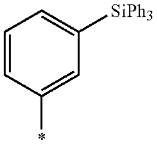 |
| 3-A1-90 | 1 | 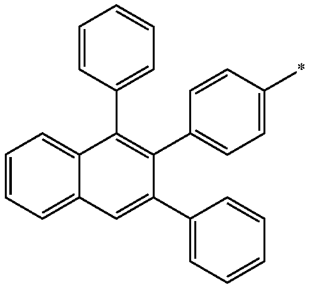 [SMILES: *c1ccc(-c2c(-c3ccccc3)cc3ccccc3c2-c2ccccc2)cc1] | 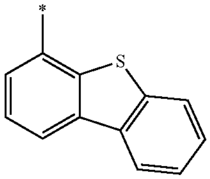 | 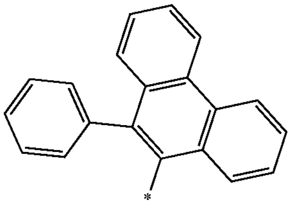 [SMILES: *c1c(-c2ccccc2)c2ccccc2c2ccccc12] |
| 3-A1-91 | 1 | 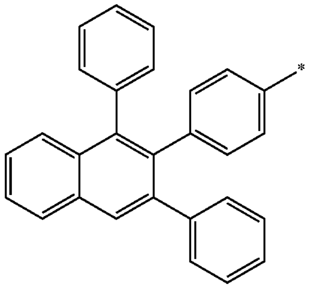 | 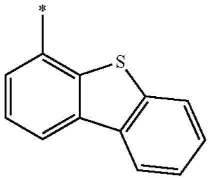 | 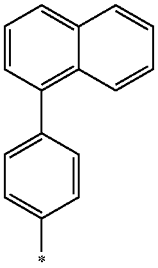 [SMILES: *c1ccc(-c2cccc3ccccc23)cc1] |
| 3-A1-92 | 1 | 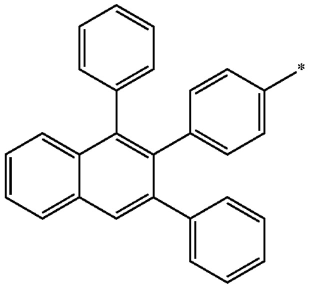 [SMILES: *c1ccc(-c2c(-c3ccccc3)cc3ccccc3c2-c2ccccc2)cc1] | 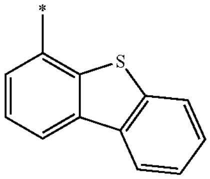 | 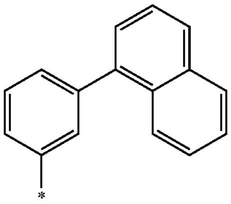 [SMILES: *c1cccc(-c2cccc3ccccc23)c1] |

-continued
| [Compound Group 1] | | | | |
|---|---|---|---|---|
| | n | A—L—* | $Ar_1$ | $Ar_2$ |
| 3-A1-93 | 1 | 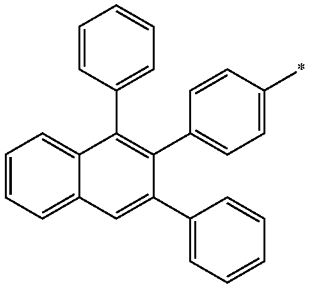 [SMILES: *c1ccc(-c2c(-c3ccccc3)cc3ccccc3c2-c2ccccc2)cc1] | 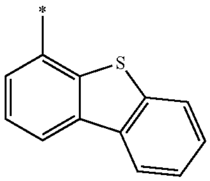 | 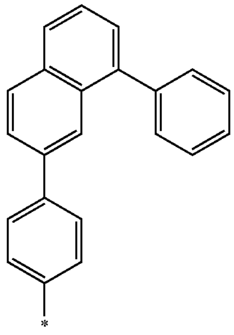 [SMILES: *c1ccc(-c2ccc3cccc(-c4ccccc4)c3c2)cc1] |
| 3-A1-94 | 1 | 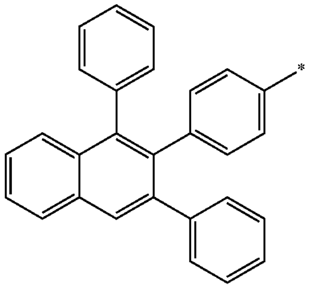 [SMILES: *c1ccc(-c2c(-c3ccccc3)cc3ccccc3c2-c2ccccc2)cc1] | 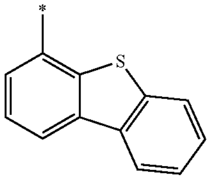 | 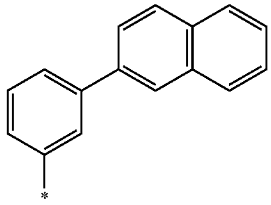 [SMILES: *c1cccc(-c2ccc3ccccc3c2)c1] |
| 3-A1-95 | 1 | 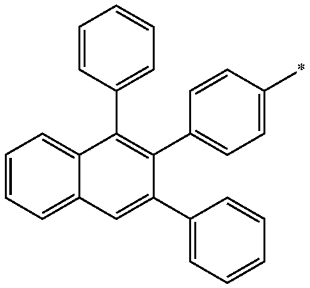 [SMILES: *c1ccc(-c2c(-c3ccccc3)cc3ccccc3c2-c2ccccc2)cc1] | 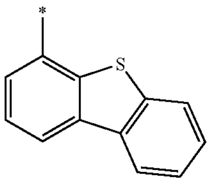 | 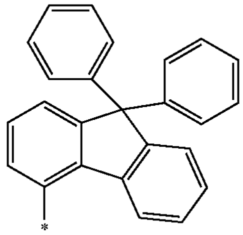 [SMILES: *c1cccc2c1-c1ccccc1C2(c1ccccc1)c1ccccc1] |
| 3-A1-96 | 1 | 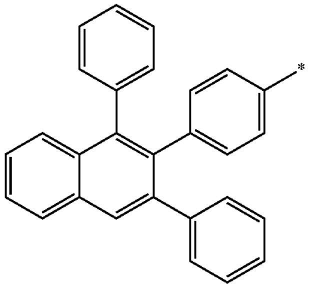 [SMILES: *c1ccc(-c2c(-c3ccccc3)cc3ccccc3c2-c2ccccc2)cc1] | 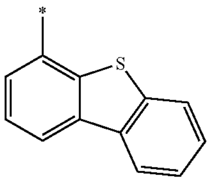 | 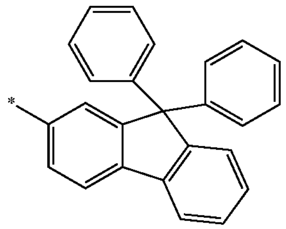 [SMILES: *c1ccc2c(c1)C(c1ccccc1)(c1ccccc1)c1ccccc1-2] |
| 3-A1-99 | 1 | 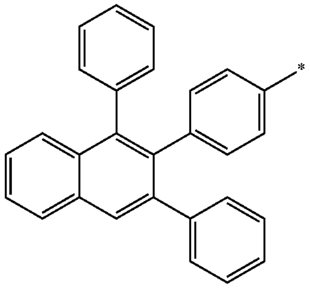 | 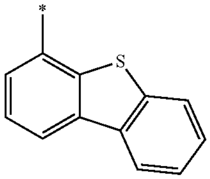 | 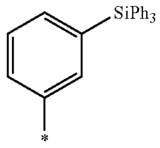 |

[Compound Group 2]
| | n | A-L-* | $Ar_1$ | $Ar_2$ |
|---|---|---|---|---|
| 2-B1-50 | 1 | 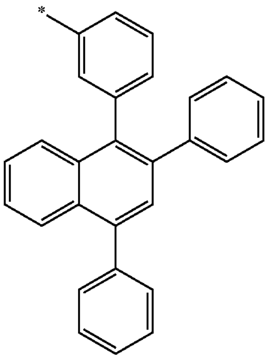 [SMILES: *c1cccc(-c2c(-c3ccccc3)cc(-c3ccccc3)c3ccccc23)c1] | 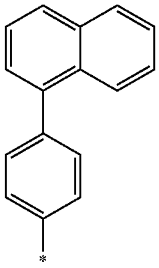 [SMILES: *c1ccc(-c2cccc3ccccc23)cc1] | 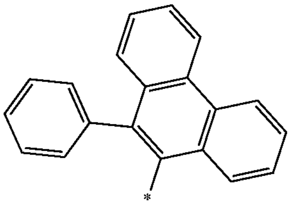 [SMILES: *c1c(-c2ccccc2)c2ccccc2c2ccccc12] |
| 2-B1-51 | 1 | 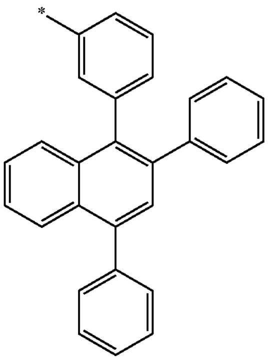 [SMILES: *c1cccc(-c2c(-c3ccccc3)cc(-c3ccccc3)c3ccccc23)c1] | 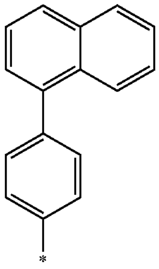 [SMILES: *c1ccc(-c2cccc3ccccc23)cc1] | 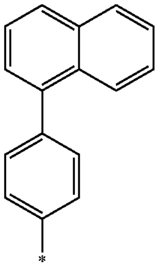 [SMILES: *c1ccc(-c2cccc3ccccc23)cc1] |
| 2-B1-52 | 1 | 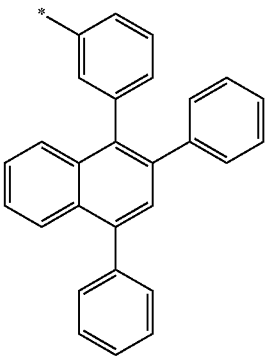 [SMILES: *c1cccc(-c2c(-c3ccccc3)cc(-c3ccccc3)c3ccccc23)c1] | 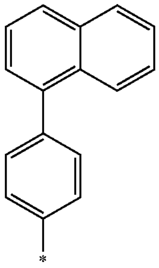 [SMILES: *c1ccc(-c2cccc3ccccc23)cc1] | 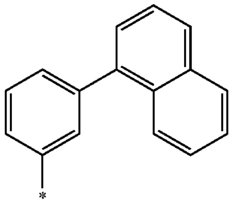 |
| 2-B1-53 | 1 | 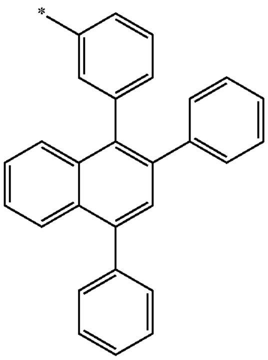 [SMILES: *c1cccc(-c2c(-c3ccccc3)cc(-c3ccccc3)c3ccccc23)c1] | 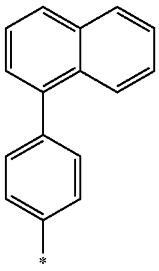 [SMILES: *c1ccc(-c2cccc3ccccc23)cc1] | 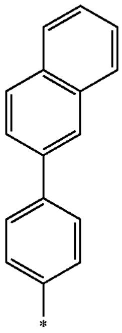 [SMILES: *c1ccc(-c2ccc3ccccc3c2)cc1] |

-continued
| [Compound Group 2] | | | | |
|---|---|---|---|---|
| | n | A-L-* | $Ar_1$ | $Ar_2$ |
| 2-B1-54 | 1 | 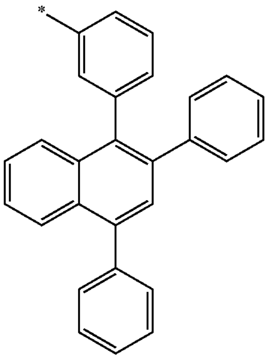 [SMILES: *c1cccc(-c2c(-c3ccccc3)cc(-c3ccccc3)c3ccccc23)c1] | 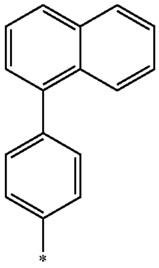 [SMILES: *c1ccc(-c2cccc3ccccc23)cc1] | 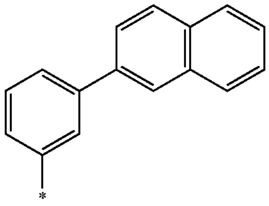 [SMILES: *c1cccc(-c2ccc3ccccc3c2)c1] |
| 2-B1-55 | 1 | 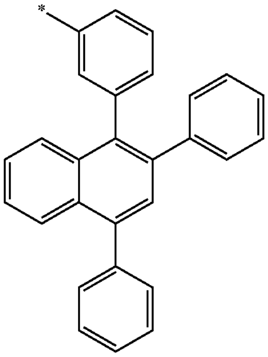 [SMILES: *c1cccc(-c2c(-c3ccccc3)cc(-c3ccccc3)c3ccccc23)c1] | 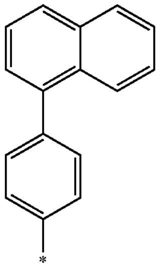 [SMILES: *c1ccc(-c2cccc3ccccc23)cc1] | 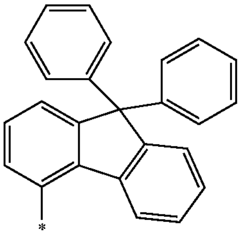 [SMILES: *c1cccc2c1-c1ccccc1C2(c1ccccc1)c1ccccc1] |
| 2-B1-56 | 1 | 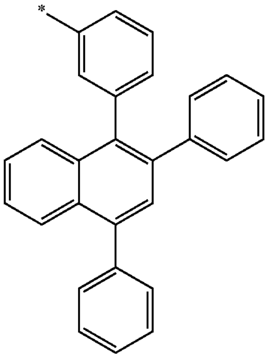 [SMILES: *c1cccc(-c2c(-c3ccccc3)cc(-c3ccccc3)c3ccccc23)c1] | 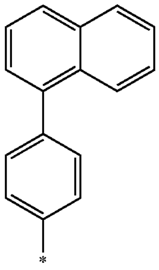 [SMILES: *c1ccc(-c2cccc3ccccc23)cc1] | 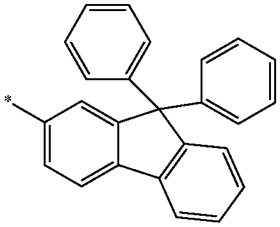 [SMILES: *c1ccc2c(c1)C(c1ccccc1)(c1ccccc1)c1ccccc1-2] |
| 2-B1-58 | 1 | 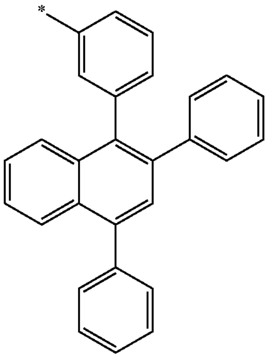 [SMILES: *c1cccc(-c2c(-c3ccccc3)cc(-c3ccccc3)c3ccccc23)c1] | 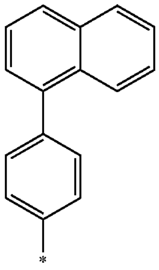 [SMILES: *c1ccc(-c2cccc3ccccc23)cc1] | 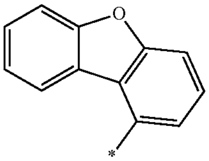 [SMILES: *c1cccc2oc3ccccc3c12] |

-continued
[Compound Group 2]
| | n | A-L-* | $Ar_1$ | $Ar_2$ |
|---|---|---|---|---|
| 2-B1-59 | 1 | 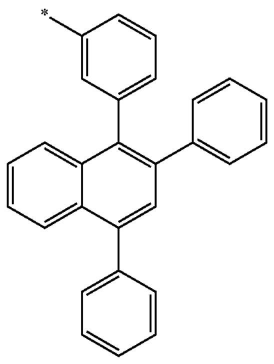 [SMILES: *c1cccc(-c2c(-c3ccccc3)cc(-c3ccccc3)c3ccccc23)c1] | 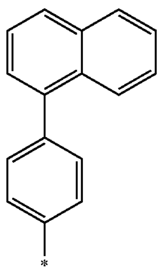 [SMILES: *c1ccc(-c2cccc3ccccc23)cc1] | 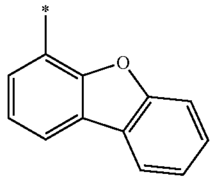 [SMILES: *c1cccc2c1oc1ccccc12] |
| 2-B1-60 | 1 | 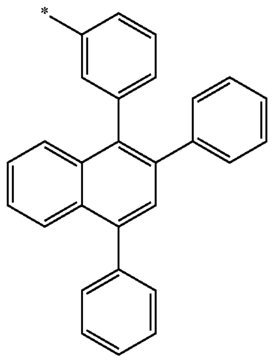 [SMILES: *c1cccc(-c2c(-c3ccccc3)cc(-c3ccccc3)c3ccccc23)c1] | 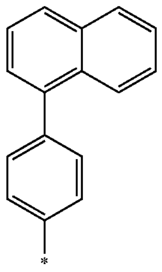 [SMILES: *c1ccc(-c2cccc3ccccc23)cc1] | 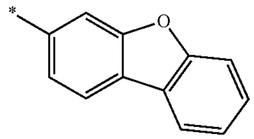 [SMILES: *c1ccc2c(c1)oc1ccccc12] |
| 2-B1-61 | 1 | 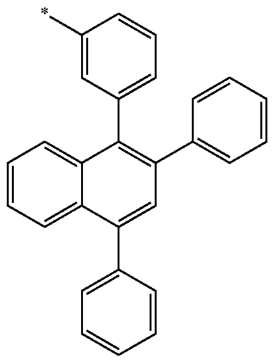 [SMILES: *c1cccc(-c2c(-c3ccccc3)cc(-c3ccccc3)c3ccccc23)c1] | 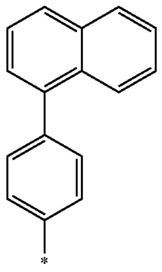 [SMILES: *c1ccc(-c2cccc3ccccc23)cc1] | 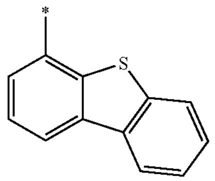 |
| 2-B1-62 | 1 | 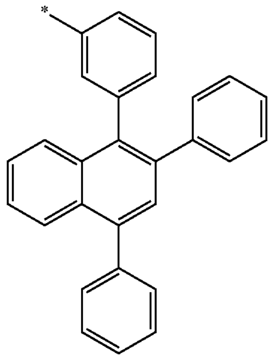 [SMILES: *c1cccc(-c2c(-c3ccccc3)cc(-c3ccccc3)c3ccccc23)c1] | 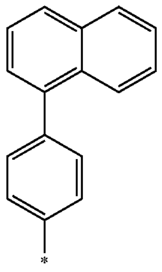 [SMILES: *c1ccc(-c2cccc3ccccc23)cc1] | 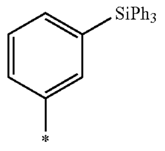 |

-continued
| [Compound Group 2] | | | | |
|---|---|---|---|---|
| | n | A-L-* | $Ar_1$ | $Ar_2$ |
| 2-B1-65 | 1 | 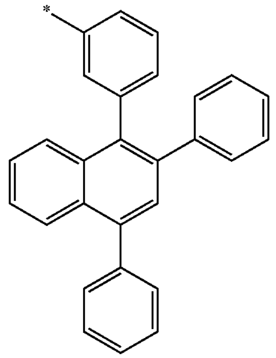 [SMILES: *c1cccc(-c2c(-c3ccccc3)cc(-c3ccccc3)c3ccccc23)c1] | 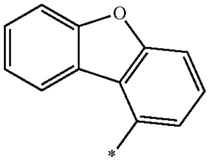 [SMILES: *c1cccc2oc3ccccc3c12] | 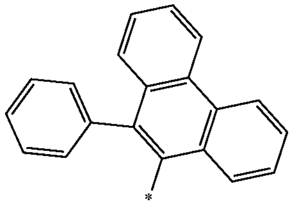 [SMILES: *c1c(-c2ccccc2)c2ccccc2c2ccccc12] |
| 2-B1-66 | 1 | 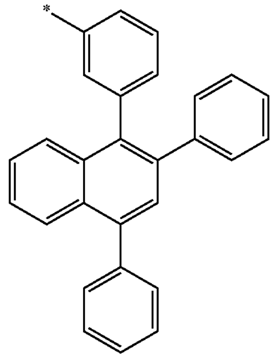 [SMILES: *c1cccc(-c2c(-c3ccccc3)cc(-c3ccccc3)c3ccccc23)c1] | 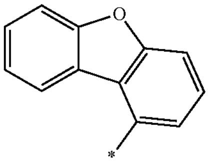 [SMILES: *c1cccc2oc3ccccc3c12] | 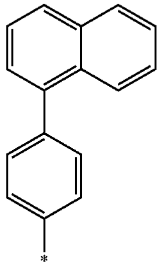 [SMILES: *c1ccc(-c2cccc3ccccc23)cc1] |
| 2-B1-67 | 1 | 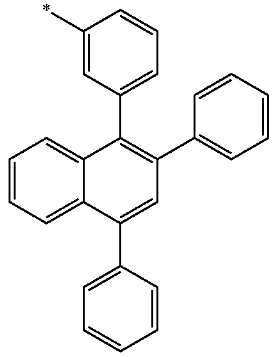 [SMILES: *c1cccc(-c2c(-c3ccccc3)cc(-c3ccccc3)c3ccccc23)c1] | 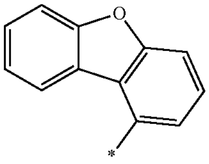 [SMILES: *c1cccc2oc3ccccc3c12] | 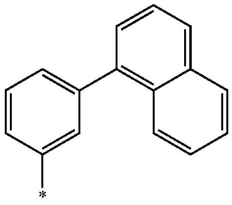 |
| 2-B1-68 | 1 | 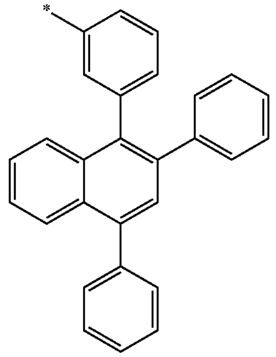 [SMILES: *c1cccc(-c2c(-c3ccccc3)cc(-c3ccccc3)c3ccccc23)c1] | 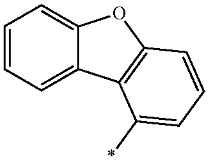 [SMILES: *c1cccc2oc3ccccc3c12] | 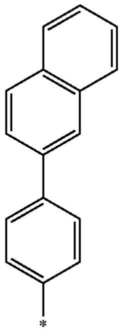 [SMILES: *c1ccc(-c2ccc3ccccc3c2)cc1] |

-continued
[Compound Group 2]
| | n | A-L-* | $Ar_1$ | $Ar_2$ |
|---|---|---|---|---|
| 2-B1-69 | 1 | 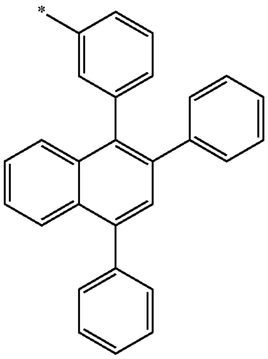 [SMILES: *c1cccc(-c2c(-c3ccccc3)cc(-c3ccccc3)c3ccccc23)c1] | 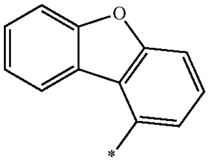 [SMILES: *c1cccc2oc3ccccc3c12] | 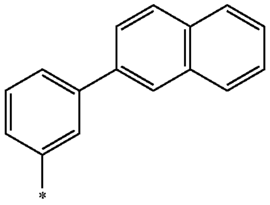 |
| 2-B1-70 | 1 | 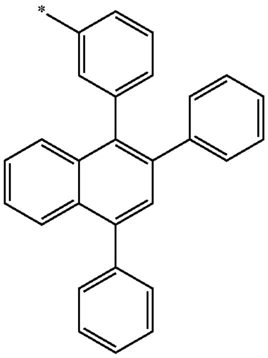 [SMILES: *c1cccc(-c2c(-c3ccccc3)cc(-c3ccccc3)c3ccccc23)c1] | 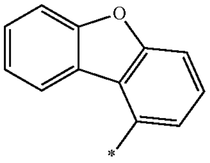 [SMILES: *c1cccc2oc3ccccc3c12] | 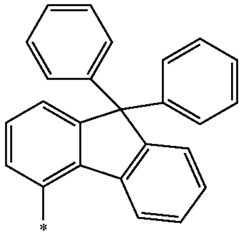 [SMILES: *c1cccc2c1-c1ccccc1C2(c1ccccc1)c1ccccc1] |
| 2-B1-71 | 1 | 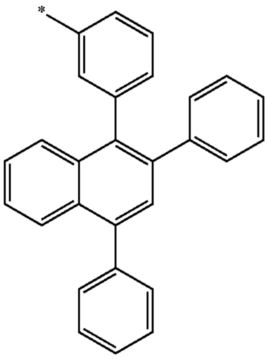 [SMILES: *c1cccc(-c2c(-c3ccccc3)cc(-c3ccccc3)c3ccccc23)c1] | 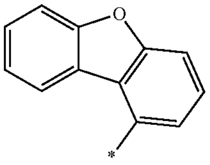 [SMILES: *c1cccc2oc3ccccc3c12] | 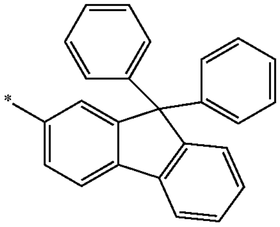 [SMILES: *c1ccc2c(c1)C(c1ccccc1)(c1ccccc1)c1ccccc1-2] |
| 2-B1-76 | 1 | 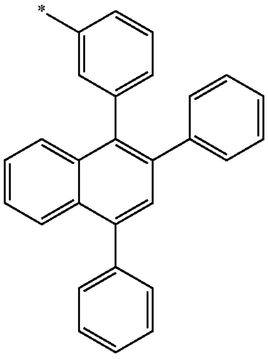 [SMILES: *c1cccc(-c2c(-c3ccccc3)cc(-c3ccccc3)c3ccccc23)c1] | 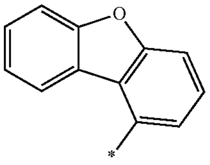 [SMILES: *c1cccc2oc3ccccc3c12] | 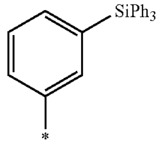 |

-continued
| [Compound Group 2] | | | | |
|---|---|---|---|---|
| | n | A-L-* | $Ar_1$ | $Ar_2$ |
| 2-B1-78 | 1 | 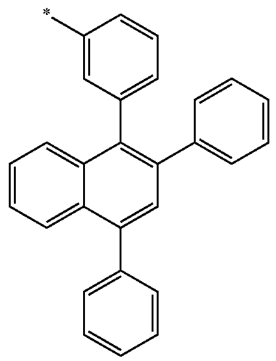 [SMILES: *c1cccc(-c2c(-c3ccccc3)cc(-c3ccccc3)c3ccccc23)c1] | 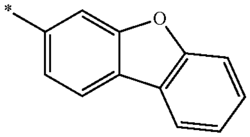 [SMILES: *c1ccc2c(c1)oc1ccccc12] | 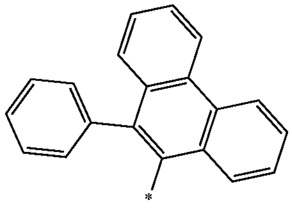 [SMILES: *c1c(-c2ccccc2)c2ccccc2c2ccccc12] |
| 2-B1-79 | 1 | 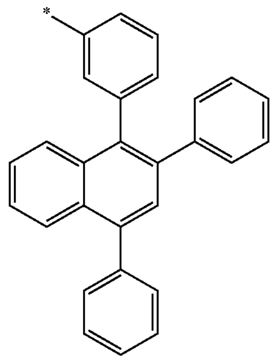 [SMILES: *c1cccc(-c2c(-c3ccccc3)cc(-c3ccccc3)c3ccccc23)c1] | 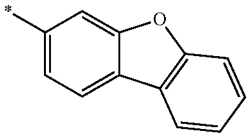 [SMILES: *c1ccc2c(c1)oc1ccccc12] | 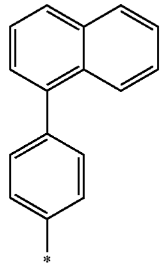 [SMILES: *c1ccc(-c2cccc3ccccc23)cc1] |
| 2-B1-80 | 1 | 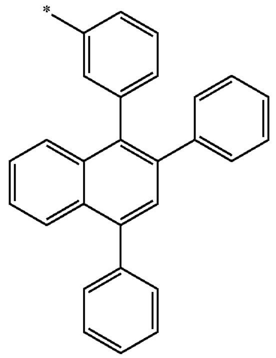 [SMILES: *c1cccc(-c2c(-c3ccccc3)cc(-c3ccccc3)c3ccccc23)c1] | 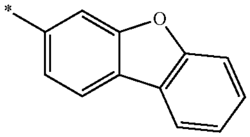 [SMILES: *c1ccc2c(c1)oc1ccccc12] | 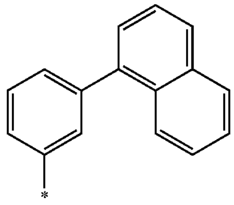 |
| 2-B1-81 | 1 | 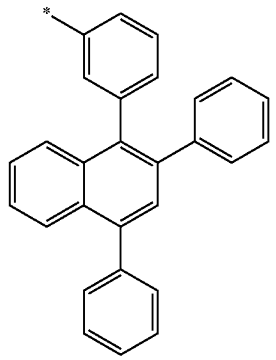 [SMILES: *c1cccc(-c2c(-c3ccccc3)cc(-c3ccccc3)c3ccccc23)c1] | 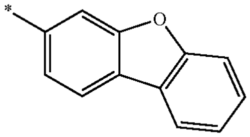 [SMILES: *c1ccc2c(c1)oc1ccccc12] | 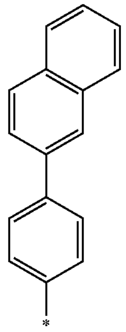 [SMILES: *c1ccc(-c2ccc3ccccc3c2)cc1] |

-continued
| [Compound Group 2] | | | | |
|---|---|---|---|---|
| | n | A-L-* | $Ar_1$ | $Ar_2$ |
| 2-B1-82 | 1 | 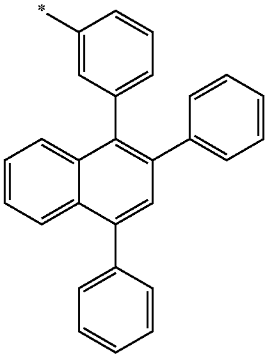 [SMILES: *c1cccc(-c2c(-c3ccccc3)cc(-c3ccccc3)c3ccccc23)c1] | 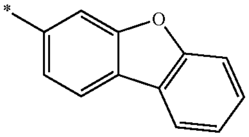 [SMILES: *c1ccc2c(c1)oc1ccccc12] | 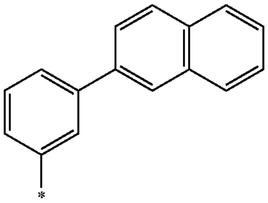 [SMILES: *c1cccc(-c2ccc3ccccc3c2)c1] |
| 2-B1-83 | 1 | 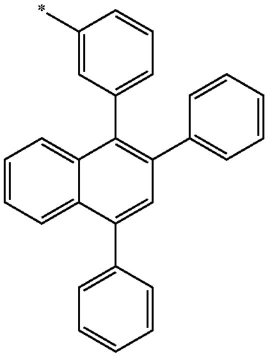 [SMILES: *c1cccc(-c2c(-c3ccccc3)cc(-c3ccccc3)c3ccccc23)c1] | 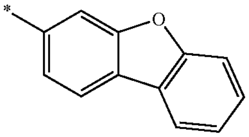 [SMILES: *c1ccc2c(c1)oc1ccccc12] | 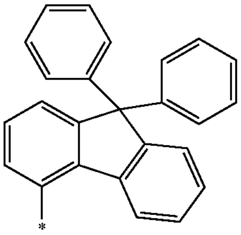 [SMILES: *c1cccc2c1-c1ccccc1C2(c1ccccc1)c1ccccc1] |
| 2-B1-84 | 1 | 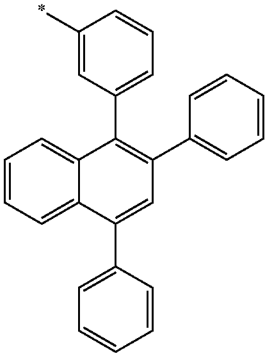 [SMILES: *c1cccc(-c2c(-c3ccccc3)cc(-c3ccccc3)c3ccccc23)c1] | 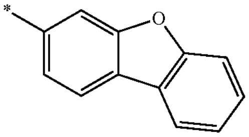 [SMILES: *c1ccc2c(c1)oc1ccccc12] | 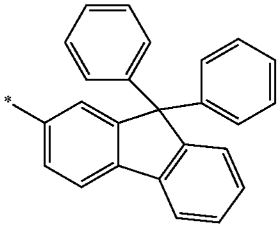 [SMILES: *c1ccc2c(c1)C(c1ccccc1)(c1ccccc1)c1ccccc1-2] |
| 2-B1-88 | 1 | 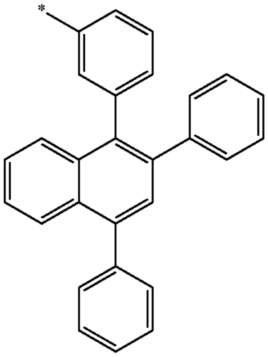 [SMILES: *c1cccc(-c2c(-c3ccccc3)cc(-c3ccccc3)c3ccccc23)c1] | 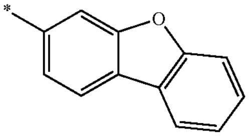 [SMILES: *c1ccc2c(c1)oc1ccccc12] | 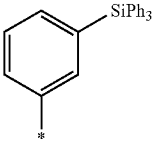 |

-continued
[Compound Group 2]
| | n | A-L-* | $Ar_1$ | $Ar_2$ |
|---|---|---|---|---|
| 2-B1-90 | 1 | 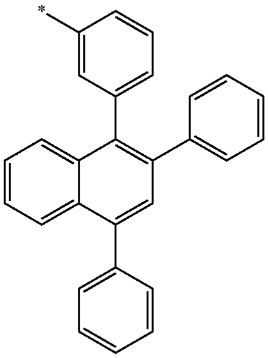 [SMILES: *c1cccc(-c2c(-c3ccccc3)cc(-c3ccccc3)c3ccccc23)c1] | 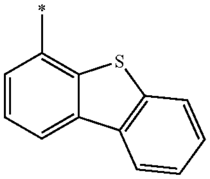 | 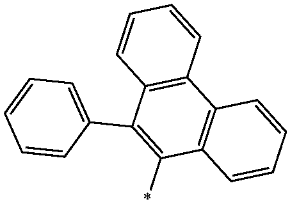 [SMILES: *c1c(-c2ccccc2)c2ccccc2c2ccccc12] |
| 2-B1-91 | 1 | 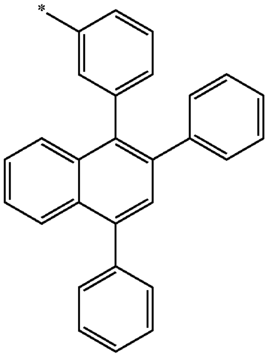 [SMILES: *c1cccc(-c2c(-c3ccccc3)cc(-c3ccccc3)c3ccccc23)c1] | 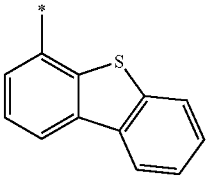 | 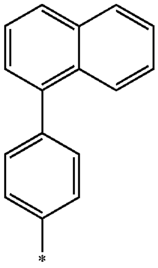 [SMILES: *c1ccc(-c2cccc3ccccc23)cc1] |
| 2-B1-92 | 1 | 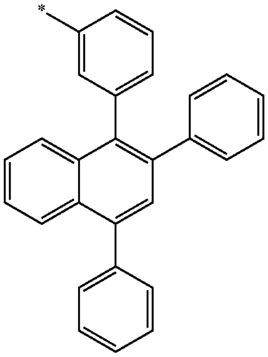 [SMILES: *c1cccc(-c2c(-c3ccccc3)cc(-c3ccccc3)c3ccccc23)c1] | 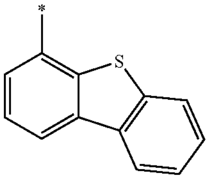 | 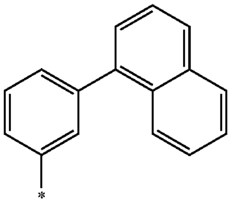 |
| 2-B1-93 | 1 | 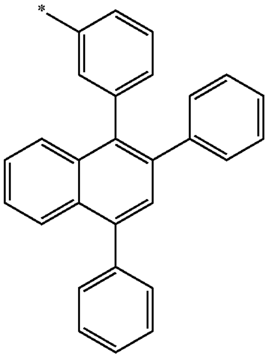 [SMILES: *c1cccc(-c2c(-c3ccccc3)cc(-c3ccccc3)c3ccccc23)c1] | 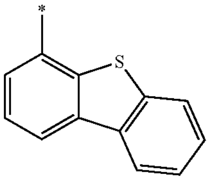 | 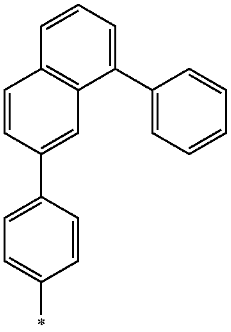 [SMILES: *c1ccc(-c2ccc3cccc(-c4ccccc4)c3c2)cc1] |

-continued
[Compound Group 2]
| | n | A-L-* | $Ar_1$ | $Ar_2$ |
|---|---|---|---|---|
| 2-B1-94 | 1 | 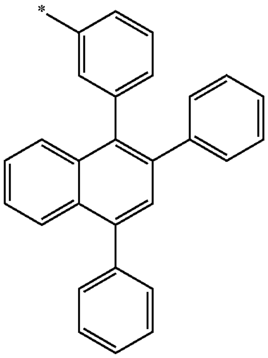 [SMILES: *c1cccc(-c2c(-c3ccccc3)cc(-c3ccccc3)c3ccccc23)c1] | 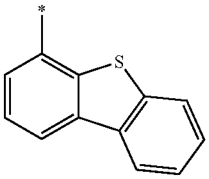 | 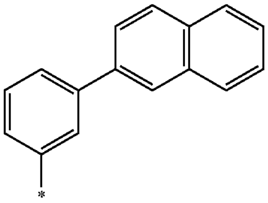 |
| 2-B1-95 | 1 | 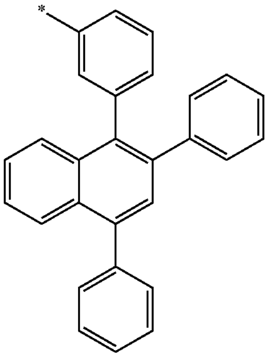 [SMILES: *c1cccc(-c2c(-c3ccccc3)cc(-c3ccccc3)c3ccccc23)c1] | 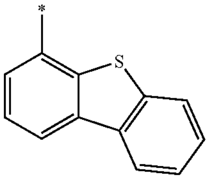 | 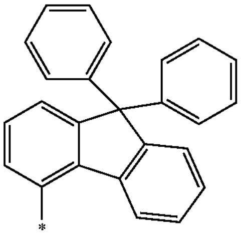 [SMILES: *c1cccc2c1-c1ccccc1C2(c1ccccc1)c1ccccc1] |
| 2-B1-96 | 1 | 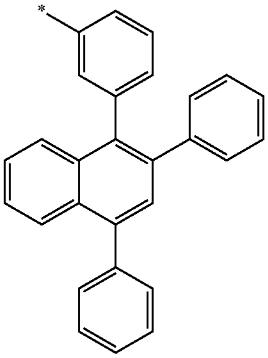 [SMILES: *c1cccc(-c2c(-c3ccccc3)cc(-c3ccccc3)c3ccccc23)c1] | 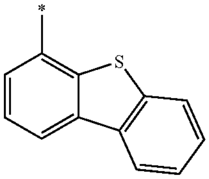 | 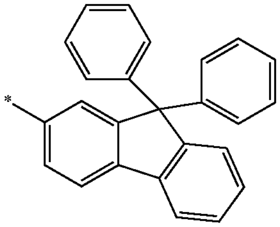 [SMILES: *c1ccc2c(c1)C(c1ccccc1)(c1ccccc1)c1ccccc1-2] |
| 2-B1-99 | 1 | 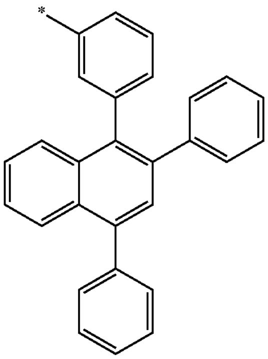 [SMILES: *c1cccc(-c2c(-c3ccccc3)cc(-c3ccccc3)c3ccccc23)c1] | 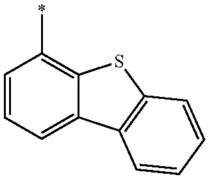 | 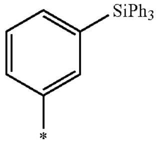 |

-continued
[Compound Group 2]
| | n | A-L-* | $Ar_1$ | $Ar_2$ |
|---|---|---|---|---|
| 3-B1-50 | 1 | 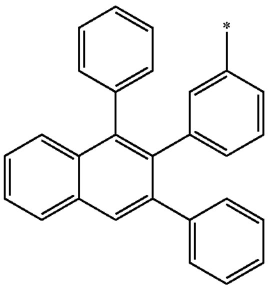 [SMILES: *c1cccc(-c2c(-c3ccccc3)cc3ccccc3c2-c2ccccc2)c1] | 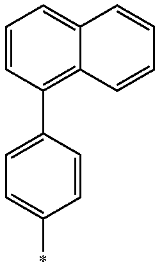 [SMILES: *c1ccc(-c2cccc3ccccc23)cc1] | 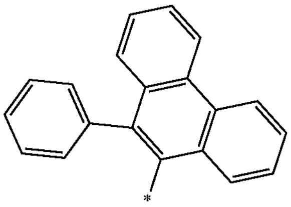 [SMILES: *c1c(-c2ccccc2)c2ccccc2c2ccccc12] |
| 3-B1-51 | 1 | 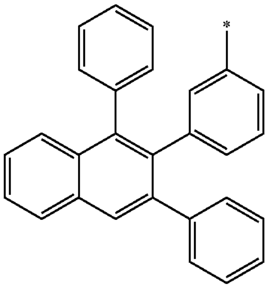 [SMILES: *c1cccc(-c2c(-c3ccccc3)cc3ccccc3c2-c2ccccc2)c1] | 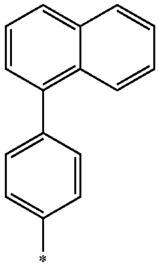 [SMILES: *c1ccc(-c2cccc3ccccc23)cc1] | 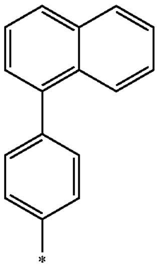 [SMILES: *c1ccc(-c2cccc3ccccc23)cc1] |
| 3-B1-52 | 1 | 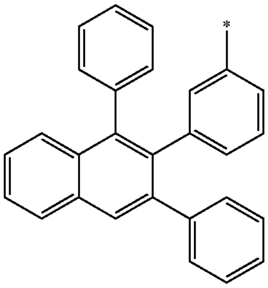 [SMILES: *c1cccc(-c2c(-c3ccccc3)cc3ccccc3c2-c2ccccc2)c1] | 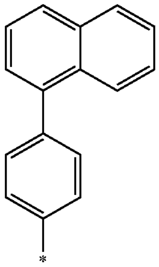 [SMILES: *c1ccc(-c2cccc3ccccc23)cc1] | 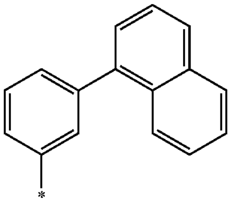 [SMILES: *c1cccc(-c2cccc3ccccc23)c1] |
| 3-B1-53 | 1 | 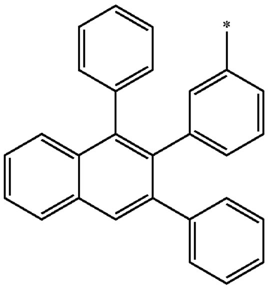 [SMILES: *c1cccc(-c2c(-c3ccccc3)cc3ccccc3c2-c2ccccc2)c1] | 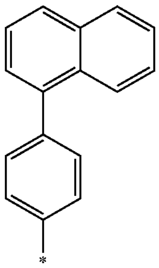 [SMILES: *c1ccc(-c2cccc3ccccc23)cc1] | 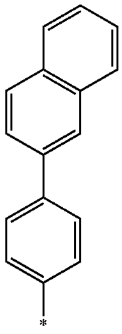 [SMILES: *c1ccc(-c2ccc3ccccc3c2)cc1] |
| 3-B1-54 | 1 | 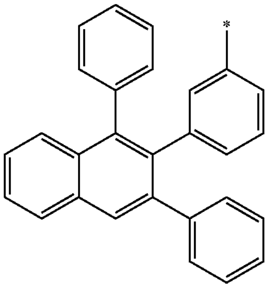 [SMILES: *c1cccc(-c2c(-c3ccccc3)cc3ccccc3c2-c2ccccc2)c1] | 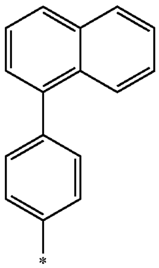 [SMILES: *c1ccc(-c2cccc3ccccc23)cc1] | 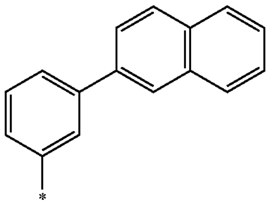 [SMILES: *c1cccc(-c2ccc3ccccc3c2)c1] |

-continued
[Compound Group 2]
| | n | A-L-* | $Ar_1$ | $Ar_2$ |
|---|---|---|---|---|
| 3-B1-55 | 1 | 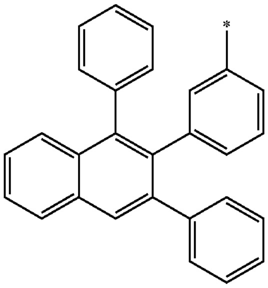 [SMILES: *c1cccc(-c2c(-c3ccccc3)cc3ccccc3c2-c2ccccc2)c1] | 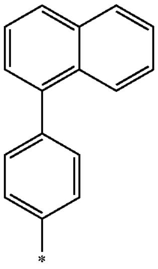 [SMILES: *c1ccc(-c2cccc3ccccc23)cc1] | 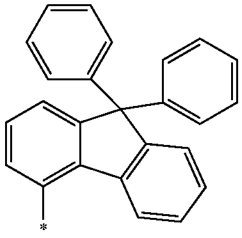 [SMILES: *c1cccc2c1-c1ccccc1C2(c1ccccc1)c1ccccc1] |
| 3-B1-56 | 1 | 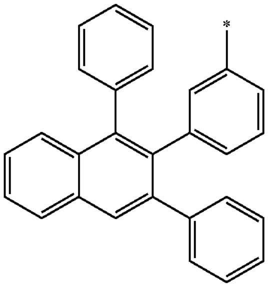 [SMILES: *c1cccc(-c2c(-c3ccccc3)cc3ccccc3c2-c2ccccc2)c1] | 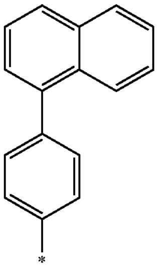 [SMILES: *c1ccc(-c2cccc3ccccc23)cc1] | 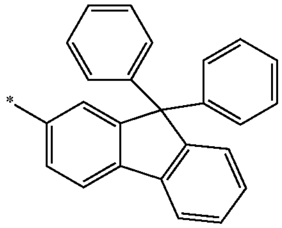 [SMILES: *c1ccc2c(c1)C(c1ccccc1)(c1ccccc1)c1ccccc1-2] |
| 3-B1-58 | 1 | 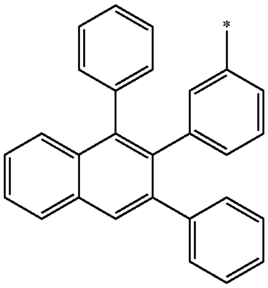 [SMILES: *c1cccc(-c2c(-c3ccccc3)cc3ccccc3c2-c2ccccc2)c1] | 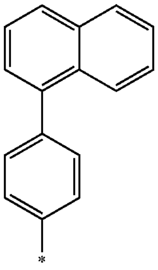 [SMILES: *c1ccc(-c2cccc3ccccc23)cc1] | 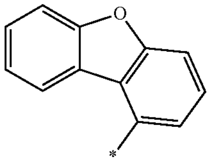 [SMILES: *c1cccc2oc3ccccc3c12] |
| 3-B1-59 | 1 | 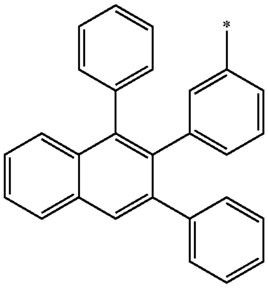 [SMILES: *c1cccc(-c2c(-c3ccccc3)cc3ccccc3c2-c2ccccc2)c1] | 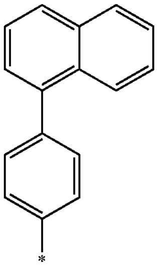 [SMILES: *c1ccc(-c2cccc3ccccc23)cc1] | 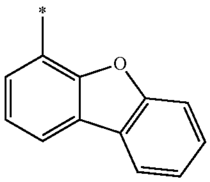 [SMILES: *c1cccc2c1oc1ccccc12] |
| 3-B1-60 | 1 | 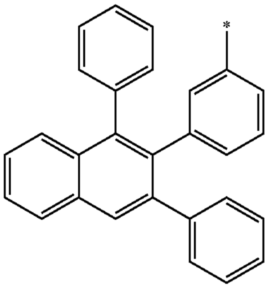 [SMILES: *c1cccc(-c2c(-c3ccccc3)cc3ccccc3c2-c2ccccc2)c1] | 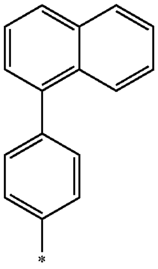 [SMILES: *c1ccc(-c2cccc3ccccc23)cc1] | 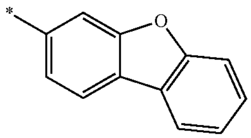 [SMILES: *c1ccc2c(c1)oc1ccccc12] |

-continued
[Compound Group 2]
| | n | A-L-* | $Ar_1$ | $Ar_2$ |
|---|---|---|---|---|
| 3-B1-61 | 1 | 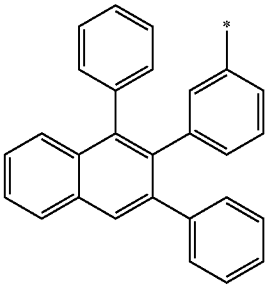 [SMILES: *c1cccc(-c2c(-c3ccccc3)cc3ccccc3c2-c2ccccc2)c1] | 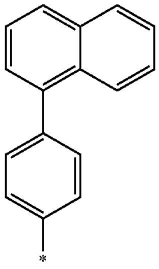 [SMILES: *c1ccc(-c2cccc3ccccc23)cc1] | 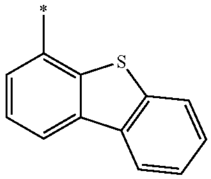 |
| 3-B1-62 | 1 | 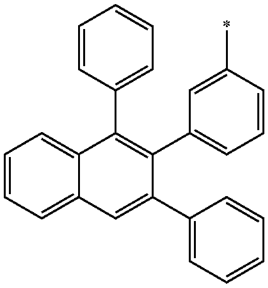 [SMILES: *c1cccc(-c2c(-c3ccccc3)cc3ccccc3c2-c2ccccc2)c1] | 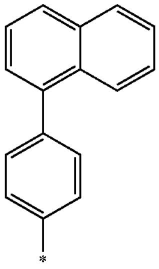 [SMILES: *c1ccc(-c2cccc3ccccc23)cc1] | 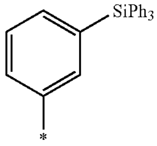 |
| 3-B1-65 | 1 | 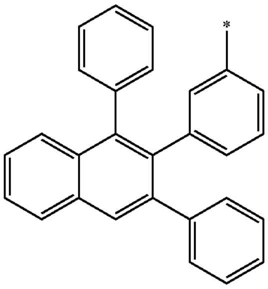 [SMILES: *c1cccc(-c2c(-c3ccccc3)cc3ccccc3c2-c2ccccc2)c1] | 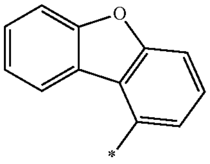 [SMILES: *c1cccc2oc3ccccc3c12] | 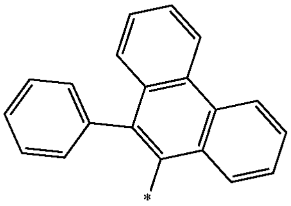 [SMILES: *c1c(-c2ccccc2)c2ccccc2c2ccccc12] |
| 3-B1-66 | 1 | 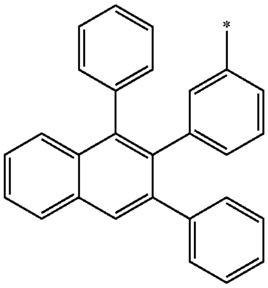 [SMILES: *c1cccc(-c2c(-c3ccccc3)cc3ccccc3c2-c2ccccc2)c1] | 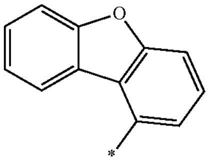 [SMILES: *c1cccc2oc3ccccc3c12] | 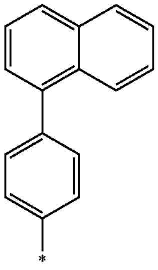 [SMILES: *c1ccc(-c2cccc3ccccc23)cc1] |
| 3-B1-67 | 1 | 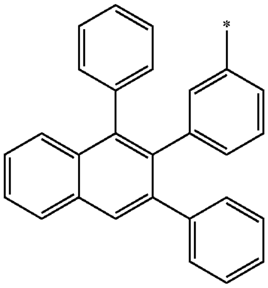 [SMILES: *c1cccc(-c2c(-c3ccccc3)cc3ccccc3c2-c2ccccc2)c1] | 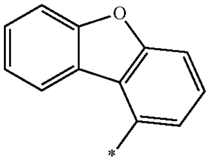 [SMILES: *c1cccc2oc3ccccc3c12] | 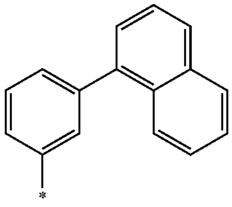 [SMILES: *c1cccc(-c2cccc3ccccc23)c1] |

-continued
[Compound Group 2]
| | n | A-L-* | $Ar_1$ | $Ar_2$ |
|---|---|---|---|---|
| 3-B1-68 | 1 | 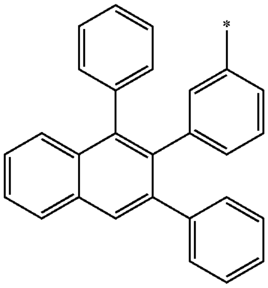 [SMILES: *c1cccc(-c2c(-c3ccccc3)cc3ccccc3c2-c2ccccc2)c1] | 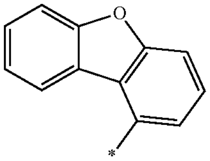 [SMILES: *c1cccc2oc3ccccc3c12] | 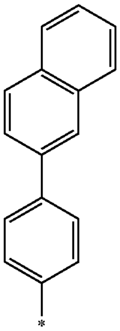 [SMILES: *c1ccc(-c2ccc3ccccc3c2)cc1] |
| 3-B1-69 | 1 | 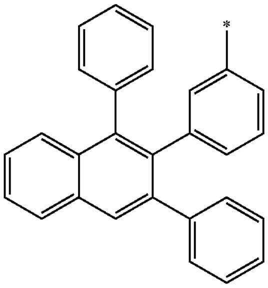 [SMILES: *c1cccc(-c2c(-c3ccccc3)cc3ccccc3c2-c2ccccc2)c1] | 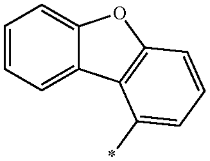 [SMILES: *c1cccc2oc3ccccc3c12] | 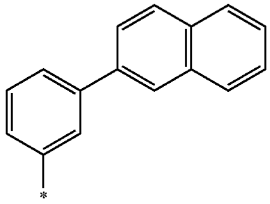 [SMILES: *c1cccc(-c2ccc3ccccc3c2)c1] |
| 3-B1-70 | 1 | 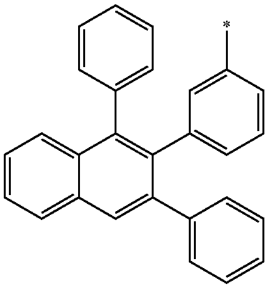 [SMILES: *c1cccc(-c2c(-c3ccccc3)cc3ccccc3c2-c2ccccc2)c1] | 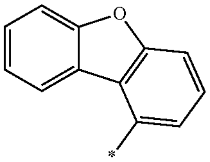 [SMILES: *c1cccc2oc3ccccc3c12] | 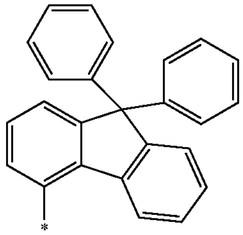 [SMILES: *c1cccc2c1-c1ccccc1C2(c1ccccc1)c1ccccc1] |
| 3-B1-71 | 1 | 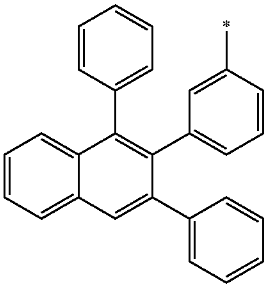 [SMILES: *c1cccc(-c2c(-c3ccccc3)cc3ccccc3c2-c2ccccc2)c1] | 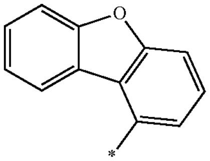 [SMILES: *c1cccc2oc3ccccc3c12] | 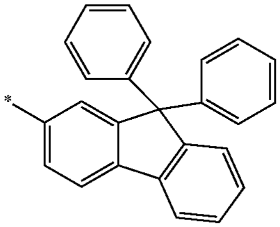 [SMILES: *c1ccc2c(c1)C(c1ccccc1)(c1ccccc1)c1ccccc1-2] |
| 3-B1-76 | 1 | 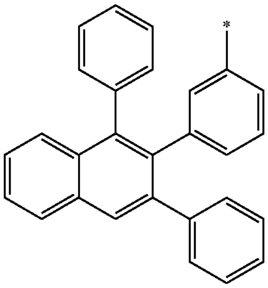 [SMILES: *c1cccc(-c2c(-c3ccccc3)cc3ccccc3c2-c2ccccc2)c1] | 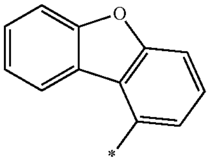 [SMILES: *c1cccc2oc3ccccc3c12] | 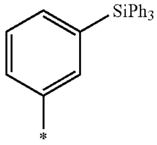 |

-continued
[Compound Group 2]
| | n | A-L-* | $Ar_1$ | $Ar_2$ |
|---|---|---|---|---|
| 3-B1-78 | 1 | 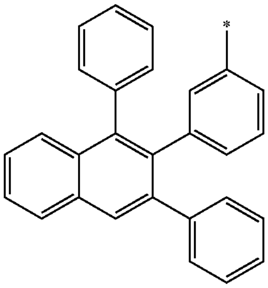 [SMILES: *c1cccc(-c2c(-c3ccccc3)cc3ccccc3c2-c2ccccc2)c1] | 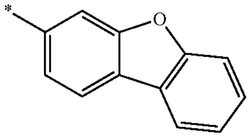 [SMILES: *c1ccc2c(c1)oc1ccccc12] | 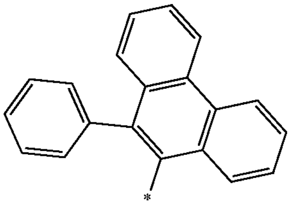 [SMILES: *c1c(-c2ccccc2)c2ccccc2c2ccccc12] |
| 3-B1-79 | 1 | 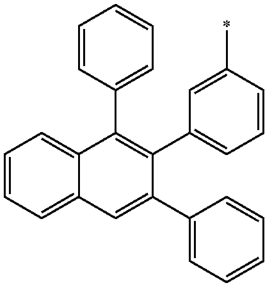 [SMILES: *c1cccc(-c2c(-c3ccccc3)cc3ccccc3c2-c2ccccc2)c1] | 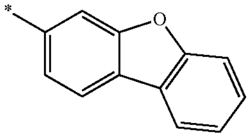 [SMILES: *c1ccc2c(c1)oc1ccccc12] | 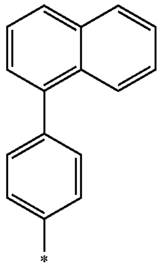 [SMILES: *c1ccc(-c2cccc3ccccc23)cc1] |
| 3-B1-80 | 1 | 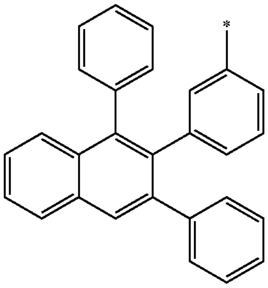 [SMILES: *c1cccc(-c2c(-c3ccccc3)cc3ccccc3c2-c2ccccc2)c1] | 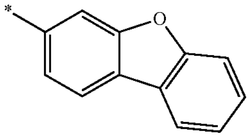 [SMILES: *c1ccc2c(c1)oc1ccccc12] | 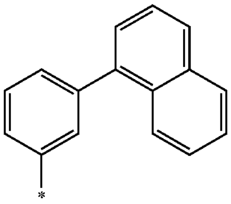 |
| 3-B1-81 | 1 | 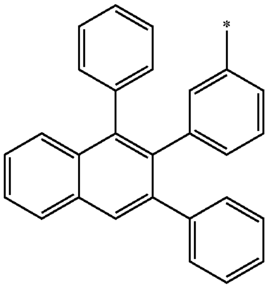 [SMILES: *c1cccc(-c2c(-c3ccccc3)cc3ccccc3c2-c2ccccc2)c1] | 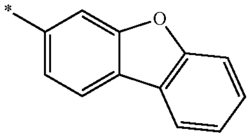 [SMILES: *c1ccc2c(c1)oc1ccccc12] | 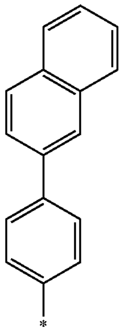 [SMILES: *c1ccc(-c2ccc3ccccc3c2)cc1] |
| 3-B1-82 | 1 | 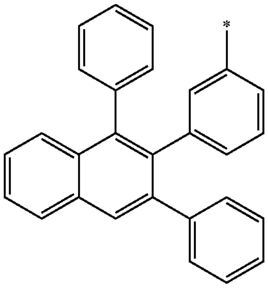 [SMILES: *c1cccc(-c2c(-c3ccccc3)cc3ccccc3c2-c2ccccc2)c1] | 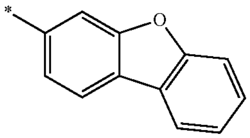 [SMILES: *c1ccc2c(c1)oc1ccccc12] | 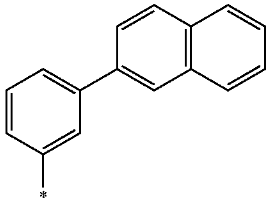 |

-continued
[Compound Group 2]
| | n | A-L-* | $Ar_1$ | $Ar_2$ |
|---|---|---|---|---|
| 3-B1-83 | 1 | 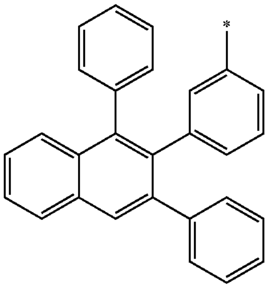 [SMILES: *c1cccc(-c2c(-c3ccccc3)cc3ccccc3c2-c2ccccc2)c1] | 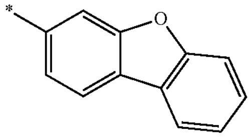 [SMILES: *c1ccc2c(c1)oc1ccccc12] | 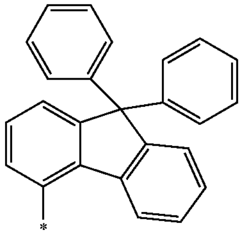 [SMILES: *c1cccc2c1-c1ccccc1C2(c1ccccc1)c1ccccc1] |
| 3-B1-84 | 1 | 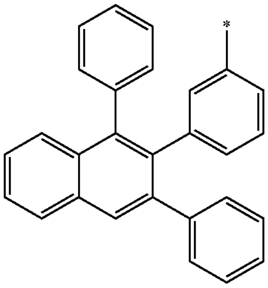 [SMILES: *c1cccc(-c2c(-c3ccccc3)cc3ccccc3c2-c2ccccc2)c1] | 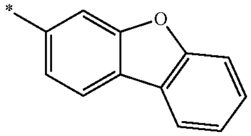 [SMILES: *c1ccc2c(c1)oc1ccccc12] | 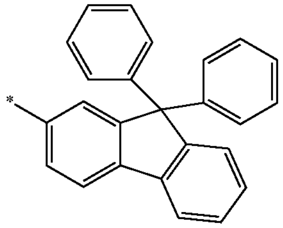 [SMILES: *c1ccc2c(c1)C(c1ccccc1)(c1ccccc1)c1ccccc1-2] |
| 3-B1-88 | 1 | 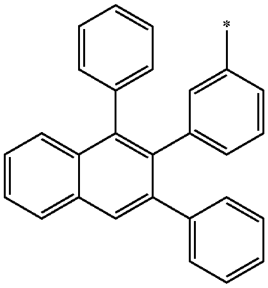 [SMILES: *c1cccc(-c2c(-c3ccccc3)cc3ccccc3c2-c2ccccc2)c1] | 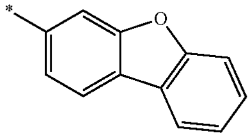 [SMILES: *c1ccc2c(c1)oc1ccccc12] | 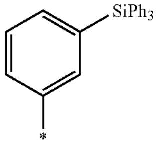 |
| 3-B1-90 | 1 | 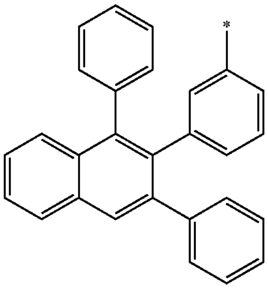 [SMILES: *c1cccc(-c2c(-c3ccccc3)cc3ccccc3c2-c2ccccc2)c1] | 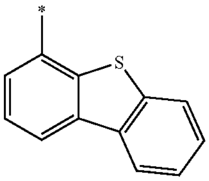 | 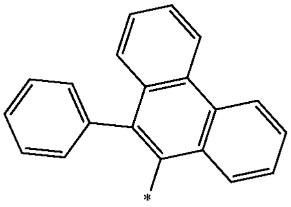 [SMILES: *c1c(-c2ccccc2)c2ccccc2c2ccccc12] |
| 3-B1-91 | 1 | 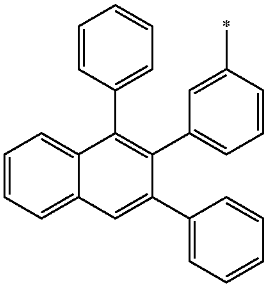 [SMILES: *c1cccc(-c2c(-c3ccccc3)cc3ccccc3c2-c2ccccc2)c1] | 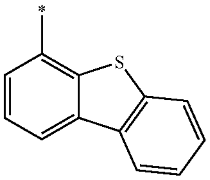 | 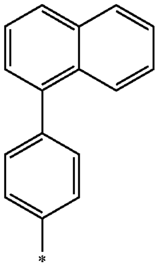 [SMILES: *c1ccc(-c2cccc3ccccc23)cc1] |

-continued
| [Compound Group 2] | | | | |
|---|---|---|---|---|
| | n | A-L-* | $Ar_1$ | $Ar_2$ |
| 3-B1-92 | 1 | 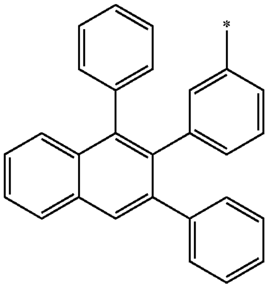 [SMILES: *c1cccc(-c2c(-c3ccccc3)cc3ccccc3c2-c2ccccc2)c1] | 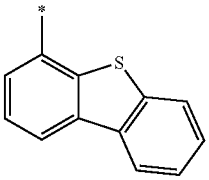 | 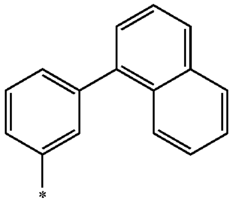 |
| 3-B1-93 | 1 | 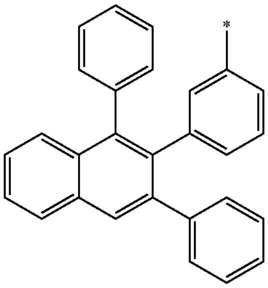 [SMILES: *c1cccc(-c2c(-c3ccccc3)cc3ccccc3c2-c2ccccc2)c1] | 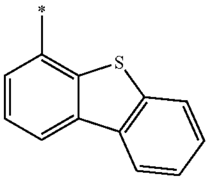 | 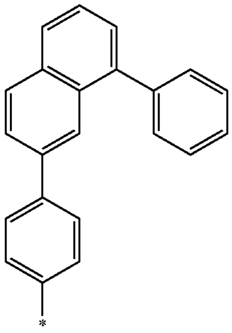 [SMILES: *c1ccc(-c2ccc3cccc(-c4ccccc4)c3c2)cc1] |
| 3-B1-94 | 1 | 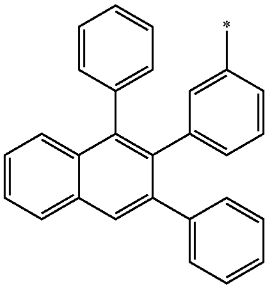 [SMILES: *c1cccc(-c2c(-c3ccccc3)cc3ccccc3c2-c2ccccc2)c1] | 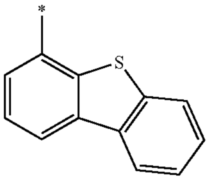 [SMILES: *c1cccc2c1sc1ccccc12] | 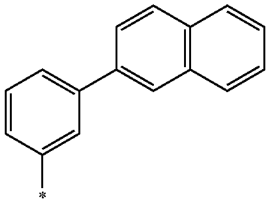 [SMILES: *c1cccc(-c2ccc3ccccc3c2)c1] |
| 3-B1-95 | 1 | 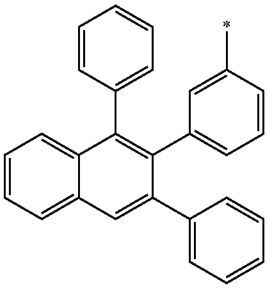 [SMILES: *c1cccc(-c2c(-c3ccccc3)cc3ccccc3c2-c2ccccc2)c1] | 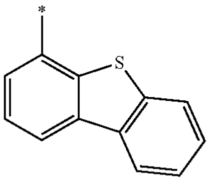 | 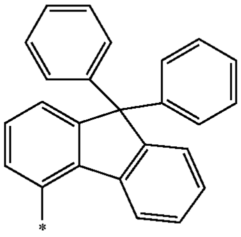 [SMILES: *c1cccc2c1-c1ccccc1C2(c1ccccc1)c1ccccc1] |
| 3-B1-96 | 1 | 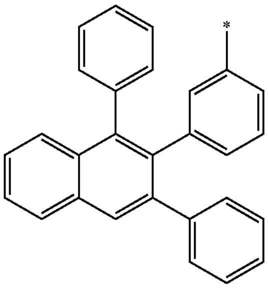 [SMILES: *c1cccc(-c2c(-c3ccccc3)cc3ccccc3c2-c2ccccc2)c1] | 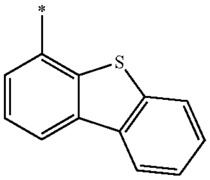 | 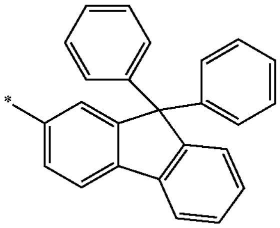 [SMILES: *c1ccc2c(c1)C(c1ccccc1)(c1ccccc1)c1ccccc1-2] |

-continued
| [Compound Group 2] | | | | |
|---|---|---|---|---|
| | n | A-L-* | $Ar_1$ | $Ar_2$ |
| 3-B1-99 | 1 | 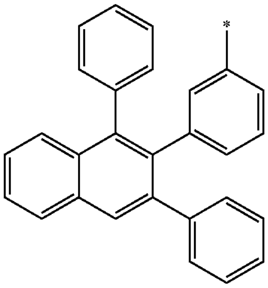 [SMILES: *c1cccc(-c2c(-c3ccccc3)cc3ccccc3c2-c2ccccc2)c1] | 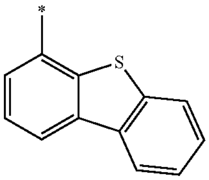 [SMILES: *c1cccc2c1sc1ccccc12] | 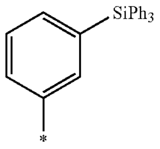 |
| [Compound Group 3] | | | | |
|---|---|---|---|---|
| | n | A—L—* | $Ar_1$ | $Ar_2$ |
| 2-C1-58 | 0 | 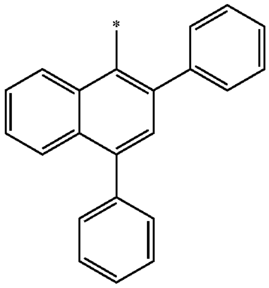 [SMILES: *c1c(-c2ccccc2)cc(-c2ccccc2)c2ccccc12] | 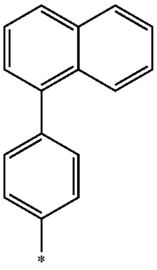 [SMILES: *c1ccc(-c2cccc3ccccc23)cc1] | 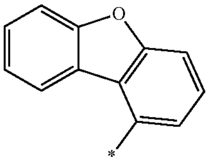 [SMILES: *c1cccc2oc3ccccc3c12] |
| 2-C1-59 | 0 | 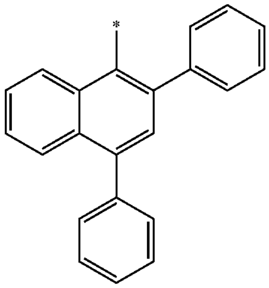 [SMILES: *c1c(-c2ccccc2)cc(-c2ccccc2)c2ccccc12] | 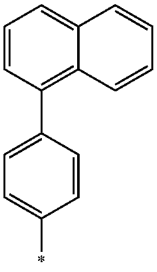 [SMILES: *c1ccc(-c2cccc3ccccc23)cc1] | 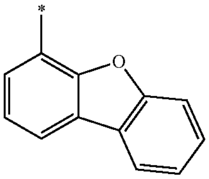 |
| 2-C1-60 | 0 | 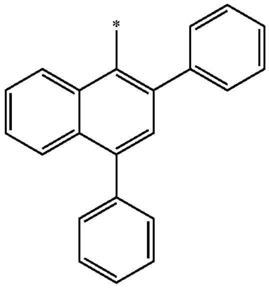 | 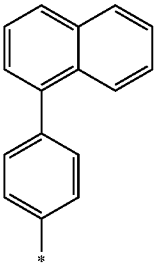 [SMILES: *c1ccc(-c2cccc3ccccc23)cc1] | 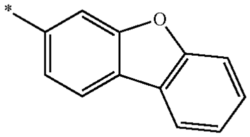 [SMILES: *c1ccc2c(c1)oc1ccccc12] |

-continued
[Compound Group 3]
| | n | A—L—* | $Ar_1$ | $Ar_2$ |
|---|---|---|---|---|
| 2-C1-61 | 0 | 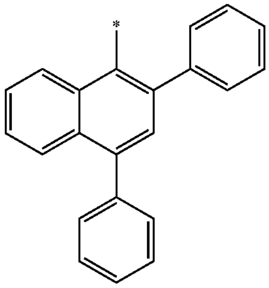 | 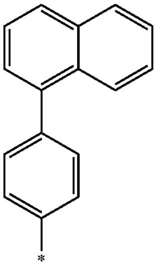 [SMILES: *c1ccc(-c2cccc3ccccc23)cc1] | 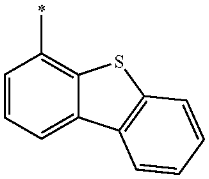 |
| 2-C1-65 | 0 | 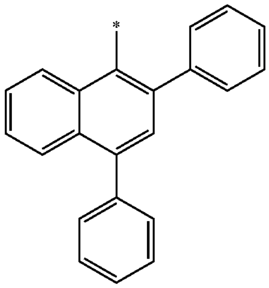 | 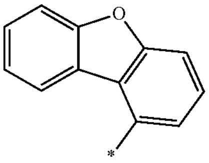 [SMILES: *c1cccc2oc3ccccc3c12] | 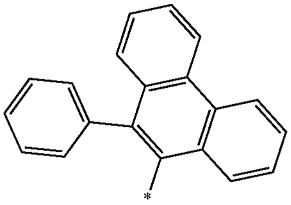 [SMILES: *c1c(-c2ccccc2)c2ccccc2c2ccccc12] |
| 2-C1-66 | 0 | 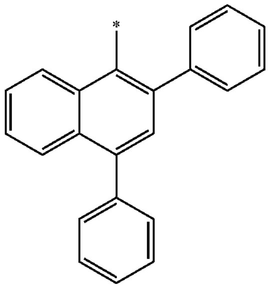 | 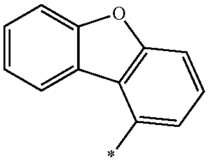 [SMILES: *c1cccc2oc3ccccc3c12] | 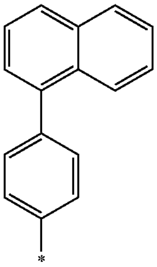 [SMILES: *c1ccc(-c2cccc3ccccc23)cc1] |
| 2-C1-67 | 0 | 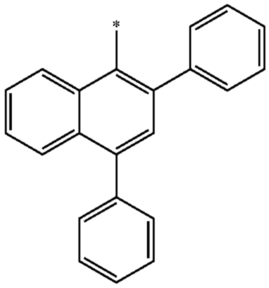 | 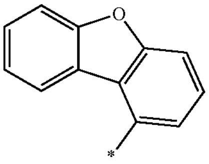 [SMILES: *c1cccc2oc3ccccc3c12] | 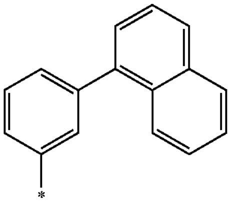 [SMILES: *c1cccc(-c2cccc3ccccc23)c1] |
| 2-C1-68 | 0 | 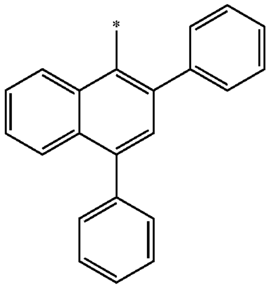 [SMILES: *c1c(-c2ccccc2)cc(-c2ccccc2)c2ccccc12] | 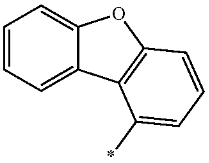 [SMILES: *c1cccc2oc3ccccc3c12] | 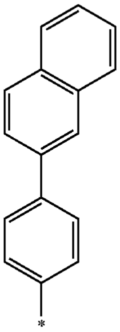 |

-continued
[Compound Group 3]
| | n | A—L—* | $Ar_1$ | $Ar_2$ |
|---|---|---|---|---|
| 2-C1-69 | 0 | 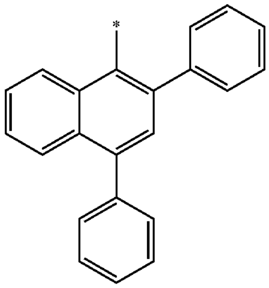 | 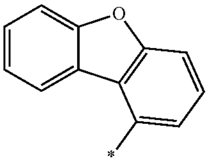 [SMILES: *c1cccc2oc3ccccc3c12] | 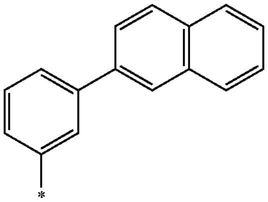 [SMILES: *c1cccc(-c2ccc3ccccc3c2)c1] |
| 2-C1-70 | 0 | 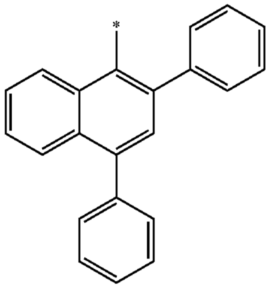 [SMILES: *c1c(-c2ccccc2)cc(-c2ccccc2)c2ccccc12] | 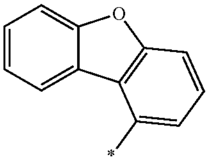 [SMILES: *c1cccc2oc3ccccc3c12] | 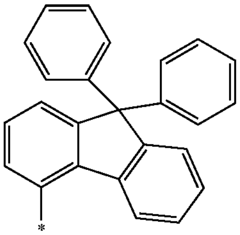 [SMILES: *c1cccc2c1-c1ccccc1C2(c1ccccc1)c1ccccc1] |
| 2-C1-71 | 0 | 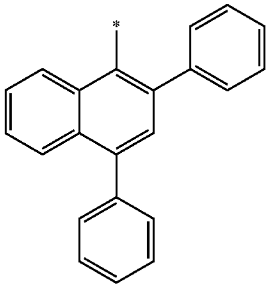 [SMILES: *c1c(-c2ccccc2)cc(-c2ccccc2)c2ccccc12] | 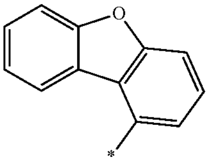 [SMILES: *c1cccc2oc3ccccc3c12] | 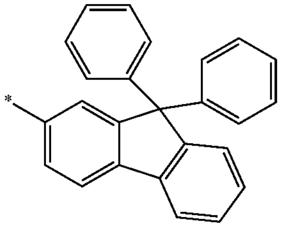 [SMILES: *c1ccc2c(c1)C(c1ccccc1)(c1ccccc1)c1ccccc1-2] |
| 2-C1-76 | 0 | 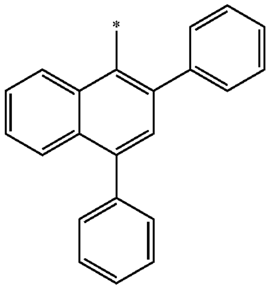 | 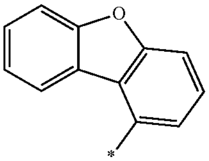 [SMILES: *c1cccc2oc3ccccc3c12] | 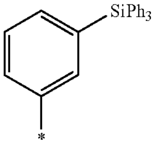 |
| 2-C1-78 | 0 | 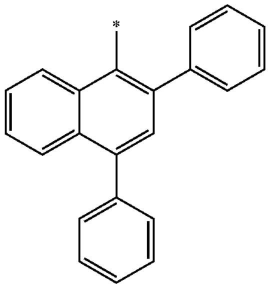 [SMILES: *c1c(-c2ccccc2)cc(-c2ccccc2)c2ccccc12] | 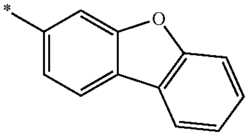 [SMILES: *c1ccc2c(c1)oc1ccccc12] | 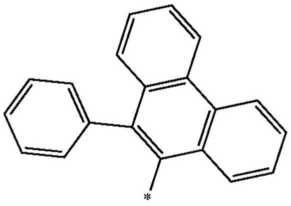 [SMILES: *c1c(-c2ccccc2)c2ccccc2c2ccccc12] |

-continued
| [Compound Group 3] | n | A—L—* | $Ar_1$ | $Ar_2$ |
|---|---|---|---|---|
| 2-C1-79 | 0 | 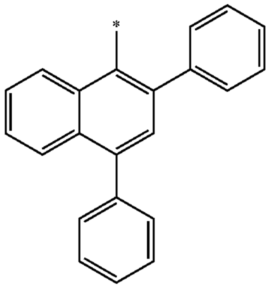 [SMILES: *c1c(-c2ccccc2)cc(-c2ccccc2)c2ccccc12] | 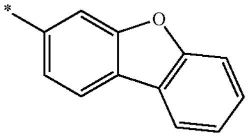 [SMILES: *c1ccc2c(c1)oc1ccccc12] | 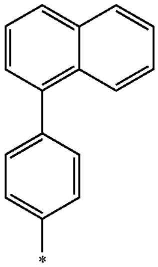 [SMILES: *c1ccc(-c2cccc3ccccc23)cc1] |
| 2-C1-80 | 0 | 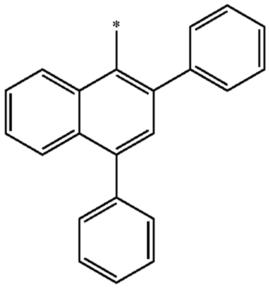 | 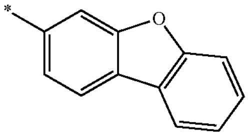 [SMILES: *c1ccc2c(c1)oc1ccccc12] | 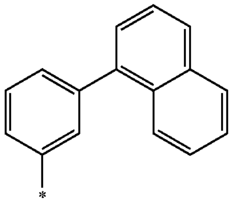 |
| 2-C1-81 | 0 | 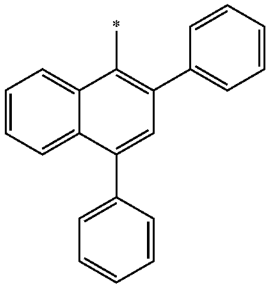 [SMILES: *c1c(-c2ccccc2)cc(-c2ccccc2)c2ccccc12] | 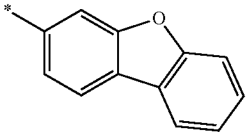 [SMILES: *c1ccc2c(c1)oc1ccccc12] | 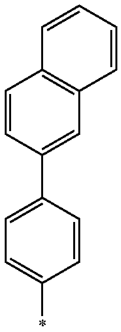 |
| 2-C1-82 | 0 | 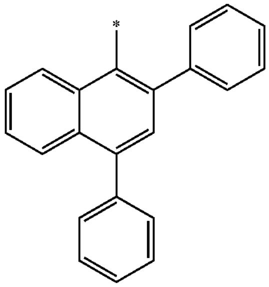 | 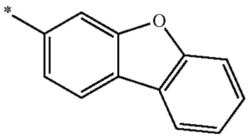 [SMILES: *c1ccc2c(c1)oc1ccccc12] | 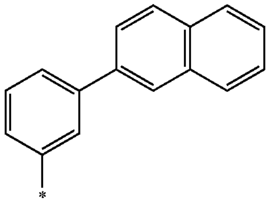 |
| 2-C1-83 | 0 | 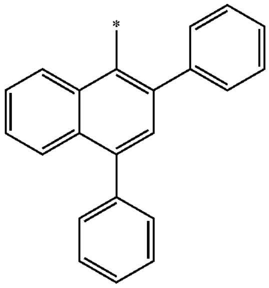 [SMILES: *c1c(-c2ccccc2)cc(-c2ccccc2)c2ccccc12] | 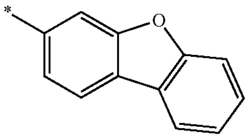 [SMILES: *c1ccc2c(c1)oc1ccccc12] | 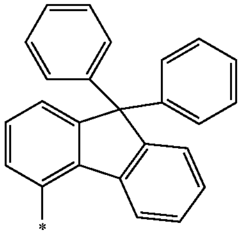 [SMILES: *c1cccc2c1-c1ccccc1C2(c1ccccc1)c1ccccc1] |

-continued
[Compound Group 3]
| | n | A—L—* | $Ar_1$ | $Ar_2$ |
|---|---|---|---|---|
| 2-C1-84 | 0 | 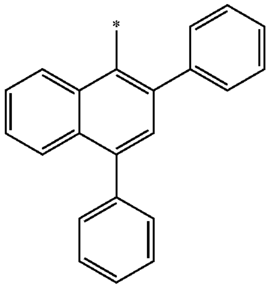 | 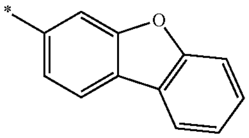 [SMILES: *c1ccc2c(c1)oc1ccccc12] | 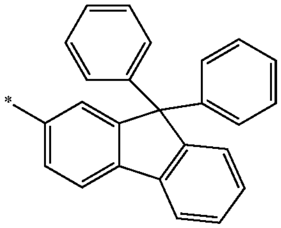 [SMILES: *c1ccc2c(c1)C(c1ccccc1)(c1ccccc1)c1ccccc1-2] |
| 2-C1-88 | 0 | 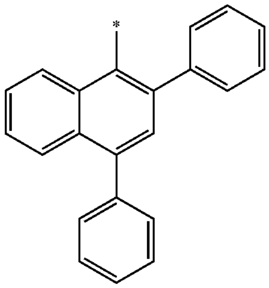 [SMILES: *c1c(-c2ccccc2)cc(-c2ccccc2)c2ccccc12] | 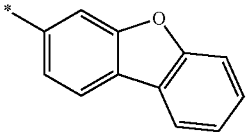 [SMILES: *c1ccc2c(c1)oc1ccccc12] | 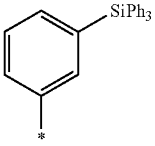 |
| 2-C1-90 | 0 | 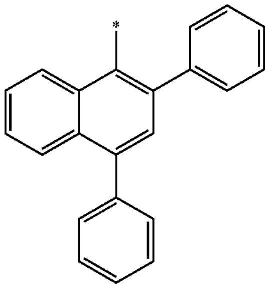 [SMILES: *c1c(-c2ccccc2)cc(-c2ccccc2)c2ccccc12] | 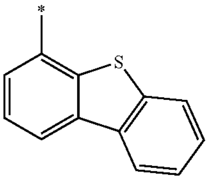 | 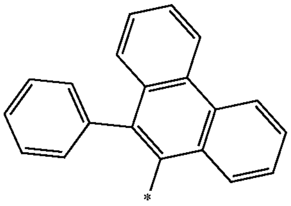 [SMILES: *c1c(-c2ccccc2)c2ccccc2c2ccccc12] |
| 2-C1-91 | 0 | 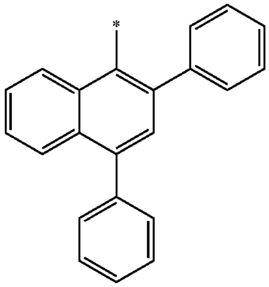 | 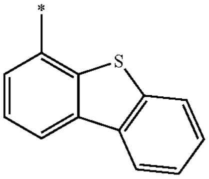 | 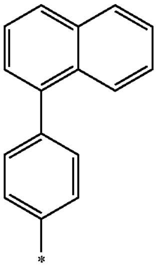 [SMILES: *c1ccc(-c2cccc3ccccc23)cc1] |
| 2-C1-92 | 0 | 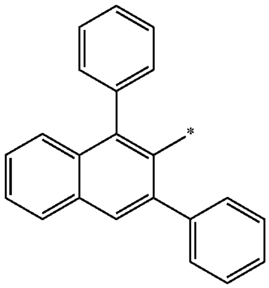 | 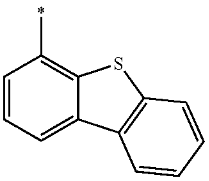 | 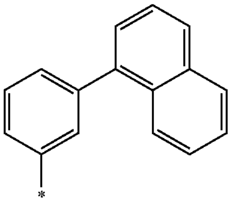 |

-continued
[Compound Group 3]
| | n | A—L—* | $Ar_1$ | $Ar_2$ |
|---|---|---|---|---|
| 2-C1-93 | 0 | 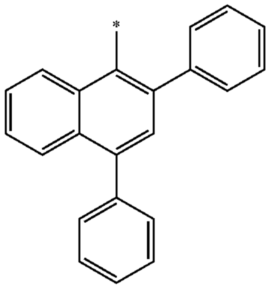 [SMILES: *c1c(-c2ccccc2)cc(-c2ccccc2)c2ccccc12] | 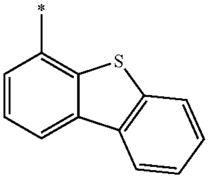 [SMILES: *c1cccc2c1sc1ccccc12] | 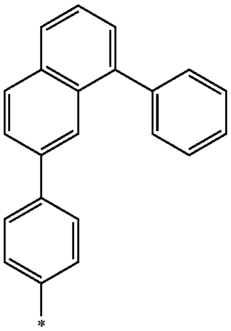 [SMILES: *c1ccc(-c2ccc3cccc(-c4ccccc4)c3c2)cc1] |
| 2-C1-94 | 0 | 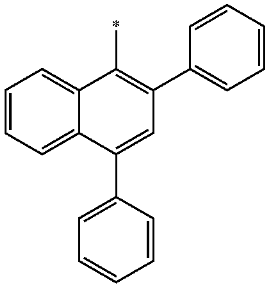 | 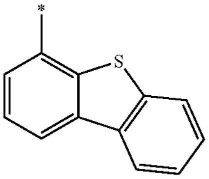 | 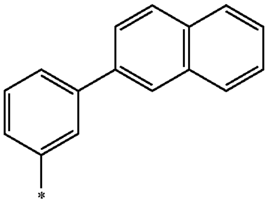 |
| 2-C1-95 | 0 | 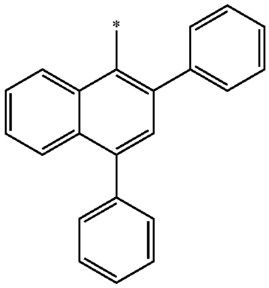 [SMILES: *c1c(-c2ccccc2)cc(-c2ccccc2)c2ccccc12] | 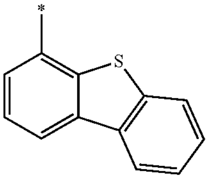 | 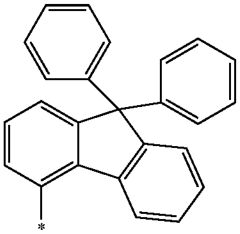 [SMILES: *c1cccc2c1-c1ccccc1C2(c1ccccc1)c1ccccc1] |
| 2-C1-96 | 0 | 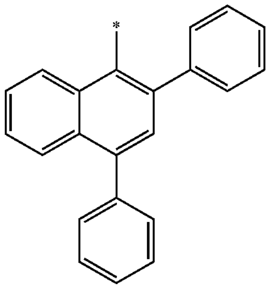 [SMILES: *c1c(-c2ccccc2)cc(-c2ccccc2)c2ccccc12] | 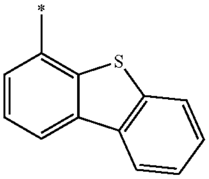 | 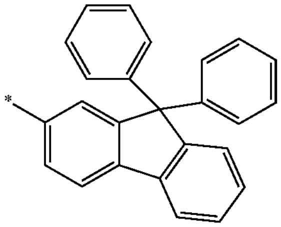 [SMILES: *c1ccc2c(c1)C(c1ccccc1)(c1ccccc1)c1ccccc1-2] |
| 2-C1-99 | 0 | 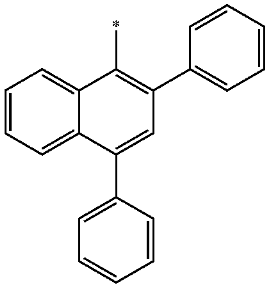 | 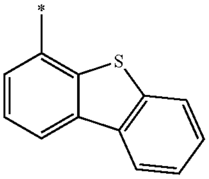 | 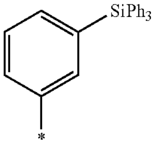 |

-continued
| [Compound Group 3] | | | | |
|---|---|---|---|---|
| | n | A—L—* | $Ar_1$ | $Ar_2$ |
| 3-C1-50 | 0 | 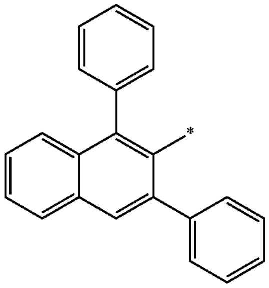 [SMILES: *c1c(-c2ccccc2)cc2ccccc2c1-c1ccccc1] | 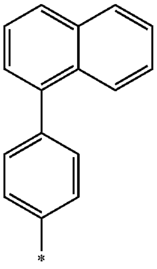 [SMILES: *c1ccc(-c2cccc3ccccc23)cc1] | 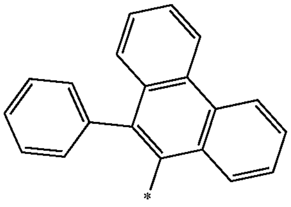 [SMILES: *c1c(-c2ccccc2)c2ccccc2c2ccccc12] |
| 3-C1-51 | 0 | 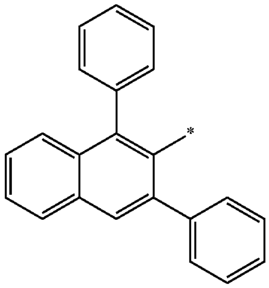 | 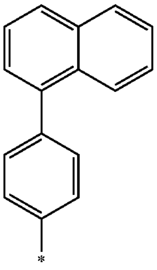 [SMILES: *c1ccc(-c2cccc3ccccc23)cc1] | 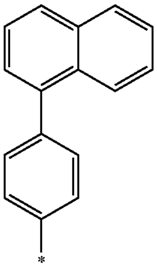 [SMILES: *c1ccc(-c2cccc3ccccc23)cc1] |
| 3-C1-52 | 0 | 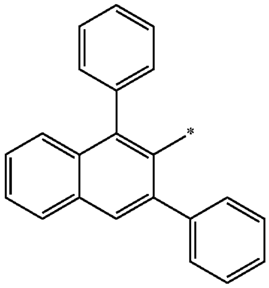 [SMILES: *c1c(-c2ccccc2)cc2ccccc2c1-c1ccccc1] | 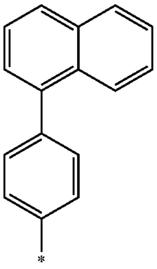 [SMILES: *c1ccc(-c2cccc3ccccc23)cc1] | 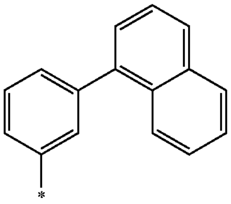 [SMILES: *c1cccc(-c2cccc3ccccc23)c1] |
| 3-C1-53 | 0 | 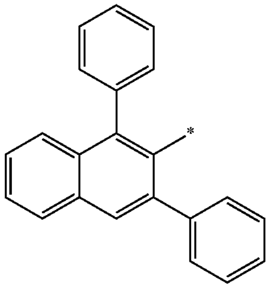 [SMILES: *c1c(-c2ccccc2)cc2ccccc2c1-c1ccccc1] | 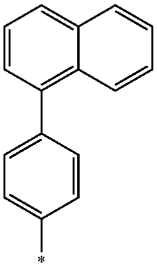 [SMILES: *c1ccc(-c2cccc3ccccc23)cc1] | 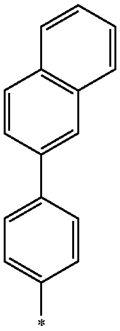 |
| 3-C1-54 | 0 | 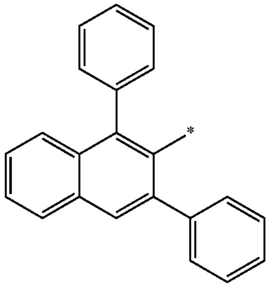 [SMILES: *c1c(-c2ccccc2)cc2ccccc2c1-c1ccccc1] | 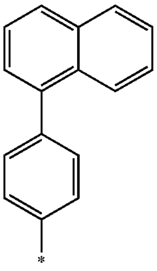 [SMILES: *c1ccc(-c2cccc3ccccc23)cc1] | 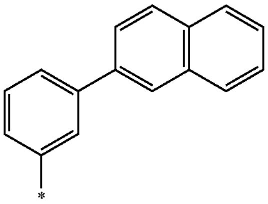 [SMILES: *c1cccc(-c2ccc3ccccc3c2)c1] |

-continued
[Compound Group 3]
| | n | A—L—* | $Ar_1$ | $Ar_2$ |
|---|---|---|---|---|
| 3-C1-55 | 0 | 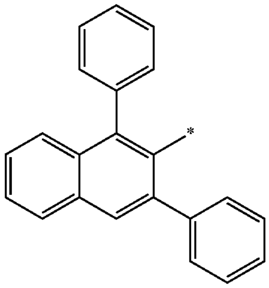 [SMILES: *c1c(-c2ccccc2)cc2ccccc2c1-c1ccccc1] | 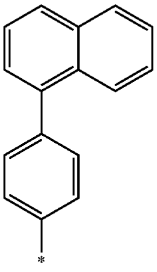 [SMILES: *c1ccc(-c2cccc3ccccc23)cc1] | 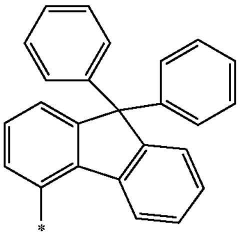 [SMILES: *c1cccc2c1-c1ccccc1C2(c1ccccc1)c1ccccc1] |
| 3-C1-56 | 0 | 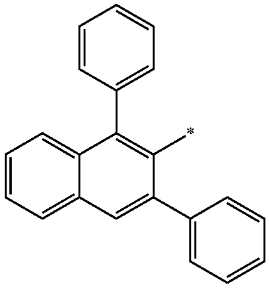 | 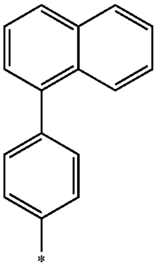 [SMILES: *c1ccc(-c2cccc3ccccc23)cc1] | 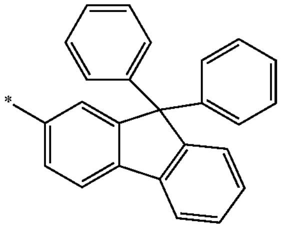 [SMILES: *c1ccc2c(c1)C(c1ccccc1)(c1ccccc1)c1ccccc1-2] |
| 3-C1-58 | 0 | 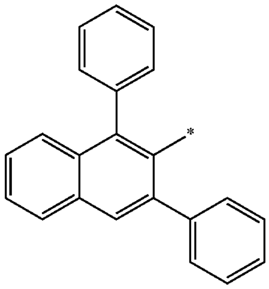 [SMILES: *c1c(-c2ccccc2)cc2ccccc2c1-c1ccccc1] | 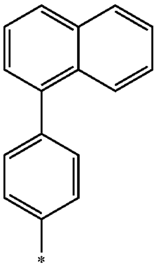 [SMILES: *c1ccc(-c2cccc3ccccc23)cc1] | 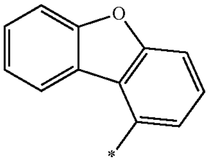 [SMILES: *c1cccc2oc3ccccc3c12] |
| 3-C1-59 | 0 | 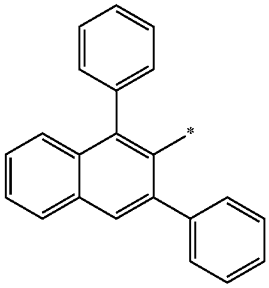 | 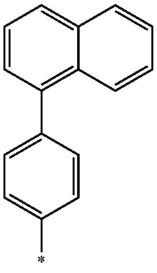 [SMILES: *c1ccc(-c2cccc3ccccc23)cc1] | 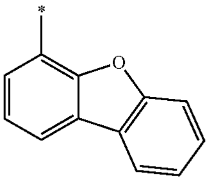 [SMILES: *c1cccc2c1oc1ccccc12] |
| 3-C1-60 | 0 | 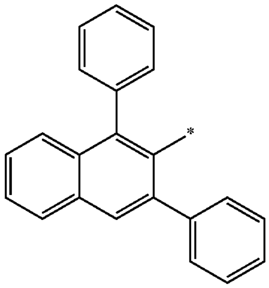 | 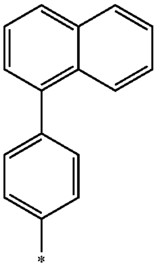 [SMILES: *c1ccc(-c2cccc3ccccc23)cc1] | 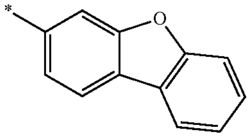 [SMILES: *c1ccc2c(c1)oc1ccccc12] |

-continued
| [Compound Group 3] | | | | |
|---|---|---|---|---|
| | n | A—L—* | $Ar_1$ | $Ar_2$ |
| 3-C-61 | 0 | 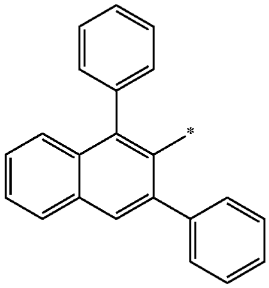 [SMILES: *c1c(-c2ccccc2)cc2ccccc2c1-c1ccccc1] | 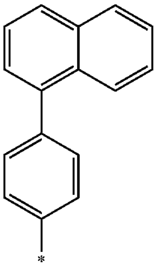 [SMILES: *c1ccc(-c2cccc3ccccc23)cc1] | 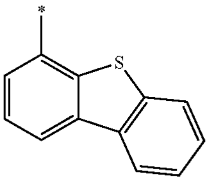 [SMILES: *c1cccc2c1sc1ccccc12] |
| 3-C-62 | 0 | 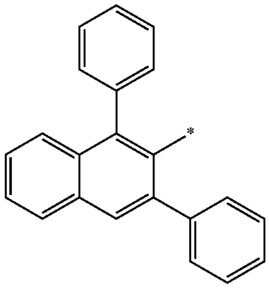 [SMILES: *c1c(-c2ccccc2)cc2ccccc2c1-c1ccccc1] | 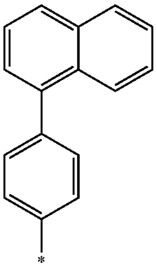 [SMILES: *c1ccc(-c2cccc3ccccc23)cc1] | 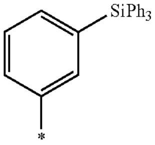 |
| 3-C-65 | 0 | 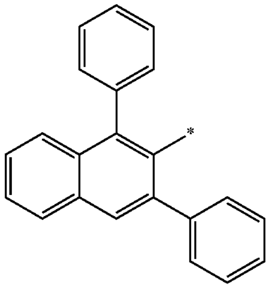 | 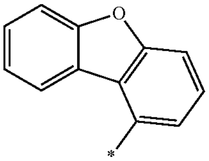 [SMILES: *c1cccc2oc3ccccc3c12] | 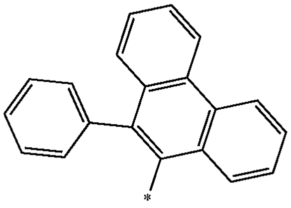 [SMILES: *c1c(-c2ccccc2)c2ccccc2c2ccccc12] |
| 3-C-66 | 0 | 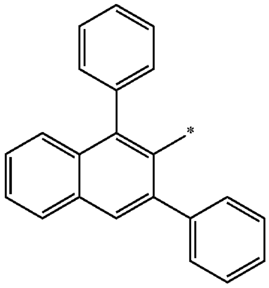 [SMILES: *c1c(-c2ccccc2)cc2ccccc2c1-c1ccccc1] | 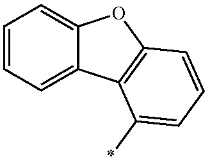 [SMILES: *c1cccc2oc3ccccc3c12] | 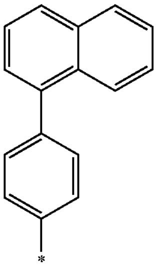 [SMILES: *c1ccc(-c2cccc3ccccc23)cc1] |
| 3-C-67 | 0 | 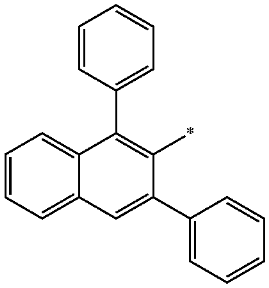 | 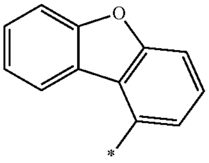 [SMILES: *c1cccc2oc3ccccc3c12] | 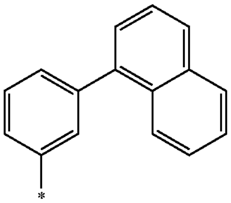 [SMILES: *c1cccc(-c2cccc3ccccc23)c1] |

-continued
[Compound Group 3]
| | n | A—L—* | $Ar_1$ | $Ar_2$ |
|---|---|---|---|---|
| 3-C1-68 | 0 | 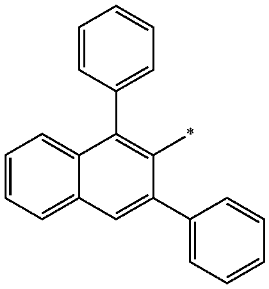 | 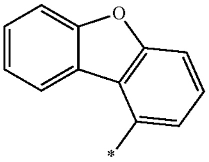 [SMILES: *c1cccc2oc3ccccc3c12] | 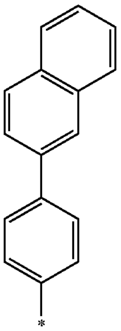 |
| 3-C1-69 | 0 | 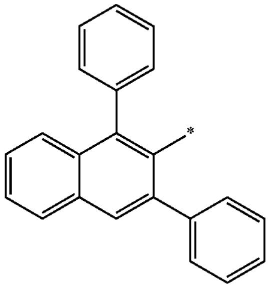 [SMILES: *c1c(-c2ccccc2)cc2ccccc2c1-c1ccccc1] | 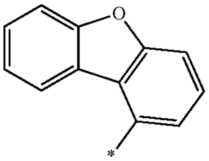 [SMILES: *c1cccc2oc3ccccc3c12] | 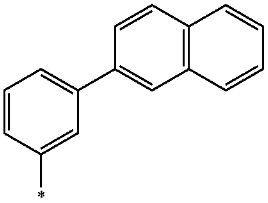 [SMILES: *c1cccc(-c2ccc3ccccc3c2)c1] |
| 3-C1-70 | 0 | 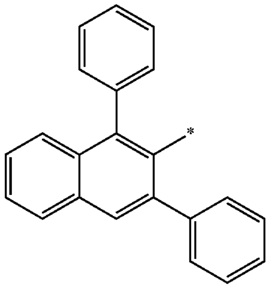 | 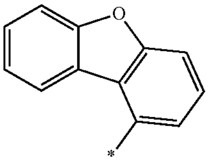 [SMILES: *c1cccc2oc3ccccc3c12] | 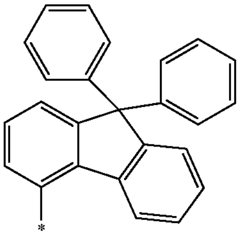 [SMILES: *c1cccc2c1-c1ccccc1C2(c1ccccc1)c1ccccc1] |
| 3-C1-71 | 0 | 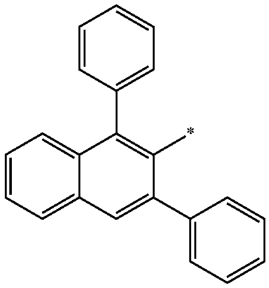 [SMILES: *c1c(-c2ccccc2)cc2ccccc2c1-c1ccccc1] | 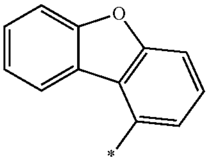 [SMILES: *c1cccc2oc3ccccc3c12] | 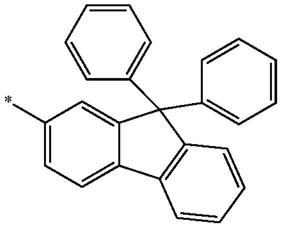 [SMILES: *c1ccc2c(c1)C(c1ccccc1)(c1ccccc1)c1ccccc1-2] |
| 3-C1-76 | 0 | 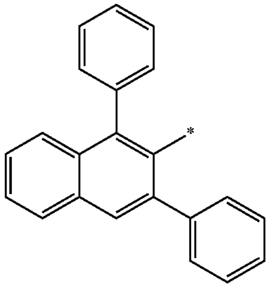 [SMILES: *c1c(-c2ccccc2)cc2ccccc2c1-c1ccccc1] | 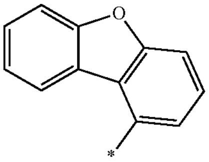 [SMILES: *c1cccc2oc3ccccc3c12] | 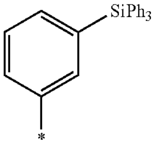 |

-continued
| [Compound Group 3] | | | | |
|---|---|---|---|---|
| | n | A—L—* | $Ar_1$ | $Ar_2$ |
| 3-C1-78 | 0 | 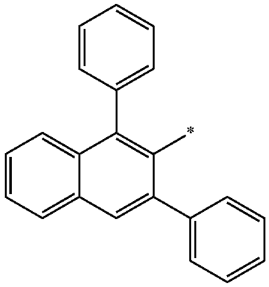 [SMILES: *c1c(-c2ccccc2)cc2ccccc2c1-c1ccccc1] | 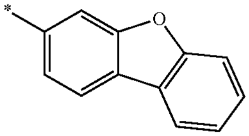 [SMILES: *c1ccc2c(c1)oc1ccccc12] | 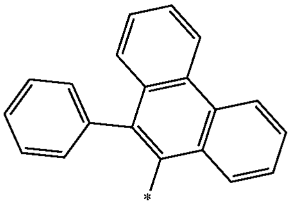 [SMILES: *c1c(-c2ccccc2)c2ccccc2c2ccccc12] |
| 3-C1-79 | 0 | 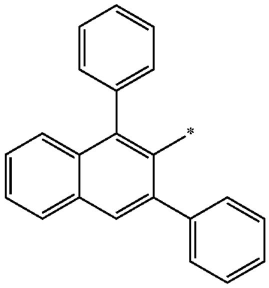 [SMILES: *c1c(-c2ccccc2)cc2ccccc2c1-c1ccccc1] | 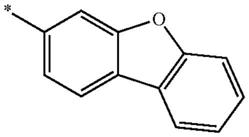 [SMILES: *c1ccc2c(c1)oc1ccccc12] | 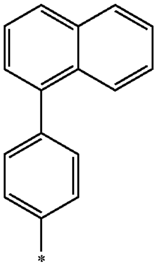 [SMILES: *c1ccc(-c2cccc3ccccc23)cc1] |
| 3-C1-80 | 0 | 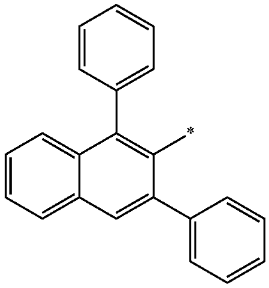 [SMILES: *c1c(-c2ccccc2)cc2ccccc2c1-c1ccccc1] | 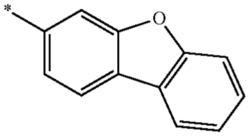 [SMILES: *c1ccc2c(c1)oc1ccccc12] | 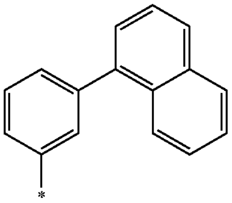 [SMILES: *c1cccc(-c2cccc3ccccc23)c1] |
| 3-C1-81 | 0 | 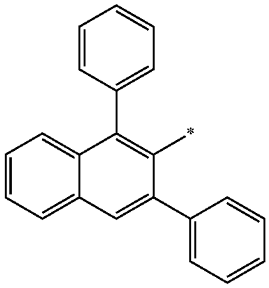 [SMILES: *c1c(-c2ccccc2)cc2ccccc2c1-c1ccccc1] | 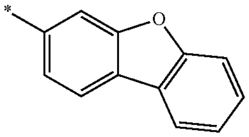 [SMILES: *c1ccc2c(c1)oc1ccccc12] | 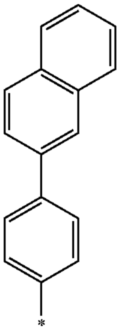 |
| 3-C1-82 | 0 | 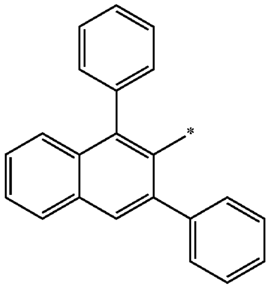 [SMILES: *c1c(-c2ccccc2)cc2ccccc2c1-c1ccccc1] | 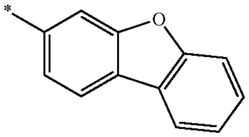 [SMILES: *c1ccc2c(c1)oc1ccccc12] | 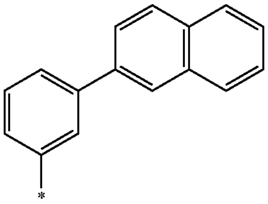 |

-continued
[Compound Group 3]
| | n | A—L—* | $Ar_1$ | $Ar_2$ |
| --- | --- | --- | --- | --- |
| 3-C1-83 | 0 | 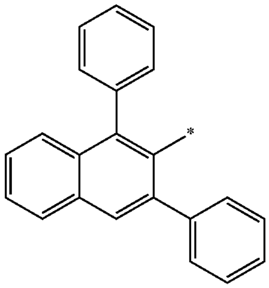 [SMILES: *c1c(-c2ccccc2)cc2ccccc2c1-c1ccccc1] | 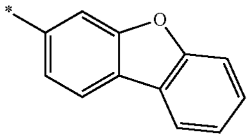 [SMILES: *c1ccc2c(c1)oc1ccccc12] | 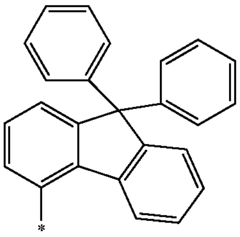 [SMILES: *c1cccc2c1-c1ccccc1C2(c1ccccc1)c1ccccc1] |
| 3-C1-84 | 0 | 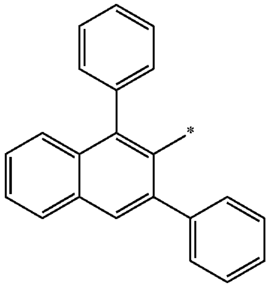 [SMILES: *c1c(-c2ccccc2)cc2ccccc2c1-c1ccccc1] | 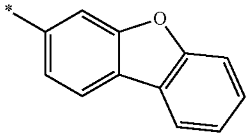 [SMILES: *c1ccc2c(c1)oc1ccccc12] | 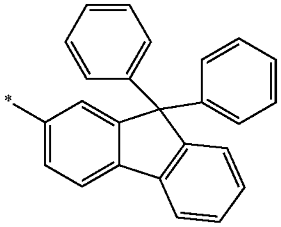 [SMILES: *c1ccc2c(c1)C(c1ccccc1)(c1ccccc1)c1ccccc1-2] |
| 3-C1-88 | 0 | 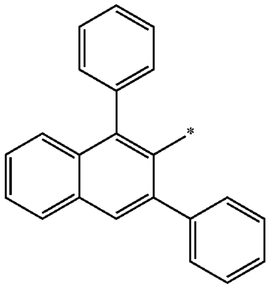 [SMILES: *c1c(-c2ccccc2)cc2ccccc2c1-c1ccccc1] | 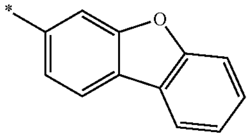 [SMILES: *c1ccc2c(c1)oc1ccccc12] | 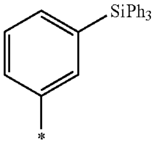 |
| 3-C1-90 | 0 | 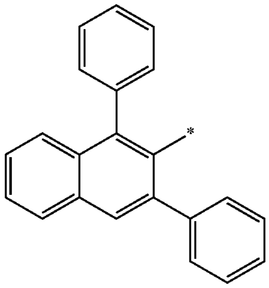 [SMILES: *c1c(-c2ccccc2)cc2ccccc2c1-c1ccccc1] | 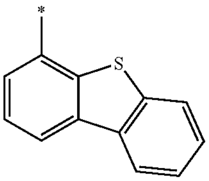 | 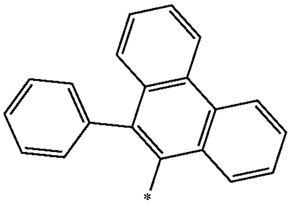 [SMILES: *c1c(-c2ccccc2)c2ccccc2c2ccccc12] |
| 3-C1-91 | 0 | 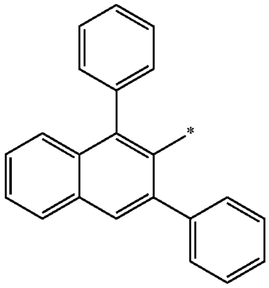 | 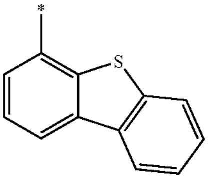 [SMILES: *c1cccc2c1sc1ccccc12] | 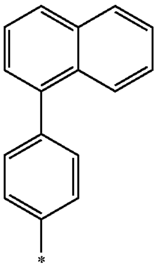 [SMILES: *c1ccc(-c2cccc3ccccc23)cc1] |

-continued
[Compound Group 3]
| | n | A—L—* | $Ar_1$ | $Ar_2$ |
|---|---|---|---|---|
| 3-C1-92 | 0 | 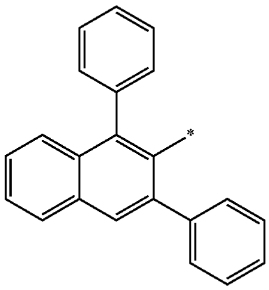 [SMILES: *c1c(-c2ccccc2)cc2ccccc2c1-c1ccccc1] | 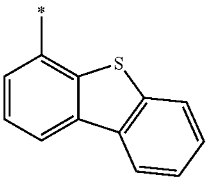 | 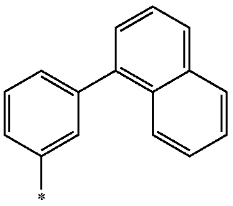 [SMILES: *c1cccc(-c2cccc3ccccc23)c1] |
| 3-C1-93 | 0 | 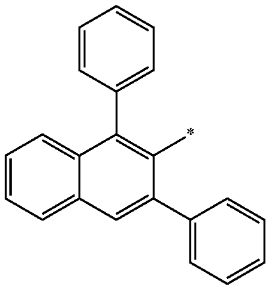 [SMILES: *c1c(-c2ccccc2)cc2ccccc2c1-c1ccccc1] | 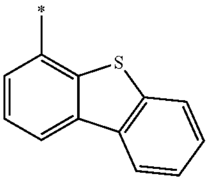 | 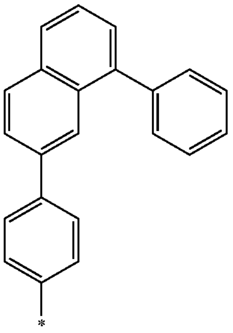 [SMILES: *c1ccc(-c2ccc3cccc(-c4ccccc4)c3c2)cc1] |
| 3-C1-94 | 0 | 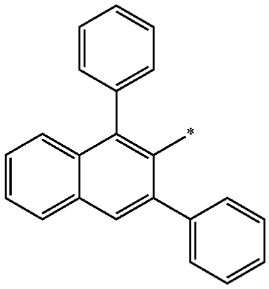 [SMILES: *c1c(-c2ccccc2)cc2ccccc2c1-c1ccccc1] | 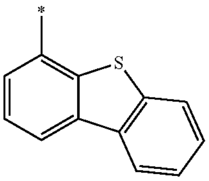 | 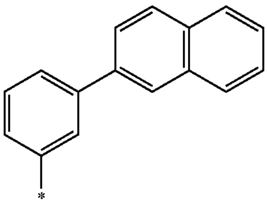 |
| 3-C1-95 | 0 | 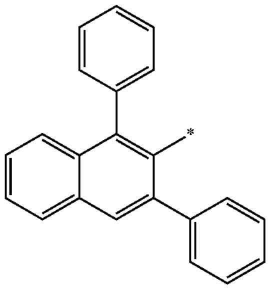 [SMILES: *c1c(-c2ccccc2)cc2ccccc2c1-c1ccccc1] | 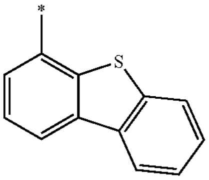 | 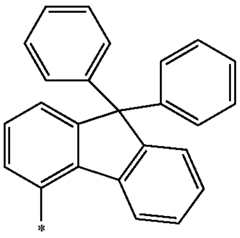 [SMILES: *c1cccc2c1-c1ccccc1C2(c1ccccc1)c1ccccc1] |
| 3-C1-96 | 0 | 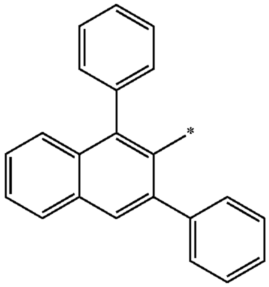 | 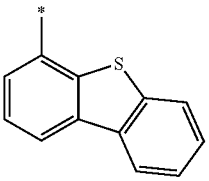 | 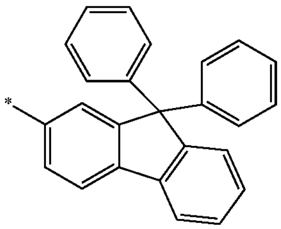 [SMILES: *c1ccc2c(c1)C(c1ccccc1)(c1ccccc1)c1ccccc1-2] |

-continued
| [Compound Group 3] | | | | |
|---|---|---|---|---|
| | n | A—L—* | $Ar_1$ | $Ar_2$ |
| 3-C1-99 | 0 | 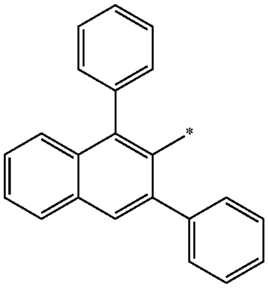 | 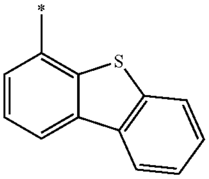 | 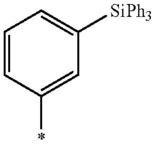 |
| [Compound Group 4] | | | |
|---|---|---|---|
| | n | A—L—* | $Ar_1$ |
| 2-D1-50 | 1 | 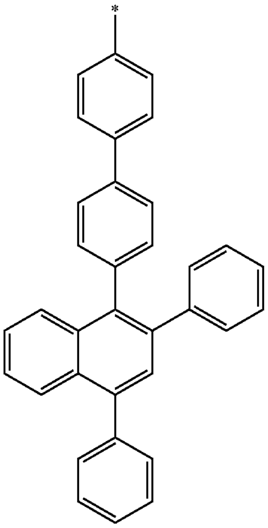 [SMILES: *c1ccc(-c2ccc(-c3c(-c4ccccc4)cc(-c4ccccc4)c4ccccc34)cc2)cc1] | 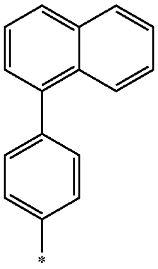 [SMILES: *c1ccc(-c2cccc3ccccc23)cc1] |
| 2-D1-51 | 1 | 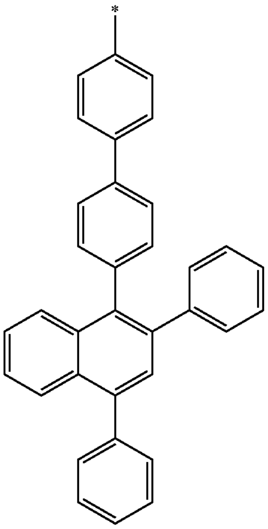 [SMILES: *c1ccc(-c2ccc(-c3c(-c4ccccc4)cc(-c4ccccc4)c4ccccc34)cc2)cc1] | 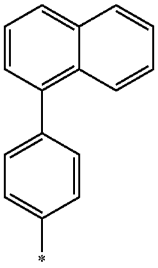 [SMILES: *c1ccc(-c2cccc3ccccc23)cc1] |

-continued
| [Compound Group 4] | | | |
|---|---|---|---|
| 2-D1-52 | 1 | 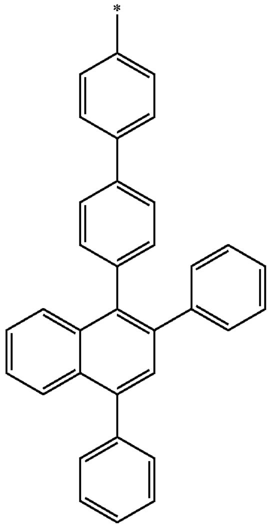 [SMILES: *c1ccc(-c2ccc(-c3c(-c4ccccc4)cc(-c4ccccc4)c4ccccc34)cc2)cc1] | 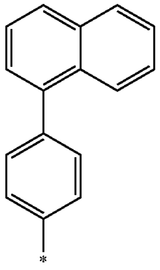 [SMILES: *c1ccc(-c2cccc3ccccc23)cc1] |
| 2-D1-53 | 1 | 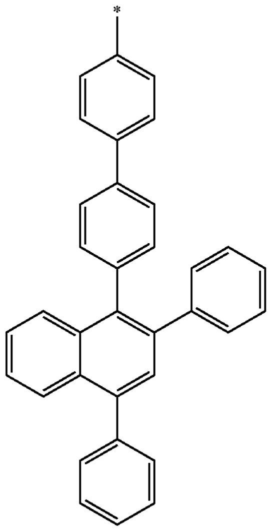 [SMILES: *c1ccc(-c2ccc(-c3c(-c4ccccc4)cc(-c4ccccc4)c4ccccc34)cc2)cc1] | 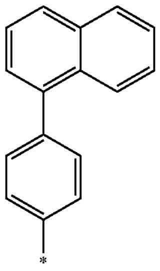 [SMILES: *c1ccc(-c2cccc3ccccc23)cc1] |
| 2-D1-54 | 1 | 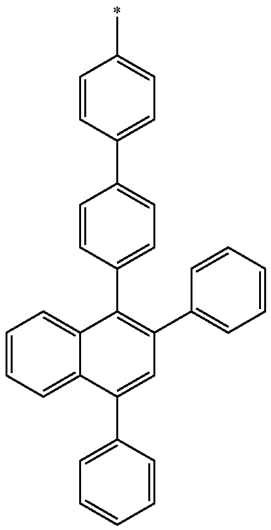 [SMILES: *c1ccc(-c2ccc(-c3c(-c4ccccc4)cc(-c4ccccc4)c4ccccc34)cc2)cc1] | 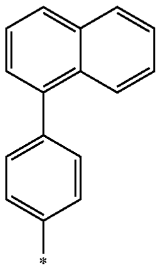 [SMILES: *c1ccc(-c2cccc3ccccc23)cc1] |

-continued
| [Compound Group 4] | | | |
|---|---|---|---|
| 2-D1-55 | 1 | 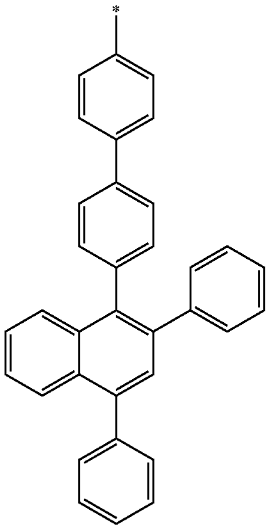 [SMILES: *c1ccc(-c2ccc(-c3c(-c4ccccc4)cc(-c4ccccc4)c4ccccc34)cc2)cc1] | 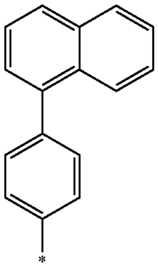 [SMILES: *c1ccc(-c2cccc3ccccc23)cc1] |
| 2-D1-56 | 1 | 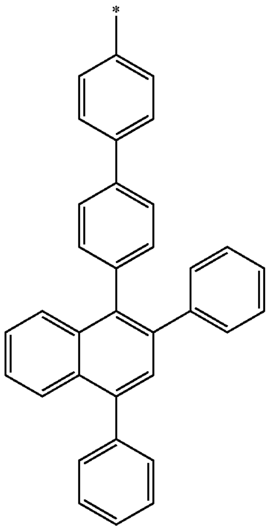 [SMILES: *c1ccc(-c2ccc(-c3c(-c4ccccc4)cc(-c4ccccc4)c4ccccc34)cc2)cc1] | 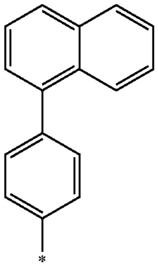 [SMILES: *c1ccc(-c2cccc3ccccc23)cc1] |
| 2-D1-58 | 1 | 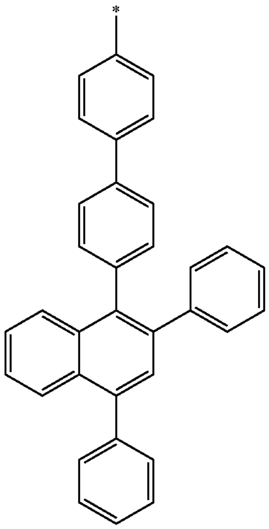 [SMILES: *c1ccc(-c2ccc(-c3c(-c4ccccc4)cc(-c4ccccc4)c4ccccc34)cc2)cc1] | 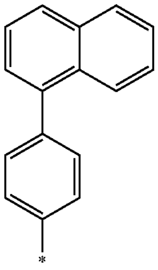 [SMILES: *c1ccc(-c2cccc3ccccc23)cc1] |

-continued
[Compound Group 4]
| | | | |
|---|---|---|---|
| 2-D1-59 | 1 | 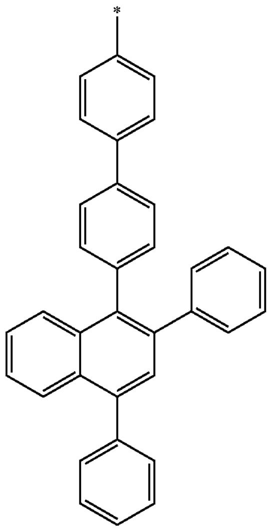 [SMILES: *c1ccc(-c2ccc(-c3c(-c4ccccc4)cc(-c4ccccc4)c4ccccc34)cc2)cc1] | 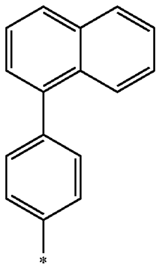 [SMILES: *c1ccc(-c2cccc3ccccc23)cc1] |
| 2-D1-60 | 1 | 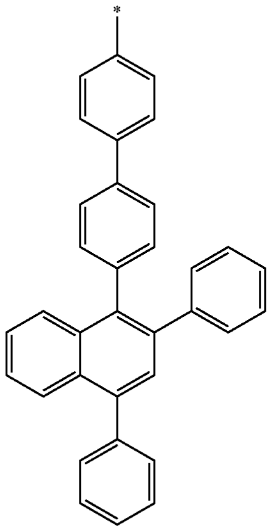 [SMILES: *c1ccc(-c2ccc(-c3c(-c4ccccc4)cc(-c4ccccc4)c4ccccc34)cc2)cc1] | 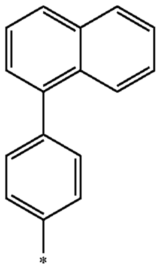 [SMILES: *c1ccc(-c2cccc3ccccc23)cc1] |
| 2-D1-61 | 1 | 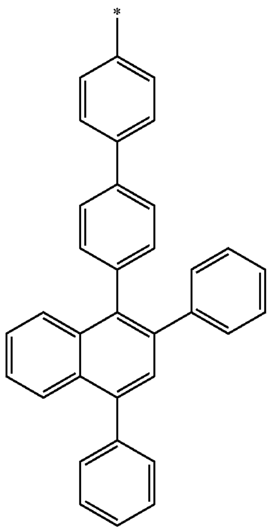 [SMILES: *c1ccc(-c2ccc(-c3c(-c4ccccc4)cc(-c4ccccc4)c4ccccc34)cc2)cc1] | 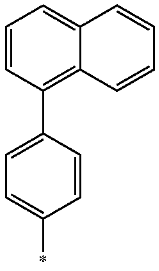 [SMILES: *c1ccc(-c2cccc3ccccc23)cc1] |

-continued
| [Compound Group 4] | | |
|---|---|---|
| 2-D1-62 1 | 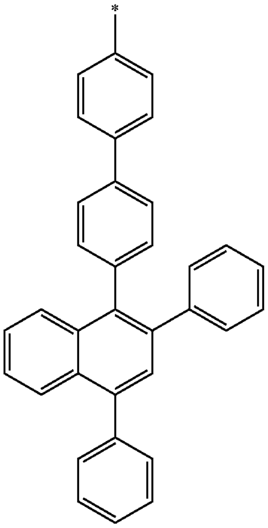 [SMILES: *c1ccc(-c2ccc(-c3c(-c4ccccc4)cc(-c4ccccc4)c4ccccc34)cc2)cc1] | 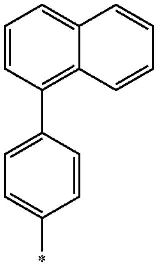 [SMILES: *c1ccc(-c2cccc3ccccc23)cc1] |
| 2-D1-65 1 | 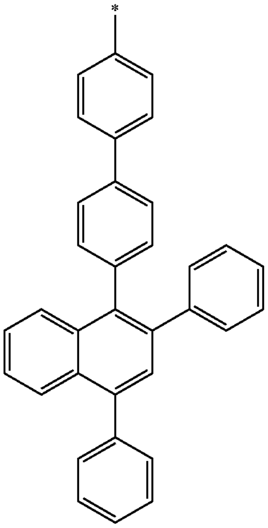 [SMILES: *c1ccc(-c2ccc(-c3c(-c4ccccc4)cc(-c4ccccc4)c4ccccc34)cc2)cc1] | 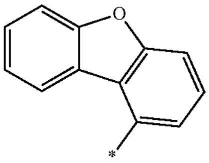 [SMILES: *c1cccc2oc3ccccc3c12] |
| 2-D1-66 1 | 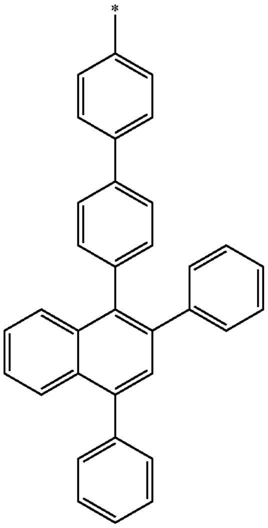 [SMILES: *c1ccc(-c2ccc(-c3c(-c4ccccc4)cc(-c4ccccc4)c4ccccc34)cc2)cc1] | 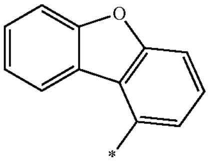 [SMILES: *c1cccc2oc3ccccc3c12] |

-continued
| [Compound Group 4] | | |
|---|---|---|
| 2-D1-67 1 | 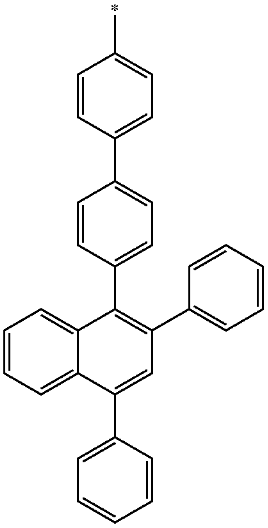 [SMILES: *c1ccc(-c2ccc(-c3c(-c4ccccc4)cc(-c4ccccc4)c4ccccc34)cc2)cc1] | 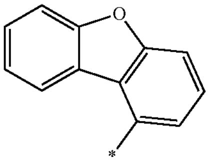 [SMILES: *c1cccc2oc3ccccc3c12] |
| 2-D1-68 1 | 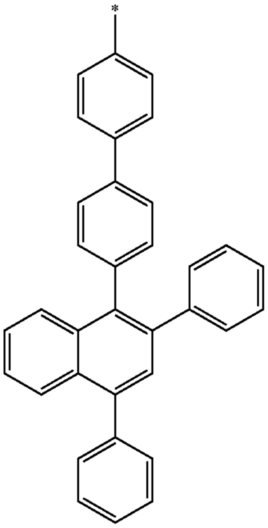 [SMILES: *c1ccc(-c2ccc(-c3c(-c4ccccc4)cc(-c4ccccc4)c4ccccc34)cc2)cc1] | 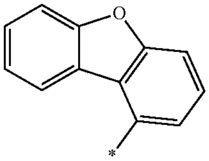 [SMILES: *c1cccc2oc3ccccc3c12] |
| 2-D1-69 1 | 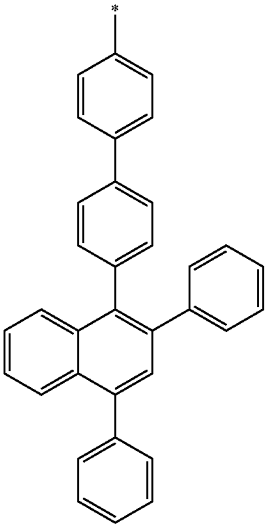 [SMILES: *c1ccc(-c2ccc(-c3c(-c4ccccc4)cc(-c4ccccc4)c4ccccc34)cc2)cc1] | 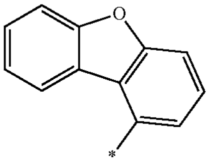 [SMILES: *c1cccc2oc3ccccc3c12] |

-continued
| [Compound Group 4] | | |
|---|---|---|
| 2-D1-70 1 | 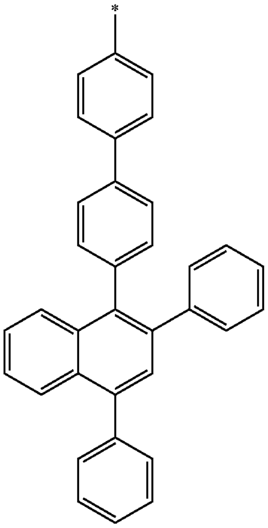 [SMILES: *c1ccc(-c2ccc(-c3c(-c4ccccc4)cc(-c4ccccc4)c4ccccc34)cc2)cc1] | 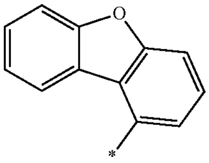 [SMILES: *c1cccc2oc3ccccc3c12] |
| 2-D1-71 1 | 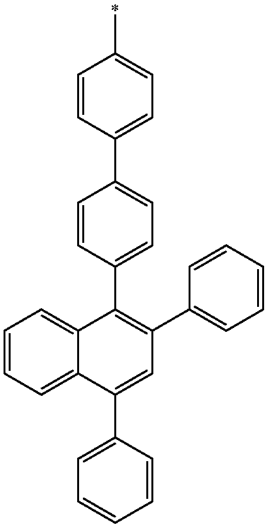 [SMILES: *c1ccc(-c2ccc(-c3c(-c4ccccc4)cc(-c4ccccc4)c4ccccc34)cc2)cc1] | 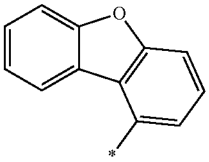 [SMILES: *c1cccc2oc3ccccc3c12] |
| 2-D1-76 1 | 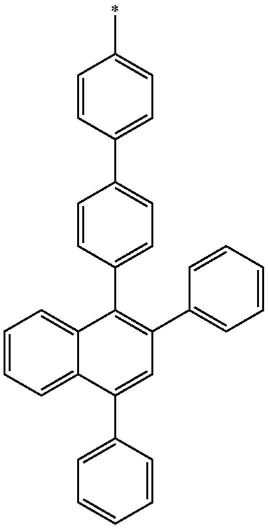 [SMILES: *c1ccc(-c2ccc(-c3c(-c4ccccc4)cc(-c4ccccc4)c4ccccc34)cc2)cc1] | 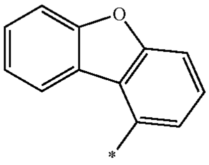 [SMILES: *c1cccc2oc3ccccc3c12] |

-continued
| [Compound Group 4] | | | |
|---|---|---|---|
| 2-D1-78 | 1 | 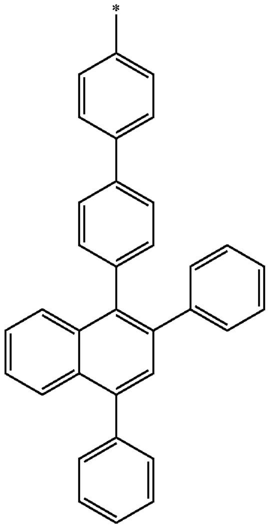 [SMILES: *c1ccc(-c2ccc(-c3c(-c4ccccc4)cc(-c4ccccc4)c4ccccc34)cc2)cc1] | 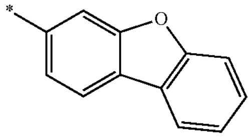 [SMILES: *c1ccc2c(c1)oc1ccccc12] |
| 2-D1-79 | 1 | 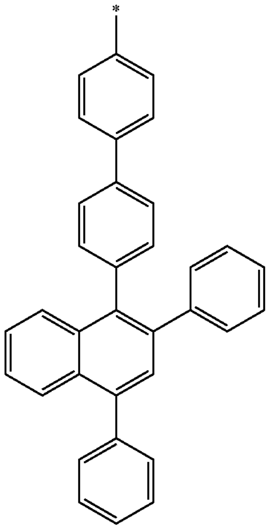 [SMILES: *c1ccc(-c2ccc(-c3c(-c4ccccc4)cc(-c4ccccc4)c4ccccc34)cc2)cc1] | 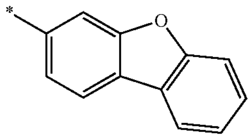 [SMILES: *c1ccc2c(c1)oc1ccccc12] |
| 2-D1-80 | 1 | 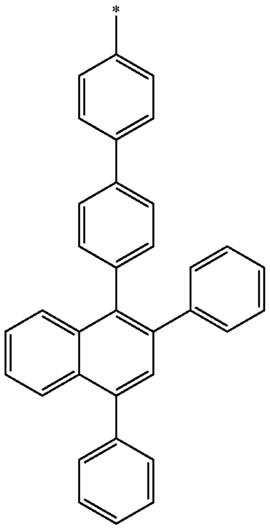 [SMILES: *c1ccc(-c2ccc(-c3c(-c4ccccc4)cc(-c4ccccc4)c4ccccc34)cc2)cc1] | 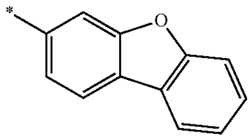 [SMILES: *c1ccc2c(c1)oc1ccccc12] |

-continued
| [Compound Group 4] | | |
|---|---|---|
| 2-D1-81 1 | 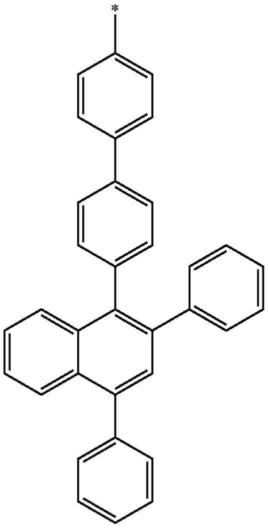 [SMILES: *c1ccc(-c2ccc(-c3c(-c4ccccc4)cc(-c4ccccc4)c4ccccc34)cc2)cc1] | 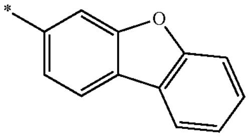 [SMILES: *c1ccc2c(c1)oc1ccccc12] |
| 2-D1-82 1 | 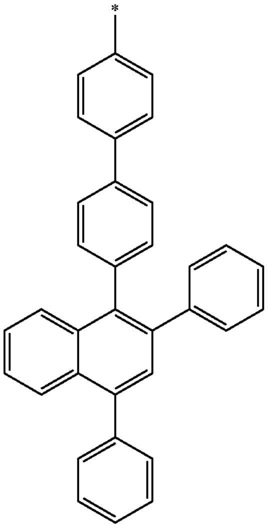 [SMILES: *c1ccc(-c2ccc(-c3c(-c4ccccc4)cc(-c4ccccc4)c4ccccc34)cc2)cc1] | 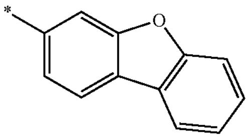 [SMILES: *c1ccc2c(c1)oc1ccccc12] |
| 2-D1-83 1 | 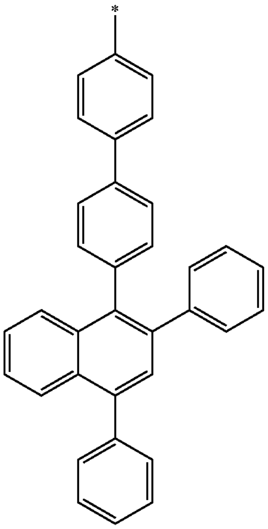 [SMILES: *c1ccc(-c2ccc(-c3c(-c4ccccc4)cc(-c4ccccc4)c4ccccc34)cc2)cc1] | 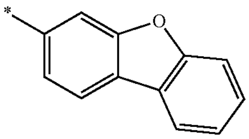 [SMILES: *c1ccc2c(c1)oc1ccccc12] |

-continued
| [Compound Group 4] | | | |
|---|---|---|---|
| 2-D1-84 | 1 | 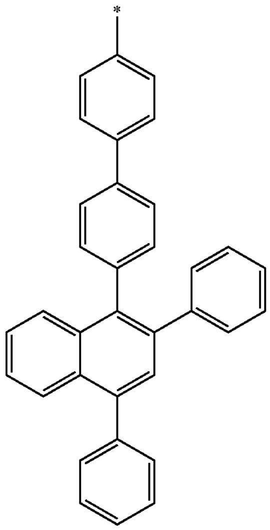 [SMILES: *c1ccc(-c2ccc(-c3c(-c4ccccc4)cc(-c4ccccc4)c4ccccc34)cc2)cc1] | 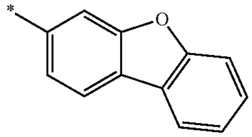 [SMILES: *c1ccc2c(c1)oc1ccccc12] |
| 2-D1-88 | 1 | 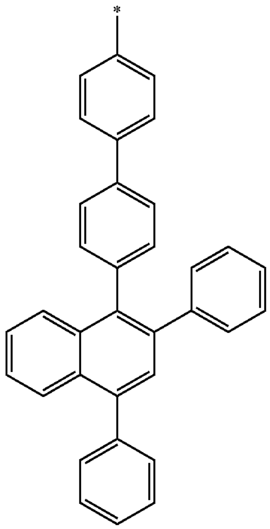 [SMILES: *c1ccc(-c2ccc(-c3c(-c4ccccc4)cc(-c4ccccc4)c4ccccc34)cc2)cc1] | 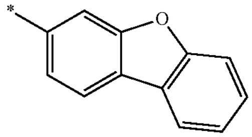 [SMILES: *c1ccc2c(c1)oc1ccccc12] |
| 2-D1-90 | 1 | 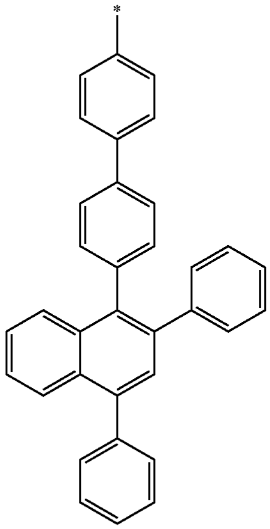 [SMILES: *c1ccc(-c2ccc(-c3c(-c4ccccc4)cc(-c4ccccc4)c4ccccc34)cc2)cc1] | 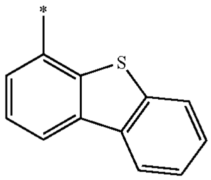 |

-continued
| [Compound Group 4] | | |
|---|---|---|
| 2-D1-91 1 | 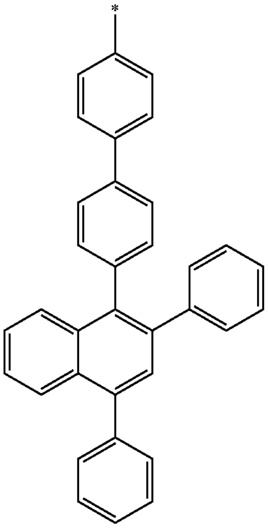 [SMILES: *c1ccc(-c2ccc(-c3c(-c4ccccc4)cc(-c4ccccc4)c4ccccc34)cc2)cc1] | 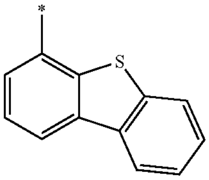 |
| 2-D1-92 1 | 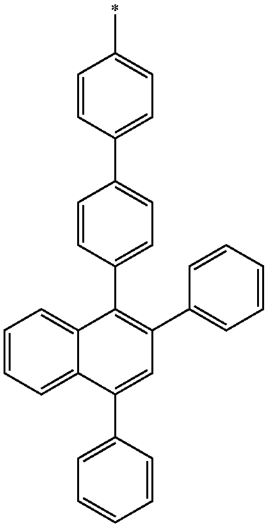 [SMILES: *c1ccc(-c2ccc(-c3c(-c4ccccc4)cc(-c4ccccc4)c4ccccc34)cc2)cc1] | 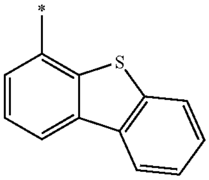 |
| 2-D1-93 1 | 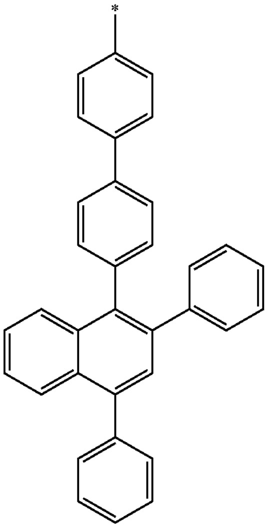 [SMILES: *c1ccc(-c2ccc(-c3c(-c4ccccc4)cc(-c4ccccc4)c4ccccc34)cc2)cc1] | 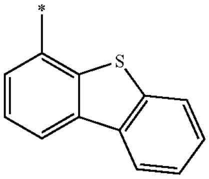 |

-continued
[Compound Group 4]
2-D1-94 1
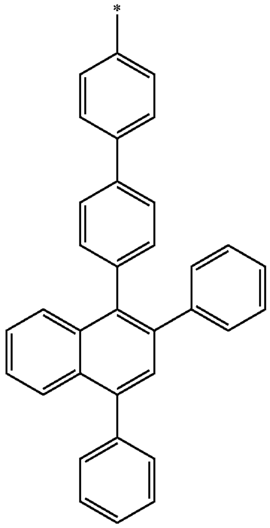 [SMILES: *c1ccc(-c2ccc(-c3c(-c4ccccc4)cc(-c4ccccc4)c4ccccc34)cc2)cc1]
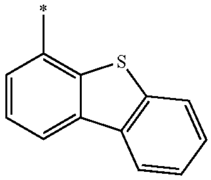
2-D1-95 1
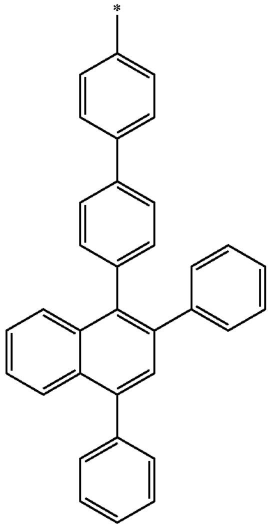 [SMILES: *c1ccc(-c2ccc(-c3c(-c4ccccc4)cc(-c4ccccc4)c4ccccc34)cc2)cc1]
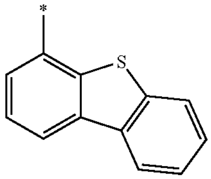 [SMILES: *c1cccc2c1sc1ccccc12]
2-D1-96 1
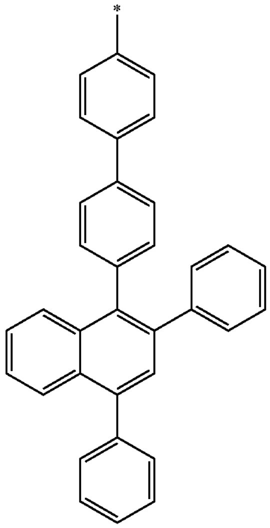 [SMILES: *c1ccc(-c2ccc(-c3c(-c4ccccc4)cc(-c4ccccc4)c4ccccc34)cc2)cc1]
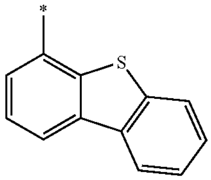

-continued
| [Compound Group 4] | | | |
|---|---|---|---|
| 2-D1-99 | 1 | 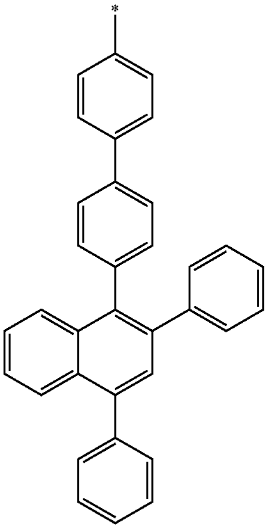 [SMILES: *c1ccc(-c2ccc(-c3c(-c4ccccc4)cc(-c4ccccc4)c4ccccc34)cc2)cc1] | 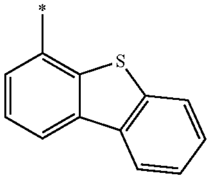 |
| 3-D1-50 | 1 | 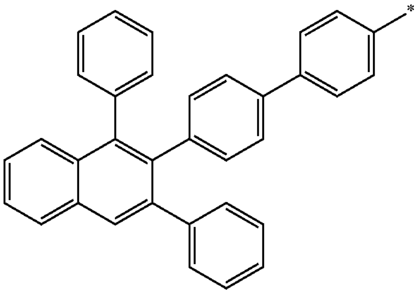 [SMILES: *c1ccc(-c2ccc(-c3c(-c4ccccc4)cc4ccccc4c3-c3ccccc3)cc2)cc1] | 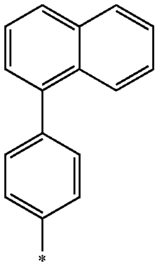 [SMILES: *c1ccc(-c2cccc3ccccc23)cc1] |
| 3-D1-51 | 1 | 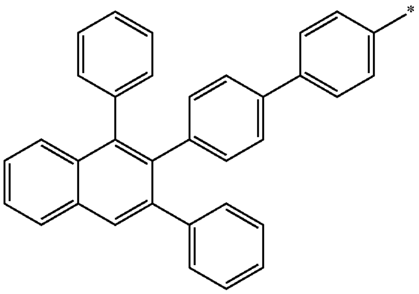 [SMILES: *c1ccc(-c2ccc(-c3c(-c4ccccc4)cc4ccccc4c3-c3ccccc3)cc2)cc1] | 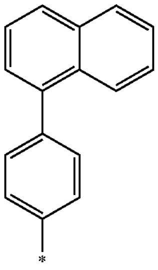 [SMILES: *c1ccc(-c2cccc3ccccc23)cc1] |
| 3-D1-52 | 1 | 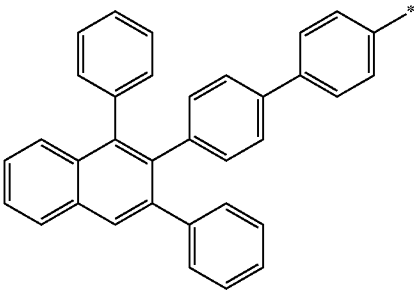 [SMILES: *c1ccc(-c2ccc(-c3c(-c4ccccc4)cc4ccccc4c3-c3ccccc3)cc2)cc1] | 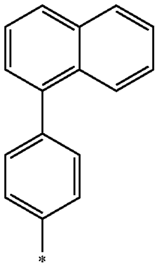 [SMILES: *c1ccc(-c2cccc3ccccc23)cc1] |

-continued
| [Compound Group 4] | | |
|---|---|---|
| 3-D1-53 | 1 | 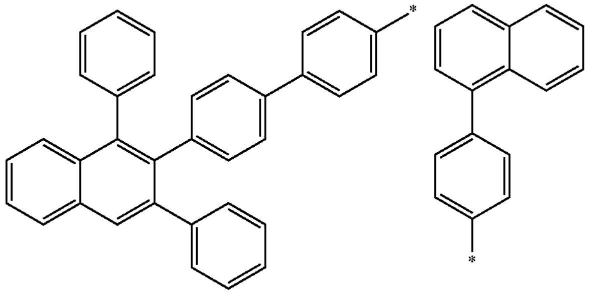 |
| 3-D1-54 | 1 | 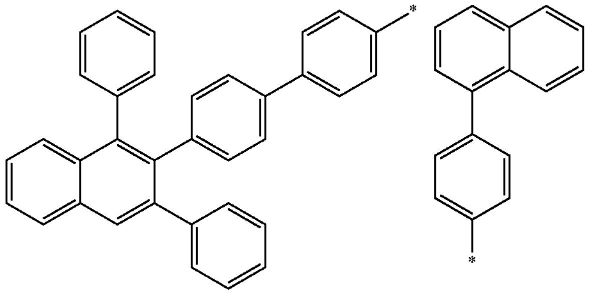 |
| 3-D1-55 | 1 | 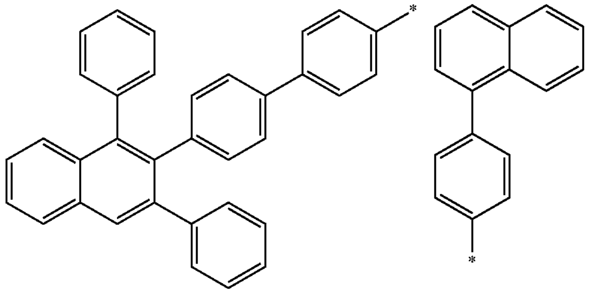 |
| 3-D1-56 | 1 | 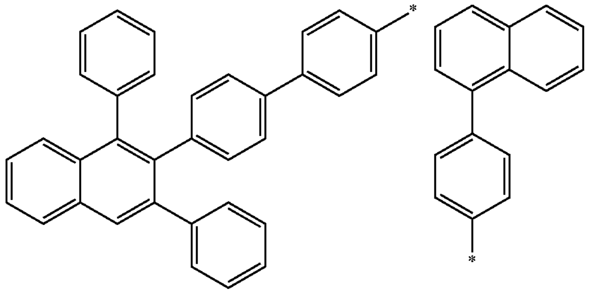 |
| 3-D1-58 | 1 | 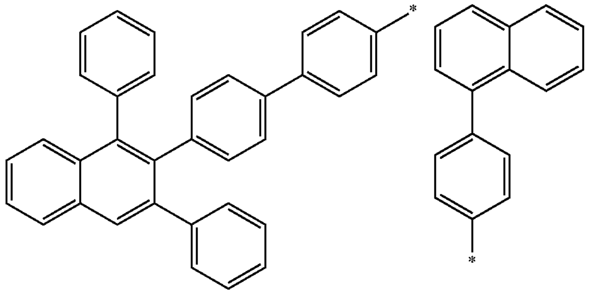 |

-continued
| [Compound Group 4] | | |
|---|---|---|
| 3-D1-59 | 1 | 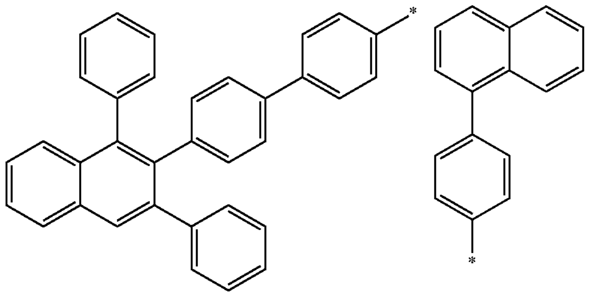 |
| 3-D1-60 | 1 | 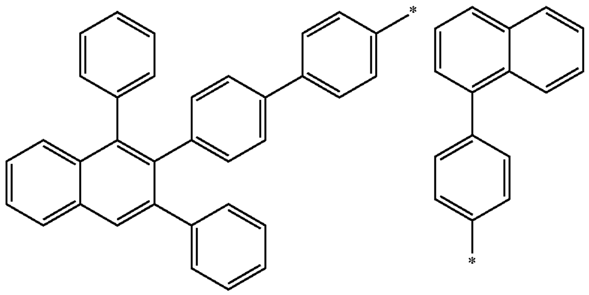 |
| 3-D1-61 | 1 | 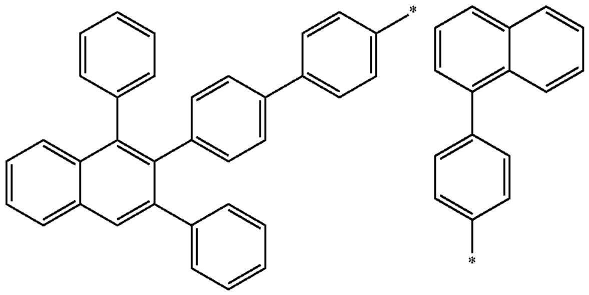 |
| 3-D1-62 | 1 | 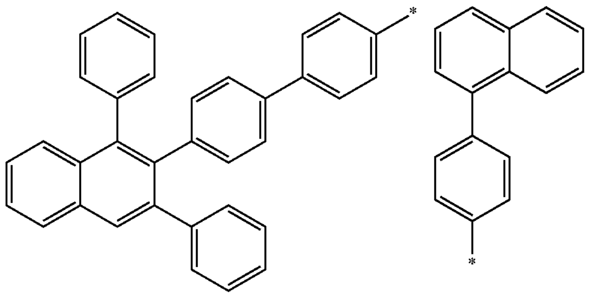 |
| 3-D1-65 | 1 | 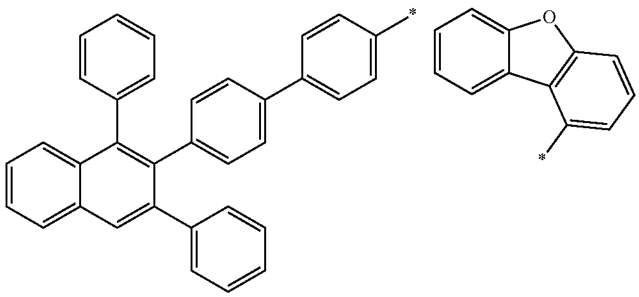 |

-continued
| [Compound Group 4] | | |
|---|---|---|
| 3-D1-66 | 1 | 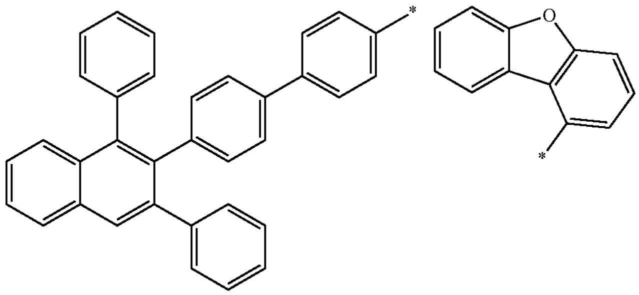 |
| 3-D1-67 | 1 | 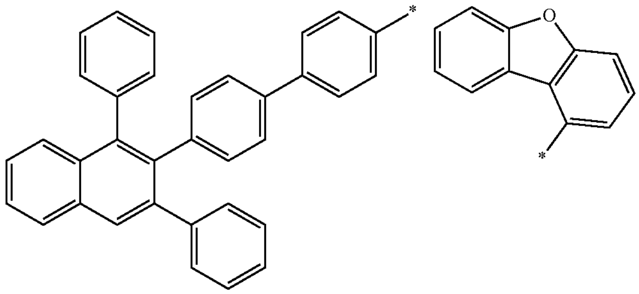 |
| 3-D1-68 | 1 | 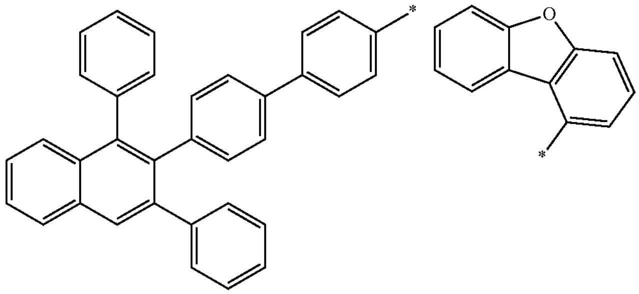 |
| 3-D1-69 | 1 | 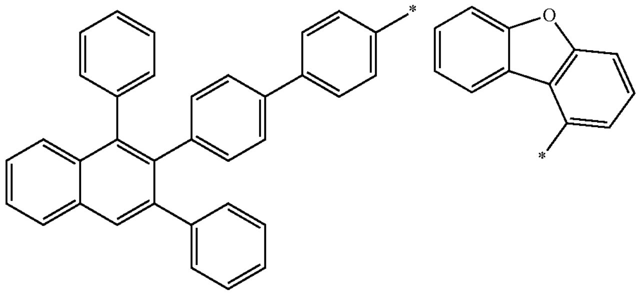 |
| 3-D1-70 | 1 | 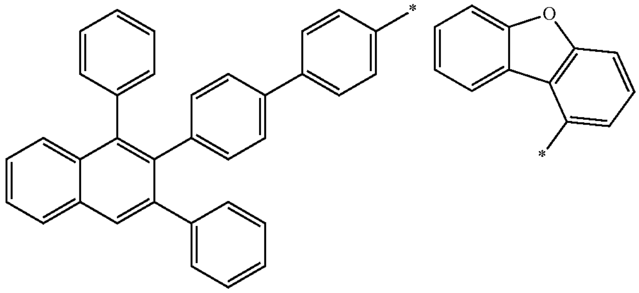 |

-continued
| [Compound Group 4] | |
|---|---|
| 3-D1-71 1 | 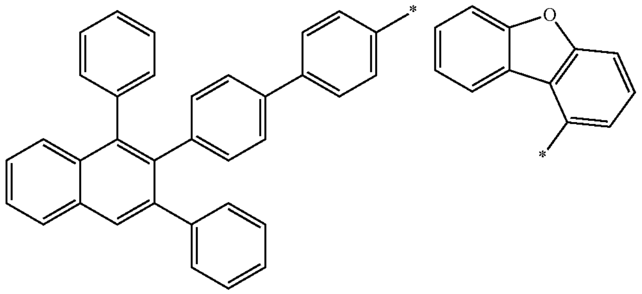 |
| 3-D1-76 1 | 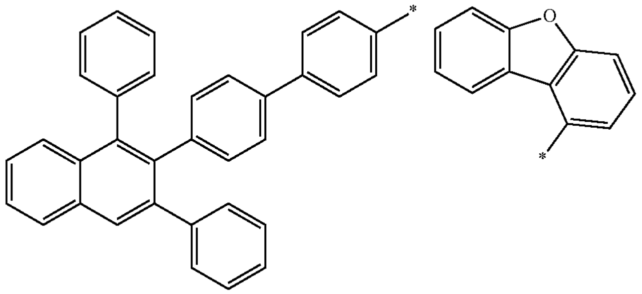 |
| 3-D1-78 1 | 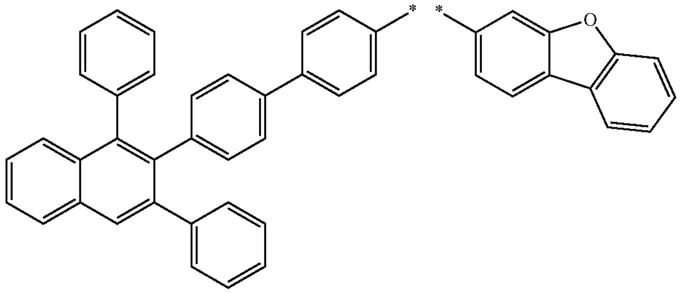 |
| 3-D1-79 1 | 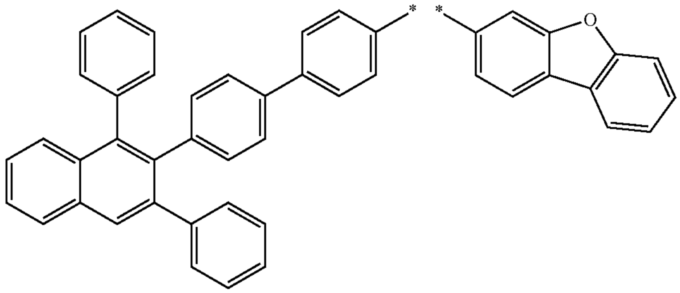 |
| 3-D1-80 1 | 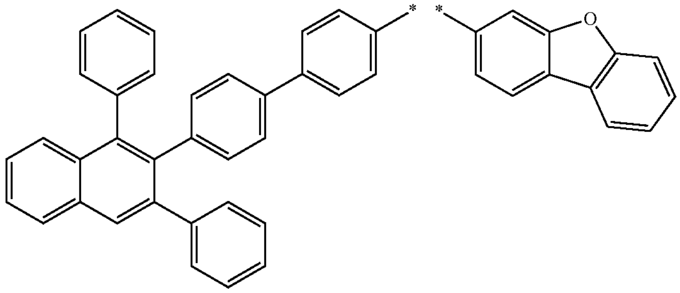 |

-continued
| [Compound Group 4] | |
|---|---|
| 3-D1-81 1 | 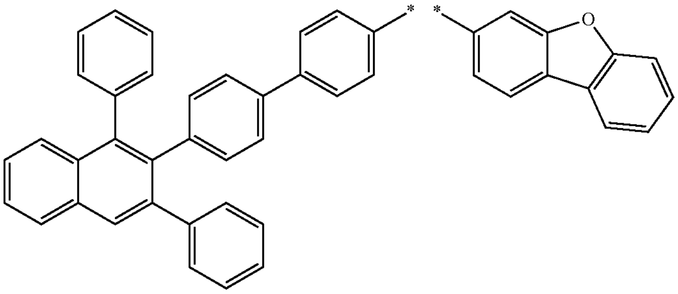 |
| 3-D1-82 1 | 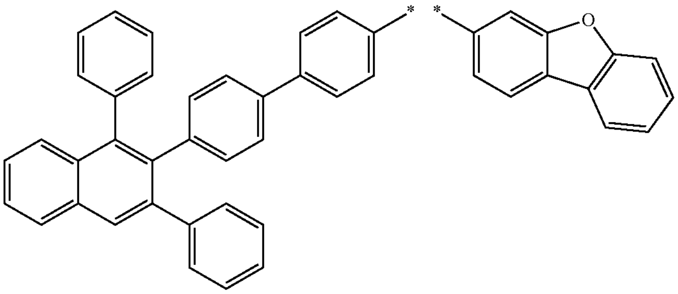 |
| 3-D1-83 1 | 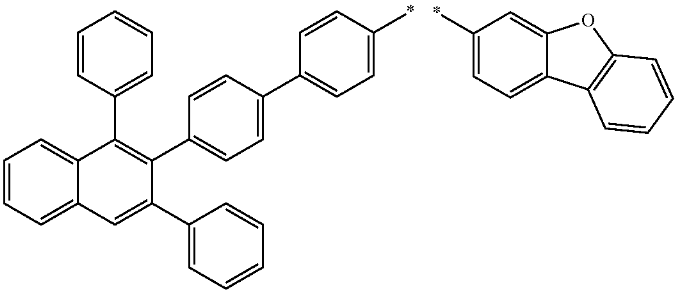 |
| 3-D1-84 1 | 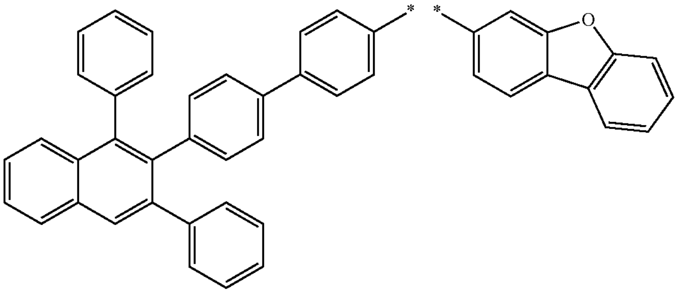 |
| 3-D1-88 1 | 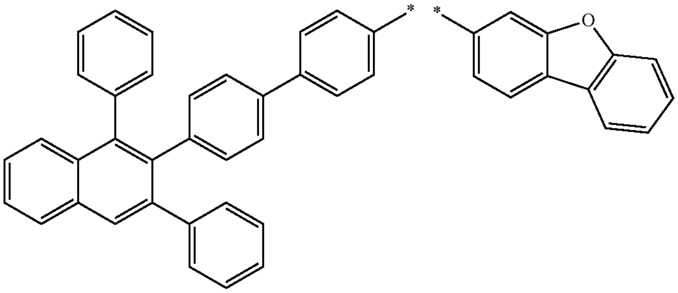 |

-continued
| [Compound Group 4] | | |
|---|---|---|
| 3-D1-90 | 1 | 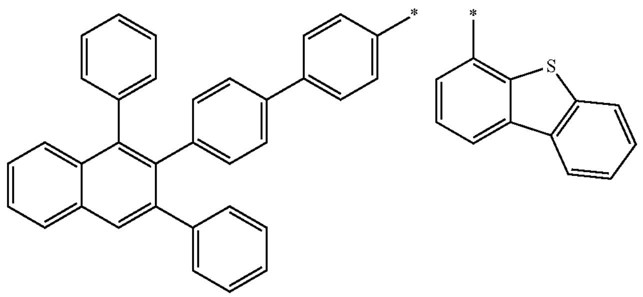 |
| 3-D1-91 | 1 | 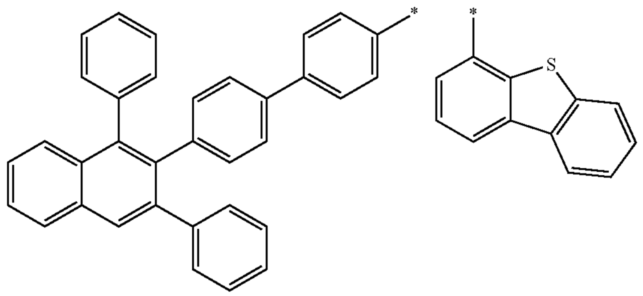 |
| 3-D1-92 | 1 | 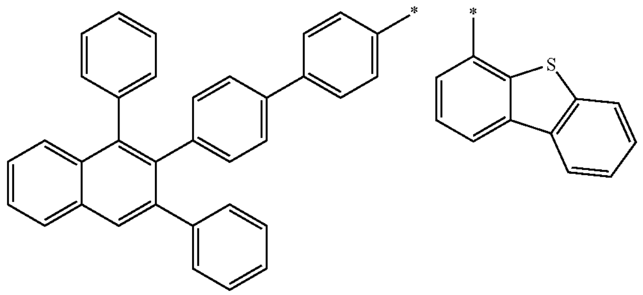 |
| 3-D1-93 | 1 | 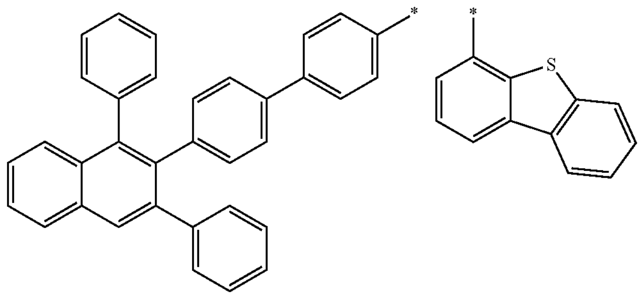 |
| 3-D1-94 | 1 | 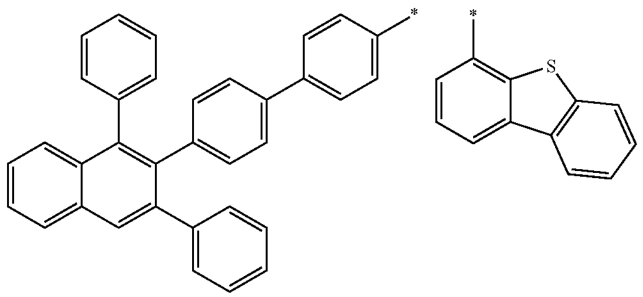 |

-continued
| [Compound Group 4] | | | |
|---|---|---|---|
| 3-D1-95 | 1 | 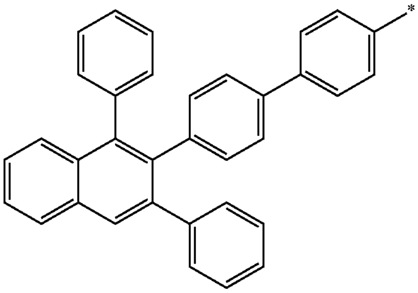 [SMILES: *c1ccc(-c2ccc(-c3c(-c4ccccc4)cc4ccccc4c3-c3ccccc3)cc2)cc1] | 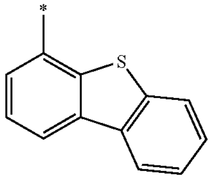 [SMILES: *c1cccc2c1sc1ccccc12] |
| 3-D1-96 | 1 | 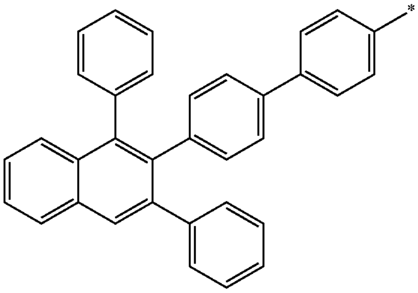 [SMILES: *c1ccc(-c2ccc(-c3c(-c4ccccc4)cc4ccccc4c3-c3ccccc3)cc2)cc1] | 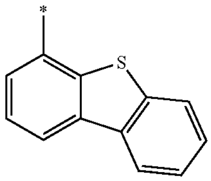 |
| 3-D1-99 | 1 | 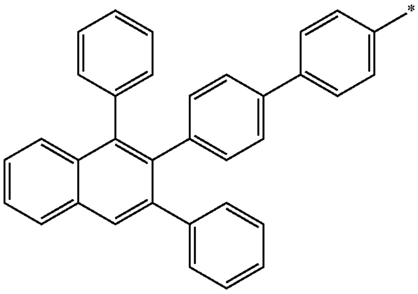 [SMILES: *c1ccc(-c2ccc(-c3c(-c4ccccc4)cc4ccccc4c3-c3ccccc3)cc2)cc1] | 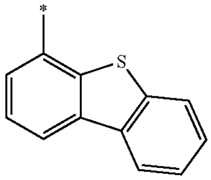 |
| | n | Ar$_2$ |
|---|---|---|
| 2-D1-50 | 1 | 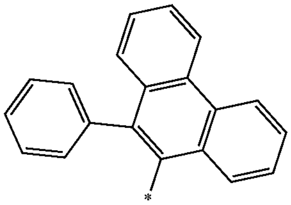 [SMILES: *c1c(-c2ccccc2)c2ccccc2c2ccccc12] |
| 2-D1-51 | 1 | 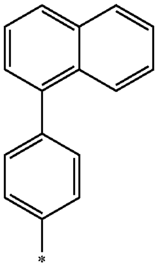 [SMILES: *c1ccc(-c2cccc3ccccc23)cc1] |

-continued
[Compound Group 4]
2-D1-52 1
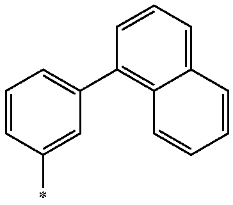 [SMILES: *c1cccc(-c2cccc3ccccc23)c1]
2-D1-53 1
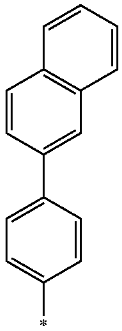 [SMILES: *c1ccc(-c2ccc3ccccc3c2)cc1]
2-D1-54 1
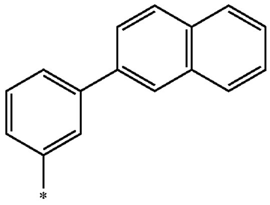 [SMILES: *c1cccc(-c2ccc3ccccc3c2)c1]
2-D1-55 1
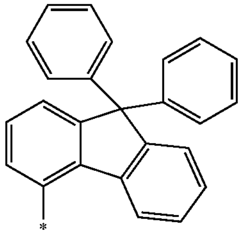 [SMILES: *c1cccc2c1-c1ccccc1C2(c1ccccc1)c1ccccc1]
2-D1-56 1
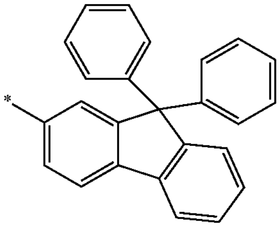 [SMILES: *c1ccc2c(c1)C(c1ccccc1)(c1ccccc1)c1ccccc1-2]
2-D1-58 1
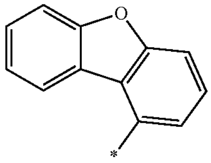 [SMILES: *c1cccc2oc3ccccc3c12]
2-D1-59 1
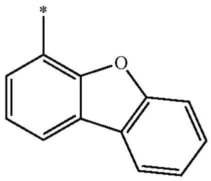

-continued
| [Compound Group 4] | |
|---|---|
| 2-D1-60 1 | 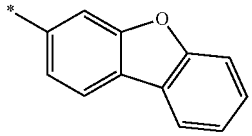 [SMILES: *c1ccc2c(c1)oc1ccccc12] |
| 2-D1-61 1 | 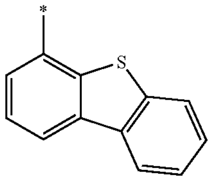 |
| 2-D1-62 1 | 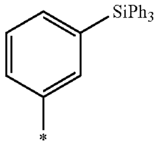 |
| 2-D1-65 1 | 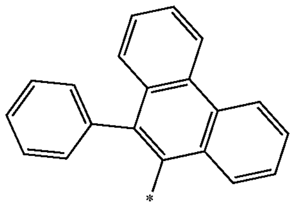 [SMILES: *c1c(-c2ccccc2)c2ccccc2c2ccccc12] |
| 2-D1-66 1 | 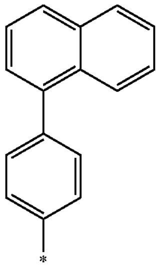 [SMILES: *c1ccc(-c2cccc3ccccc23)cc1] |
| 2-D1-67 1 | 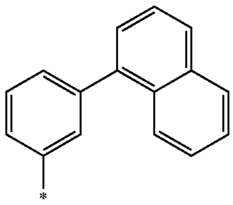 |
| 2-D1-68 1 | 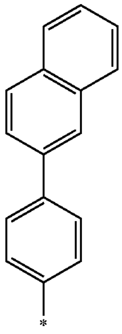 [SMILES: *c1ccc(-c2ccc3ccccc3c2)cc1] |

-continued
| [Compound Group 4] | |
|---|---|
| 2-D1-69 1 | 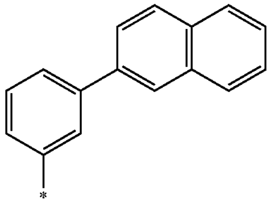 [SMILES: *c1cccc(-c2ccc3ccccc3c2)c1] |
| 2-D1-70 1 | 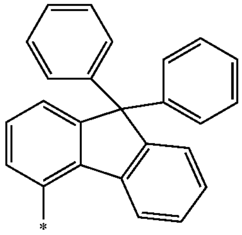 [SMILES: *c1cccc2c1-c1ccccc1C2(c1ccccc1)c1ccccc1] |
| 2-D1-71 1 | 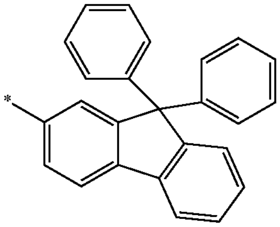 [SMILES: *c1ccc2c(c1)C(c1ccccc1)(c1ccccc1)c1ccccc1-2] |
| 2-D1-76 1 | 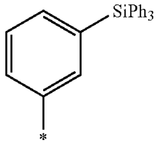 |
| 2-D1-78 1 | 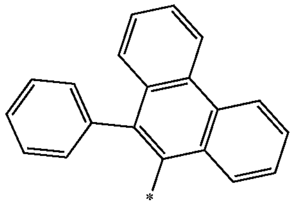 [SMILES: *c1c(-c2ccccc2)c2ccccc2c2ccccc12] |
| 2-D1-79 1 | 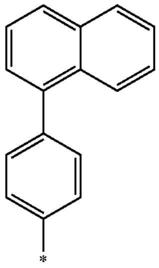 [SMILES: *c1ccc(-c2cccc3ccccc23)cc1] |
| 2-D1-80 1 | 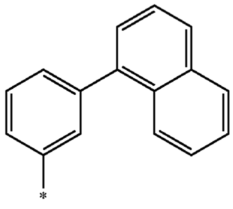 [SMILES: *c1cccc(-c2cccc3ccccc23)c1] |

-continued
| [Compound Group 4] | |
|---|---|
| 2-D1-81 1 | 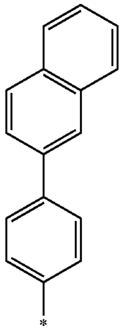 [SMILES: *c1ccc(-c2ccc3ccccc3c2)cc1] |
| 2-D1-82 1 | 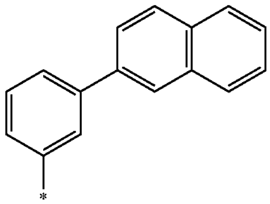 [SMILES: *c1cccc(-c2ccc3ccccc3c2)c1] |
| 2-D1-83 1 | 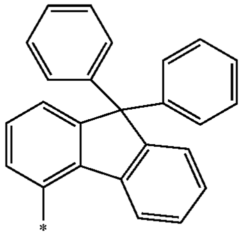 [SMILES: *c1cccc2c1-c1ccccc1C2(c1ccccc1)c1ccccc1] |
| 2-D1-84 1 | 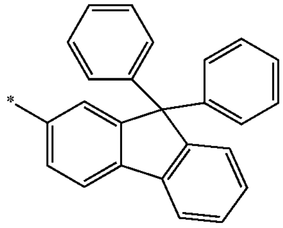 [SMILES: *c1ccc2c(c1)C(c1ccccc1)(c1ccccc1)c1ccccc1-2] |
| 2-D1-88 1 | 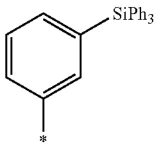 |
| 2-D1-90 1 | 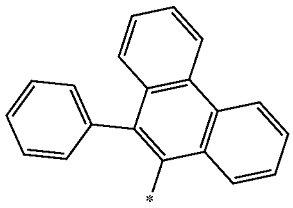 [SMILES: *c1c(-c2ccccc2)c2ccccc2c2ccccc12] |

-continued
[Compound Group 4]
2-D1-91 1
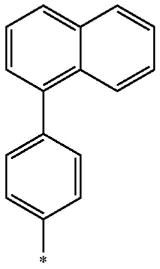 [SMILES: *c1ccc(-c2cccc3ccccc23)cc1]
2-D1-92 1
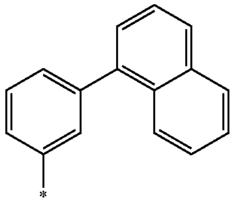
2-D1-93 1
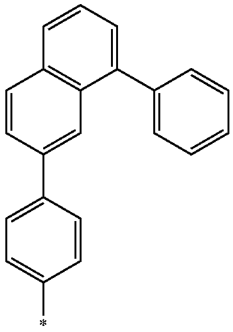 [SMILES: *c1ccc(-c2ccc3cccc(-c4ccccc4)c3c2)cc1]
2-D1-94 1
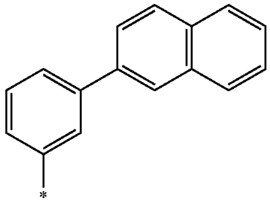 [SMILES: *c1cccc(-c2ccc3ccccc3c2)c1]
2-D1-95 1
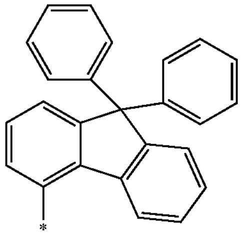 [SMILES: *c1cccc2c1-c1ccccc1C2(c1ccccc1)c1ccccc1]
2-D1-96 1
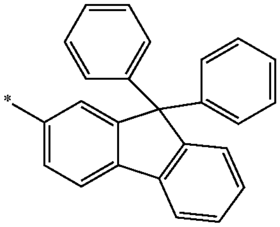 [SMILES: *c1ccc2c(c1)C(c1ccccc1)(c1ccccc1)c1ccccc1-2]

-continued
[Compound Group 4]
2-D1-99 1
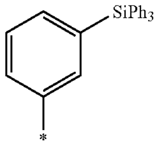
3-D1-50 1
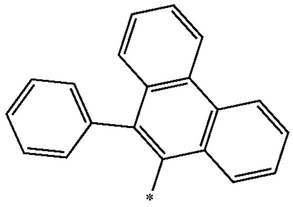 [SMILES: *c1c(-c2ccccc2)c2ccccc2c2ccccc12]
3-D1-51 1
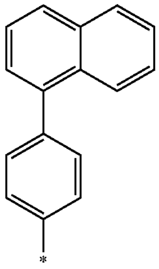 [SMILES: *c1ccc(-c2cccc3ccccc23)cc1]
3-D1-52 1
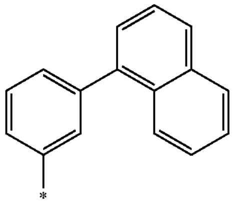 [SMILES: *c1cccc(-c2cccc3ccccc23)c1]
3-D1-53 1
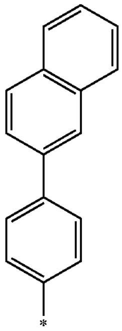 [SMILES: *c1ccc(-c2ccc3ccccc3c2)cc1]
3-D1-54 1
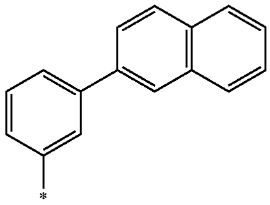 [SMILES: *c1cccc(-c2ccc3ccccc3c2)c1]

-continued
| [Compound Group 4] | | |
|---|---|---|
| 3-D1-55 | 1 | 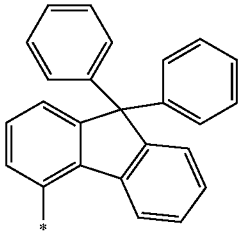 [SMILES: *c1cccc2c1-c1ccccc1C2(c1ccccc1)c1ccccc1] |
| 3-D1-56 | 1 | 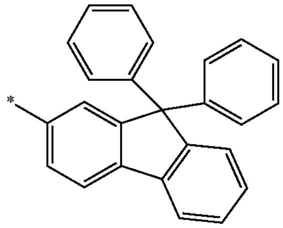 [SMILES: *c1ccc2c(c1)C(c1ccccc1)(c1ccccc1)c1ccccc1-2] |
| 3-D1-58 | 1 | 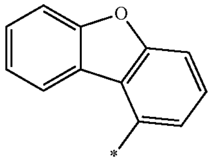 [SMILES: *c1cccc2oc3ccccc3c12] |
| 3-D1-59 | 1 | 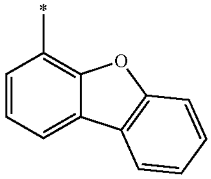 |
| 3-D1-60 | 1 | 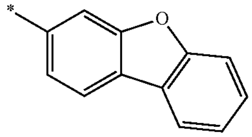 [SMILES: *c1ccc2c(c1)oc1ccccc12] |
| 3-D1-61 | 1 | 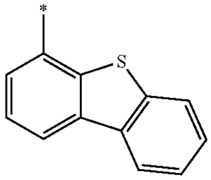 |
| 3-D1-62 | 1 | 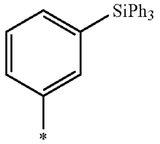 |
| 3-D1-65 | 1 | 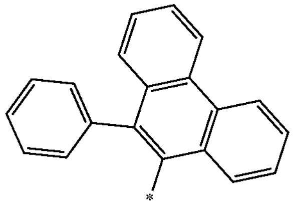 [SMILES: *c1c(-c2ccccc2)c2ccccc2c2ccccc12] |

-continued
| [Compound Group 4] | |
|---|---|
| 3-D1-66 1 | 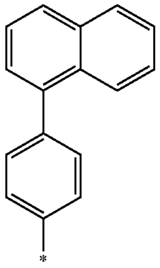 [SMILES: *c1ccc(-c2cccc3ccccc23)cc1] |
| 3-D1-67 1 | 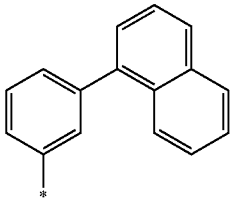 [SMILES: *c1cccc(-c2cccc3ccccc23)c1] |
| 3-D1-68 1 | 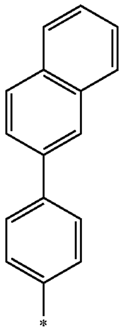 [SMILES: *c1ccc(-c2ccc3ccccc3c2)cc1] |
| 3-D1-69 1 | 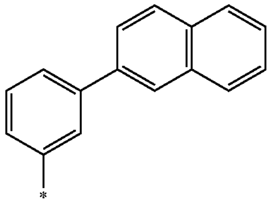 [SMILES: *c1cccc(-c2ccc3ccccc3c2)c1] |
| 3-D1-70 1 | 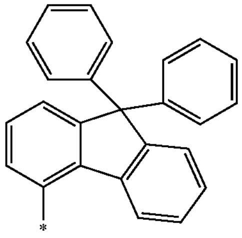 [SMILES: *c1cccc2c1-c1ccccc1C2(c1ccccc1)c1ccccc1] |
| 3-D1-71 1 | 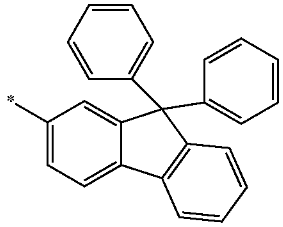 [SMILES: *c1ccc2c(c1)C(c1ccccc1)(c1ccccc1)c1ccccc1-2] |

-continued
| [Compound Group 4] | |
|---|---|
| 3-D1-76 1 | 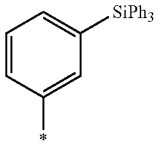 |
| 3-D1-78 1 | 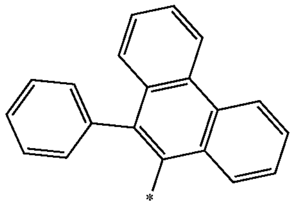 [SMILES: *c1c(-c2ccccc2)c2ccccc2c2ccccc12] |
| 3-D1-79 1 | 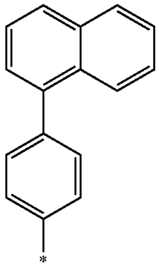 [SMILES: *c1ccc(-c2cccc3ccccc23)cc1] |
| 3-D1-80 1 | 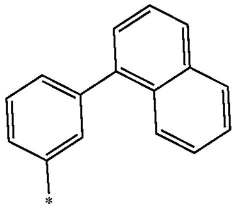 [SMILES: *c1cccc(-c2cccc3ccccc23)c1] |
| 3-D1-81 1 | 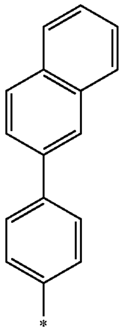 [SMILES: *c1ccc(-c2ccc3ccccc3c2)cc1] |
| 3-D1-82 1 | 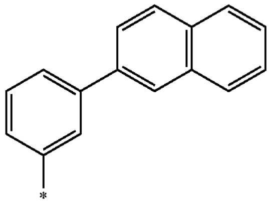 |

-continued
| [Compound Group 4] | |
|---|---|
| 3-D1-83 1 | 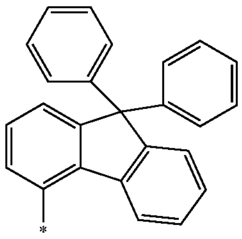 [SMILES: *c1cccc2c1-c1ccccc1C2(c1ccccc1)c1ccccc1] |
| 3-D1-84 1 | 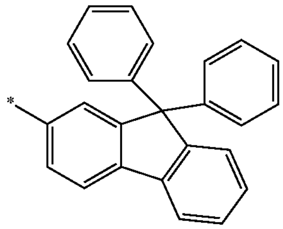 [SMILES: *c1ccc2c(c1)C(c1ccccc1)(c1ccccc1)c1ccccc1-2] |
| 3-D1-88 1 | 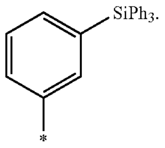 |
| 3-D1-90 1 | 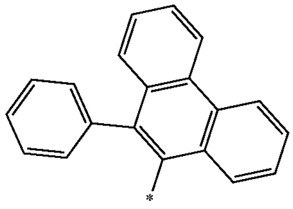 [SMILES: *c1c(-c2ccccc2)c2ccccc2c2ccccc12] |
| 3-D1-91 1 | 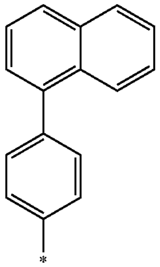 [SMILES: *c1ccc(-c2cccc3ccccc23)cc1] |
| 3-D1-92 1 | 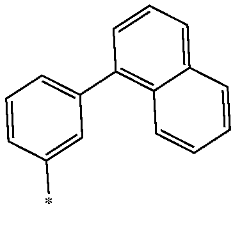 [SMILES: *c1cccc(-c2cccc3ccccc23)c1] |

-continued
| [Compound Group 4] | |
| --- | --- |
| 3-D1-93 1 | 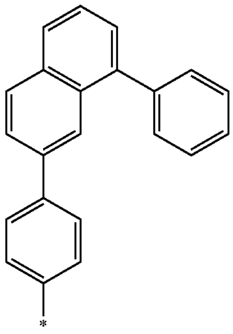 [SMILES: *c1ccc(-c2ccc3cccc(-c4ccccc4)c3c2)cc1] |
| 3-D1-94 1 | 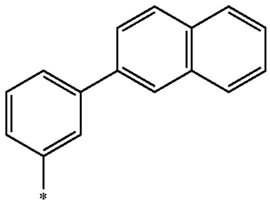 [SMILES: *c1cccc(-c2ccc3ccccc3c2)c1] |
| 3-D1-95 1 | 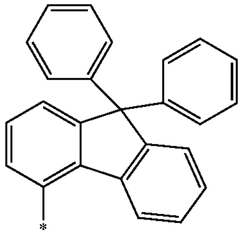 [SMILES: *c1cccc2c1-c1ccccc1C2(c1ccccc1)c1ccccc1] |
| 3-D1-96 1 | 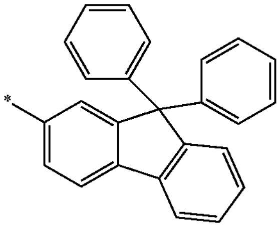 [SMILES: *c1ccc2c(c1)C(c1ccccc1)(c1ccccc1)c1ccccc1-2] |
| 3-D1-99 1 | 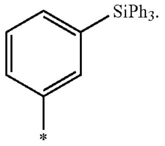 |

2. The organic electroluminescence device of claim 1, wherein the hole transport region comprises:

a hole injection layer disposed on the first electrode; and a hole transport layer disposed on the hole injection layer, and the hole transport layer comprises the amine compound represented by Formula 1.

3. The organic electroluminescence device of claim 2, wherein the hole transport layer further comprises a p-dopant, and the p-dopant is at least one selected from quinone derivatives, metal oxides, and cyano group-containing compounds.

4. The organic electroluminescence device of claim 1, further comprising a capping layer disposed on the second electrode and having a refractive index equal to or greater than about 1.6.

5. The organic electroluminescence device of claim 4, wherein the capping layer comprises at least one organic layer or at least one inorganic layer.

6. An amine compound represented by Formula 1:

[Formula 1]

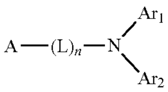

wherein the amine compound represented by Formula 1 is at least one selected from Compound Group 1, Compound Group 2, Compound Group 3, and Compound Group 4:

[Compound Group 1]

| | n | A—L—* | $Ar_1$ | $Ar_2$ |
|---|---|---|---|---|
| 2-A1-50 | 1 | 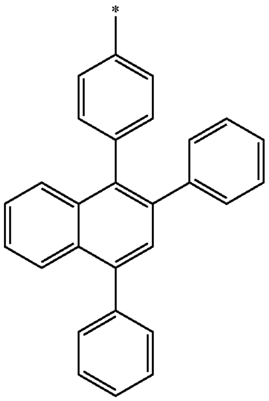 [SMILES: *c1ccc(-c2c(-c3ccccc3)cc(-c3ccccc3)c3ccccc23)cc1] | 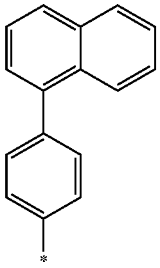 [SMILES: *c1ccc(-c2cccc3ccccc23)cc1] | 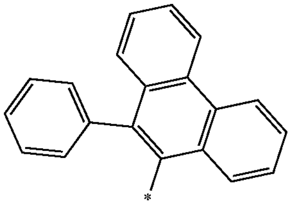 [SMILES: *c1c(-c2ccccc2)c2ccccc2c2ccccc12] |
| 2-A1-51 | 1 | 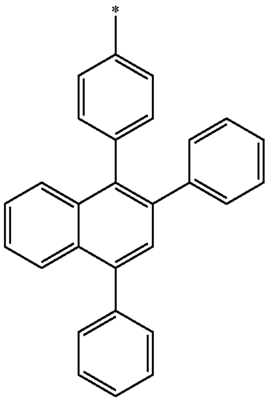 [SMILES: *c1ccc(-c2c(-c3ccccc3)cc(-c3ccccc3)c3ccccc23)cc1] | 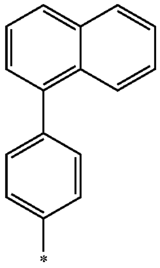 [SMILES: *c1ccc(-c2cccc3ccccc23)cc1] | 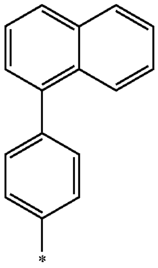 [SMILES: *c1ccc(-c2cccc3ccccc23)cc1] |

-continued
[Compound Group 1]
| | n | A—L—* | $Ar_1$ | $Ar_2$ |
|---|---|---|---|---|
| 2-A1-52 | 1 | 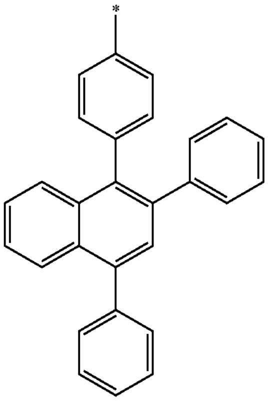 [SMILES: *c1ccc(-c2c(-c3ccccc3)cc(-c3ccccc3)c3ccccc23)cc1] | 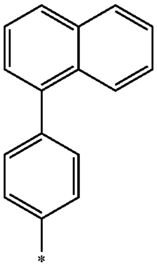 [SMILES: *c1ccc(-c2cccc3ccccc23)cc1] | 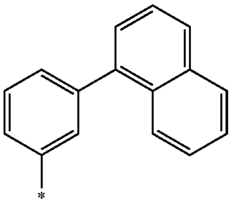 |
| 2-A1-53 | 1 | 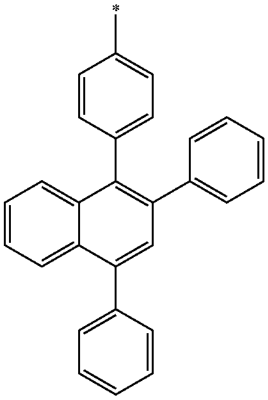 [SMILES: *c1ccc(-c2c(-c3ccccc3)cc(-c3ccccc3)c3ccccc23)cc1] | 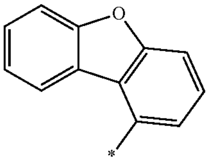 [SMILES: *c1cccc2oc3ccccc3c12] | 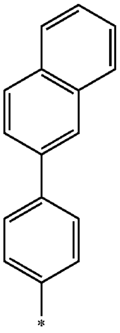 [SMILES: *c1ccc(-c2ccc3ccccc3c2)cc1] |
| 2-A1-54 | 1 | 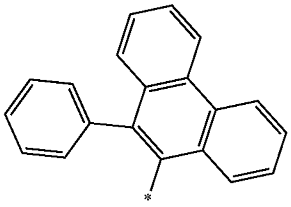 [SMILES: *c1c(-c2ccccc2)c2ccccc2c2ccccc12] | 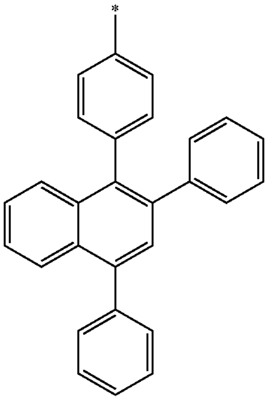 [SMILES: *c1ccc(-c2c(-c3ccccc3)cc(-c3ccccc3)c3ccccc23)cc1] | 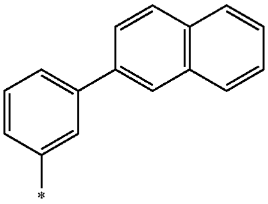 |
| 2-A1-55 | 1 | 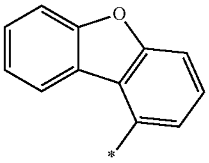 [SMILES: *c1cccc2oc3ccccc3c12] | 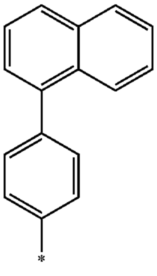 [SMILES: *c1ccc(-c2cccc3ccccc23)cc1] | 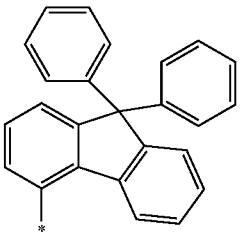 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 2-A1-56 | 1 | 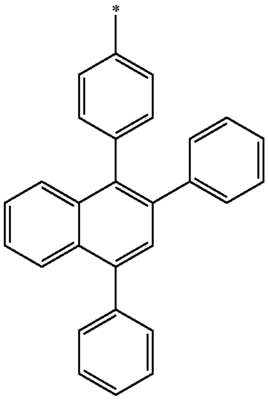 [SMILES: *c1ccc(-c2c(-c3ccccc3)cc(-c3ccccc3)c3ccccc23)cc1] | 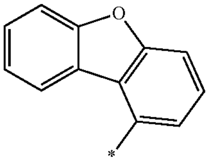 [SMILES: *c1cccc2oc3ccccc3c12] | 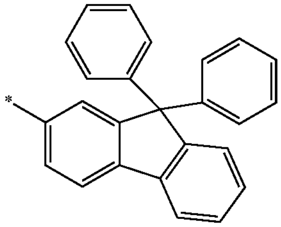 [SMILES: *c1ccc2c(c1)C(c1ccccc1)(c1ccccc1)c1ccccc1-2] |
| 2-A1-58 | 1 | 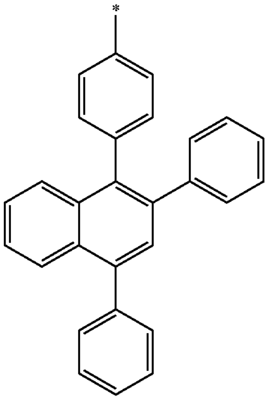 [SMILES: *c1ccc(-c2c(-c3ccccc3)cc(-c3ccccc3)c3ccccc23)cc1] | 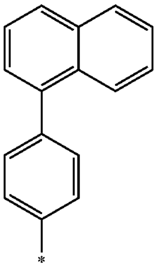 [SMILES: *c1ccc(-c2cccc3ccccc23)cc1] | 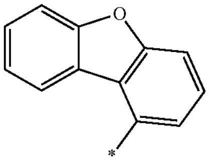 [SMILES: *c1cccc2oc3ccccc3c12] |
| 2-A1-59 | 1 | 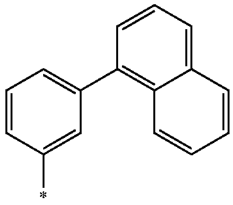 [SMILES: *c1cccc(-c2cccc3ccccc23)c1] | 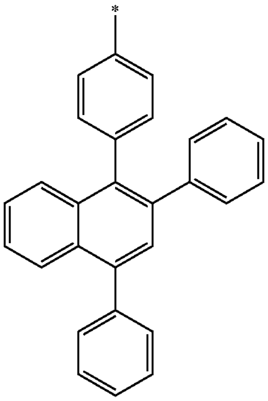 [SMILES: *c1ccc(-c2c(-c3ccccc3)cc(-c3ccccc3)c3ccccc23)cc1] | 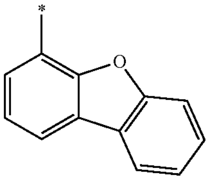 |
| 2-A1-60 | 1 | 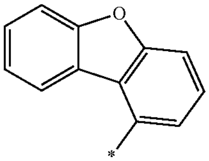 [SMILES: *c1cccc2oc3ccccc3c12] | 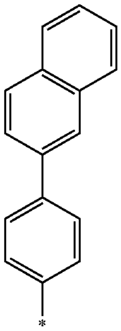 [SMILES: *c1ccc(-c2ccc3ccccc3c2)cc1] | 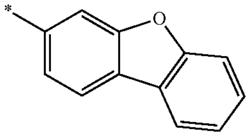 [SMILES: *c1ccc2c(c1)oc1ccccc12] |

-continued
[Compound Group 1]
| | n | A—L—* | $Ar_1$ | $Ar_2$ |
|---|---|---|---|---|
| 2-A1-61 | 1 | 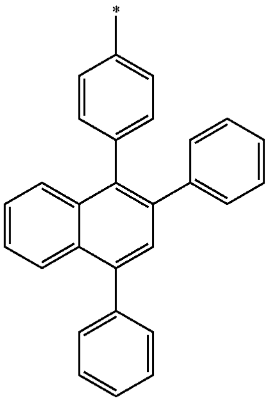 [SMILES: *c1ccc(-c2c(-c3ccccc3)cc(-c3ccccc3)c3ccccc23)cc1] | 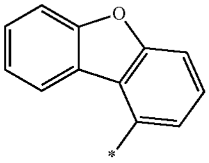 [SMILES: *c1cccc2oc3ccccc3c12] | 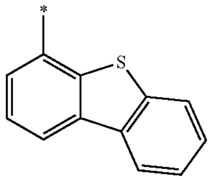 |
| 2-A1-62 | 1 | 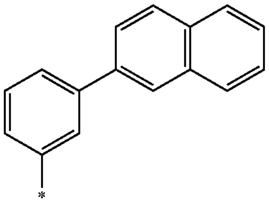 [SMILES: *c1cccc(-c2ccc3ccccc3c2)c1] | 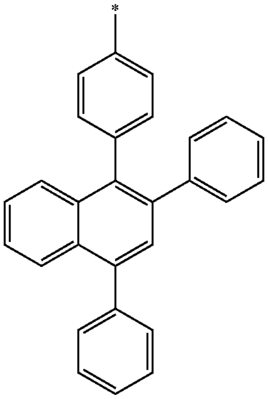 [SMILES: *c1ccc(-c2c(-c3ccccc3)cc(-c3ccccc3)c3ccccc23)cc1] | 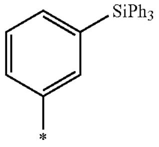 |
| 2-A1-65 | 1 | 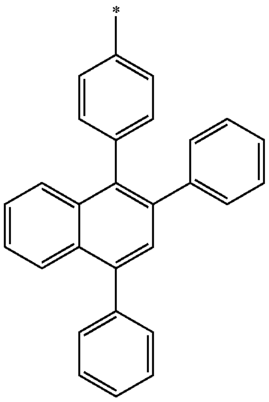 [SMILES: *c1ccc(-c2c(-c3ccccc3)cc(-c3ccccc3)c3ccccc23)cc1] | 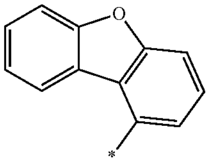 [SMILES: *c1cccc2oc3ccccc3c12] | 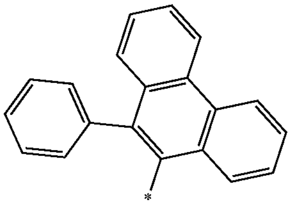 [SMILES: *c1c(-c2ccccc2)c2ccccc2c2ccccc12] |

-continued
[Compound Group 1]
| | n | A—L—* | $Ar_1$ | $Ar_2$ |
|---|---|---|---|---|
| 2-A1-66 | 1 | 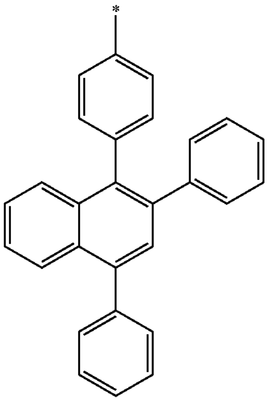 [SMILES: *c1ccc(-c2c(-c3ccccc3)cc(-c3ccccc3)c3ccccc23)cc1] | 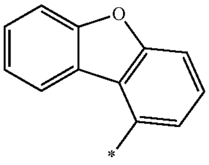 [SMILES: *c1cccc2oc3ccccc3c12] | 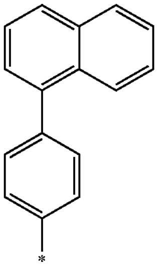 [SMILES: *c1ccc(-c2cccc3ccccc23)cc1] |
| 2-A1-67 | 1 | 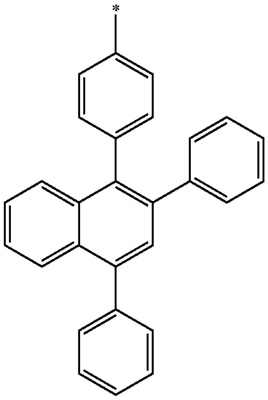 [SMILES: *c1ccc(-c2c(-c3ccccc3)cc(-c3ccccc3)c3ccccc23)cc1] | 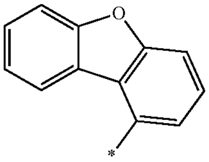 [SMILES: *c1cccc2oc3ccccc3c12] | 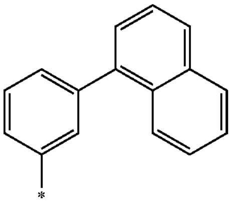 [SMILES: *c1cccc(-c2cccc3ccccc23)c1] |
| 2-A1-68 | 1 | 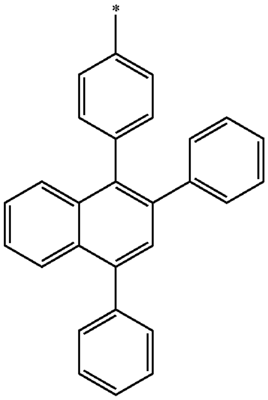 [SMILES: *c1ccc(-c2c(-c3ccccc3)cc(-c3ccccc3)c3ccccc23)cc1] | 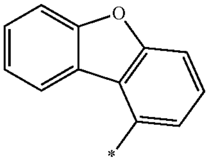 [SMILES: *c1cccc2oc3ccccc3c12] | 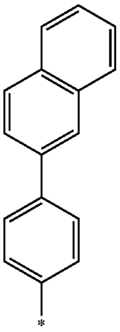 [SMILES: *c1ccc(-c2ccc3ccccc3c2)cc1] |

-continued
| [Compound Group 1] | n | A—L—* | $Ar_1$ | $Ar_2$ |
|---|---|---|---|---|
| 2-A1-69 | 1 | 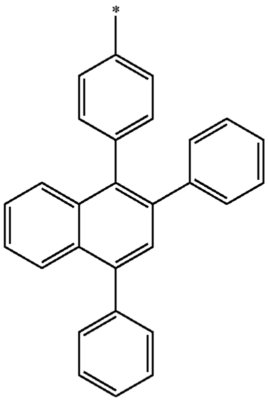 [SMILES: *c1ccc(-c2c(-c3ccccc3)cc(-c3ccccc3)c3ccccc23)cc1] | 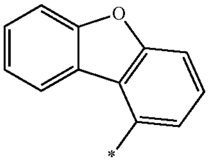 [SMILES: *c1cccc2oc3ccccc3c12] | 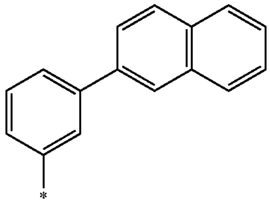 [SMILES: *c1cccc(-c2ccc3ccccc3c2)c1] |
| 2-A1-70 | 1 | 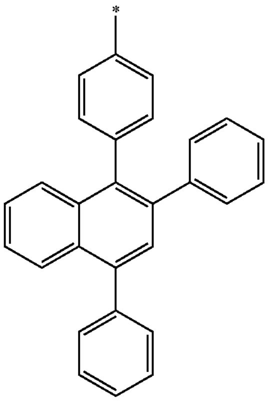 [SMILES: *c1ccc(-c2c(-c3ccccc3)cc(-c3ccccc3)c3ccccc23)cc1] | 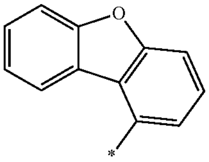 [SMILES: *c1cccc2oc3ccccc3c12] | 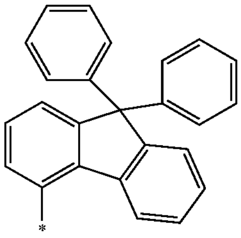 [SMILES: *c1cccc2c1-c1ccccc1C2(c1ccccc1)c1ccccc1] |
| 2-A1-71 | 1 | 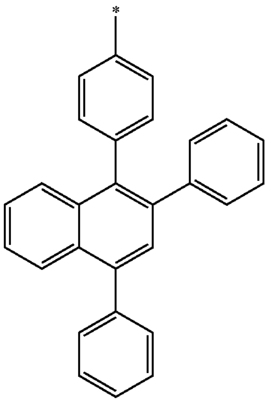 [SMILES: *c1ccc(-c2c(-c3ccccc3)cc(-c3ccccc3)c3ccccc23)cc1] | 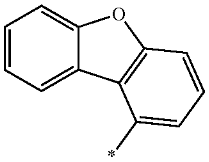 | 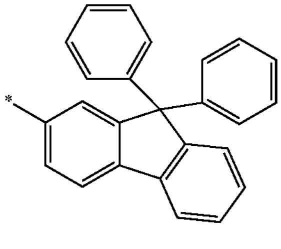 [SMILES: *c1ccc2c(c1)C(c1ccccc1)(c1ccccc1)c1ccccc1-2] |

-continued
[Compound Group 1]
| | n | A—L—* | $Ar_1$ | $Ar_2$ |
|---|---|---|---|---|
| 2-A1-76 | 1 | 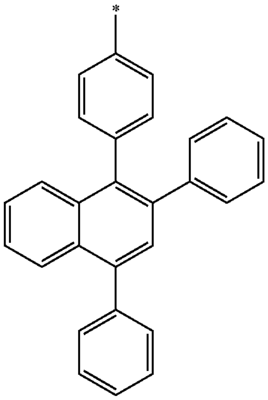 [SMILES: *c1ccc(-c2c(-c3ccccc3)cc(-c3ccccc3)c3ccccc23)cc1] | 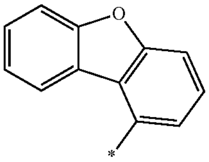 [SMILES: *c1cccc2oc3ccccc3c12] | 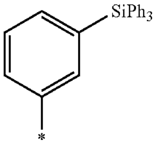 |
| 2-A1-78 | 1 | 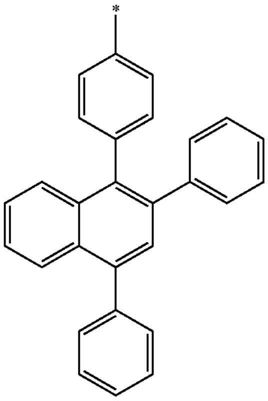 [SMILES: *c1ccc(-c2c(-c3ccccc3)cc(-c3ccccc3)c3ccccc23)cc1] | 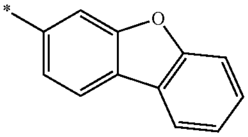 | 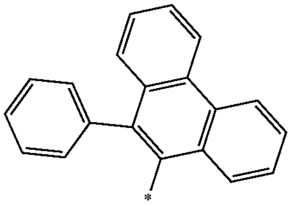 [SMILES: *c1c(-c2ccccc2)c2ccccc2c2ccccc12] |
| 2-A1-79 | 1 | 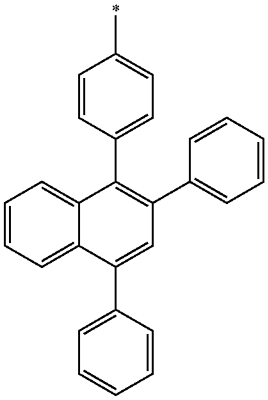 [SMILES: *c1ccc(-c2c(-c3ccccc3)cc(-c3ccccc3)c3ccccc23)cc1] | 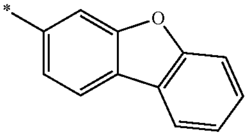 [SMILES: *c1ccc2c(c1)oc1ccccc12] | 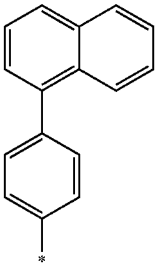 [SMILES: *c1ccc(-c2cccc3ccccc23)cc1] |

-continued
[Compound Group 1]
| | n | A—L—* | $Ar_1$ | $Ar_2$ |
|---|---|---|---|---|
| 2-A1-80 | 1 | 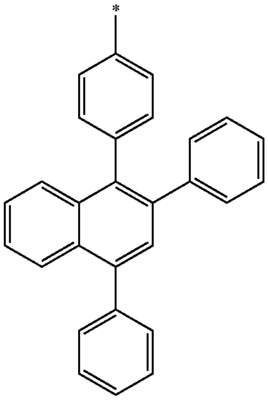 [SMILES: *c1ccc(-c2c(-c3ccccc3)cc(-c3ccccc3)c3ccccc23)cc1] | 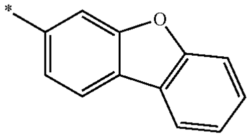 [SMILES: *c1ccc2c(c1)oc1ccccc12] | 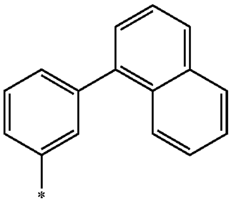 |
| 2-A1-81 | 1 | 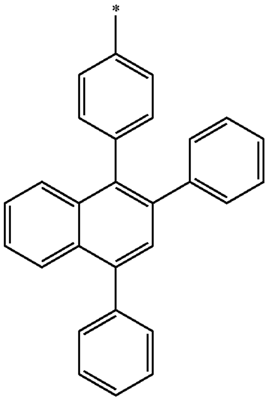 [SMILES: *c1ccc(-c2c(-c3ccccc3)cc(-c3ccccc3)c3ccccc23)cc1] | 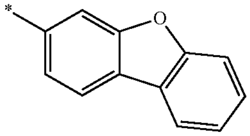 [SMILES: *c1ccc2c(c1)oc1ccccc12] | 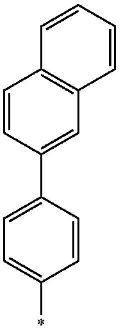 [SMILES: *c1ccc(-c2ccc3ccccc3c2)cc1] |
| 2-A1-82 | 1 | 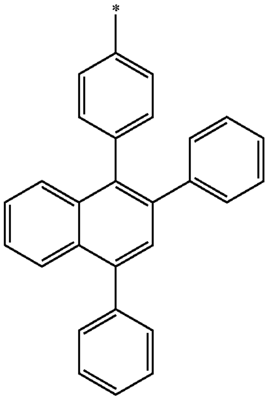 [SMILES: *c1ccc(-c2c(-c3ccccc3)cc(-c3ccccc3)c3ccccc23)cc1] | 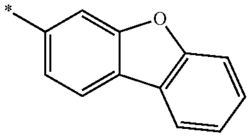 | 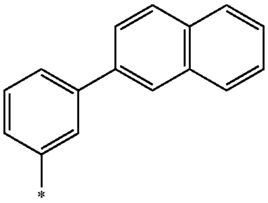 [SMILES: *c1cccc(-c2ccc3ccccc3c2)c1] |

-continued
[Compound Group 1]
| | n | A—L—* | $Ar_1$ | $Ar_2$ |
|---|---|---|---|---|
| 2-A1-83 | 1 | 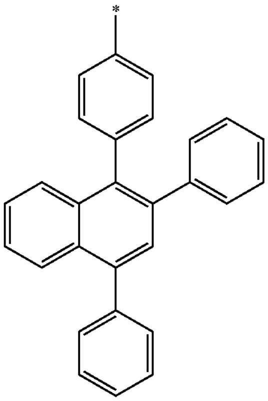 [SMILES: *c1ccc(-c2c(-c3ccccc3)cc(-c3ccccc3)c3ccccc23)cc1] | 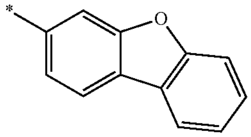 | 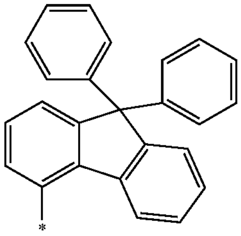 [SMILES: *c1cccc2c1-c1ccccc1C2(c1ccccc1)c1ccccc1] |
| 2-A1-84 | 1 | 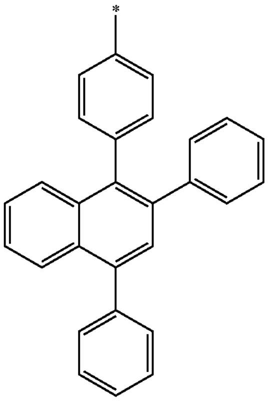 [SMILES: *c1ccc(-c2c(-c3ccccc3)cc(-c3ccccc3)c3ccccc23)cc1] | 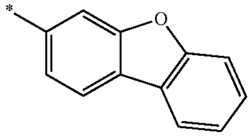 [SMILES: *c1ccc2c(c1)oc1ccccc12] | 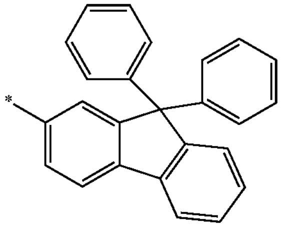 [SMILES: *c1ccc2c(c1)C(c1ccccc1)(c1ccccc1)c1ccccc1-2] |
| 2-A1-88 | 1 | 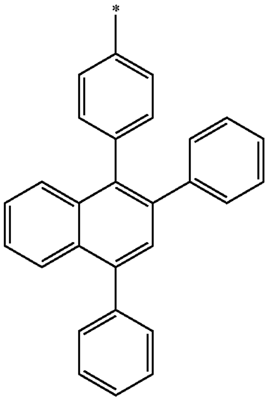 [SMILES: *c1ccc(-c2c(-c3ccccc3)cc(-c3ccccc3)c3ccccc23)cc1] | 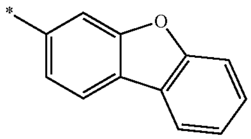 [SMILES: *c1ccc2c(c1)oc1ccccc12] | 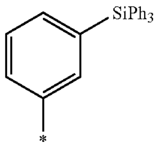 |

-continued
| [Compound Group 1] | | | | |
|---|---|---|---|---|
| | n | A—L—* | $Ar_1$ | $Ar_2$ |
| 2-A1-90 | 1 | 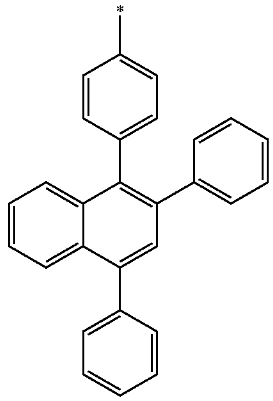 [SMILES: *c1ccc(-c2c(-c3ccccc3)cc(-c3ccccc3)c3ccccc23)cc1] | 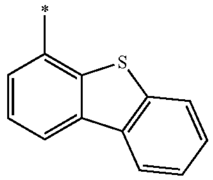 [SMILES: *c1cccc2c1sc1ccccc12] | 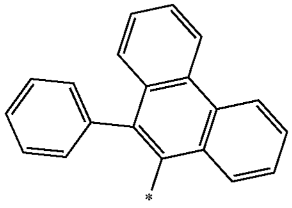 [SMILES: *c1c(-c2ccccc2)c2ccccc2c2ccccc12] |
| 2-A1-91 | 1 | 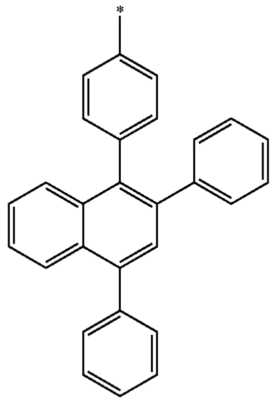 [SMILES: *c1ccc(-c2c(-c3ccccc3)cc(-c3ccccc3)c3ccccc23)cc1] | 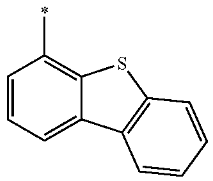 | 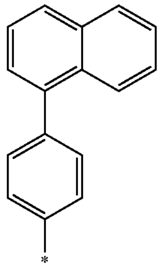 [SMILES: *c1ccc(-c2cccc3ccccc23)cc1] |
| 2-A1-92 | 1 | 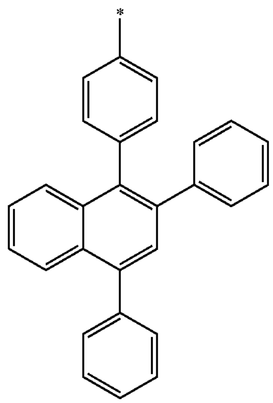 [SMILES: *c1ccc(-c2c(-c3ccccc3)cc(-c3ccccc3)c3ccccc23)cc1] | 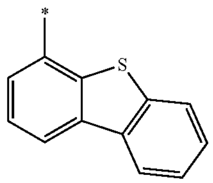 [SMILES: *c1cccc2c1sc1ccccc12] | 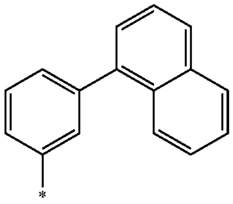 |

-continued
[Compound Group 1]
| | n | A—L—* | $Ar_1$ | $Ar_2$ |
|---|---|---|---|---|
| 2-A1-93 | 1 | 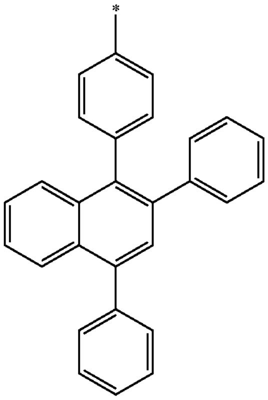 [SMILES: *c1ccc(-c2c(-c3ccccc3)cc(-c3ccccc3)c3ccccc23)cc1] | 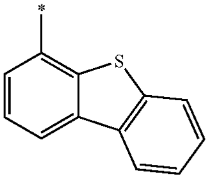 [SMILES: *c1cccc2c1sc1ccccc12] | 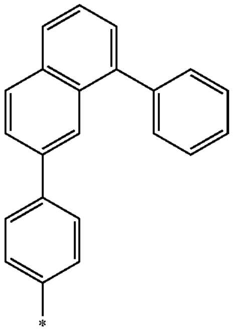 [SMILES: *c1ccc(-c2ccc3cccc(-c4ccccc4)c3c2)cc1] |
| 2-A1-94 | 1 | 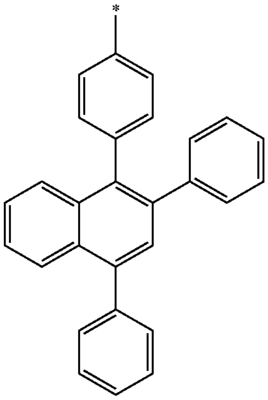 [SMILES: *c1ccc(-c2c(-c3ccccc3)cc(-c3ccccc3)c3ccccc23)cc1] | 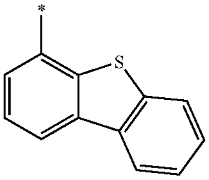 | 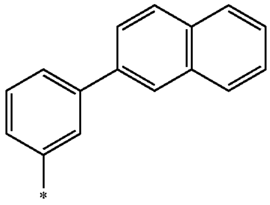 [SMILES: *c1cccc(-c2ccc3ccccc3c2)c1] |
| 2-A1-95 | 1 | 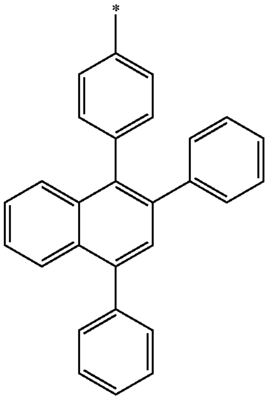 [SMILES: *c1ccc(-c2c(-c3ccccc3)cc(-c3ccccc3)c3ccccc23)cc1] | 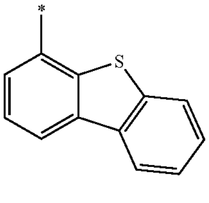 | 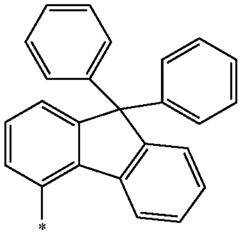 [SMILES: *c1cccc2c1-c1ccccc1C2(c1ccccc1)c1ccccc1] |

-continued
[Compound Group 1]
| | n | A—L—* | $Ar_1$ | $Ar_2$ |
|---|---|---|---|---|
| 2-A1-96 | 1 | 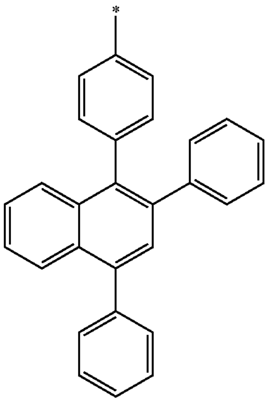 [SMILES: *c1ccc(-c2c(-c3ccccc3)cc(-c3ccccc3)c3ccccc23)cc1] | 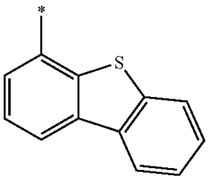 [SMILES: *c1cccc2c1sc1ccccc12] | 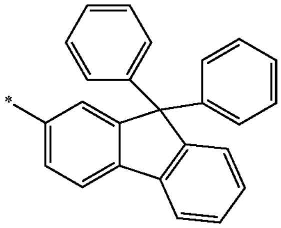 [SMILES: *c1ccc2c(c1)C(c1ccccc1)(c1ccccc1)c1ccccc1-2] |
| 2-A1-99 | 1 | 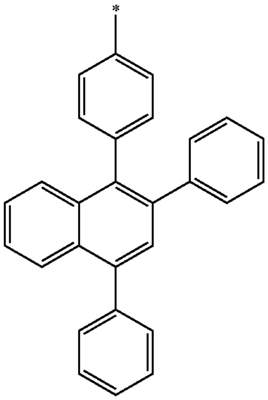 [SMILES: *c1ccc(-c2c(-c3ccccc3)cc(-c3ccccc3)c3ccccc23)cc1] | 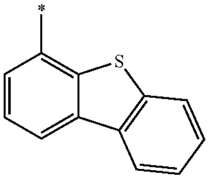 [SMILES: *c1cccc2c1sc1ccccc12] | 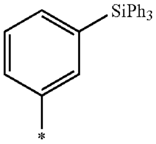 |
| 3-A1-50 | 1 | 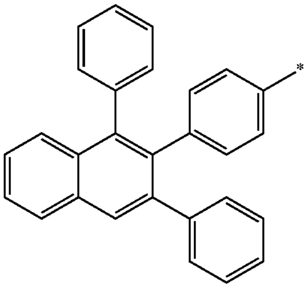 [SMILES: *c1ccc(-c2c(-c3ccccc3)cc3ccccc3c2-c2ccccc2)cc1] | 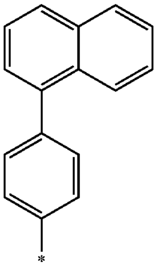 [SMILES: *c1ccc(-c2cccc3ccccc23)cc1] | 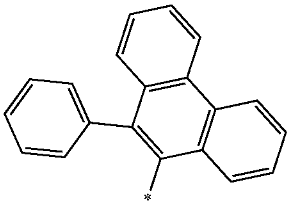 [SMILES: *c1c(-c2ccccc2)c2ccccc2c2ccccc12] |
| 3-A1-51 | 1 | 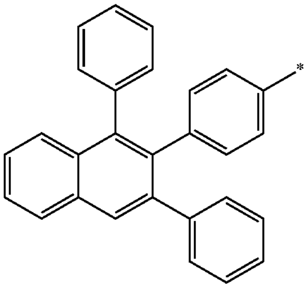 [SMILES: *c1ccc(-c2c(-c3ccccc3)cc3ccccc3c2-c2ccccc2)cc1] | 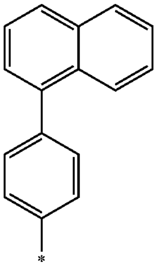 [SMILES: *c1ccc(-c2cccc3ccccc23)cc1] | 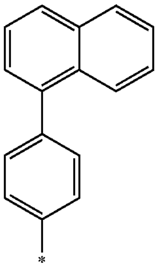 [SMILES: *c1ccc(-c2cccc3ccccc23)cc1] |

-continued
[Compound Group 1]
| | n | A—L—* | $Ar_1$ | $Ar_2$ |
|---|---|---|---|---|
| 3-A1-52 | 1 | 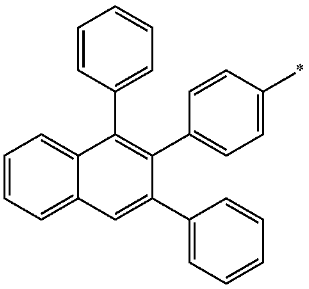 [SMILES: *c1ccc(-c2c(-c3ccccc3)cc3ccccc3c2-c2ccccc2)cc1] | 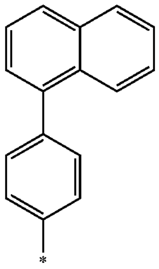 [SMILES: *c1ccc(-c2cccc3ccccc23)cc1] | 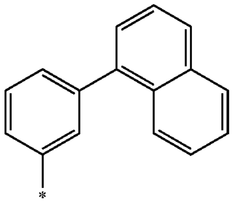 |
| 3-A1-53 | 1 | 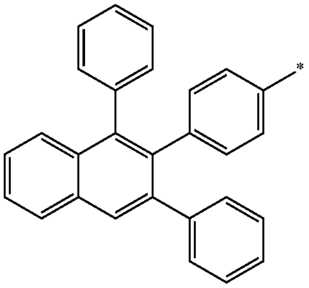 [SMILES: *c1ccc(-c2c(-c3ccccc3)cc3ccccc3c2-c2ccccc2)cc1] | 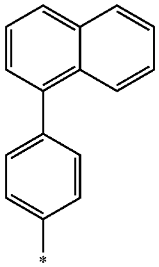 [SMILES: *c1ccc(-c2cccc3ccccc23)cc1] | 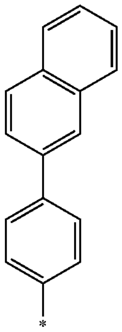 [SMILES: *c1ccc(-c2ccc3ccccc3c2)cc1] |
| 3-A1-54 | 1 | 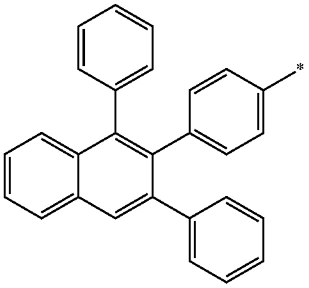 [SMILES: *c1ccc(-c2c(-c3ccccc3)cc3ccccc3c2-c2ccccc2)cc1] | 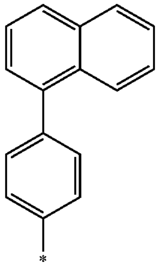 [SMILES: *c1ccc(-c2cccc3ccccc23)cc1] | 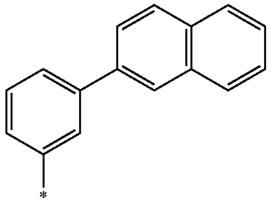 [SMILES: *c1cccc(-c2ccc3ccccc3c2)c1] |
| 3-A1-55 | 1 | 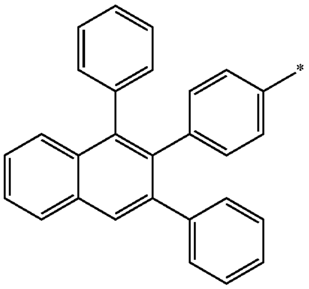 [SMILES: *c1ccc(-c2c(-c3ccccc3)cc3ccccc3c2-c2ccccc2)cc1] | 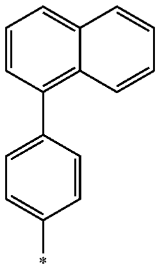 [SMILES: *c1ccc(-c2cccc3ccccc23)cc1] | 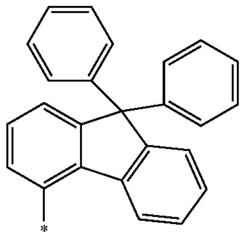 [SMILES: *c1cccc2c1-c1ccccc1C2(c1ccccc1)c1ccccc1] |
| 3-A1-56 | 1 | 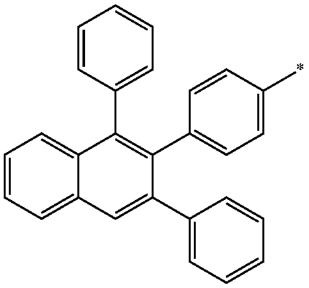 [SMILES: *c1ccc(-c2c(-c3ccccc3)cc3ccccc3c2-c2ccccc2)cc1] | 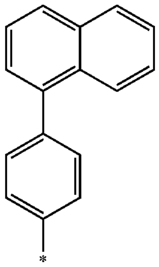 [SMILES: *c1ccc(-c2cccc3ccccc23)cc1] | 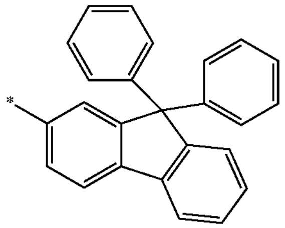 [SMILES: *c1ccc2c(c1)C(c1ccccc1)(c1ccccc1)c1ccccc1-2] |

-continued
[Compound Group 1]
| | n | A—L—* | $Ar_1$ | $Ar_2$ |
|---|---|---|---|---|
| 3-A1-58 | 1 | 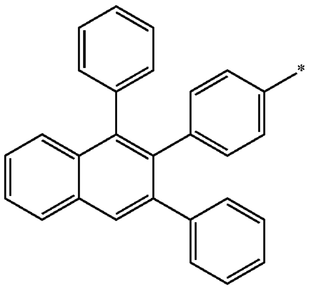 | 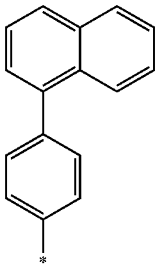 [SMILES: *c1ccc(-c2cccc3ccccc23)cc1] | 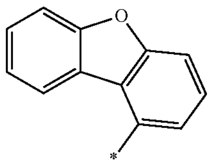 [SMILES: *c1cccc2oc3ccccc3c12] |
| 3-A1-59 | 1 | 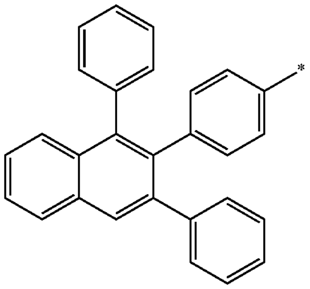 [SMILES: *c1ccc(-c2c(-c3ccccc3)cc3ccccc3c2-c2ccccc2)cc1] | 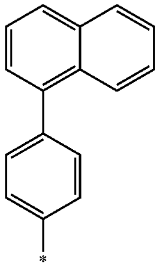 [SMILES: *c1ccc(-c2cccc3ccccc23)cc1] | 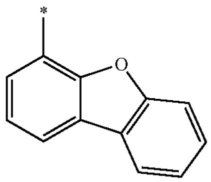 |
| 3-A1-60 | 1 | 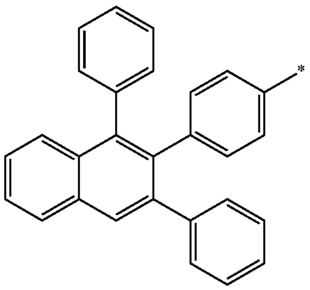 [SMILES: *c1ccc(-c2c(-c3ccccc3)cc3ccccc3c2-c2ccccc2)cc1] | 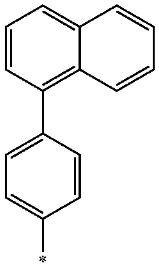 [SMILES: *c1ccc(-c2cccc3ccccc23)cc1] | 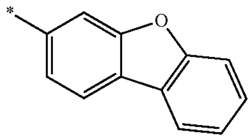 [SMILES: *c1ccc2c(c1)oc1ccccc12] |
| 3-A1-61 | 1 | 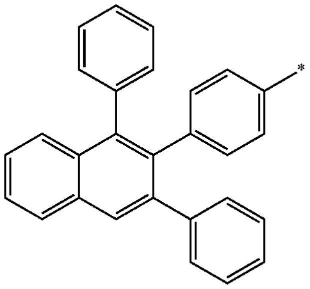 [SMILES: *c1ccc(-c2c(-c3ccccc3)cc3ccccc3c2-c2ccccc2)cc1] | 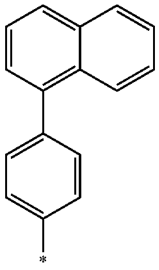 [SMILES: *c1ccc(-c2cccc3ccccc23)cc1] | 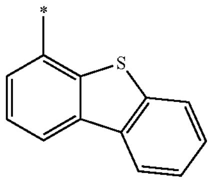 [SMILES: *c1cccc2c1sc1ccccc12] |
| 3-A1-62 | 1 | 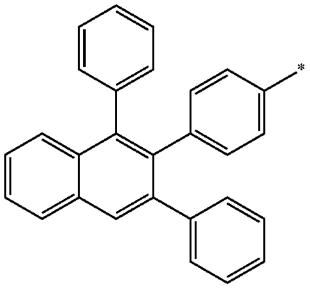 [SMILES: *c1ccc(-c2c(-c3ccccc3)cc3ccccc3c2-c2ccccc2)cc1] | 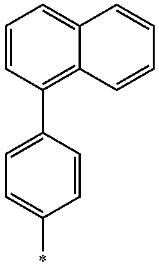 [SMILES: *c1ccc(-c2cccc3ccccc23)cc1] | 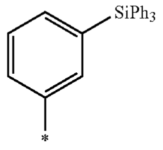 |

-continued
[Compound Group 1]
| | n | A—L—* | $Ar_1$ | $Ar_2$ |
|---|---|---|---|---|
| 3-A1-65 | 1 | 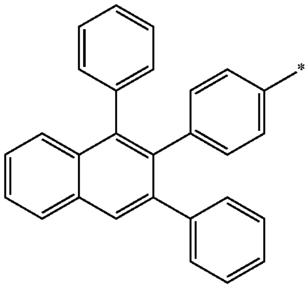 [SMILES: *c1ccc(-c2c(-c3ccccc3)cc3ccccc3c2-c2ccccc2)cc1] | 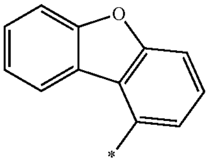 [SMILES: *c1cccc2oc3ccccc3c12] | 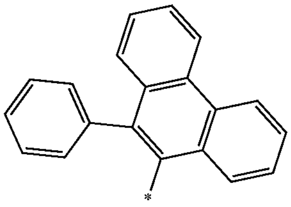 [SMILES: *c1c(-c2ccccc2)c2ccccc2c2ccccc12] |
| 3-A1-66 | 1 | 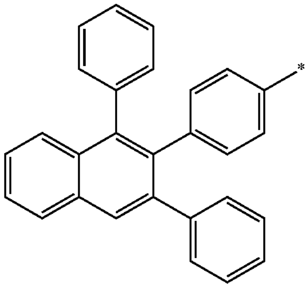 [SMILES: *c1ccc(-c2c(-c3ccccc3)cc3ccccc3c2-c2ccccc2)cc1] | 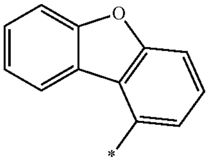 [SMILES: *c1cccc2oc3ccccc3c12] | 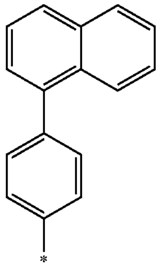 [SMILES: *c1ccc(-c2cccc3ccccc23)cc1] |
| 3-A1-67 | 1 | 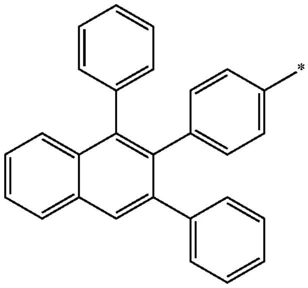 [SMILES: *c1ccc(-c2c(-c3ccccc3)cc3ccccc3c2-c2ccccc2)cc1] | 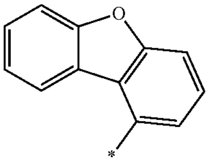 [SMILES: *c1cccc2oc3ccccc3c12] | 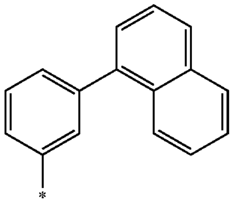 [SMILES: *c1cccc(-c2cccc3ccccc23)c1] |
| 3-A1-68 | 1 | 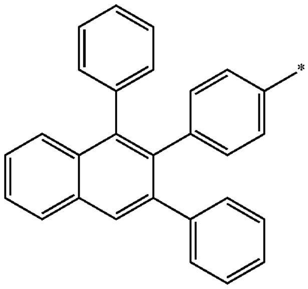 [SMILES: *c1ccc(-c2c(-c3ccccc3)cc3ccccc3c2-c2ccccc2)cc1] | 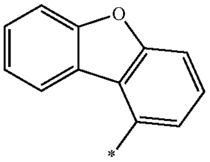 [SMILES: *c1cccc2oc3ccccc3c12] | 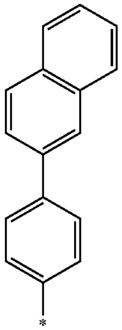 [SMILES: *c1ccc(-c2ccc3ccccc3c2)cc1] |
| 3-A1-69 | 1 | 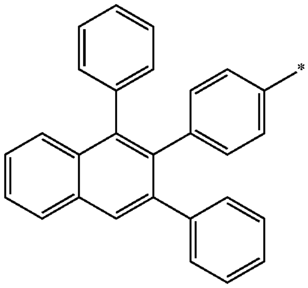 [SMILES: *c1ccc(-c2c(-c3ccccc3)cc3ccccc3c2-c2ccccc2)cc1] | 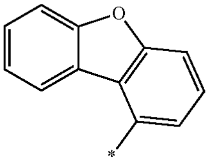 [SMILES: *c1cccc2oc3ccccc3c12] | 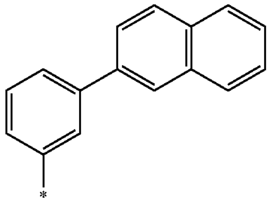 [SMILES: *c1cccc(-c2ccc3ccccc3c2)c1] |

-continued
[Compound Group 1]
| | n | A—L—* | $Ar_1$ | $Ar_2$ |
|---|---|---|---|---|
| 3-A1-70 | 1 | 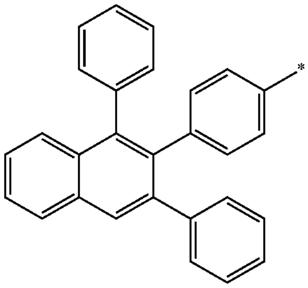 [SMILES: *c1ccc(-c2c(-c3ccccc3)cc3ccccc3c2-c2ccccc2)cc1] | 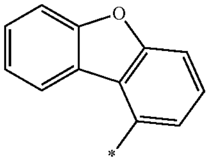 [SMILES: *c1cccc2oc3ccccc3c12] | 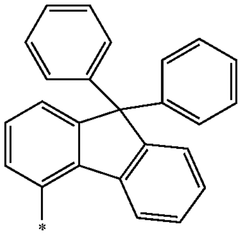 [SMILES: *c1cccc2c1-c1ccccc1C2(c1ccccc1)c1ccccc1] |
| 3-A1-71 | 1 | 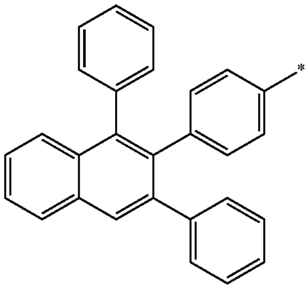 [SMILES: *c1ccc(-c2c(-c3ccccc3)cc3ccccc3c2-c2ccccc2)cc1] | 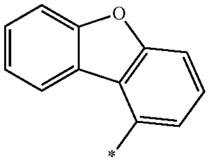 [SMILES: *c1cccc2oc3ccccc3c12] | 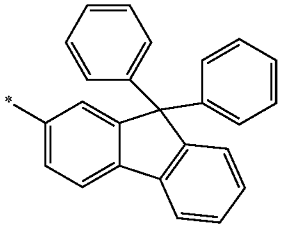 [SMILES: *c1ccc2c(c1)C(c1ccccc1)(c1ccccc1)c1ccccc1-2] |
| 3-A1-76 | 1 | 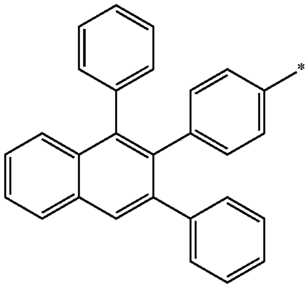 | 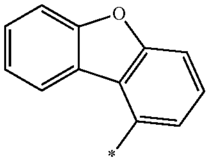 [SMILES: *c1cccc2oc3ccccc3c12] | 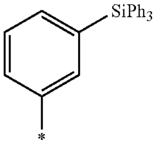 |
| 3-A1-78 | 1 | 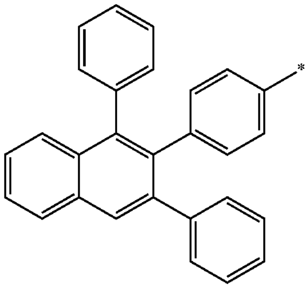 [SMILES: *c1ccc(-c2c(-c3ccccc3)cc3ccccc3c2-c2ccccc2)cc1] | 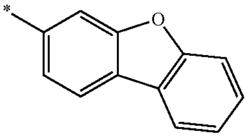 [SMILES: *c1ccc2c(c1)oc1ccccc12] | 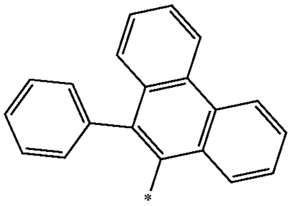 [SMILES: *c1c(-c2ccccc2)c2ccccc2c2ccccc12] |
| 3-A1-79 | 1 | 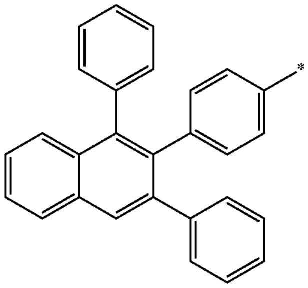 [SMILES: *c1ccc(-c2c(-c3ccccc3)cc3ccccc3c2-c2ccccc2)cc1] | 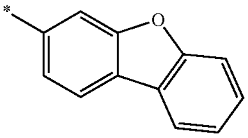 [SMILES: *c1ccc2c(c1)oc1ccccc12] | 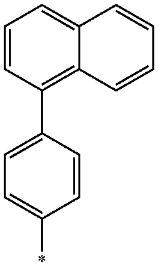 [SMILES: *c1ccc(-c2cccc3ccccc23)cc1] |

-continued
[Compound Group 1]
| | n | A—L—* | $Ar_1$ | $Ar_2$ |
|---|---|---|---|---|
| 3-A1-80 | 1 | 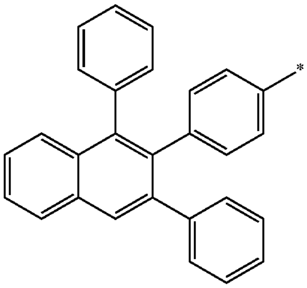 [SMILES: *c1ccc(-c2c(-c3ccccc3)cc3ccccc3c2-c2ccccc2)cc1] | 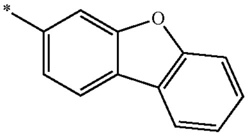 [SMILES: *c1ccc2c(c1)oc1ccccc12] | 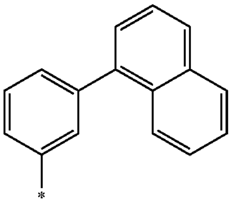 [SMILES: *c1cccc(-c2cccc3ccccc23)c1] |
| 3-A1-81 | 1 | 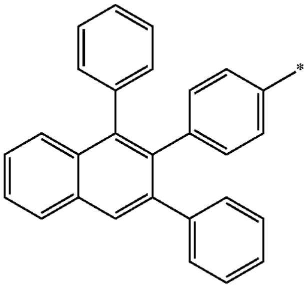 [SMILES: *c1ccc(-c2c(-c3ccccc3)cc3ccccc3c2-c2ccccc2)cc1] | 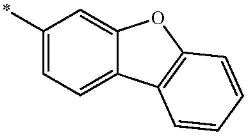 [SMILES: *c1ccc2c(c1)oc1ccccc12] | 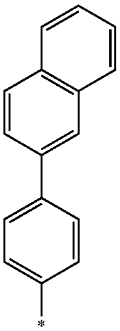 [SMILES: *c1ccc(-c2ccc3ccccc3c2)cc1] |
| 3-A1-82 | 1 | 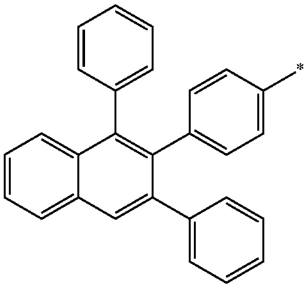 [SMILES: *c1ccc(-c2c(-c3ccccc3)cc3ccccc3c2-c2ccccc2)cc1] | 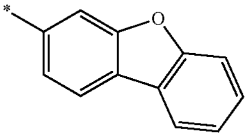 | 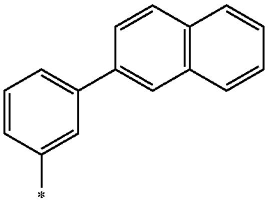 [SMILES: *c1cccc(-c2ccc3ccccc3c2)c1] |
| 3-A1-83 | 1 | 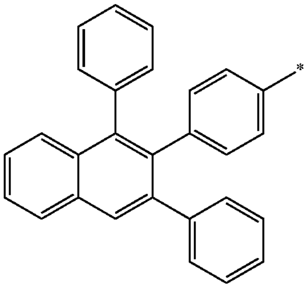 [SMILES: *c1ccc(-c2c(-c3ccccc3)cc3ccccc3c2-c2ccccc2)cc1] | 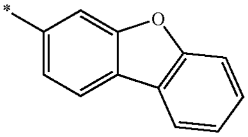 [SMILES: *c1ccc2c(c1)oc1ccccc12] | 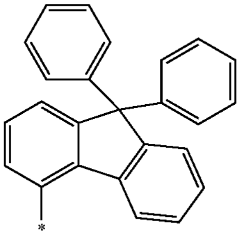 [SMILES: *c1cccc2c1-c1ccccc1C2(c1ccccc1)c1ccccc1] |
| 3-A1-84 | 1 | 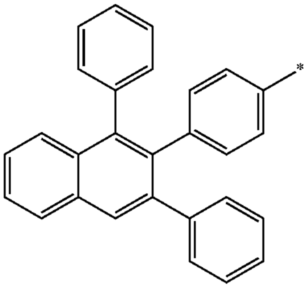 [SMILES: *c1ccc(-c2c(-c3ccccc3)cc3ccccc3c2-c2ccccc2)cc1] | 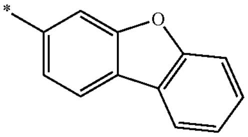 [SMILES: *c1ccc2c(c1)oc1ccccc12] | 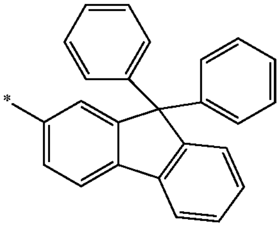 [SMILES: *c1ccc2c(c1)C(c1ccccc1)(c1ccccc1)c1ccccc1-2] |

-continued
[Compound Group 1]
| | n | A—L—* | $Ar_1$ | $Ar_2$ |
|---|---|---|---|---|
| 3-A1-88 | 1 | 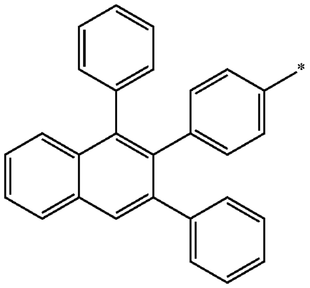 [SMILES: *c1ccc(-c2c(-c3ccccc3)cc3ccccc3c2-c2ccccc2)cc1] | 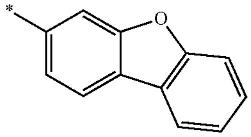 [SMILES: *c1ccc2c(c1)oc1ccccc12] | 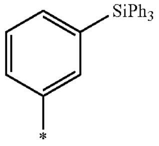 |
| 3-A1-90 | 1 | 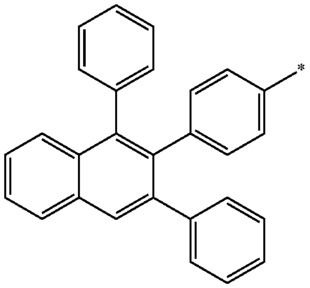 [SMILES: *c1ccc(-c2c(-c3ccccc3)cc3ccccc3c2-c2ccccc2)cc1] | 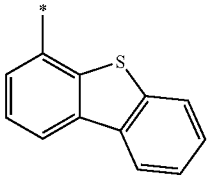 | 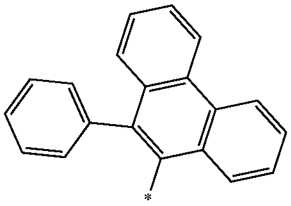 [SMILES: *c1c(-c2ccccc2)c2ccccc2c2ccccc12] |
| 3-A1-91 | 1 | 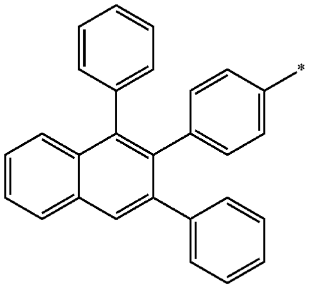 [SMILES: *c1ccc(-c2c(-c3ccccc3)cc3ccccc3c2-c2ccccc2)cc1] | 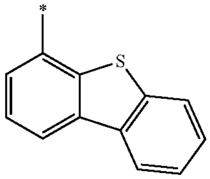 | 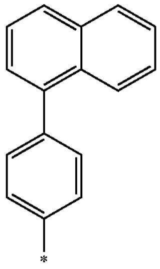 [SMILES: *c1ccc(-c2cccc3ccccc23)cc1] |
| 3-A1-92 | 1 | 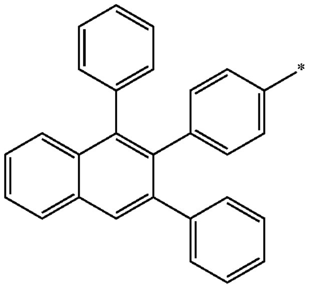 [SMILES: *c1ccc(-c2c(-c3ccccc3)cc3ccccc3c2-c2ccccc2)cc1] | 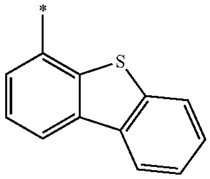 | 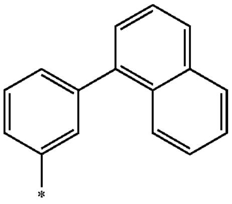 |
| 3-A1-93 | 1 | 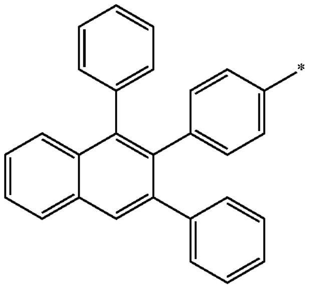 [SMILES: *c1ccc(-c2c(-c3ccccc3)cc3ccccc3c2-c2ccccc2)cc1] | 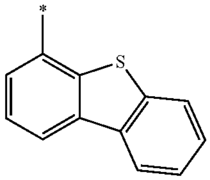 [SMILES: *c1cccc2c1sc1ccccc12] | 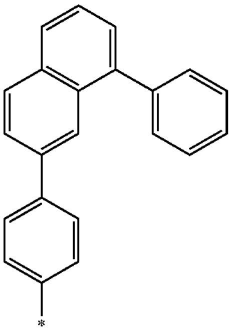 [SMILES: *c1ccc(-c2ccc3cccc(-c4ccccc4)c3c2)cc1] |

-continued
[Compound Group 1]
| | n | A—L—* | $Ar_1$ | $Ar_2$ |
|---|---|---|---|---|
| 3-A1-94 | 1 | 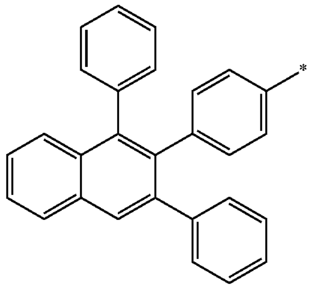 [SMILES: *c1ccc(-c2c(-c3ccccc3)cc3ccccc3c2-c2ccccc2)cc1] | 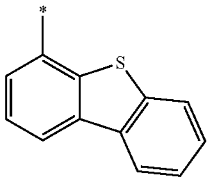 | 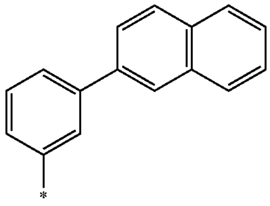 |
| 3-A1-95 | 1 | 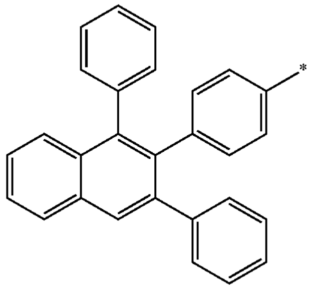 | 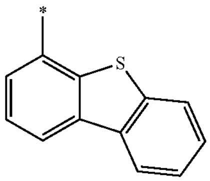 [SMILES: *c1cccc2c1sc1ccccc12] | 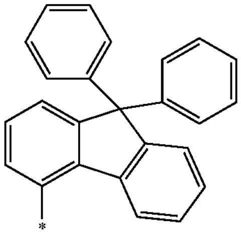 [SMILES: *c1cccc2c1-c1ccccc1C2(c1ccccc1)c1ccccc1] |
| 3-A1-96 | 1 | 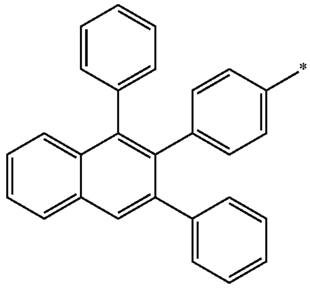 [SMILES: *c1ccc(-c2c(-c3ccccc3)cc3ccccc3c2-c2ccccc2)cc1] | 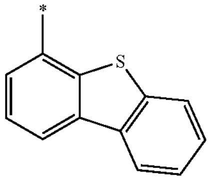 [SMILES: *c1cccc2c1sc1ccccc12] | 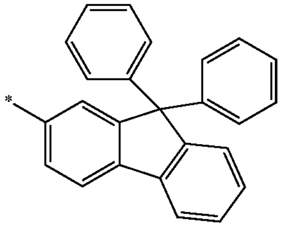 [SMILES: *c1ccc2c(c1)C(c1ccccc1)(c1ccccc1)c1ccccc1-2] |
| 3-A1-99 | 1 | 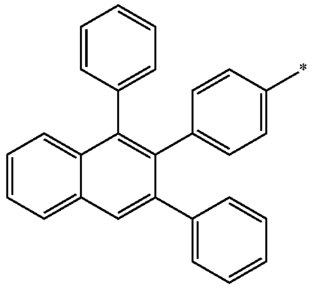 [SMILES: *c1ccc(-c2c(-c3ccccc3)cc3ccccc3c2-c2ccccc2)cc1] | 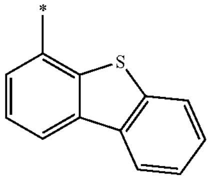 | 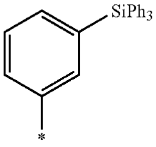 |

[Compound Group 2]
| | n | A—L—* | $Ar_1$ | $Ar_2$ |
|---|---|---|---|---|
| 2-B1-50 | 1 | 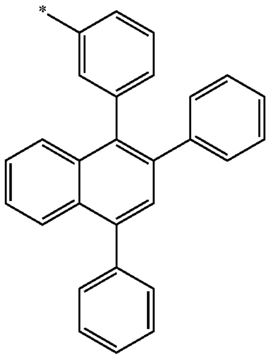 [SMILES: *c1cccc(-c2c(-c3ccccc3)cc(-c3ccccc3)c3ccccc23)c1] | 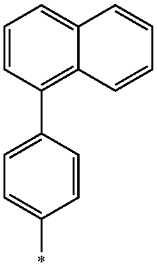 [SMILES: *c1ccc(-c2cccc3ccccc23)cc1] | 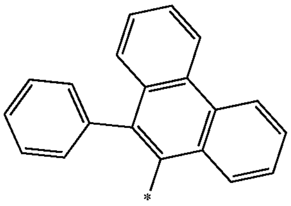 [SMILES: *c1c(-c2ccccc2)c2ccccc2c2ccccc12] |
| 2-B1-51 | 1 | 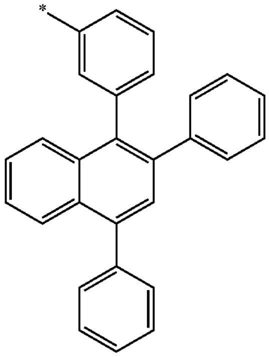 [SMILES: *c1cccc(-c2c(-c3ccccc3)cc(-c3ccccc3)c3ccccc23)c1] | 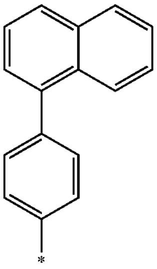 [SMILES: *c1ccc(-c2cccc3ccccc23)cc1] | 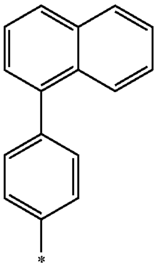 [SMILES: *c1ccc(-c2cccc3ccccc23)cc1] |
| 2-B1-52 | 1 | 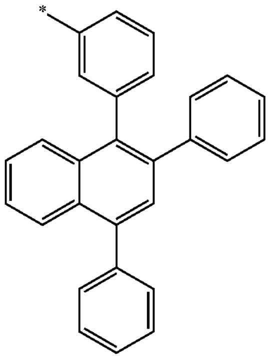 [SMILES: *c1cccc(-c2c(-c3ccccc3)cc(-c3ccccc3)c3ccccc23)c1] | 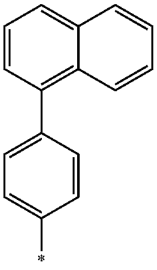 [SMILES: *c1ccc(-c2cccc3ccccc23)cc1] | 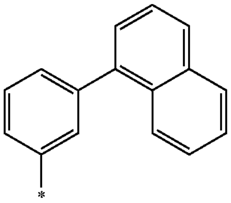 |
| 2-B1-53 | 1 | 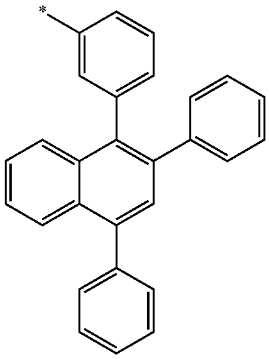 [SMILES: *c1cccc(-c2c(-c3ccccc3)cc(-c3ccccc3)c3ccccc23)c1] | 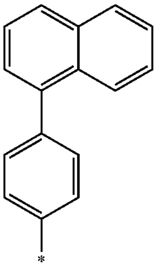 [SMILES: *c1ccc(-c2cccc3ccccc23)cc1] | 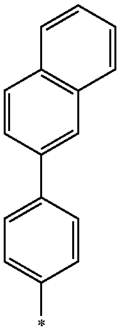 |

-continued
[Compound Group 2]
| | n | A—L—* | $Ar_1$ | $Ar_2$ |
|---|---|---|---|---|
| 2-B1-54 | 1 | 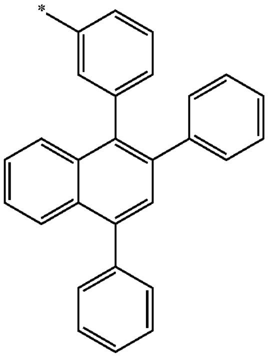 [SMILES: *c1cccc(-c2c(-c3ccccc3)cc(-c3ccccc3)c3ccccc23)c1] | 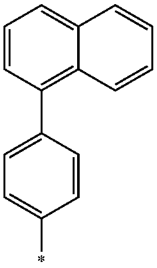 [SMILES: *c1ccc(-c2cccc3ccccc23)cc1] | 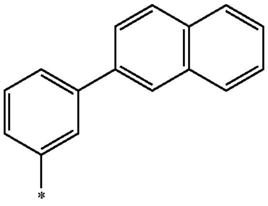 [SMILES: *c1cccc(-c2ccc3ccccc3c2)c1] |
| 2-B1-55 | 1 | 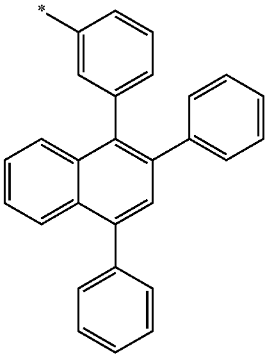 [SMILES: *c1cccc(-c2c(-c3ccccc3)cc(-c3ccccc3)c3ccccc23)c1] | 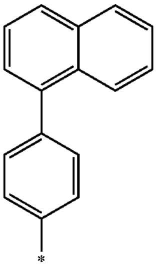 [SMILES: *c1ccc(-c2cccc3ccccc23)cc1] | 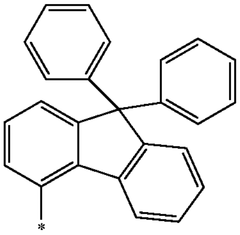 [SMILES: *c1cccc2c1-c1ccccc1C2(c1ccccc1)c1ccccc1] |
| 2-B1-56 | 1 | 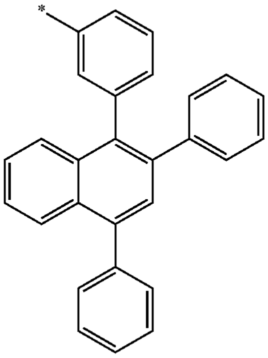 [SMILES: *c1cccc(-c2c(-c3ccccc3)cc(-c3ccccc3)c3ccccc23)c1] | 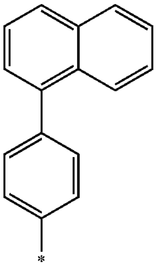 [SMILES: *c1ccc(-c2cccc3ccccc23)cc1] | 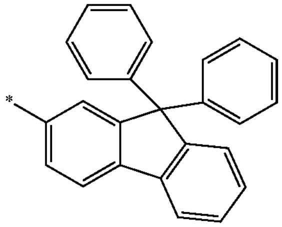 [SMILES: *c1ccc2c(c1)C(c1ccccc1)(c1ccccc1)c1ccccc1-2] |
| 2-B1-58 | 1 | 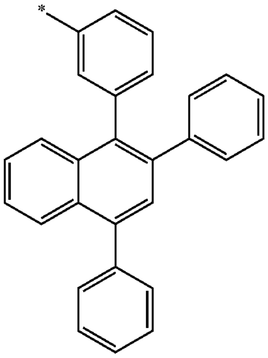 [SMILES: *c1cccc(-c2c(-c3ccccc3)cc(-c3ccccc3)c3ccccc23)c1] | 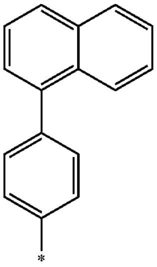 [SMILES: *c1ccc(-c2cccc3ccccc23)cc1] | 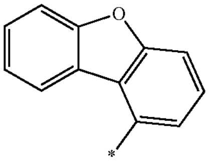 [SMILES: *c1cccc2oc3ccccc3c12] |

-continued
[Compound Group 2]
| | n | A—L—* | $Ar_1$ | $Ar_2$ |
|---|---|---|---|---|
| 2-B1-59 | 1 | 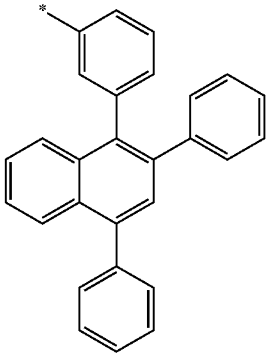 [SMILES: *c1cccc(-c2c(-c3ccccc3)cc(-c3ccccc3)c3ccccc23)c1] | 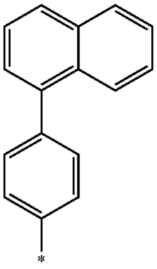 [SMILES: *c1ccc(-c2cccc3ccccc23)cc1] | 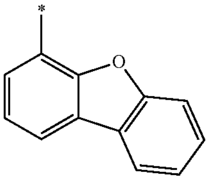 |
| 2-B1-60 | 1 | 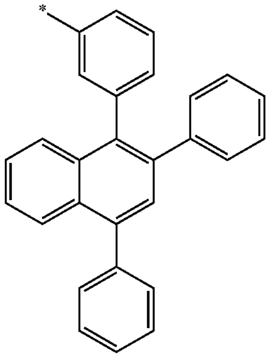 [SMILES: *c1cccc(-c2c(-c3ccccc3)cc(-c3ccccc3)c3ccccc23)c1] | 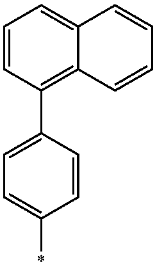 [SMILES: *c1ccc(-c2cccc3ccccc23)cc1] | 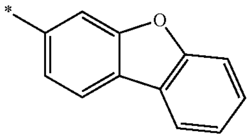 [SMILES: *c1ccc2c(c1)oc1ccccc12] |
| 2-B1-61 | 1 | 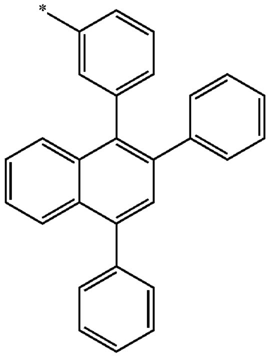 [SMILES: *c1cccc(-c2c(-c3ccccc3)cc(-c3ccccc3)c3ccccc23)c1] | 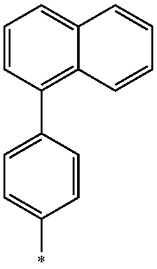 [SMILES: *c1ccc(-c2cccc3ccccc23)cc1] | 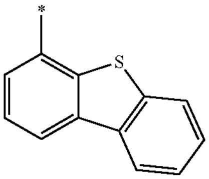 [SMILES: *c1cccc2c1sc1ccccc12] |
| 2-B1-62 | 1 | 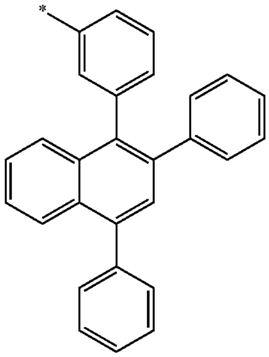 [SMILES: *c1cccc(-c2c(-c3ccccc3)cc(-c3ccccc3)c3ccccc23)c1] | 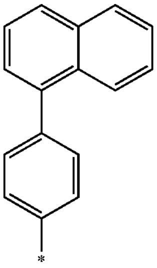 [SMILES: *c1ccc(-c2cccc3ccccc23)cc1] | 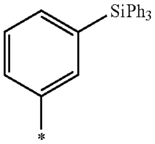 |

-continued
| [Compound Group 2] | | | | |
|---|---|---|---|---|
| | n | A—L—* | $Ar_1$ | $Ar_2$ |
| 2-B1-65 | 1 | 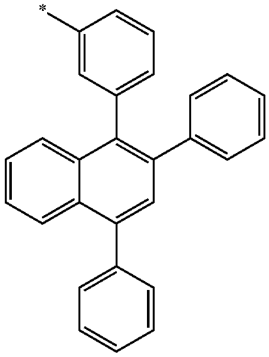 [SMILES: *c1cccc(-c2c(-c3ccccc3)cc(-c3ccccc3)c3ccccc23)c1] | 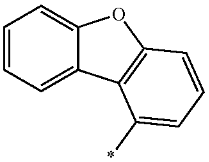 [SMILES: *c1cccc2oc3ccccc3c12] | 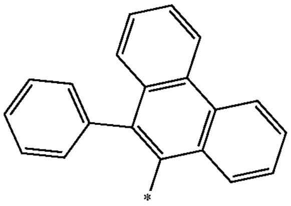 [SMILES: *c1c(-c2ccccc2)c2ccccc2c2ccccc12] |
| 2-B1-66 | 1 | 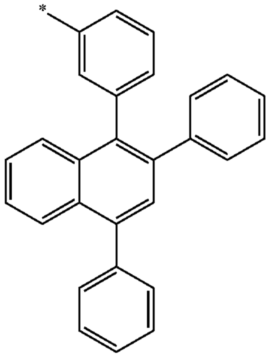 [SMILES: *c1cccc(-c2c(-c3ccccc3)cc(-c3ccccc3)c3ccccc23)c1] | 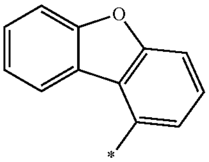 [SMILES: *c1cccc2oc3ccccc3c12] | 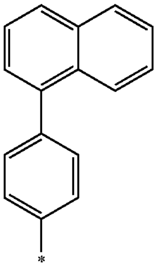 [SMILES: *c1ccc(-c2cccc3ccccc23)cc1] |
| 2-B1-67 | 1 | 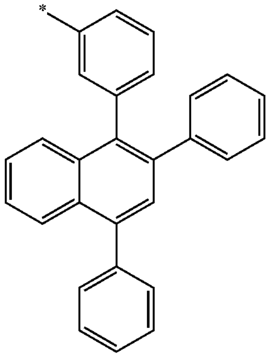 [SMILES: *c1cccc(-c2c(-c3ccccc3)cc(-c3ccccc3)c3ccccc23)c1] | 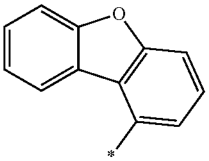 [SMILES: *c1cccc2oc3ccccc3c12] | 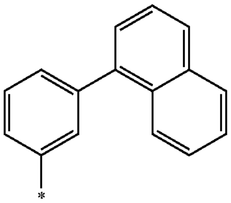 |
| 2-B1-68 | 1 | 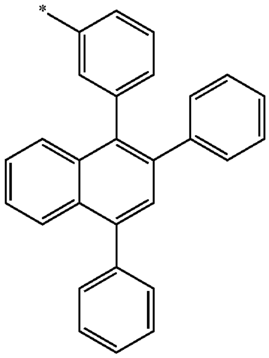 [SMILES: *c1cccc(-c2c(-c3ccccc3)cc(-c3ccccc3)c3ccccc23)c1] | 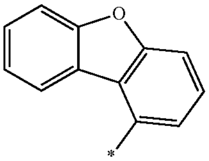 [SMILES: *c1cccc2oc3ccccc3c12] | 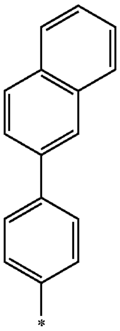 |

-continued
| [Compound Group 2] | | | | |
|---|---|---|---|---|
| | n | A—L—* | $Ar_1$ | $Ar_2$ |
| 2-B1-69 | 1 | 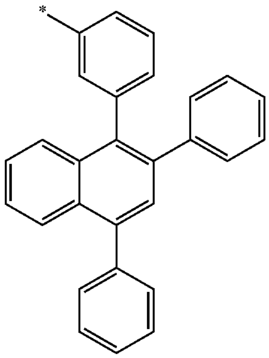 [SMILES: *c1cccc(-c2c(-c3ccccc3)cc(-c3ccccc3)c3ccccc23)c1] | 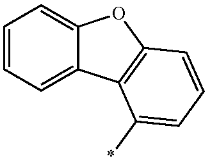 [SMILES: *c1cccc2oc3ccccc3c12] | 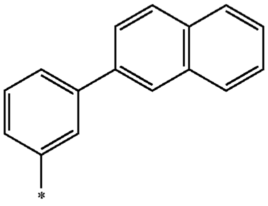 [SMILES: *c1cccc(-c2ccc3ccccc3c2)c1] |
| 2-B1-70 | 1 | 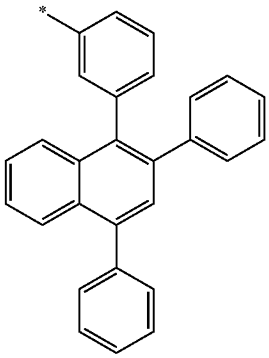 [SMILES: *c1cccc(-c2c(-c3ccccc3)cc(-c3ccccc3)c3ccccc23)c1] | 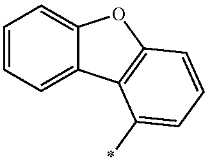 [SMILES: *c1cccc2oc3ccccc3c12] | 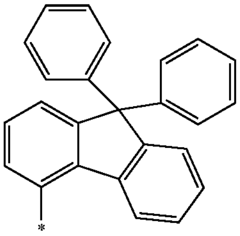 [SMILES: *c1cccc2c1-c1ccccc1C2(c1ccccc1)c1ccccc1] |
| 2-B1-71 | 1 | 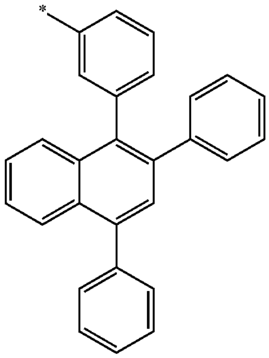 [SMILES: *c1cccc(-c2c(-c3ccccc3)cc(-c3ccccc3)c3ccccc23)c1] | 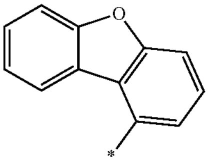 [SMILES: *c1cccc2oc3ccccc3c12] | 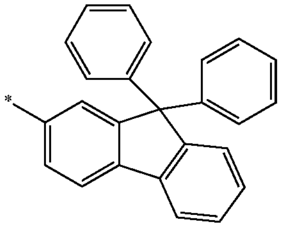 [SMILES: *c1ccc2c(c1)C(c1ccccc1)(c1ccccc1)c1ccccc1-2] |
| 2-B1-76 | 1 | 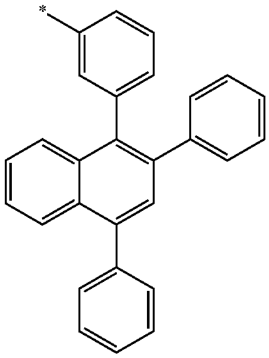 [SMILES: *c1cccc(-c2c(-c3ccccc3)cc(-c3ccccc3)c3ccccc23)c1] | 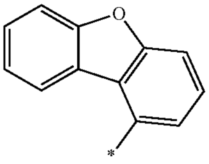 [SMILES: *c1cccc2oc3ccccc3c12] | 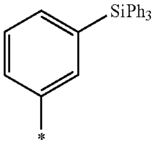 |

-continued
[Compound Group 2]
| | n | A—L—* | $Ar_1$ | $Ar_2$ |
|---|---|---|---|---|
| 2-B1-78 | 1 | 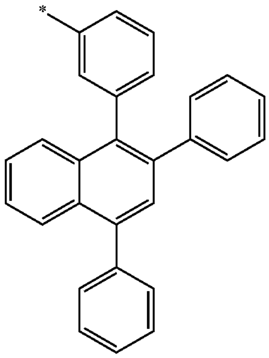 [SMILES: *c1cccc(-c2c(-c3ccccc3)cc(-c3ccccc3)c3ccccc23)c1] | 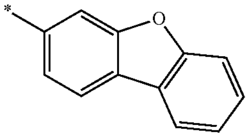 [SMILES: *c1ccc2c(c1)oc1ccccc12] | 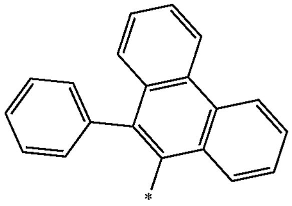 [SMILES: *c1c(-c2ccccc2)c2ccccc2c2ccccc12] |
| 2-B1-79 | 1 | 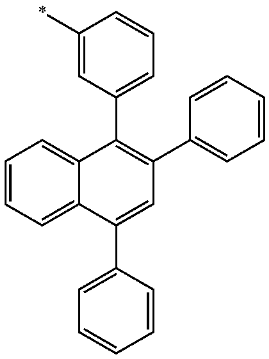 [SMILES: *c1cccc(-c2c(-c3ccccc3)cc(-c3ccccc3)c3ccccc23)c1] | 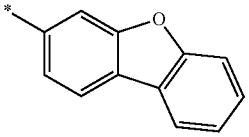 [SMILES: *c1ccc2c(c1)oc1ccccc12] | 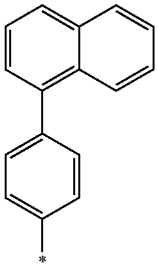 [SMILES: *c1ccc(-c2cccc3ccccc23)cc1] |
| 2-B1-80 | 1 | 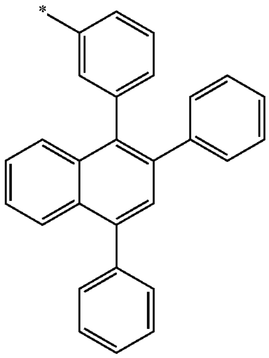 [SMILES: *c1cccc(-c2c(-c3ccccc3)cc(-c3ccccc3)c3ccccc23)c1] | 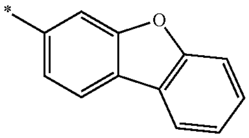 [SMILES: *c1ccc2c(c1)oc1ccccc12] | 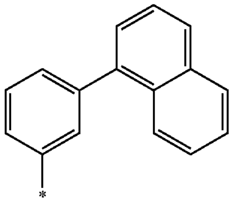 |
| 2-B1-81 | 1 | 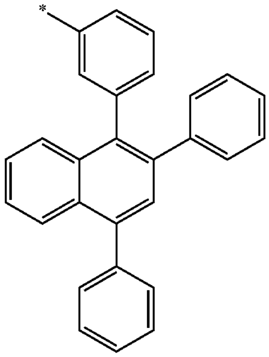 [SMILES: *c1cccc(-c2c(-c3ccccc3)cc(-c3ccccc3)c3ccccc23)c1] | 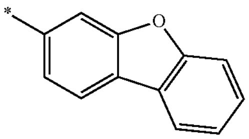 [SMILES: *c1ccc2c(c1)oc1ccccc12] | 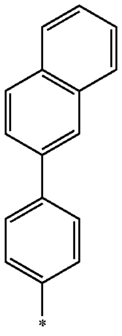 |

-continued
| [Compound Group 2] | | | | |
|---|---|---|---|---|
| | n | A—L—* | $Ar_1$ | $Ar_2$ |
| 2-B1-82 | 1 | 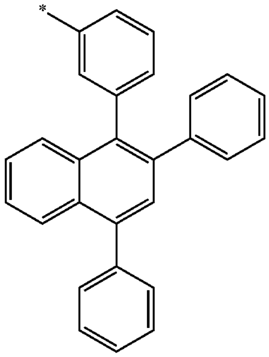 [SMILES: *c1cccc(-c2c(-c3ccccc3)cc(-c3ccccc3)c3ccccc23)c1] | 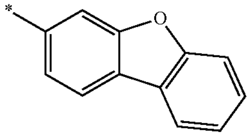 [SMILES: *c1ccc2c(c1)oc1ccccc12] | 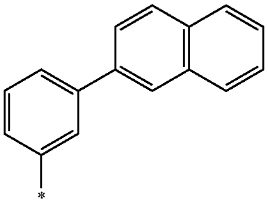 |
| 2-B1-83 | 1 | 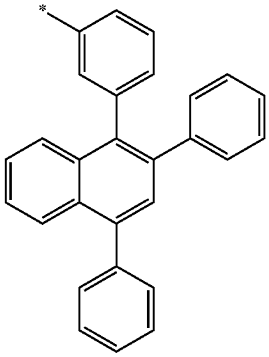 [SMILES: *c1cccc(-c2c(-c3ccccc3)cc(-c3ccccc3)c3ccccc23)c1] | 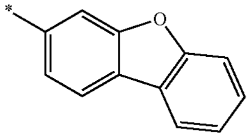 [SMILES: *c1ccc2c(c1)oc1ccccc12] | 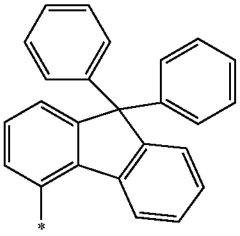 [SMILES: *c1cccc2c1-c1ccccc1C2(c1ccccc1)c1ccccc1] |
| 2-B1-84 | 1 | 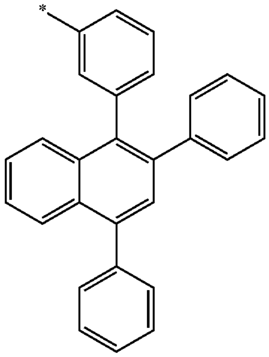 [SMILES: *c1cccc(-c2c(-c3ccccc3)cc(-c3ccccc3)c3ccccc23)c1] | 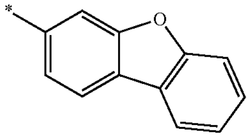 [SMILES: *c1ccc2c(c1)oc1ccccc12] | 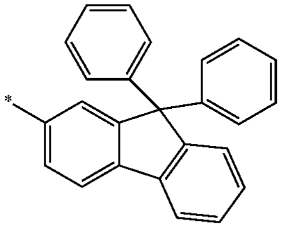 [SMILES: *c1ccc2c(c1)C(c1ccccc1)(c1ccccc1)c1ccccc1-2] |
| 2-B1-88 | 1 | 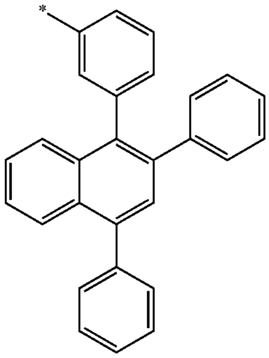 [SMILES: *c1cccc(-c2c(-c3ccccc3)cc(-c3ccccc3)c3ccccc23)c1] | 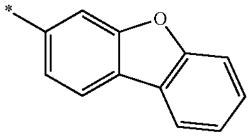 [SMILES: *c1ccc2c(c1)oc1ccccc12] | 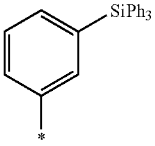 |

-continued
[Compound Group 2]
| | n | A—L—* | $Ar_1$ | $Ar_2$ |
|---|---|---|---|---|
| 2-B1-90 | 1 | 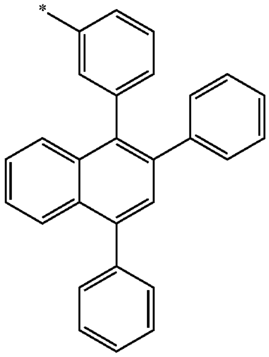 [SMILES: *c1cccc(-c2c(-c3ccccc3)cc(-c3ccccc3)c3ccccc23)c1] | 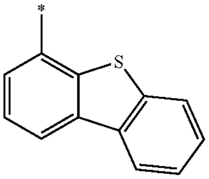 | 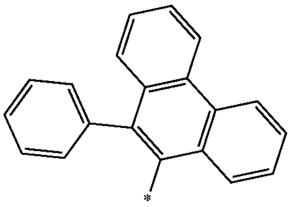 [SMILES: *c1c(-c2ccccc2)c2ccccc2c2ccccc12] |
| 2-B1-91 | 1 | 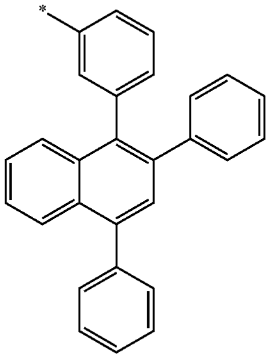 [SMILES: *c1cccc(-c2c(-c3ccccc3)cc(-c3ccccc3)c3ccccc23)c1] | 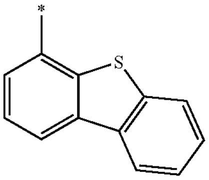 | 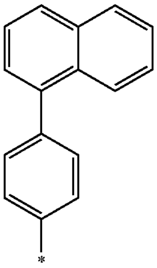 [SMILES: *c1ccc(-c2cccc3ccccc23)cc1] |
| 2-B1-92 | 1 | 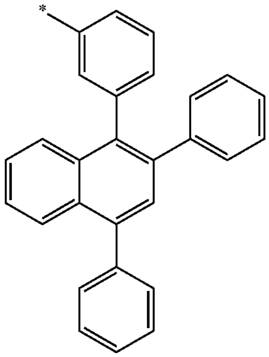 [SMILES: *c1cccc(-c2c(-c3ccccc3)cc(-c3ccccc3)c3ccccc23)c1] | 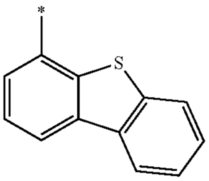 | 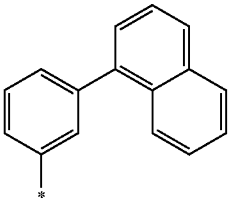 [SMILES: *c1cccc(-c2cccc3ccccc23)c1] |
| 2-B1-93 | 1 | 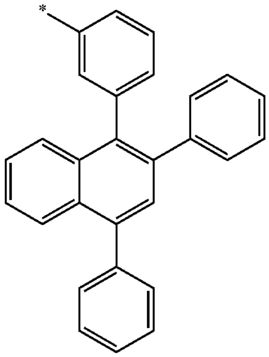 [SMILES: *c1cccc(-c2c(-c3ccccc3)cc(-c3ccccc3)c3ccccc23)c1] | 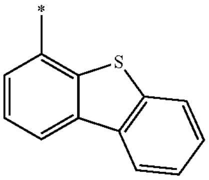 | 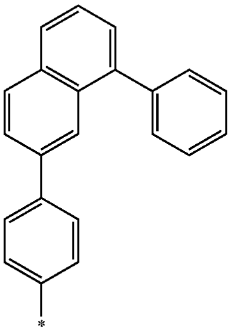 [SMILES: *c1ccc(-c2ccc3cccc(-c4ccccc4)c3c2)cc1] |

-continued
| [Compound Group 2] | | | | |
|---|---|---|---|---|
| | n | A—L—* | $Ar_1$ | $Ar_2$ |
| 2-B1-94 | 1 | 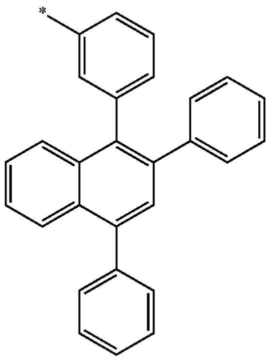 [SMILES: *c1cccc(-c2c(-c3ccccc3)cc(-c3ccccc3)c3ccccc23)c1] | 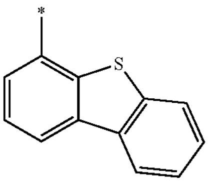 | 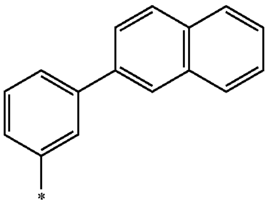 [SMILES: *c1cccc(-c2ccc3ccccc3c2)c1] |
| 2-B1-95 | 1 | 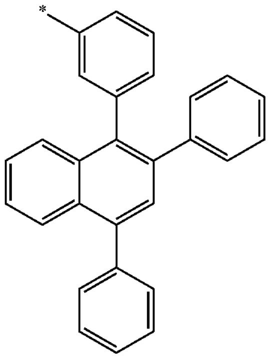 [SMILES: *c1cccc(-c2c(-c3ccccc3)cc(-c3ccccc3)c3ccccc23)c1] | 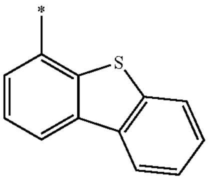 | 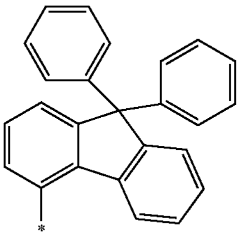 [SMILES: *c1cccc2c1-c1ccccc1C2(c1ccccc1)c1ccccc1] |
| 2-B1-96 | 1 | 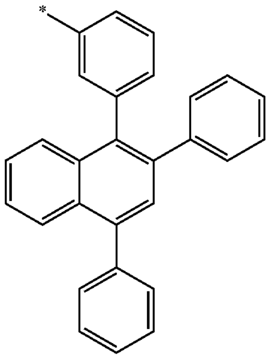 [SMILES: *c1cccc(-c2c(-c3ccccc3)cc(-c3ccccc3)c3ccccc23)c1] | 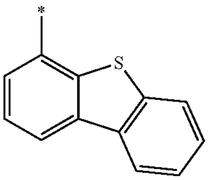 | 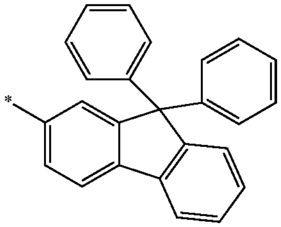 [SMILES: *c1ccc2c(c1)C(c1ccccc1)(c1ccccc1)c1ccccc1-2] |
| 2-B1-99 | 1 | 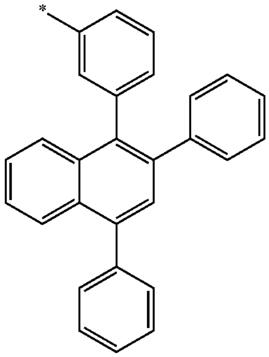 [SMILES: *c1cccc(-c2c(-c3ccccc3)cc(-c3ccccc3)c3ccccc23)c1] | 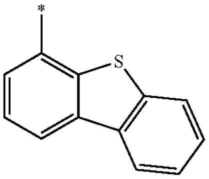 | 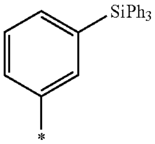 |

-continued
[Compound Group 2]
| | n | A—L—* | $Ar_1$ | $Ar_2$ |
|---|---|---|---|---|
| 3-B1-50 | 1 | 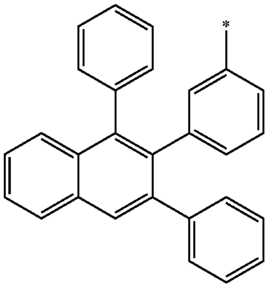 [SMILES: *c1cccc(-c2c(-c3ccccc3)cc3ccccc3c2-c2ccccc2)c1] | 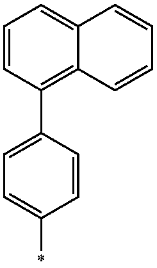 [SMILES: *c1ccc(-c2cccc3ccccc23)cc1] | 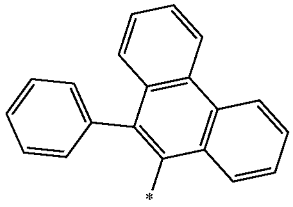 [SMILES: *c1c(-c2ccccc2)c2ccccc2c2ccccc12] |
| 3-B1-51 | 1 | 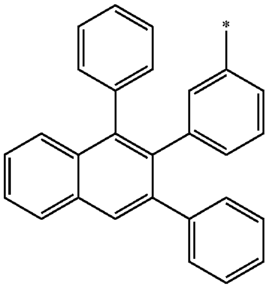 [SMILES: *c1cccc(-c2c(-c3ccccc3)cc3ccccc3c2-c2ccccc2)c1] | 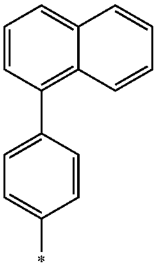 [SMILES: *c1ccc(-c2cccc3ccccc23)cc1] | 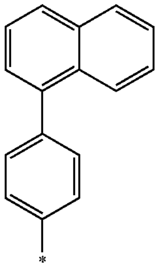 [SMILES: *c1ccc(-c2cccc3ccccc23)cc1] |
| 3-B1-52 | 1 | 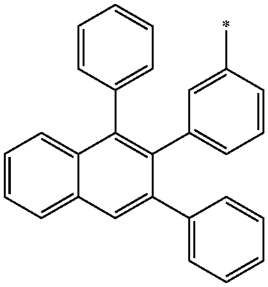 [SMILES: *c1cccc(-c2c(-c3ccccc3)cc3ccccc3c2-c2ccccc2)c1] | 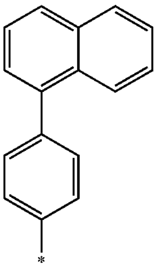 [SMILES: *c1ccc(-c2cccc3ccccc23)cc1] | 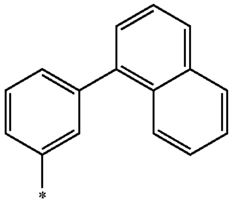 [SMILES: *c1cccc(-c2cccc3ccccc23)c1] |
| 3-B1-53 | 1 | 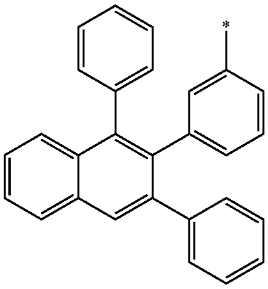 [SMILES: *c1cccc(-c2c(-c3ccccc3)cc3ccccc3c2-c2ccccc2)c1] | 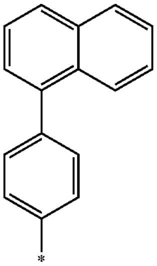 [SMILES: *c1ccc(-c2cccc3ccccc23)cc1] | 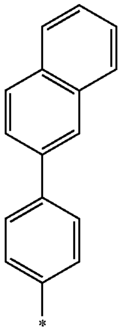 |
| 3-B1-54 | 1 | 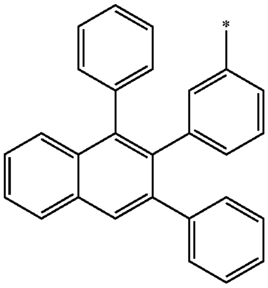 [SMILES: *c1cccc(-c2c(-c3ccccc3)cc3ccccc3c2-c2ccccc2)c1] | 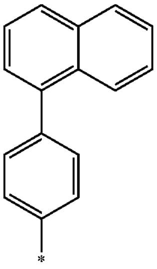 [SMILES: *c1ccc(-c2cccc3ccccc23)cc1] | 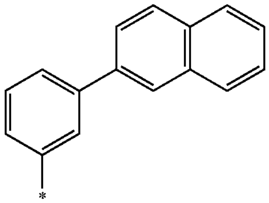 [SMILES: *c1cccc(-c2ccc3ccccc3c2)c1] |

-continued
[Compound Group 2]
| | n | A—L—* | $Ar_1$ | $Ar_2$ |
|---|---|---|---|---|
| 3-B1-55 | 1 | 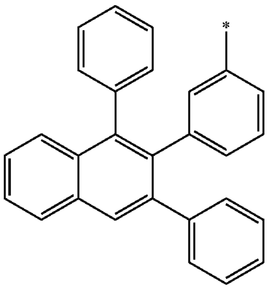 [SMILES: *c1cccc(-c2c(-c3ccccc3)cc3ccccc3c2-c2ccccc2)c1] | 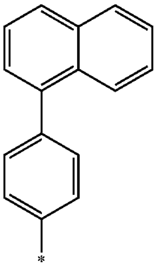 [SMILES: *c1ccc(-c2cccc3ccccc23)cc1] | 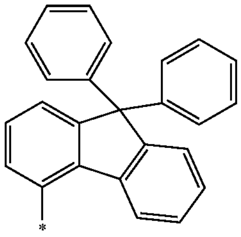 [SMILES: *c1cccc2c1-c1ccccc1C2(c1ccccc1)c1ccccc1] |
| 3-B1-56 | 1 | 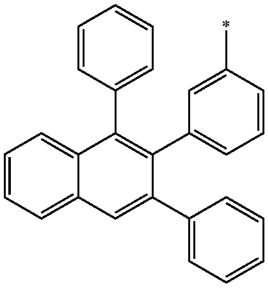 [SMILES: *c1cccc(-c2c(-c3ccccc3)cc3ccccc3c2-c2ccccc2)c1] | 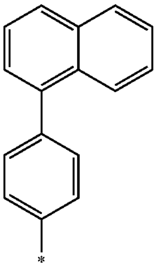 [SMILES: *c1ccc(-c2cccc3ccccc23)cc1] | 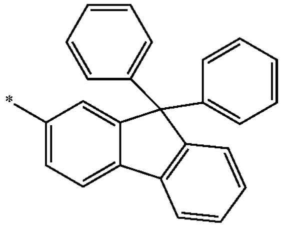 [SMILES: *c1ccc2c(c1)C(c1ccccc1)(c1ccccc1)c1ccccc1-2] |
| 3-B1-58 | 1 | 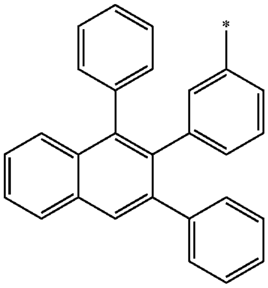 [SMILES: *c1cccc(-c2c(-c3ccccc3)cc3ccccc3c2-c2ccccc2)c1] | 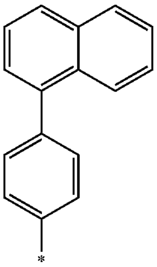 [SMILES: *c1ccc(-c2cccc3ccccc23)cc1] | 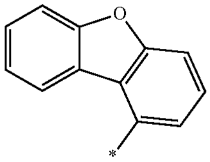 |
| 3-B1-59 | 1 | 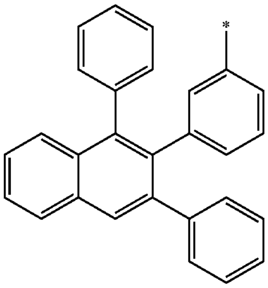 [SMILES: *c1cccc(-c2c(-c3ccccc3)cc3ccccc3c2-c2ccccc2)c1] | 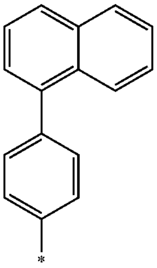 [SMILES: *c1ccc(-c2cccc3ccccc23)cc1] | 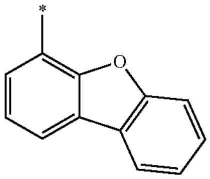 [SMILES: *c1cccc2c1oc1ccccc12] |
| 3-B1-60 | 1 | 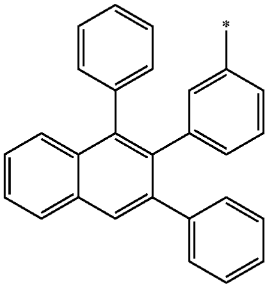 [SMILES: *c1cccc(-c2c(-c3ccccc3)cc3ccccc3c2-c2ccccc2)c1] | 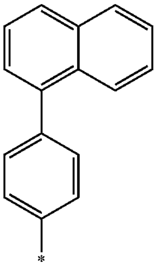 [SMILES: *c1ccc(-c2cccc3ccccc23)cc1] | 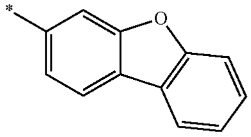 [SMILES: *c1ccc2c(c1)oc1ccccc12] |

-continued
[Compound Group 2]
| | n | A—L—* | $Ar_1$ | $Ar_2$ |
|---|---|---|---|---|
| 3-B1-61 | 1 | 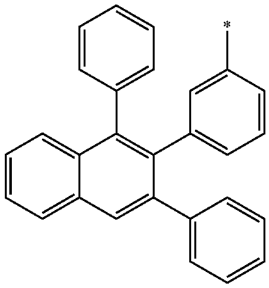 [SMILES: *c1cccc(-c2c(-c3ccccc3)cc3ccccc3c2-c2ccccc2)c1] | 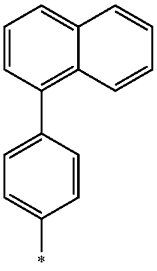 [SMILES: *c1ccc(-c2cccc3ccccc23)cc1] | 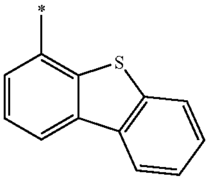 [SMILES: *c1cccc2c1sc1ccccc12] |
| 3-B1-62 | 1 | 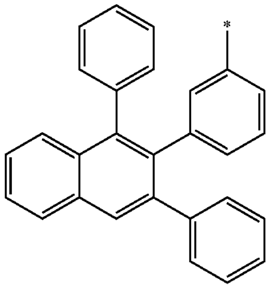 [SMILES: *c1cccc(-c2c(-c3ccccc3)cc3ccccc3c2-c2ccccc2)c1] | 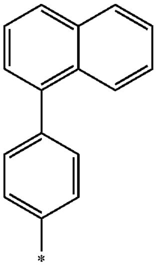 [SMILES: *c1ccc(-c2cccc3ccccc23)cc1] | 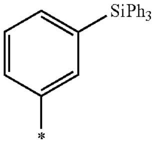 |
| 3-B1-65 | 1 | 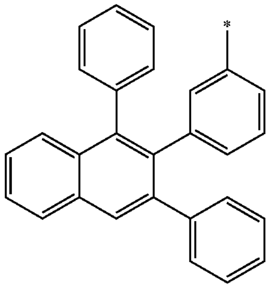 [SMILES: *c1cccc(-c2c(-c3ccccc3)cc3ccccc3c2-c2ccccc2)c1] | 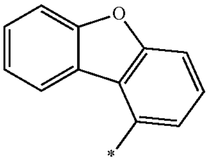 | 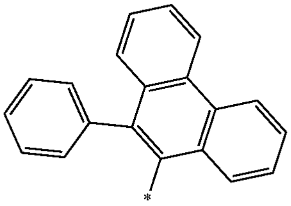 [SMILES: *c1c(-c2ccccc2)c2ccccc2c2ccccc12] |
| 3-B1-66 | 1 | 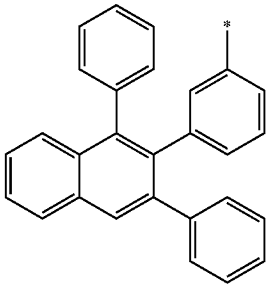 [SMILES: *c1cccc(-c2c(-c3ccccc3)cc3ccccc3c2-c2ccccc2)c1] | 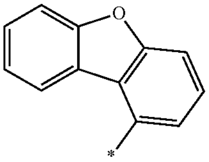 [SMILES: *c1cccc2oc3ccccc3c12] | 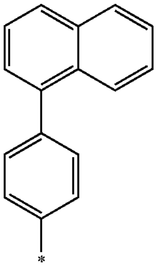 [SMILES: *c1ccc(-c2cccc3ccccc23)cc1] |
| 3-B1-67 | 1 | 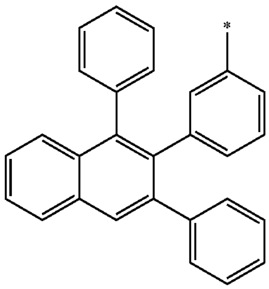 [SMILES: *c1cccc(-c2c(-c3ccccc3)cc3ccccc3c2-c2ccccc2)c1] | 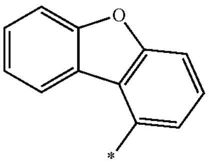 [SMILES: *c1cccc2oc3ccccc3c12] | 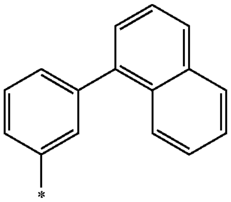 |

-continued
[Compound Group 2]
| | n | A—L—* | $Ar_1$ | $Ar_2$ |
|---|---|---|---|---|
| 3-B1-68 | 1 | 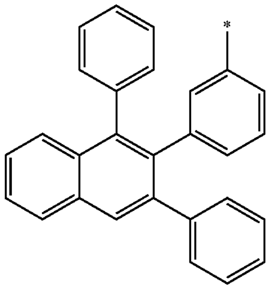 [SMILES: *c1cccc(-c2c(-c3ccccc3)cc3ccccc3c2-c2ccccc2)c1] | 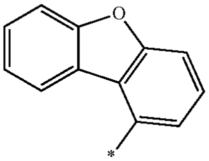 [SMILES: *c1cccc2oc3ccccc3c12] | 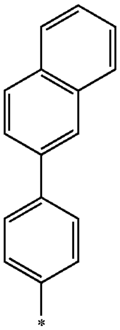 |
| 3-B1-69 | 1 | 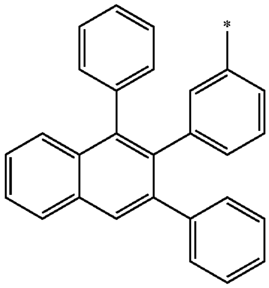 [SMILES: *c1cccc(-c2c(-c3ccccc3)cc3ccccc3c2-c2ccccc2)c1] | 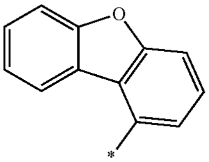 [SMILES: *c1cccc2oc3ccccc3c12] | 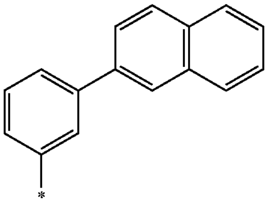 [SMILES: *c1cccc(-c2ccc3ccccc3c2)c1] |
| 3-B1-70 | 1 | 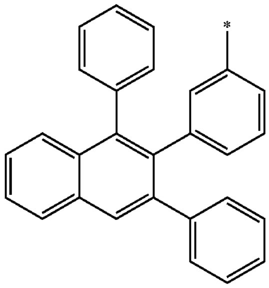 [SMILES: *c1cccc(-c2c(-c3ccccc3)cc3ccccc3c2-c2ccccc2)c1] | 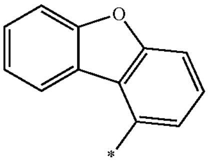 [SMILES: *c1cccc2oc3ccccc3c12] | 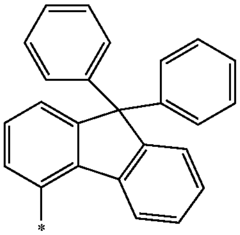 [SMILES: *c1cccc2c1-c1ccccc1C2(c1ccccc1)c1ccccc1] |
| 3-B1-71 | 1 | 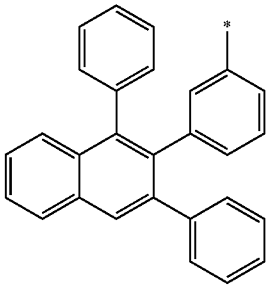 [SMILES: *c1cccc(-c2c(-c3ccccc3)cc3ccccc3c2-c2ccccc2)c1] | 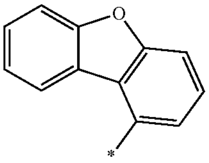 [SMILES: *c1cccc2oc3ccccc3c12] | 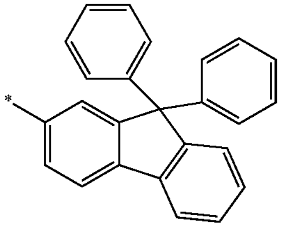 [SMILES: *c1ccc2c(c1)C(c1ccccc1)(c1ccccc1)c1ccccc1-2] |
| 3-B1-76 | 1 | 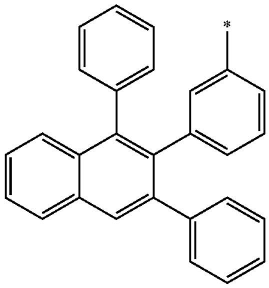 [SMILES: *c1cccc(-c2c(-c3ccccc3)cc3ccccc3c2-c2ccccc2)c1] | 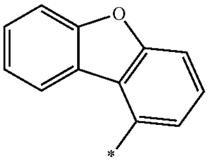 [SMILES: *c1cccc2oc3ccccc3c12] | 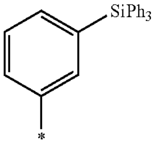 |

-continued
[Compound Group 2]
| | n | A—L—* | $Ar_1$ | $Ar_2$ |
|---|---|---|---|---|
| 3-B1-78 | 1 | 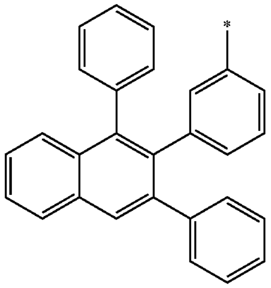 [SMILES: *c1cccc(-c2c(-c3ccccc3)cc3ccccc3c2-c2ccccc2)c1] | 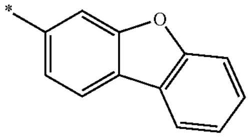 [SMILES: *c1ccc2c(c1)oc1ccccc12] | 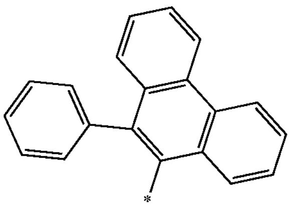 [SMILES: *c1c(-c2ccccc2)c2ccccc2c2ccccc12] |
| 3-B1-79 | 1 | 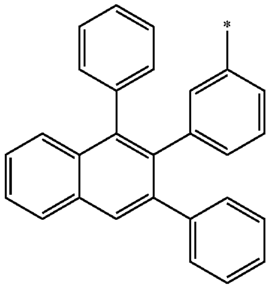 [SMILES: *c1cccc(-c2c(-c3ccccc3)cc3ccccc3c2-c2ccccc2)c1] | 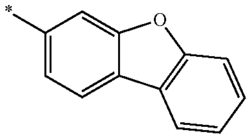 [SMILES: *c1ccc2c(c1)oc1ccccc12] | 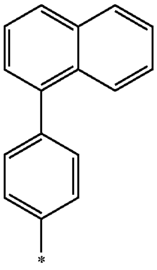 [SMILES: *c1ccc(-c2cccc3ccccc23)cc1] |
| 3-B1-80 | 1 | 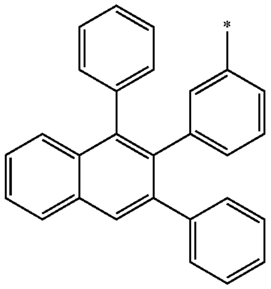 [SMILES: *c1cccc(-c2c(-c3ccccc3)cc3ccccc3c2-c2ccccc2)c1] | 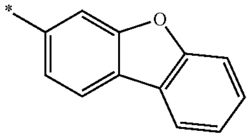 [SMILES: *c1ccc2c(c1)oc1ccccc12] | 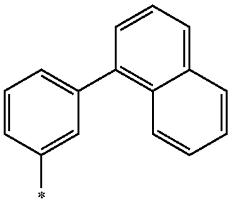 [SMILES: *c1cccc(-c2cccc3ccccc23)c1] |
| 3-B1-81 | 1 | 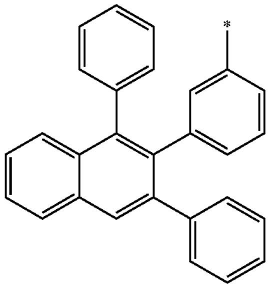 [SMILES: *c1cccc(-c2c(-c3ccccc3)cc3ccccc3c2-c2ccccc2)c1] | 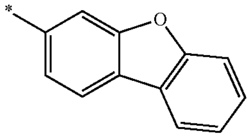 [SMILES: *c1ccc2c(c1)oc1ccccc12] | 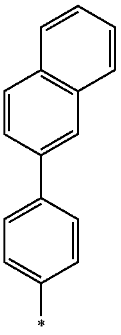 |
| 3-B1-82 | 1 | 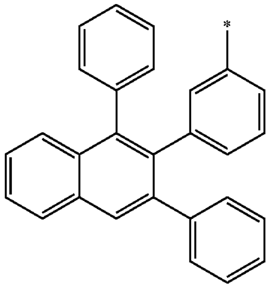 [SMILES: *c1cccc(-c2c(-c3ccccc3)cc3ccccc3c2-c2ccccc2)c1] | 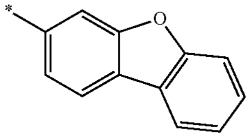 [SMILES: *c1ccc2c(c1)oc1ccccc12] | 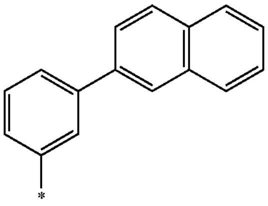 [SMILES: *c1cccc(-c2ccc3ccccc3c2)c1] |

-continued
[Compound Group 2]
| | n | A—L—* | $Ar_1$ | $Ar_2$ |
|---|---|---|---|---|
| 3-B1-83 | 1 | 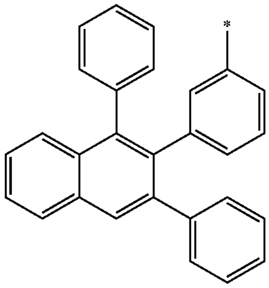 [SMILES: *c1cccc(-c2c(-c3ccccc3)cc3ccccc3c2-c2ccccc2)c1] | 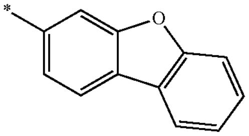 [SMILES: *c1ccc2c(c1)oc1ccccc12] | 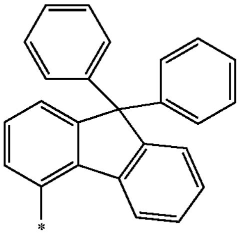 [SMILES: *c1cccc2c1-c1ccccc1C2(c1ccccc1)c1ccccc1] |
| 3-B1-84 | 1 | 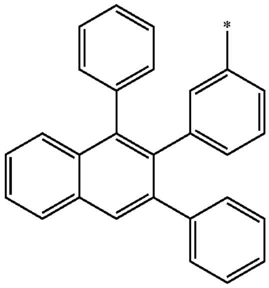 [SMILES: *c1cccc(-c2c(-c3ccccc3)cc3ccccc3c2-c2ccccc2)c1] | 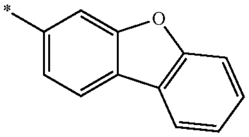 | 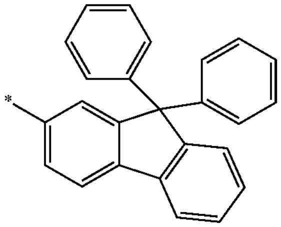 [SMILES: *c1ccc2c(c1)C(c1ccccc1)(c1ccccc1)c1ccccc1-2] |
| 3-B1-88 | 1 | 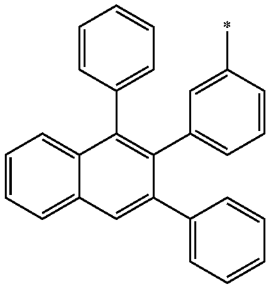 [SMILES: *c1cccc(-c2c(-c3ccccc3)cc3ccccc3c2-c2ccccc2)c1] | 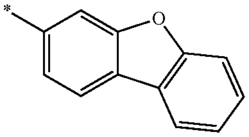 [SMILES: *c1ccc2c(c1)oc1ccccc12] | 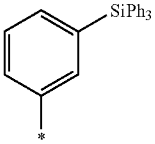 |
| 3-B1-90 | 1 | 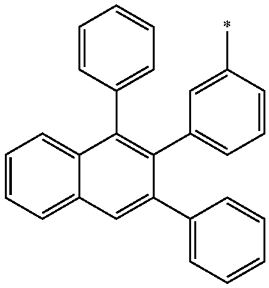 [SMILES: *c1cccc(-c2c(-c3ccccc3)cc3ccccc3c2-c2ccccc2)c1] | 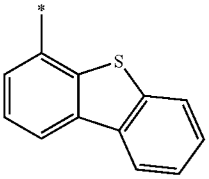 | 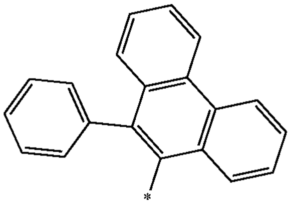 [SMILES: *c1c(-c2ccccc2)c2ccccc2c2ccccc12] |
| 3-B1-91 | 1 | 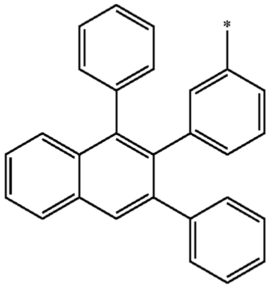 [SMILES: *c1cccc(-c2c(-c3ccccc3)cc3ccccc3c2-c2ccccc2)c1] | 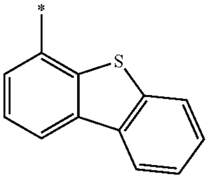 | 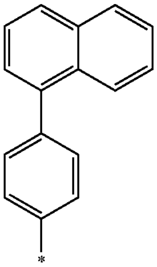 [SMILES: *c1ccc(-c2cccc3ccccc23)cc1] |

-continued
[Compound Group 2]
| | n | A—L—* | $Ar_1$ | $Ar_2$ |
| --- | --- | --- | --- | --- |
| 3-B1-92 | 1 | 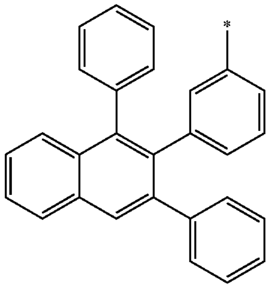 [SMILES: *c1cccc(-c2c(-c3ccccc3)cc3ccccc3c2-c2ccccc2)c1] | 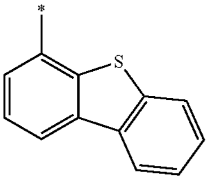 | 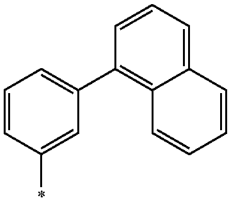 |
| 3-B1-93 | 1 | 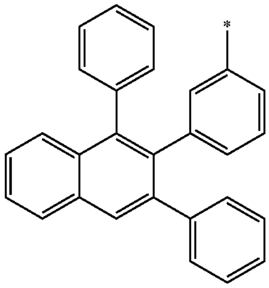 [SMILES: *c1cccc(-c2c(-c3ccccc3)cc3ccccc3c2-c2ccccc2)c1] | 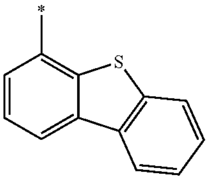 | 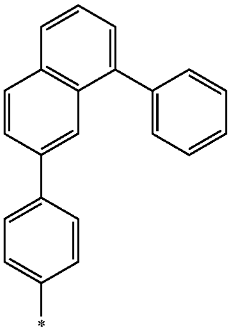 [SMILES: *c1ccc(-c2ccc3cccc(-c4ccccc4)c3c2)cc1] |
| 3-B1-94 | 1 | 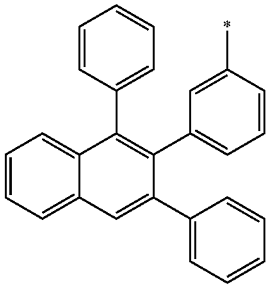 [SMILES: *c1cccc(-c2c(-c3ccccc3)cc3ccccc3c2-c2ccccc2)c1] | 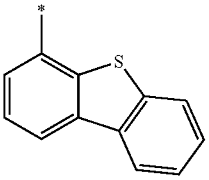 | 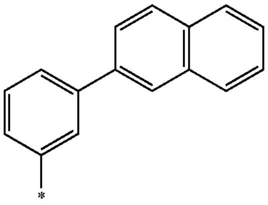 |
| 3-B1-95 | 1 | 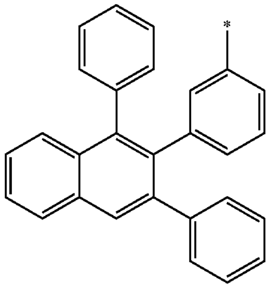 [SMILES: *c1cccc(-c2c(-c3ccccc3)cc3ccccc3c2-c2ccccc2)c1] | 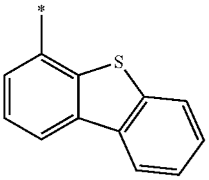 | 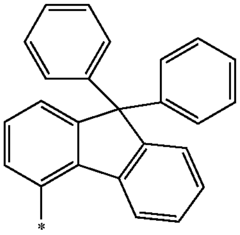 [SMILES: *c1cccc2c1-c1ccccc1C2(c1ccccc1)c1ccccc1] |
| 3-B1-96 | 1 | 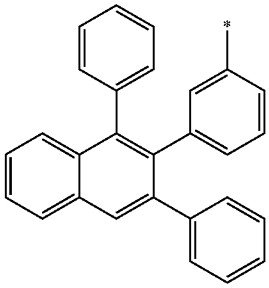 [SMILES: *c1cccc(-c2c(-c3ccccc3)cc3ccccc3c2-c2ccccc2)c1] | 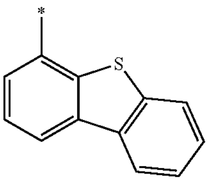 | 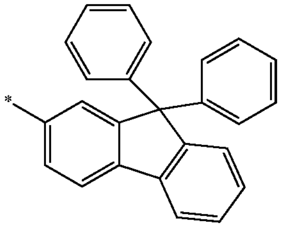 [SMILES: *c1ccc2c(c1)C(c1ccccc1)(c1ccccc1)c1ccccc1-2] |

-continued
[Compound Group 2]
| | n | A—L—* | $Ar_1$ | $Ar_2$ |
|---|---|---|---|---|
| 3-B1-99 | 1 | 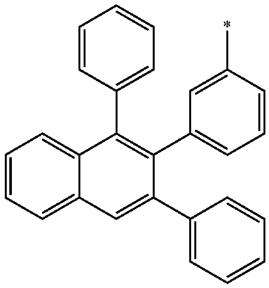 [SMILES: *c1cccc(-c2c(-c3ccccc3)cc3ccccc3c2-c2ccccc2)c1] | 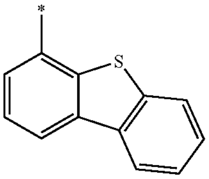 | 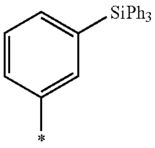 |
[Compound Group 3]
| | n | A—L—* | $Ar_1$ | $Ar_2$ |
|---|---|---|---|---|
| 2-C1-58 | 0 | 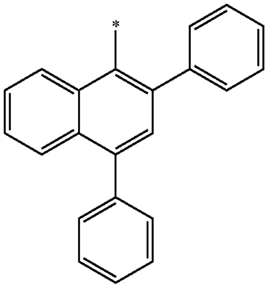 [SMILES: *c1c(-c2ccccc2)cc(-c2ccccc2)c2ccccc12] | 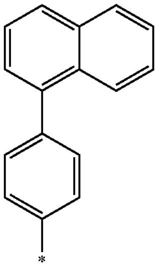 [SMILES: *c1ccc(-c2cccc3ccccc23)cc1] | 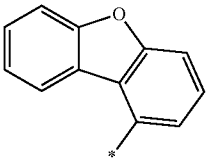 [SMILES: *c1cccc2oc3ccccc3c12] |
| 2-C1-59 | 0 | 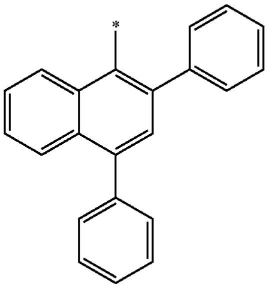 [SMILES: *c1c(-c2ccccc2)cc(-c2ccccc2)c2ccccc12] | 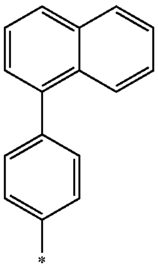 [SMILES: *c1ccc(-c2cccc3ccccc23)cc1] | 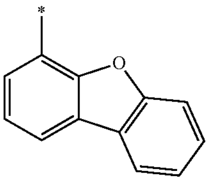 [SMILES: *c1cccc2c1oc1ccccc12] |
| 2-C1-60 | 0 | 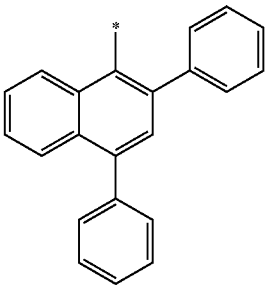 [SMILES: *c1c(-c2ccccc2)cc(-c2ccccc2)c2ccccc12] | 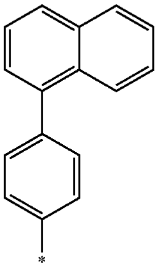 [SMILES: *c1ccc(-c2cccc3ccccc23)cc1] | 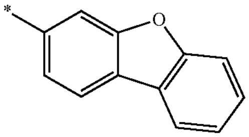 [SMILES: *c1ccc2c(c1)oc1ccccc12] |

-continued
| [Compound Group 3] | | | | |
|---|---|---|---|---|
| | n | A—L—* | $Ar_1$ | $Ar_2$ |
| 2-C1-61 | 0 | 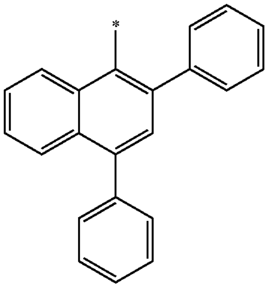 [SMILES: *c1c(-c2ccccc2)cc(-c2ccccc2)c2ccccc12] | 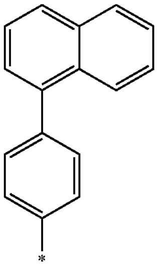 [SMILES: *c1ccc(-c2cccc3ccccc23)cc1] | 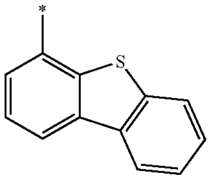 |
| 2-C1-65 | 0 | 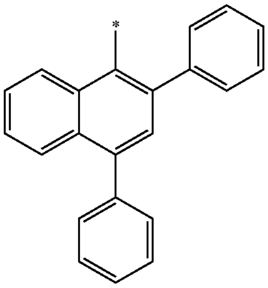 [SMILES: *c1c(-c2ccccc2)cc(-c2ccccc2)c2ccccc12] | 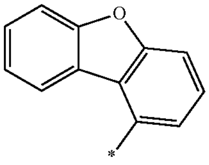 [SMILES: *c1cccc2oc3ccccc3c12] | 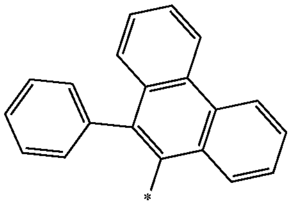 [SMILES: *c1c(-c2ccccc2)c2ccccc2c2ccccc12] |
| 2-C1-66 | 0 | 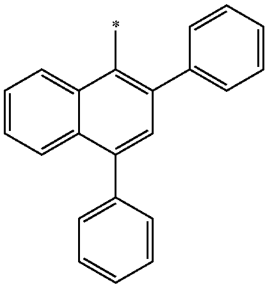 [SMILES: *c1c(-c2ccccc2)cc(-c2ccccc2)c2ccccc12] | 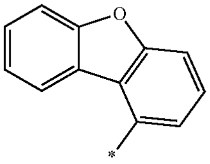 [SMILES: *c1cccc2oc3ccccc3c12] | 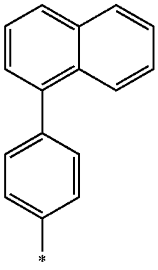 [SMILES: *c1ccc(-c2cccc3ccccc23)cc1] |
| 2-C1-67 | 0 | 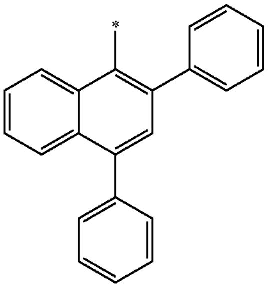 [SMILES: *c1c(-c2ccccc2)cc(-c2ccccc2)c2ccccc12] | 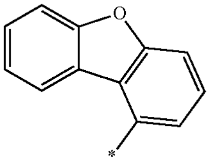 [SMILES: *c1cccc2oc3ccccc3c12] | 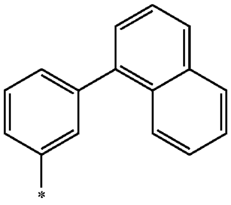 [SMILES: *c1cccc(-c2cccc3ccccc23)c1] |
| 2-C1-68 | 0 | 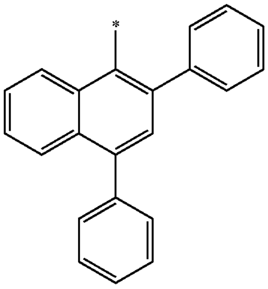 [SMILES: *c1c(-c2ccccc2)cc(-c2ccccc2)c2ccccc12] | 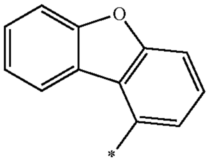 [SMILES: *c1cccc2oc3ccccc3c12] | 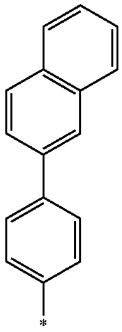 [SMILES: *c1ccc(-c2ccc3ccccc3c2)cc1] |

-continued
[Compound Group 3]
| | n | A—L—* | $Ar_1$ | $Ar_2$ |
|---|---|---|---|---|
| 2-C1-69 | 0 | 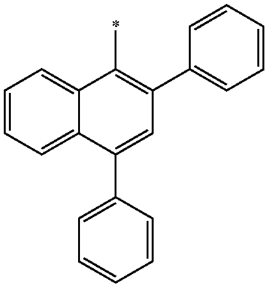 [SMILES: *c1c(-c2ccccc2)cc(-c2ccccc2)c2ccccc12] | 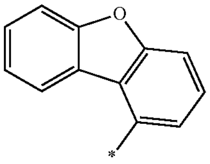 [SMILES: *c1cccc2oc3ccccc3c12] | 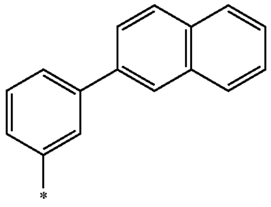 |
| 2-C1-70 | 0 | 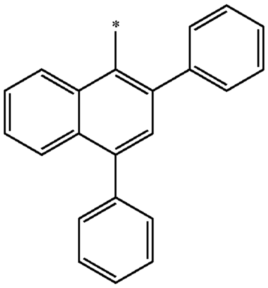 [SMILES: *c1c(-c2ccccc2)cc(-c2ccccc2)c2ccccc12] | 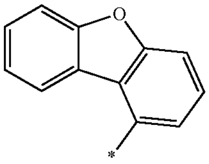 [SMILES: *c1cccc2oc3ccccc3c12] | 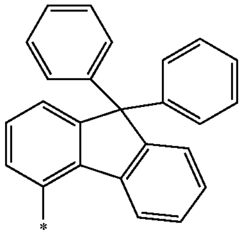 [SMILES: *c1cccc2c1-c1ccccc1C2(c1ccccc1)c1ccccc1] |
| 2-C1-71 | 0 | 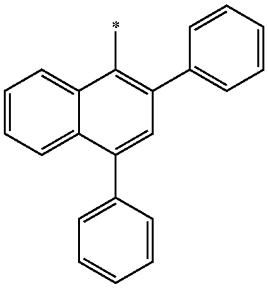 [SMILES: *c1c(-c2ccccc2)cc(-c2ccccc2)c2ccccc12] | 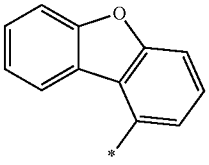 [SMILES: *c1cccc2oc3ccccc3c12] | 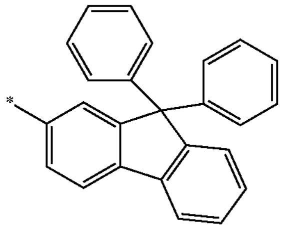 [SMILES: *c1ccc2c(c1)C(c1ccccc1)(c1ccccc1)c1ccccc1-2] |
| 2-C1-76 | 0 | 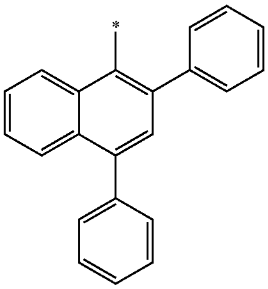 [SMILES: *c1c(-c2ccccc2)cc(-c2ccccc2)c2ccccc12] | 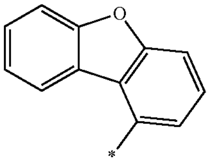 [SMILES: *c1cccc2oc3ccccc3c12] | 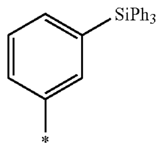 |
| 2-C1-78 | 0 | 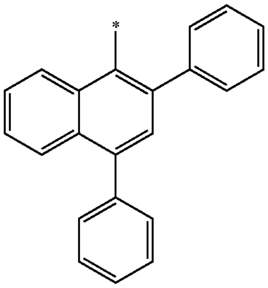 [SMILES: *c1c(-c2ccccc2)cc(-c2ccccc2)c2ccccc12] | 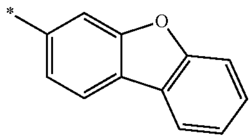 | 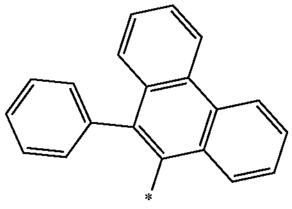 [SMILES: *c1c(-c2ccccc2)c2ccccc2c2ccccc12] |

-continued
[Compound Group 3]
| | n | A—L—* | $Ar_1$ | $Ar_2$ |
|---|---|---|---|---|
| 2-C1-79 | 0 | 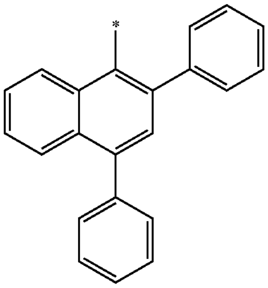 [SMILES: *c1c(-c2ccccc2)cc(-c2ccccc2)c2ccccc12] | 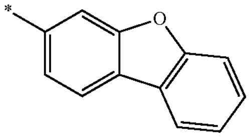 [SMILES: *c1ccc2c(c1)oc1ccccc12] | 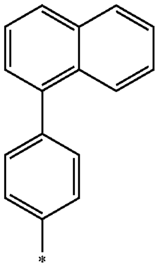 [SMILES: *c1ccc(-c2cccc3ccccc23)cc1] |
| 2-C1-80 | 0 | 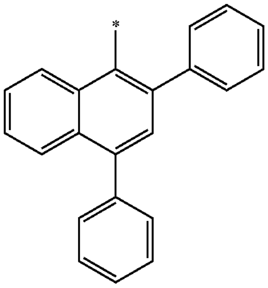 [SMILES: *c1c(-c2ccccc2)cc(-c2ccccc2)c2ccccc12] | 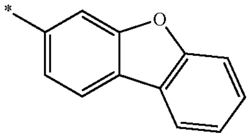 [SMILES: *c1ccc2c(c1)oc1ccccc12] | 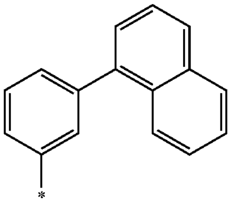 [SMILES: *c1cccc(-c2cccc3ccccc23)c1] |
| 2-C1-81 | 0 | 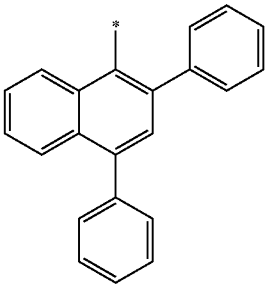 [SMILES: *c1c(-c2ccccc2)cc(-c2ccccc2)c2ccccc12] | 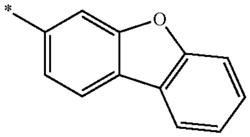 [SMILES: *c1ccc2c(c1)oc1ccccc12] | 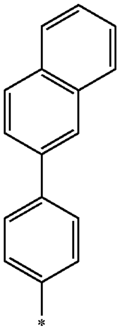 [SMILES: *c1ccc(-c2ccc3ccccc3c2)cc1] |
| 2-C1-82 | 0 | 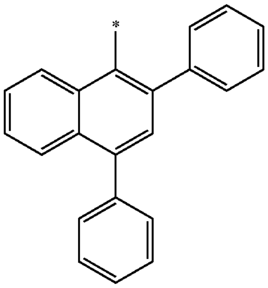 [SMILES: *c1c(-c2ccccc2)cc(-c2ccccc2)c2ccccc12] | 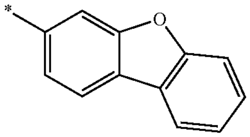 [SMILES: *c1ccc2c(c1)oc1ccccc12] | 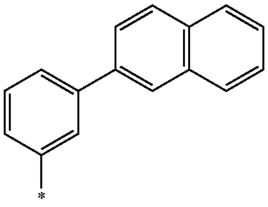 [SMILES: *c1cccc(-c2ccc3ccccc3c2)c1] |
| 2-C1-83 | 0 | 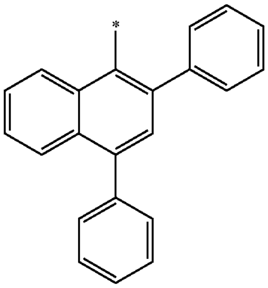 [SMILES: *c1c(-c2ccccc2)cc(-c2ccccc2)c2ccccc12] | 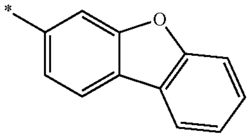 [SMILES: *c1ccc2c(c1)oc1ccccc12] | 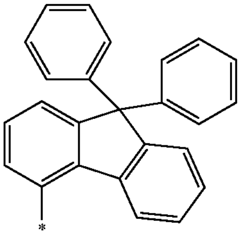 [SMILES: *c1cccc2c1-c1ccccc1C2(c1ccccc1)c1ccccc1] |

-continued
[Compound Group 3]
| | n | A—L—* | $Ar_1$ | $Ar_2$ |
|---|---|---|---|---|
| 2-C1-84 | 0 | 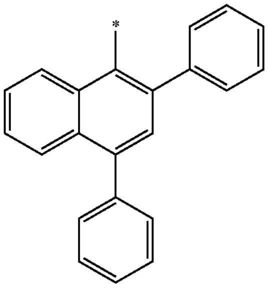 [SMILES: *c1c(-c2ccccc2)cc(-c2ccccc2)c2ccccc12] | 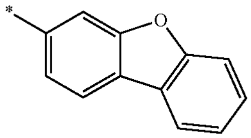 [SMILES: *c1ccc2c(c1)oc1ccccc12] | 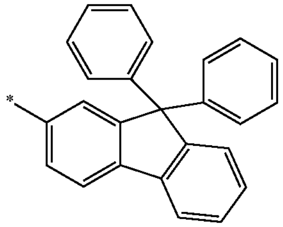 [SMILES: *c1ccc2c(c1)C(c1ccccc1)(c1ccccc1)c1ccccc1-2] |
| 2-C1-88 | 0 | 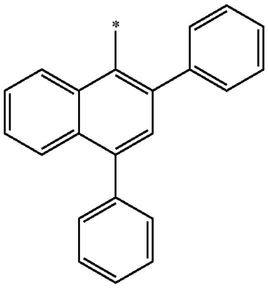 [SMILES: *c1c(-c2ccccc2)cc(-c2ccccc2)c2ccccc12] | 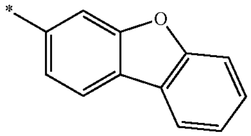 [SMILES: *c1ccc2c(c1)oc1ccccc12] | 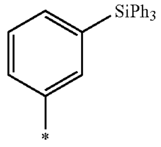 |
| 2-C1-90 | 0 | 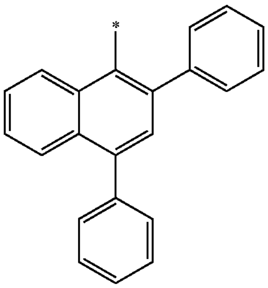 [SMILES: *c1c(-c2ccccc2)cc(-c2ccccc2)c2ccccc12] | 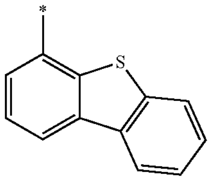 | 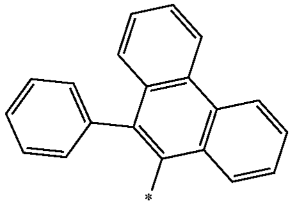 [SMILES: *c1c(-c2ccccc2)c2ccccc2c2ccccc12] |
| 2-C1-91 | 0 | 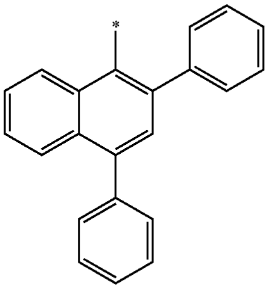 [SMILES: *c1c(-c2ccccc2)cc(-c2ccccc2)c2ccccc12] | 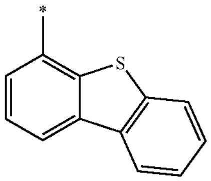 | 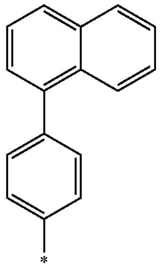 [SMILES: *c1ccc(-c2cccc3ccccc23)cc1] |
| 2-C1-92 | 0 | 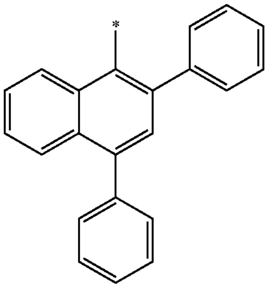 [SMILES: *c1c(-c2ccccc2)cc(-c2ccccc2)c2ccccc12] | 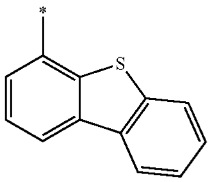 | 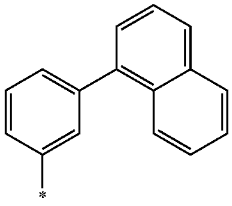 |

-continued
[Compound Group 3]
| | n | A—L—* | $Ar_1$ | $Ar_2$ |
|---|---|---|---|---|
| 2-C1-93 | 0 | 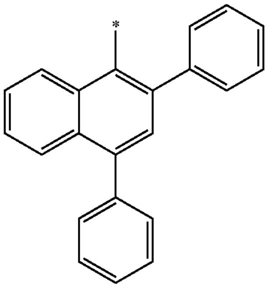 [SMILES: *c1c(-c2ccccc2)cc(-c2ccccc2)c2ccccc12] | 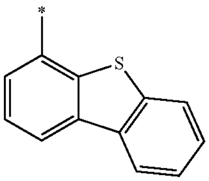 | 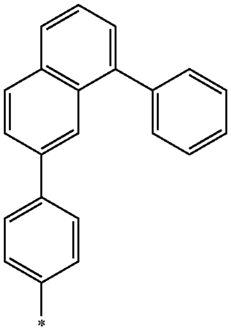 [SMILES: *c1ccc(-c2ccc3cccc(-c4ccccc4)c3c2)cc1] |
| 2-C1-94 | 0 | 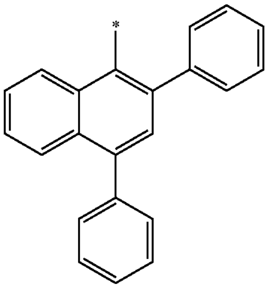 [SMILES: *c1c(-c2ccccc2)cc(-c2ccccc2)c2ccccc12] | 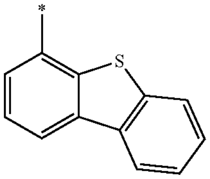 | 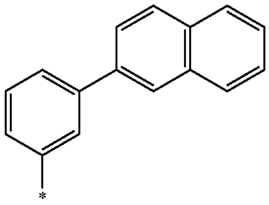 [SMILES: *c1cccc(-c2ccc3ccccc3c2)c1] |
| 2-C1-95 | 0 | 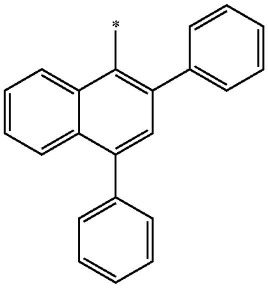 [SMILES: *c1c(-c2ccccc2)cc(-c2ccccc2)c2ccccc12] | 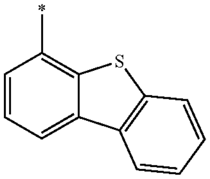 | 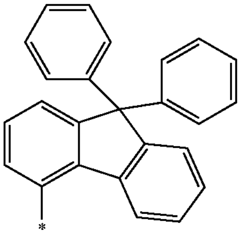 [SMILES: *c1cccc2c1-c1ccccc1C2(c1ccccc1)c1ccccc1] |
| 2-C1-96 | 0 | 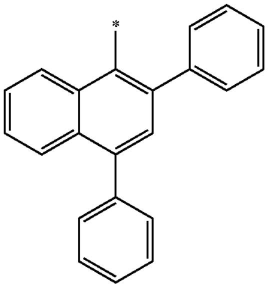 [SMILES: *c1c(-c2ccccc2)cc(-c2ccccc2)c2ccccc12] | 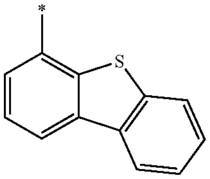 | 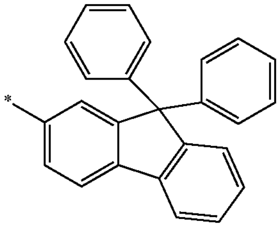 [SMILES: *c1ccc2c(c1)C(c1ccccc1)(c1ccccc1)c1ccccc1-2] |
| 2-C1-99 | 0 | 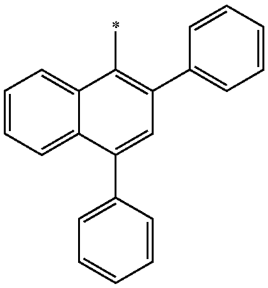 [SMILES: *c1c(-c2ccccc2)cc(-c2ccccc2)c2ccccc12] | 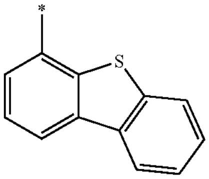 [SMILES: *c1cccc2c1sc1ccccc12] | 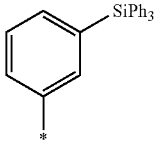 |

-continued
[Compound Group 3]
| | n | A—L—* | $Ar_1$ | $Ar_2$ |
|---|---|---|---|---|
| 3-C1-50 | 0 | 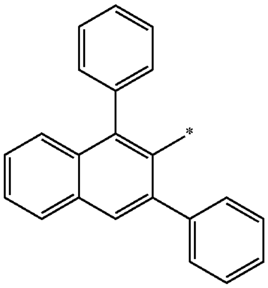 [SMILES: *c1c(-c2ccccc2)cc2ccccc2c1-c1ccccc1] | 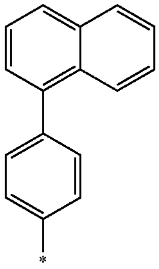 [SMILES: *c1ccc(-c2cccc3ccccc23)cc1] | 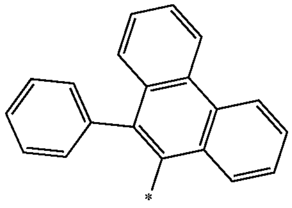 [SMILES: *c1c(-c2ccccc2)c2ccccc2c2ccccc12] |
| 3-C1-51 | 0 | 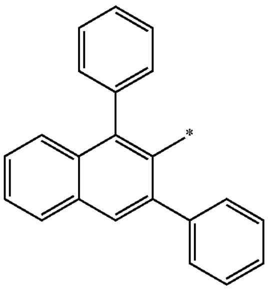 [SMILES: *c1c(-c2ccccc2)cc2ccccc2c1-c1ccccc1] | 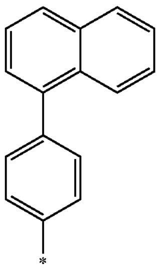 [SMILES: *c1ccc(-c2cccc3ccccc23)cc1] | 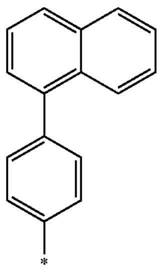 [SMILES: *c1ccc(-c2cccc3ccccc23)cc1] |
| 3-C1-52 | 0 | 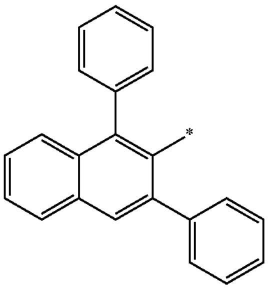 [SMILES: *c1c(-c2ccccc2)cc2ccccc2c1-c1ccccc1] | 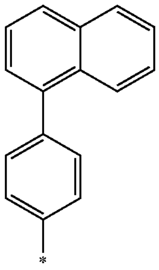 [SMILES: *c1ccc(-c2cccc3ccccc23)cc1] | 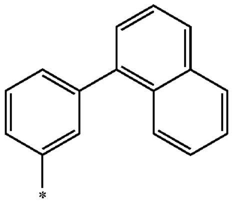 [SMILES: *c1cccc(-c2cccc3ccccc23)c1] |
| 3-C1-53 | 0 | 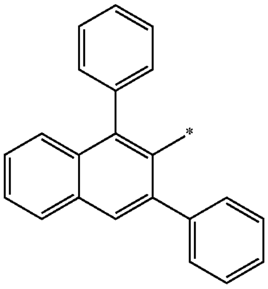 [SMILES: *c1c(-c2ccccc2)cc2ccccc2c1-c1ccccc1] | 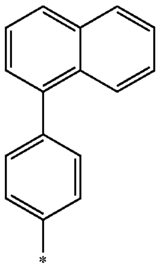 [SMILES: *c1ccc(-c2cccc3ccccc23)cc1] | 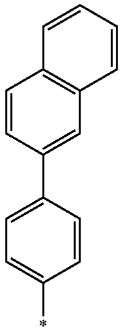 [SMILES: *c1ccc(-c2ccc3ccccc3c2)cc1] |
| 3-C1-54 | 0 | 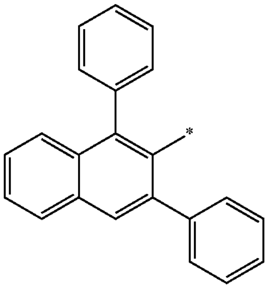 [SMILES: *c1c(-c2ccccc2)cc2ccccc2c1-c1ccccc1] | 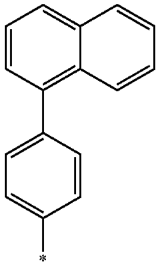 [SMILES: *c1ccc(-c2cccc3ccccc23)cc1] | 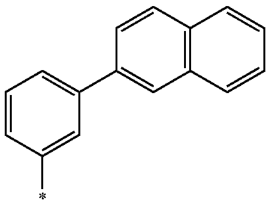 |

-continued
[Compound Group 3]
| | n | A—L—* | $Ar_1$ | $Ar_2$ |
| --- | --- | --- | --- | --- |
| 3-C1-55 | 0 | 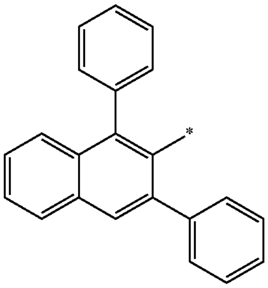 [SMILES: *c1c(-c2ccccc2)cc2ccccc2c1-c1ccccc1] | 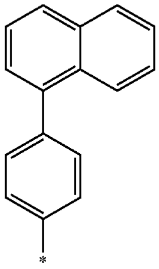 [SMILES: *c1ccc(-c2cccc3ccccc23)cc1] | 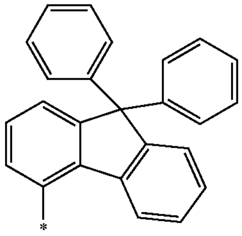 [SMILES: *c1cccc2c1-c1ccccc1C2(c1ccccc1)c1ccccc1] |
| 3-C1-56 | 0 | 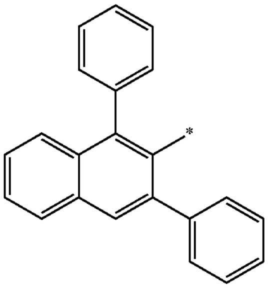 [SMILES: *c1c(-c2ccccc2)cc2ccccc2c1-c1ccccc1] | 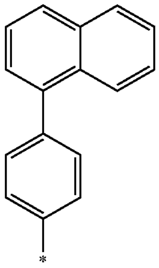 [SMILES: *c1ccc(-c2cccc3ccccc23)cc1] | 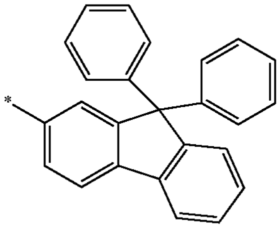 [SMILES: *c1ccc2c(c1)C(c1ccccc1)(c1ccccc1)c1ccccc1-2] |
| 3-C1-58 | 0 | 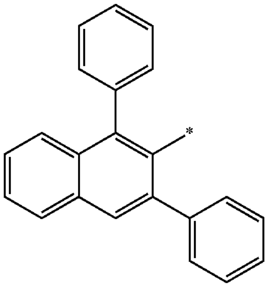 [SMILES: *c1c(-c2ccccc2)cc2ccccc2c1-c1ccccc1] | 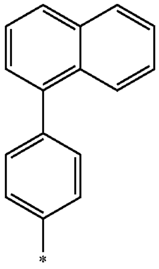 [SMILES: *c1ccc(-c2cccc3ccccc23)cc1] | 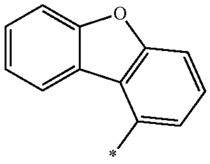 [SMILES: *c1cccc2oc3ccccc3c12] |
| 3-C1-59 | 0 | 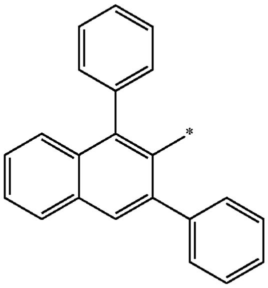 [SMILES: *c1c(-c2ccccc2)cc2ccccc2c1-c1ccccc1] | 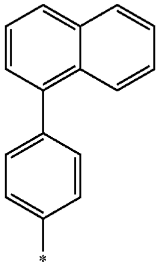 [SMILES: *c1ccc(-c2cccc3ccccc23)cc1] | 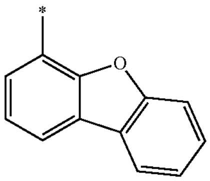 [SMILES: *c1cccc2c1oc1ccccc12] |
| 3-C1-60 | 0 | 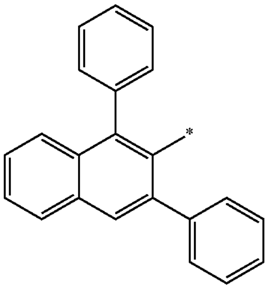 [SMILES: *c1c(-c2ccccc2)cc2ccccc2c1-c1ccccc1] | 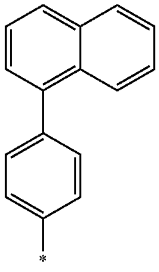 [SMILES: *c1ccc(-c2cccc3ccccc23)cc1] | 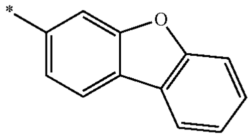 [SMILES: *c1ccc2c(c1)oc1ccccc12] |

-continued
[Compound Group 3]
| | n | A—L—* | $Ar_1$ | $Ar_2$ |
|---|---|---|---|---|
| 3-C-61 | 0 | 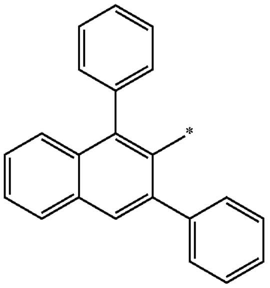 | 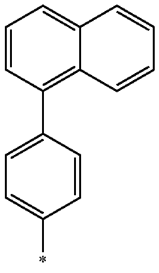 [SMILES: *c1ccc(-c2cccc3ccccc23)cc1] | 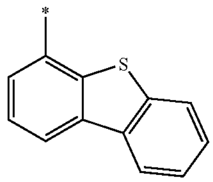 |
| 3-C-62 | 0 | 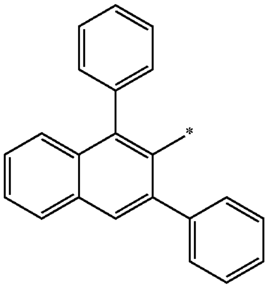 [SMILES: *c1c(-c2ccccc2)cc2ccccc2c1-c1ccccc1] | 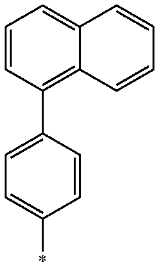 [SMILES: *c1ccc(-c2cccc3ccccc23)cc1] | 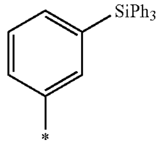 |
| 3-C-65 | 0 | 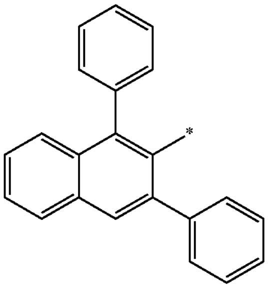 [SMILES: *c1c(-c2ccccc2)cc2ccccc2c1-c1ccccc1] | 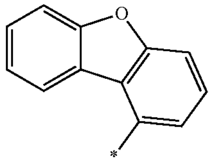 [SMILES: *c1cccc2oc3ccccc3c12] | 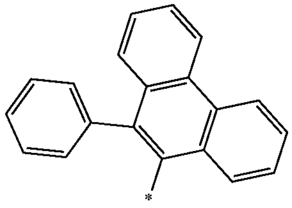 [SMILES: *c1c(-c2ccccc2)c2ccccc2c2ccccc12] |
| 3-C-66 | 0 | 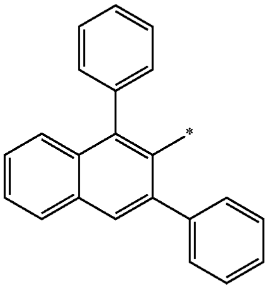 [SMILES: *c1c(-c2ccccc2)cc2ccccc2c1-c1ccccc1] | 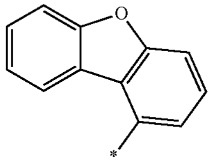 [SMILES: *c1cccc2oc3ccccc3c12] | 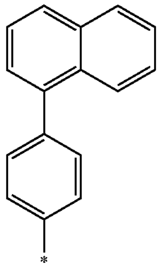 [SMILES: *c1ccc(-c2cccc3ccccc23)cc1] |
| 3-C-67 | 0 | 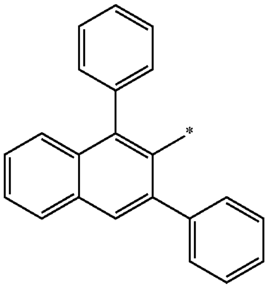 [SMILES: *c1c(-c2ccccc2)cc2ccccc2c1-c1ccccc1] | 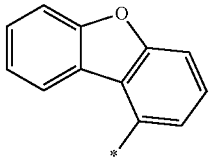 [SMILES: *c1cccc2oc3ccccc3c12] | 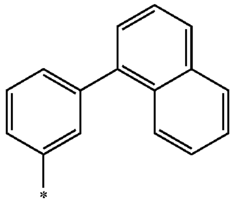 [SMILES: *c1cccc(-c2cccc3ccccc23)c1] |

-continued
[Compound Group 3]
| | n | A—L—* | $Ar_1$ | $Ar_2$ |
|---|---|---|---|---|
| 3-C1-68 | 0 | 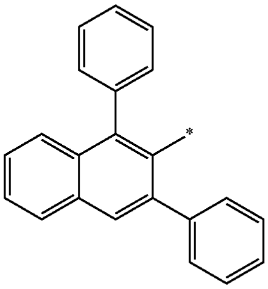 [SMILES: *c1c(-c2ccccc2)cc2ccccc2c1-c1ccccc1] | 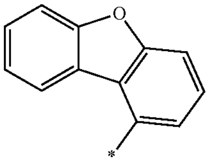 [SMILES: *c1cccc2oc3ccccc3c12] | 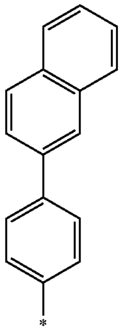 [SMILES: *c1ccc(-c2ccc3ccccc3c2)cc1] |
| 3-C1-69 | 0 | 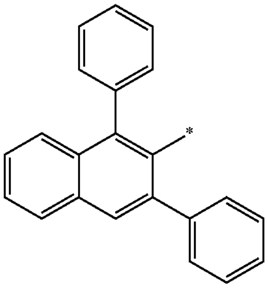 [SMILES: *c1c(-c2ccccc2)cc2ccccc2c1-c1ccccc1] | 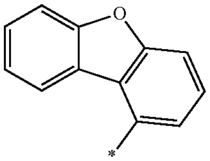 [SMILES: *c1cccc2oc3ccccc3c12] | 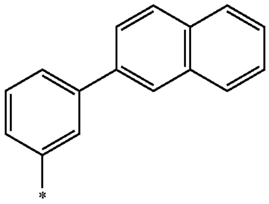 |
| 3-C1-70 | 0 | 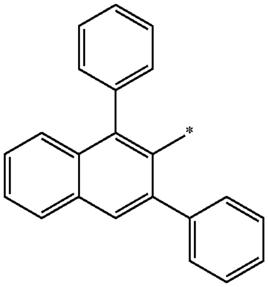 [SMILES: *c1c(-c2ccccc2)cc2ccccc2c1-c1ccccc1] | 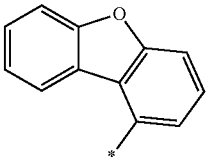 [SMILES: *c1cccc2oc3ccccc3c12] | 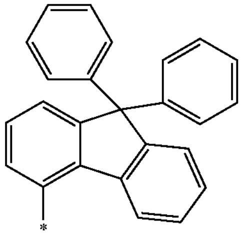 [SMILES: *c1cccc2c1-c1ccccc1C2(c1ccccc1)c1ccccc1] |
| 3-C1-71 | 0 | 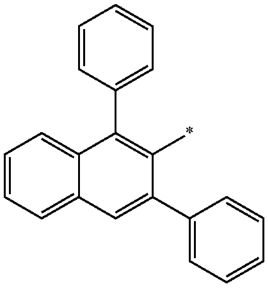 [SMILES: *c1c(-c2ccccc2)cc2ccccc2c1-c1ccccc1] | 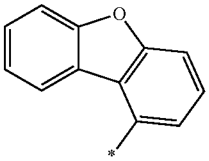 [SMILES: *c1cccc2oc3ccccc3c12] | 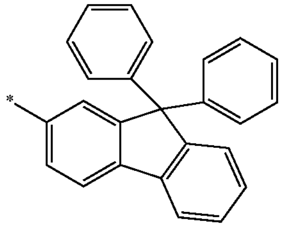 [SMILES: *c1ccc2c(c1)C(c1ccccc1)(c1ccccc1)c1ccccc1-2] |
| 3-C1-76 | 0 | 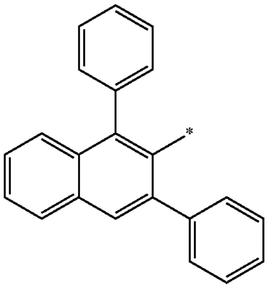 [SMILES: *c1c(-c2ccccc2)cc2ccccc2c1-c1ccccc1] | 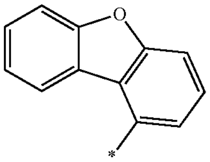 [SMILES: *c1cccc2oc3ccccc3c12] | 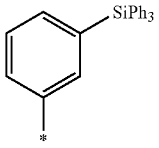 |

-continued
[Compound Group 3]
| | n | A—L—* | $Ar_1$ | $Ar_2$ |
|---|---|---|---|---|
| 3-C1-78 | 0 | 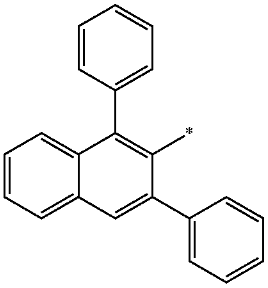 [SMILES: *c1c(-c2ccccc2)cc2ccccc2c1-c1ccccc1] | 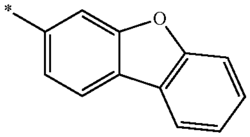 [SMILES: *c1ccc2c(c1)oc1ccccc12] | 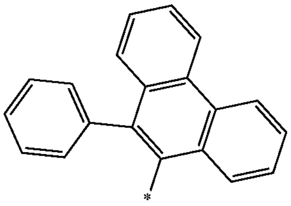 [SMILES: *c1c(-c2ccccc2)c2ccccc2c2ccccc12] |
| 3-C1-79 | 0 | 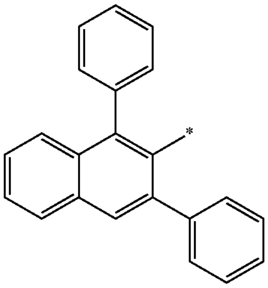 [SMILES: *c1c(-c2ccccc2)cc2ccccc2c1-c1ccccc1] | 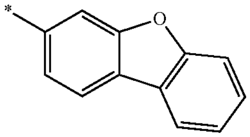 [SMILES: *c1ccc2c(c1)oc1ccccc12] | 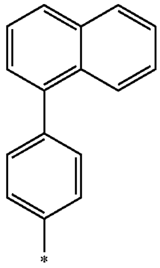 [SMILES: *c1ccc(-c2cccc3ccccc23)cc1] |
| 3-C1-80 | 0 | 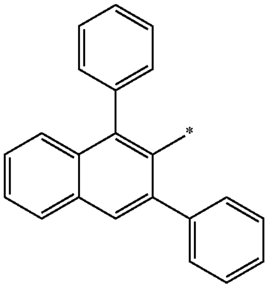 [SMILES: *c1c(-c2ccccc2)cc2ccccc2c1-c1ccccc1] | 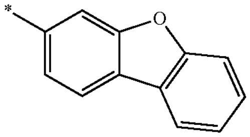 [SMILES: *c1ccc2c(c1)oc1ccccc12] | 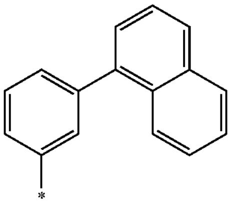 |
| 3-C1-81 | 0 | 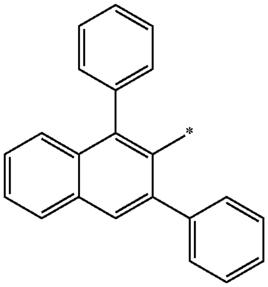 [SMILES: *c1c(-c2ccccc2)cc2ccccc2c1-c1ccccc1] | 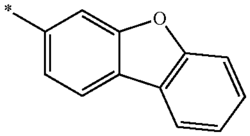 [SMILES: *c1ccc2c(c1)oc1ccccc12] | 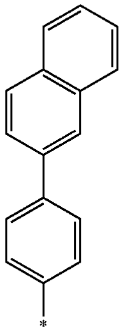 [SMILES: *c1ccc(-c2ccc3ccccc3c2)cc1] |
| 3-C1-82 | 0 | 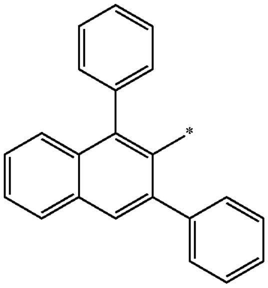 [SMILES: *c1c(-c2ccccc2)cc2ccccc2c1-c1ccccc1] | 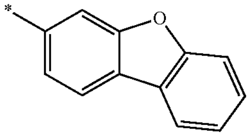 [SMILES: *c1ccc2c(c1)oc1ccccc12] | 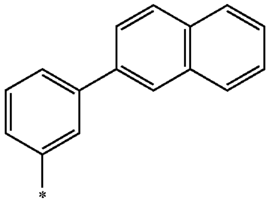 [SMILES: *c1cccc(-c2ccc3ccccc3c2)c1] |

-continued
| [Compound Group 3] | | | | |
|---|---|---|---|---|
| | n | A—L—* | $Ar_1$ | $Ar_2$ |
| 3-C1-83 | 0 | 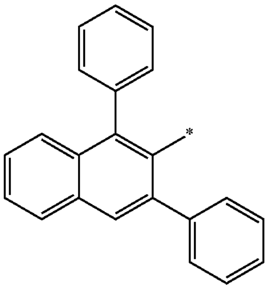 [SMILES: *c1c(-c2ccccc2)cc2ccccc2c1-c1ccccc1] | 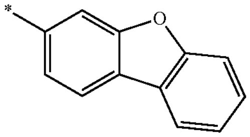 [SMILES: *c1ccc2c(c1)oc1ccccc12] | 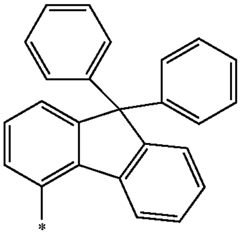 [SMILES: *c1cccc2c1-c1ccccc1C2(c1ccccc1)c1ccccc1] |
| 3-C1-84 | 0 | 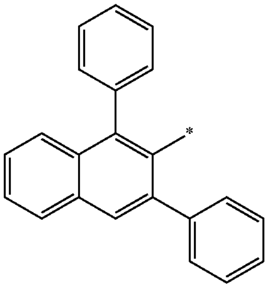 [SMILES: *c1c(-c2ccccc2)cc2ccccc2c1-c1ccccc1] | 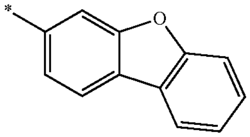 [SMILES: *c1ccc2c(c1)oc1ccccc12] | 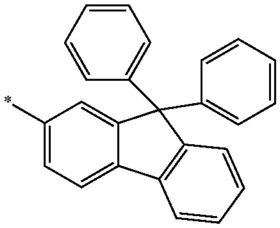 [SMILES: *c1ccc2c(c1)C(c1ccccc1)(c1ccccc1)c1ccccc1-2] |
| 3-C1-88 | 0 | 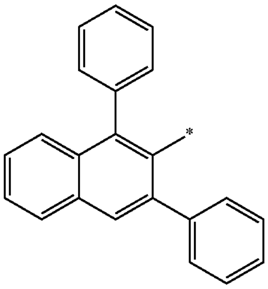 [SMILES: *c1c(-c2ccccc2)cc2ccccc2c1-c1ccccc1] | 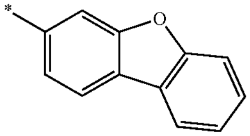 [SMILES: *c1ccc2c(c1)oc1ccccc12] | 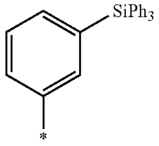 |
| 3-C1-90 | 0 | 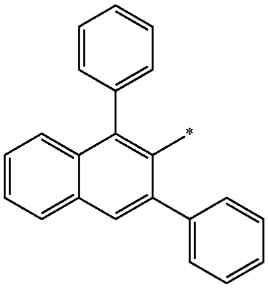 [SMILES: *c1c(-c2ccccc2)cc2ccccc2c1-c1ccccc1] | 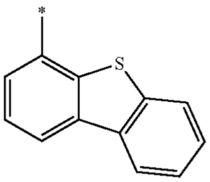 | 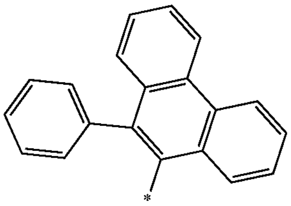 [SMILES: *c1c(-c2ccccc2)c2ccccc2c2ccccc12] |
| 3-C1-91 | 0 | 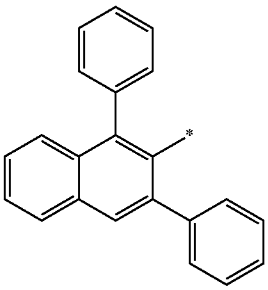 [SMILES: *c1c(-c2ccccc2)cc2ccccc2c1-c1ccccc1] | 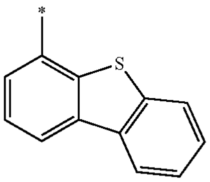 [SMILES: *c1cccc2c1sc1ccccc12] | 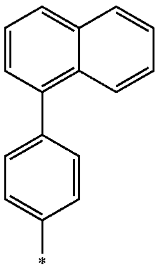 [SMILES: *c1ccc(-c2cccc3ccccc23)cc1] |

-continued
[Compound Group 3]
| | n | A—L—* | $Ar_1$ | $Ar_2$ |
|---|---|---|---|---|
| 3-C1-92 | 0 | 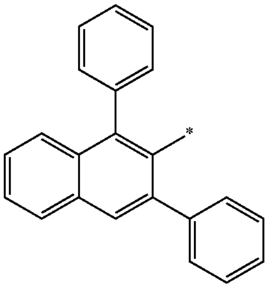 [SMILES: *c1c(-c2ccccc2)cc2ccccc2c1-c1ccccc1] | 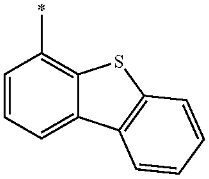 | 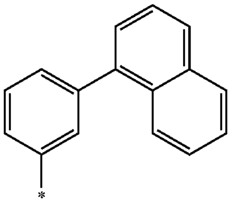 [SMILES: *c1cccc(-c2cccc3ccccc23)c1] |
| 3-C1-93 | 0 | 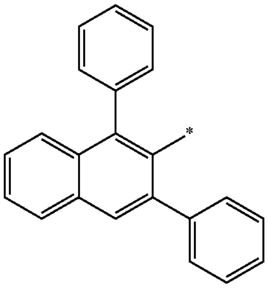 [SMILES: *c1c(-c2ccccc2)cc2ccccc2c1-c1ccccc1] | 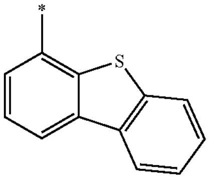 | 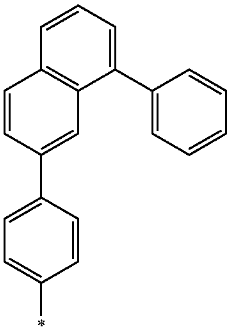 [SMILES: *c1ccc(-c2ccc3cccc(-c4ccccc4)c3c2)cc1] |
| 3-C1-94 | 0 | 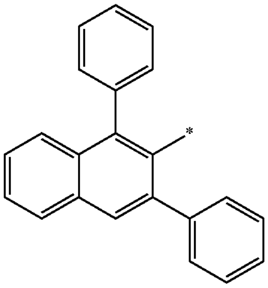 [SMILES: *c1c(-c2ccccc2)cc2ccccc2c1-c1ccccc1] | 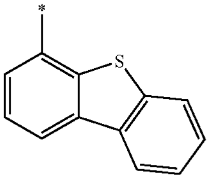 | 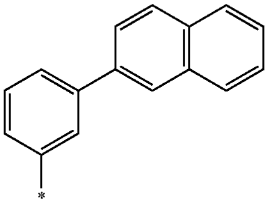 [SMILES: *c1cccc(-c2ccc3ccccc3c2)c1] |
| 3-C1-95 | 0 | 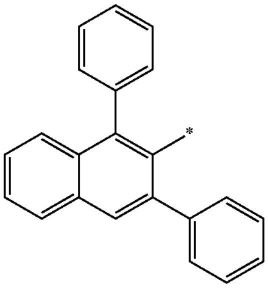 [SMILES: *c1c(-c2ccccc2)cc2ccccc2c1-c1ccccc1] | 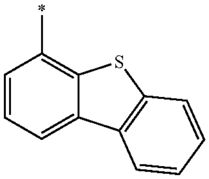 | 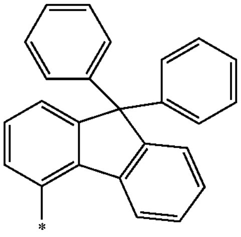 [SMILES: *c1cccc2c1-c1ccccc1C2(c1ccccc1)c1ccccc1] |
| 3-C1-96 | 0 | 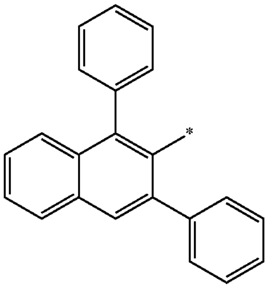 [SMILES: *c1c(-c2ccccc2)cc2ccccc2c1-c1ccccc1] | 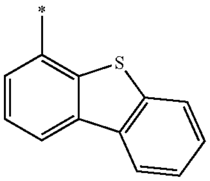 | 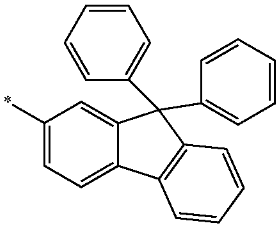 [SMILES: *c1ccc2c(c1)C(c1ccccc1)(c1ccccc1)c1ccccc1-2] |

-continued
| [Compound Group 3] | | | | |
|---|---|---|---|---|
| | n | A—L—* | $Ar_1$ | $Ar_2$ |
| 3-C1-99 | 0 | 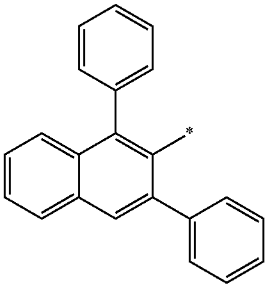 [SMILES: *c1c(-c2ccccc2)cc2ccccc2c1-c1ccccc1] | 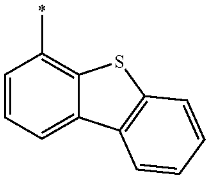 | 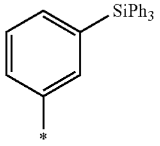 |
| [Compound Group 4] | | | |
|---|---|---|---|
| | n | A-L-* | $Ar_1$ |
| 2-D1-50 | 1 | 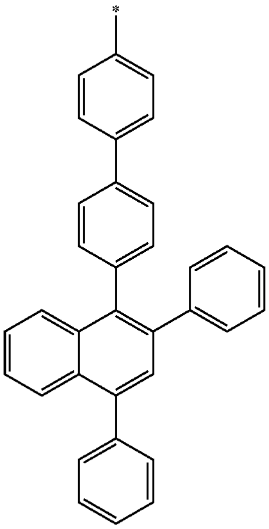 [SMILES: *c1ccc(-c2ccc(-c3c(-c4ccccc4)cc(-c4ccccc4)c4ccccc34)cc2)cc1] | 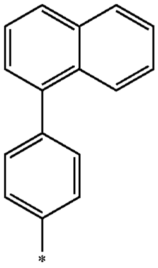 [SMILES: *c1ccc(-c2cccc3ccccc23)cc1] |
| 2-D1-51 | 1 | 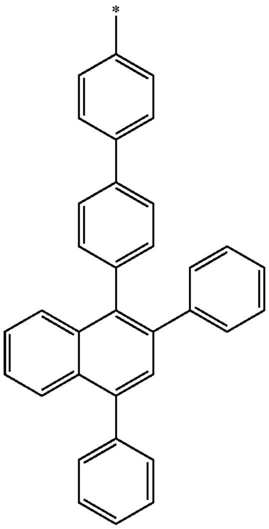 [SMILES: *c1ccc(-c2ccc(-c3c(-c4ccccc4)cc(-c4ccccc4)c4ccccc34)cc2)cc1] | 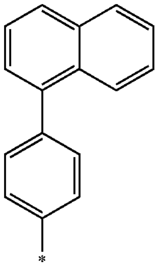 [SMILES: *c1ccc(-c2cccc3ccccc23)cc1] |

-continued
| [Compound Group 4] | | |
|---|---|---|
| 2-D1-52 1 | 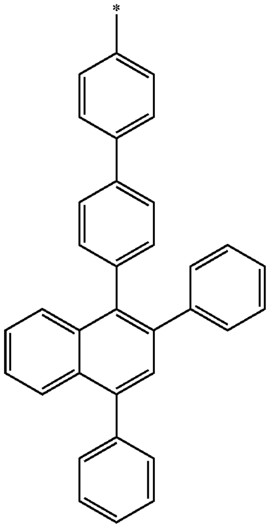 [SMILES: *c1ccc(-c2ccc(-c3c(-c4ccccc4)cc(-c4ccccc4)c4ccccc34)cc2)cc1] | 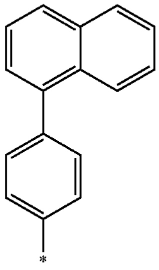 [SMILES: *c1ccc(-c2cccc3ccccc23)cc1] |
| 2-D1-53 1 | 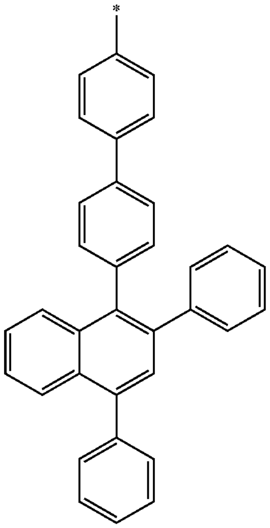 [SMILES: *c1ccc(-c2ccc(-c3c(-c4ccccc4)cc(-c4ccccc4)c4ccccc34)cc2)cc1] | 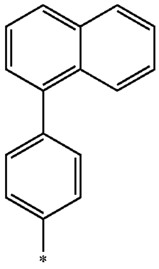 [SMILES: *c1ccc(-c2cccc3ccccc23)cc1] |
| 2-D1-54 1 | 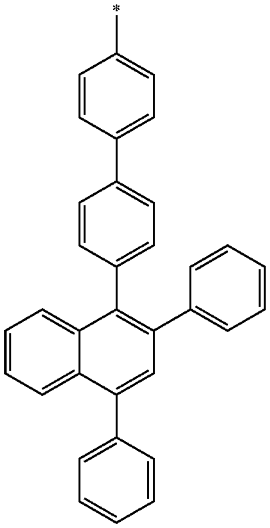 [SMILES: *c1ccc(-c2ccc(-c3c(-c4ccccc4)cc(-c4ccccc4)c4ccccc34)cc2)cc1] | 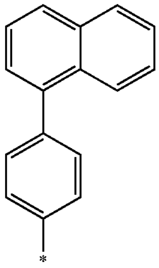 [SMILES: *c1ccc(-c2cccc3ccccc23)cc1] |

-continued
| [Compound Group 4] | | | |
|---|---|---|---|
| 2-D1-55 | 1 | 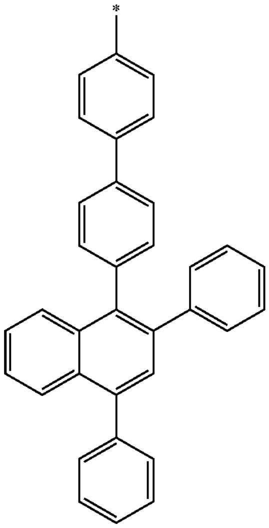 [SMILES: *c1ccc(-c2ccc(-c3c(-c4ccccc4)cc(-c4ccccc4)c4ccccc34)cc2)cc1] | 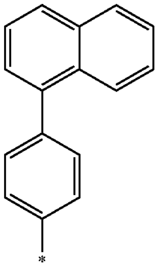 [SMILES: *c1ccc(-c2cccc3ccccc23)cc1] |
| 2-D1-56 | 1 | 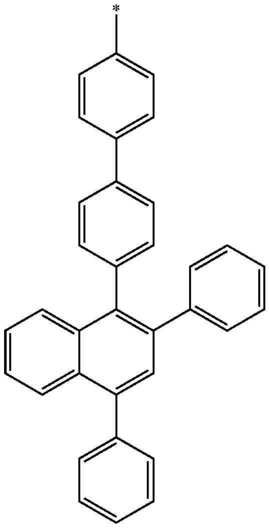 [SMILES: *c1ccc(-c2ccc(-c3c(-c4ccccc4)cc(-c4ccccc4)c4ccccc34)cc2)cc1] | 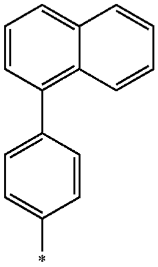 [SMILES: *c1ccc(-c2cccc3ccccc23)cc1] |
| 2-D1-58 | 1 | 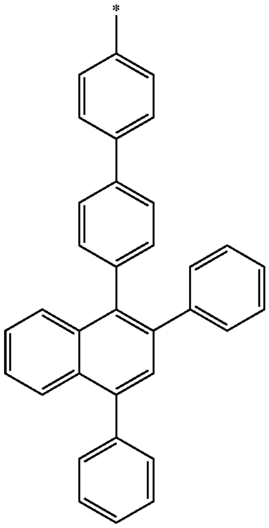 [SMILES: *c1ccc(-c2ccc(-c3c(-c4ccccc4)cc(-c4ccccc4)c4ccccc34)cc2)cc1] | 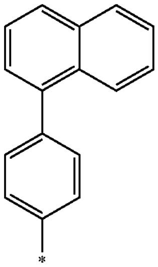 [SMILES: *c1ccc(-c2cccc3ccccc23)cc1] |

-continued
| [Compound Group 4] | | | |
|---|---|---|---|
| 2-D1-59 | 1 | 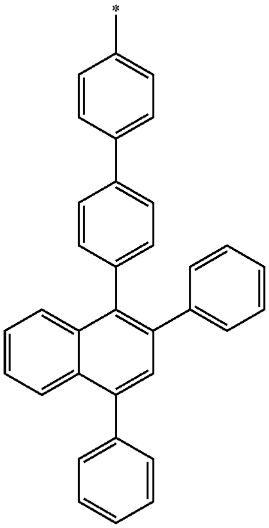 [SMILES: *c1ccc(-c2ccc(-c3c(-c4ccccc4)cc(-c4ccccc4)c4ccccc34)cc2)cc1] | 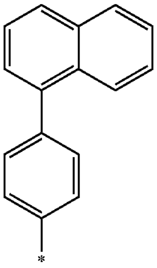 [SMILES: *c1ccc(-c2cccc3ccccc23)cc1] |
| 2-D1-60 | 1 | 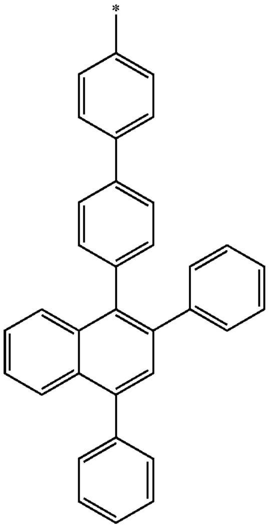 [SMILES: *c1ccc(-c2ccc(-c3c(-c4ccccc4)cc(-c4ccccc4)c4ccccc34)cc2)cc1] | 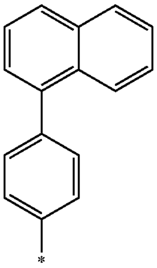 [SMILES: *c1ccc(-c2cccc3ccccc23)cc1] |
| 2-D1-61 | 1 | 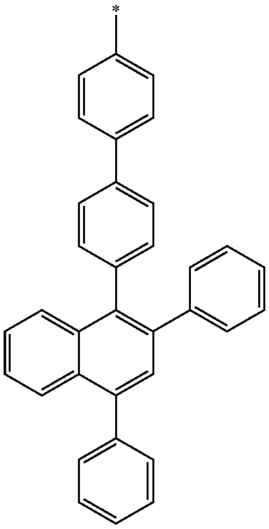 [SMILES: *c1ccc(-c2ccc(-c3c(-c4ccccc4)cc(-c4ccccc4)c4ccccc34)cc2)cc1] | 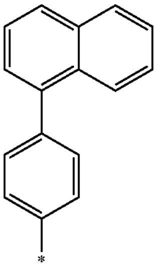 [SMILES: *c1ccc(-c2cccc3ccccc23)cc1] |

-continued
| [Compound Group 4] | | |
|---|---|---|
| 2-D1-62 1 | 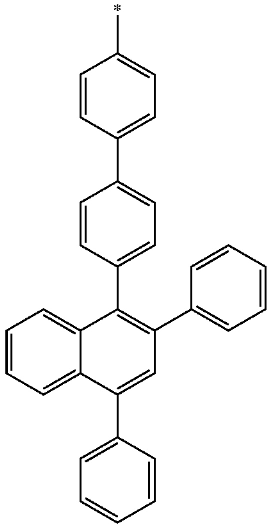 [SMILES: *c1ccc(-c2ccc(-c3c(-c4ccccc4)cc(-c4ccccc4)c4ccccc34)cc2)cc1] | 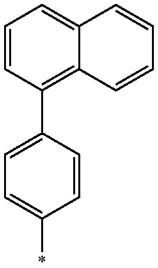 [SMILES: *c1ccc(-c2cccc3ccccc23)cc1] |
| 2-D1-65 1 | 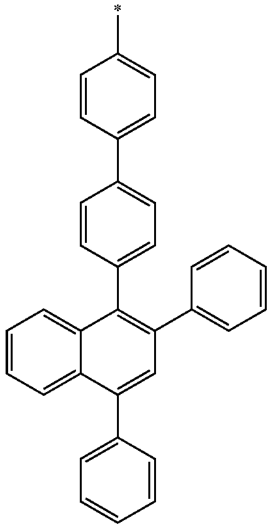 [SMILES: *c1ccc(-c2ccc(-c3c(-c4ccccc4)cc(-c4ccccc4)c4ccccc34)cc2)cc1] | 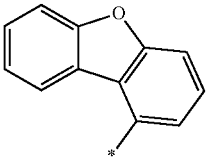 [SMILES: *c1cccc2oc3ccccc3c12] |
| 2-D1-66 1 | 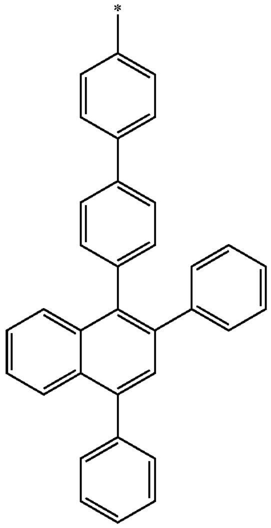 [SMILES: *c1ccc(-c2ccc(-c3c(-c4ccccc4)cc(-c4ccccc4)c4ccccc34)cc2)cc1] | 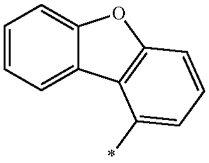 [SMILES: *c1cccc2oc3ccccc3c12] |

-continued
[Compound Group 4]
2-D1-67 1 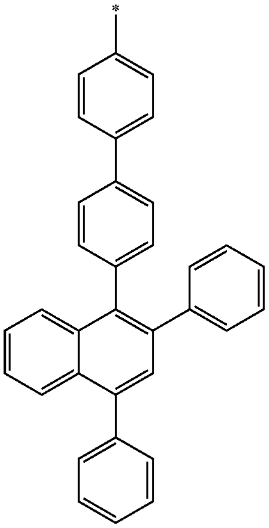 [SMILES: *c1ccc(-c2ccc(-c3c(-c4ccccc4)cc(-c4ccccc4)c4ccccc34)cc2)cc1] 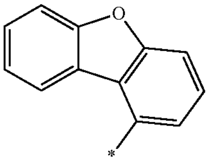 [SMILES: *c1cccc2oc3ccccc3c12]
2-D1-68 1 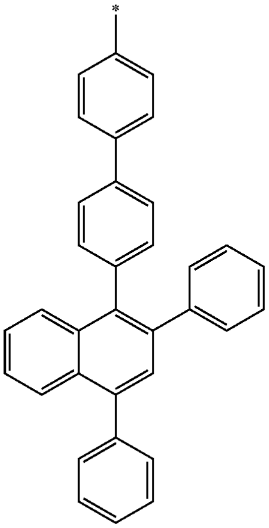 [SMILES: *c1ccc(-c2ccc(-c3c(-c4ccccc4)cc(-c4ccccc4)c4ccccc34)cc2)cc1] 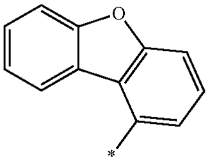 [SMILES: *c1cccc2oc3ccccc3c12]
2-D1-69 1 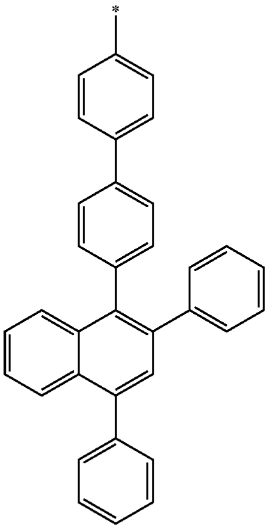 [SMILES: *c1ccc(-c2ccc(-c3c(-c4ccccc4)cc(-c4ccccc4)c4ccccc34)cc2)cc1] 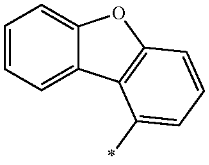 [SMILES: *c1cccc2oc3ccccc3c12]

-continued
| [Compound Group 4] | | | |
|---|---|---|---|
| 2-D1-70 | 1 | 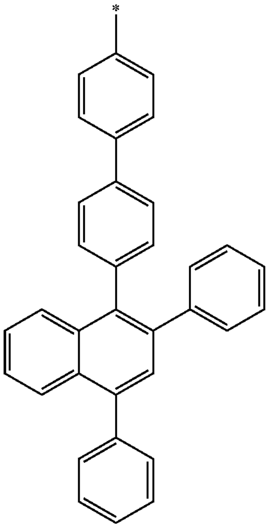 [SMILES: *c1ccc(-c2ccc(-c3c(-c4ccccc4)cc(-c4ccccc4)c4ccccc34)cc2)cc1] | 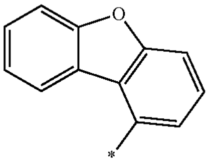 [SMILES: *c1cccc2oc3ccccc3c12] |
| 2-D1-71 | 1 | 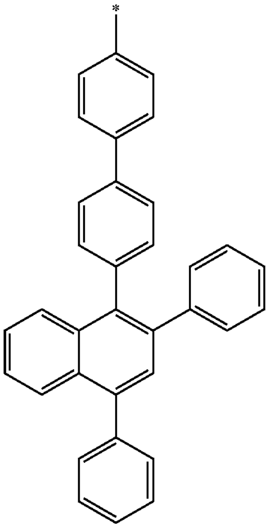 [SMILES: *c1ccc(-c2ccc(-c3c(-c4ccccc4)cc(-c4ccccc4)c4ccccc34)cc2)cc1] | 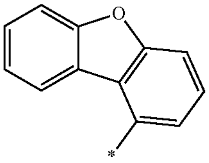 [SMILES: *c1cccc2oc3ccccc3c12] |
| 2-D1-76 | 1 | 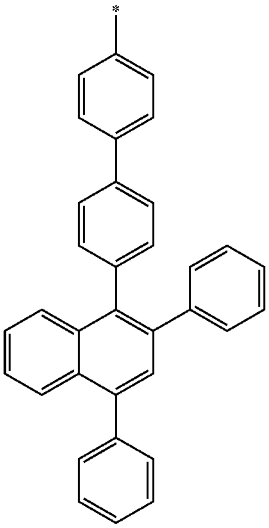 [SMILES: *c1ccc(-c2ccc(-c3c(-c4ccccc4)cc(-c4ccccc4)c4ccccc34)cc2)cc1] | 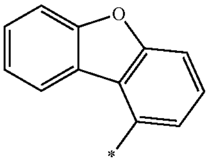 [SMILES: *c1cccc2oc3ccccc3c12] |

-continued
| [Compound Group 4] | | | |
|---|---|---|---|
| 2-D1-78 | 1 | 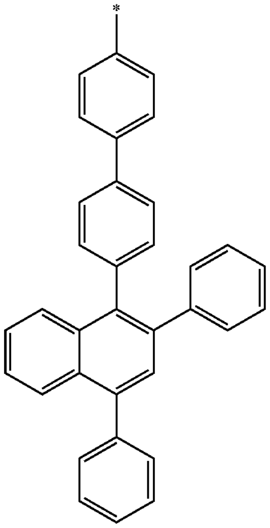 [SMILES: *c1ccc(-c2ccc(-c3c(-c4ccccc4)cc(-c4ccccc4)c4ccccc34)cc2)cc1] | 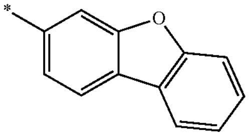 [SMILES: *c1ccc2c(c1)oc1ccccc12] |
| 2-D1-79 | 1 | 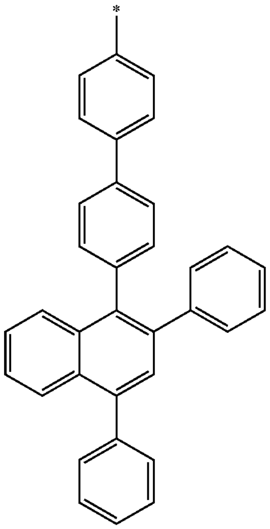 [SMILES: *c1ccc(-c2ccc(-c3c(-c4ccccc4)cc(-c4ccccc4)c4ccccc34)cc2)cc1] | 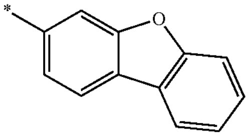 [SMILES: *c1ccc2c(c1)oc1ccccc12] |
| 2-D1-80 | 1 | 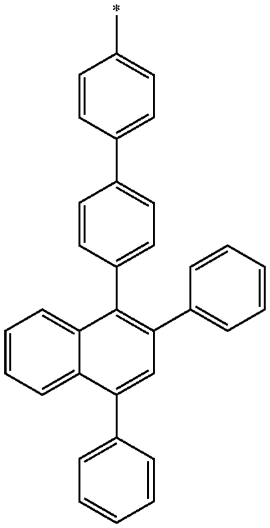 [SMILES: *c1ccc(-c2ccc(-c3c(-c4ccccc4)cc(-c4ccccc4)c4ccccc34)cc2)cc1] | 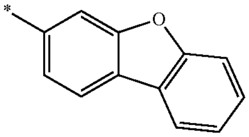 [SMILES: *c1ccc2c(c1)oc1ccccc12] |

-continued
| [Compound Group 4] | | | |
|---|---|---|---|
| 2-D1-81 | 1 | 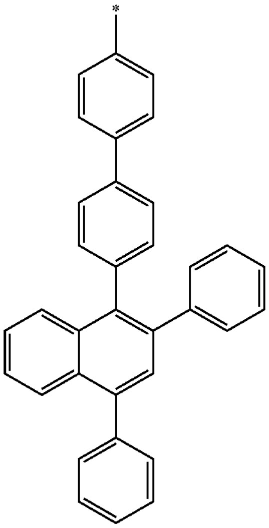 [SMILES: *c1ccc(-c2ccc(-c3c(-c4ccccc4)cc(-c4ccccc4)c4ccccc34)cc2)cc1] | 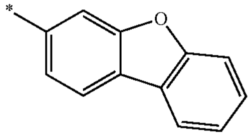 [SMILES: *c1ccc2c(c1)oc1ccccc12] |
| 2-D1-82 | 1 | 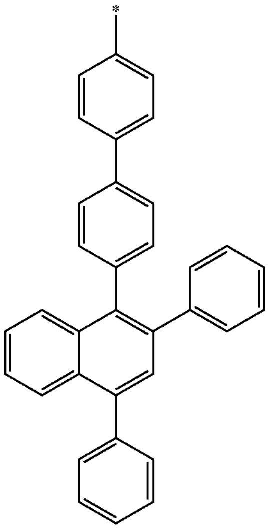 [SMILES: *c1ccc(-c2ccc(-c3c(-c4ccccc4)cc(-c4ccccc4)c4ccccc34)cc2)cc1] | 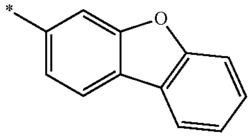 [SMILES: *c1ccc2c(c1)oc1ccccc12] |
| 2-D1-83 | 1 | 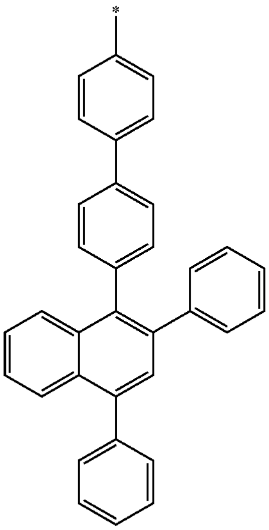 [SMILES: *c1ccc(-c2ccc(-c3c(-c4ccccc4)cc(-c4ccccc4)c4ccccc34)cc2)cc1] | 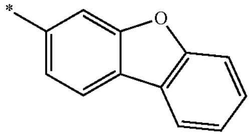 [SMILES: *c1ccc2c(c1)oc1ccccc12] |

-continued
| [Compound Group 4] | | | |
|---|---|---|---|
| 2-D1-84 | 1 | 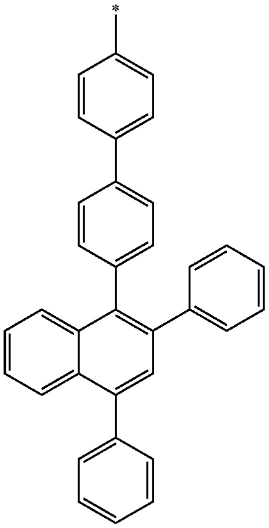 [SMILES: *c1ccc(-c2ccc(-c3c(-c4ccccc4)cc(-c4ccccc4)c4ccccc34)cc2)cc1] | 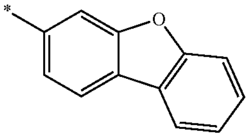 [SMILES: *c1ccc2c(c1)oc1ccccc12] |
| 2-D1-88 | 1 | 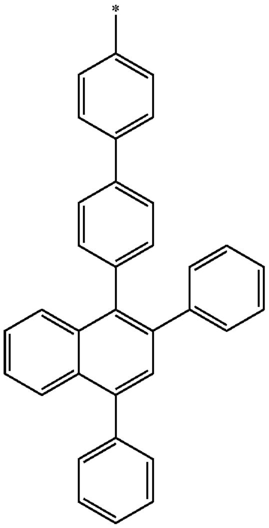 [SMILES: *c1ccc(-c2ccc(-c3c(-c4ccccc4)cc(-c4ccccc4)c4ccccc34)cc2)cc1] | 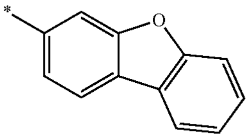 [SMILES: *c1ccc2c(c1)oc1ccccc12] |
| 2-D1-90 | 1 | 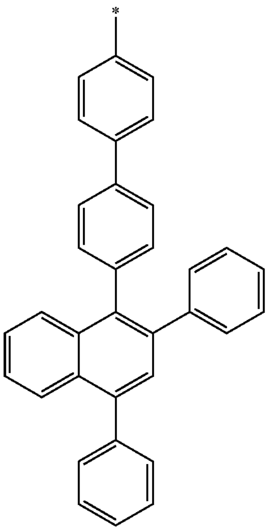 [SMILES: *c1ccc(-c2ccc(-c3c(-c4ccccc4)cc(-c4ccccc4)c4ccccc34)cc2)cc1] | 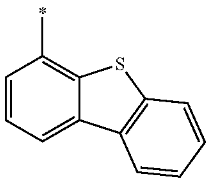 |

-continued
| [Compound Group 4] | | | |
|---|---|---|---|
| 2-D1-91 | 1 | 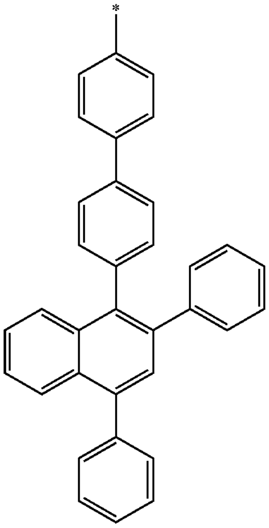 [SMILES: *c1ccc(-c2ccc(-c3c(-c4ccccc4)cc(-c4ccccc4)c4ccccc34)cc2)cc1] | 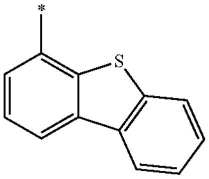 |
| 2-D1-92 | 1 | 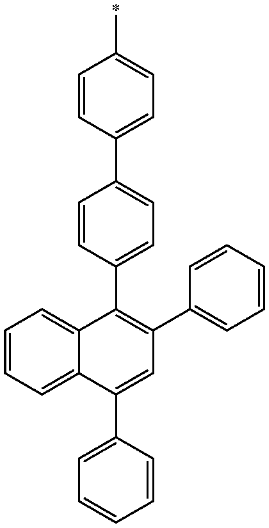 [SMILES: *c1ccc(-c2ccc(-c3c(-c4ccccc4)cc(-c4ccccc4)c4ccccc34)cc2)cc1] | 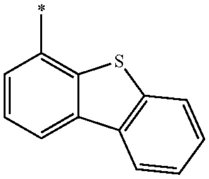 |
| 2-D1-93 | 1 | 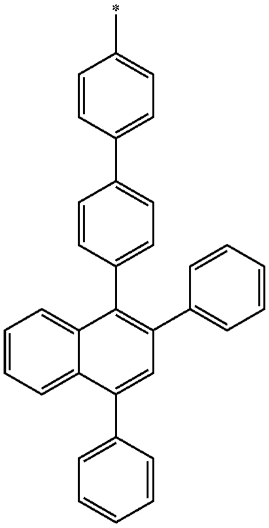 [SMILES: *c1ccc(-c2ccc(-c3c(-c4ccccc4)cc(-c4ccccc4)c4ccccc34)cc2)cc1] | 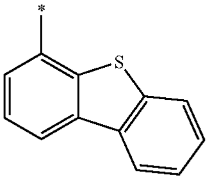 |

-continued
| [Compound Group 4] | | | |
|---|---|---|---|
| 2-D1-94 | 1 | 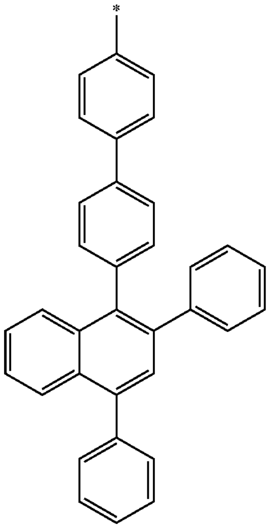 [SMILES: *c1ccc(-c2ccc(-c3c(-c4ccccc4)cc(-c4ccccc4)c4ccccc34)cc2)cc1] | 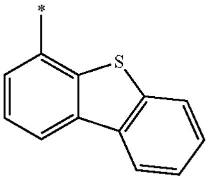 |
| 2-D1-95 | 1 | 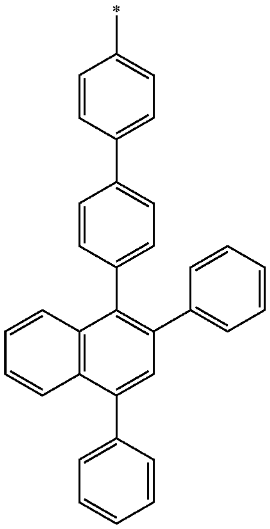 [SMILES: *c1ccc(-c2ccc(-c3c(-c4ccccc4)cc(-c4ccccc4)c4ccccc34)cc2)cc1] | 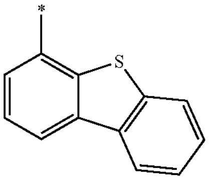 [SMILES: *c1cccc2c1sc1ccccc12] |
| 2-D1-96 | 1 | 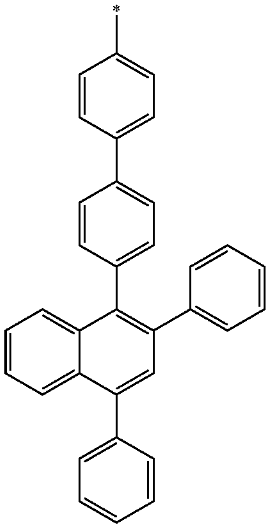 [SMILES: *c1ccc(-c2ccc(-c3c(-c4ccccc4)cc(-c4ccccc4)c4ccccc34)cc2)cc1] | 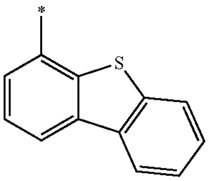 |

-continued
[Compound Group 4]
| | | | |
|---|---|---|---|
| 2-D1-99 | 1 | 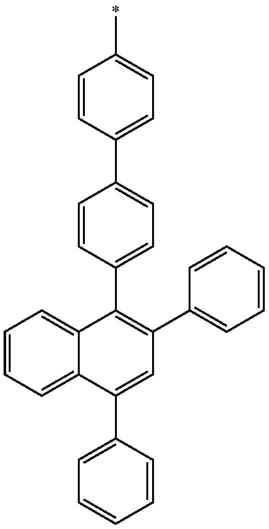 [SMILES: *c1ccc(-c2ccc(-c3c(-c4ccccc4)cc(-c4ccccc4)c4ccccc34)cc2)cc1] | 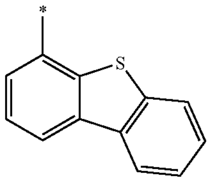 [SMILES: *c1cccc2c1sc1ccccc12] |
| 3-D1-50 | 1 | 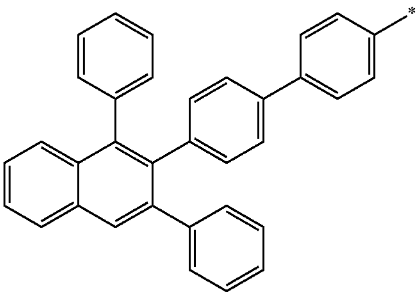 [SMILES: *c1ccc(-c2ccc(-c3c(-c4ccccc4)cc4ccccc4c3-c3ccccc3)cc2)cc1] | 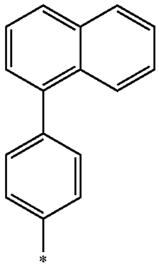 [SMILES: *c1ccc(-c2cccc3ccccc23)cc1] |
| 3-D1-51 | 1 | 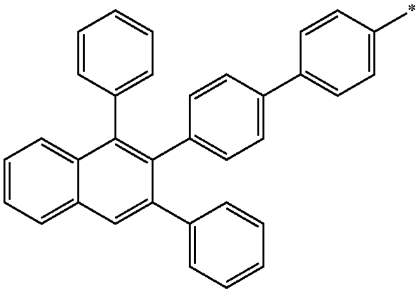 [SMILES: *c1ccc(-c2ccc(-c3c(-c4ccccc4)cc4ccccc4c3-c3ccccc3)cc2)cc1] | 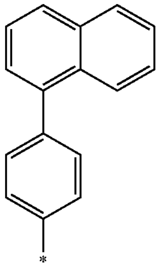 [SMILES: *c1ccc(-c2cccc3ccccc23)cc1] |
| 3-D1-52 | 1 | 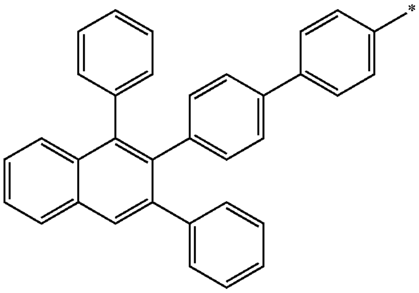 [SMILES: *c1ccc(-c2ccc(-c3c(-c4ccccc4)cc4ccccc4c3-c3ccccc3)cc2)cc1] | 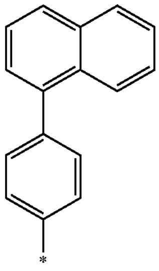 [SMILES: *c1ccc(-c2cccc3ccccc23)cc1] |

-continued
| [Compound Group 4] | | | |
|---|---|---|---|
| 3-D1-53 | 1 | 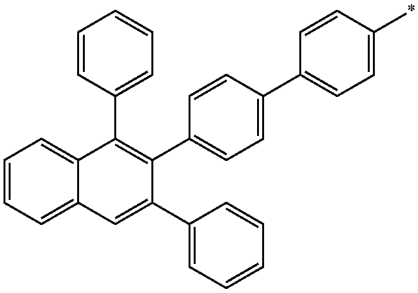 [SMILES: *c1ccc(-c2ccc(-c3c(-c4ccccc4)cc4ccccc4c3-c3ccccc3)cc2)cc1] | 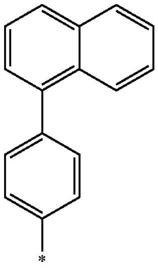 [SMILES: *c1ccc(-c2cccc3ccccc23)cc1] |
| 3-D1-54 | 1 | 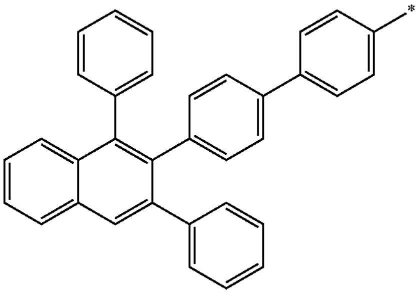 [SMILES: *c1ccc(-c2ccc(-c3c(-c4ccccc4)cc4ccccc4c3-c3ccccc3)cc2)cc1] | 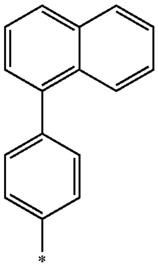 [SMILES: *c1ccc(-c2cccc3ccccc23)cc1] |
| 3-D1-55 | 1 | 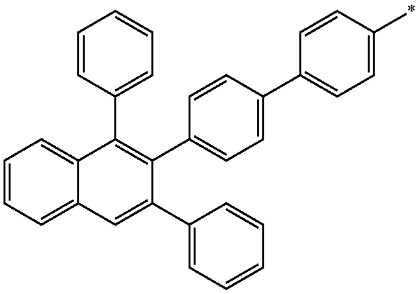 [SMILES: *c1ccc(-c2ccc(-c3c(-c4ccccc4)cc4ccccc4c3-c3ccccc3)cc2)cc1] | 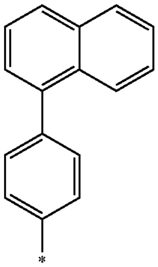 [SMILES: *c1ccc(-c2cccc3ccccc23)cc1] |
| 3-D1-56 | 1 | 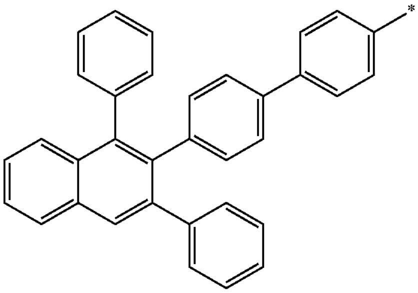 [SMILES: *c1ccc(-c2ccc(-c3c(-c4ccccc4)cc4ccccc4c3-c3ccccc3)cc2)cc1] | 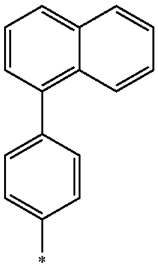 [SMILES: *c1ccc(-c2cccc3ccccc23)cc1] |
| 3-D1-58 | 1 | 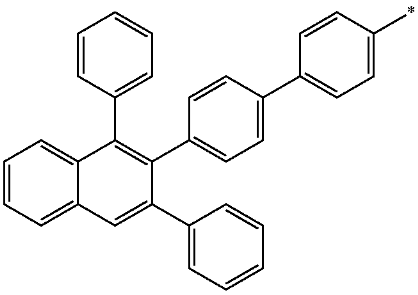 [SMILES: *c1ccc(-c2ccc(-c3c(-c4ccccc4)cc4ccccc4c3-c3ccccc3)cc2)cc1] | 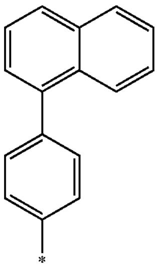 [SMILES: *c1ccc(-c2cccc3ccccc23)cc1] |

-continued
| [Compound Group 4] | | | |
|---|---|---|---|
| 3-D1-59 | 1 | 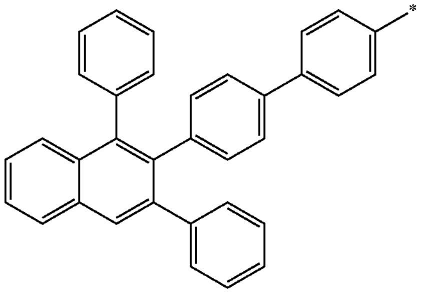 [SMILES: *c1ccc(-c2ccc(-c3c(-c4ccccc4)cc4ccccc4c3-c3ccccc3)cc2)cc1] | 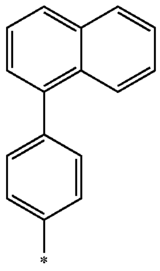 [SMILES: *c1ccc(-c2cccc3ccccc23)cc1] |
| 3-D1-60 | 1 | 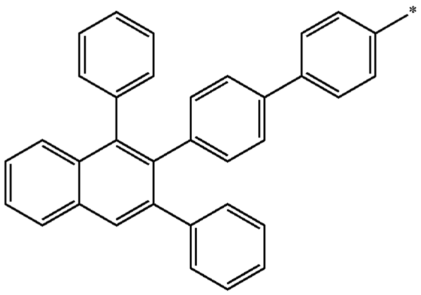 [SMILES: *c1ccc(-c2ccc(-c3c(-c4ccccc4)cc4ccccc4c3-c3ccccc3)cc2)cc1] | 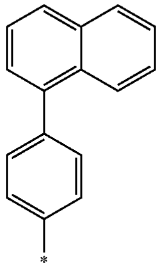 [SMILES: *c1ccc(-c2cccc3ccccc23)cc1] |
| 3-D1-61 | 1 | 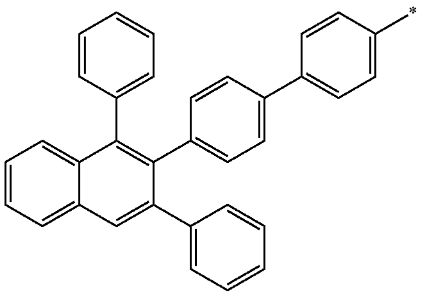 [SMILES: *c1ccc(-c2ccc(-c3c(-c4ccccc4)cc4ccccc4c3-c3ccccc3)cc2)cc1] | 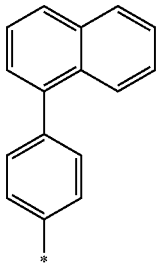 [SMILES: *c1ccc(-c2cccc3ccccc23)cc1] |
| 3-D1-62 | 1 | 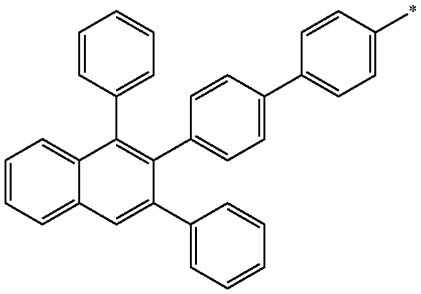 [SMILES: *c1ccc(-c2ccc(-c3c(-c4ccccc4)cc4ccccc4c3-c3ccccc3)cc2)cc1] | 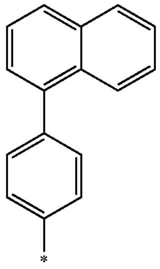 [SMILES: *c1ccc(-c2cccc3ccccc23)cc1] |
| 3-D1-65 | 1 | 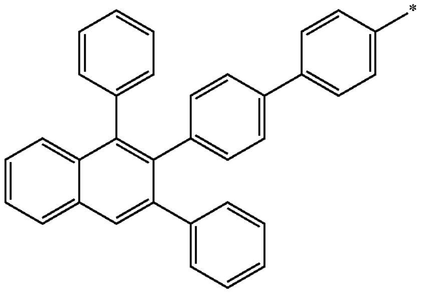 [SMILES: *c1ccc(-c2ccc(-c3c(-c4ccccc4)cc4ccccc4c3-c3ccccc3)cc2)cc1] | 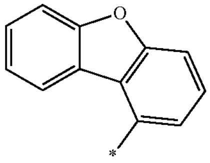 [SMILES: *c1cccc2oc3ccccc3c12] |

-continued
| [Compound Group 4] | | | |
|---|---|---|---|
| 3-D1-66 | 1 | 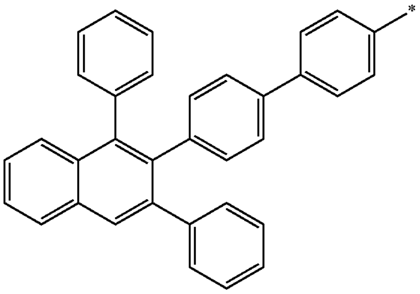 [SMILES: *c1ccc(-c2ccc(-c3c(-c4ccccc4)cc4ccccc4c3-c3ccccc3)cc2)cc1] | 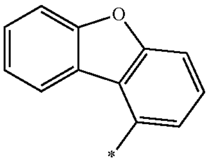 [SMILES: *c1cccc2oc3ccccc3c12] |
| 3-D1-67 | 1 | 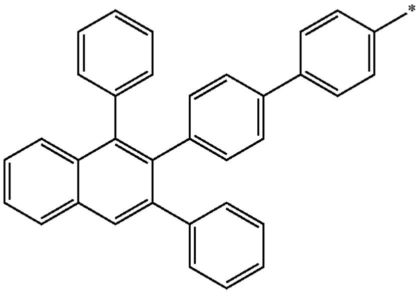 [SMILES: *c1ccc(-c2ccc(-c3c(-c4ccccc4)cc4ccccc4c3-c3ccccc3)cc2)cc1] | 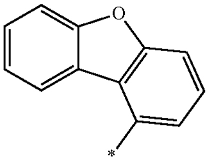 [SMILES: *c1cccc2oc3ccccc3c12] |
| 3-D1-68 | 1 | 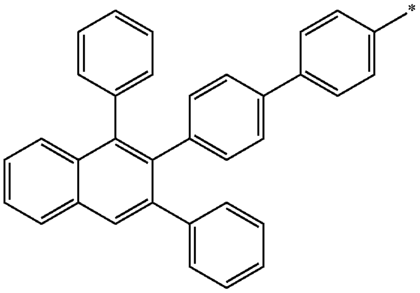 [SMILES: *c1ccc(-c2ccc(-c3c(-c4ccccc4)cc4ccccc4c3-c3ccccc3)cc2)cc1] | 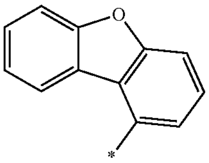 [SMILES: *c1cccc2oc3ccccc3c12] |
| 3-D1-69 | 1 | 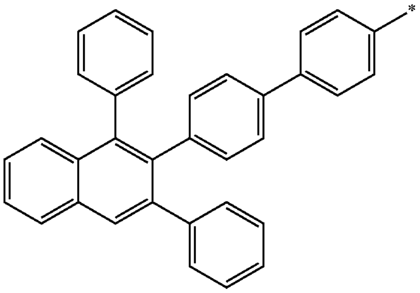 [SMILES: *c1ccc(-c2ccc(-c3c(-c4ccccc4)cc4ccccc4c3-c3ccccc3)cc2)cc1] | 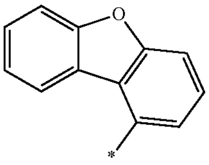 [SMILES: *c1cccc2oc3ccccc3c12] |
| 3-D1-70 | 1 | 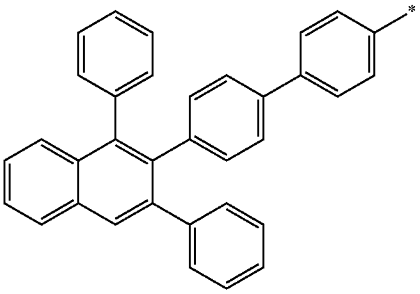 [SMILES: *c1ccc(-c2ccc(-c3c(-c4ccccc4)cc4ccccc4c3-c3ccccc3)cc2)cc1] | 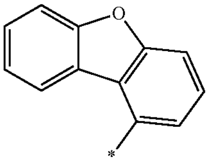 [SMILES: *c1cccc2oc3ccccc3c12] |

-continued
| [Compound Group 4] | | | |
|---|---|---|---|
| 3-D1-71 | 1 | 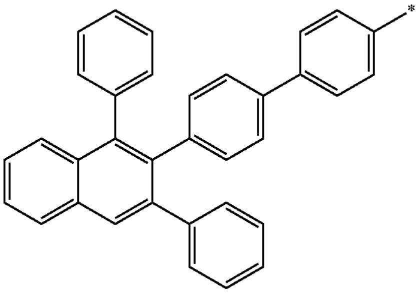 [SMILES: *c1ccc(-c2ccc(-c3c(-c4ccccc4)cc4ccccc4c3-c3ccccc3)cc2)cc1] | 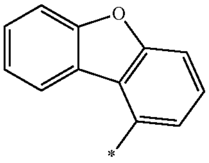 [SMILES: *c1cccc2oc3ccccc3c12] |
| 3-D1-76 | 1 | 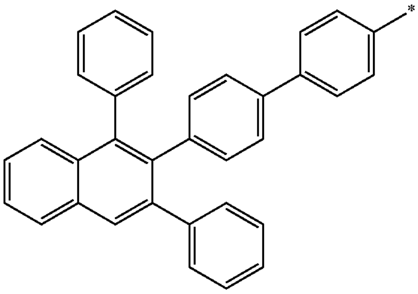 [SMILES: *c1ccc(-c2ccc(-c3c(-c4ccccc4)cc4ccccc4c3-c3ccccc3)cc2)cc1] | 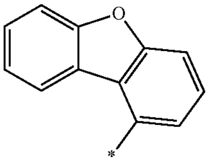 [SMILES: *c1cccc2oc3ccccc3c12] |
| 3-D1-78 | 1 | 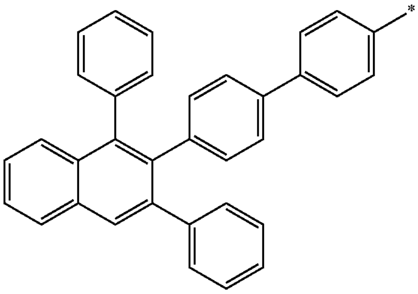 [SMILES: *c1ccc(-c2ccc(-c3c(-c4ccccc4)cc4ccccc4c3-c3ccccc3)cc2)cc1] | 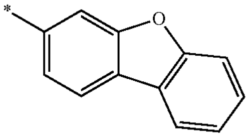 |
| 3-D1-79 | 1 | 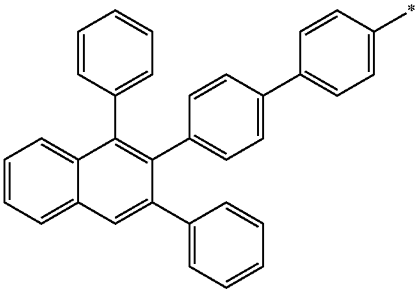 [SMILES: *c1ccc(-c2ccc(-c3c(-c4ccccc4)cc4ccccc4c3-c3ccccc3)cc2)cc1] | 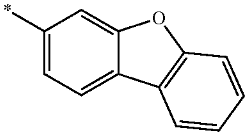 [SMILES: *c1ccc2c(c1)oc1ccccc12] |
| 3-D1-80 | 1 | 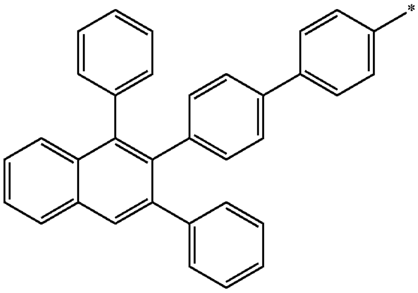 [SMILES: *c1ccc(-c2ccc(-c3c(-c4ccccc4)cc4ccccc4c3-c3ccccc3)cc2)cc1] | 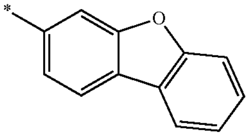 [SMILES: *c1ccc2c(c1)oc1ccccc12] |

-continued
[Compound Group 4]
3-D1-81 1
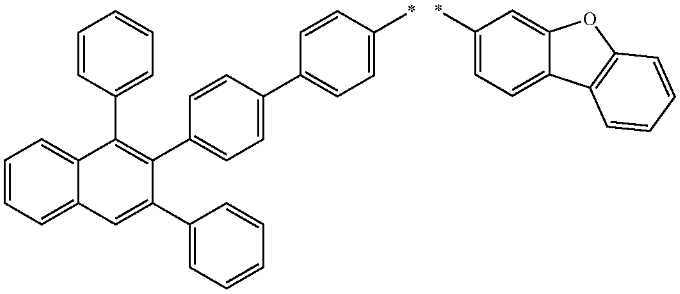
3-D1-82 1
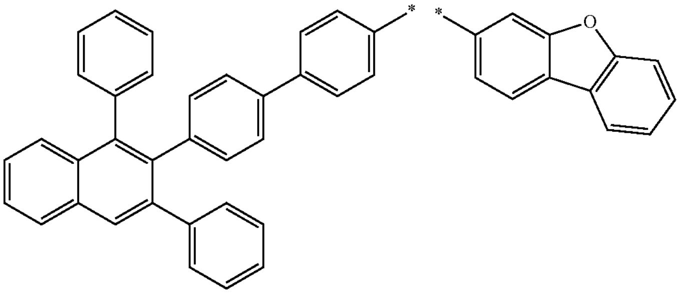
3-D1-83 1
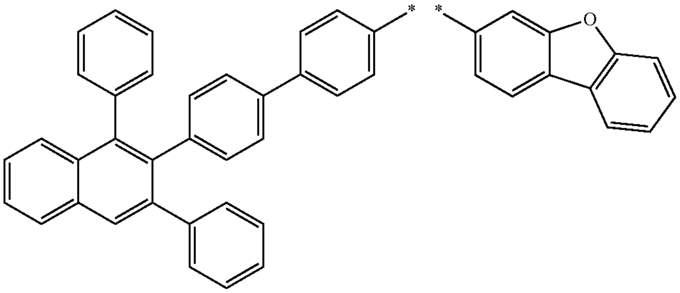
3-D1-84 1
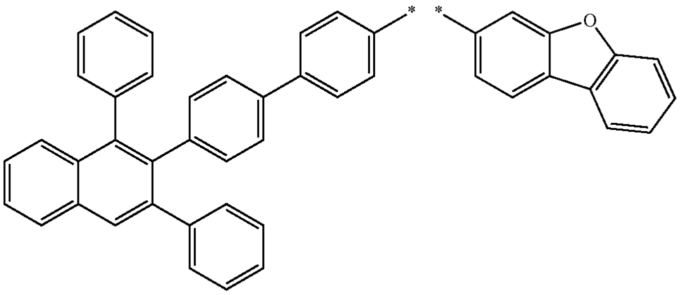
3-D1-88 1
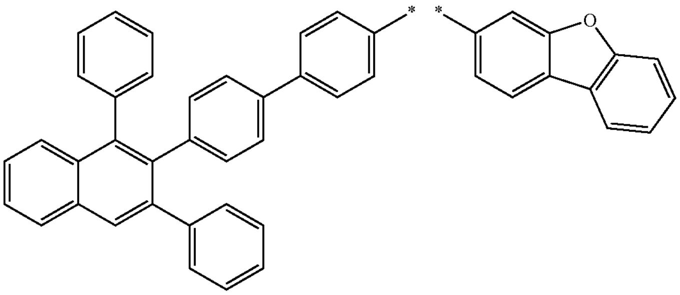

-continued
| [Compound Group 4] | | | |
|---|---|---|---|
| 3-D1-90 | 1 | 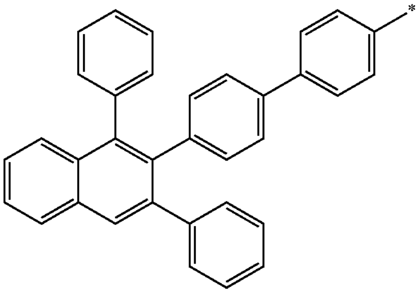 [SMILES: *c1ccc(-c2ccc(-c3c(-c4ccccc4)cc4ccccc4c3-c3ccccc3)cc2)cc1] | 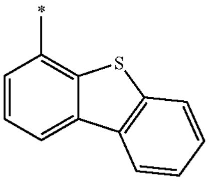 [SMILES: *c1cccc2c1sc1ccccc12] |
| 3-D1-91 | 1 | 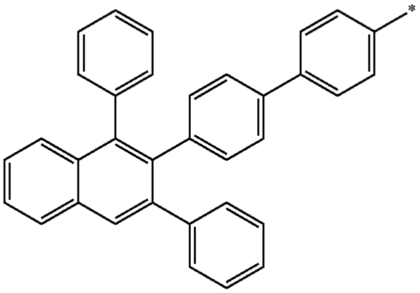 [SMILES: *c1ccc(-c2ccc(-c3c(-c4ccccc4)cc4ccccc4c3-c3ccccc3)cc2)cc1] | 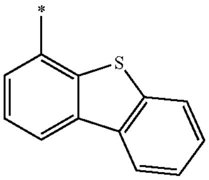 [SMILES: *c1cccc2c1sc1ccccc12] |
| 3-D1-92 | 1 | 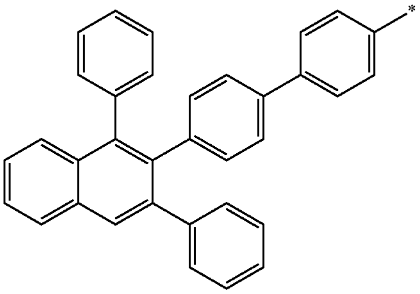 [SMILES: *c1ccc(-c2ccc(-c3c(-c4ccccc4)cc4ccccc4c3-c3ccccc3)cc2)cc1] | 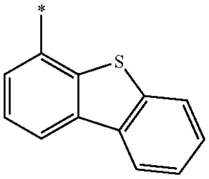 |
| 3-D1-93 | 1 | 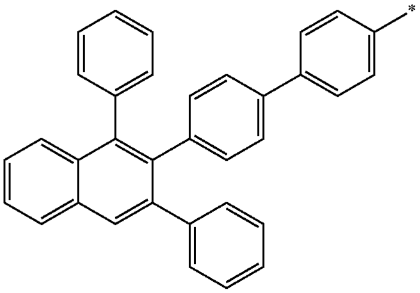 [SMILES: *c1ccc(-c2ccc(-c3c(-c4ccccc4)cc4ccccc4c3-c3ccccc3)cc2)cc1] | 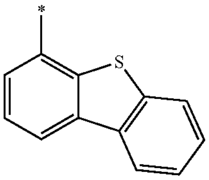 |
| 3-D1-94 | 1 | 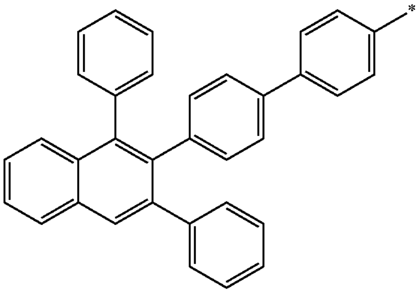 [SMILES: *c1ccc(-c2ccc(-c3c(-c4ccccc4)cc4ccccc4c3-c3ccccc3)cc2)cc1] | 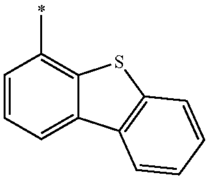 |

-continued
| [Compound Group 4] | | | |
|---|---|---|---|
| 3-D1-95 | 1 | 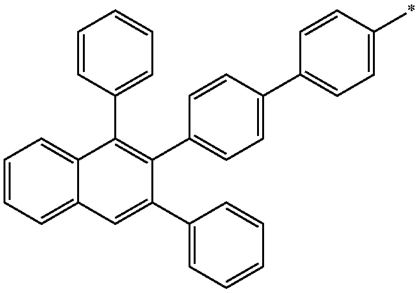 [SMILES: *c1ccc(-c2ccc(-c3c(-c4ccccc4)cc4ccccc4c3-c3ccccc3)cc2)cc1] | 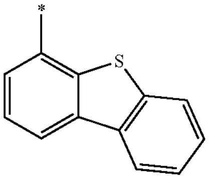 [SMILES: *c1cccc2c1sc1ccccc12] |
| 3-D1-96 | 1 | 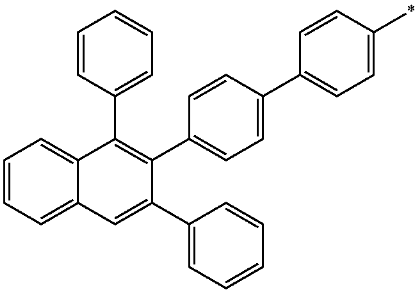 [SMILES: *c1ccc(-c2ccc(-c3c(-c4ccccc4)cc4ccccc4c3-c3ccccc3)cc2)cc1] | 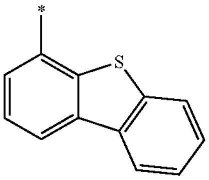 |
| 3-D1-99 | 1 | 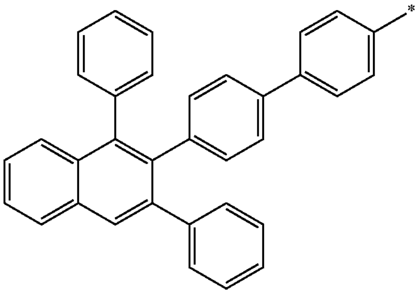 [SMILES: *c1ccc(-c2ccc(-c3c(-c4ccccc4)cc4ccccc4c3-c3ccccc3)cc2)cc1] | 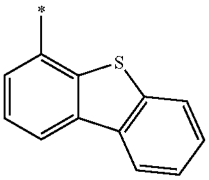 |
| | $Ar_2$ |
|---|---|
| 2-D1-50 | 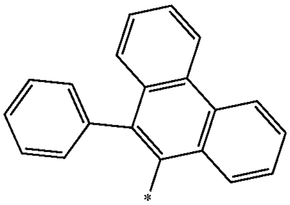 [SMILES: *c1c(-c2ccccc2)c2ccccc2c2ccccc12] |
| 2-D1-51 | 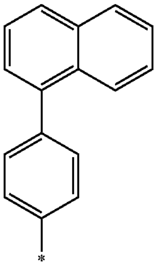 [SMILES: *c1ccc(-c2cccc3ccccc23)cc1] |

-continued
[Compound Group 4]
2-D1-52
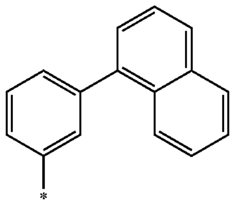 [SMILES: *c1cccc(-c2cccc3ccccc23)c1]
2-D1-53
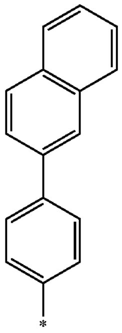 [SMILES: *c1ccc(-c2ccc3ccccc3c2)cc1]
2-D1-54
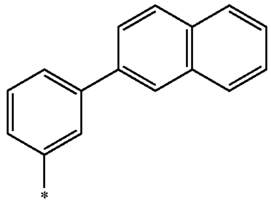 [SMILES: *c1cccc(-c2ccc3ccccc3c2)c1]
2-D1-55
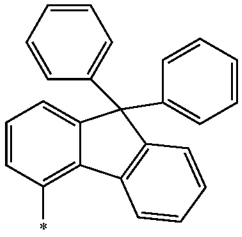 [SMILES: *c1cccc2c1-c1ccccc1C2(c1ccccc1)c1ccccc1]
2-D1-56
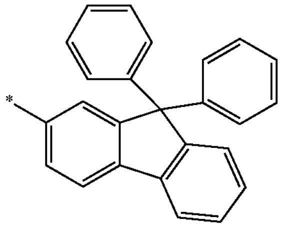 [SMILES: *c1ccc2c(c1)C(c1ccccc1)(c1ccccc1)c1ccccc1-2]
2-D1-58
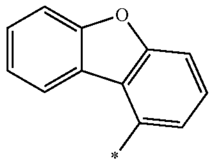 [SMILES: *c1cccc2oc3ccccc3c12]

-continued
| [Compound Group 4] | |
|---|---|
| 2-D1-59 | 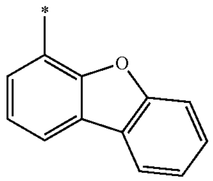 |
| 2-D1-60 | 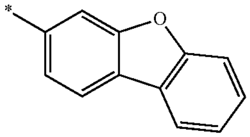 [SMILES: *c1ccc2c(c1)oc1ccccc12] |
| 2-D1-61 | 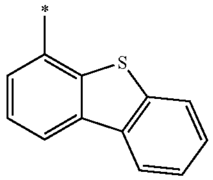 |
| 2-D1-62 | 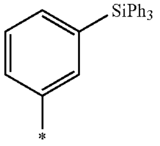 |
| 2-D1-65 | 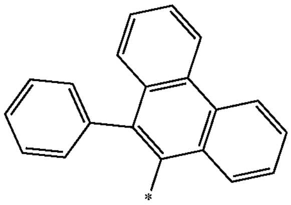 [SMILES: *c1c(-c2ccccc2)c2ccccc2c2ccccc12] |
| 2-D1-66 | 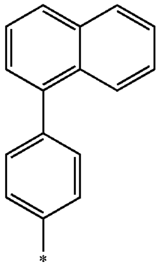 [SMILES: *c1ccc(-c2cccc3ccccc23)cc1] |
| 2-D1-67 | 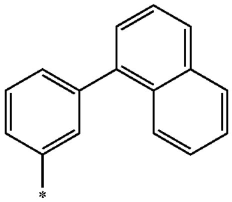 [SMILES: *c1cccc(-c2cccc3ccccc23)c1] |

-continued
| [Compound Group 4] | |
|---|---|
| 2-D1-68 | 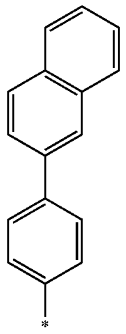 [SMILES: *c1ccc(-c2ccc3ccccc3c2)cc1] |
| 2-D1-69 | 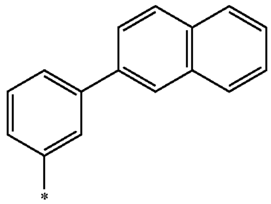 [SMILES: *c1cccc(-c2ccc3ccccc3c2)c1] |
| 2-D1-70 | 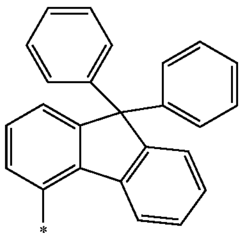 [SMILES: *c1cccc2c1-c1ccccc1C2(c1ccccc1)c1ccccc1] |
| 2-D1-71 | 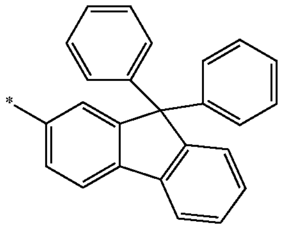 [SMILES: *c1ccc2c(c1)C(c1ccccc1)(c1ccccc1)c1ccccc1-2] |
| 2-D1-76 | 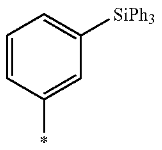 |
| 2-D1-78 | 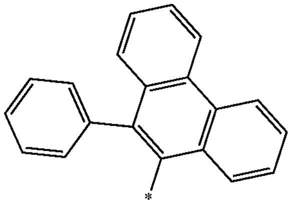 [SMILES: *c1c(-c2ccccc2)c2ccccc2c2ccccc12] |

-continued
| [Compound Group 4] | |
|---|---|
| 2-D1-79 | 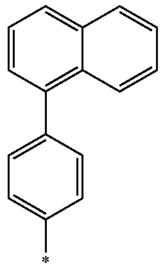 [SMILES: *c1ccc(-c2cccc3ccccc23)cc1] |
| 2-D1-80 | 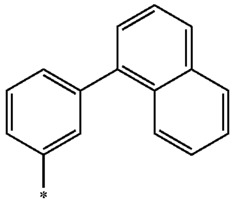 |
| 2-D1-81 | 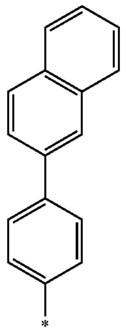 [SMILES: *c1ccc(-c2ccc3ccccc3c2)cc1] |
| 2-D1-82 | 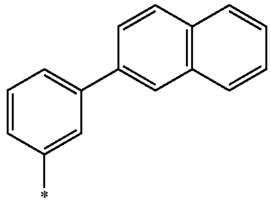 |
| 2-D1-83 | 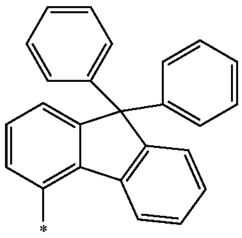 [SMILES: *c1cccc2c1-c1ccccc1C2(c1ccccc1)c1ccccc1] |
| 2-D1-84 | 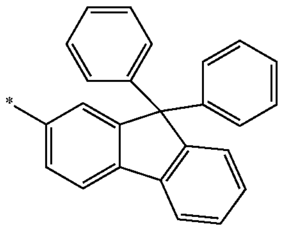 [SMILES: *c1ccc2c(c1)C(c1ccccc1)(c1ccccc1)c1ccccc1-2] |

-continued
| [Compound Group 4] | |
|---|---|
| 2-D1-88 | 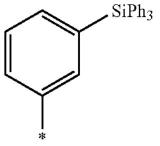 |
| 2-D1-90 | 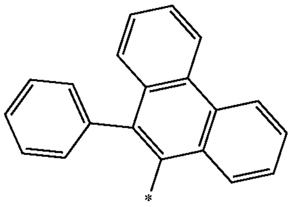 [SMILES: *c1c(-c2ccccc2)c2ccccc2c2ccccc12] |
| 2-D1-91 | 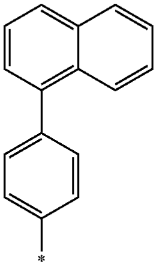 [SMILES: *c1ccc(-c2cccc3ccccc23)cc1] |
| 2-D1-92 | 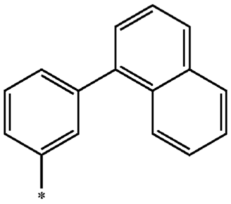 [SMILES: *c1cccc(-c2cccc3ccccc23)c1] |
| 2-D1-93 | 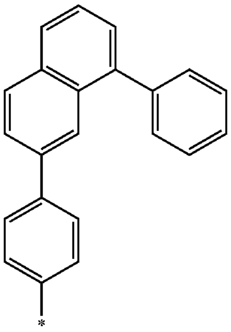 [SMILES: *c1ccc(-c2ccc3cccc(-c4ccccc4)c3c2)cc1] |
| 2-D1-94 | 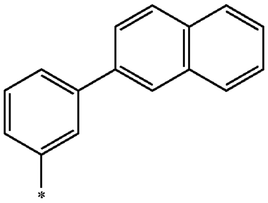 [SMILES: *c1cccc(-c2ccc3ccccc3c2)c1] |

-continued
| [Compound Group 4] | |
|---|---|
| 2-D1-95 | 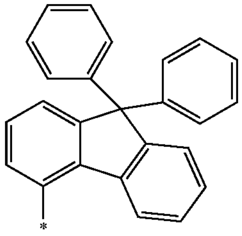 [SMILES: *c1cccc2c1-c1ccccc1C2(c1ccccc1)c1ccccc1] |
| 2-D1-96 | 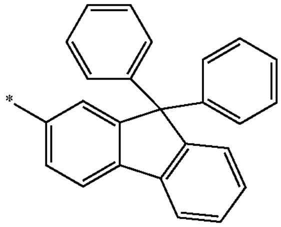 [SMILES: *c1ccc2c(c1)C(c1ccccc1)(c1ccccc1)c1ccccc1-2] |
| 2-D1-99 | 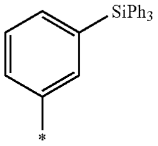 |
| 3-D1-50 | 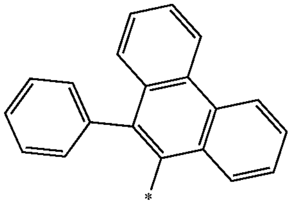 [SMILES: *c1c(-c2ccccc2)c2ccccc2c2ccccc12] |
| 3-D1-51 | 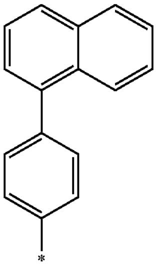 [SMILES: *c1ccc(-c2cccc3ccccc23)cc1] |
| 3-D1-52 | 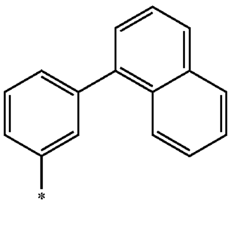 |

-continued
[Compound Group 4]
3-D1-53
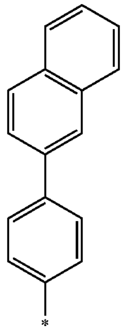 [SMILES: *c1ccc(-c2ccc3ccccc3c2)cc1]
3-D1-54
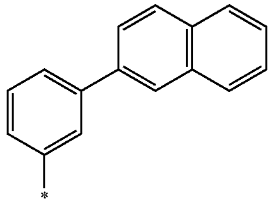 [SMILES: *c1cccc(-c2ccc3ccccc3c2)c1]
3-D1-55
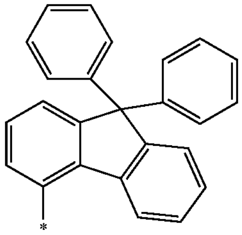 [SMILES: *c1cccc2c1-c1ccccc1C2(c1ccccc1)c1ccccc1]
3-D1-56
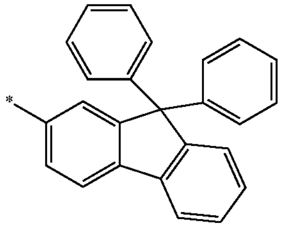 [SMILES: *c1ccc2c(c1)C(c1ccccc1)(c1ccccc1)c1ccccc1-2]
3-D1-58
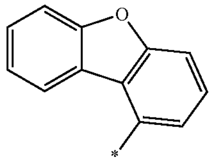 [SMILES: *c1cccc2oc3ccccc3c12]
3-D1-59
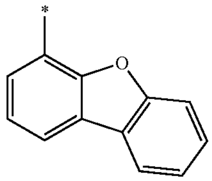 [SMILES: *c1cccc2c1oc1ccccc12]
3-D1-60
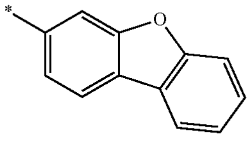 [SMILES: *c1ccc2c(c1)oc1ccccc12]

-continued
| [Compound Group 4] | |
|---|---|
| 3-D1-61 | 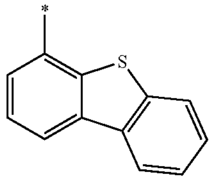 |
| 3-D1-62 | 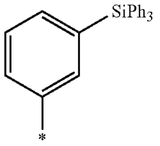 |
| 3-D1-65 | 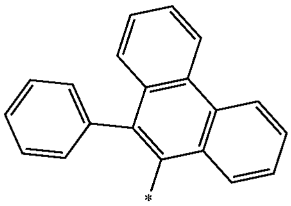 [SMILES: *c1c(-c2ccccc2)c2ccccc2c2ccccc12] |
| 3-D1-66 | 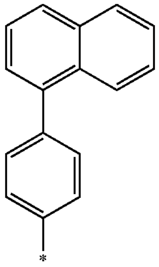 [SMILES: *c1ccc(-c2cccc3ccccc23)cc1] |
| 3-D1-67 | 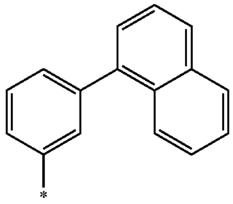 |
| 3-D1-68 | 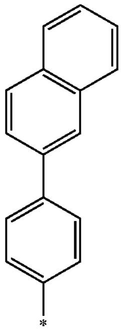 [SMILES: *c1ccc(-c2ccc3ccccc3c2)cc1] |
| 3-D1-69 | 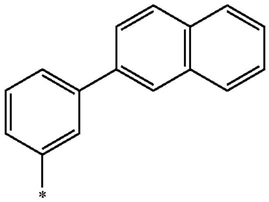 |

-continued
[Compound Group 4]
3-D1-70
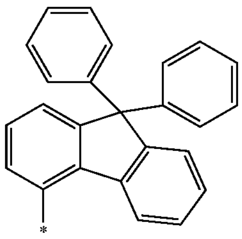 [SMILES: *c1cccc2c1-c1ccccc1C2(c1ccccc1)c1ccccc1]
3-D1-71
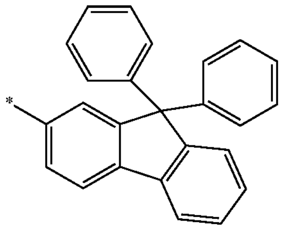 [SMILES: *c1ccc2c(c1)C(c1ccccc1)(c1ccccc1)c1ccccc1-2]
3-D1-76
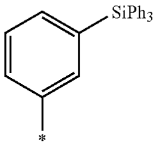
3-D1-78
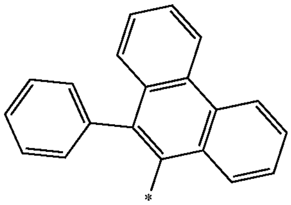 [SMILES: *c1c(-c2ccccc2)c2ccccc2c2ccccc12]
3-D1-79
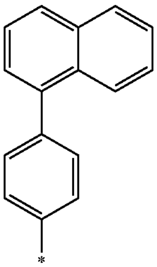 [SMILES: *c1ccc(-c2cccc3ccccc23)cc1]
3-D1-80
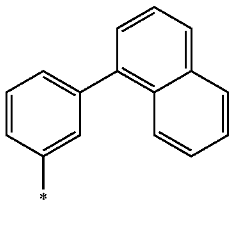

-continued
| [Compound Group 4] | |
|---|---|
| 3-D1-81 | 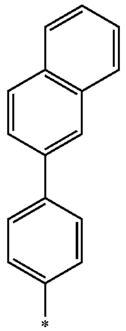 [SMILES: *c1ccc(-c2ccc3ccccc3c2)cc1] |
| 3-D1-82 | 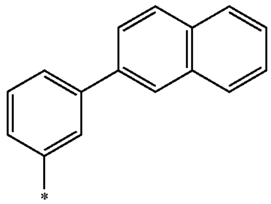 [SMILES: *c1cccc(-c2ccc3ccccc3c2)c1] |
| 3-D1-83 | 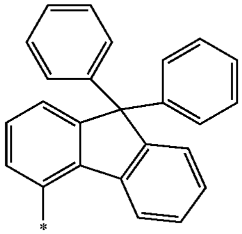 [SMILES: *c1cccc2c1-c1ccccc1C2(c1ccccc1)c1ccccc1] |
| 3-D1-84 | 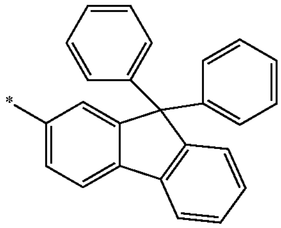 [SMILES: *c1ccc2c(c1)C(c1ccccc1)(c1ccccc1)c1ccccc1-2] |
| 3-D1-88 | 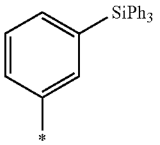 |
| 3-D1-90 | 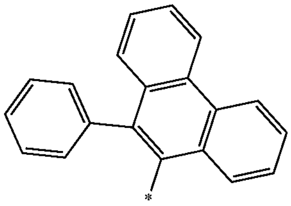 [SMILES: *c1c(-c2ccccc2)c2ccccc2c2ccccc12] |

-continued
| [Compound Group 4] | |
|---|---|
| 3-D1-91 | 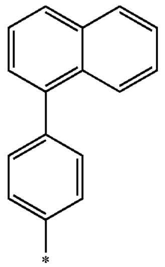 [SMILES: *c1ccc(-c2cccc3ccccc23)cc1] |
| 3-D1-92 | 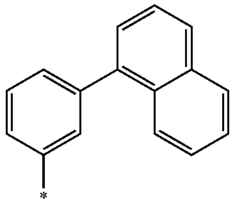 |
| 3-D1-93 | 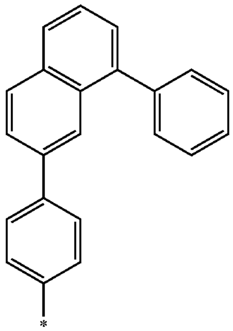 [SMILES: *c1ccc(-c2ccc3cccc(-c4ccccc4)c3c2)cc1] |
| 3-D1-94 | 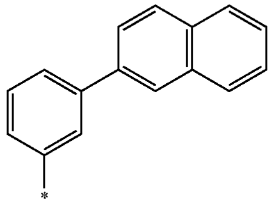 [SMILES: *c1cccc(-c2ccc3ccccc3c2)c1] |
| 3-D1-95 | 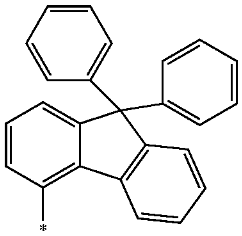 [SMILES: *c1cccc2c1-c1ccccc1C2(c1ccccc1)c1ccccc1] |
| 3-D1-96 | 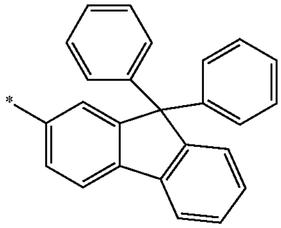 [SMILES: *c1ccc2c(c1)C(c1ccccc1)(c1ccccc1)c1ccccc1-2] |

-continued
| [Compound Group 4] | |
|---|---|
| 3-D1-99 | 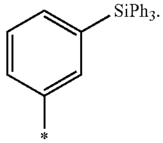 SiPh3. |
* * * * *